US012753341B2

(12) United States Patent
Aoyama et al.

(10) Patent No.: US 12,753,341 B2
(45) Date of Patent: Oct. 6, 2026

(54) ORGANIC ELECTROLUMINESCENT ELEMENT AND ELECTRONIC DEVICE

(71) Applicant: IDEMITSU KOSAN CO., LTD., Tokyo (JP)

(72) Inventors: Yoshinori Aoyama, Tokyo (JP); Kazuki Nishimura, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 492 days.

(21) Appl. No.: 18/281,556

(22) PCT Filed: Mar. 9, 2022

(86) PCT No.: PCT/JP2022/010286
§ 371 (c)(1),
(2) Date: Sep. 11, 2023

(87) PCT Pub. No.: WO2022/191237
PCT Pub. Date: Sep. 15, 2022

(65) Prior Publication Data
US 2024/0334721 A1 Oct. 3, 2024

(30) Foreign Application Priority Data
Mar. 12, 2021 (JP) ................................. 2021-040812

(51) Int. Cl.
*C09K 11/06* (2006.01)
*H10K 50/11* (2023.01)
*H10K 85/60* (2023.01)
*H10K 101/10* (2023.01)

(52) U.S. Cl.
CPC .............. *C09K 11/06* (2013.01); *H10K 50/11* (2023.02); *H10K 85/622* (2023.02);
(Continued)

(58) Field of Classification Search
CPC ............ C09K 11/06; C09K 2211/1029; C09K 2211/1044; H10K 85/622; H10K 85/6572; H10K 50/11; H10K 2101/10
(Continued)

(56) References Cited

U.S. PATENT DOCUMENTS

2010/0295444 A1 11/2010 Kuma et al.
2010/0301318 A1 12/2010 Kuma et al.
(Continued)

FOREIGN PATENT DOCUMENTS

JP 2007-294261 A 11/2007
JP 2019-161218 A 9/2019
(Continued)

OTHER PUBLICATIONS

International Searching Authority, "International Search Report," issued in connection with International Patent Application No. PCT/JP2022/010286, dated May 24, 2022.
(Continued)

*Primary Examiner* — Anita Nassiri-Motlagh
(74) *Attorney, Agent, or Firm* — Foley & Lardner LLP

(57) ABSTRACT

An organic EL device is provided in which a first emitting layer contains a first compound as a first host material and a first emitting compound, a second emitting layer contains a second compound as a second host material and a second emitting compound, a triplet energy of the first host material $T_1(H1)$ and a triplet energy of the second host material $T_1(H2)$ satisfy a relationship of (Numerical Formula 1A) below, a first electron transporting layer contains a third compound, and a difference between an affinity value of the third compound Af(M3) and an affinity value of the host material contained in the emitting layer that is closer to the cathode and is the first emitting layer or the second emitting
(Continued)

layer Af(HX) satisfies a relationship of (Numerical Formula 2A) below, $$T_1(H1) > T_1(H2), \quad \text{(Numerical Formula 1A)}$$

$$0\ \text{eV} \leq Af(HX) - Af(M3) < 0.15\ \text{eV}. \quad \text{(Numerical Formula 2A)}$$

41 Claims, 2 Drawing Sheets

(52) U.S. Cl.
CPC .. *H10K 85/6572* (2023.02); *C09K 2211/1029* (2013.01); *C09K 2211/1044* (2013.01); *H10K 2101/10* (2023.02)

(58) Field of Classification Search
USPC .................................................... 252/301.16
See application file for complete search history.

(56) References Cited

U.S. PATENT DOCUMENTS

| | | | |
|---|---|---|---|
| 2013/0092913 | A1 | 4/2013 | Nishimura et al. |
| 2013/0270539 | A1 | 10/2013 | Kuma et al. |
| 2014/0183500 | A1 | 7/2014 | Ikeda et al. |
| 2015/0303391 | A1 | 10/2015 | Nishimura et al. |
| 2017/0200920 | A1 | 7/2017 | Nishimura et al. |
| 2017/0324043 | A1 | 11/2017 | Ikeda et al. |
| 2019/0280209 | A1 | 9/2019 | Fujita |
| 2023/0088213 | A1 | 3/2023 | Tasaki et al. |

FOREIGN PATENT DOCUMENTS

| | | | |
|---|---|---|---|
| KR | 2020-0011527 | A | 2/2020 |
| WO | WO-2010/134350 | A1 | 11/2010 |
| WO | WO-2011/155508 | A1 | 12/2011 |
| WO | WO-2014/087913 | A1 | 6/2014 |
| WO | WO-2014/104144 | A1 | 7/2014 |
| WO | WO-2021/049651 | A1 | 3/2021 |

OTHER PUBLICATIONS

International Searching Authority, "Written Opinion," issued in connection with International Patent Application No. PCT/JP2022/010286, dated May 24, 2022.

PCT International Preliminary Report on Patentability, dated Sep. 12, 2023, which includes a Translation of International Searching Authority, "Written Opinion," issued in connection with International Patent Application No. PCT/JP2022/010286, dated May 24, 2022.

ORGANIC ELECTROLUMINESCENT ELEMENT AND ELECTRONIC DEVICE

CROSS-REFERENCE TO RELATED APPLICATIONS

The present application claims priority under 35 U.S.C. § 371 to International Patent Application No. PCT/JP2022/010286, filed Mar. 9, 2022, which claims priority to and the benefit of Japanese Patent Application No. 2021-040812, filed on Mar. 12, 2021. The contents of these applications are hereby incorporated by reference in their entireties.

TECHNICAL FIELD

The present invention relates to an organic electroluminescence device and an electronic device.

BACKGROUND ART

An organic electroluminescence device (hereinafter, occasionally referred to as "organic EL device".) has found its application in a full-color display for mobile phones, televisions, and the like. When voltage is applied to an organic EL device, holes are injected from an anode and electrons are injected from a cathode into an emitting layer. The injected holes and electrons are recombined in the emitting layer to form excitons. Specifically, according to the electron spin statistics theory, singlet excitons and triplet excitons are generated at a ratio of 25%:75%.

Various studies have been made on compounds to be used for an organic EL device in order to enhance the performance of the organic EL device. The performance of the organic EL device is evaluable in terms of, for instance, luminance, emission wavelength, chromaticity, luminous efficiency, drive voltage, and lifetime.

Patent Literature 1, for instance, describes an organic electroluminescence device including an emitting layer containing a pyrene derivative and provided close to an anode and an emitting layer containing an anthracene derivative and provided close to a cathode.

Patent Literature 2, for instance, describes an organic electroluminescence device including an emitting layer containing a pyrene derivative as a host material and provided close to an anode and an emitting layer containing an anthracene derivative as a host material and provided close to a cathode.

Patent Literature 3, in order to enhance the performance of an organic EL device, describes a phenomenon in which a singlet exciton is generated by collision and fusion of two triplet excitons (hereinafter, occasionally referred to as a Triplet-Triplet Fusion (TTF) phenomenon).

CITATION LIST

Patent Literature(s)

Patent Literature 1 JP 2007-294261 A

Patent Literature 2 JP 2019-161218 A

Patent Literature 3 International Publication No. WO 2010/134350

SUMMARY OF THE INVENTION

Problem(s) to be Solved by the Invention

Organic electroluminescence devices excellent in multiple performances in a balanced manner have been demanded.

An object of the invention is to provide an organic electroluminescence device excellent in multiple performances in a balanced manner and an electronic device including the organic electroluminescence device.

Means for Solving the Problem(s)

According to an aspect of the invention, there is provided an organic electroluminescence device including:

an anode;

a cathode;

an emitting zone disposed between the anode and the cathode; and a first electron transporting layer disposed between the emitting zone and the cathode, in which the emitting zone includes a first emitting layer and a second emitting layer, the first emitting layer contains a first compound as a first host material and a first emitting compound that emits light having a maximum peak wavelength of 500 nm or less, the second emitting layer contains a second compound as a second host material and a second emitting compound that emits light having a maximum peak wavelength of 500 nm or less, the first host material and the second host material are mutually different, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1A) below, the first electron transporting layer contains a third compound, and a difference between an affinity value of the third compound Af(M3) and an affinity value of the host material contained in the emitting layer that is disposed closer to the cathode and is either the first emitting layer or the second emitting layer Af(HX) satisfies a relationship of a formula below (Numerical Formula 2A).

$$T_1(H1) > T_1(H2) \quad \text{(Numerical Formula 1A)}$$

$$0\ \text{eV} \leq Af(M3) - Af(HX) < 0.15\ \text{eV} \quad \text{(Numerical Formula 2A)}$$

According to an aspect of the invention, there is provided an organic electroluminescence device including:

an anode;

a cathode;

an emitting zone disposed between the anode and the cathode; and a first electron transporting layer disposed between the emitting zone and the cathode, in which the emitting zone includes a first emitting layer and a second emitting layer, the first emitting layer contains a first compound as a first host material and a first emitting compound that emits light having a maximum peak wavelength of 500 nm or less, the second emitting layer contains a second compound as a second host material and a second emitting compound that emits light having a maximum peak wavelength of 500 nm or less, the first host material and the second host material are mutually different, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1A) below, the first electron transporting layer contains a third compound, the third compound is a pyrimidine compound, and a difference between an affinity value of the third compound Af(M3) and an affinity value of the host material contained in the emitting layer that is disposed closer to the cathode and is either the first emitting layer or the second emitting layer Af(HX) satisfies a relationship of a formula below (Numerical Formula 2B).

$$T_1(H1) > T_1(H2) \quad \text{(Numerical Formula 1A)}$$

$$0\ \text{eV} \leq Af(M3) - Af(HX) < 0.22\ \text{eV} \quad \text{(Numerical Formula 2B)}$$

According to an aspect of the invention, there is provided an electronic device including the organic electroluminescence device according to an aspect of the invention.

According to an aspect of the invention, an organic electroluminescence device excellent in multiple performances in a balanced manner can be provided. According to an aspect of the invention, an electronic device including the organic electroluminescence device can be provided.

DESCRIPTION OF EMBODIMENT(S)

Definitions

Figure 1:
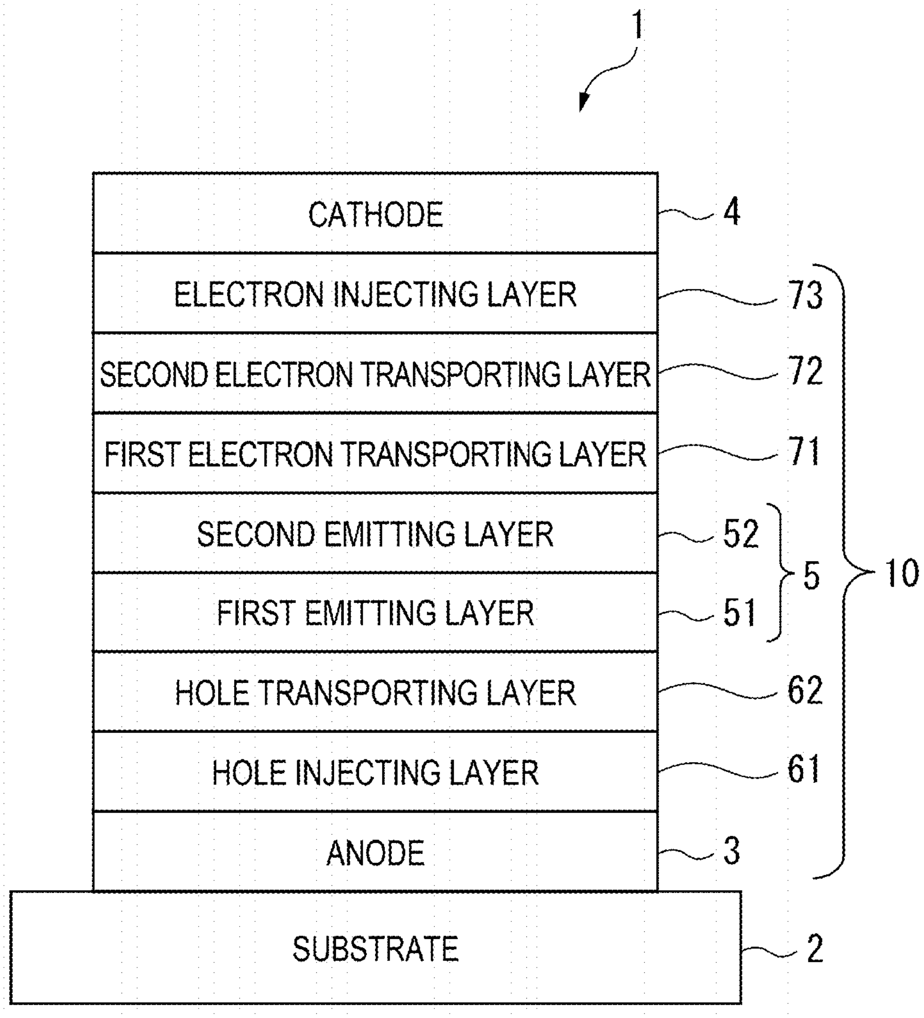
FIG. 1 schematically depicts an exemplary arrangement of an organic electroluminescence device according to an exemplary embodiment of the invention.

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent is not counted as the pyridine ring atoms. Accordingly, a pyridine ring bonded to a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituent mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group", and a substituted aryl group refers to a "substituted aryl group" in a "substituted or unsubstituted aryl group.") A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and a monovalent aryl group derived by removing one hydrogen atom from cyclic structures represented by formulae (TEMP-1) to (TEMP-15) below.

[Formula 1]

(TEMP-1)

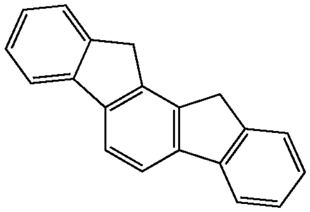

(TEMP-2)

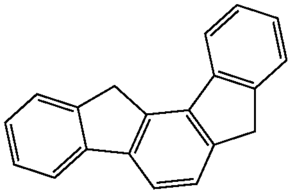

(TEMP-3)

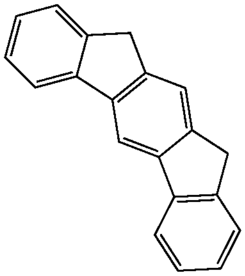

(TEMP-4)

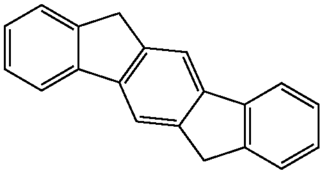

(TEMP-5)

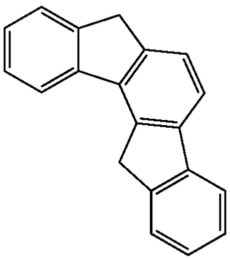

(TEMP-6)

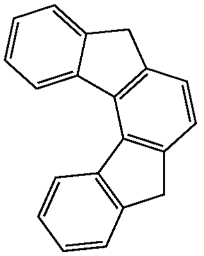

-continued (TEMP-7)

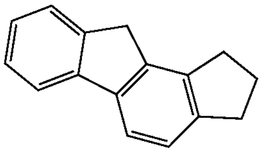

(TEMP-8)

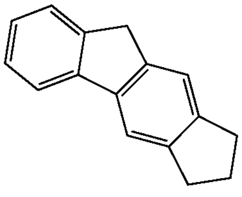

(TEMP-9)

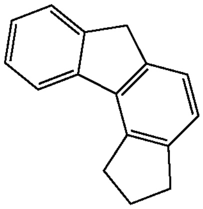

[Formula 2]

(TEMP-10)

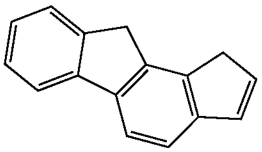

(TEMP-11)

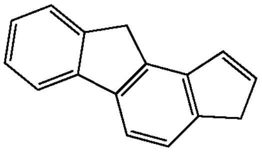

(TEMP-12)

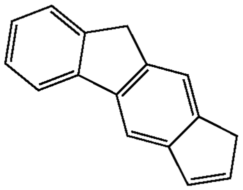

(TEMP-13)

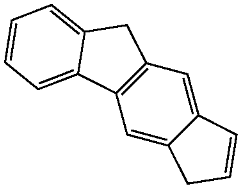

(TEMP-14)

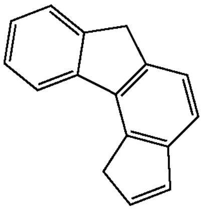

-continued (TEMP-15)

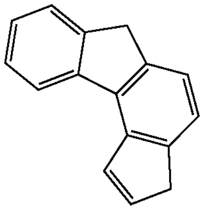

Substituted Aryl Group (Specific Example Group G1B):

an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

a furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

[Formula 3]

(TEMP-16)

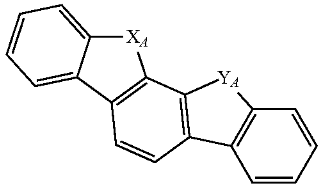

(TEMP-17)

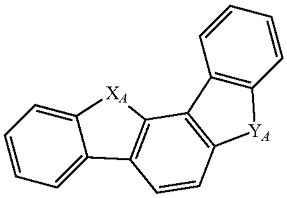

(TEMP-18)

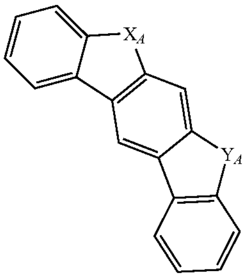

(TEMP-19)

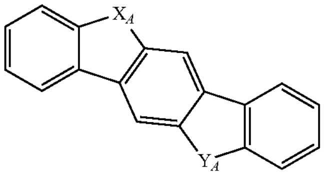

(TEMP-20)

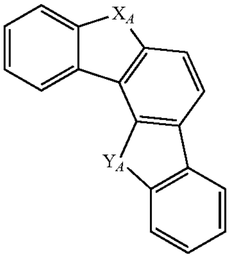

(TEMP-21)

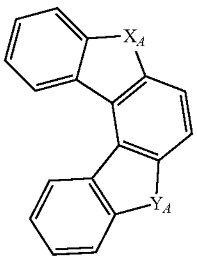

-continued (TEMP-22)

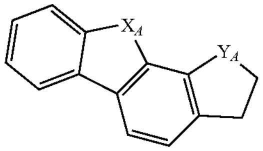

(TEMP-23)

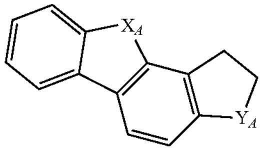

(TEMP-24)

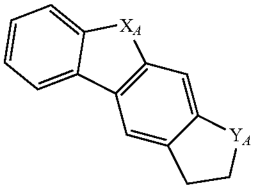

[Formula 4]

(TEMP-25)

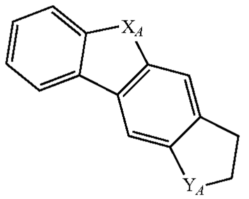

(TEMP-26)

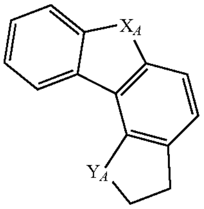

(TEMP-27)

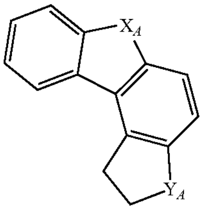

(TEMP-28)

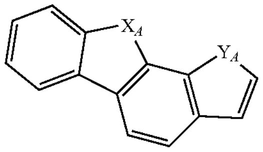

(TEMP-29)

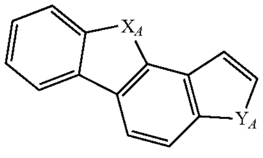

-continued (TEMP-30)

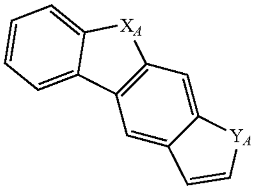

(TEMP-31)

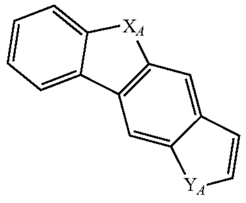

(TEMP-32)

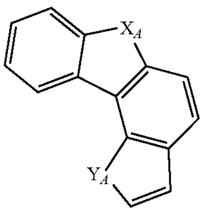

(TEMP-33)

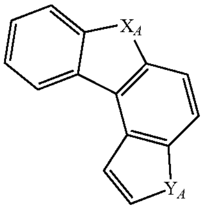

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

a phenyldibenzofuranyl group, methyldibenzofuranyl group, t-butyl dibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyl dibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

a methyl group, ethyl group, n-propyl group, isopropyl group, n-butyl group, isobutyl group, s-butyl group, and t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B):

a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):

an ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

a 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —Si(G1)(G1)(G1) are mutually the same or different;

a plurality of G2 in —Si(G2)(G2)(G2) are mutually the same or different;

a plurality of G1 in —Si(G1)(G1)(G1) are mutually the same or different;

a plurality of G2 in —Si(G2)(G2)(G2) are mutually the same or different;

a plurality of G3 in —Si(G3)(G3)(G3) are mutually the same or different; and a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6);

where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —N(G1)(G1) are mutually the same or different;

a plurality of G2 in —N(G2)(G2) are mutually the same or different;

a plurality of G3 in —N(G3)(G3) are mutually the same or different; and a plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "unsubstituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, and more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "unsubstituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. A plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by -(G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

[Formula 5]

(TEMP-Cz1)

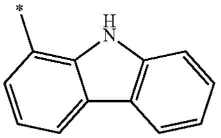

(TEMP-Cz2)

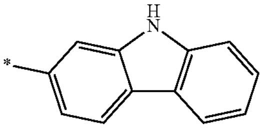

(TEMP-Cz3)

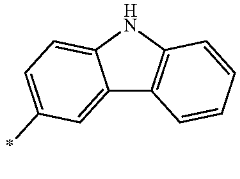

-continued (TEMP-Cz4)

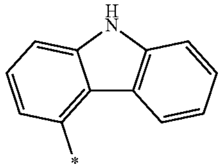

(TEMP-Cz5)

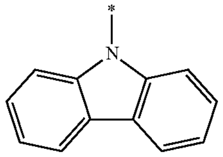

The (9-phenyl)carbazolyl group mentioned herein is, unless otherwise specified herein, specifically a group represented by one of formulae below.

[Formula 6]

(TEMP-Cz6)

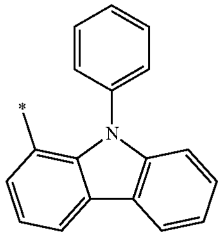

(TEMP-Cz7)

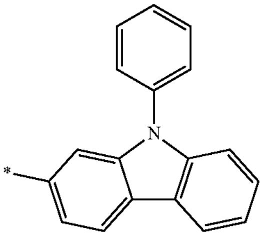

(TEMP-Cz8)

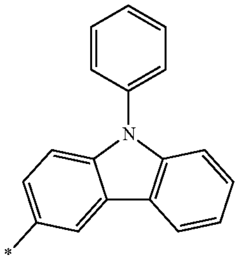

(TEMP-Cz9)

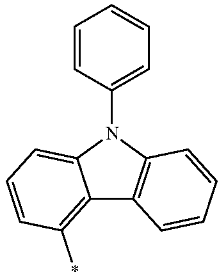

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

[Formula 7]

(TEMP-34)

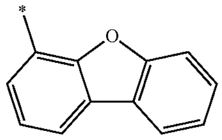

(TEMP-35)

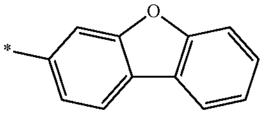

(TEMP-36)

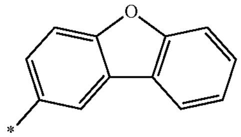

(TEMP-37)

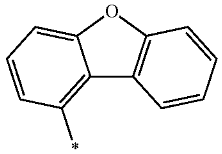

(TEMP-38)

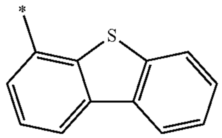

(TEMP-39)

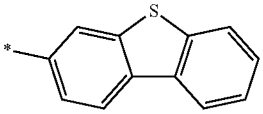

(TEMP-40)

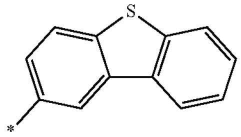

(TEMP-41)

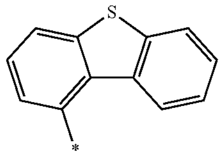

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the “substituted or unsubstituted arylene group” (specific example group G12) include a divalent group derived by removing one hydrogen atom on an aryl ring of the “substituted or unsubstituted aryl group” in the specific example group G1.

Substituted or Unsubstituted Divalent Heterocyclic Group

The “substituted or unsubstituted divalent heterocyclic group” mentioned herein is, unless otherwise specified herein, a divalent group derived by removing one hydrogen atom on a heterocycle of the “substituted or unsubstituted heterocyclic group.” Specific examples of the “substituted or unsubstituted divalent heterocyclic group” (specific example group G13) include a divalent group derived by removing one hydrogen atom on a heterocyclic ring of the “substituted or unsubstituted heterocyclic group” in the specific example group G2.

Substituted or Unsubstituted Alkylene Group

The “substituted or unsubstituted alkylene group” mentioned herein is, unless otherwise specified herein, a divalent group derived by removing one hydrogen atom on an alkyl chain of the “substituted or unsubstituted alkyl group.” Specific examples of the “substituted or unsubstituted alkylene group” (specific example group G14) include a divalent group derived by removing one hydrogen atom on an alkyl chain of the “substituted or unsubstituted alkyl group” in the specific example group G3.

The substituted or unsubstituted arylene group mentioned herein is, unless otherwise specified herein, preferably any one of groups represented by formulae (TEMP-42) to (TEMP-68) below.

[Formula 8]

(TEMP-42)

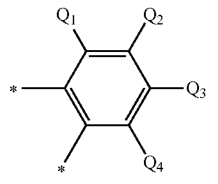

(TEMP-43)

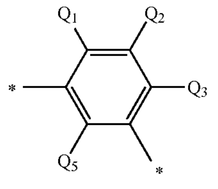

(TEMP-44)

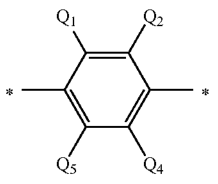

-continued (TEMP-45)

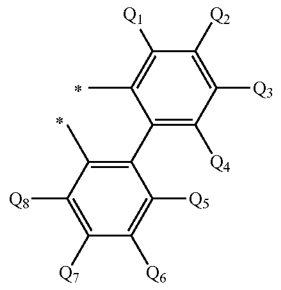

(TEMP-46)

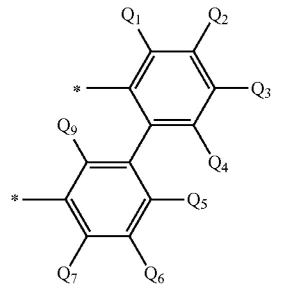

(TEMP-47)

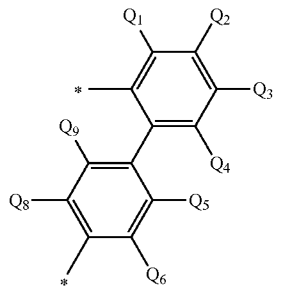

[Formula 9]

(TEMP-48)

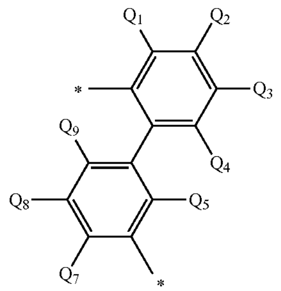

(TEMP-49)

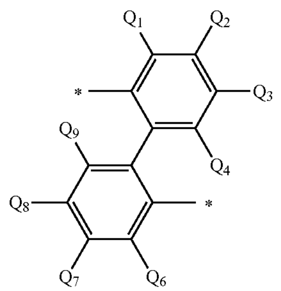

-continued (TEMP-50)

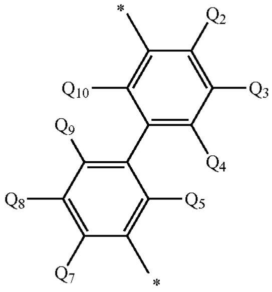

(TEMP-51)

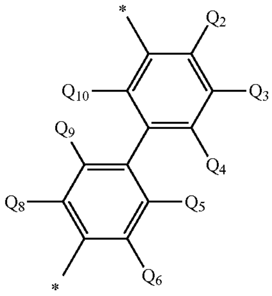

(TEMP-52)

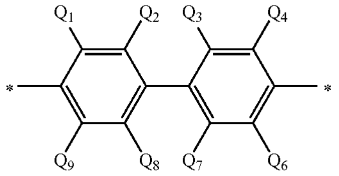

In the formulae (TEMP-42) to (TEMP-52), $Q_1$ to $Q_{10}$ are each independently a hydrogen atom or a substituent.

In the formulae (TEMP-42) to (TEMP-52), * represents a bonding position.

[Formula 10]

(TEMP-53)

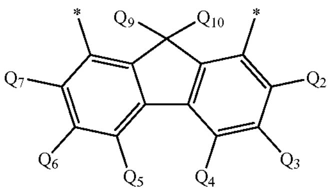

(TEMP-54)

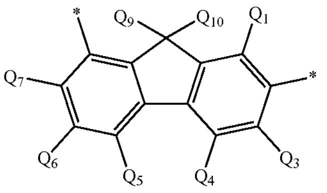

(TEMP-55)

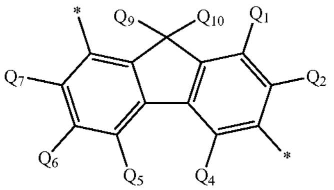

-continued (TEMP-56)

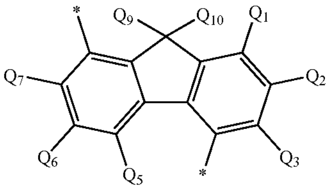

(TEMP-57)

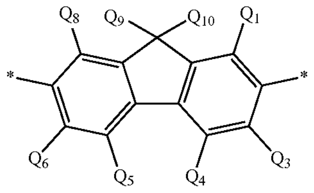

(TEMP-58)

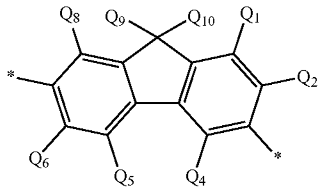

(TEMP-59)

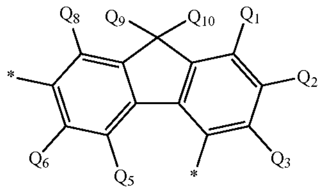

(TEMP-60)

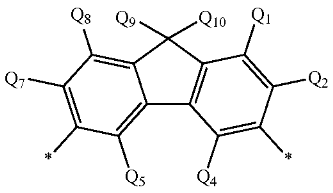

(TEMP-61)

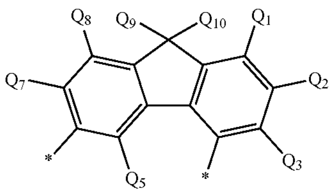

(TEMP-62)

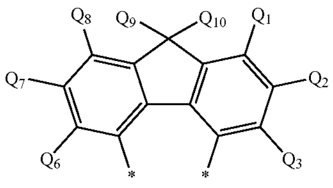

In the formulae (TEMP-53) to (TEMP-62), $Q_1$ to $Q_{10}$ are each independently a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

[Fomrula 11]

(TEMP-63)

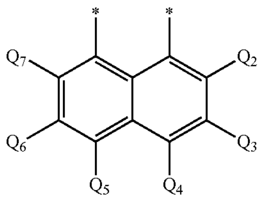

(TEMP-64)

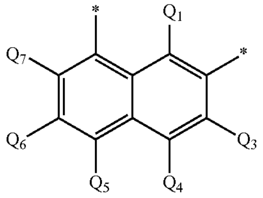

(TEMP-65)

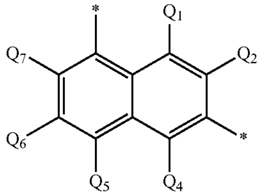

(TEMP-66)

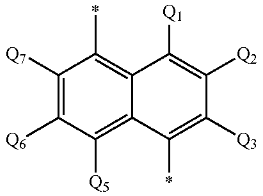

(TEMP-67)

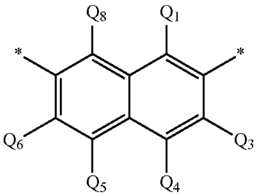

(TEMP-68)

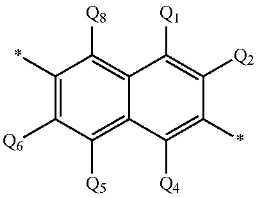

In the formulae (TEMP-63) to (TEMP-68), $Q_1$ to $Q_8$ are each independently a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

[Formula 12]

(TEMP-69)

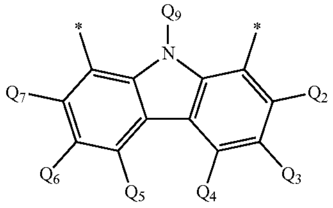

(TEMP-70)

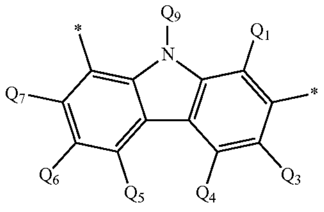

(TEMP-71)

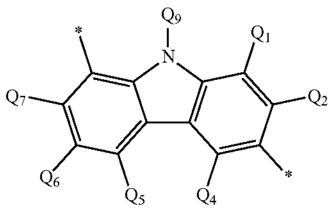

(TEMP-72)

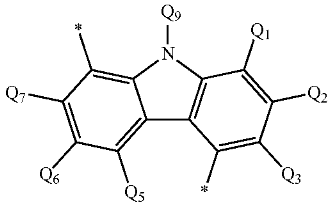

(TEMP-73)

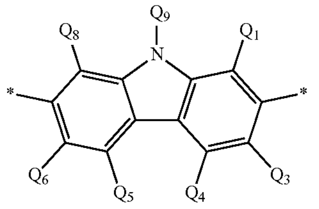

(TEMP-74)

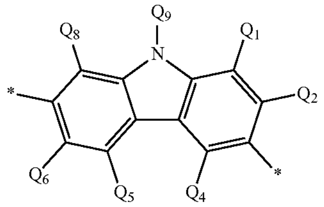

[Formula 13]

(TEMP-75)

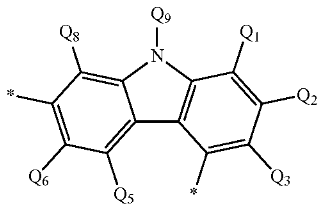

-continued
(TEMP-76)
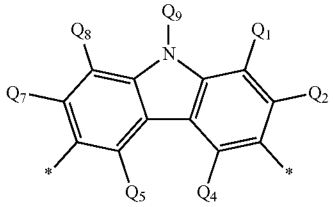
(TEMP-77)
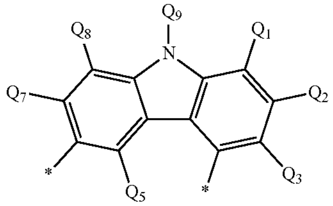
(TEMP-78)
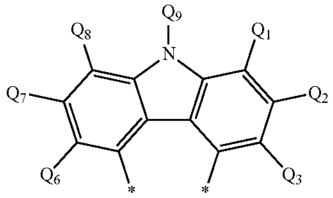
(TEMP-79)
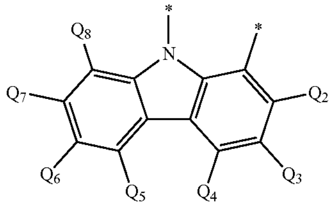
(TEMP-80)
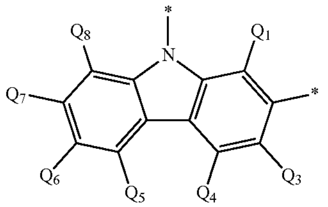
[Formula 14]
(TEMP-81)
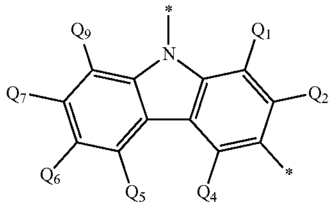
(TEMP-82)
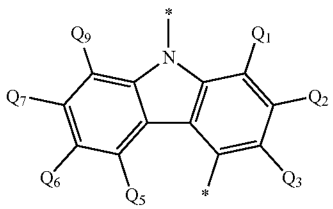
In the formulae (TEMP-69) to (TEMP-82), $Q_1$ to $Q_9$ are each independently a hydrogen atom or a substituent.
[Formula 15]
(TEMP-83)
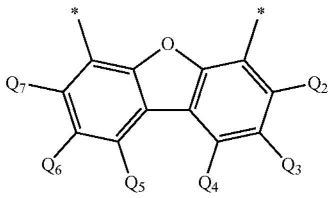
(TEMP-84)
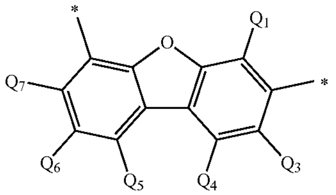
(TEMP-85)
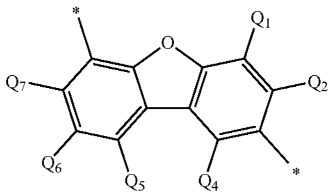
(TEMP-86)
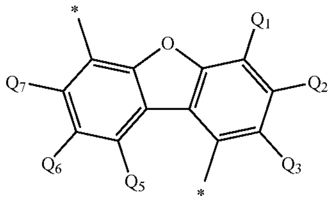
(TEMP-87)
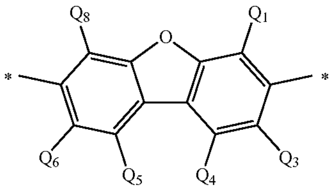
(TEMP-88)
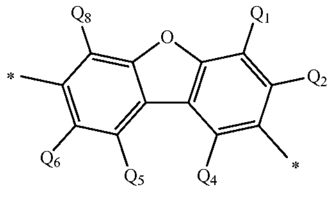
[Formula 16]
(TEMP-89)
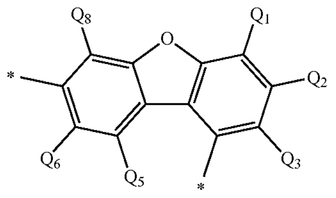

-continued (TEMP-90)

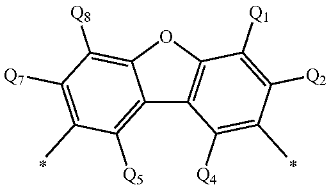

(TEMP-91)

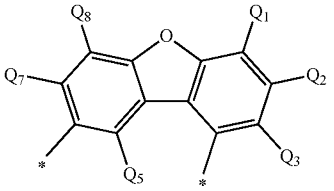

(TEMP-92)

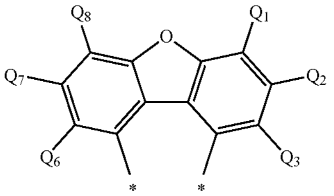

[Formula 17]

(TEMP-93)

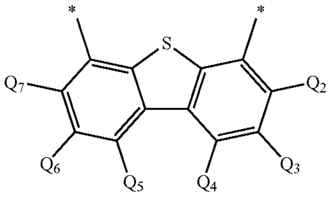

(TEMP-94)

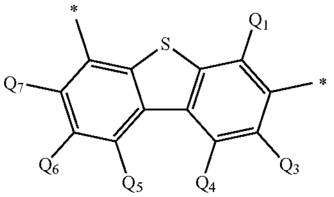

(TEMP-95)

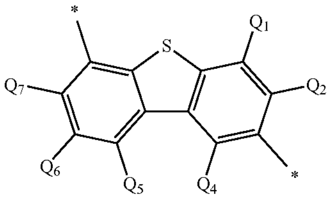

(TEMP-96)

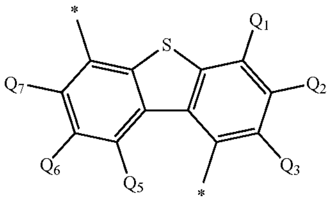

-continued (TEMP-97)

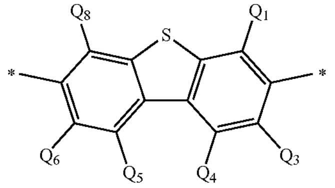

(TEMP-98)

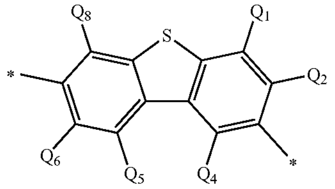

[Formula 18]

(TEMP-99)

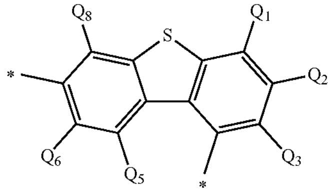

(TEMP-100)

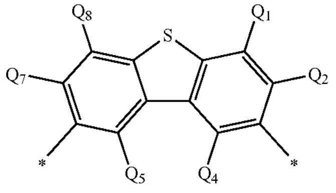

(TEMP-101)

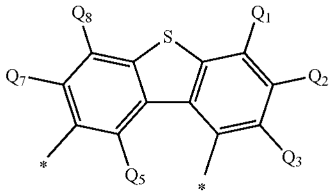

(TEMP-102)

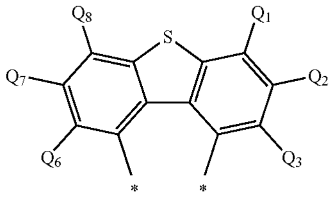

In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

[Formula 19]

(TEMP-103)

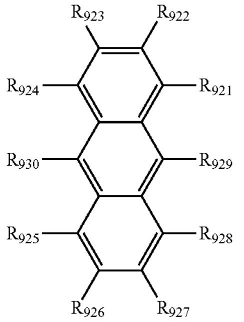

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

[Formula 20]

(TEMP-104)

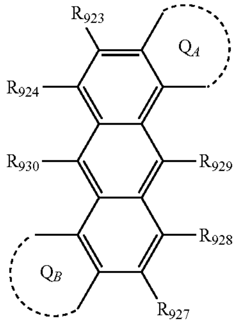

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

[Formula 21]

(TEMP-105)

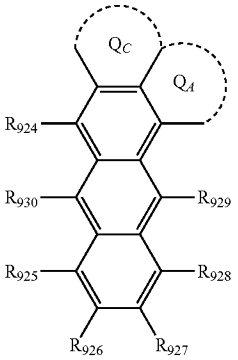

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, the substituent for the substituted or unsubstituted group (hereinafter occasionally referred to as an "optional substituent"), is for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent for the substituted or unsubstituted group is a group selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent for the substituted or unsubstituted group is a group selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

First Exemplary Embodiment

Organic Electroluminescence Device

An organic electroluminescence device according to the exemplary embodiment has a basic arrangement below.

Basic Arrangement

An organic electroluminescence device according to the exemplary embodiment includes an anode, a cathode, an emitting zone disposed between the anode and the cathode, and a first electron transporting layer disposed between the emitting zone and the cathode, in which the emitting zone includes a first emitting layer and a second emitting layer, the first emitting layer contains a first host material and a first emitting compound that emits light having a maximum peak wavelength of 500 nm or less, the second emitting layer contains a second host material and a second emitting compound that emits light having a maximum peak wavelength of 500 nm or less, the first host material and the second host material are mutually different, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1A) below, and the first electron transporting layer contains a third compound.

$$T_1(H1) > T_1(H2) \quad \text{(Numerical Formula 1A)}$$

In addition to the above basic arrangement, the organic EL device according to the exemplary embodiment further includes Element 1 or Element 2 below.

Element 1

In Element 1, a difference between an affinity value of the third compound Af(M3) and an affinity value of the host material contained in the emitting layer that is disposed closer to the cathode and is either the first emitting layer or the second emitting layer Af(HX) satisfies a relationship of a numerical formula (Numerical Formula 2A) below.

$$0 \text{ eV} \le Af(M3) - Af(HX) < 0.15 \text{ eV} \quad \text{(Numerical Formula 2A)}$$

Element 2

In Element 2, the third compound is a pyrimidine compound, and a difference between an affinity value of the third compound Af(M3) and an affinity value of the host material contained in the emitting layer that is disposed closer to the cathode and is either the first emitting layer or the second emitting layer Af(HX) satisfies a relationship of a numerical formula (Numerical Formula 2B) below.

$$0 \text{ eV} \le Af(M3) - Af(HX) < 0.22 \text{ eV} \quad \text{(Numerical Formula 2B)}$$

Hereafter, the organic EL device according to the exemplary embodiment including the aforementioned basic arrangement and either Element 1 or Element 2 will be described.

When the second emitting layer is an emitting layer disposed closer to the cathode than the first emitting layer, the numerical formula (Numerical Formula 2A) is represented by a numerical formula (Numerical Formula 21A) below.

$$0 \text{ eV} \le Af(M3) - Af(H2) < 0.15 \text{ eV} \quad \text{(Numerical Formula 21A)}$$

When the first emitting layer is an emitting layer disposed closer to the cathode than the second emitting layer, the numerical formula (Numerical Formula 2A) is represented by a numerical formula (Numerical Formula 22A) below.

$$0 \text{ eV} \le Af(M3) - Af(H1) < 0.15 \text{ eV} \quad \text{(Numerical Formula 22A)}$$

When the second emitting layer is an emitting layer disposed closer to the cathode than the first emitting layer, the numerical formula (Numerical Formula 2B) is represented by a numerical formula (Numerical Formula 21B) below.

$$0 \text{ eV} \le Af(M3) - Af(H2) < 0.22 \text{ eV} \quad \text{(Numerical Formula 21B)}$$

When the first emitting layer is an emitting layer disposed closer to the cathode than the second emitting layer, the numerical formula (Numerical Formula 2B) is represented by a numerical formula (Numerical Formula 22B) below.

$$0 \text{ eV} \le Af(M3) - Af(H1) < 0.22 \text{ eV} \quad \text{(Numerical Formula 22B)}$$

Conventionally, Triplet-Triplet-Annihilation (occasionally referred to as TTA) is known as a technique for enhancing the luminous efficiency of the organic electroluminescence device. TTA is a mechanism in which triplet excitons collide with one another to generate singlet excitons. The TTA mechanism is also referred to as a TTF mechanism. TTF stands for Triplet-Triplet Fusion.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of the conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in density thereof, whereby a reaction shown by the following formula occurs. In the formula, $^1A$ represents the ground state and $^1A^*$ represents the lowest singlet excitons.

$$^3A^* + {}^3A^* \rightarrow (4/9)\,{}^1A + (1/9)\,{}^1A^* + (13/9)\,{}^3A^*$$

In other words, $5\,^3A^* \rightarrow 4\,^1A + 1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

In the organic electroluminescence device according to the exemplary embodiment, it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

The organic electroluminescence device according to the exemplary embodiment includes at least two emitting layers satisfying a predetermined relationship (i.e., the first and second emitting layers), in which the triplet energy of the first host material $T_1(H1)$ in the first emitting layer and the triplet energy of the second host material $T_1(H2)$ in the second emitting layer satisfy the relationship of the numerical formula (Numerical Formula 1A).

By including the first emitting layer and the second emitting layer so as to satisfy the relationship of the numerical formula (Numerical Formula 1A), triplet excitons generated in the first emitting layer transfer to the second emitting layer without being quenched by excessive carriers and are inhibited from back-transferring from the second emitting layer to the first emitting layer. Consequently, the second emitting layer exhibits the TTF mechanism to effectively generate singlet excitons, thereby improving the luminous efficiency.

Accordingly, the organic electroluminescence device includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

In the organic EL device according to the exemplary embodiment, the triplet energy of the first host material $T_1(H1)$ and the triplet energy of the second host material $T_1(H2)$ preferably satisfy a relationship of a numerical formula (Numerical Formula 1B) below.

$$T_1(H1) - T_1(H2) > 0.03\ \text{eV} \qquad \text{(Numerical Formula 1B)}$$

In the organic EL device according to the exemplary embodiment, the difference between the affinity value of the third compound Af(M3) and the affinity value of the host material contained in the emitting layer that is disposed closer to the cathode and is either the first emitting layer or the second emitting layer (occasionally referred to as the cathode side emitting layer) Af(HX) satisfies the upper limit relationship of the numerical formula (Numerical Formula 2A) or (Numerical Formula 2B), thereby making it difficult for the charge to accumulate at an interface between the cathode side emitting layer and the first electron transporting layer. The accumulation of the charge at the interface between the cathode side emitting layer and the first electron transporting layer could cause excitons in the cathode side emitting layer to be deactivated leading to a decrease in the performances of the device. The satisfaction of the lower limit relationship of the numerical formula (Numerical Formula 2A) or (Numerical Formula 2B) can reduce an energy barrier at the interface between the first electron transporting layer and the layer disposed closer to the cathode and contacting the first electron transporting layer, so that an increase in the drive voltage can be inhibited.

The organic EL device according to the exemplary embodiment enables the charge to hardly accumulate at the interface between the cathode side emitting layer and the first electron transporting layer, thus inhibiting the decrease in the performances of the device. The organic EL device satisfying both the relationship of the numerical formula (Numerical Formula 1A) and the relationship of the numerical formula (Numerical Formula 2A) or (Numerical Formula 2B) exhibits multiple excellent performances in a balanced manner.

Layer Structure of Organic EL Device

In addition to the first emitting layer, the second emitting layer, and the first electron transporting layer, the organic EL device according to the exemplary embodiment may include one or more organic layers. Examples of the organic layer include at least one layer selected from the group consisting of a hole injecting layer, a hole transporting layer, an emitting layer, an electron injecting layer, an electron transporting layer, a hole blocking layer, and an electron blocking layer.

The organic layers of the organic EL device according to the exemplary embodiment may consist of the first emitting layer, the second emitting layer, and the first electron transporting layer. Alternatively, the organic EL device according to the exemplary embodiment may further include, for instance, at least one layer selected from the group consisting of a hole injecting layer, a hole transporting layer, an electron injecting layer, an electron transporting layer, a hole blocking layer, and an electron blocking layer.

In the organic EL device of the exemplary embodiment, the first emitting layer is also preferably disposed between the anode and the second emitting layer.

In the organic EL device of the exemplary embodiment, the second emitting layer is also preferably disposed between the anode and the first emitting layer.

In the organic EL device of the exemplary embodiment, either the first emitting layer or the second emitting layer is preferably a layer disposed closest to the cathode among a plurality of layers included in the emitting zone.

In the organic EL device according to the exemplary embodiment, the anode, the first emitting layer, the second emitting layer, and the cathode may be provided in this order. Alternatively, the order of including the first emitting layer and the second emitting layer may be reverse. That is, the anode, the second emitting layer, the first emitting layer, and the cathode may be provided in this order. Irrespective of the laying order of the first and second emitting layers, the effects resulting from layering the first emitting layer and the second emitting layer can be expected by selecting a combination of materials satisfying the relationship of the numerical formula (Numerical Formula 1A).

FIG. 1 schematically depicts an exemplary arrangement of the organic EL device according to the exemplary embodiment.

An organic EL device 1 includes a light-transmissive substrate 2, an anode 3, a cathode 4, and organic layers 10 provided between the anode 3 and the cathode 4. The organic layers 10 include a hole injecting layer 61, a hole transporting layer 62, a first emitting layer 51, a second emitting layer 52, a first electron transporting layer 71, a second electron transporting layer 72 and an electron injecting layer 73 that are layered in this order from the side where the anode 3 is provided. An emitting zone 5 of the organic EL device 1 includes the first emitting layer 51, which is disposed closer to the anode 3, and the second emitting layer 52, which is disposed closer to the cathode 4.

Figure 2:
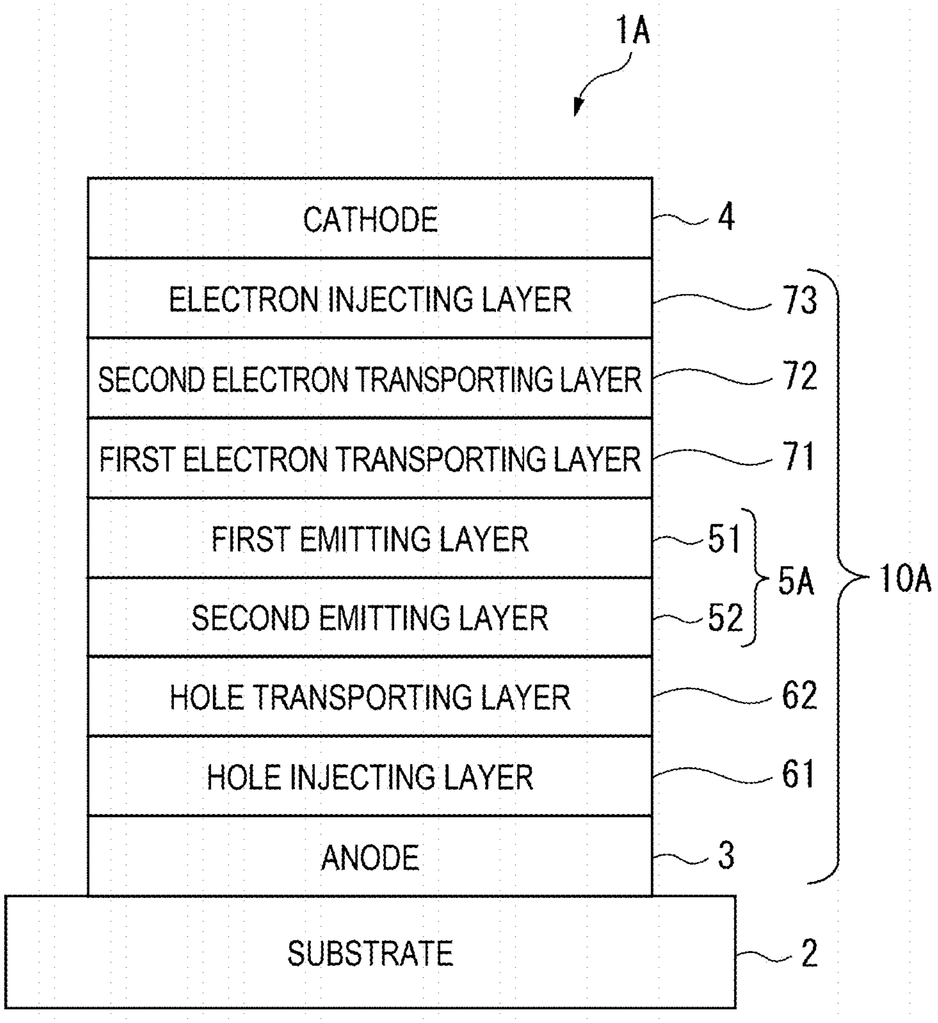
FIG. 2 schematically depicts another exemplary arrangement of an organic electroluminescence device according to an exemplary embodiment of the invention.

FIG. 2 schematically depicts another exemplary arrangement of the organic EL device according to the exemplary embodiment.

An organic EL device 1A includes a light-transmissive substrate 2, an anode 3, a cathode 4, and organic layers 10A provided between the anode 3 and the cathode 4. The organic layers 10A include a hole injecting layer 61, a hole transporting layer 62, a second emitting layer 52, a first emitting layer 51, a first electron transporting layer 71, a second electron transporting layer 72 and an electron injecting layer 73 that are layered in this order from the side where the anode 3 is provided. An emitting zone 5A of the organic EL device 1A includes the second emitting layer 52, which is disposed closer to the anode 3, and the first emitting layer 51, which is disposed closer to the cathode 4.

The invention is not limited to the exemplary arrangements of the organic EL device depicted in FIGS. 1 and 2.

The arrangement of the organic EL device of the exemplary embodiment will be further described below. It should be noted that the reference numerals are occasionally omitted below.

Electron Transporting Layer

The organic EL device of the exemplary embodiment preferably includes, as an additional electron transporting layer, at least one of a second electron transporting layer or a third electron transporting layer, in addition to the first electron transporting layer.

In the organic EL device of the exemplary embodiment, the second electron transporting layer is preferably disposed between the first electron transporting layer and the cathode. The second electron transporting layer preferably contains a fourth compound.

The second electron transporting layer preferably further contains a fifth compound. That is, the second electron transporting layer preferably contains the fourth compound and the fifth compound. An affinity value of the fifth compound Af(M5) is preferably more than an affinity value of the fourth compound Af(M4). The affinity value of the fifth compound Af(M5) and the affinity value of the fourth compound Af(M4) preferably satisfy a relationship of a numerical formula (Numerical Formula 23B) below.

$$Af(M5) > Af(M4) \quad \text{(Numerical Formula 23B)}$$

In an exemplary embodiment, a value given by subtracting the affinity value of the fourth compound Af(M4) from the affinity value of the fifth compound Af(M5) is in a range from 0.05 to 0.40, in a range from 0.15 to 0.40, in a range from 0.20 to 0.40, or in a range from 0.30 to 0.40.

In the organic EL device of the exemplary embodiment, the first electron transporting layer is preferably in direct contact with the second electron transporting layer.

In the organic EL device of the exemplary embodiment, the first electron transporting layer is preferably in direct contact with the first emitting layer or the second emitting layer in the emitting zone.

In the organic EL device of the exemplary embodiment, when the first emitting layer and the second emitting layer are disposed in this order from the side where the anode is provided, the second emitting layer and the first electron transporting layer are preferably in direct contact with each other.

In the organic EL device of the exemplary embodiment, when the second emitting layer and first emitting layer are disposed in this order from the side where the anode is provided, the first emitting layer and the first electron transporting layer are preferably in direct contact with each other.

In the organic EL device of the exemplary embodiment, the third electron transporting layer may be disposed between the first electron transporting layer and the emitting layers. In this case, the third electron transporting layer is preferably in direct contact with the emitting layer that is disposed closer to the cathode and is either the first emitting layer or the second emitting layer.

When the organic EL device according to the exemplary embodiment includes a plurality of electron transporting layers, one, which is provided closer to the emitting layers, of the plurality of electron transporting layers is sometimes referred to as the hole blocking layer.

Third Compound

In the organic EL device of the exemplary embodiment, the third compound is contained in the first electron transporting layer. In the organic EL device according to the exemplary embodiment, the third compound is preferably a compound represented by a formula (3) below.

[Formula 22]

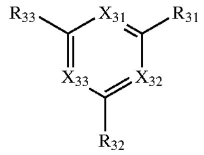

(3)

In the formula (3):

$X_{31}$ to $X_{33}$ are each independently $CR_{34}$ or a nitrogen atom;

$R_{34}$ is a hydrogen atom or a substituent $R_{30}$;

at least two of $X_{31}$ to $X_{33}$ are each a nitrogen atom;

when two or more $R_{34}$ are present, the two or more $R_{34}$ are mutually the same or different;

$R_{31}$ to $R_{33}$ are each independently a hydrogen atom, or a substituent $R_{30}$; and the substituent $R_{30}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

when two or more substituents $R_{30}$ are present, the two or more substituents $R_{30}$ are mutually the same or different;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the organic EL device of the exemplary embodiment, the third compound is also preferably a compound represented by a formula (31) below.

[Formula 23]

(31)

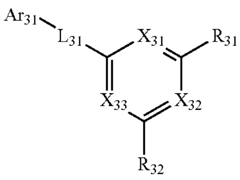

In the formula (31):

$X_{31}$ to $X_{33}$, $R_{31}$ and $R_{32}$ are defined as in the formula (3);

$L_{31}$ is a single bond, a substituted or unsubstituted arylene group having 6 to 50 ring carbon atoms, or a substituted or unsubstituted divalent heterocyclic group having 5 to 50 ring atoms; and $Ar_{31}$ is a substituted or unsubstituted aryl group having 6 to 50 ring carbon atoms, or a substituted or unsubstituted heterocyclic group having 5 to 50 ring atoms.

In the organic EL device of the exemplary embodiment, $L_{31}$ of the third compound is also preferably a divalent group formed by bonding two or more groups selected from the group consisting of a substituted or unsubstituted arylene group having 6 to 50 ring carbon atoms and a substituted or unsubstituted divalent heterocyclic group having 5 to 50 ring atoms.

In the organic EL device of the exemplary embodiment, $Ar_{31}$ of the third compound is preferably a group represented by a formula (32) below.

[Formula 24]

(32)

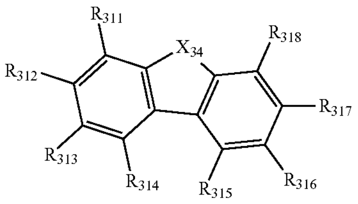

In the formula (32):

$X_{34}$ is an oxygen atom, a sulfur atom, N($R_{321}$) or C($R_{322}$)($R_{323}$);

one of $R_{311}$ to $R_{318}$ and $R_{321}$ to $R_{323}$ is a single bond with $L_{31}$;

at least one combination of adjacent two or more of $R_{311}$ to $R_{318}$ not being the single bond with $L_{31}$ are mutually bonded to form a substituted or unsubstituted monocyclic ring, mutually bonded to form a substituted or unsubstituted fused ring, or not mutually bonded;

a combination of $R_{322}$ and $R_{323}$ not being the single bond with $L_{31}$ are mutually bonded to form a substituted or unsubstituted monocyclic ring, mutually bonded to form a substituted or unsubstituted fused ring, or not mutually bonded;

$R_{311}$ to $R_{318}$ not being the single bond with $L_{31}$ and forming neither the substituted or unsubstituted monocyclic ring nor the substituted or unsubstituted fused ring, $R_{321}$, $R_{322}$ and $R_{323}$ not being the single bond with $L_{31}$ and forming neither the substituted or unsubstituted monocyclic ring nor the substituted or unsubstituted fused ring are each independently a hydrogen atom, or a substituent $R_{30}$; and the substituent $R_{30}$ is defined as in the formula (3).

In the organic EL device of the exemplary embodiment, $X_{34}$ of the third compound is preferably N($R_{321}$).

In the organic EL device of the exemplary embodiment, the third compound is also preferably a compound represented by a formula (33) below.

[Formula 25]

(33)

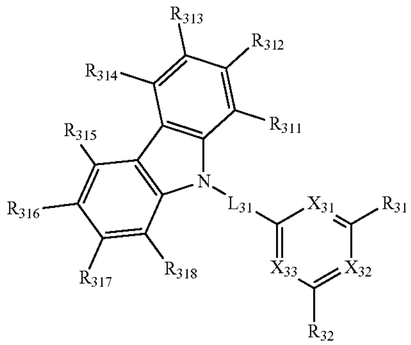

In the formula (33):

$X_{31}$ to $X_{33}$, $R_{31}$ and $R_{32}$ are each defined as in the formula (3);

$L_{31}$ is defined as in the formula (31); and $R_{311}$ to $R_{318}$ are each defined as in the formula (32).

In the organic EL device according to the exemplary embodiment, $L_{31}$ of the third compound is preferably a single bond, or an unsubstituted arylene group having 6 to 50 ring carbon atoms;

the substituent $R_{30}$ is preferably an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, a group represented by —Si($R_{911}$)($R_{912}$)($R_{913}$), a group represented by —O—($R_{914}$), a group represented by —S—($R_{915}$), a group represented by —N($R_{916}$)($R_{917}$), a halogen atom, a cyano group, a nitro group, or an unsubstituted aryl group having 6 to 50 ring carbon atoms; and $R_{911}$ to $R_{917}$ are preferably each independently a hydrogen atom, an unsubstituted alkyl group having 1 to 50 carbon atoms, an unsubstituted cycloalkyl group having 3 to 50 ring carbon atoms, or an unsubstituted aryl group having 6 to 50 ring carbon atoms.

In the organic EL device of the exemplary embodiment, it is also preferable that two of $X_{31}$ to $X_{33}$ of the third compound are each a nitrogen atom and a remaining one of $X_{31}$ to $X_{33}$ of the third compound is $CR_{34}$.

In the organic EL device of the exemplary embodiment, it is also preferable that $X_{31}$ and $X_{32}$ are nitrogen atoms and $X_{33}$ is $CR_{34}$.

In the organic EL device of the exemplary embodiment, it is also preferable that $X_{31}$ and $X_{33}$ are nitrogen atoms and $X_{32}$ is $CR_{34}$.

In the organic EL device of the exemplary embodiment, it is also preferable that $X_{32}$ and $X_{33}$ are nitrogen atoms and $X_{31}$ is $CR_{34}$.

In the organic EL device of the exemplary embodiment, it is also preferable that $R_{311}$ to $R_{318}$ of the third compound are hydrogen atoms.

In the organic EL device according to the exemplary embodiment, it is also preferable that the affinity value of the third compound Af(M3) is 2.45 eV or less, 2.35 eV or less, or 2.30 eV or less.

In the organic EL device according to the exemplary embodiment, it is also preferable that the affinity value of the third compound Af(M3) is 2.05 eV or more, 2.10 eV or more, or 2.15 eV or more.

The substituent for "the substituted or unsubstituted" group in the third compound is also preferably a group selected from the group consisting of an alkyl group having 1 to 18 carbon atoms, an aryl group having 6 to 18 ring carbon atoms and a heterocyclic group having 5 to 18 ring atoms.

The substituent for "the substituted or unsubstituted" group in the third compound is also preferably an alkyl group having 1 to 5 carbon atoms.

The groups specified to be "substituted or unsubstituted" in the third compound are each also preferably an "unsubstituted" group.

Method of Producing Third Compound

The third compound can be produced by a known method. The third compound can also be produced based on a known method through a known alternative reaction using a known material(s) tailored for the target compound.

Specific Examples of Third Compound

Specific examples of the third compound include the following compounds. It should however be noted that the invention is not limited to the specific examples of the third compound. In the specific examples of the compound, Af annexed to each compound indicates an affinity value of each compound, and the unit of the affinity value is eV.

[Formula 26]

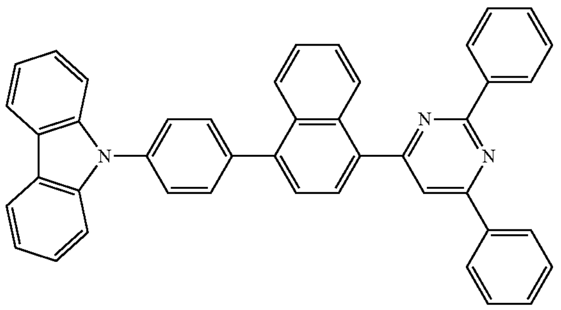

(Af = 2.20)

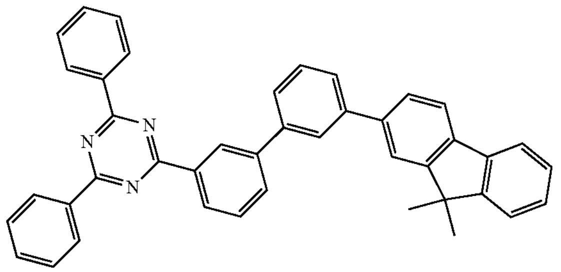

(Af = 2.35)

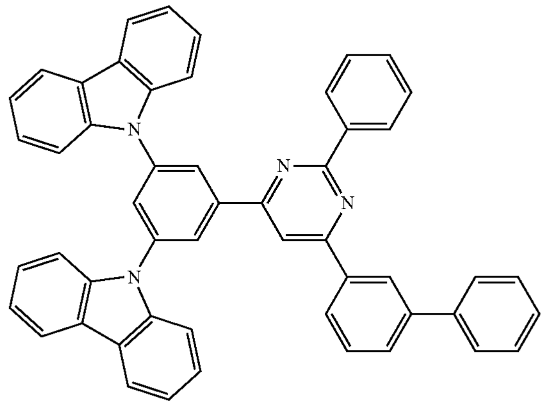

(Af = 2.32)

-continued
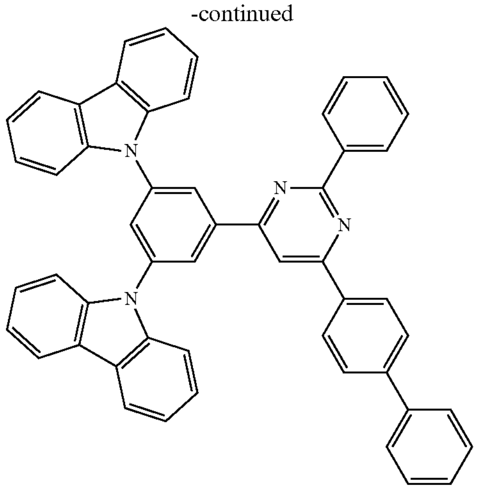
(Af = 2.33)
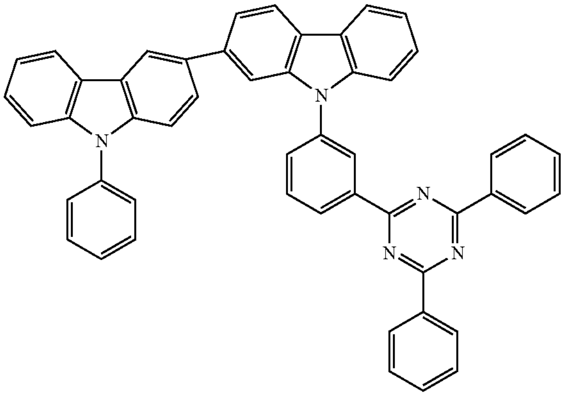
(Af = 2.41)
[Formula 27]
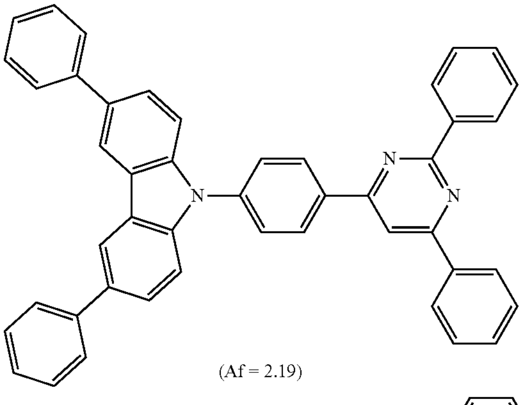
(Af = 2.19)
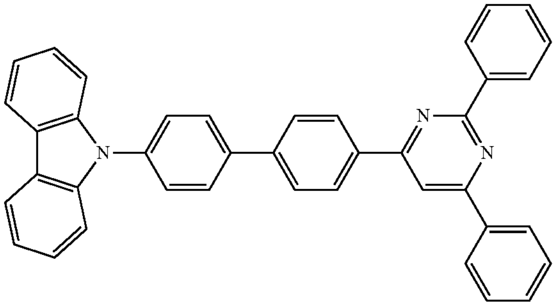
(Af = 2.22)
-continued
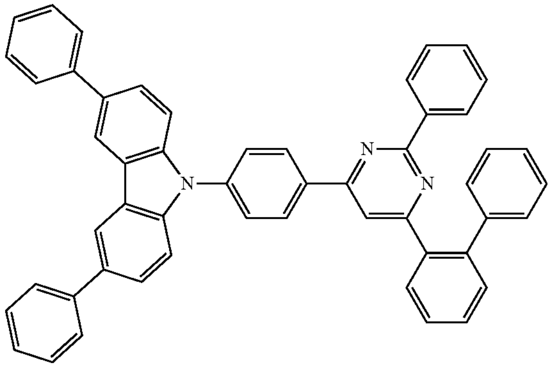
(Af = 2.15)
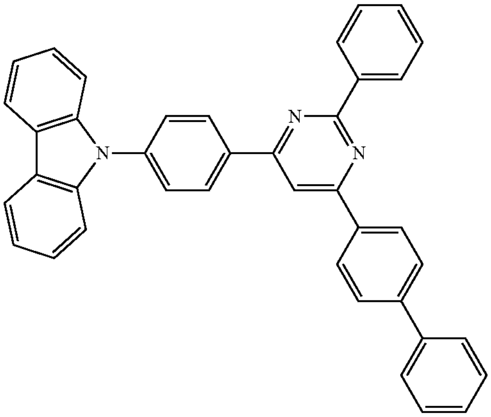
(Af = 2.22)
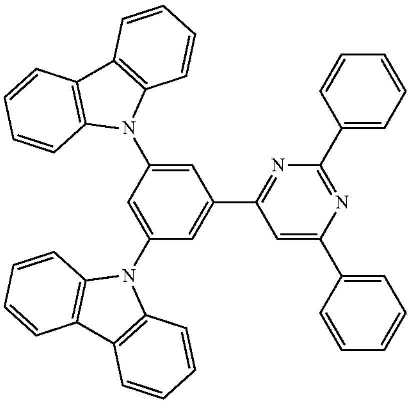
(Af = 2.29)

-continued
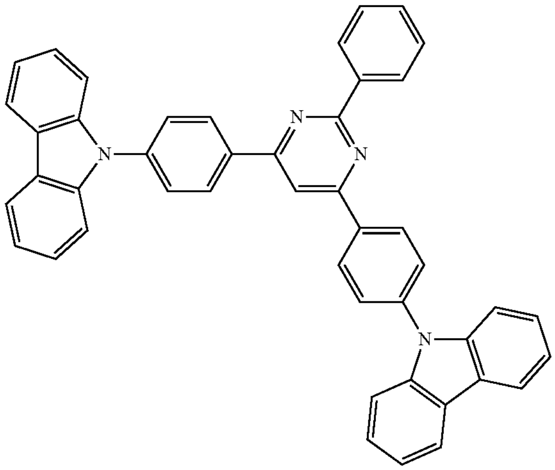
(Af = 2.25)
[Formula 28]
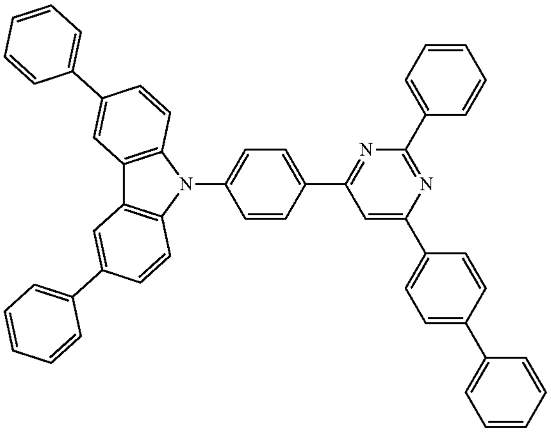
(Af = 2.23)
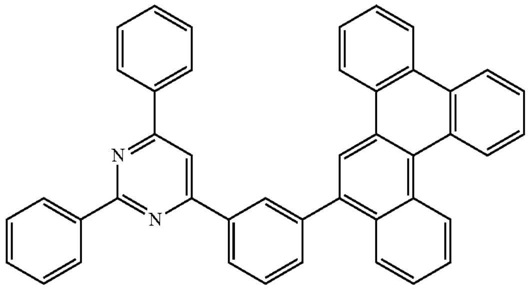
(Af = 2.15)
-continued
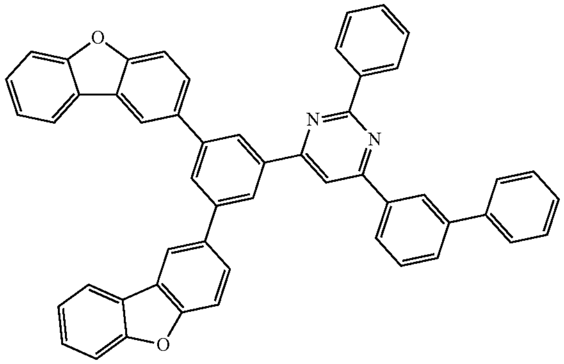
(Af = 2.17)
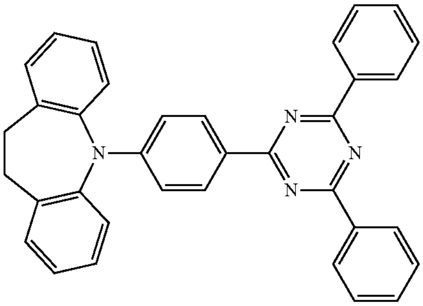
(Af = 2.21)
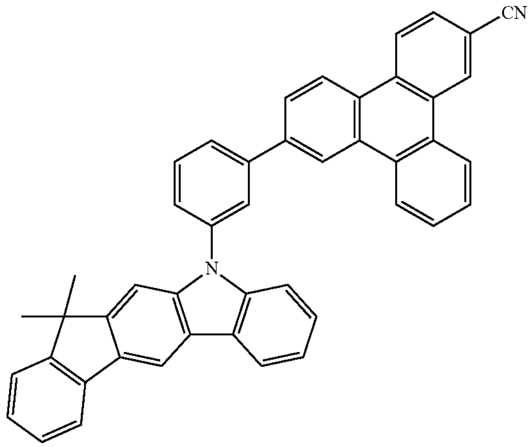
(Af = 2.13)
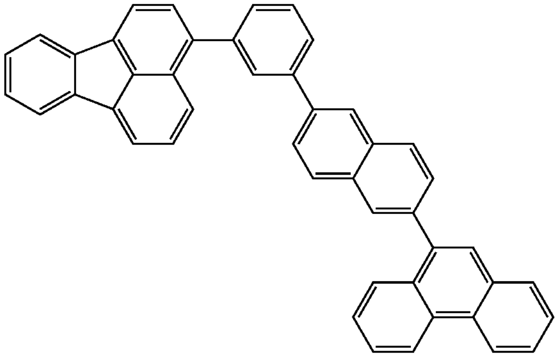
(Af = 2.26)

-continued
[Formula 29]
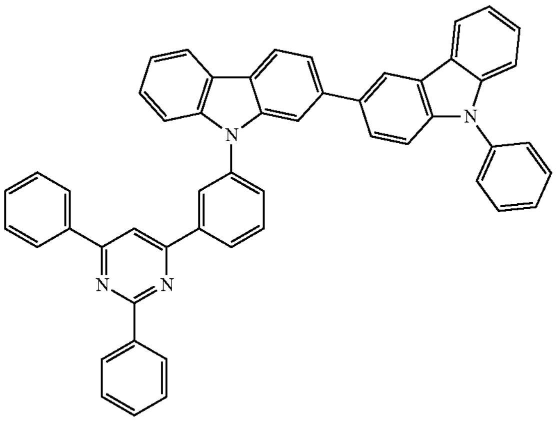
(Af = 2.2)
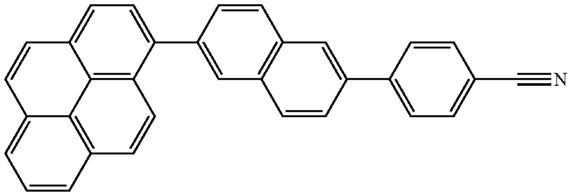
(Af = 2.10)
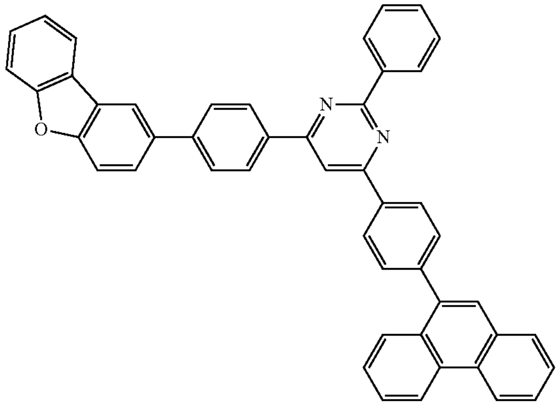
(Af = 2.2)
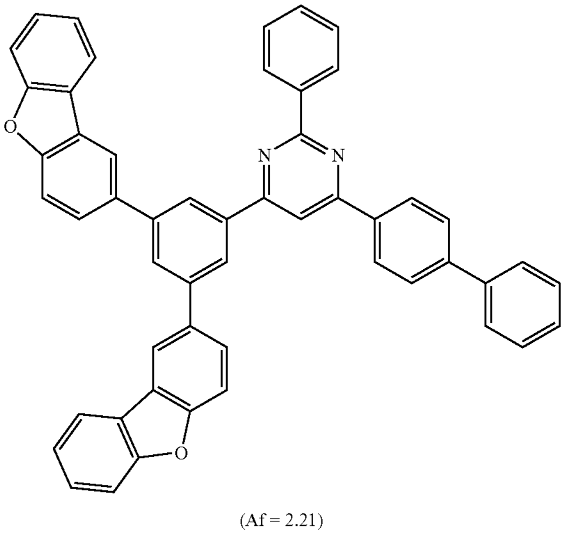
(Af = 2.21)
-continued
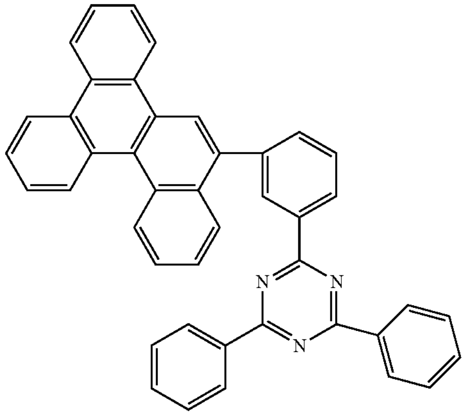
(Af = 2.27)
[Formula 30]
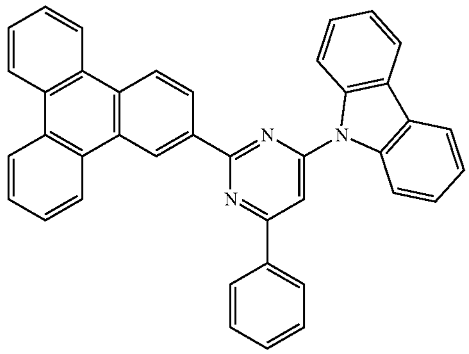
(Af = 2.17)
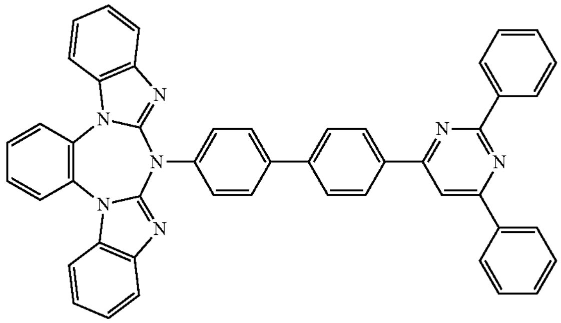
(Af = 2.19)
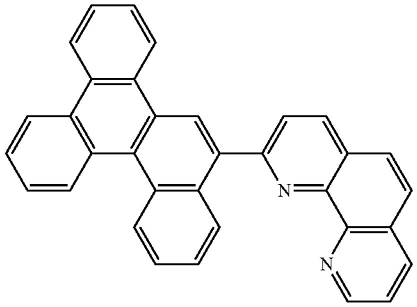
(Af = 2.14)

-continued

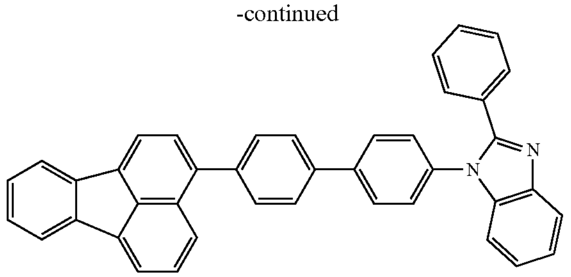

(Af = 2.29)

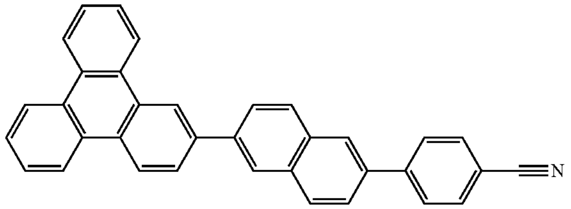

(Af = 2.11)

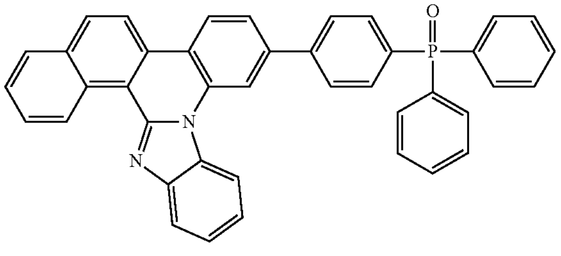

(Af = 2.13)

Fourth Compound

In the organic EL device of the exemplary embodiment, the fourth compound is contained in the second electron transporting layer. In the organic EL device of the exemplary embodiment, the fourth compound is preferably at least one compound selected from the group consisting of a compound represented by a formula (E41) below, a compound represented by a formula (E42) below, a compound represented by a formula (E43) below, a compound represented by a formula (E44) below and a phosphine oxide compound.

It is preferable that the third compound in the first electron transporting layer and the fourth compound in the second electron transporting layer are mutually different compounds.

[Formula 31]

(E41)

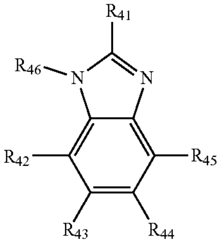

In the formula (E41):

at least one combination of adjacent two or more of $R_{41}$ to $R_{46}$ are mutually bonded to form a substituted or unsubstituted monocyclic ring, mutually bonded to form a substituted or unsubstituted fused ring, or not mutually bonded;

$R_{41}$ to $R_{46}$ forming neither the substituted or unsubstituted monocyclic ring nor the substituted or unsubstituted fused ring are each independently a hydrogen atom, or a substituent $R_{40}$;

the substituent $R_{40}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{40}$ are present, the two or more substituents $R_{40}$ are mutually the same or different.

[Formula 32]

(E42)

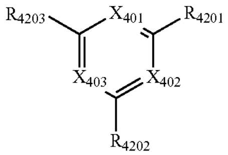

In the formula (E42):

$X_{401}$ to $X_{403}$ are each independently $CR_{4204}$ or a nitrogen atom;

$R_{4204}$ is a hydrogen atom or a substituent $R_{4200}$;

at least one of $X_{401}$ to $X_{403}$ is a nitrogen atom;

when two or more $R_{4204}$ are present, the two or more $R_{4204}$ are mutually the same or different;

$R_{4201}$ to $R_{4203}$ are each independently a hydrogen atom, or a substituent $R_{4200}$;

the substituent $R_{4200}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4200}$ are present, the two or more substituents $R_{4200}$ are mutually the same or different.

[Formula 33]

(E43)

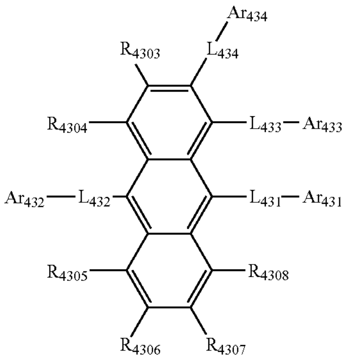

In the formula (E43):

at least one combination of adjacent two or more of $R_{4303}$ to $R_{4308}$ are mutually bonded to form a substituted or unsubstituted monocyclic ring, mutually bonded to form a substituted or unsubstituted fused ring, or not mutually bonded;

$R_{4303}$ to $R_{4308}$ forming neither the substituted or unsubstituted monocyclic ring nor the substituted or unsubstituted fused ring are each independently a hydrogen atom, or a substituent $R_{4300}$;

$L_{431}$ to $L_{434}$ are each independently a single bond, a substituted or unsubstituted arylene group having 6 to 50 ring carbon atoms, or a substituted or unsubstituted divalent heterocyclic group having 5 to 50 ring atoms;

$Ar_{431}$ to $Ar_{434}$ are each independently a hydrogen atom, a substituted or unsubstituted aryl group having 6 to 50 ring carbon atoms, or a substituted or unsubstituted heterocyclic group having 5 to 50 ring atoms;

at least one of $Ar_{431}$ to $Ar_{434}$ is a substituted or unsubstituted heterocyclic group having 5 to 50 ring atoms, and at least one heterocyclic group of $Ar_{431}$ to $Ar_{434}$ is a monovalent nitrogen-containing heterocyclic group;

the substituent $R_{4300}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4300}$ are present, the two or more substituents $R_{4300}$ are mutually the same or different.

[Formula 34]

(E44)

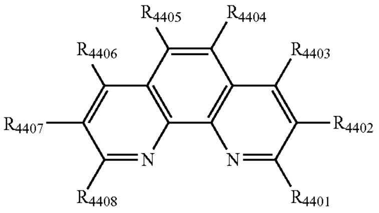

In the formula (E44):

at least one combination of adjacent two or more of $R_{4401}$ to $R_{4408}$ are mutually bonded to form a substituted or unsubstituted monocyclic ring, mutually bonded to form a substituted or unsubstituted fused ring, or not mutually bonded;

$R_{4401}$ to $R_{4408}$ forming neither the substituted or unsubstituted monocyclic ring nor the substituted or unsubstituted fused ring are each independently a hydrogen atom, or a substituent $R_{4400}$;

the substituent $R_{4400}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4400}$ are present, the two or more substituents $R_{4400}$ are mutually the same or different.

In the forth compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the organic EL device of the exemplary embodiment, the fourth compound is also preferably a compound represented by a formula (E411) or a formula (E412) below.

[Formula 35]

(E411)

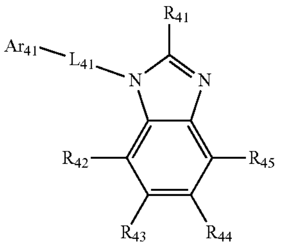

(E412)

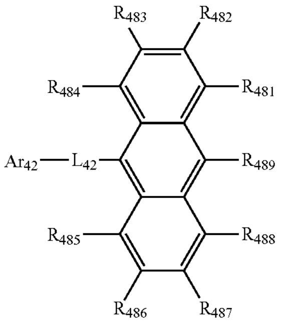

In the formula (E411):

$R_{41}$ to $R_{45}$ are defined as in the formula (E41);

$L_{41}$ is a single bond, a substituted or unsubstituted arylene group having 6 to 50 ring carbon atoms, or a substituted or unsubstituted divalent heterocyclic group having 5 to 50 ring atoms; and $Ar_{41}$ is a group represented by the formula (E412).

In the formula (E412):

one of $R_{481}$ to $R_{489}$ is a single bond with $L_{41}$;

at least one combination of adjacent two or more of $R_{481}$ to $R_{489}$ not being the single bond with $L_{41}$ are mutually bonded to form a substituted or unsubstituted monocyclic ring, mutually bonded to form a substituted or unsubstituted fused ring, or not mutually bonded;

$R_{481}$ to $R_{489}$ not being the single bond with $L_{41}$ and forming neither the substituted or unsubstituted monocyclic ring nor the substituted or unsubstituted fused ring are each independently a hydrogen atom, or a substituent $R_{480}$, $L_{42}$ are each independently a single bond, a substituted or unsubstituted arylene group having 6 to 50 ring carbon atoms, or a substituted or unsubstituted divalent heterocyclic group having 5 to 50 ring atoms;

$Ar_{42}$ are each independently a substituted or unsubstituted aryl group having 6 to 50 ring carbon atoms, or a substituted or unsubstituted heterocyclic group having 5 to 50 ring atoms;

the substituent $R_{480}$ represents the same as $R_{40}$ in the formula (E41); and when two or more substituents $R_{480}$ are present, the two or more substituents $R_{480}$ are mutually the same or different.

In the organic EL device of the exemplary embodiment, the fourth compound is also preferably a compound represented by a formula (E413) below.

[Formula 36]

(E413)

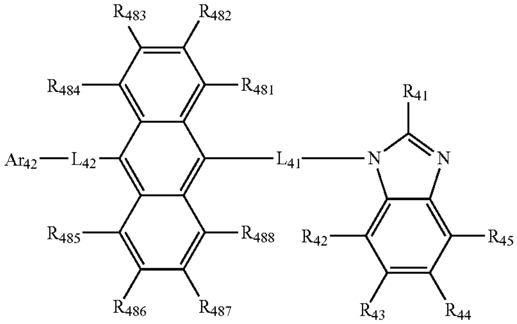

In the formula (E413):

$R_{41}$ to $R_{45}$ are defined as in the formula (E41);

$L_{41}$ is defined as in the formula (E411); and $R_{481}$ to $R_{488}$, $L_{42}$ and $Ar_{42}$ are each defined as in the formula (E412).

In the organic EL device of the exemplary embodiment, the fourth compound is also preferably a compound represented by a formula (E421) below.

[Formula 37]

(E421)

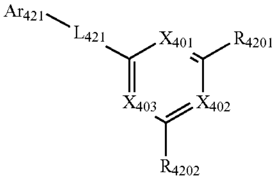

In the formula (E421):

$X_{401}$ to $X_{403}$, $R_{4201}$ and $R_{4202}$ are defined as in the formula (E42);

$L_{421}$ is a single bond, a substituted or unsubstituted arylene group having 6 to 50 ring carbon atoms, or a substituted or unsubstituted divalent heterocyclic group having 5 to 50 ring atoms; and $Ar_{421}$ is a substituted or unsubstituted aryl group having 6 to 50 ring carbon atoms, or a substituted or unsubstituted heterocyclic group having 5 to 50 ring atoms.

In the organic EL device of the exemplary embodiment, the fourth compound is also preferably a compound represented by a formula (E422) or a formula (E423) below.

[Formula 38]

(E422)

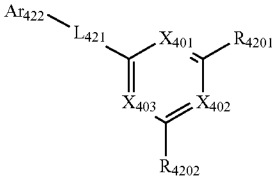

-continued (E423)

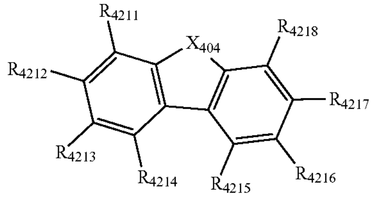

In the formula (E422):

$X_{401}$ to $X_{403}$, $R_{4201}$ and $R_{4202}$ are each defined as in the formula (E42);

$L_{421}$ is defined as in the formula (E421); and $Ar_{422}$ is a group represented by the formula (E423).

In the formula (E423):

$X_{404}$ is an oxygen atom, a sulfur atom, $N(R_{4221})$ or $C(R_{4222})(R_{4223})$;

one of $R_{4211}$ to $R_{4218}$ and $R_{4221}$ to $R_{4223}$ is a single bond with $L_{421}$;

at least one combination of adjacent two or more of $R_{4211}$ to $R_{4218}$ not being the single bond with $L_{421}$ are mutually bonded to form a substituted or unsubstituted monocyclic ring, mutually bonded to form a substituted or unsubstituted fused ring, or not mutually bonded;

a combination of $R_{4222}$ and $R_{4223}$ not being the single bond with $L_{421}$ are mutually bonded to form a substituted or unsubstituted monocyclic ring, mutually bonded to form a substituted or unsubstituted fused ring, or not mutually bonded;

$R_{4211}$ to $R_{4218}$ not being the single bond with $L_{421}$ and forming neither the substituted or unsubstituted monocyclic ring nor the substituted or unsubstituted fused ring, $R_{4221}$, and $R_{4222}$ and $R_{4223}$ not being the single bond with $L_{421}$ and forming neither the substituted or unsubstituted monocyclic ring nor the substituted or unsubstituted fused ring are each independently a hydrogen atom, or a substituent $R_{4200}$; and the substituent $R_{4200}$ is defined as in the formula (E42).

In the organic EL device of the exemplary embodiment, the fourth compound is also preferably a compound represented by a formula (E431) below.

[Formula 39]

(E431)

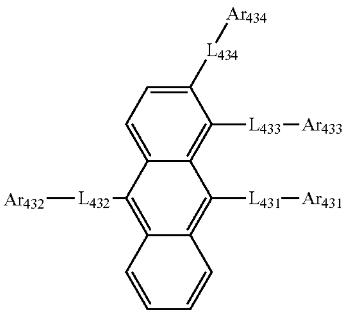

In the formula (E431), $L_{431}$ to $L_{434}$ and $Ar_{431}$ to $Ar_{434}$ are each defined as in the formula (E43).

In the organic EL device of the exemplary embodiment, the fourth compound is also preferably a compound represented by a formula (E432) below.

[Formula 40]

(E432)

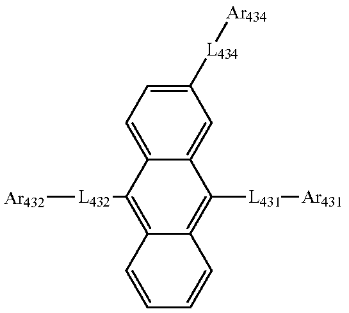

In the formula (E432), $L_{431}$, $L_{432}$, $L_{434}$, $Ar_{431}$, $Ar_{432}$, and $Ar_{434}$ are each defined as in the formula (E43).

In the organic EL device of the exemplary embodiment, the fourth compound is also preferably a compound represented by a formula (E441) below.

[Formula 41]

(E441)

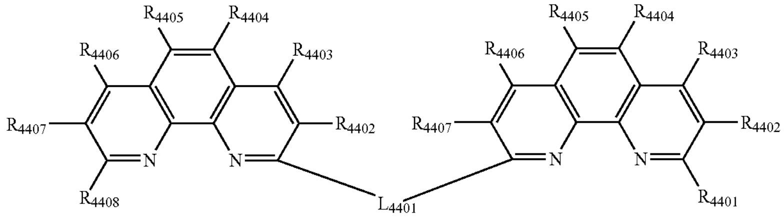

In the formula (E441):

$R_{4401}$ to $R_{4408}$ are each independently defined as in the formula (E44);

$L_{4401}$ is a single bond, a substituted or unsubstituted arylene group having 6 to 50 ring carbon atoms, or a substituted or unsubstituted divalent heterocyclic group having 5 to 50 ring atoms;

two $R_{4402}$ are mutually the same or different;
two $R_{4403}$ are mutually the same or different;
two $R_{4404}$ are mutually the same or different;
two $R_{4405}$ are mutually the same or different;
two $R_{4406}$ are mutually the same or different; and
two $R_{4407}$ are mutually the same or different.

In the organic EL device of the exemplary embodiment, the fourth compound is also preferably a compound represented by a formula (E442) below.

[Formula 42]

(E442)

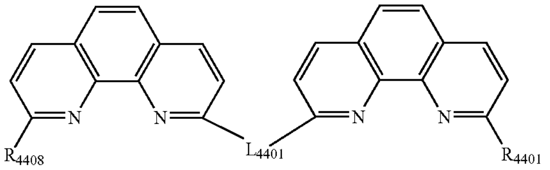

In the formula (E442), $R_{4401}$ and $R_{4408}$ are defined as in the formula (E44), and $L_{4401}$ is defined as in the formula (E441).

In the organic EL device of the exemplary embodiment, the fourth compound is also preferably a compound represented by a formula (E45) below.

[Formula 43]

(E45)

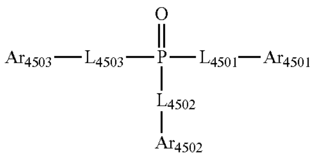

In the formula (E45):

$L_{4501}$ to $L_{4503}$ are each independently a single bond, a substituted or unsubstituted arylene group having 6 to 50 ring carbon atoms, or a substituted or unsubstituted divalent heterocyclic group having 5 to 50 ring atoms; and $Ar_{4501}$ to $Ar_{4503}$ are each independently a substituted or unsubstituted aryl group having 6 to 50 ring carbon atoms, or a substituted or unsubstituted heterocyclic group having 5 to 50 ring atoms.

In the organic EL device of the exemplary embodiment, the fourth compound is also preferably a compound represented by a formula (E451) below.

[Formula 44]

(E451)

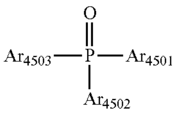

In the formula (E451), $Ar_{4501}$ to $Ar_{4503}$ are defined as in the formula (E45).

The substituent for "the substituted or unsubstituted" group in the fourth compound is also preferably a group selected from the group consisting of an alkyl group having 1 to 18 carbon atoms, an aryl group having 6 to 18 ring carbon atoms and a heterocyclic group having 5 to 18 ring atoms.

The substituent for "the substituted or unsubstituted" group in the fourth compound is also preferably an alkyl group having 1 to 5 carbon atoms.

The groups specified to be "substituted or unsubstituted" in the fourth compound are each also preferably an "unsubstituted" group.

Method of Producing Fourth Compound

The fourth compound can be produced by a known method. The fourth compound can also be produced based on a known method through a known alternative reaction using a known material(s) tailored for the target compound.

Specific Examples of Fourth Compound

Specific examples of the fourth compound include the following compounds. It should however be noted that the invention is not limited to the specific examples of the fourth compound.

[Formula 45]

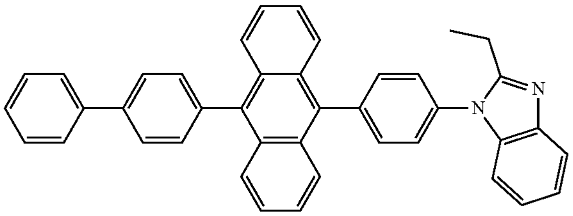

(Af = 2.10)

[Formula 46]

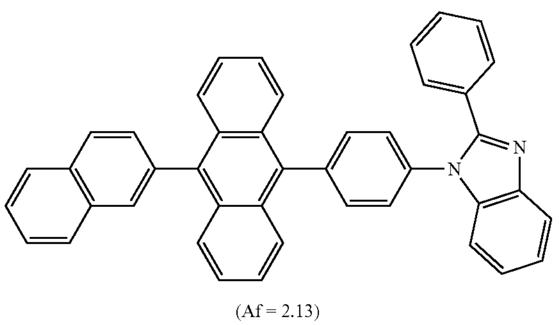

(Af = 2.13)

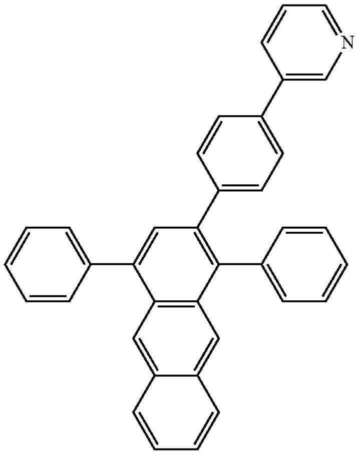
(Af = 2.13)
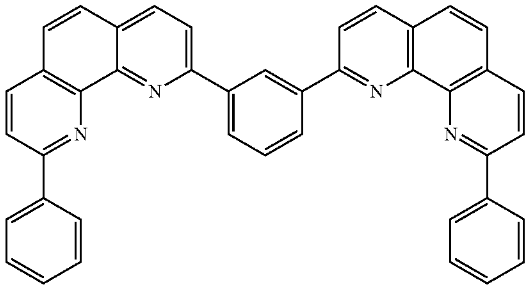
(Af = 2.07)
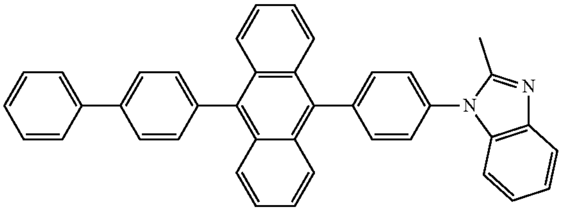
(Af = 2.11)
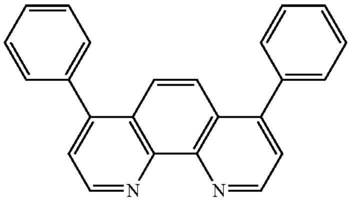
(Af = 2.01)
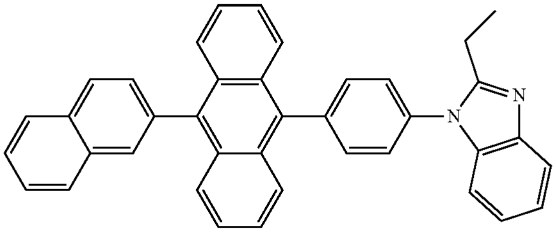
(Af = 2.13)
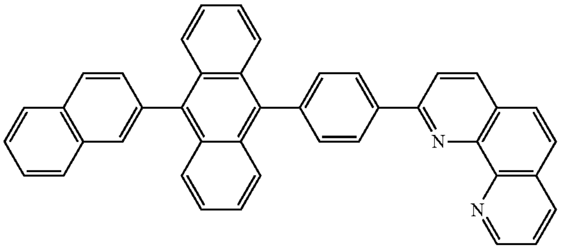
(Af = 2.1)
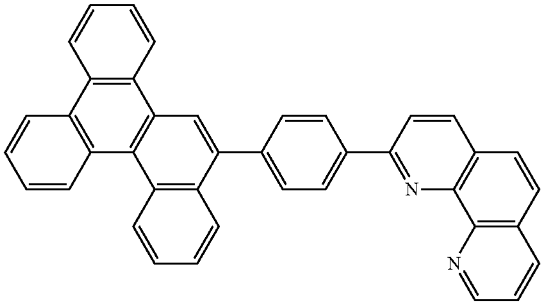
(Af = 2.05)
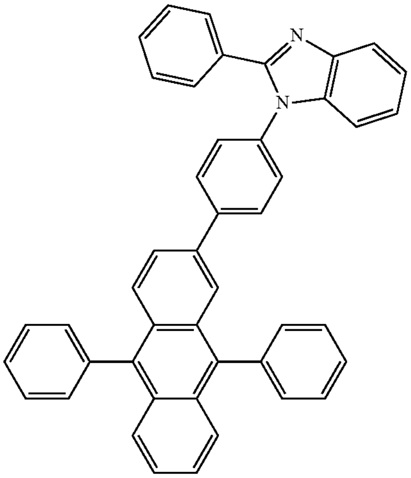
(Af = 2.21)
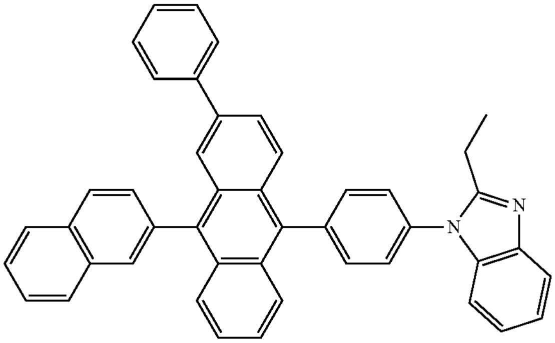
(Af = 2.19)

-continued

[Formula 48]

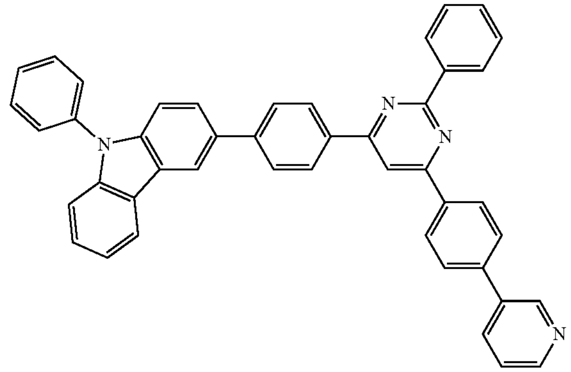

(Af = 2.23)

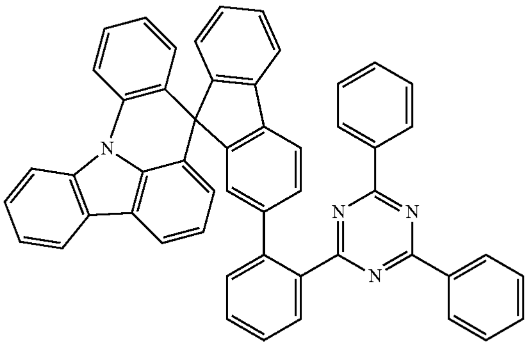

(Af = 2.25)

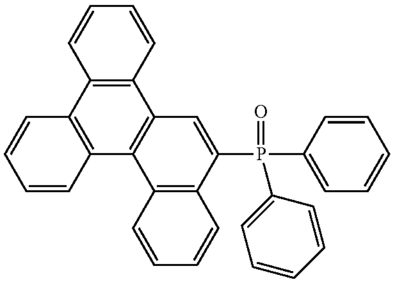

(Af = 2.13)

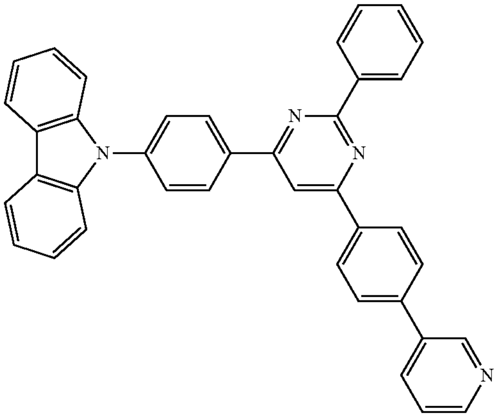

(Af = 2.27)

-continued

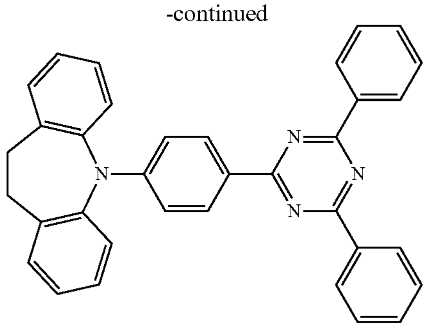

(Af = 2.21)

[Formula 49]

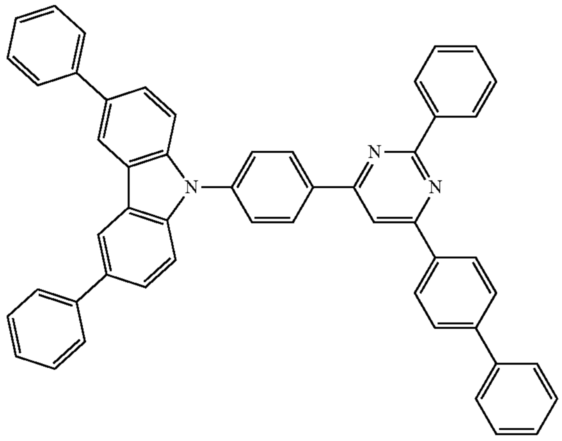

(Af = 2.23)

Fifth Compound

In the organic EL device of the exemplary embodiment, the fifth compound is contained in the second electron transporting layer. The fourth compound and the fifth compound in the second electron transporting layer are mutually different compounds.

In the organic EL device of the exemplary embodiment, the fifth compound is preferably a compound represented by a formula (E510) below.

[Formula 50]

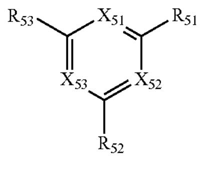

(E510)

In the formula (E510):

$X_{51}$ to $X_{53}$ are each independently $CR_{54}$ or a nitrogen atom;

$R_{54}$ is a hydrogen atom or a substituent $R_{50}$;

at least one of $X_{51}$ to $X_{53}$ is a nitrogen atom;

when two or more $R_{54}$ are present, the two or more $R_{54}$ are mutually the same or different;

$R_{51}$, $R_{52}$, and $R_{53}$ are each independently a hydrogen atom or a substituent $R_{50}$;

the substituent $R_{50}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{50}$ are present, the two or more substituents $R_{50}$ are mutually the same or different.

In the organic EL device of the exemplary embodiment, the fifth compound is preferably a compound represented by a formula (E511) or a formula (E512) below.

[Formula 51]

(E511)

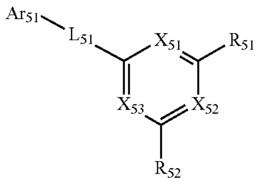

(E512)

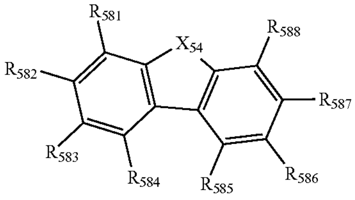

In the formula (E511):

$X_{51}$ to $X_{53}$ are each independently $CR_{54}$ or a nitrogen atom;

$R_{54}$ is a hydrogen atom or a substituent $R_{50}$;

at least one of $X_{51}$ to $X_{53}$ is a nitrogen atom;

when two or more $R_{54}$ are present, the two or more $R_{54}$ are mutually the same or different;

$R_{51}$ and $R_{52}$ are each independently a hydrogen atom or a substituent $R_{50}$;

the substituent $R_{50}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

when two or more substituents $R_{50}$ are present, the two or more substituents $R_{50}$ are mutually the same or different;

$L_{51}$ is a single bond, a substituted or unsubstituted arylene group having 6 to 50 ring carbon atoms, or a substituted or unsubstituted divalent heterocyclic group having 5 to 50 ring atoms; and $Ar_{51}$ is a group represented by the formula (E512).

In the formula (E512):

$X_{54}$ is an oxygen atom, a sulfur atom, N($R_{591}$) or C($R_{592}$)($R_{593}$);

one of $R_{581}$ to $R_{588}$ and $R_{591}$ to $R_{593}$ is a single bond with $L_{51}$;

at least one combination of adjacent two or more of $R_{581}$ to $R_{588}$ not being the single bond with $L_{51}$ are mutually bonded to form a substituted or unsubstituted monocyclic ring, mutually bonded to form a substituted or unsubstituted fused ring, or not mutually bonded;

a combination of $R_{592}$ and $R_{593}$ not being the single bond with $L_{51}$ are mutually bonded to form a substituted or unsubstituted monocyclic ring, mutually bonded to form a substituted or unsubstituted fused ring, or not mutually bonded;

$R_{581}$ to $R_{588}$ not being the single bond with $L_{51}$ and forming neither the substituted or unsubstituted monocyclic ring nor the substituted or unsubstituted fused ring, $R_{591}$, and $R_{592}$ and $R_{593}$ not being the single bond with $L_{51}$ and forming neither the substituted or unsubstituted monocyclic ring nor the substituted or unsubstituted fused ring are each independently a hydrogen atom, or a substituent $R_{50}$; and the substituent $R_{50}$ is defined as in the formula (E511).

In the fifth compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the organic EL device of the exemplary embodiment, the fifth compound is preferably a compound represented by a formula (E513) below.

[Formula 52]

(E513)

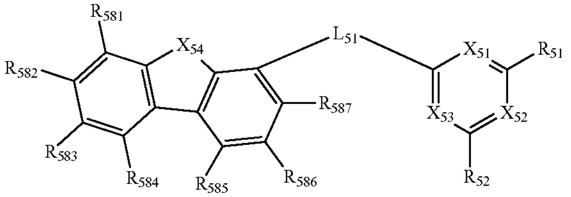

In the formula (E513):

$X_{51}$ to $X_{53}$, $R_{51}$, $R_{52}$, and $L_{51}$ are each defined as in the formula (E511); and $X_{54}$ and $R_{581}$ to $R_{587}$ are each defined as in the formula (E512).

Two or three of $X_{51}$ to $X_{53}$ in the fifth compound are preferably nitrogen atoms.

The substituent for "the substituted or unsubstituted" group in the fifth compound is also preferably a group selected from the group consisting of an alkyl group having 1 to 18 carbon atoms, an aryl group having 6 to 18 ring carbon atoms and a heterocyclic group having 5 to 18 ring atoms.

The substituent for "the substituted or unsubstituted" group in the fifth compound is also preferably an alkyl group having 1 to 5 carbon atoms.

The groups specified to be "substituted or unsubstituted" in the fifth compound are each also preferably an "unsubstituted" group.

Method of Producing Fifth Compound

The fifth compound can be produced by a known method. The fifth compound can also be produced based on a known method through a known alternative reaction using a known material(s) tailored for the target compound.

Specific Examples of Fifth Compound

Specific examples of the fifth compound include the following compounds. It should however be noted that the invention is not limited to the specific examples of the fifth compound.

[Formula 53]

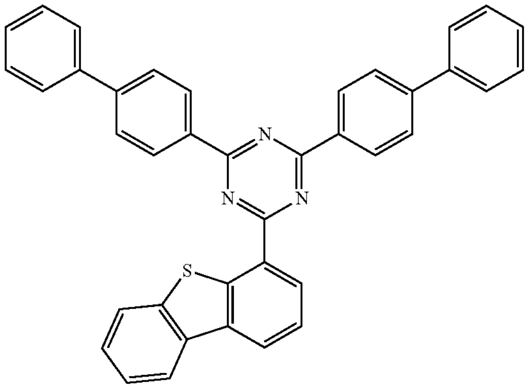

(Af = 2.50)

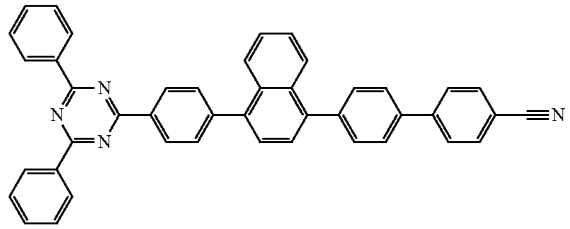

(Af = 2.36)

-continued

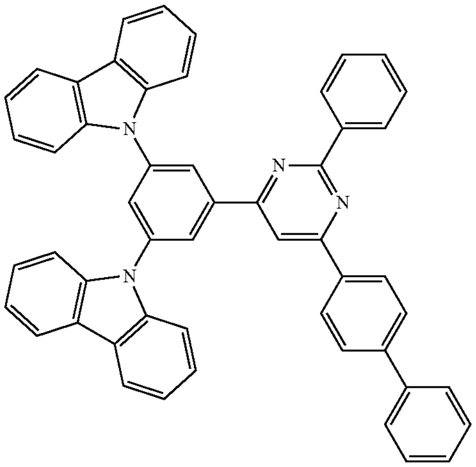

(Af = 2.33)

[Formula 54]

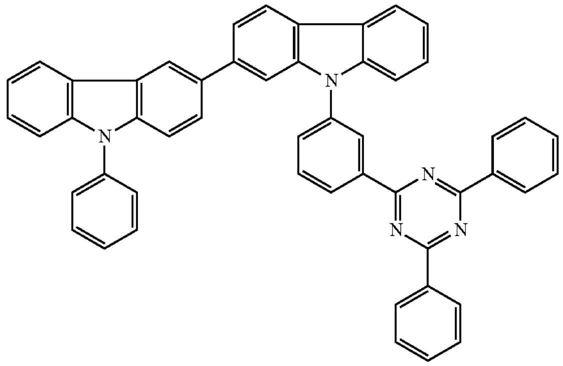

(Af = 2.41)

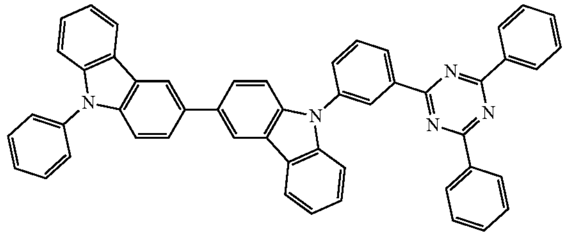

(Af = 2.41)

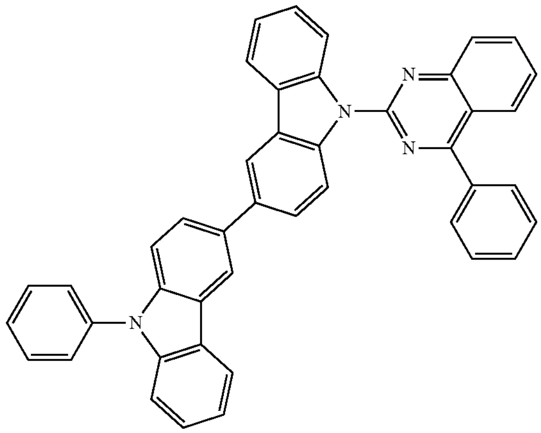

(Af = 2.42)

-continued
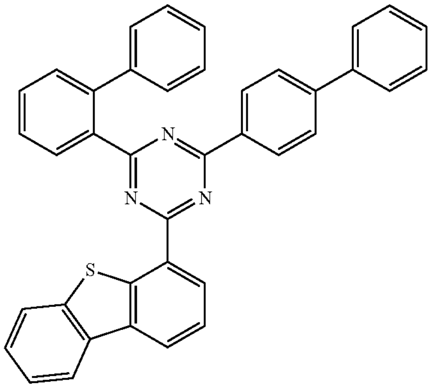
(Af = 2.42)
[Formula 55]
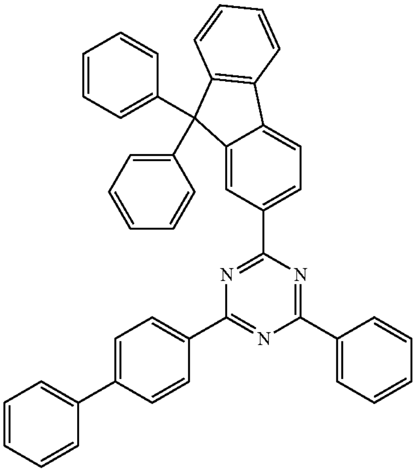
(Af = 2.42)
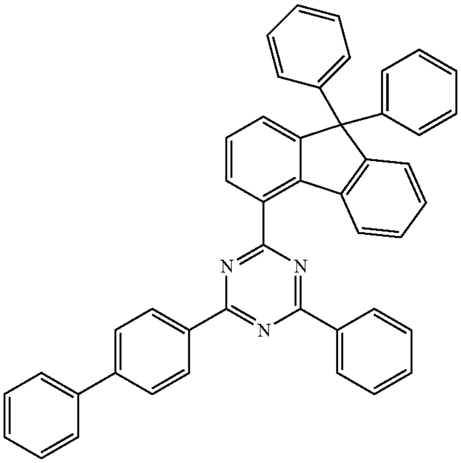
(Af = 2.41)
-continued
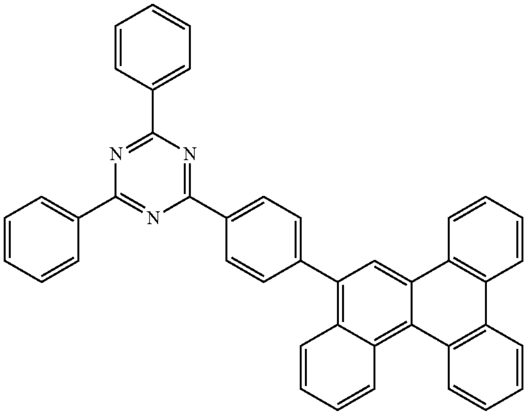
(Af = 2.40)
[Formula 56]
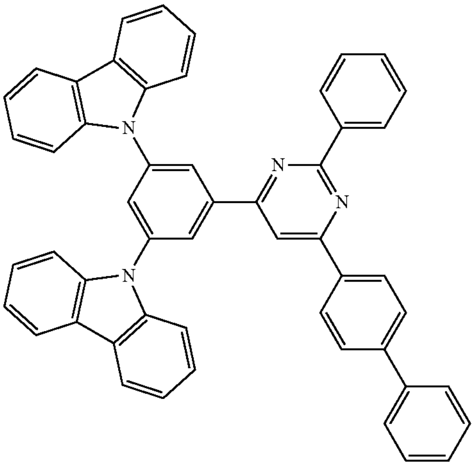
(Af = 2.33)
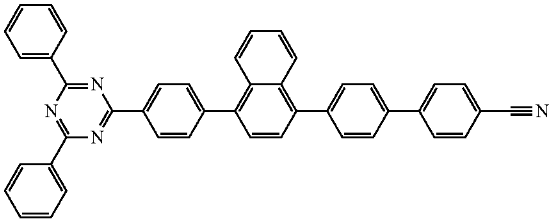
(Af = 2.36)
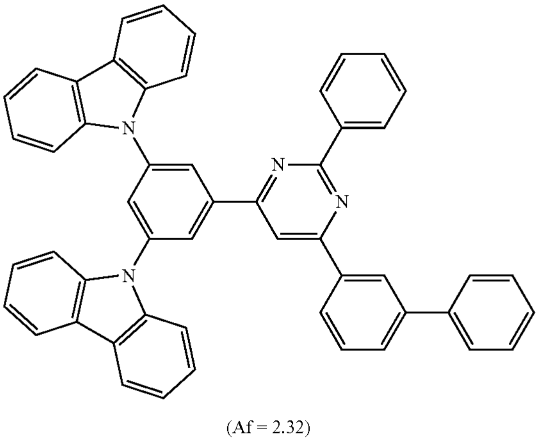
(Af = 2.32)

-continued

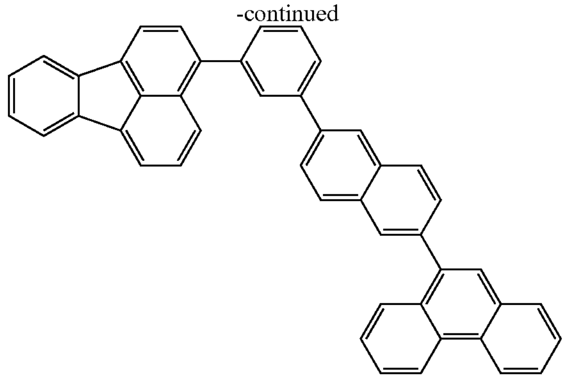

(Af = 2.26)

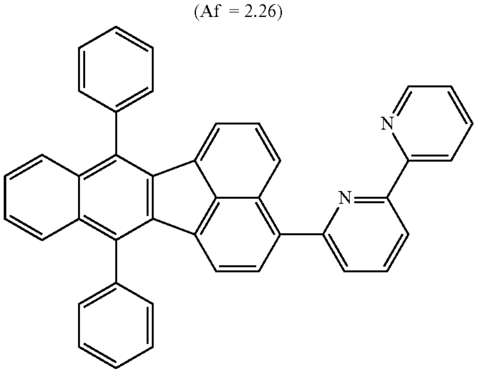

(Af = 2.33)

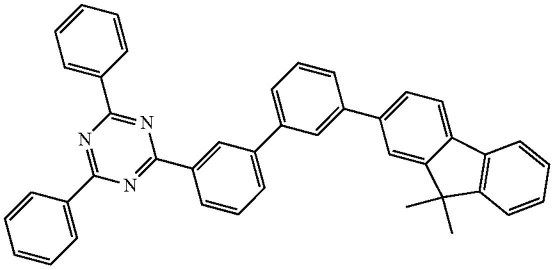

(Af = 2.35)

First Emitting Layer

The first emitting layer contains the first compound as the first host material and the first emitting compound that emits light having a maximum peak wavelength of 500 nm or less. The first host material and the second host material that is contained in the second emitting layer are mutually different compounds. The first host material and the first emitting compound are mutually different compounds.

Herein, the "host material" refers to, for instance, a material that accounts for "50 mass % or more of the layer." Accordingly, for instance, the first emitting layer contains 50 mass % or more of the first compound as the first host material with respect to the total mass of the first emitting layer. For instance, the second emitting layer contains 50 mass % or more of the second compound as the second host material with respect to the total mass of the second emitting layer. Moreover, for instance, the "host material" may account for 60 mass % or more of the layer, 70 mass % or more of the layer, 80 mass % or more of the layer, 90 mass % or more of the layer, or 95 mass % or more of the layer.

The first emitting compound is preferably a compound that emits fluorescence having a maximum peak wavelength of 500 nm or less. The first emitting compound is preferably a compound that emits fluorescence having a maximum peak wavelength of 480 nm or less. The first emitting compound is preferably a compound that emits fluorescence having a maximum peak wavelength of 430 nm or more.

A measurement method of the maximum peak wavelength of a compound is as follows. A toluene solution of a measurement target compound at a concentration ranging from $10^{-6}$ mol/L to $10^{-5}$ mol/L is prepared and put in a quartz cell. An emission spectrum (ordinate axis: emission intensity, abscissa axis: wavelength) of the thus-obtained sample is measured at a normal temperature (300K). The emission spectrum can be measured using a spectrophotometer (machine name: F-7000) produced by Hitachi High-Tech Science Corporation. It should be noted that the machine for measuring the emission spectrum is not limited to the machine used herein.

A peak wavelength of the emission spectrum exhibiting the maximum luminous intensity is defined as the maximum peak wavelength. Herein, the maximum peak wavelength of fluorescence is occasionally referred to as a maximum fluorescence peak wavelength (FL-peak).

In the organic EL device according to the exemplary embodiment, the first emitting compound is preferably a compound containing no azine ring structure in a molecule.

In the organic EL device according to the exemplary embodiment, the first emitting compound is preferably not a boron-containing complex, more preferably not a complex. The first emitting compound may be a first dopant material.

In the organic EL device according to the exemplary embodiment, the first emitting layer preferably does not contain a metal complex. Moreover, in the organic EL device according to the exemplary embodiment, the first emitting layer also preferably does not contain a boron-containing complex.

In the organic EL device according to the exemplary embodiment, the first emitting layer preferably does not contain a phosphorescent material (phosphorescent dopant material).

In addition, the first emitting layer preferably does not contain a heavy-metal complex and a phosphorescent rare earth metal complex. Examples of the heavy-metal complex herein include iridium complex, osmium complex, and platinum complex.

In an emission spectrum of the first emitting compound, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximum values.

Moreover, in the emission spectrum of the first emitting compound, the number of peaks is preferably less than three.

In the organic EL device according to the exemplary embodiment, the first emitting layer preferably emits light having a maximum peak wavelength of 500 nm or less when the device is driven.

The maximum peak wavelength of the light emitted from the emitting layer when the device is driven is measured as follows.

Maximum Peak Wavelength λp of Light Emitted from Emitting Layer When Organic EL Device is Driven For a maximum peak wavelength $\lambda p_1$ of light emitted from the first emitting layer when the organic EL device is driven, the organic EL device is produced by using the material of the first emitting layer for the first emitting layer and the second emitting layer, and voltage is applied to the organic EL device so that a current density becomes 10

$mA/cm_2$, where spectral radiance spectrum is measured by a spectroradiometer CS-2000 (produced by Konica Minolta, Inc.). The maximum peak wavelength $\lambda p_1$ (unit: nm) is calculated from the obtained spectral radiance spectrum.

For a maximum peak wavelength $\lambda p_2$ of light emitted from the second emitting layer when the organic EL device is driven, the organic EL device is produced by using the material of the second emitting layer for the first emitting layer and the second emitting layer, and voltage is applied to the organic EL device so that a current density becomes 10 $mA/cm_2$, where spectral radiance spectrum is measured by a spectroradiometer CS-2000 (produced by Konica Minolta, Inc.). The maximum peak wavelength $\lambda p_2$ (unit: nm) is calculated from the obtained spectral radiance spectrum.

In the organic EL device according to the exemplary embodiment, a singlet energy of the first host material $S_1(H1)$ and a singlet energy of the first emitting compound $S_1(D1)$ preferably satisfy a relationship of a numerical formula (Numerical Formula 1) below.

$$S_1(H1)>S_1(D1) \quad \text{(Numerical Formula 1)}$$

The singlet energy $S_1$ means an energy difference between the lowest singlet state and the ground state.

When the first host material and the first emitting compound satisfy the relationship of the numerical formula (Numerical Formula 1), singlet excitons generated on the first host material easily energy-transfer from the first host material to the first emitting compound, thereby contributing to fluorescence of the first emitting compound.

In the organic EL device according to the exemplary embodiment, the triplet energy of the first host material $T_1(H1)$ and the triplet energy of the first emitting compound $T_1(D1)$ preferably satisfy a relationship of a numerical formula (Numerical Formula 2) below.

$$T_1(D1) > T_1(H1) \quad \text{(Numerical Formula 2)}$$

When the first host material and the first emitting compound satisfy the relationship of the numerical formula (Numerical Formula 2), triplet excitons generated in the first emitting layer are transferred not onto the first emitting compound having higher triplet energy but onto the first host material, thereby being easily transferred to the second emitting layer.

The organic EL device according to the exemplary embodiment preferably satisfies a relationship of a numerical formula (Numerical Formula 3) below.

$$T_1(D1) > T_1(H1) > T_1(H2) \quad \text{(Numerical Formula 3)}$$

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is encapsulated in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$\text{Conversion Equation } (F1)\text{: } T_1\,[\text{eV}] = 1239.85/\lambda_{edge}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring the singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value $\lambda_{edge}$ (nm) at an intersection of the tangent and the abscissa axis is assigned to a conversion equation (F2) below to calculate singlet energy.

$$\text{Conversion Equation } (F2)\text{: } S_1\,[\text{eV}] = 1239.85/\lambda_{edge}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device according to the exemplary embodiment, the first emitting layer preferably contains more than 1.1 mass % of the first emitting compound. Specifically, the first emitting layer contains the first emitting compound preferably at more than 1.1 mass %, more preferably at 1.2 mass % or more, and still more preferably at 1.5 mass % or more with respect to the total mass of the first emitting layer.

The first emitting layer contains the first emitting compound preferably at 10 mass % or less, more preferably at 7 mass % or less, and still more preferably at 5 mass % or less with respect to the total mass of the first emitting layer.

In the organic EL device according to the exemplary embodiment, the first emitting layer preferably contains the first compound as the first host material at 60 mass % or more, more preferably at 70 mass % or more, still more preferably at 80 mass % or more, still further more preferably at 90 mass % or more, yet still further more preferably at 95 mass % or more, with respect to the total mass of the first emitting layer.

The first emitting layer preferably contains the first host material at 99 mass % or less with respect to the total mass of the first emitting layer.

When the first emitting layer contains the first host material and the first emitting compound, the upper limit of a total of the content ratios of the first host material and the first emitting compound is 100 mass %.

In the organic EL device according to the exemplary embodiment, the first emitting layer may further contain any other material than the first host material and the first emitting compound.

The first emitting layer may contain a single type of the first host material or may contain two or more types of the first host material. The first emitting layer may contain a single type of the first emitting compound or may contain two or more types of the first emitting compound.

In the organic EL device according to the exemplary embodiment, the film thickness of the first emitting layer is preferably 3 nm or more, more preferably 5 nm or more. When the film thickness of the first emitting layer is 3 nm or more, the film thickness is sufficiently large to cause recombination of holes and electrons in the first emitting layer.

In the organic EL device according to the exemplary embodiment, the film thickness of the first emitting layer is preferably 15 nm or less, more preferably 10 nm or less. When the film thickness of the first emitting layer is 15 nm or less, the film thickness is sufficiently thin to allow for transfer of triplet excitons to the second emitting layer.

In the organic EL device according to the exemplary embodiment, the film thickness of the first emitting layer is more preferably in a range from 3 nm to 15 nm.

Second Emitting Layer

The second emitting layer contains the second compound as the second host material and the second emitting compound that emits light having a maximum peak wavelength of 500 nm or less. The second host material and the first host material that is contained in the first emitting layer are mutually different compounds. The second host material and the second emitting compound are mutually different compounds. The second emitting compound and the first emitting compound are mutually the same or different.

The second emitting compound is preferably a compound that emits fluorescence having a maximum peak wavelength of 500 nm or less. The second emitting compound is preferably a compound that emits fluorescence having a maximum peak wavelength of 480 nm or less. The second emitting compound is preferably a compound that emits fluorescence having a maximum peak wavelength of 430 nm or more. A method of measuring the maximum peak wavelength of the compound is as described above.

In the organic EL device according to the exemplary embodiment, the second emitting layer preferably emits light having a maximum peak wavelength of 500 nm or less when the device is driven.

In the organic EL device according to the exemplary embodiment, a half bandwidth of a maximum peak of the second emitting compound is preferably in a range from 1 nm to 20 nm.

In the organic EL device according to the exemplary embodiment, a Stokes shift of the second emitting compound preferably exceeds 7 nm.

When the Stokes shift of the second dopant material exceeds 7 nm, a decrease in the luminous efficiency due to self-absorption is easily inhibited.

The self-absorption is a phenomenon in which emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by a method described in Examples. The Stokes shift can be measured by the following method.

A measurement target compound is dissolved in toluene at a concentration of $2.0\times10^{-5}$ mol/L to prepare a measurement sample. The measurement sample is put into a quartz cell and is irradiated with continuous light falling within an ultraviolet-to-visible region at a room temperature (300K) to measure an absorption spectrum (ordinate axis: absorbance, abscissa axis: wavelength). A spectrophotometer such as a spectrophotometer U-3900/3900H produced by Hitachi High-Tech Science Corporation can be used for the absorption spectrum measurement. Moreover, a measurement target compound is dissolved in toluene at a concentration of $4.9\times10^{-6}$ mol/L to prepare a measurement sample. The measurement sample was put into a quartz cell and was irradiated with excited light at a room temperature (300K) to measure fluorescence spectrum (ordinate axis: fluorescence intensity, abscissa axis: wavelength). A spectrophotometer can be used for the fluorescence spectrum measurement. For instance, a spectrophotofluorometer F-7000 produced by Hitachi High-Tech Science Corporation can be used for the measurement.

In the organic EL device according to the exemplary embodiment, a triplet energy of the second emitting compound $T_1(D2)$ and the triplet energy of the second host material $T_1(H2)$ preferably satisfy a relationship of a numerical formula (Numerical Formula 4) below.

$$T_1(D2) > T_1(H2) \quad \text{(Numerical Formula 4)}$$

In the organic EL device according to the exemplary embodiment, when the second emitting compound and the second host material satisfy the relationship of the numerical formula (Numerical Formula 4), in transfer of triplet excitons generated in the first emitting layer to the second emitting layer, the triplet excitons energy-transfer not onto the second emitting compound having higher triplet energy but onto molecules of the second host material. In addition, triplet excitons generated by recombination of holes and electrons on the second host material do not transfer to the second emitting compound having higher triplet energy. Triplet excitons generated by recombination on molecules of the second emitting compound quickly energy-transfer to molecules of the second host material.

Triplet excitons in the second host material do not transfer to the second emitting compound but efficiently collide with one another on the second host material to generate singlet excitons by the TTF phenomenon.

In the organic EL device according to the exemplary embodiment, a singlet energy of the second host material $S_1(H2)$ and a singlet energy of the second emitting compound $S_1(D2)$ preferably satisfy a relationship of a numerical formula (Numerical Formula 5) below.

$$S_1(H2) > S_1(D2) \quad \text{(Numerical Formula 5)}$$

In the organic EL device according to the exemplary embodiment, when the second emitting compound and the second host material satisfy the relationship of the numerical formula (Numerical formula 5), due to the singlet energy of the second emitting compound being smaller than the singlet energy of the second host material, singlet excitons generated by the TTF phenomenon energy-transfer from the second host material to the second emitting compound, thereby contributing to fluorescence of the second emitting compound.

In the organic EL device according to the exemplary embodiment, the second emitting compound is preferably a compound containing no azine ring structure in a molecule.

In the organic EL device according to the exemplary embodiment, the second emitting compound is preferably not a boron-containing complex, more preferably not a complex.

In the organic EL device according to the exemplary embodiment, the second emitting layer preferably does not contain a metal complex. Moreover, in the organic EL device according to the exemplary embodiment, the second emitting layer also preferably does not contain a boron-containing complex.

In the organic EL device according to the exemplary embodiment, the second emitting layer preferably does not contain a phosphorescent material (dopant material).

In addition, the second emitting layer preferably does not contain a heavy-metal complex or a phosphorescent rare earth metal complex. Examples of the heavy-metal complex herein include iridium complex, osmium complex, and platinum complex.

In the organic EL device according to the exemplary embodiment, the second emitting layer preferably contains more than 1.1 mass % of the second emitting compound. Specifically, the second emitting layer contains the second emitting compound preferably at more than 1.1 mass %, more preferably at 1.2 mass % or more, and still more preferably at 1.5 mass % or more with respect to the total mass of the second emitting layer.

The second emitting layer contains the second emitting compound preferably at 10 mass % or less, more preferably at 7 mass % or less, and still more preferably at 5 mass % or less with respect to the total mass of the second emitting layer.

The second emitting layer contains the second compound as the second host material preferably at 60 mass % or more, more preferably at 70 mass % or more, still more preferably at 80 mass % or more, still further more preferably at 90 mass % or more, and yet still further more preferably at 95 mass % or more, with respect to the total mass of the second emitting layer.

The second emitting layer preferably contains the second host material at 99 mass % or less with respect to the total mass of the second emitting layer.

When the second emitting layer contains the second host material and the second emitting compound, the upper limit of a total of the content ratios of the second host material and the second emitting compound is 100 mass %.

In the exemplary embodiment, the second emitting layer may further contain any other material than the second host material and the second emitting compound.

The second emitting layer may contain a single type of the second host material or may contain two or more types of the second host material. The second emitting layer may contain a single type of the second emitting compound or may contain two or more types of the second emitting compound.

In the organic EL device according to the exemplary embodiment, the film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion in the first emitting layer.

In the organic EL device according to the exemplary embodiment, the film thickness of the second emitting layer is preferably 25 nm or less, more preferably 20 nm or less. When the film thickness of the second emitting layer is 25 nm or less, a density of the triplet excitons in the second emitting layer is improved to cause the TTF phenomenon more easily.

In the organic EL device according to the exemplary embodiment, the film thickness of the second emitting layer is preferably in a range from 5 nm to 25 nm.

In the organic EL device according to the exemplary embodiment, a triplet energy of the first emitting compound or the second emitting compound $T_1(DX)$, the triplet energy of the first host material $T_1(H1)$ and the triplet energy of the second host material $T_1(H2)$ preferably satisfy a relationship of a numerical formula (Numerical Formula 10) below.

$$2.6 \text{ eV} > T_1(DX) > T_1(H1) > T_1(H2) \quad \text{(Numerical Formula 10)}$$

The triplet energy of the first emitting compound $T_1(D1)$ preferably satisfies a relationship of a numerical formula (Numerical Formula 10A) below.

$$2.6\ \text{eV} > T_1(D1) > T_1(H1) > T_1(H2) \quad \text{(Numerical Formula 10A)}$$

The triplet energy of the second emitting compound $T_1(D2)$ preferably satisfies a relationship of a numerical formula (Numerical Formula 10B) below.

$$2.6\ \text{eV} > T_1(D2) > T_1(H1) > T_1(H2) \quad \text{(Numerical Formula 10B)}$$

In the organic EL device according to the exemplary embodiment, the triplet energy of the first emitting compound or the second emitting compound $T_1(DX)$ and the triplet energy of the first host material $T_1(H1)$ preferably satisfy a relationship of a numerical formula (Numerical Formula 11) below.

$$0\ \text{eV} < T_1(DX) - T_1(H1) < 0.6\ \text{eV} \quad \text{(Numerical Formula 11)}$$

The triplet energy of the first emitting compound $T_1(D1)$ preferably satisfies a relationship of a numerical formula (Numerical Formula 11A) below.

$$0\ \text{eV} < T_1(D1) - T_1(H1) < 0.6\ \text{eV} \quad \text{(Numerical Formula 11A)}$$

The triplet energy of the second emitting compound $T_1(D2)$ preferably satisfies a relationship of a numerical formula (Numerical Formula 11B) below.

$$0\ \text{eV} < T_1(D2) - T_1(H1) < 0.8\ \text{eV} \quad \text{(Numerical Formula 11B)}$$

In the organic EL device according to the exemplary embodiment, the triplet energy of the first host material $T_1(H1)$ preferably satisfies a relationship of a numerical formula (Numerical Formula 12) below.

$$T_1(H1) > 2.0\ \text{eV} \quad \text{(Numerical Formula 12)}$$

In the organic EL device according to the exemplary embodiment, the triplet energy of the first host material $T_1(H1)$ also preferably satisfies a relationship of a numerical formula (Numerical Formula 12A) below, or also preferably satisfies a relationship of a numerical formula (Numerical Formula 12B) below.

$$T_1(H1) > 2.10\ \text{eV} \quad \text{(Numerical Formula 12A)}$$

$$T_1(H1) > 2.15\ \text{eV} \quad \text{(Numerical Formula 12B)}$$

In the organic EL device according to the exemplary embodiment, when the triplet energy of the first host material $T_1(H1)$ satisfies the relationship of the numerical formula (Numerical Formula 12A) or the numerical formula (Numerical Formula 12B), triplet excitons generated in the first emitting layer are easily transferred to the second emitting layer, and also easily inhibited from back-transferring from the second emitting layer to the first emitting layer. Consequently, singlet excitons are efficiently generated in the second emitting layer, thereby improving luminous efficiency.

In the organic EL device according to the exemplary embodiment, the triplet energy of the first host material $T_1(H1)$ also preferably satisfies a relationship of a numerical formula (Numerical Formula 12C) below, or also preferably satisfies a relationship of a numerical formula (Numerical Formula 12D) below.

$$2.08\ \text{eV} > T_1(H1) > 1.87\ \text{eV} \quad \text{(Numerical Formula 12C)}$$

$$2.05\ \text{eV} > T_1(H1) > 1.90\ \text{eV} \quad \text{(Numerical Formula 12D)}$$

In the organic EL device according to the exemplary embodiment, when the triplet energy of the first host material $T_1(H1)$ satisfies the relationship of the numerical formula (Numerical Formula 12C) or (Numerical Formula 12D), energy of the triplet excitons generated in the first emitting layer is reduced, so that the organic EL device can be expected to have a longer lifetime.

In the organic EL device according to the exemplary embodiment, the triplet energy of the first emitting compound $T_1(D1)$ also preferably satisfies a relationship of a numerical formula (Numerical Formula 14A) below, or also preferably satisfies a relationship of a numerical formula (Numerical Formula 14B) below.

$$2.60\ \text{eV} > T_1(D1) \quad \text{(Numerical Formula 14A)}$$

$$2.50\ \text{eV} > T_1(D1) \quad \text{(Numerical Formula 14B)}$$

When the first emitting layer contains a compound that satisfies the relationship of the numerical formula (Numerical Formula 14A) or (Numerical Formula 14B), the organic EL device has a longer lifetime.

In the organic EL device according to the exemplary embodiment, the triplet energy of the second emitting compound $T_1(D2)$ also preferably satisfies a relationship of a numerical formula (Numerical Formula 14C) below, or also preferably satisfies a relationship of a numerical formula (Numerical Formula 14D) below.

$$2.60\ \text{eV} > T_1(D2) \quad \text{(Numerical Formula 14C)}$$

$$2.50\ \text{eV} > T_1(D2) \quad \text{(Numerical Formula 14D)}$$

When the second emitting layer contains a compound that satisfies the relationship of the numerical formula (Numerical Formula 14C) or (Numerical Formula 14D), the organic EL device has a longer lifetime.

In the organic EL device according to the exemplary embodiment, the triplet energy of the second host material $T_1(H2)$ preferably satisfies a relationship of a numerical formula (Numerical Formula 13) below.

$$T_1(H2) \geq 1.9\ \text{eV} \quad \text{(Numerical Formula 13)}$$

In the organic EL device according to the exemplary embodiment, the triplet energy of the second host material $T_1(H2)$ preferably satisfies a relationship of a numerical formula (Numerical Formula 13A) below.

$$1.9\ eV > T_1(H2) \geq 1.8\ eV \quad \text{(Numerical Formula 13A)}$$

In the organic EL device according to the exemplary embodiment, when the first emitting layer and the second emitting layer are layered in this order from the side where the anode is provided, an electron mobility of the first host material μe(H1) and an electron mobility of the second host material μe(H2) satisfy a relationship of a numerical formula (Numerical Formula 30) below.

$$\mu e(H2) > \mu e(H1) \quad \text{(Numerical Formula 30)}$$

When the first host material and the second host material satisfy the relationship of the numerical formula (Numerical Formula 30), a recombination ability between holes and electrons in the first emitting layer is improved.

In the organic EL device according to the exemplary embodiment, when the first emitting layer and the second emitting layer are layered in this order from the side where the anode is provided, it is also preferable that a hole mobility of the first host material μh(H1) and a hole mobility of the second host material μh(H2) satisfy a relationship of a numerical formula (Numerical Formula 31) below.

$$\mu h(H1) > \mu h(H2) \quad \text{(Numerical Formula 31)}$$

In the organic EL device according to the exemplary embodiment, when the first emitting layer and the second emitting layer are layered in this order from the side where the anode is provided, it is also preferable that the hole mobility of the first host material μh(H1), the electron mobility of the first host material μe(H1), the hole mobility of the second host material μh(H2) and the electron mobility of the second host material μe(H2) satisfy a relationship of a numerical formula (Numerical Formula 32) below.

$$(\mu e(H2)/\mu h(H2)) > (\mu e(H1)/\mu h(H1)) \quad \text{(Numerical Formula 32)}$$

The electron mobility can be measured according to an impedance measurement using a mobility evaluation device produced by the following steps. The mobility evaluation device is, for instance, produced by the following steps.

A compound Target, which is to be measured for an electron mobility, is vapor-deposited on a glass substrate having an aluminum electrode (anode) so as to cover the aluminum electrode, thereby forming a measurement target layer. A compound ET-A below is vapor-deposited on this measurement target layer to form an electron transporting layer. LiF is vapor-deposited on this formed electron transporting layer to form an electron injecting layer. Metal aluminum (Al) is vapor-deposited on this formed electron injecting layer to form a metal cathode.

An arrangement of the mobility evaluation device above is roughly shown as follows.

glass/Al(50)/Target(200)/ET-A(10)/LiF(1)/Al(50)

Numerals in parentheses represent a film thickness (nm).

[Formula 57]

ET-A

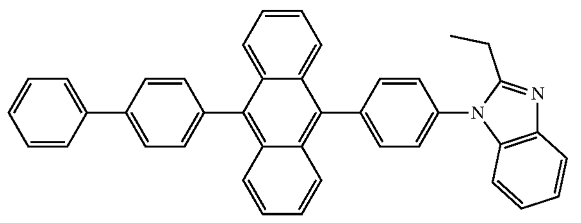

The mobility evaluation device for the electron mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using a relationship of a calculation formula (C1) below.

$$M=j\omega Z \quad \text{Calculation formula (C1):}$$

In the calculation formula (C1), j is an imaginary unit whose square is −1 and ω is an angular frequency [rad/s].

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using a calculation formula (C2) below.

$$\tau = 1/(2\pi f\mathrm{max}) \quad \text{Calculation formula (C2)}$$

π in the calculation formula (C2) is a symbol representing a circumference ratio.

An electron mobility μe is calculated from a relationship of a calculation formula (C3-1) below using τ.

$$\mu e = d^2/(V\tau) \quad \text{Calculation formula (C3-1)}$$

d in the calculation formula (C3-1) is a total film thickness of organic thin film(s) forming the device. In a case of the arrangement of the mobility evaluation device for the electron mobility, d=210 [nm] is satisfied.

The hole mobility can be measured according to an impedance measurement using a mobility evaluation device produced by the following steps. The mobility evaluation device is produced, for instance, according to the following steps.

A compound HA-2 below is vapor-deposited on a glass substrate having an ITO transparent electrode (anode) so as to cover the transparent electrode, thereby forming a hole injecting layer. A compound HT-A below is vapor-deposited on this formed hole injecting layer to form a hole transporting layer. Subsequently, a compound Target, which is to be measured for a hole mobility, is vapor-deposited to form a measurement target layer. Metal aluminum (Al) is vapor-deposited on this measurement target layer to form a metal cathode.

An arrangement of the mobility evaluation device above is roughly shown as follows.

ITO(130)/HA-2(5)/HT-A(10)/Target(200)/AI(80)

Numerals in parentheses represent a film thickness (nm).

[Formula 58]

HA-2

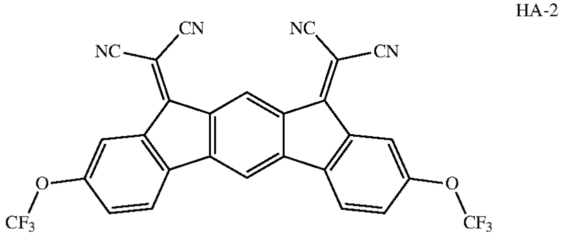

HT-A

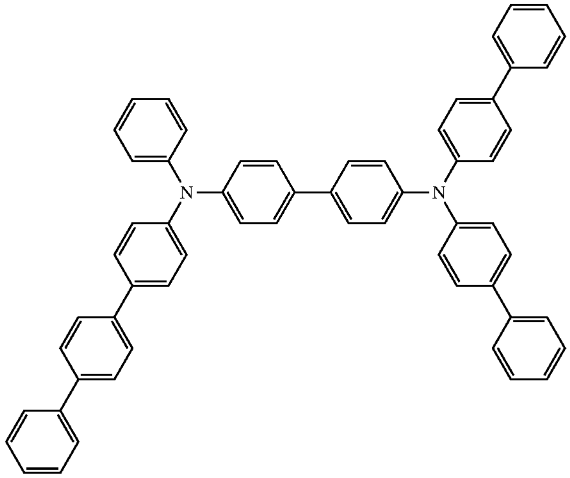

The mobility evaluation device for the hole mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using the relationship of the calculation formula (C1).

In a bode plot in which an imaginary part of the modulus M is represented by an ordinate axis and the frequency [Hz] is represented by an abscissa axis, an electrical time constant $\tau$ of the mobility evaluation device is obtained from a frequency fmax showing a peak using the calculation formula (C2).

A hole mobility $\mu h$ is calculated from a relationship of a calculation formula (C3-2) below using T obtained from the calculation formula (C2).

$$\mu h = d^2/(V\tau) \quad \text{Calculation formula (C3-2)}$$

d in the calculation formula (C3-2) is a total film thickness of organic thin film(s) forming the device. In a case of the arrangement of the mobility evaluation device for the hole mobility, d=215 [nm] is satisfied.

The electron mobility and the hole mobility herein are each a value obtained in a case where a square root of an electric field intensity meets $E^{1/2}=500$ [$V^{1/2}/cm^{1/2}$]. The square root of the electric field intensity, $E^{1/2}$, can be calculated from a relationship of a calculation formula (C4) below.

$$E^{1/2} = V^{1/2}/d^{1/2} \quad \text{Calculation formula (C4)}$$

For the impedance measurement, a 1260 type by Solartron Analytical is used as the impedance measurement device, and for a higher accuracy, a 1296 type dielectric constant measurement interface by Solartron Analytical can be used together therewith.

In the organic EL device according to the exemplary embodiment, the first emitting layer and the second emitting layer are preferably in direct contact with each other.

Herein, a layer arrangement in which the first emitting layer and the second emitting layer are in direct contact with each other can include one of arrangements (LS1), (LS2) and (LS3) below.

(LS1) An arrangement in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An arrangement in which in a case of containing an emitting compound in the first emitting layer and the second emitting layer, a region containing the first host material, the second host material and the emitting compound is generated in a process of vapor-depositing the compound of the first emitting layer and vapor-depositing the compound of the second emitting layer, and is present on the interface between the first emitting layer and the second emitting layer.

(LS3) An arrangement in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

Third Emitting Layer

In the organic EL device according to the exemplary embodiment, an emitting region may further include a third emitting layer between the first emitting layer and the second emitting layer.

The third emitting layer preferably contains a third host material. Preferably, the first host material, the second host material and the third host material are mutually different.

The third emitting layer preferably contains a third emitting compound. The third emitting compound preferably has a maximum peak wavelength of 500 nm or less. The third emitting compound is preferably a fluorescent compound that emits fluorescence having a maximum peak wavelength of 500 nm or less. A method of measuring the maximum peak wavelength of the compound is as described above. The first emitting compound, the second emitting compound and the third emitting compound are mutually the same or different.

When the emitting region of the organic EL device according to the exemplary embodiment includes the third emitting layer, the triplet energy of the first host material $T_1(H1)$ and a triplet energy of the third host material $T_1(H3)$ preferably satisfy a relationship of a numerical formula (Numerical Formula 1C) below.

$$T_1(H1) > T_1(H3) \quad \text{(Numerical Formula 1C)}$$

When the emitting region of the organic EL device according to the exemplary embodiment includes the third emitting layer, the triplet energy of the second host material $T_1(H2)$ and the triplet energy of the third host material $T_1(H3)$ also preferably satisfy a relationship of a numerical formula (Numerical Formula 1D) below, and also preferably satisfy a relationship of a numerical formula (Numerical Formula 1E).

$$T_1(H3) > T_1(H2) \quad \text{(Numerical Formula 1D)}$$

$$T_1(H1) > T_1(H3) > T_1(H2) \quad \text{(Numerical Formula 1E)}$$

When the emitting region of the organic EL device according to the exemplary embodiment includes the third emitting layer, the triplet energy of the second host material $T_1(H2)$ and the triplet energy of the third host material $T_1(H3)$ also preferably satisfy a relationship of a numerical formula (Numerical Formula 1F) below, and also preferably satisfy a relationship of a numerical formula (Numerical Formula 1G) below.

$$T_1(H2) > T_1(H3) \quad \text{(Numerical Formula 1F)}$$

$$T_1(H1) > T_1(H2) > T_1(H3) \quad \text{(Numerical Formula 1G)}$$

When the emitting region of the organic EL device according to the exemplary embodiment includes the third emitting layer, the first emitting layer and the third emitting layer are also preferably in direct contact with each other. When the emitting region of the organic EL device according to the exemplary embodiment includes the third emitting layer, the second emitting layer and the third emitting layer are also preferably in direct contact with each other.

Herein, a layer arrangement in which "the first emitting layer and the third emitting layer are in direct contact with each other" can include one of arrangements (LS4), (LS5) and (LS6) below.

(LS4) An arrangement in which a region containing both the first host material and the third host material is generated in a process of vapor-depositing the compound of the first emitting layer and vapor-depositing the compound of the third emitting layer, and is present on the interface between the first emitting layer and the third emitting layer.

(LS5) An arrangement in which in a case of containing an emitting compound in the first emitting layer and the third emitting layer, a region containing the first host material, the third host material and the emitting compound is generated in a process of vapor-depositing the compound of the first emitting layer and vapor-depositing the compound of the third emitting layer, and is present on the interface between the first emitting layer and the third emitting layer.

(LS6) An arrangement in which in a case of containing an emitting compound in the first emitting layer and the third emitting layer, a region containing the emitting compound, a region containing the first host material or a region containing the third host material is generated in a process of vapor-depositing the compound of the first emitting layer and vapor-depositing the compound of the third emitting layer, and is present on the interface between the first emitting layer and the third emitting layer.

The layer arrangement in which "the second emitting layer and the third emitting layer are in direct contact with each other" may also include, for instance, layer arrangements given in the aforementioned arrangements (LS4), (LS5) and (LS6) by replacing the first emitting layer with the second emitting layer and replacing the first host material with the second host material.

Interposed Layer

The organic EL device according to the exemplary embodiment may include an interposed layer as an organic layer disposed between the first emitting layer and the second emitting layer.

In the exemplary embodiment, in order to inhibit an overlap between a Singlet emitting region and a TTF emitting region, the interposed layer contains no emitting compound or may contain an emitting compound in an insubstantial amount provided that the overlap can be inhibited.

For instance, the interposed layer contains 0 mass % of an emitting compound. Alternatively, for instance, the interposed layer may contain an emitting compound provided that the emitting compound contained is a component accidentally mixed in a production process or a component contained as impurities in a material.

For instance, when the interposed layer consists of a material A, a material B, and a material C, the content ratios of the materials A, B, and C in the interposed layer are each 10 mass % or more, and the total of the content ratios of the materials A, B, and C is 100 mass %.

In the following, the interposed layer is occasionally referred to as a "non-doped layer". A layer containing an emitting compound is occasionally referred to as a "doped layer".

It is considered that luminous efficiency is improvable in an arrangement including layered emitting layers because the Singlet emitting region and the TTF emitting region are typically likely to be separated from each other.

In the organic EL device according to the exemplary embodiment, when the interposed layer (non-doped layer) is disposed between the first emitting layer and the second emitting layer in the emitting region, it is expected that a region where the Singlet emitting region and the TTF emitting region overlap with each other is reduced to inhibit a decrease in TTF efficiency caused by collision between triplet excitons and carriers. That is, it is considered that providing the interposed layer (non-doped layer) between the emitting layers contributes to the improvement in the efficiency of TTF emission.

The interposed layer is a non-doped layer.

The interposed layer contains no metal atom. The interposed layer thus contains no metal complex.

The interposed layer contains an interposed layer material. The interposed layer material is not an emitting compound.

The interposed layer material may be any material except for the emitting compound.

Examples of the interposed layer material include: 1) a heterocyclic compound such as an oxadiazole derivative, benzimidazole derivative, or phenanthroline derivative; 2) a fused aromatic compound such as a carbazole derivative, anthracene derivative, phenanthrene derivative, pyrene derivative or chrysene derivative; and 3) an aromatic amine compound such as a triarylamine derivative or a fused polycyclic aromatic amine derivative.

One or both of the first host material and the second host material may be used as the interposed layer material. The interposed layer material may be any material provided that the Singlet emitting region and the TTF emitting region are separated from each other and the Singlet emission and the TTF emission are not hindered.

In the organic EL device according to the exemplary embodiment, the respective content ratios of all the materials forming the interposed layer in the interposed layer are each 10 mass % or more.

The interposed layer contains the interposed layer material as a material forming the interposed layer.

The interposed layer preferably contains 60 mass % or more of the interposed layer material, more preferably contains 70 mass % or more of the interposed layer material, still more preferably contains 80 mass % or more of the interposed layer material, still further more preferably 90 mass % or more of the interposed layer material, yet still further more preferably 95 mass % or more of the interposed layer material, with respect to the total mass of the interposed layer.

The interposed layer may contain a single type of the interposed layer material or may contain two or more types of the interposed layer material.

When the interposed layer contains two or more types of the interposed layer material, the upper limit of the total of the content ratios of the two or more types of the interposed layer material is 100 mass %.

It should be noted that the interposed layer of the exemplary embodiment may further contain any other material than the interposed layer material.

The interposed layer may be provided in the form of a single layer or a laminate of two or more layers.

As long as the overlap between the Singlet emitting region and the TTF emitting region is inhibited, the film thickness of the interposed layer is not particularly limited but each layer in the interposed layer is preferably in a range from 3 nm to 15 nm, more preferably in a range from 5 nm to 10 nm.

The interposed layer having a film thickness of 3 nm or more easily separates the Singlet emitting region from the emitting region derived from TTF.

The interposed layer having a film thickness of 15 nm or less easily inhibits a phenomenon where the host material of the interposed layer emits light.

It is preferable that the interposed layer contains the interposed layer material as a material forming the interposed layer and the triplet energy of the first host material $T_1(H1)$, the triplet energy of the second host material $T_1(H2)$, and a triplet energy of at least one interposed layer material $T_1(M_{mid})$ satisfy a relationship of a numerical formula (Numerical Formula 41) below.

$$T_1(H1) \geq T_1(M_{mid}) \geq T_1(H2) \quad \text{(Numerical Formula 41)}$$

When the interposed layer contains two or more interposed layer materials as a material forming the interposed layer, the triplet energy of the first host material $T_1(H1)$, the triplet energy of the second host material $T_1(H2)$, and a triplet energy of each interposed layer material $T_1(M_{EA})$ more preferably satisfy a relationship of a numerical formula (Numerical Formula 42) below.

$$T_1(H1) \geq T_1(M_{EA}) \geq T_1(H2) \quad \text{(Numerical Formula 42)}$$

First Host Material, Second Host Material, and Third Host Material

In the organic EL device according to the exemplary embodiment, the first host material, the second host material, and the third host material are exemplified by the first compound represented by a formula (1), a formula (1X), a formula (12X), a formula (13X), a formula (14X), a formula (15X), or a formula (16X) below, the second compound represented by a formula (2) below, and the like. Further, the first compound is usable as the first host material and also the second host material. In this case, the compound represented by the formula (1), the formula (1X), the formula (12X), the formula (13X), the formula (14X), the formula (15X), or the formula (16X) that is used as the second host material is occasionally referred to as the second compound for convenience.

In the organic EL device according to the exemplary embodiment, it is preferable that the first compound as the first host material is a compound selected from the group consisting of compounds represented by the formula (1), the formula (1X), the formula (12X), the formula (13X), the formula (14X), the formula (15X) and the formula (16X) below.

First Compound

The first compound is also preferably a compound represented by the formula (1) below. The first compound has at least one group represented by a formula (11) below.

[Formula 59]

(1)

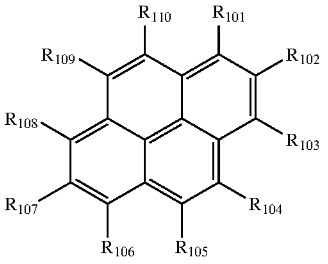

(11)

$$*-(L_{101})_{mx}-Ar_{101}$$

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1).

In the first compound, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

The group represented by the formula (11) is preferably a group represented by a formula (111) below.

[Formula 60]

(111)

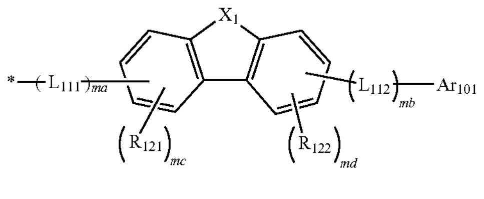

In the formula (111):

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$Ar_{101}$ represents the same as $Ar_{101}$ in the formula (11);

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

Among positions *1 to *8 of carbon atoms in a cyclic structure represented by a formula (111a) below in the group represented by the formula (111), $L_{111}$ is bonded to one of the positions *1 to *4, $R_{121}$ is bonded to each of three positions of the rest of *1 to *4, $L_{112}$ is bonded to one of the positions *5 to *8, and $R_{122}$ is bonded to each of three positions of the rest of *5 to *8.

[Formula 61]

(111a)

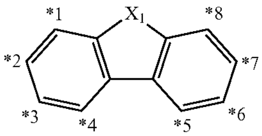

For instance, in the group represented by the formula (111), when $L_{111}$ is bonded to a carbon atom at a position *2 in the cyclic structure represented by the formula (111a) and $L_{112}$ is bonded to a carbon atom at a position *7 in the cyclic structure represented by the formula (111a), the group represented by the formula (111) is represented by a formula (111b) below.

[Formula 62]

(111b)

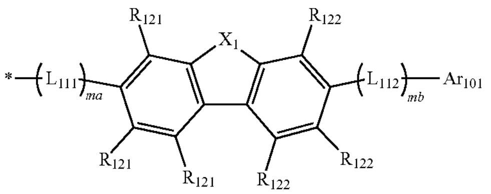

In the formula (111b):

$X_1$, $L_{111}$, $L_{112}$, ma, mb, $Ar_{101}$, $R_{121}$, $R_{122}$, $R_{123}$, $R_{124}$, and $R_{125}$ each independently represent the same as $X_1$, $L_{111}$, $L_{112}$, ma, mb, $Ar_{101}$, $R_{121}$, $R_{122}$, $R_{123}$, $R_{124}$, and $R_{125}$ in the formula (111);

a plurality of $R_{121}$ are mutually the same or different; and a plurality of $R_{122}$ are mutually the same or different.

In the organic EL device according to the exemplary embodiment, the group represented by the formula (111) is preferably a group represented by the formula (111b).

In the organic EL device according to the exemplary embodiment, preferably, ma is 0, 1, or 2, and mb is 0, 1 or 2.

In the organic EL device according to the exemplary embodiment, preferably, ma is 0 or 1, and mb is 0 or 1.

When ma is 0 and mb is 1 in a group represented by formula (111), the group represented by formula (111) is represented by a formula (111c) below.

[Formula 63]

(111c)

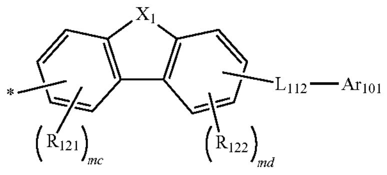

In the formula (111c), $X_1$, $L_{112}$, mc, md, $Ar_{101}$, $R_{121}$ and $R_{122}$ each independently represent the same as $X_1$, $L_{112}$, mc, md, $Ar_{101}$, $R_{121}$ and $R_{122}$ in the formula (111).

In the organic EL device according to the exemplary embodiment, $Ar_{101}$ is preferably a substituted or unsubstituted aryl group having 6 to 50 ring carbon atoms.

In the organic EL device according to the exemplary embodiment, $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In the organic EL device according to the exemplary embodiment, $Ar_{101}$ is also preferably a group represented by a formula (12), a formula (13), or a formula (14) below.

[Formula 64]

(12)

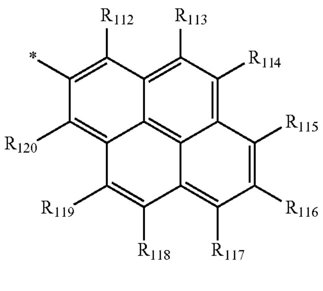

-continued (13)

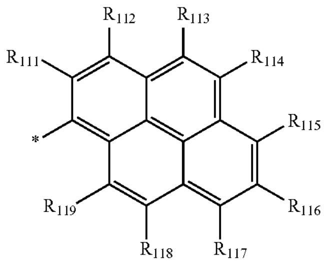

(14)

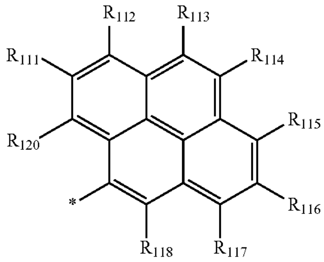

In the formulae (12), (13), and (14):

$R_{111}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{124}$, a group represented by $-COOR_{125}$, a halogen atom, a cyano group, a nitro group, a substituted or unsubstituted aryl group having 6 to 50 ring carbon atoms, or a substituted or unsubstituted heterocyclic group having 5 to 50 ring atoms; and in the formulae (12), (13) and (14), * represents a bonding position to $L_{101}$ in the formula (11), a bonding position to $L_{112}$ in the formula (111), or a bonding position to $L_{112}$ in the formula (111b).

It is also preferable that $R_{124}$ and $R_{125}$ in the formulae (12), (13), and (14) each independently represent the same as $R_{801}$ and $R_{802}$ above.

The first compound is preferably represented by a formula (101) below.

[Formula 65]

(101)

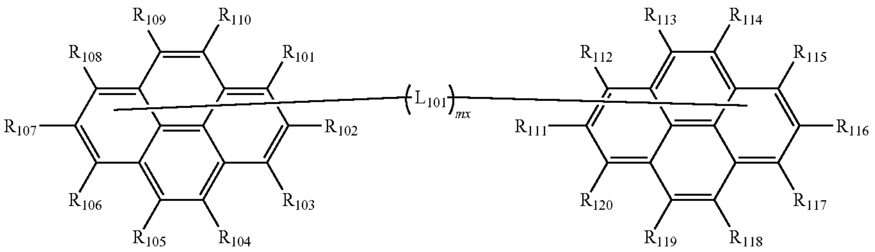

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

[Formula 66]

(101A)

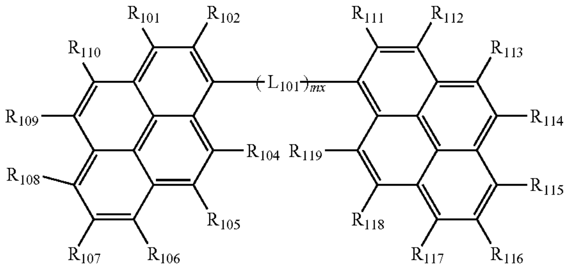

In the formula (101A), $R_{101}$, $R_{102}$, $R_{104}$ to $R_{119}$, $L_{101}$ and mx respectively represent the same as $R_{101}$, $R_{102}$, $R_{104}$ to $R_{119}$, $L_{101}$ and mx in the formula (101).

In the organic EL device according to the exemplary embodiment, $L_{101}$ is preferably a single bond or a substituted or unsubstituted arylene group having 6 to 50 ring carbon atoms.

In the organic EL device according to the exemplary embodiment, the first compound is preferably a compound represented by a formula (102) below.

[Formula 67]

(102)

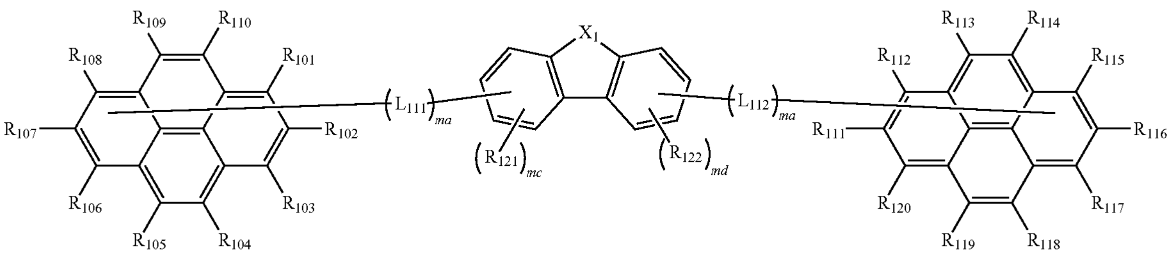

mx is 0, 1, 2, 3, 4, or 5; and when two or more $L_{101}$ are present, the two or more $L_{101}$ are mutually the same or different.

When $R_{103}$ is a bonding position with $L_{101}$ and $R_{120}$ is a bonding position with $L_{101}$ in the formula (101), the compound represented by the formula (101) is represented by a formula (101A) below.

In the formula (102):

$R_{101}$ to $R_{120}$ each independently represent the same as $R_{101}$ to $R_{120}$ in the formula (101);

one of $R_{101}$ to $R_{110}$ represents a bonding position to $L_{111}$, and one of $R_{111}$ to $R_{120}$ represents a bonding position to $L_{112}$;

$X_1$ is $CR_{123}R_{124}$, an oxygen atom, a sulfur atom, or $NR_{125}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 0, 1, 2, 3, or 4;

mb is 0, 1, 2, 3, or 4;

ma+mb is 0, 1, 2, 3, or 4;

$R_{121}$, $R_{122}$, $R_{123}$, $R_{124}$ and $R_{125}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{121}$ are mutually the same or different;

md is 3; and three $R_{122}$ are mutually the same or different.

In the compound represented by the formula (102), preferably, ma is 0, 1 or 2, and mb is 0, 1, or 2.

In the compound represented by the formula (102), preferably, ma is 0 or 1 and mb is 0 or 1.

In the organic EL device according to the exemplary embodiment, two or more of $R_{101}$ to $R_{110}$ are each preferably a group represented by the formula (11).

In the organic EL device according to the exemplary embodiment, it is preferable that two or more of $R_{101}$ to $R_{110}$ are each a group represented by the formula (11) and that $Ar_{101}$ is a substituted or unsubstituted aryl group having 6 to 50 ring carbon atoms.

In the organic EL device according to the exemplary embodiment, $Ar_{101}$ is not a substituted or unsubstituted pyrenyl group, $L_{101}$ is not a substituted or unsubstituted pyrenylene group, and the substituted or unsubstituted aryl group having 6 to 50 ring carbon atoms for $R_{101}$ to $R_{110}$ not being the group represented by the formula (11) is not a substituted or unsubstituted pyrenyl group.

In the organic EL device according to the exemplary embodiment, $R_{101}$ to $R_{110}$ not being the group represented by the formula (11) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the organic EL device according to the exemplary embodiment, $R_{101}$ to $R_{110}$ not being the group represented by the formula (11) are preferably each independently a hydrogen atom, a substituted or unsubstituted alkyl group having 1 to 50 carbon atoms, or a substituted or unsubstituted cycloalkyl group having 3 to 50 ring carbon atoms.

In the organic EL device according to the exemplary embodiment, $R_{101}$ to $R_{110}$ not being the group represented by the formula (11) are each preferably a hydrogen atom.

In the organic EL device according to the exemplary embodiment, $X_1$ is preferably $CR_{123}R_{124}$. When $X_1$ is $CR_{123}R_{124}$, the compound represented by the formula (111) is represented by a formula (111d) below.

[Formula 68]

(111d)

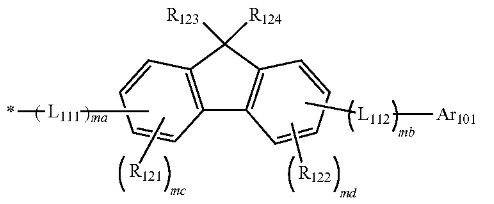

In the formula (111d), $L_{111}$, $L_{112}$, ma, mb, ma+mb, $Ar_{101}$, $R_{121}$, $R_{122}$, $R_{123}$, $R_{124}$, mc and md are each defined as in the formula (111).

In the organic EL device according to the exemplary embodiment, preferably, $R_{123}$ and $R_{124}$ are not bonded to each other.

In the organic EL device of the exemplary embodiment, at least one of $L_{111}$ or $L_{112}$ is preferably a substituted or unsubstituted arylene group having 6 to 50 ring carbon atoms or a substituted or unsubstituted divalent heterocyclic group having 5 to 50 ring atoms.

Compound Represented by Formula (1X)

In the organic EL device according to the exemplary embodiment, the first compound is also preferably a compound represented by the formula (1X) below.

[Formula 69]

(1X)

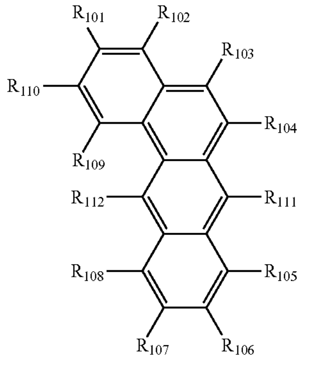

(11X)

$*—(L_{101})_{mx}—Ar_{101}$

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is a group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device according to the exemplary embodiment, the group represented by the formula (11X) is preferably a group represented by a formula (111X) below.

[Formula 70]

(111X)

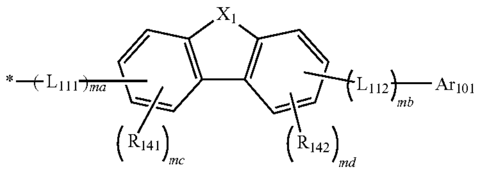

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, or 4;

$Ar_{101}$ represents the same as $Ar_{101}$ in the formula (11X);

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

[Formula 71]

(111aX)

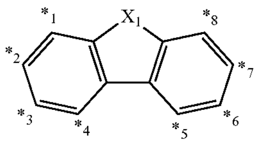

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111ax), the group represented by the formula (111X) is represented by a formula (111bX) below.

[Formula 72]

(111bX)

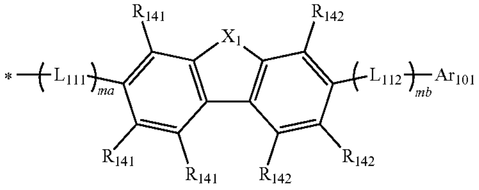

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to the exemplary embodiment, the group represented by the formula (111X) is preferably a group represented by the formula (111bX).

In the compound represented by the formula (1X), preferably, ma is 1 or 2 and mb is 1 or 2.

In the compound represented by the formula (1X), preferably, ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group, a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

[Formula 73]

(101X)

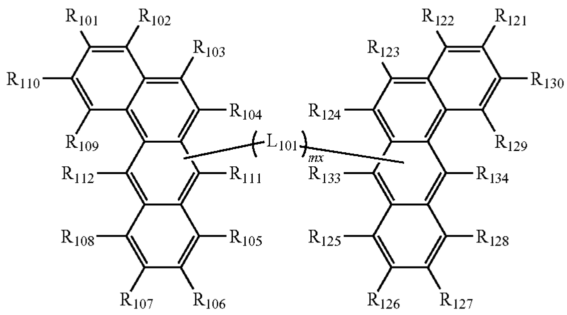

$(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4, or 5; and when two or more $L_{101}$ are present, the two or more $L_{101}$ are mutually the same or different.

In the compound represented by the formula (1X), $L_{101}$ is preferably a single bond, or a substituted or unsubstituted arylene group having 6 to 50 ring carbon atoms.

The compound represented by the formula (1X) is also preferably represented by a formula (102X) below.

[Formula 74]

(102X)

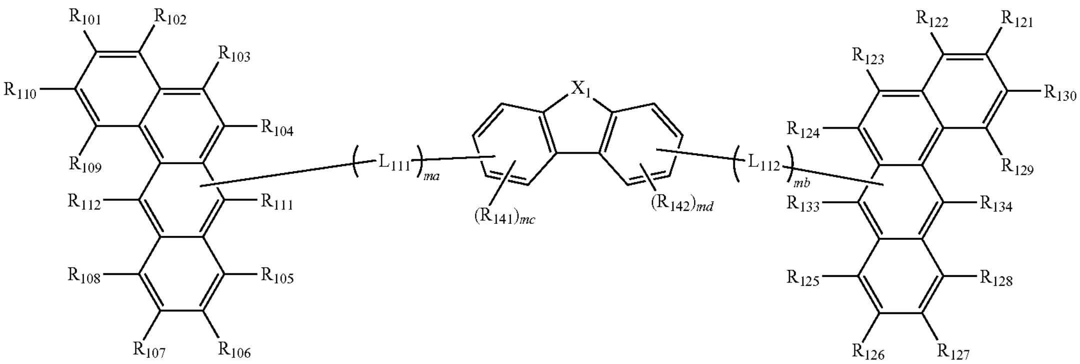

In the formula (101X):

one of $R_{111}$ and $R_{112}$ represents a bonding position to $L_{101}$ and one of $R_{133}$ and $R_{134}$ represents a bonding position to $L_{101}$;

$R_{101}$ to $R_{110}$, $R_{121}$ to $R_{130}$, $R_{111}$ or $R_{112}$ not being the bonding position to $L_{101}$, and $R_{133}$ or $R_{134}$ not being the bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si In the formula (102X):

one of $R_{111}$ and $R_{112}$ represents a bonding position to $L_{111}$ and one of $R_{133}$ and $R_{134}$ represents a bonding position to $L_{112}$;

$R_{101}$ to $R_{110}$, $R_{121}$ to $R_{130}$, $R_{111}$ or $R_{112}$ not being the bonding position to $L_{111}$, and $R_{133}$ or $R_{134}$ not being the bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si $(R_{901})(R_{902})(R_{903})$, a group represented by —O—$(R_{904})$, a group represented by —S—$(R_{905})$, a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$ and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

In the compound represented by the formula (1X), preferably, ma is 1 or 2 and mb is 1 or 2 in the formula (102X).

In the compound represented by the formula (1X), preferably, ma is 1 and mb is 1 in the formula (102X).

In the compound represented by the formula (1X), the group represented by the formula (11X) is also preferably a group represented by a formula (11AX) or a group represented by a formula (11BX) below.

[Formula 75]

(11AX)

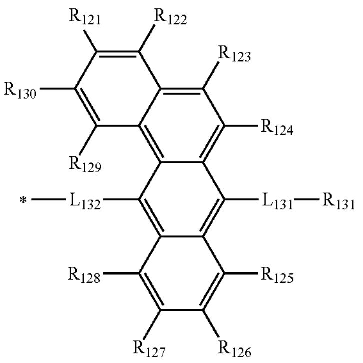

-continued (11BX)

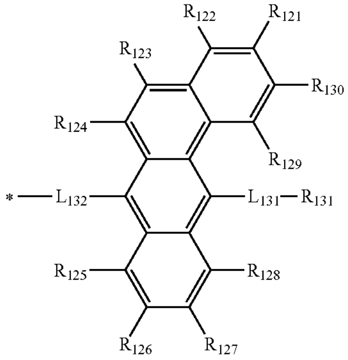

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in the formulae (11AX) and (11BX) each represent a bonding position to a benz[a]anthracene ring in the formula (1X).

The compound represented by the formula (1X) is also preferably represented by a formula (103X) below.

[Formula 76]

(103X)

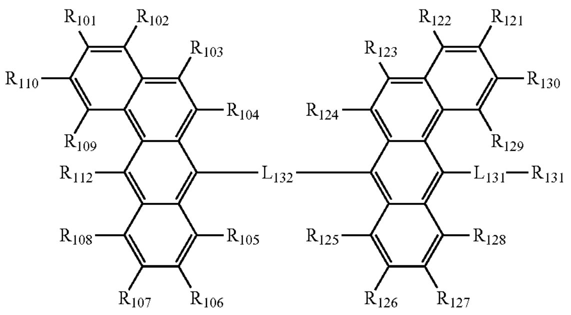

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$, and $L_{132}$ respectively represent the same as $R_{121}$ to $R_{131}$, $L_{131}$, and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are each also preferably a group represented by the formula (11X).

In the compound represented by the formula (1X), it is preferable that two or more of $R_{101}$ to $R_{112}$ are each a group represented by the formula (11X) and $Ar_{101}$ in the formula (11X) is a substituted or unsubstituted aryl group having 6 to 50 ring carbon atoms.

In the compound represented by the formula (1X), it is also preferable that $Ar_{101}$ is not a substituted or unsubstituted benz[a]anthryl group, $L_{101}$ is not a substituted or unsubstituted benz[a]anthrylene group, and the substituted or unsubstituted aryl group having 6 to 50 ring carbon atoms for $R_{101}$ to $R_{110}$ not being the group represented by the formula (11X) is not a substituted or unsubstituted benz[a]anthryl group.

In the compound represented by the formula (1X), $R_{101}$ to $R_{112}$ not being the group represented by the formula (11X) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ not being the group represented by the formula (11X) are each preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ not being the group represented by the formula (11X) are each preferably a hydrogen atom.

Compound Represented by Formula (12X)

In the organic EL device according to the exemplary embodiment, the first compound is also preferably a compound represented by the formula (12X) below.

[Formula 77]

(12X)

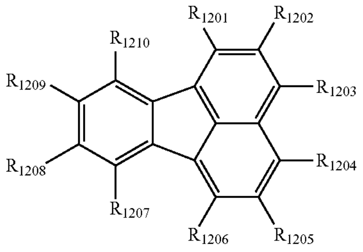

(121)

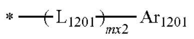

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ forming neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

at least one of a substituent, if present, for the substituted or unsubstituted monocyclic ring, a substituent, if present, for the substituted or unsubstituted fused ring, or $R_{1201}$ to $R_{1210}$ is a group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to the exemplary embodiment, the first compound is also preferably a compound represented by the formula (13X) below.

[Formula 78]

(13X)

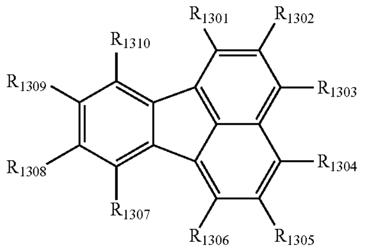

(131)

$$* -(L_{1301})_{mx3}- Ar_{1301}$$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is a group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring in the formula (13X).

In the organic EL device according to the exemplary embodiment, none of combinations of adjacent two or more of $R_{1301}$ to $R_{1310}$ not being the group represented by the formula (131) are bonded to each other. Combinations of adjacent two of $R_{1301}$ to $R_{1310}$ in the formula (13X) refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device according to the exemplary embodiment, the first compound is also preferably a compound represented by the formula (14X) below.

[Formula 79]

(14X)

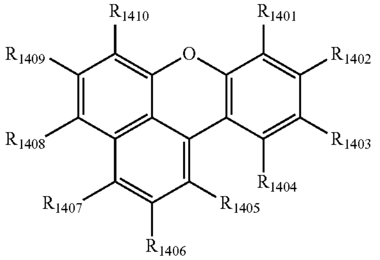

(141)

$$* -(L_{1401})_{mx4}- Ar_{1401}$$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is a group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device according to the exemplary embodiment, the first compound is also preferably a compound represented by the formula (15X) below.

[Formula 80]

(15X)

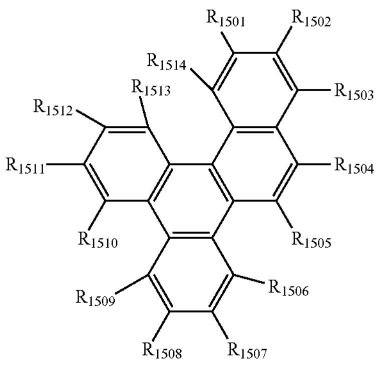

(151)

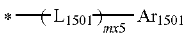

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is a group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to the exemplary embodiment, the first compound is also preferably a compound represented by the formula (16X) below.

[Formula 81]

(16X)

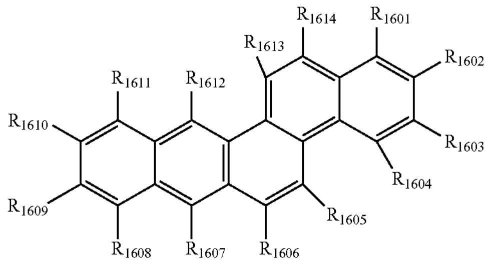

(161)

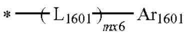

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is a group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and

* in the formula (161) represents a bonding position to a ring represented by the formula (16X).

In the organic EL device according to the exemplary embodiment, it is also preferable that the first host material has, in a molecule, a linking structure including a benzene ring and a naphthalene ring that are linked with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

When the first host material has the linking structure including such cross-linking, deterioration in the chromaticity of the organic EL device is expected to be inhibited.

The first host material in the above case is only required to have a linking structure as the minimum unit in a molecule, the linking structure including a benzene ring and a naphthalene ring linked to each other with a single bond (occasionally referred to as a benzene-naphthalene linking structure), the linking structure being as represented by a formula (X1) or a formula (X2) below. The benzene ring may be fused with a further monocyclic ring or fused ring, and the naphthalene ring may be fused with a further monocyclic ring or fused ring. For instance, also in a case where the first host material has, in a molecule, a linking structure including a naphthalene ring and a naphthalene ring linked to each other with a single bond (occasionally referred to as a naphthalene-naphthalene linking structure) and being as represented by a formula (X3), a formula (X4), or a formula (X5) below, the naphthalene-naphthalene linking structure is regarded as including the benzene-naphthalene linking structure since one of the naphthalene rings includes a benzene ring.

[Formula 82]

(X1)

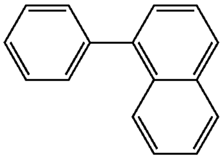

(X2)

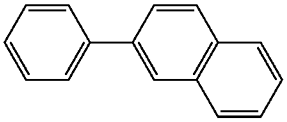

(X3)

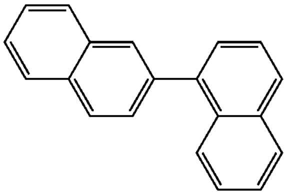

(X4)

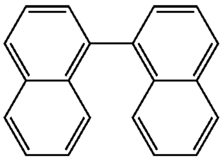

(X5)

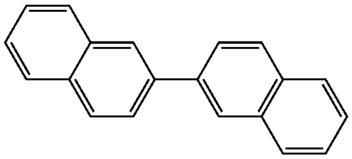

In the organic EL device according to the exemplary embodiment, the cross-linking also preferably includes a double bond.

Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at at least one site other than the single bond by cross-linking, for instance, a linking structure (fused ring) represented by a formula (X11) below is obtained in a case of the formula (X1), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for instance, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for instance, a linking structure (fused ring) represented by a formula (X13) below is obtained in a case of the formula (X1).

[Formula 83]

(X11)

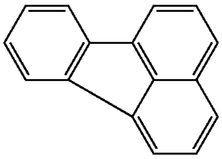

(X12)

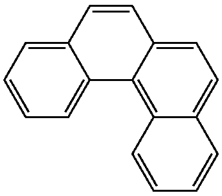

(X13)

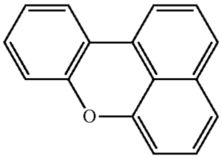

(X21)

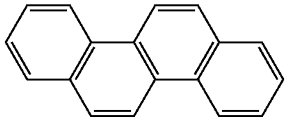

(X22)

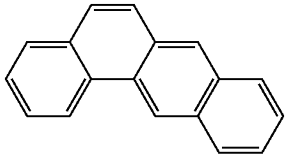

-continued (X31)

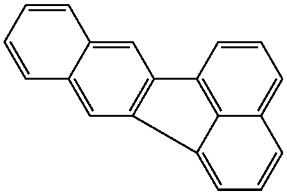

(X41)

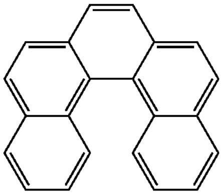

(X51)

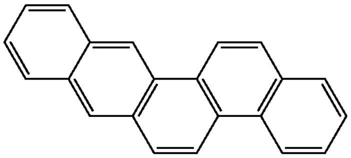

In the organic EL device according to the exemplary embodiment, also preferably, the first host material has, in a molecule, a biphenyl structure including a first benzene ring and a second benzene ring linked to each other with a single bond, and the first benzene ring and the second benzene ring in the biphenyl structure are further linked to each other by cross-linking at at least one site other than the single bond.

In the organic EL device according to the exemplary embodiment, also preferably, the first benzene ring and the second benzene ring in the biphenyl structure are further linked to each other by the cross-linking at one site other than the single bond. When the first host material has the biphenyl structure including such cross-linking, deterioration in the chromaticity of the organic EL device is expected to be inhibited.

In the organic EL device according to the exemplary embodiment, the cross-linking also preferably includes a double bond.

In the organic EL device according to the exemplary embodiment, the cross-linking also preferably includes no double bond.

Also preferably, the first benzene ring and the second benzene ring in the biphenyl structure are further linked to each other by the cross-linking at two sites other than the single bond.

In the organic EL device according to the exemplary embodiment, also preferably, the first benzene ring and the second benzene ring in the biphenyl structure are further linked to each other by the cross-linking at two sites other than the single bond, and the cross-linking includes no double bond. When the first host material has the biphenyl structure including such cross-linking, deterioration in the chromaticity of the organic EL device is expected to be inhibited.

For instance, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

[Formula 84]

(BP1)

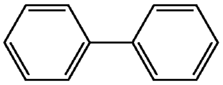

(BP11)

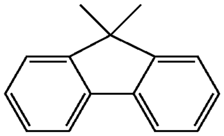

(BP12)

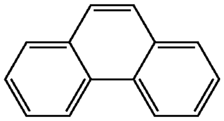

(BP13)

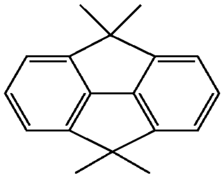

(BP14)

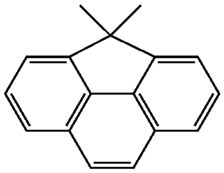

(BP15)

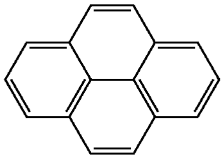

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other by cross-linking including no double bond at one of two sites other than the single bond, and the first benzene ring and the second benzene ring are linked to each other by cross-linking including a double bond at the other of the two sites other than the single bond.

The formula (BP15) represents a linking structure in which the first benzene ring and the second benzene ring are linked to each other at two sites other than the single bond by cross-linking including a double bond.

In the first compound, the groups specified to be "substituted or unsubstituted" are each preferably an "unsubstituted" group.

Method of Producing First Compound

The first compound can be produced by a known method. The first compound can also be produced based on a known method through a known alternative reaction using a known material(s) tailored for the target compound.

Specific Examples of First Compound

Specific examples of the first compound include the following compounds. It should however be noted that the invention is not limited to the specific examples of the first compound.

In the specific examples of the compound herein, D represents a deuterium atom, Me represents a methyl group, and tBu represents a tert-butyl group.

[Formula 85]

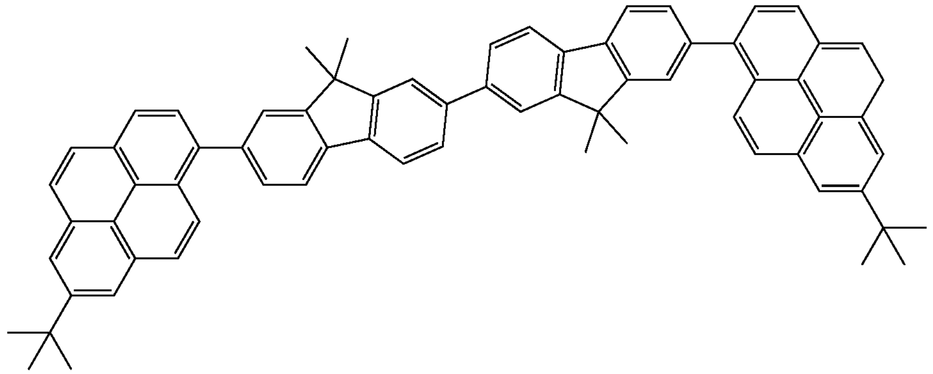

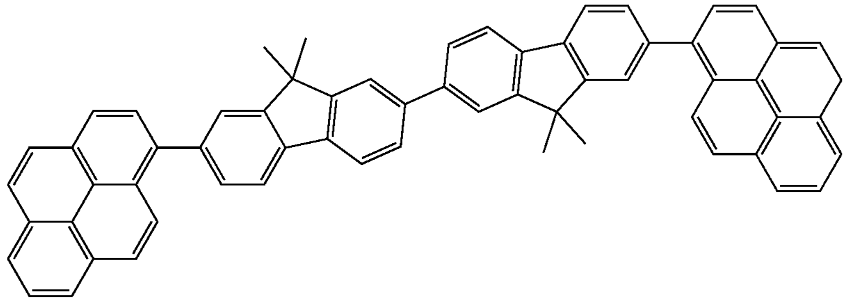

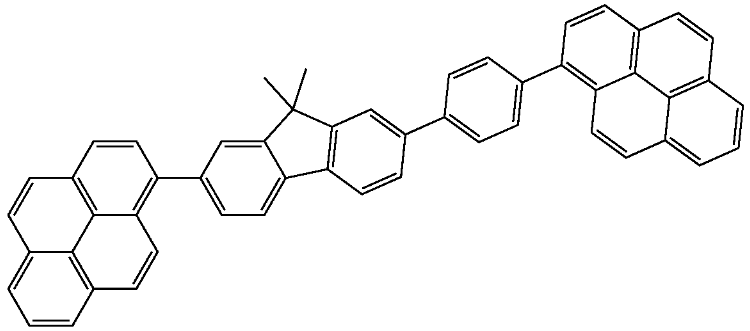

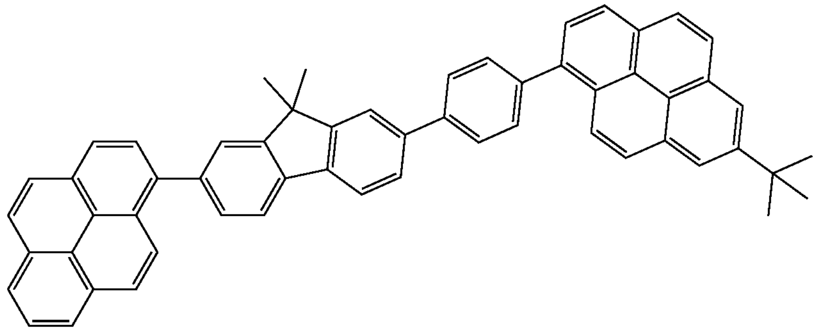

-continued
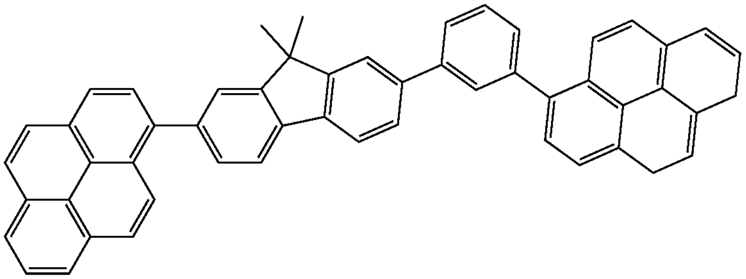
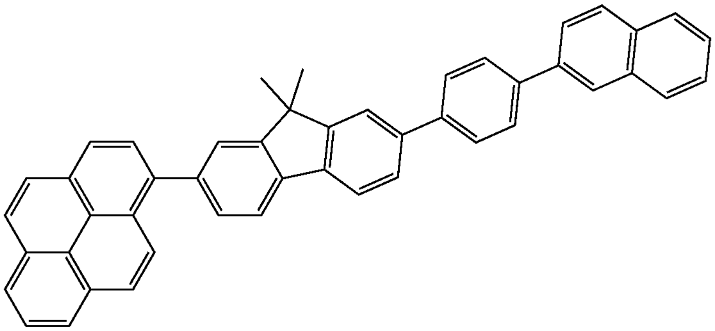
[Formula 86]
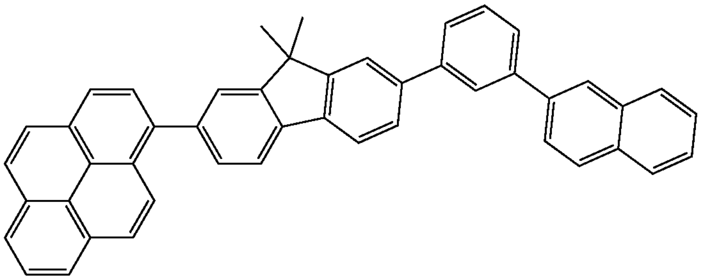
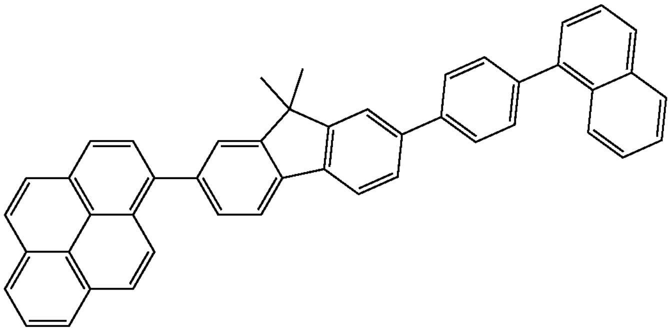
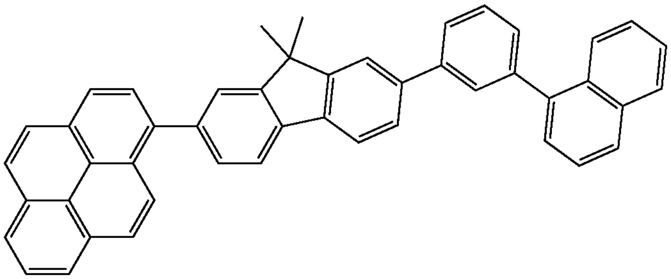

-continued
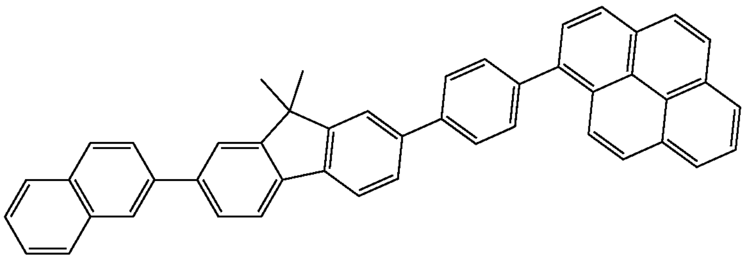
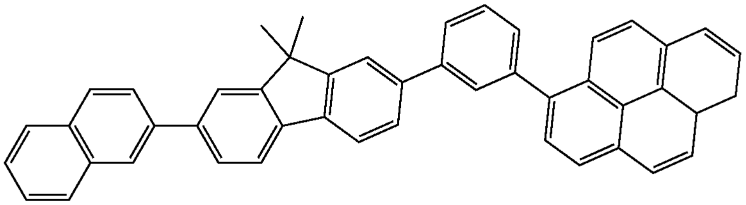
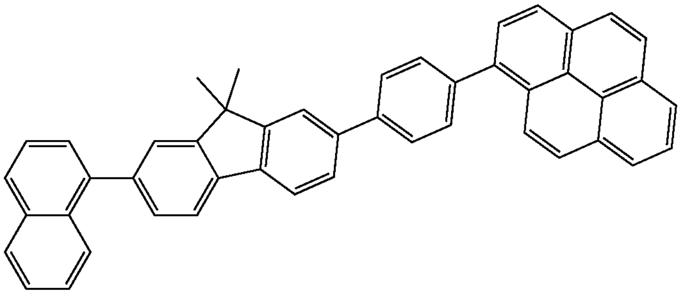
[Formula 87]
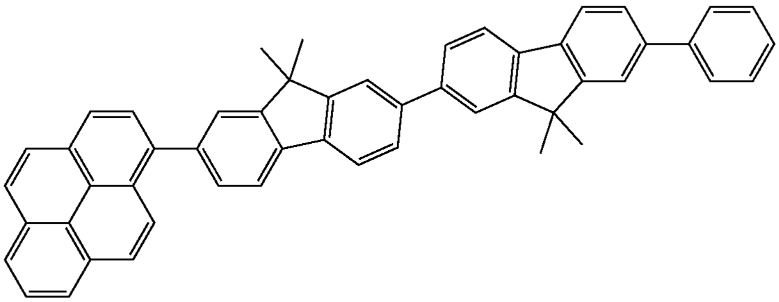
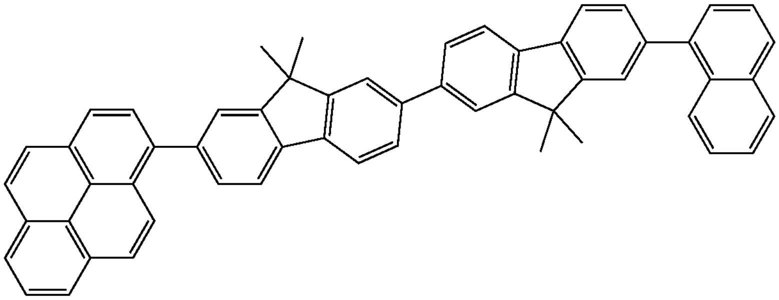
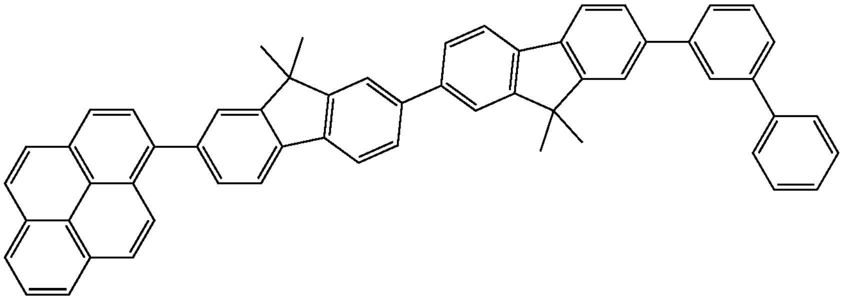

-continued
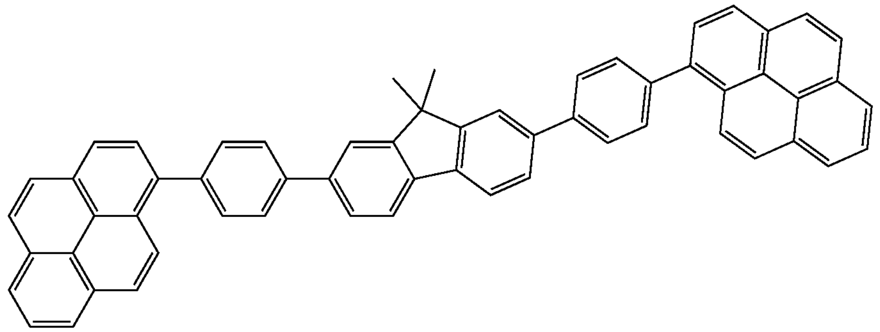
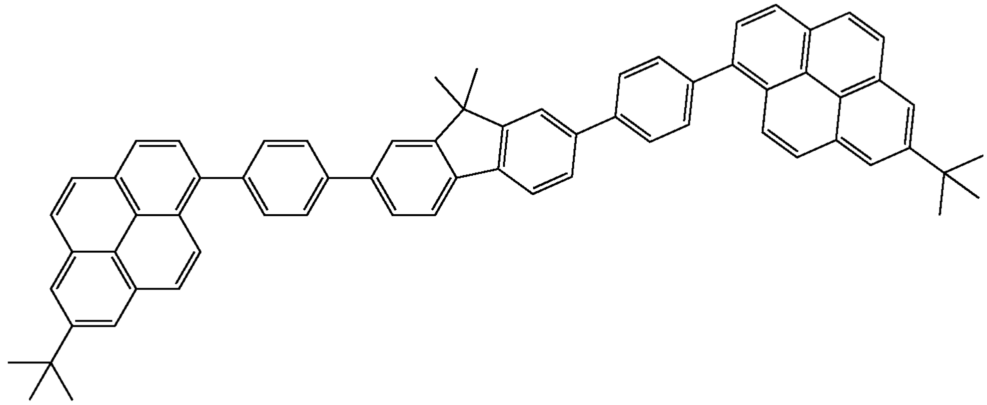
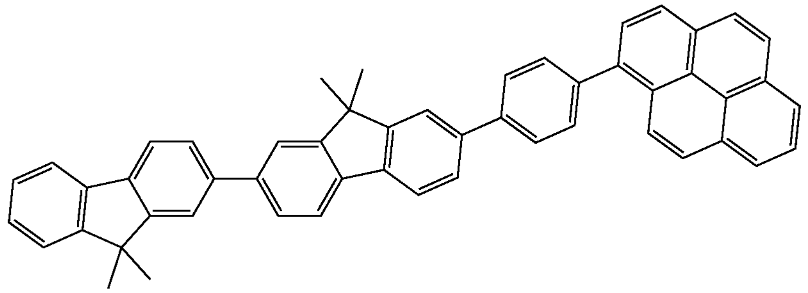
[Formula 88]
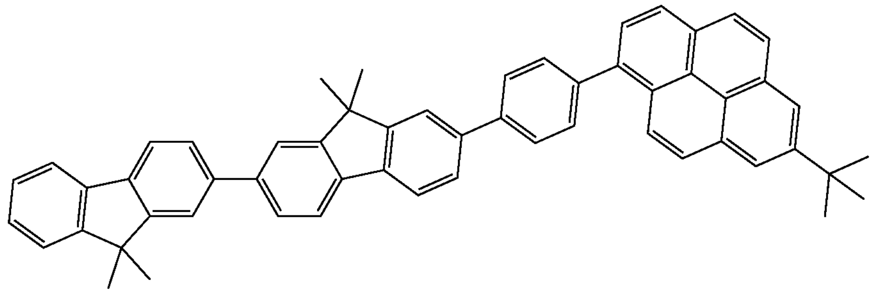
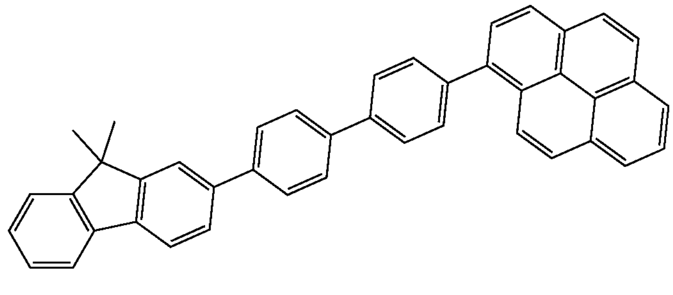

-continued
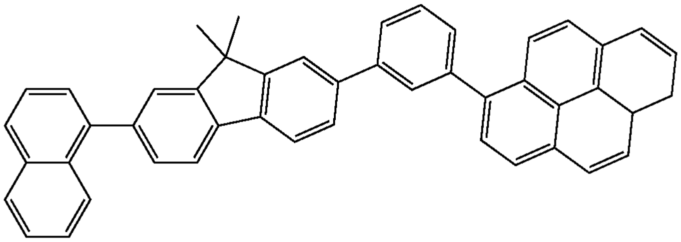
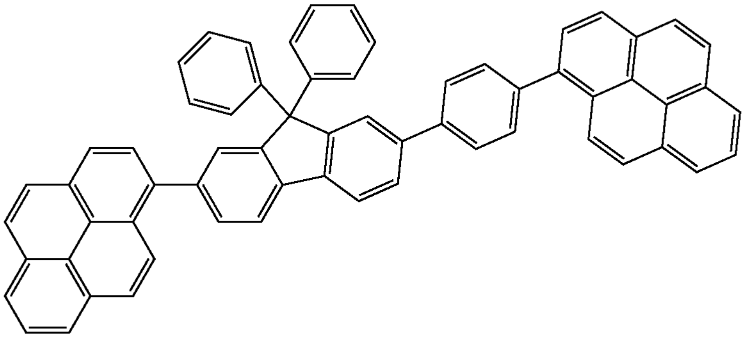
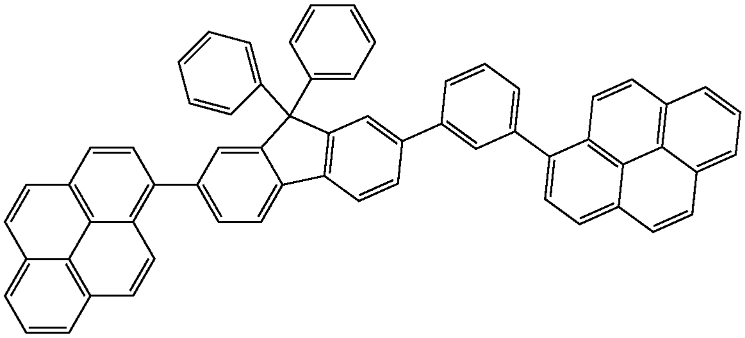
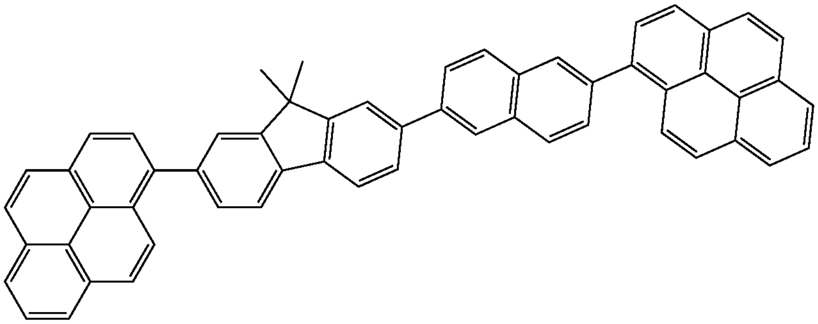
[Formula 89]
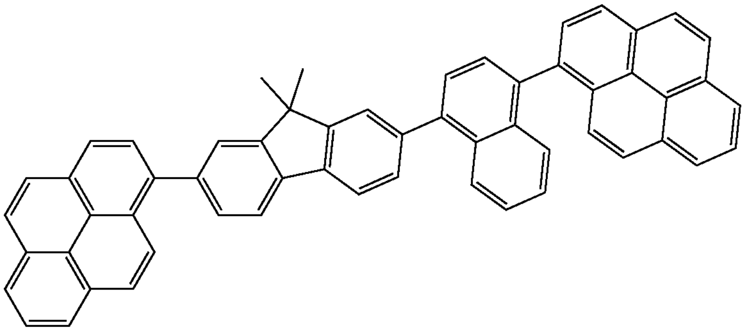

-continued
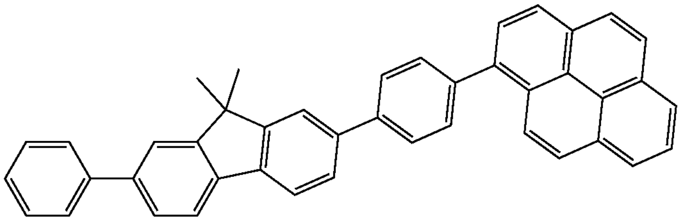
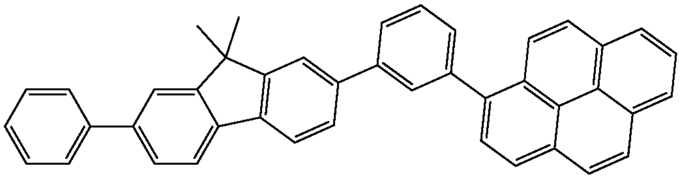
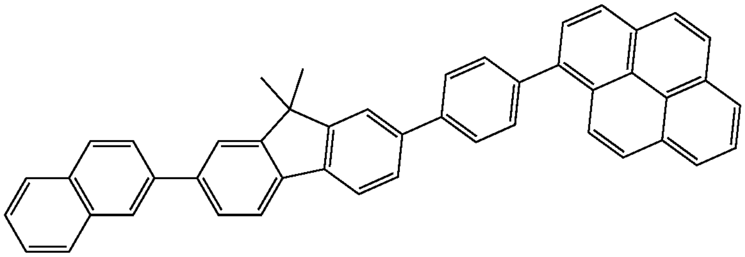
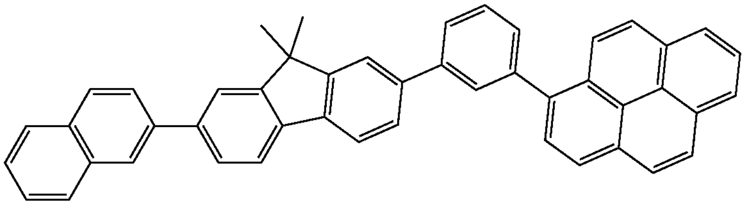
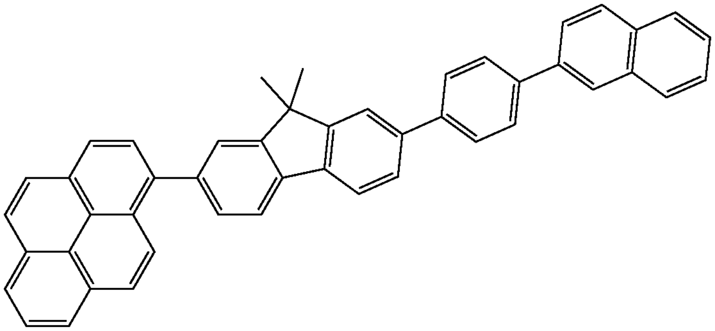
[Formula 90]
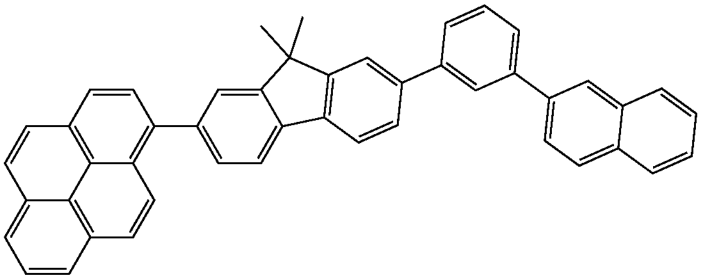

-continued
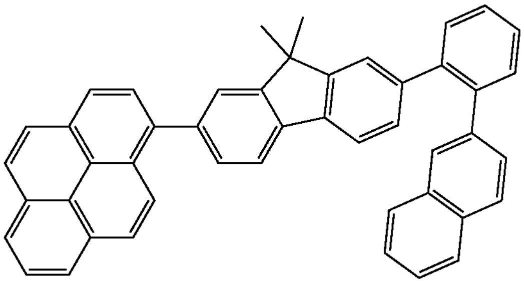
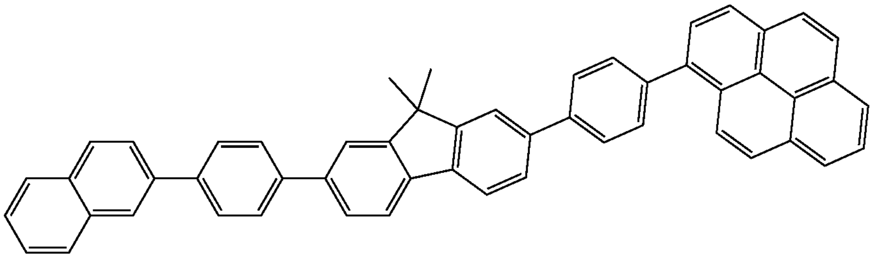
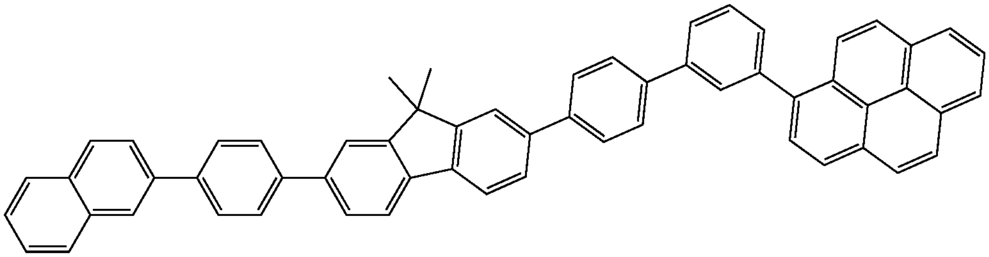
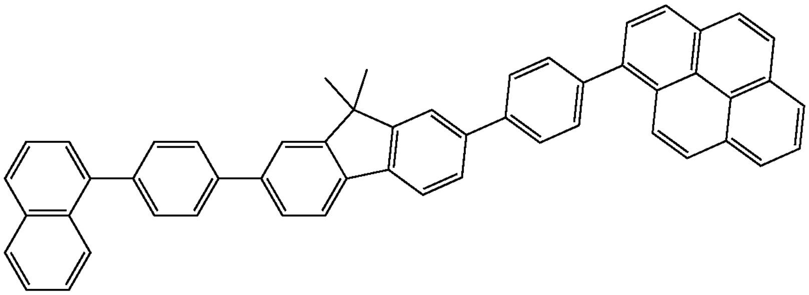
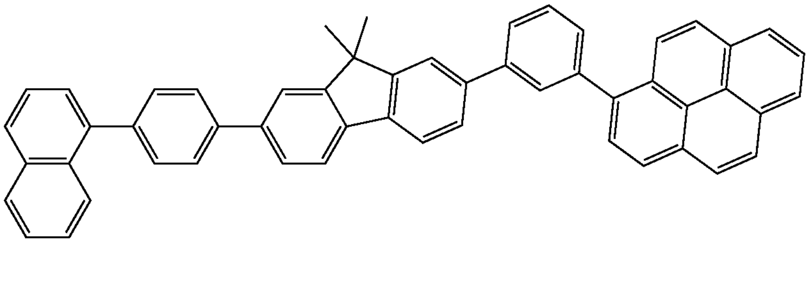

-continued
[Formula 91]
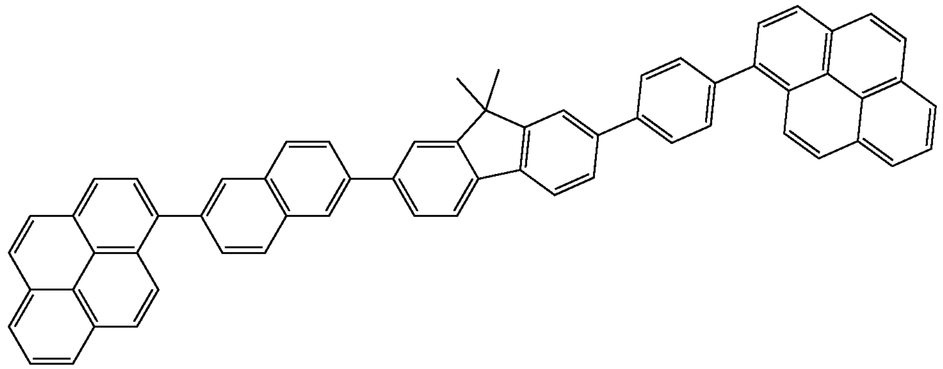
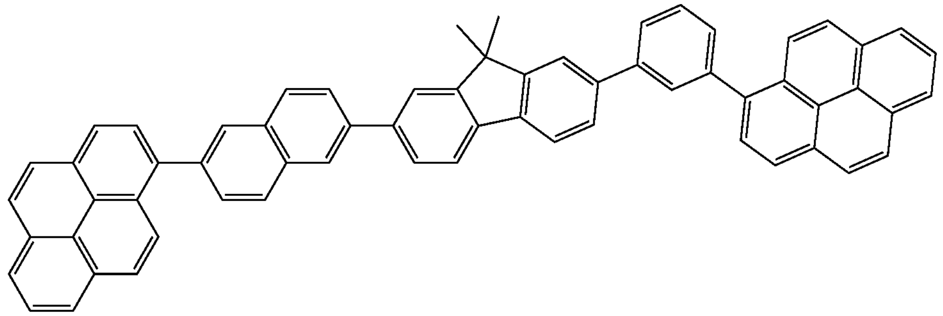
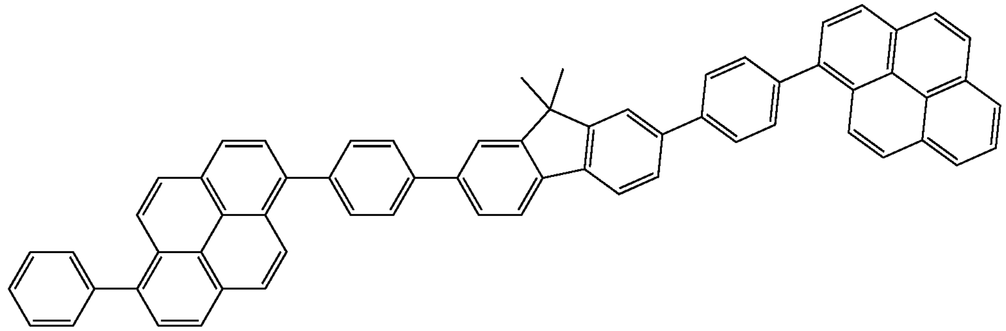
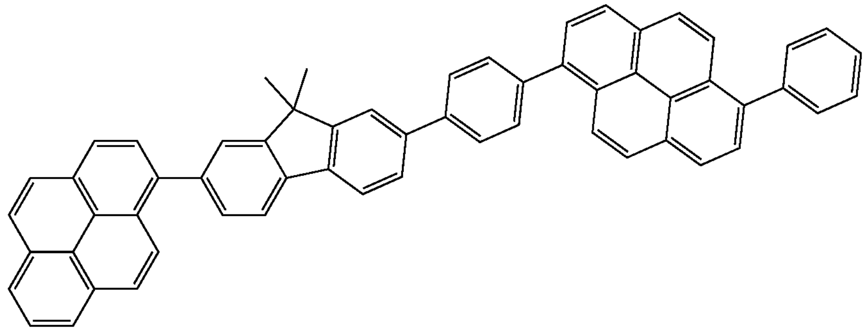
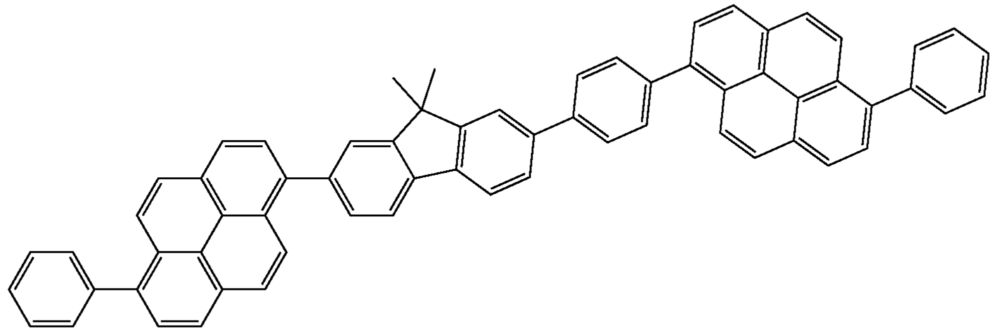

-continued
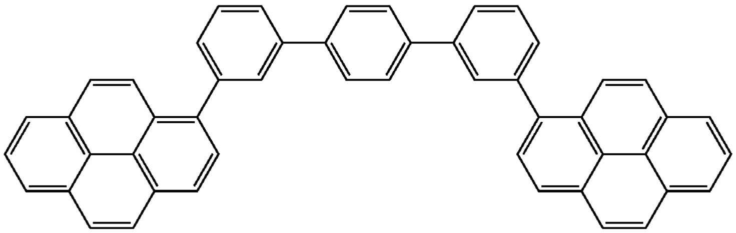
[Formula 92]
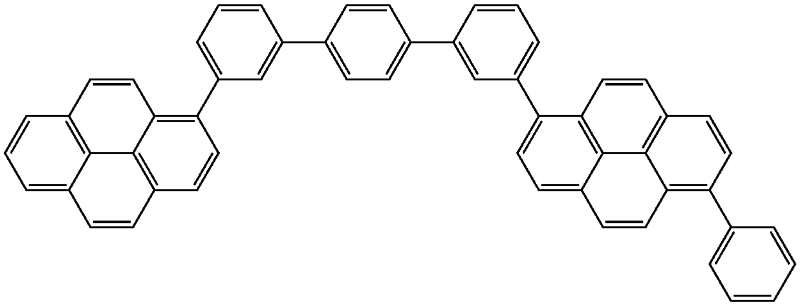
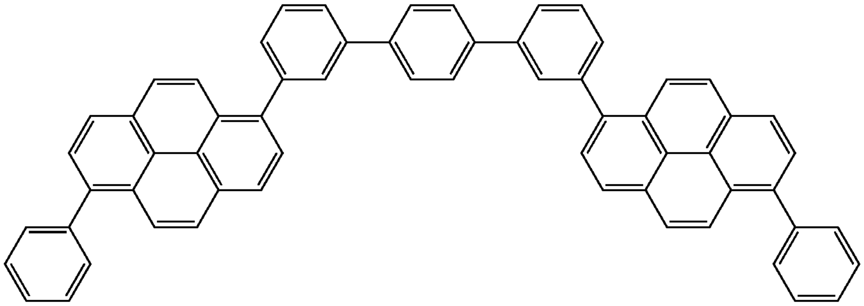
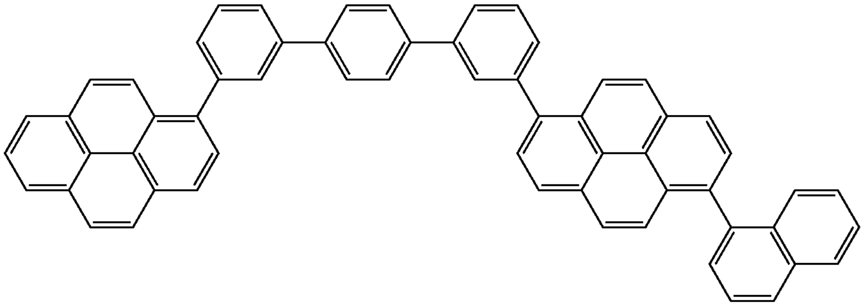
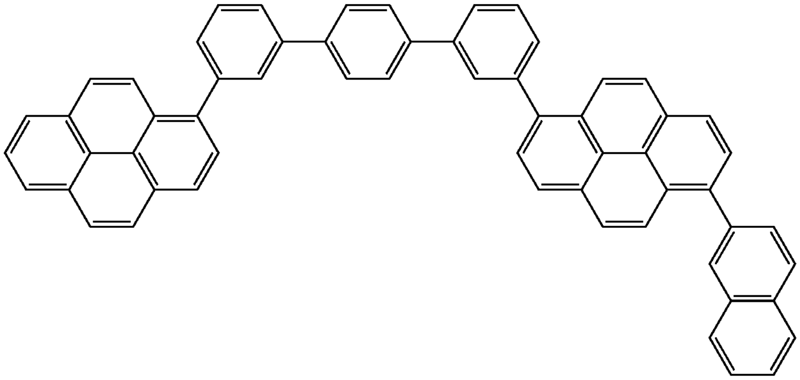

-continued
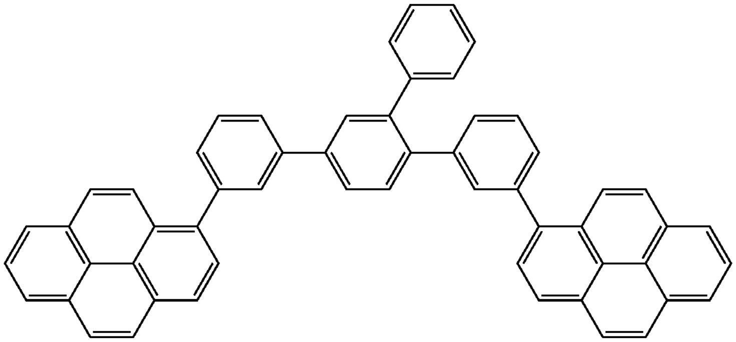
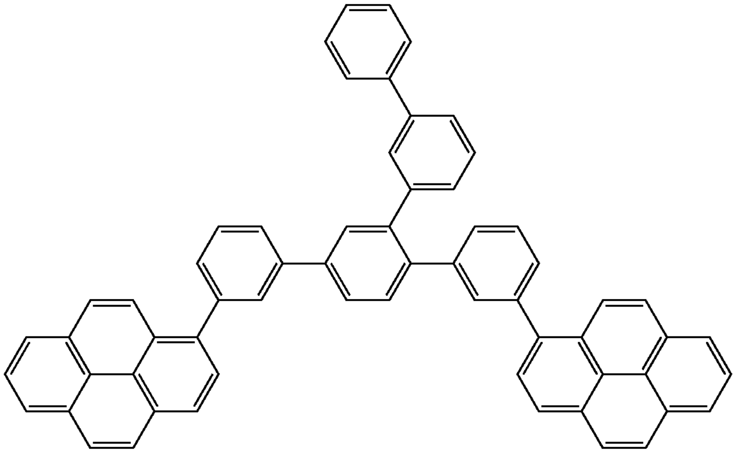
[Formula 93]
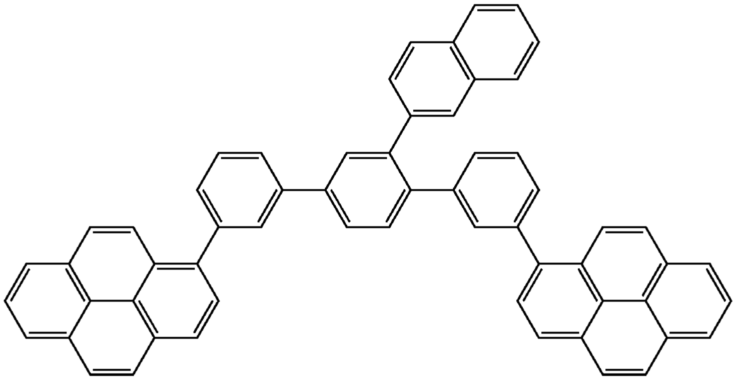
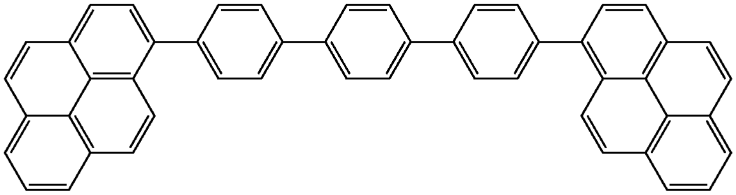
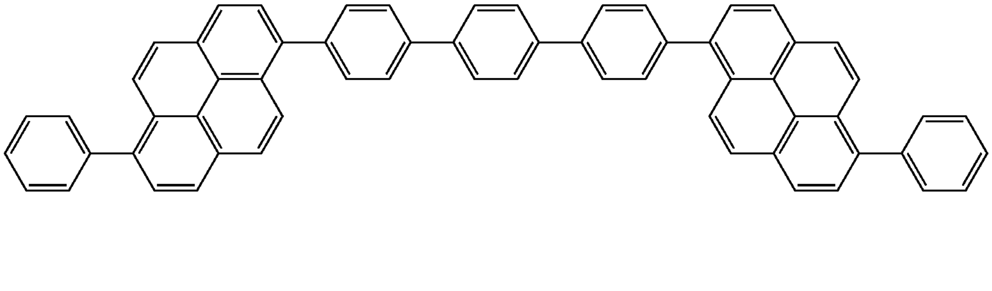

-continued
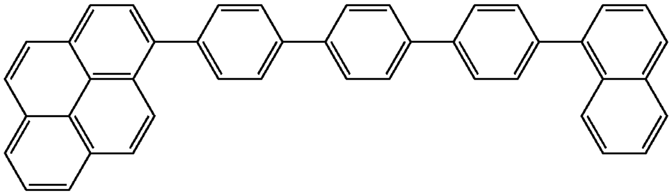
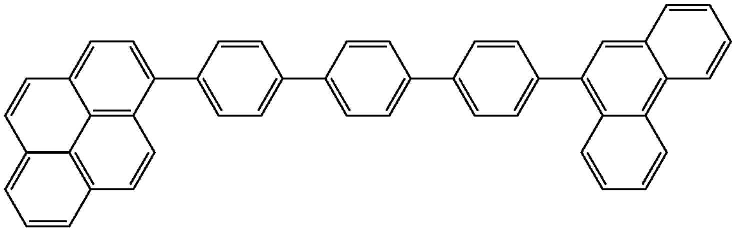
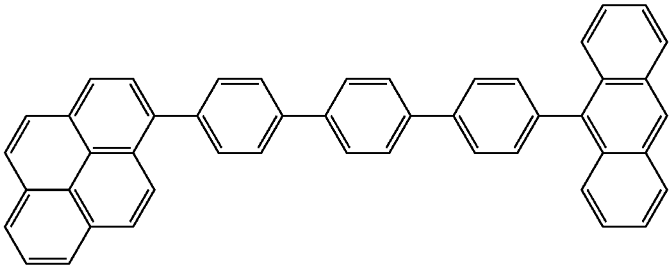
[Formula 94]
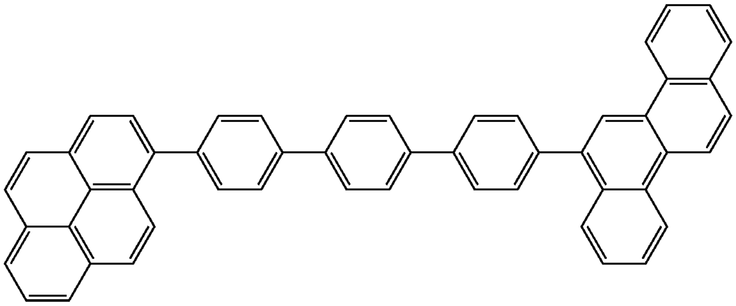
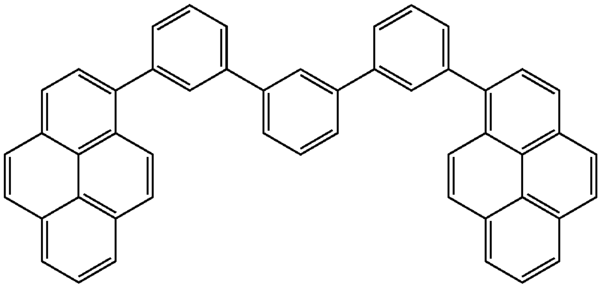
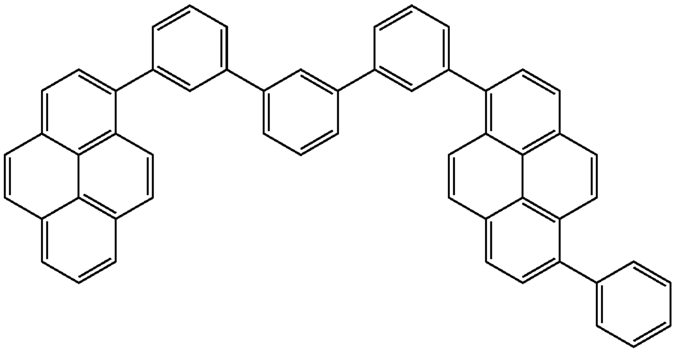

-continued
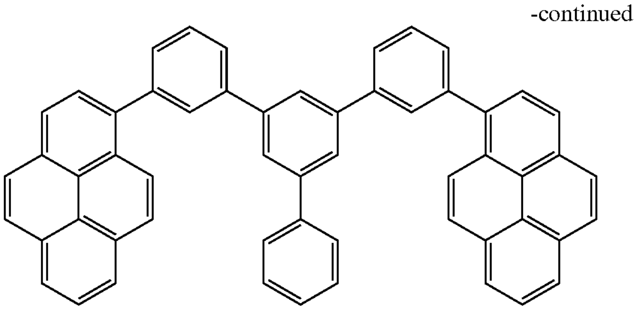
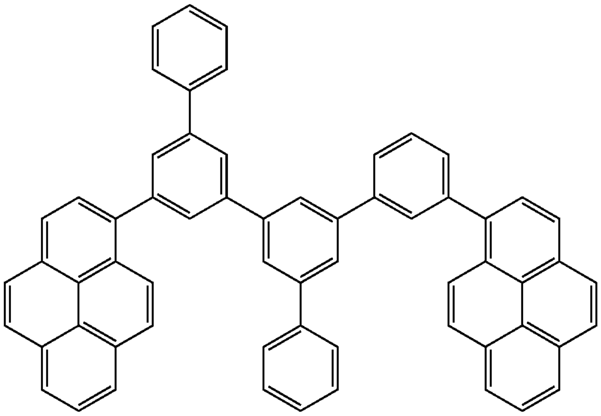
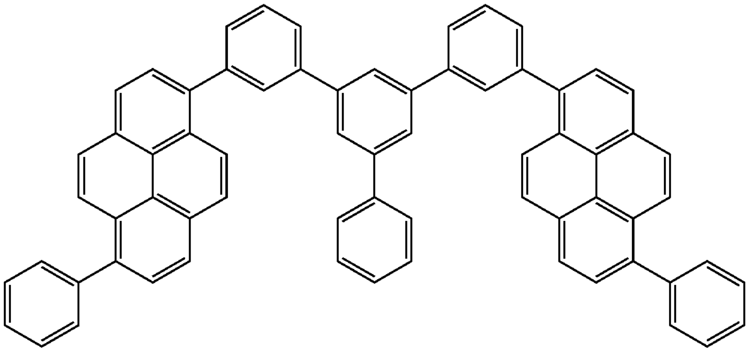
[Formula 95]
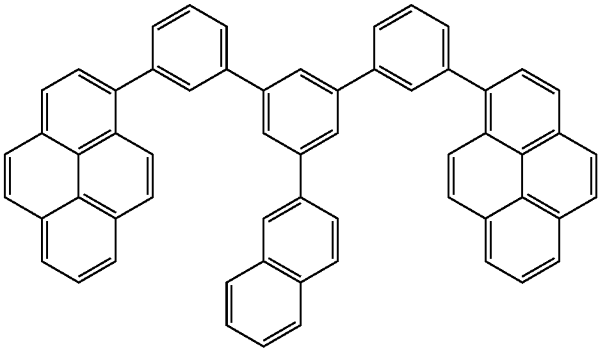
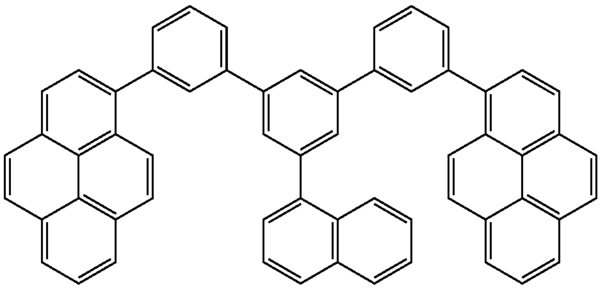

-continued
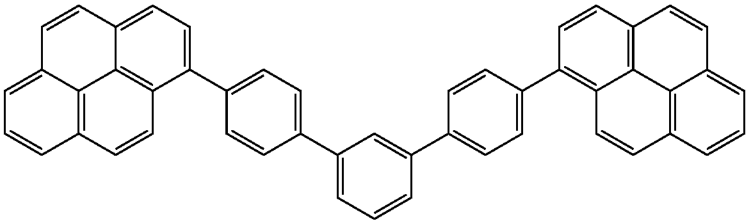
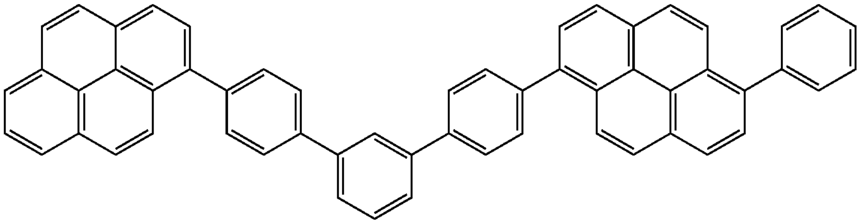
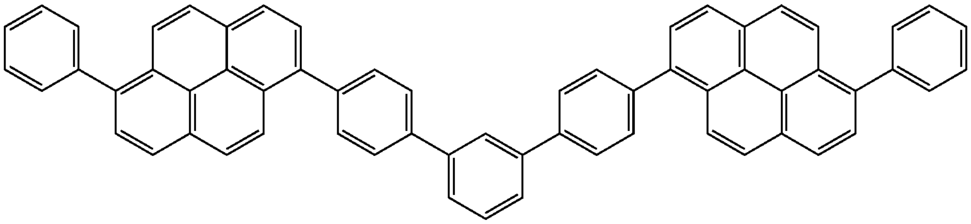
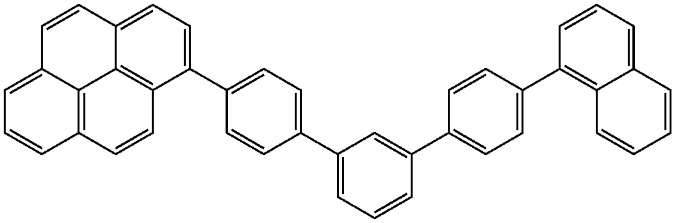
[Formula 96]
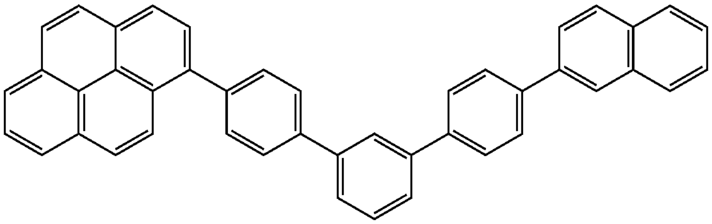
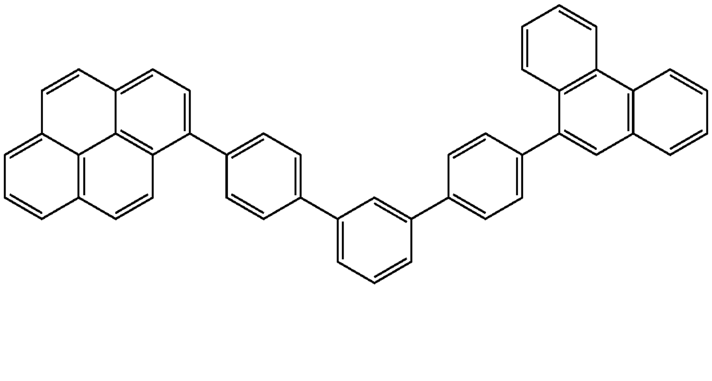

-continued
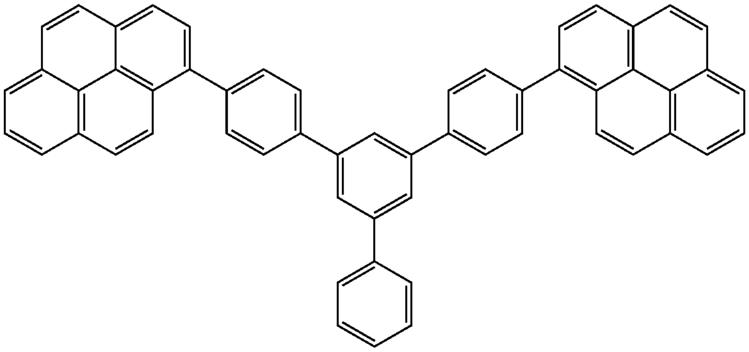
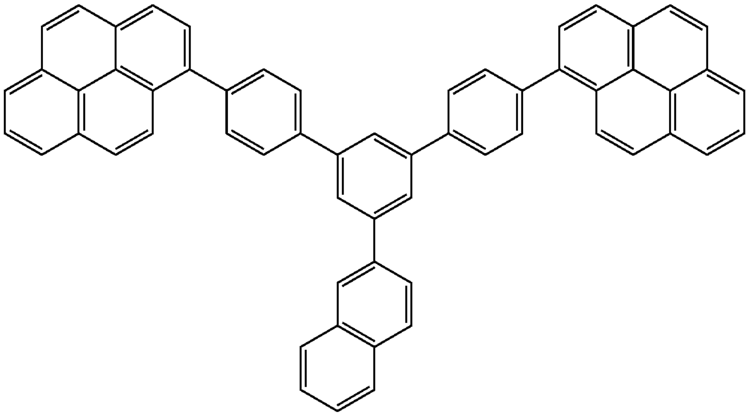
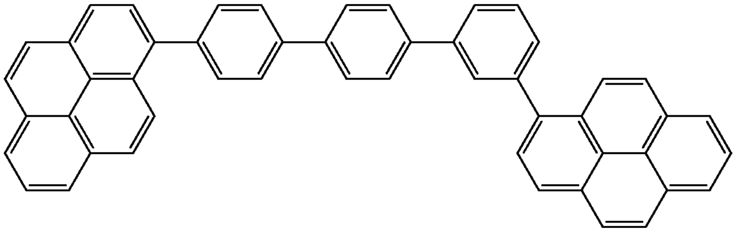
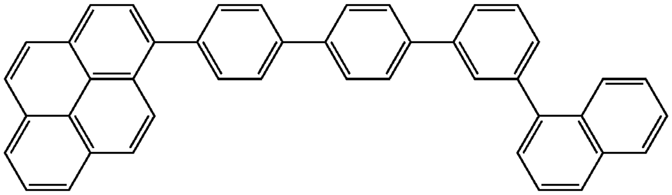
[Formula 97]
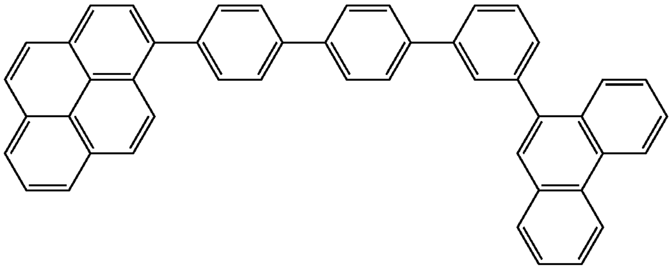
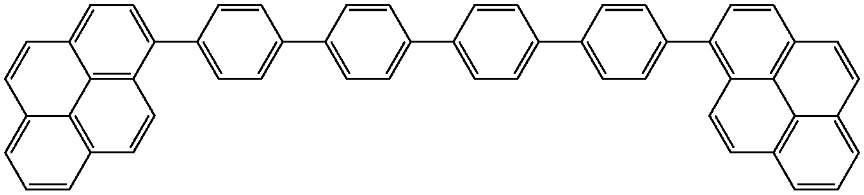

-continued
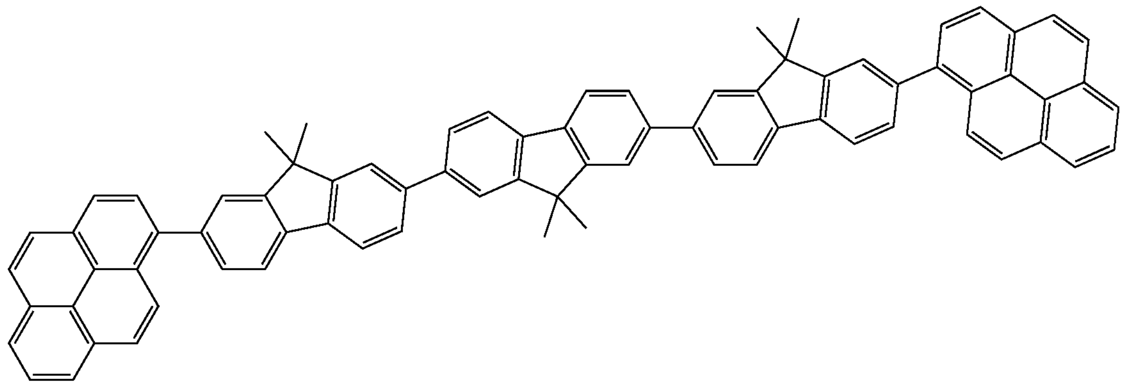
[Formula 98]
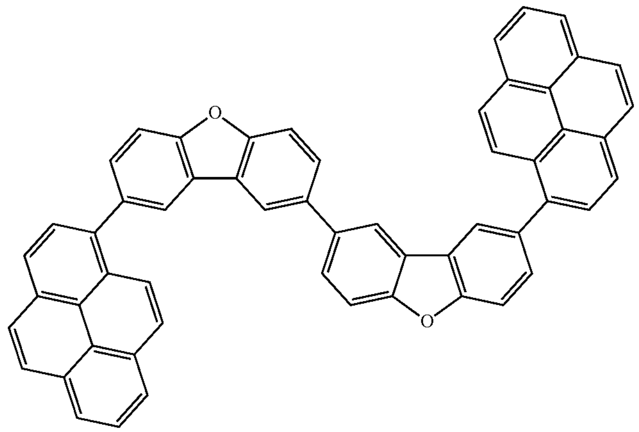
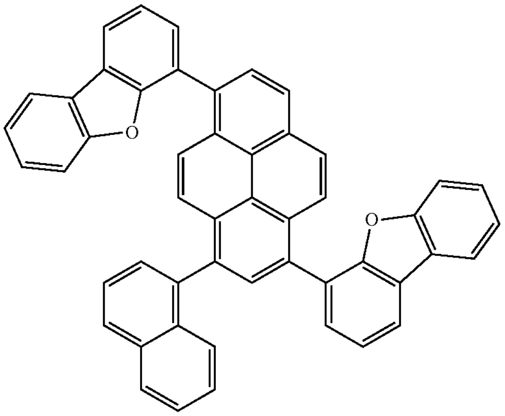
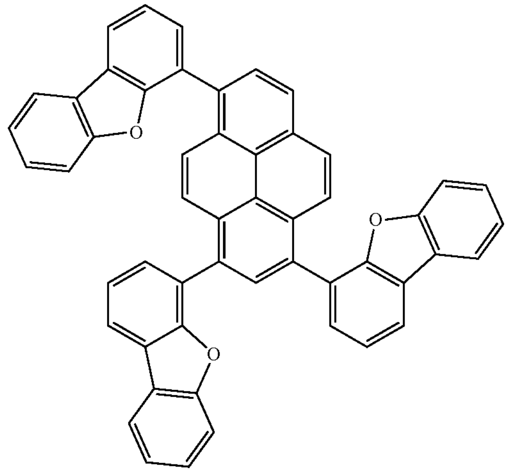
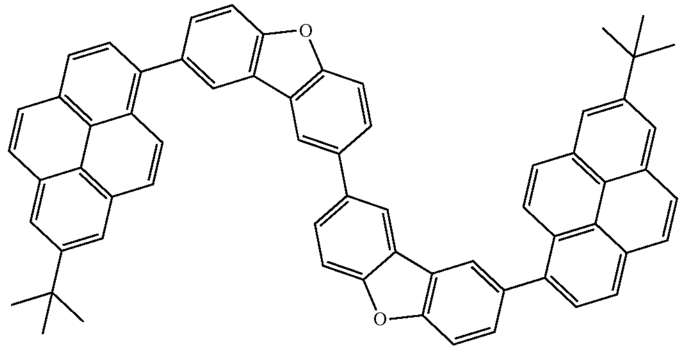

-continued
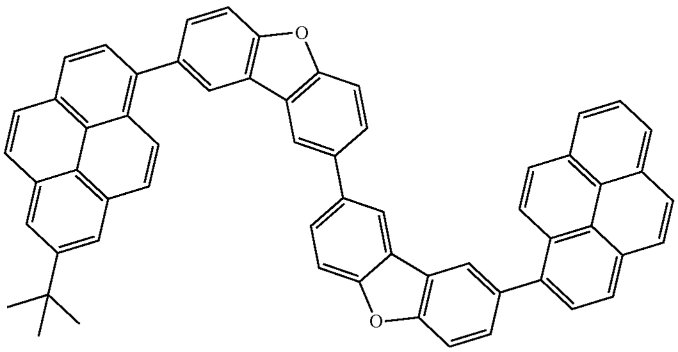
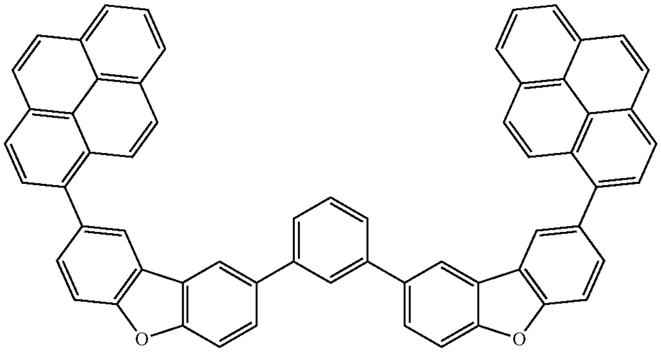
[Formula 99]
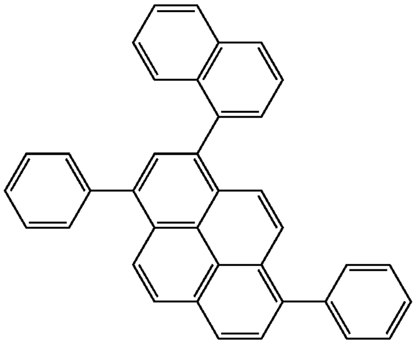
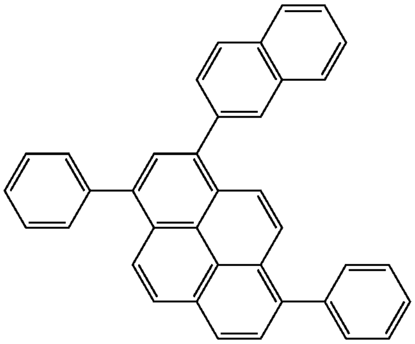
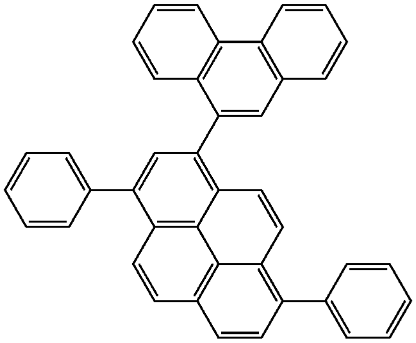
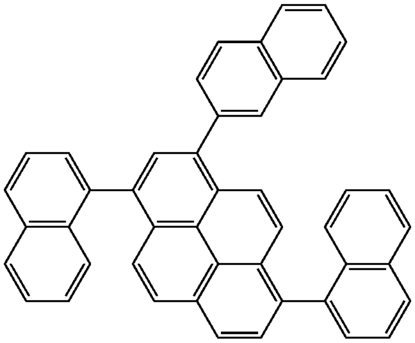

-continued
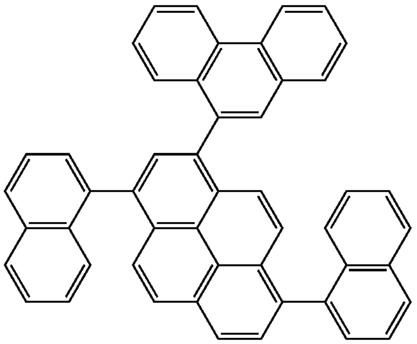
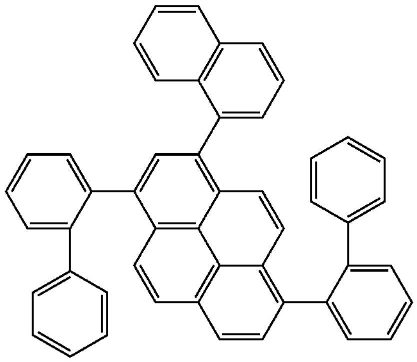
[Formula 100]
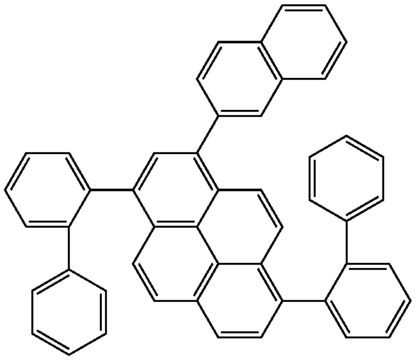
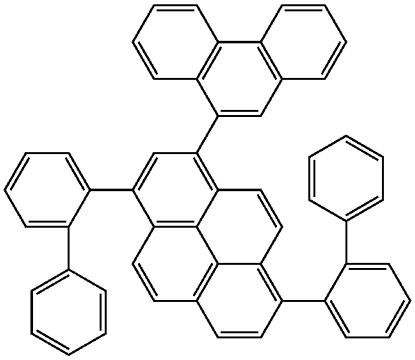
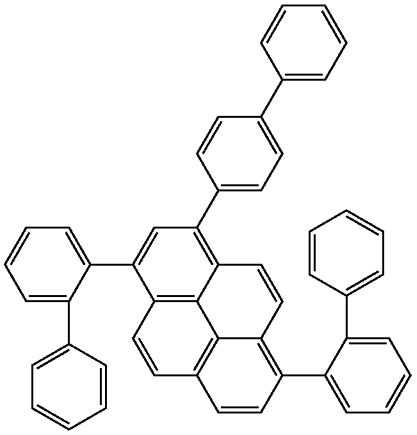
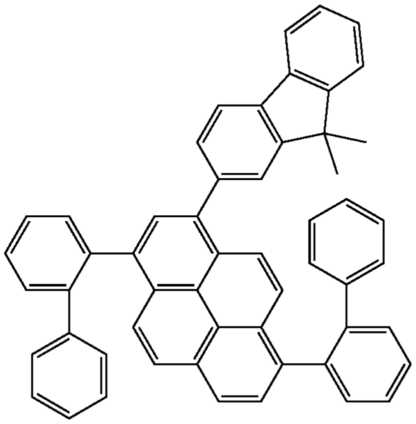
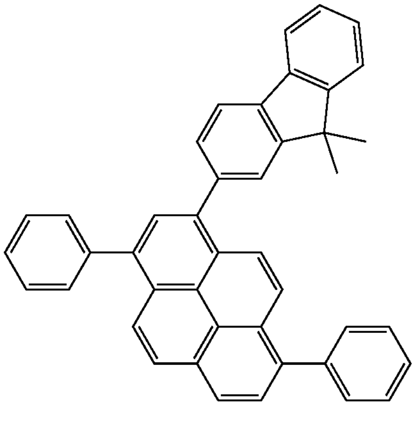
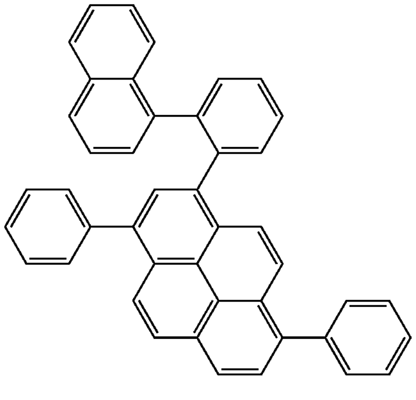

-continued
[Formula 101]
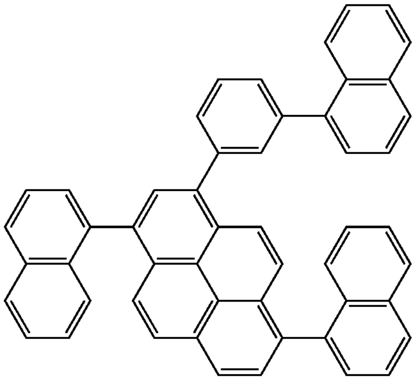
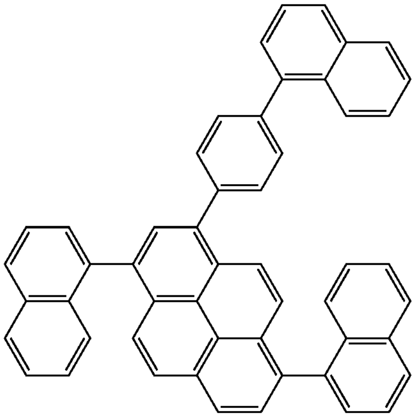
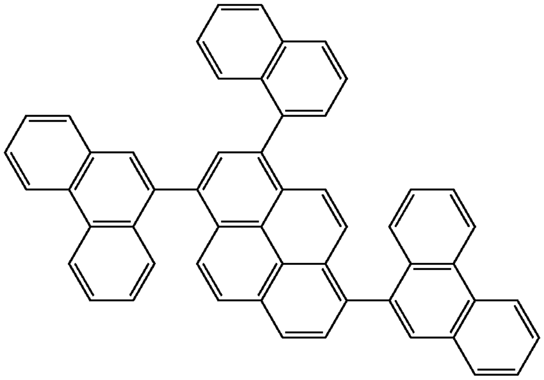
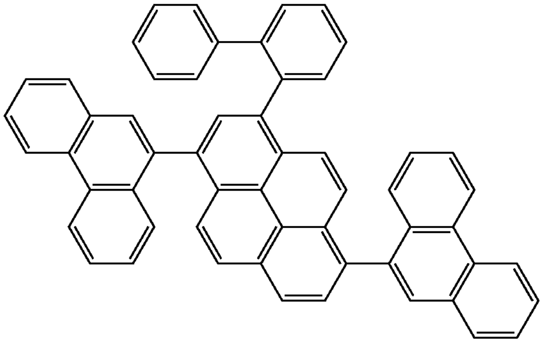
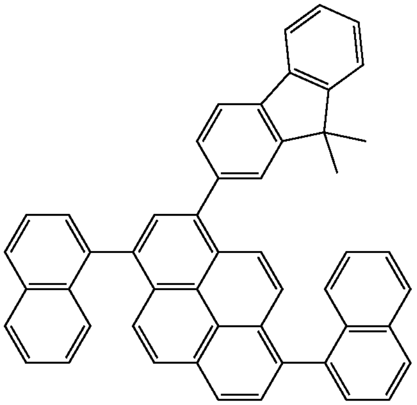
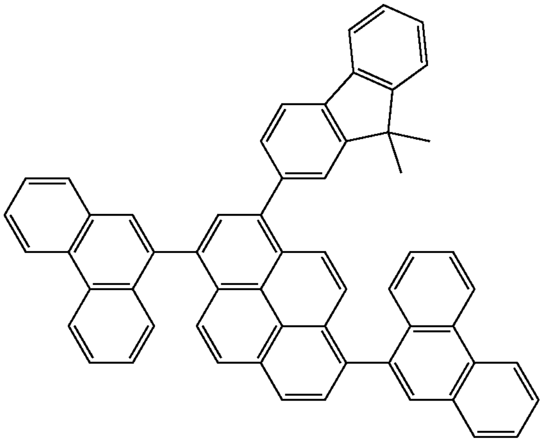

-continued
[Formula 102]
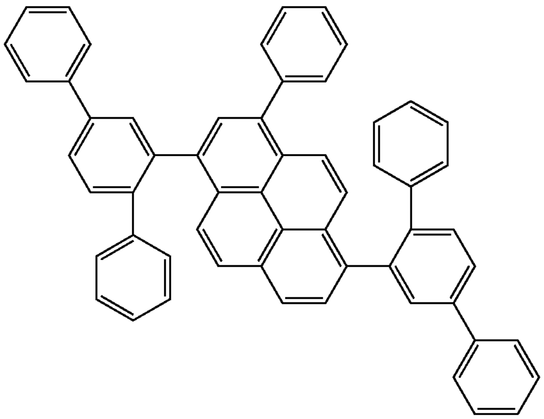
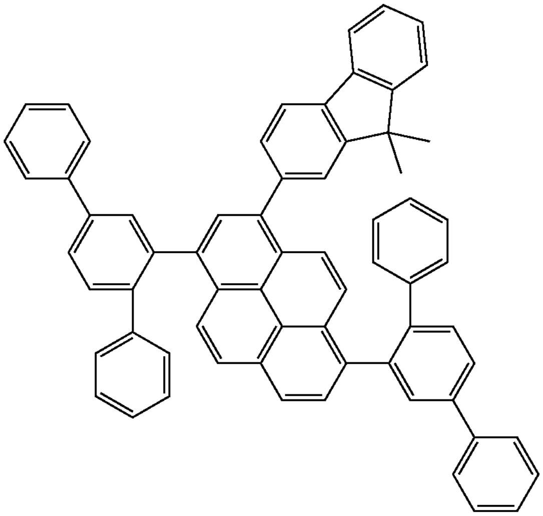
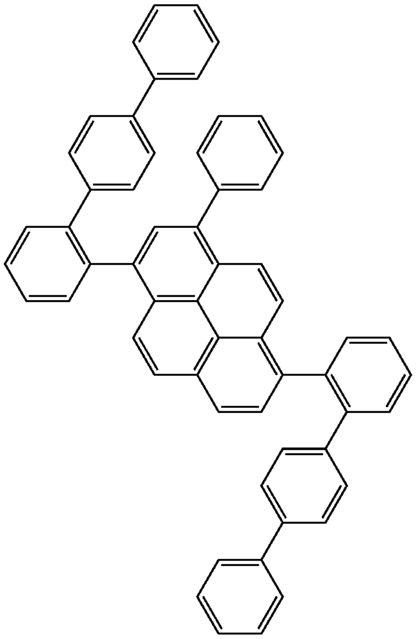
[Formula 103]
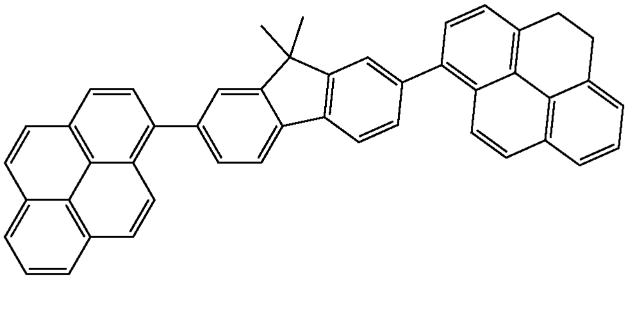

-continued
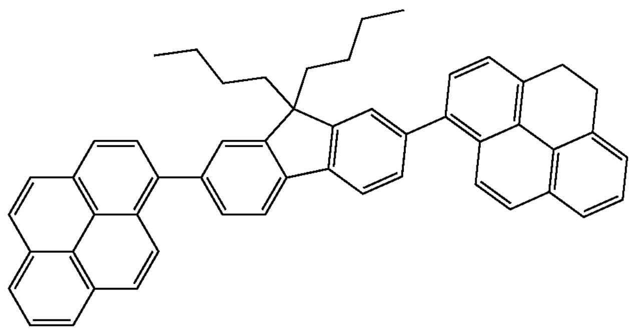
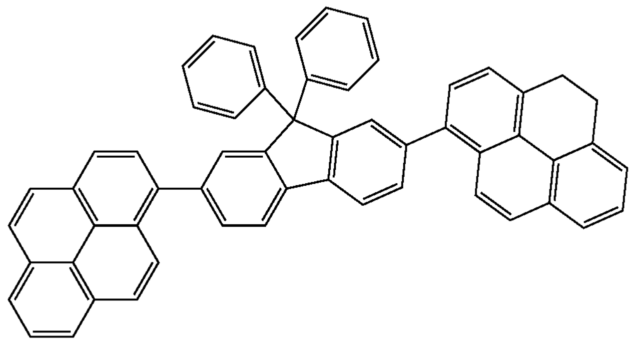
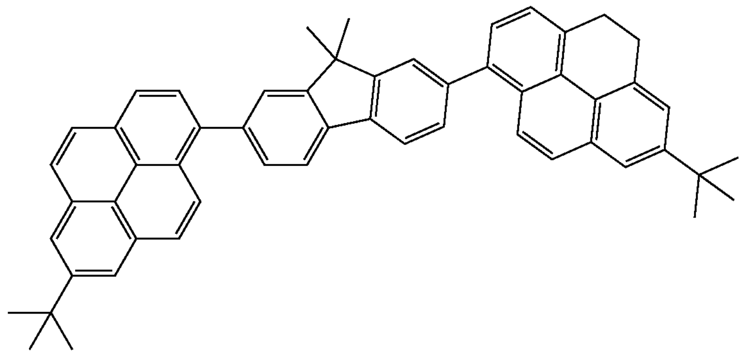
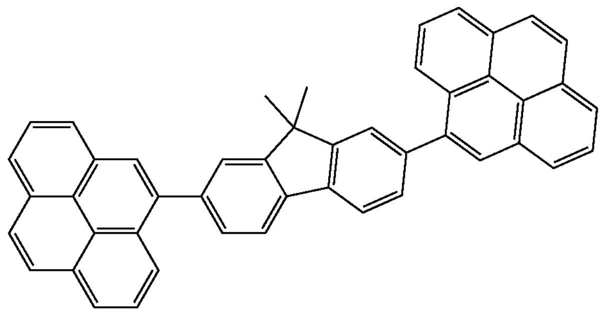

-continued
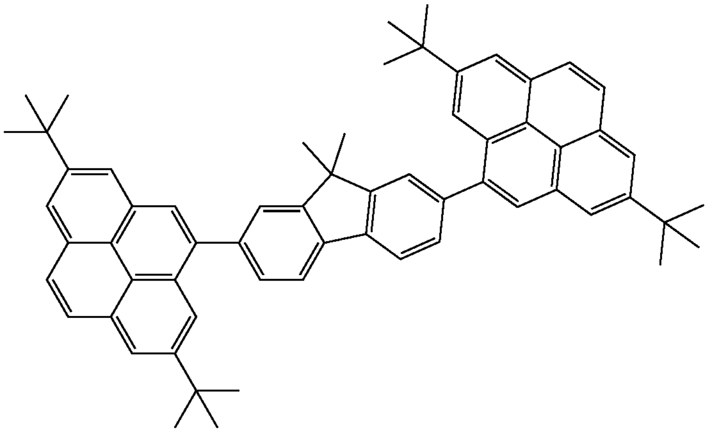
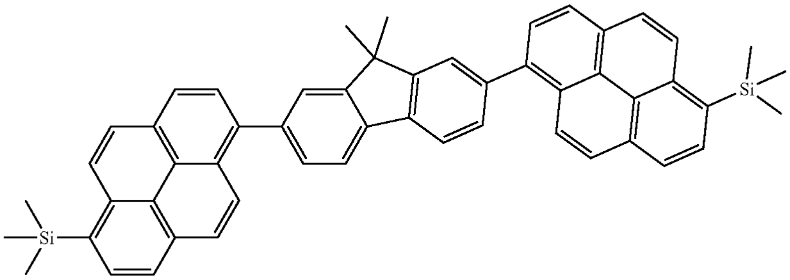
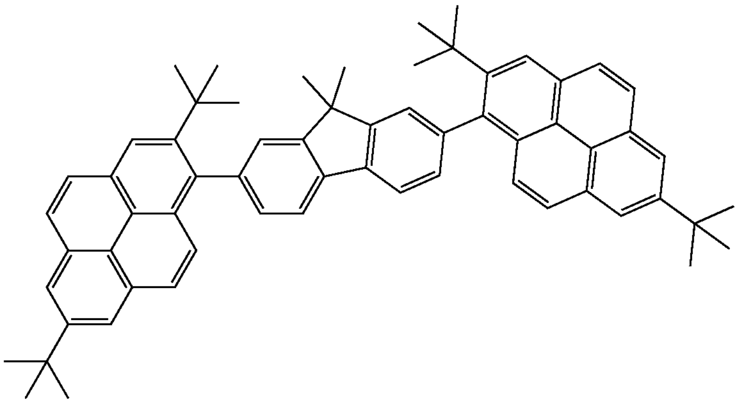
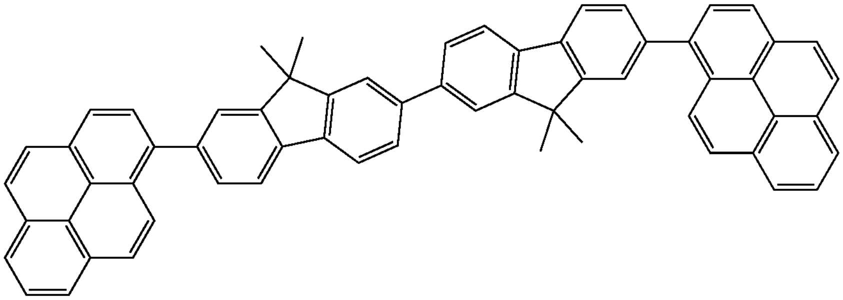

-continued
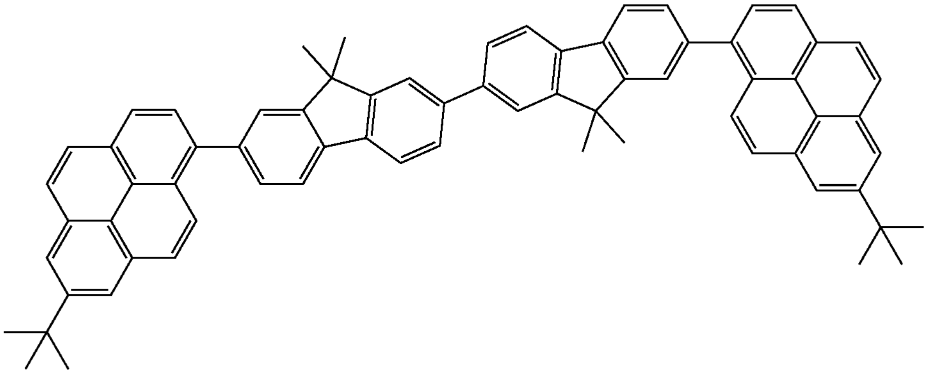
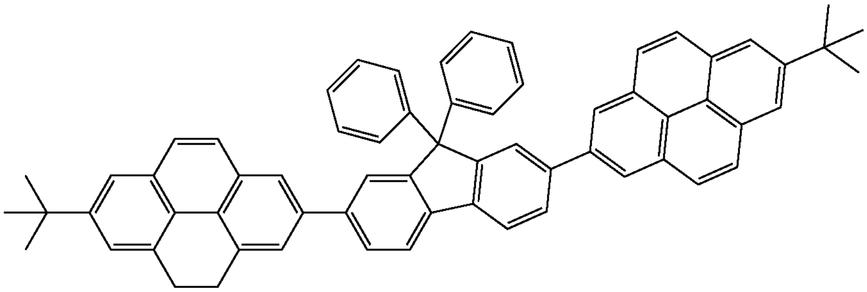
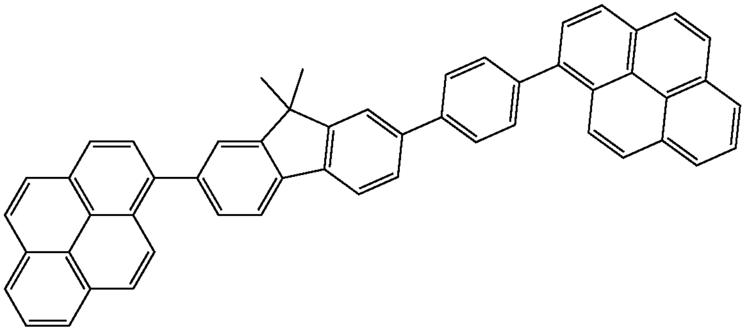
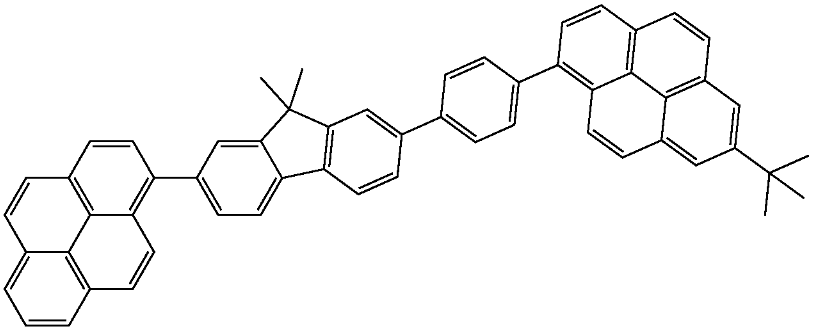
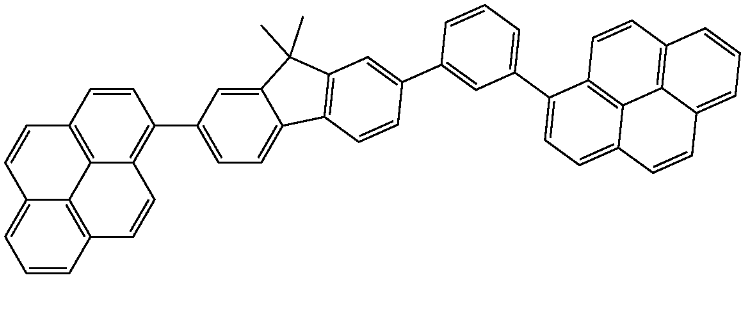

-continued
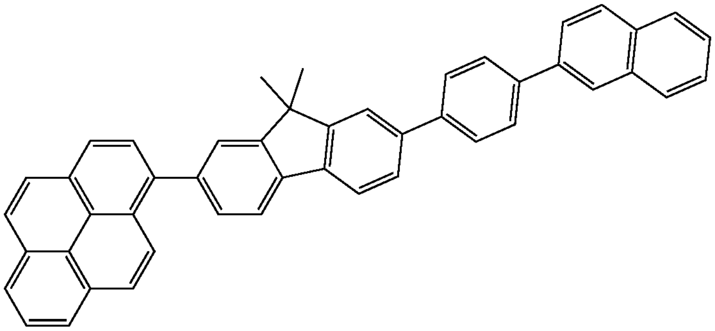
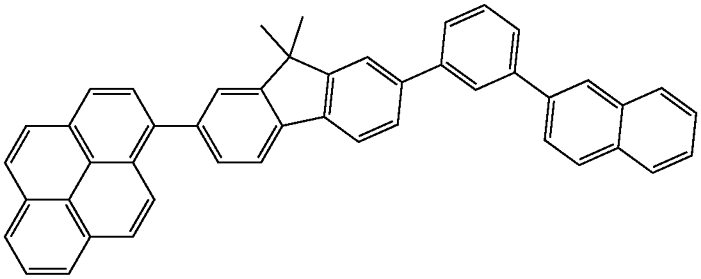
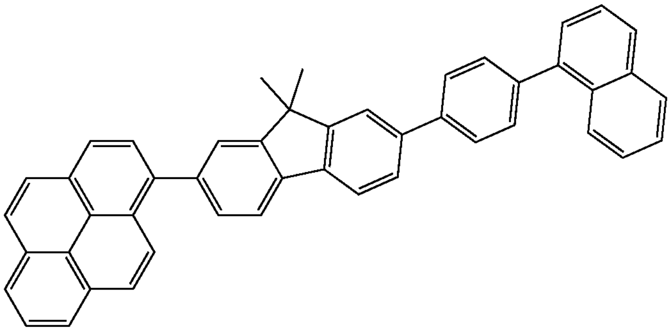
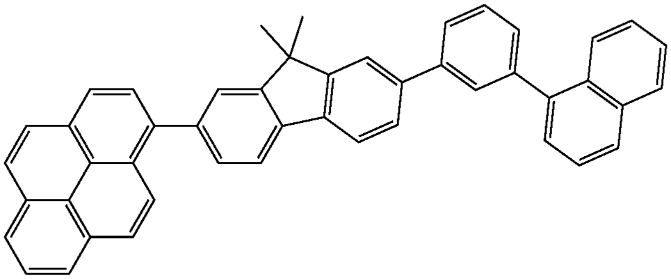
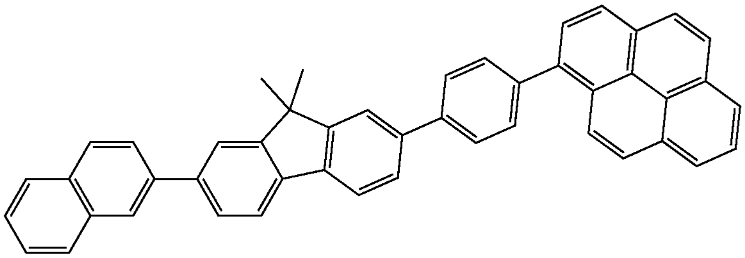
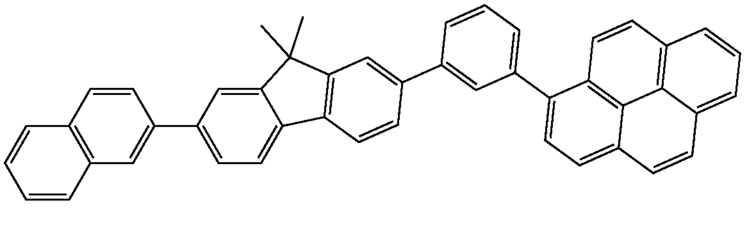

-continued
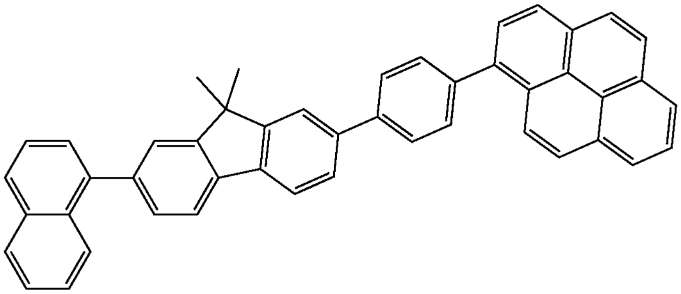
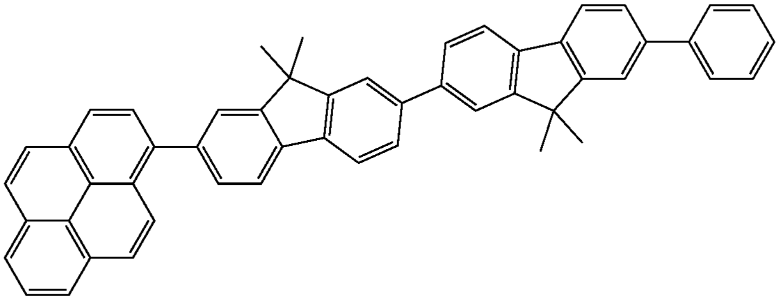
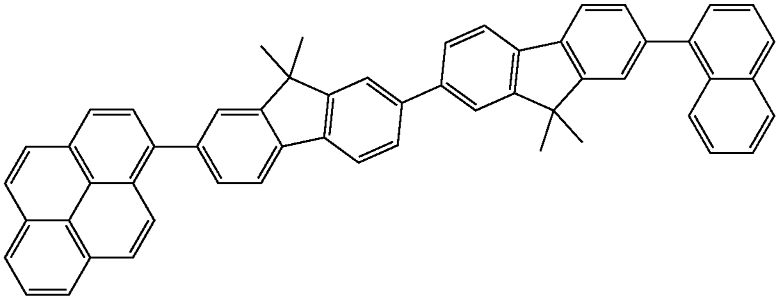
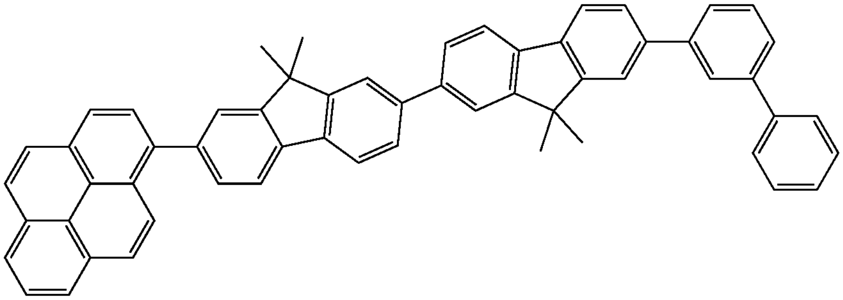
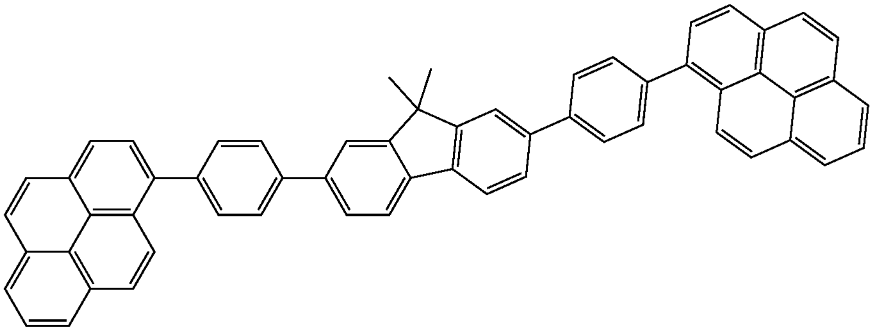

-continued
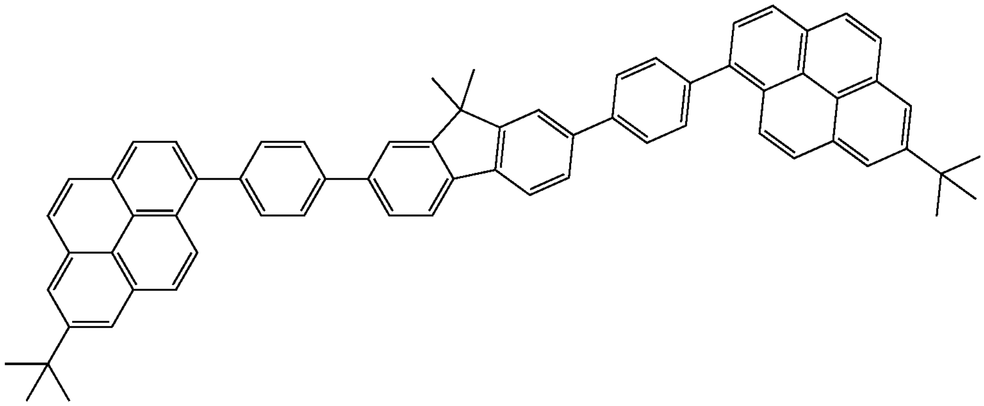
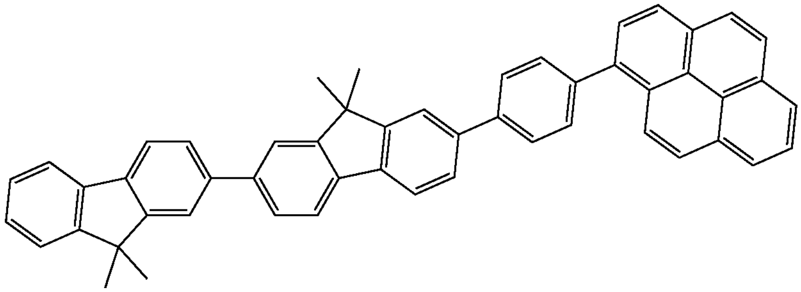
[Formula 104]
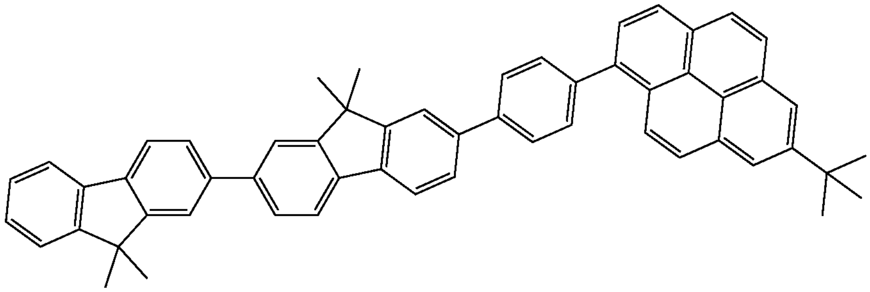
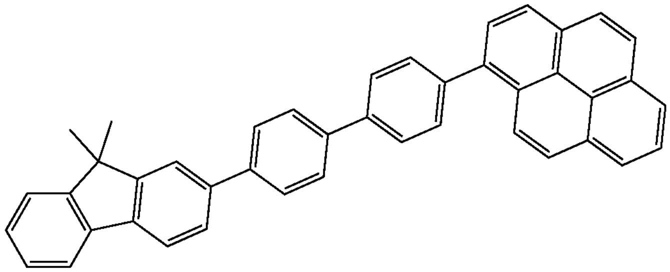
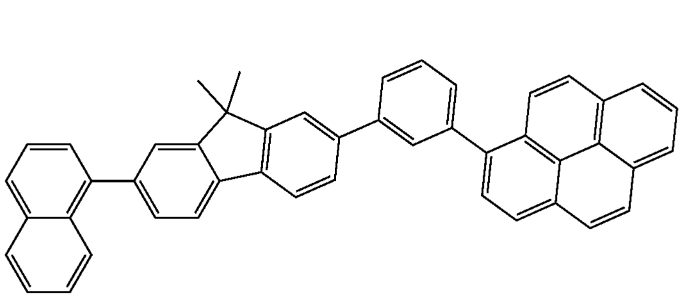

-continued
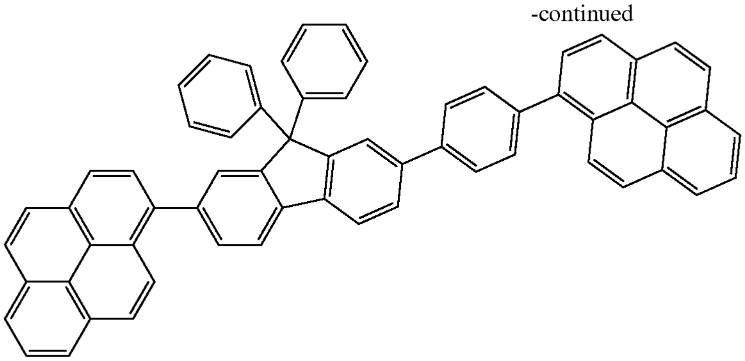
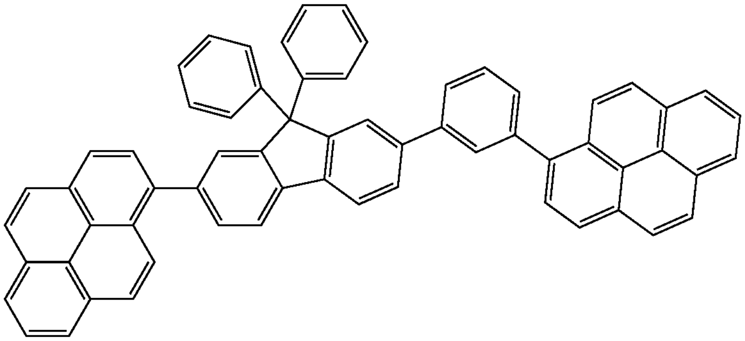
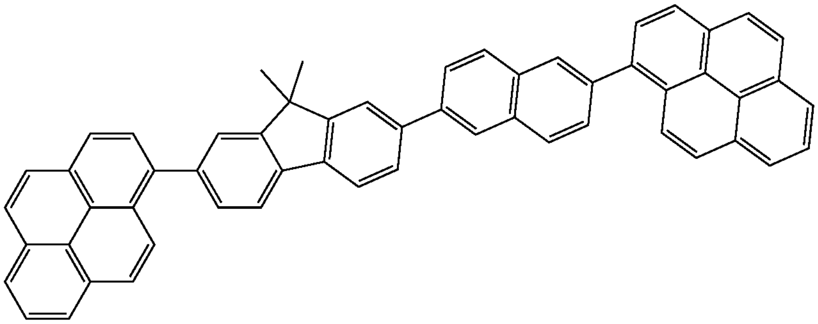
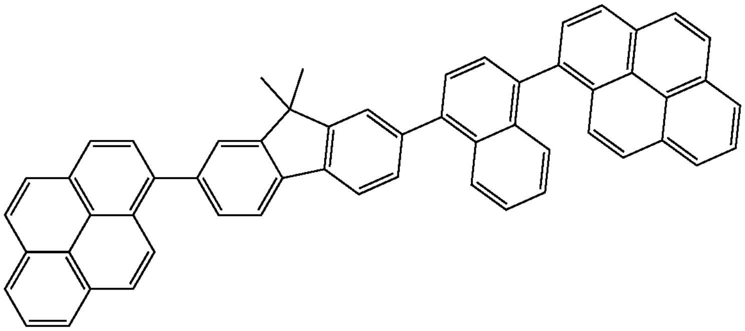
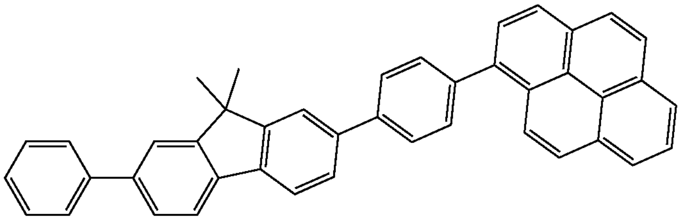
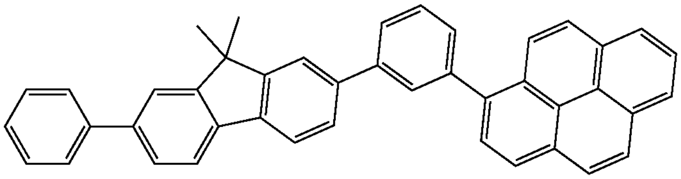

-continued
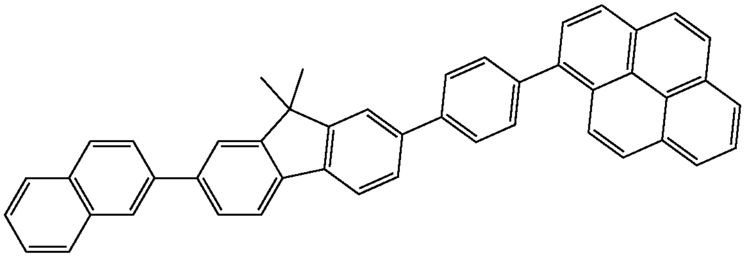
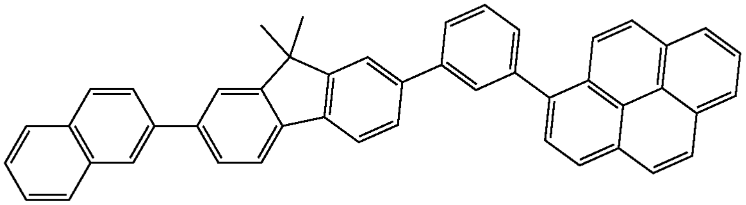
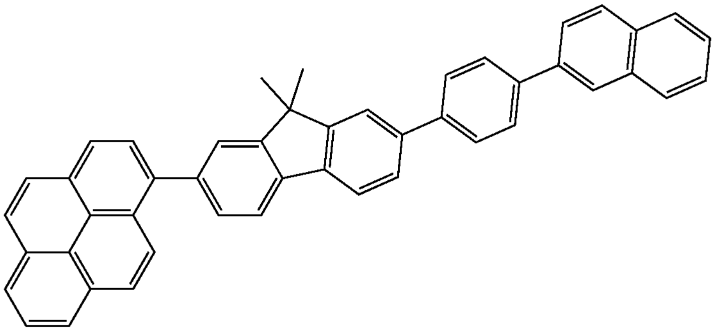
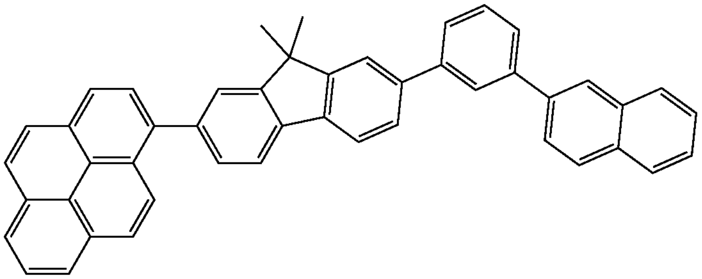
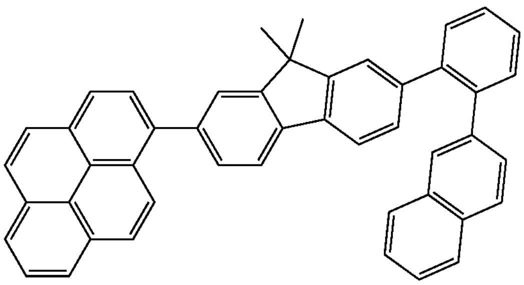
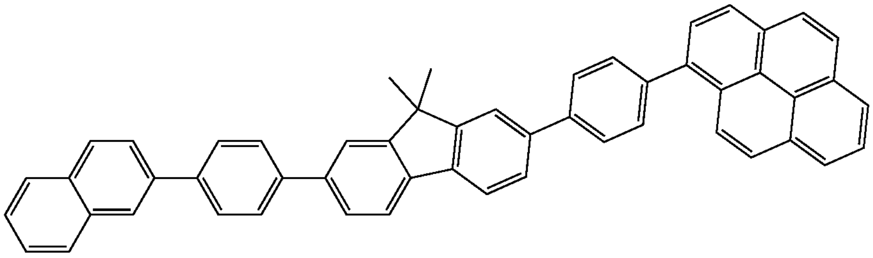

-continued
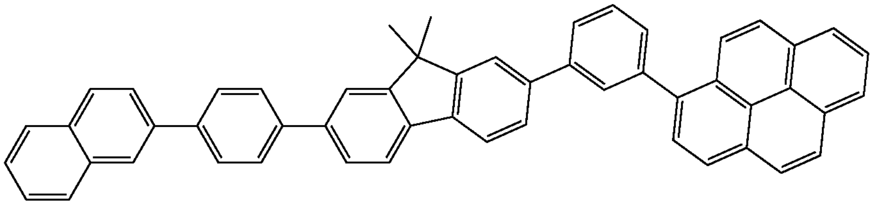
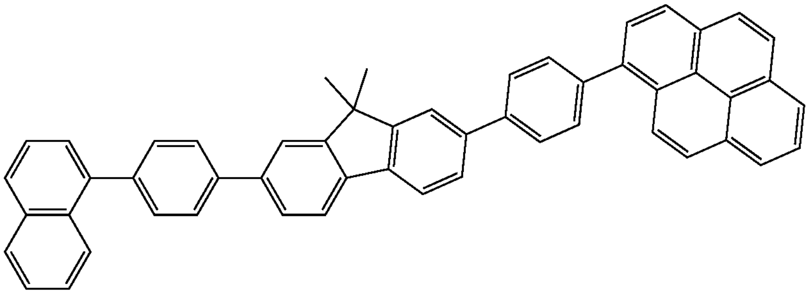
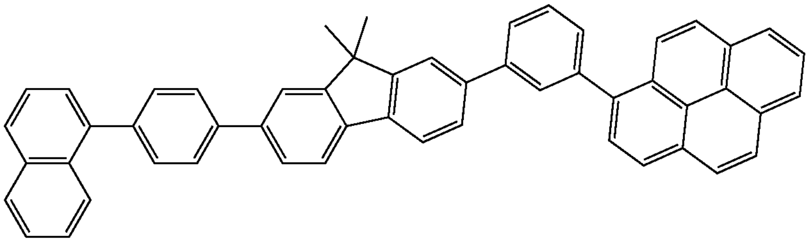
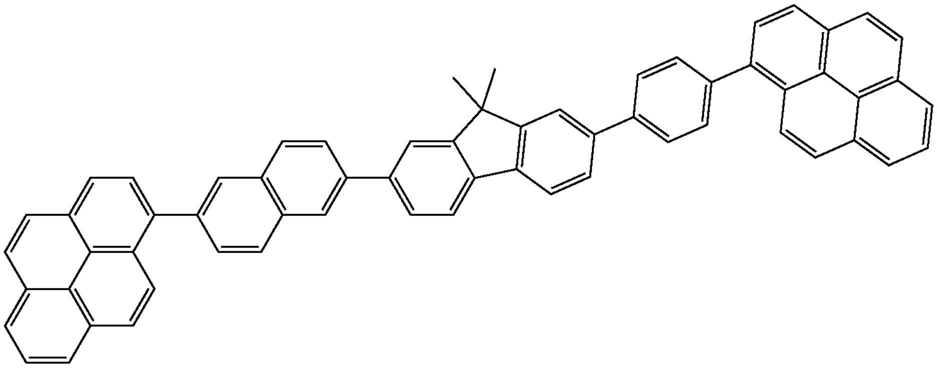
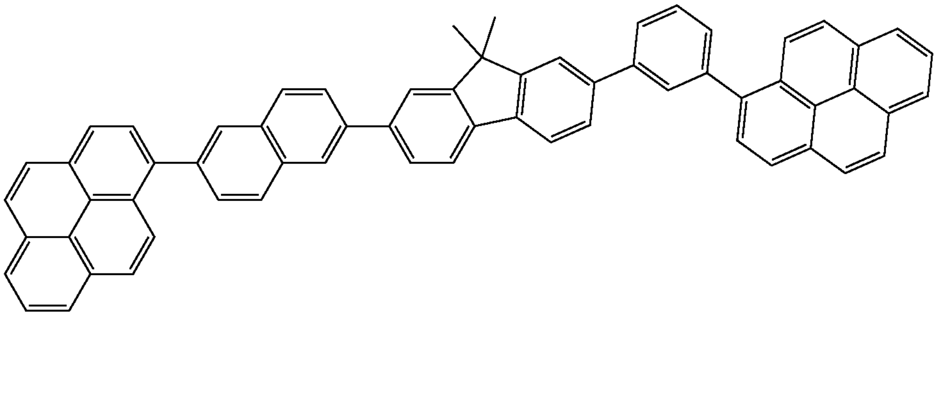

-continued
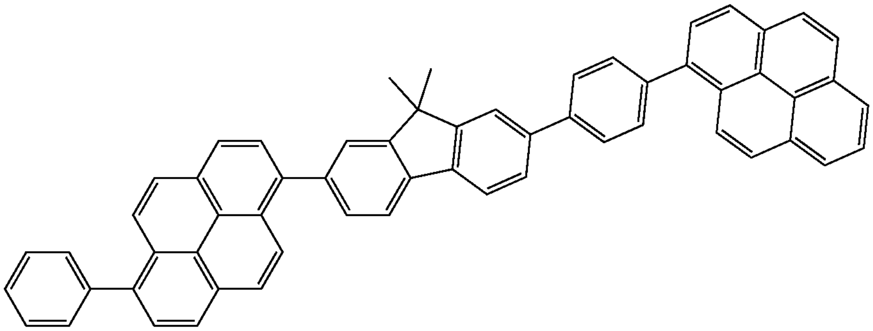
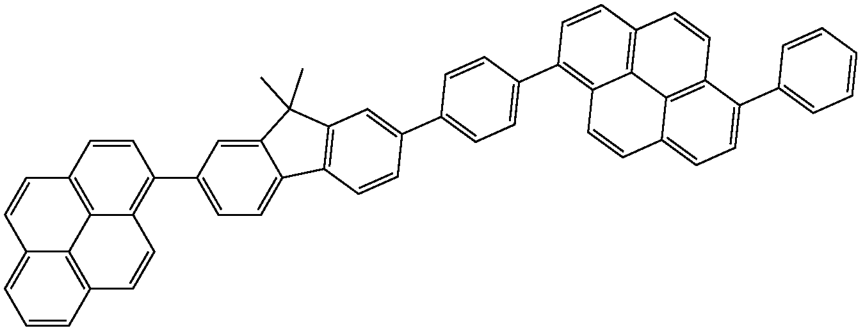
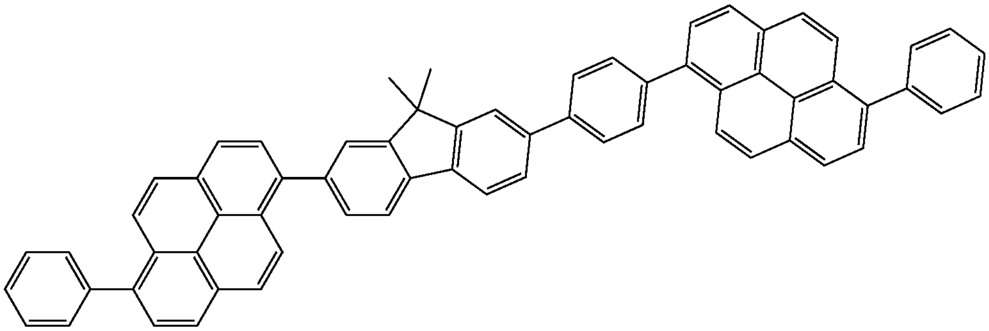
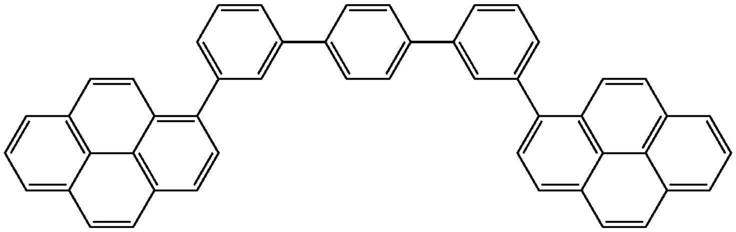
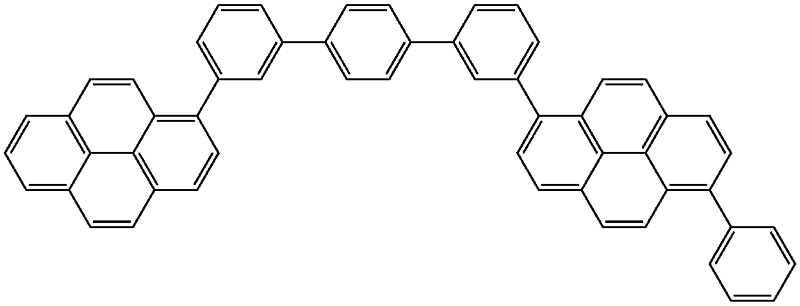

-continued
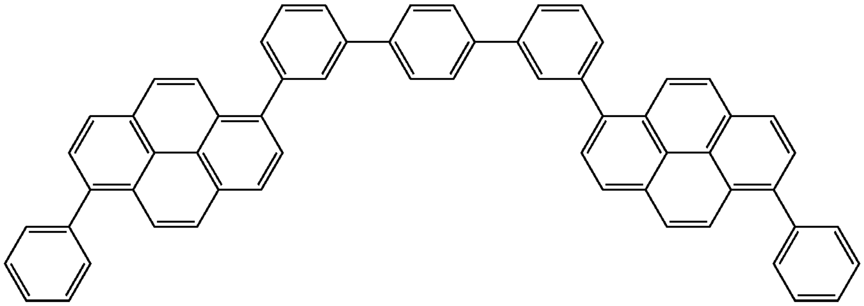
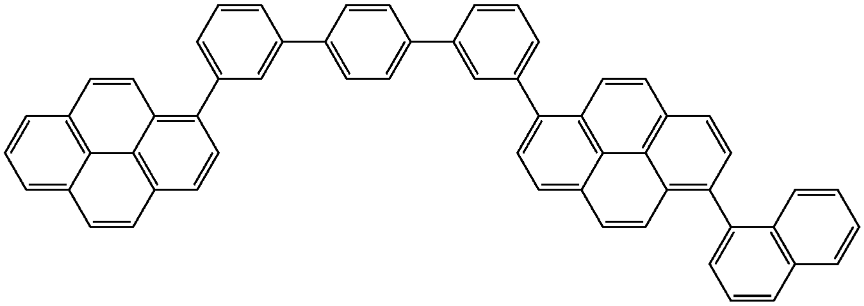
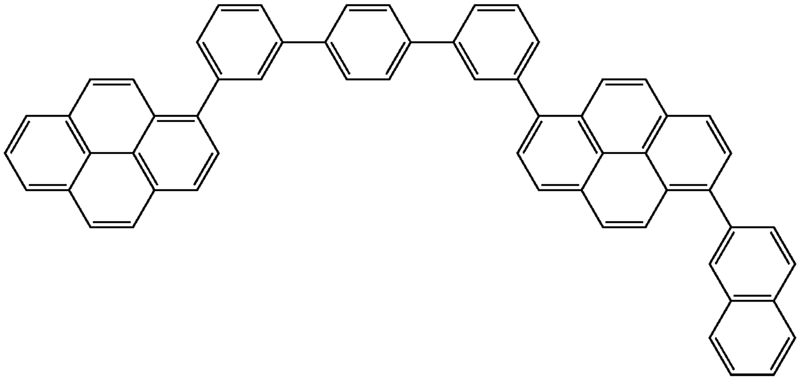
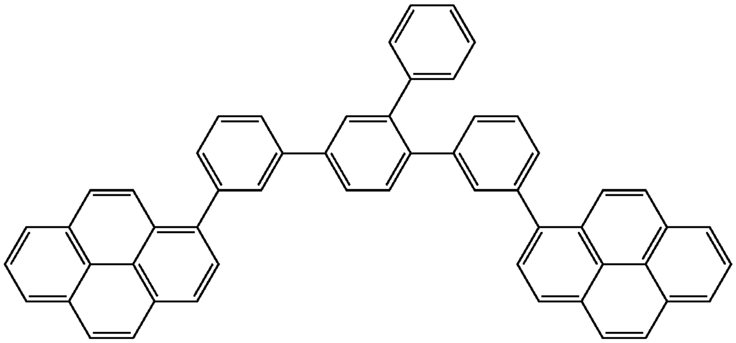

-continued
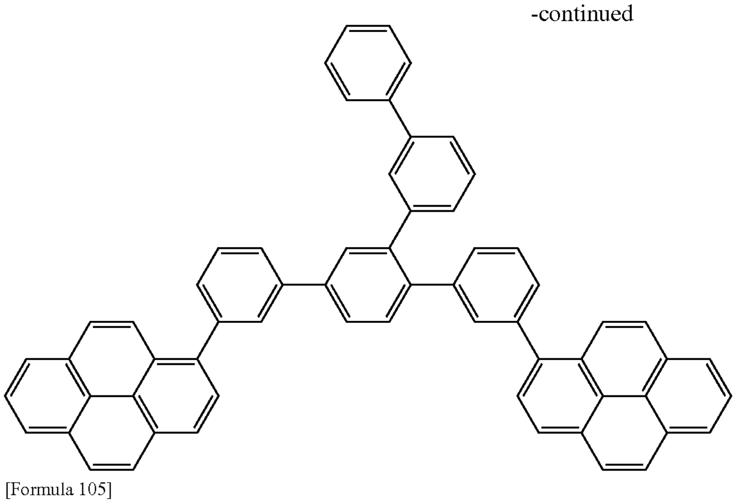
[Formula 105]
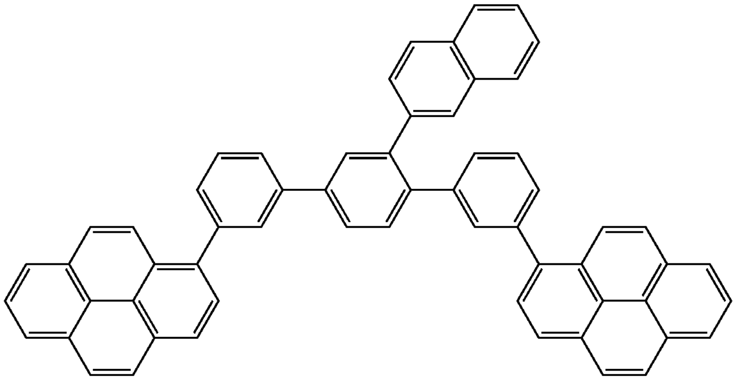
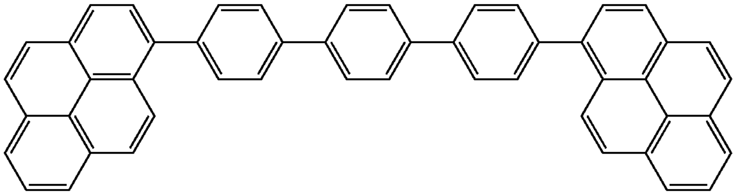
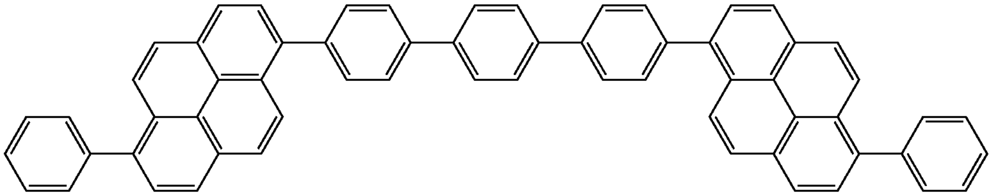
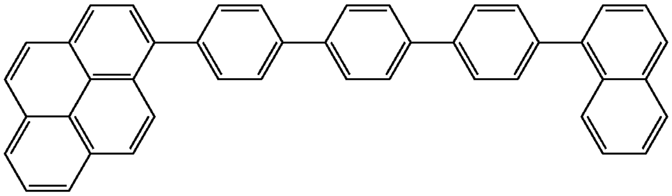

-continued
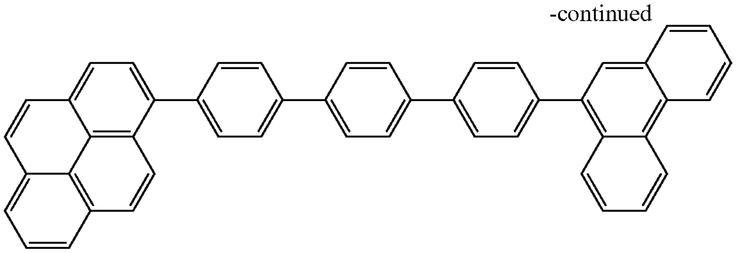
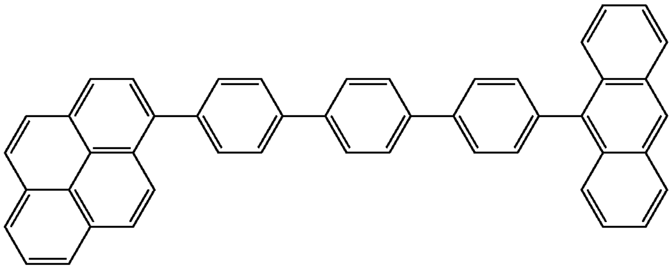
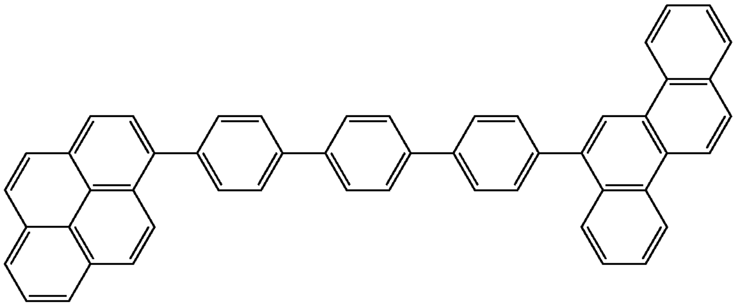
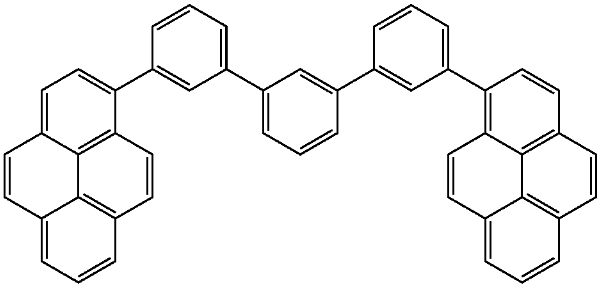
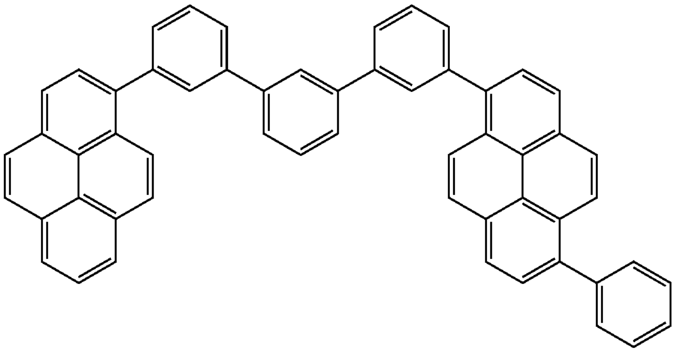
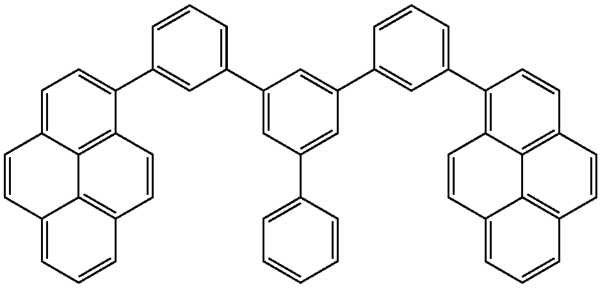

-continued
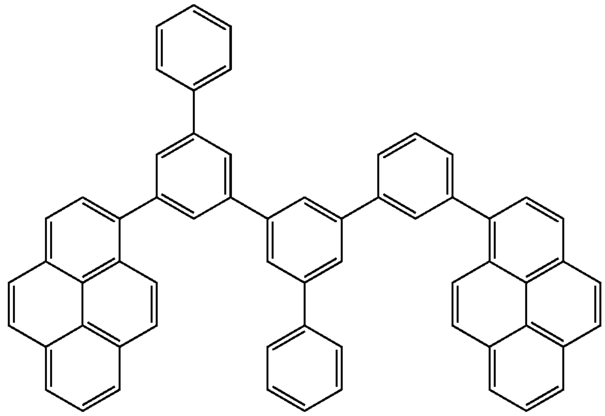
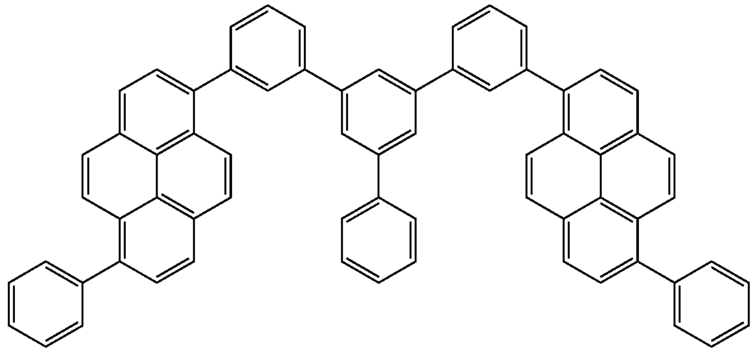
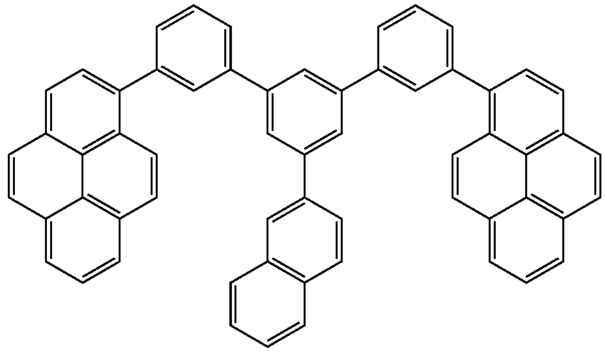
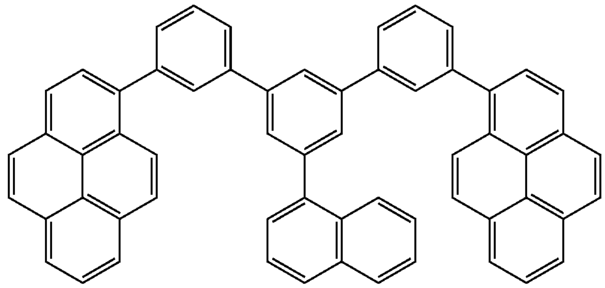
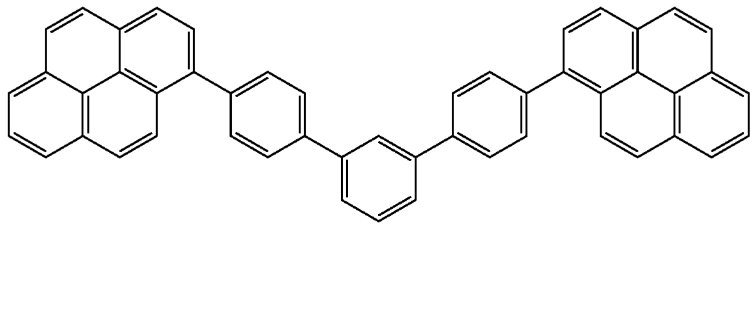

-continued
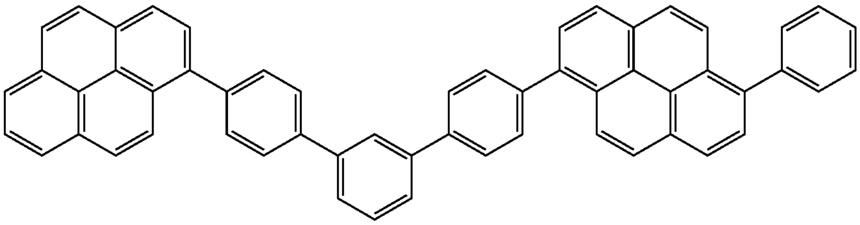
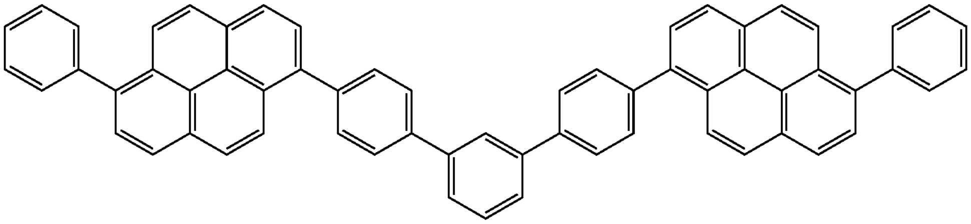
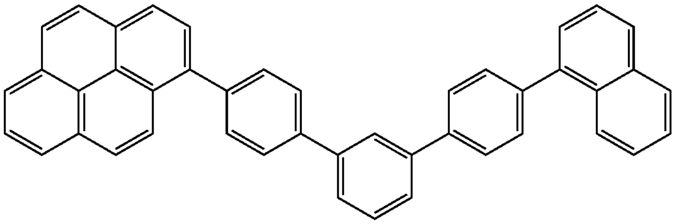
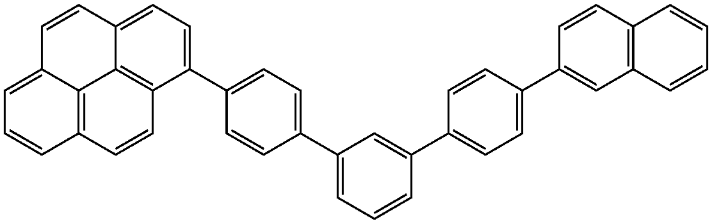
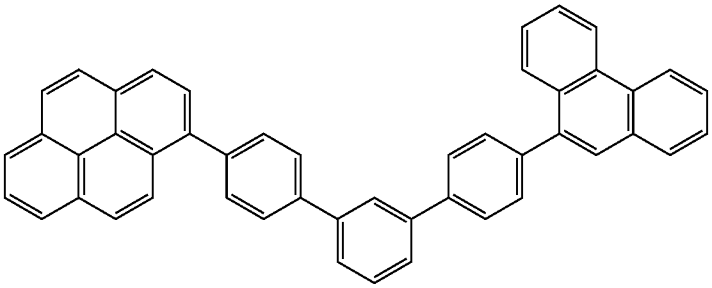
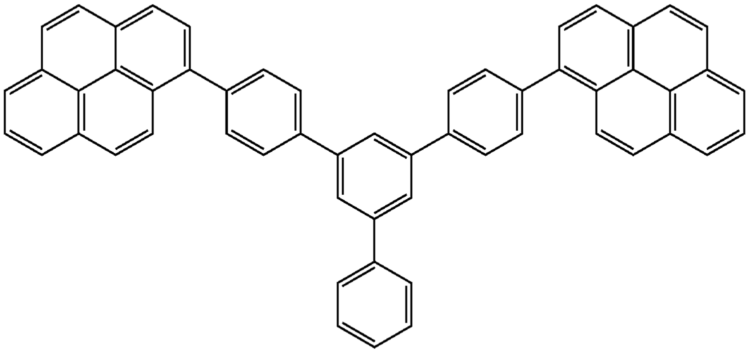

-continued
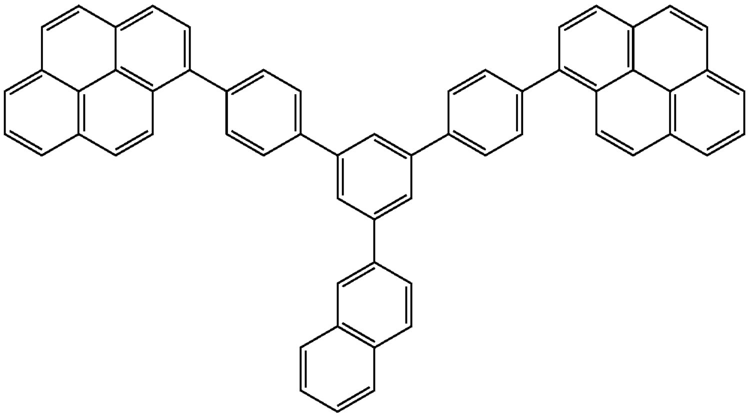
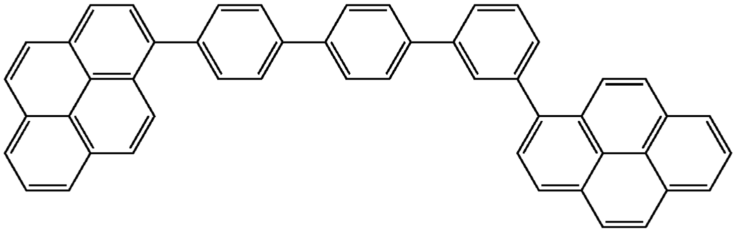
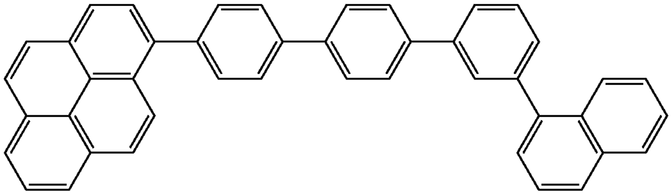
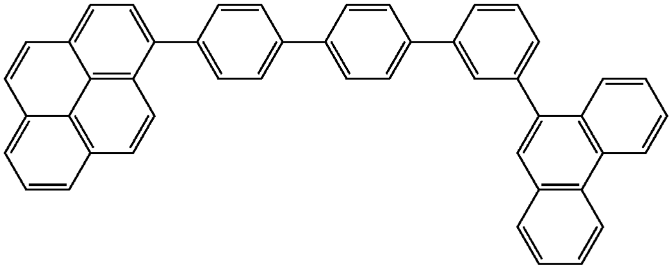
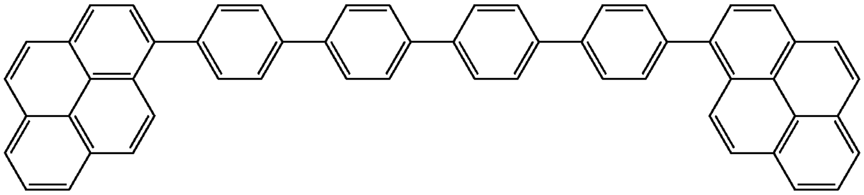
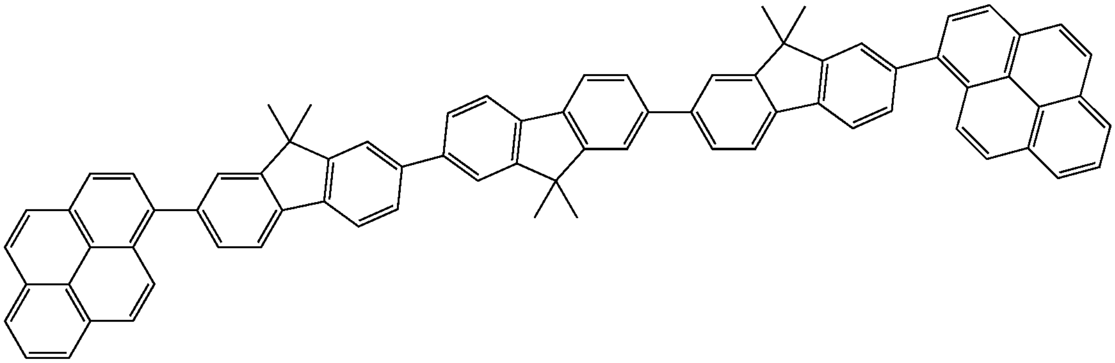

-continued
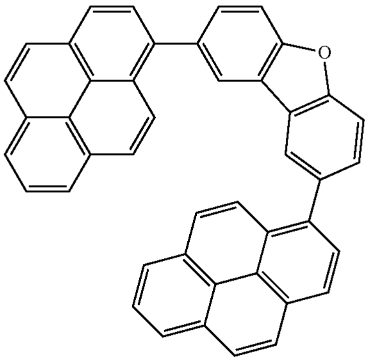
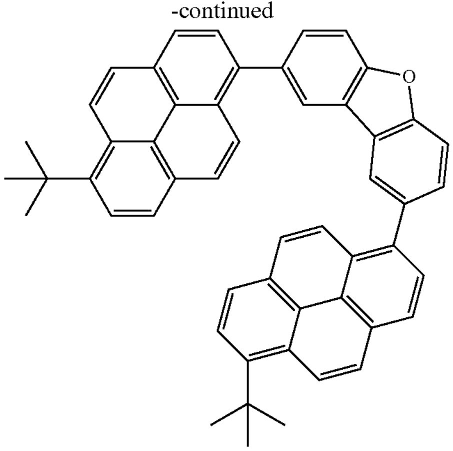
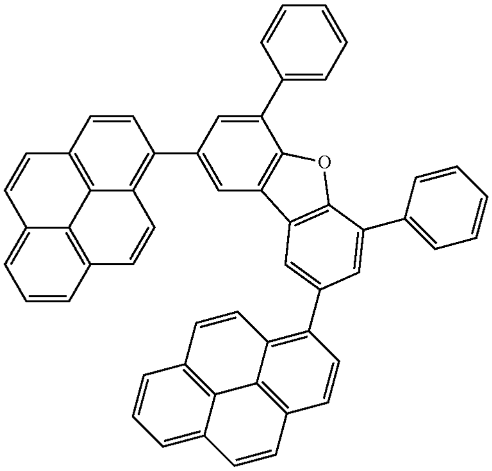
[Formula 106]
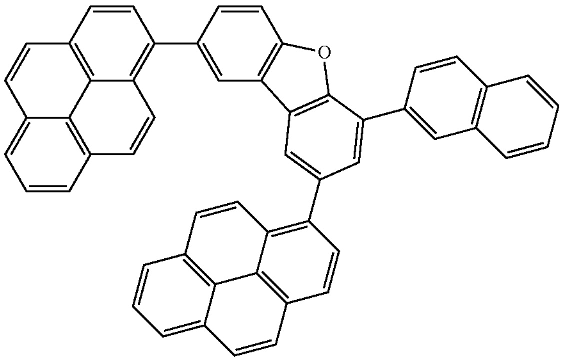
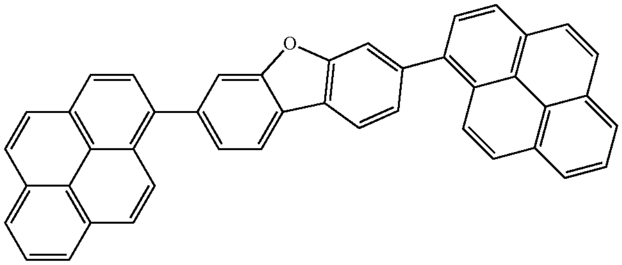

-continued
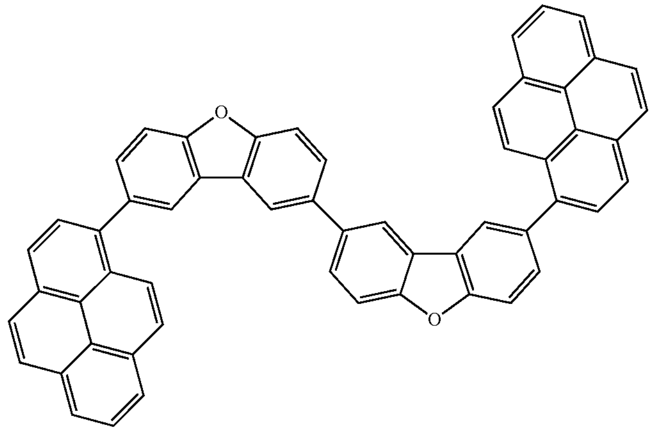
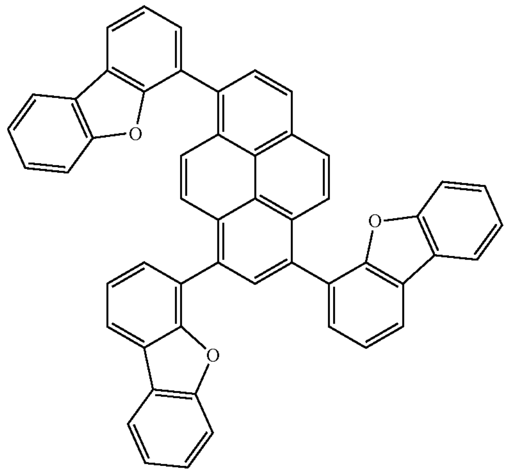
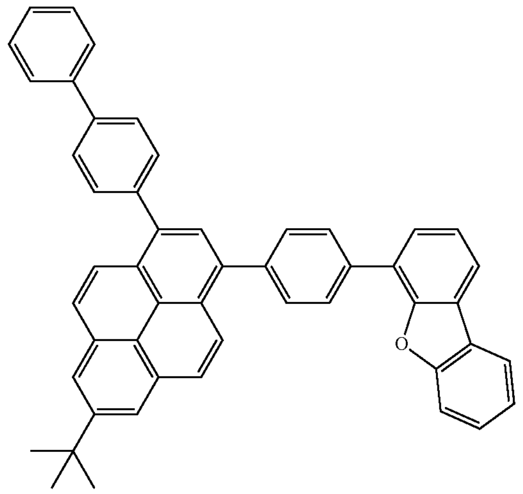
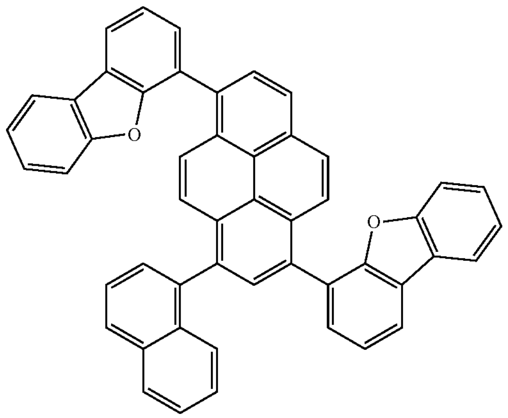
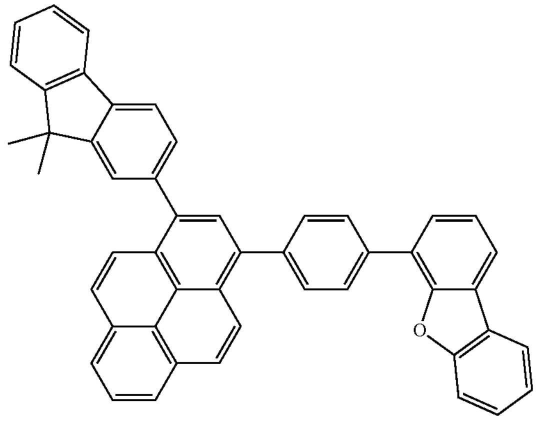
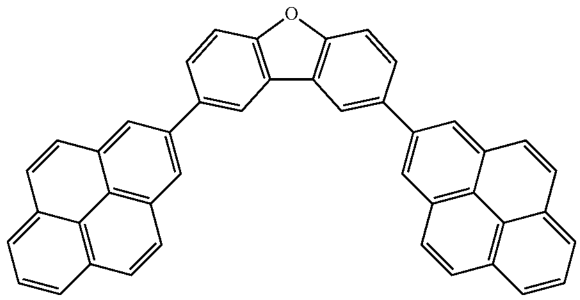

-continued
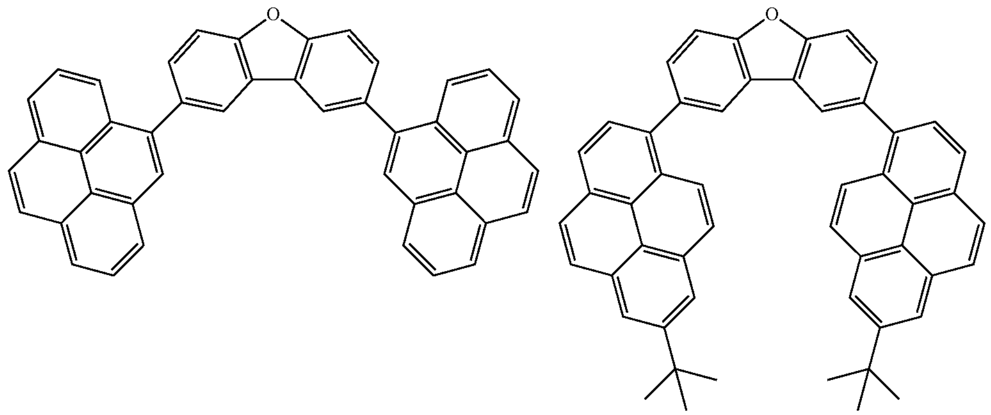
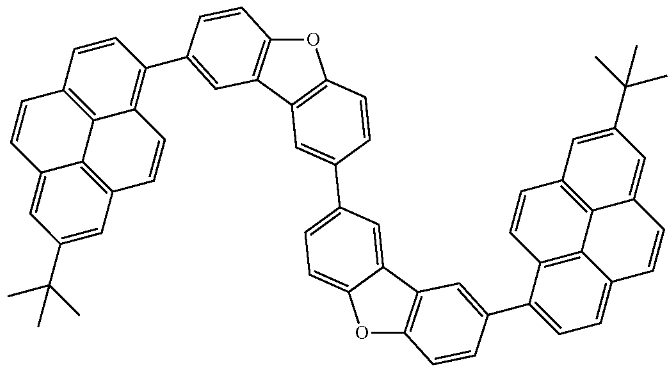
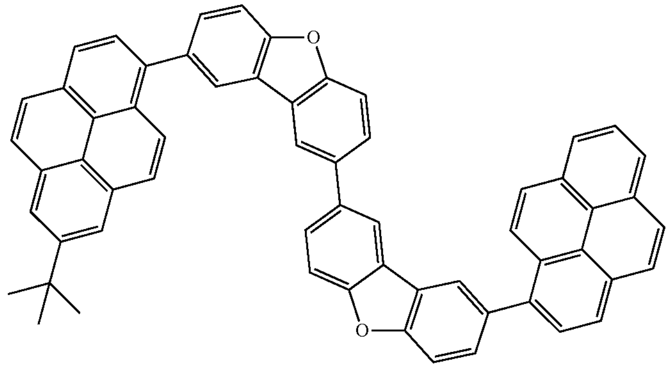
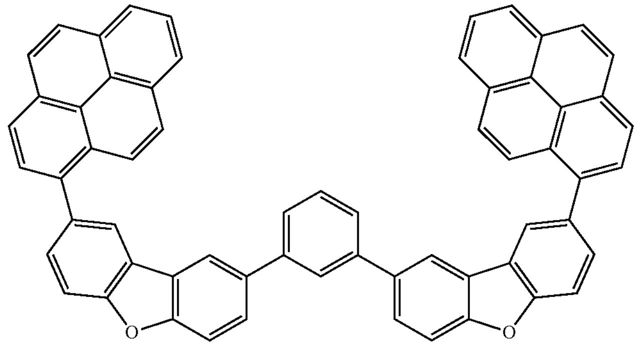

-continued
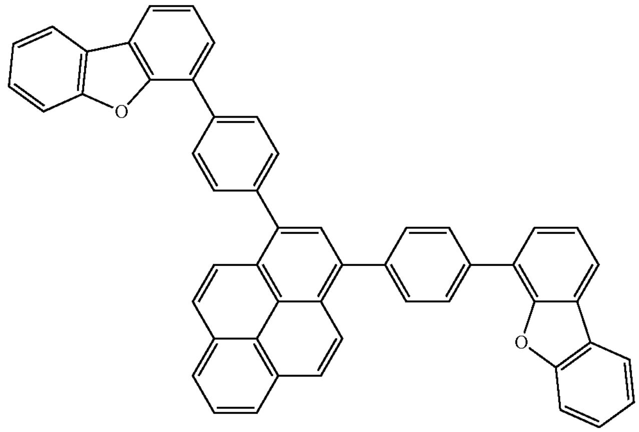
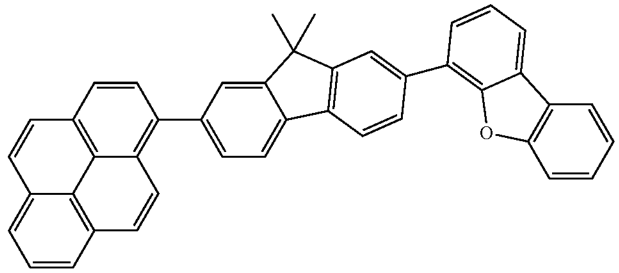
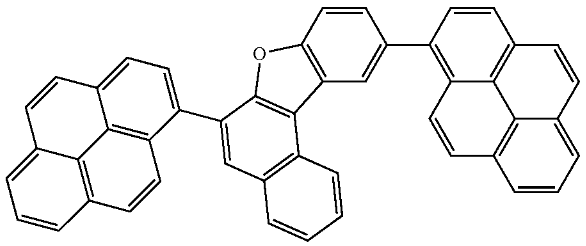
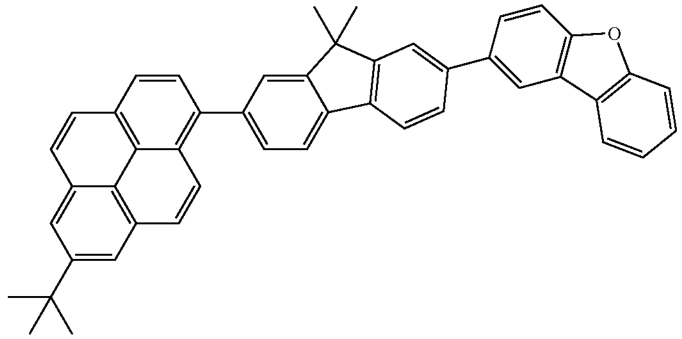
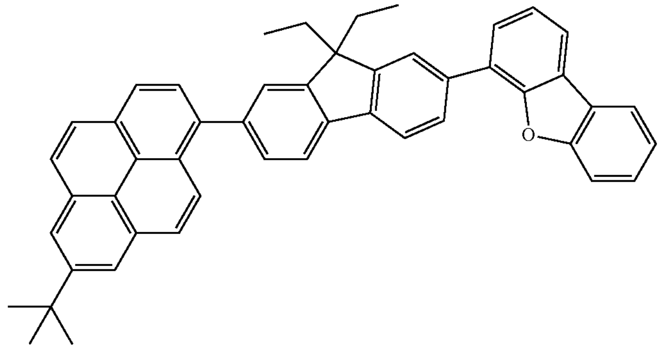
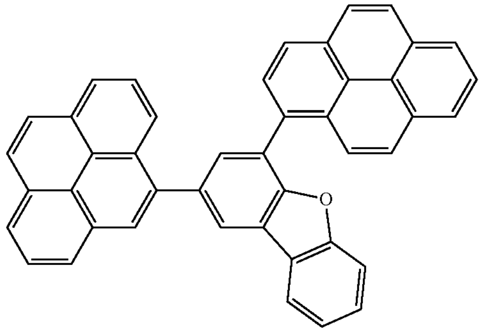
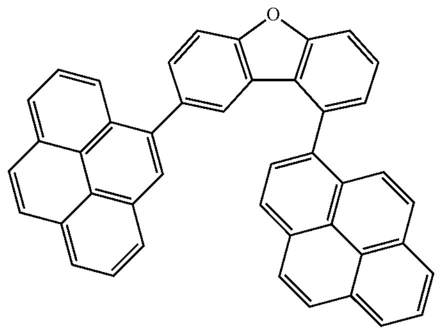

-continued
[Formula 107]
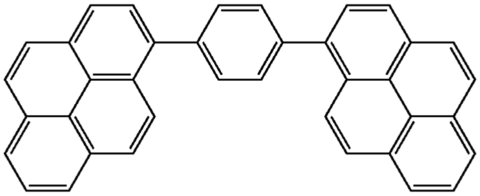
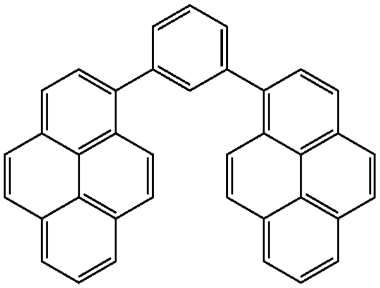
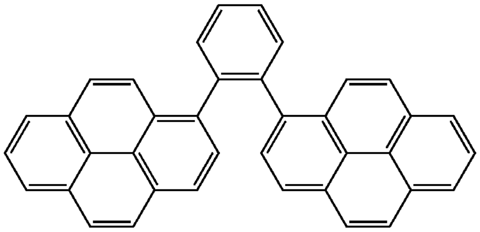
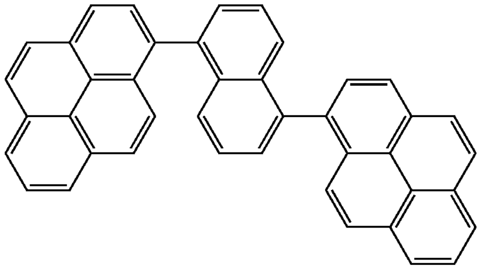
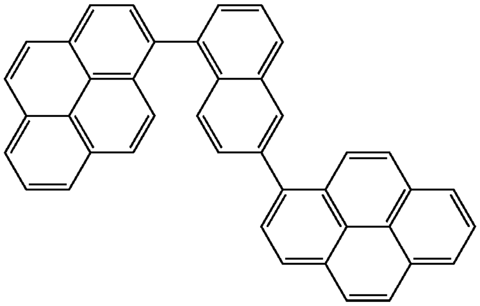
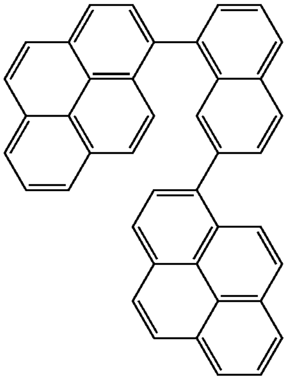
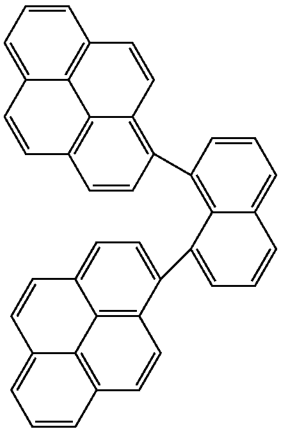
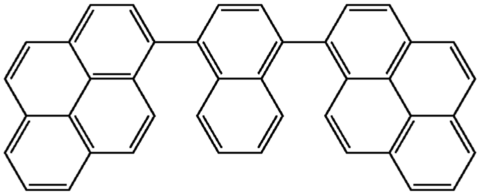
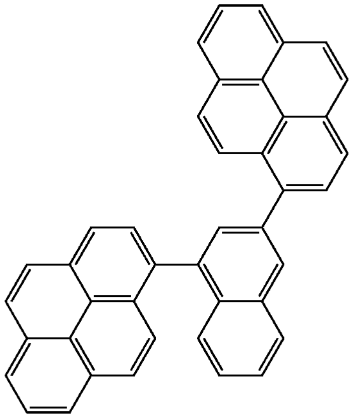
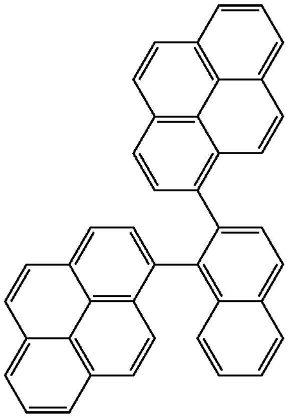
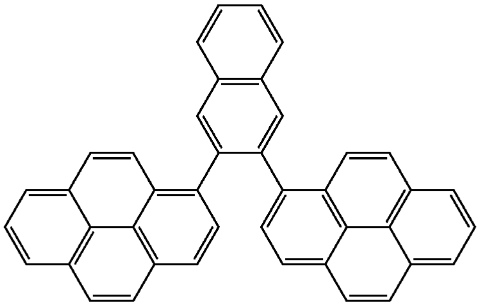
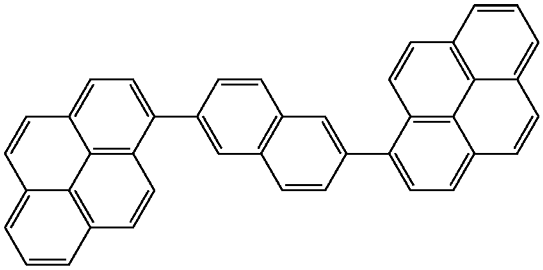

-continued
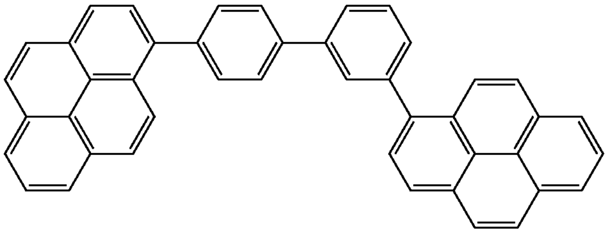
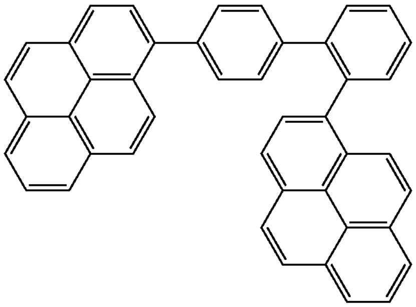
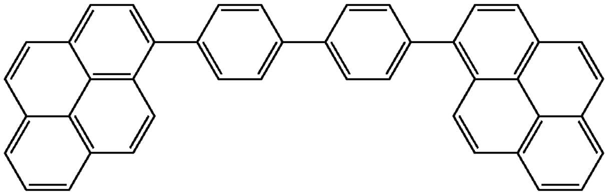
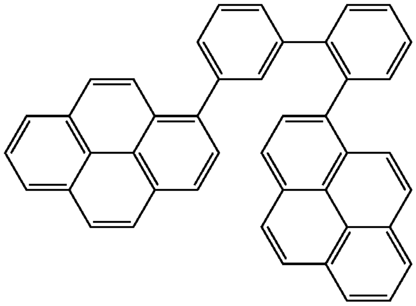
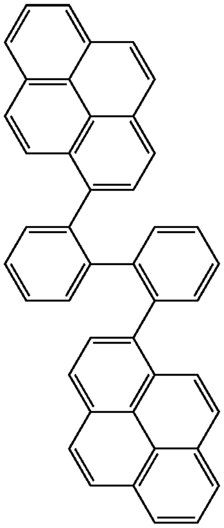
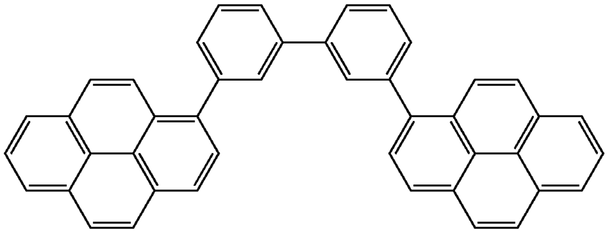
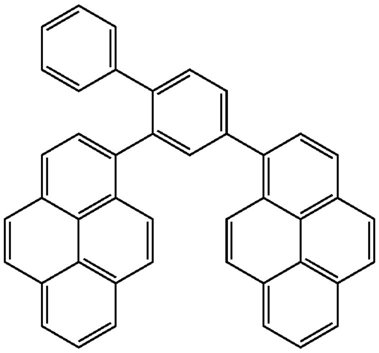
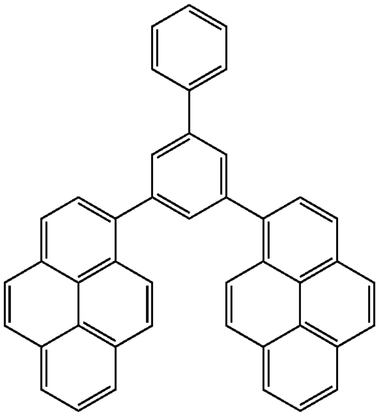

-continued
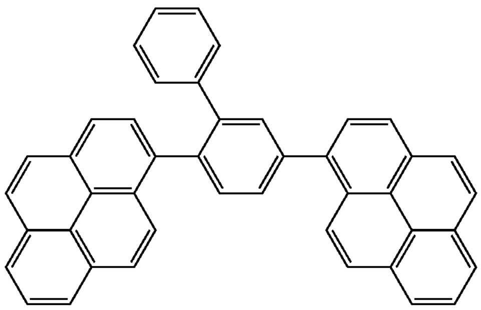
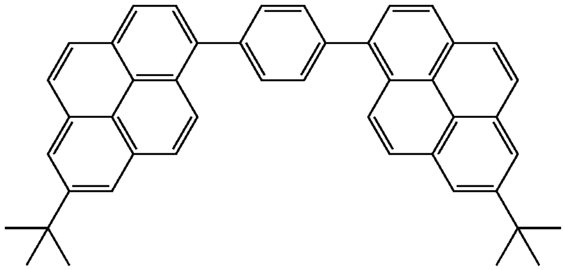
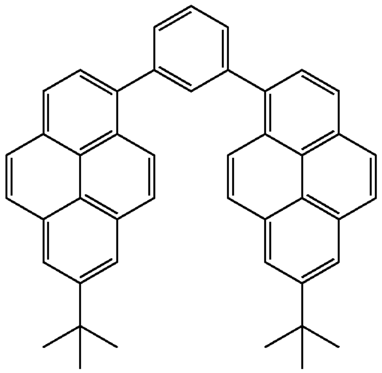
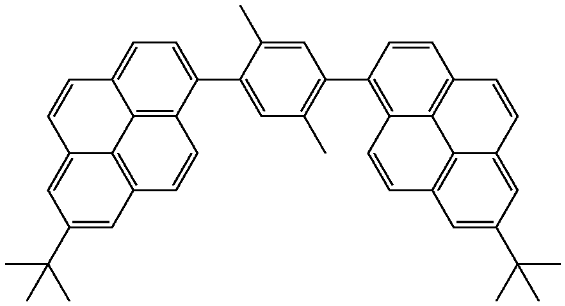
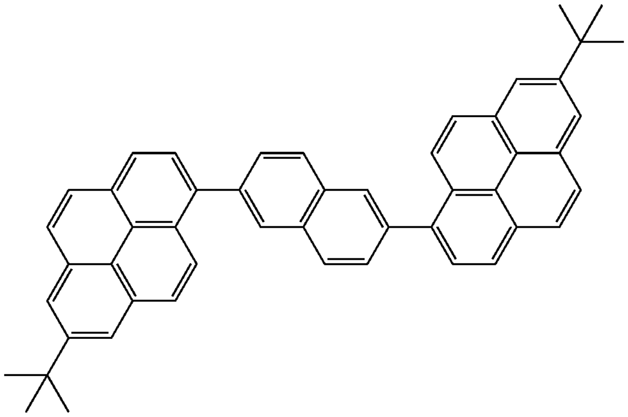
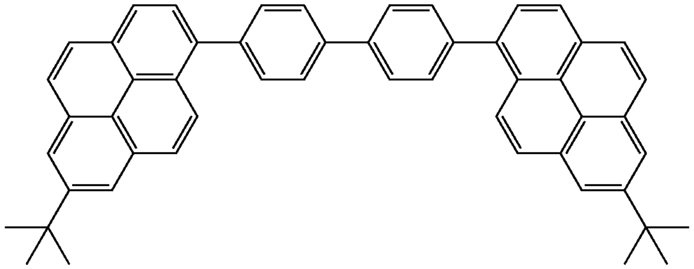
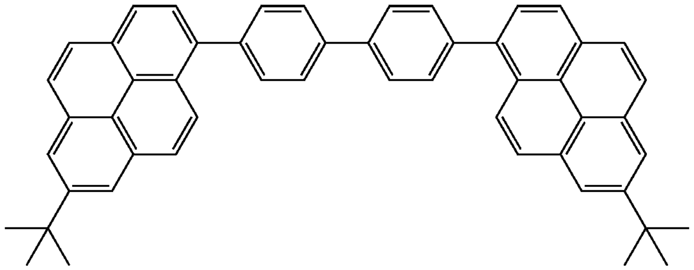

-continued
[Formula 108]
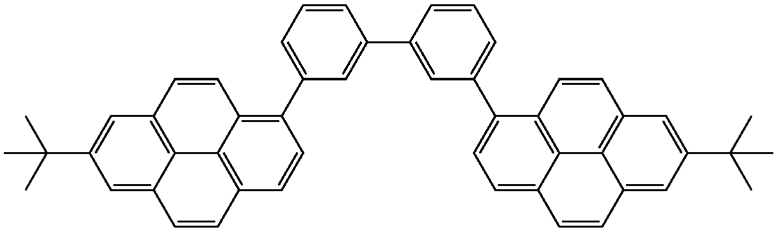
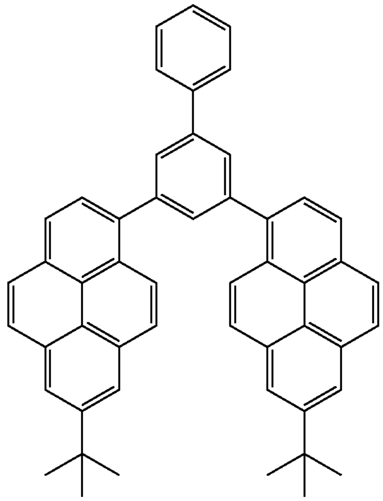
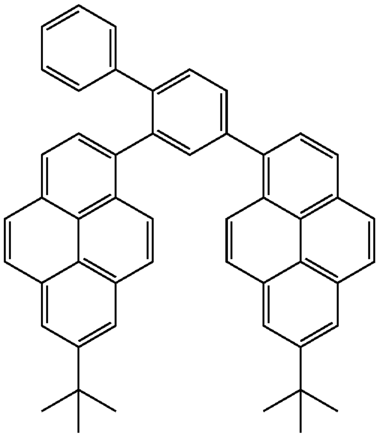
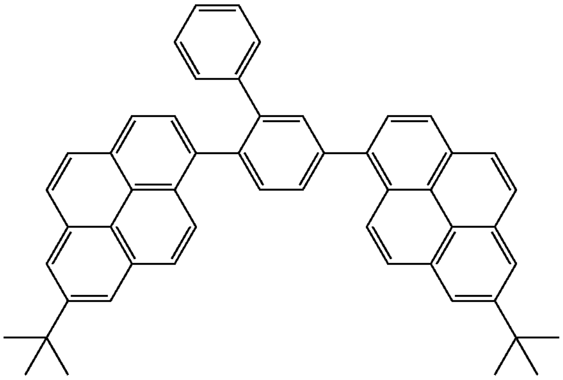
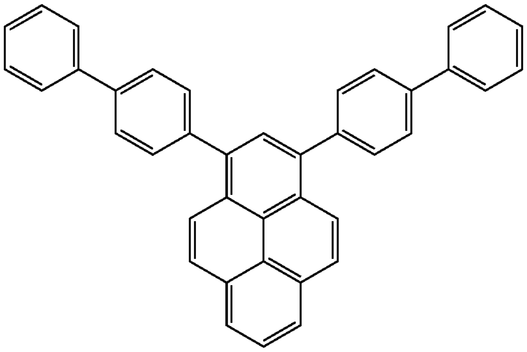
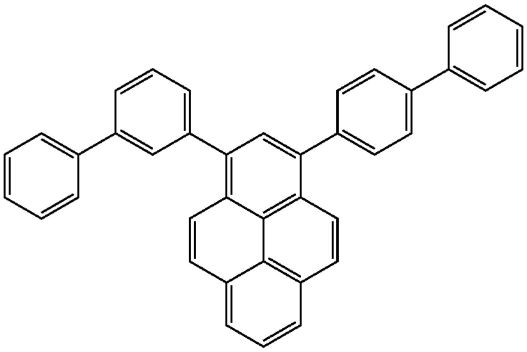
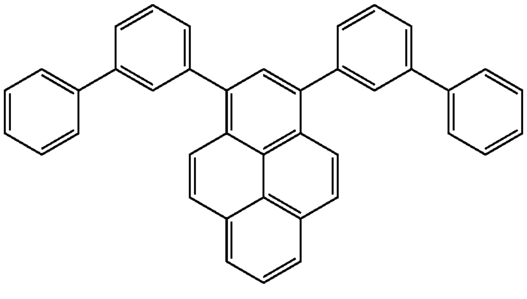
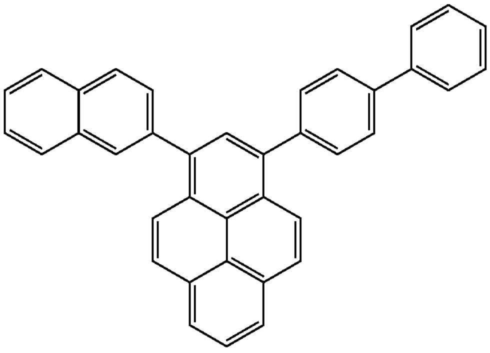

-continued
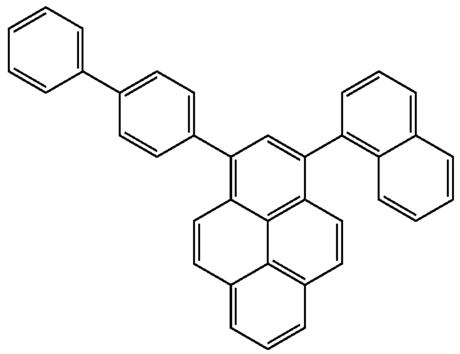
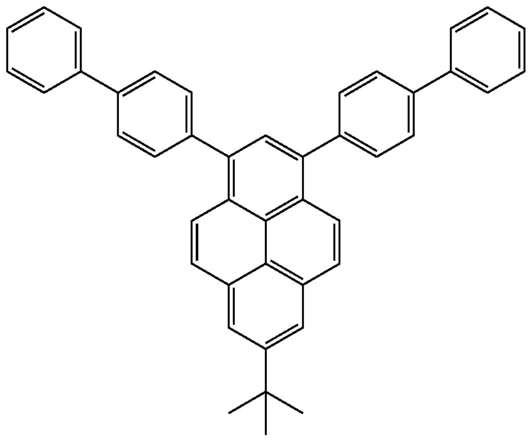
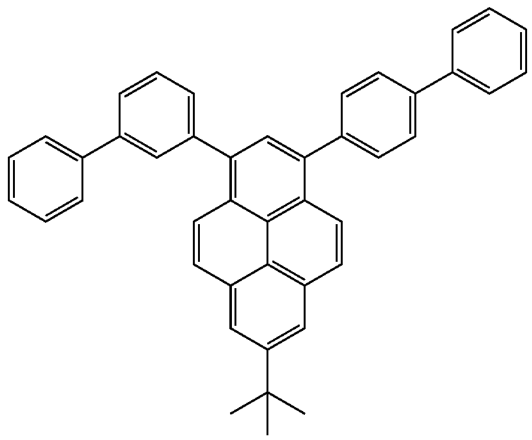
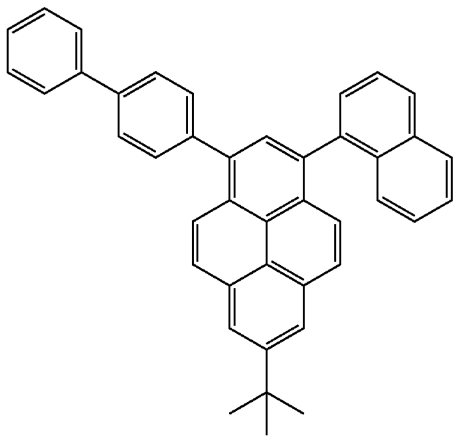
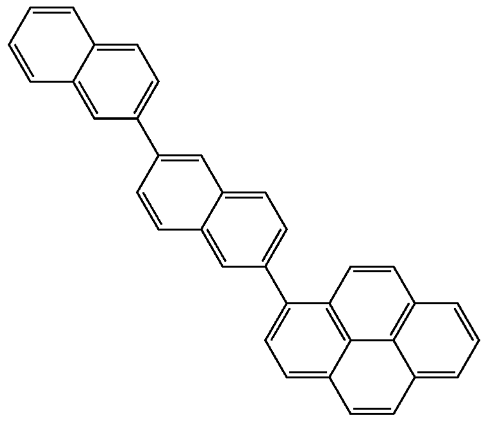
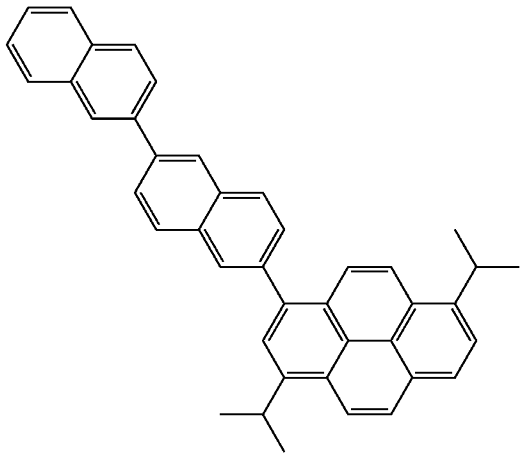

-continued
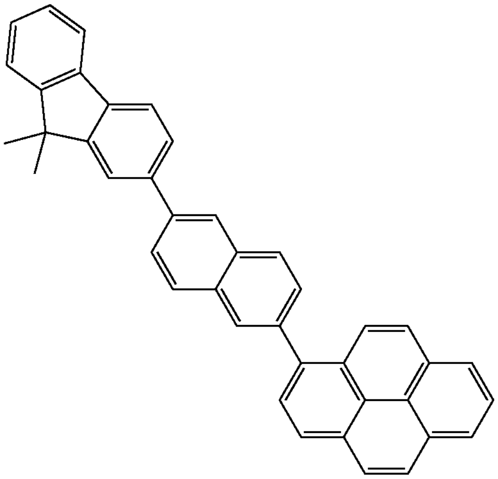
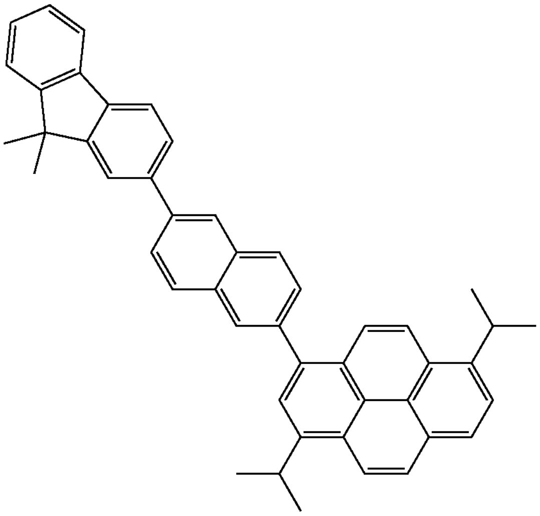
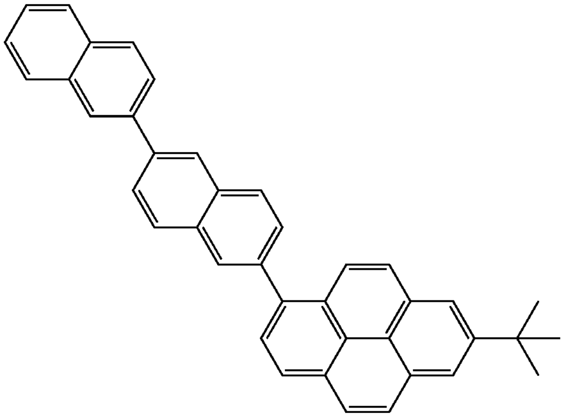
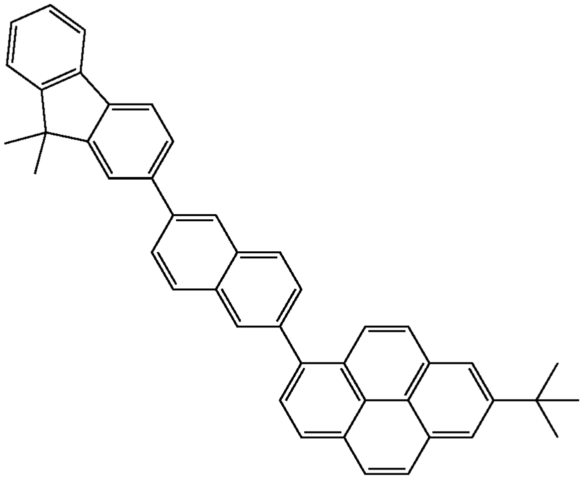
[Formula 109]
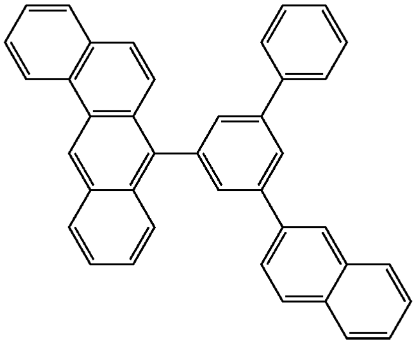
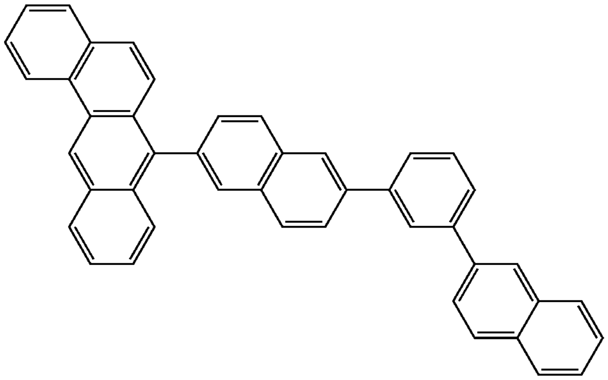

-continued
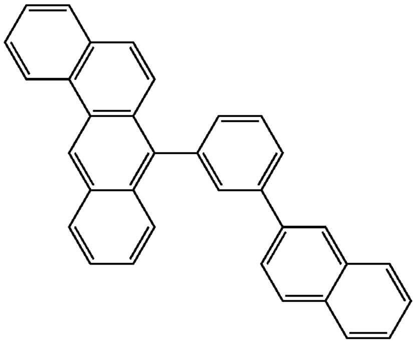
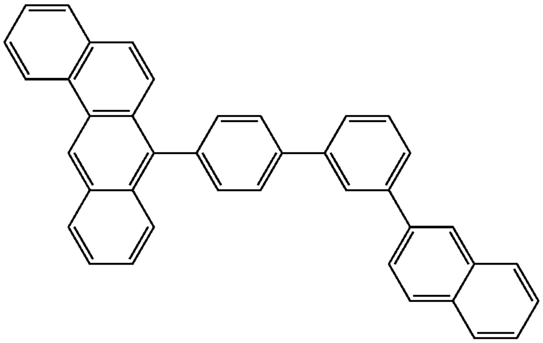
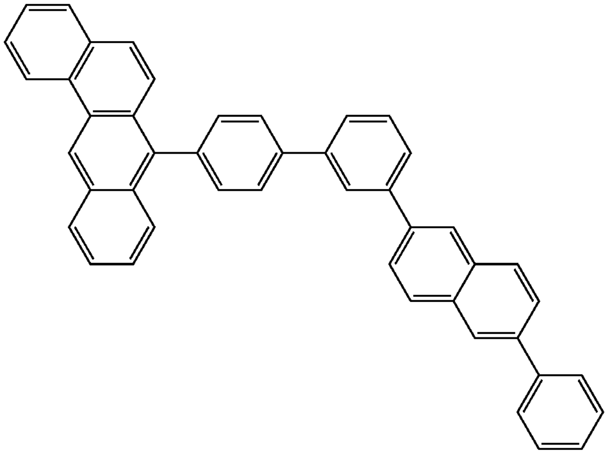
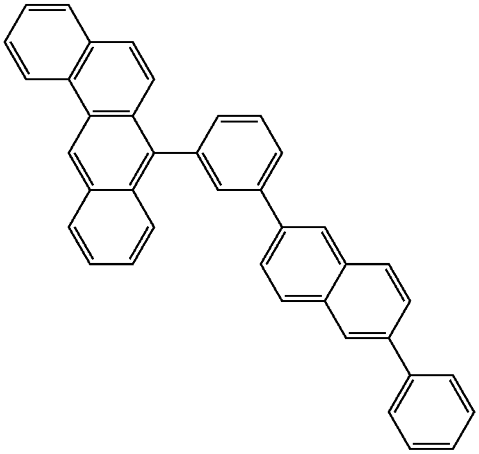
[Formula 110]
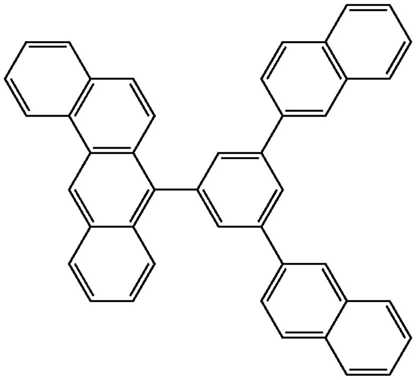
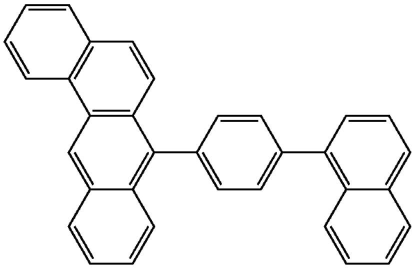
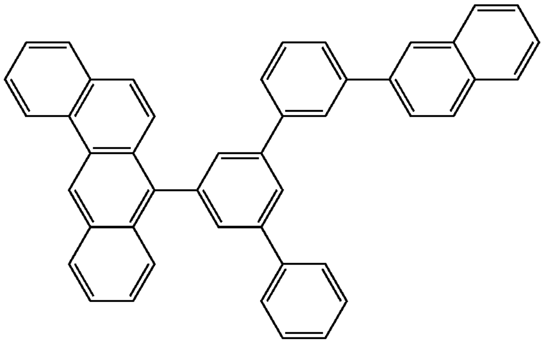

-continued
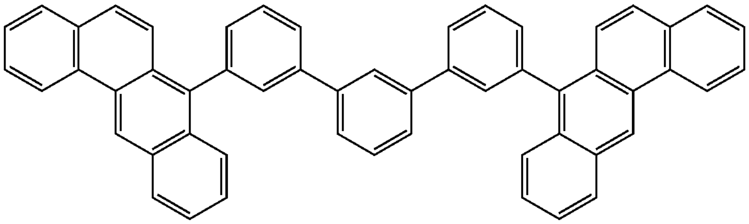
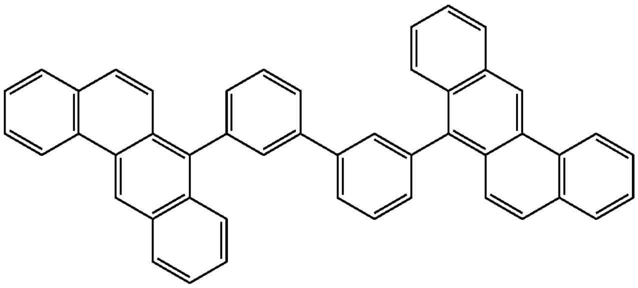
[Formula 111]
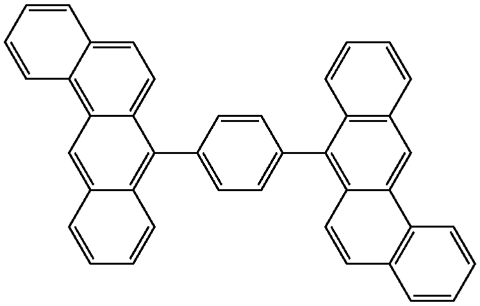
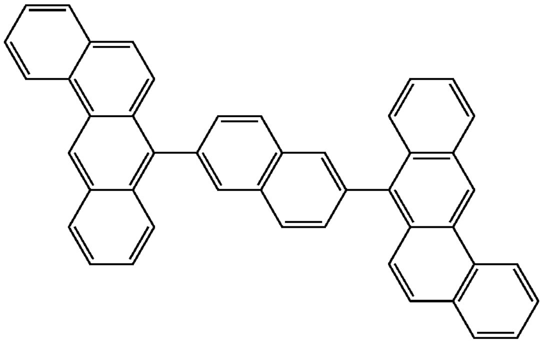
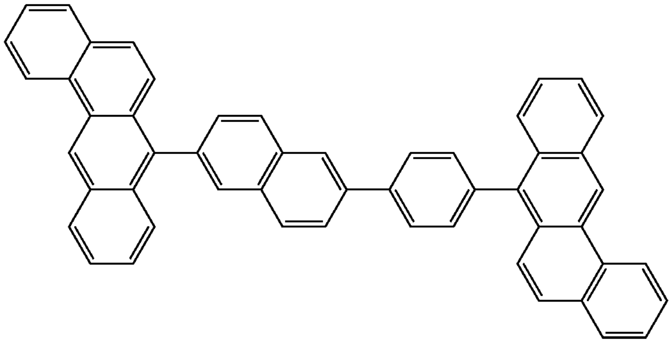
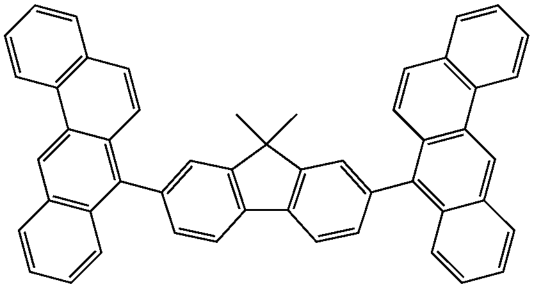
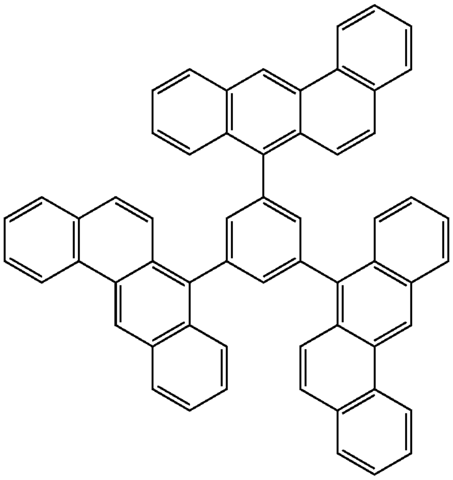

-continued
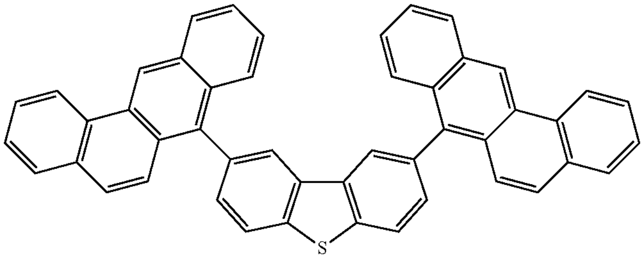
[Formula 112]
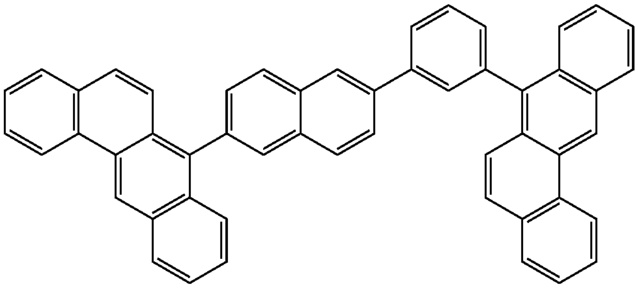
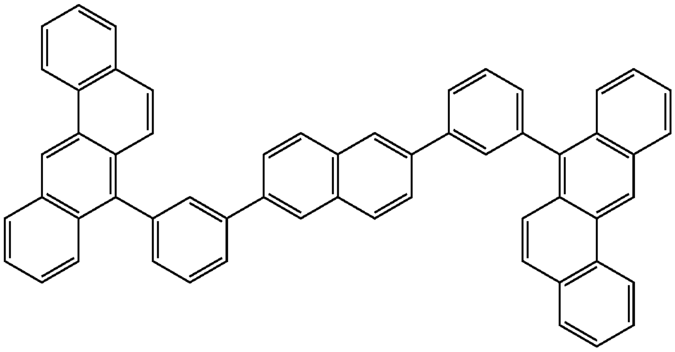
[Formula 113]
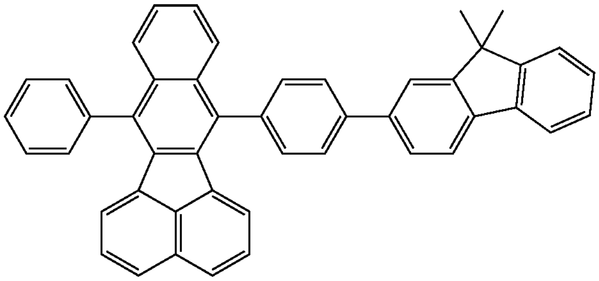
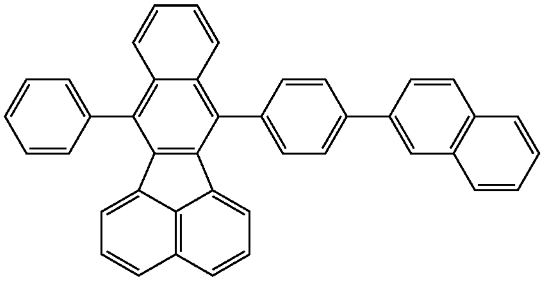
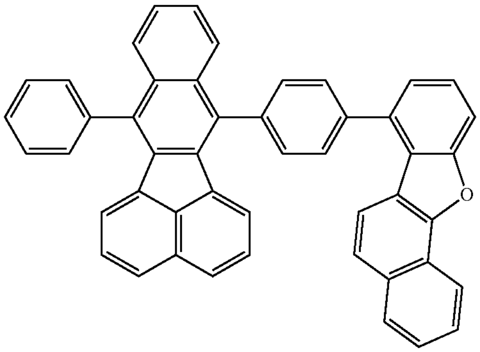
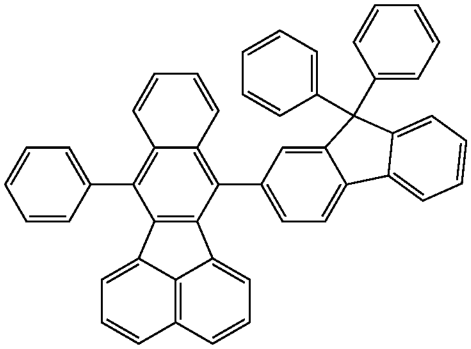

-continued
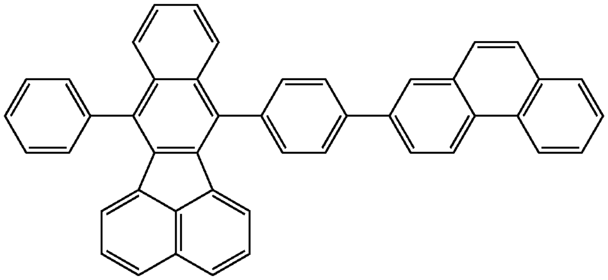
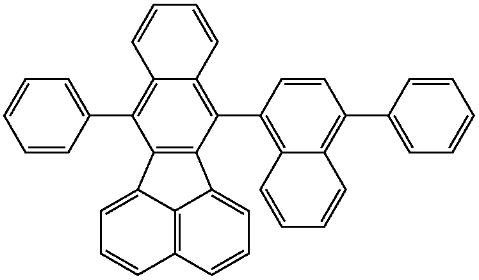
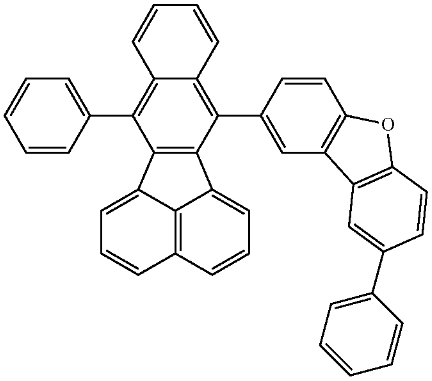
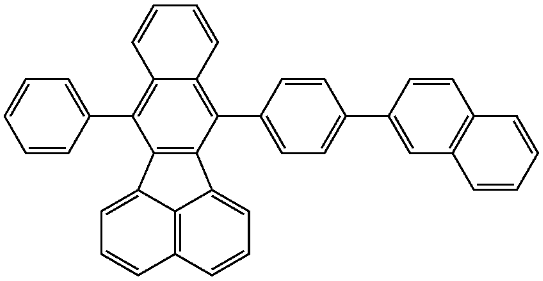
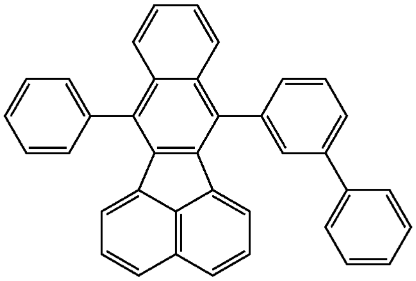
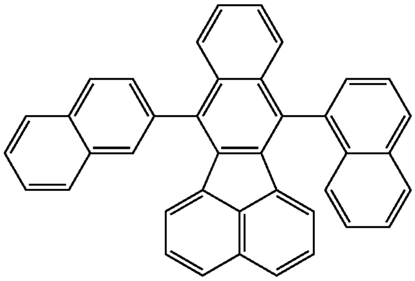
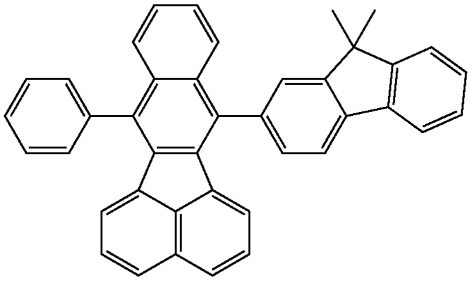
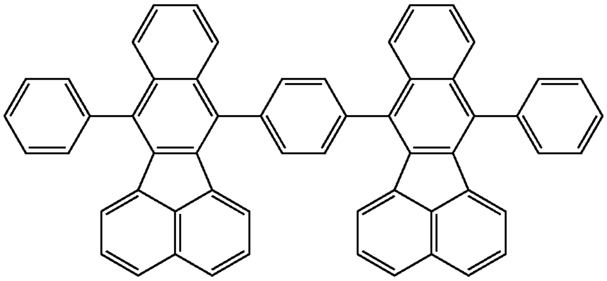
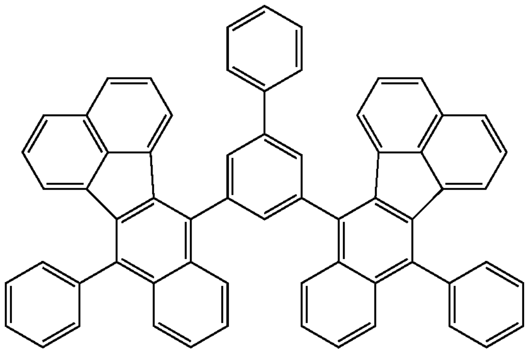
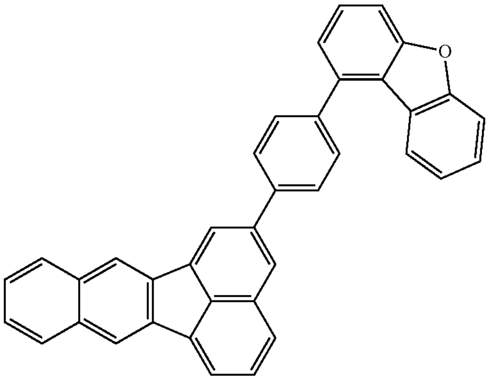

-continued
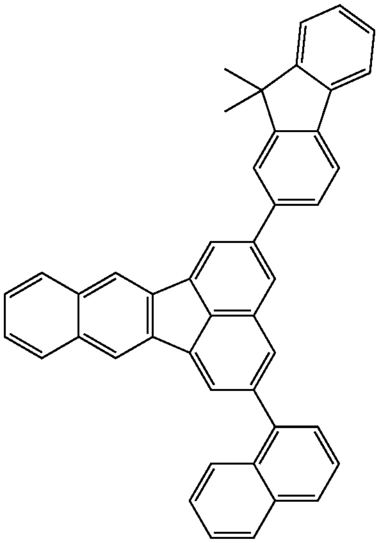
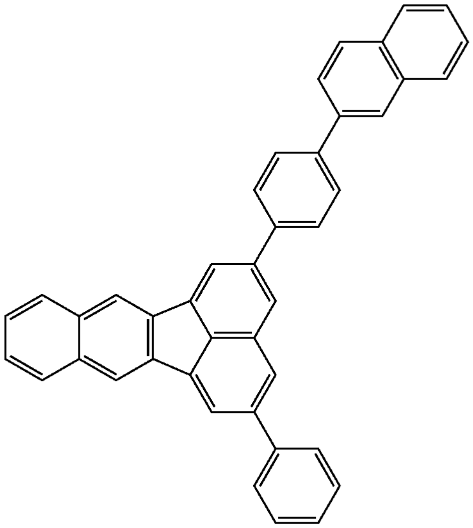
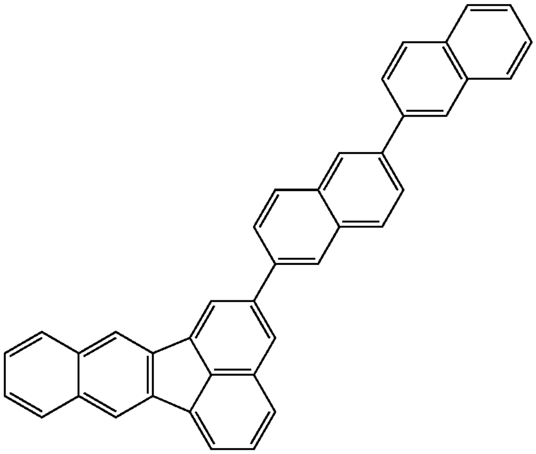
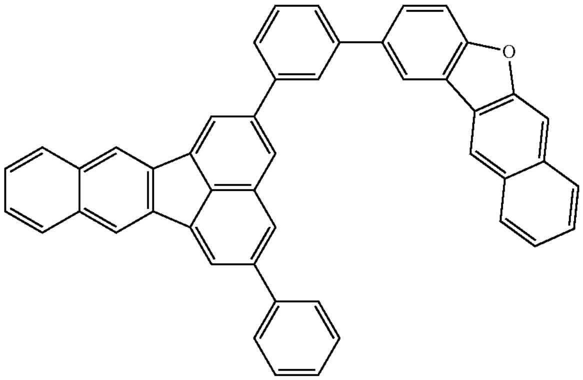
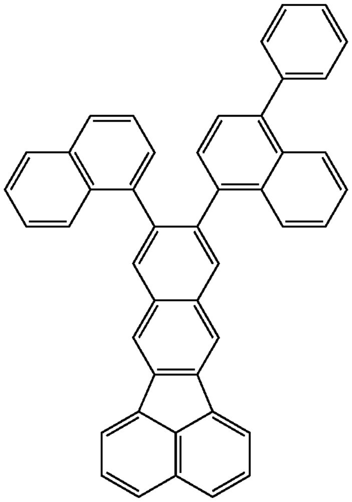
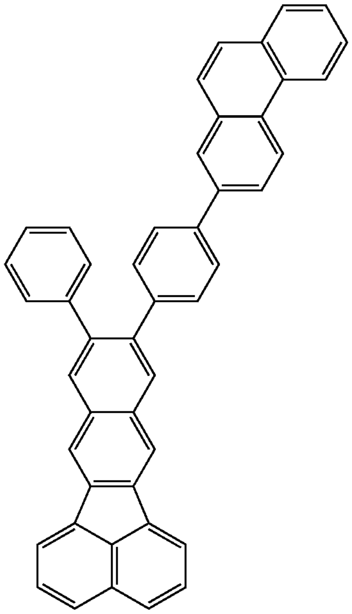

-continued
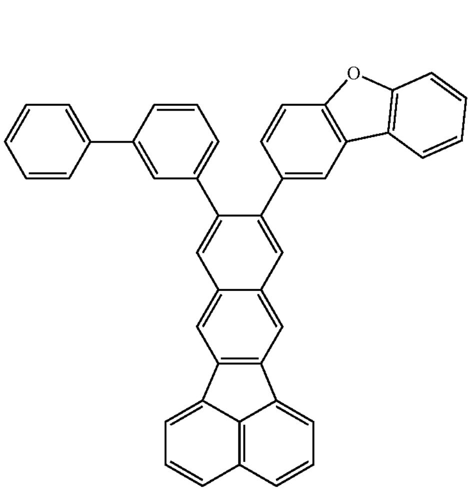
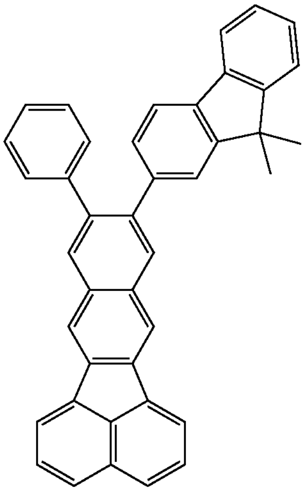
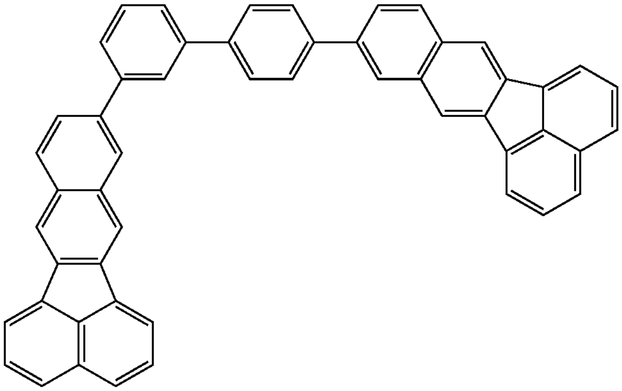
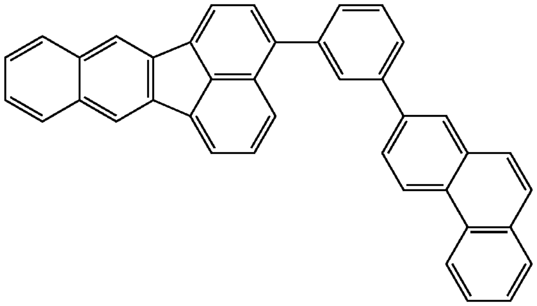
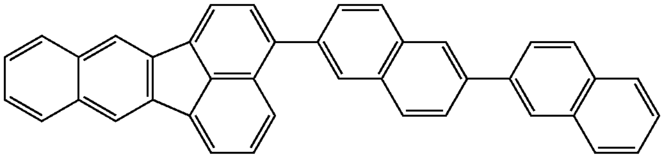
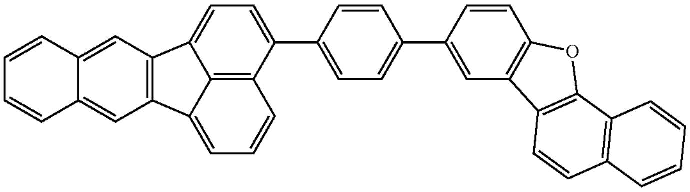
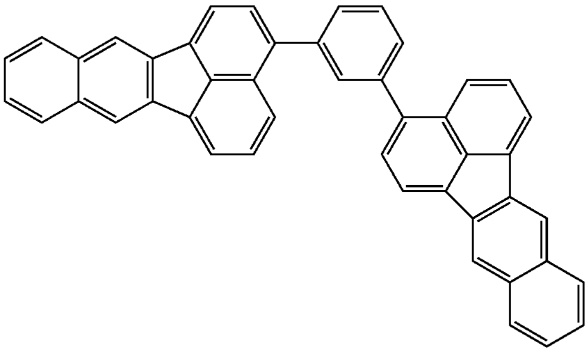
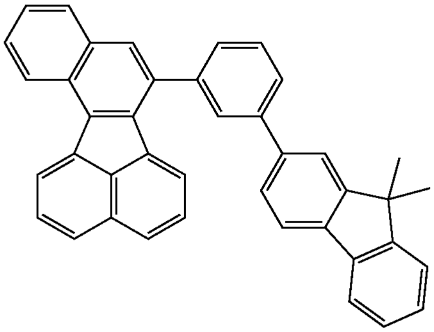

-continued
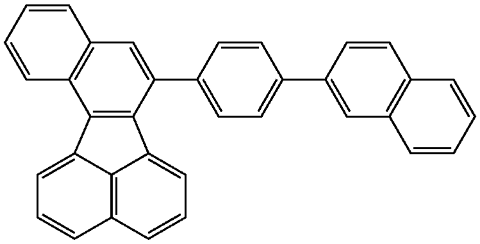
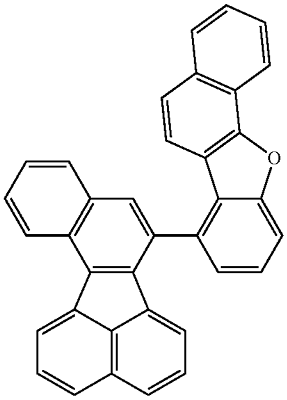
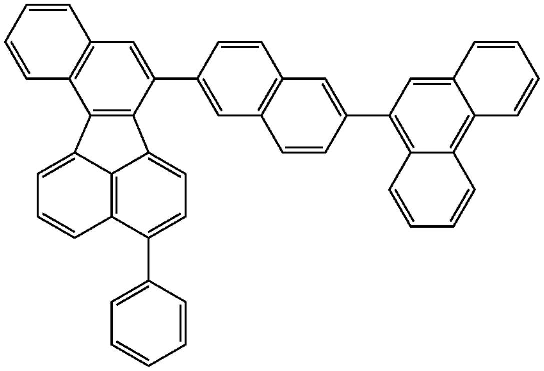
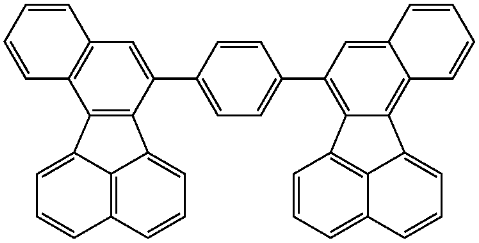
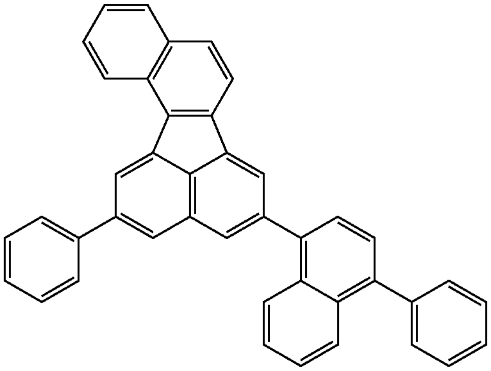
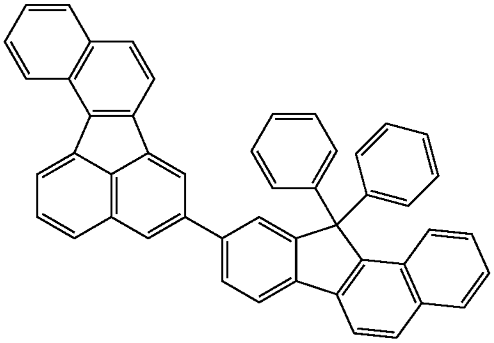
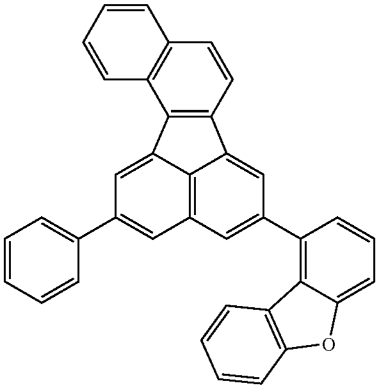
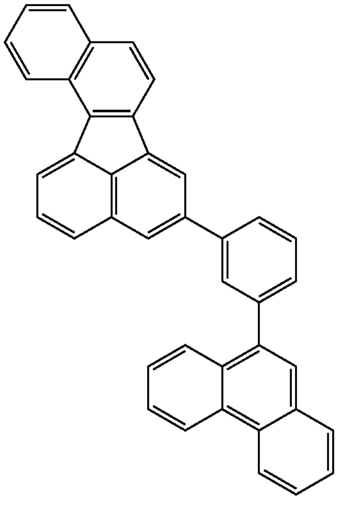

-continued
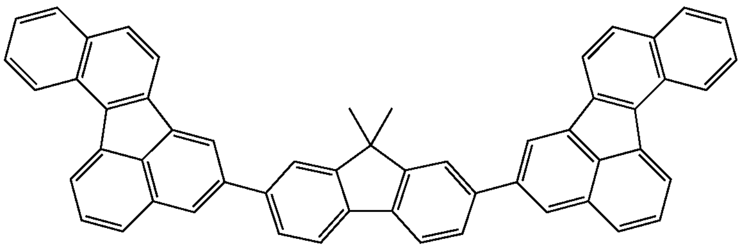
[Formula 114]
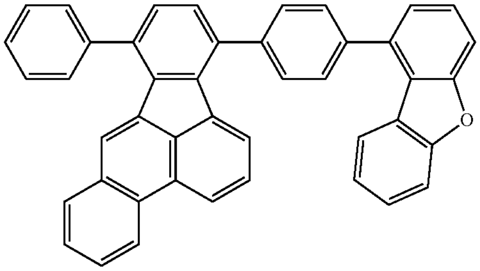
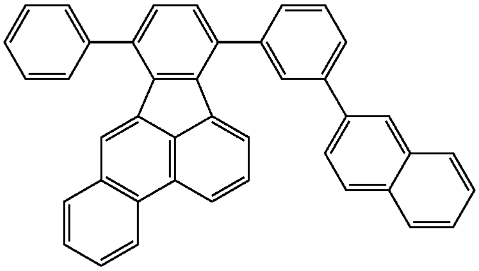
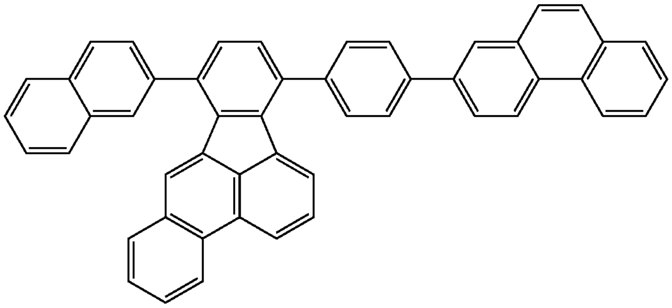
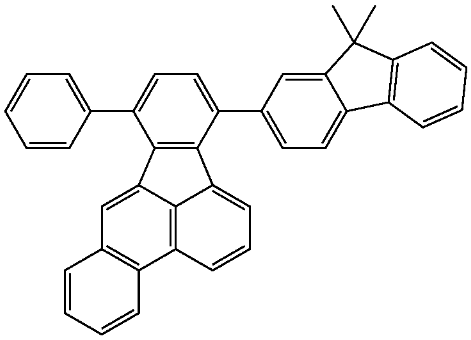
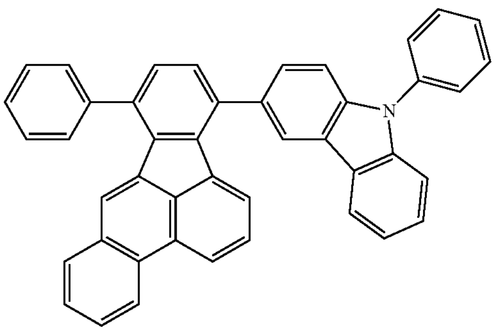
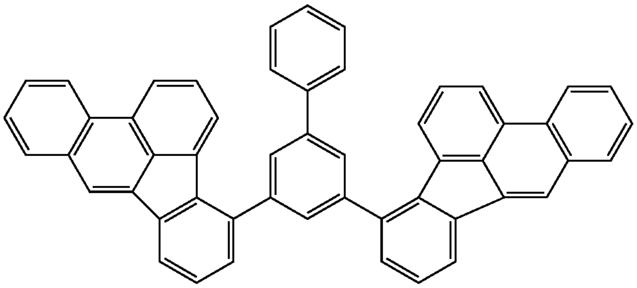
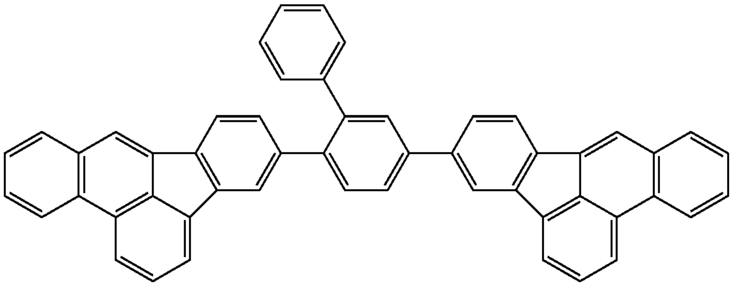

-continued
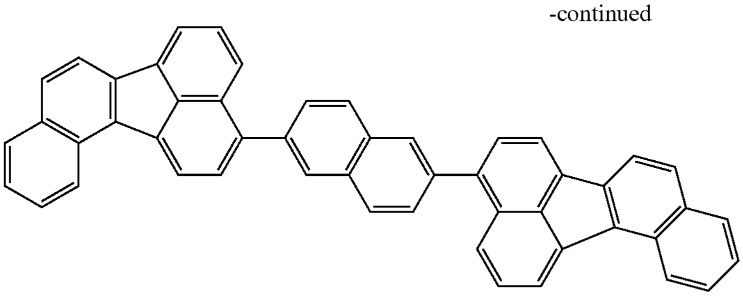
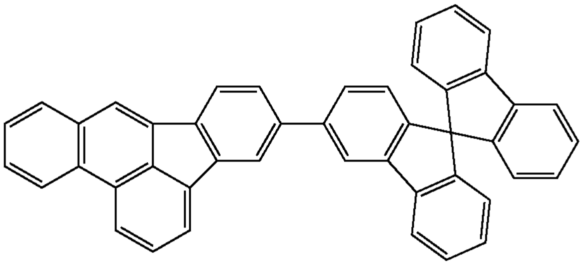
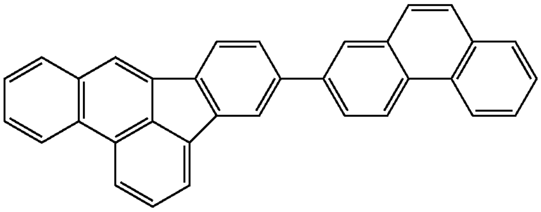
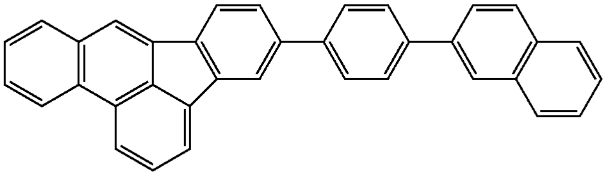
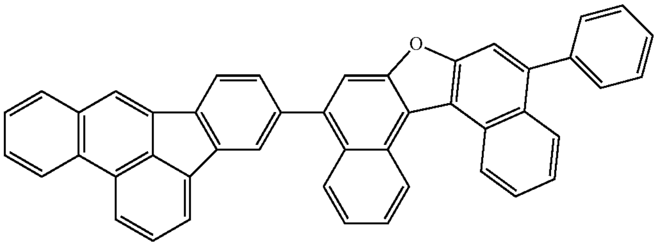
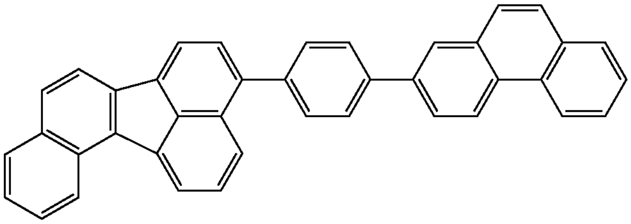
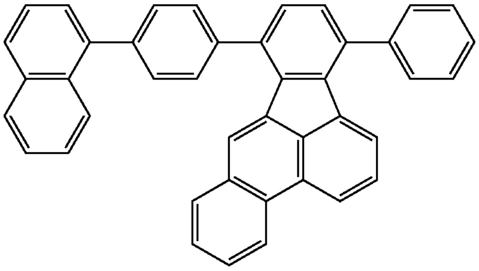
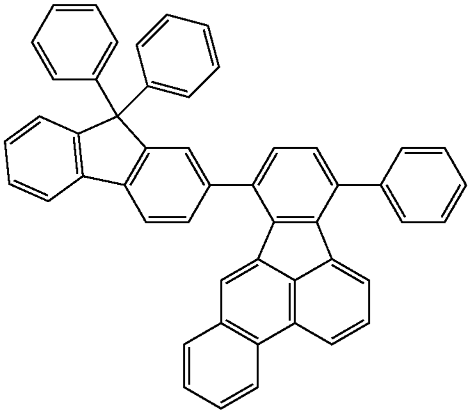
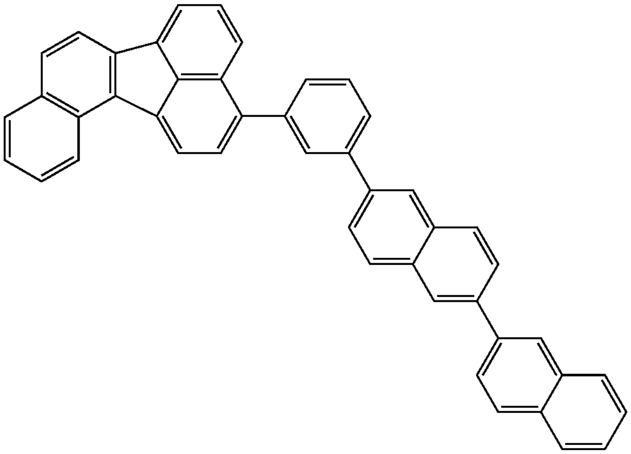

-continued
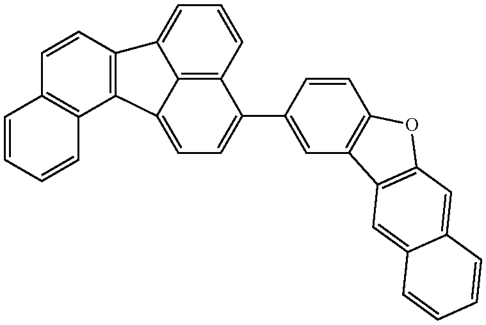
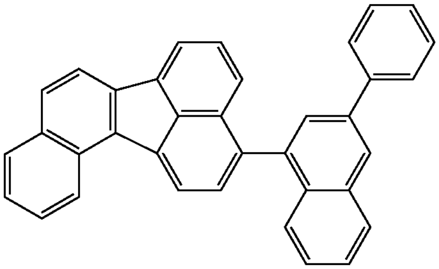
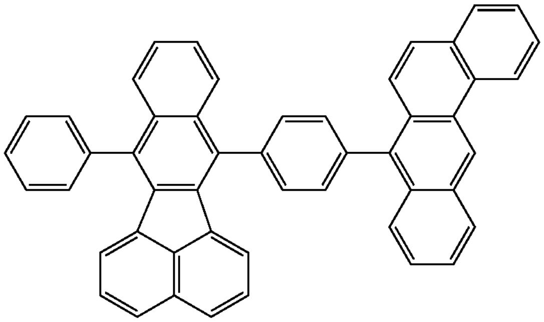
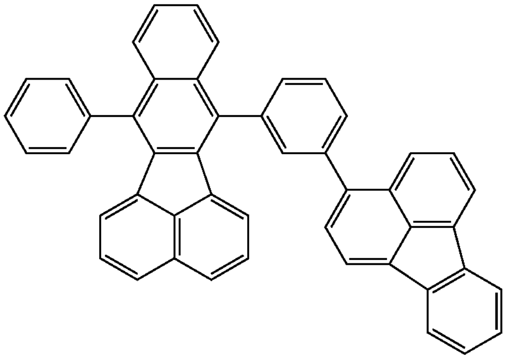
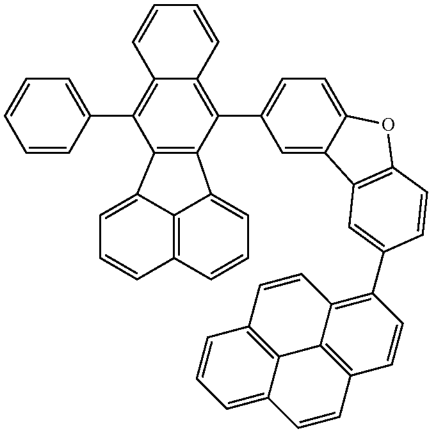
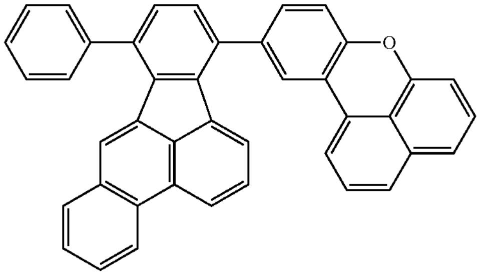
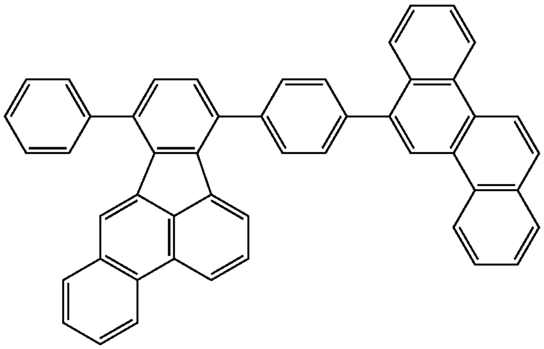
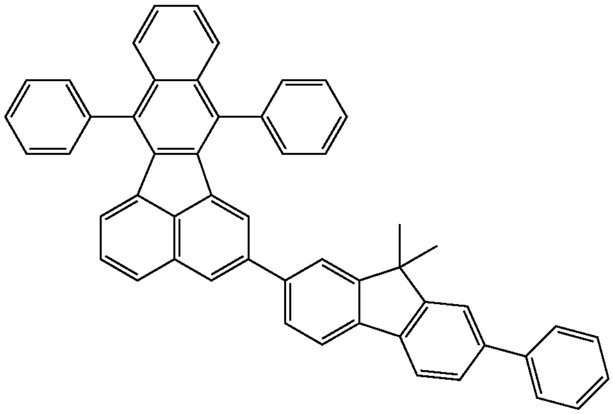

-continued
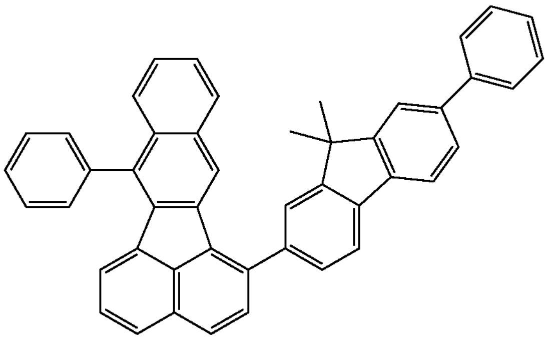
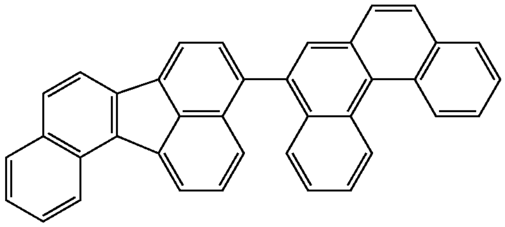
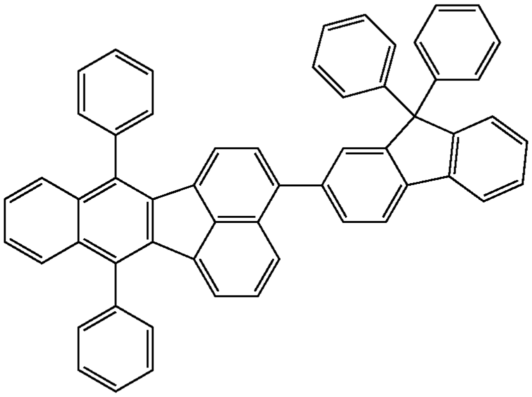
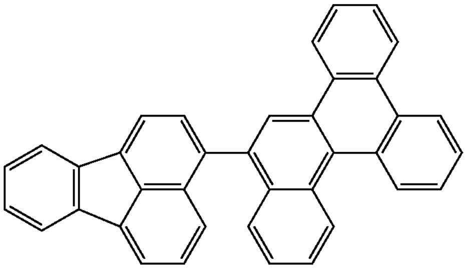
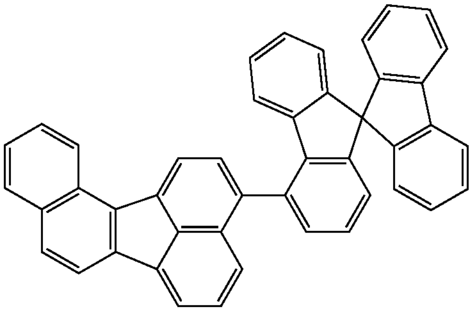
[Formula 115]
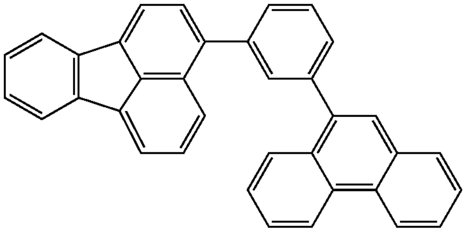
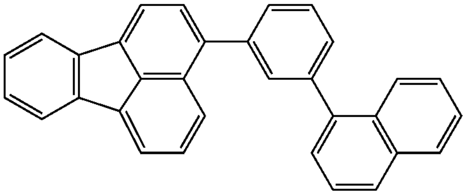

-continued
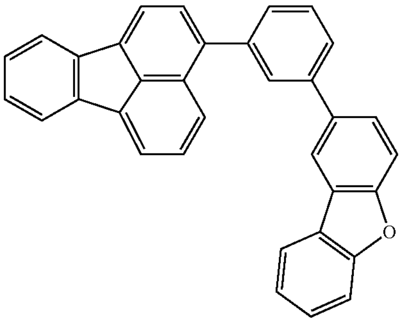
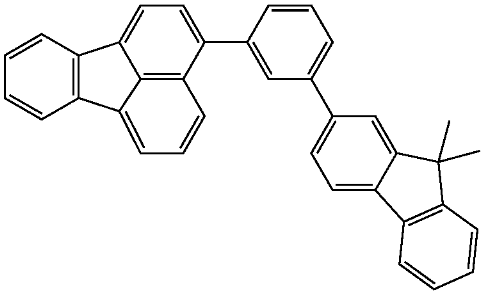
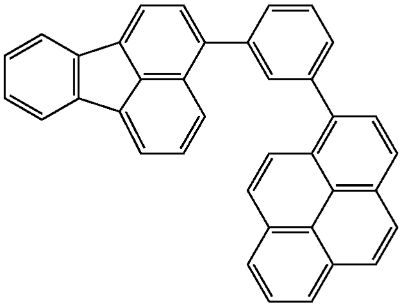
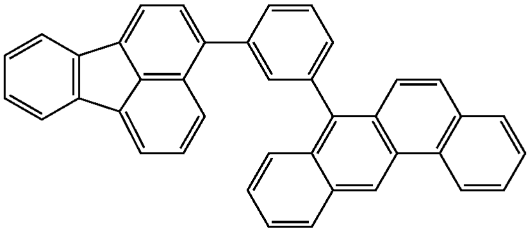
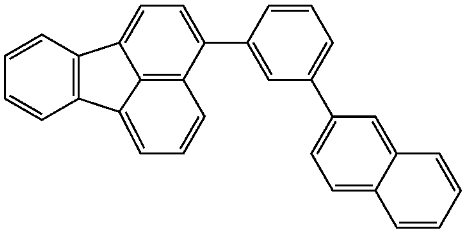
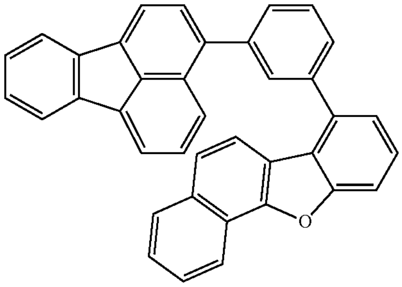
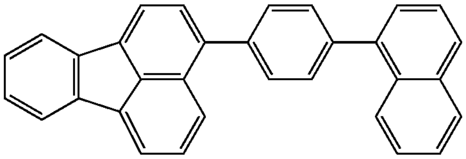
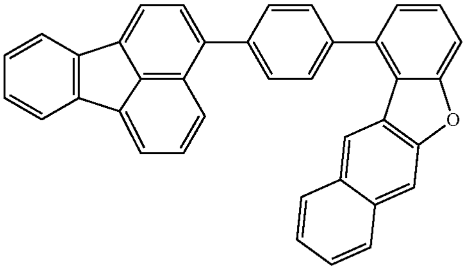
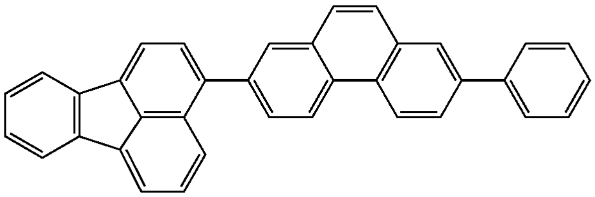
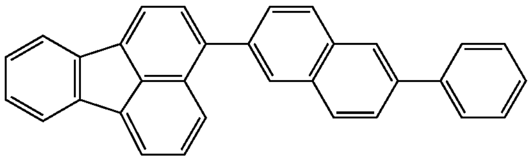
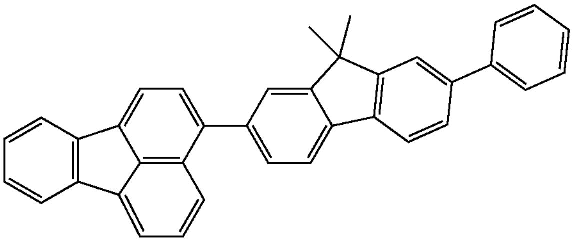
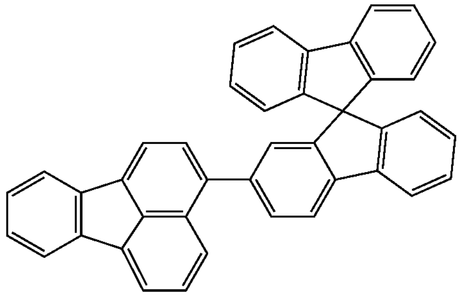

-continued
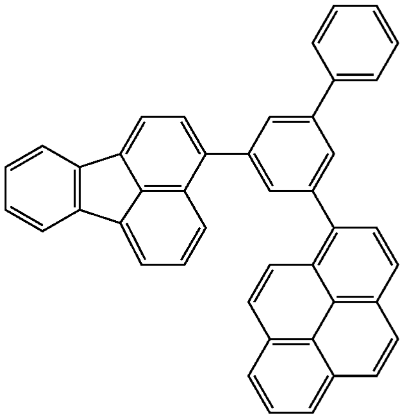
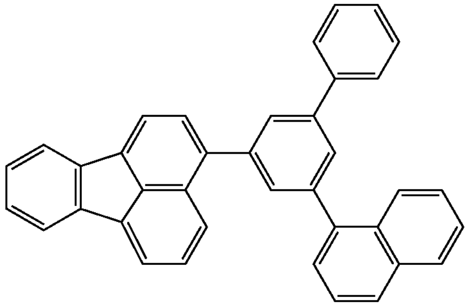
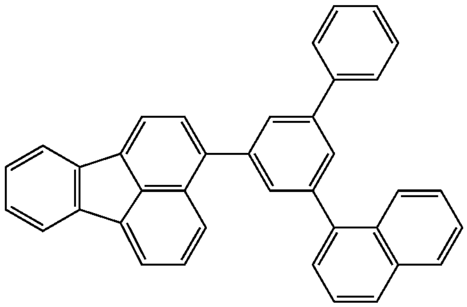
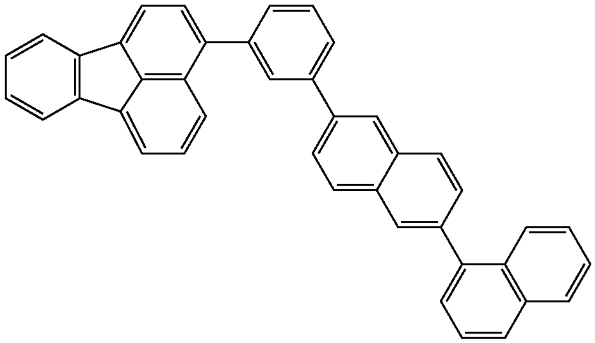
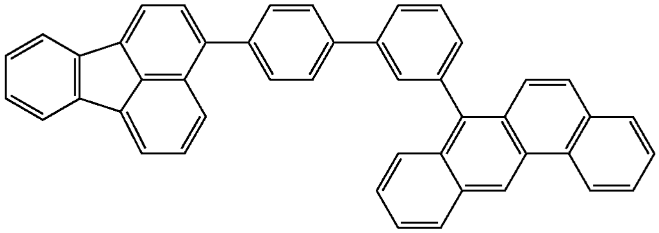
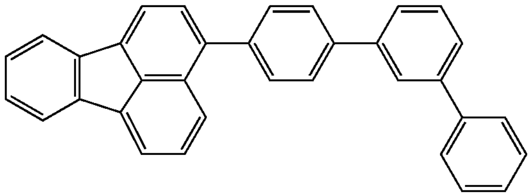
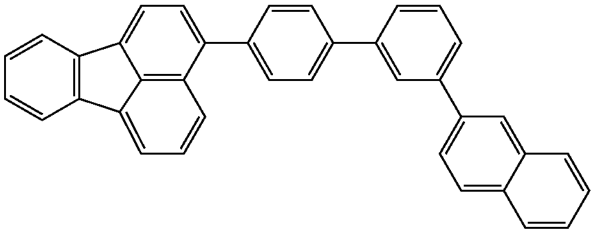

-continued
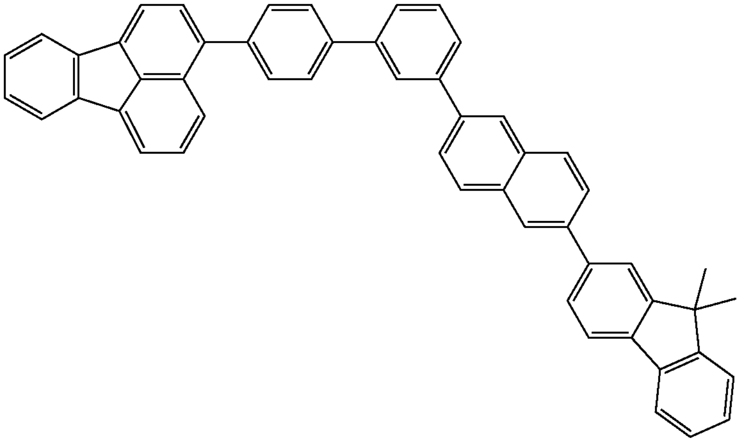
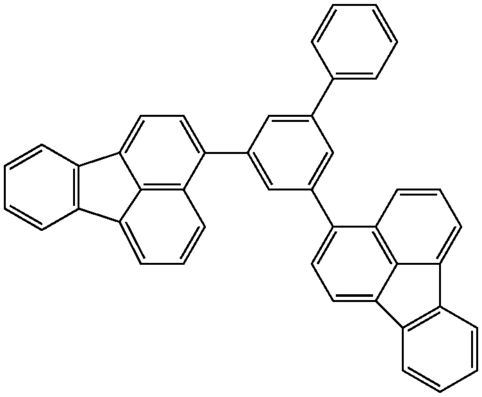
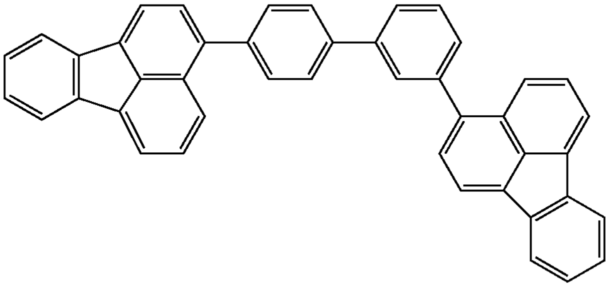
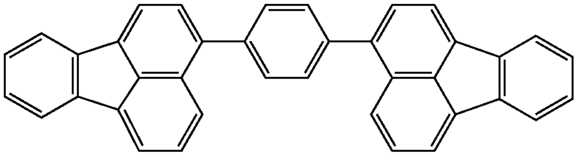
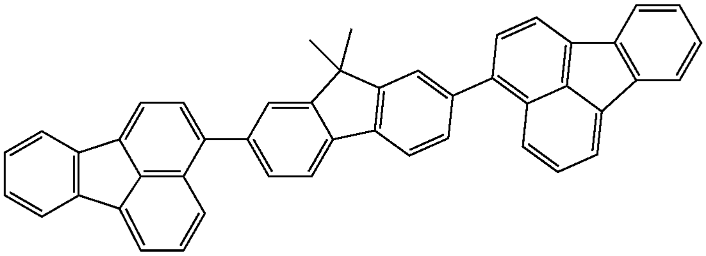
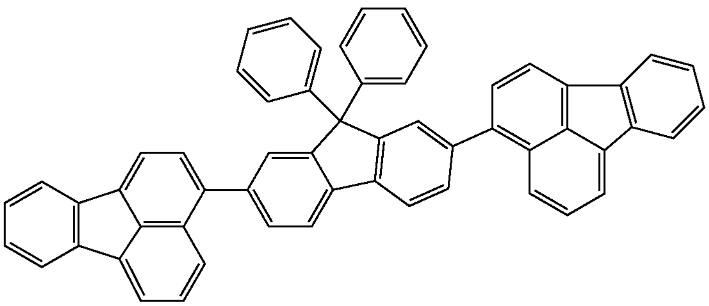

-continued
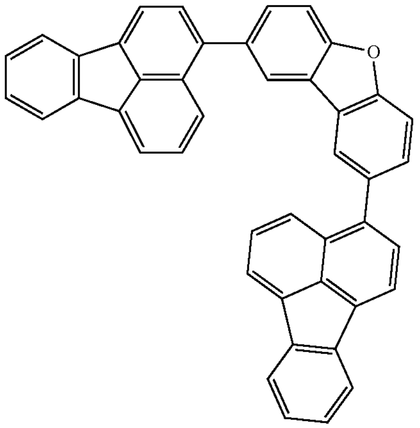
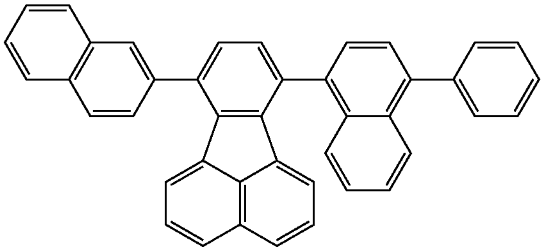
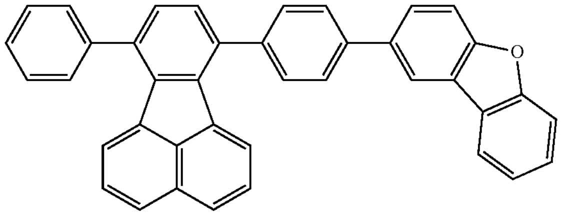
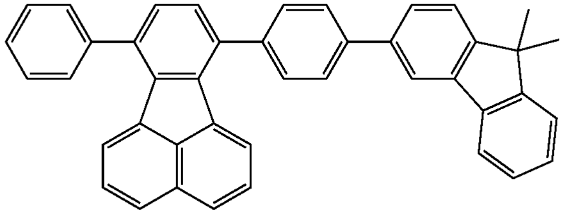
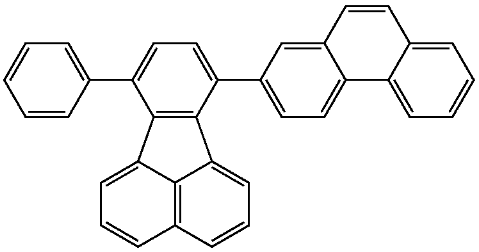
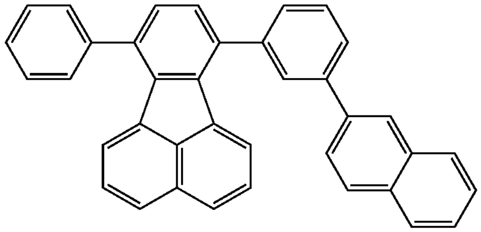
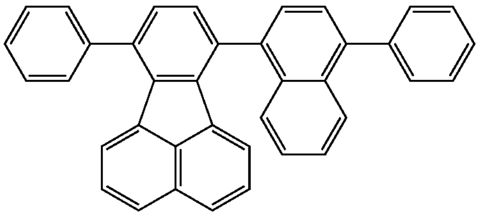
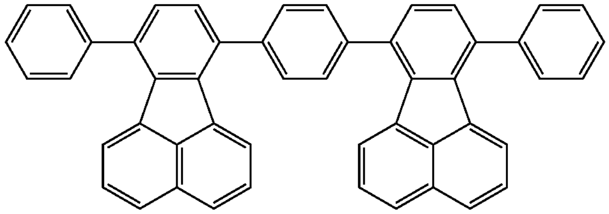
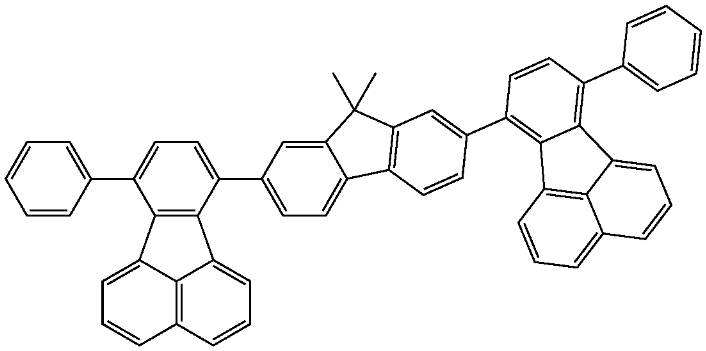

-continued
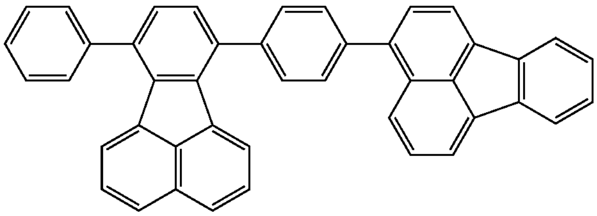
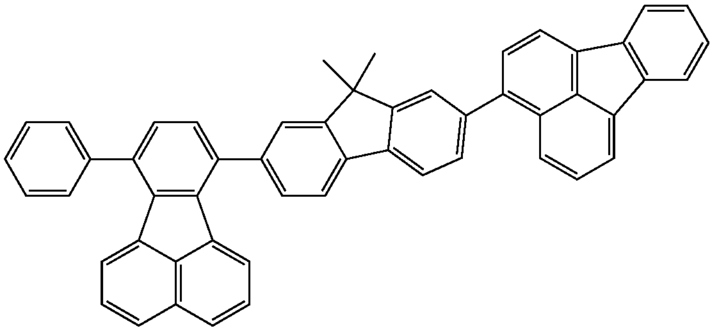
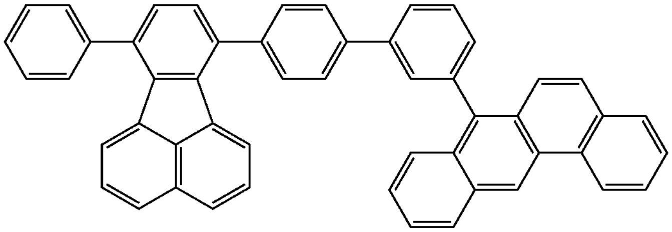
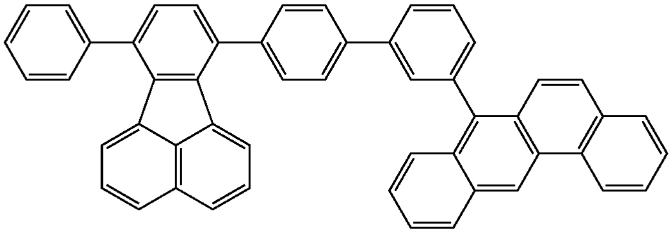
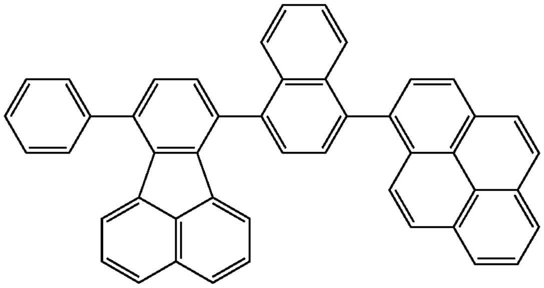
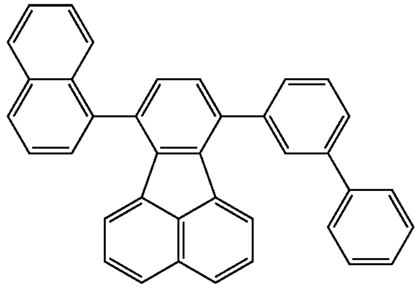
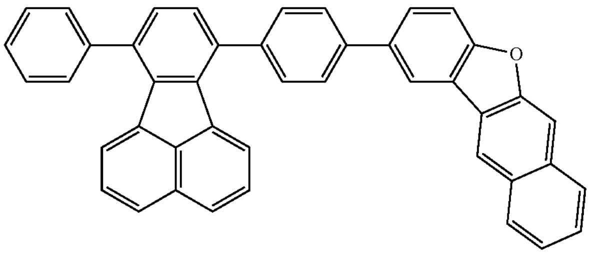
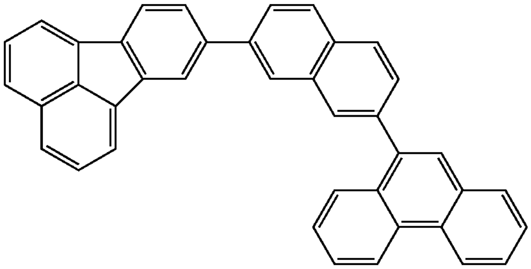

-continued
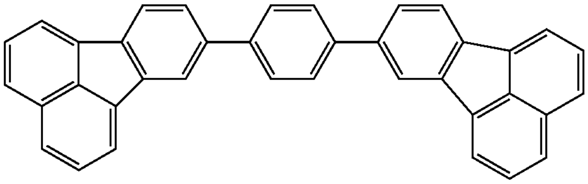
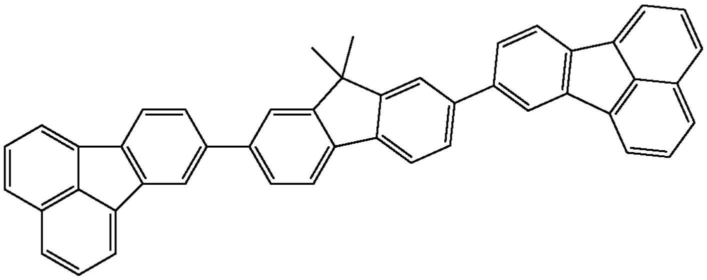
[Formula 116]
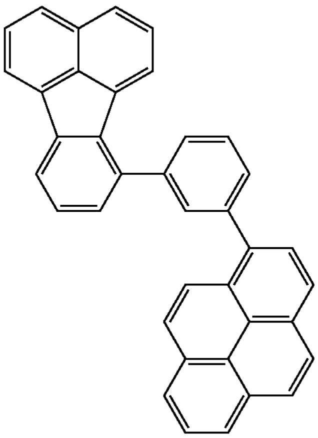
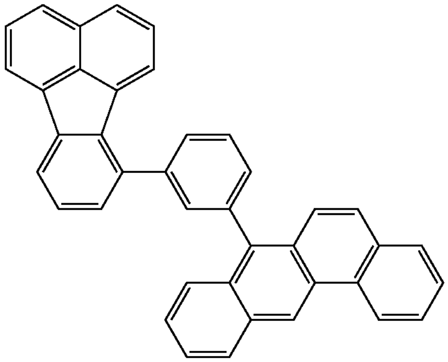
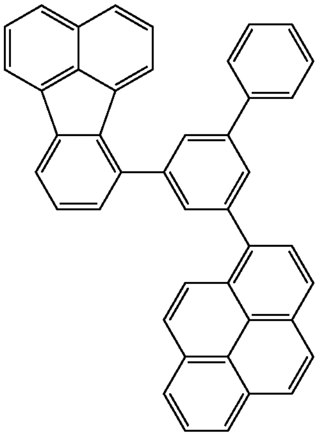
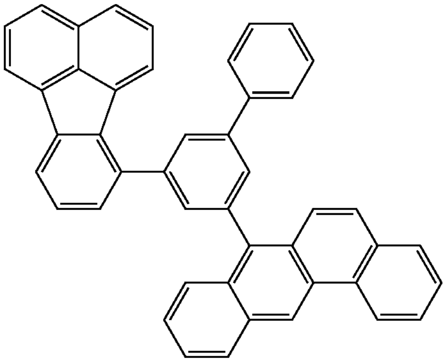
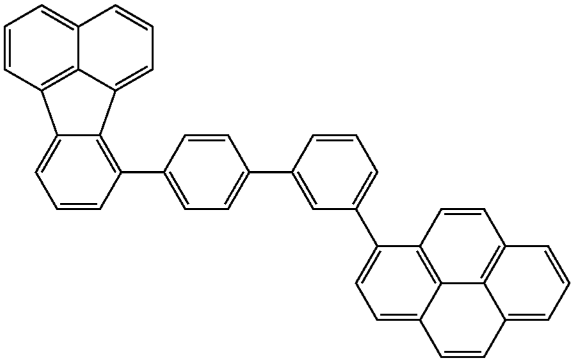

-continued
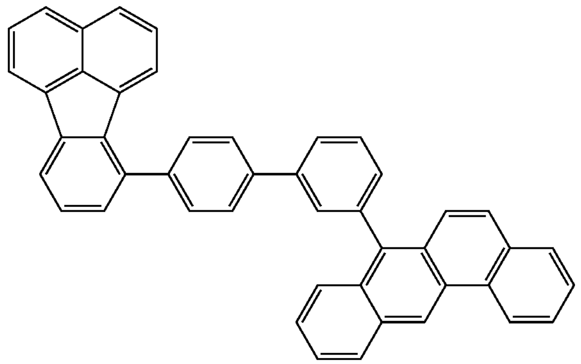
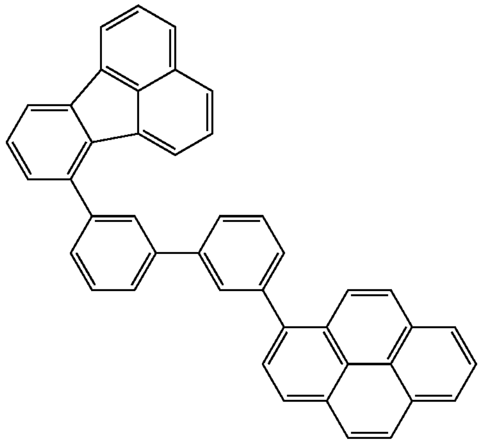
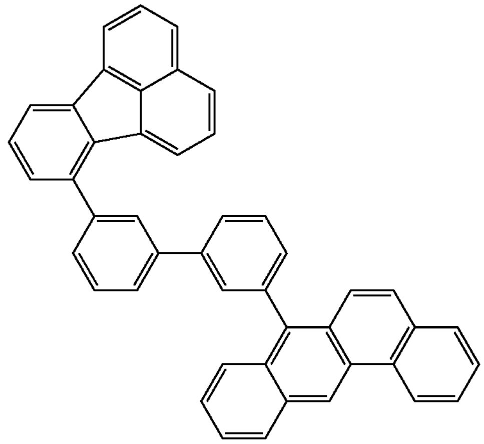
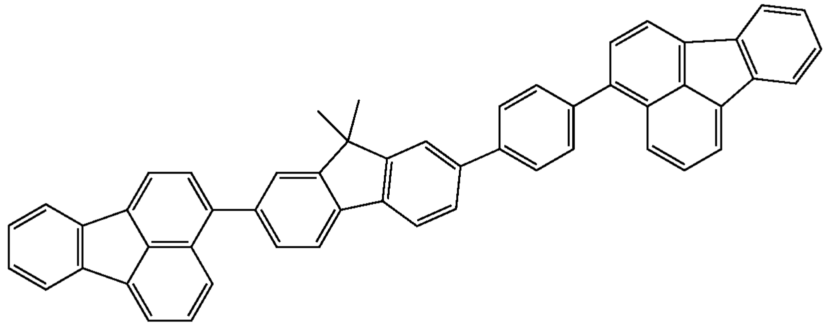
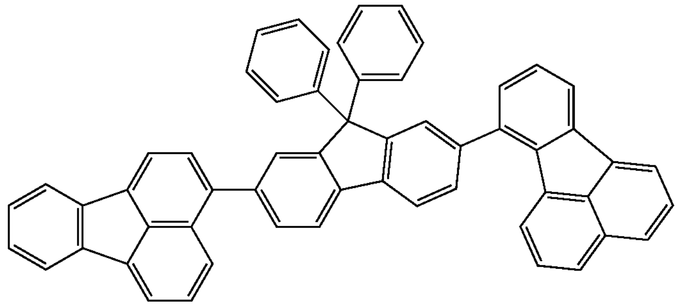

-continued
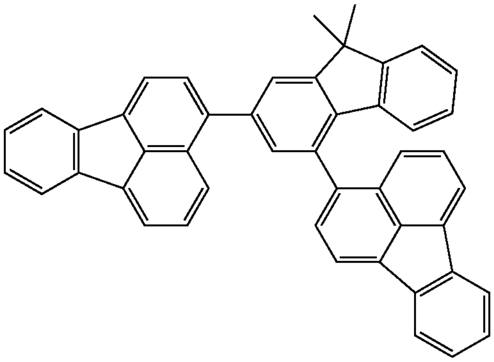
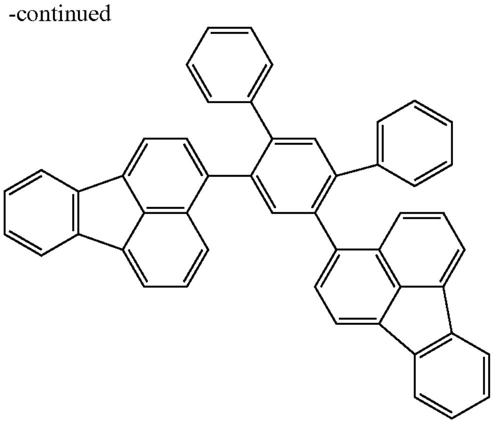
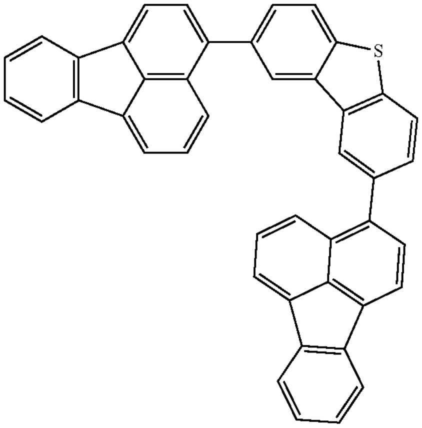
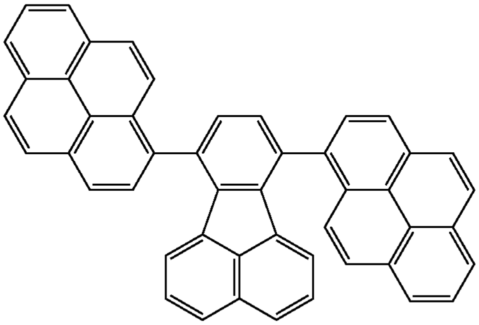
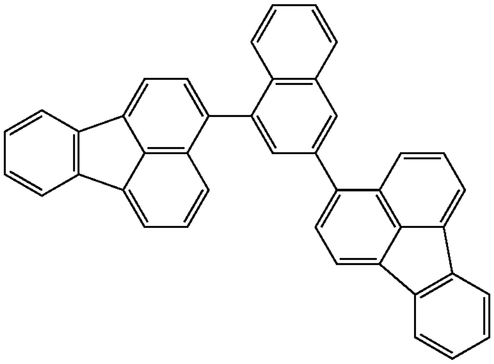
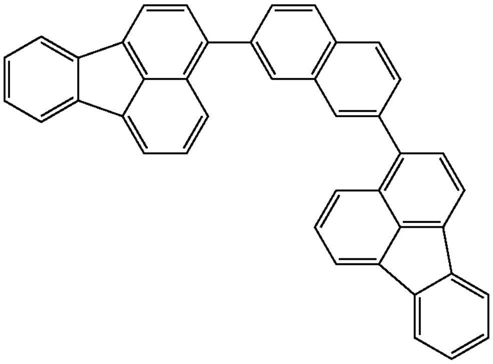
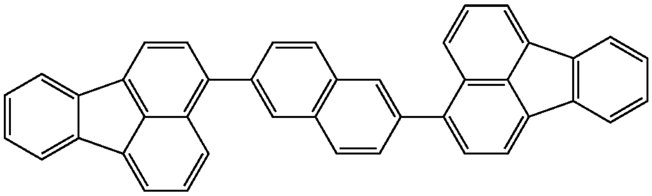
[Formula 117]
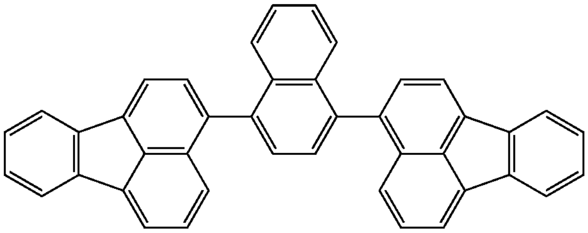
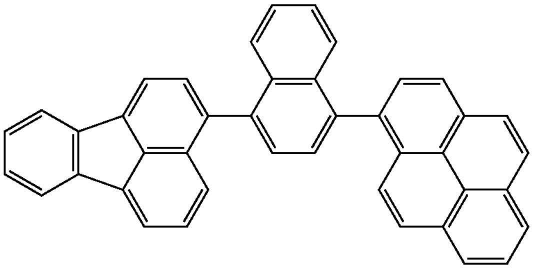

-continued
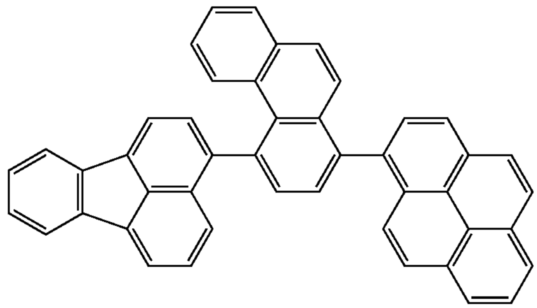
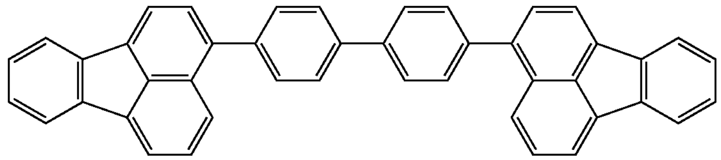
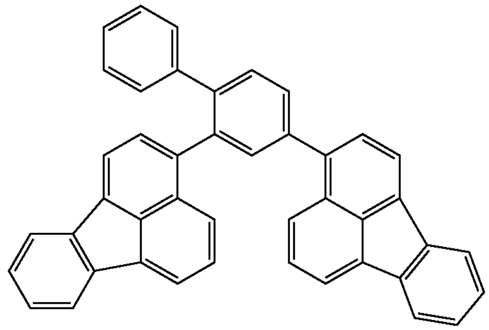
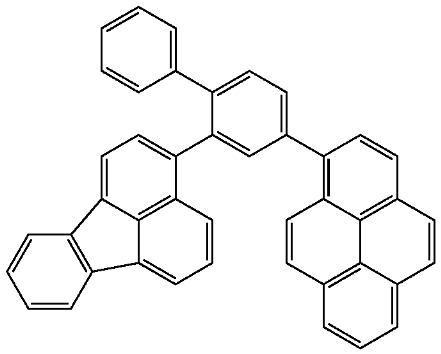
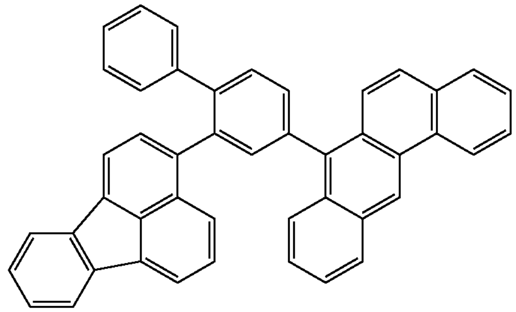
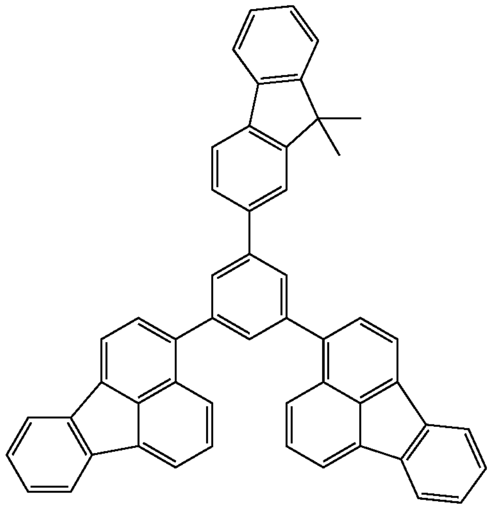

-continued
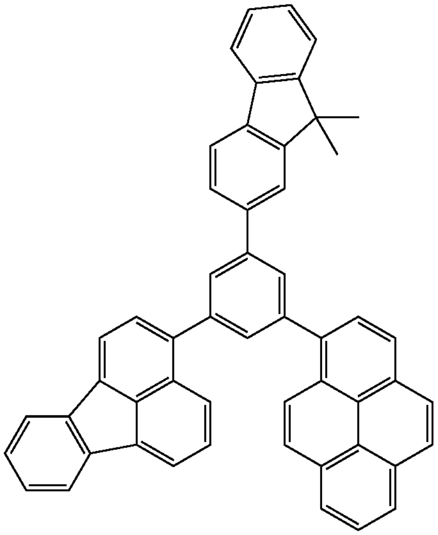
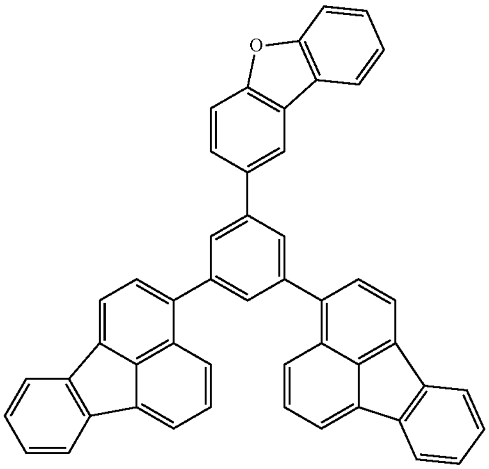
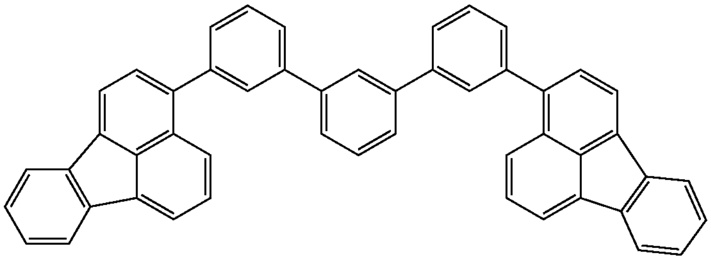
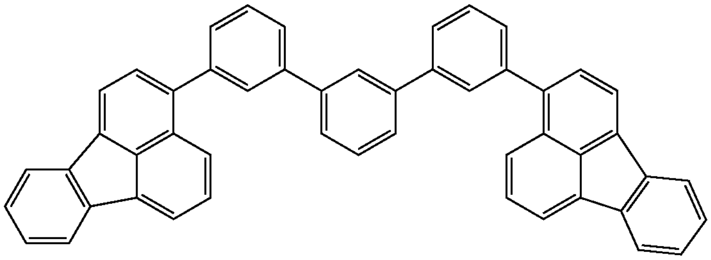
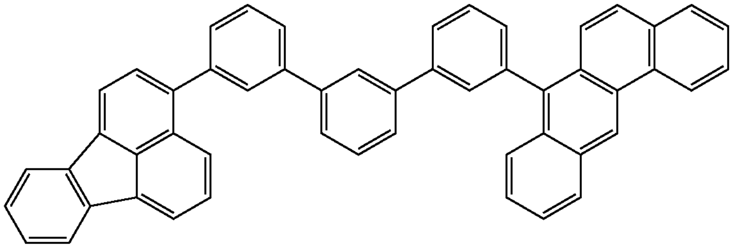
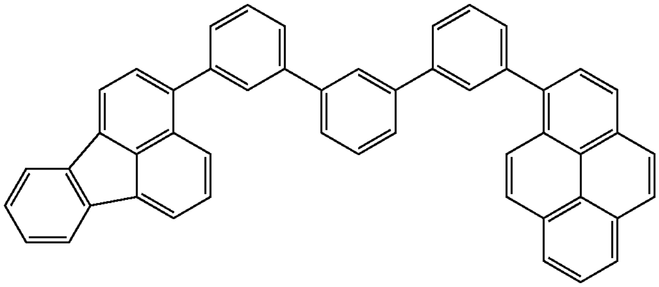

-continued
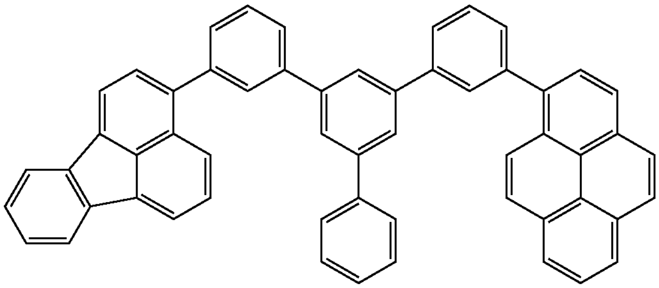
[Formula 118]
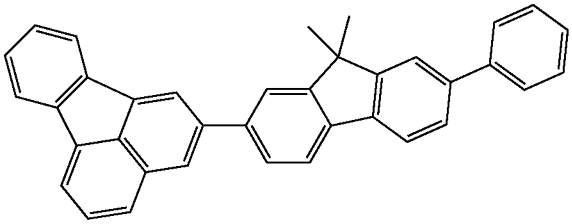
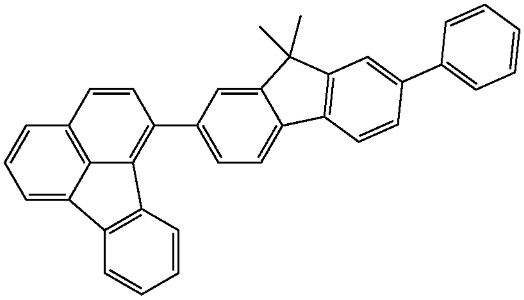
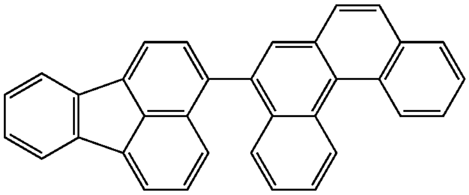
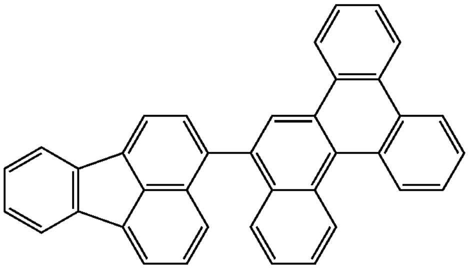
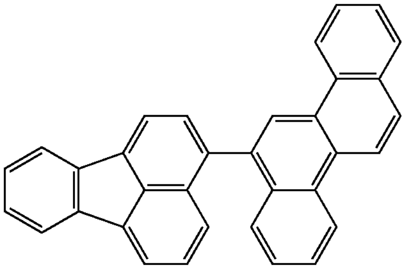
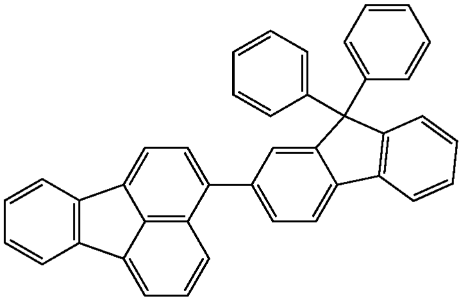
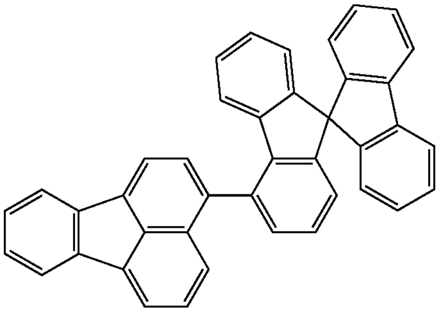
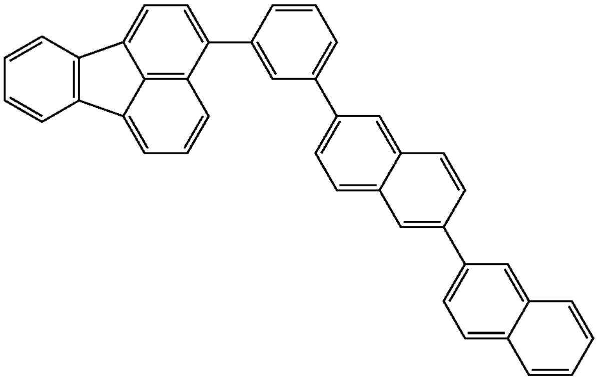

-continued
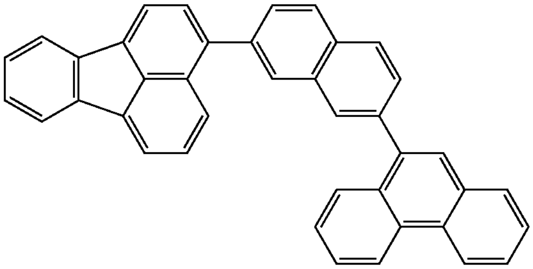
[Formula 119]
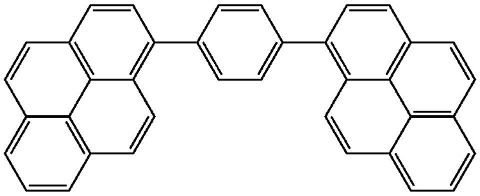
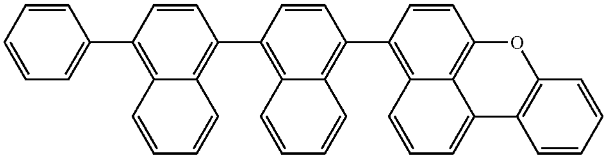
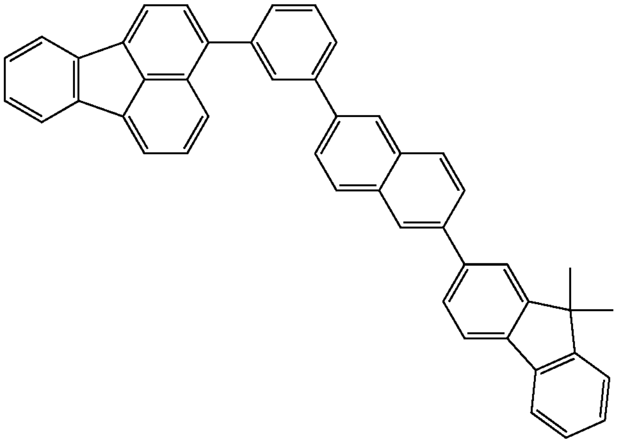
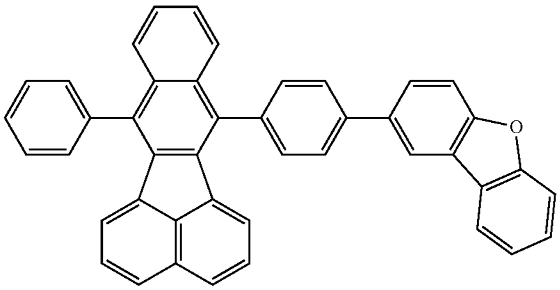
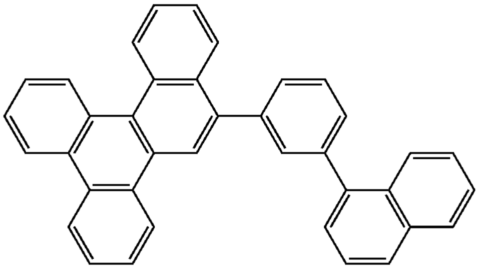

-continued
[Formula 120\
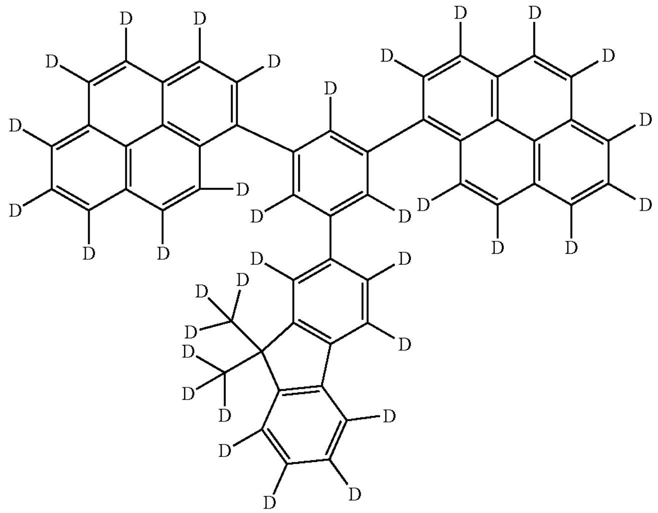
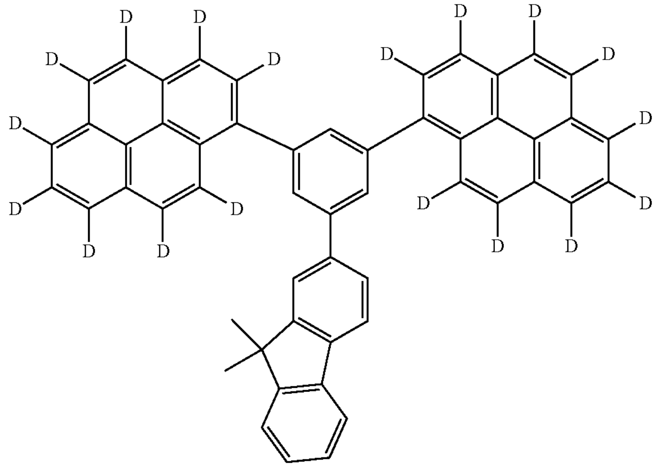
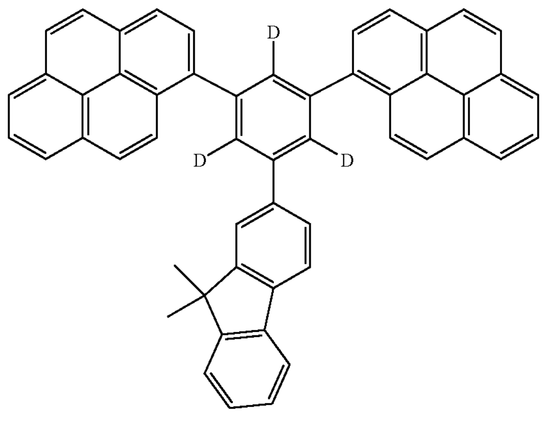
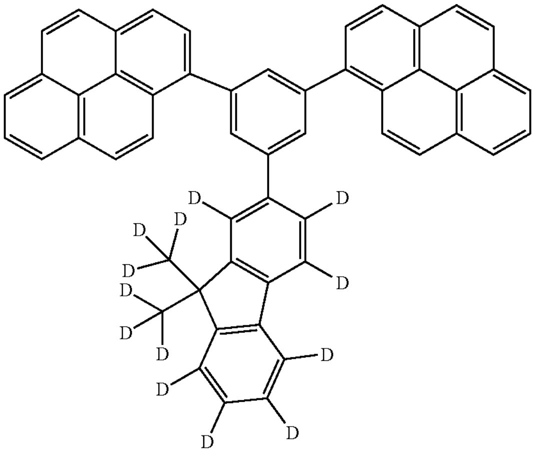

-continued
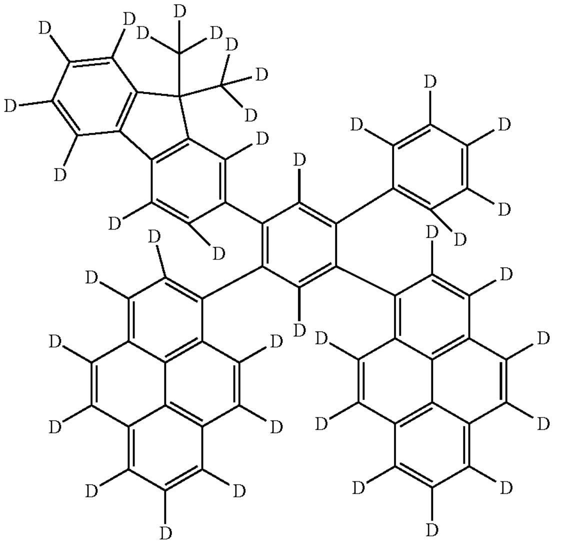
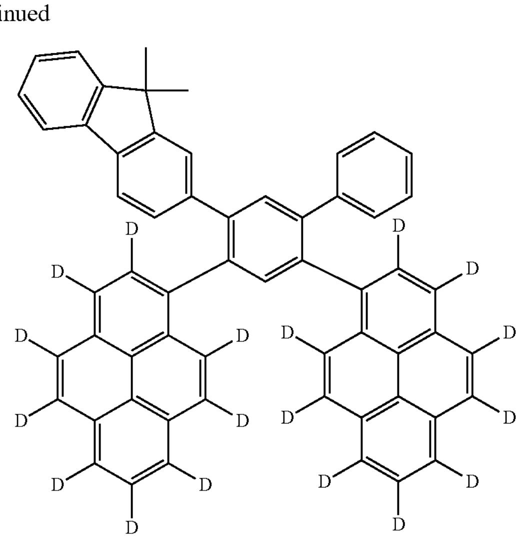
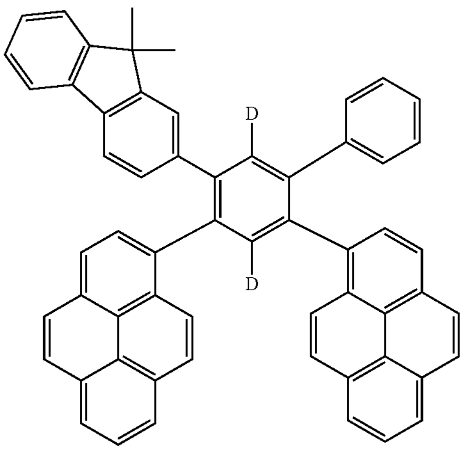
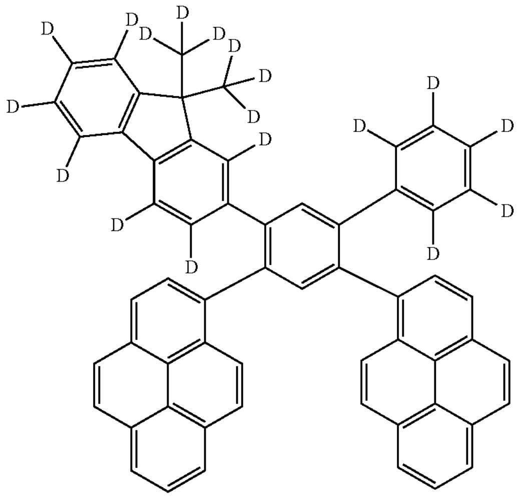
[Formula 121]
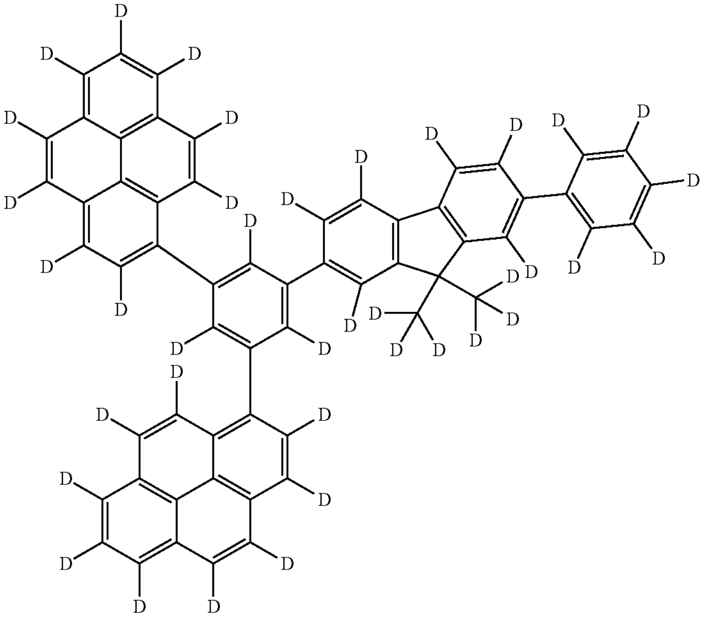

-continued
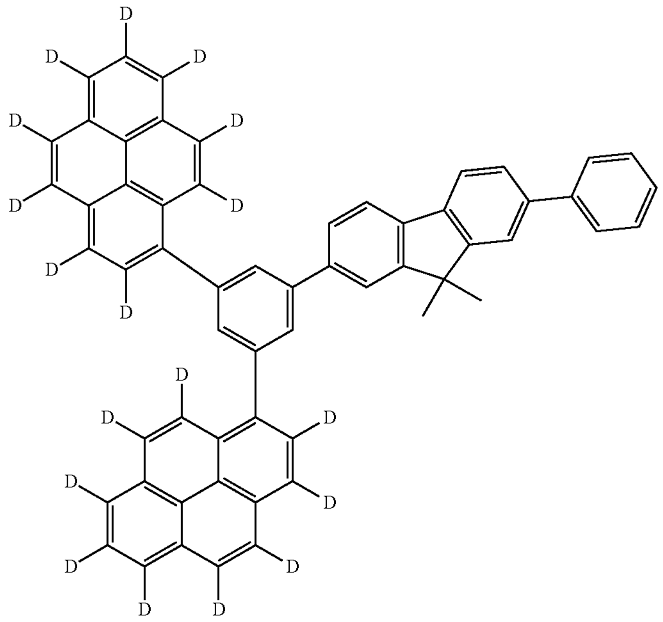
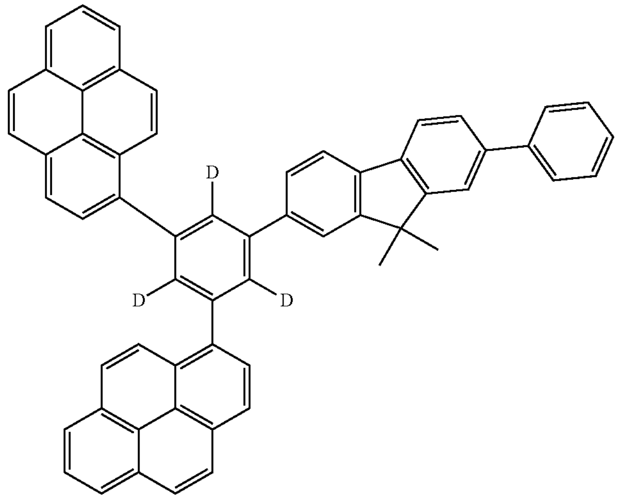
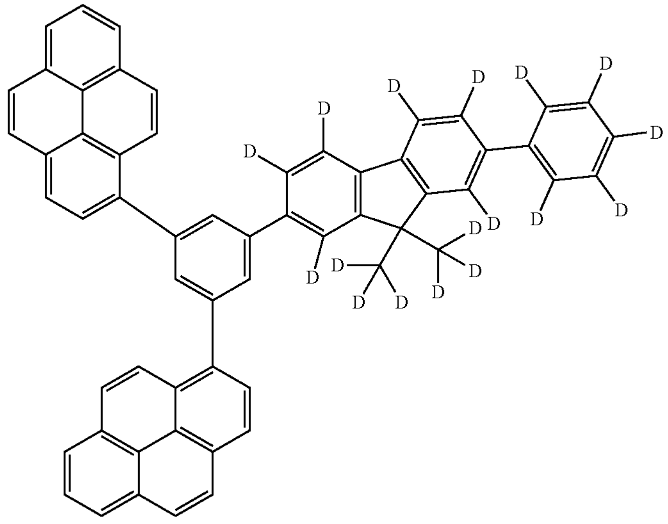

-continued
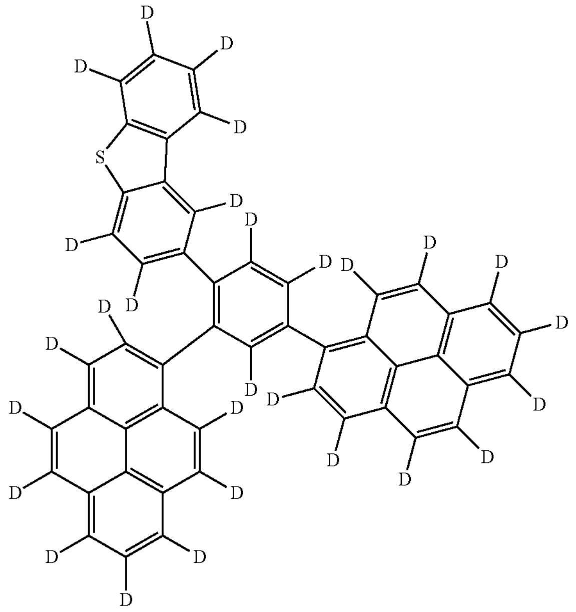
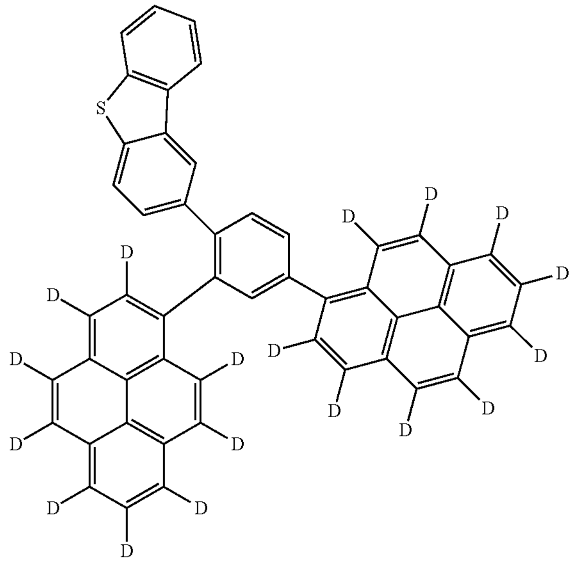
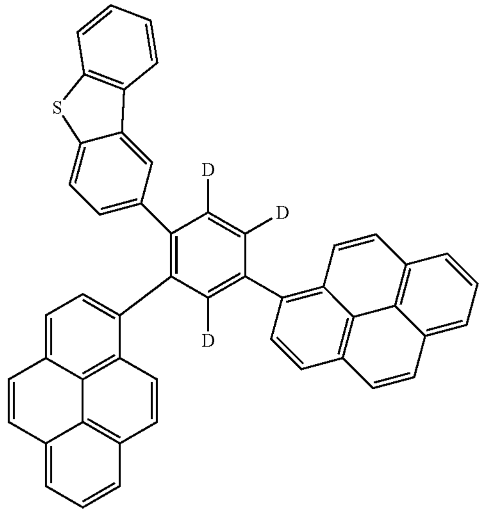
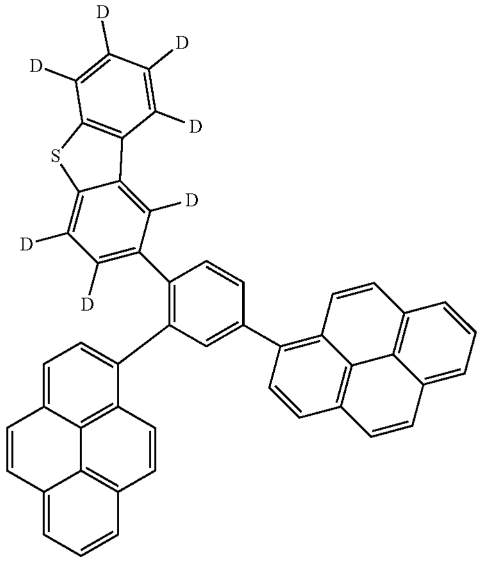

-continued
[Formula 122]
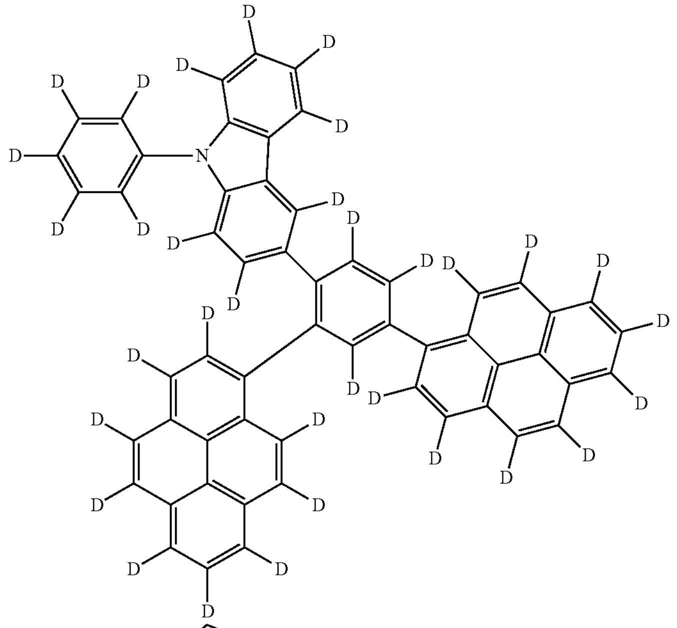
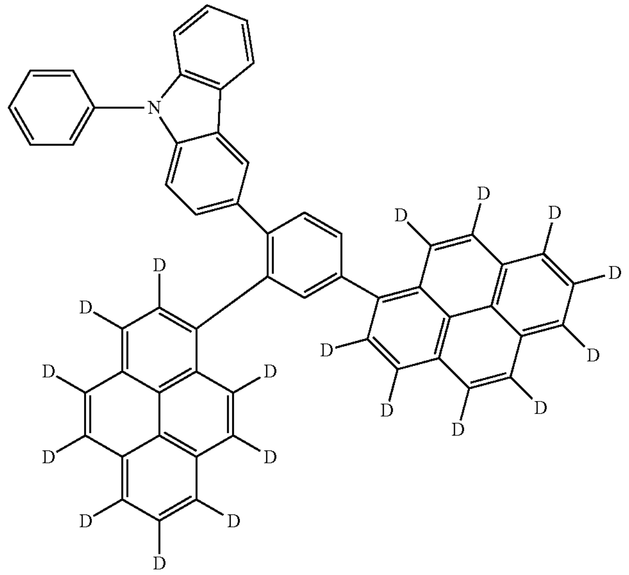
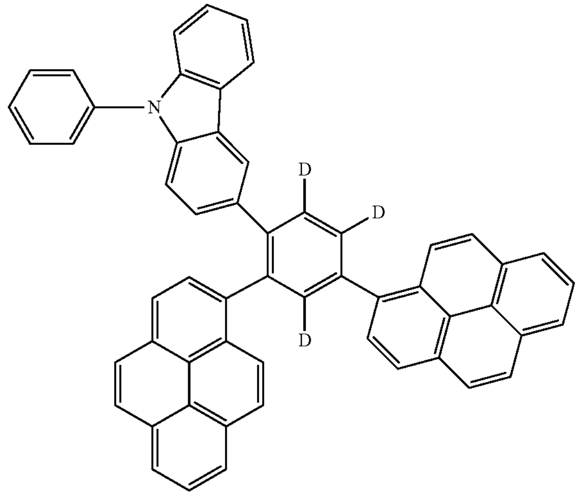

-continued
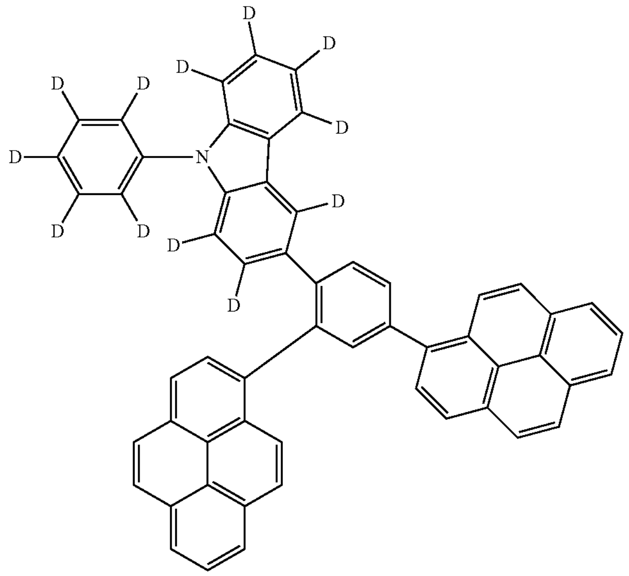
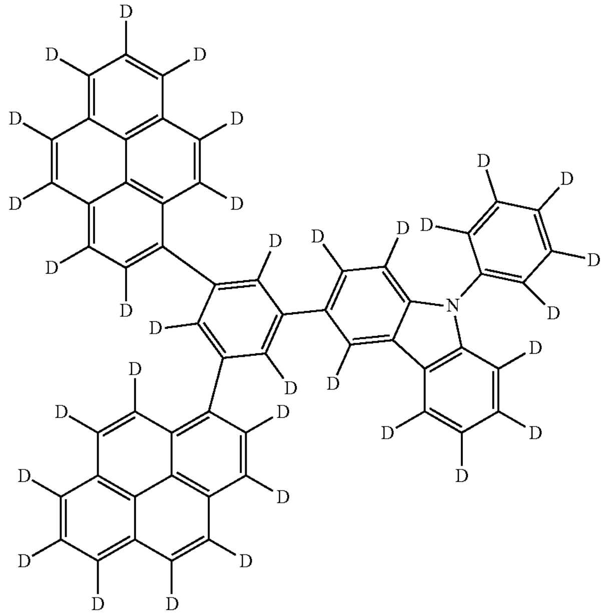

-continued
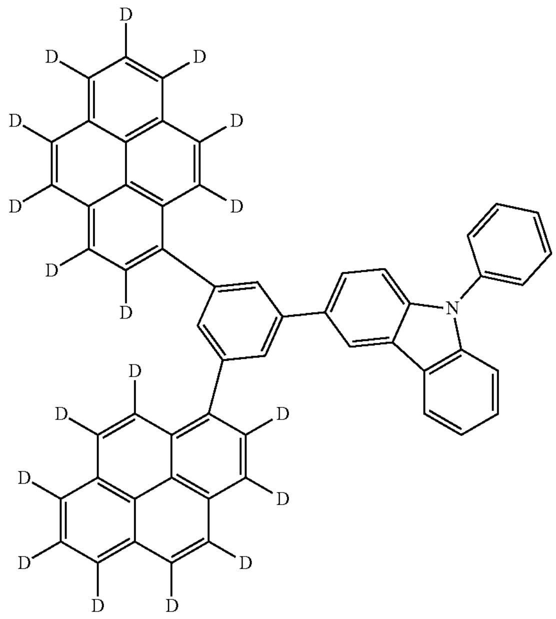
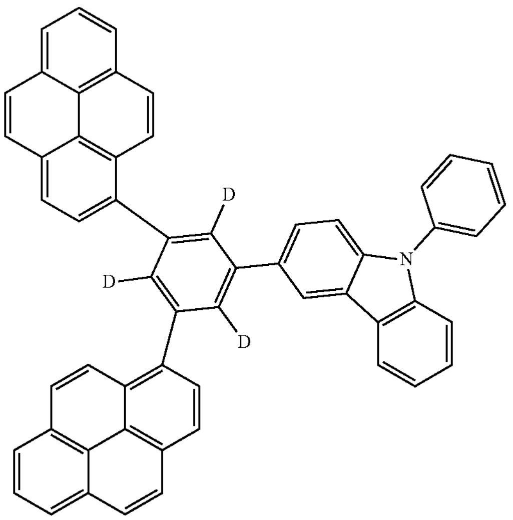
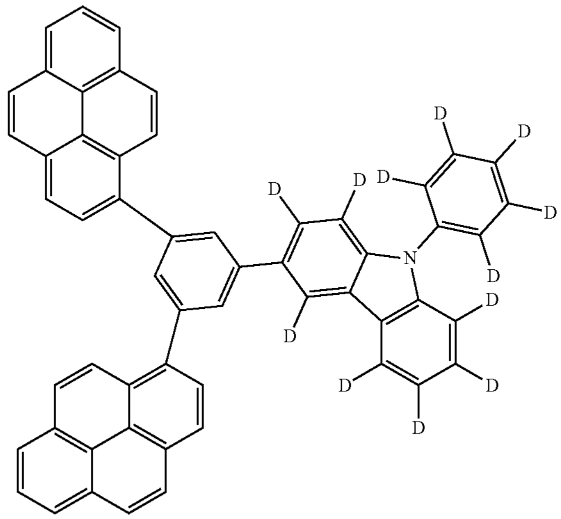

-continued
[Formula 123]
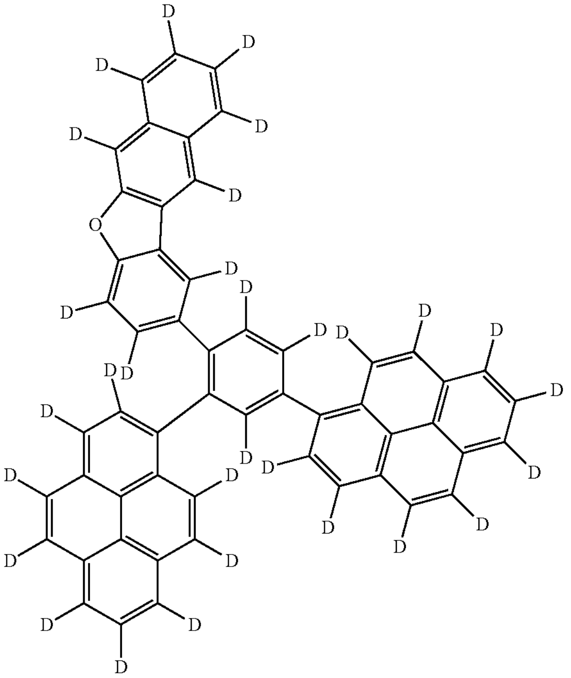
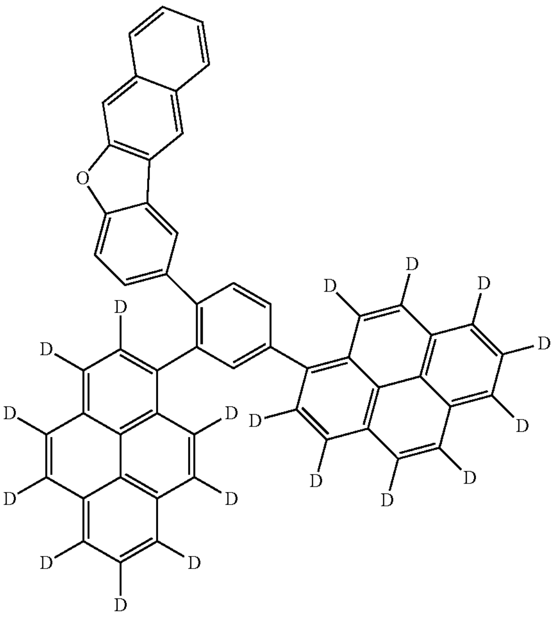
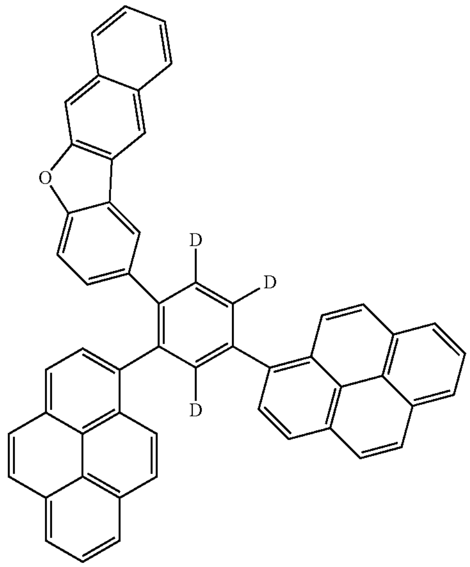
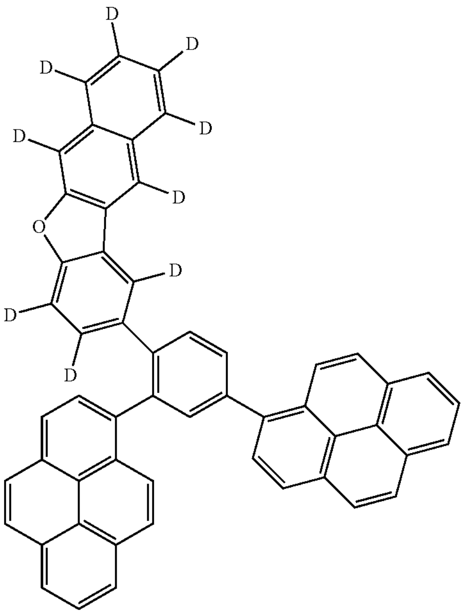

-continued
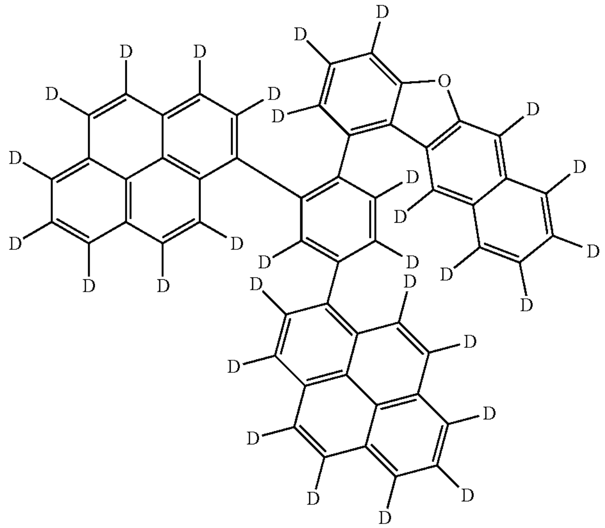
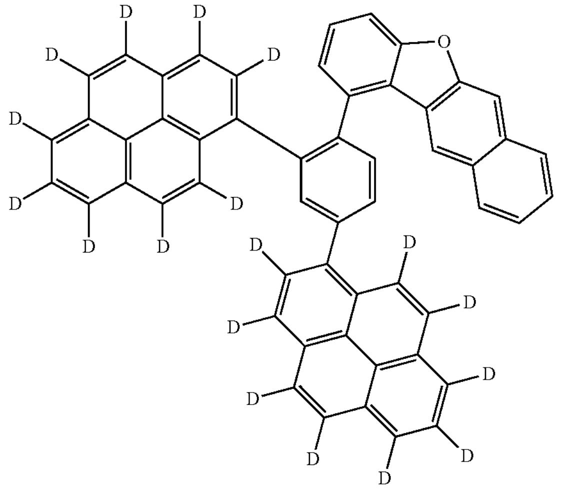
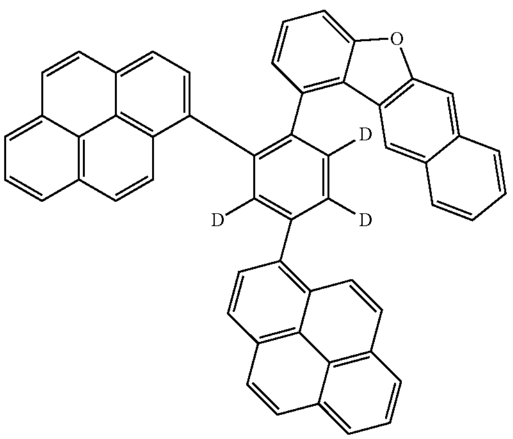
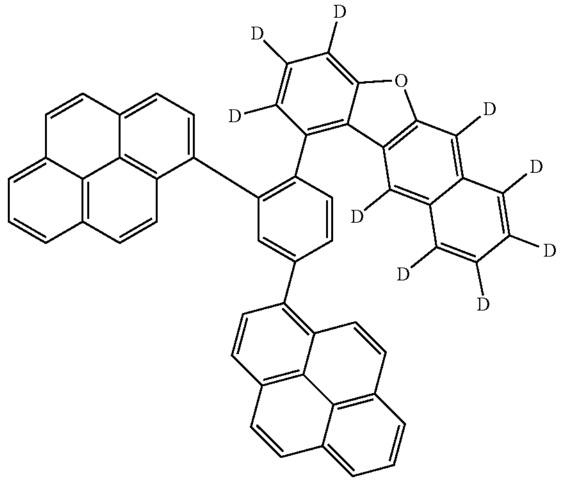

-continued
[Formula 124]
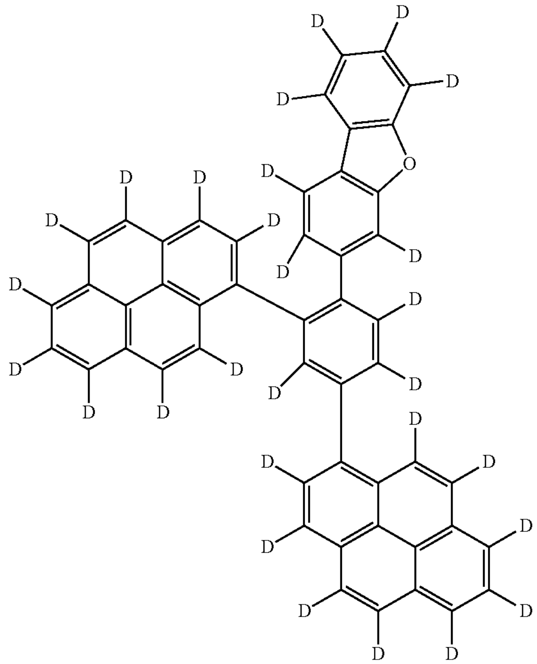
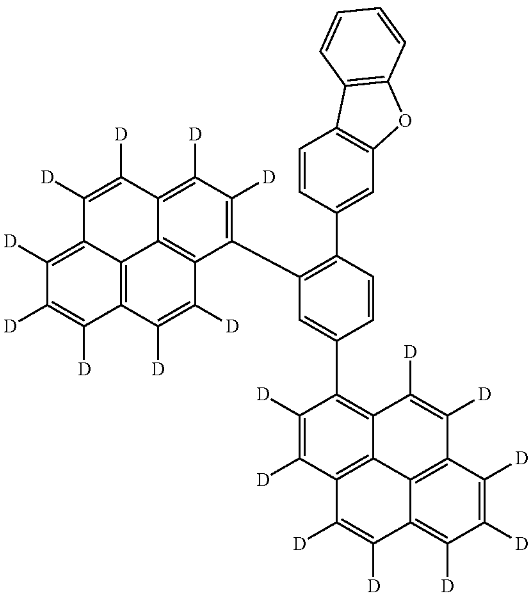
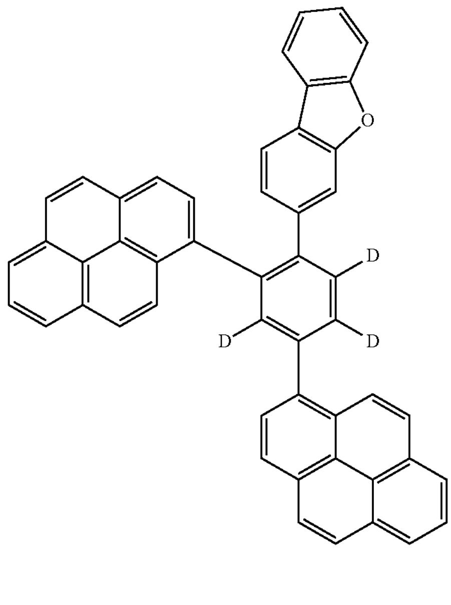
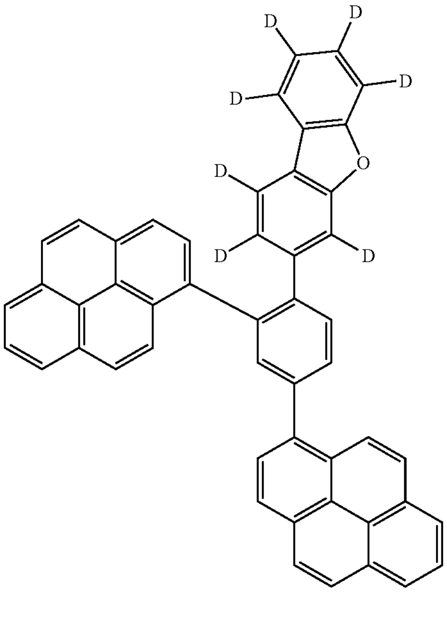

-continued
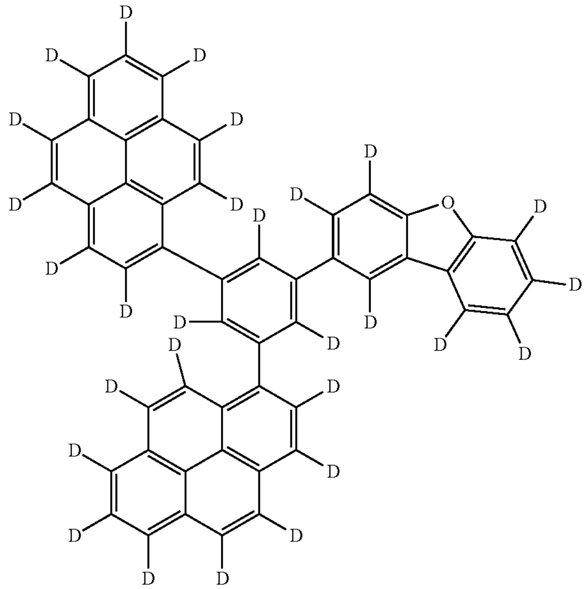
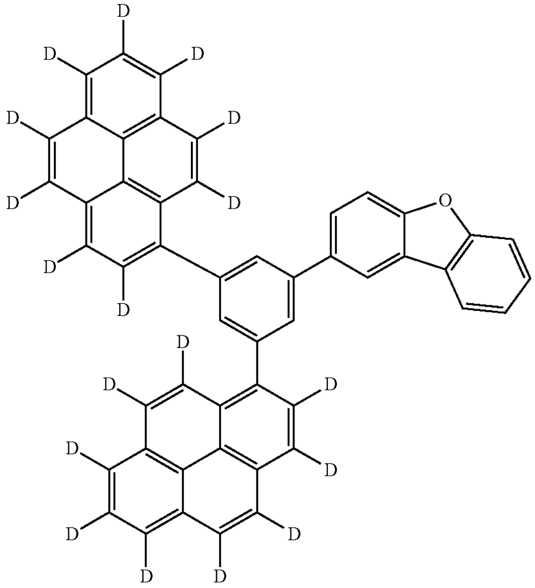
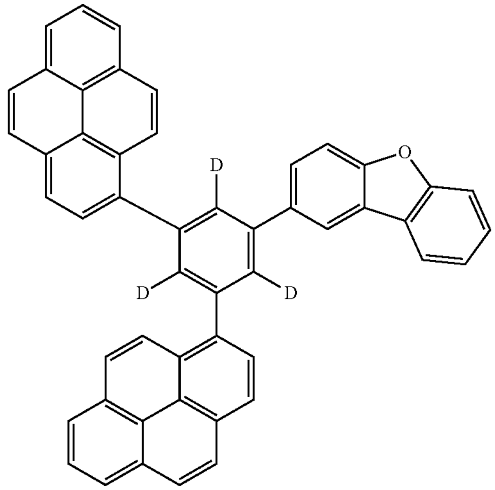
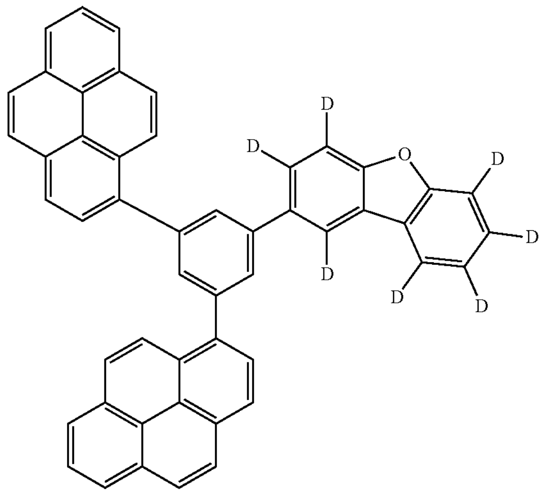
[Formula 125]
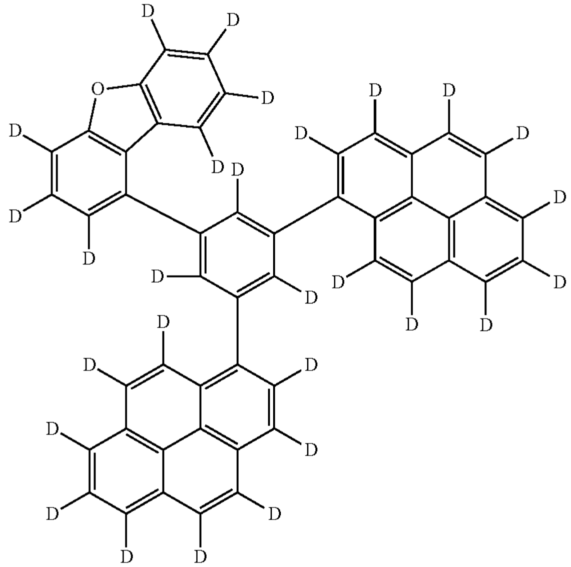
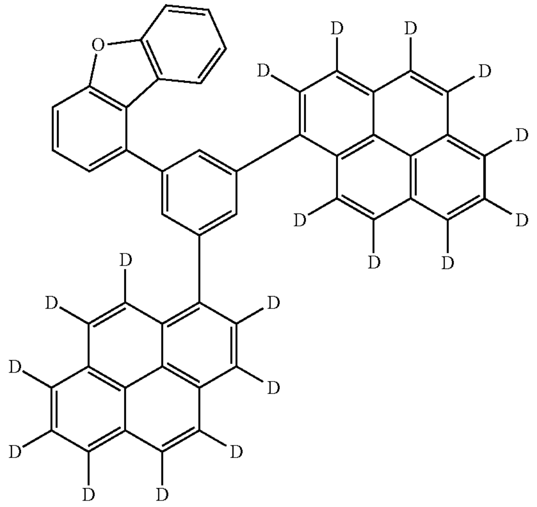

-continued
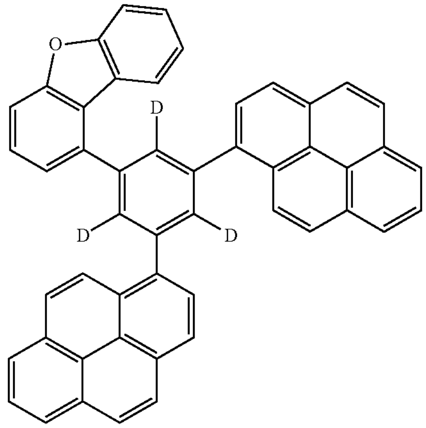
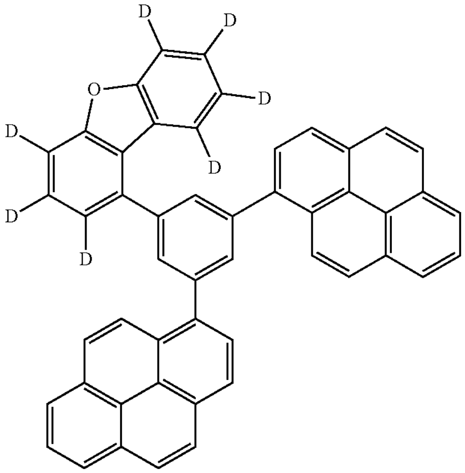
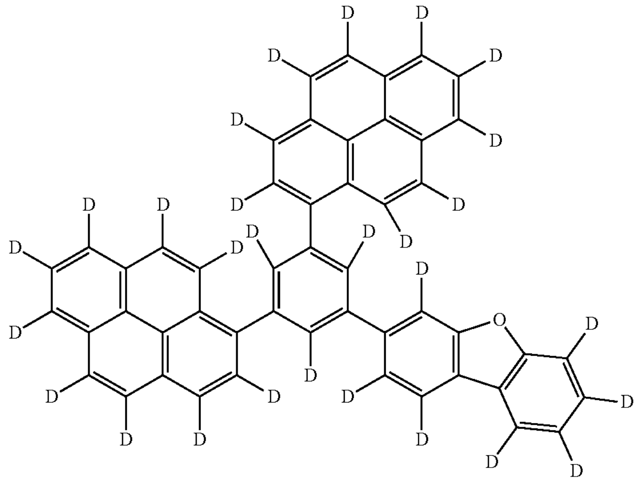
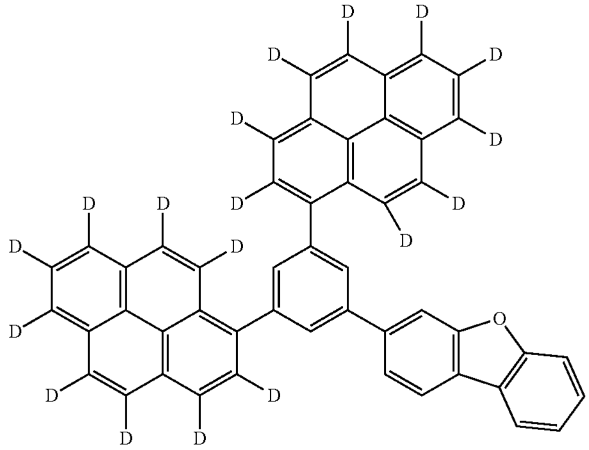
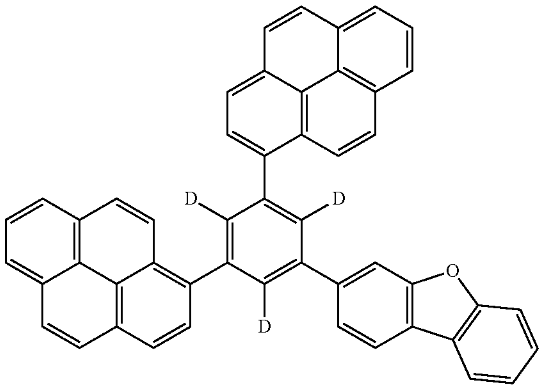

-continued
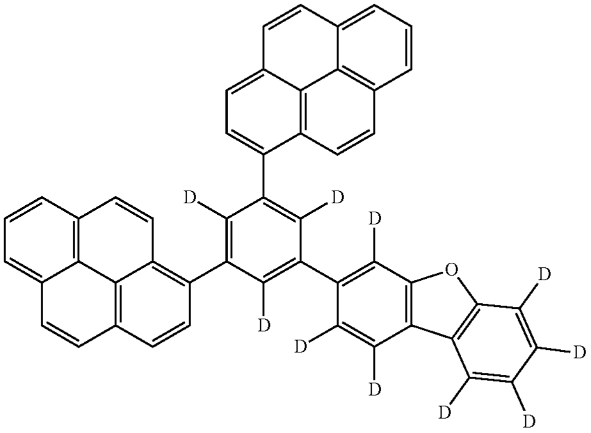
[Formula 126]
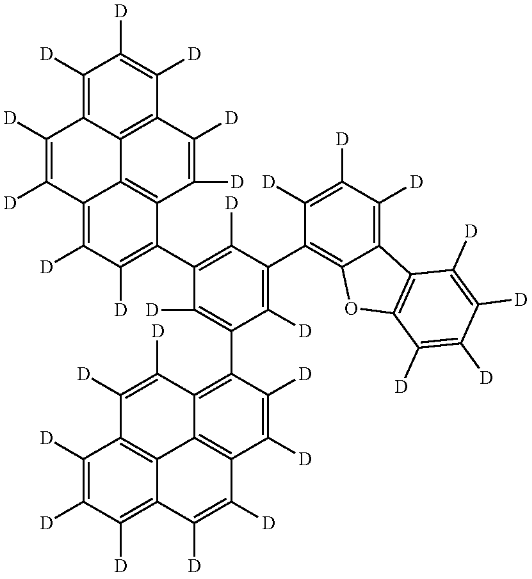
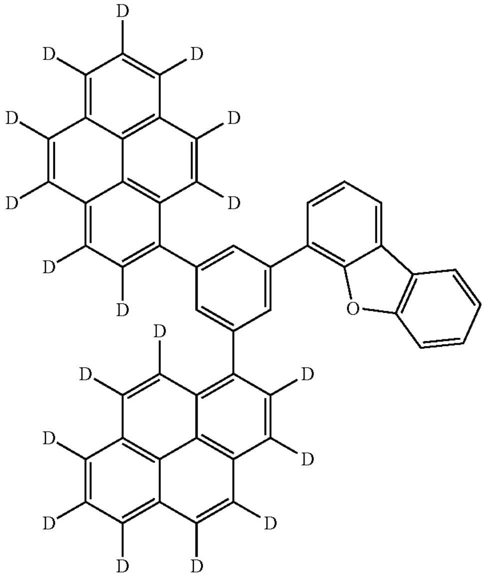
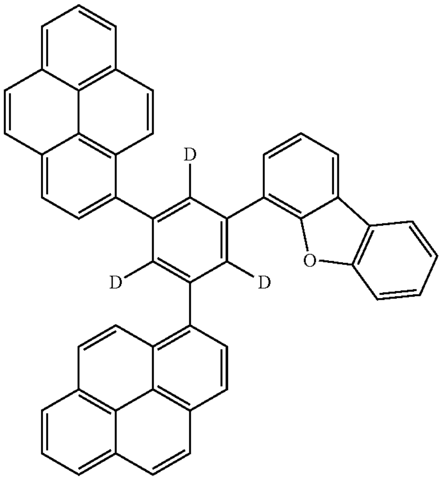
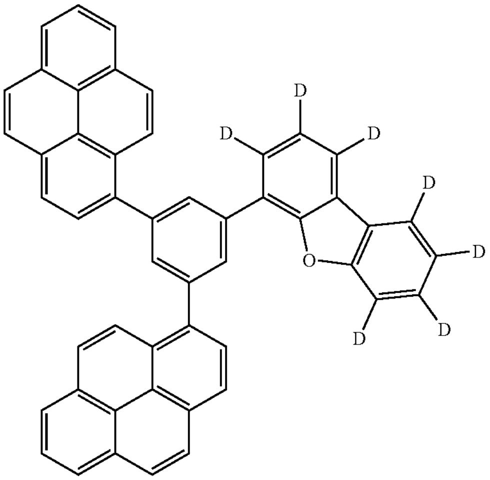

-continued
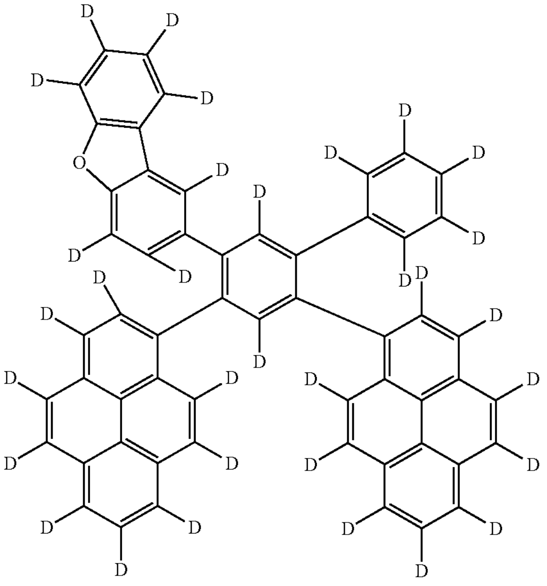
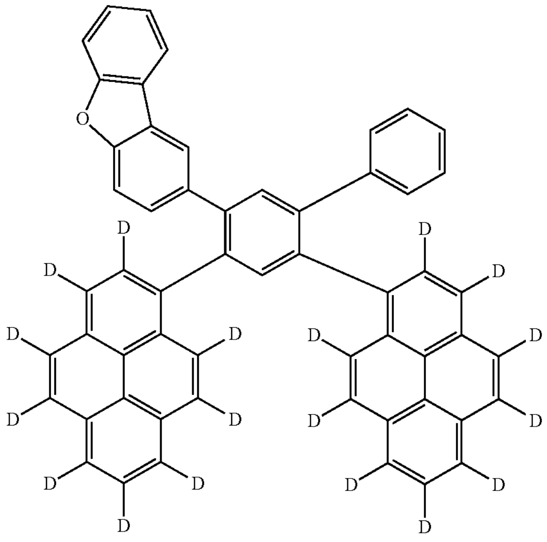
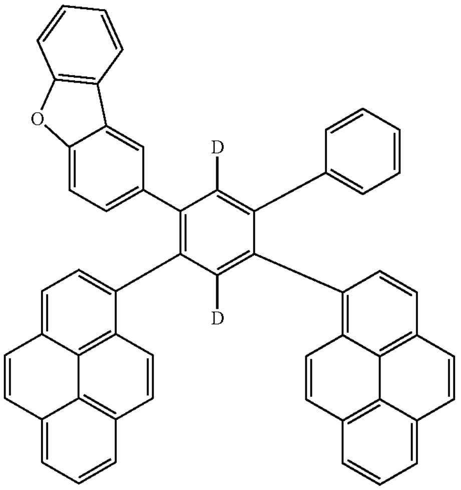
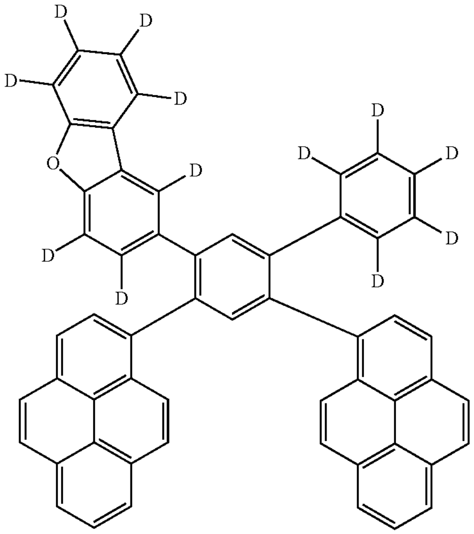

-continued
[Formula 127]
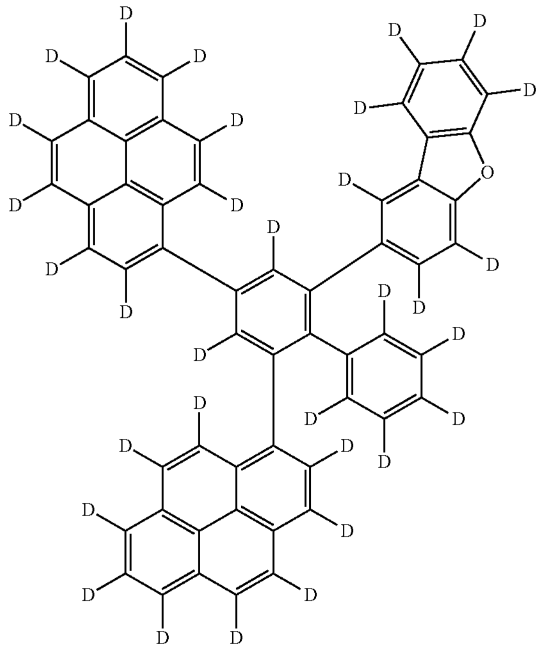
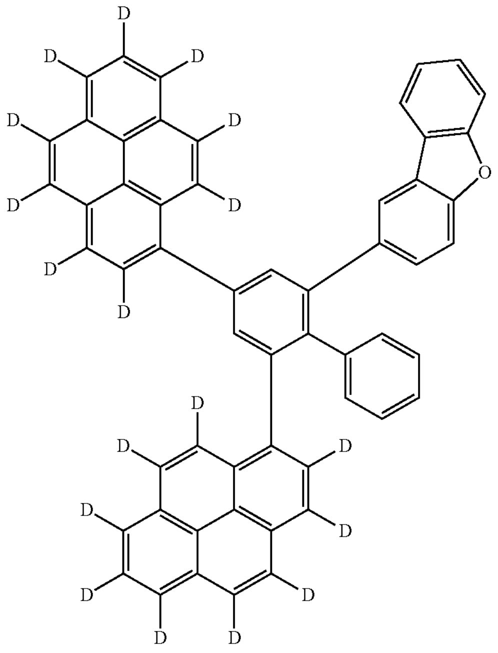
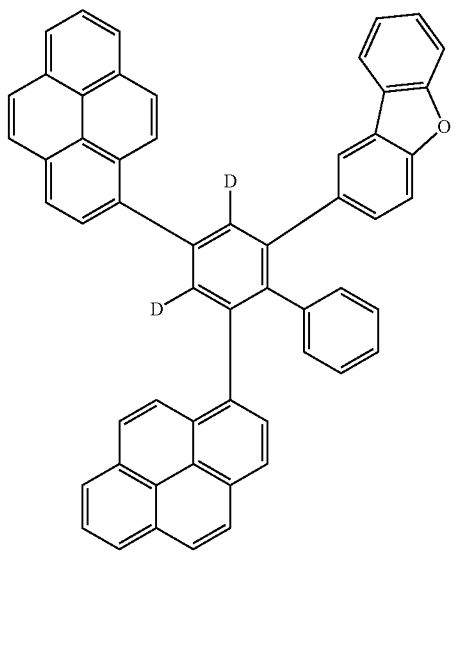
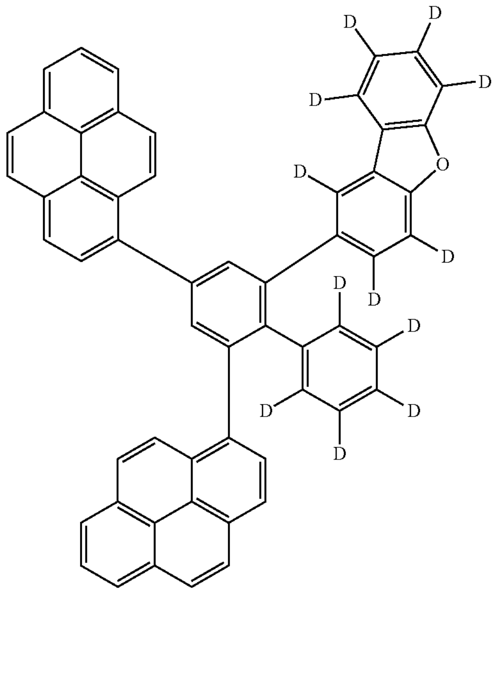

-continued
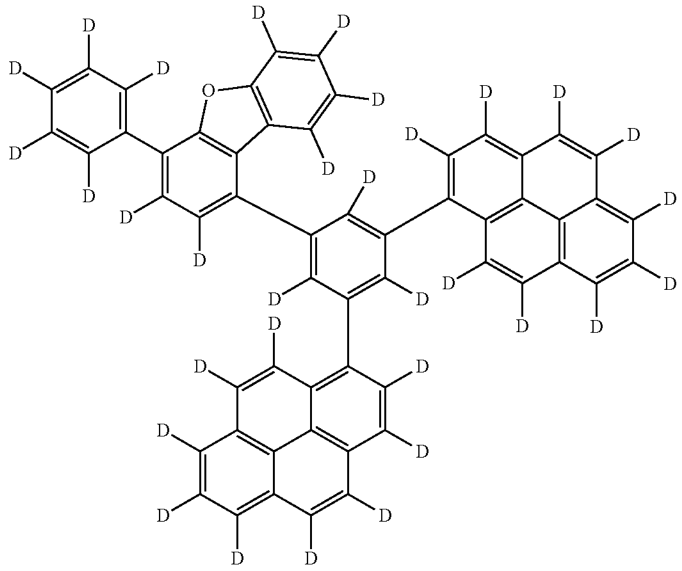
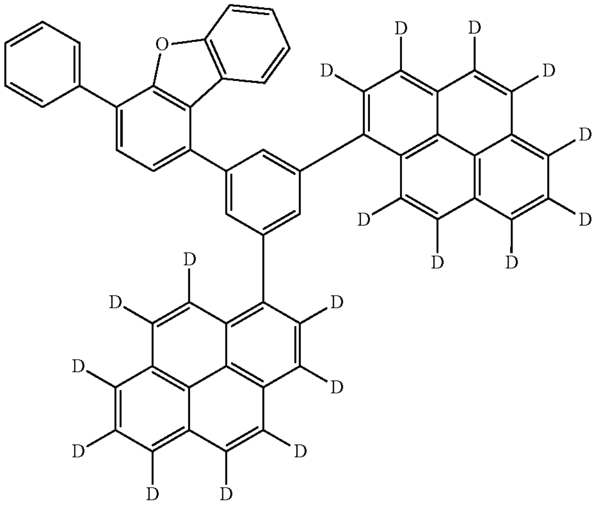
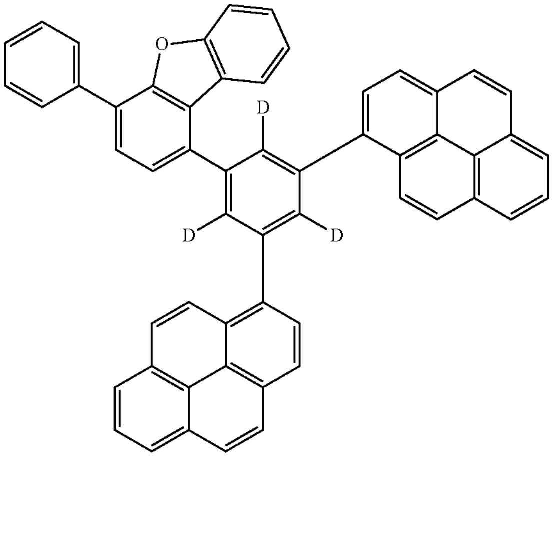

-continued
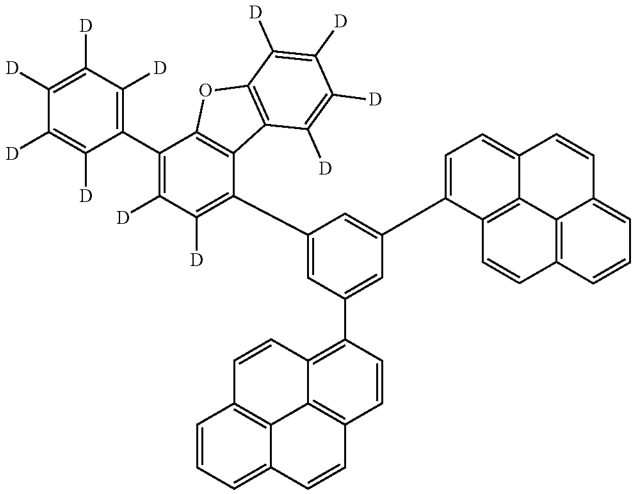
[Formula 128]
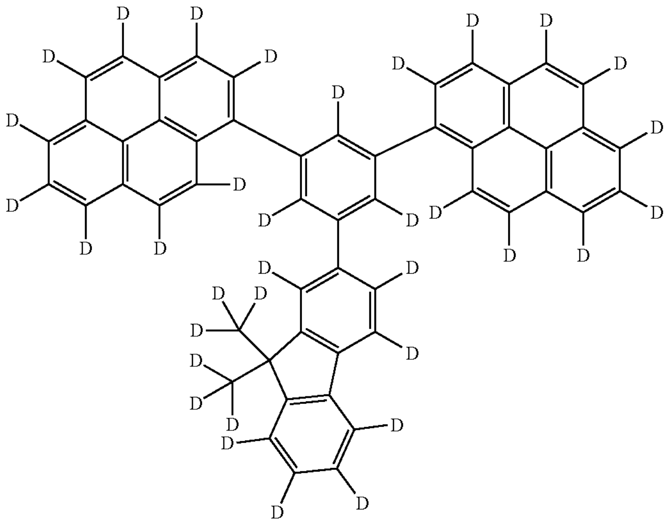
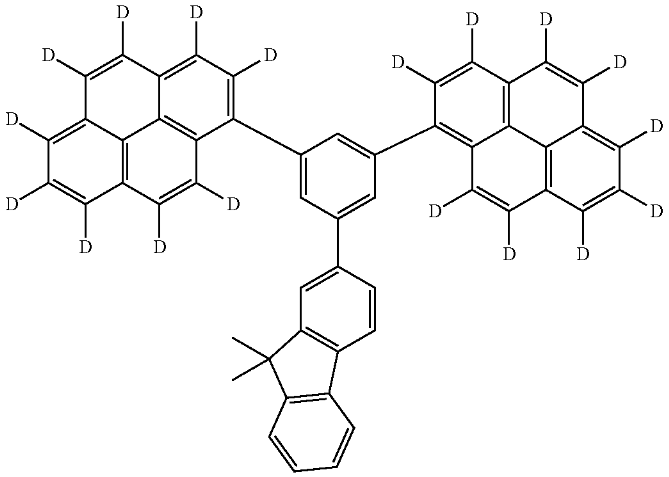

-continued
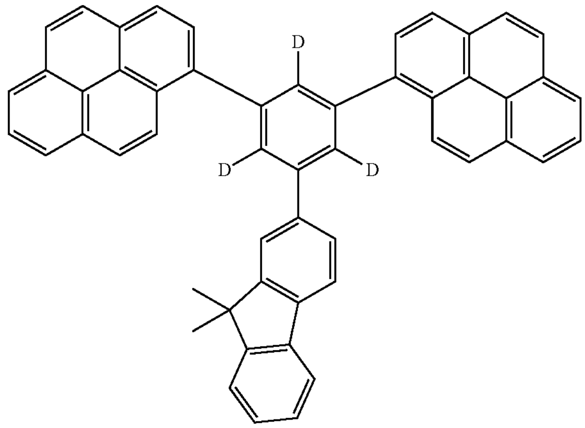
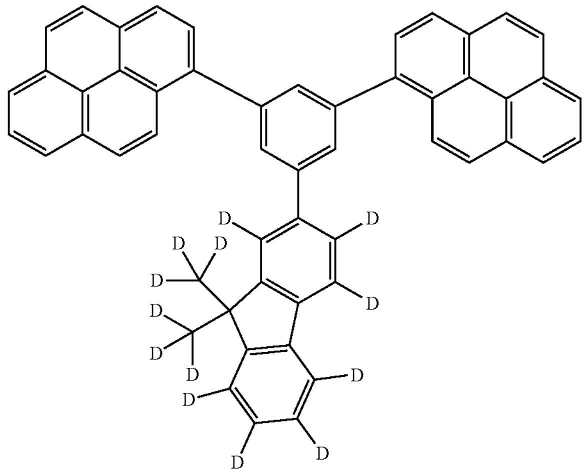
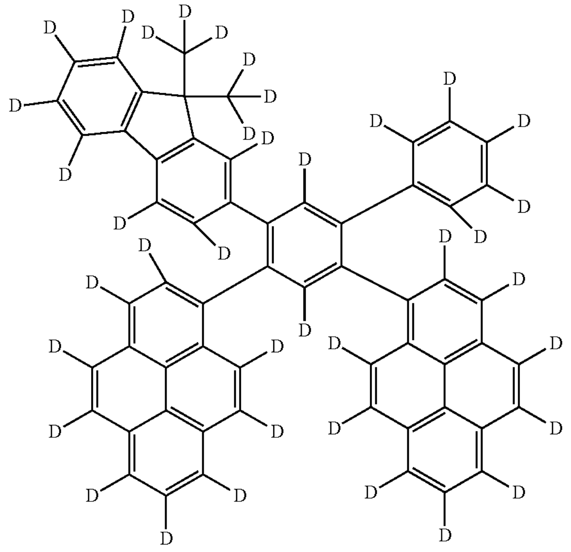
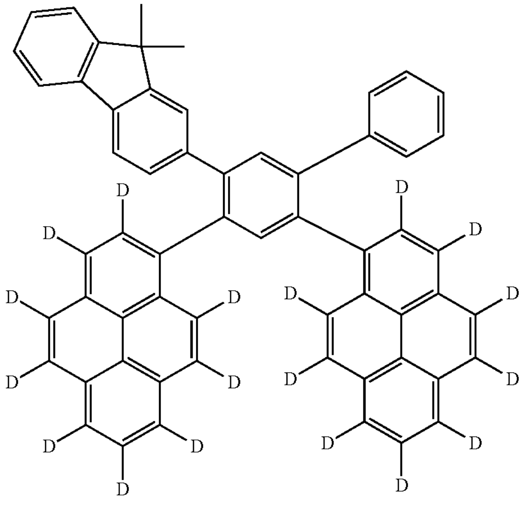

-continued
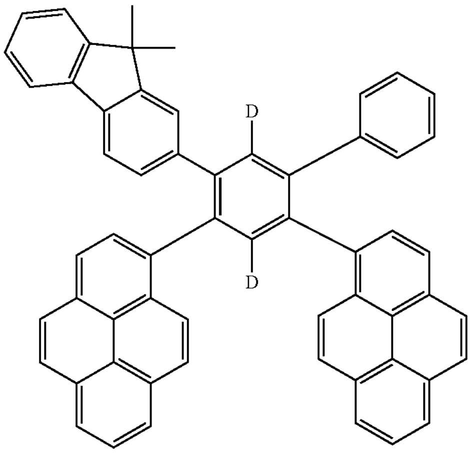
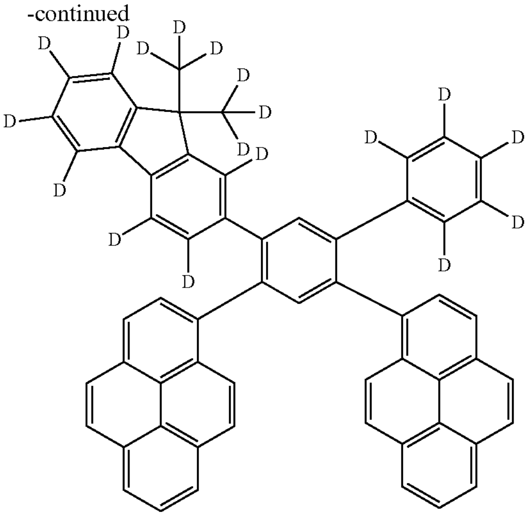
[Formula 129]
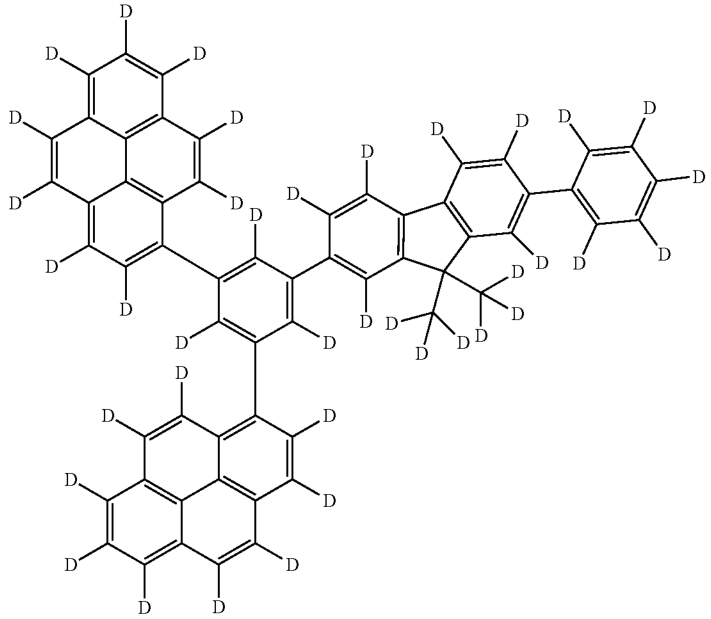

-continued
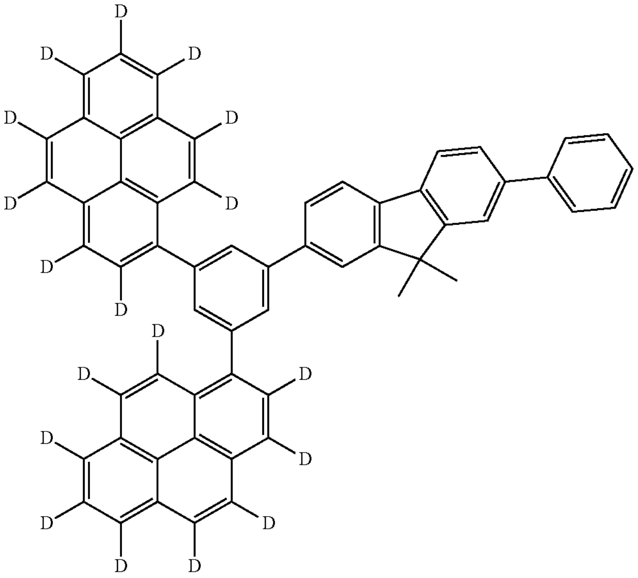
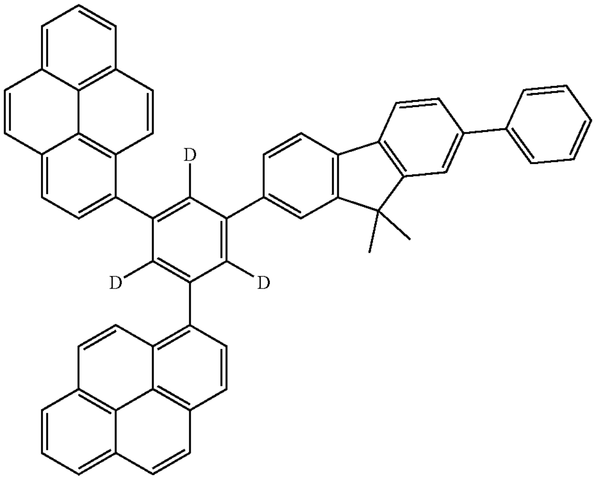
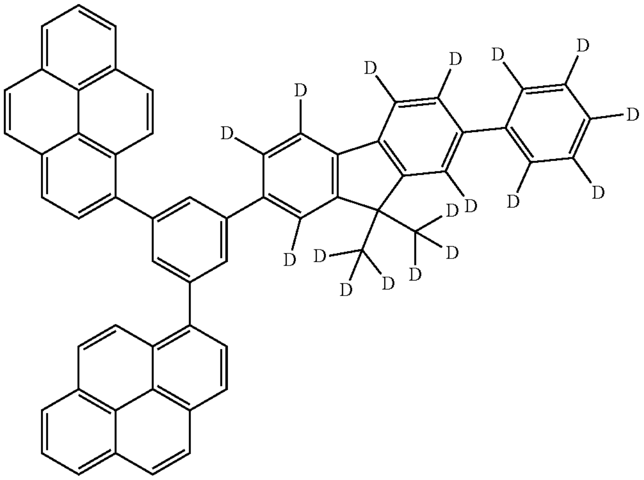

-continued
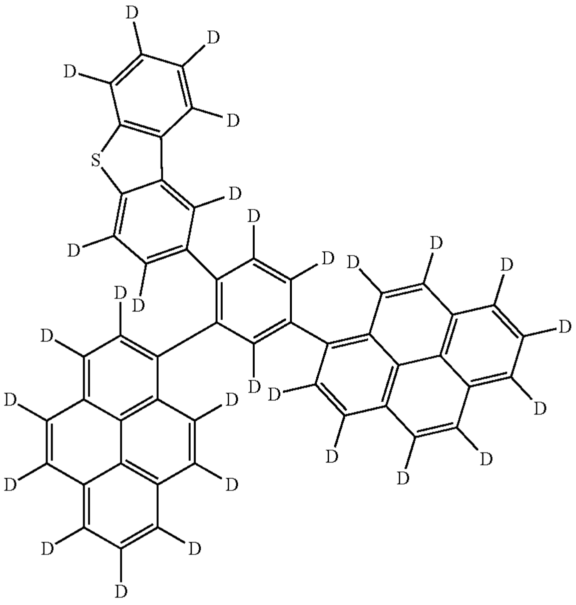
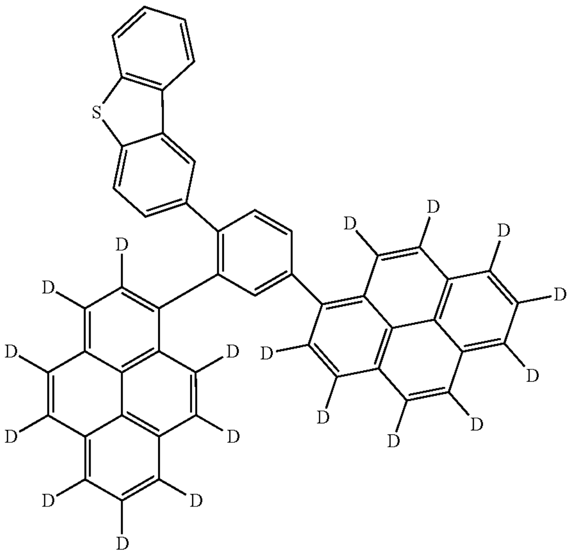
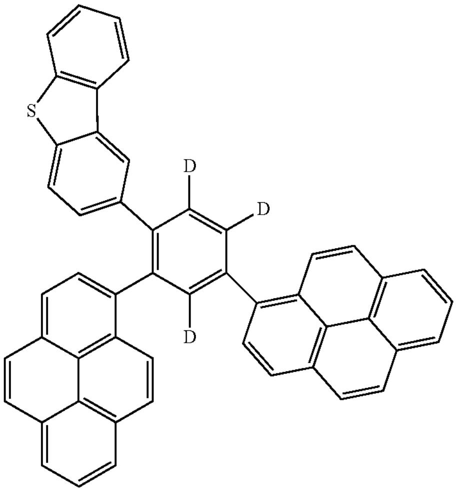
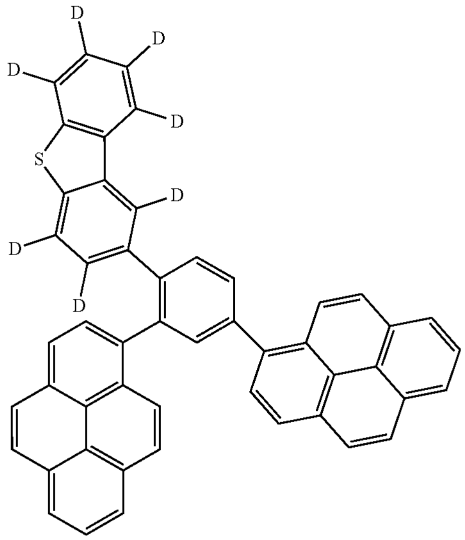

-continued
[Formula 130]
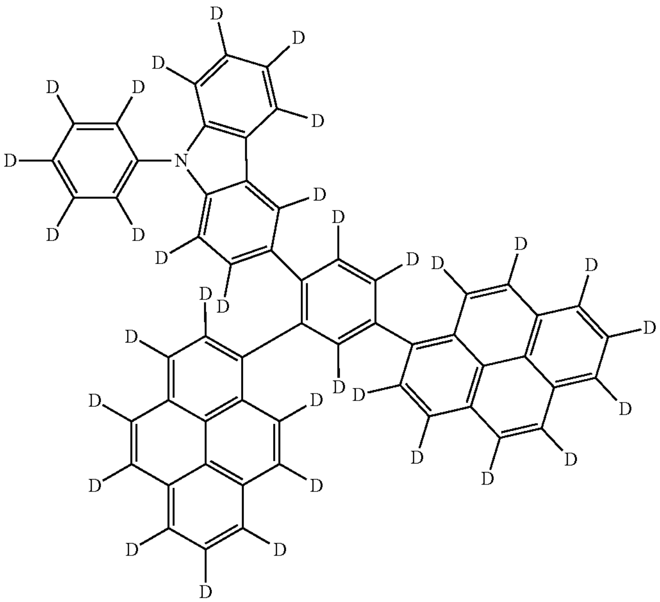
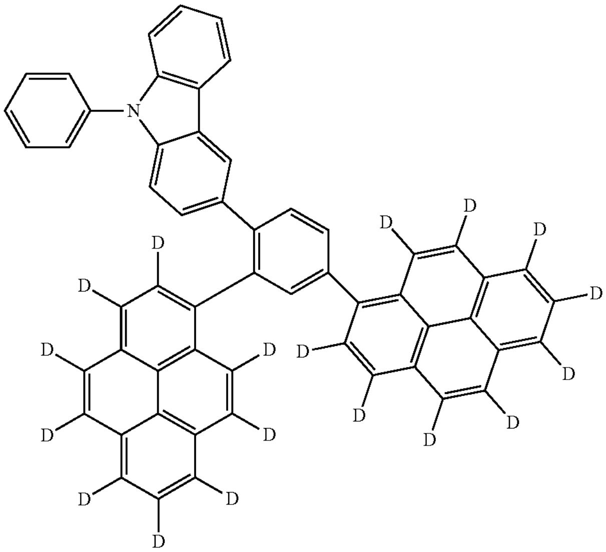
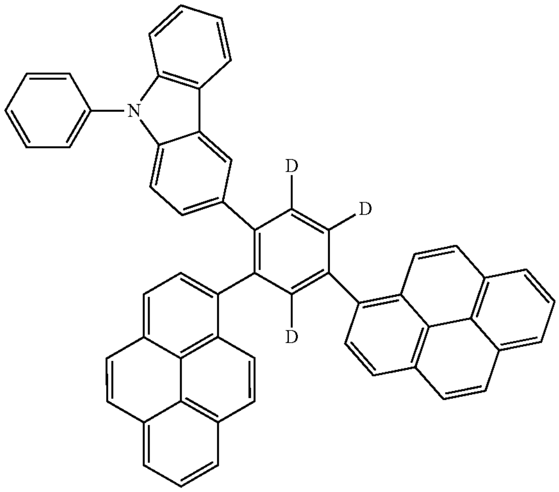
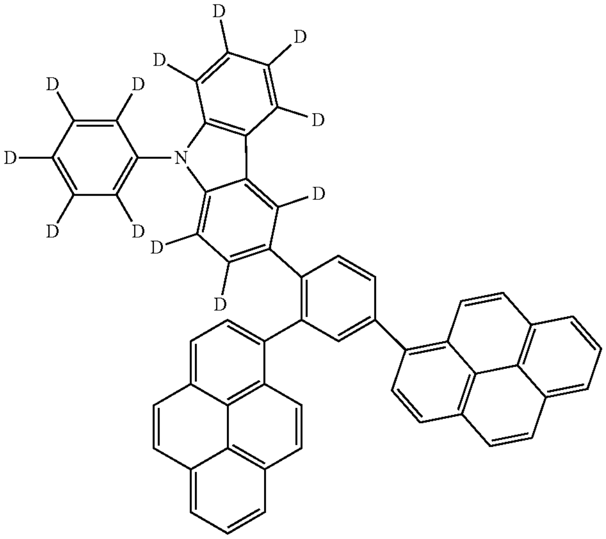

-continued
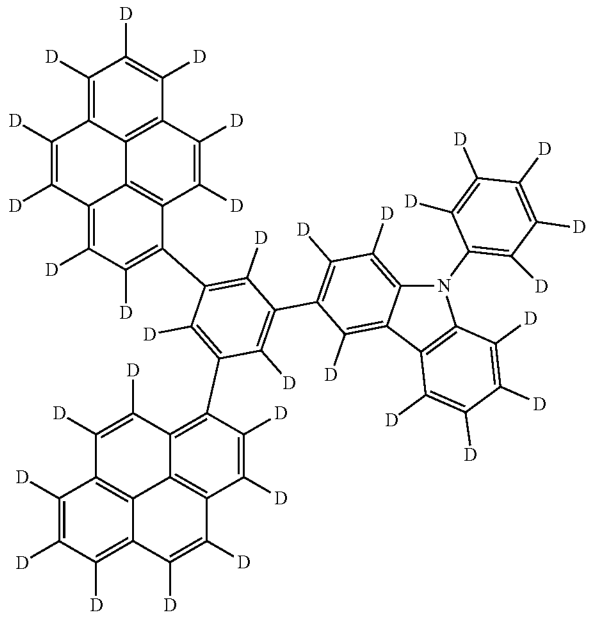
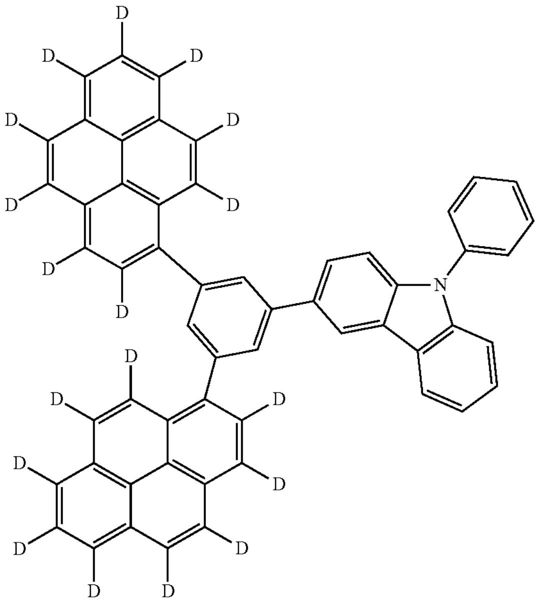
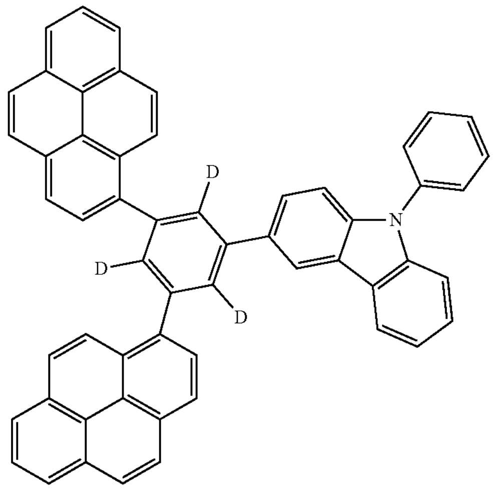
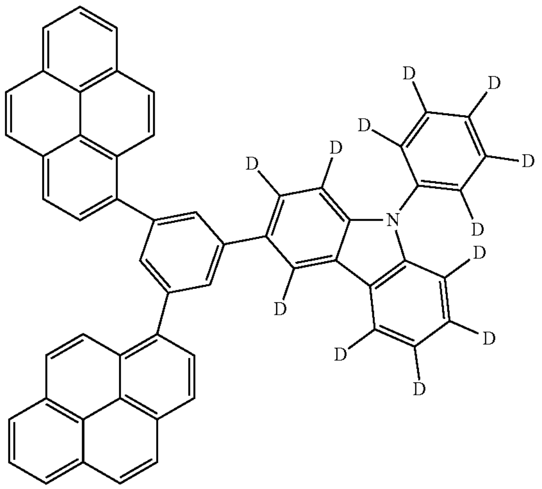

-continued
[Formula 131]
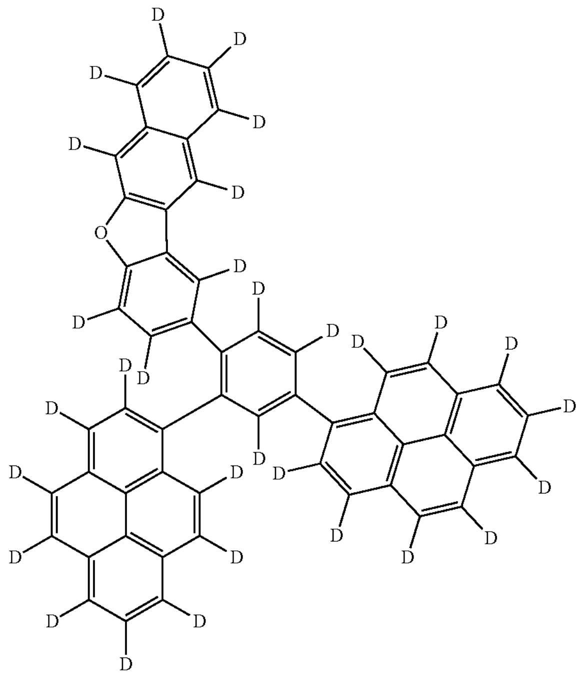
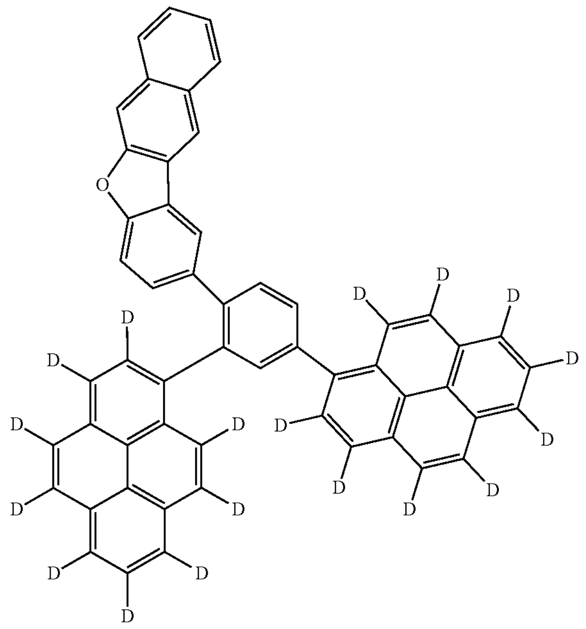
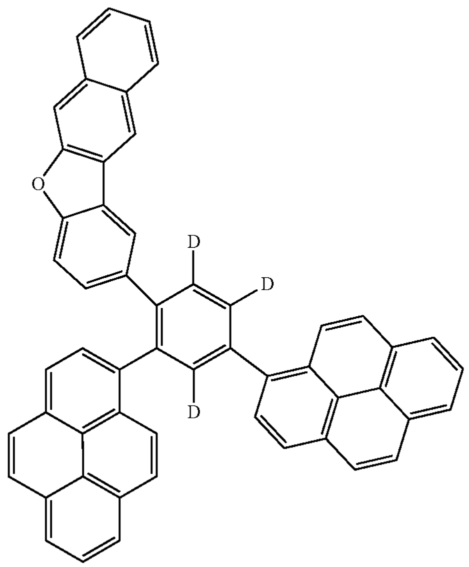
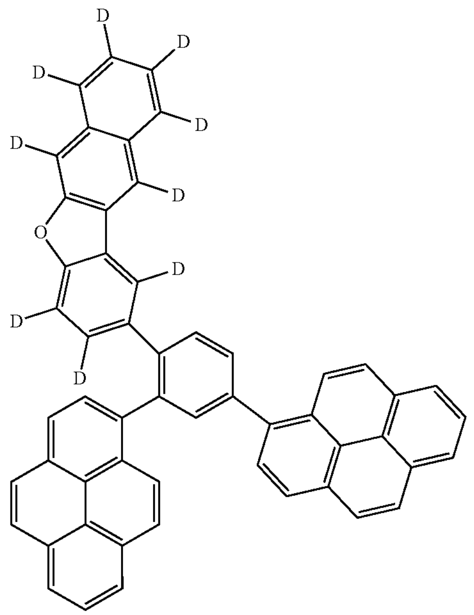

-continued
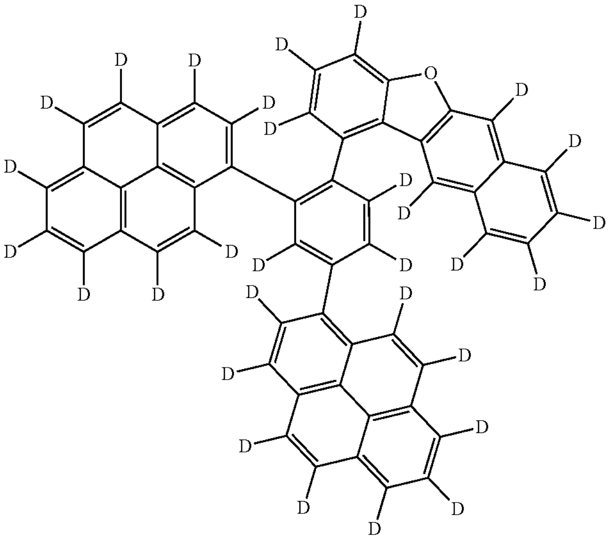
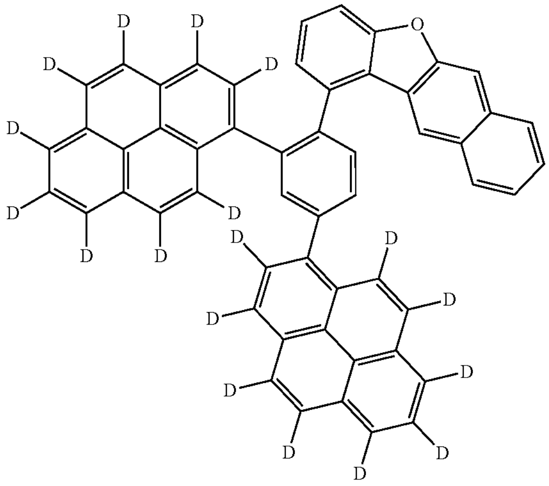
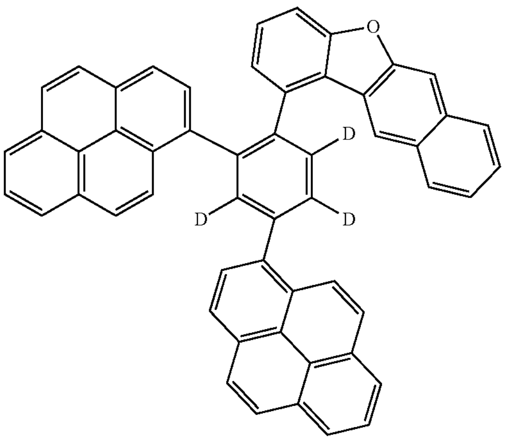
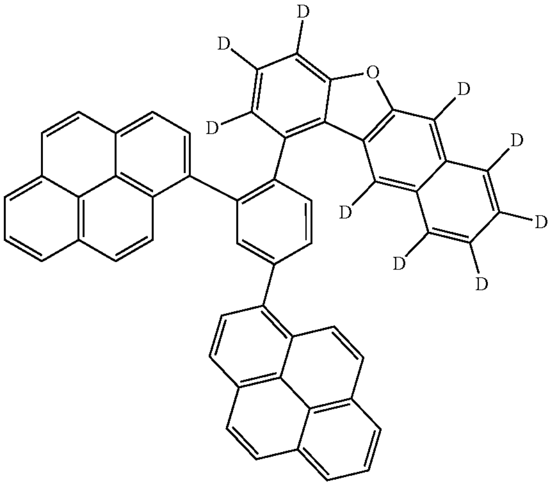
[Formula 132]
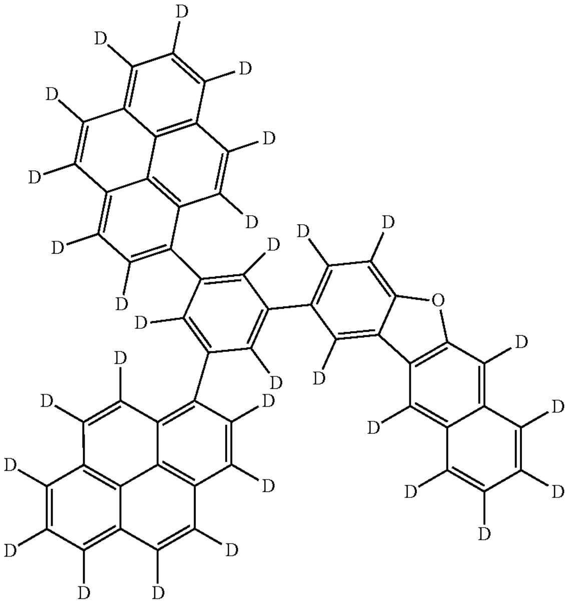
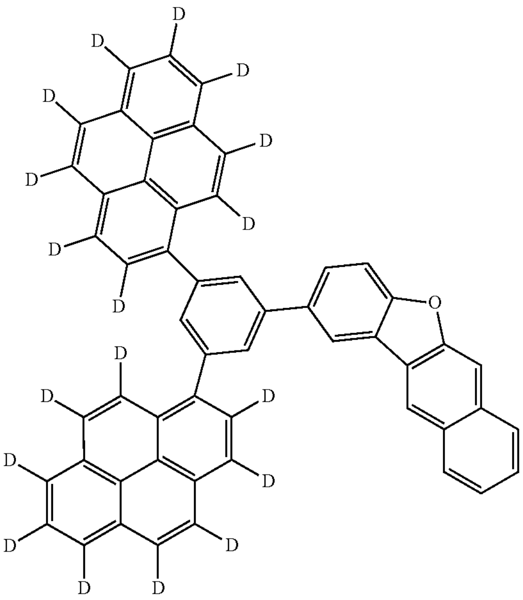

-continued
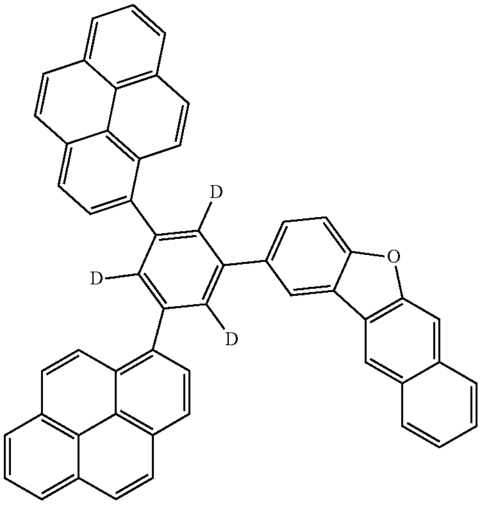
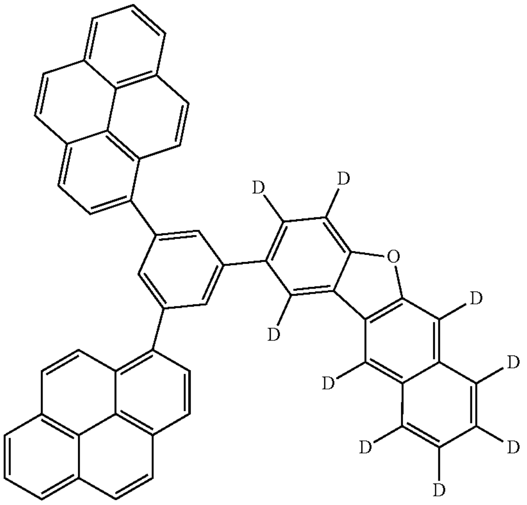
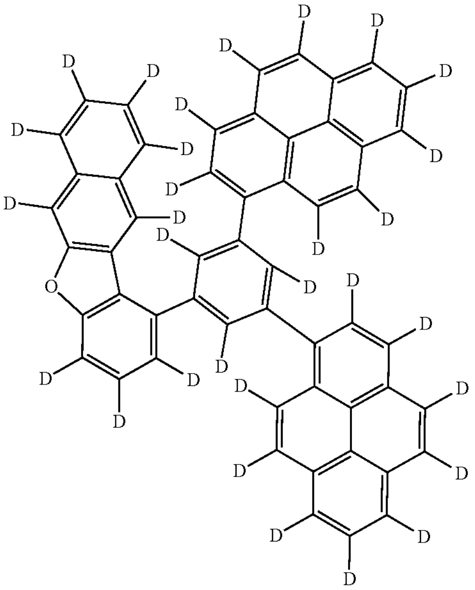
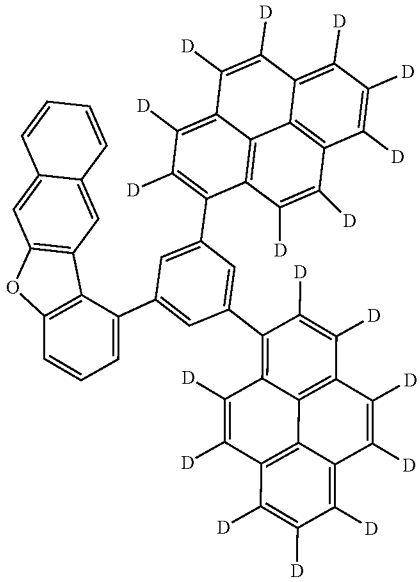
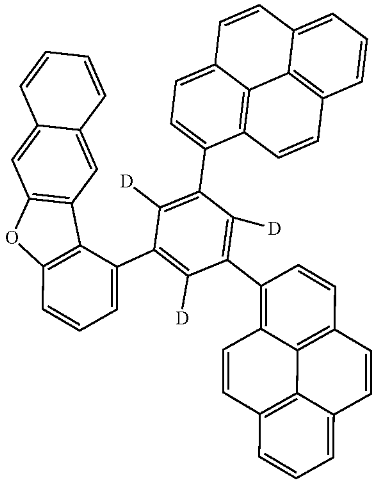
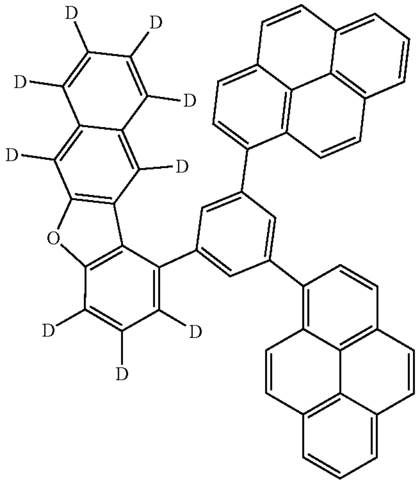

-continued
[Formula 133]
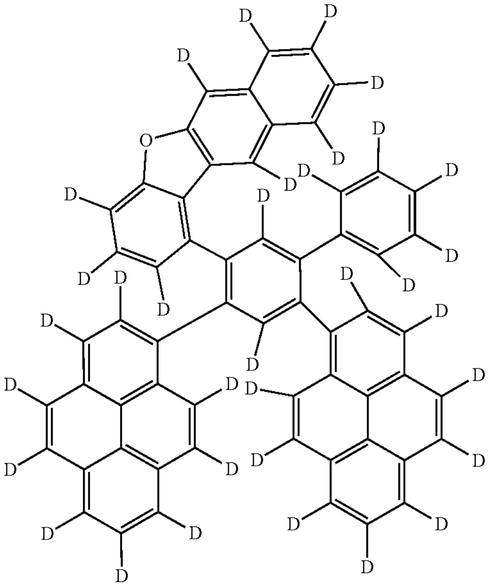
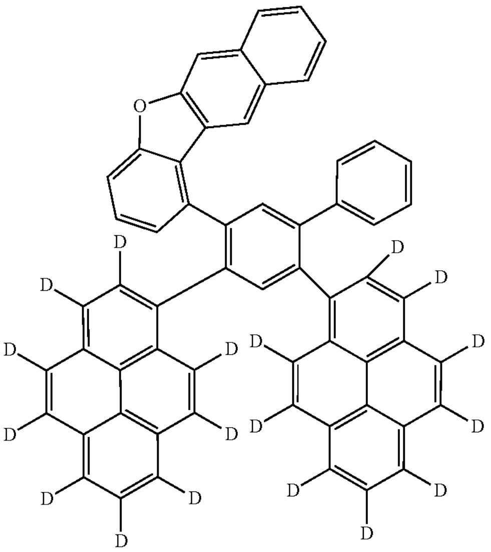
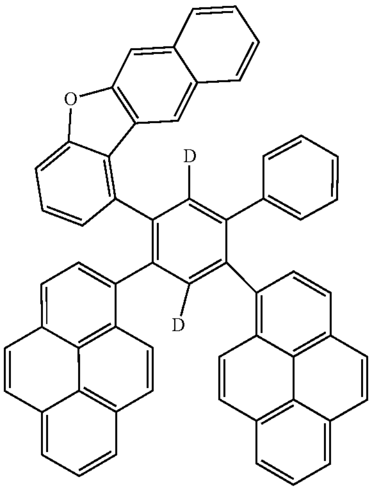
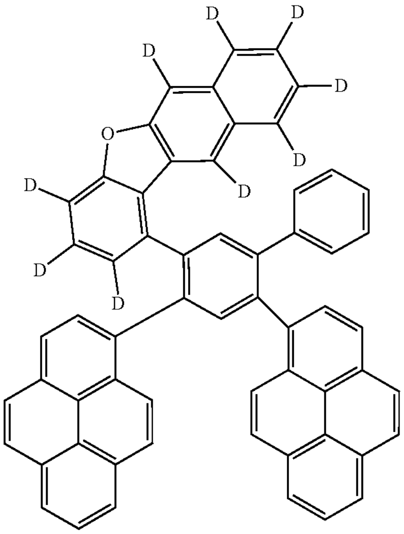

-continued
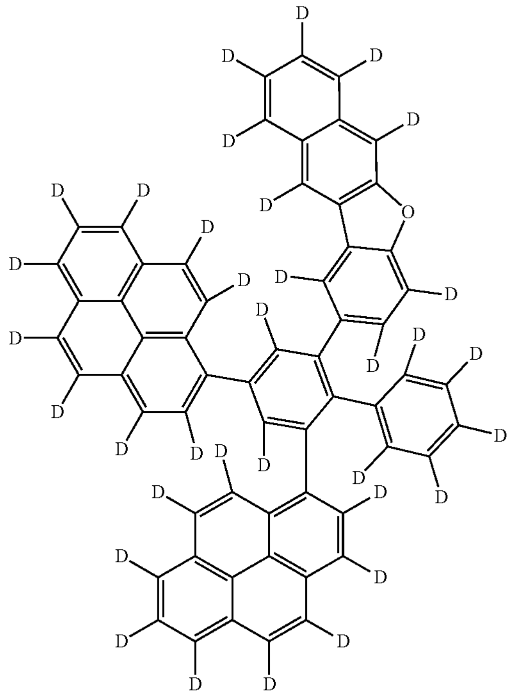
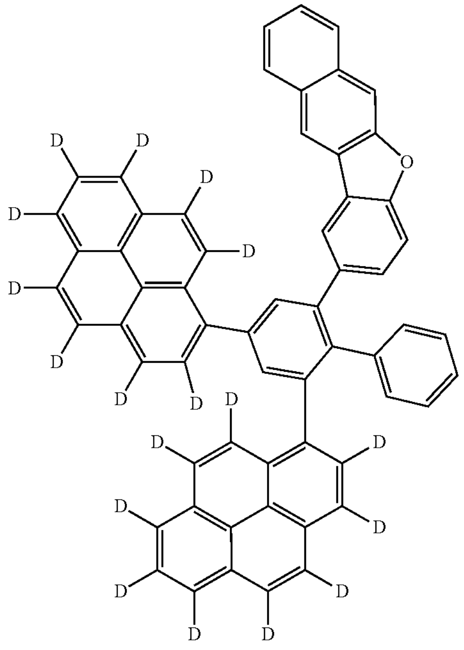
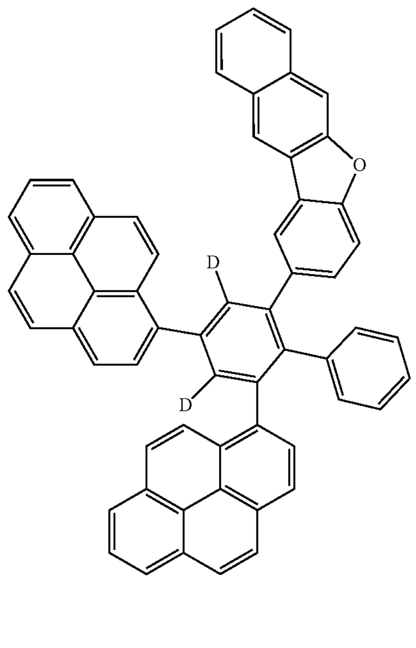
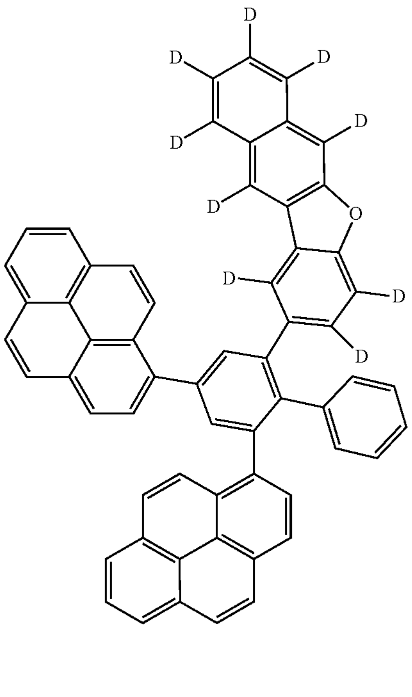

-continued
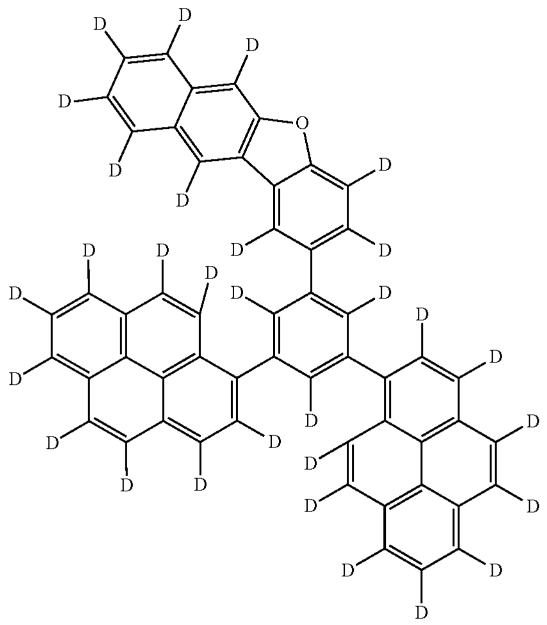
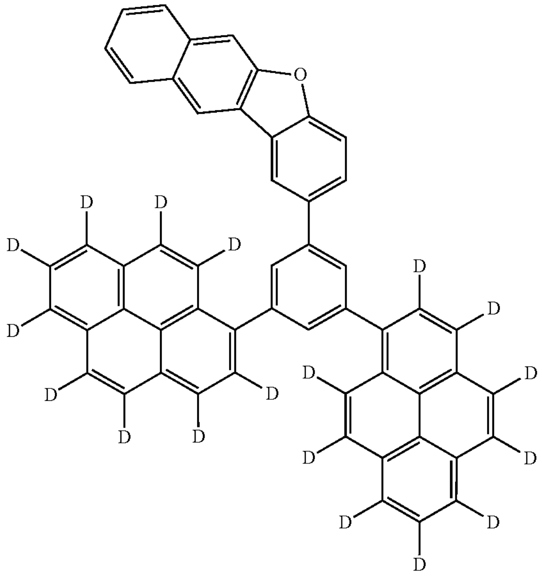
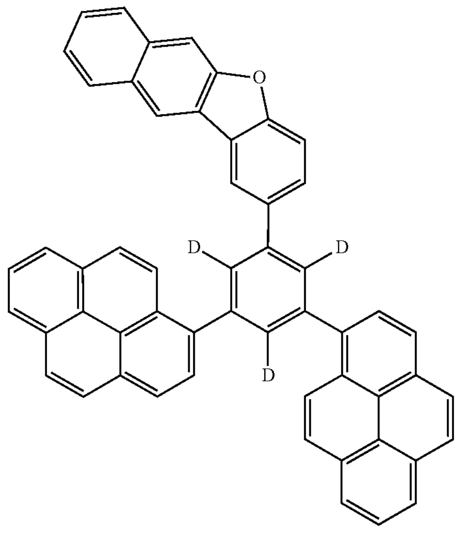
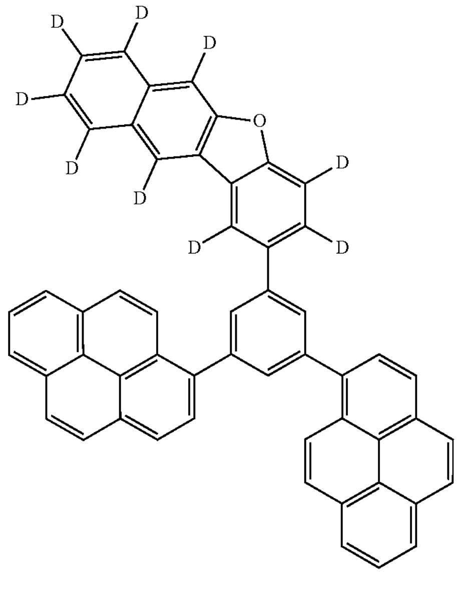

-continued
[Formula 134]
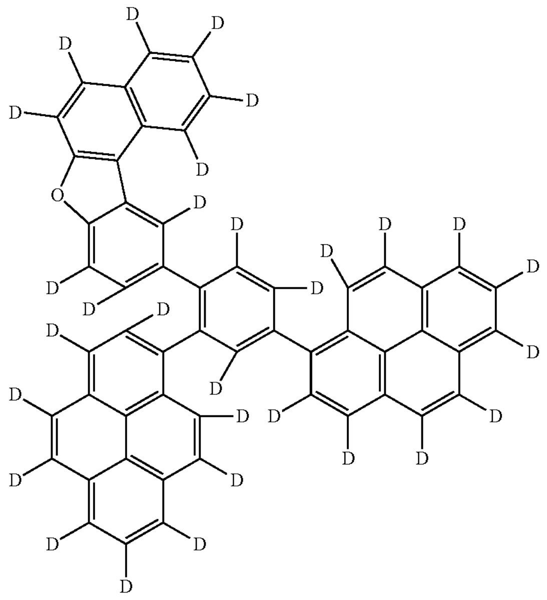
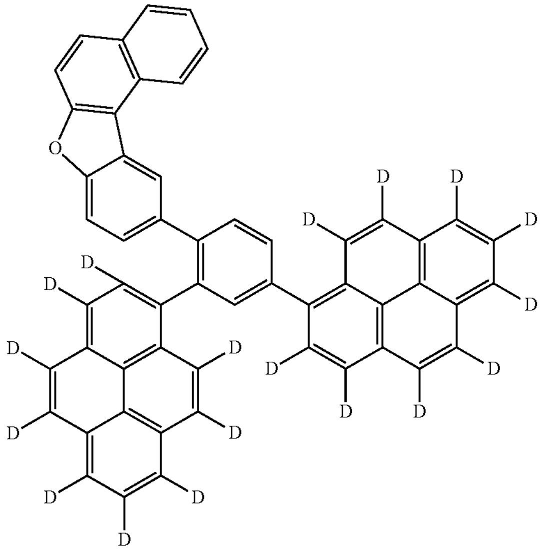
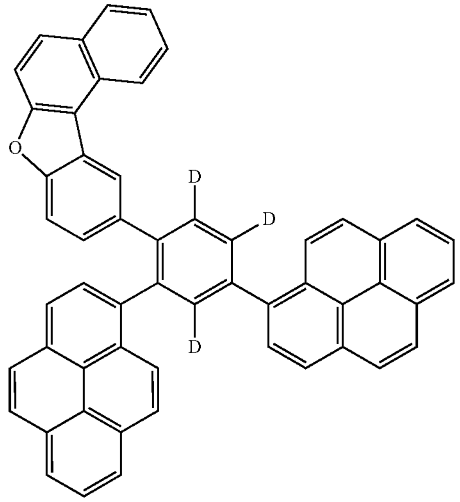
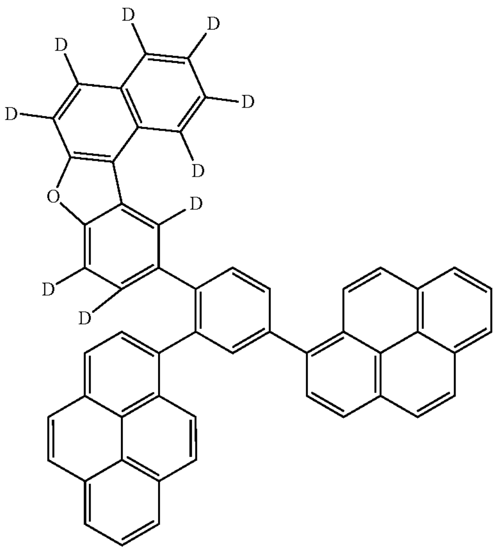

-continued
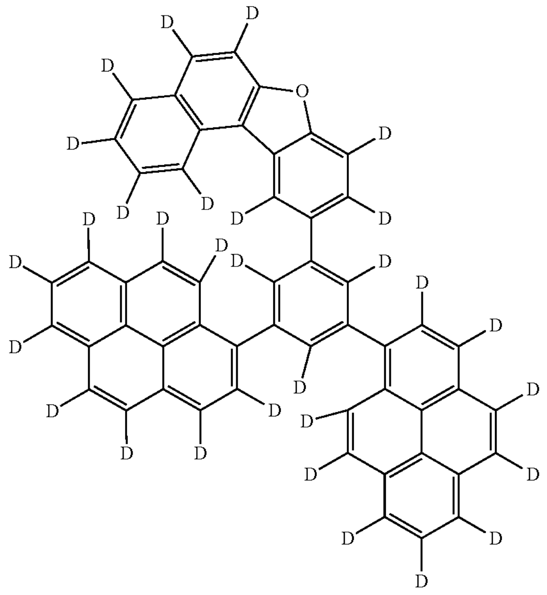
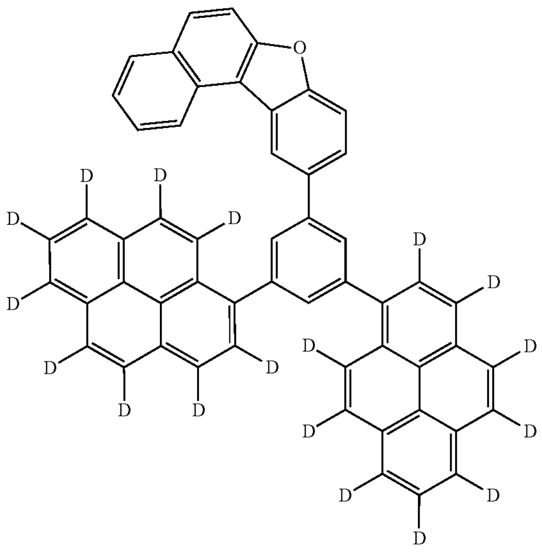
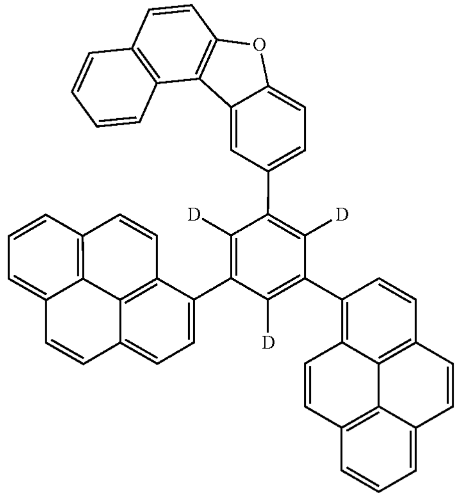
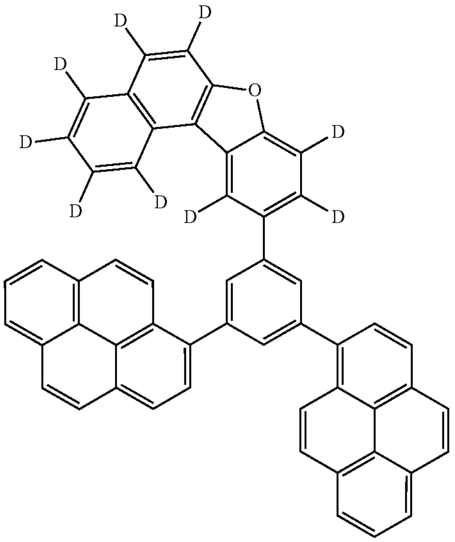

-continued
[Formula 135]
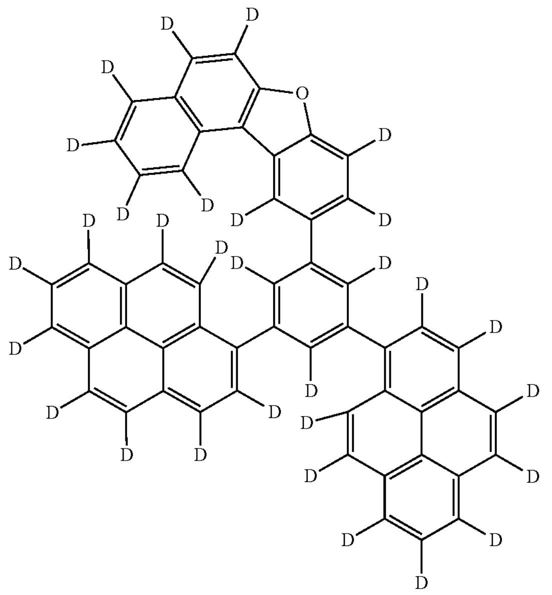
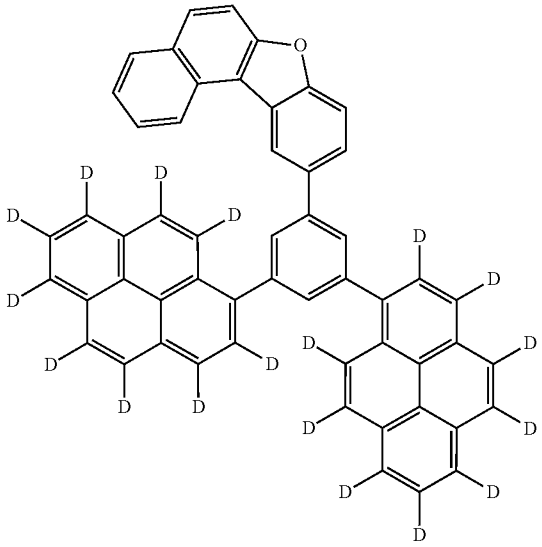
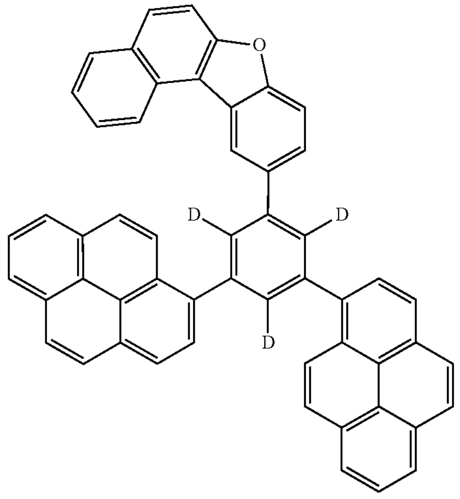
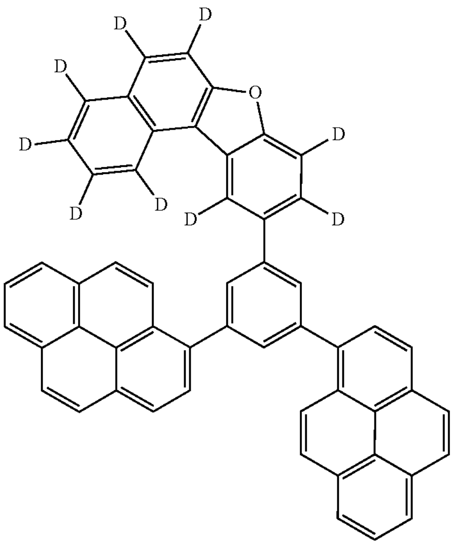

-continued
[Formula 136]
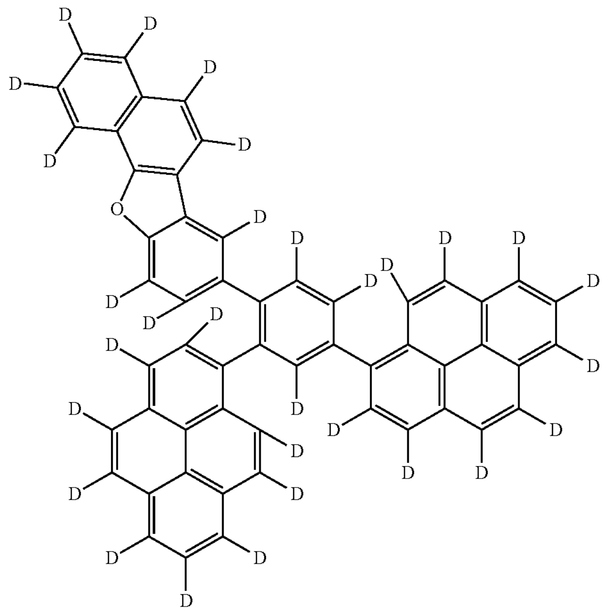
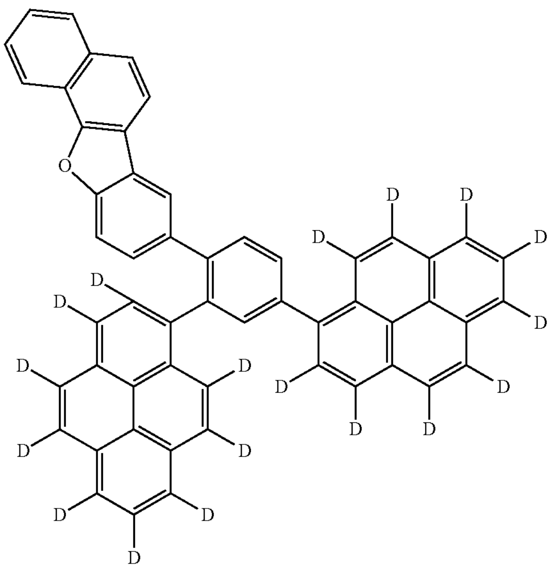
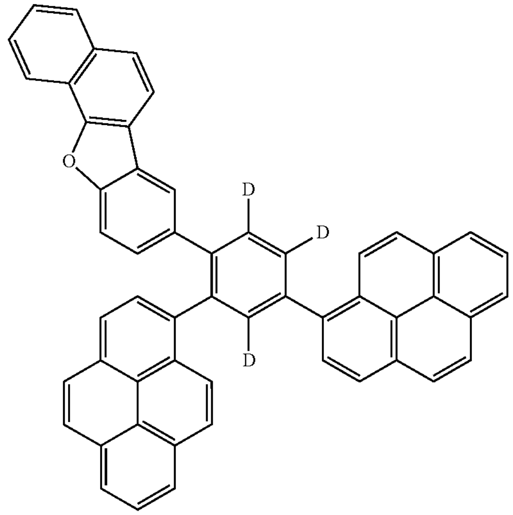
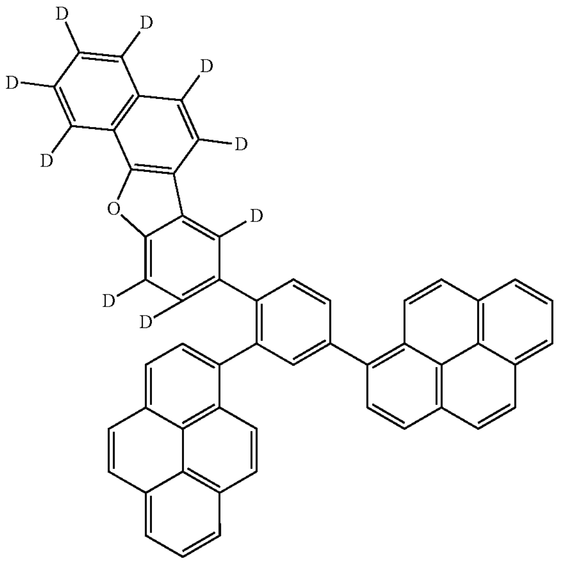

-continued
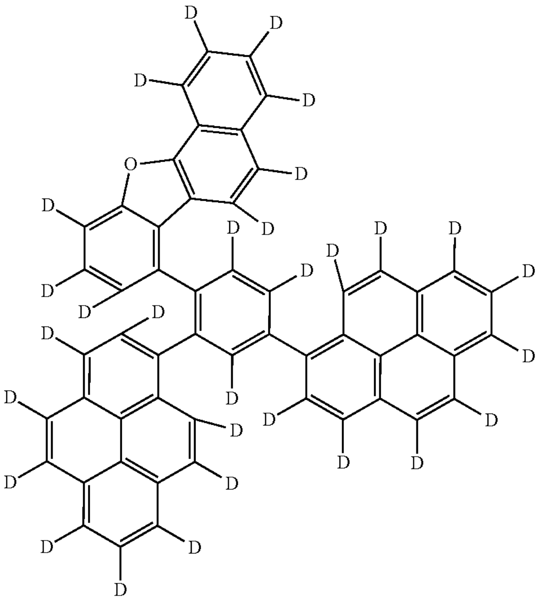
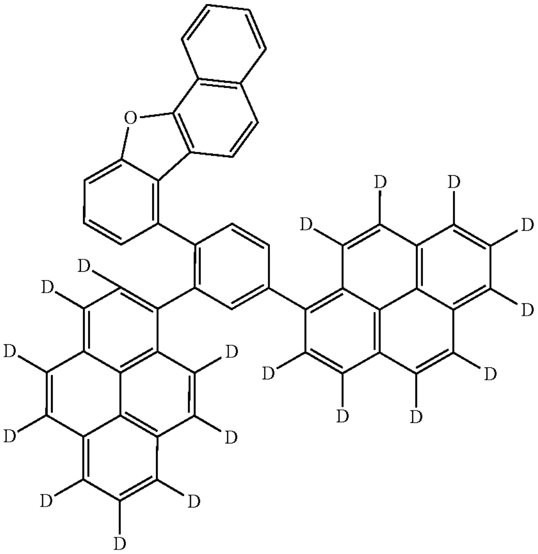
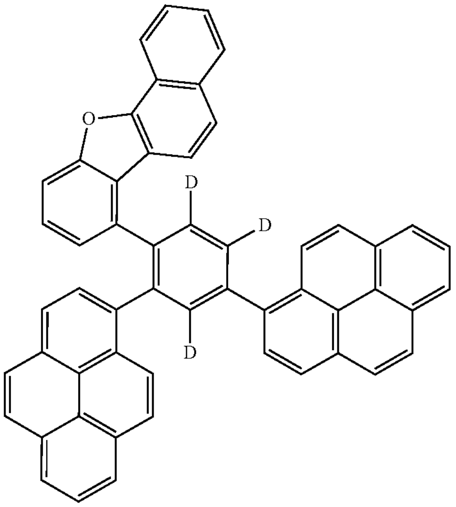
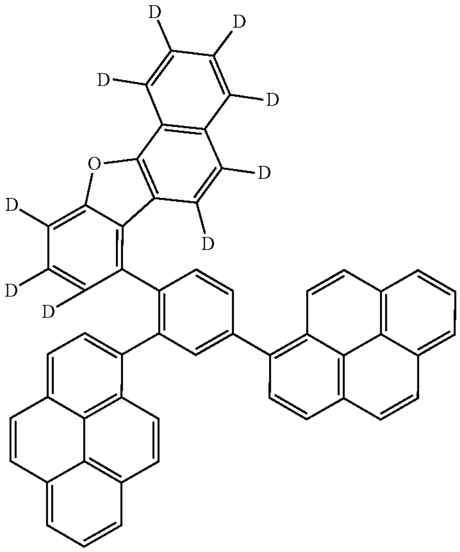

-continued
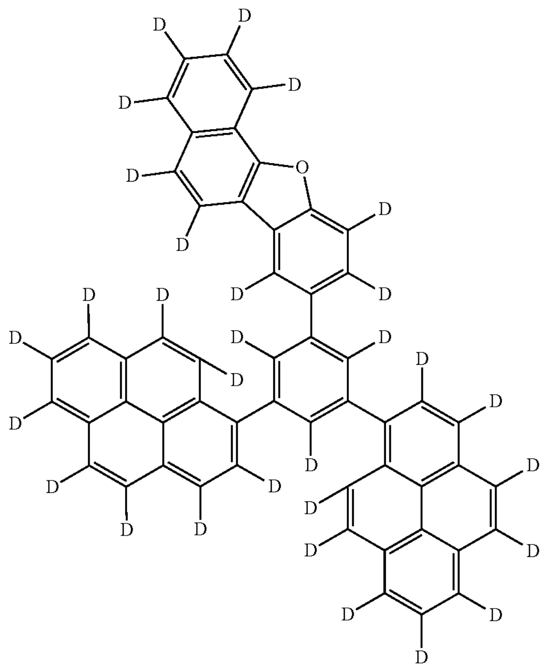
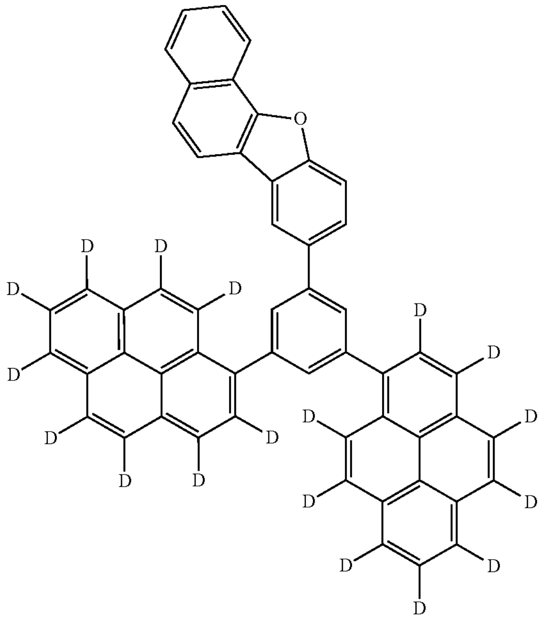
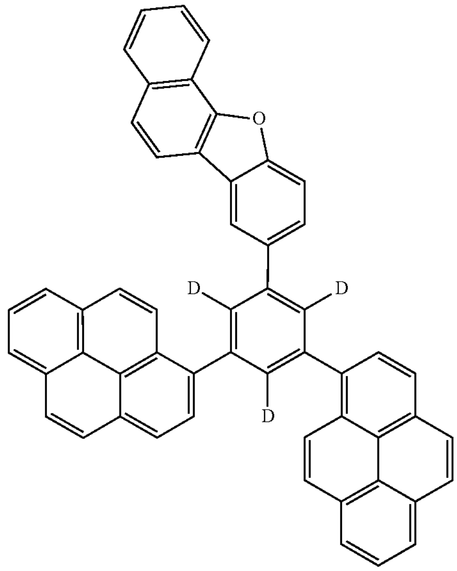
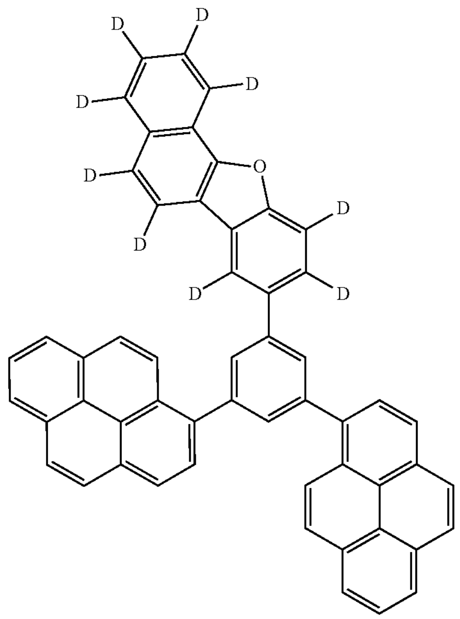

-continued
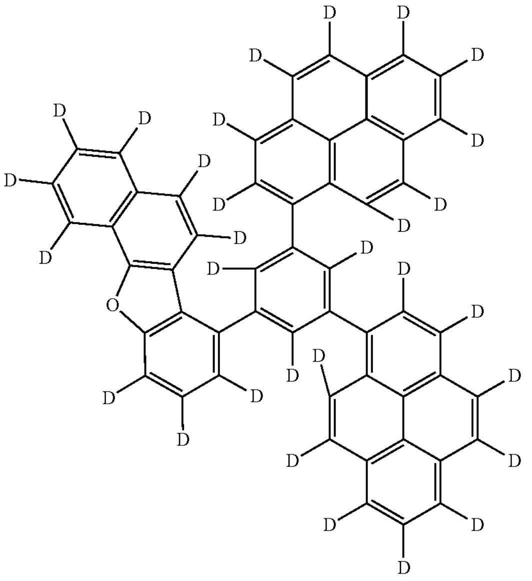
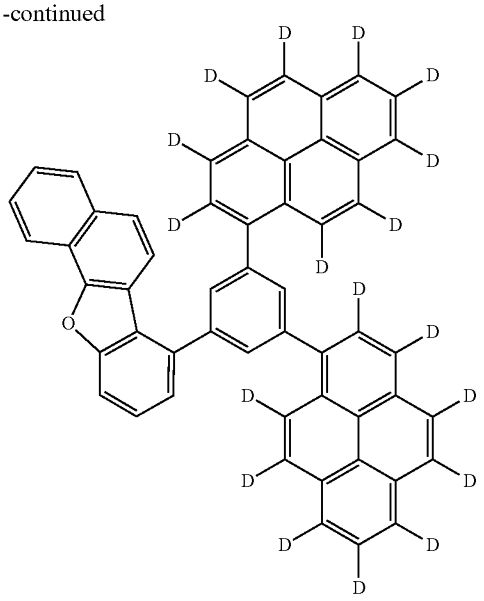
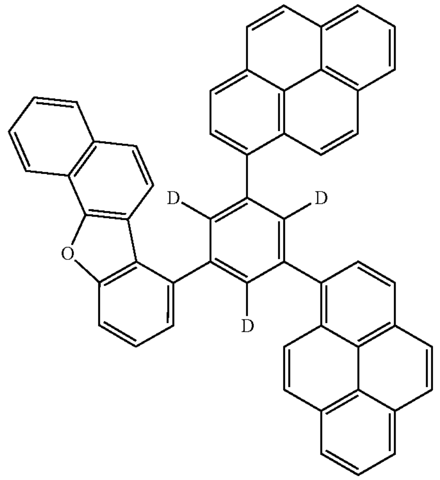
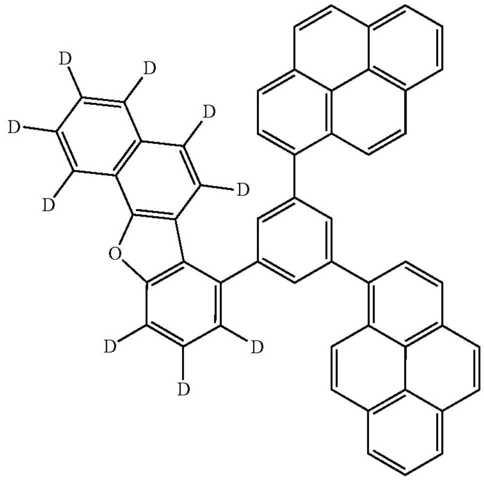
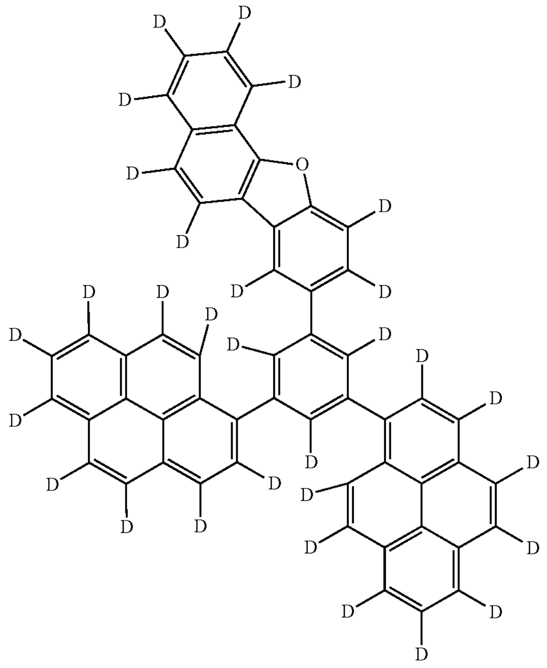
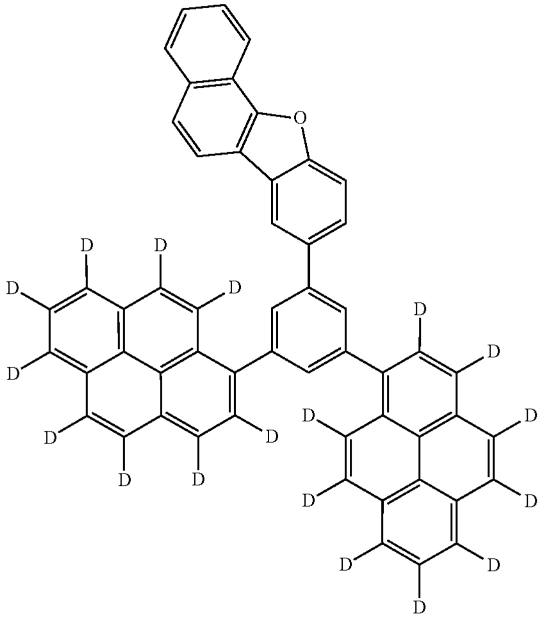

-continued
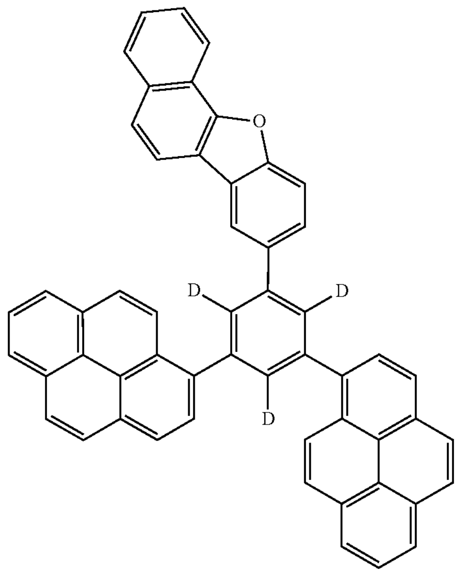
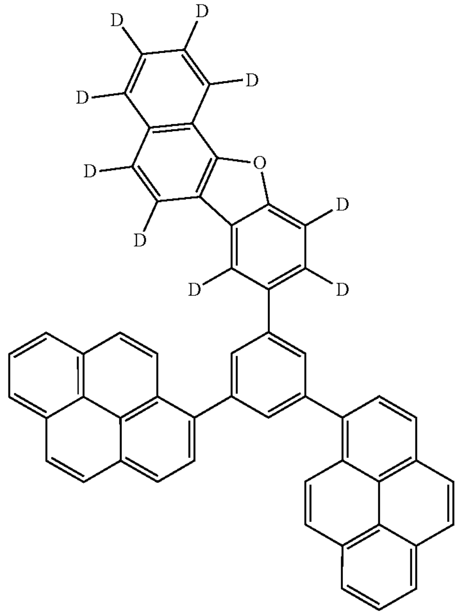
[Formula 138]
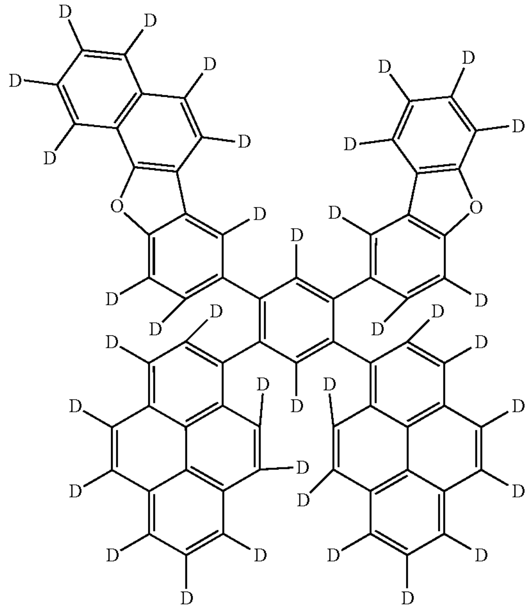
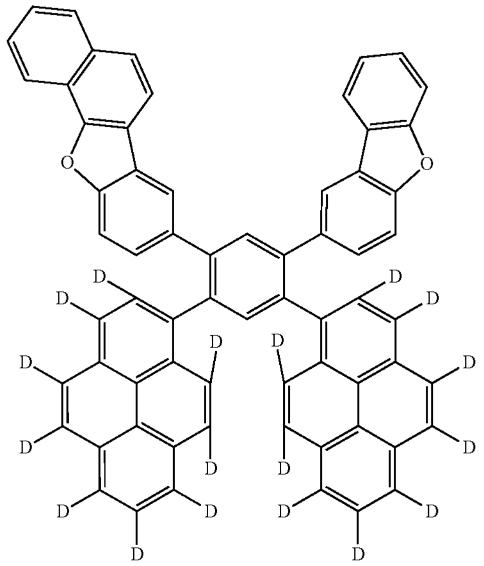

-continued
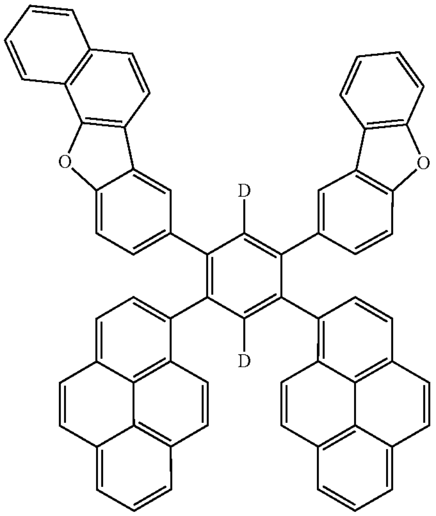
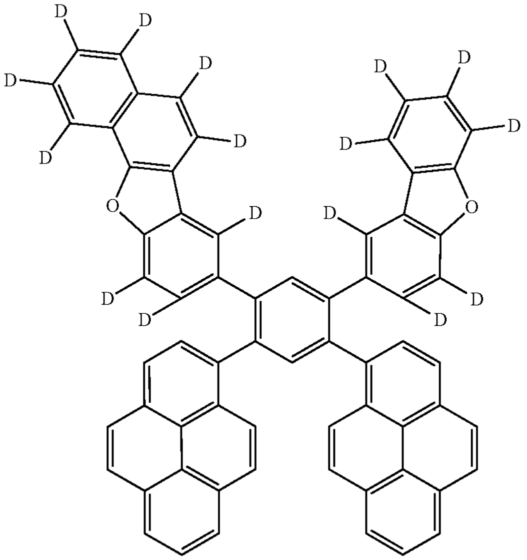
[Formula 139]
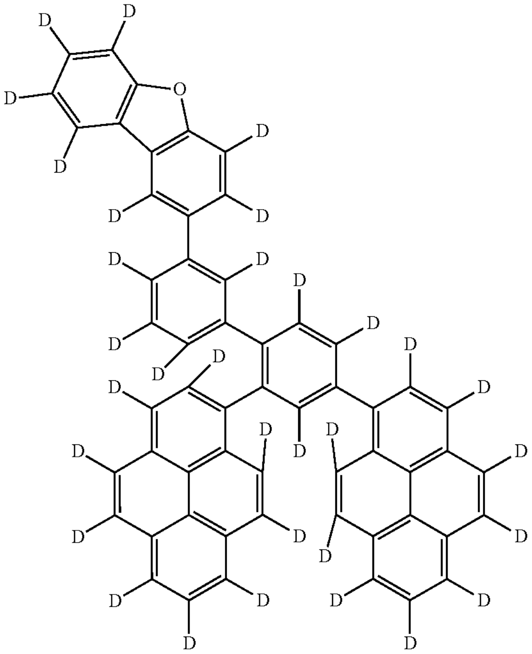
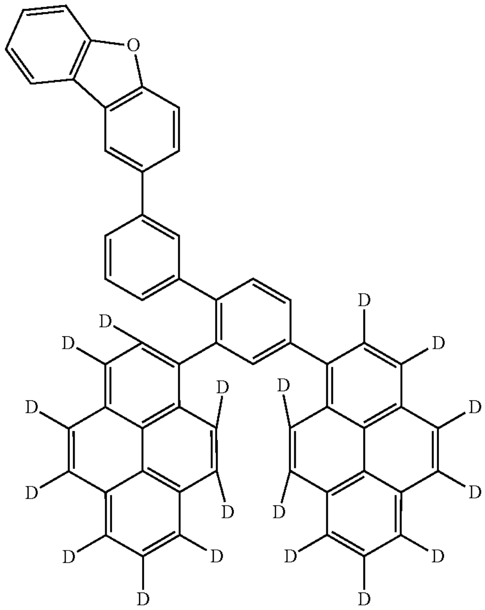

-continued
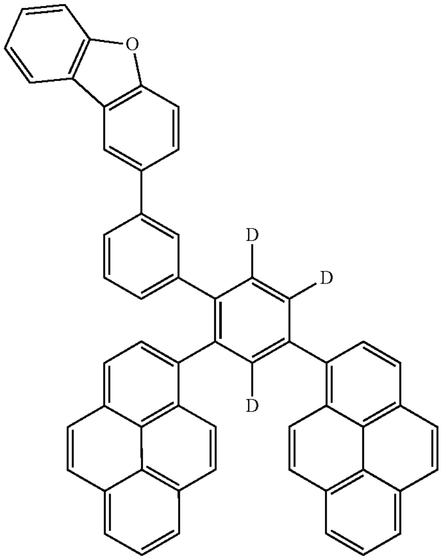
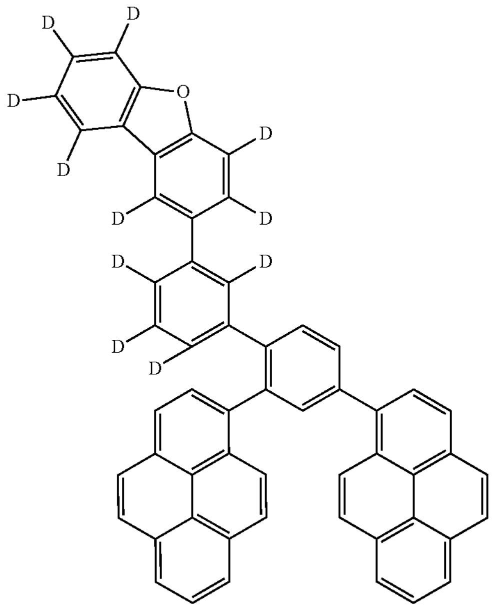
[Formula 140]
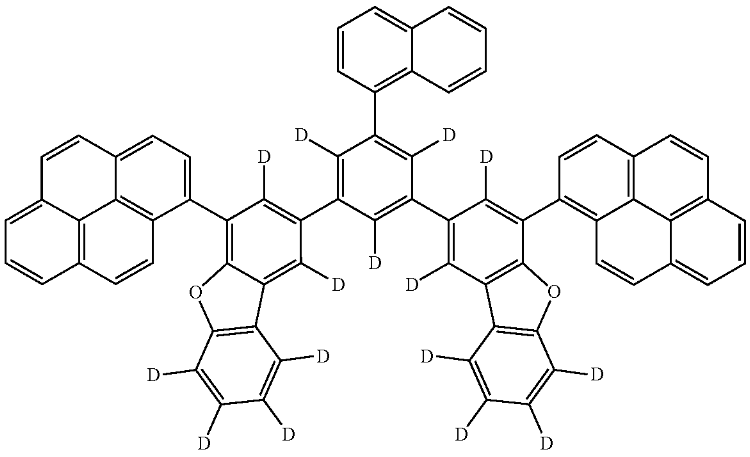
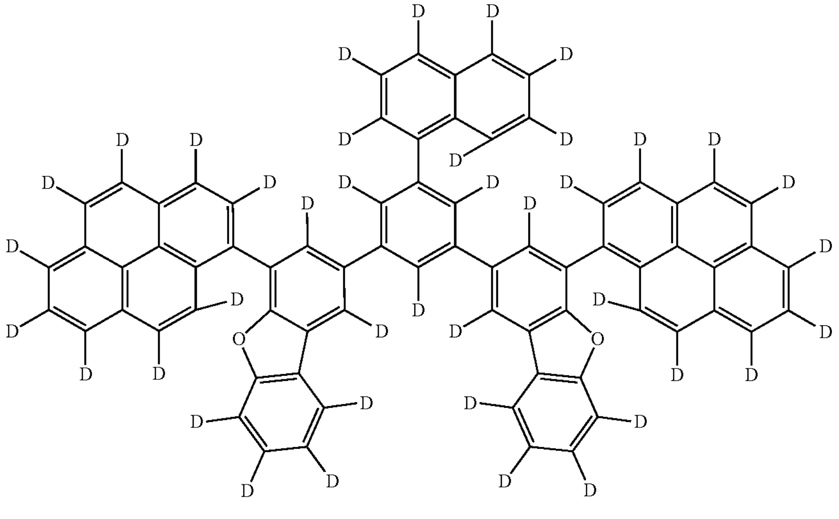

-continued
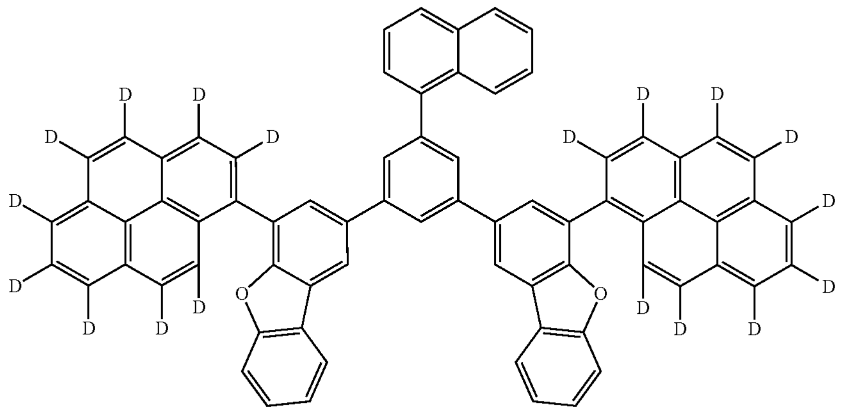
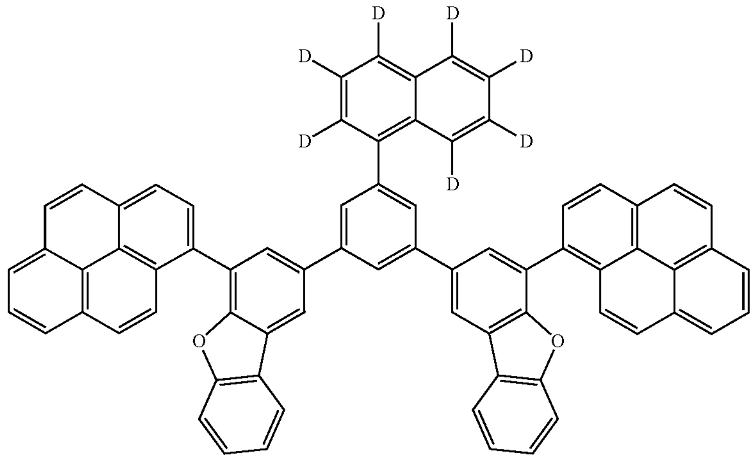
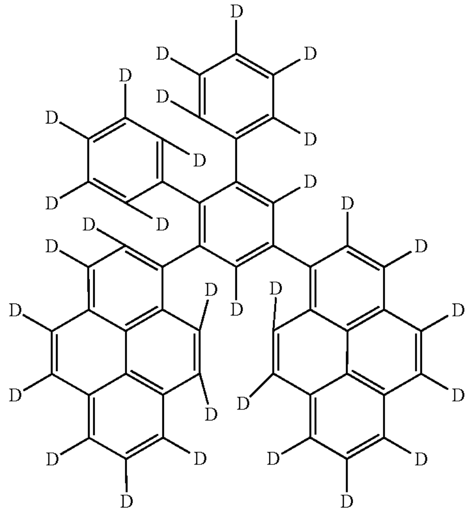
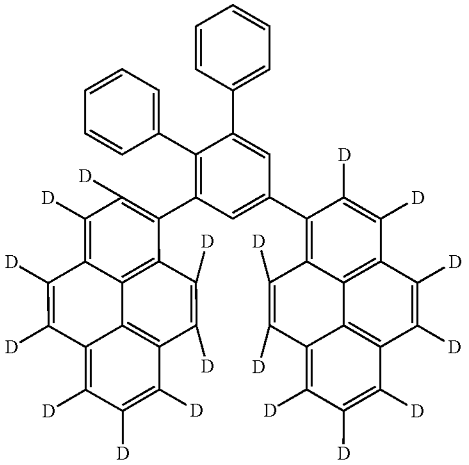

-continued
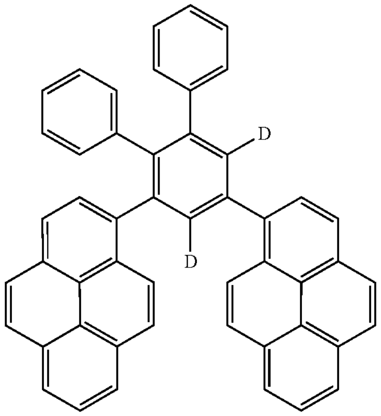
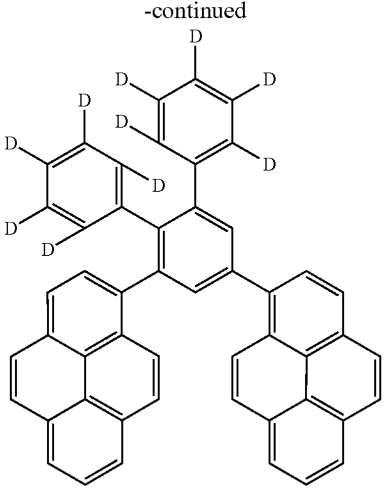
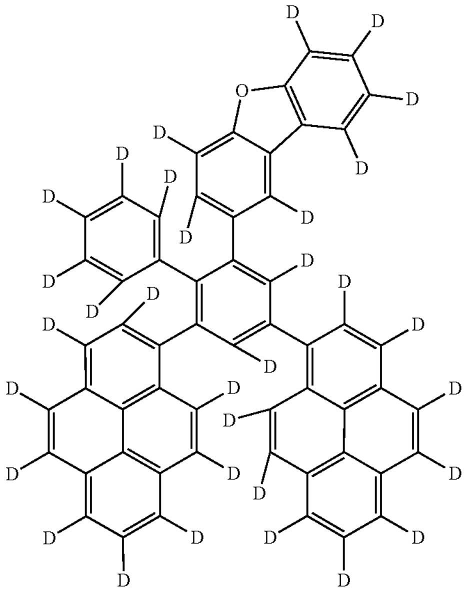
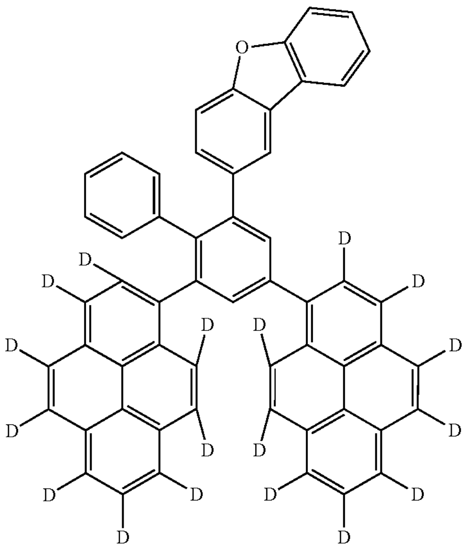
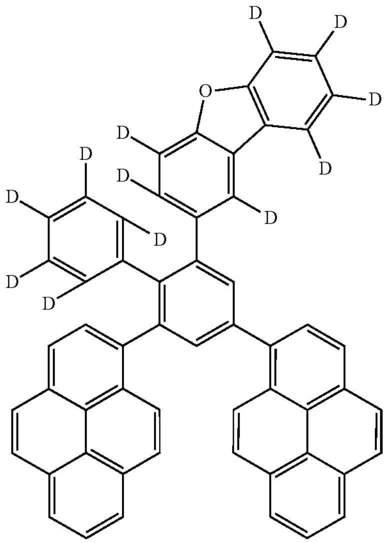

-continued
[Formula 141]
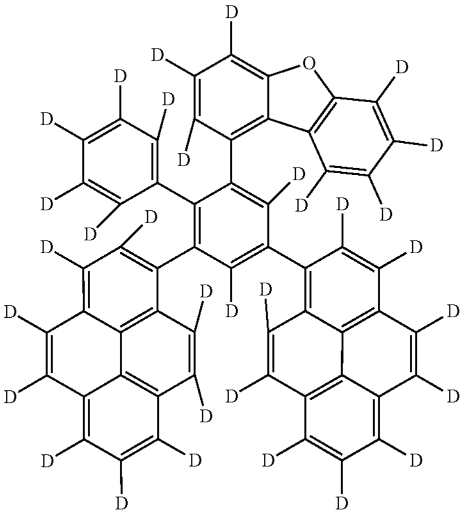
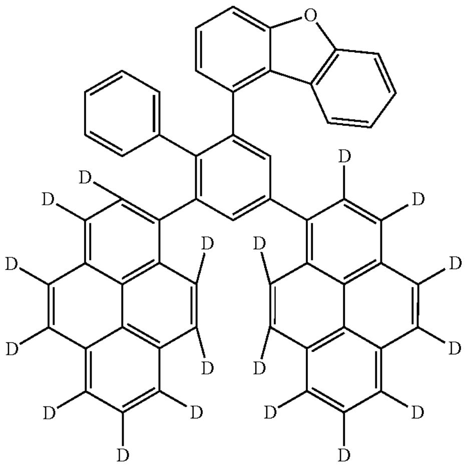
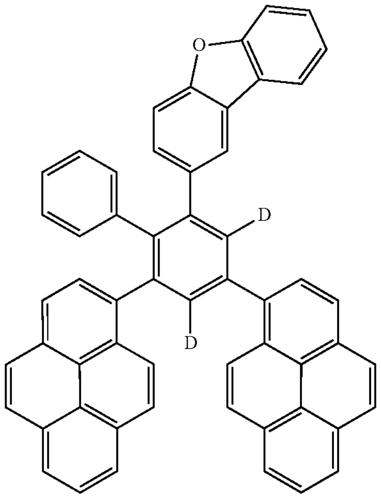
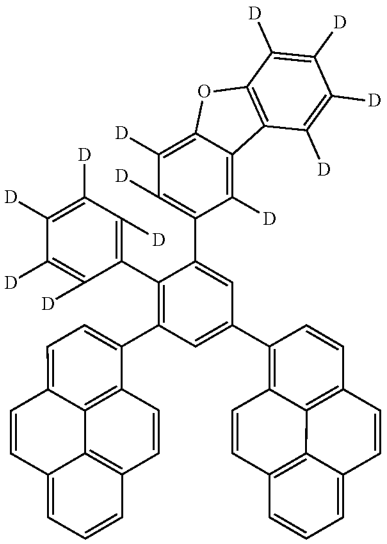
[Formula 142]
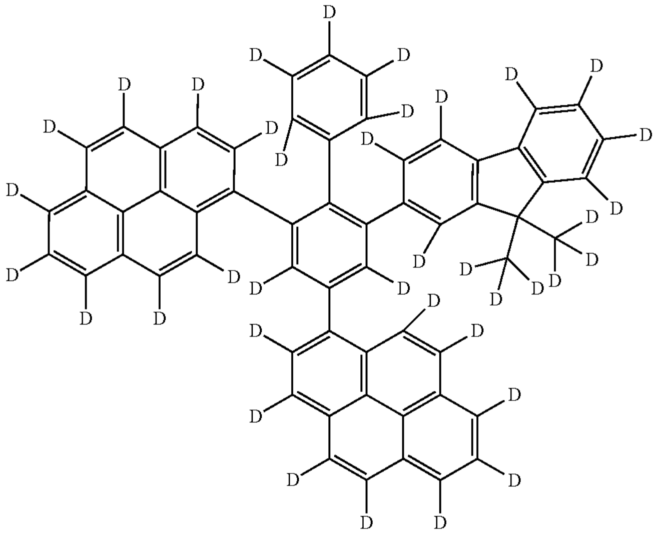

-continued
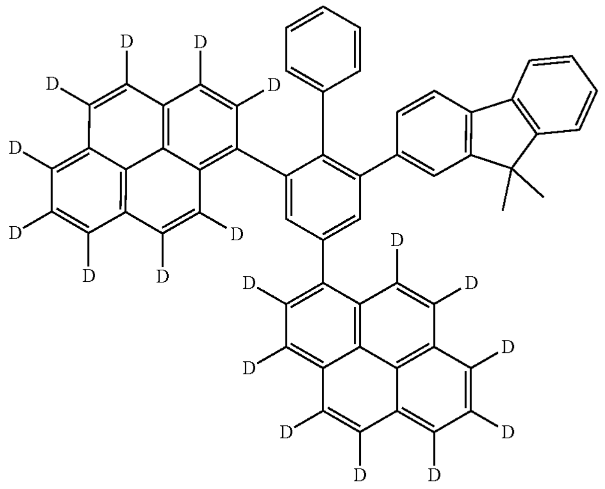
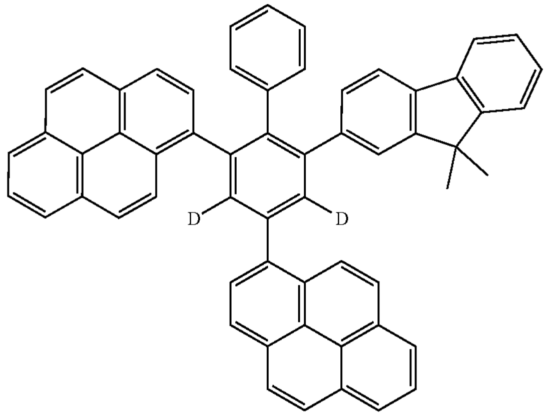
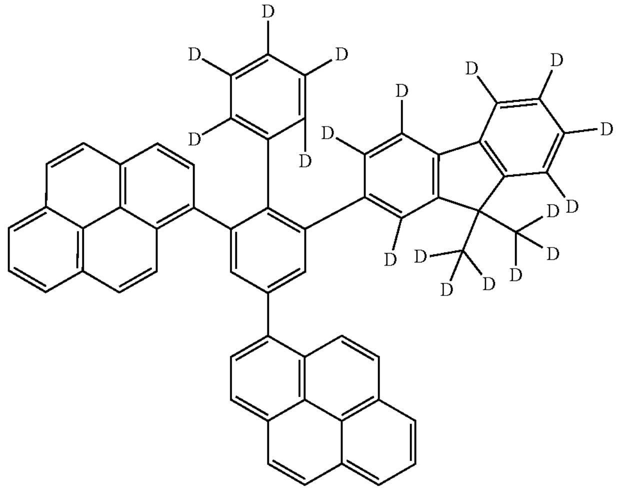
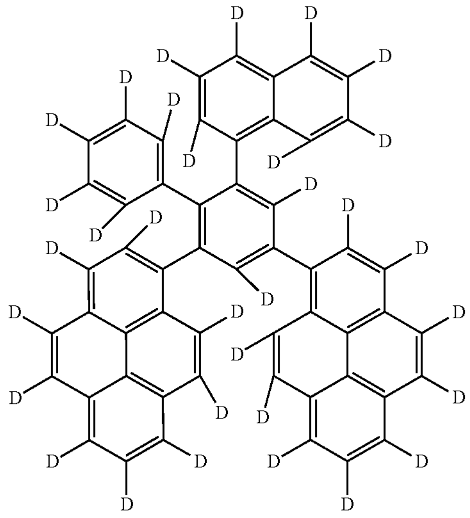
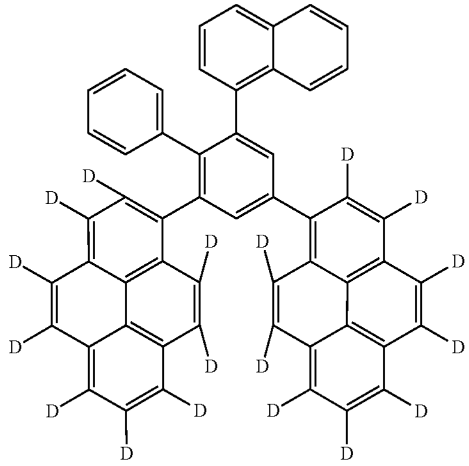
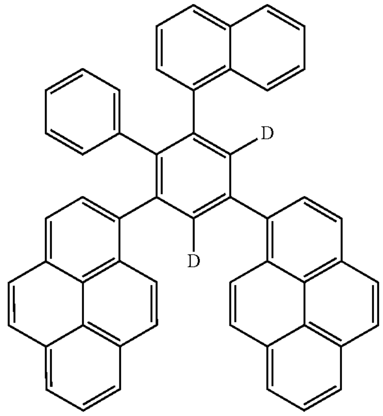

-continued
[Formula 143]
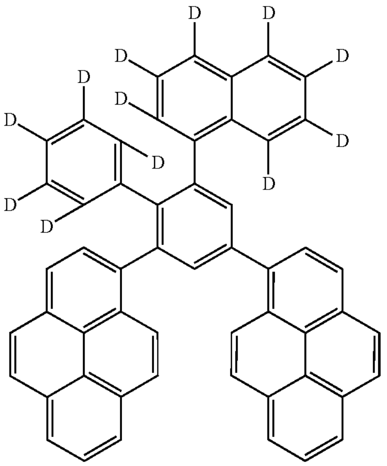
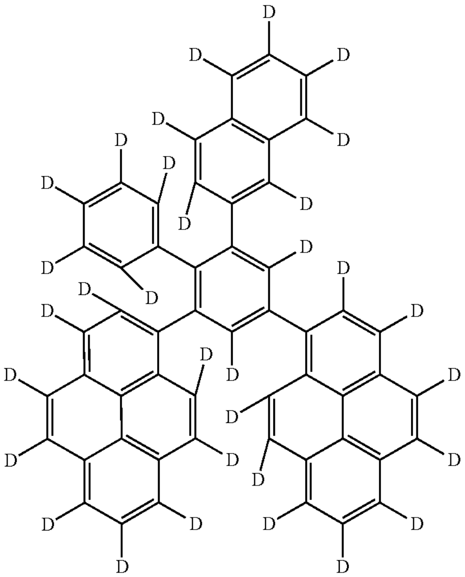
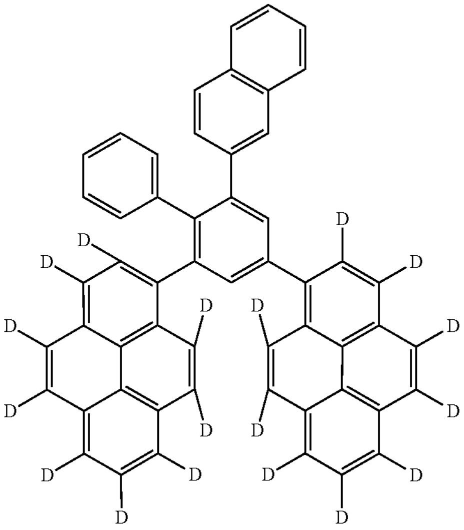
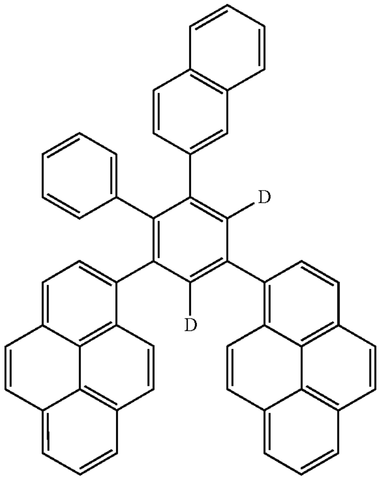
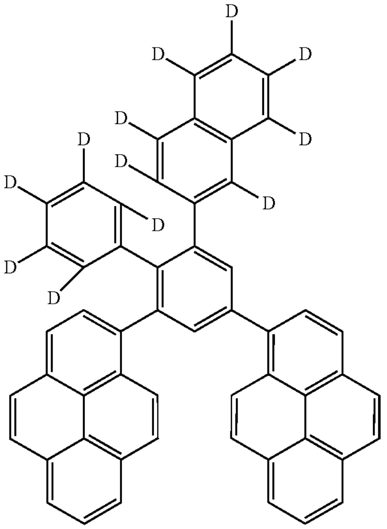
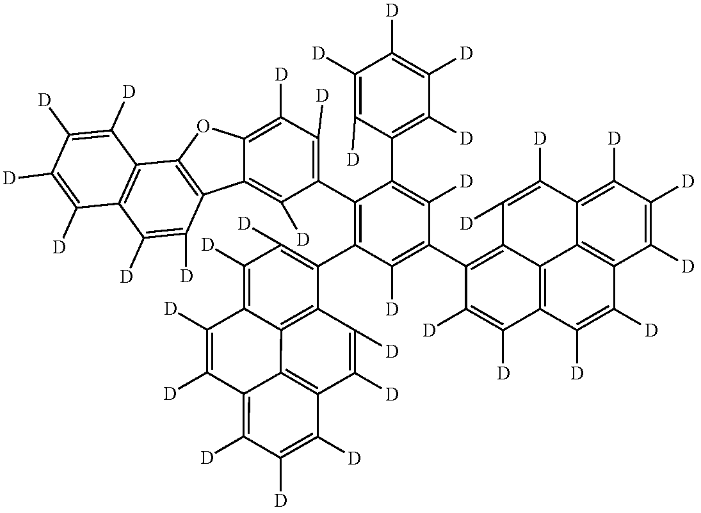

-continued
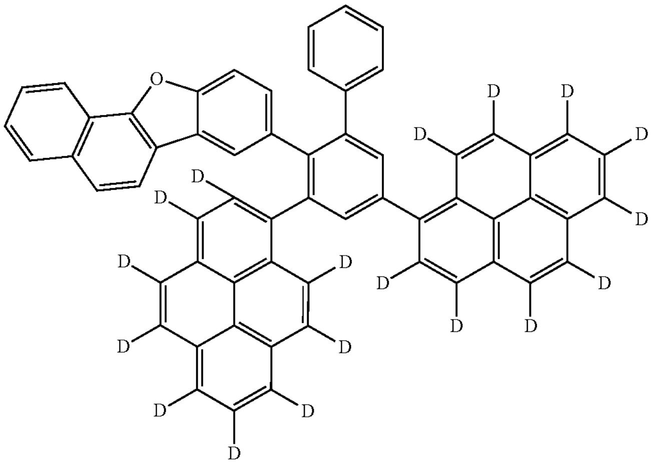
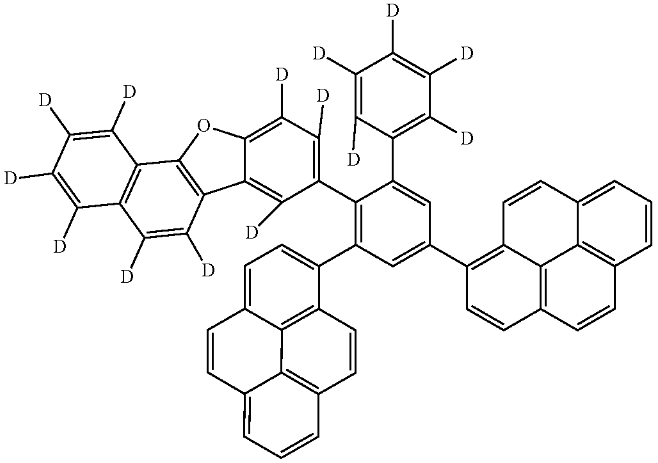
[Formula 144]
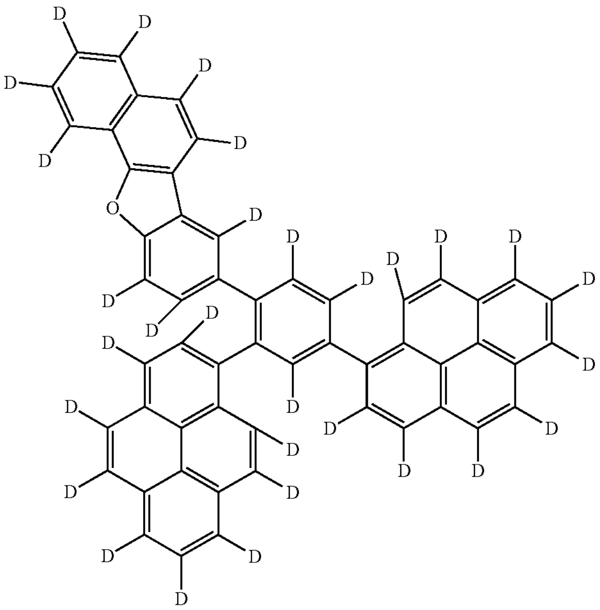
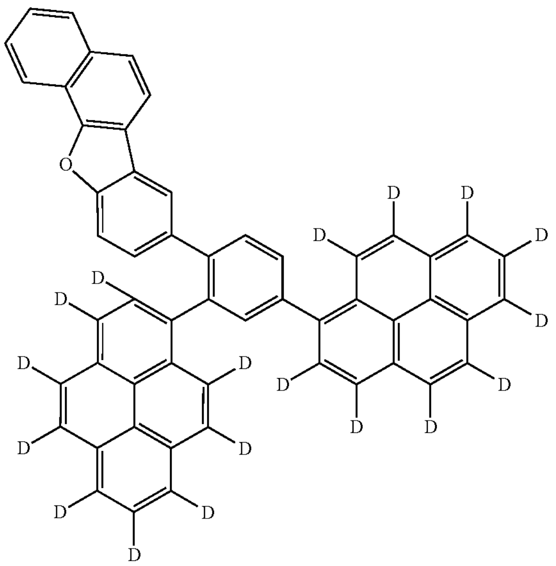

-continued
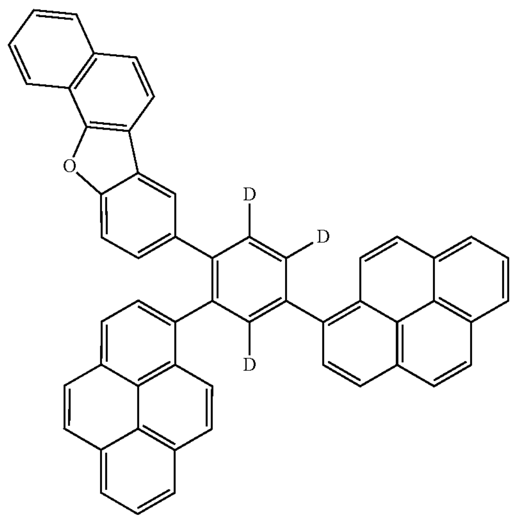
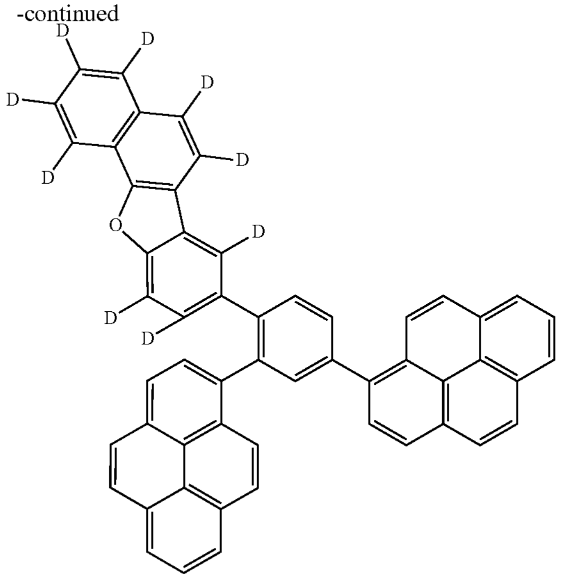
[Formula 145]
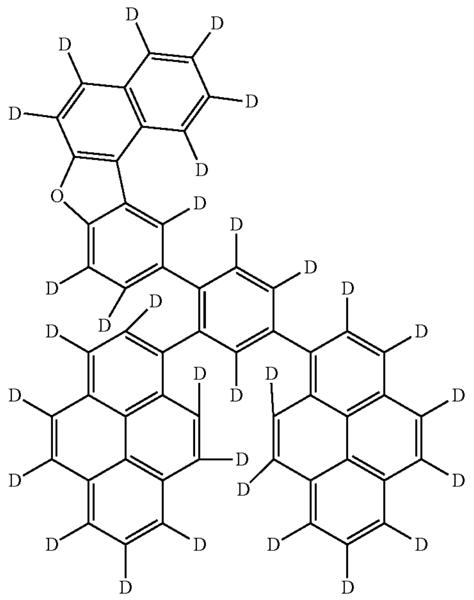
-continued
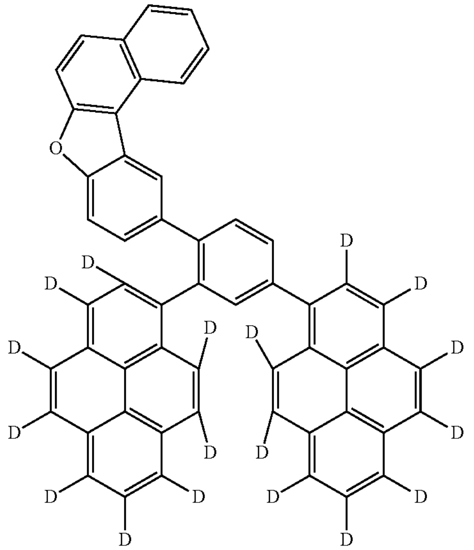
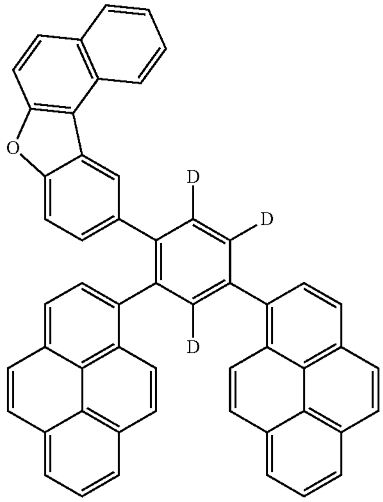

-continued
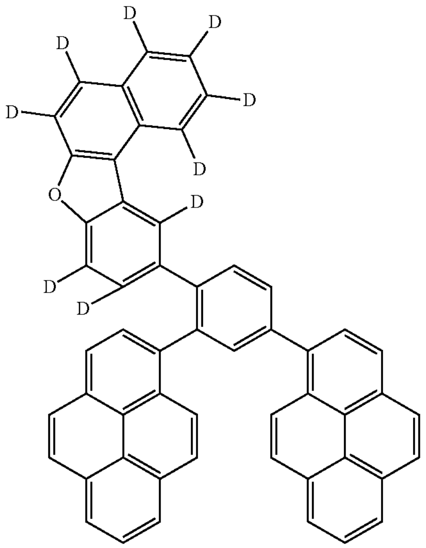
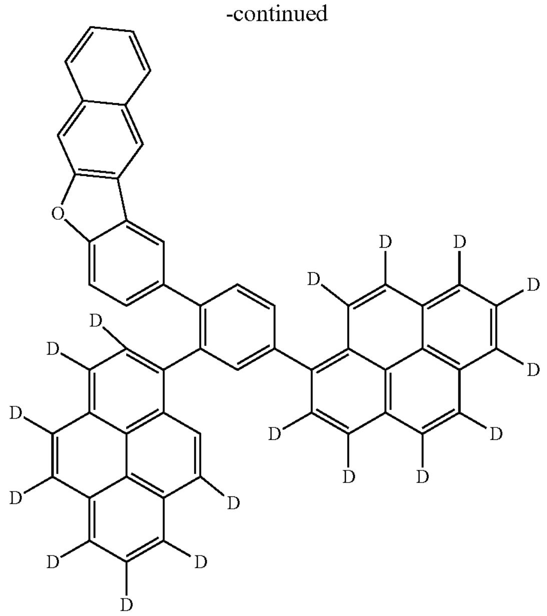
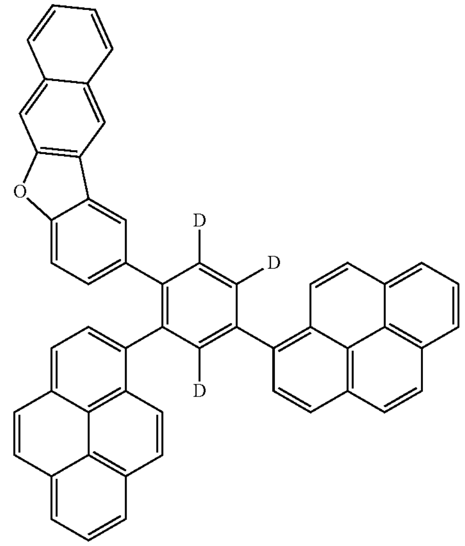
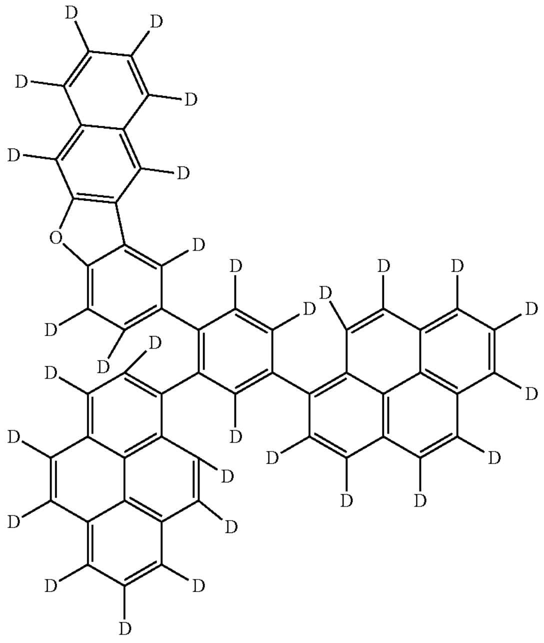
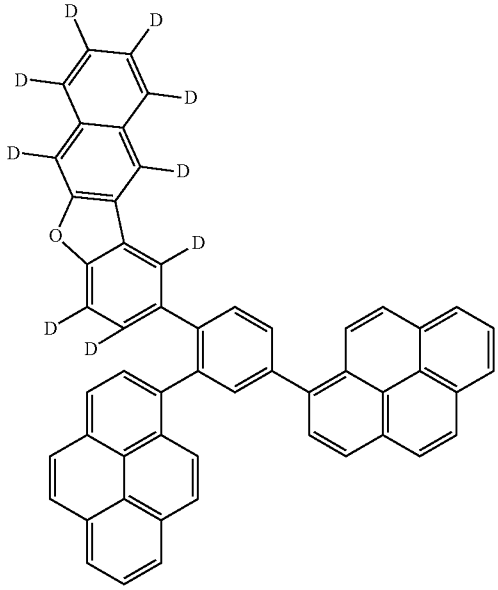
-continued -continued
[Formula 146]
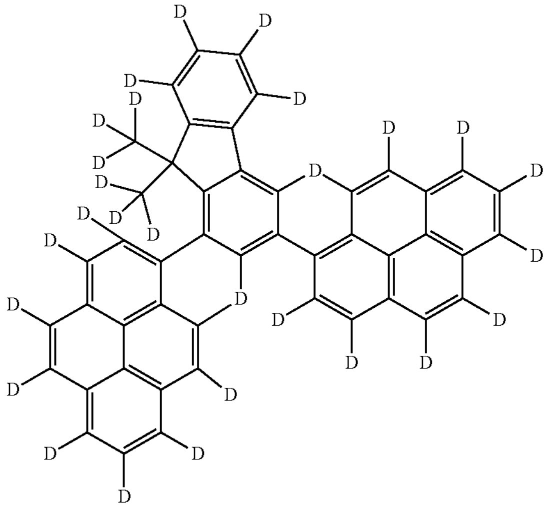
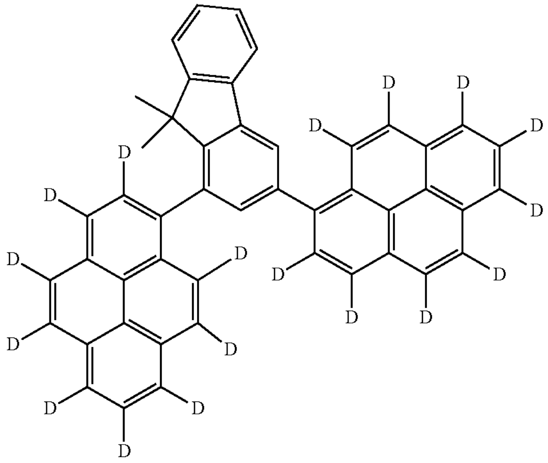
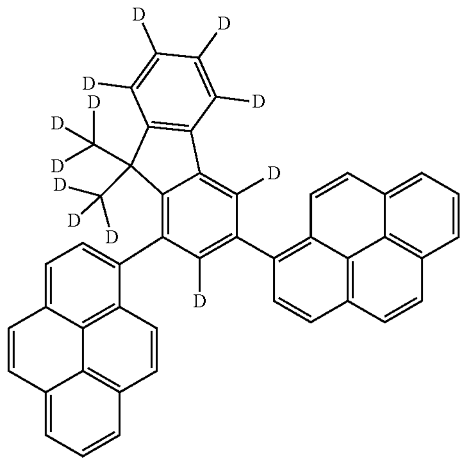
-continued
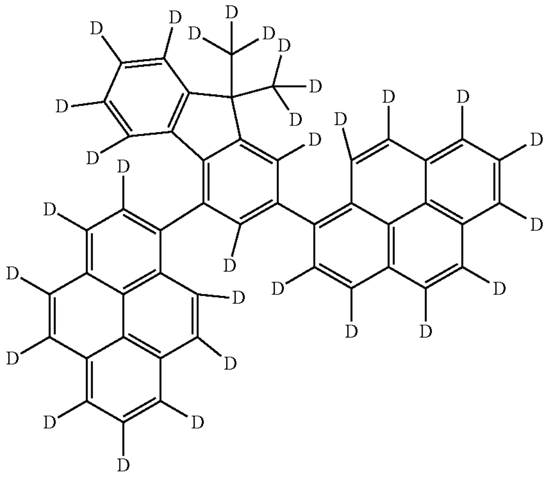
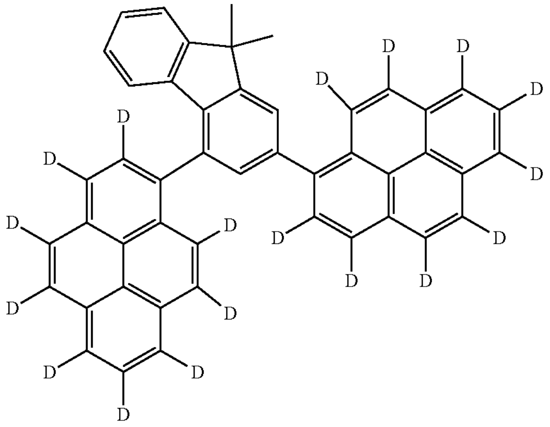
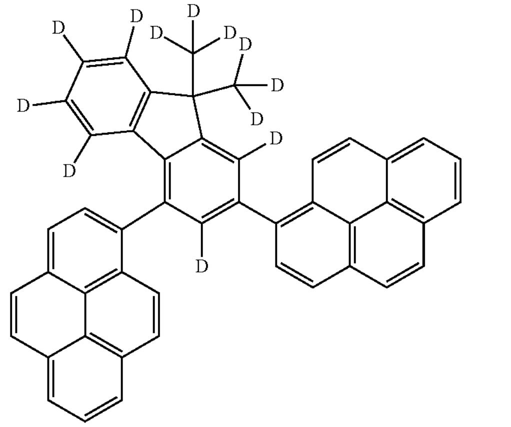
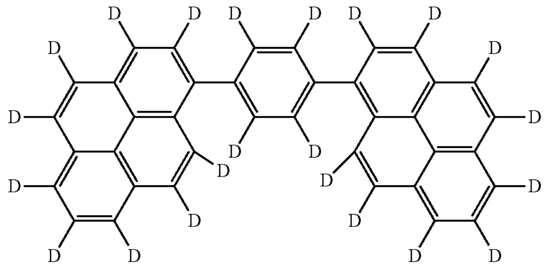

-continued
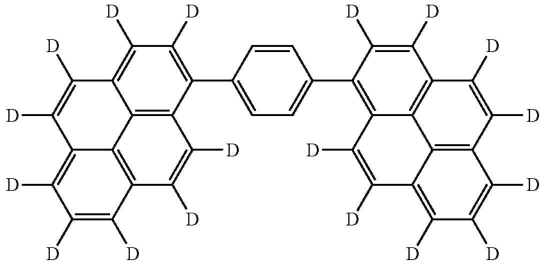
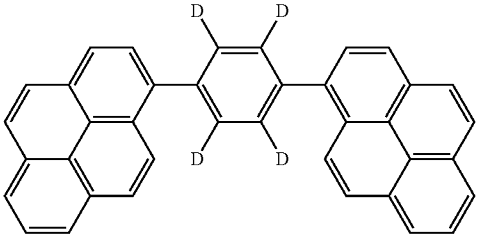
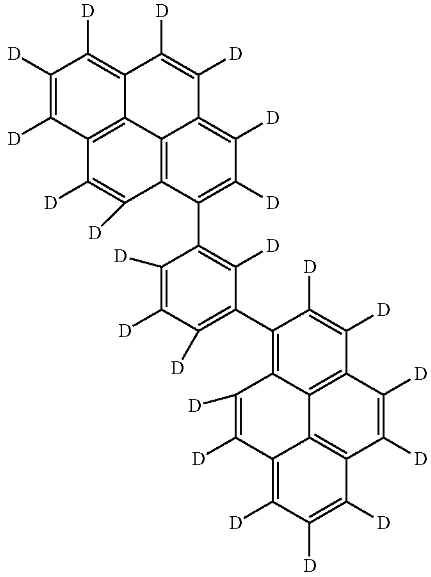
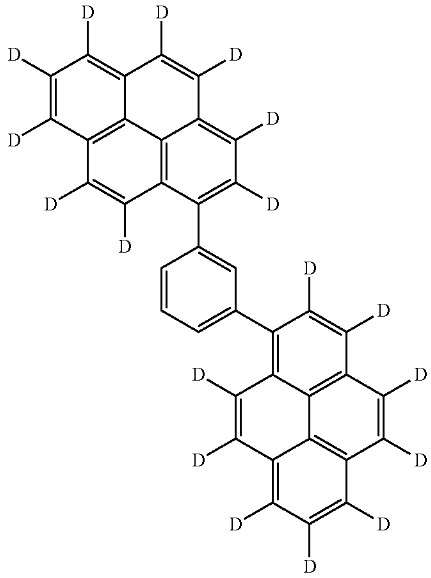
-continued
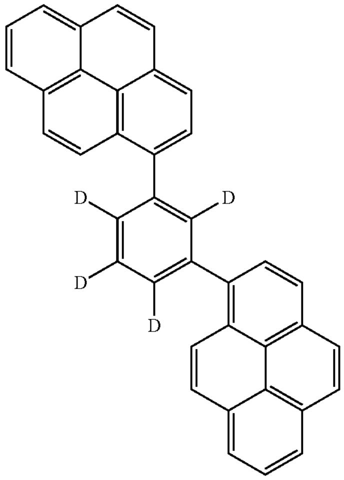
[Formula 147]
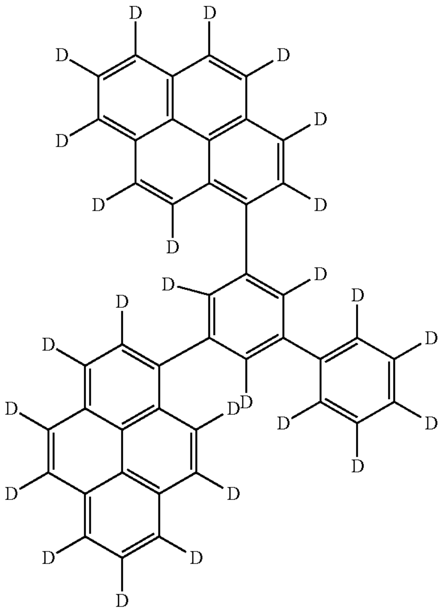
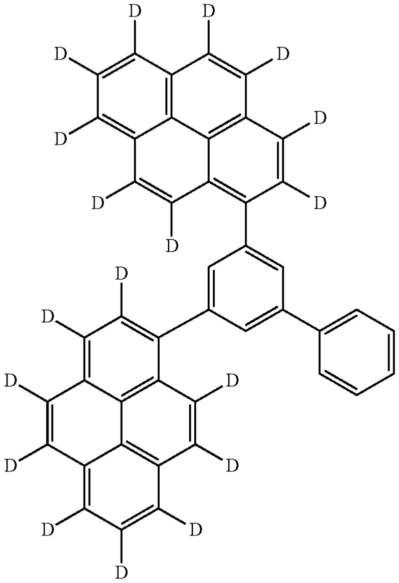

-continued
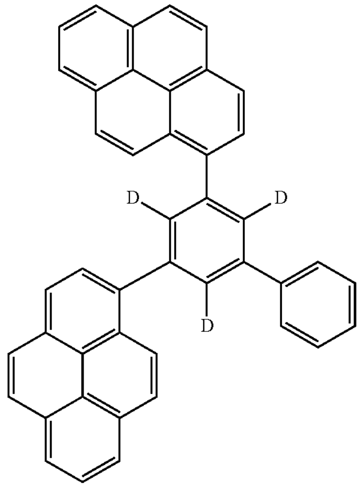
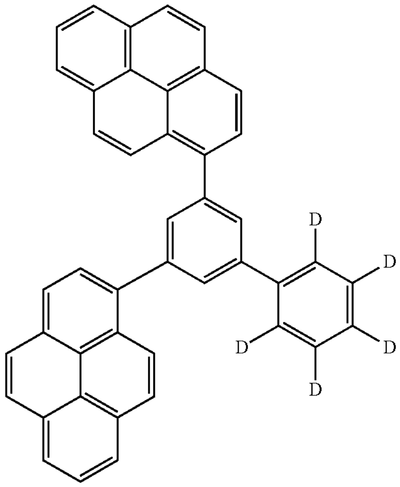
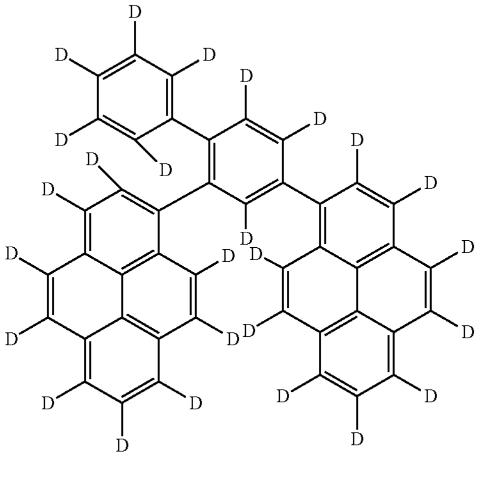
-continued
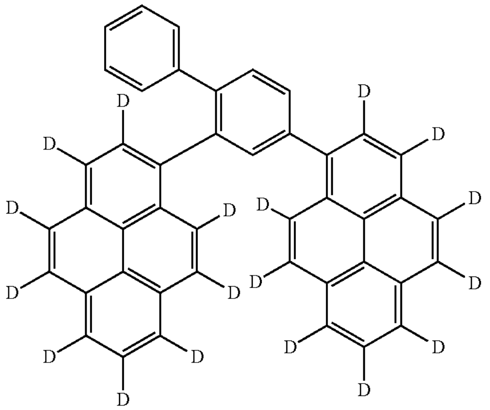
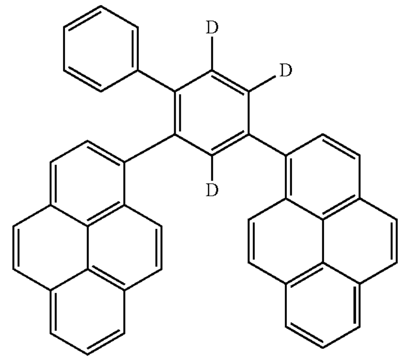
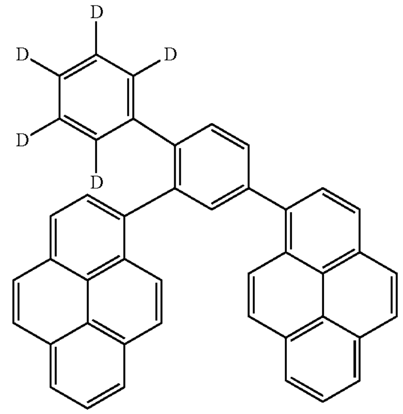
[Formula 148]
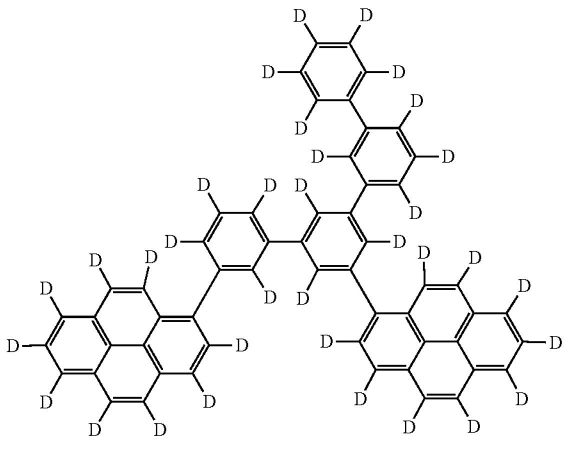

-continued
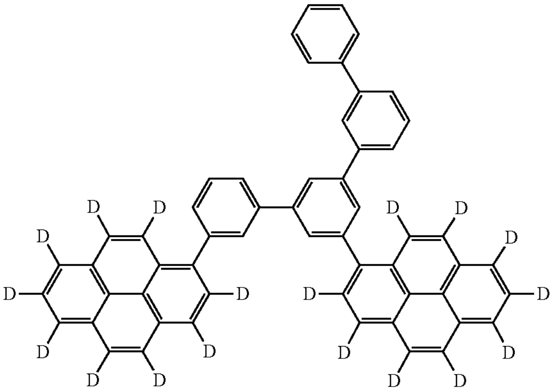
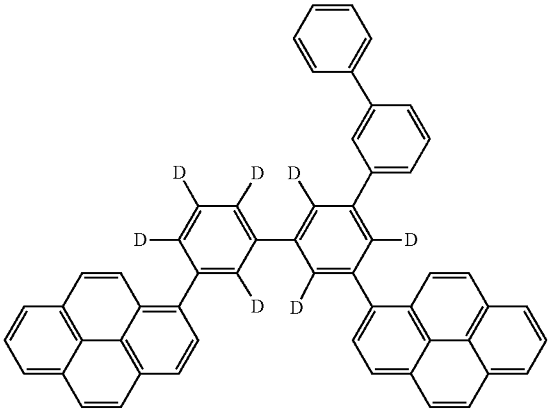
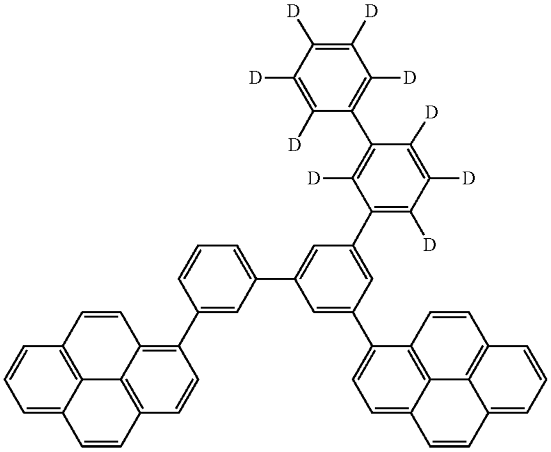
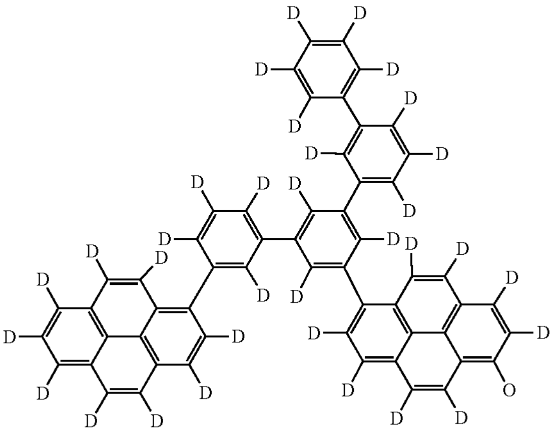
-continued
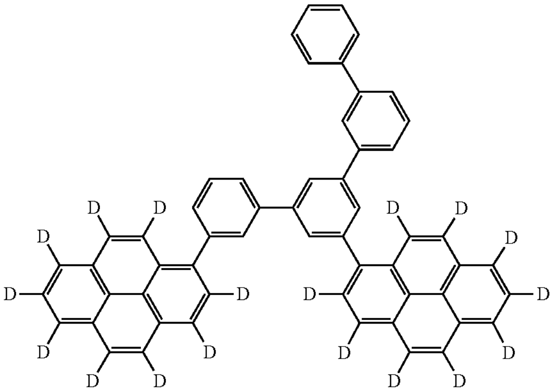
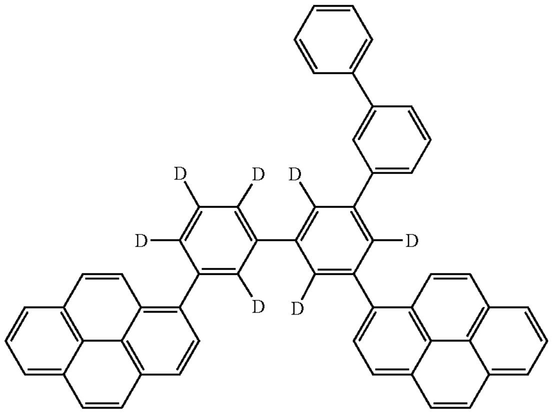
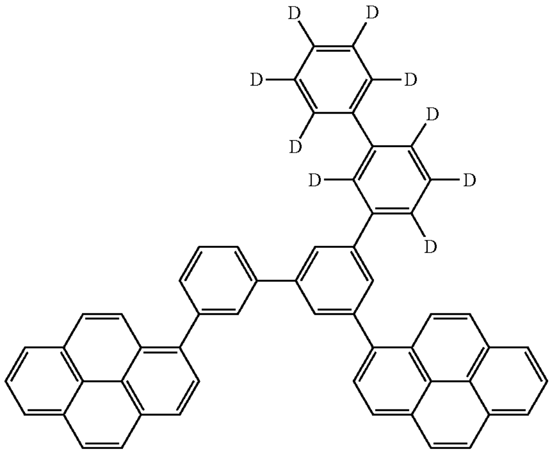

-continued
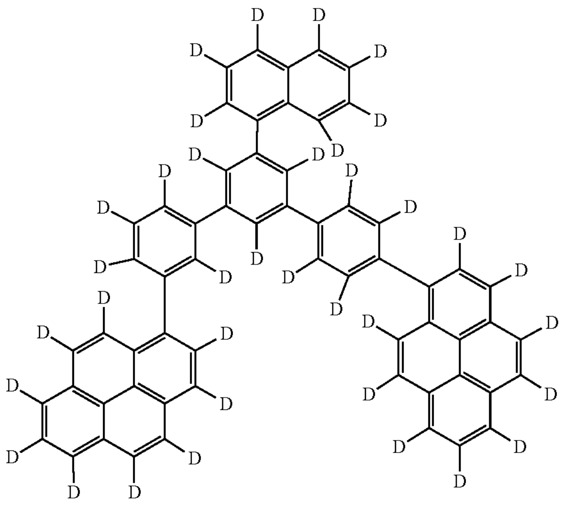
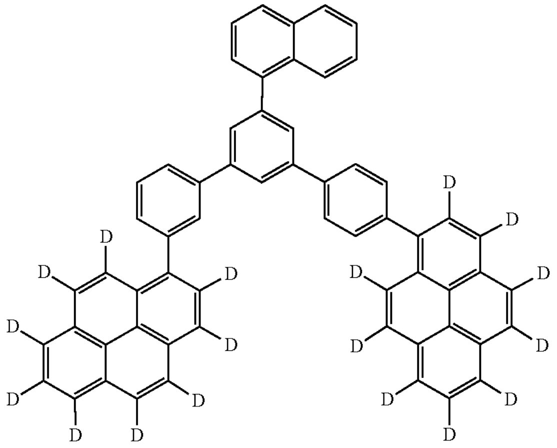
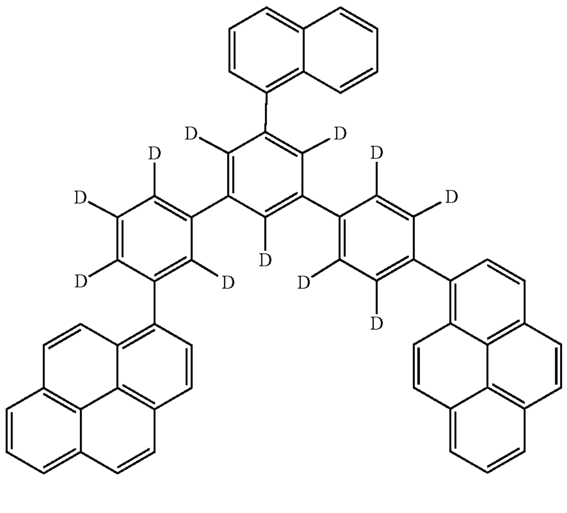
-continued
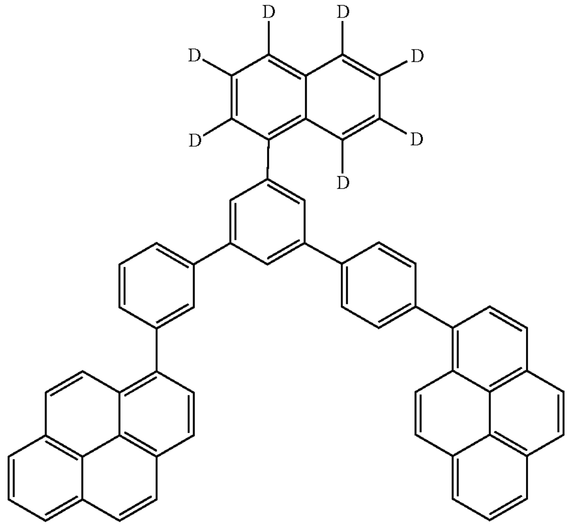
[Formula 149]
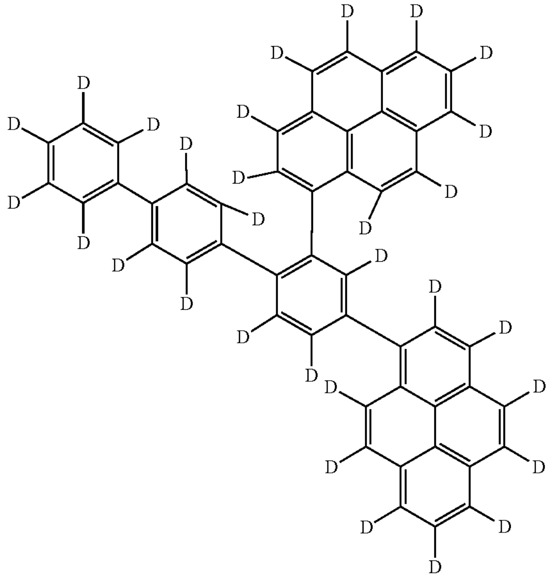
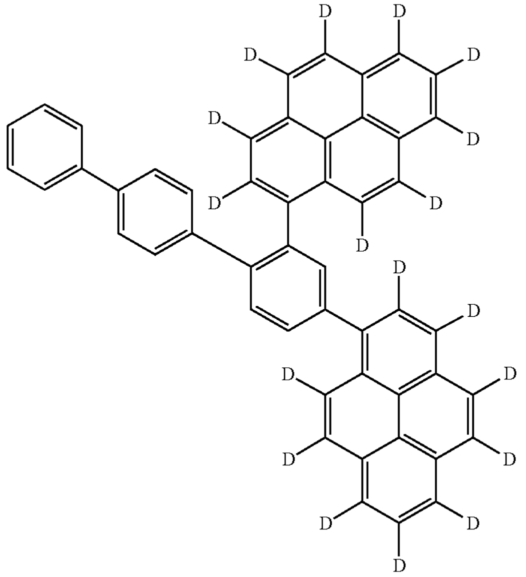

-continued
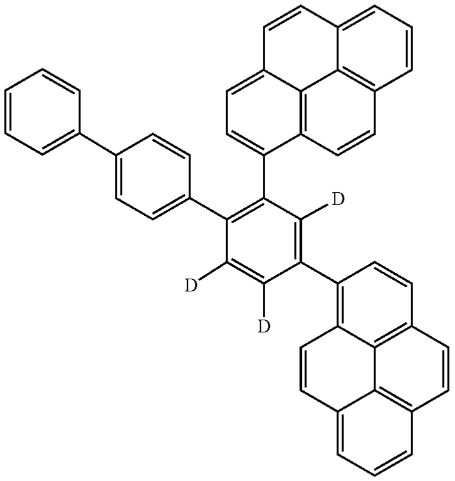
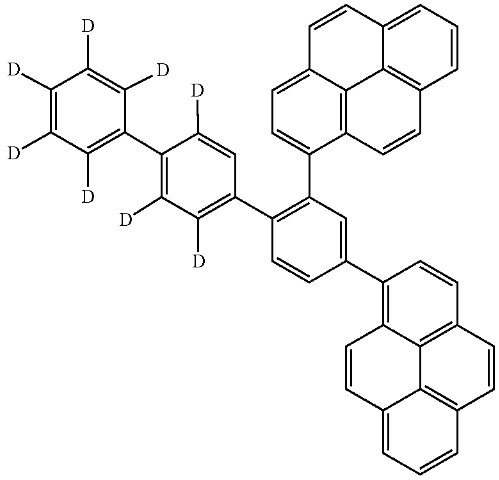
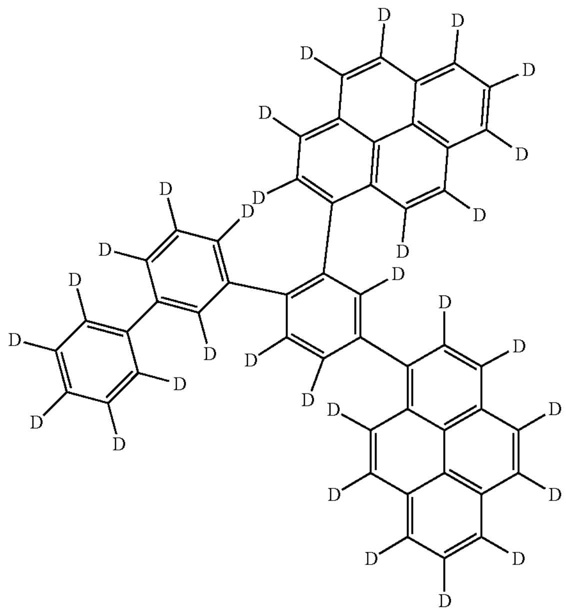
-continued
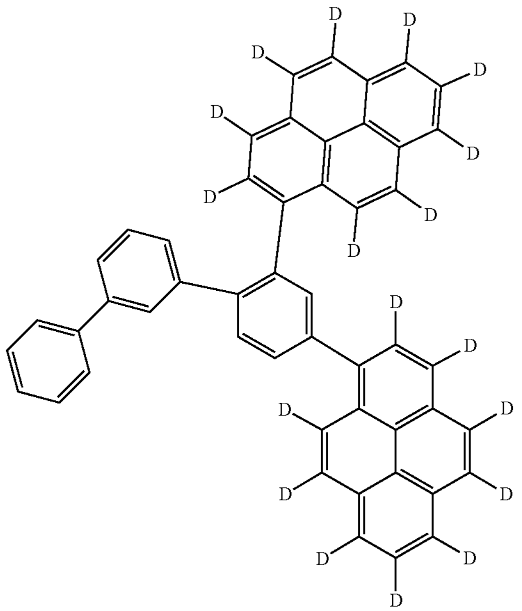
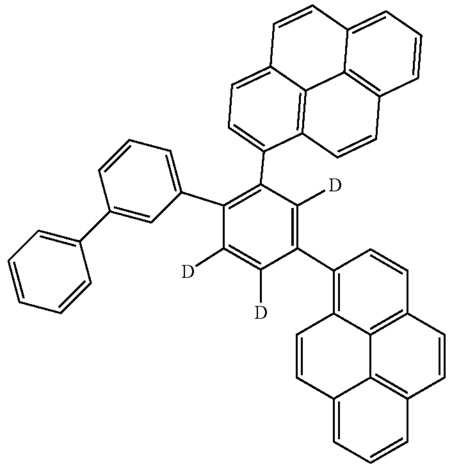
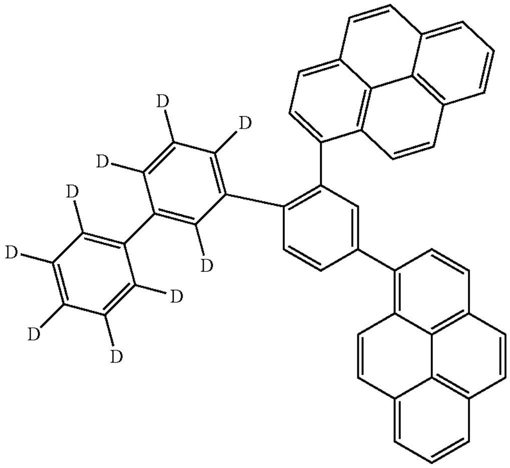

-continued
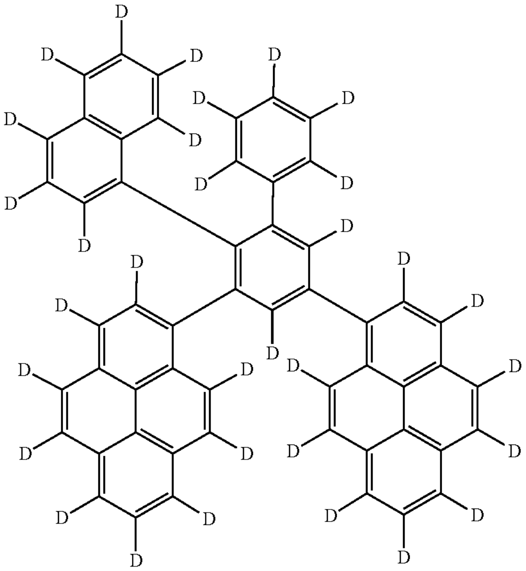
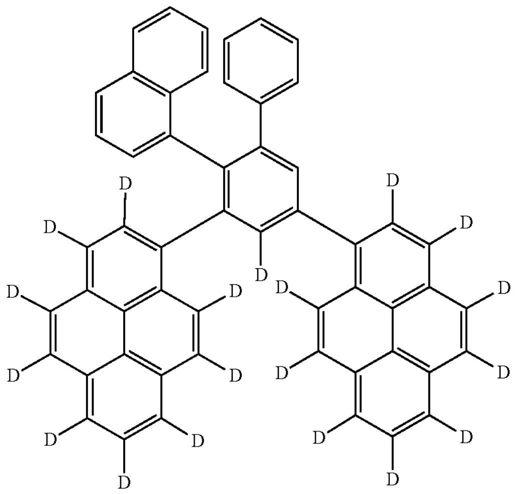
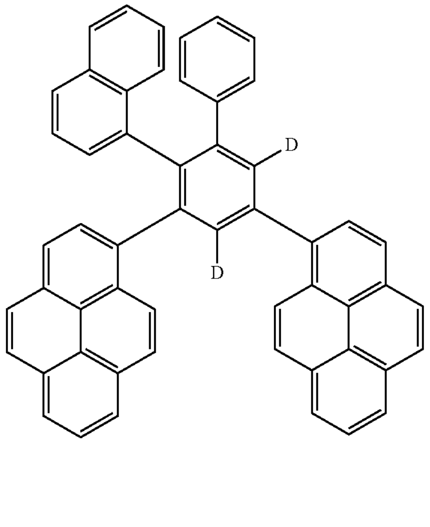
-continued
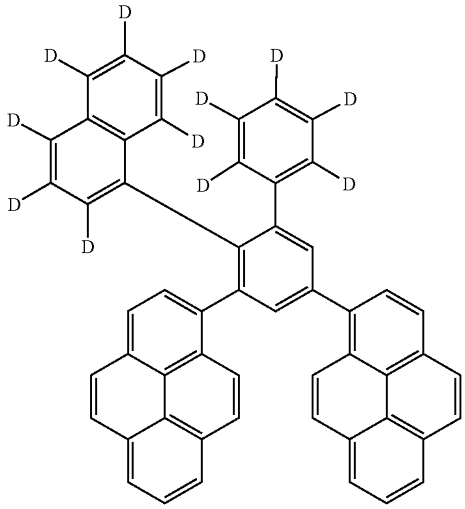
[Formula 150]
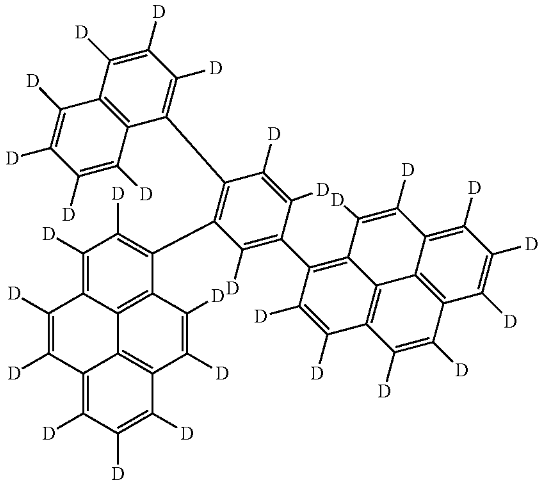
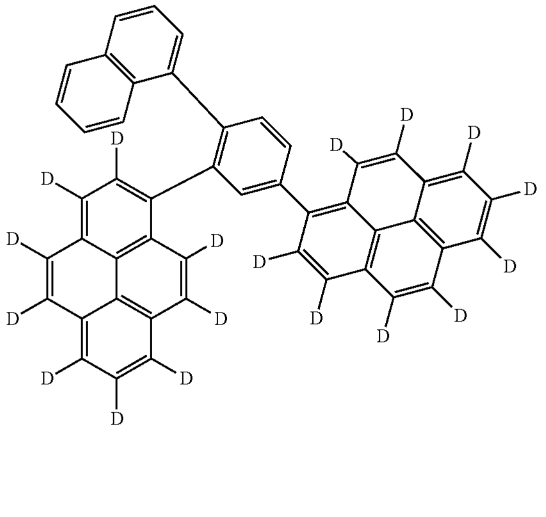

-continued
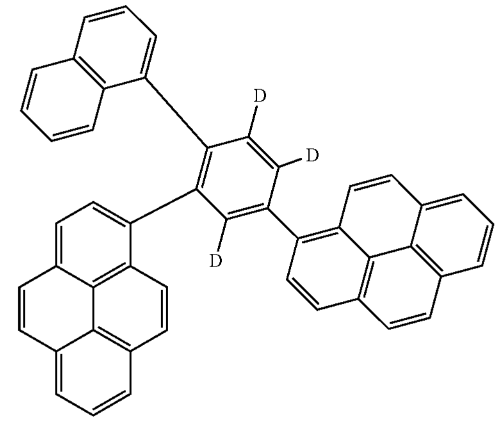
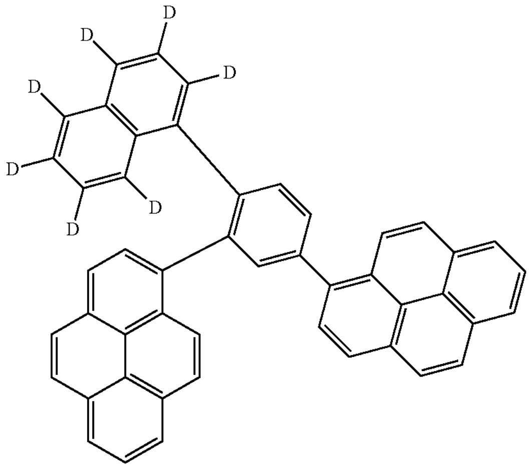
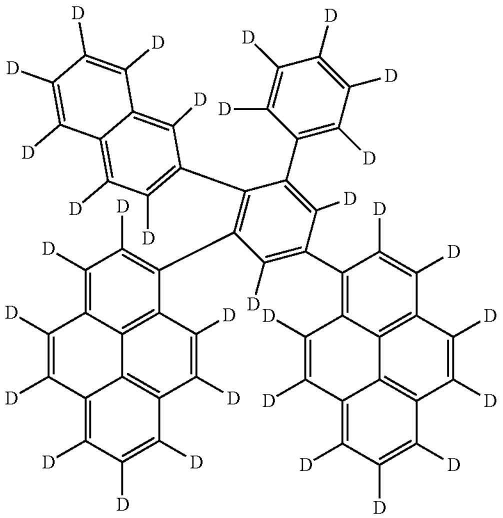
-continued
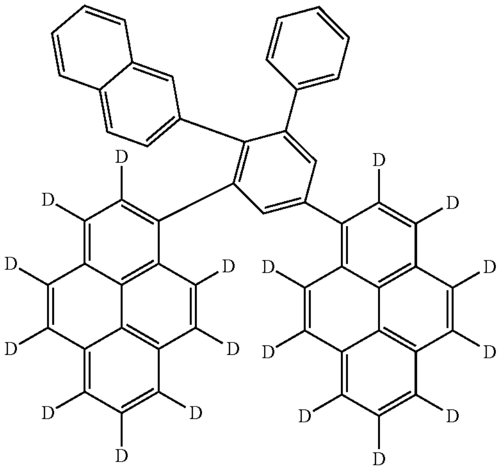
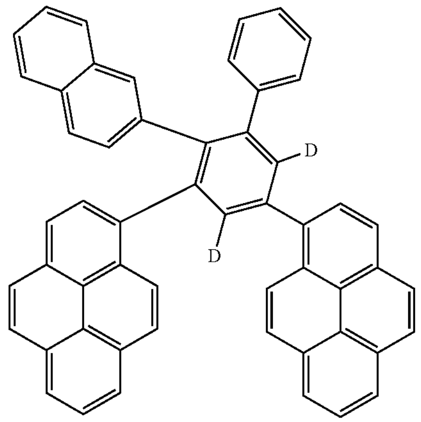
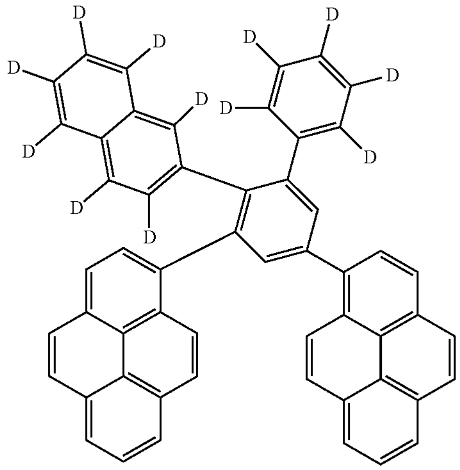

-continued
[Formula 151]
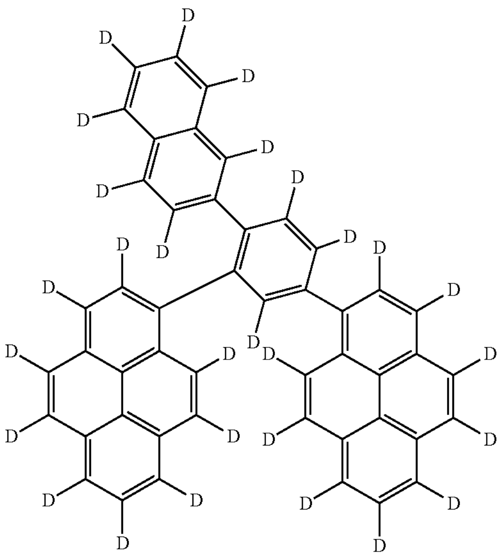
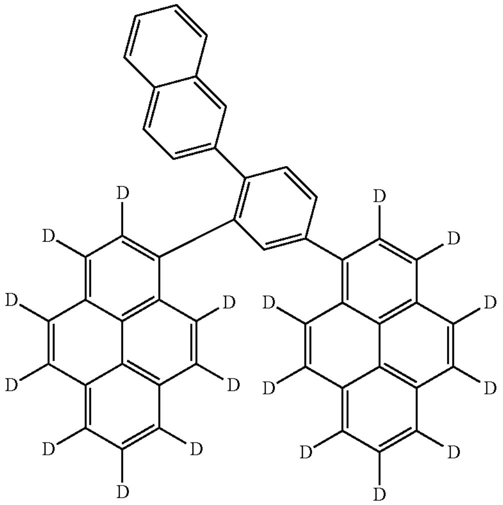
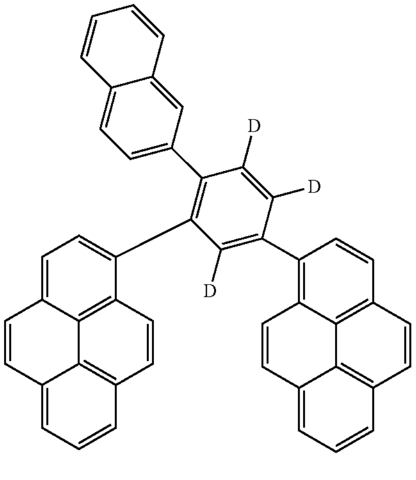
-continued
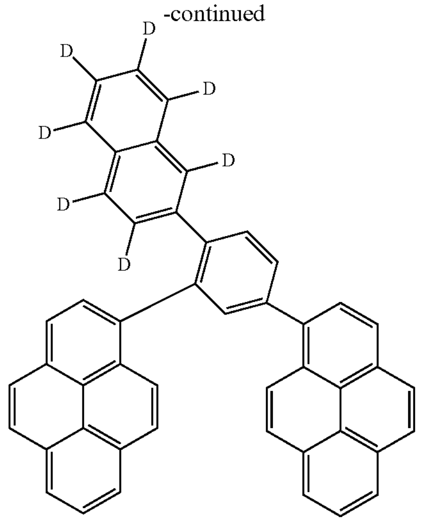
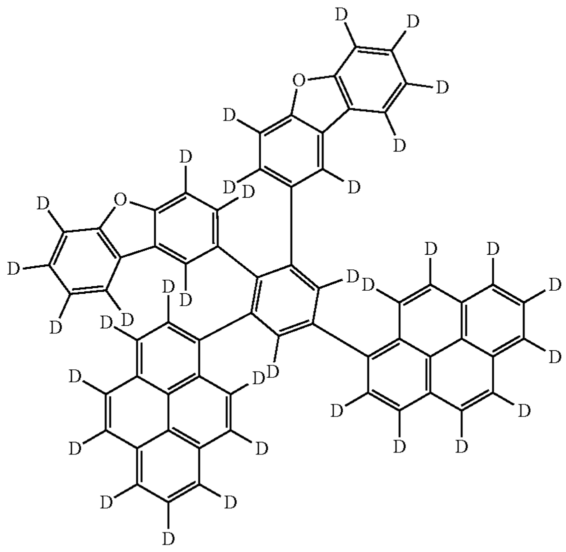
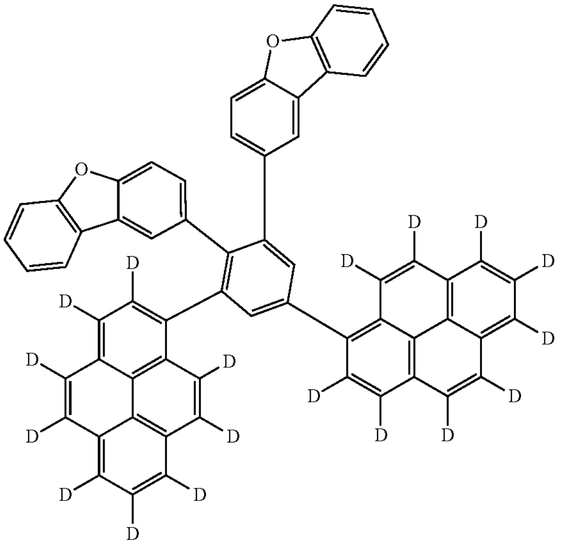

-continued
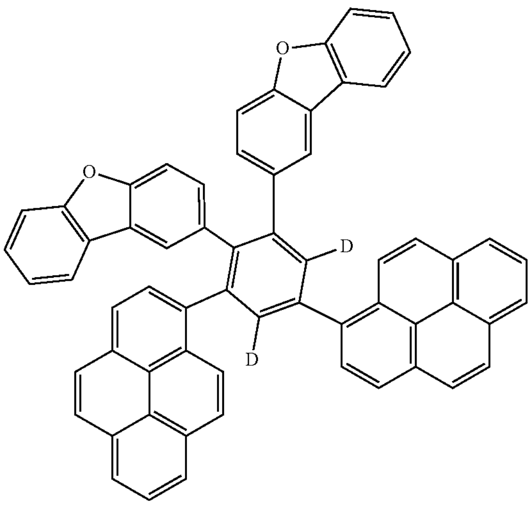
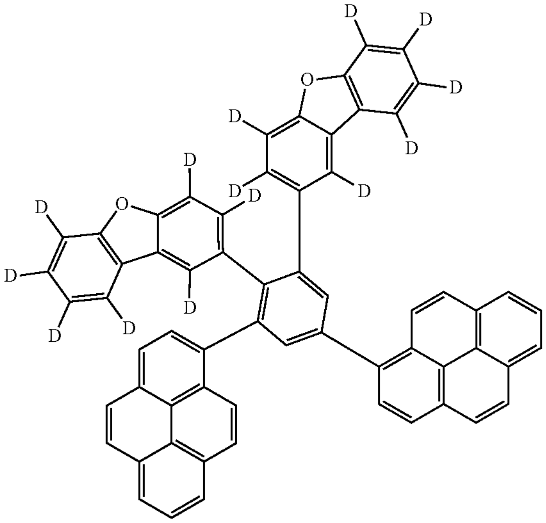
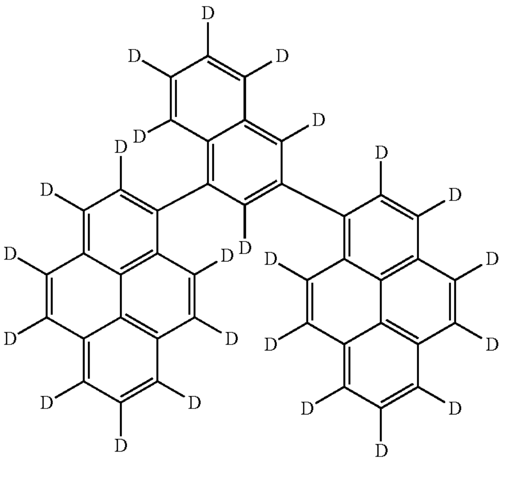
-continued
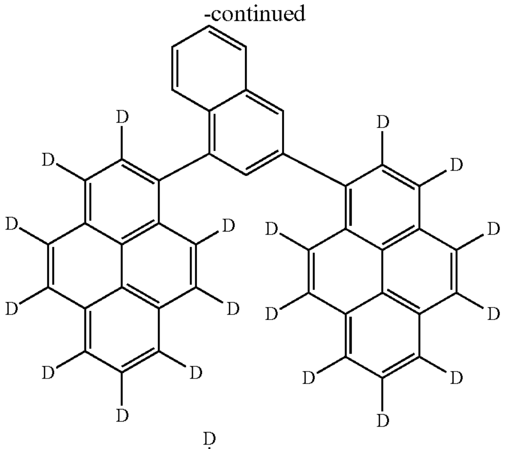
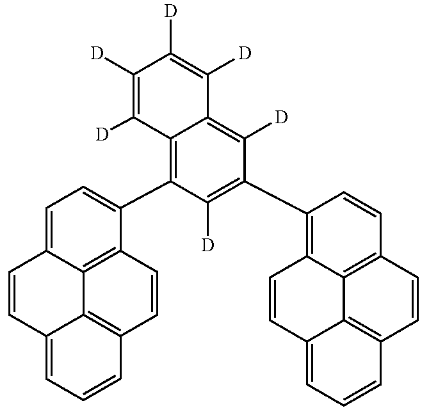
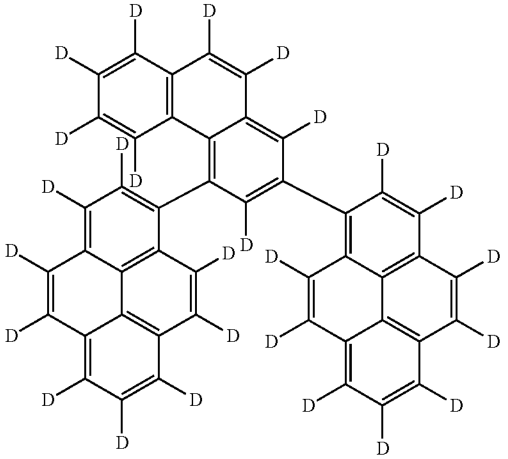
[Formula 152]
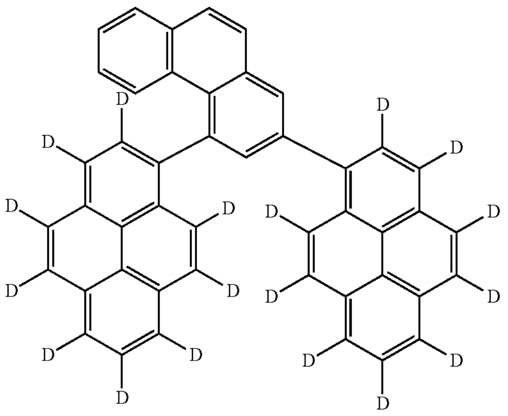

-continued
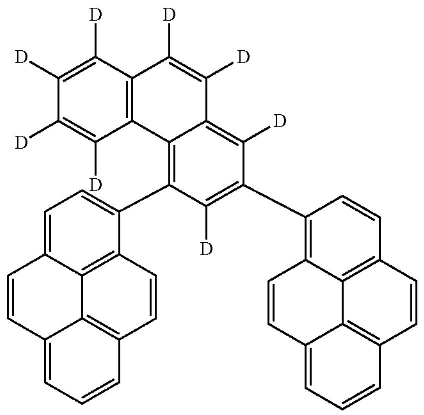
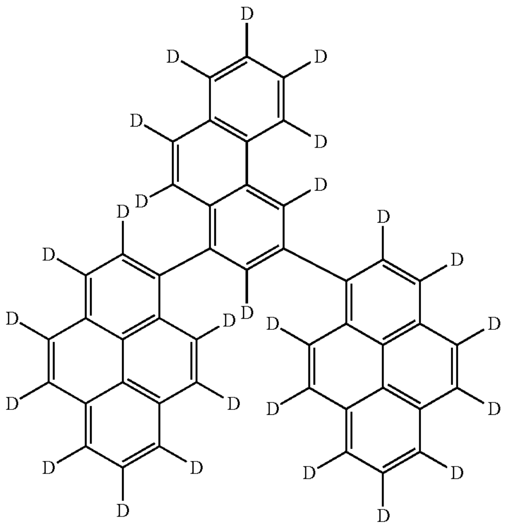
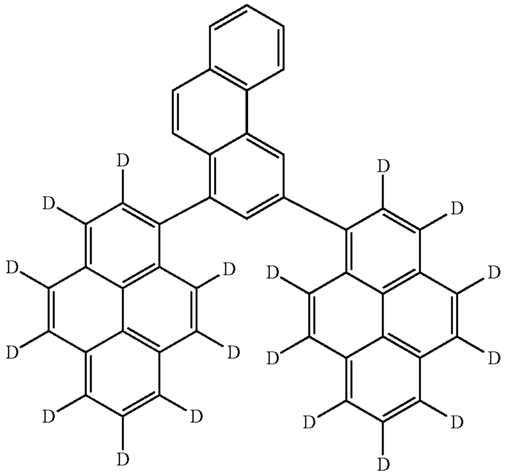
-continued
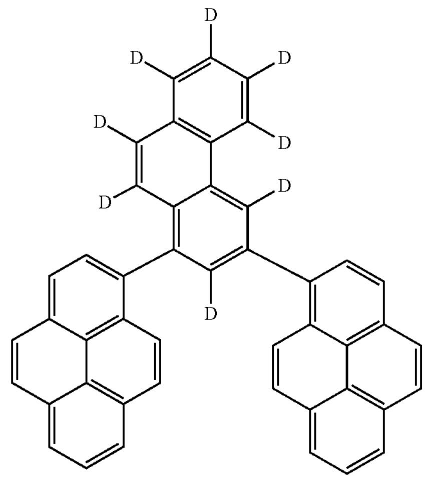
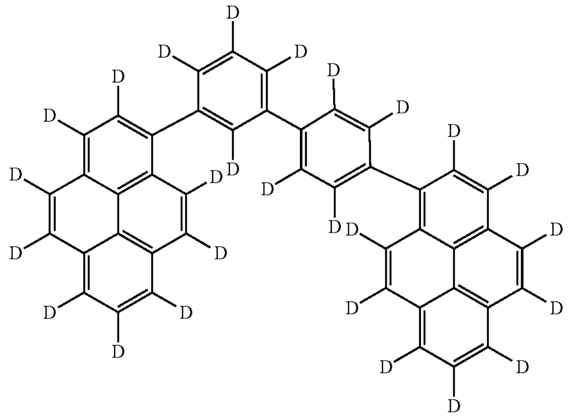
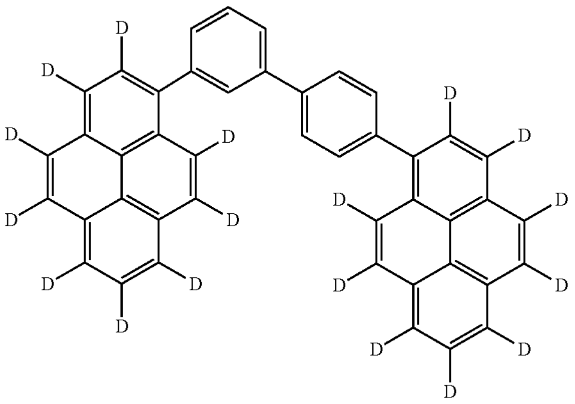
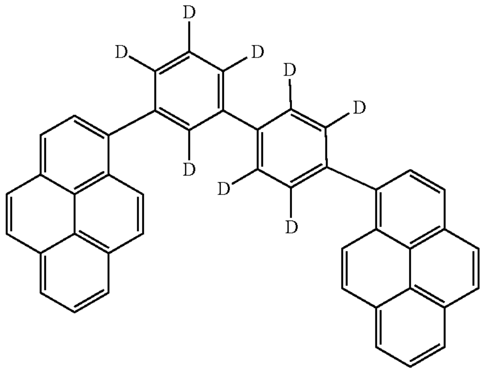

-continued
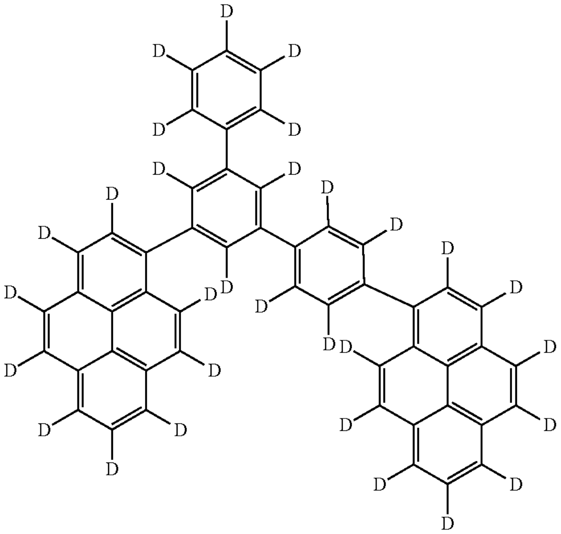
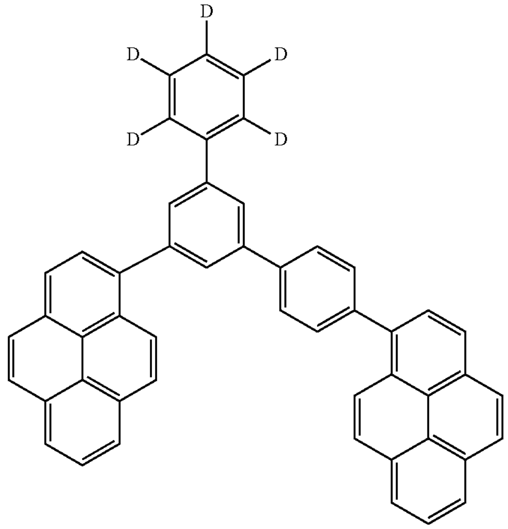
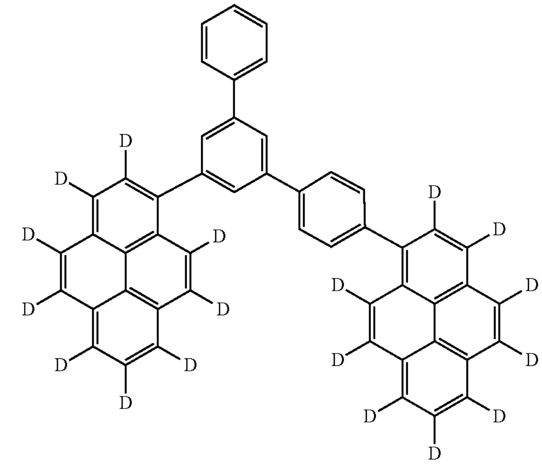
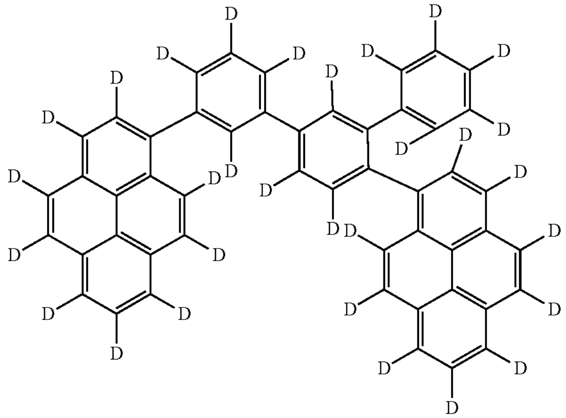
[Formula 153]
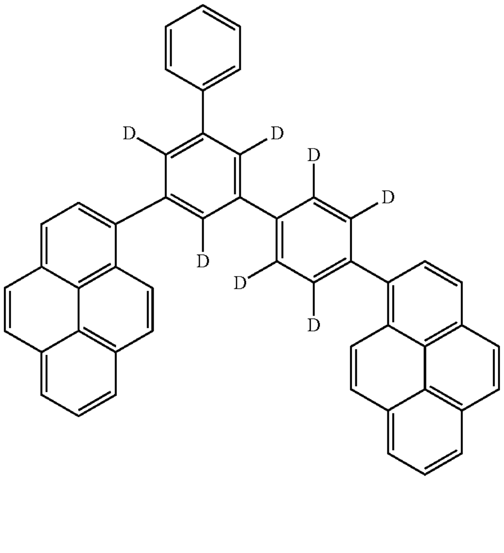
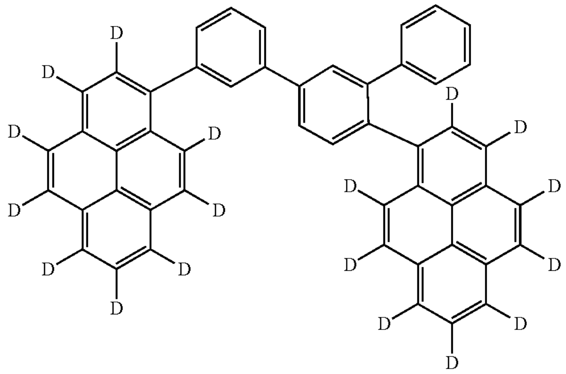

-continued
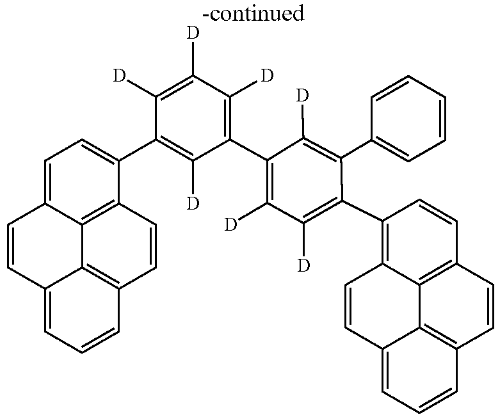
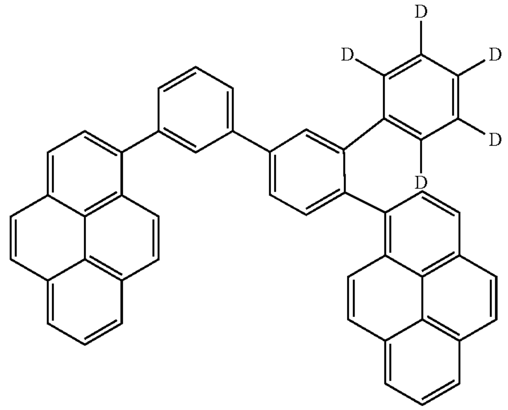
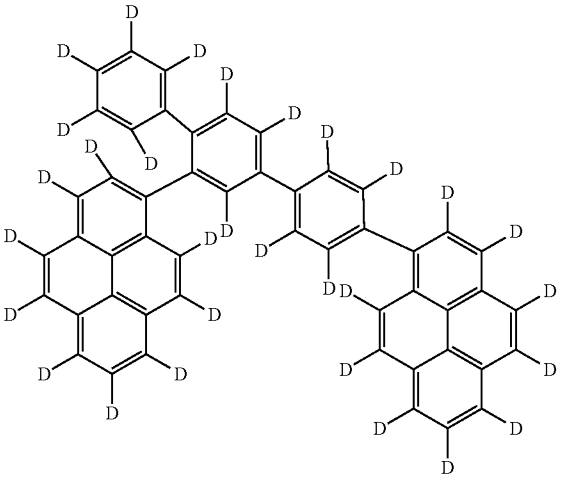
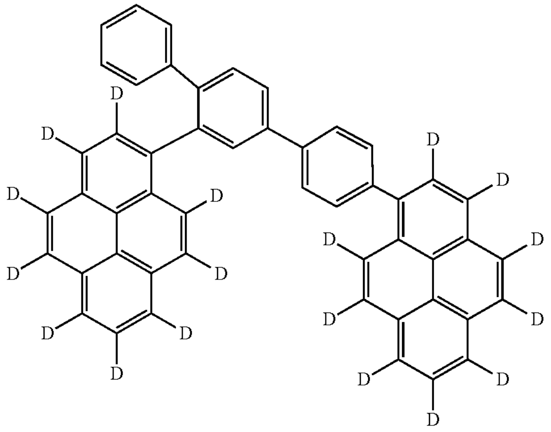
-continued
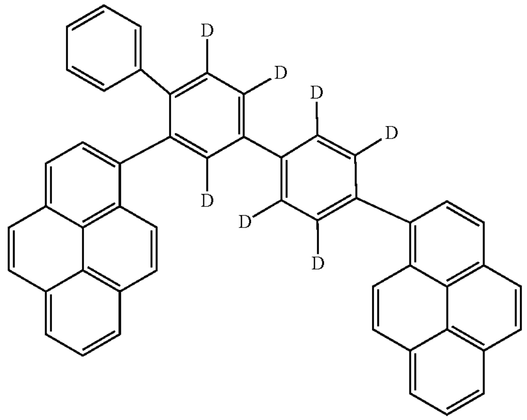
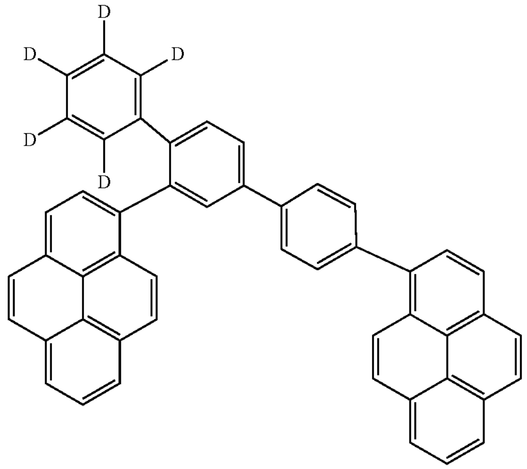
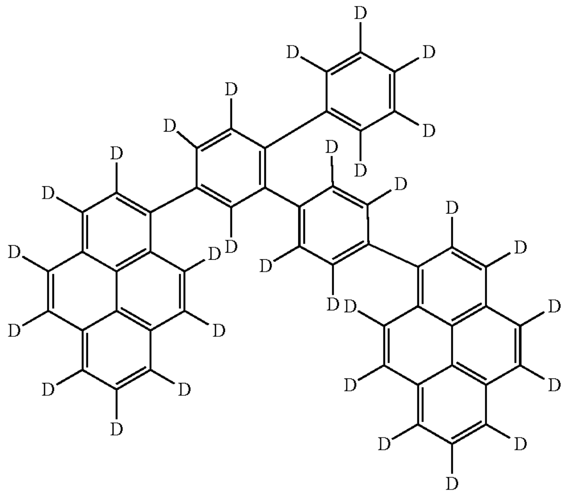

-continued
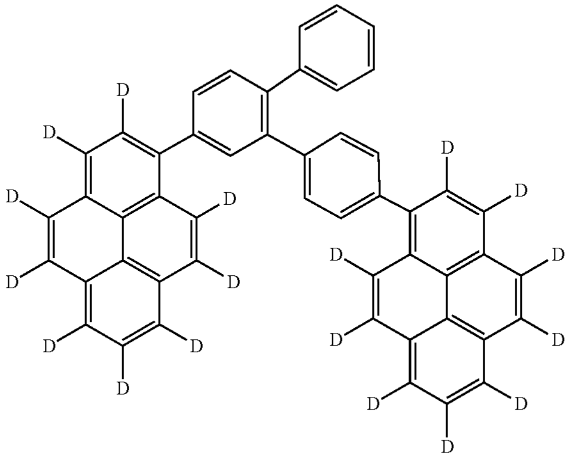
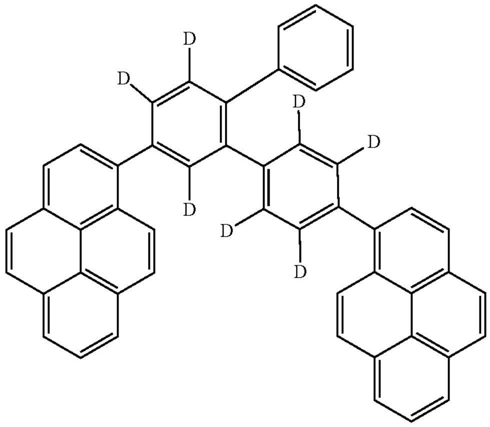
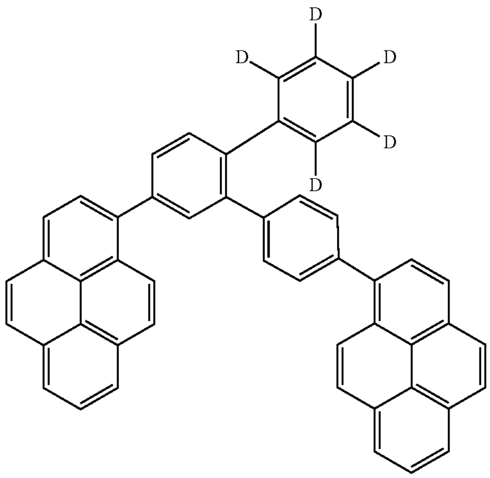
-continued
[Formula 154]
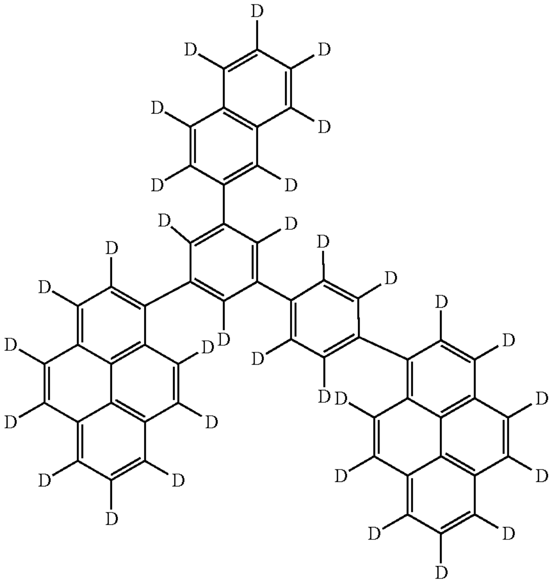
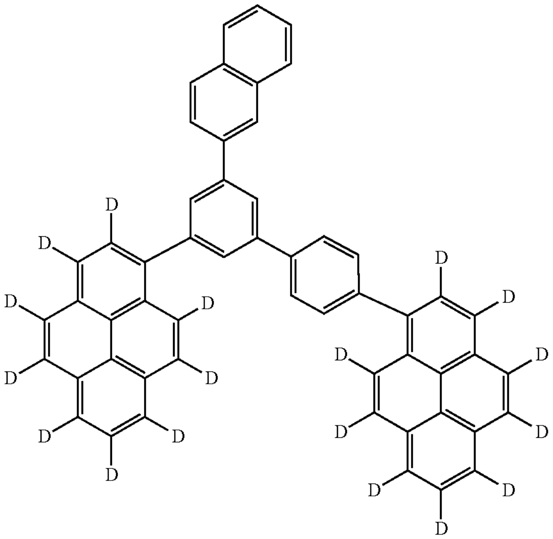
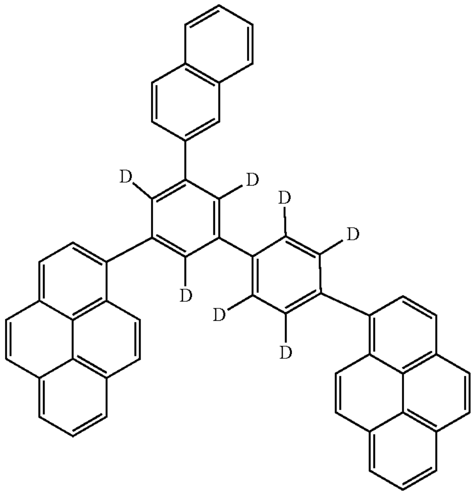

-continued
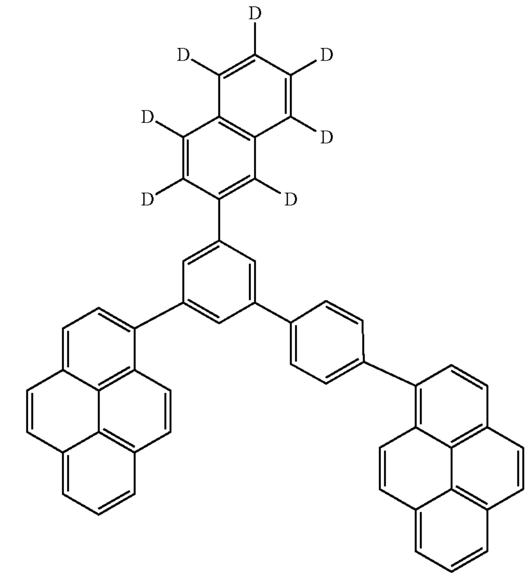
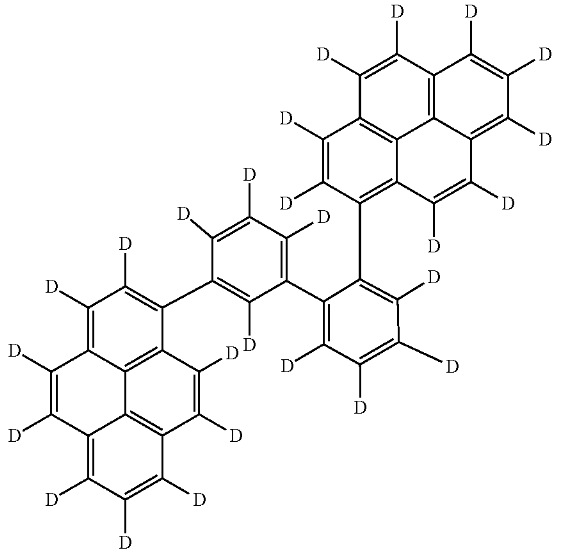
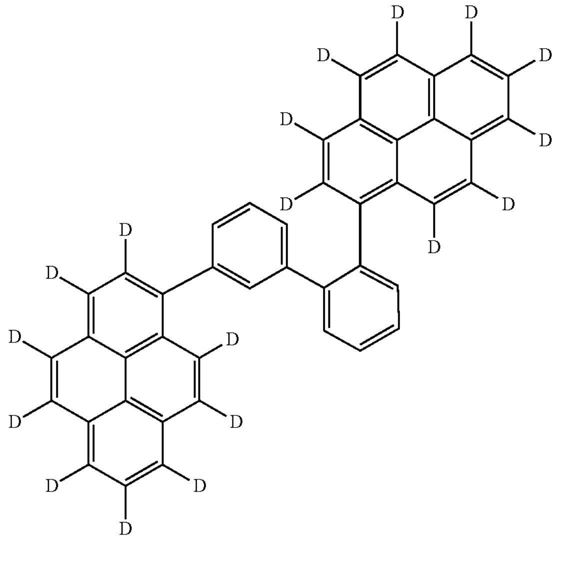
-continued
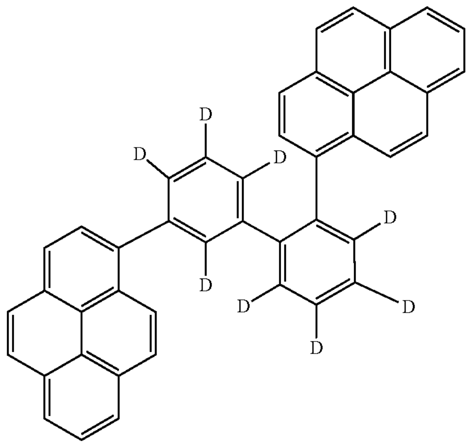
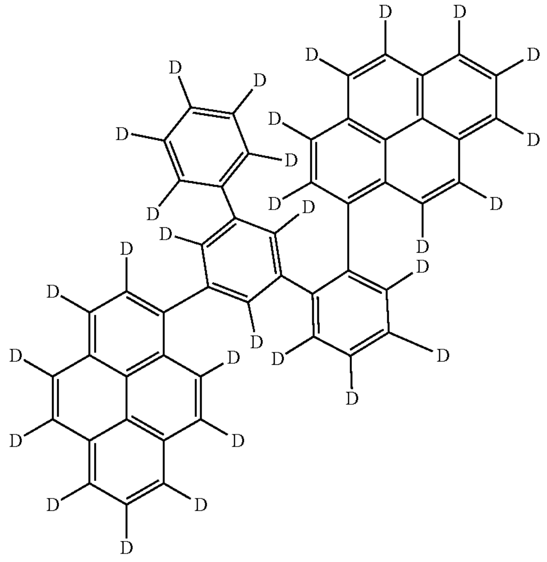
[Formula 155]
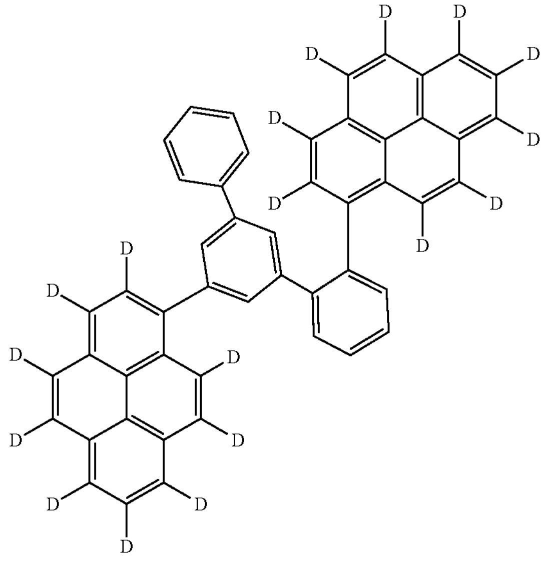

-continued
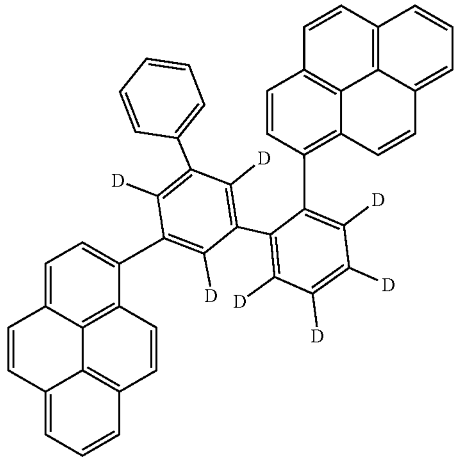
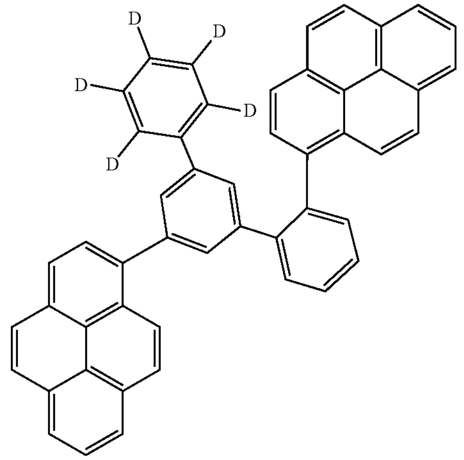
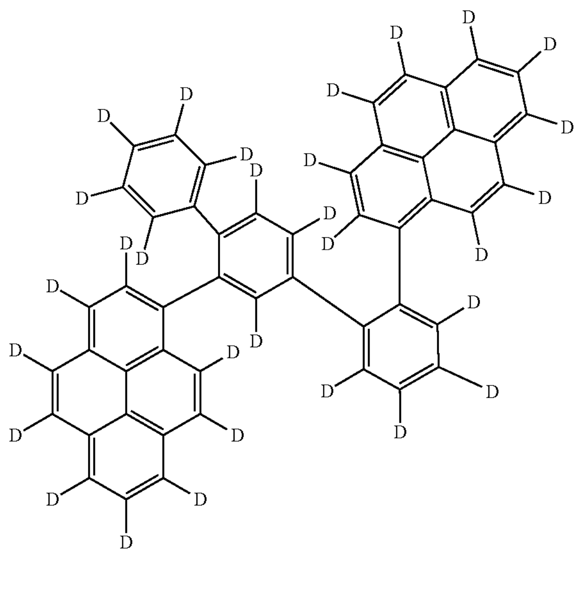
-continued
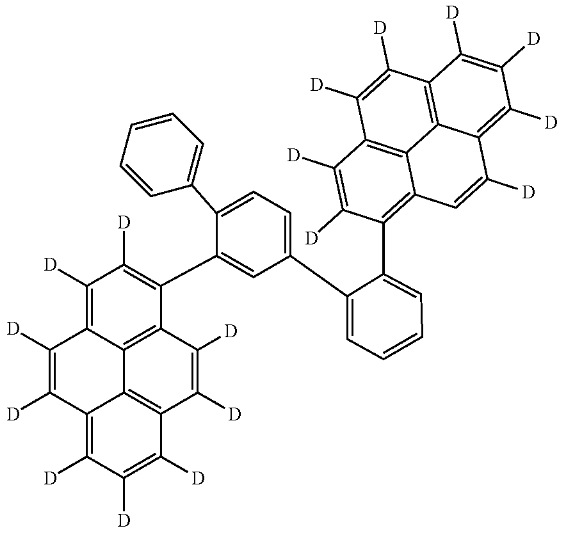
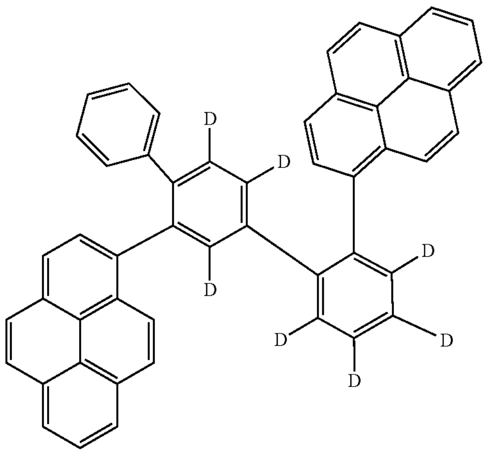
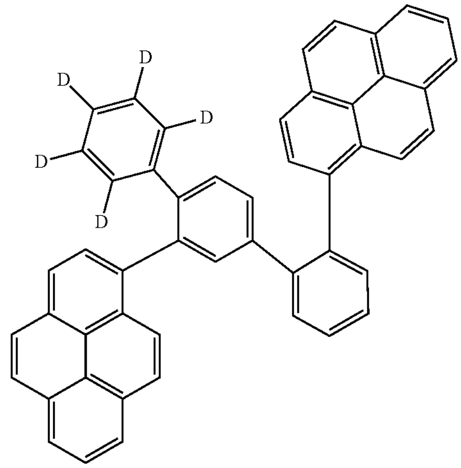

-continued
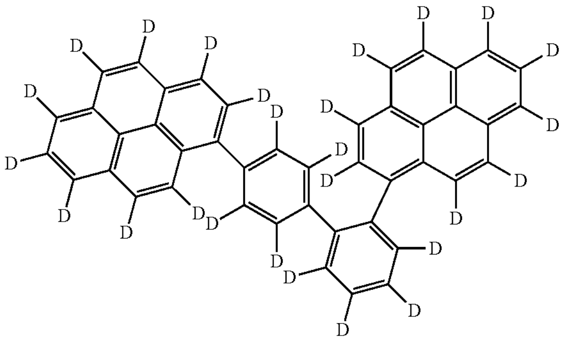
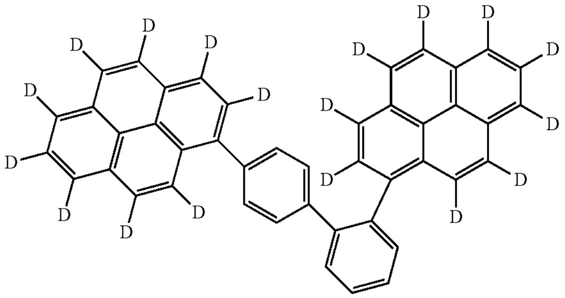
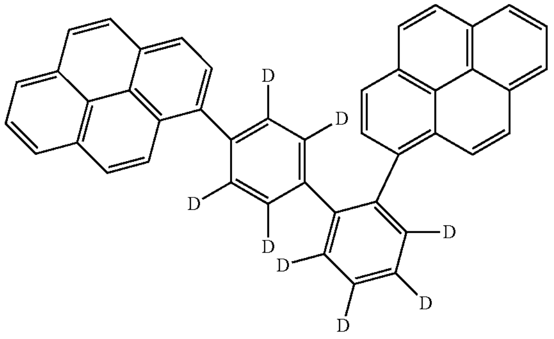
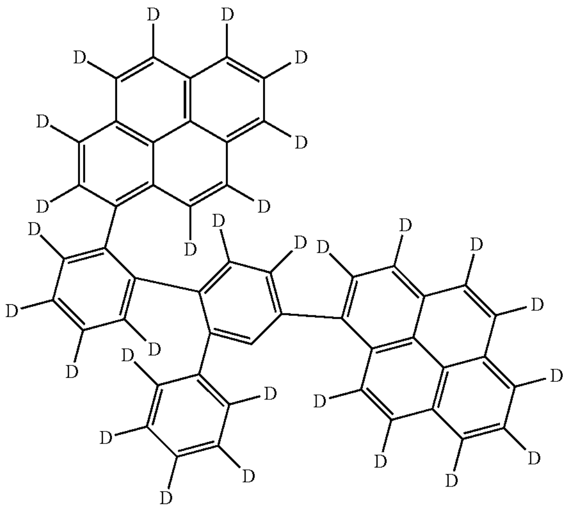
-continued
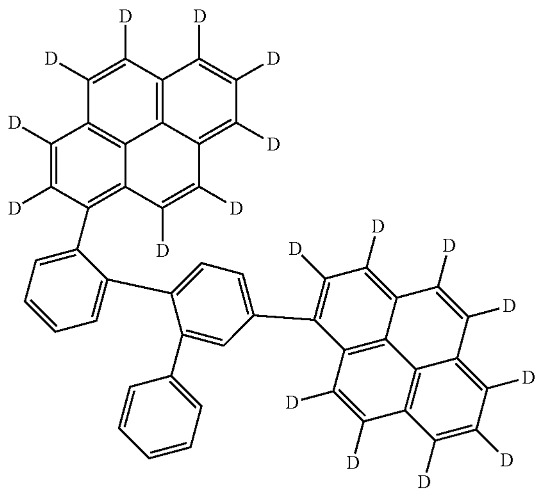
[Formula 156]
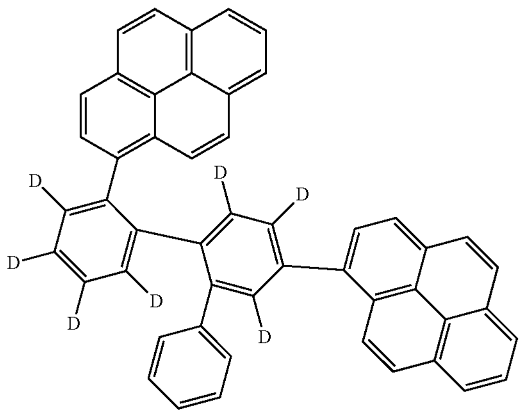
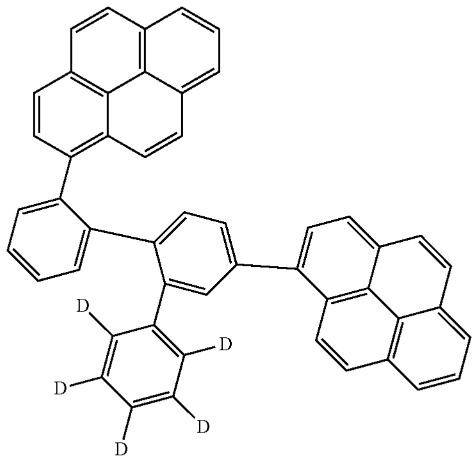

-continued
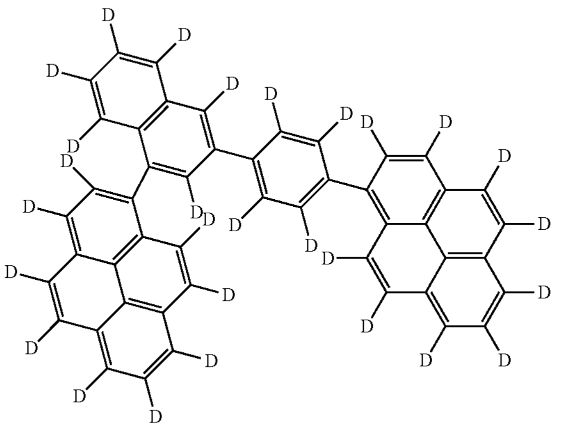
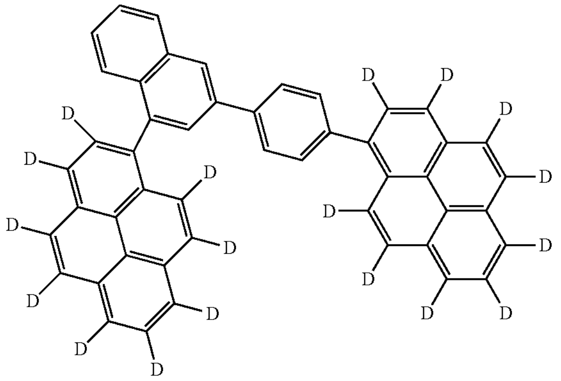
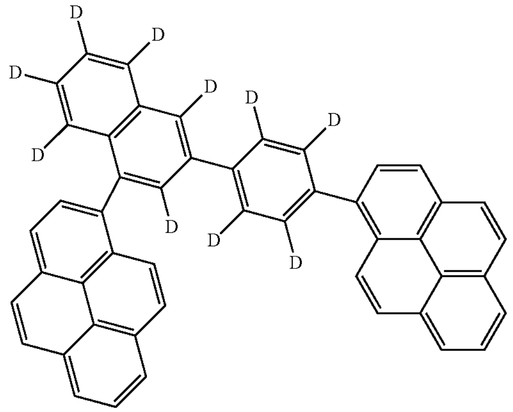
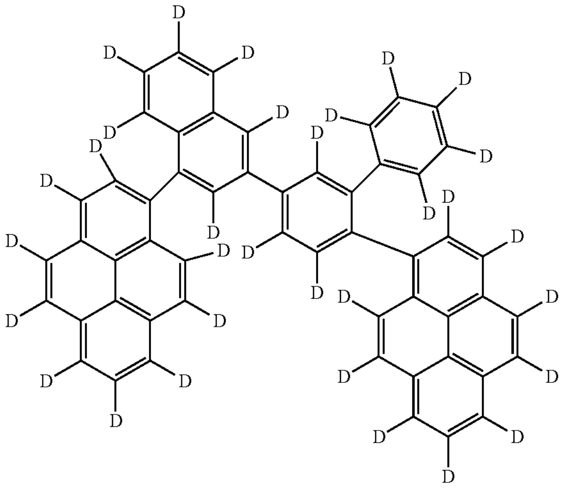
-continued
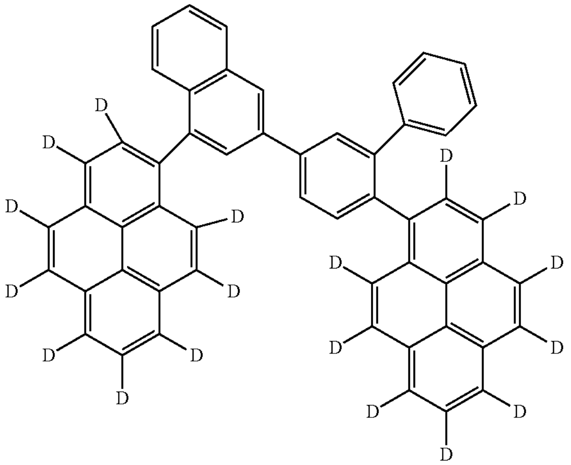
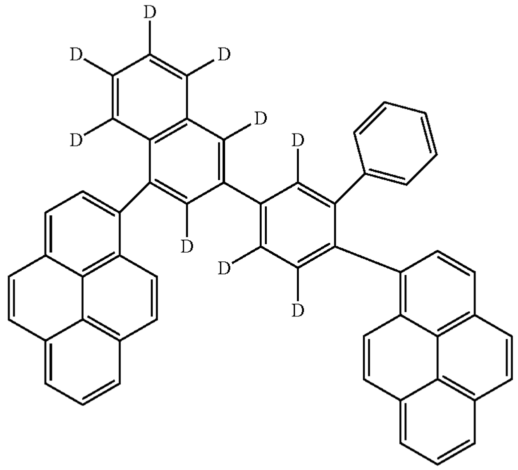
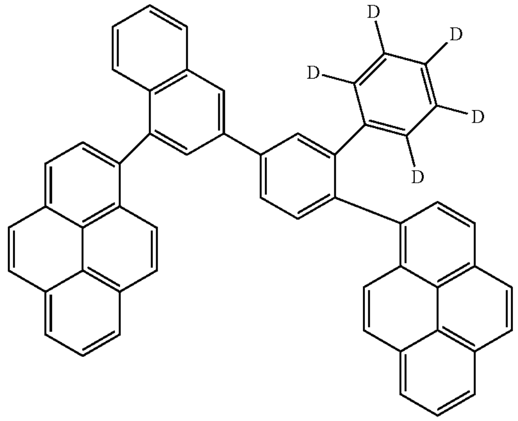

-continued
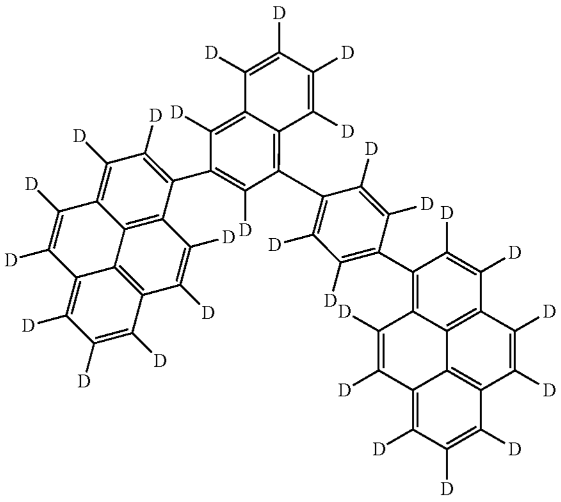
-continued
[Formula 157]
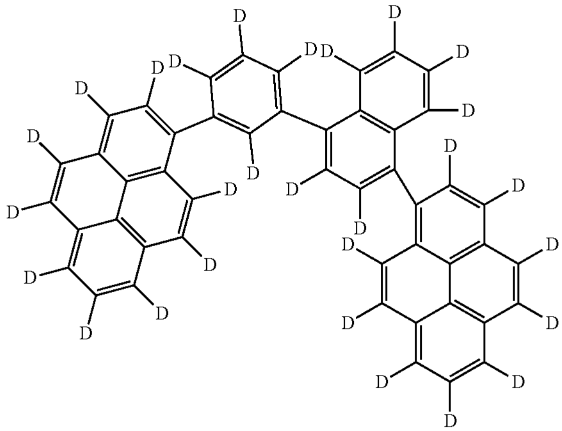
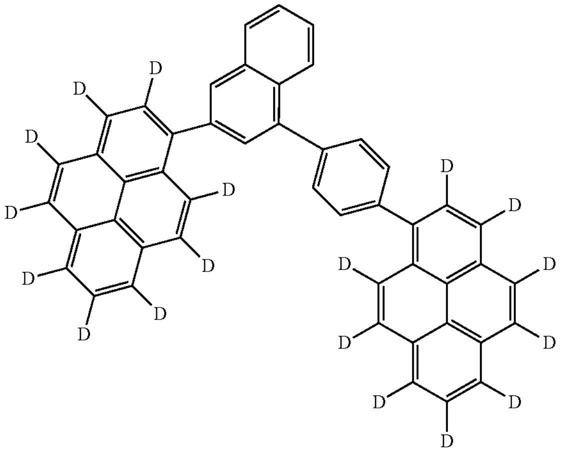
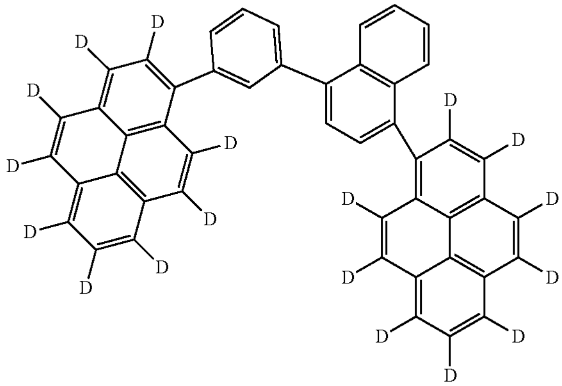
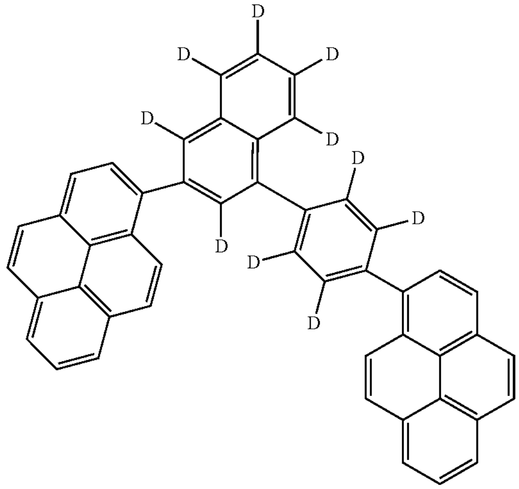
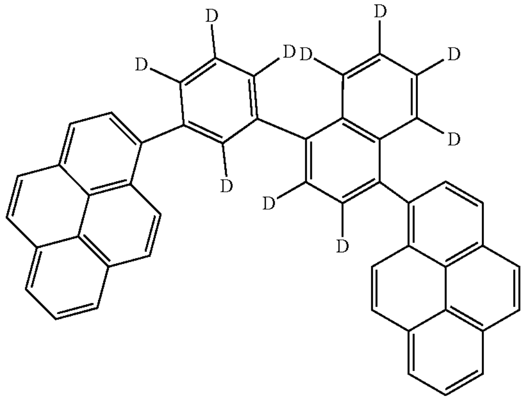

-continued
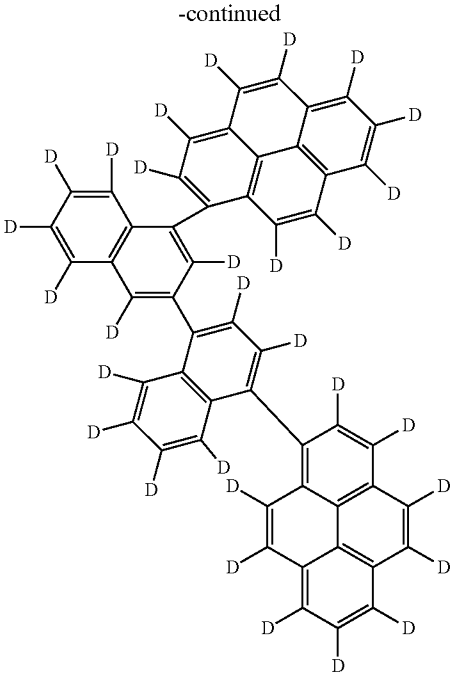
-continued
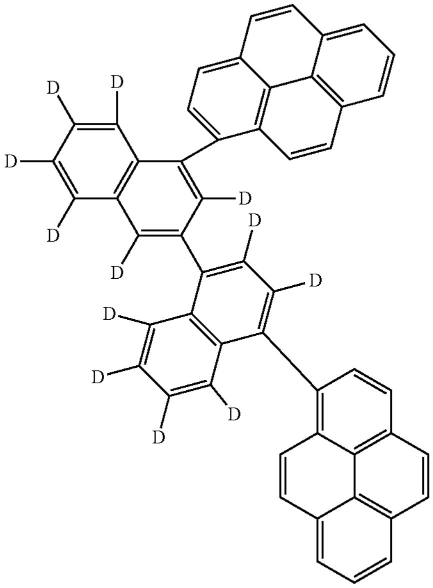
[Formula 158]
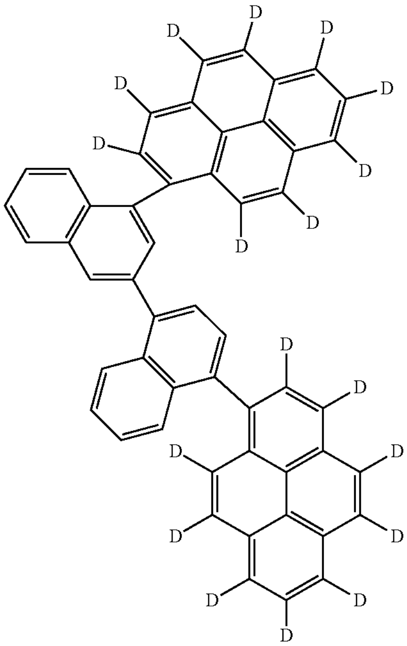
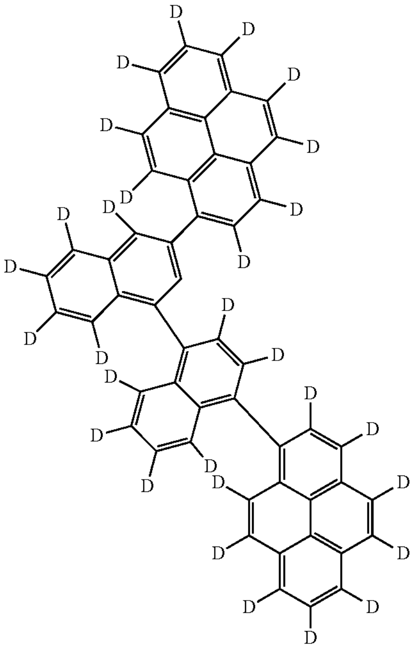

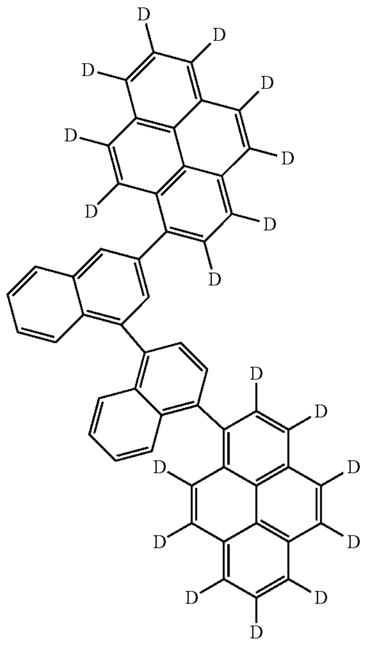
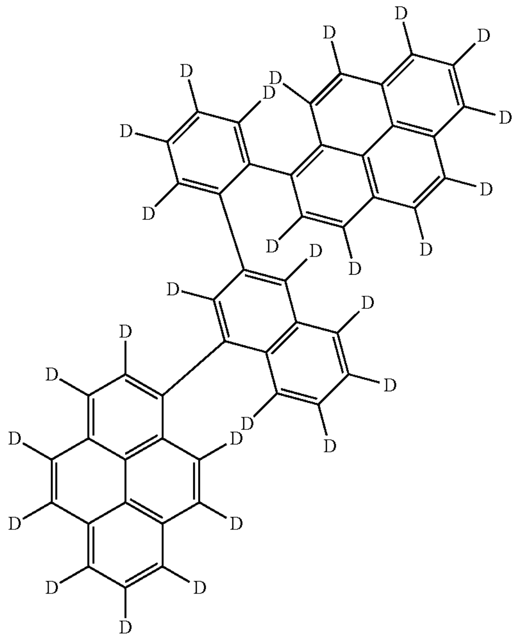
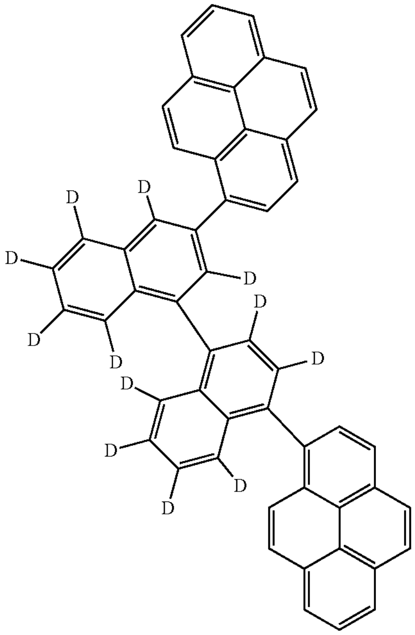
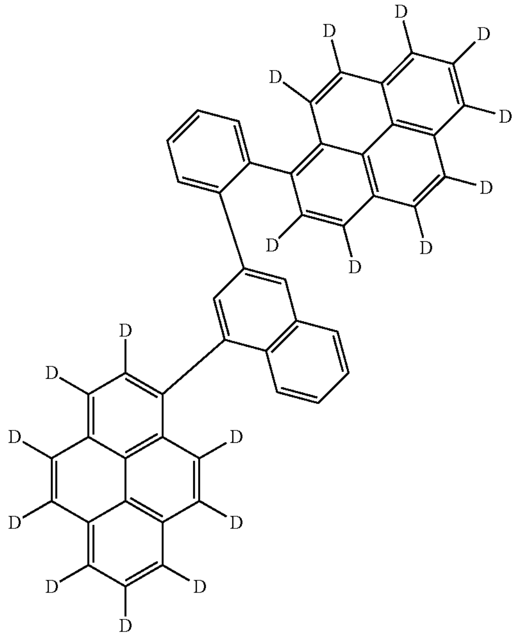

-continued
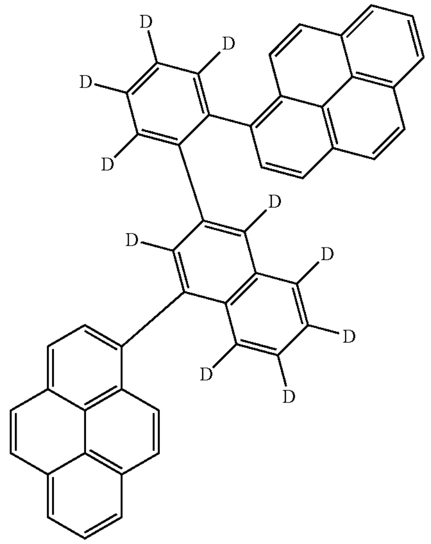
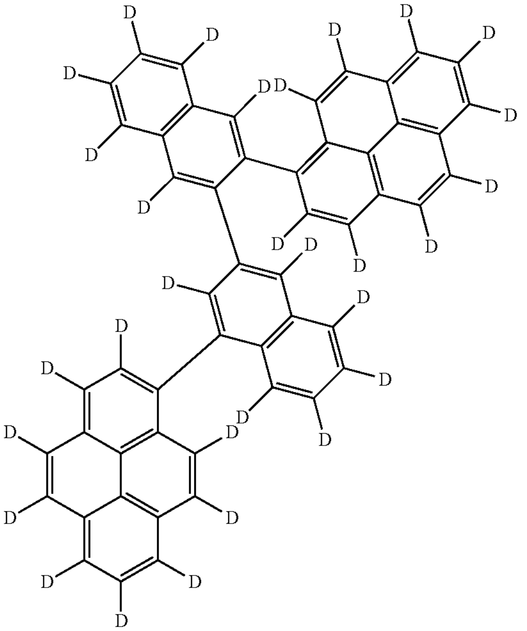
-continued
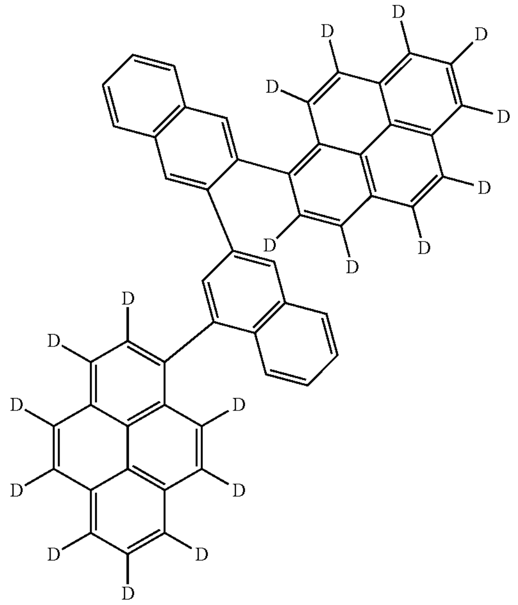
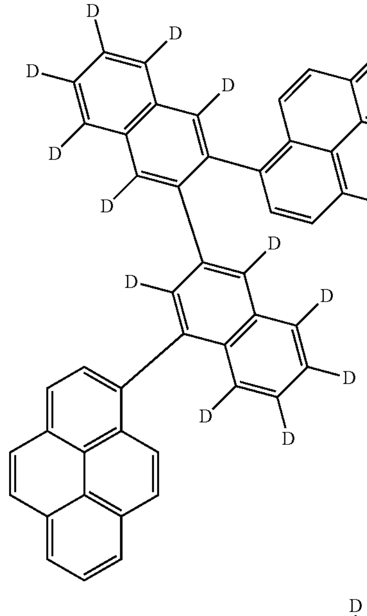
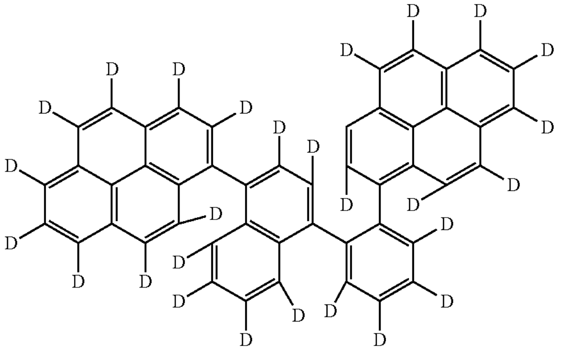

[Formula 159]
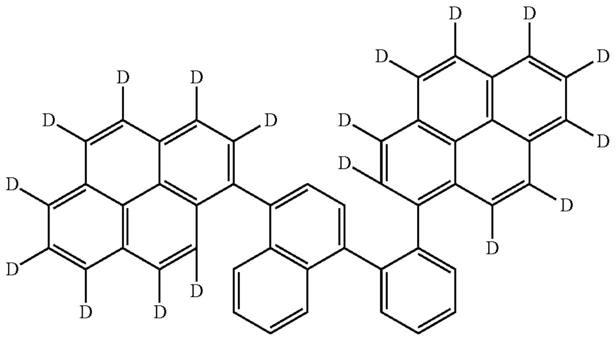
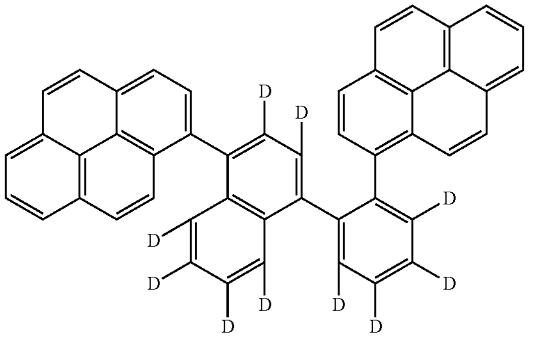
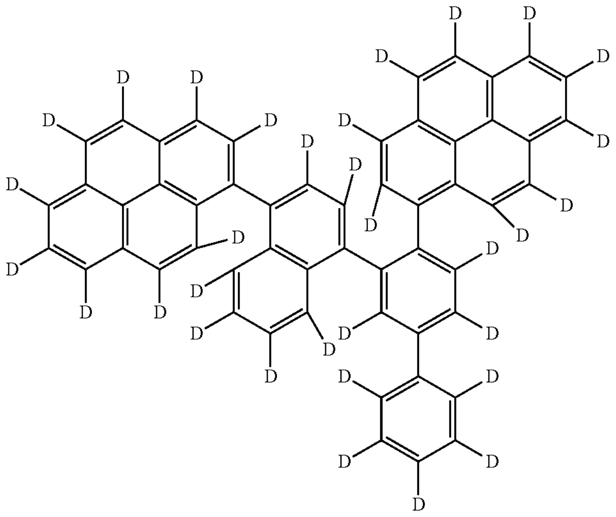
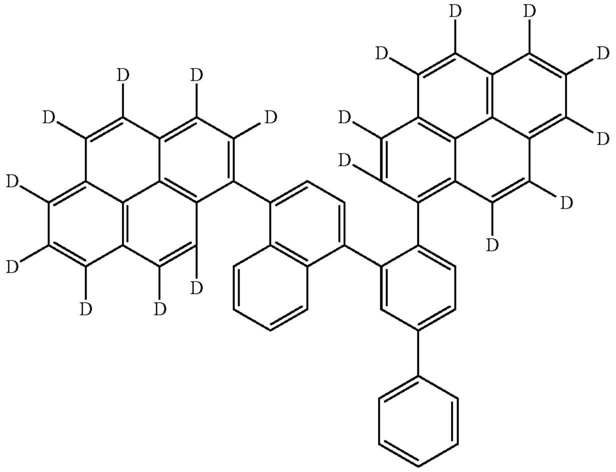

-continued
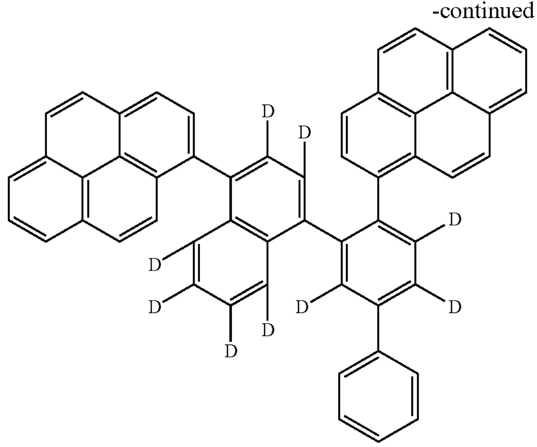
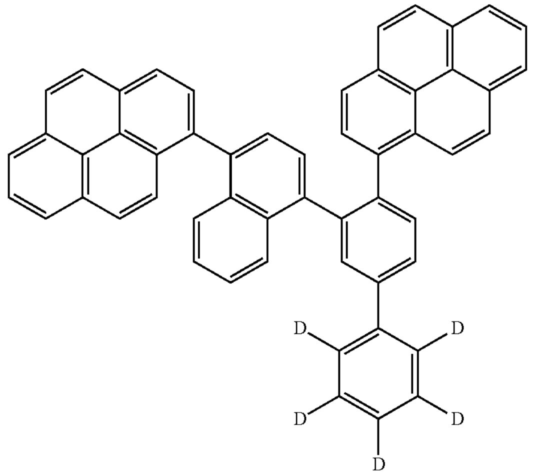
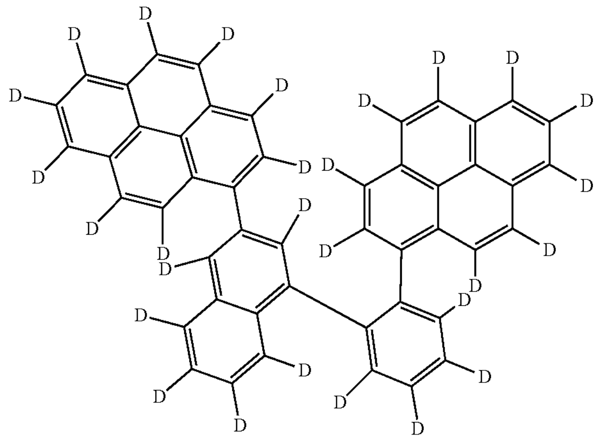
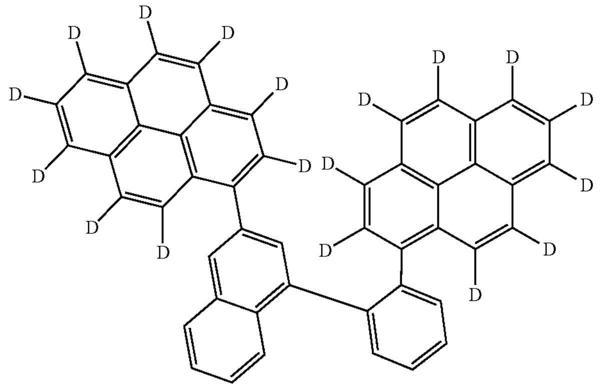

-continued
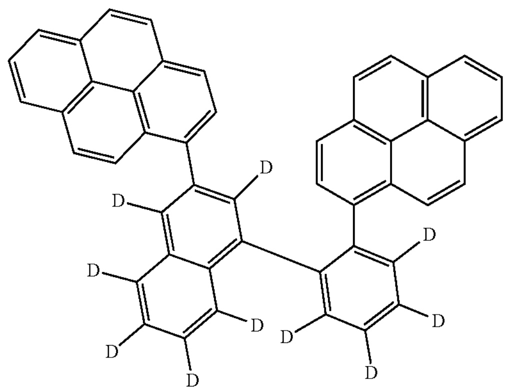
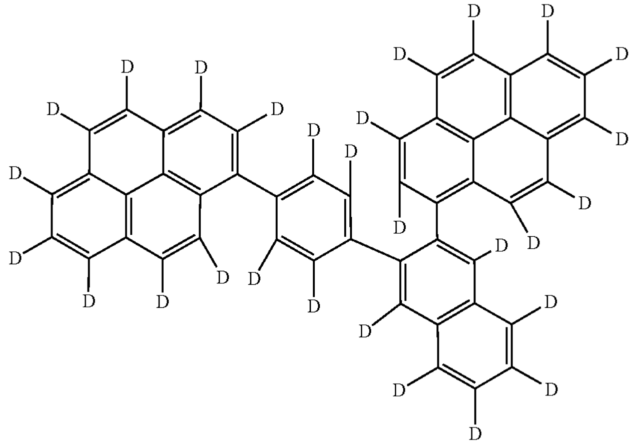
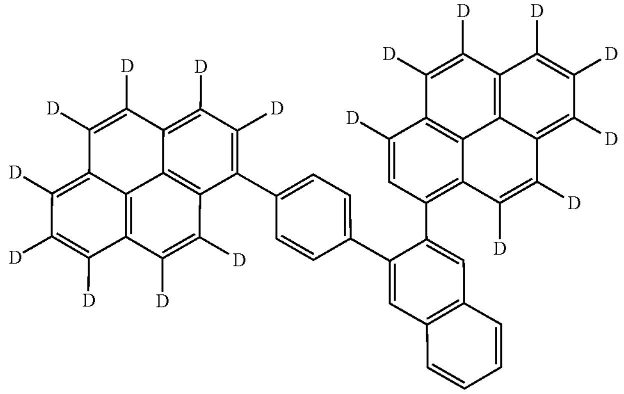
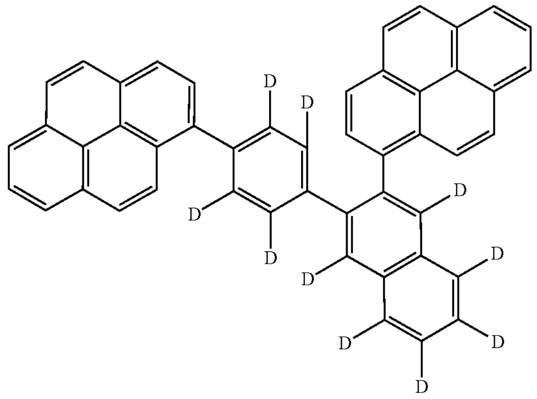

-continued
[Formula 160]
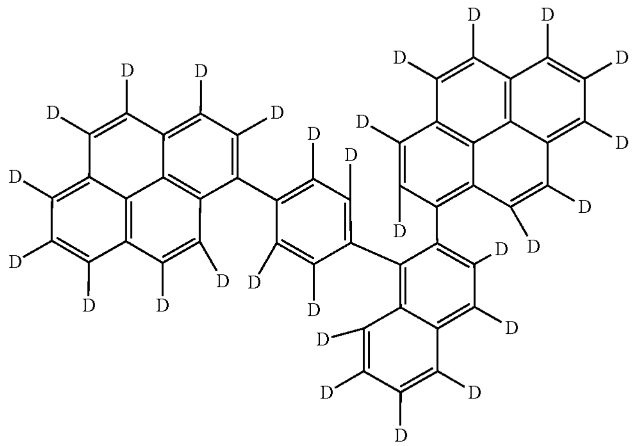
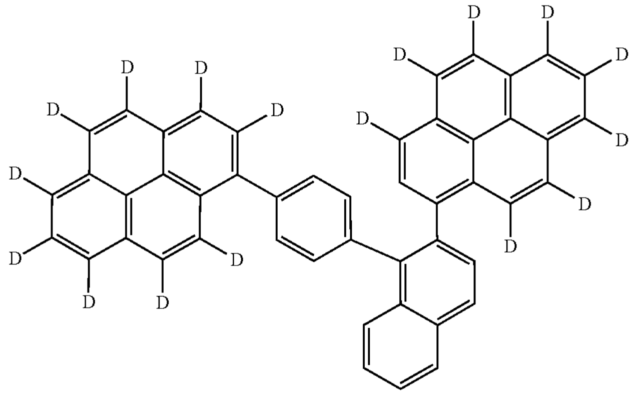
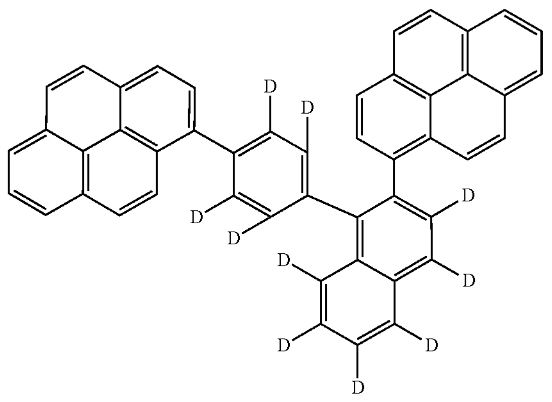

-continued
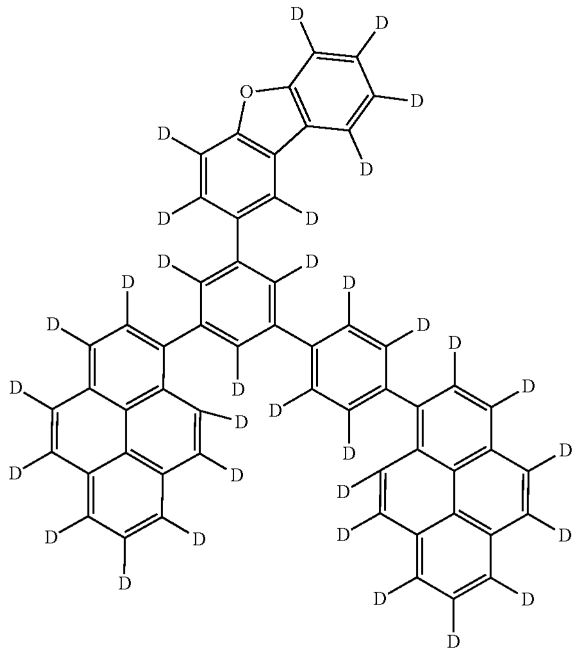
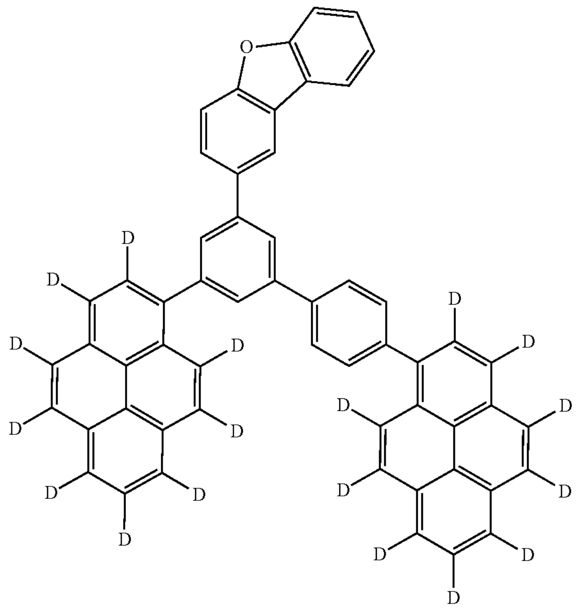

-continued
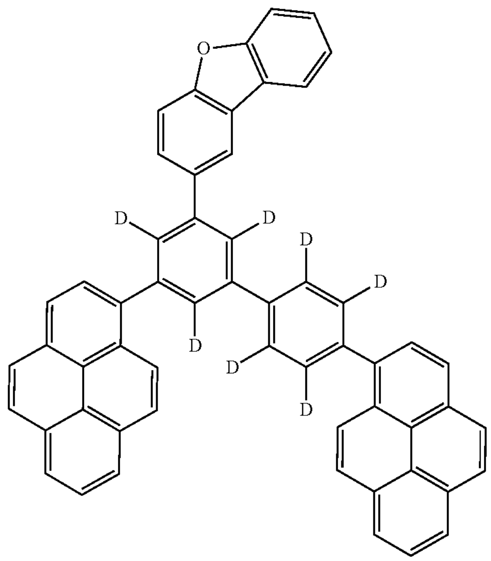
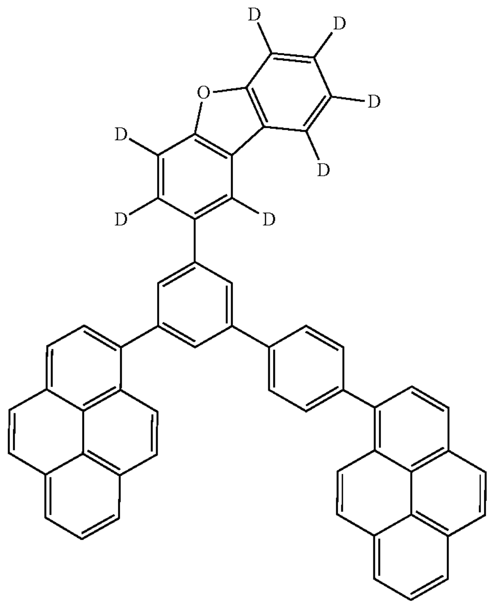

-continued
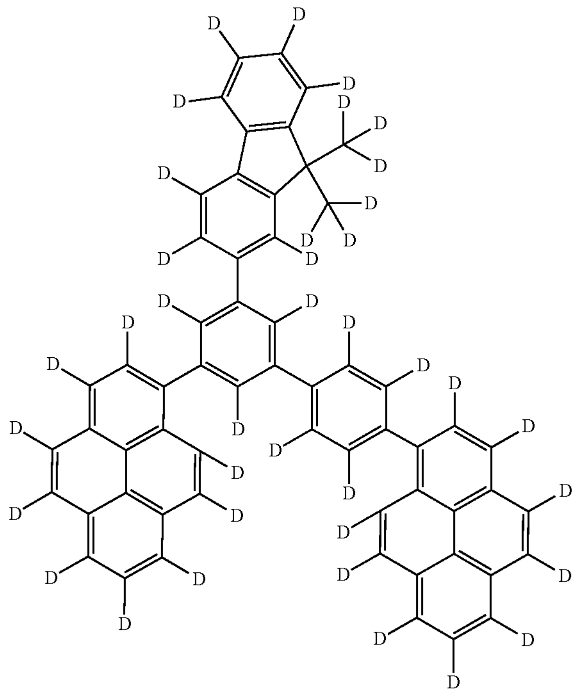
[Formula 161]
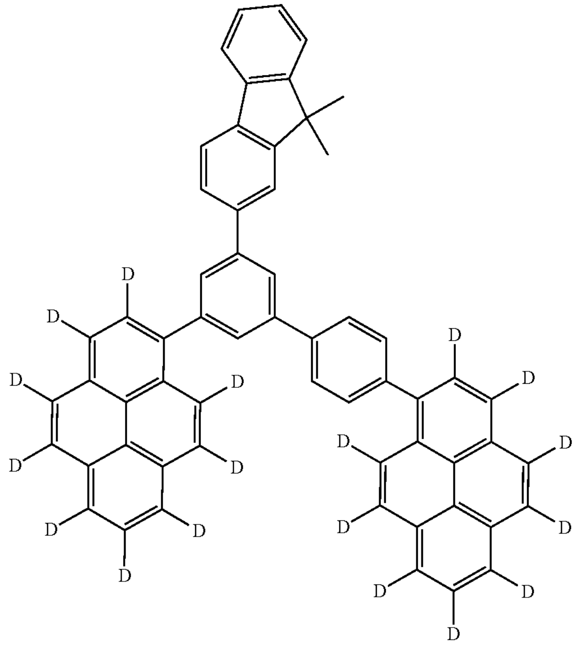

-continued
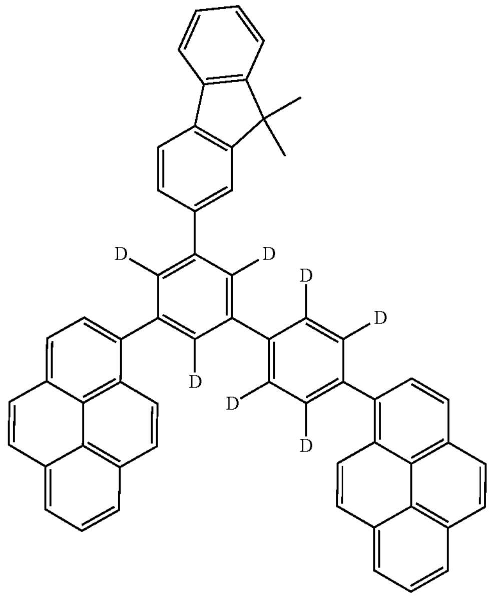
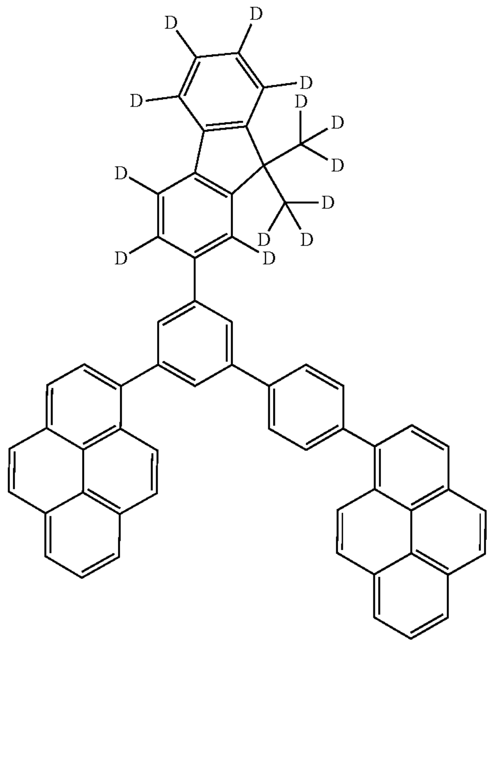

-continued
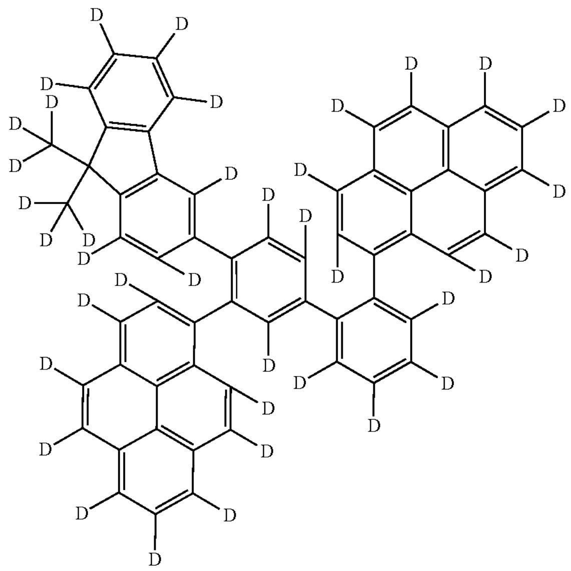
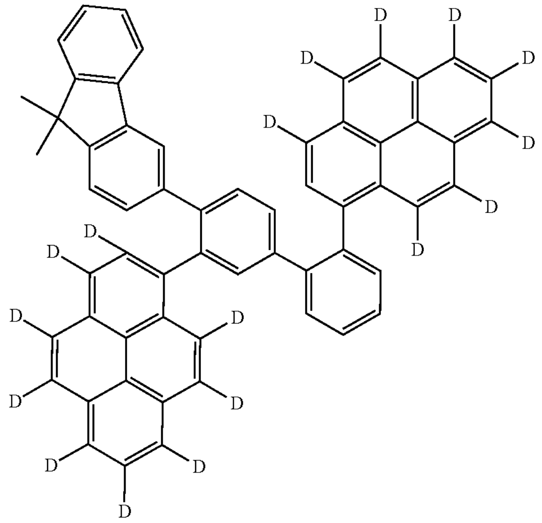
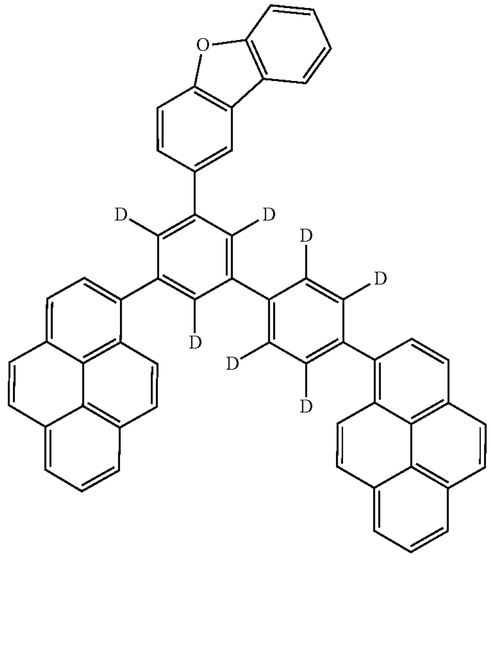

-continued
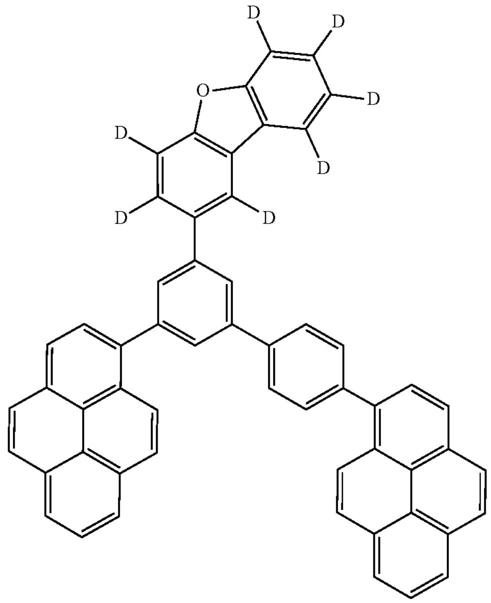
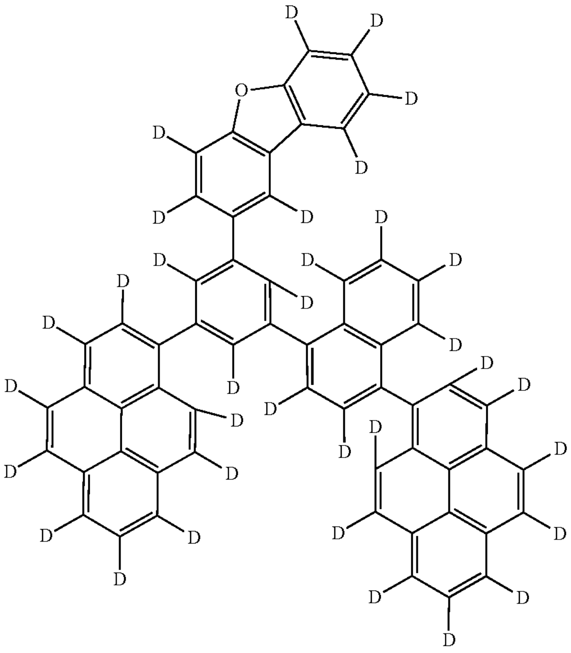

-continued
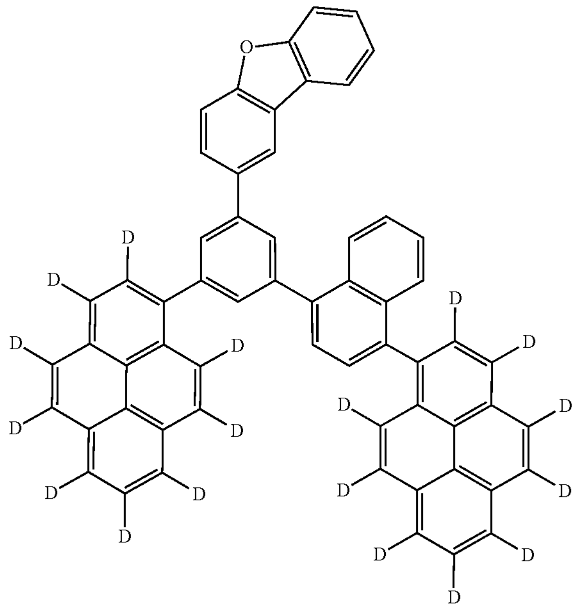
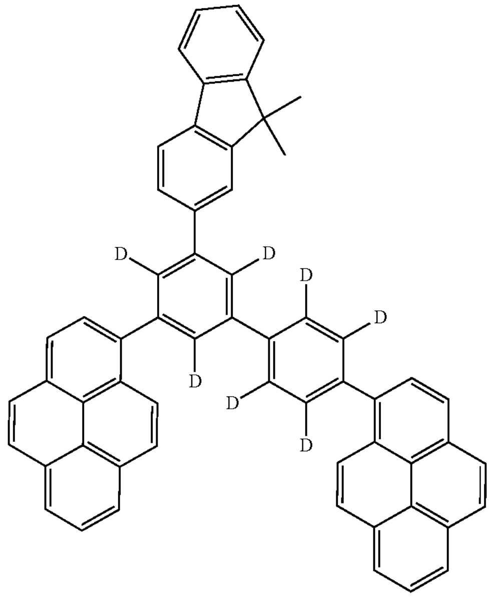

-continued
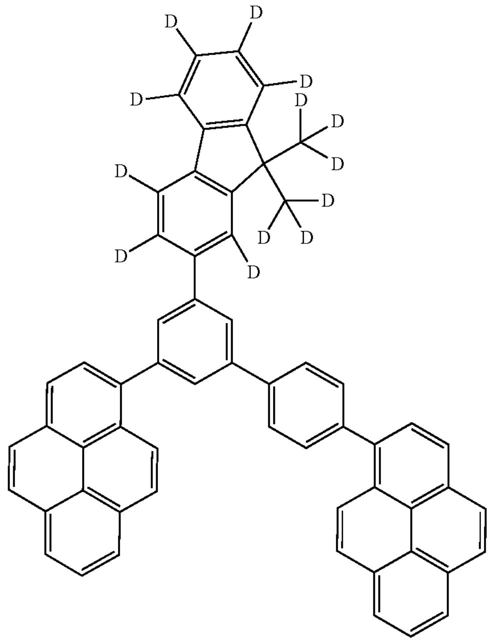
[Formula 162]
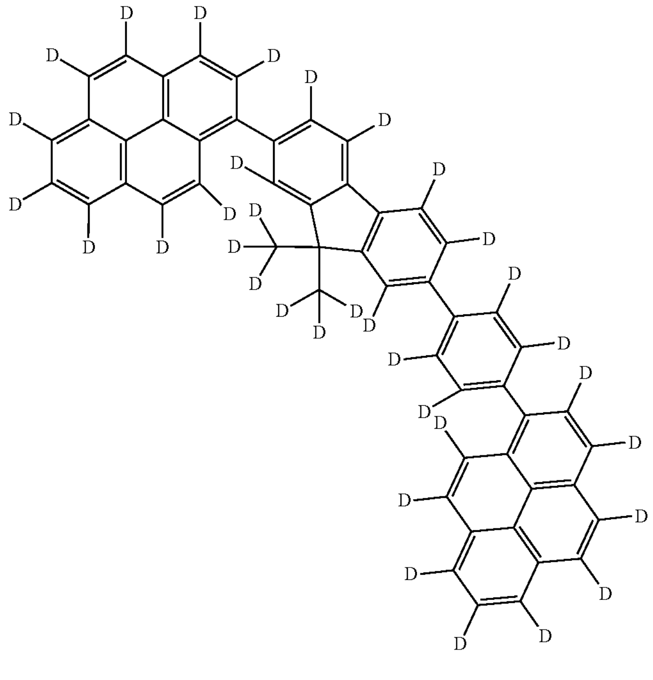

-continued
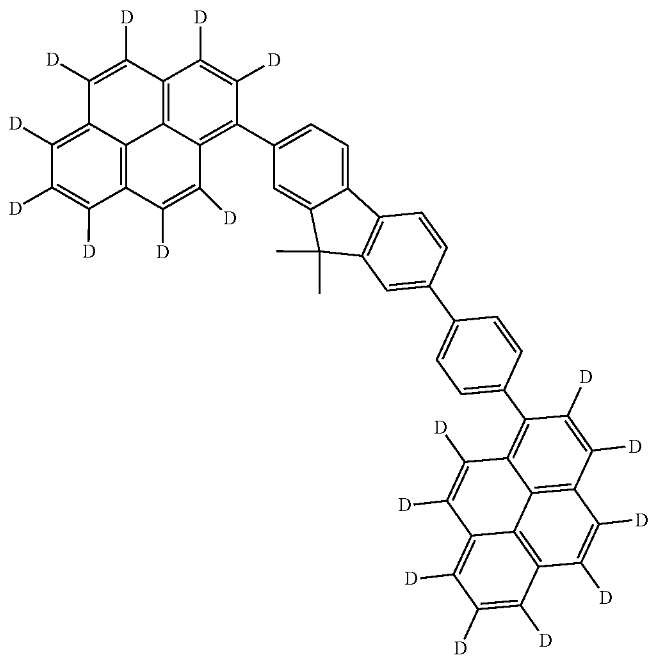
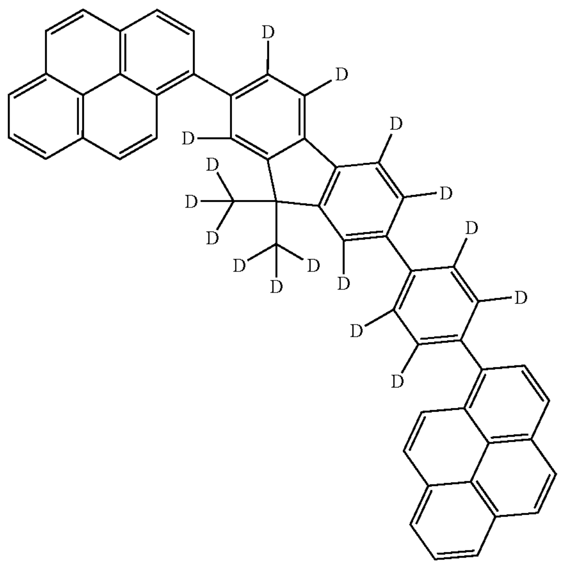

-continued
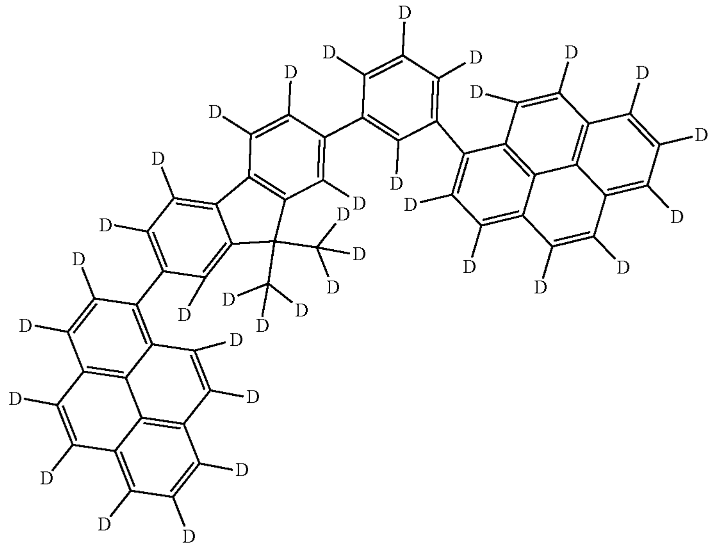
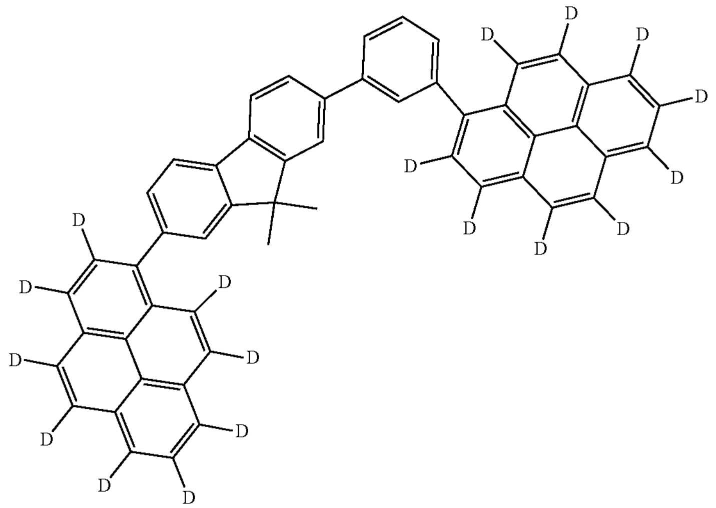
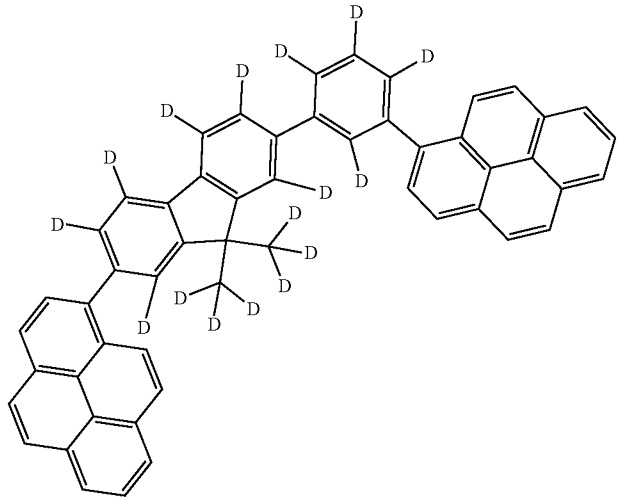

-continued
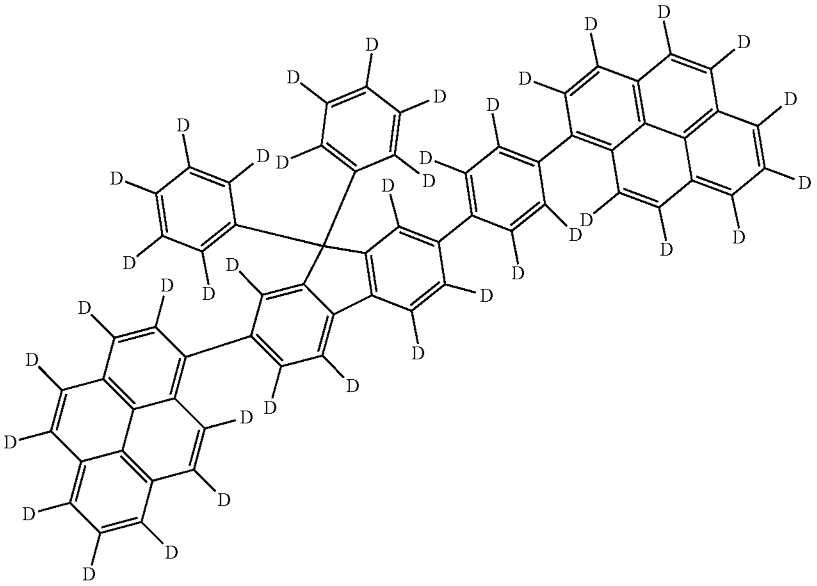
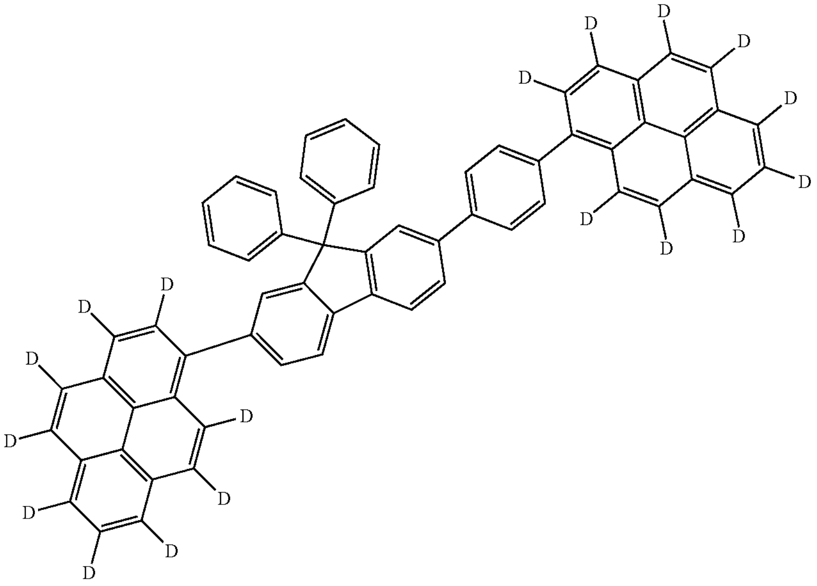
[Formula 163]
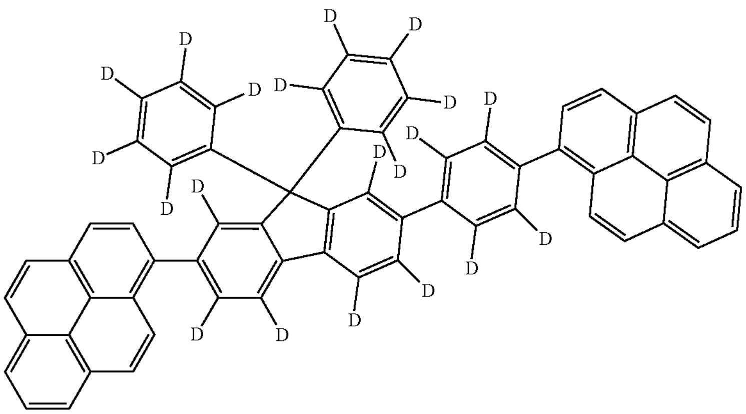

-continued
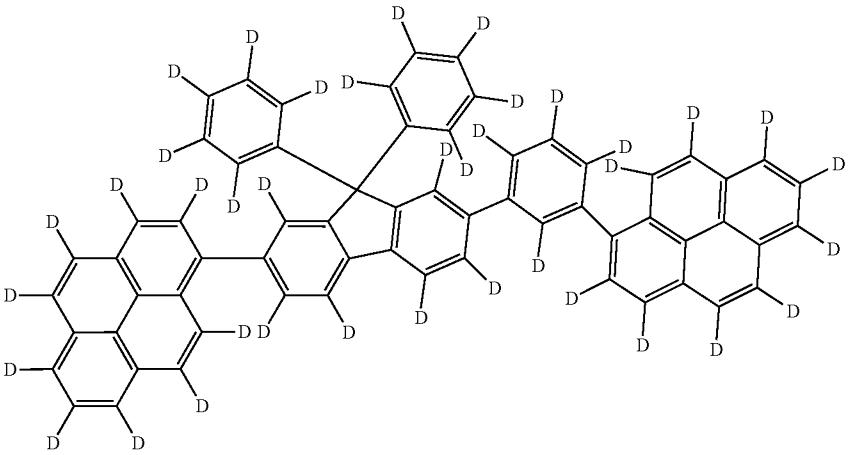
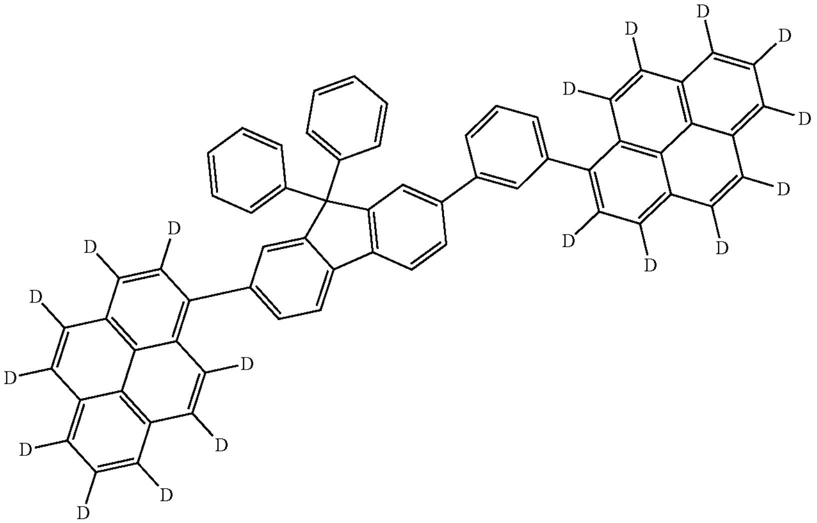
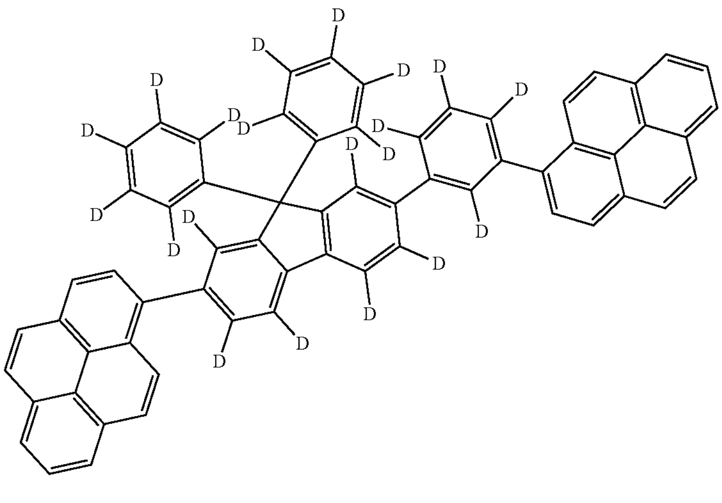

-continued
[Formula 164]
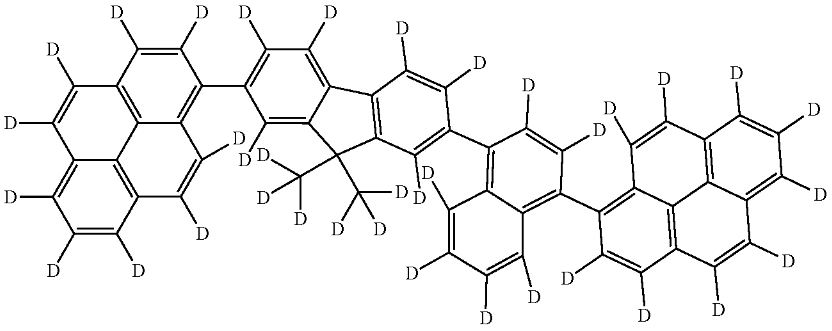
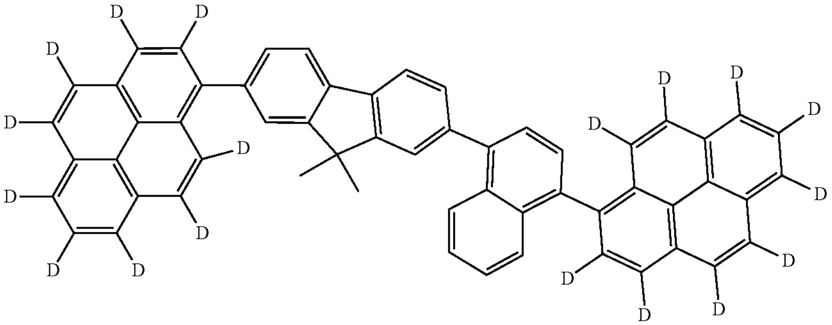
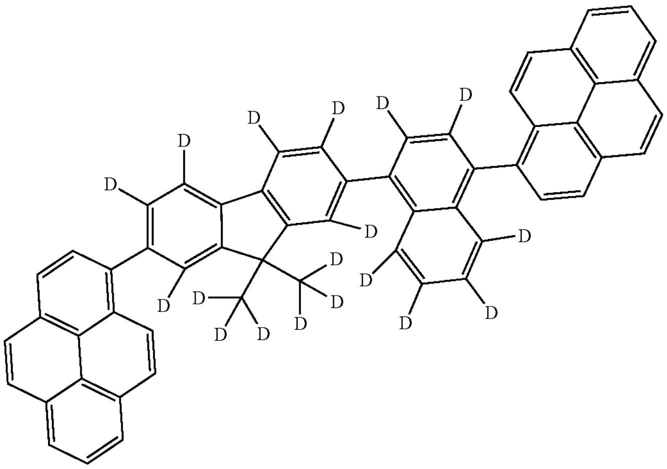
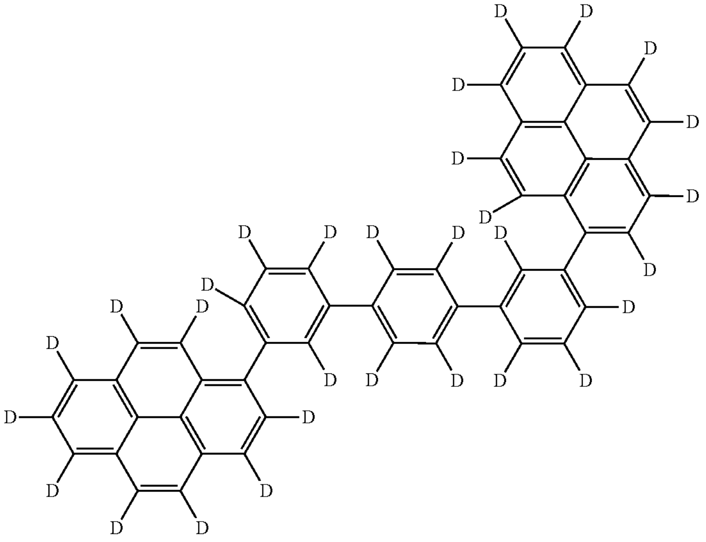

-continued
[Formula 165]
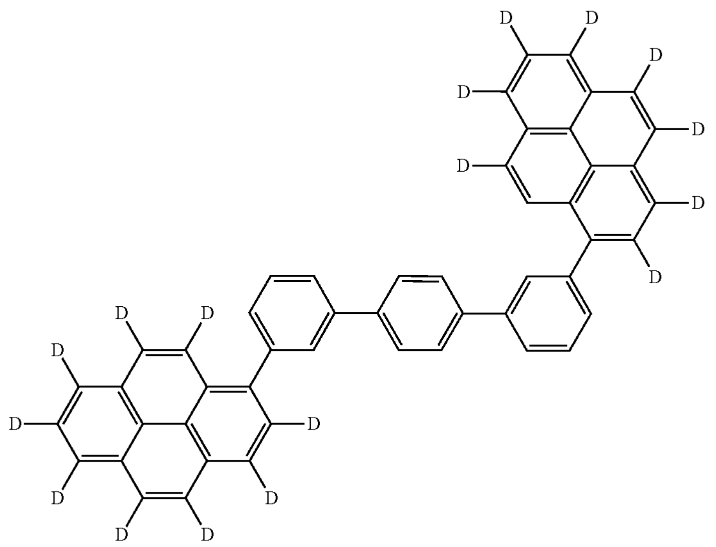
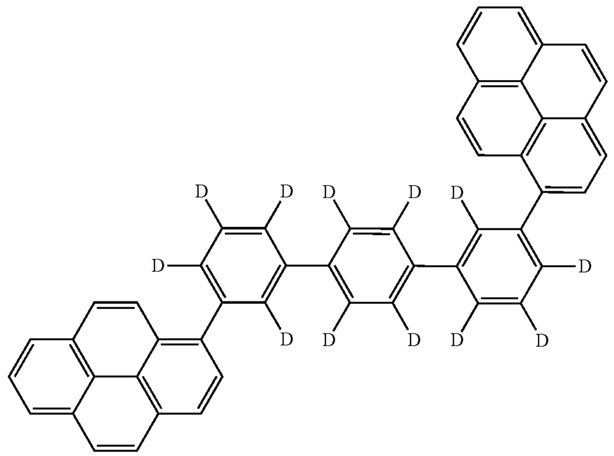
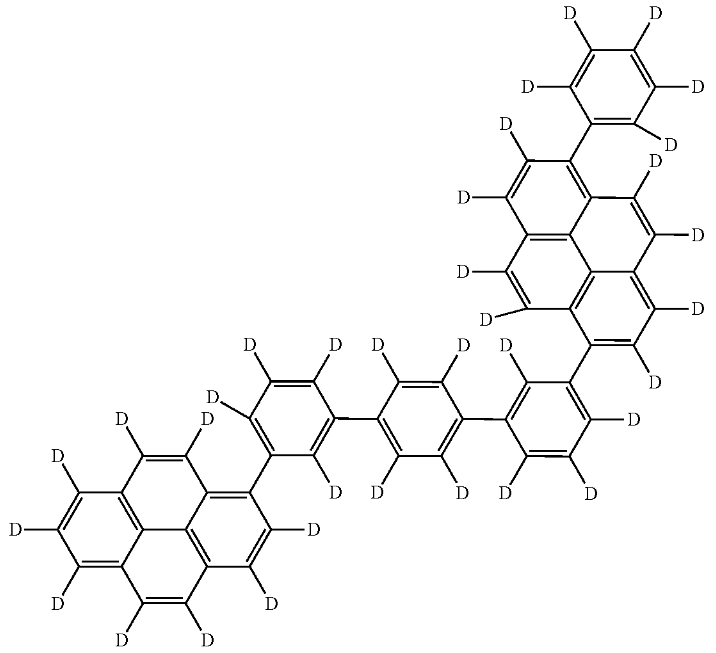

-continued
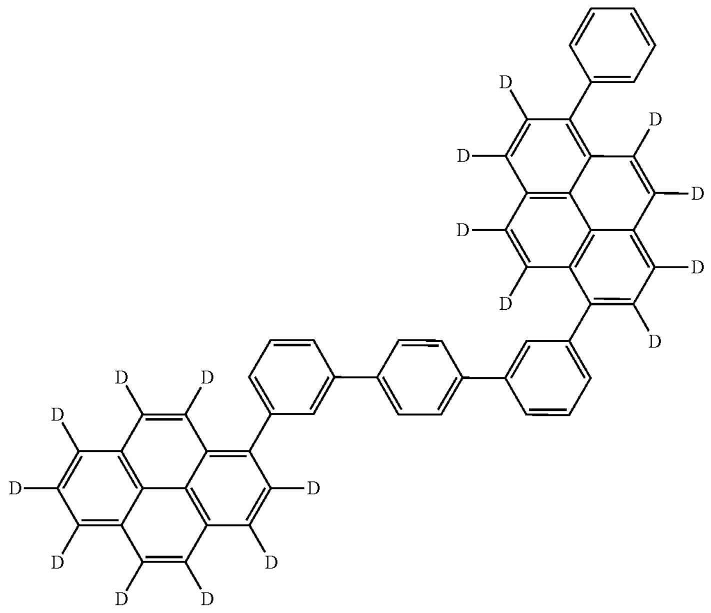
[Formula 166]
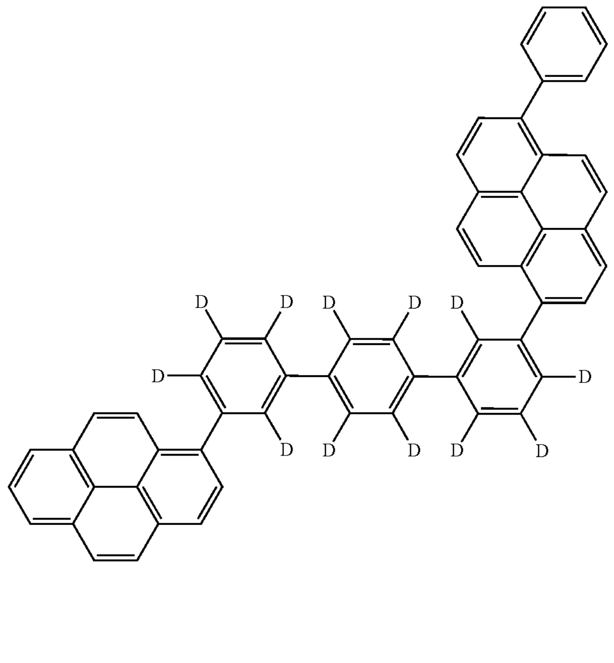

-continued
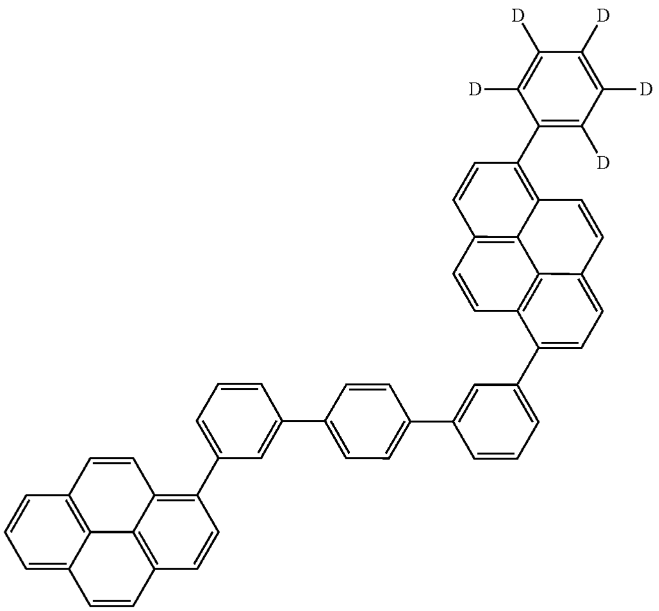
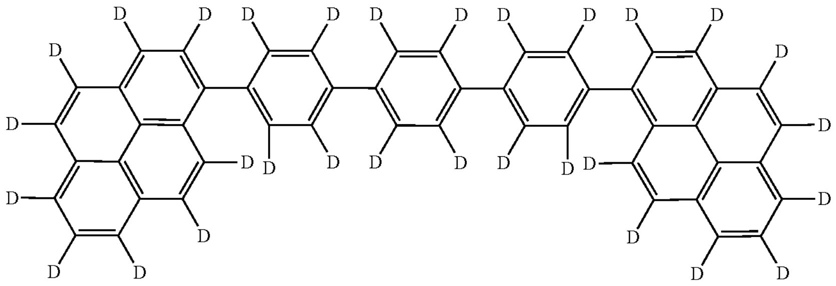
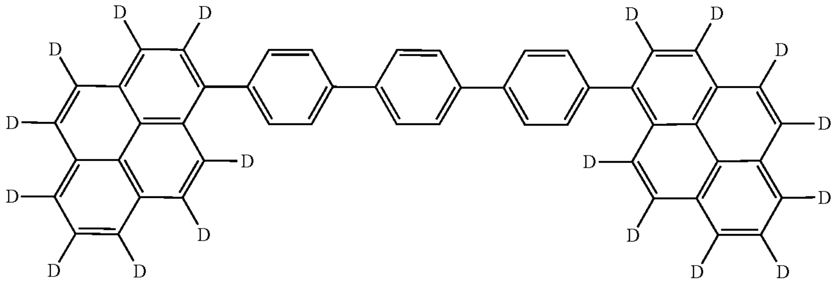
[Formula 167]
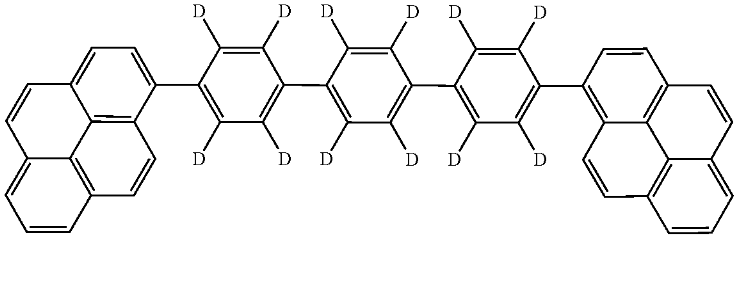

-continued
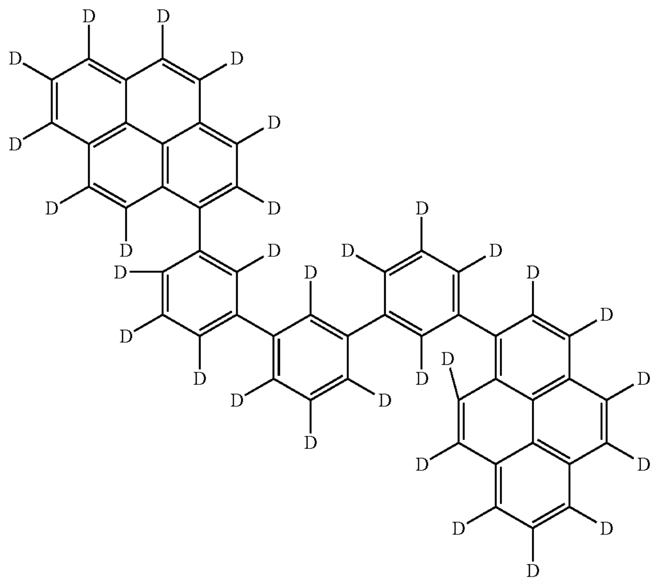
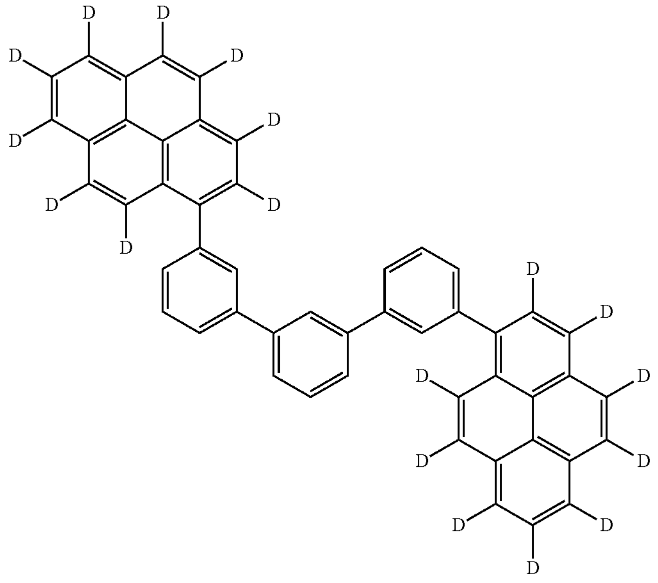
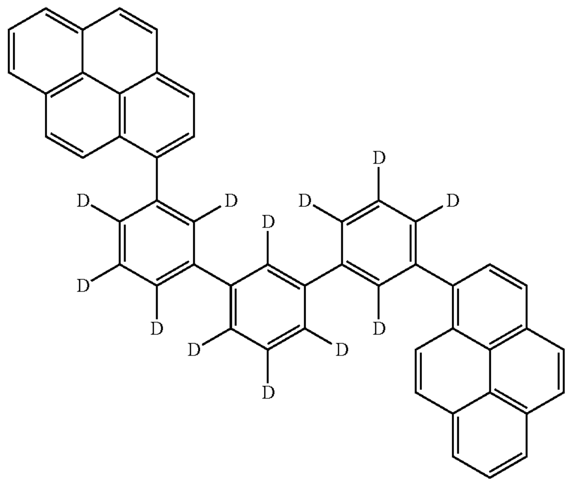

-continued
[Formula 168]
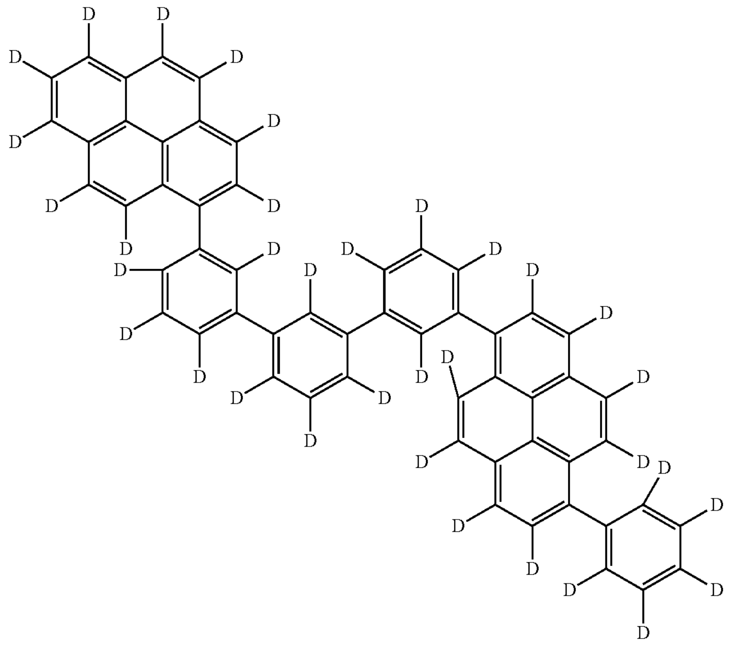
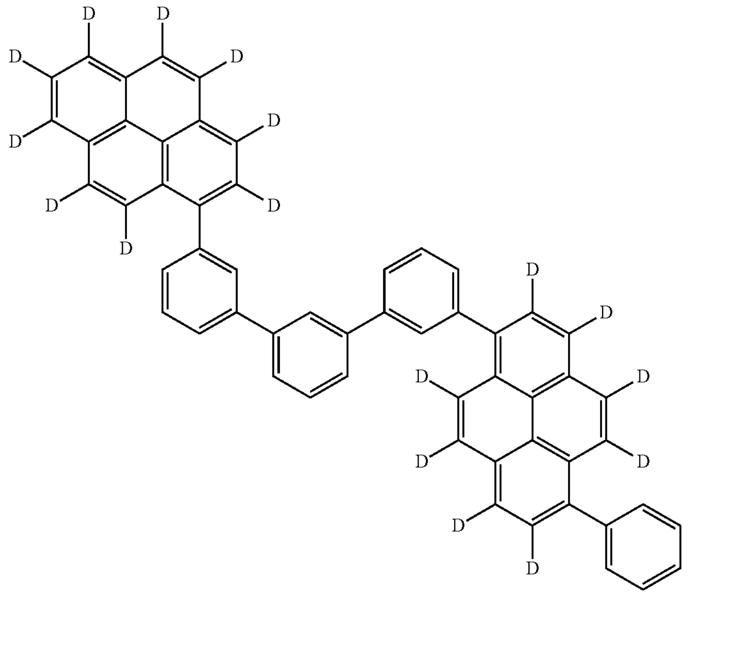

-continued
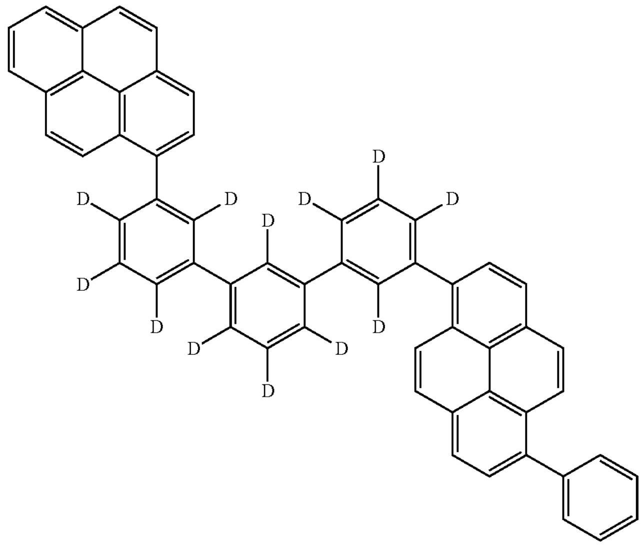
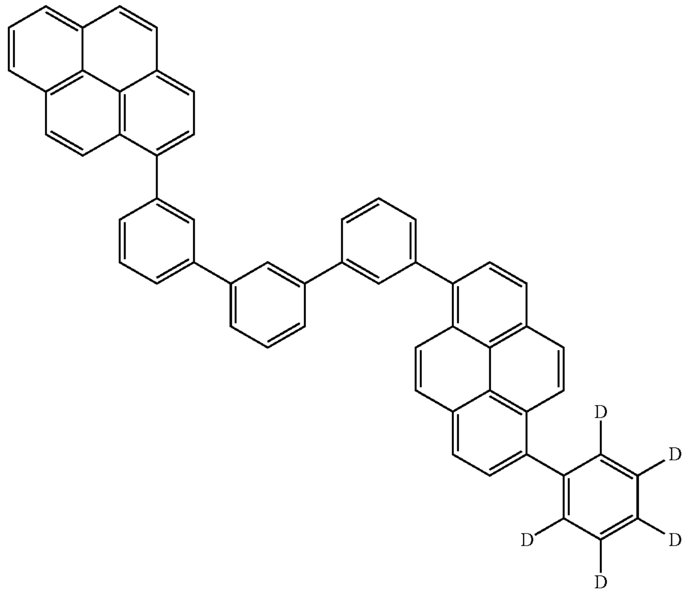
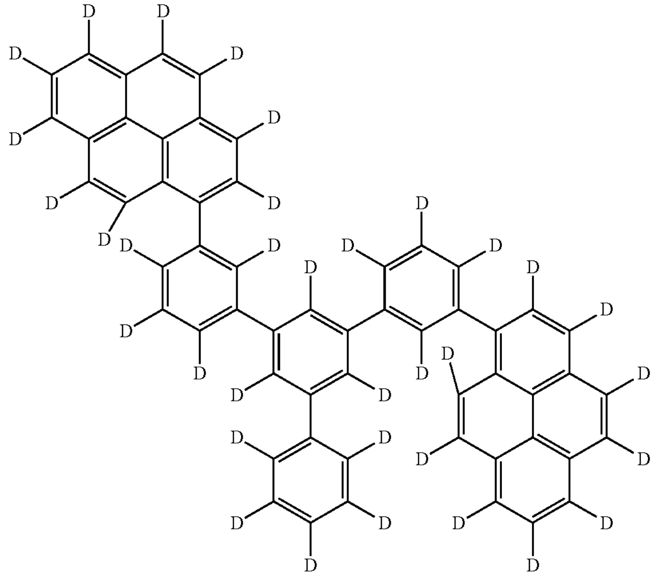

-continued
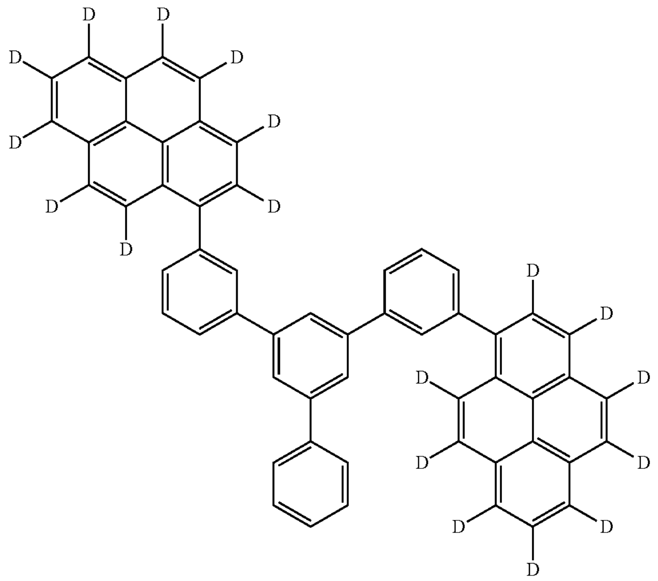
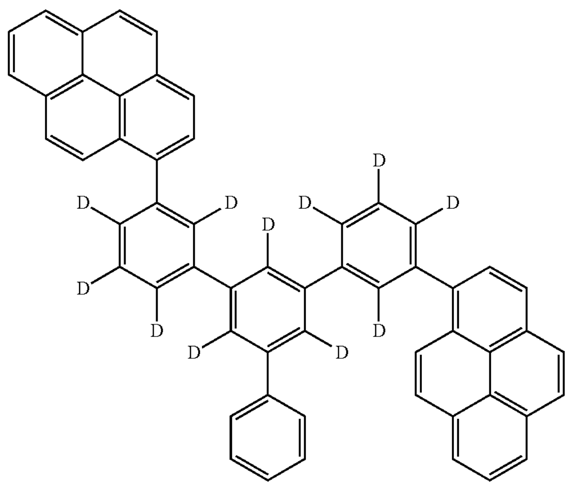
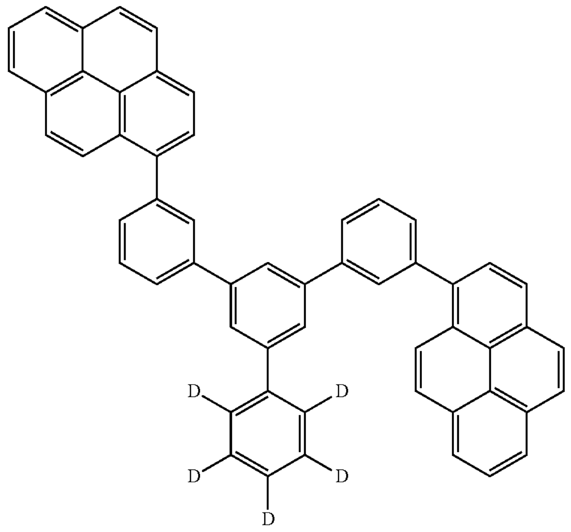

-continued
[Formula 169]
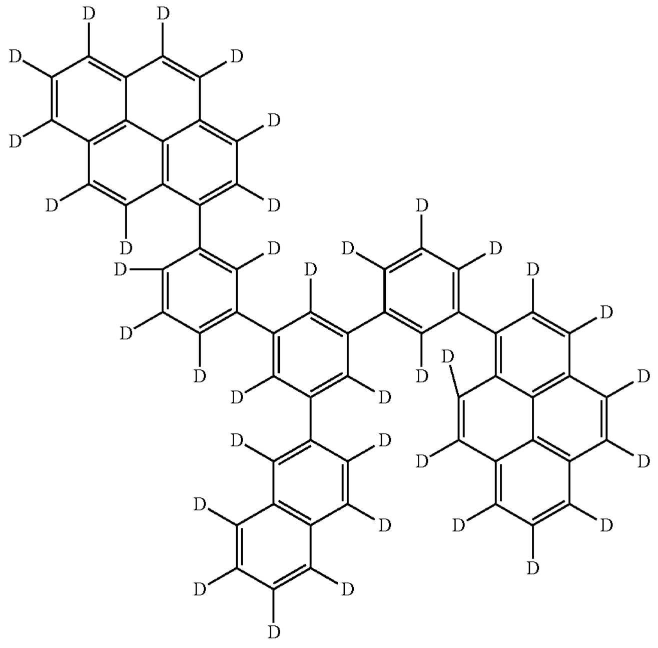
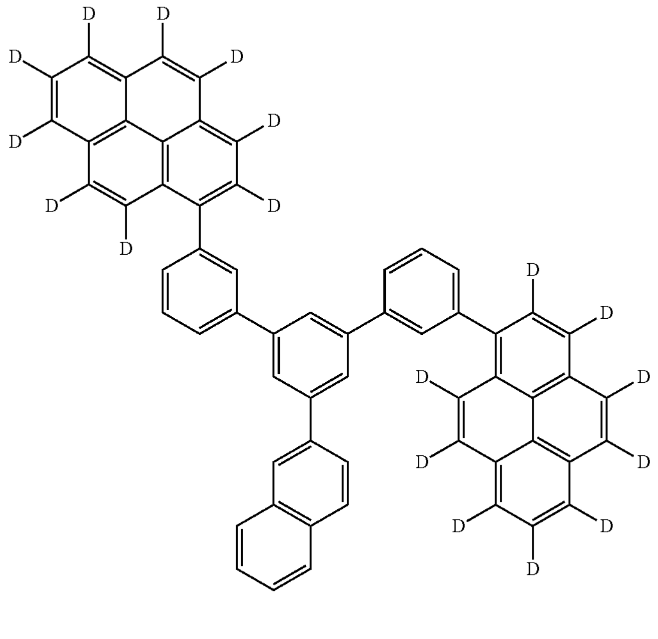

-continued
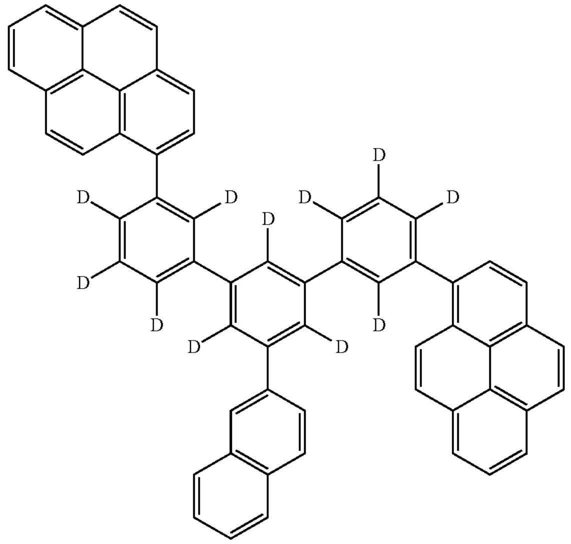
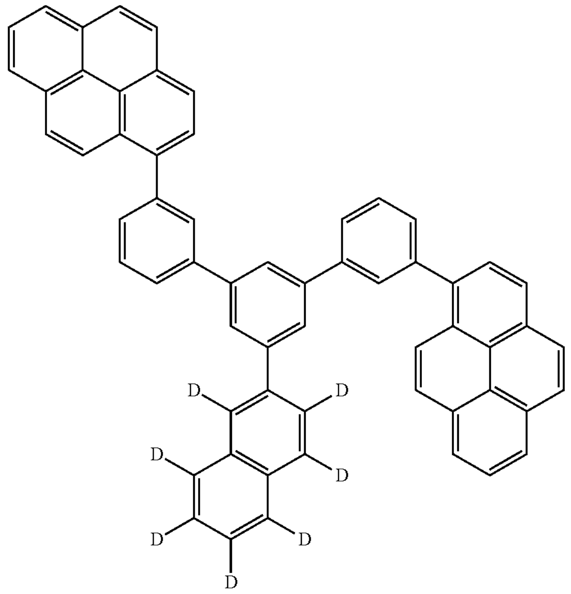
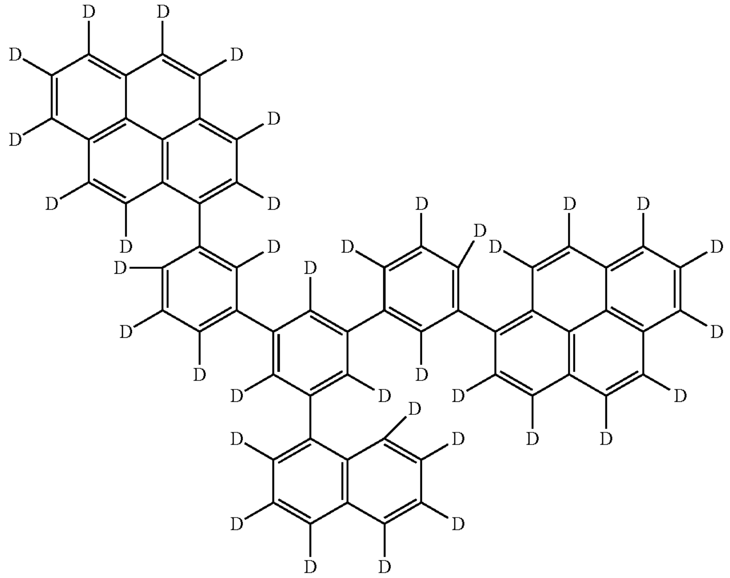

-continued
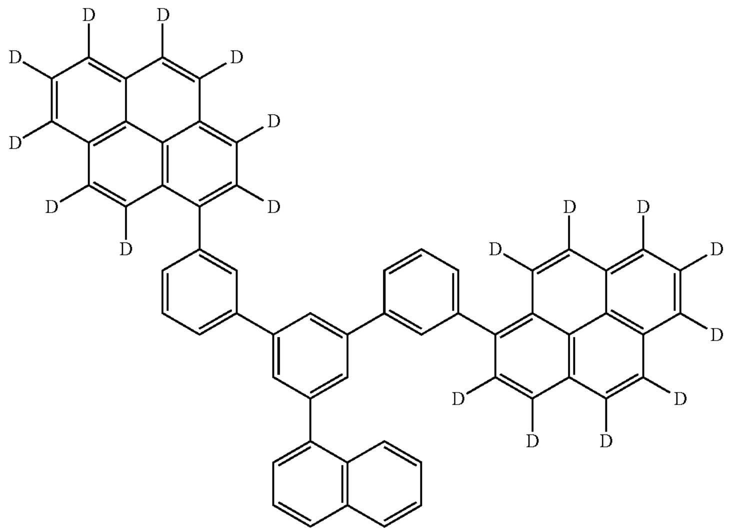
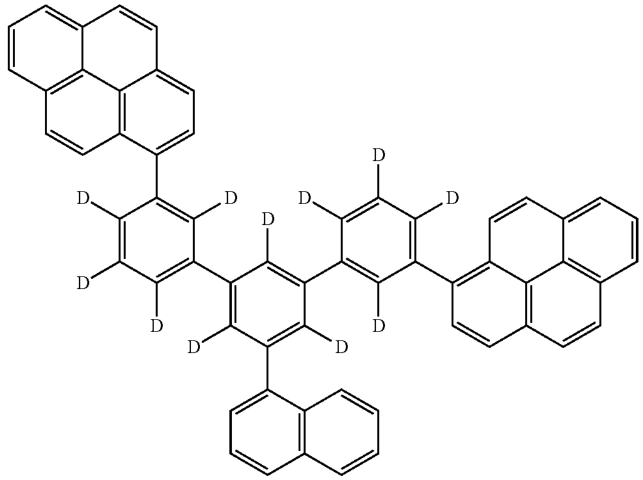
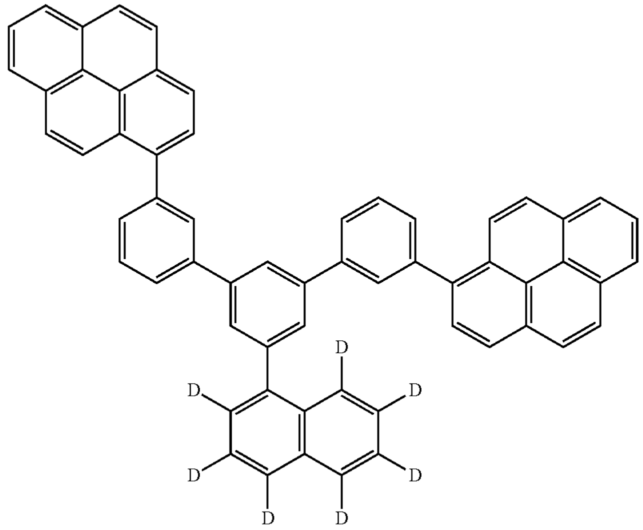

-continued
[Formula 170]
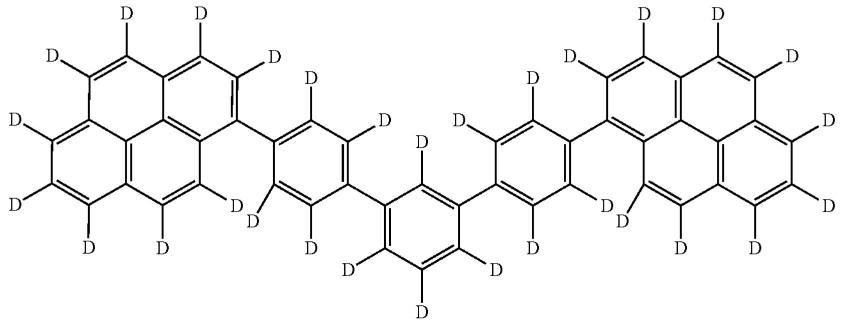
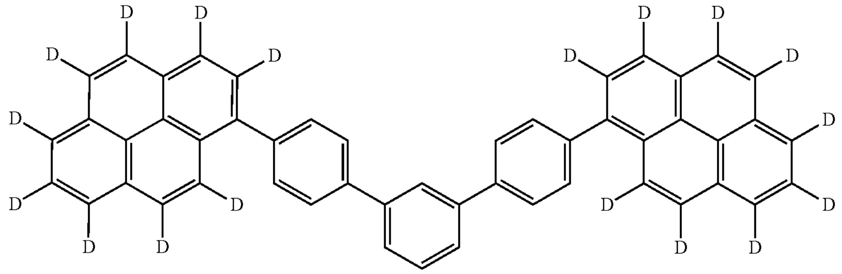
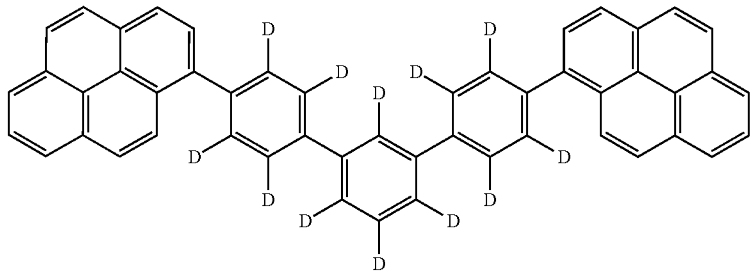
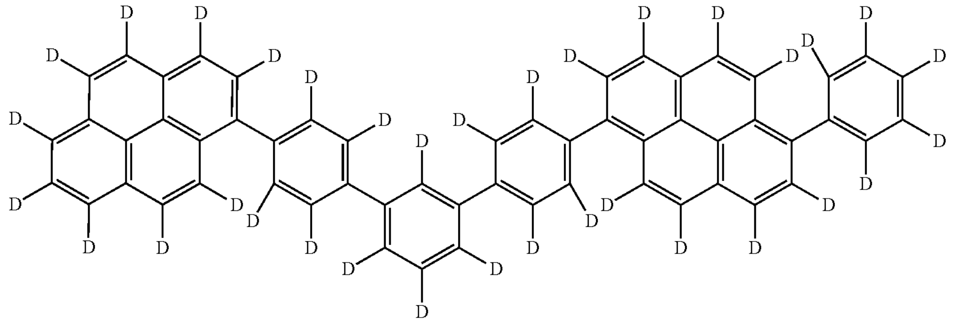
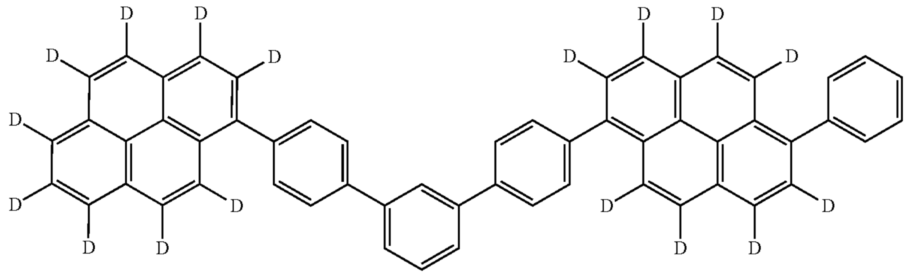

-continued
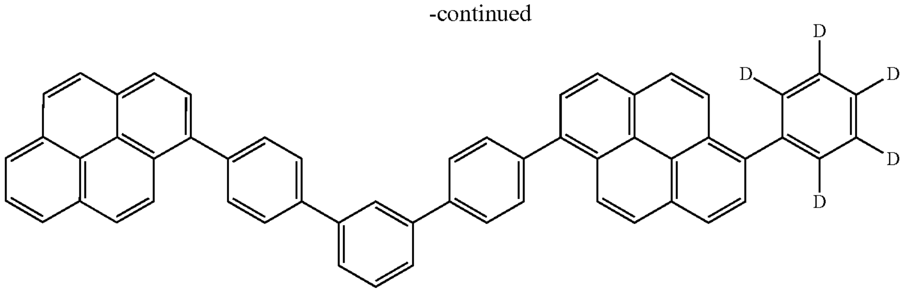
[Formula 171]
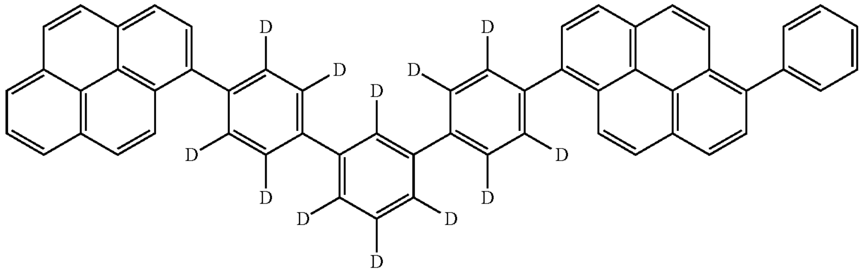
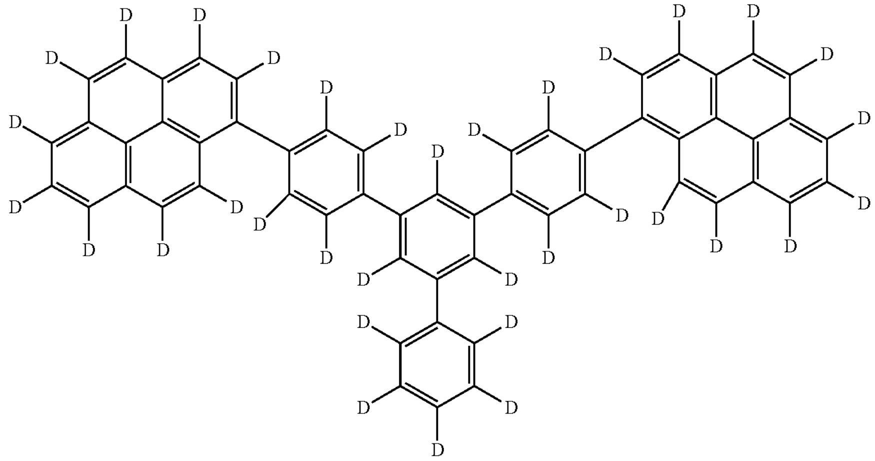
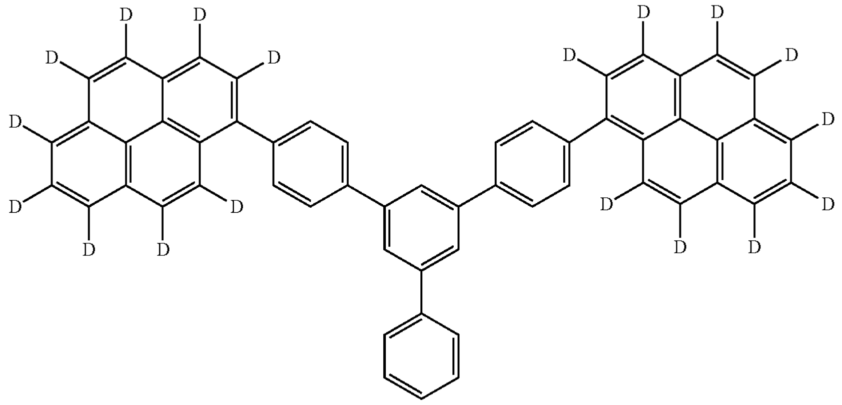

-continued
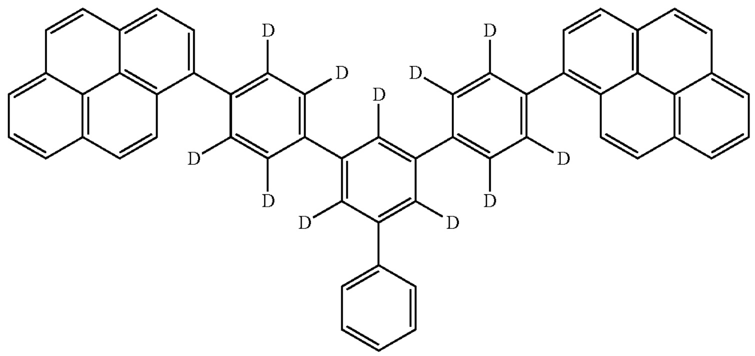
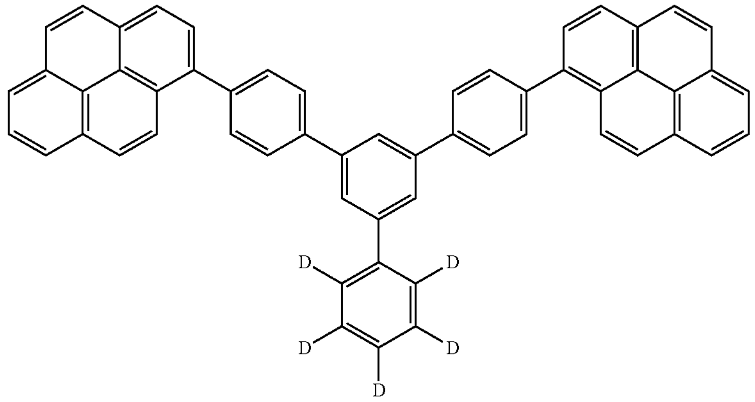
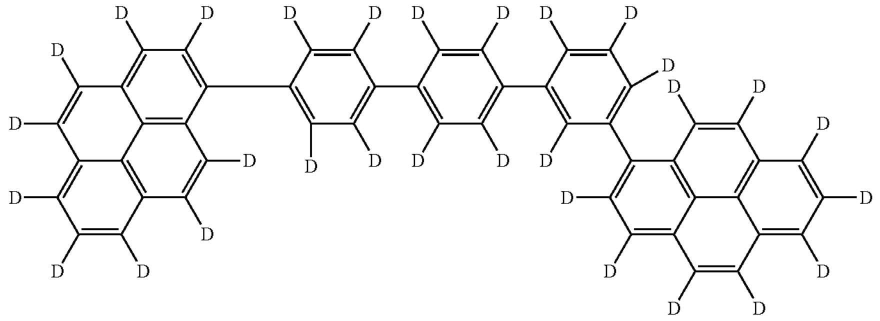
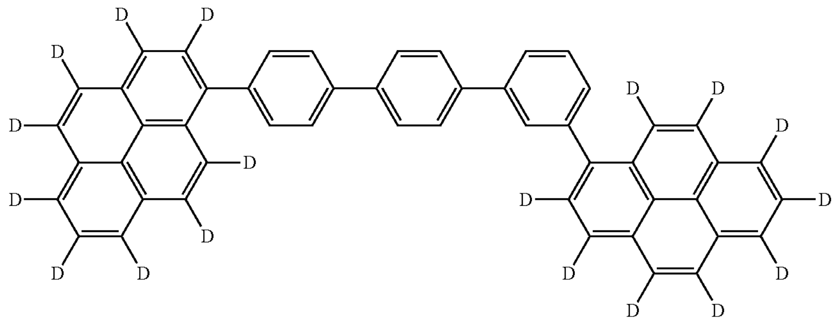
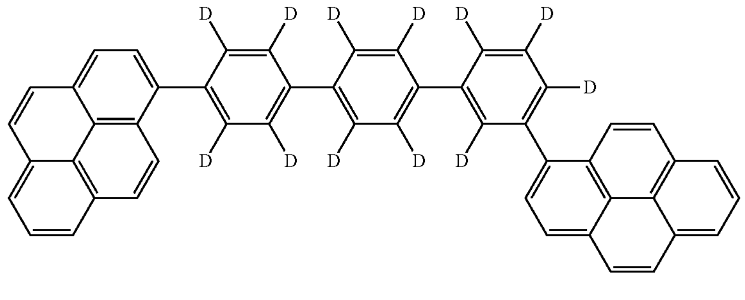

-continued
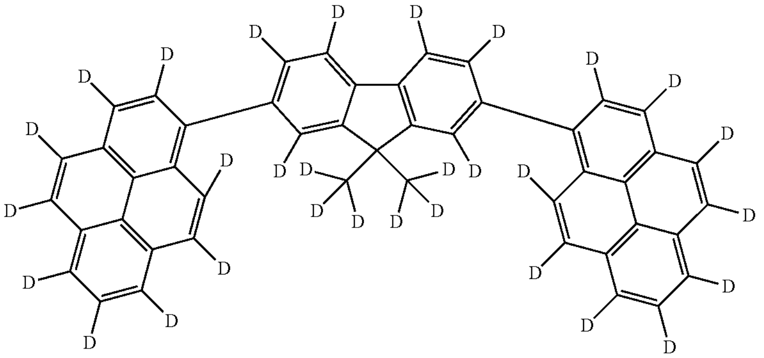
[Formula 172]
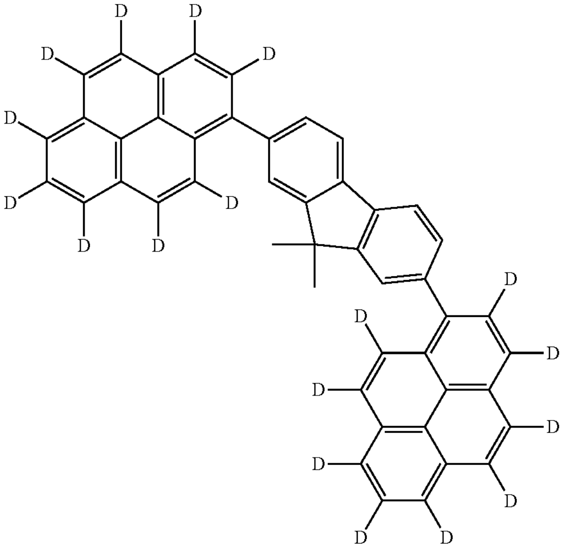
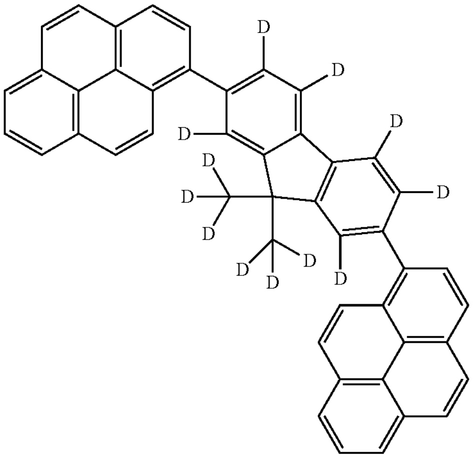
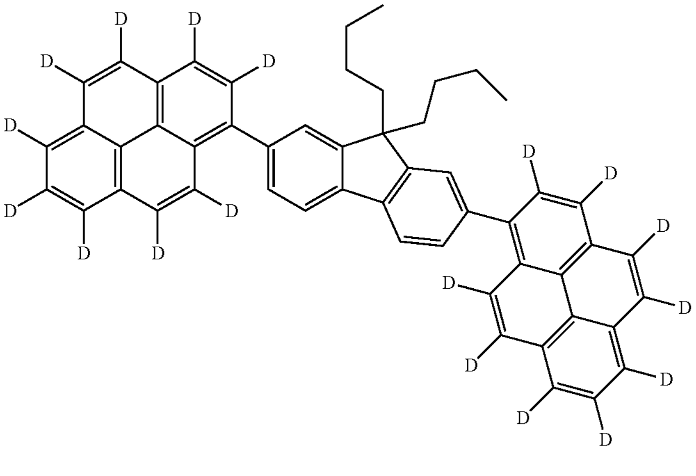

-continued
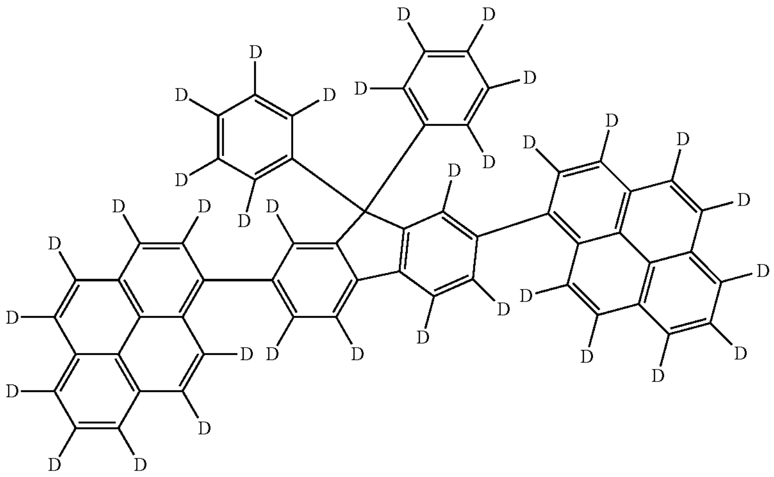
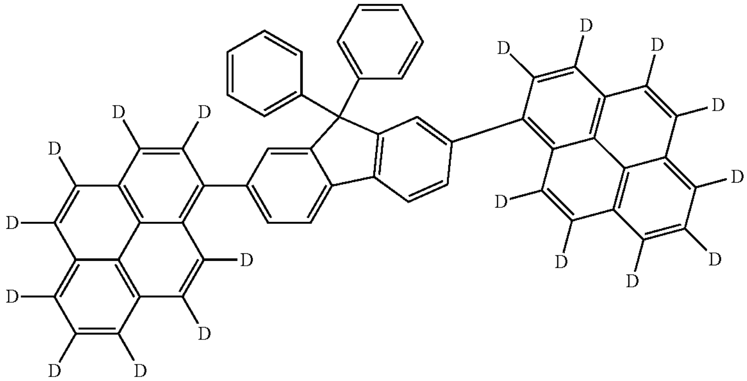
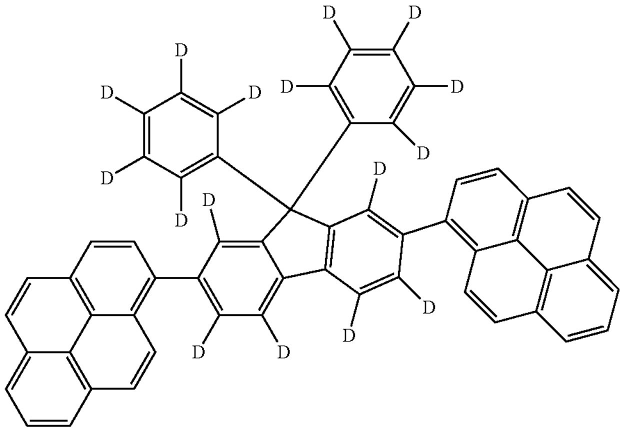

-continued
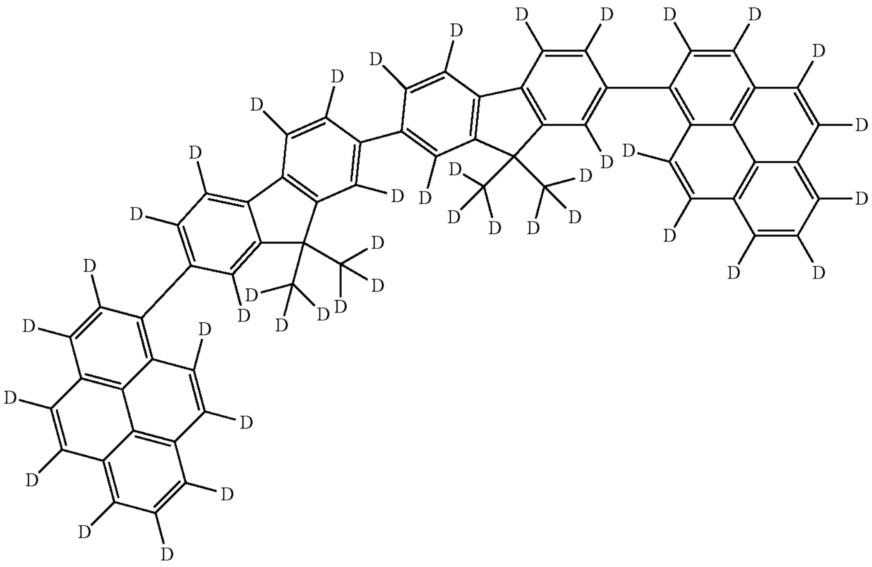
[Formula 173]
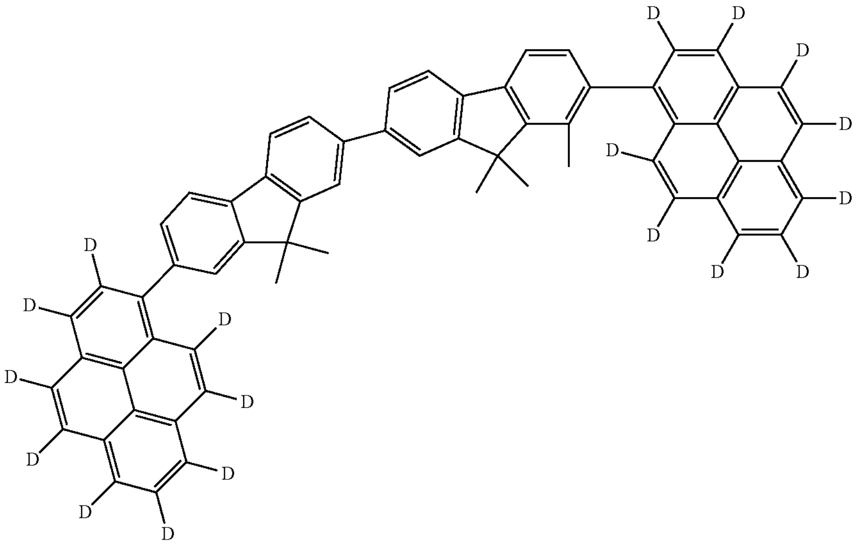
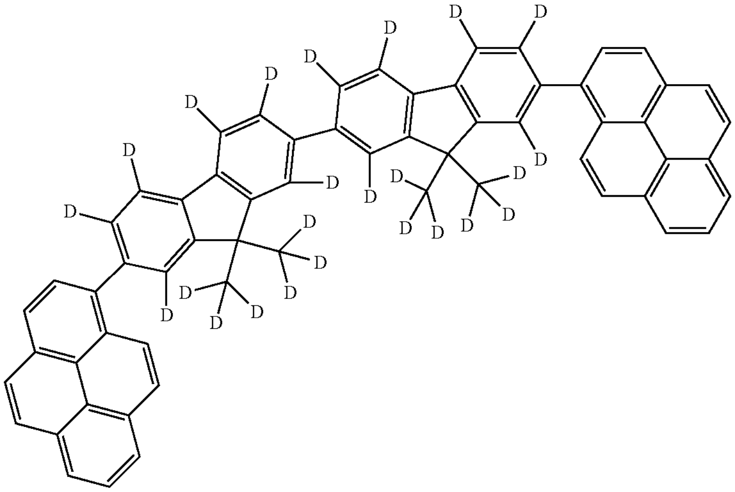

-continued
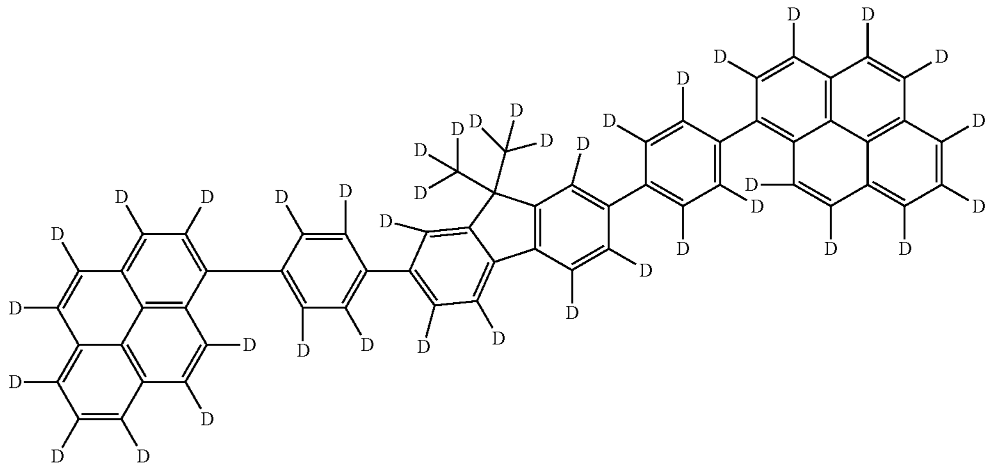
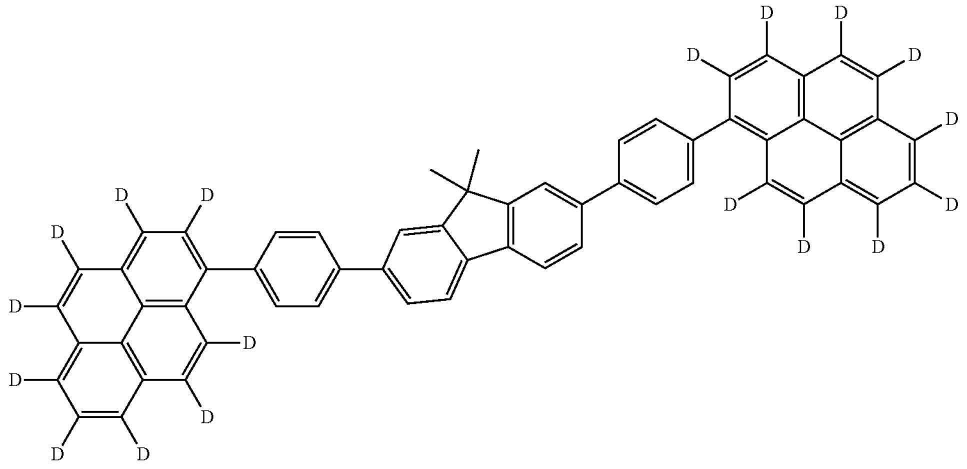
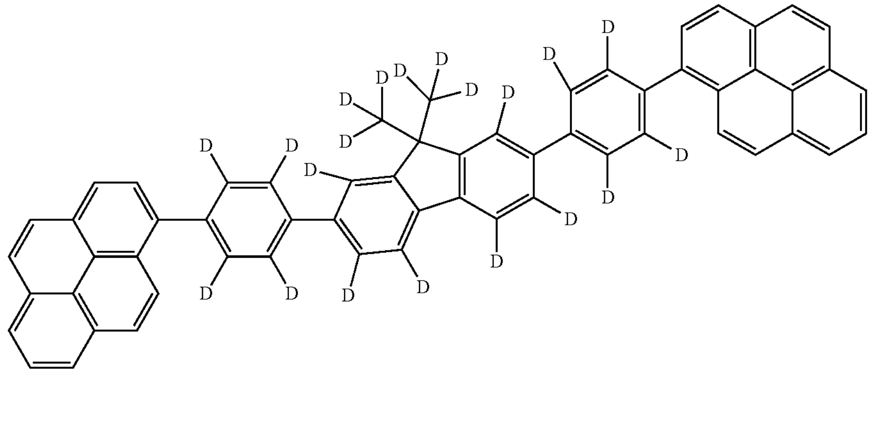

-continued
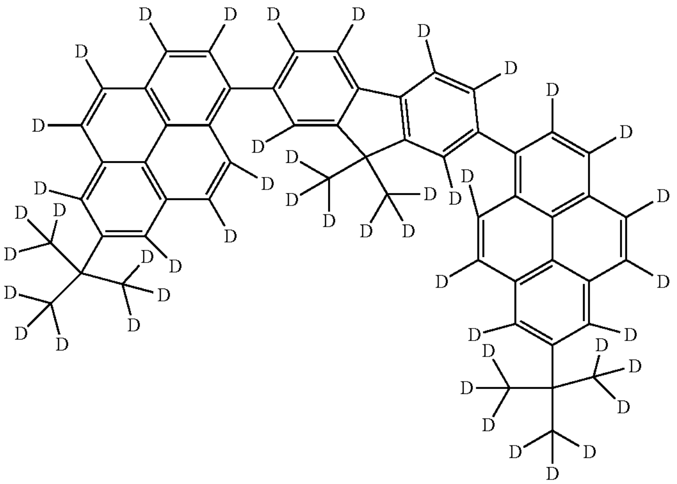
[Formula 174]
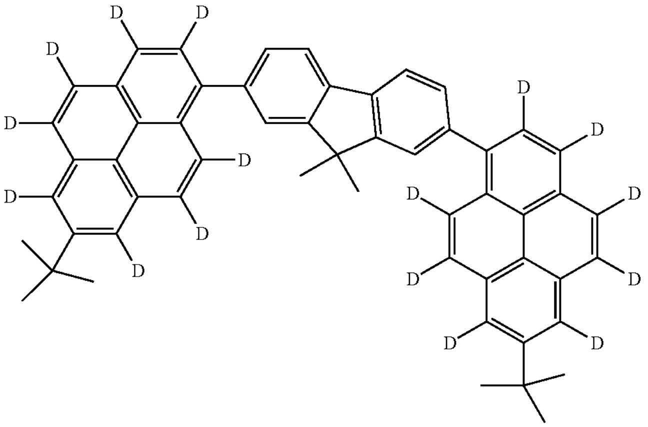
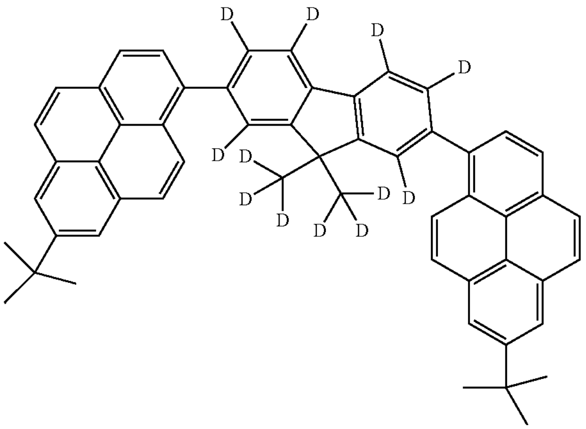

-continued
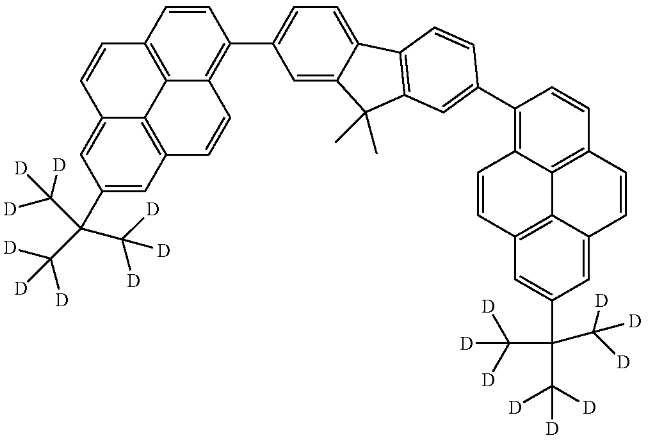
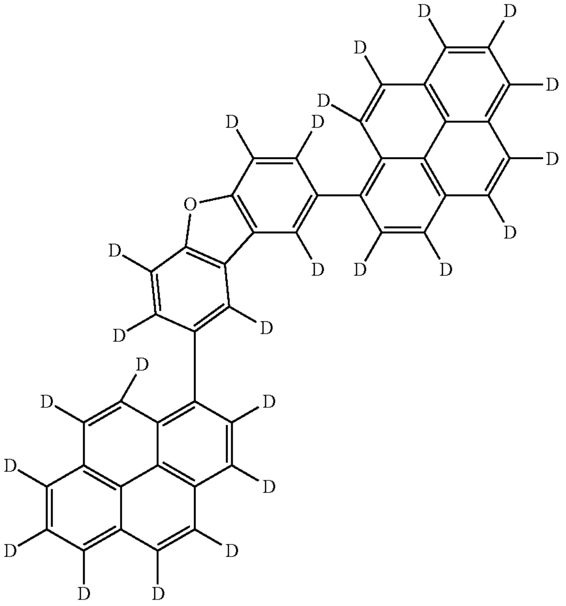
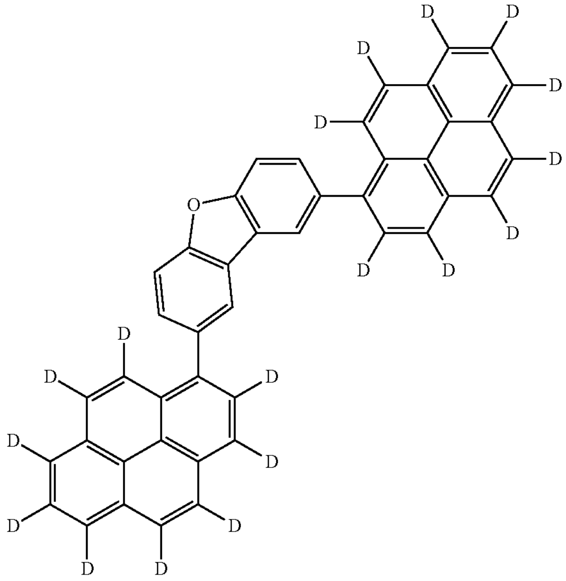
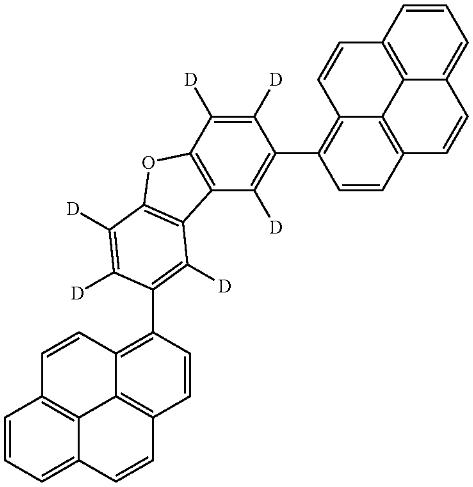
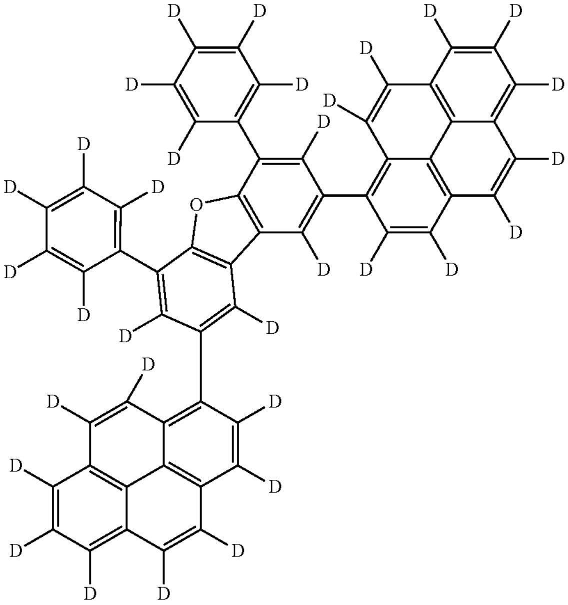

-continued
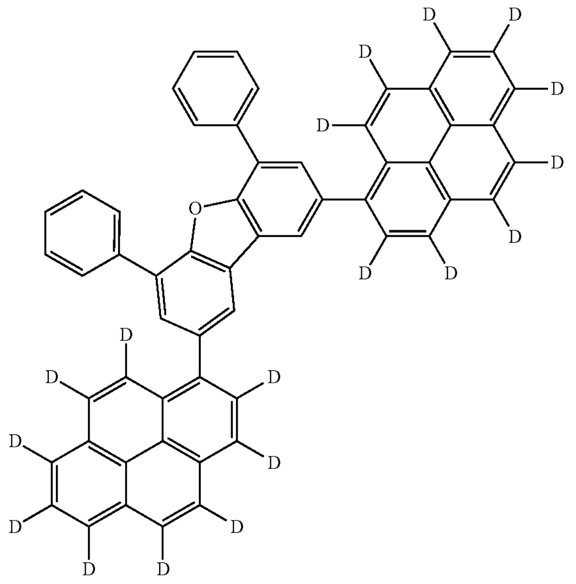
[Formula 175]
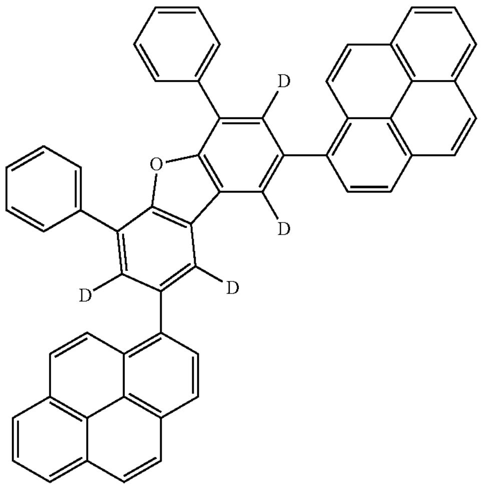
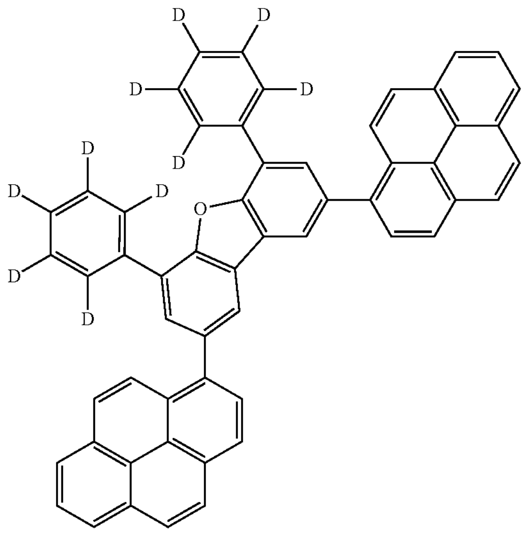
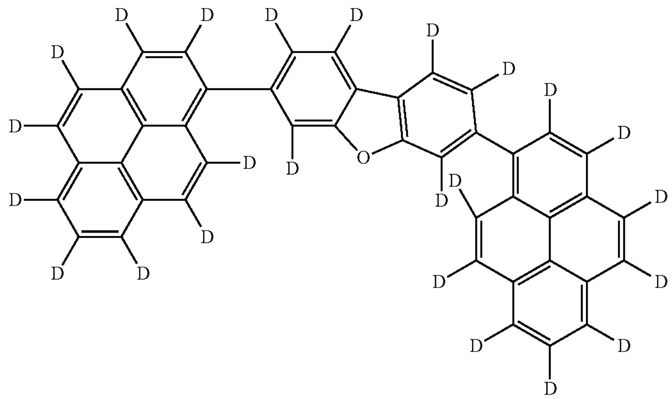

-continued
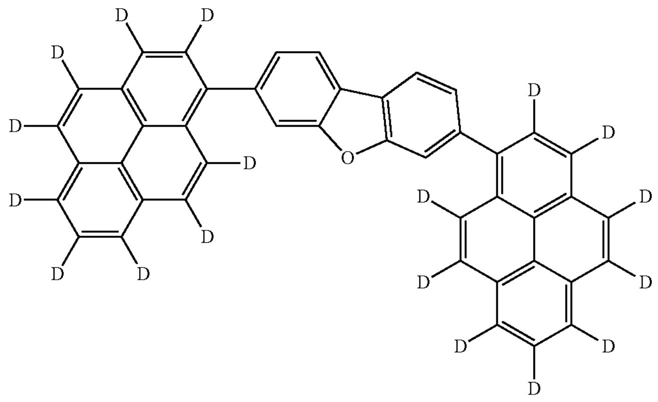
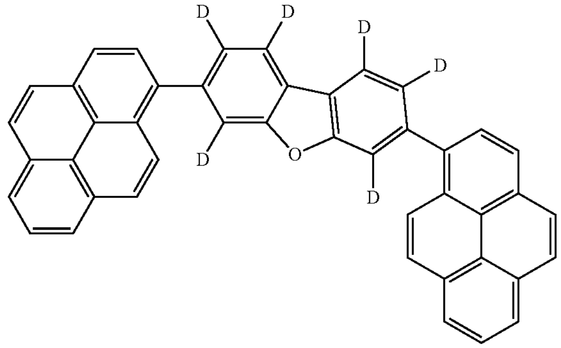
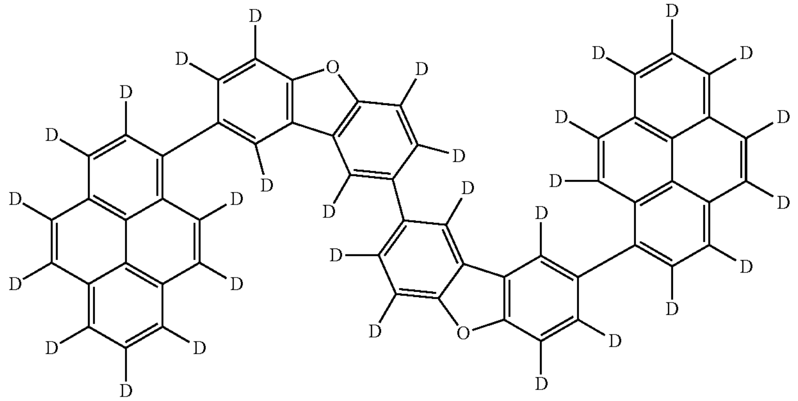
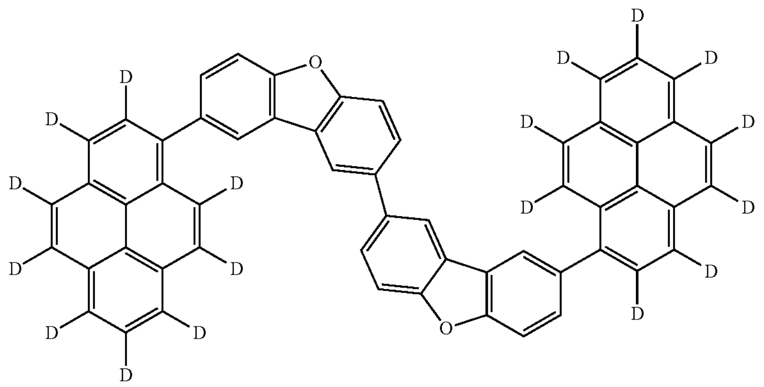

-continued
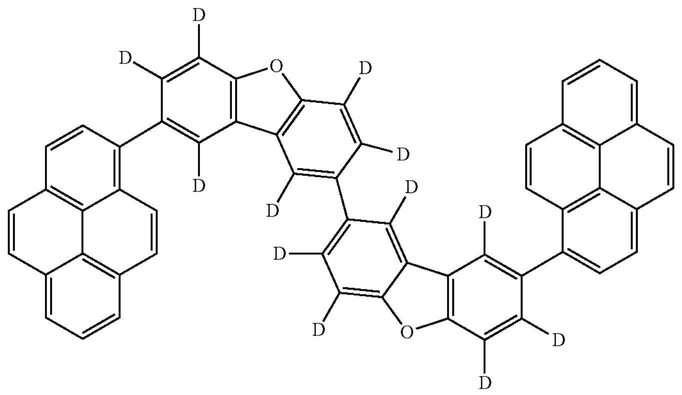
[Formula 176]
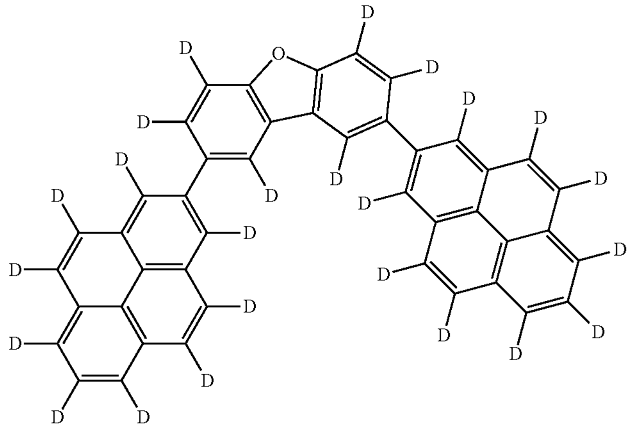
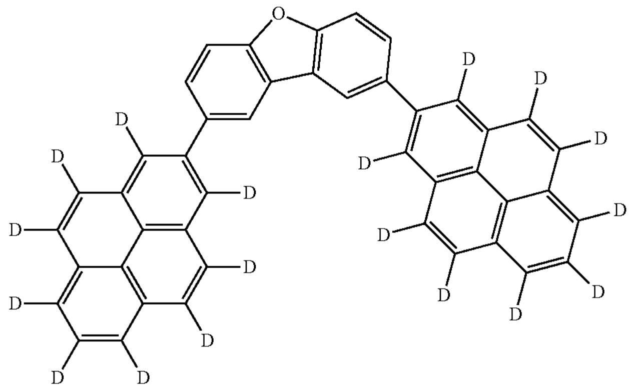
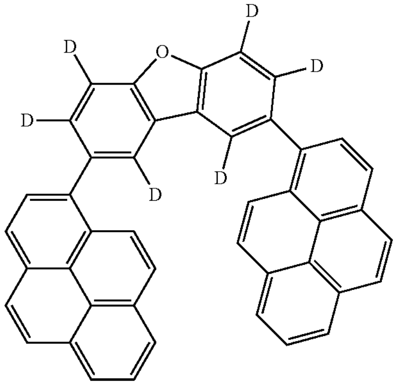

-continued
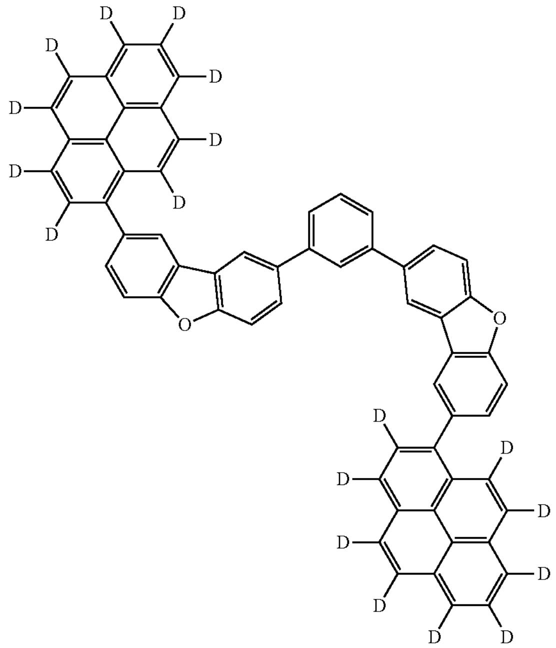
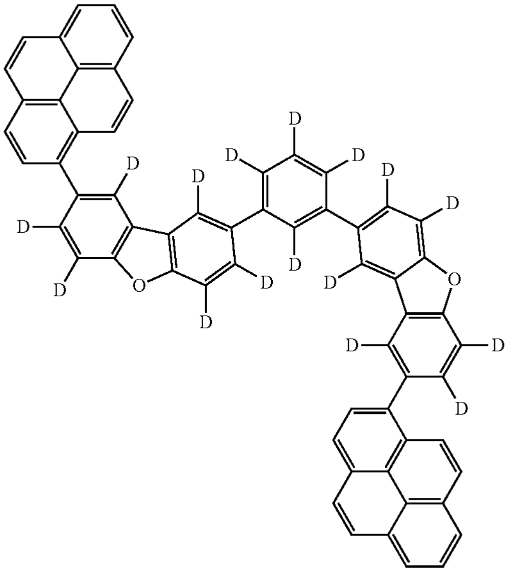
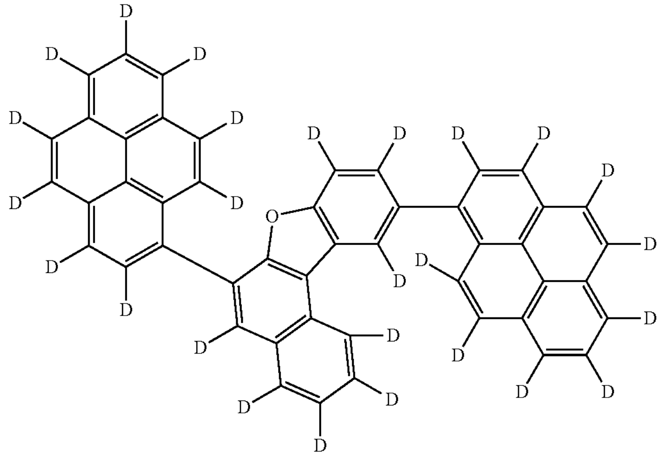
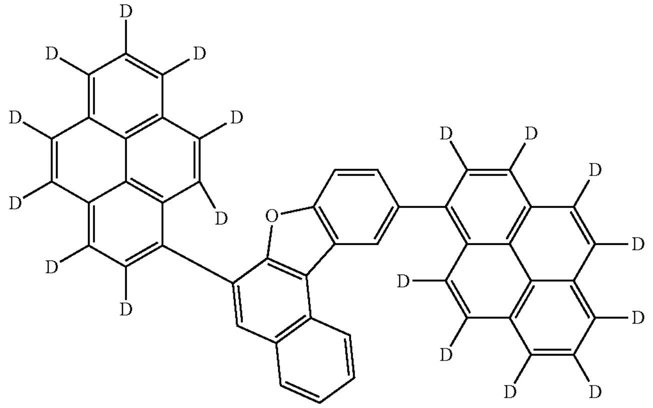
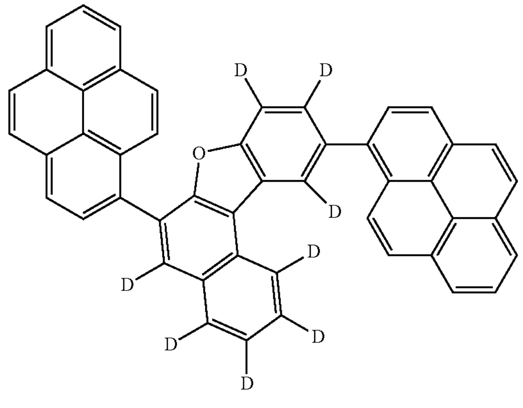

-continued
[Formula 177]
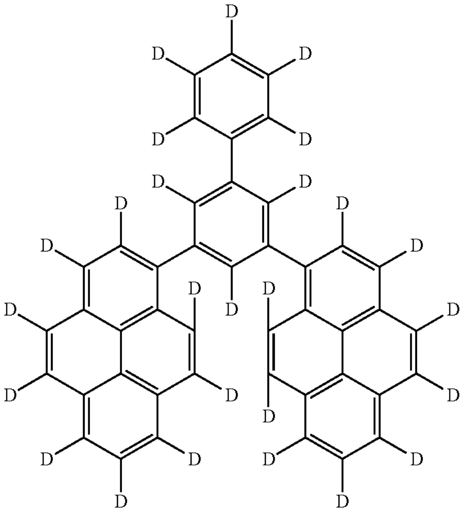
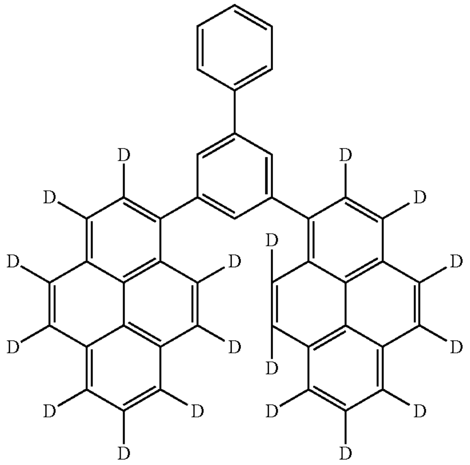
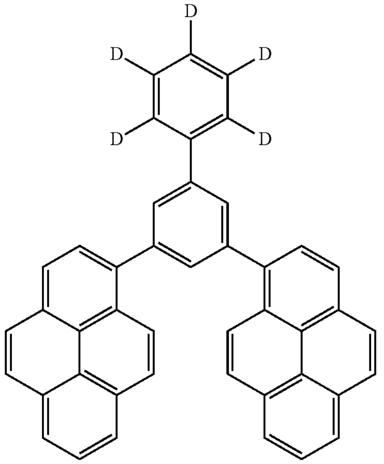
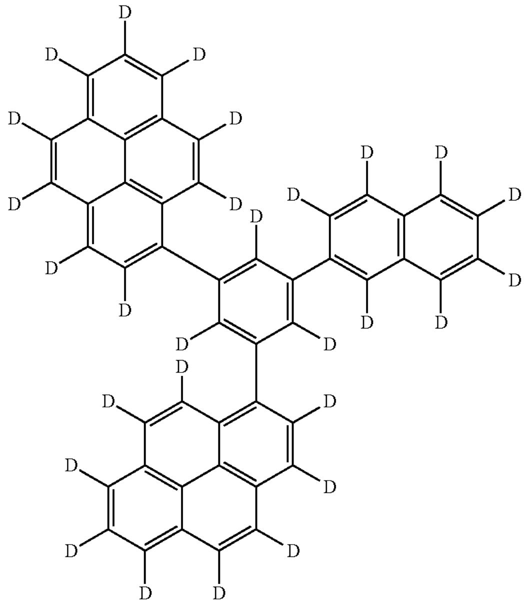
[Formula 178]
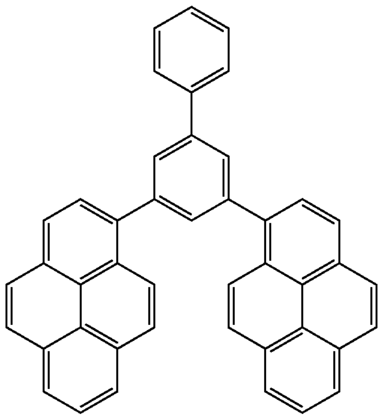
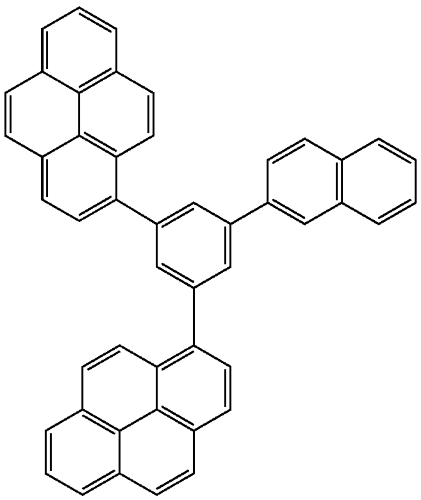

-continued

[Formula 179]

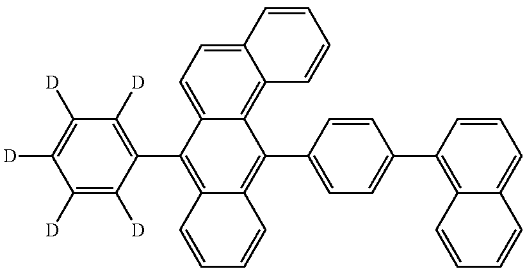

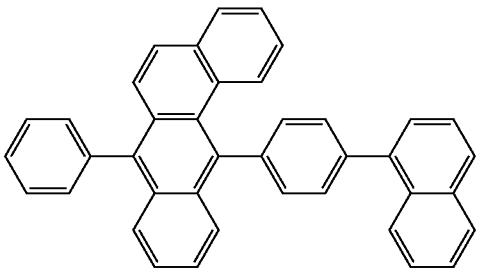

[Formula 180]

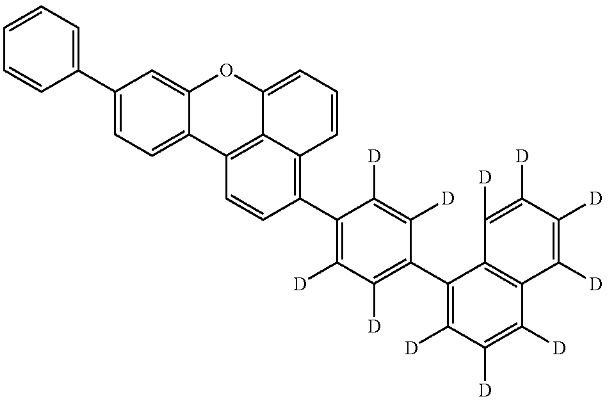

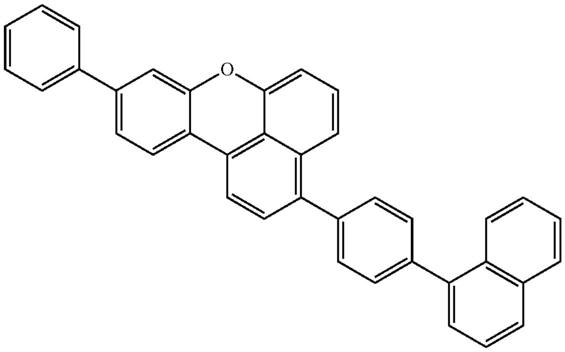

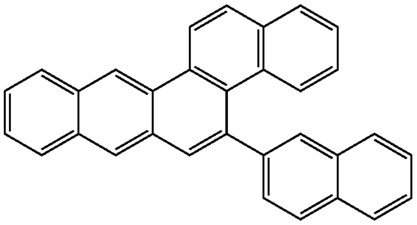

Second Compound

In the organic EL device according to the exemplary embodiment, the second compound as the second host material is preferably a compound represented by the formula (2) below.

[Formula 181]

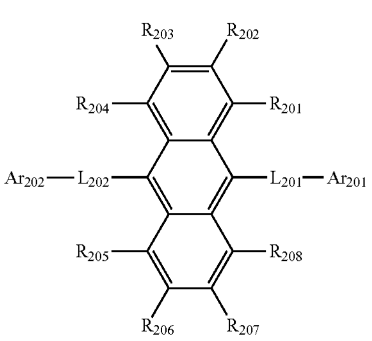

(2)

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound represented by the formula (2), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, it is preferable that $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(═O)R_{801}$, a group represented by $—COOR_{802}$, a halogen atom, a cyano group, or a nitro group;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that $L_{201}$ and $L_{202}$ are each independently a single bond, or a substituted or unsubstituted arylene group having 6 to 50 ring carbon atoms and $Ar_{201}$ and $Ar_{202}$ are each independently a substituted or unsubstituted aryl group having 6 to 50 ring carbon atoms.

In the organic EL device according to the exemplary embodiment, $Ar_{201}$ and $Ar_{202}$ are preferably each independently a phenyl group, a naphthyl group, a phenanthryl group, a biphenyl group, a terphenyl group, a diphenylfluorenyl group, a dimethylfluorenyl group, a benzodiphenylfluorenyl group, a benzodimethylfluorenyl group, a dibenzofuranyl group, a dibenzothienyl group, a naphthobenzofuranyl group, or a naphthobenzothienyl group.

In the organic EL device according to the exemplary embodiment, the second compound represented by the formula (2) is preferably a compound represented by a formula (201), a formula (202), a formula (203), a formula (204), a formula (205), a formula (206), a formula (207), a formula (208), a formula (209), or a formula (210) below.

[Formula 182]

(201)

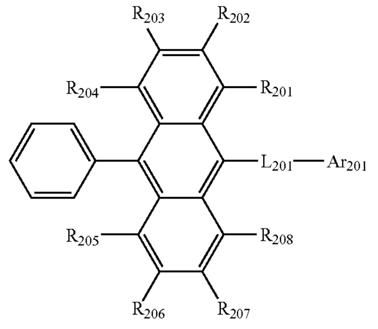

[Formula 183]

(202)

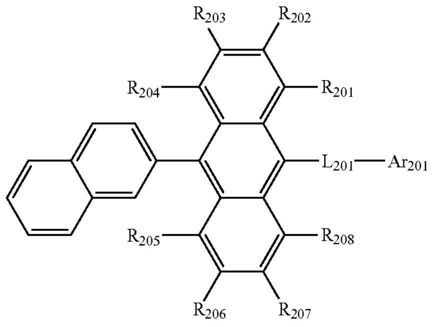

[Formula 184]

(203)

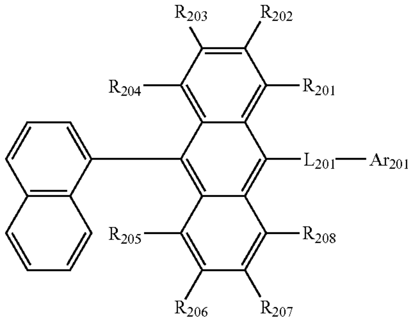

[Formula 185]

(204)

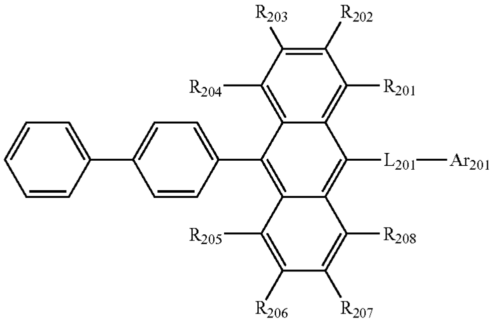

-continued

[Formula 186]

(205)

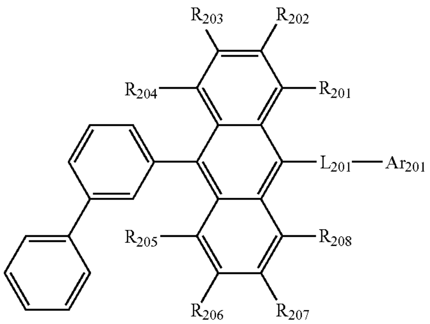

[Formula 187]

(206)

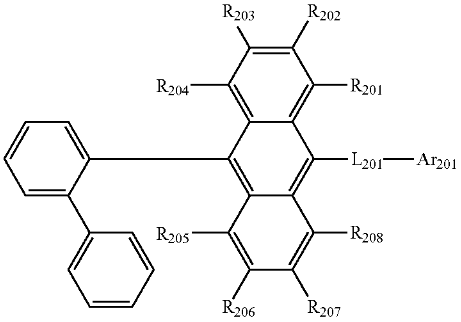

[Formula 188]

(207)

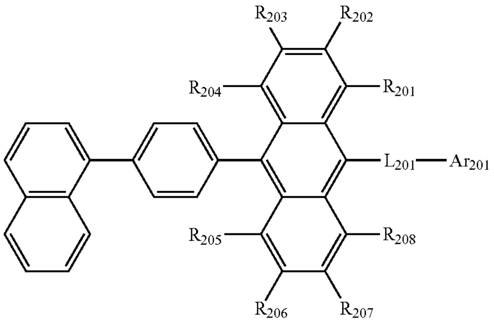

[Formula 189]

(208)

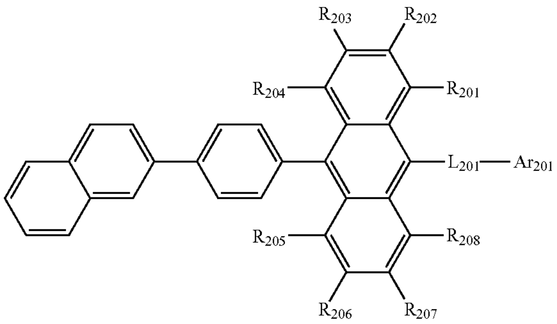

-continued

[Formula 190]

(209)

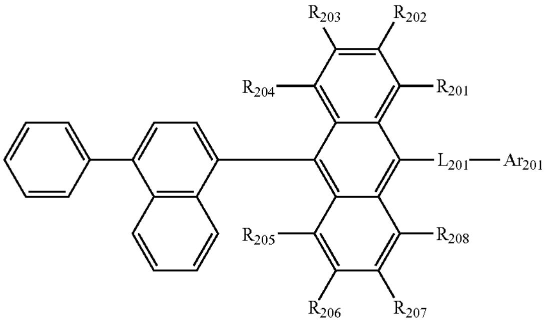

[Formula 191]

(210)

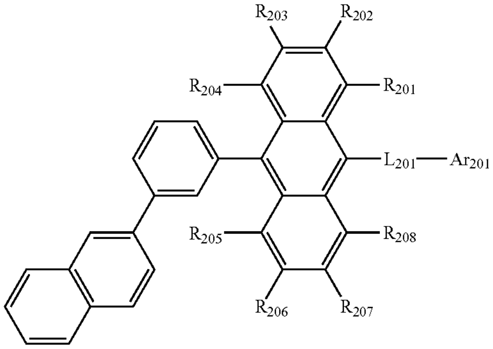

In the formulae (201) to (210):

$L_{201}$ and $Ar_{201}$ represent the same as $L_{201}$ and $Ar_{201}$ in the formula (2); and $R_{201}$ to $R_{208}$ each independently represent the same as $R_{201}$ to $R_{208}$ in the formula (2).

The second compound represented by the formula (2) is also preferably a compound represented by a formula (221), a formula (222), a formula (223), a formula (224), a formula (225), a formula (226), a formula (227), a formula (228), or a formula (229) below.

[Formula 192]

(221)

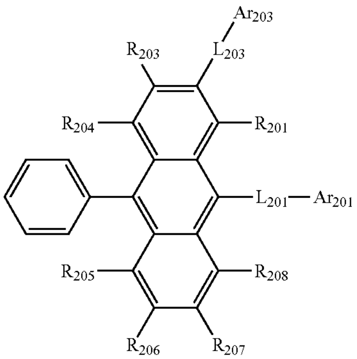

-continued
[Formula 193]
(222)
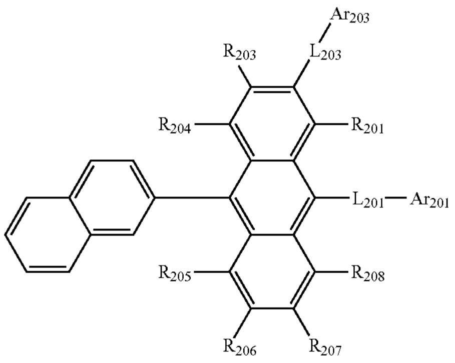
[Formula 194]
(223)
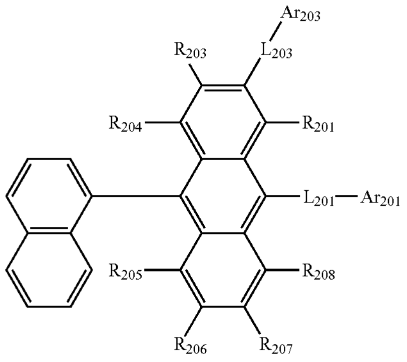
[Formula 195]
(224)
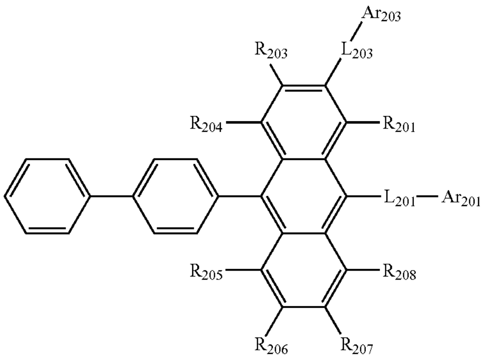
[Formula 196]
(225)
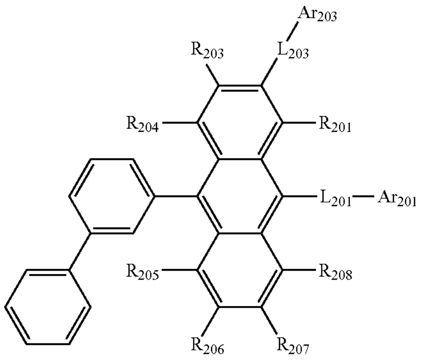
-continued
[Formula 197]
(226)
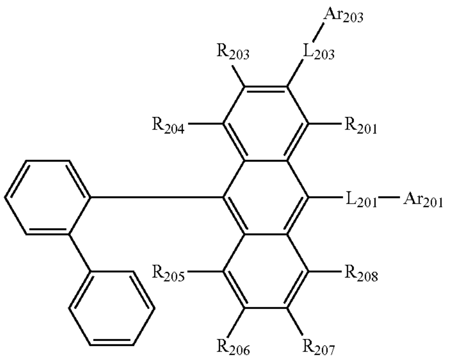
[Formula 198]
(227)
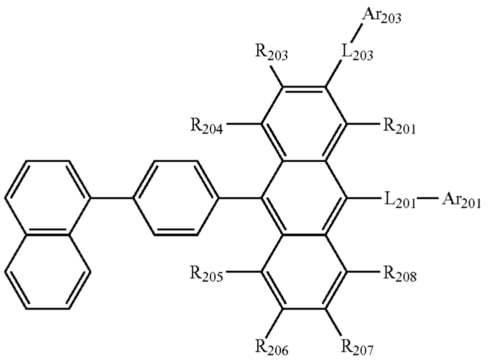
[Formula 199]
(228)
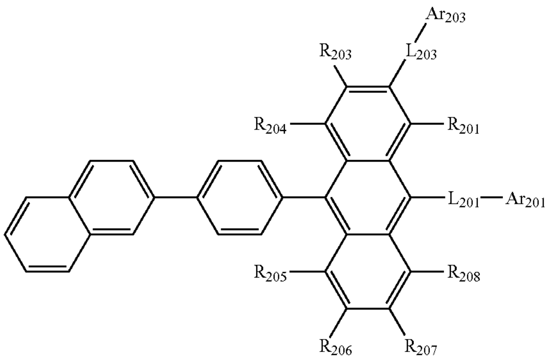

-continued

[Formula 200]

(229)

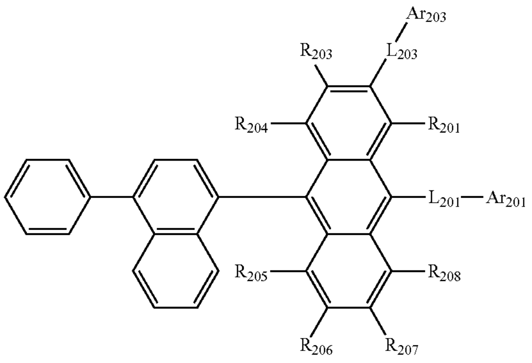

In the formulae (221), (222), (223), (224), (225), (226), (227), (228) and (229):

$R_{201}$ and $R_{203}$ to $R_{208}$ each independently represent the same as $R_{201}$ and $R_{203}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

The second compound represented by the formula (2) is also preferably a compound represented by a formula (241), a formula (242), a formula (243), a formula (244), a formula (245), a formula (246), a formula (247), a formula (248), or a formula (249) below.

[Formula 201]

(241)

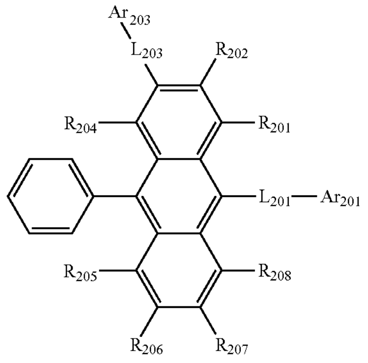

-continued

[Formula 202]

(242)

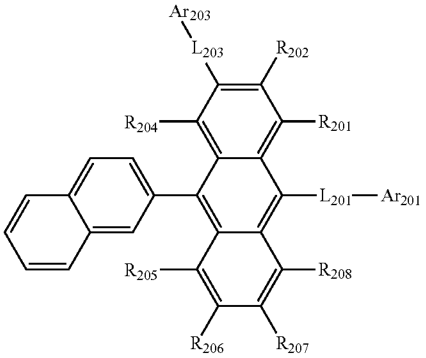

[Formula 203]

(243)

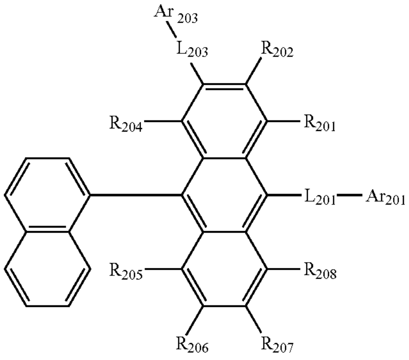

[Formula 204]

(244)

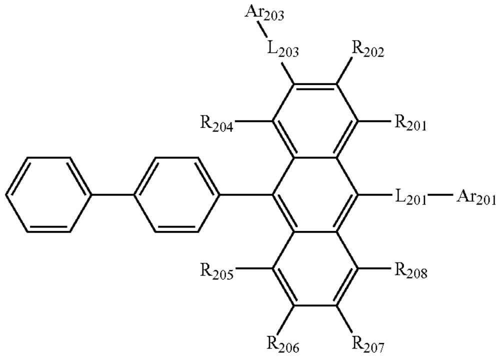

[Formula 205]

(245)

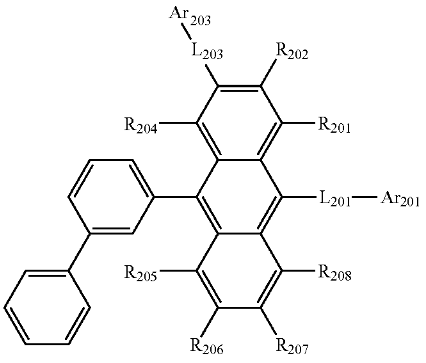

-continued

[Formula 206]

(246)

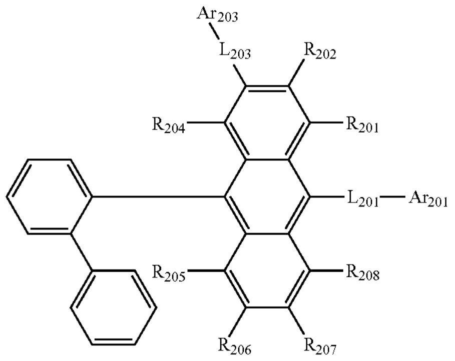

[Formula 207]

(247)

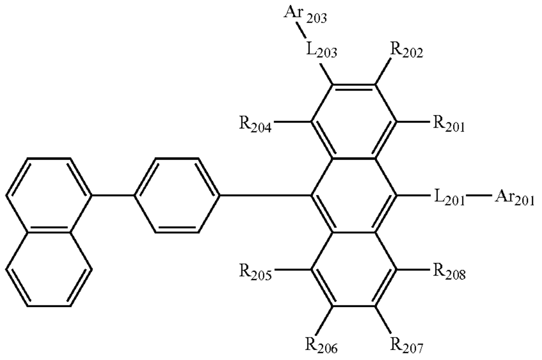

[Formula 208]

(248)

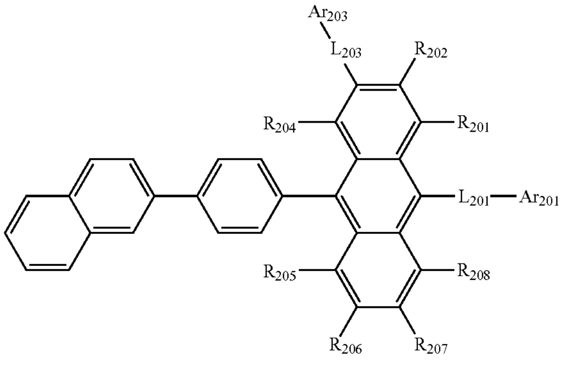

-continued

[Formula 209]

(249)

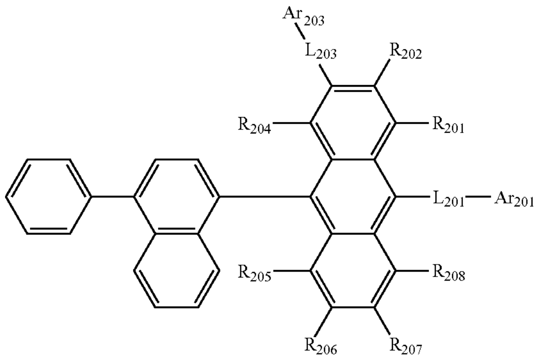

In the formulae (241), (242), (243), (244), (245), (246), (247), (248) and (249):

$R_{201}$, $R_{202}$ and $R_{204}$ to $R_{208}$ each independently represent the same as $R_{201}$, $R_{202}$ and $R_{204}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

In the second compound represented by the formula (2), $R_{201}$ to $R_{208}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

It is preferable that $L_{201}$ is a single bond, or an unsubstituted arylene group having 6 to 22 ring carbon atoms and $Ar_{201}$ is a substituted or unsubstituted aryl group having 6 to 22 ring carbon atoms.

In the organic EL device according to the exemplary embodiment, $R_{201}$ to $R_{208}$ that are substituents of an anthracene skeleton in the second compound represented by the formula (2) are preferably hydrogen atoms in terms of preventing inhibition of intermolecular interaction and inhibiting decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that the relationship of $\mu e(H2) > \mu e(H1)$ shown by the numerical formula (Numerical Formula 30) may not be satisfied. When the second compound is used in the second emitting layer, it can be expected that satisfying the relationship of $\mu e(H2) > \mu e(H1)$ inhibits a decrease in a recombination ability between holes and electrons in the first emitting layer and a decrease in luminous efficiency. It should be noted that substituents, namely, a haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(=O)$R_{801}$, group represented by —COO$R_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are each not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the organic EL device according to the exemplary embodiment, in the second compound represented by the formula (2), $R_{201}$ to $R_{208}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In the organic EL device according to the exemplary embodiment, in the second compound represented by the formula (2), $R_{201}$ to $R_{208}$ are each preferably a hydrogen atom.

In the second compound, examples of the substituent for the "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. When examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

Further preferably, $R_{201}$ to $R_{208}$ that are the substituents on the anthracene skeleton are not bulky substituents and $R_{201}$ to $R_{208}$ as substituents are unsubstituted. Assuming that $R_{201}$ to $R_{208}$ that are the substituents on the anthracene skeleton are not bulky substituents and substituents are bonded to $R_{201}$ to $R_{208}$ that are not bulky substituents, the substituents bonded to $R_{201}$ to $R_{208}$ are preferably not bulky substituents; and the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the second compound, the groups specified to be "substituted or unsubstituted" are each preferably an unsubstituted group.

Method of Producing Second Compound

The second compound can be produced by a known method. The second compound can also be produced based on a known method through a known alternative reaction using a known material(s) tailored for the target compound.

Specific Examples of Second Compound

Specific examples of the second compound include the following compounds. It should however be noted that the invention is not limited to the specific examples of the second compound.

[Formula 210]

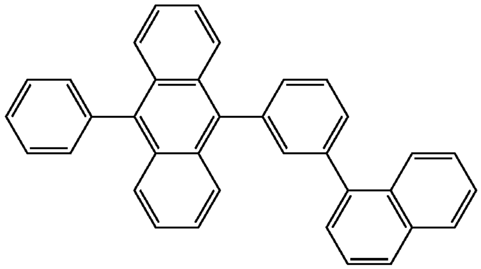

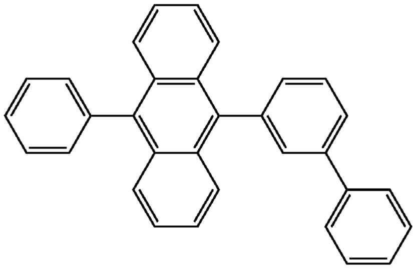

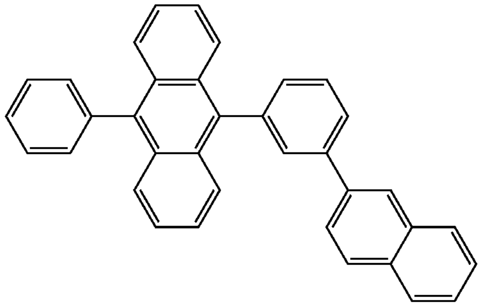

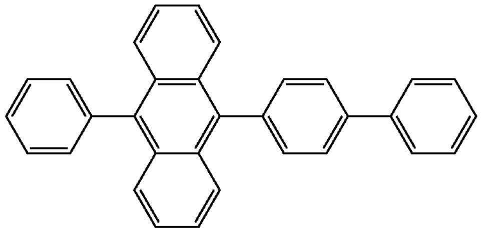

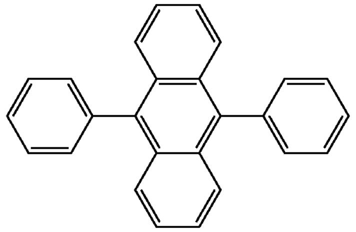

-continued
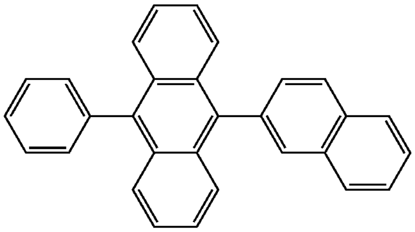
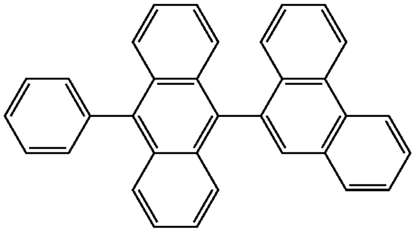
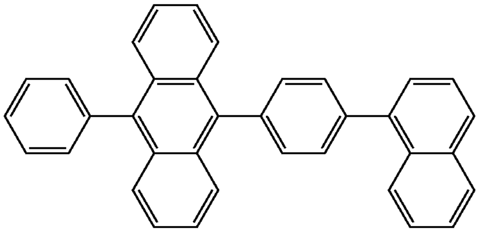
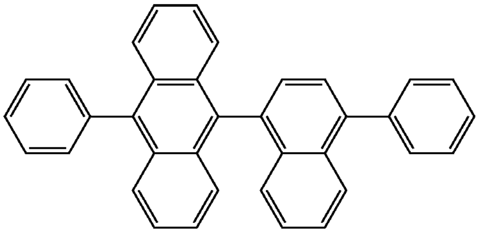
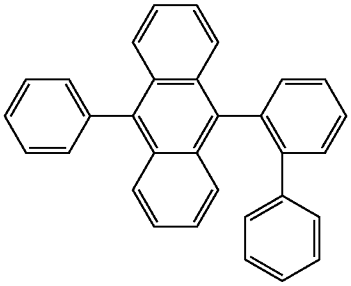
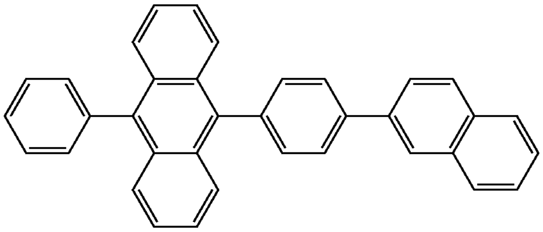
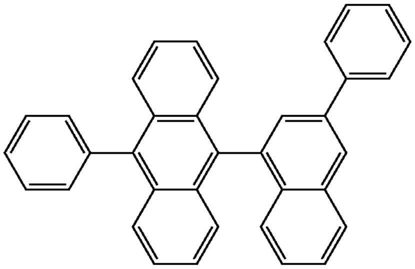
-continued
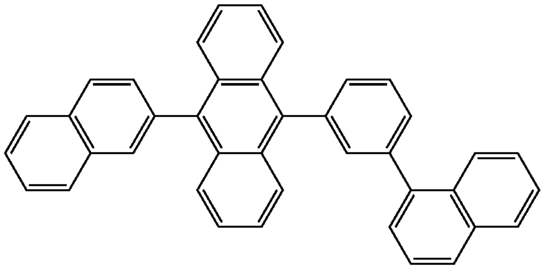
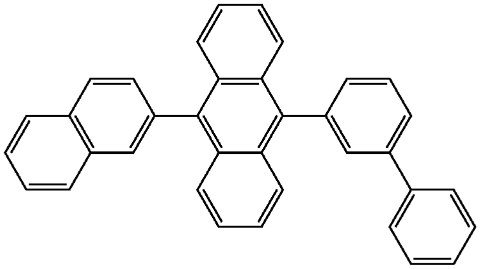
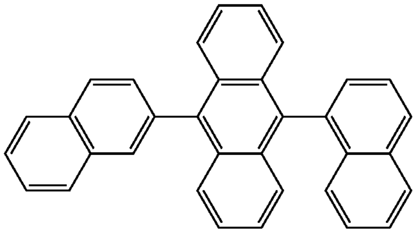
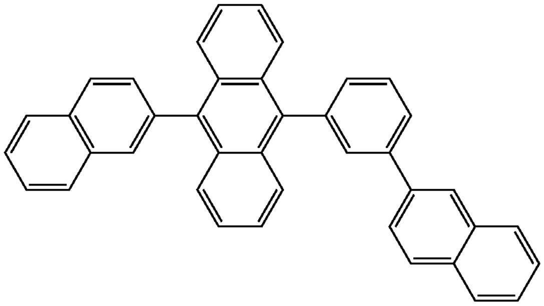
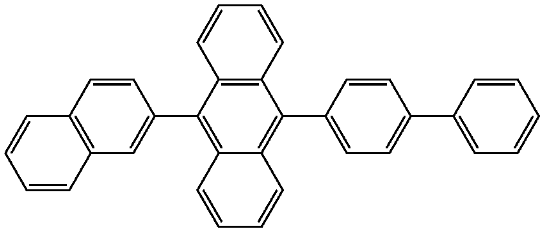
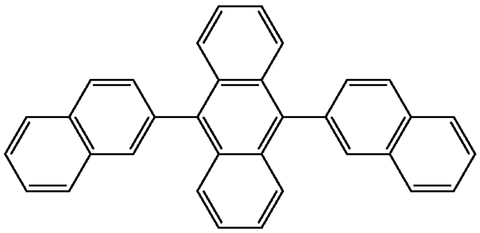

-continued
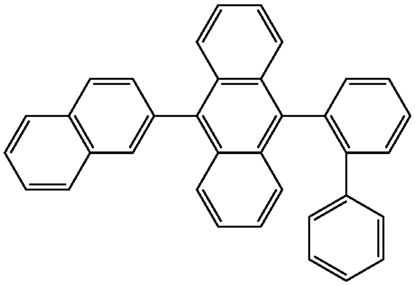
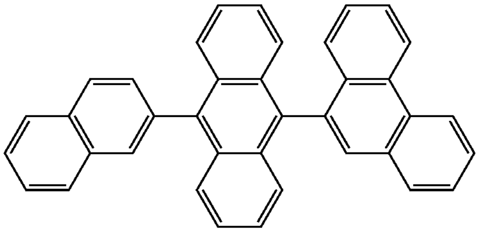
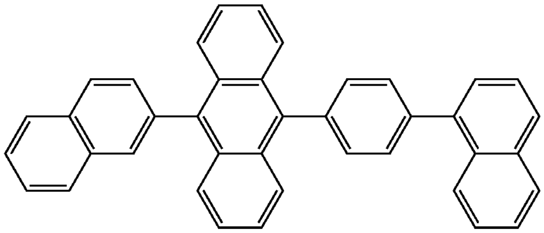
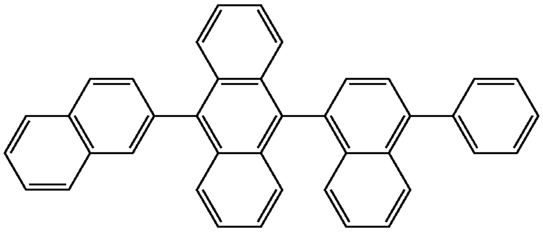
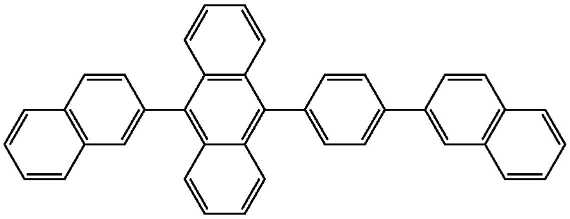
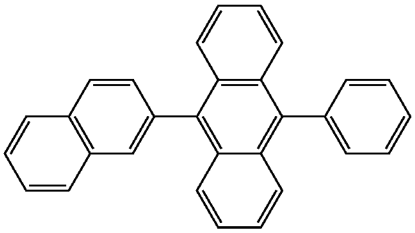
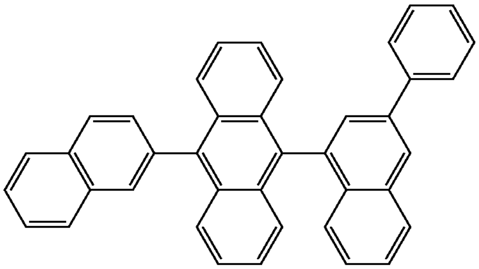
-continued
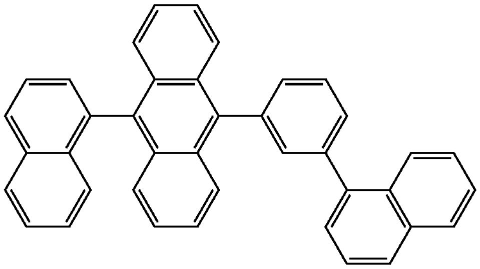
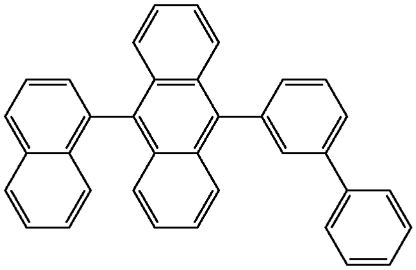
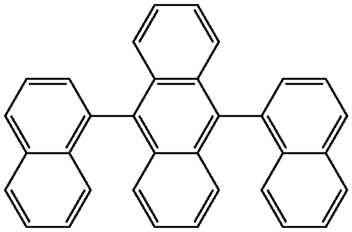
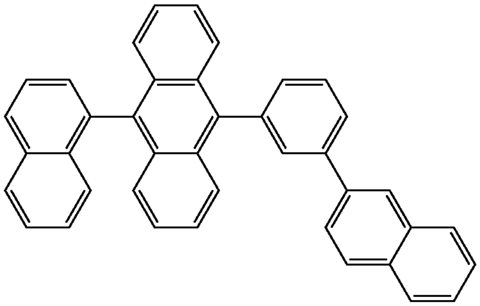
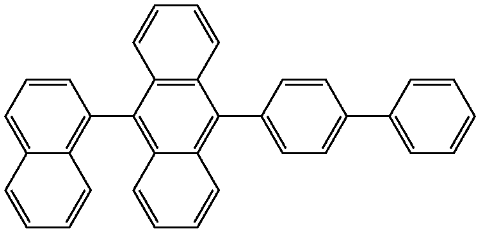
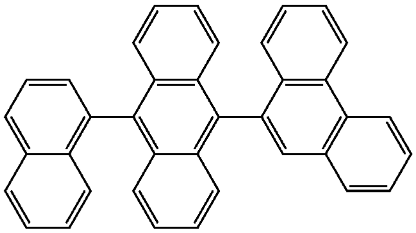

-continued
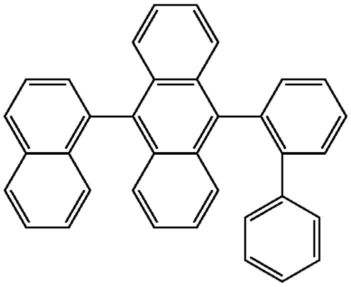
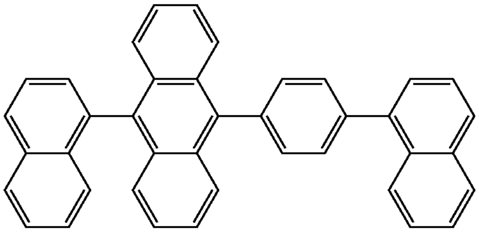
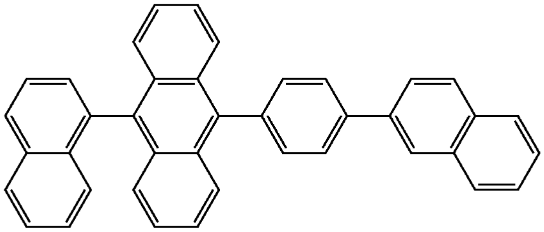
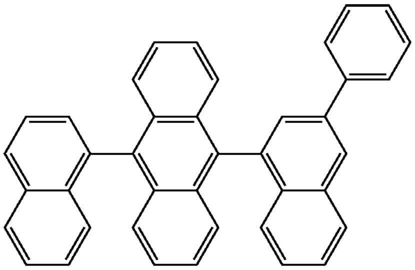
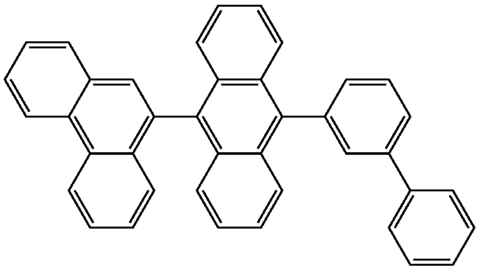
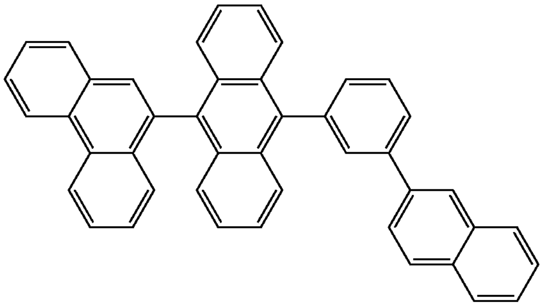
-continued
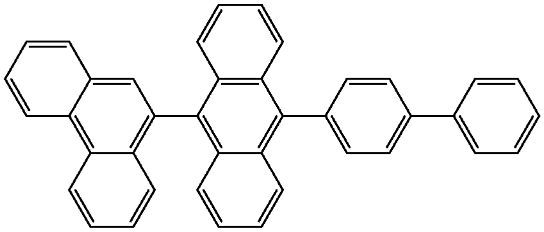
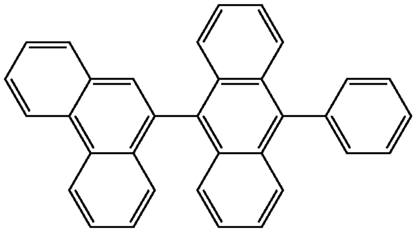
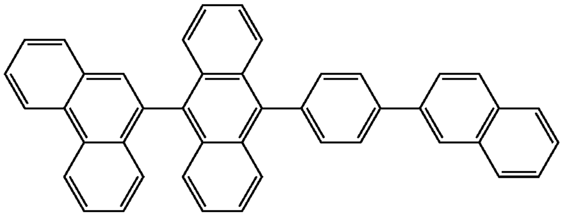
[Formula 211]
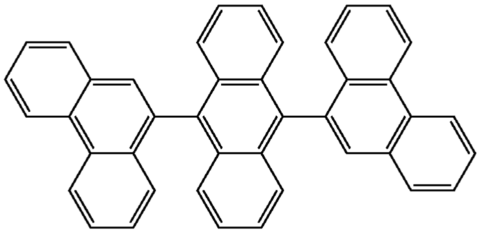
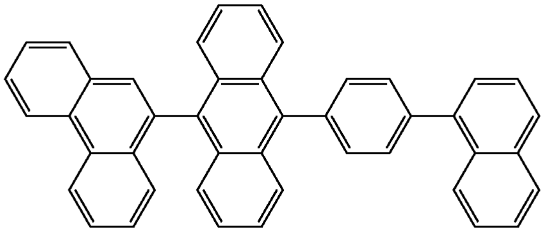
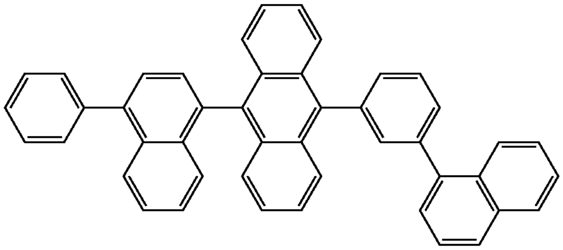
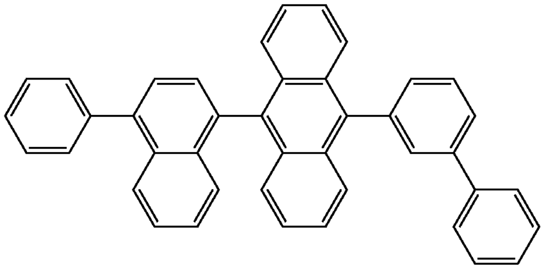

-continued
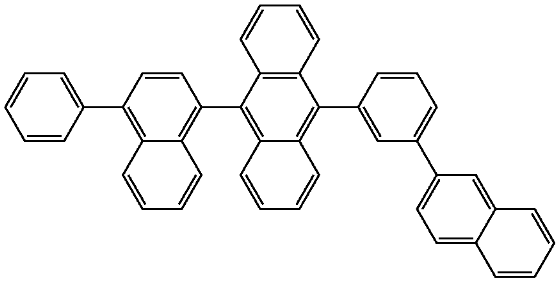
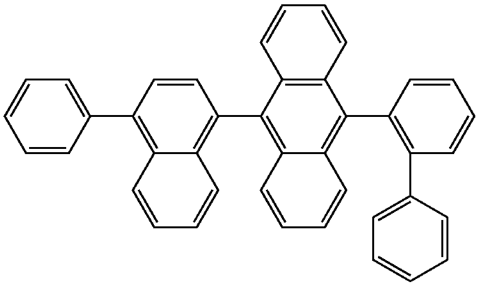
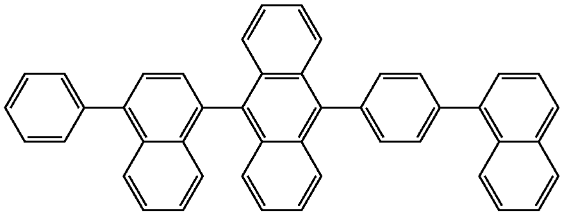
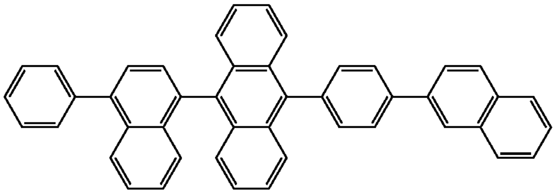
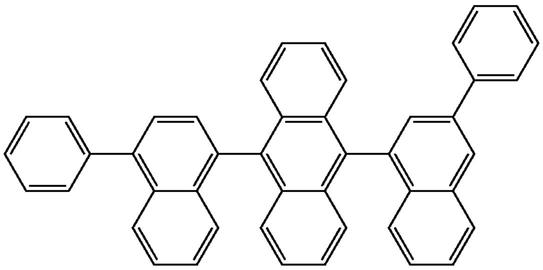
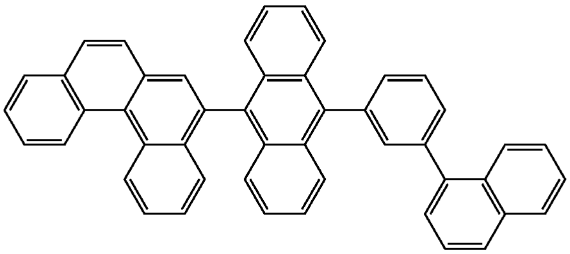
-continued
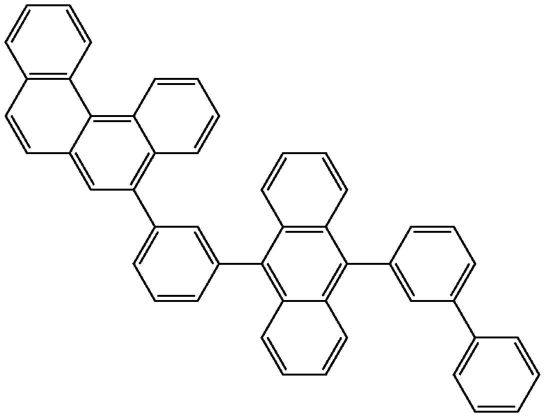
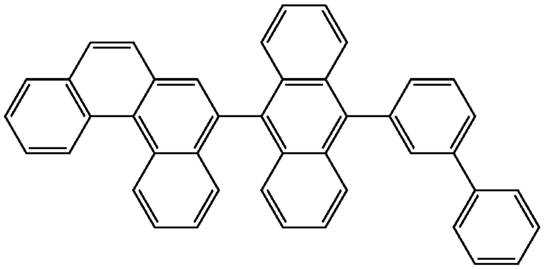
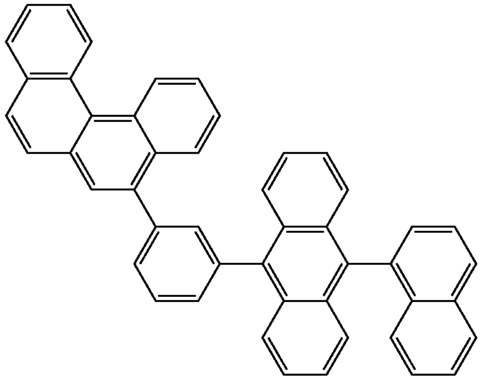
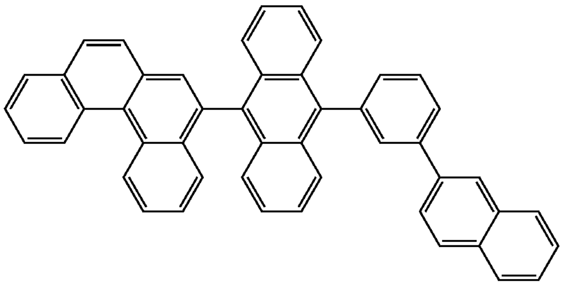
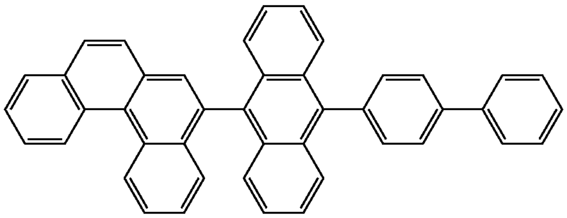

-continued
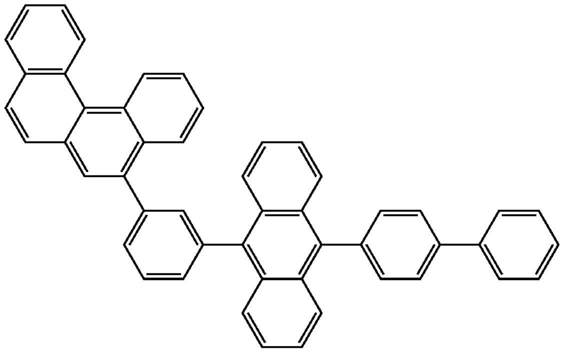
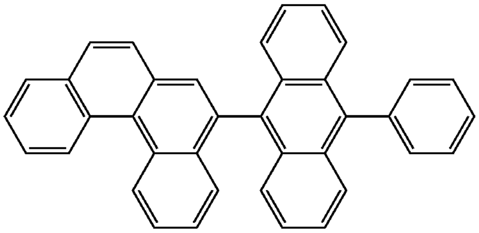
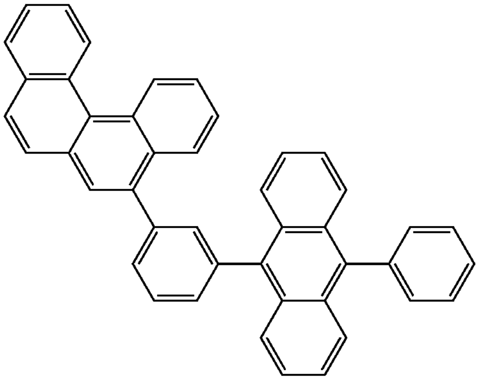
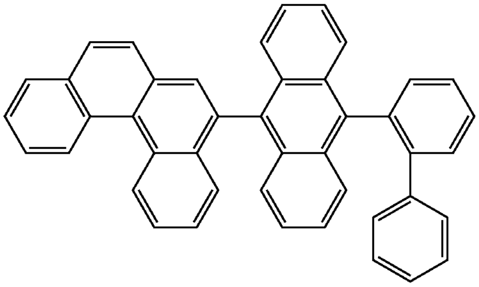
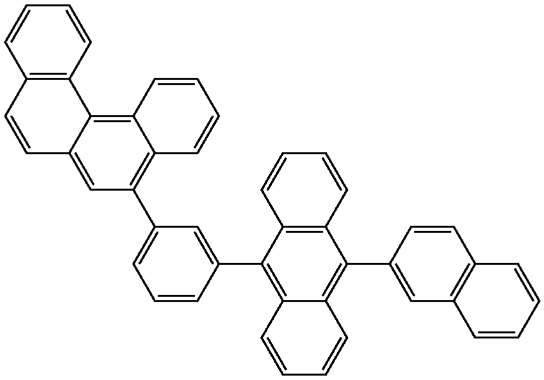
-continued
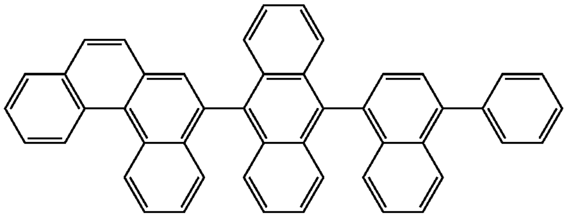
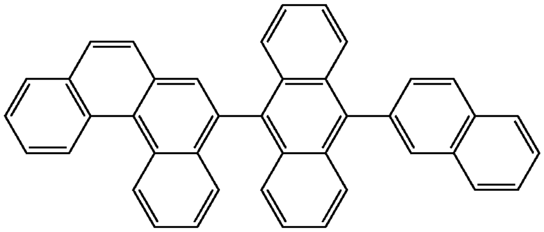
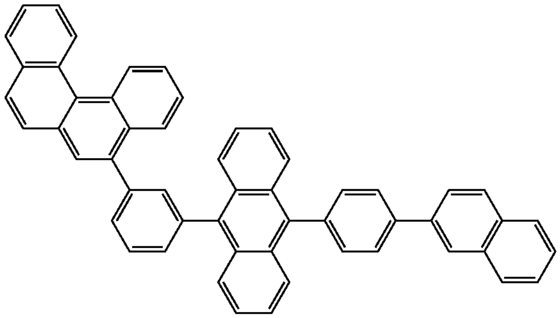
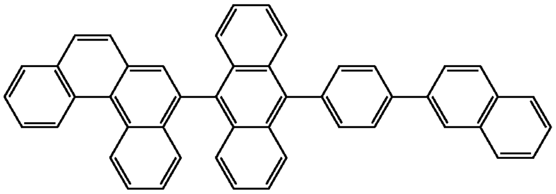
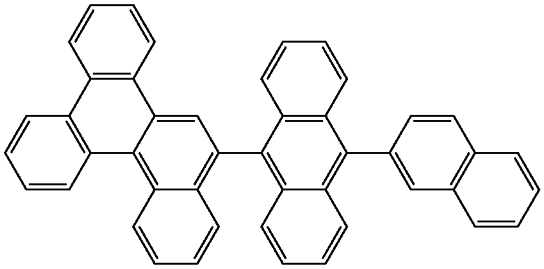
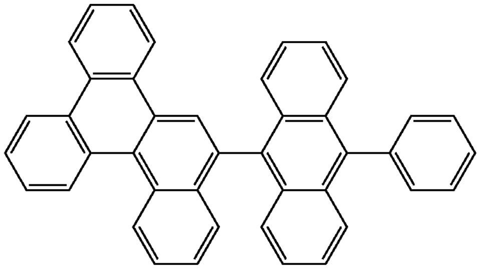

-continued
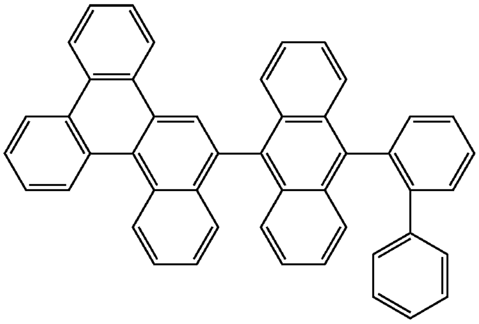
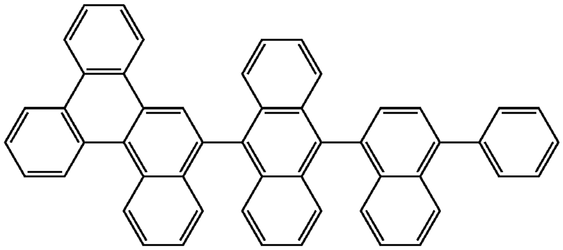
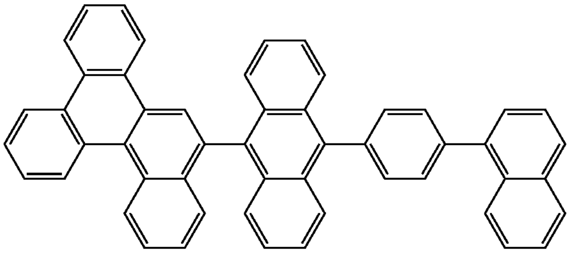
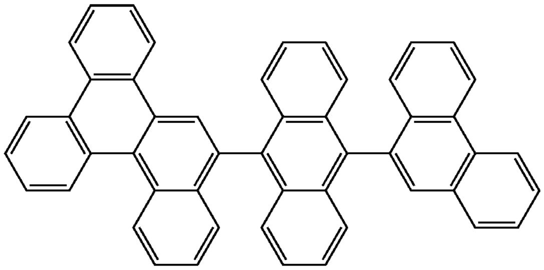
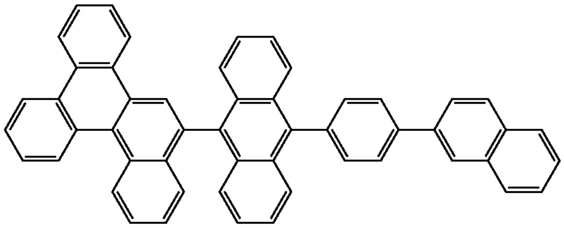
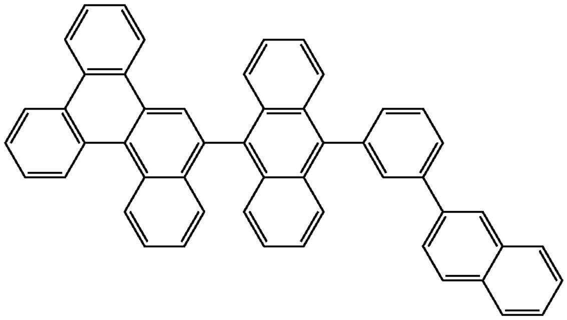
-continued
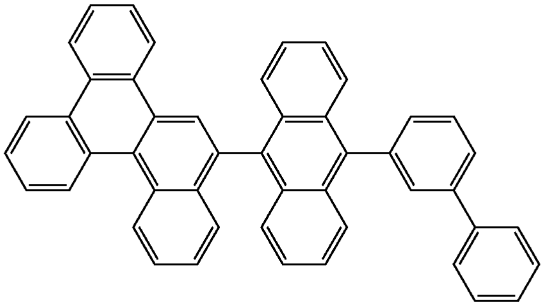
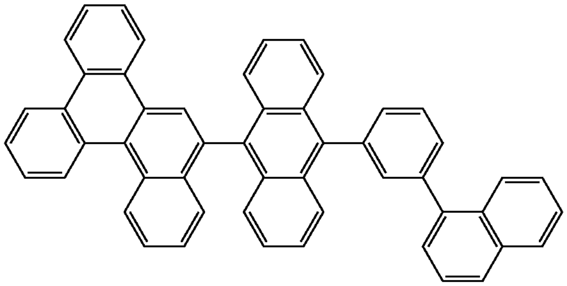
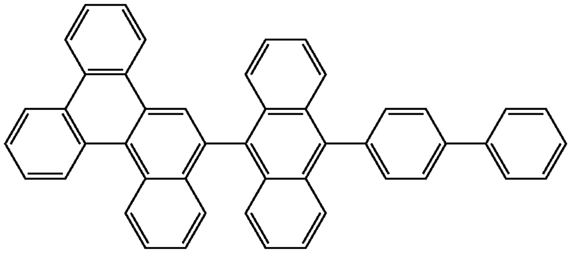
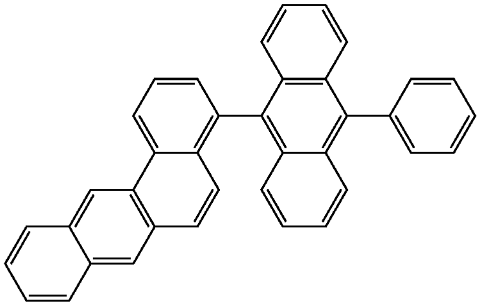
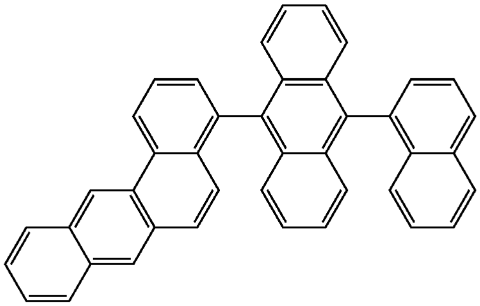

-continued
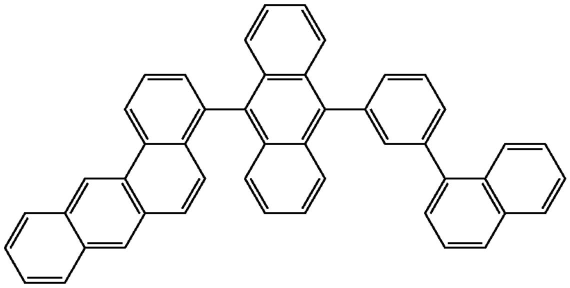
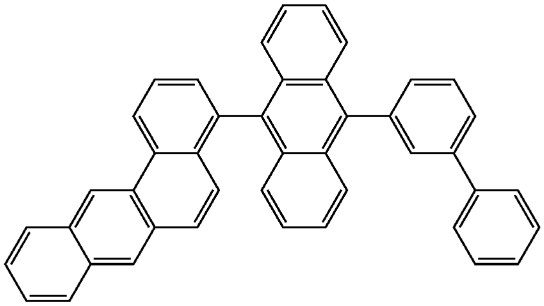
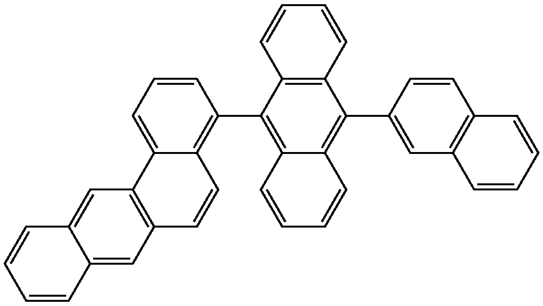
[Formula 212]
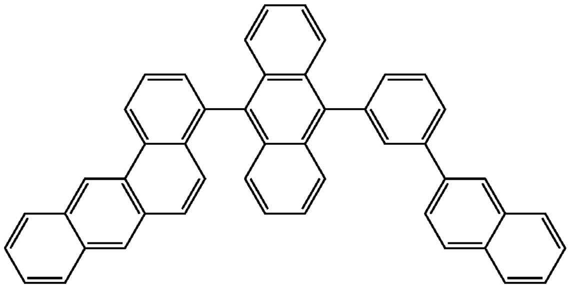
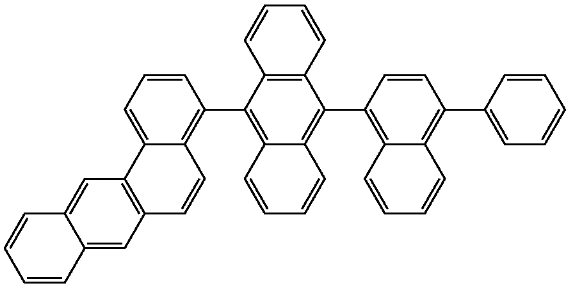
-continued
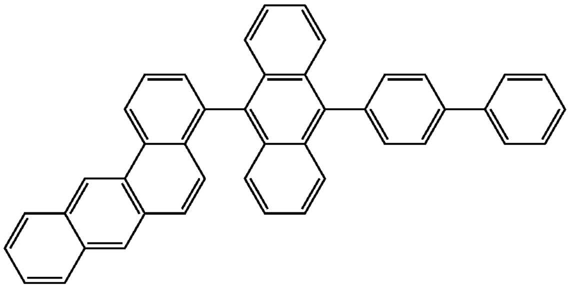
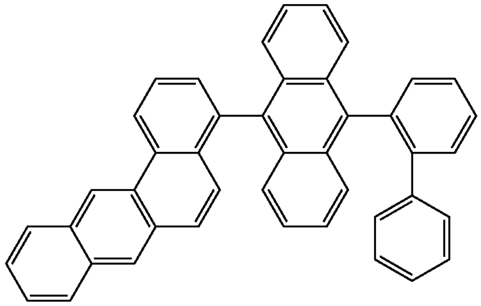
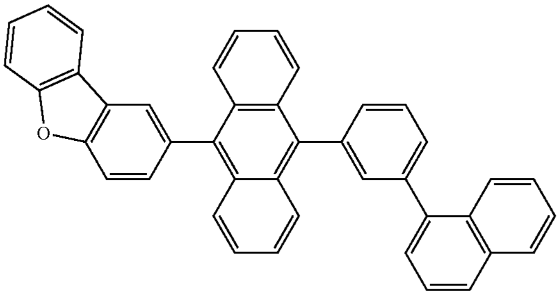
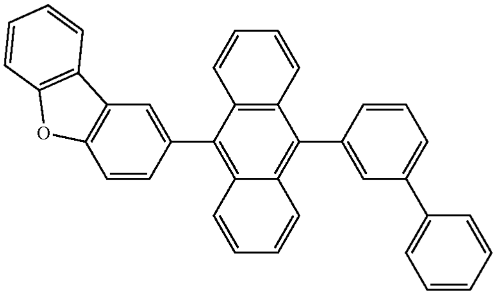
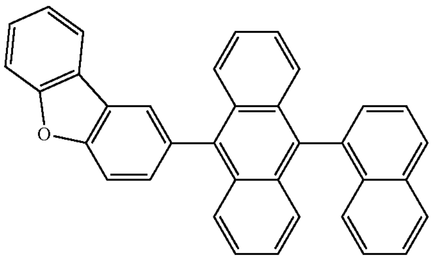

-continued
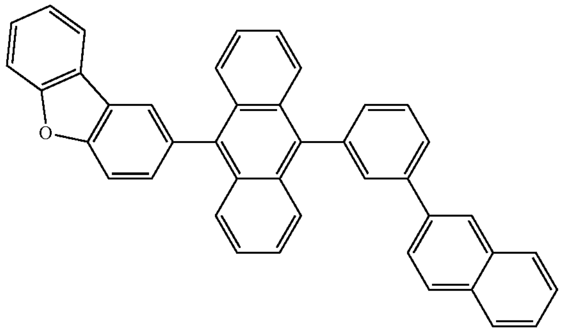
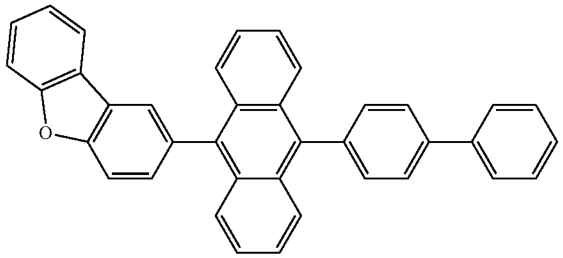
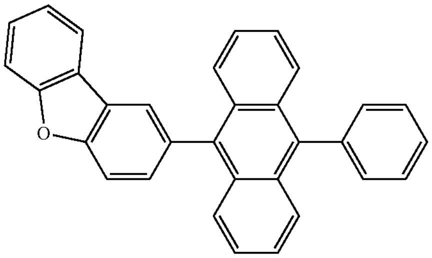
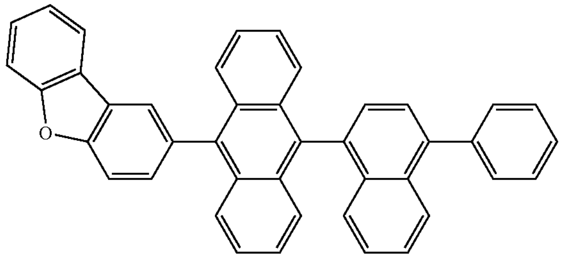
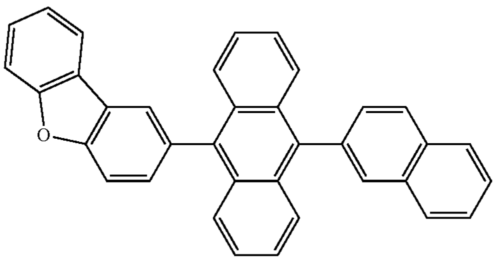
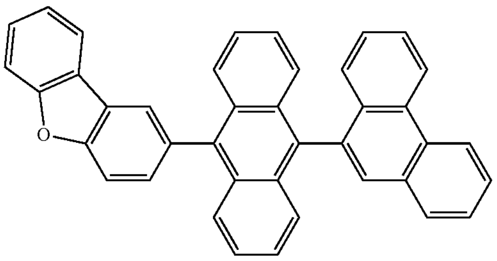
-continued
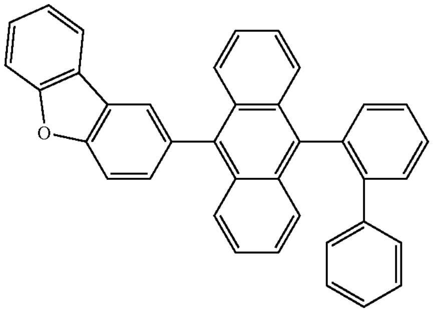
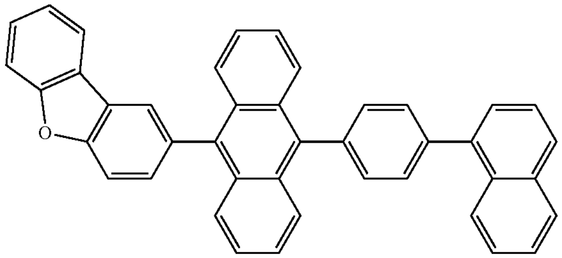
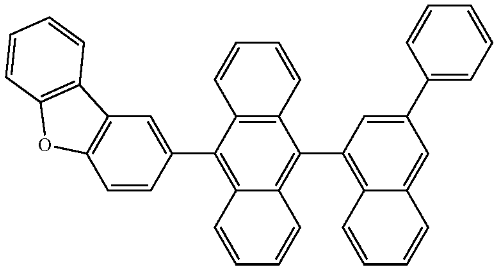
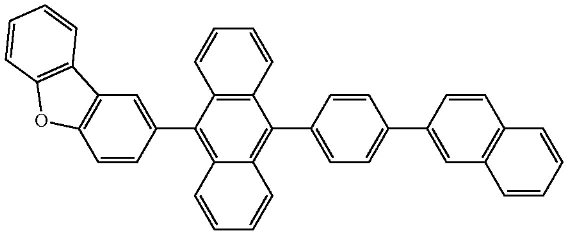
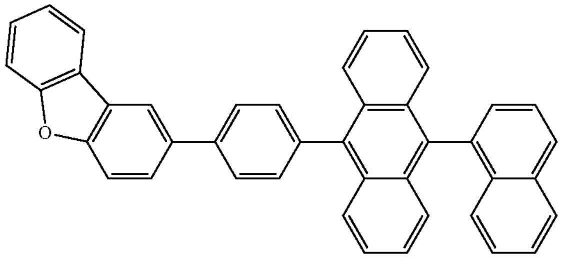
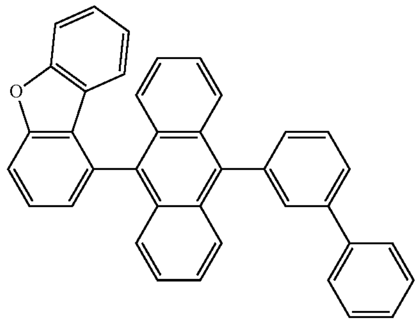

-continued
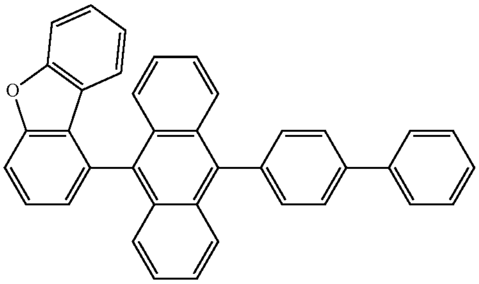
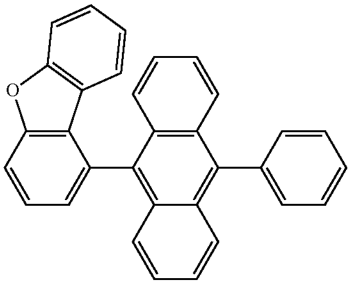
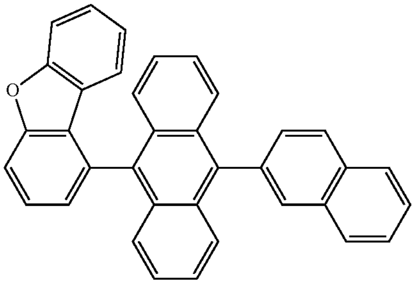
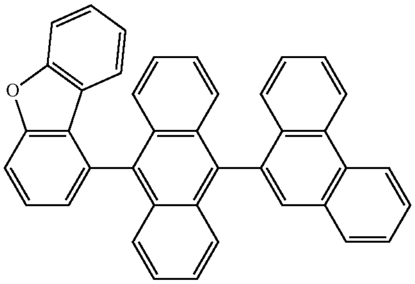
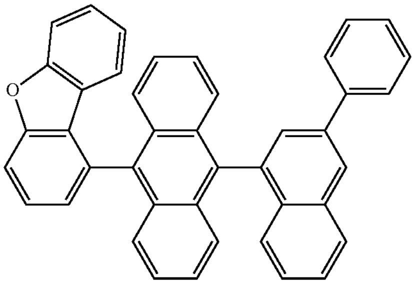
-continued
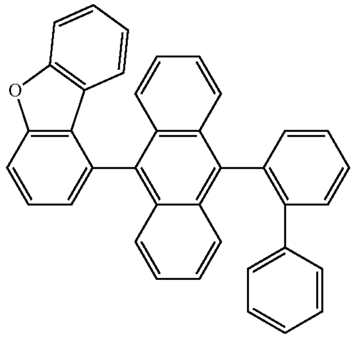
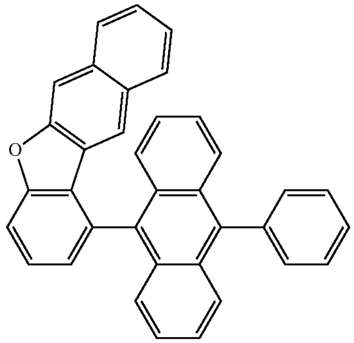
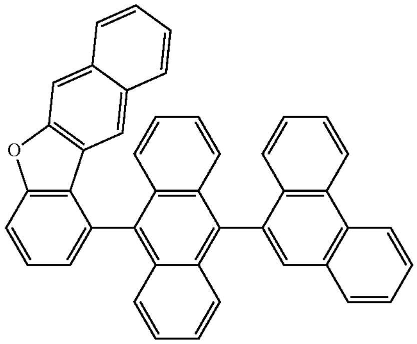
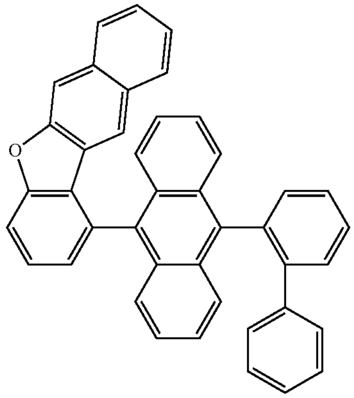

-continued
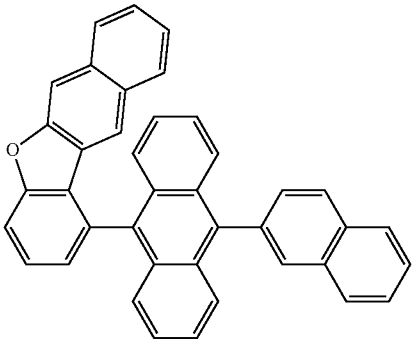
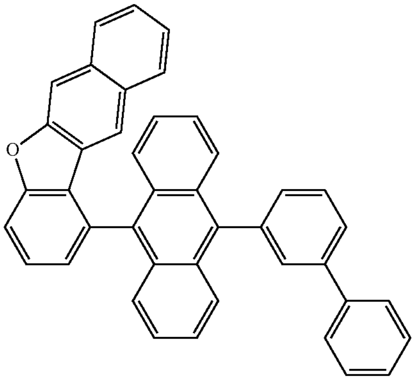
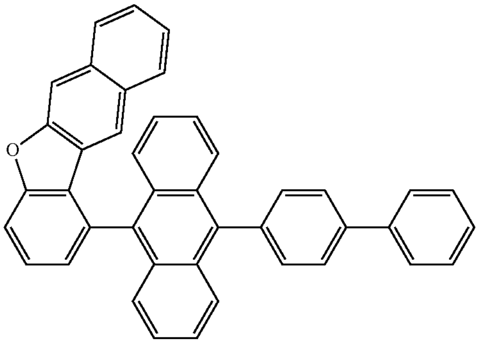
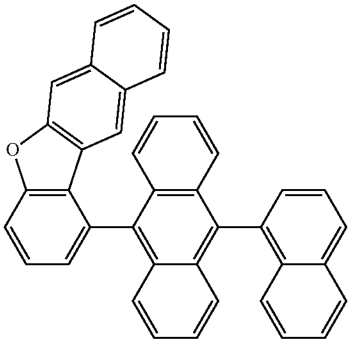
-continued
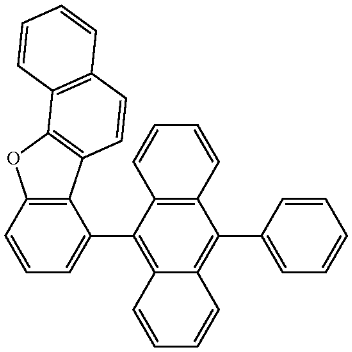
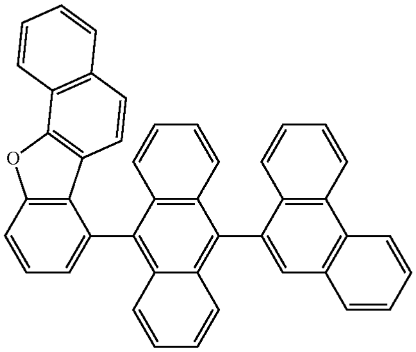
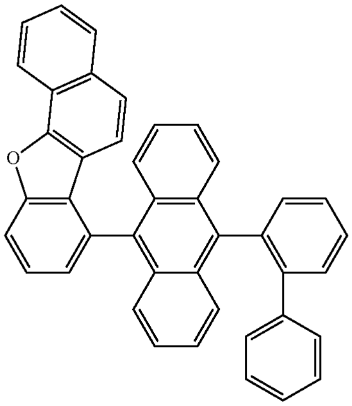
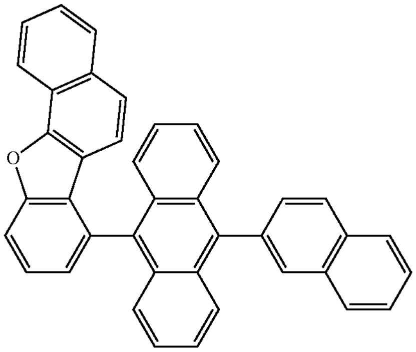

-continued
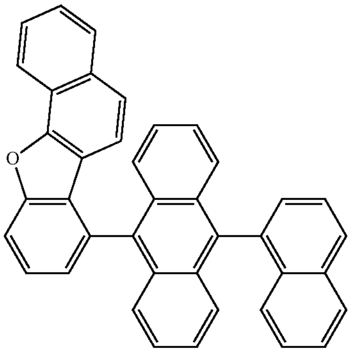
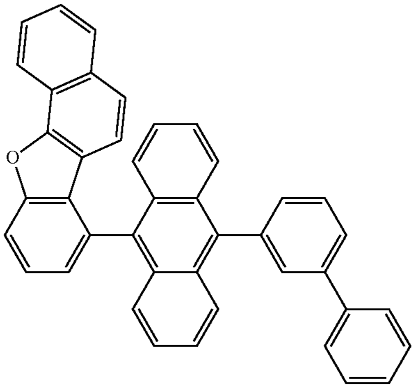
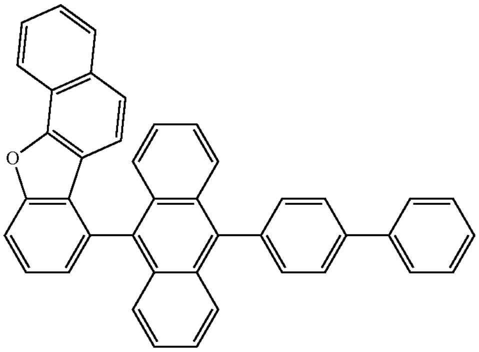
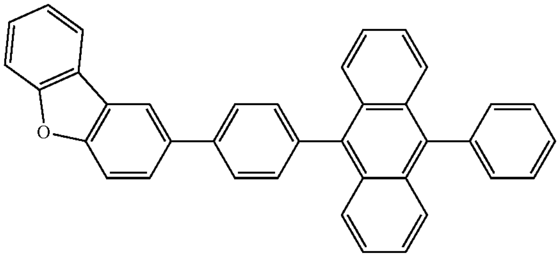
[Formula 213]
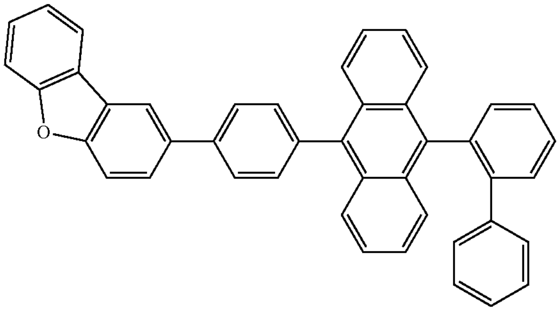
-continued
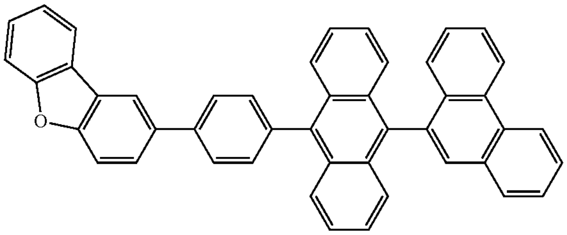
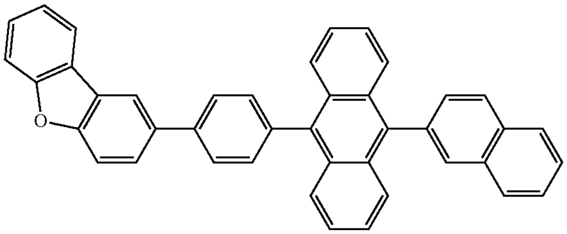
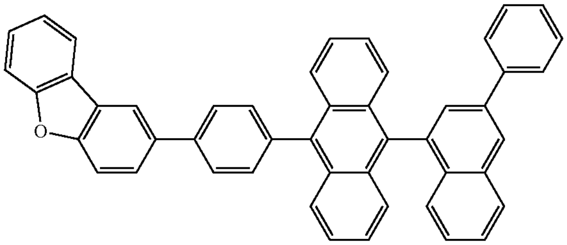
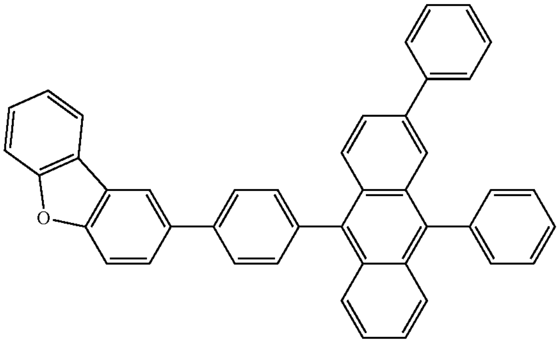
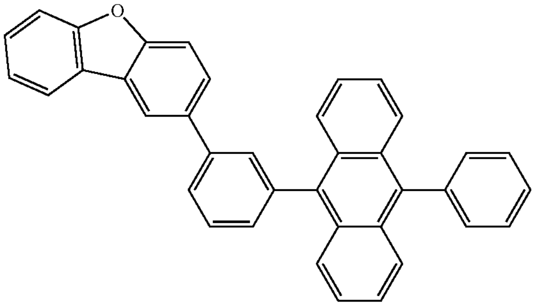
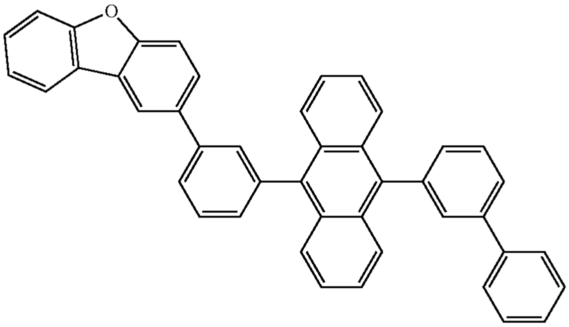

-continued
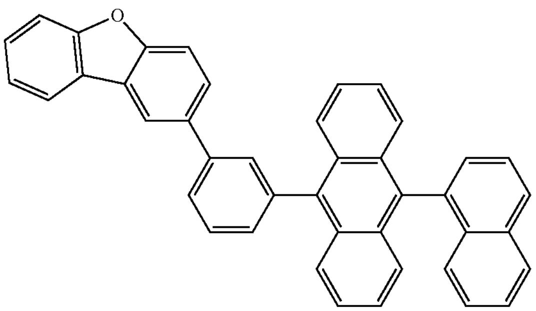
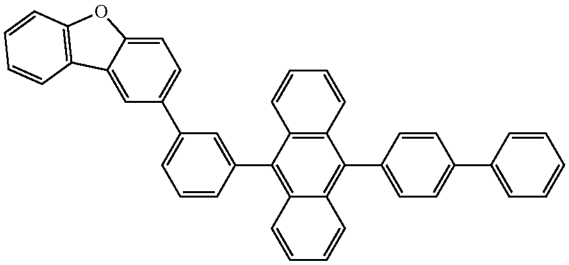
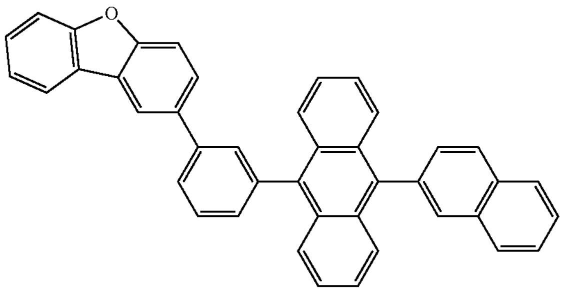
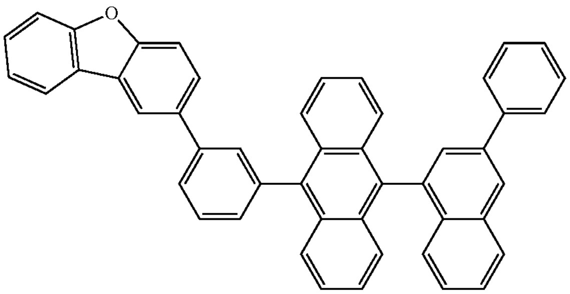
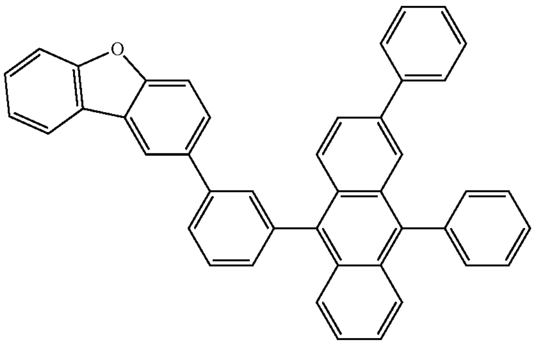
-continued
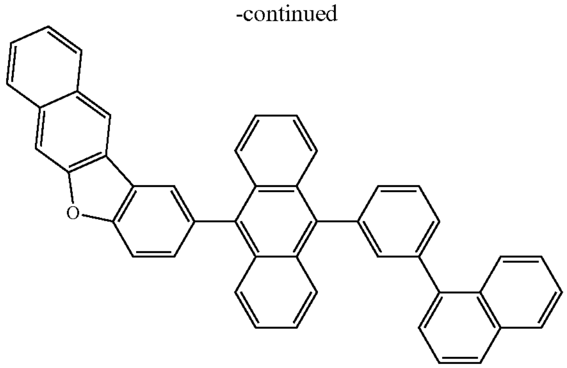
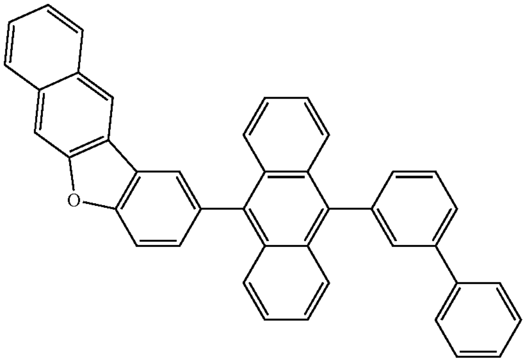
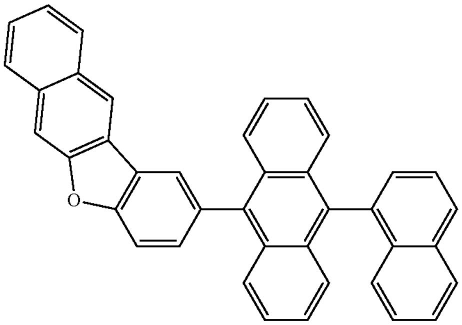
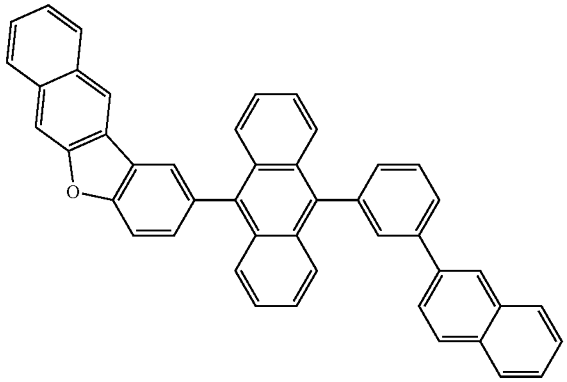
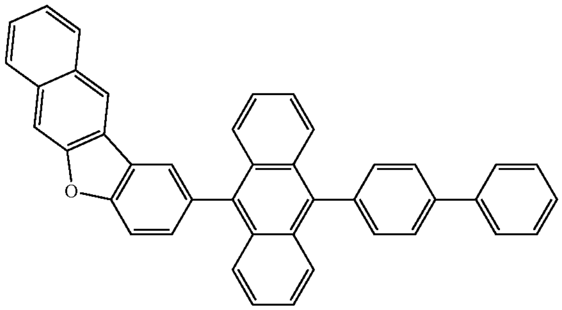

-continued
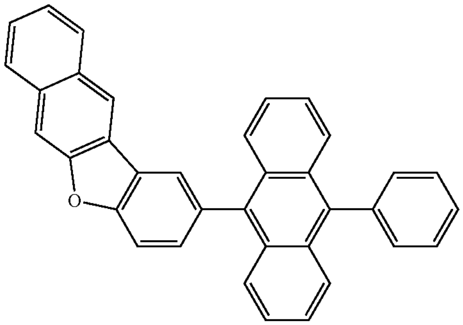
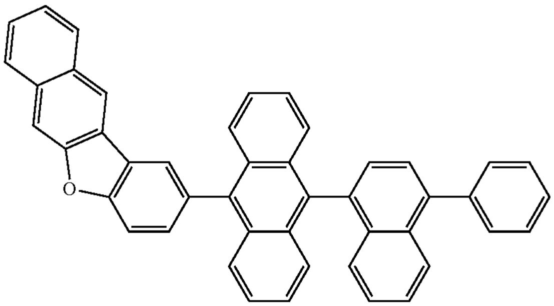
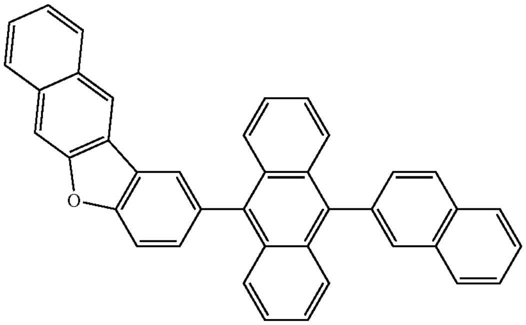
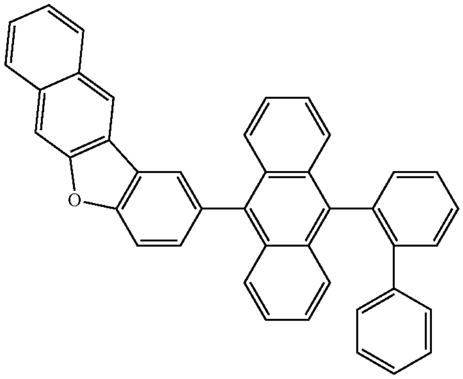
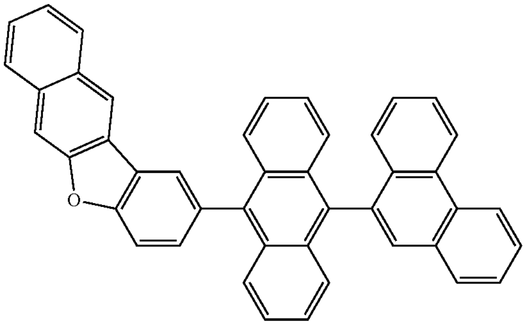
-continued
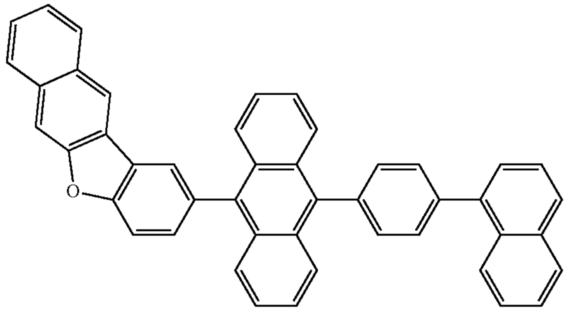
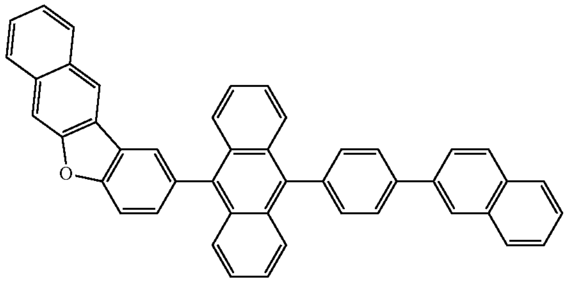
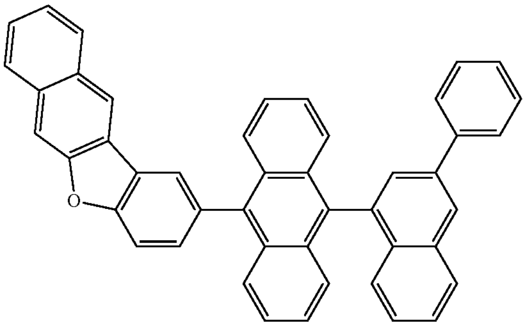
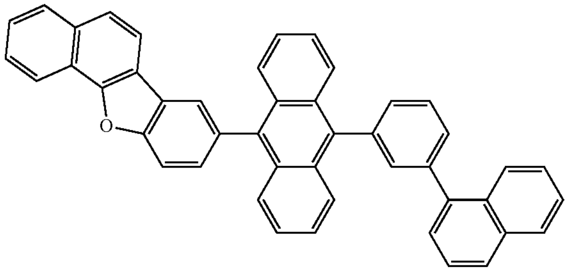
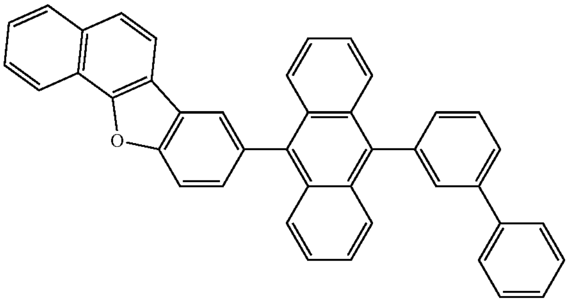

-continued
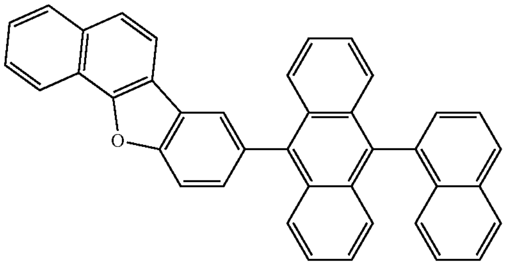
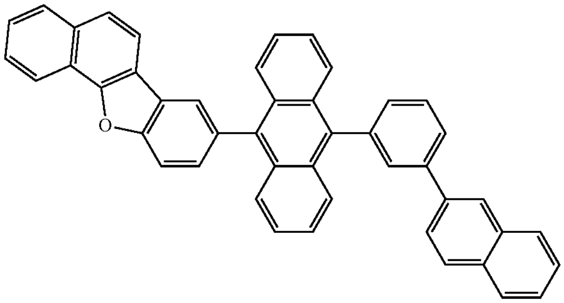
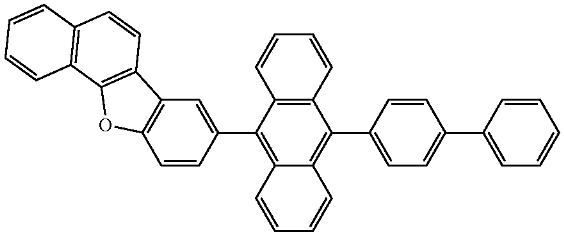
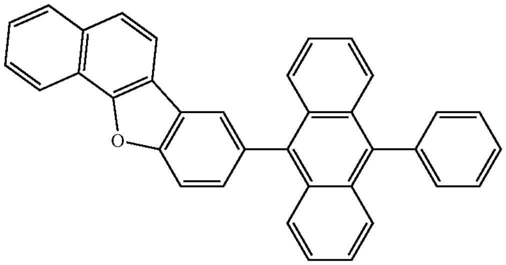
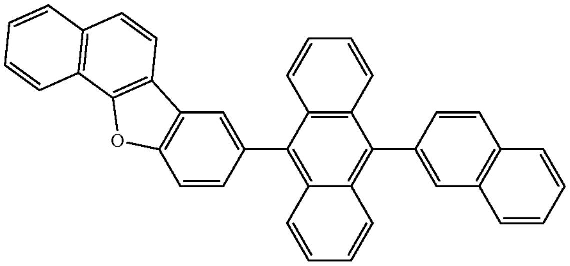
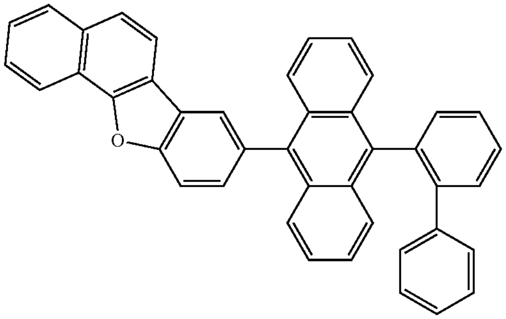
-continued
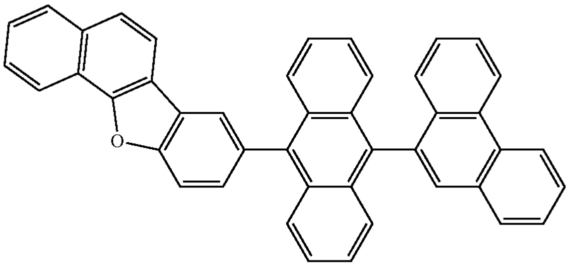
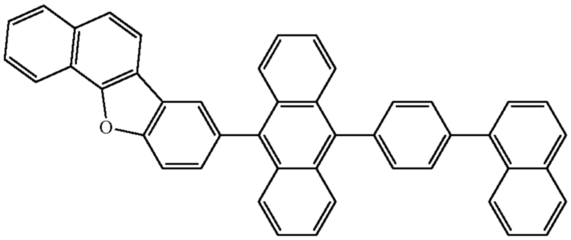
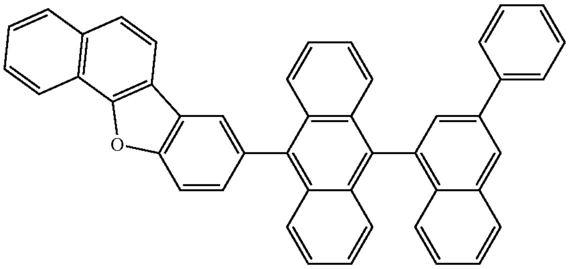
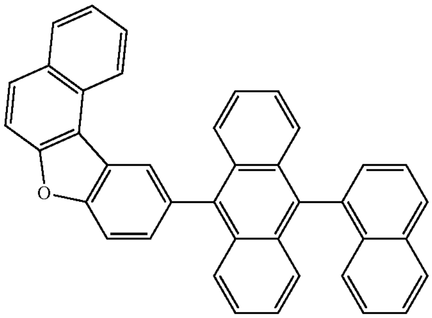
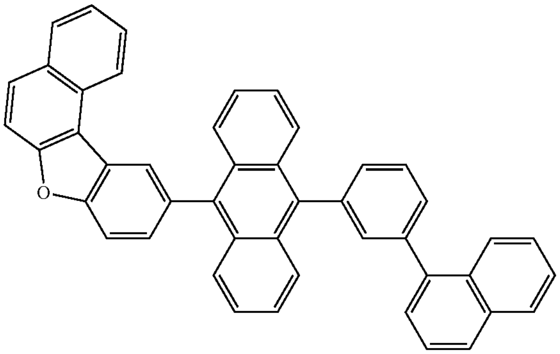

-continued
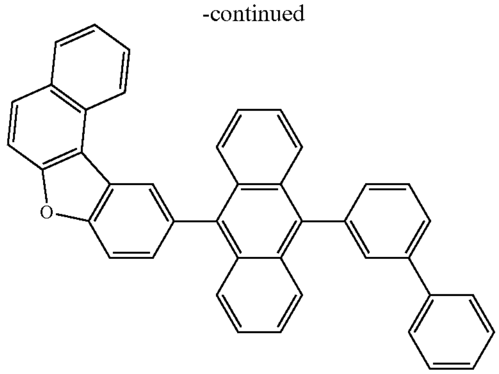
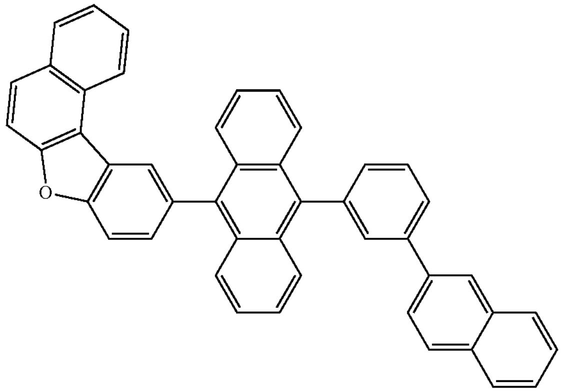
[Formula 214]
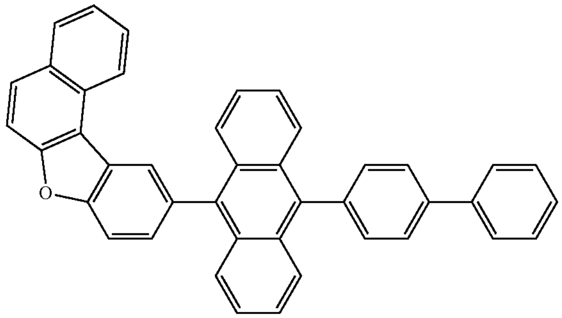
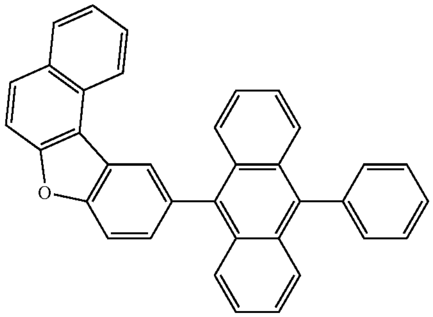
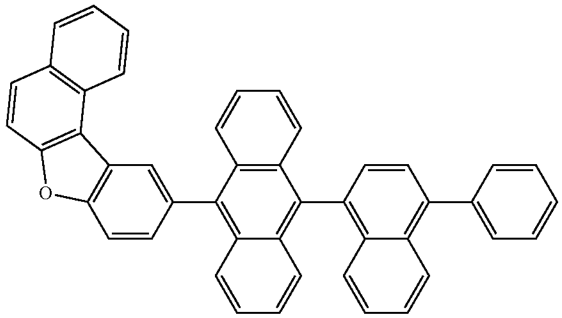
-continued
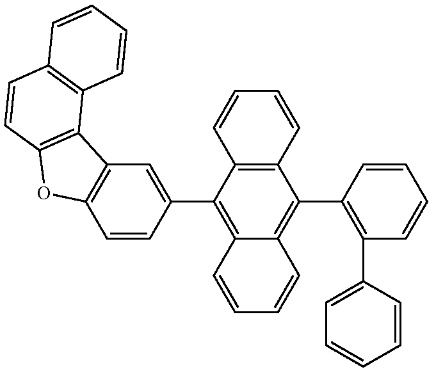
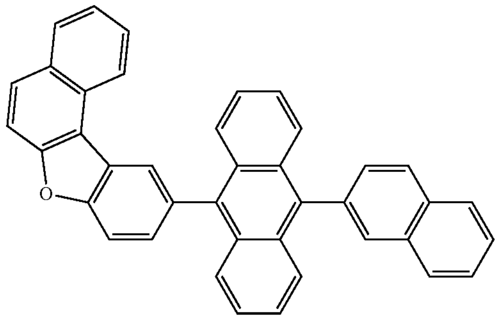
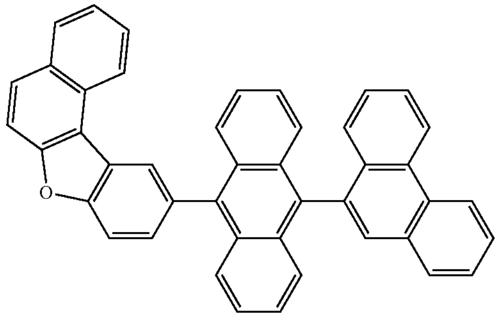
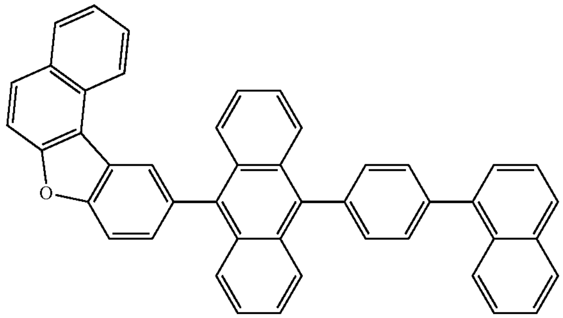
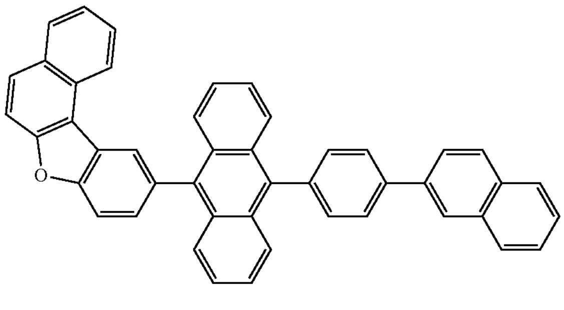

-continued
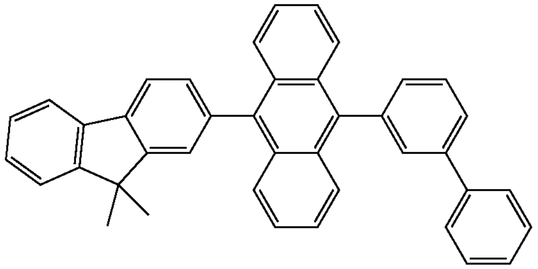
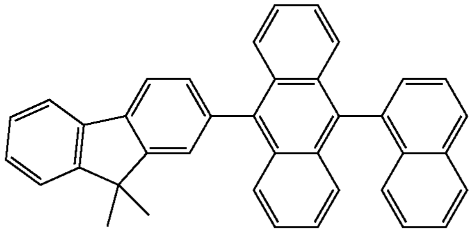
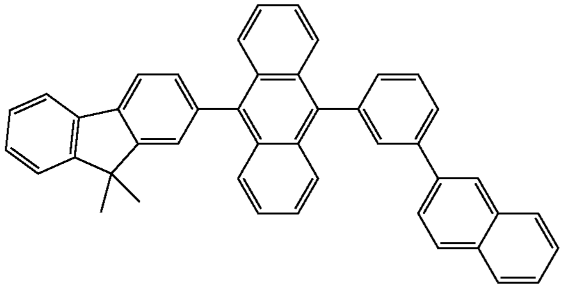
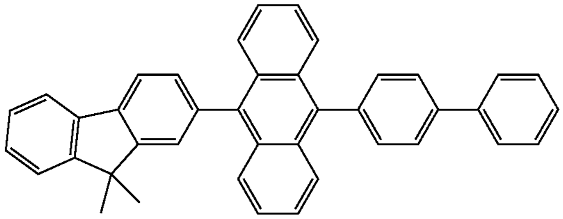
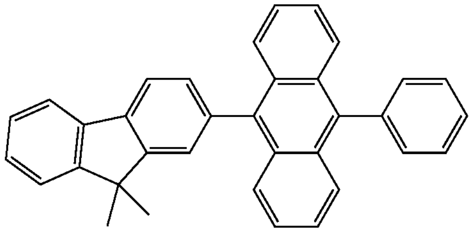
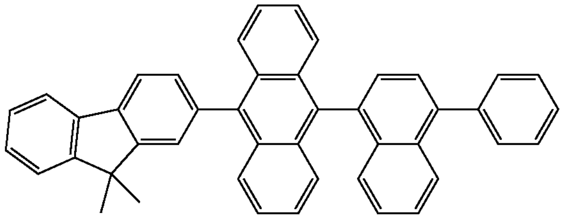
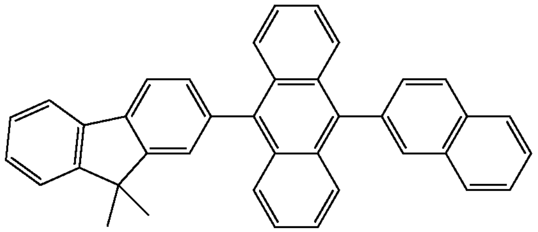
-continued
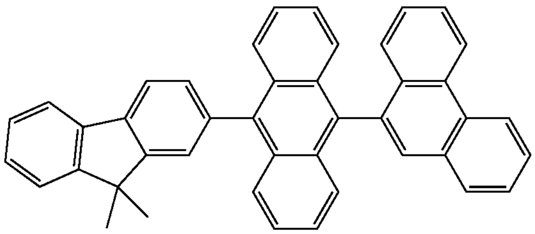
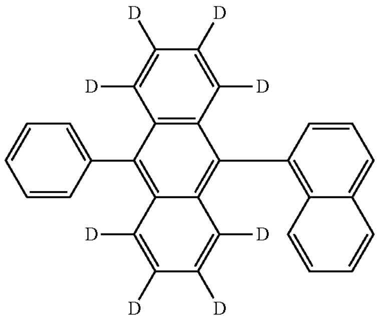
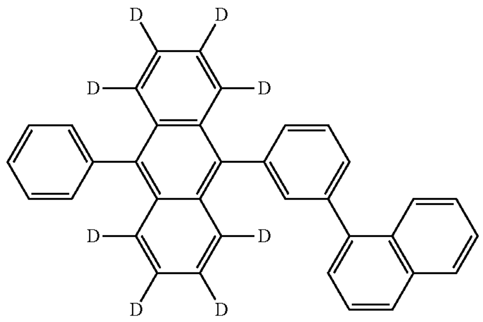
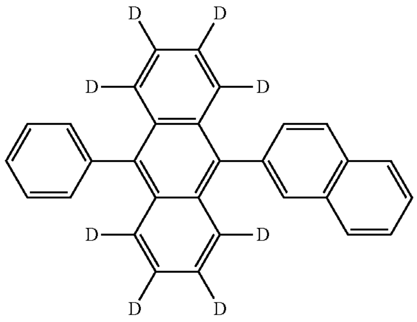
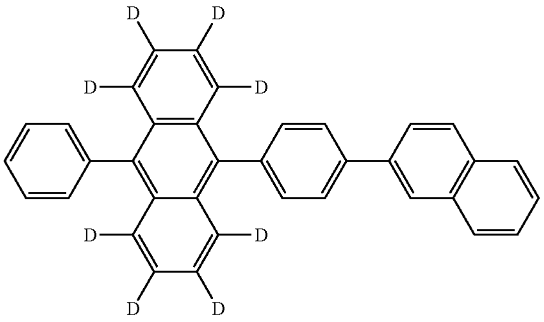

-continued
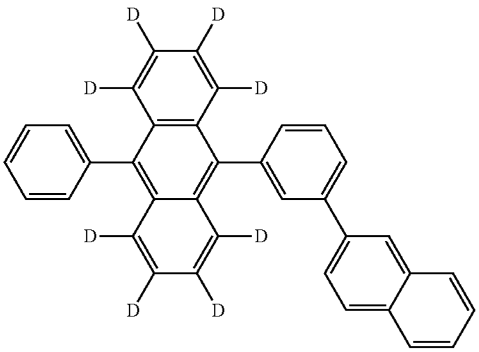
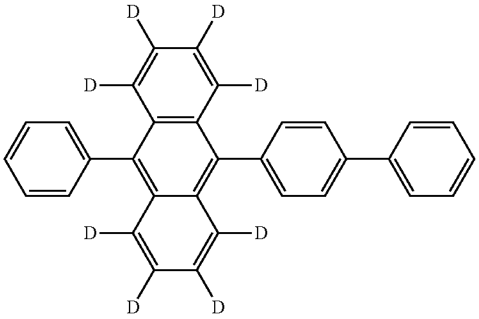
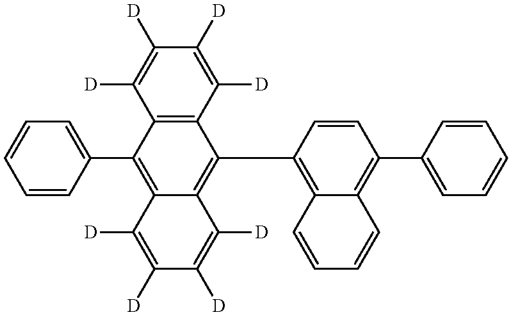
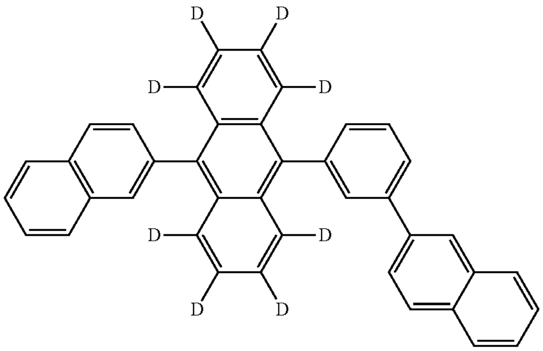
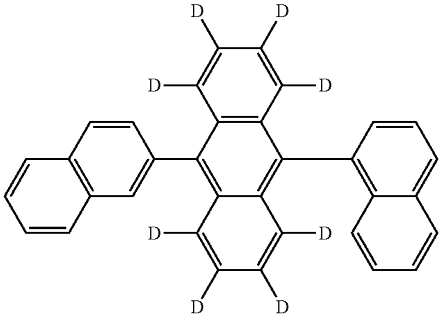
-continued
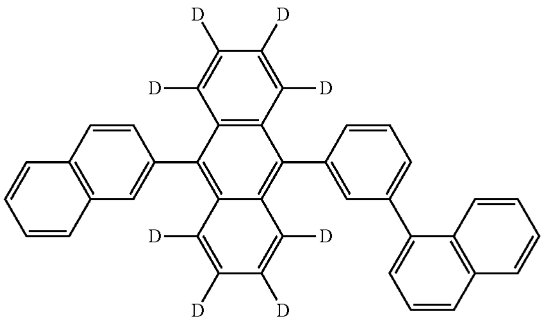
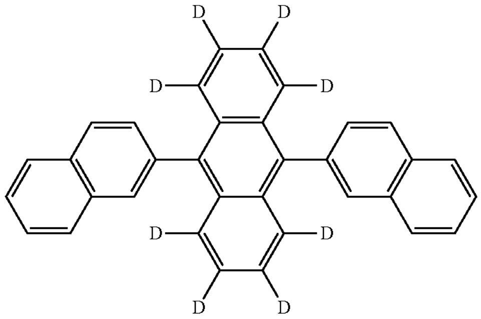
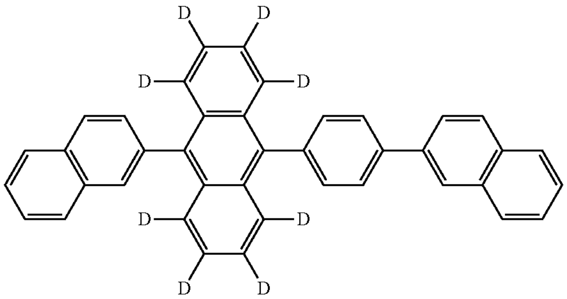
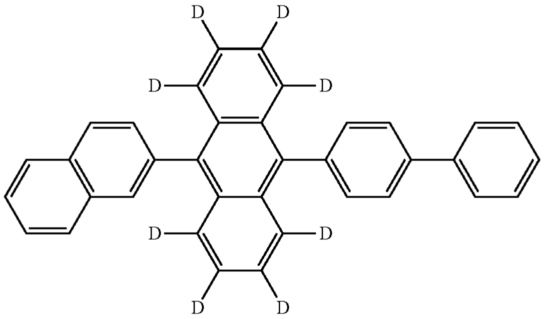
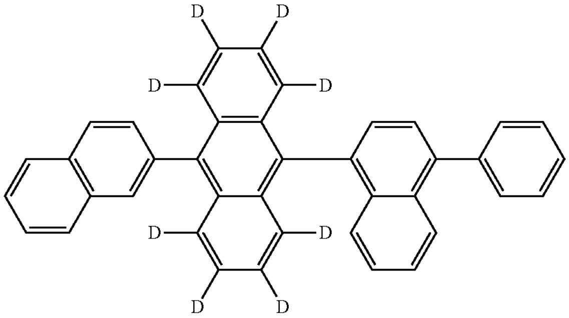

-continued
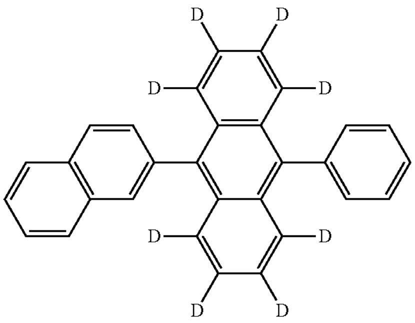
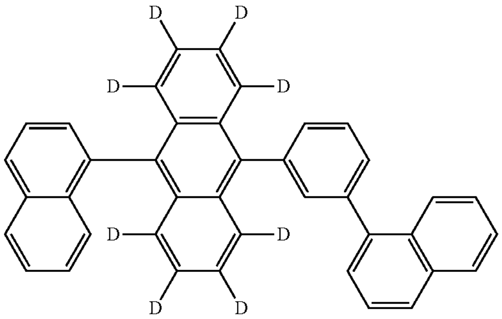
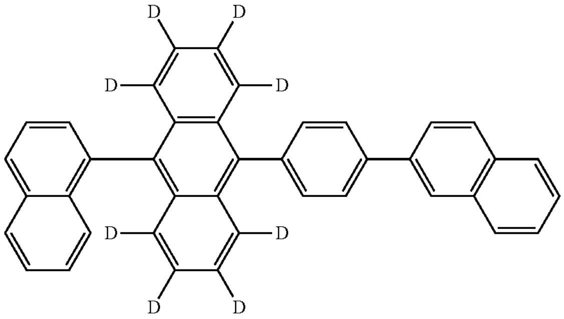
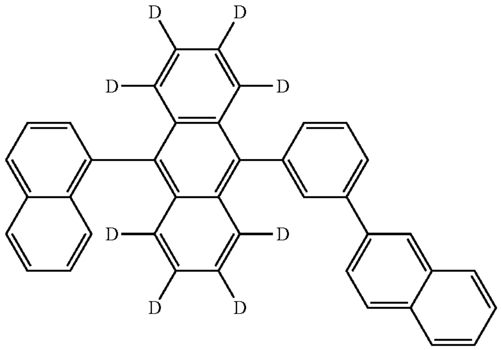
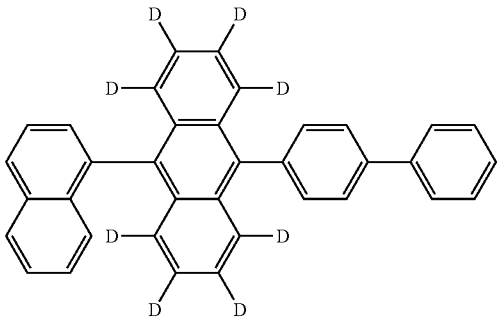
-continued
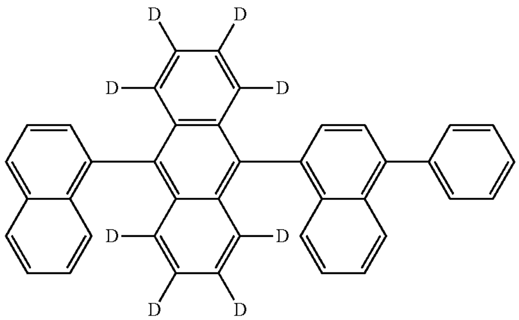
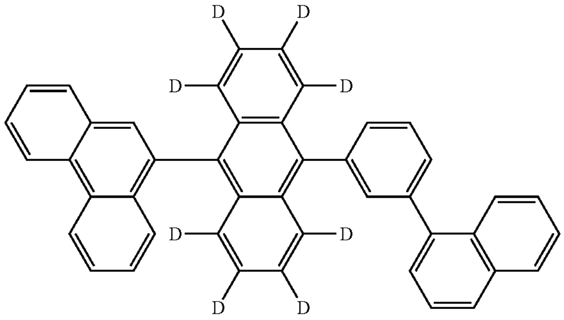
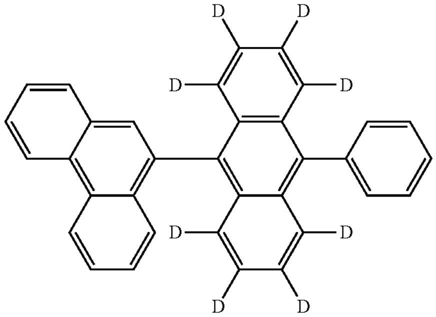
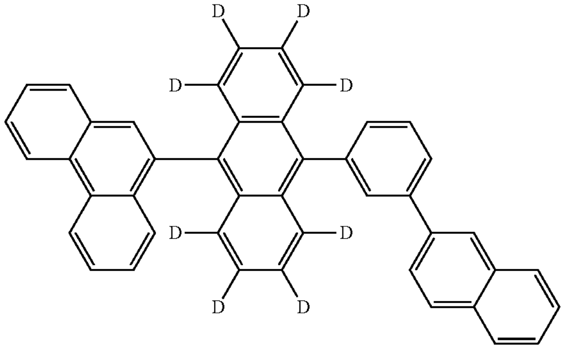
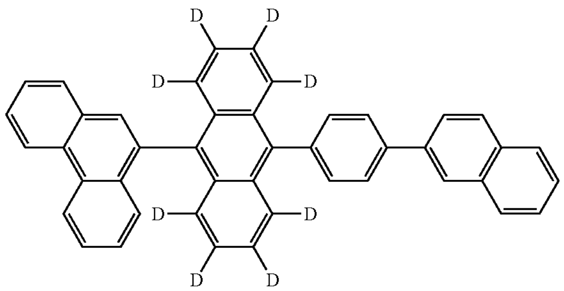

[Formula 215]
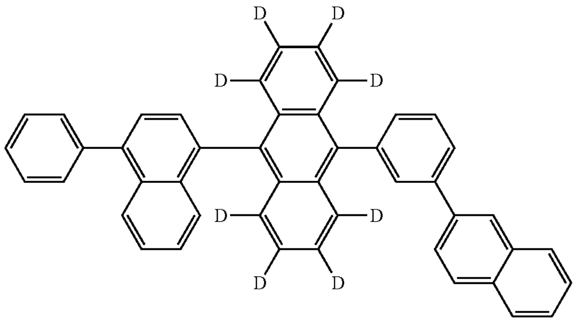
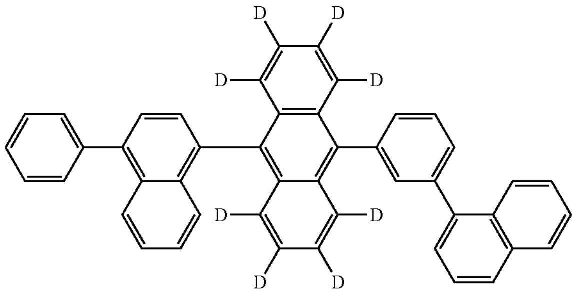
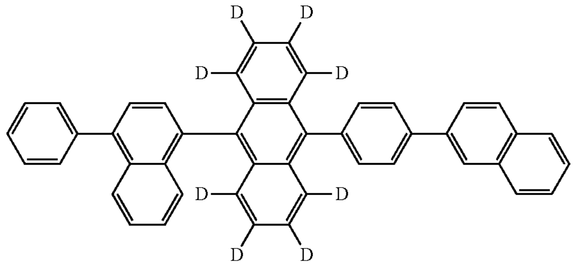
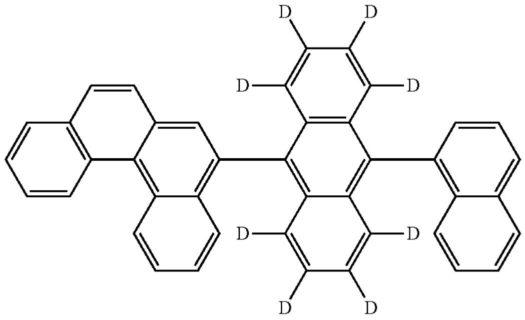
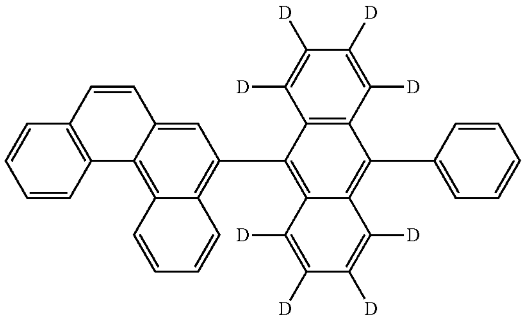
-continued
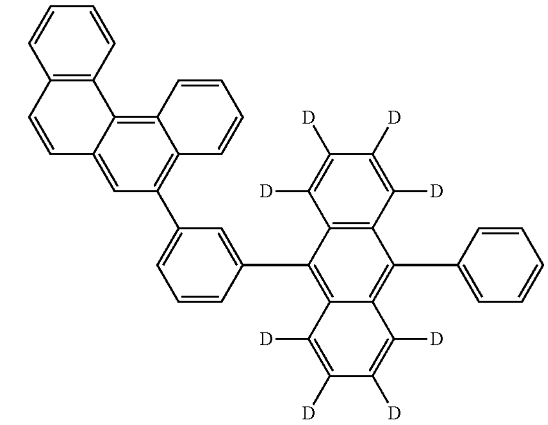
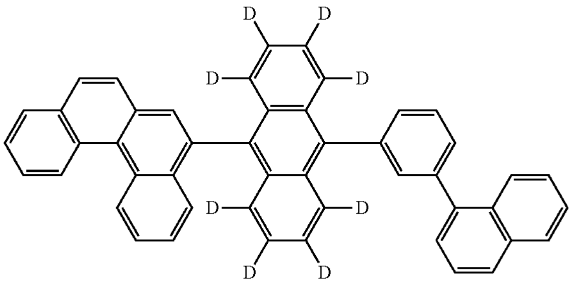
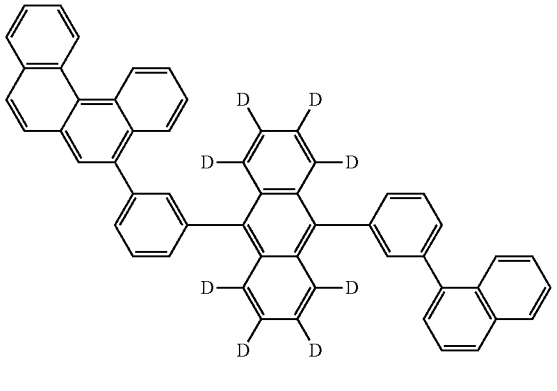
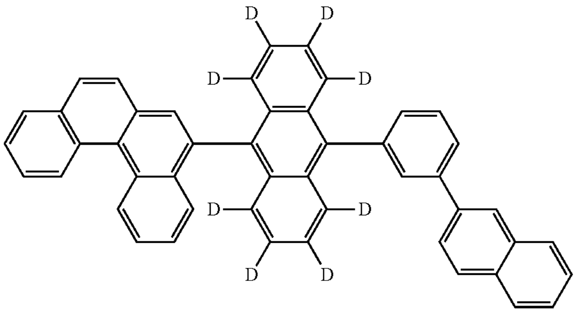

-continued
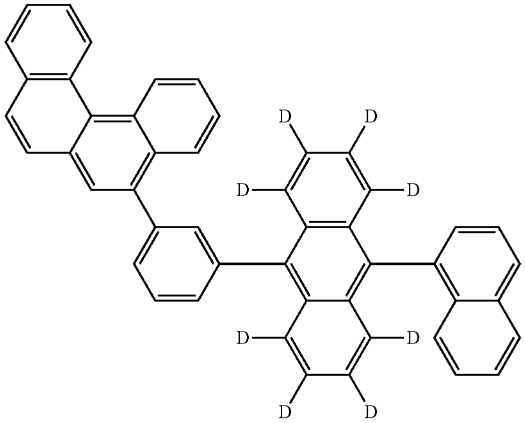
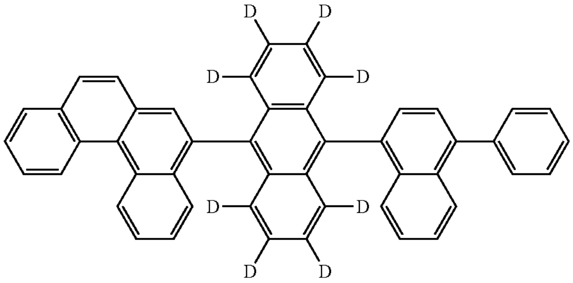
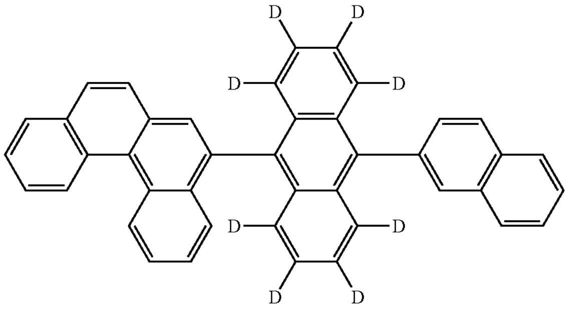
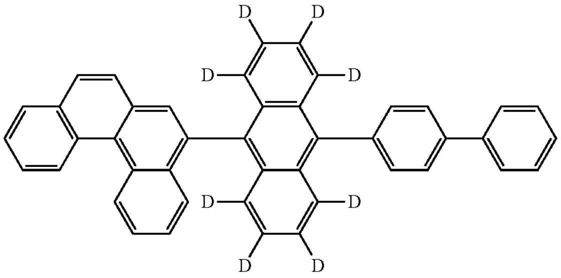
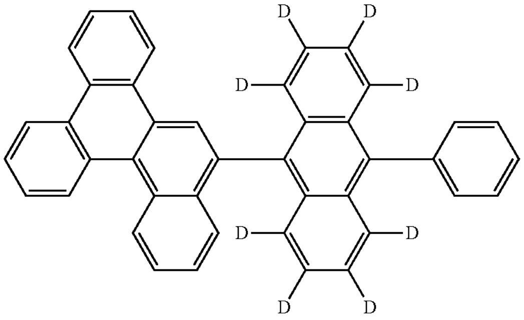
-continued
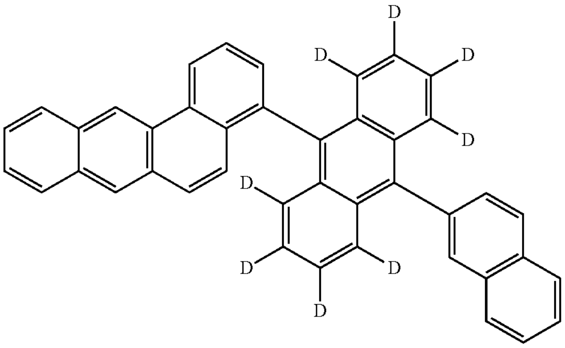
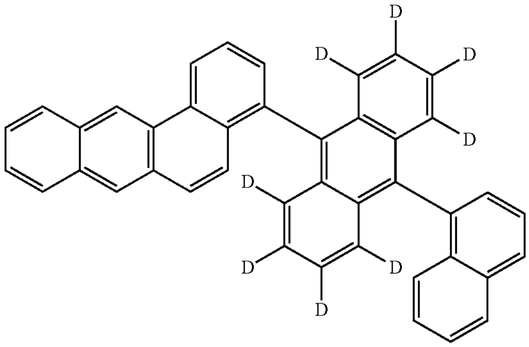
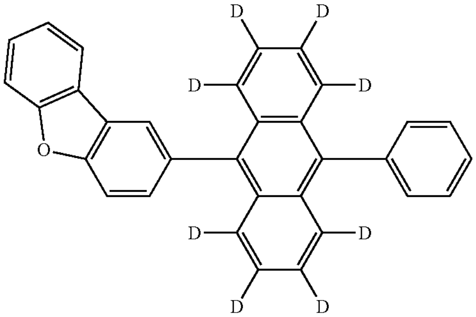
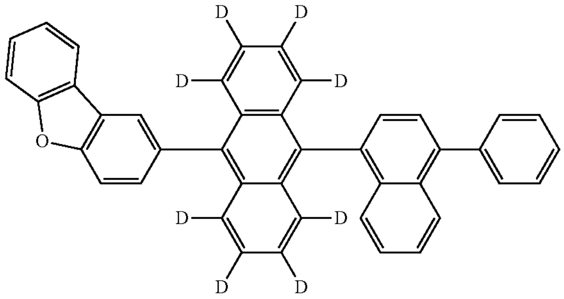
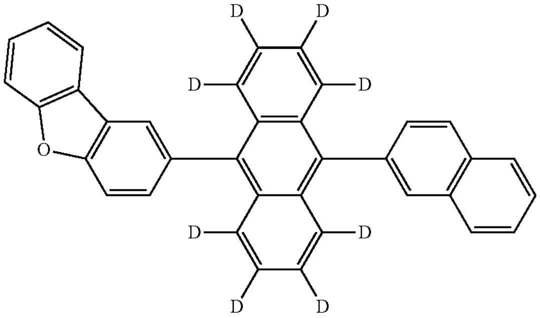

-continued
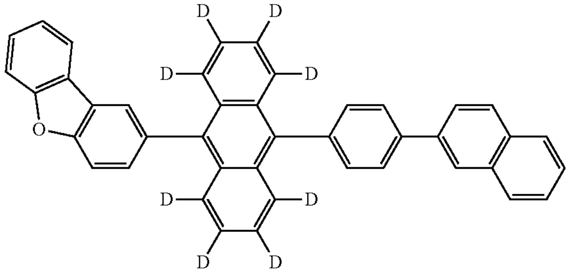
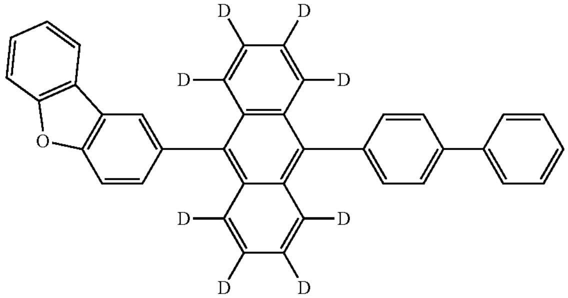
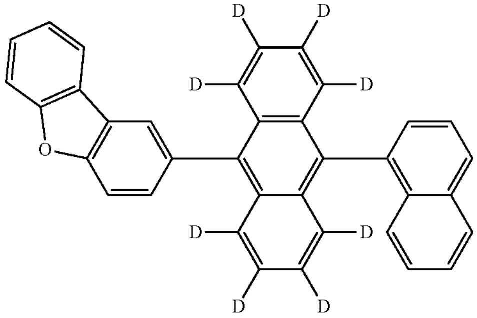
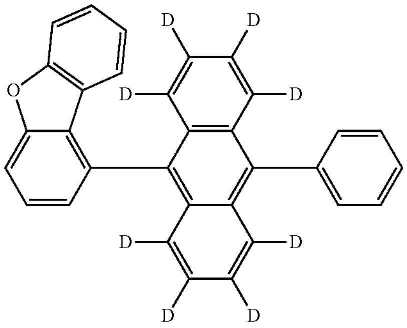
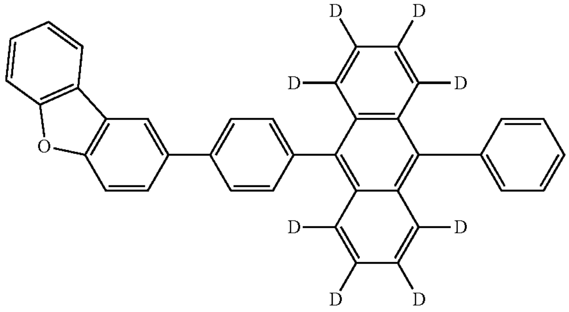
-continued
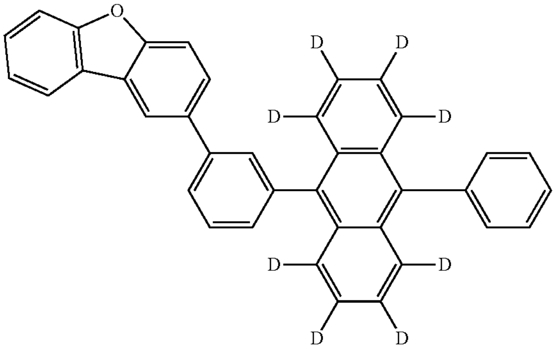
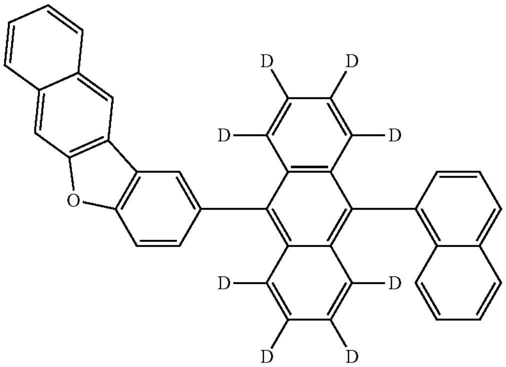
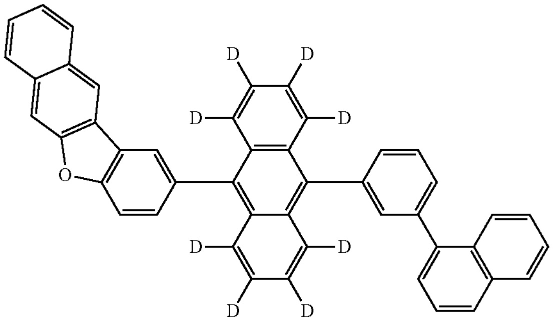
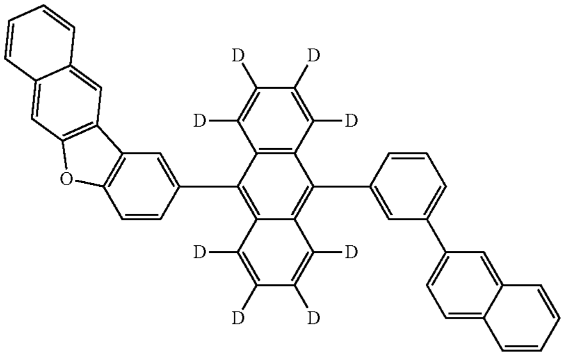

-continued
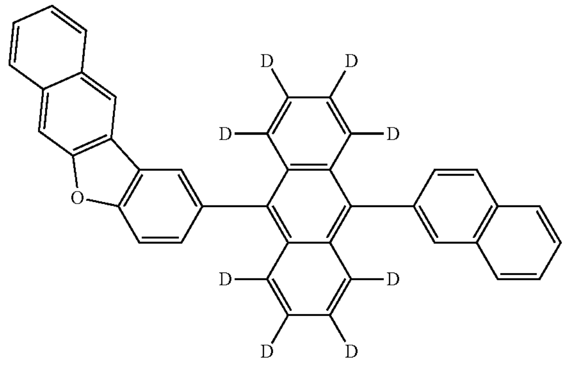
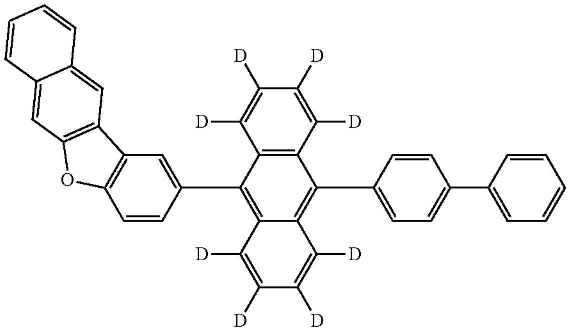
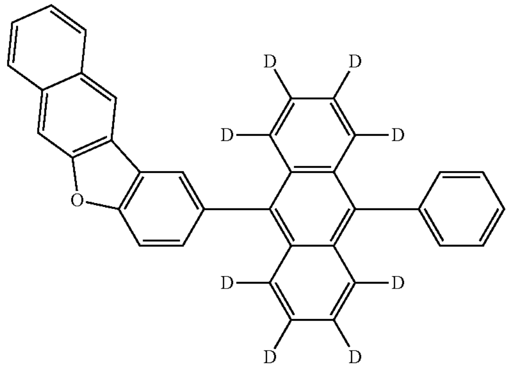
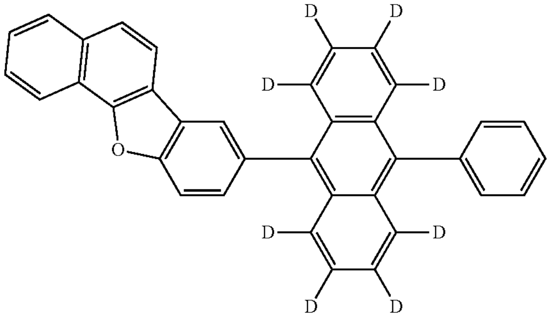
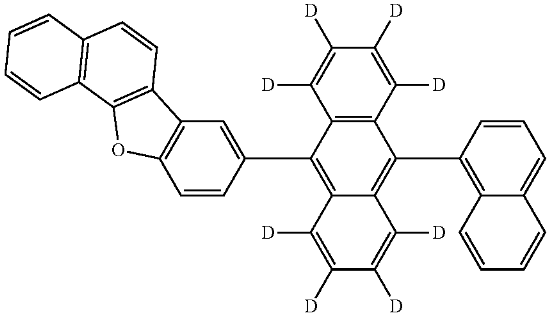
-continued
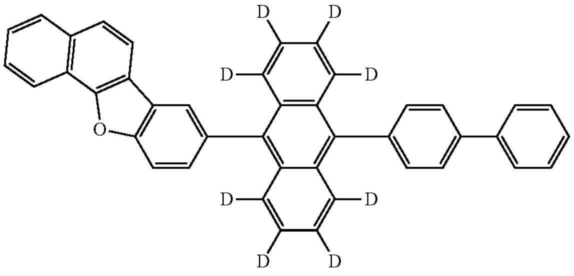
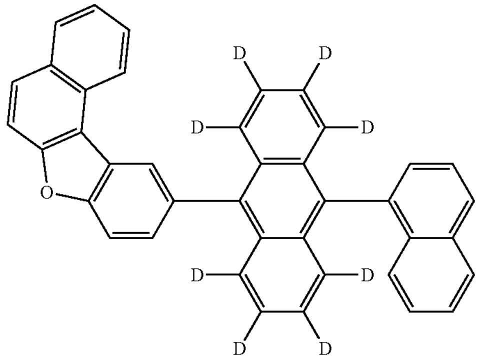
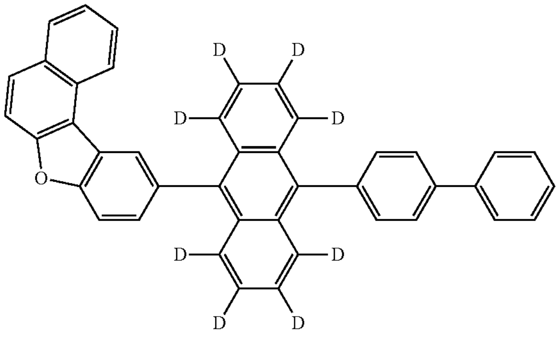
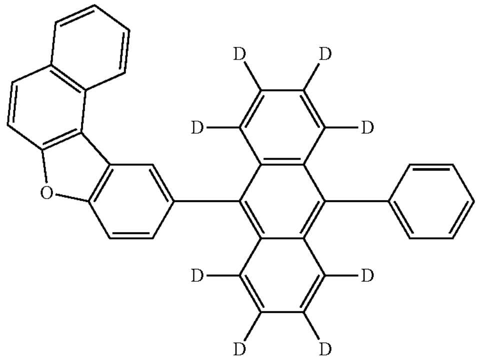
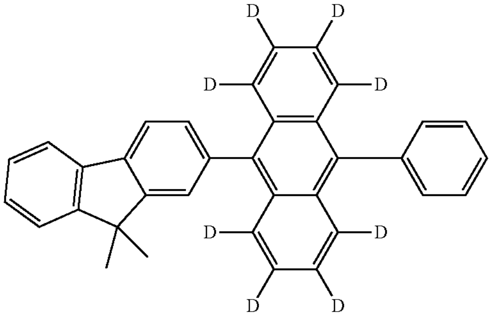

-continued
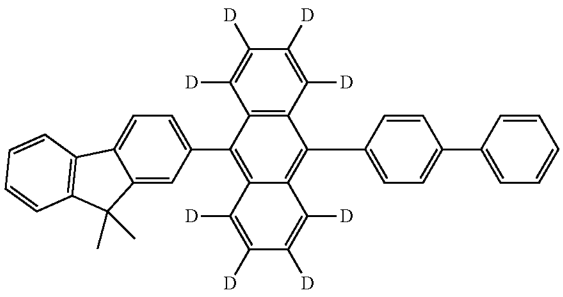
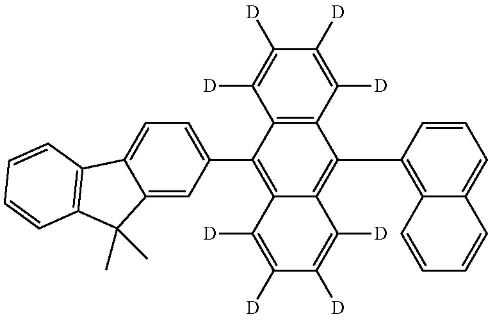
[Formula 216]
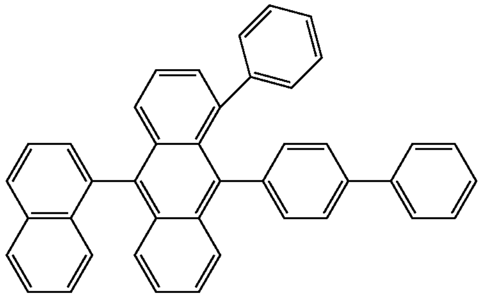
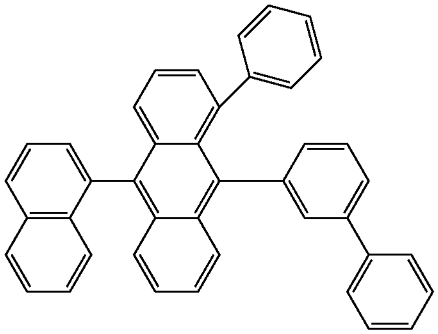
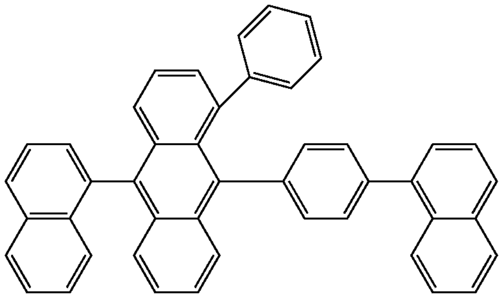
-continued
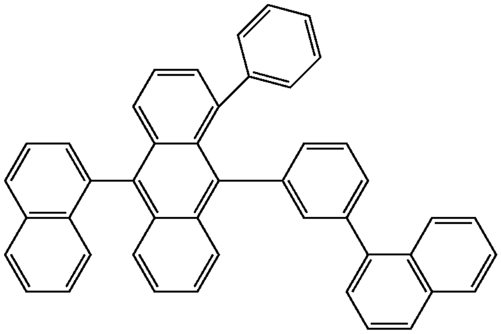
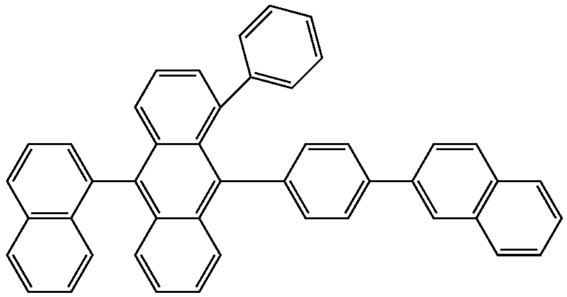
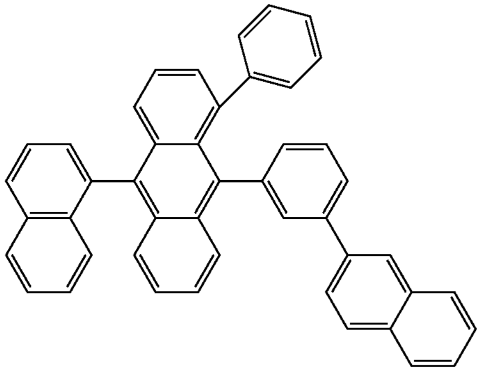
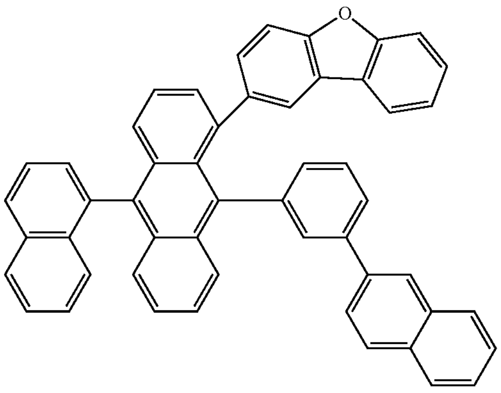

-continued
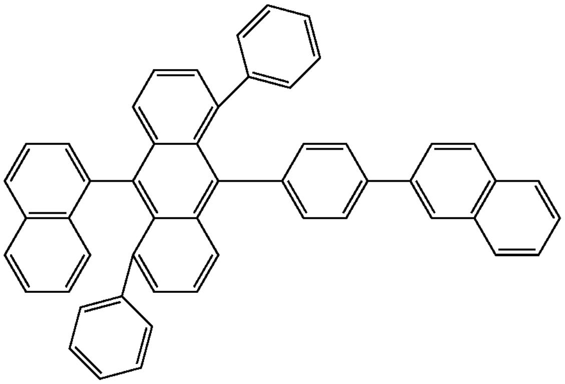
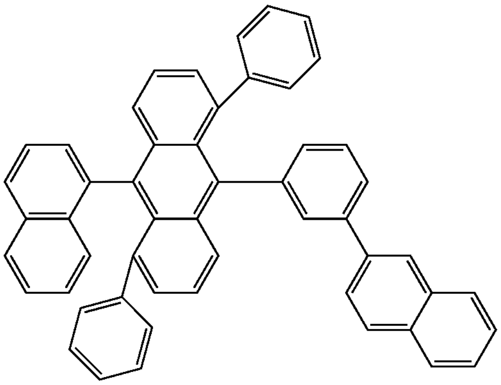
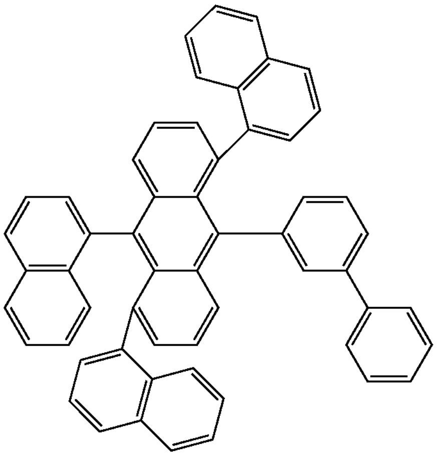
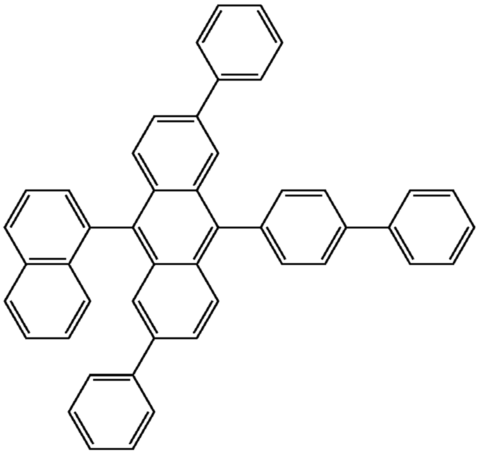
-continued
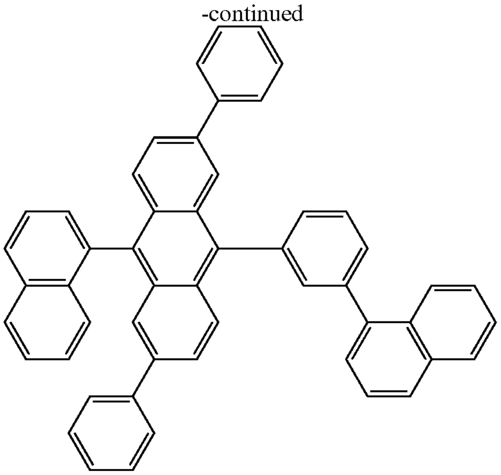
[Formula 217]
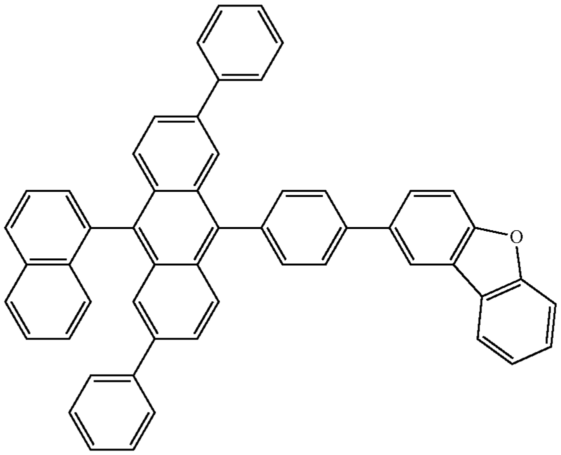
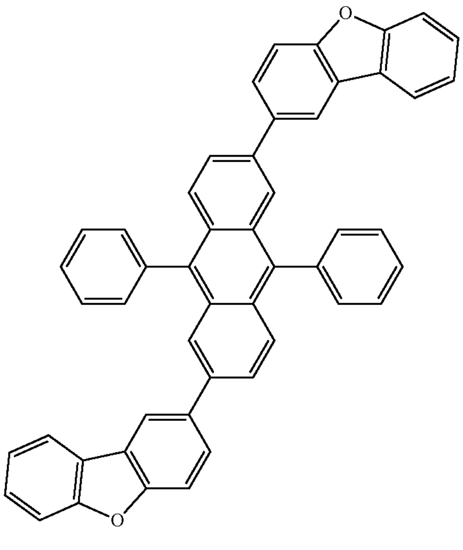

-continued
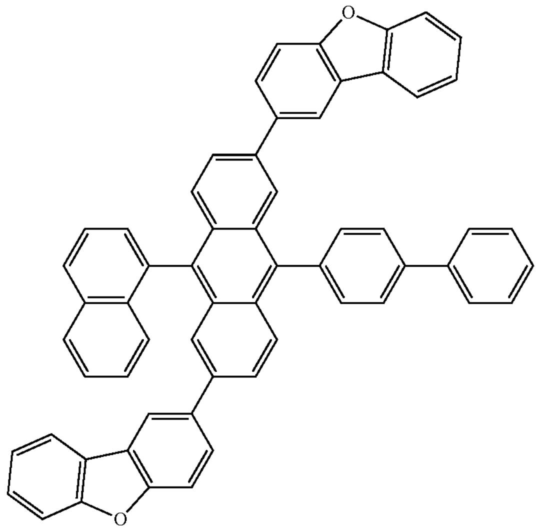
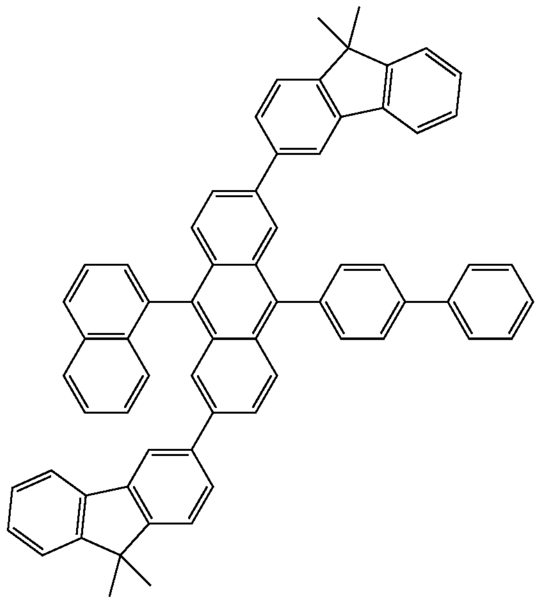
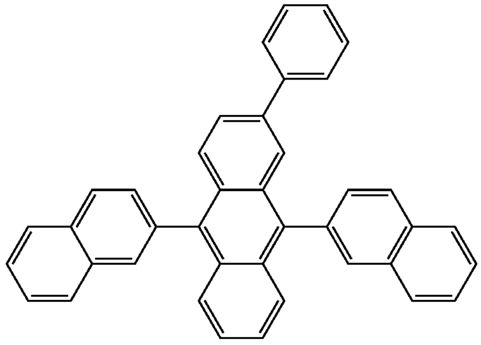
-continued
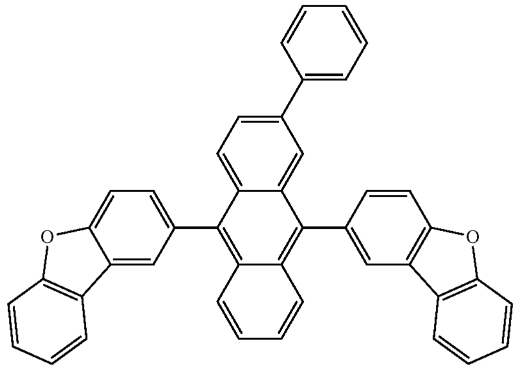
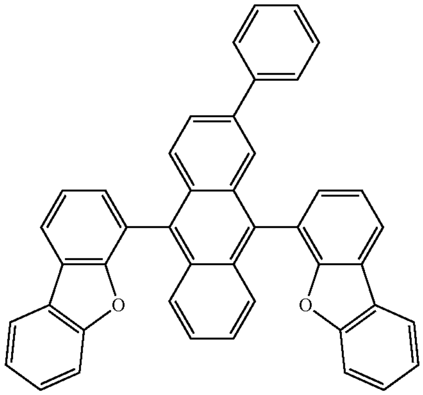
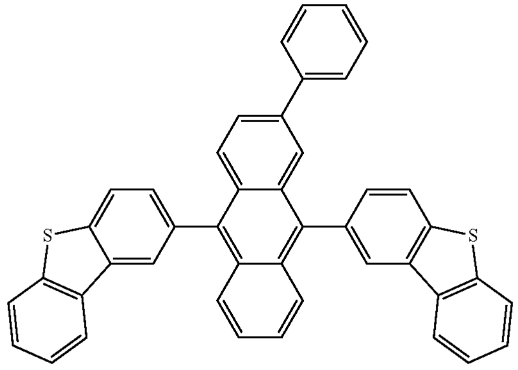
[Formula 218]
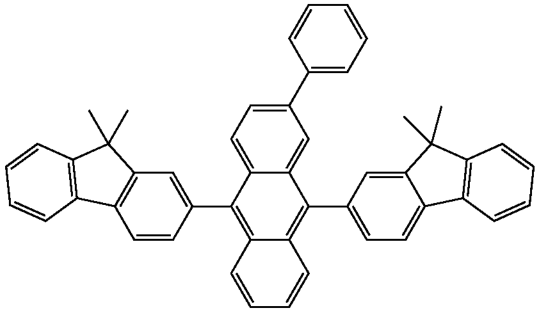

-continued
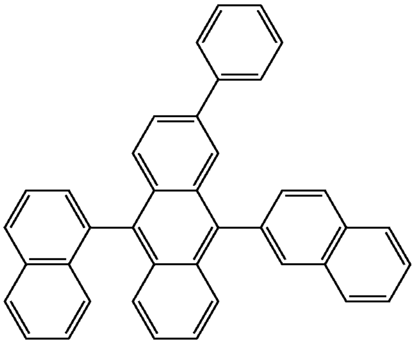
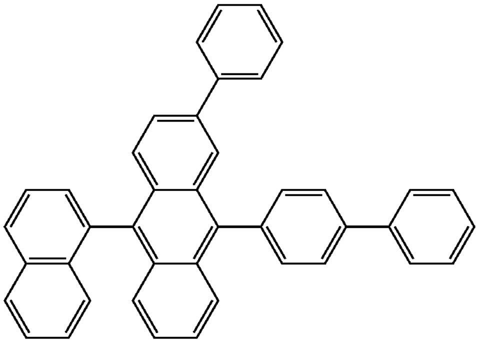
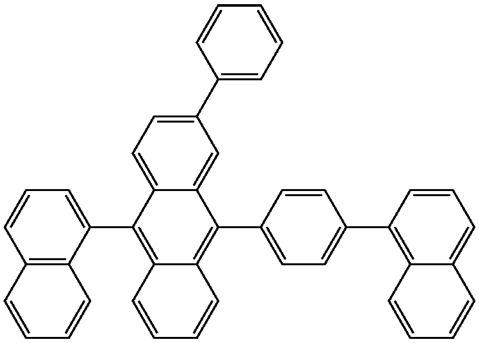
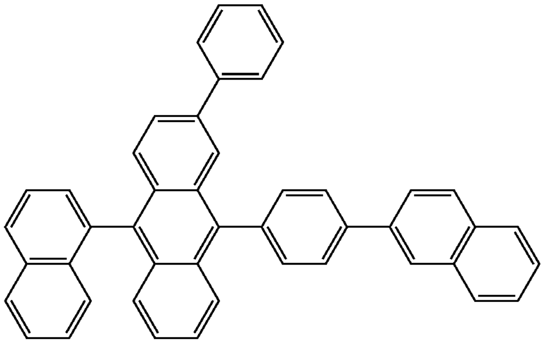
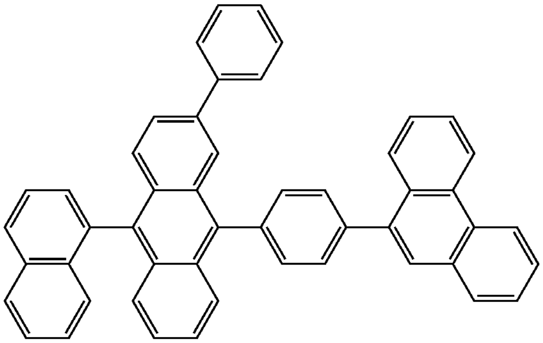
-continued
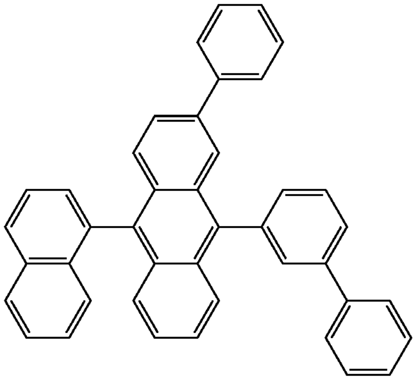
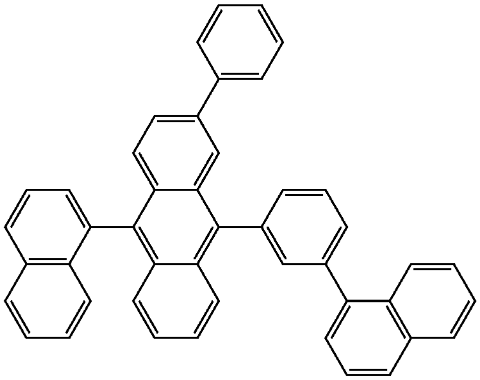
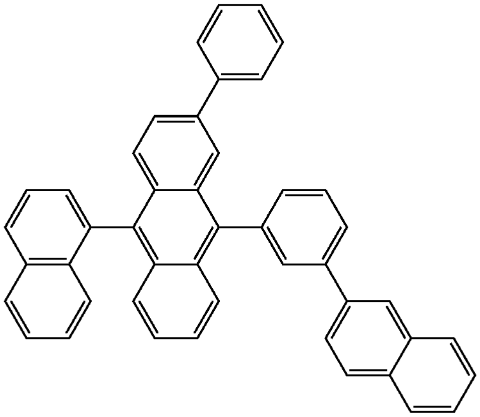
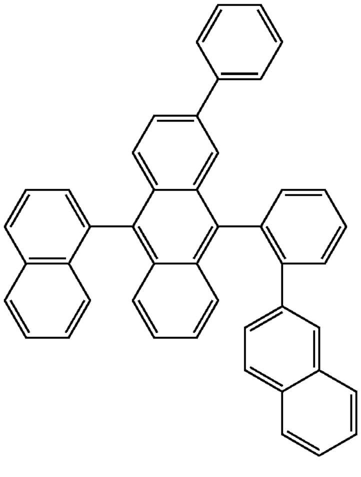

-continued
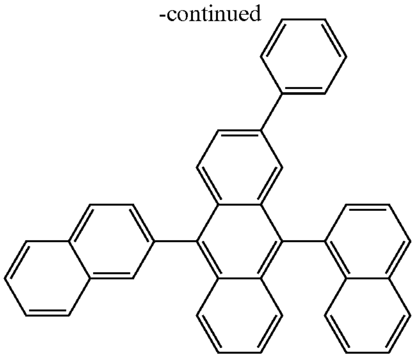
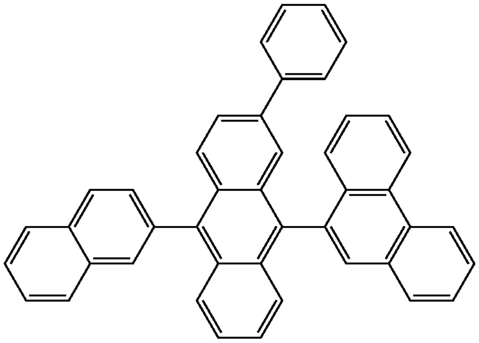
[Formula 219]
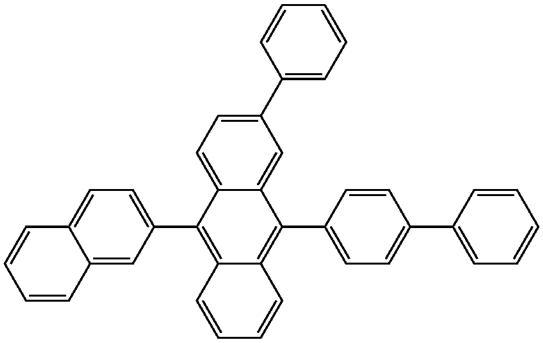
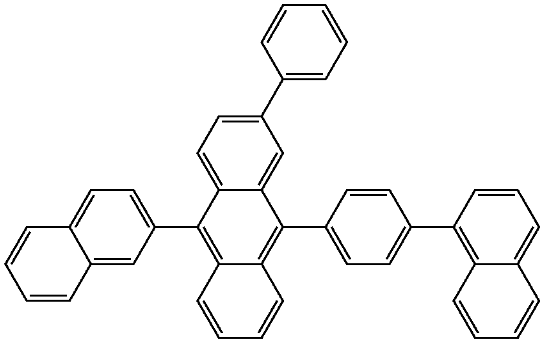
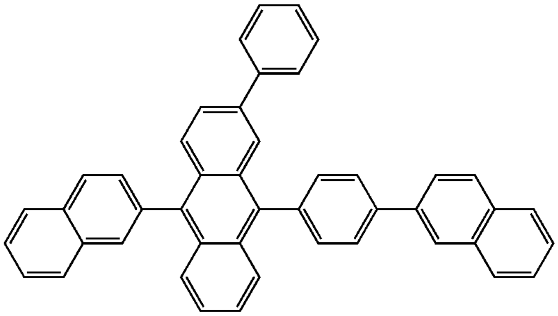
-continued
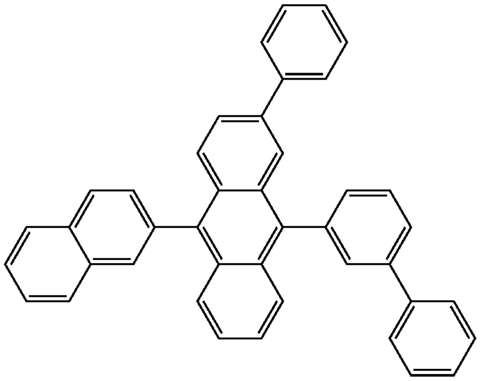
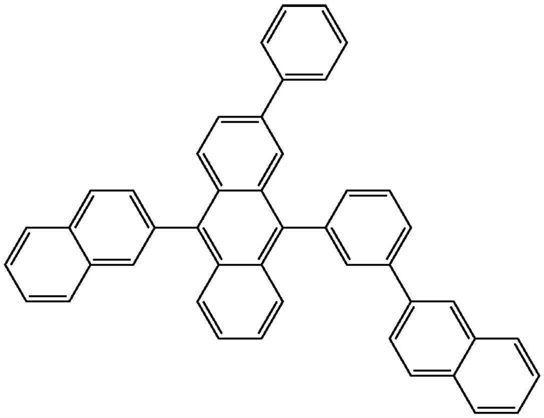
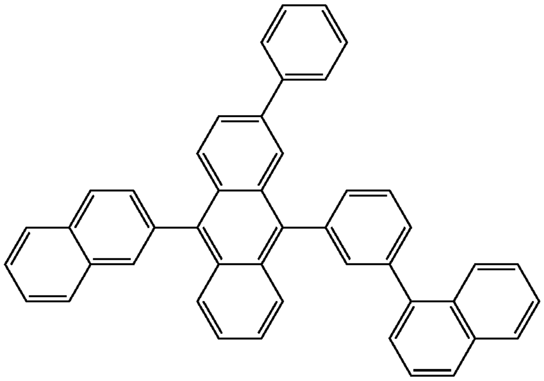
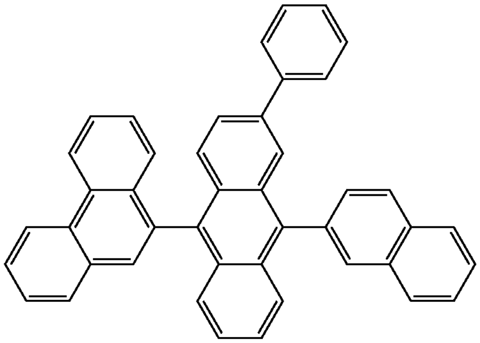

-continued
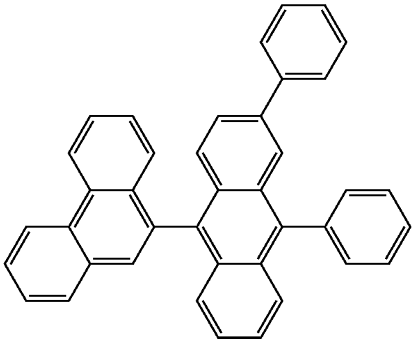
[Formula 220]
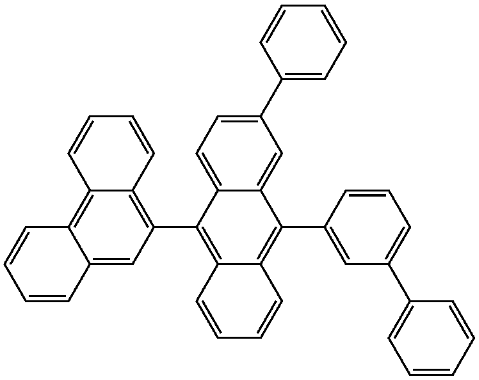
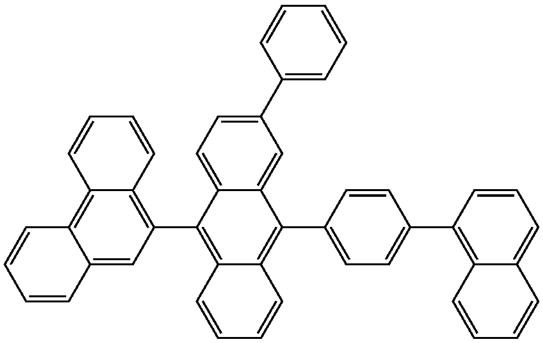
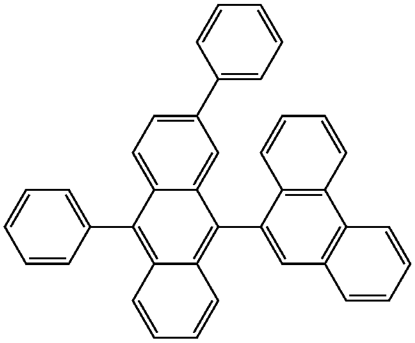
-continued
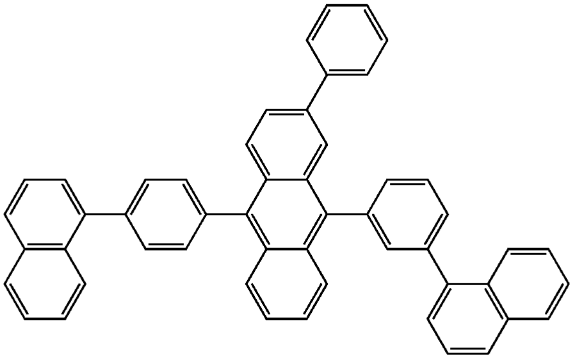
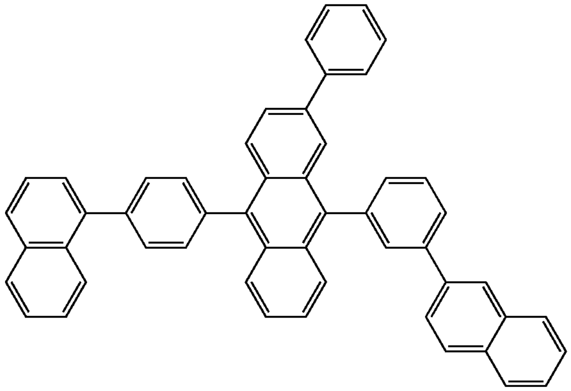
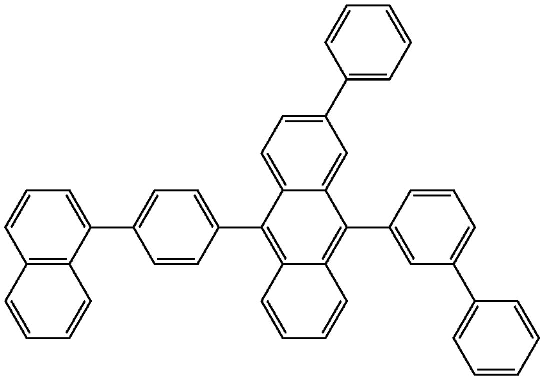
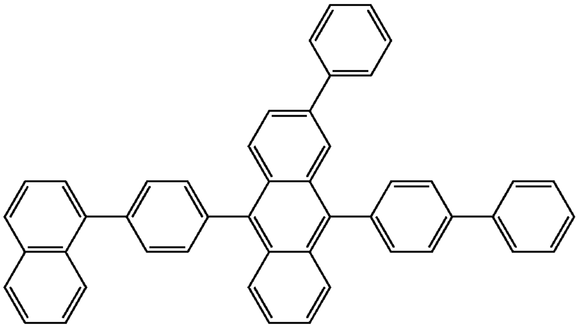

-continued
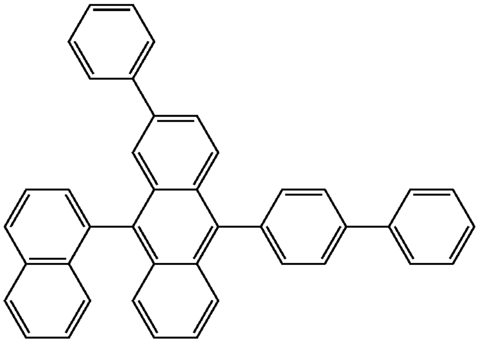
[Formula 221]
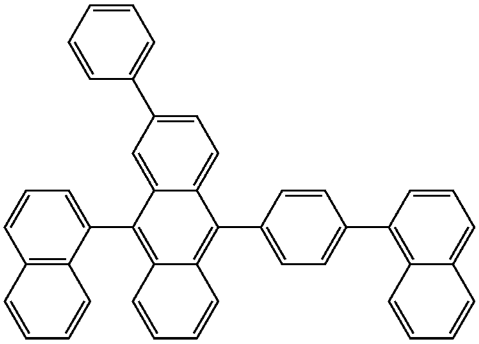
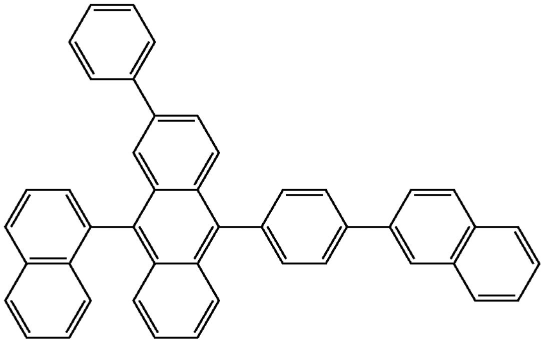
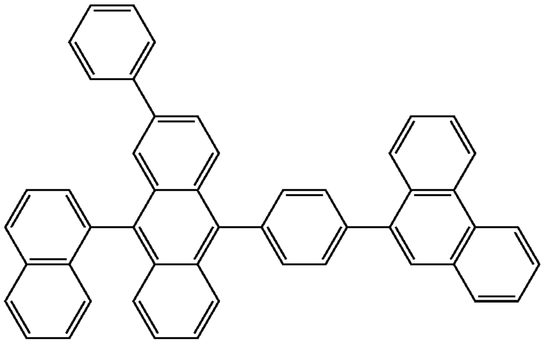
-continued
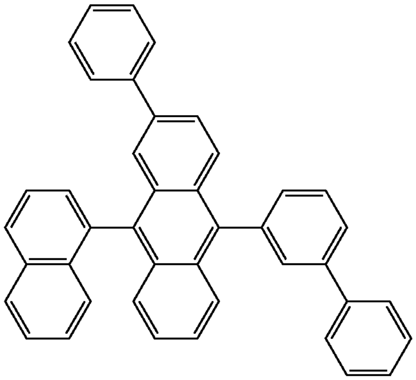
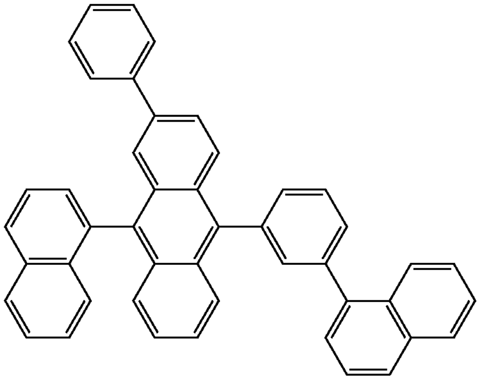
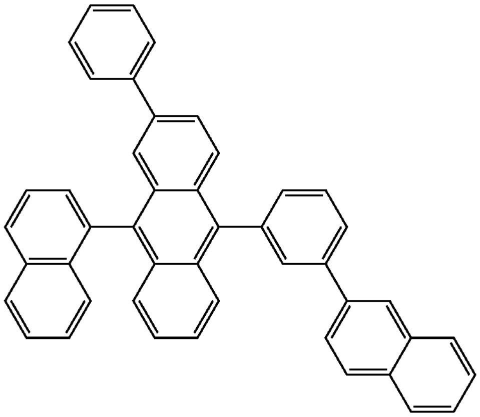
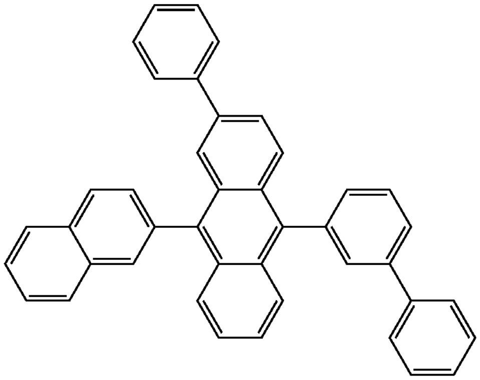

-continued
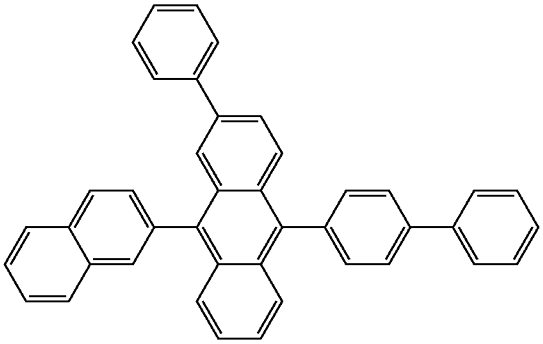
[Formula 222]
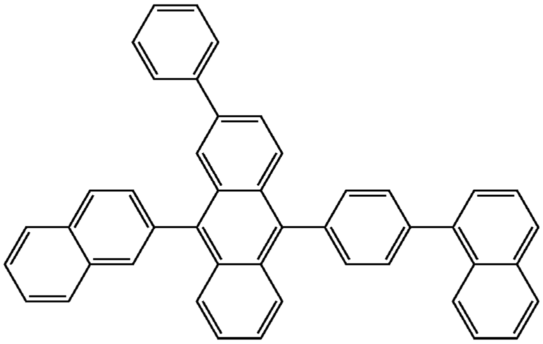
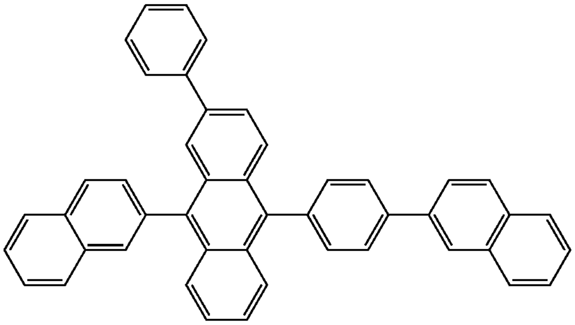
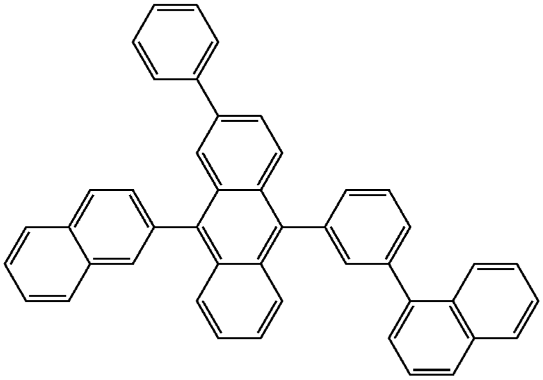
-continued
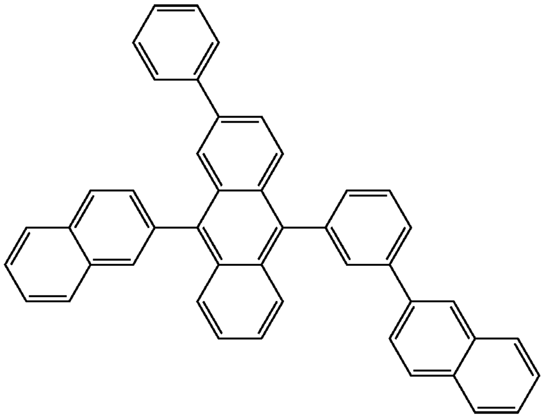
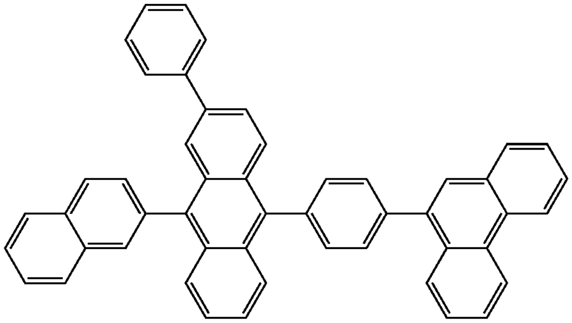
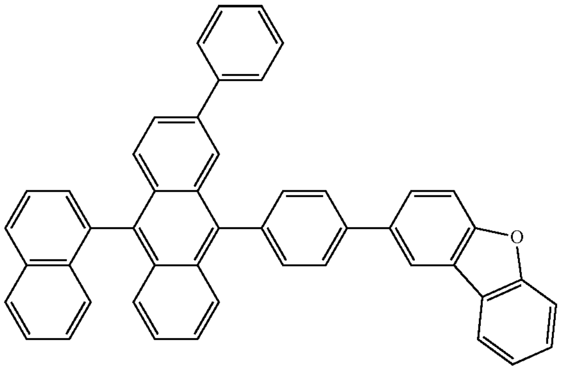
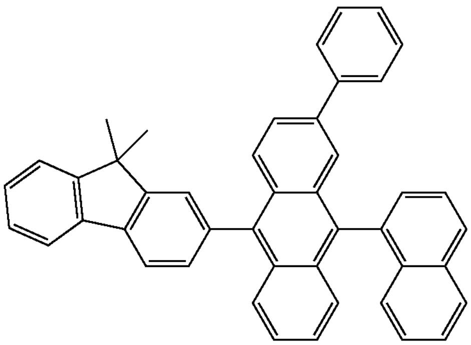

-continued
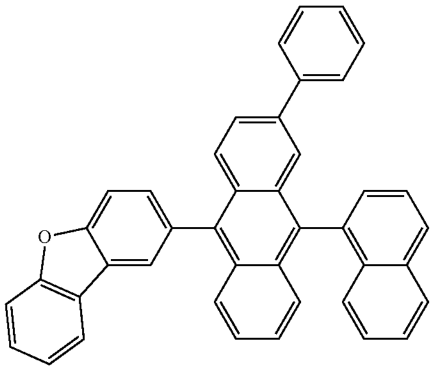
[Formula 223]
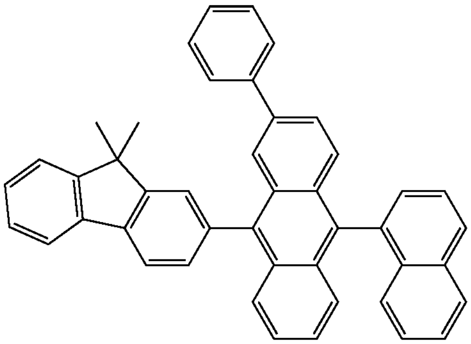
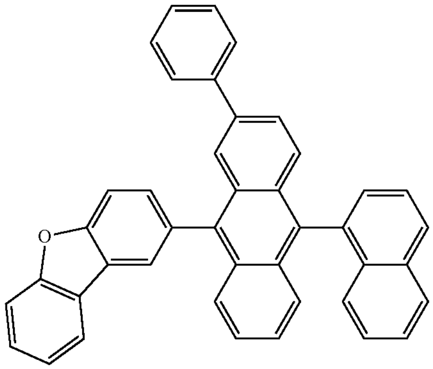
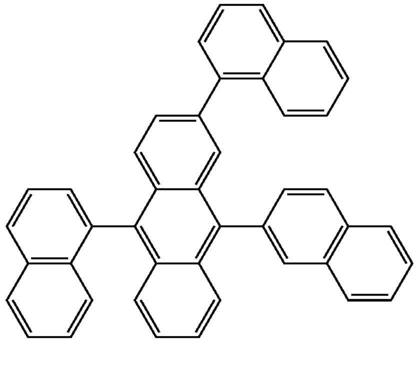
-continued
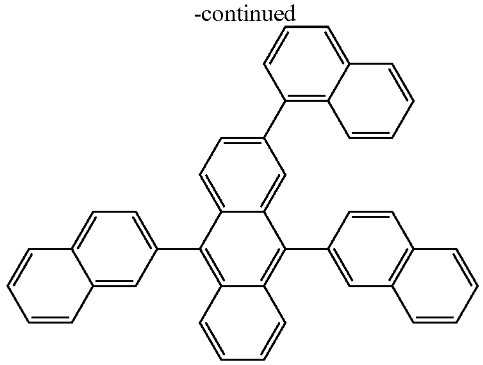
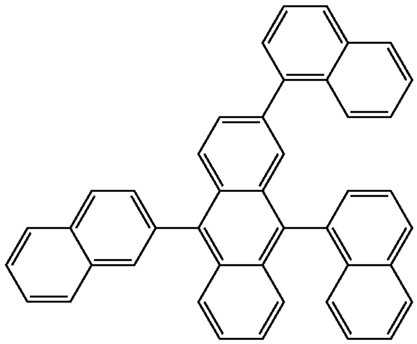
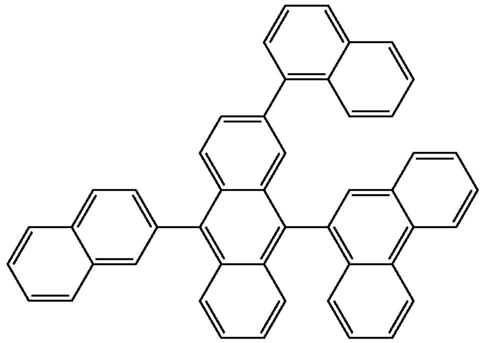
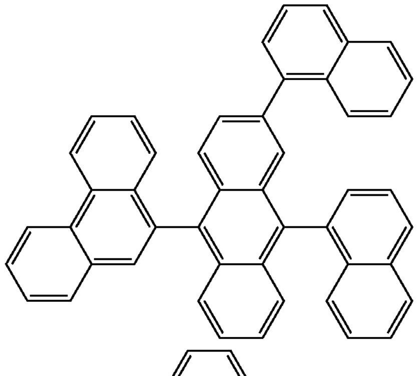
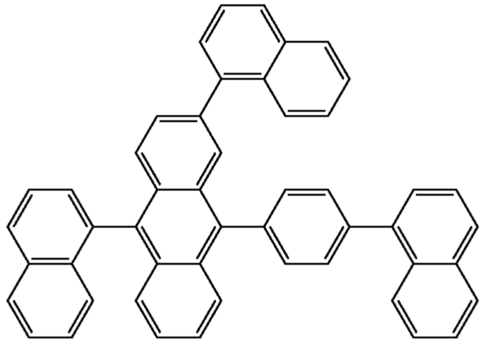

-continued
[Formula 224]
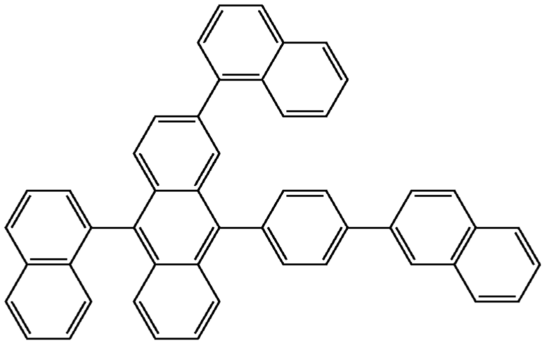
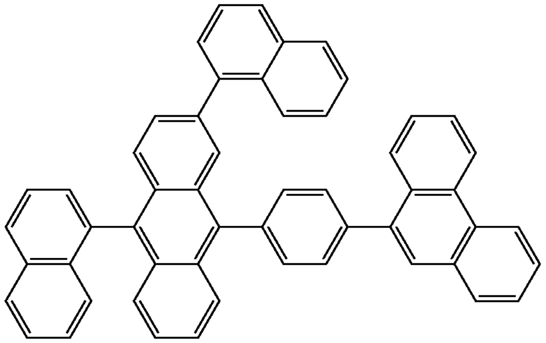
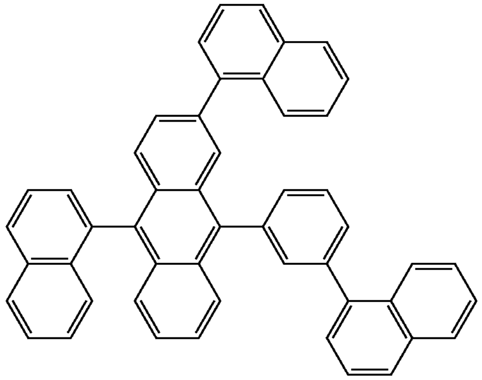
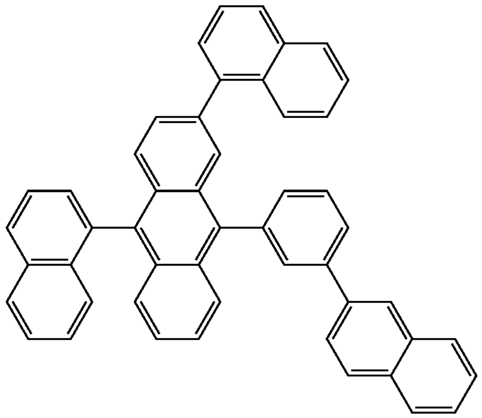
-continued
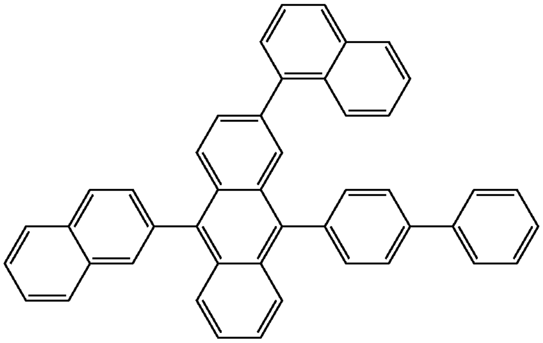
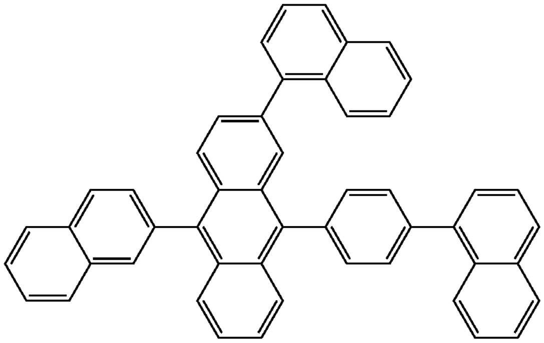
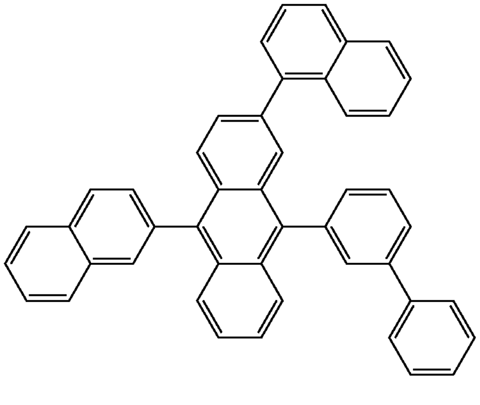
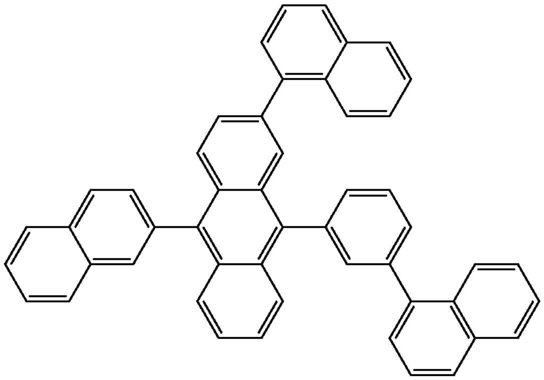

-continued
[Formula 225]
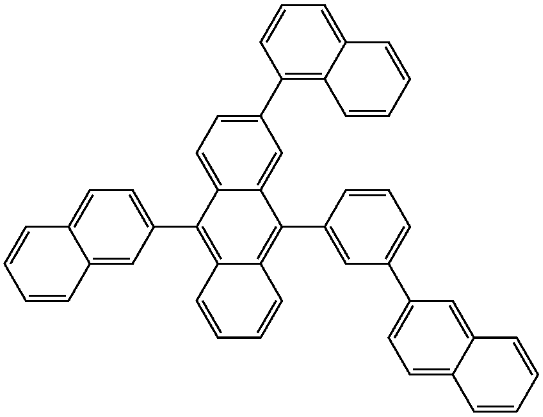
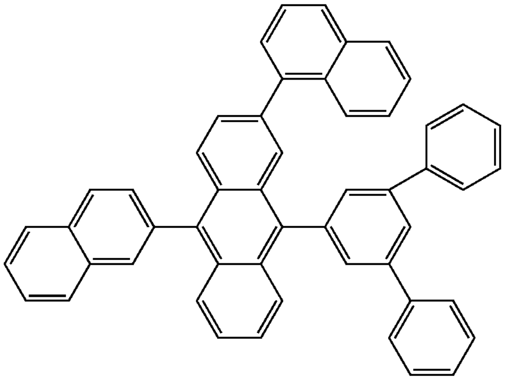
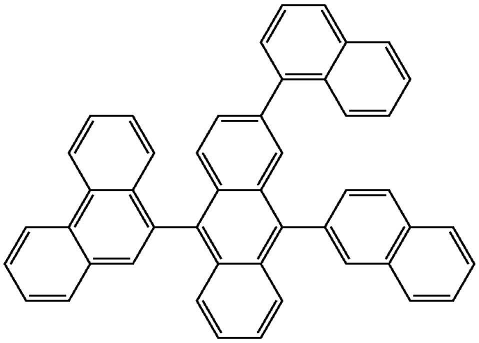
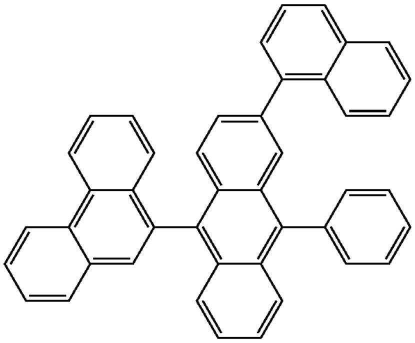
-continued
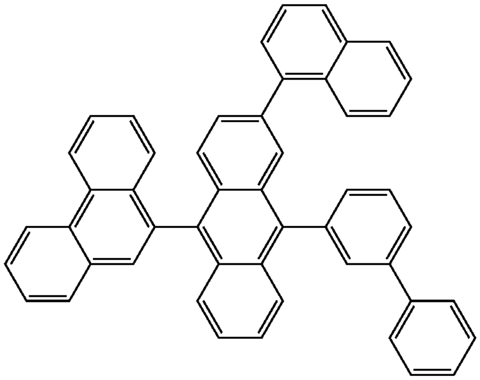
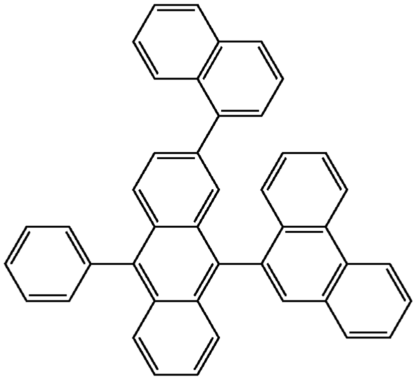
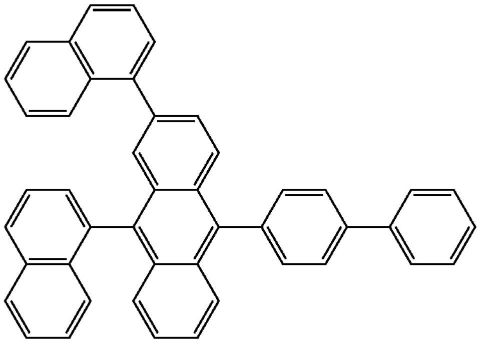
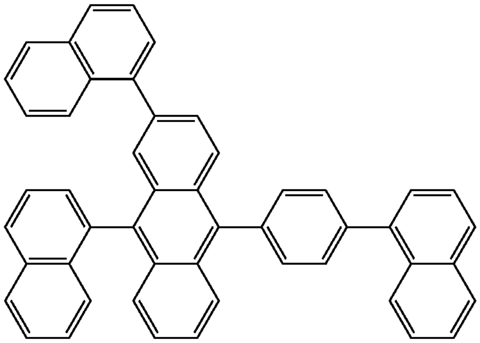

-continued
[Formula 226]
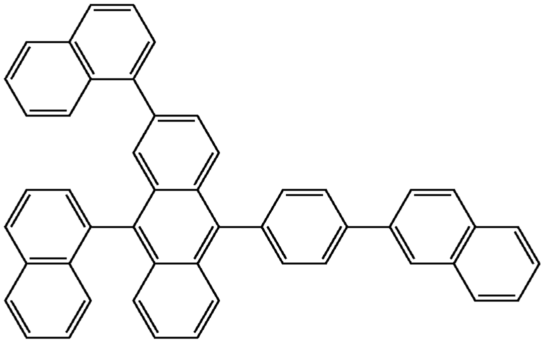
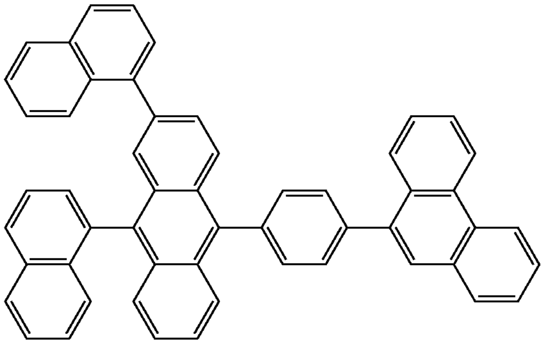
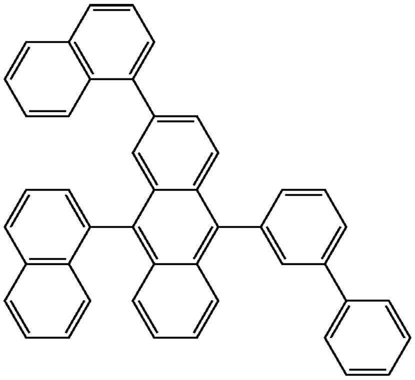
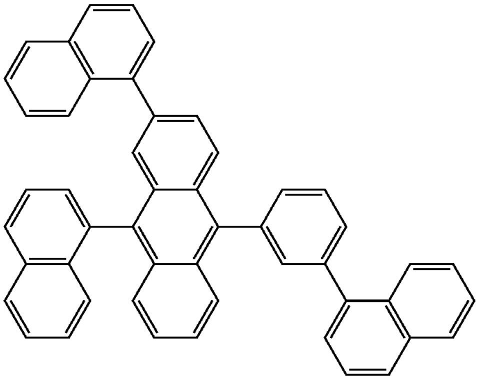
-continued
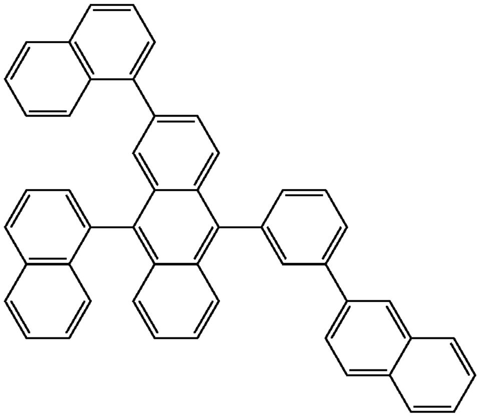
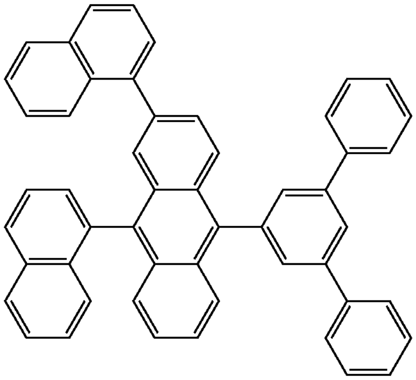
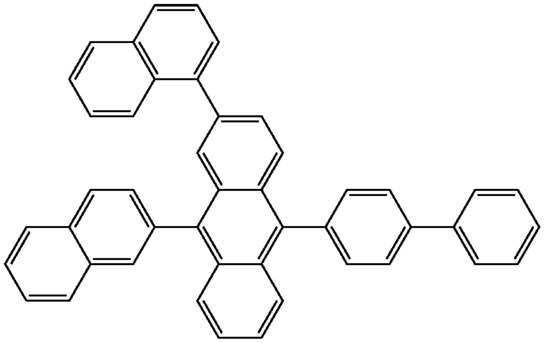
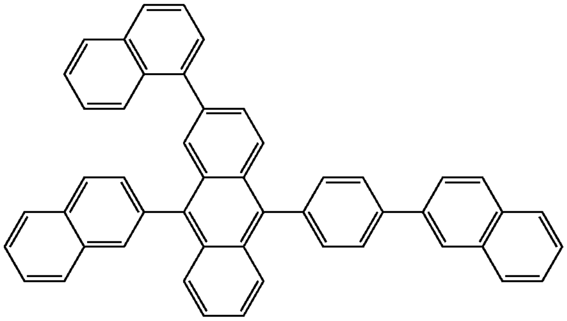

[Formula 227]
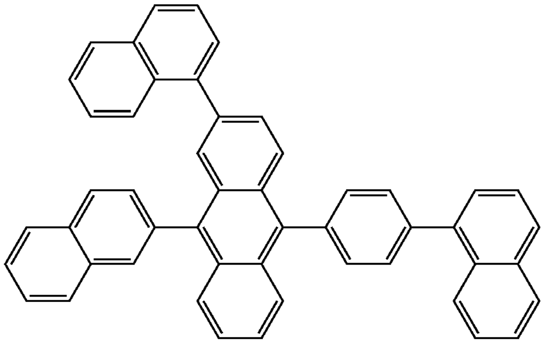
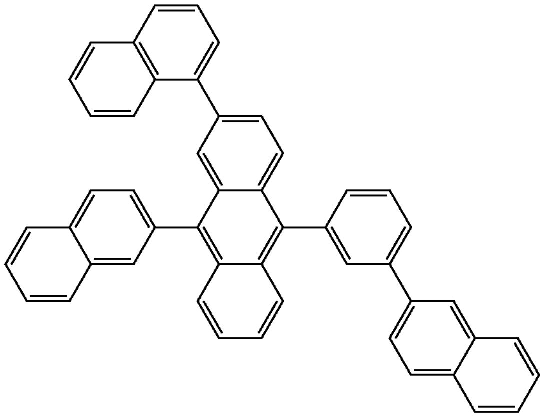
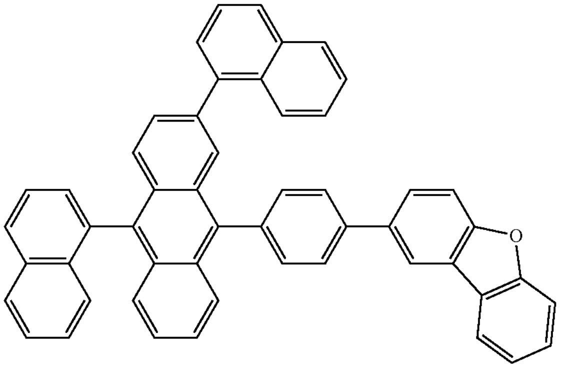
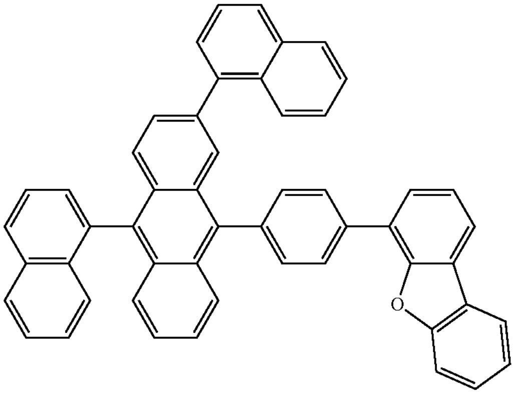
-continued
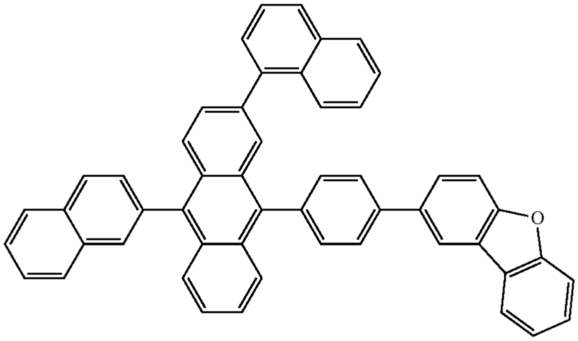
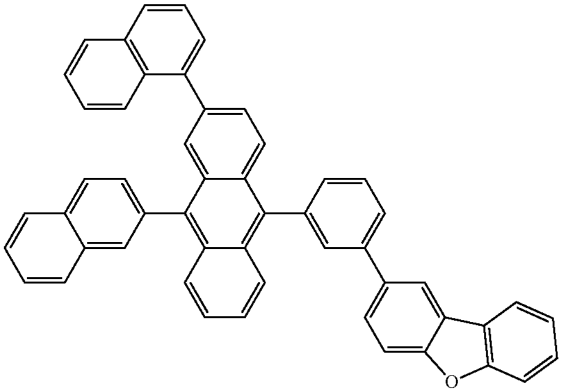
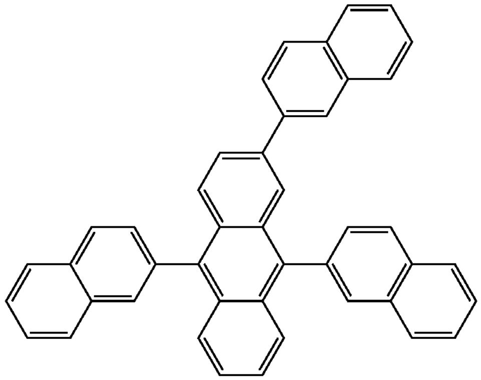
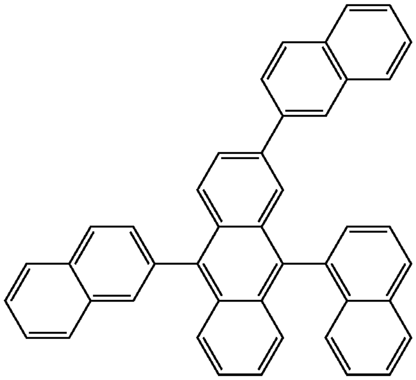

-continued
[Formula 228]
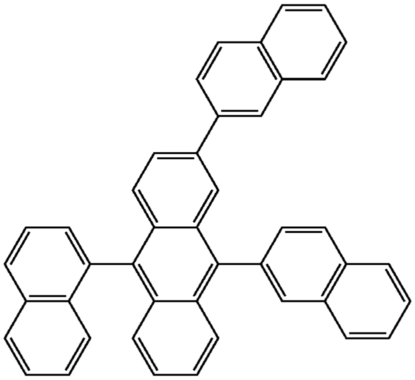
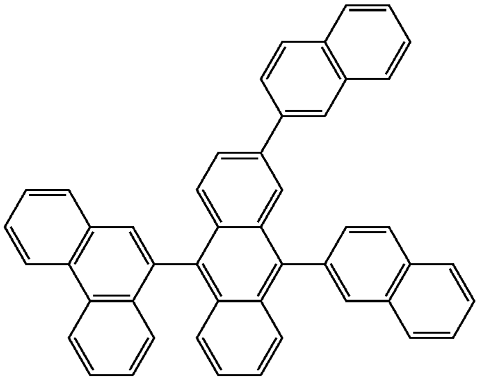
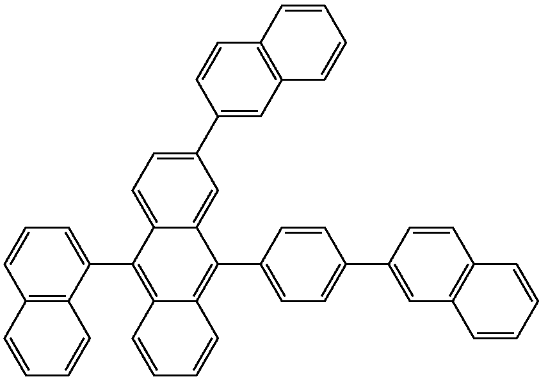
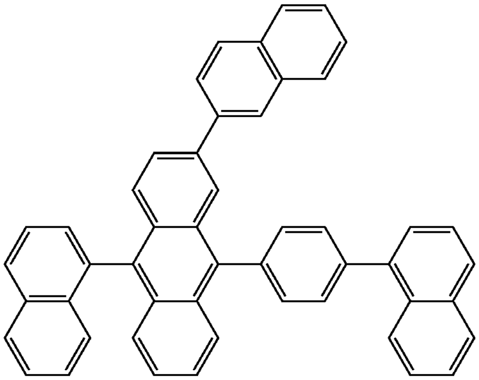
-continued
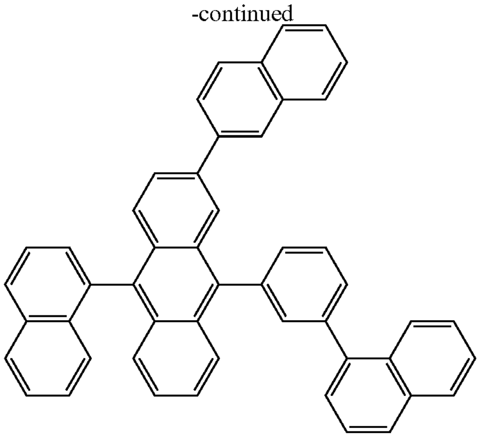
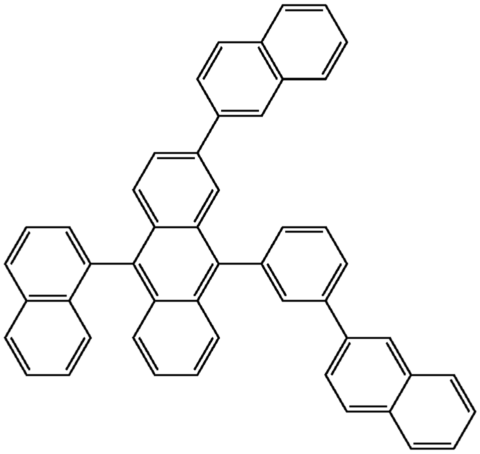
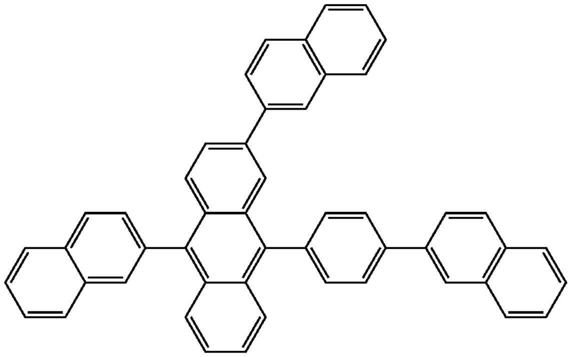
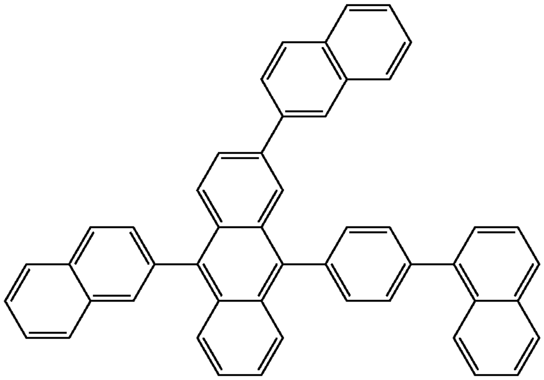

-continued
[Formula 229]
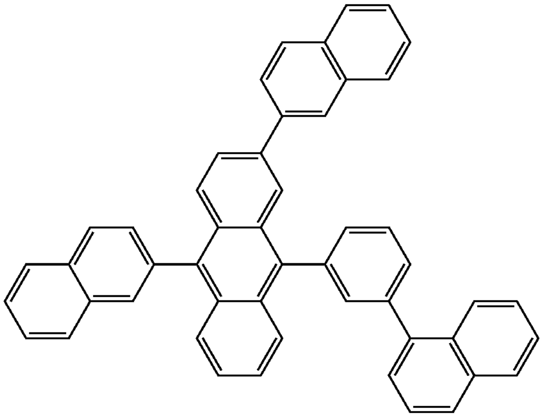
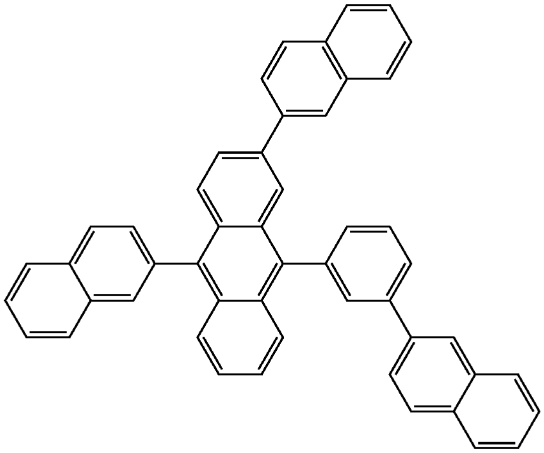
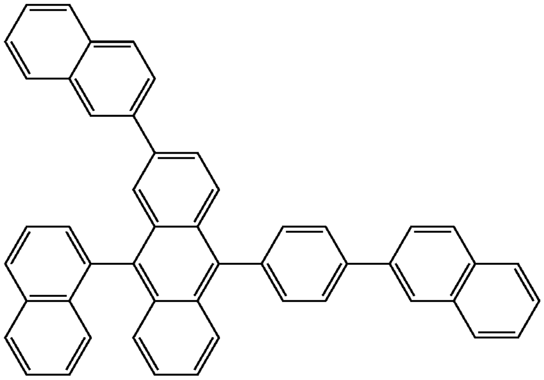
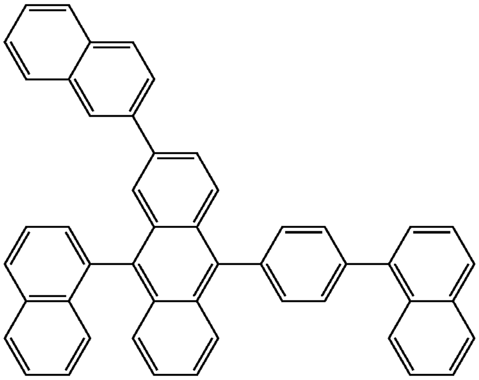
-continued
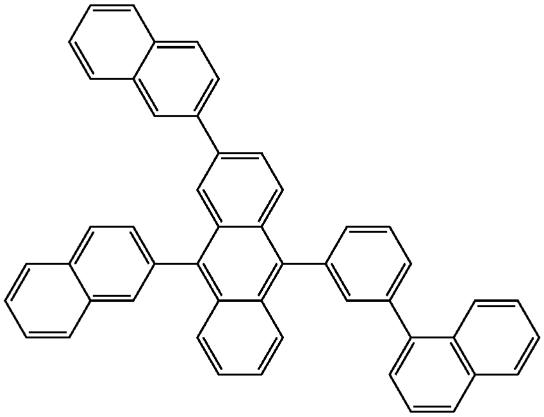
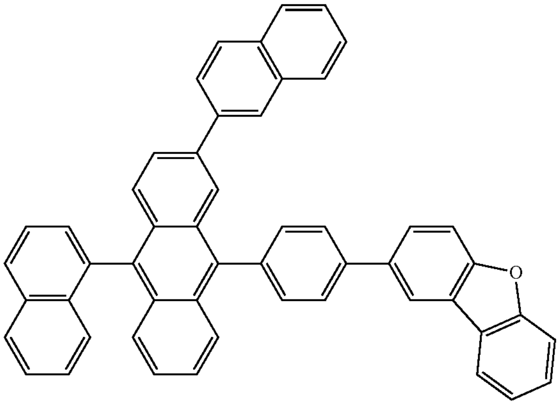
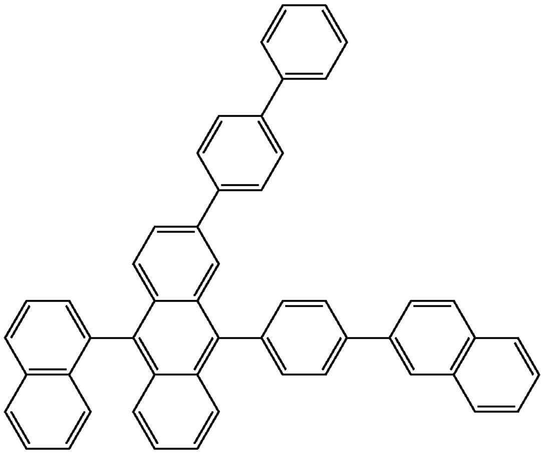

-continued
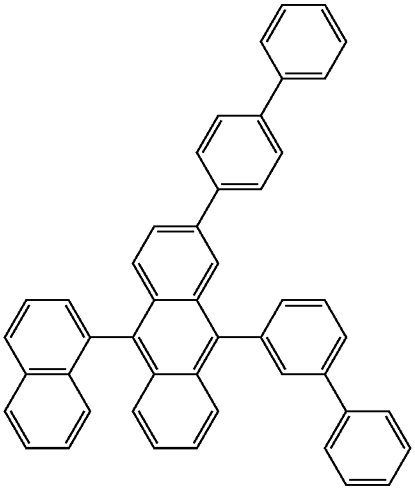
[Formula 230]
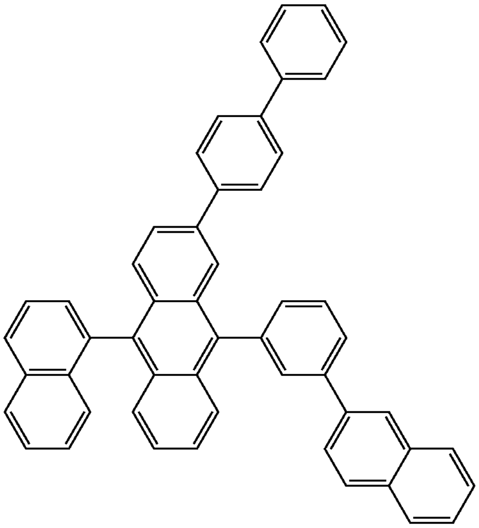
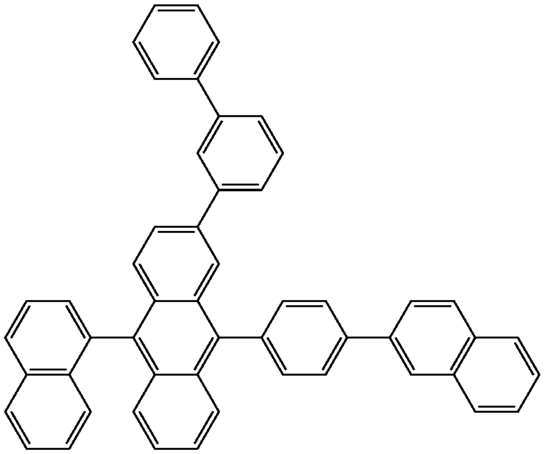
-continued
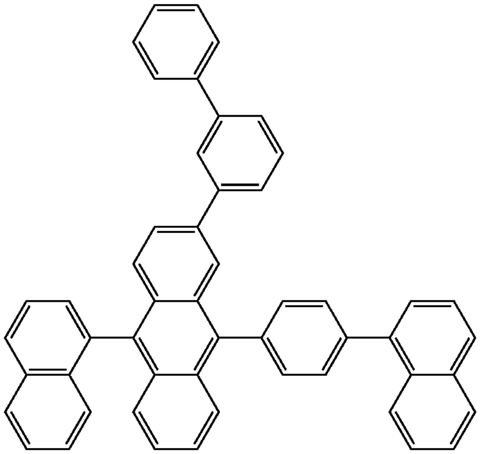
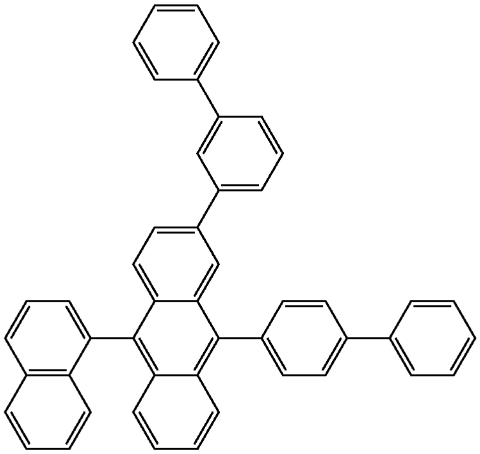
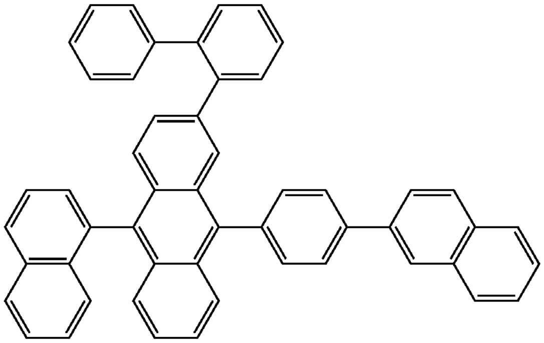
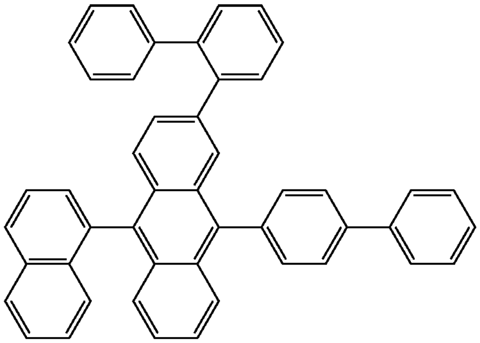

-continued
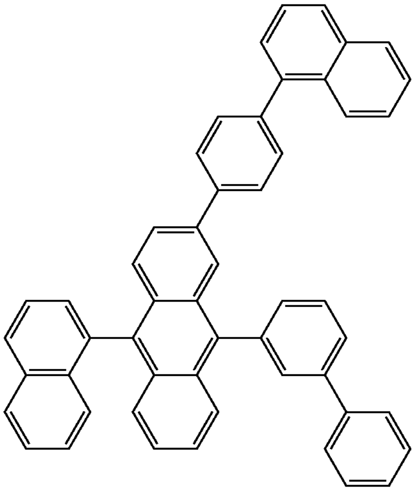
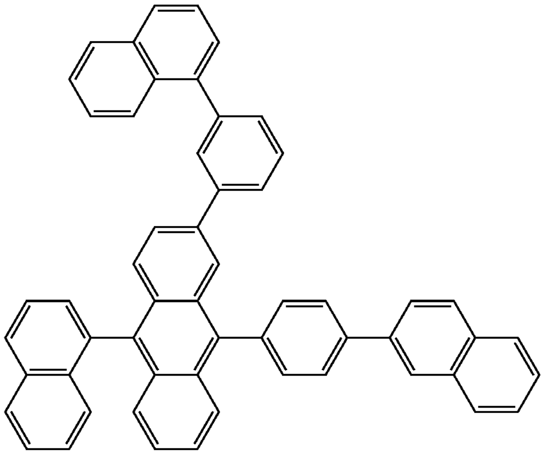
[Formula 231]
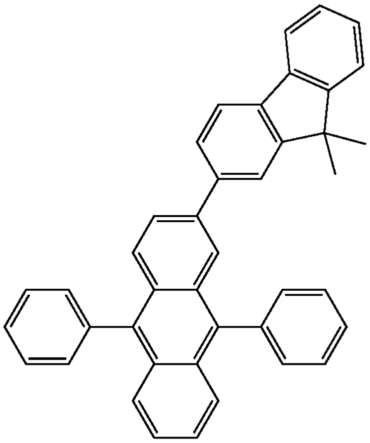
-continued
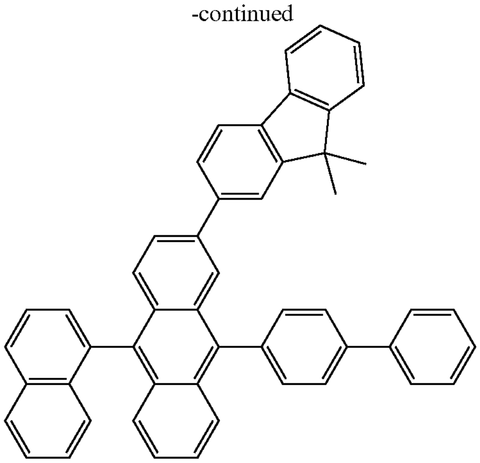
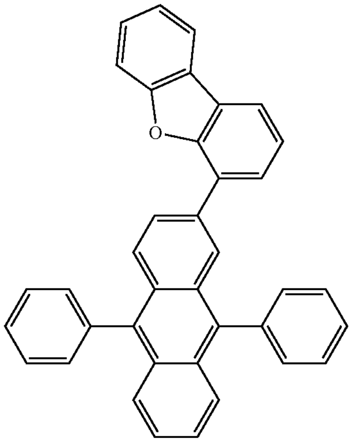
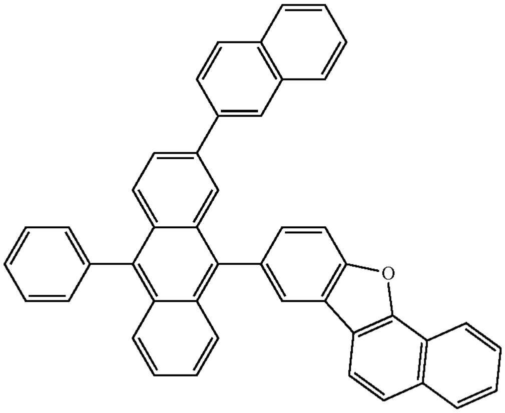
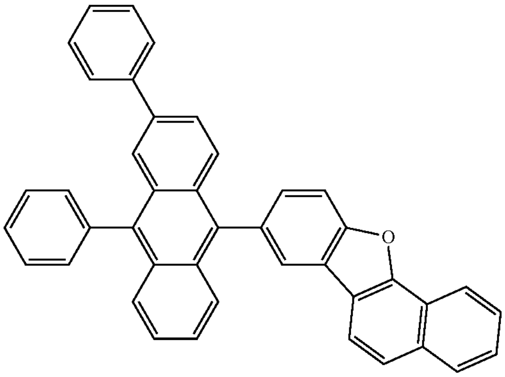

-continued
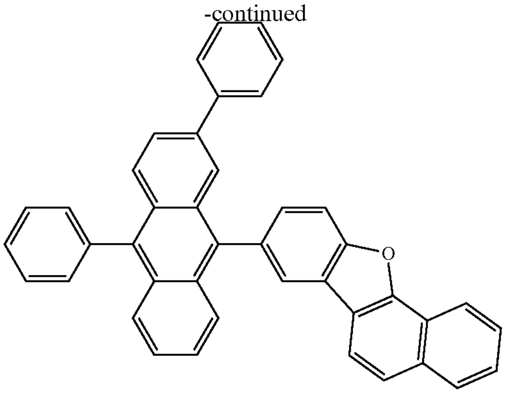
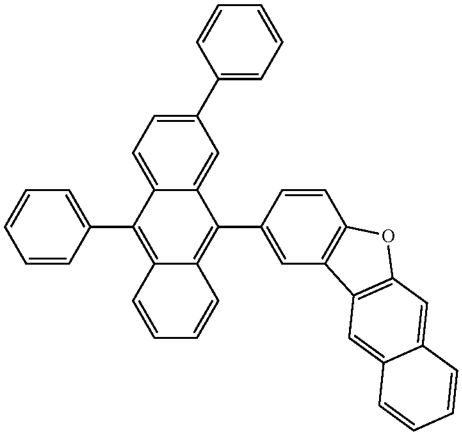
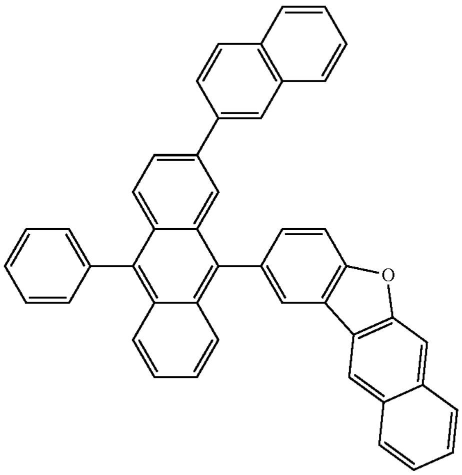
-continued
[Formula 232]
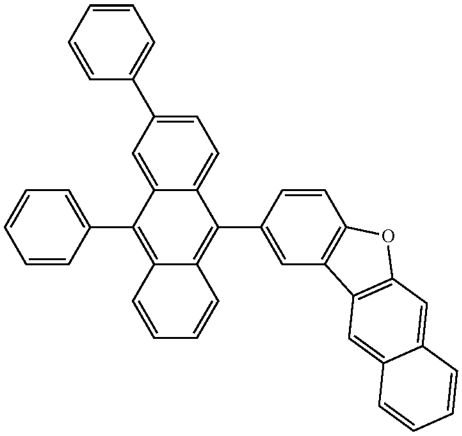
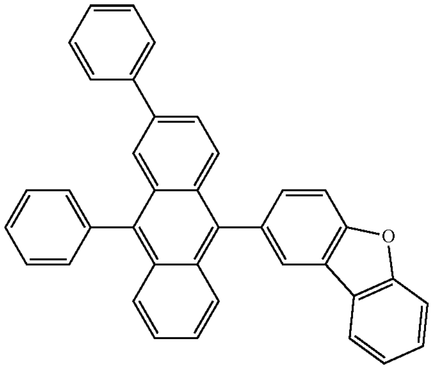
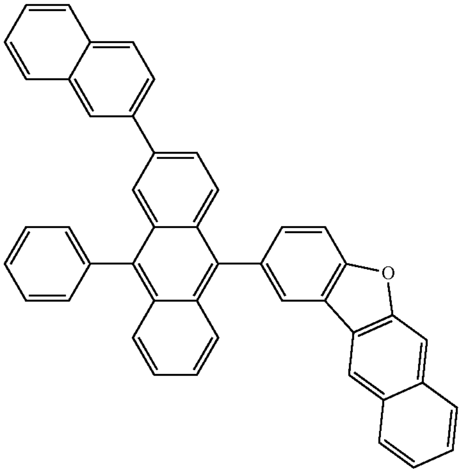
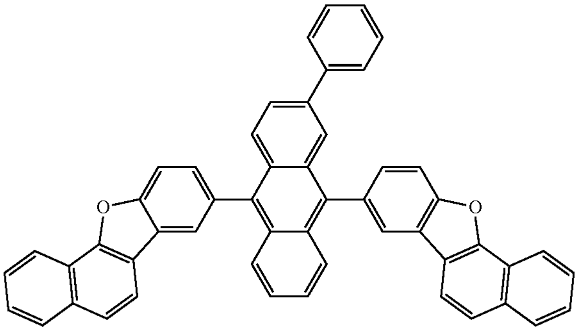

-continued
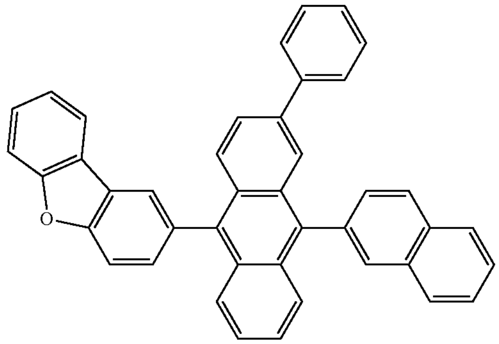
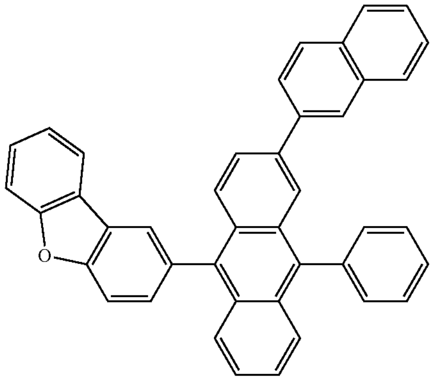
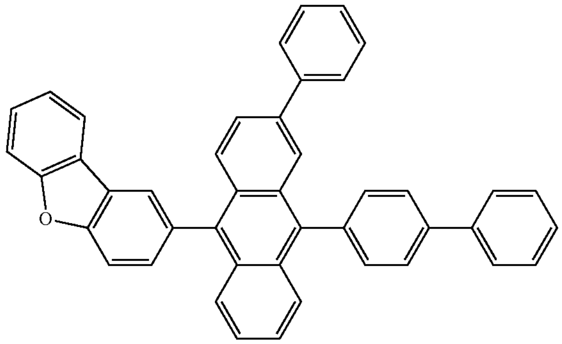
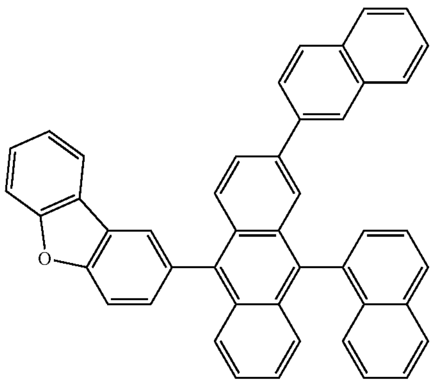
-continued
[Formula 233]
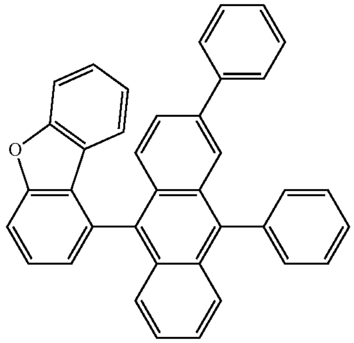
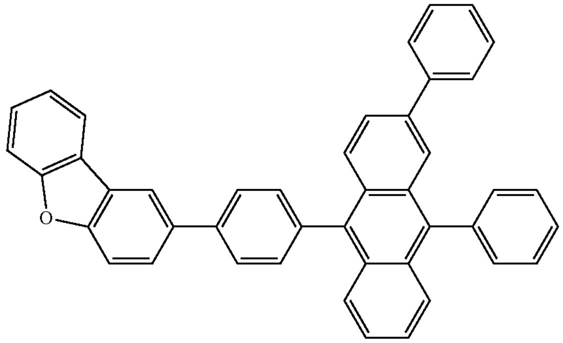
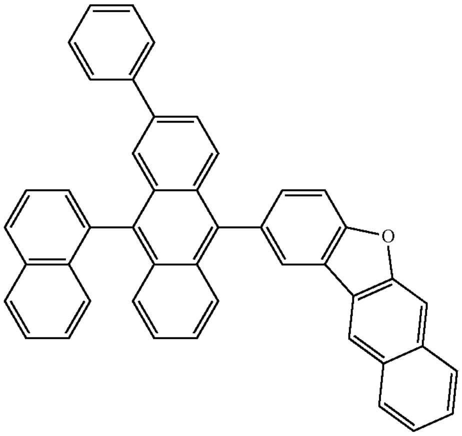
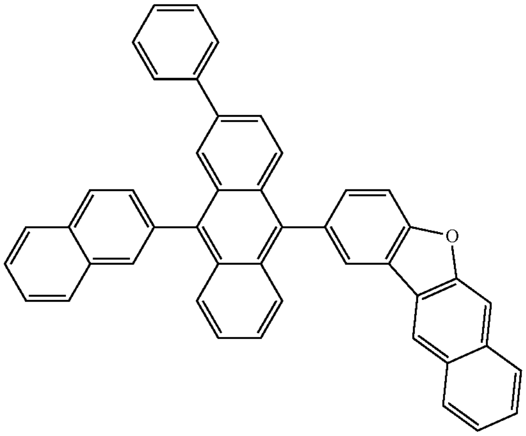

-continued

[Formula 234]

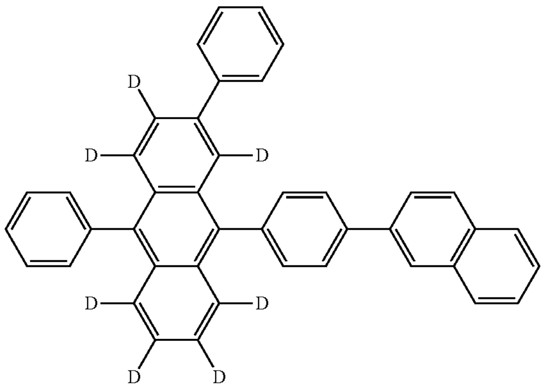

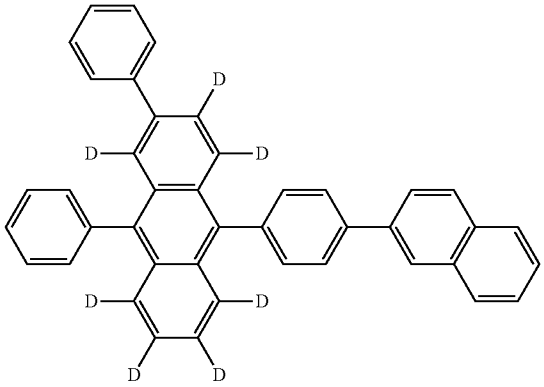

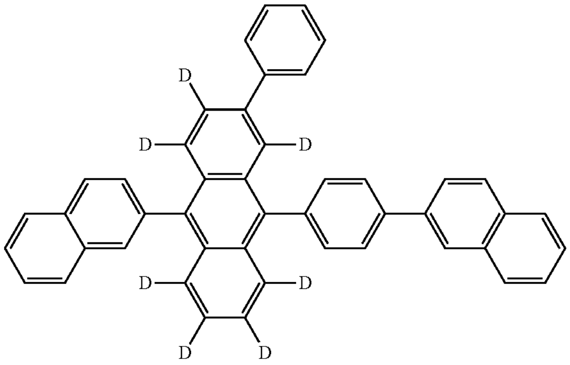

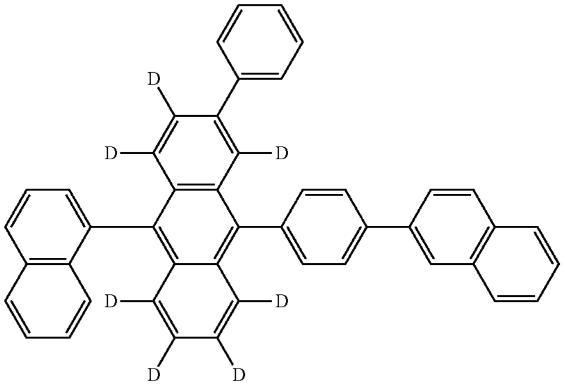

-continued

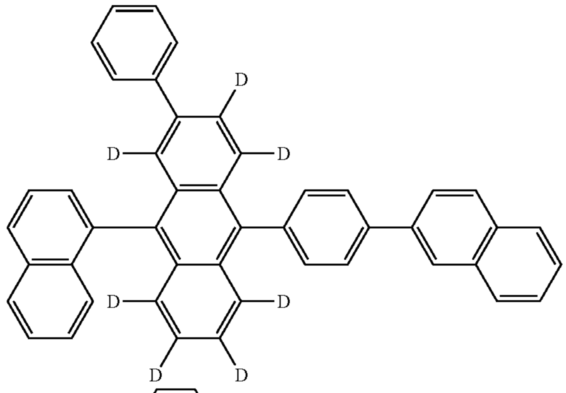

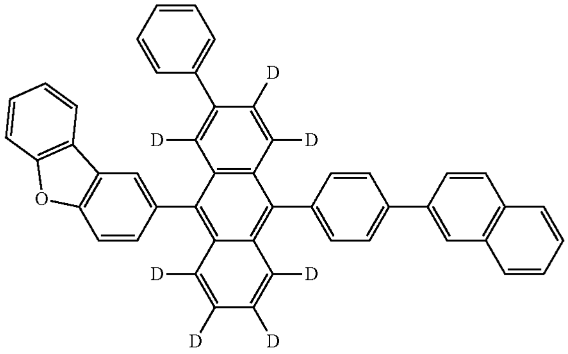

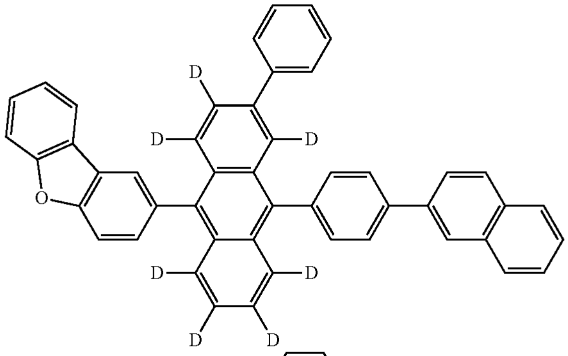

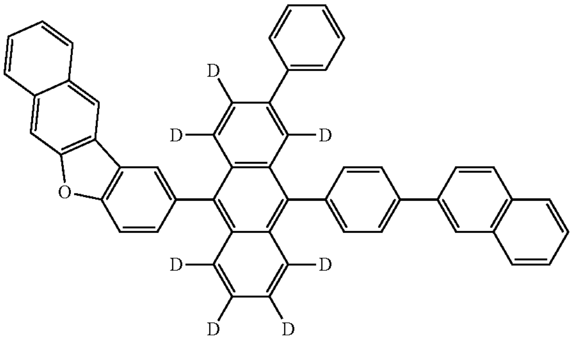

Emitting Compound

In the organic EL device according to the exemplary embodiment, the emitting compounds including the first emitting compound, the second emitting compound and the third emitting compound are also preferably each independently at least one compound selected from the group consisting of a compound represented by a formula (3A), a compound represented by a formula (4), a compound represented by a formula (5), a compound represented by a formula (6), a compound represented by a formula (7), a compound represented by a formula (8), a compound represented by a formula (9), and a compound represented by a formula (10) below.

Compound Represented by Formula (3A)

The compound represented by the formula (3A) will be described below.

[Formula 235]

(3A)

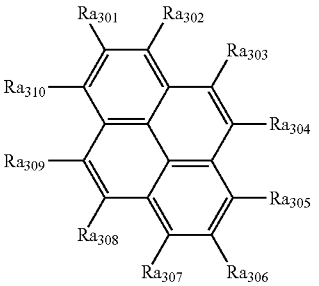

In the formula (3A):

at least one combination of adjacent two or more of $Ra_{301}$, $Ra_{302}$, $Ra_{303}$, $Ra_{304}$, $Ra_{305}$, $Ra_{306}$, $Ra_{307}$, $Ra_{308}$, $Ra_{309}$ and $Ra_{310}$ are mutually bonded to form a substituted or unsubstituted monocyclic ring, mutually bonded to form a substituted or unsubstituted fused ring, or not mutually bonded;

at least one of $Ra_{301}$ to $Ra_{310}$ is a monovalent group represented by a formula (31A) below; and $Ra_{301}$ to $Ra_{310}$ forming neither the monocyclic ring nor the fused ring and not being the monovalent group represented by the formula (31A) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 236]

(31A)

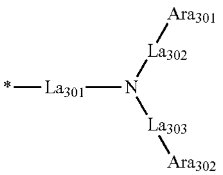

In the formula (31A):

$Ara_{301}$ and $Ara_{302}$ are each independently a substituted or unsubstituted aryl group having 6 to 50 ring carbon atoms, or a substituted or unsubstituted heterocyclic group having 5 to 50 ring atoms;

$La_{301}$, $La_{302}$, and $La_{303}$ are each independently a single bond, a substituted or unsubstituted arylene group having 6 to 30 ring carbon atoms, or a substituted or unsubstituted divalent heterocyclic group having 5 to 30 ring atoms; and

* represents a bonding position to a pyrene ring in the formula (3A).

In the emitting compounds including the first emitting compound, the second emitting compound and the third emitting compound, $R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; preferably, a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the formula (3A), two of $Ra_{301}$ to $Ra_{310}$ are each preferably a group represented by the formula (31A).

In an exemplary embodiment, the compound represented by the formula (3A) is a compound represented by a formula (33A) below.

[Formula 237]

(33A)

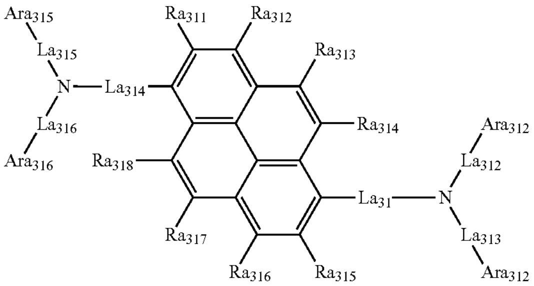

In the formula (33A):

$Ra_{311}$, $Ra_{312}$, $Ra_{313}$, $Ra_{314}$, $Ra_{315}$, $Ra_{316}$, $Ra_{317}$ and $Ra_{318}$ each independently represent the same as $Ra_{301}$ to $Ra_{310}$ in the formula (3A) that are each not the monovalent group represented by the formula (31A);

$La_{311}$, $La_{312}$, $La_{313}$, $La_{314}$, $La_{315}$, and $La_{316}$ are each independently a single bond, a substituted or unsubstituted arylene group having 6 to 30 ring carbon atoms, or a substituted or unsubstituted divalent heterocyclic group having 5 to 30 ring atoms; and $Ara_{312}$, $Ara_{313}$, $Ara_{315}$, and $Ara_{316}$ are each independently a substituted or unsubstituted aryl group having 6 to 50 ring carbon atoms, or a substituted or unsubstituted heterocyclic group having 5 to 50 ring atoms.

In the formula (31A), $La_{301}$ is preferably a single bond, and $La_{302}$ and $La_{303}$ are each preferably a single bond.

In an exemplary embodiment, the compound represented by the formula (3A) is represented by a formula (34A) or a formula (35A) below.

[Formula 238]

(34A)

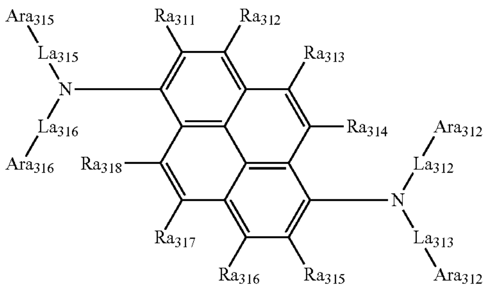

In the formula (34A):

$Ra_{311}$ to $Ra_{318}$ each independently represent the same as $Ra_{301}$ to $Ra_{310}$ in the formula (3A) that are each not the monovalent group represented by the formula (31A);

$La_{312}$, $La_{313}$, $La_{315}$ and $La_{316}$ each independently represent the same as $La_{312}$, $La_{313}$, $La_{315}$ and $La_{316}$ in the formula (33A); and $Ara_{312}$, $Ara_{313}$, $Ara_{315}$ and $Ara_{316}$ each independently represent the same as $Ara_{312}$, $Ara_{313}$, $Ara_{315}$ and $Ara_{316}$ in the formula (33A).

[Formula 239]

(35A)

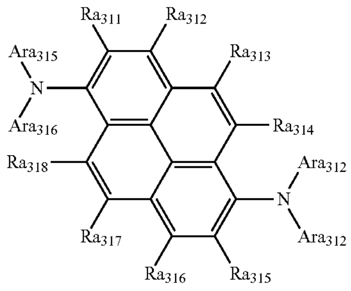

In the formula (35A):

$Ra_{311}$ to $Ra_{318}$ each independently represent the same as $Ra_{301}$ to $Ra_{310}$ in the formula (3A) that are each not the monovalent group represented by the formula (31A); and $Ara_{312}$, $Ara_{313}$, $Ara_{315}$ and $Ara_{316}$ each independently represent the same as $Ara_{312}$, $Ara_{313}$, $Ara_{315}$ and $Ara_{316}$ in the formula (33A).

In the formula (31A), at least one of $Ara_{301}$ or $Ara_{302}$ is preferably a group represented by a formula (36A) below.

In the formulae (33A) to (35A), at least one of $Ara_{312}$ or $Ara_{313}$ is preferably a group represented by the formula (36A) below.

In the formulae (33A) to (35A), at least one of $Ara_{315}$ or $Ara_{316}$ is preferably a group represented by the formula (36A) below.

[Formula 240]

(36A)

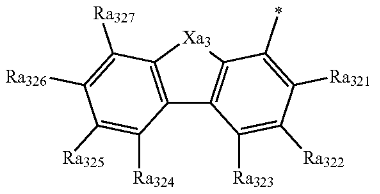

In the formula (36A):

$Xa_3$ represents an oxygen atom or a sulfur atom;

at least one combination of adjacent two or more of $Ra_{321}$ to $Ra_{327}$ are mutually bonded to form a substituted or unsubstituted monocyclic ring, mutually bonded to form a substituted or unsubstituted fused ring, or not mutually bonded;

$Ra_{321}$, $Ra_{322}$, $Ra_{323}$, $Ra_{324}$, $Ra_{325}$, $Ra_{326}$ and $Ra_{327}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* represents a bonding position to $La_{302}$, $La_{303}$, $La_{312}$, $La_{313}$, $La_{315}$ or $La_{316}$.

$Xa_3$ is preferably an oxygen atom.

At least one of $Ra_{321}$ to $Ra_{327}$ is preferably a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the formula (31A), preferably, $Ara_{301}$ is a group represented by the formula (36A) and $Ara_{302}$ is a substituted or unsubstituted aryl group having 6 to 50 ring carbon atoms.

In the formulae (33A) to (35A), preferably, $Ara_{312}$ is a group represented by the formula (36A) and $Ara_{313}$ is a substituted or unsubstituted aryl group having 6 to 50 ring carbon atoms.

In the formulae (33A) to (35A), preferably, $Ara_{315}$ is a group represented by the formula (36A) and $Ara_{316}$ is a substituted or unsubstituted aryl group having 6 to 50 ring carbon atoms.

In an exemplary embodiment, the compound represented by the formula (3A) is represented by a formula (37A) below.

[Formula 241]

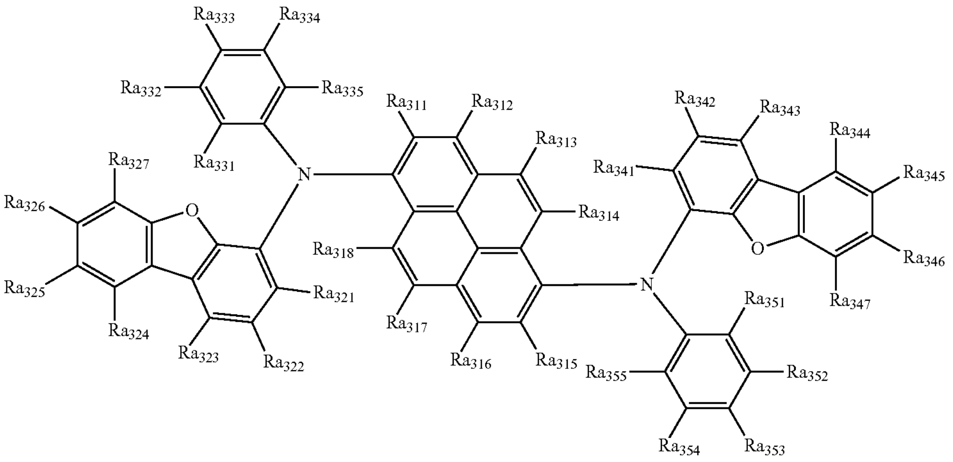

(37A)

In the formula (37A):

$Ra_{311}$ to $Ra_{318}$ each independently represent the same as $Ra_{301}$ to $Ra_{310}$ in the formula (3A) that are each not the monovalent group represented by the formula (31A);

at least one combination of adjacent two or more of $Ra_{321}$ to $Ra_{327}$ are mutually bonded to form a substituted or unsubstituted monocyclic ring, mutually bonded to form a substituted or unsubstituted fused ring, or not mutually bonded;

at least one combination of adjacent two or more of $Ra_{341}$ to $Ra_{347}$ are mutually bonded to form a substituted or unsubstituted monocyclic ring, mutually bonded to form a substituted or unsubstituted fused ring, or not mutually bonded; $Ra_{321}$ to $Ra_{327}$ and $Ra_{341}$ to $Ra_{347}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $Ra_{331}$ to $Ra_{335}$ and $Ra_{351}$ to $Ra_{335}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (3A)

Specific examples of the compound represented by the formula (3A) include compounds shown below.

[Formula 242]

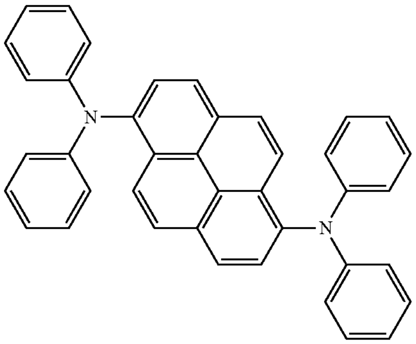

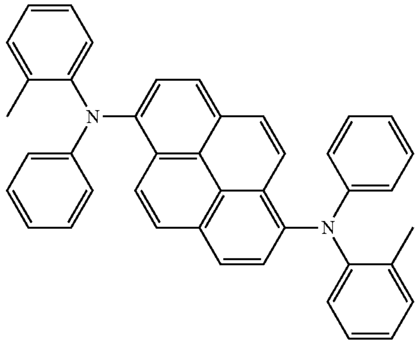

-continued
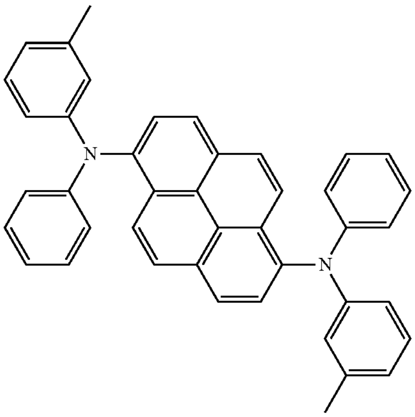
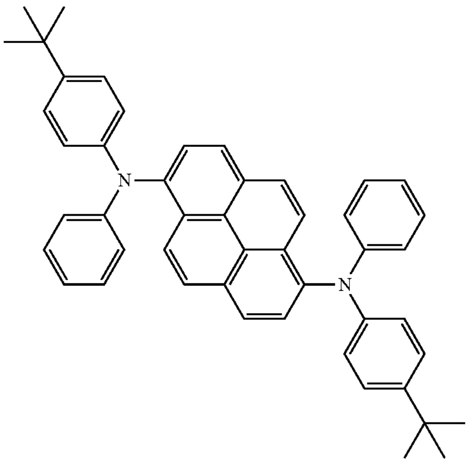
-continued
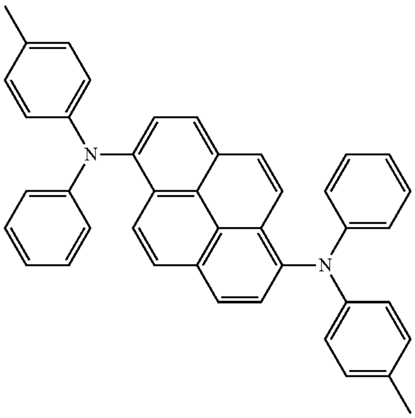
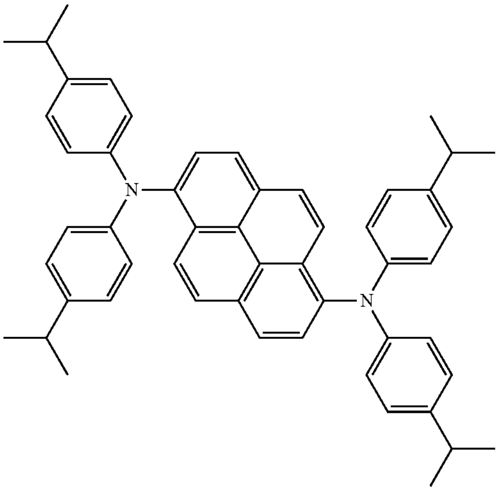
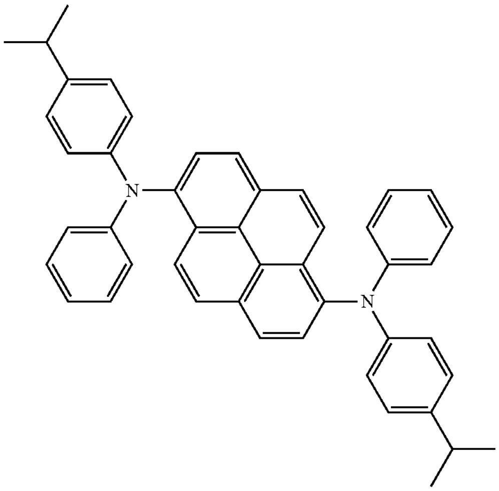
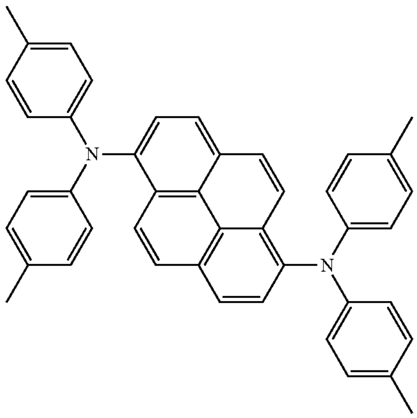

-continued
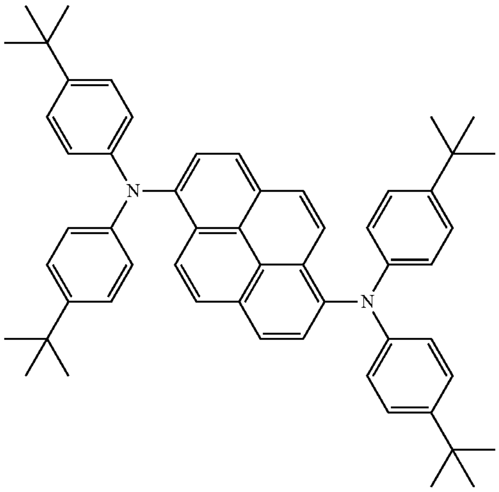
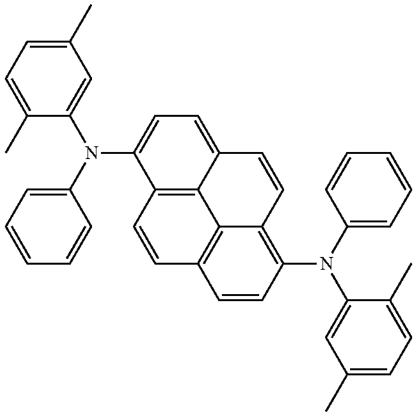
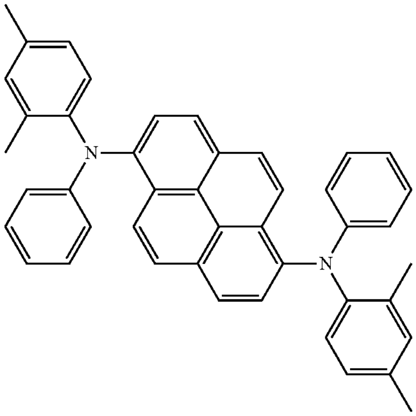
-continued
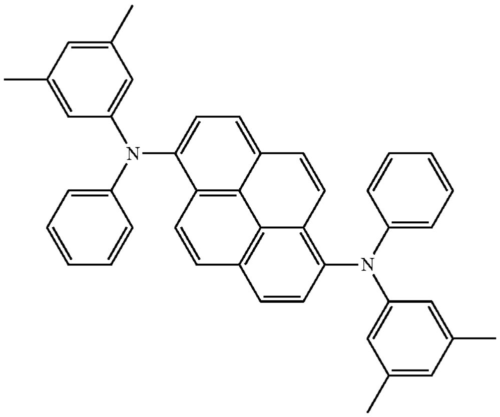
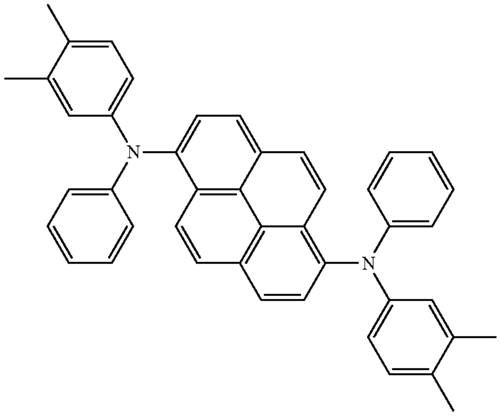
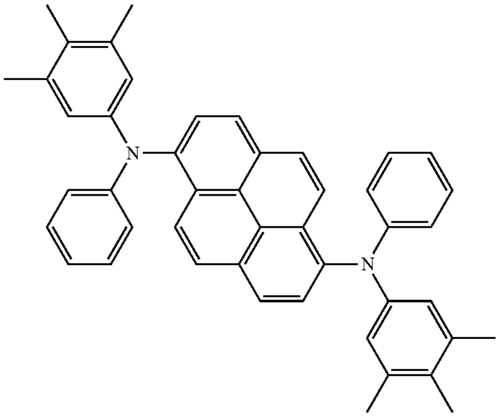
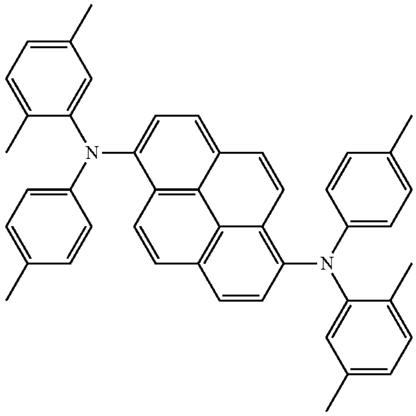

-continued
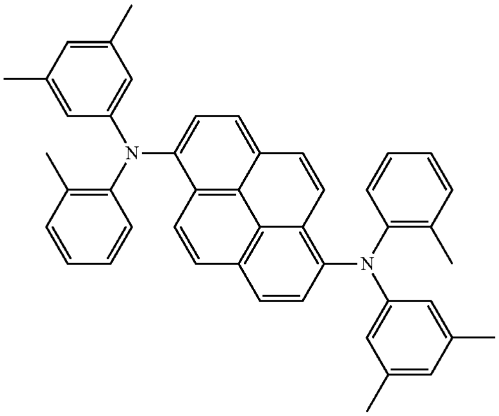
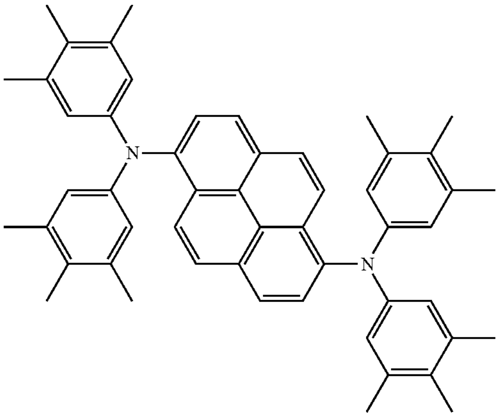
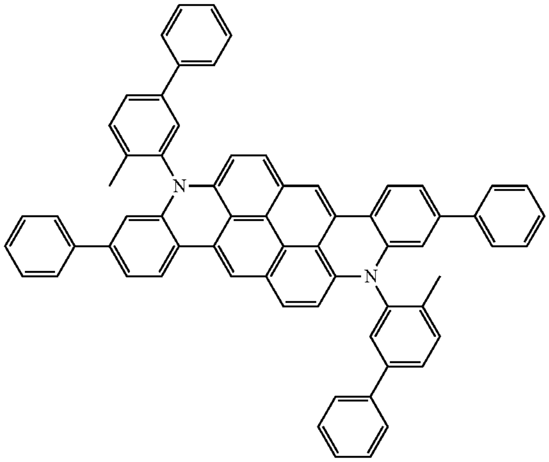
-continued
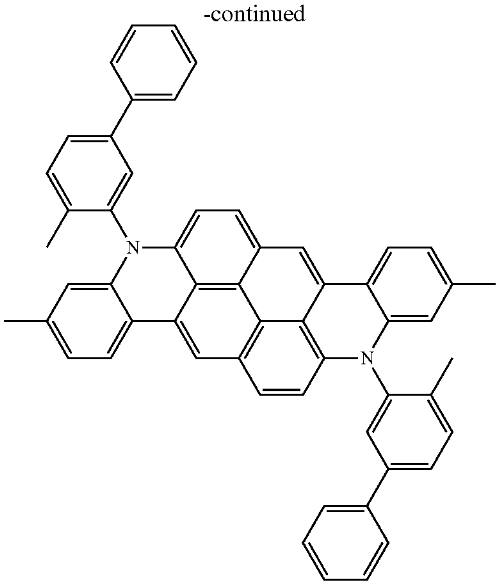
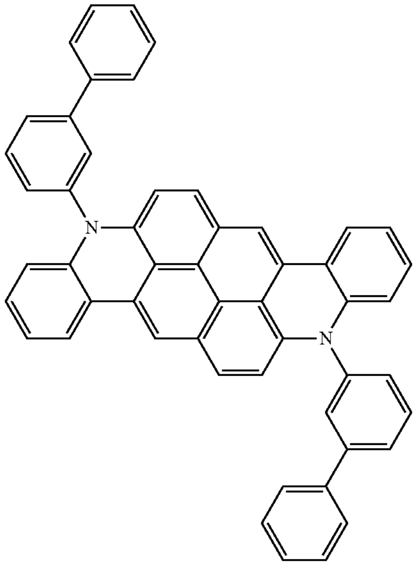
[Formula 243]
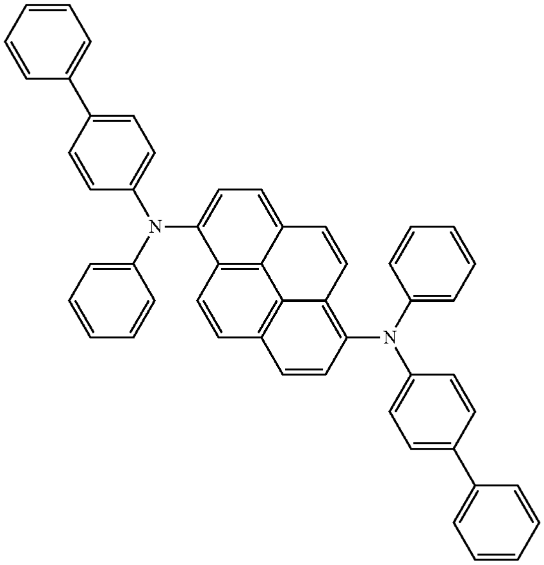

-continued
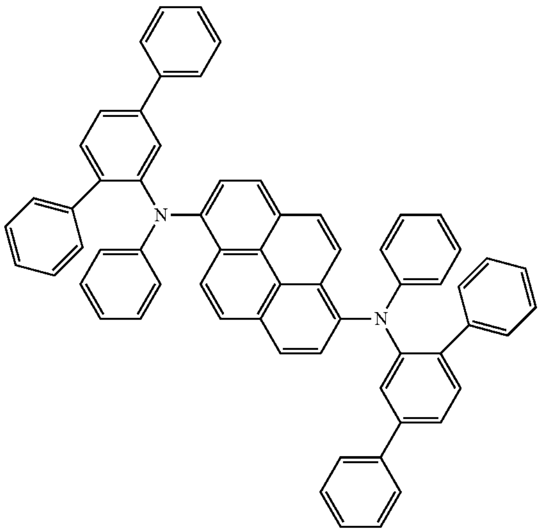
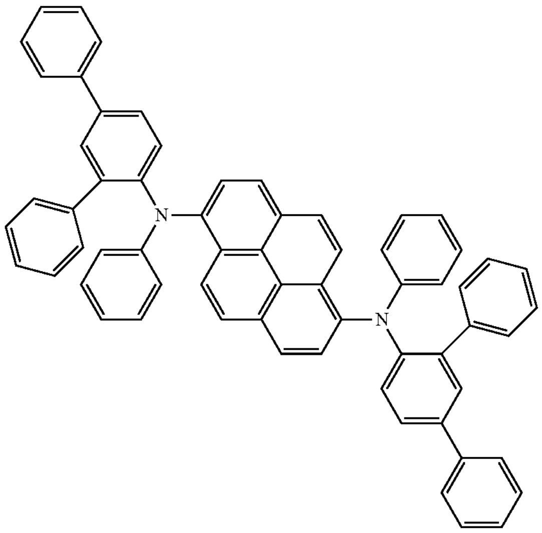
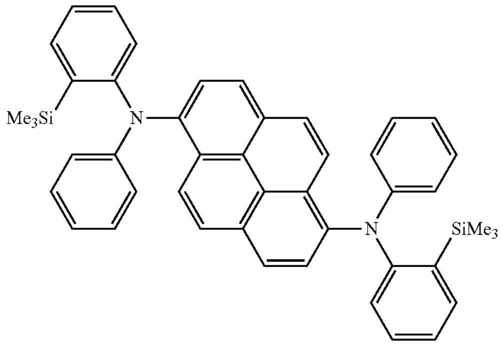
-continued
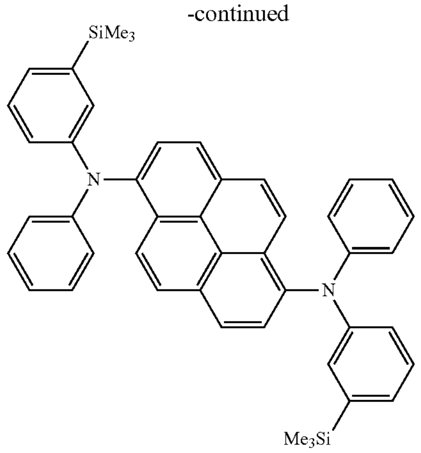
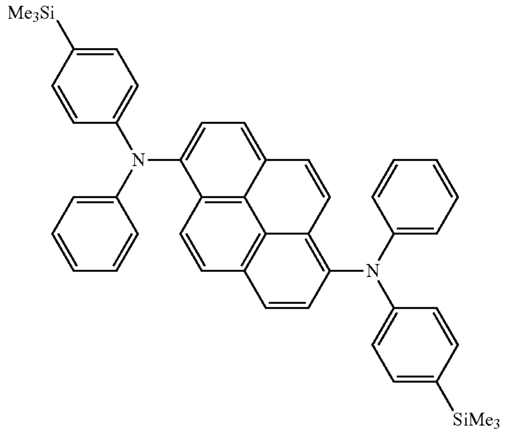
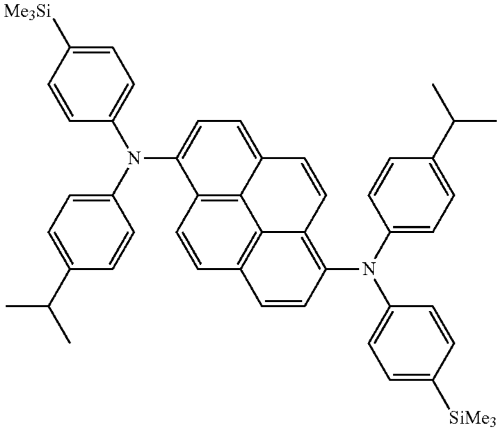
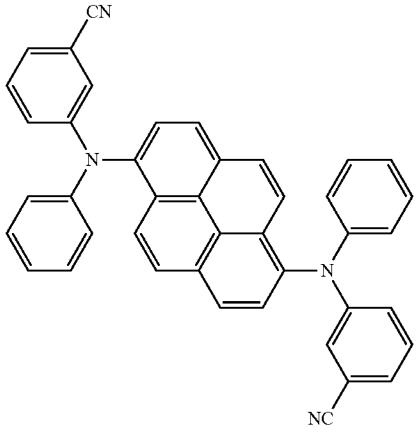

-continued
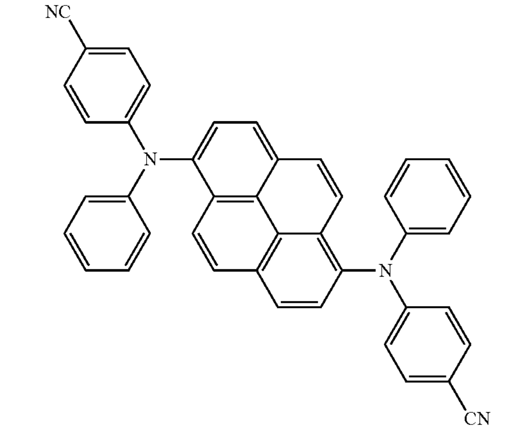
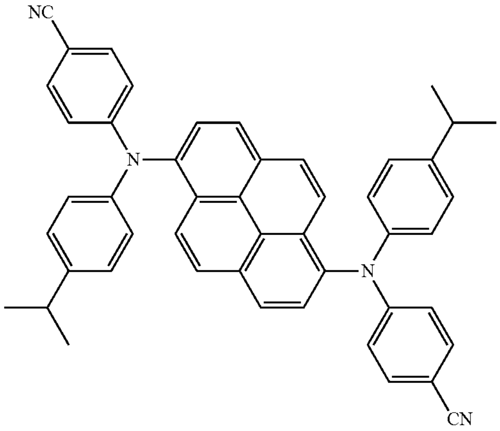
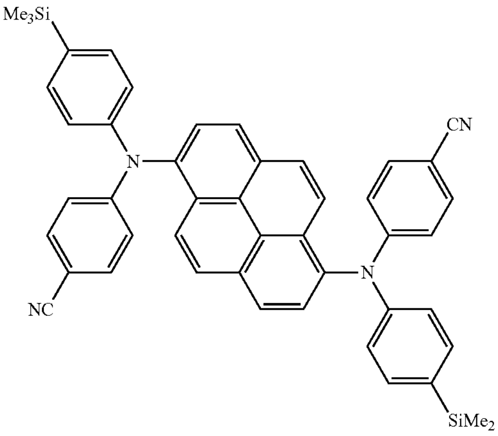
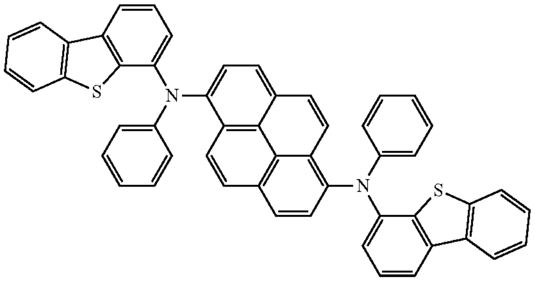
-continued
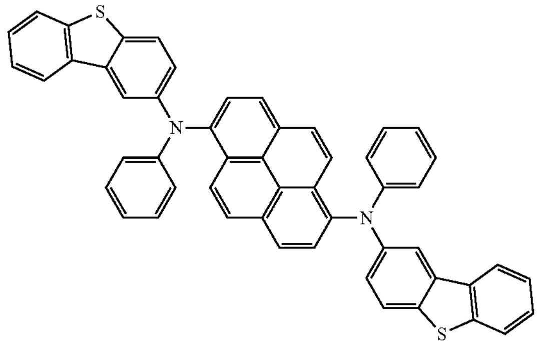
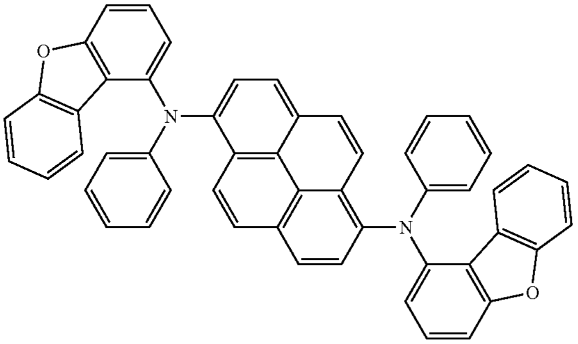
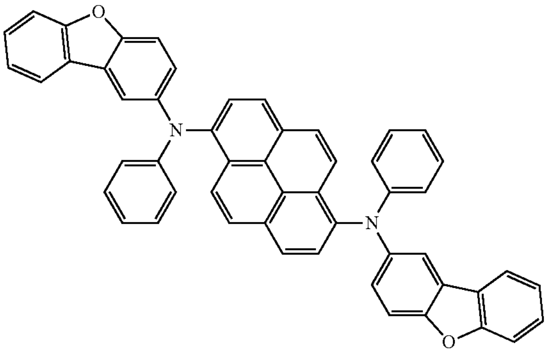
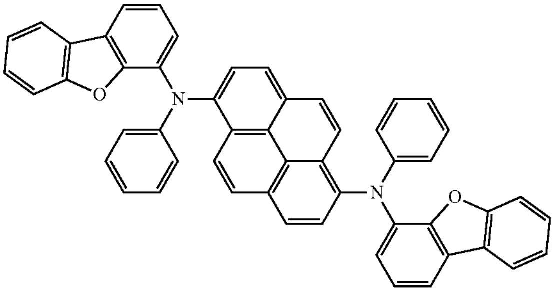

-continued
[Formula 244]
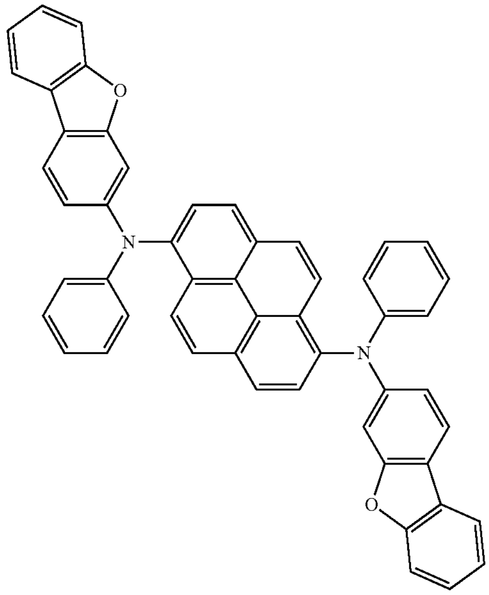
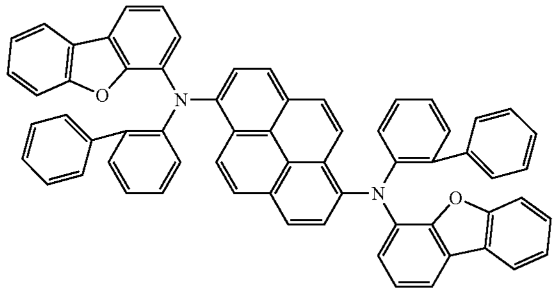
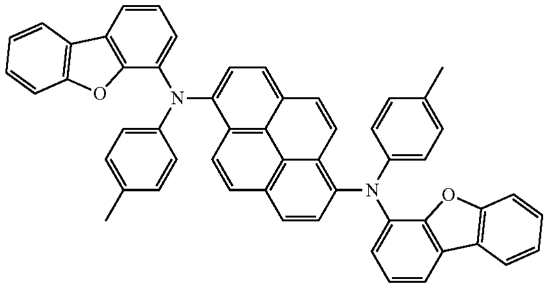
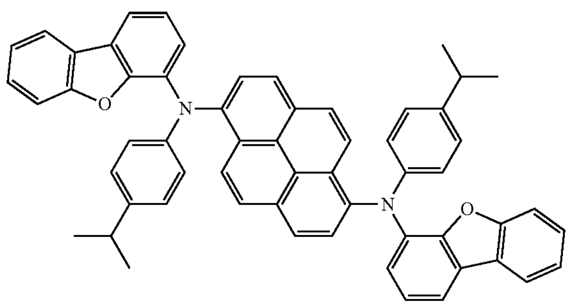
-continued
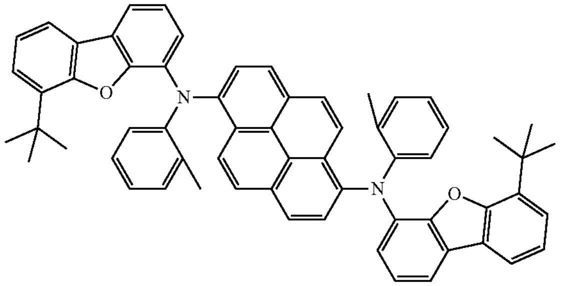
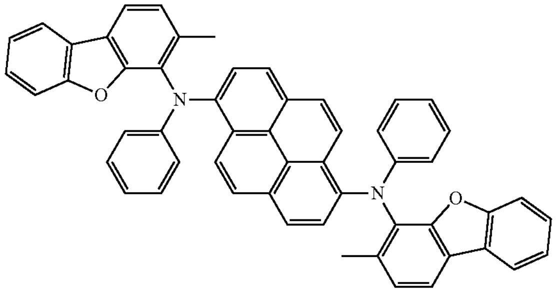
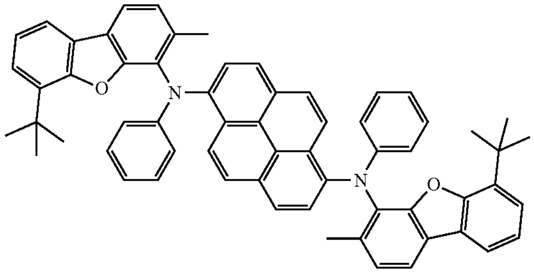
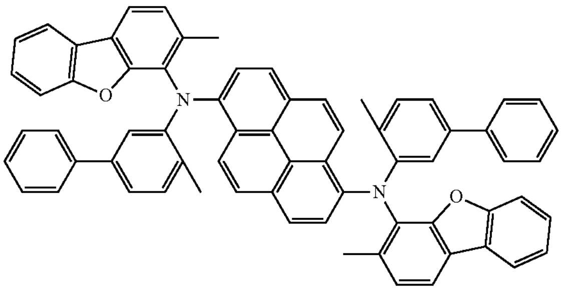
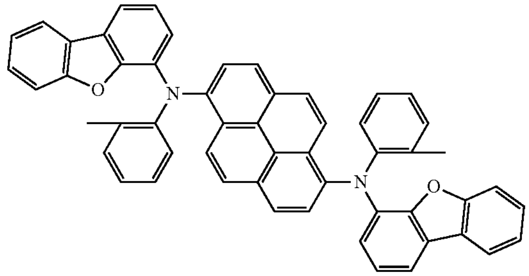
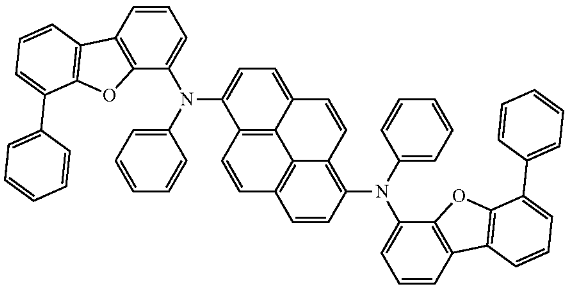

-continued
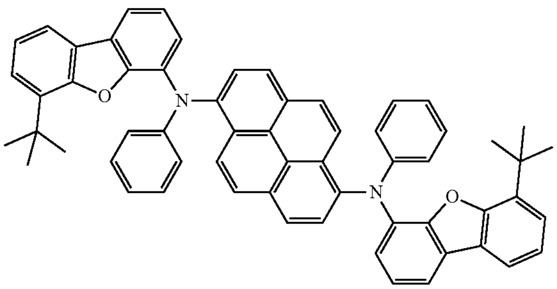
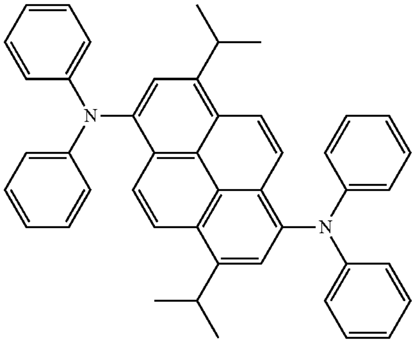
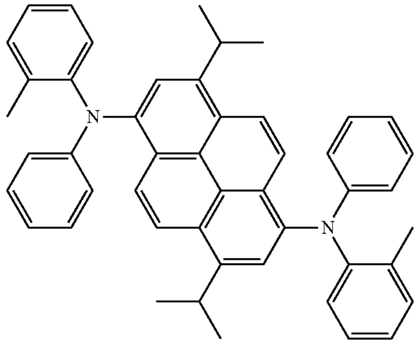
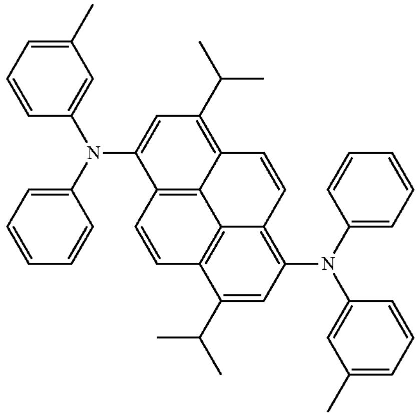
-continued
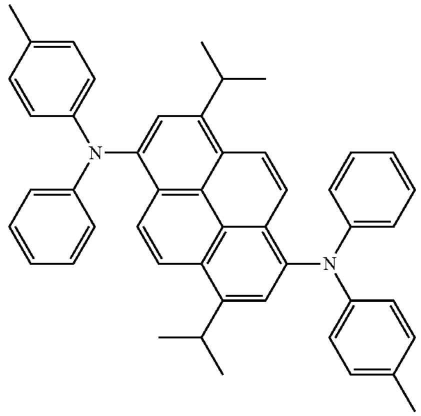
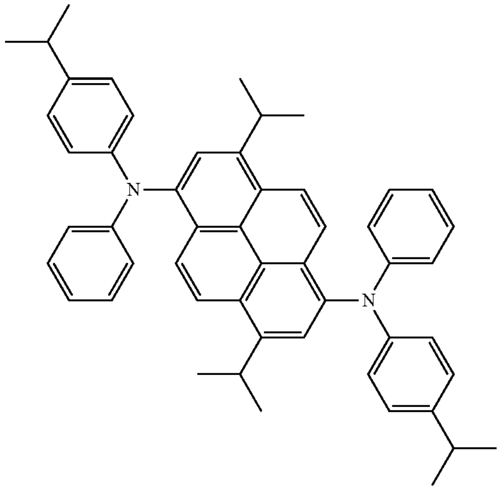
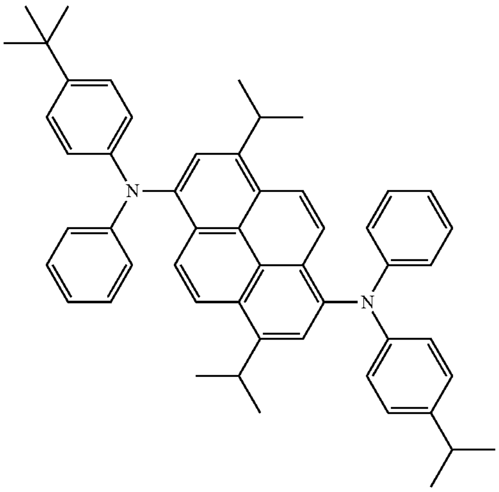

-continued
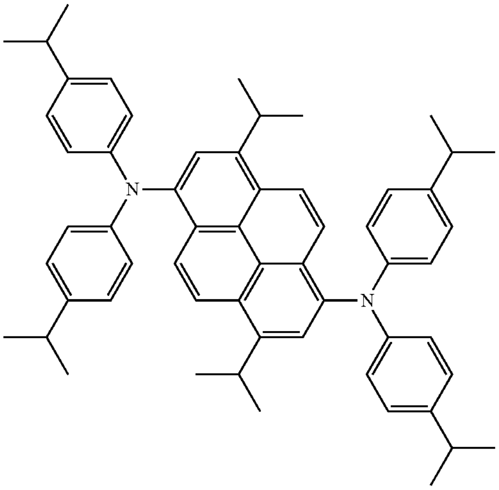
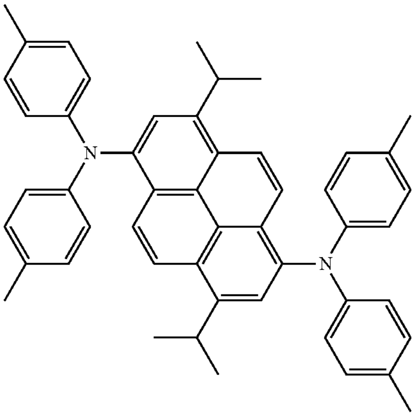
[Formula 245]
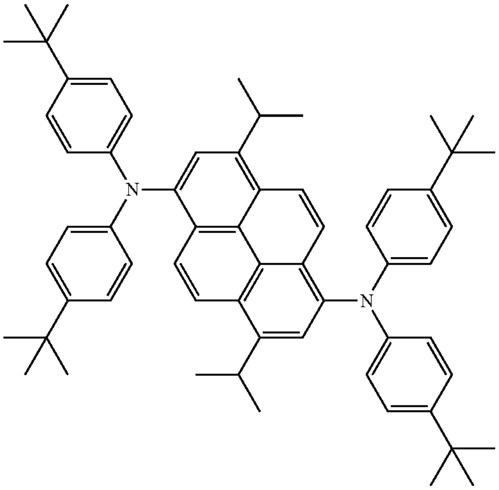
-continued
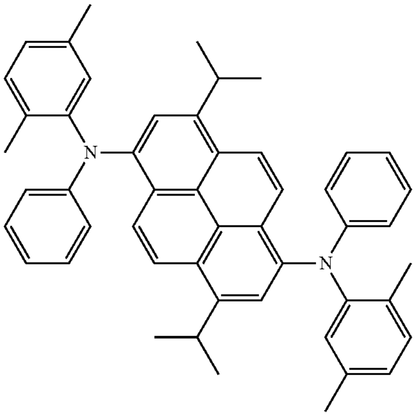
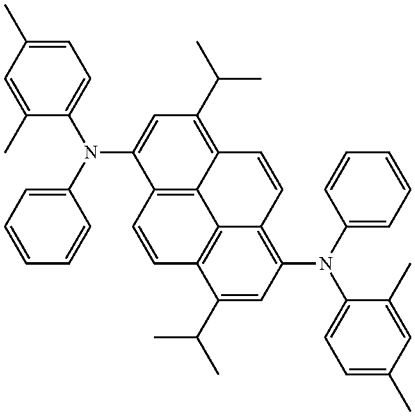
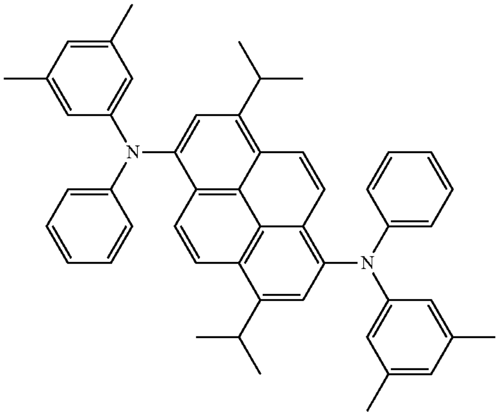
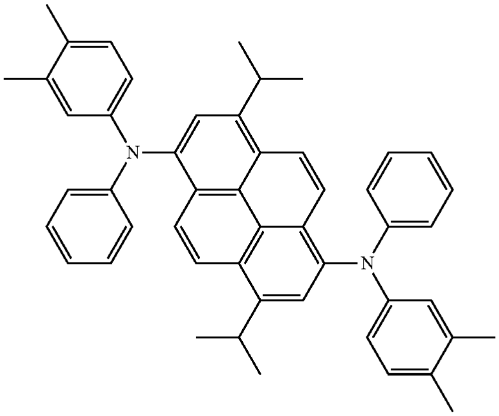

-continued
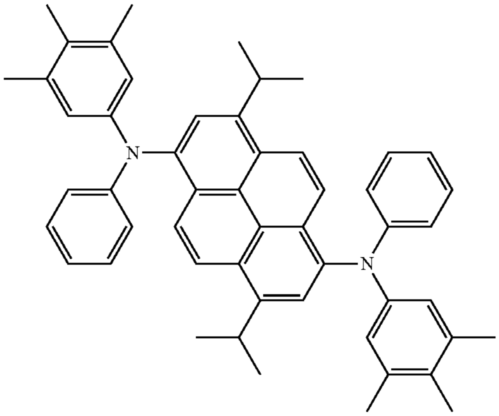
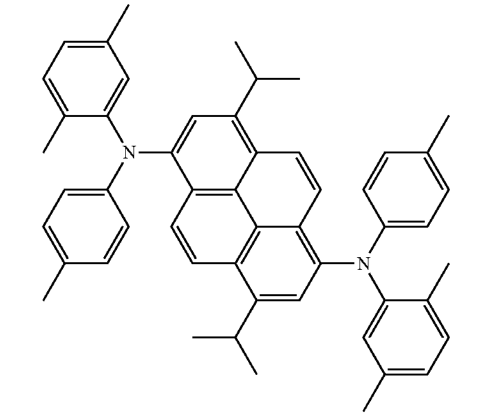
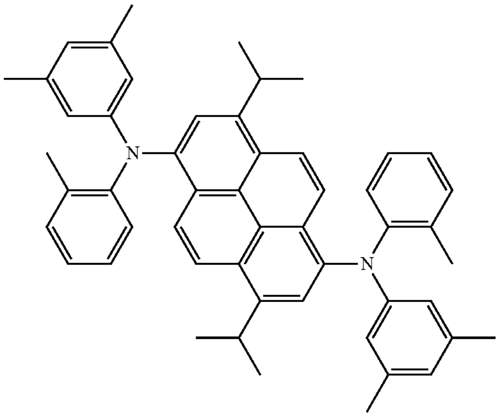
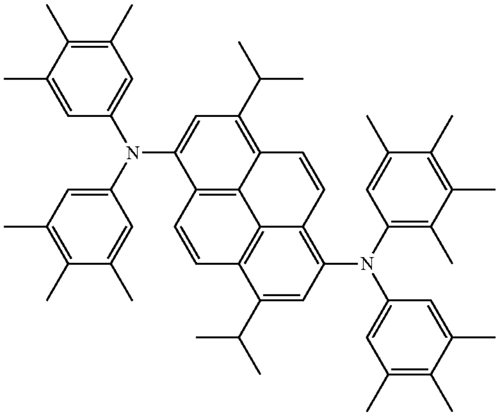
-continued
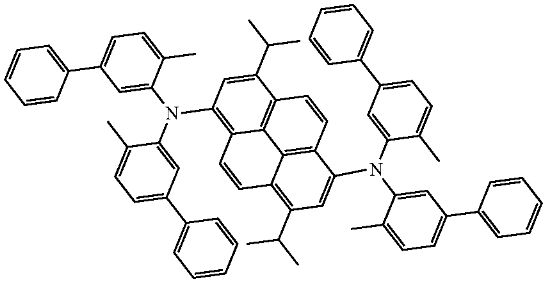
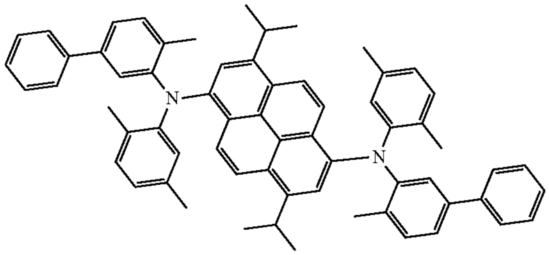
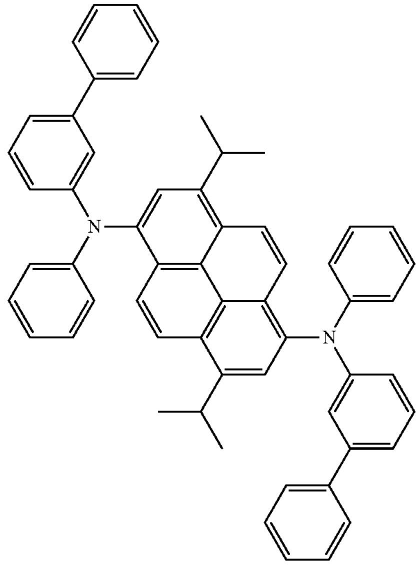
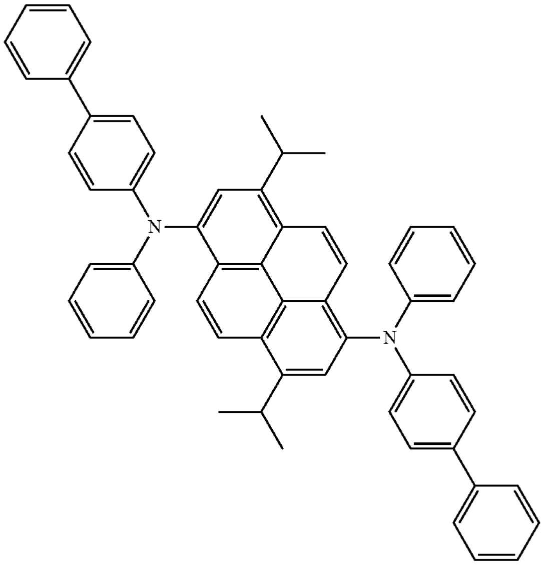

-continued
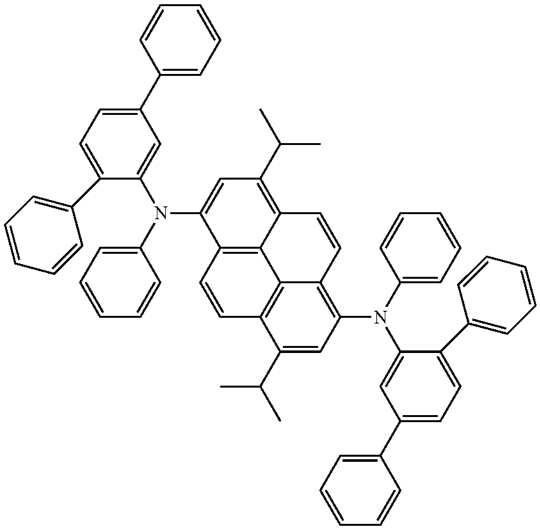
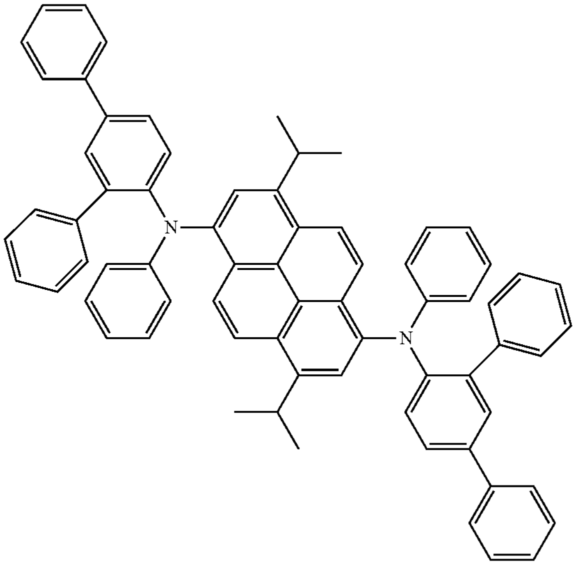
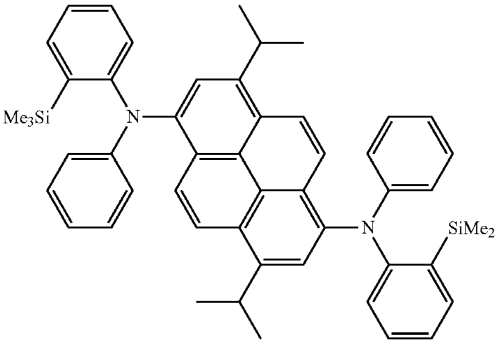
-continued
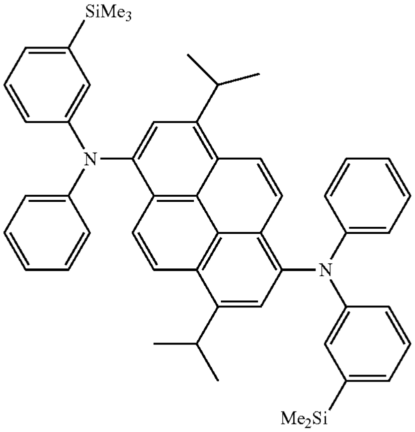
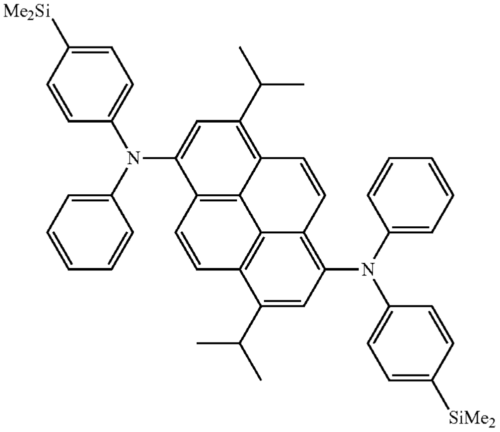
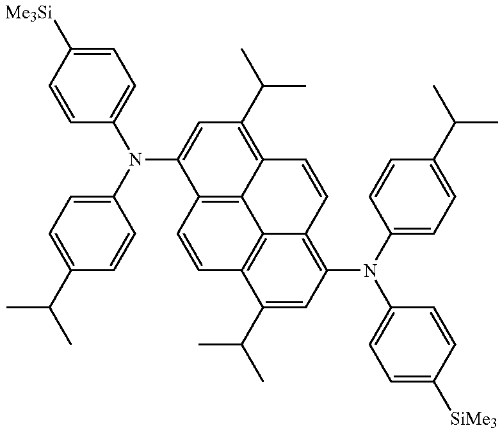
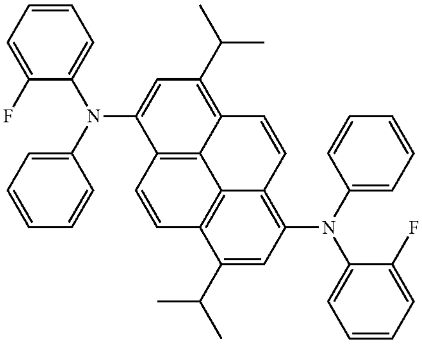

-continued
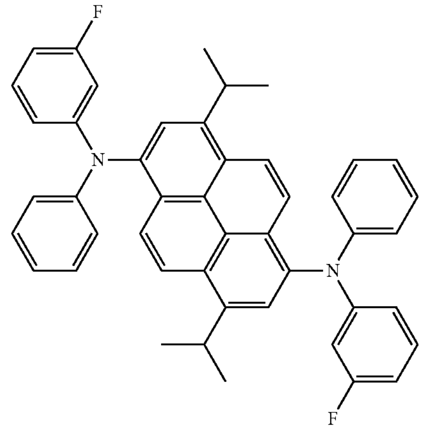
[Formula 246]
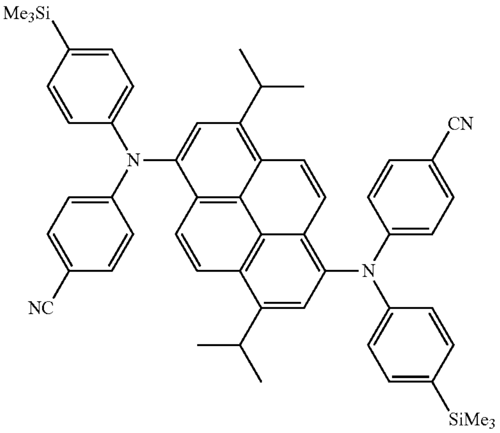
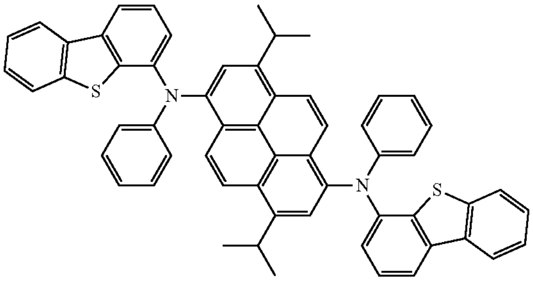
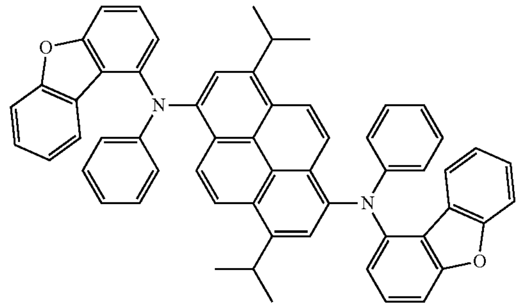
-continued
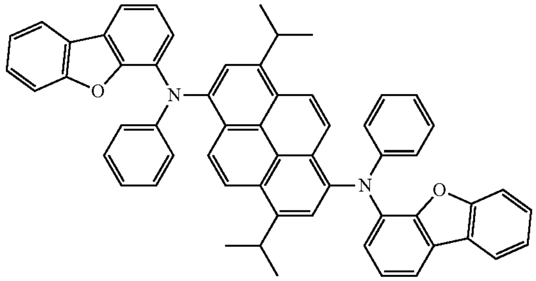
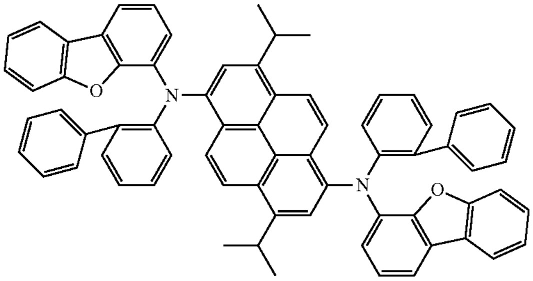
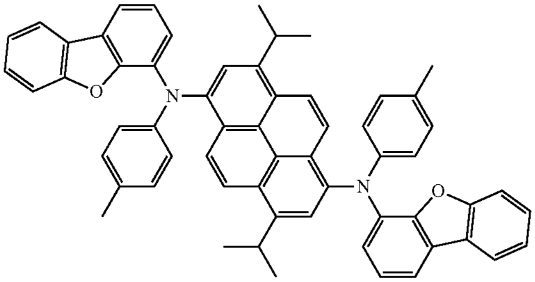
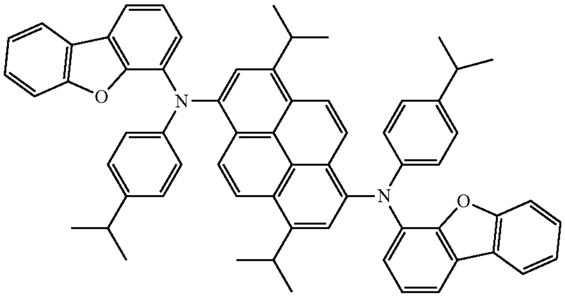
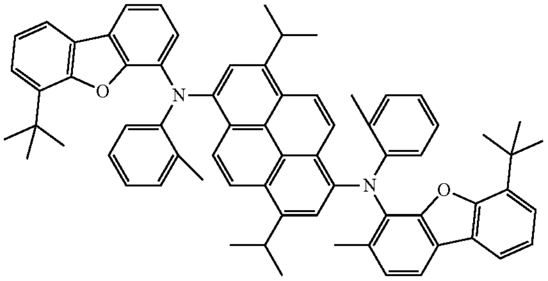
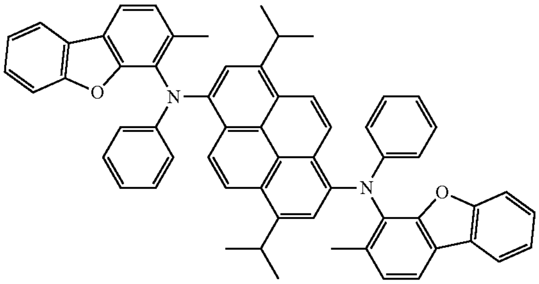

-continued

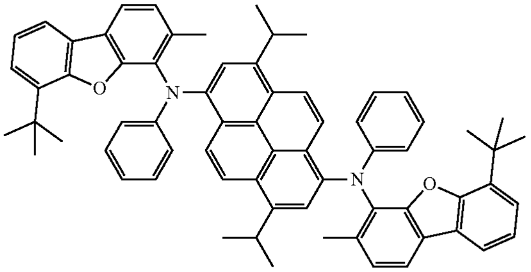

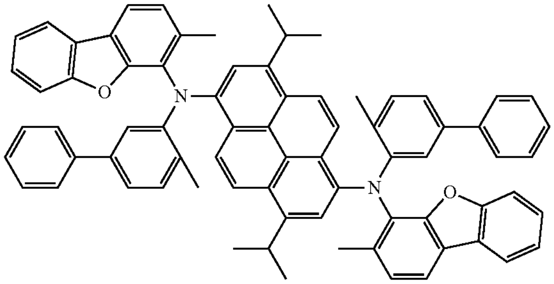

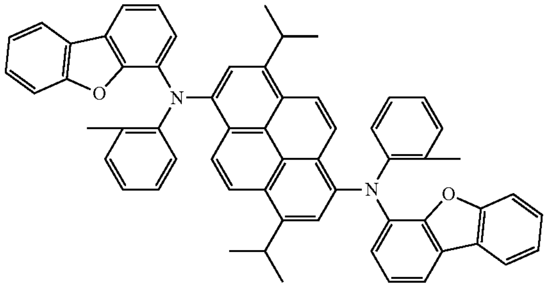

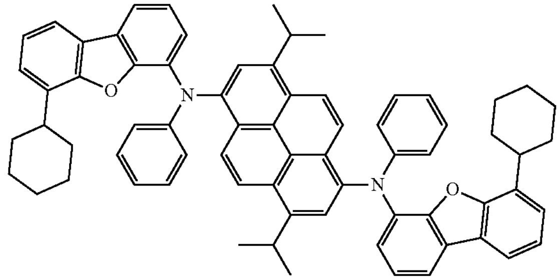

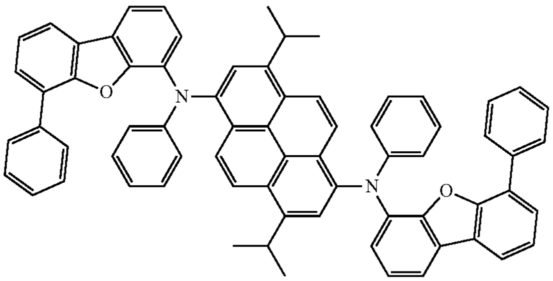

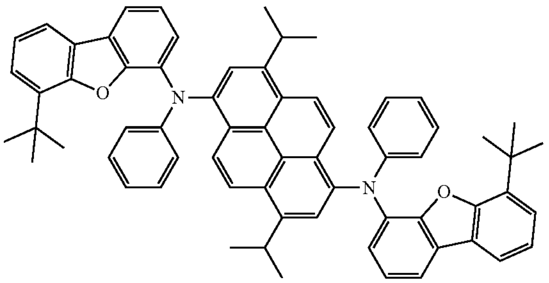

Compound Represented by Formula (4)

The compound represented by the formula (4) will be described below.

[Formula 247]

(4)

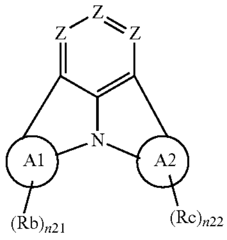

In the formula (4):

Z are each independently CRa or a nitrogen atom;

a ring A1 and a ring A2 are each independently a substituted or unsubstituted aromatic hydrocarbon ring having 6 to 50 ring carbon atoms, or a substituted or unsubstituted heterocycle having 5 to 50 ring atoms;

when a plurality of Ra are present, at least one combination of adjacent two or more of the plurality of Ra are mutually bonded to form a substituted or unsubstituted monocyclic ring, mutually bonded to form a substituted or unsubstituted fused ring, or not mutually bonded;

n21 and n22 are each independently 0, 1, 2, 3, or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of the plurality of Rc are mutually bonded to form a substituted or unsubstituted monocyclic ring, mutually bonded to form a substituted or unsubstituted fused ring, or not mutually bonded; and Ra, Rb, and Rc forming neither the monocyclic ring nor the fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

The "aromatic hydrocarbon ring" for the ring A1 and the ring A2 has the same structure as a compound formed by introducing a hydrogen atom to the "aryl group" described above.

Ring atoms of the "aromatic hydrocarbon ring" for the ring A1 and the ring A2 include two carbon atoms on a fused bicyclic structure at the center of the formula (4)

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the ring A1 and the ring A2 has the same structure as a compound formed by introducing a hydrogen atom to the "heterocyclic group" described above.

Ring atoms of the "heterocycle" for the ring A1 and the ring A2 include two carbon atoms on a fused bicyclic structure at the center of the formula (4).

Specific examples of the "substituted or unsubstituted heterocycle having 5 to 50 ring atoms" include a compound formed by introducing a hydrogen atom to the "heterocyclic group" described in the specific example group G2.

Rb is bonded to any one of carbon atoms forming the aromatic hydrocarbon ring as the ring A1 or any one of atoms forming the heterocycle as the ring A1.

Rc is bonded to any one of carbon atoms forming the aromatic hydrocarbon ring as the ring A2 or any one of atoms forming the heterocycle as the ring A2.

At least one of Ra, Rb, or Rc is preferably a group represented by a formula (4a) below. More preferably, at least two of Ra, Rb, or Rc are each a group represented by the formula (4a).

[Formula 248]

$$*\text{-}L_{401}\text{-}Ar_{401} \qquad (4a)$$

In the formula (4a):

$L_{401}$ is a single bond, a substituted or unsubstituted arylene group having 6 to 30 ring carbon atoms, or a substituted or unsubstituted divalent heterocyclic group having 5 to 30 ring atoms; and $Ar_{401}$ is a substituted or unsubstituted aryl group having 6 to 50 ring carbon atoms, a substituted or unsubstituted heterocyclic group having 5 to 50 ring atoms, and a group represented by a formula (4b) below.

[Formula 249]

(4b)

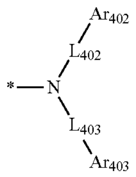

In the formula (4b):

$L_{402}$ and $L_{403}$ are each independently a single bond, a substituted or unsubstituted arylene group having 6 to 30 ring carbon atoms, or a substituted or unsubstituted divalent heterocyclic group having 5 to 30 ring atoms;

a combination of $Ar_{402}$ and $Ar_{403}$ are mutually bonded to form a substituted or unsubstituted monocyclic ring, mutually bonded to form a substituted or unsubstituted fused ring, or not mutually bonded; and $Ar_{402}$ and $Ar_{403}$ forming neither the monocyclic ring nor the fused ring are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is represented by a formula (42) below.

[Formula 250]

(42)

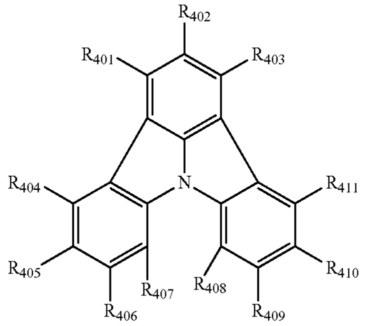

In the formula (42):

at least one combination of adjacent two or more of $R_{401}$ to $R_{411}$ are mutually bonded to form a substituted or unsubstituted monocyclic ring, mutually bonded to form a substituted or unsubstituted fused ring, or not mutually bonded; and $R_{401}$ to $R_{411}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one of $R_{401}$ to $R_{411}$ is preferably a group represented by the formula (4a). More preferably, at least two of $R_{401}$ to $R_{411}$ are each a group represented by the formula (4a).

$R_{404}$ and $R_{411}$ are each preferably a group represented by the formula (4a).

In an exemplary embodiment, the compound represented by the formula (4) is a compound formed by bonding a structure represented by a formula (4-1) or a formula (4-2) below to the ring A1.

Further, in an exemplary embodiment, the compound represented by the formula (42) is a compound formed by bonding the structure represented by the formula (4-1) or the formula (4-2) to a ring bonded to $R_{404}$ to $R_{407}$.

[Formula 251]

(4-1)

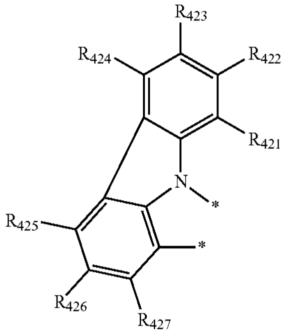

-continued (4-2)

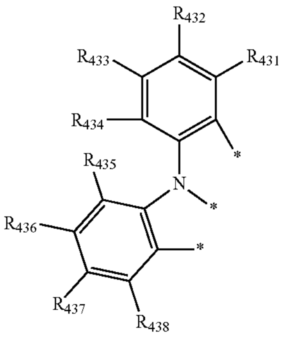

In the formula (4-1), two * are each independently bonded to a ring-forming carbon atom of the aromatic hydrocarbon ring or a ring atom of the heterocycle as the ring A1 in the formula (4) or bonded to one of $R_{404}$ to $R_{407}$ in the formula (42);

in the formula (4-2), three * are each independently bonded to a ring-forming carbon atom of the aromatic hydrocarbon ring or a ring atom of the heterocycle as the ring A1 in the formula (4) or bonded to one of $R_{404}$ to $R_{407}$ in the formula (42);

at least one combination of adjacent two or more of $R_{421}$ to $R_{427}$ are mutually bonded to form a substituted or unsubstituted monocyclic ring, mutually bonded to form a substituted or unsubstituted fused ring, or not mutually bonded;

at least one combination of adjacent two or more of $R_{431}$ to $R_{438}$ are mutually bonded to form a substituted or unsubstituted monocyclic ring, mutually bonded to form a substituted or unsubstituted fused ring, or not mutually bonded; and $R_{421}$ to $R_{427}$ and $R_{431}$ to $R_{438}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by a formula (41-3), a formula (41-4) or a formula (41-5) below.

[Formula 252]

(41-3)

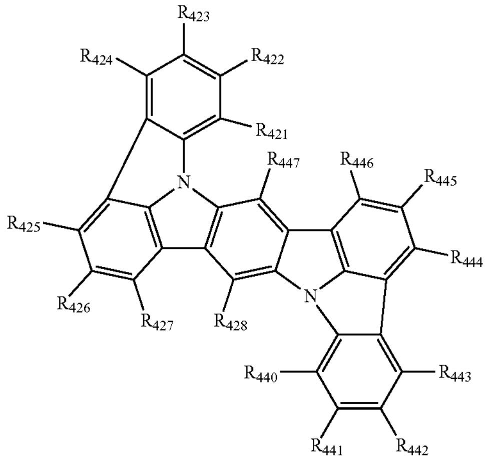

[Formula 253]

(41-4)

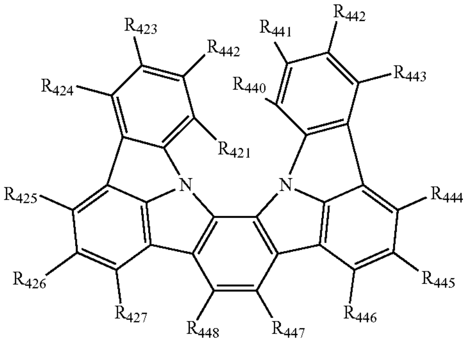

[Formula 254]

(41-5)

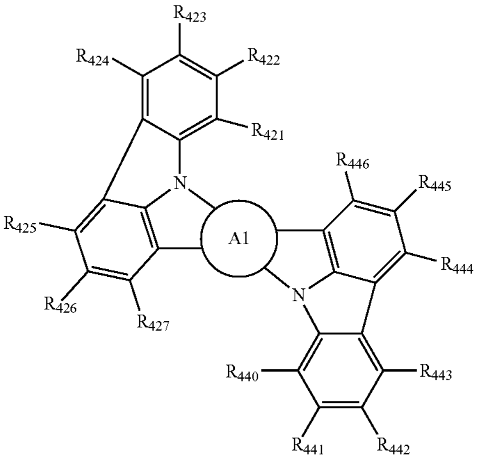

In the formulae (41-3), (41-4), and (41-5):

a ring A1 is defined as in the formula (4);

$R_{421}$ to $R_{427}$ each independently represent the same as $R_{421}$ to $R_{427}$ in the formula (4-1); and $R_{440}$ to $R_{448}$ each independently represent the same as $R_{401}$ to $R_{411}$ in the formula (42).

In an exemplary embodiment, a substituted or unsubstituted aromatic hydrocarbon ring having 6 to 50 ring carbon atoms as the ring A1 in the formula (41-5) is a substituted or unsubstituted naphthalene ring, or a substituted or unsubstituted fluorene ring.

In an exemplary embodiment, a substituted or unsubstituted heterocycle having 5 to 50 ring atoms as the ring A1 in the formula (41-5) is a substituted or unsubstituted dibenzofuran ring, a substituted or unsubstituted carbazole ring, or a substituted or unsubstituted dibenzothiophene ring.

In an exemplary embodiment, the compound represented by the formula (4) or the formula (42) is selected from the group consisting of compounds represented by formulae (461) to (467) below.

[Formula 255]

(461)

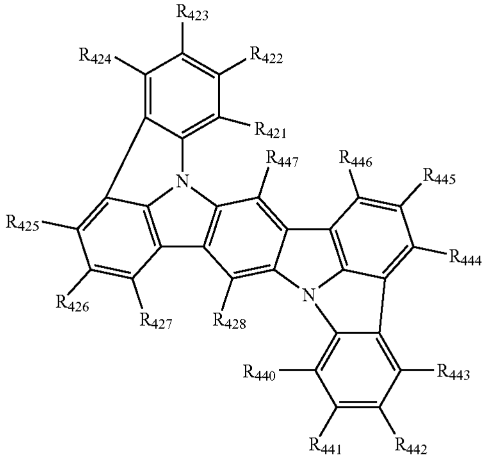

(462)

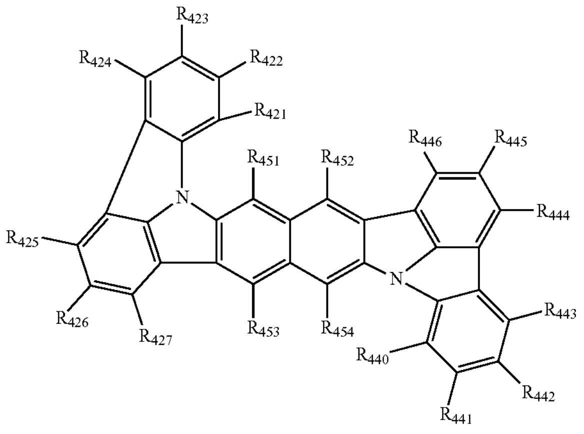

-continued

[Formula 256]

(463)

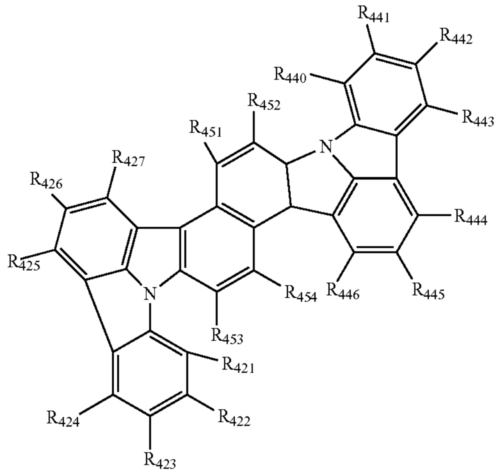

(464)

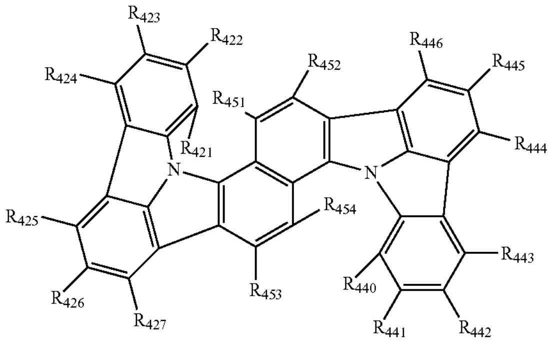

[Formula 257]

(465)

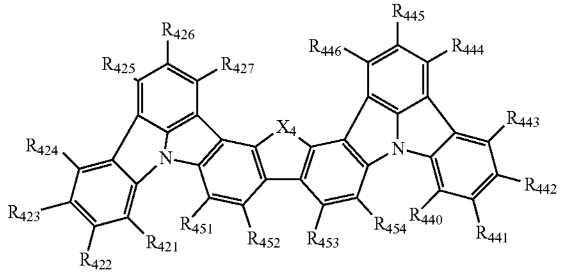

[Formula 258]

(466)

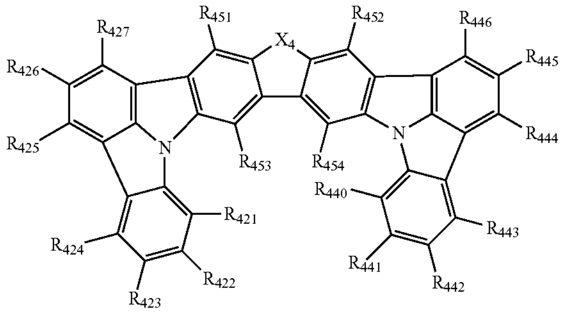

-continued

[Formula 259]

(467)

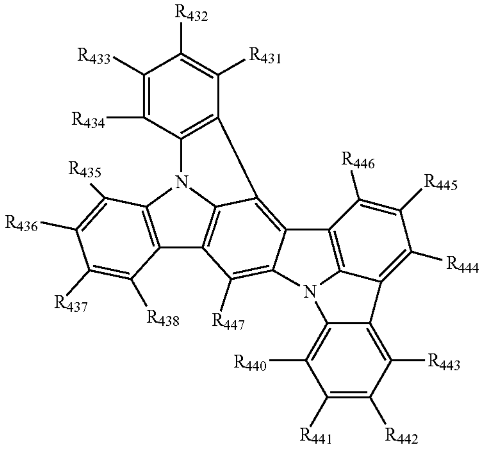

In the formulae (461), (462), (463), (464), (465), (466), and (467):

$R_{421}$ to $R_{427}$ each independently represent the same as $R_{421}$ to $R_{427}$ in the formula (4-1);

$R_{431}$ to $R_{438}$ each independently represent the same as $R_{431}$ to $R_{438}$ in the formula (4-2);

$R_{440}$ to $R_{448}$ and $R_{451}$ to $R_{454}$ each independently represent the same as $R_{401}$ to $R_{411}$ in the formula (42);

$X_4$ is an oxygen atom, $NR_{801}$, or $C(R_{802})(R_{803})$;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; preferably, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, at least one combination of adjacent two or more of $R_{401}$ to $R_{411}$ in the compound represented by the formula (42) are mutually bonded to form a substituted or unsubstituted monocyclic ring, or mutually bonded to form a substituted or unsubstituted fused ring. This exemplary embodiment will be described in detail below as a compound represented by a formula (45) below.

Compound Represented by Formula (45)

The compound represented by the formula (45) will be described below.

[Formula 260]

(45)

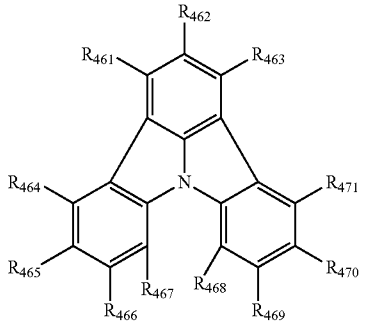

In the formula (45):

two or more of combinations selected from the group consisting of a combination of $R_{461}$ and $R_{462}$, a combination of $R_{462}$ and $R_{463}$, a combination of $R_{464}$ and $R_{465}$, a combination of $R_{465}$ and $R_{466}$, a combination of $R_{466}$ and $R_{467}$, a combination of $R_{468}$ and $R_{469}$, a combination of $R_{469}$ and $R_{470}$, and a combination of $R_{470}$ and $R_{471}$ are mutually bonded to form a substituted or unsubstituted monocyclic ring or mutually bonded to form a substituted or unsubstituted fused ring;

the combination of $R_{461}$ and $R_{462}$ and the combination of $R_{462}$ and $R_{463}$; the combination of $R_{464}$ and $R_{465}$ and the combination of $R_{465}$ and $R_{466}$; the combination of $R_{465}$ and $R_{466}$ and the combination of $R_{466}$ and $R_{467}$; the combination of $R_{468}$ and $R_{469}$ and the combination of $R_{469}$ and $R_{470}$; and the combination of $R_{469}$ and $R_{470}$ and the combination of $R_{470}$ and $R_{471}$ do not form a ring simultaneously;

the two or more rings formed by $R_{461}$ to $R_{471}$ are mutually the same or different; and $R_{461}$ to $R_{471}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

In the formula (45), $R_n$ and $R_{n+1}$ (n being an integer selected from 461, 462, 464 to 466, and 468 to 470) are mutually bonded to form a substituted or unsubstituted monocyclic ring or fused ring together with two ring-forming carbon atoms bonded to $R_n$ and $R_{n+1}$. The ring is preferably formed of atoms selected from the group consisting of a carbon atom, an oxygen atom, a sulfur atom, and a nitrogen atom, and is made of preferably 3 to 7 atoms, more preferably 5 or 6 atoms.

The number of the above cyclic structures in the compound represented by the formula (45) is, for instance, 2, 3, or 4. The two or more of the cyclic structures may be present on the same benzene ring on the basic skeleton represented by the formula (45) or may be present on different benzene rings. For instance, when three cyclic structures are present, each of the cyclic structures may be present on the corresponding one of the three benzene rings of the formula (45).

Examples of the above cyclic structures in the compound represented by the formula (45) include structures represented by formulae (451) to (460) below.

[Formula 261]

(451)

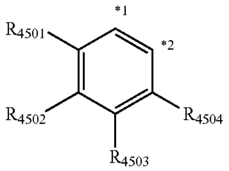

(452)

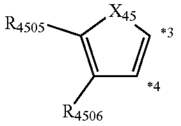

(453)

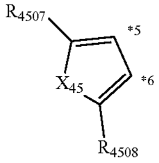

(454)

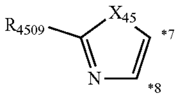

(455)

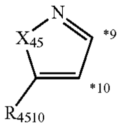

(456)

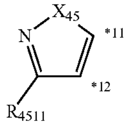

(457)

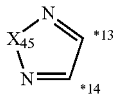

In the formulae (451) to (457):

each combination of *1 and *2, *3 and *4, *5 and *6, *7 and *8, *9 and *10, *11 and *12, and *13 and *14 represents the two ring-forming carbon atoms bonded to $R_n$ and $R_{n+1}$;

the ring-forming carbon atom bonded to $R_n$ may be any one of the two ring-forming carbon atoms represented by *1 and *2, *3 and *4, *5 and *6, *7 and *8, *9 and *10, *11 and *12, and *13 and *14;

$X_{45}$ is $C(R_{4512})(R_{4513})$, $NR_{4514}$, an oxygen atom, or a sulfur atom;

at least one combination of adjacent two or more of $R_{4501}$ to $R_{4506}$ and $R_{4512}$ to $R_{4513}$ are mutually bonded to form a substituted or unsubstituted monocyclic ring, mutually bonded to form a substituted or unsubstituted fused ring, or not mutually bonded; and $R_{4501}$ to $R_{4514}$ forming neither the monocyclic ring nor the fused ring each independently represent the same as $R_{461}$ to $R_{471}$ in the formula (45).

[Formula 262]

(458)

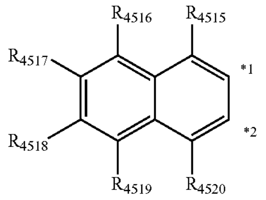

(459)

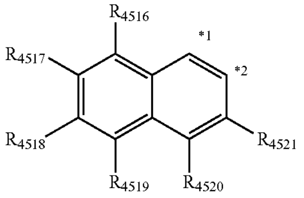

(460)

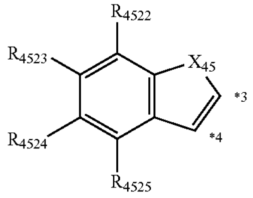

In the formulae (458) to (460):

each combination of *1 and *2, and *3 and *4 represents the two ring-forming carbon atoms bonded to $R_n$ and $R_{n+1}$;

the ring-forming carbon atom bonded to $R_n$ may be any one of the two ring-forming carbon atoms represented by *1 and *2, or *3 and *4;

$X_{45}$ is $C(R_{4512})(R_{4513})$, $NR_{4514}$, an oxygen atom, or a sulfur atom;

at least one combination of adjacent two or more of $R_{4512}$ to $R_{4513}$ and $R_{4515}$ to $R_{4525}$ are mutually bonded to form a substituted or unsubstituted monocyclic ring, mutually bonded to form a substituted or unsubstituted fused ring, or not mutually bonded; and $R_{4512}$ to $R_{4513}$, $R_{4515}$ to $R_{4521}$ and $R_{4522}$ to $R_{4525}$ forming neither the monocyclic ring nor the fused ring, and $R_{4514}$ each independently represent the same as $R_{461}$ to $R_{471}$ in the formula (45).

In the formula (45), preferably, at least one of $R_{462}$, $R_{464}$, $R_{465}$, $R_{470}$ or $R_{471}$ (preferably, at least one of $R_{462}$, $R_{465}$ or $R_{470}$, more preferably $R_{462}$) is a group forming no cyclic structure.

(i) A substituent, if present, for a cyclic structure formed by $R_n$ and $R_{n+1}$ in the formula (45), (ii) $R_{461}$ to $R_{471}$ forming no cyclic structure in the formula (45), and (iii) $R_{4501}$ to $R_{4514}$, $R_{4515}$ to $R_{4525}$ in the formulae (451) to (460) are preferably each independently a group selected from the group consisting of a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, a substituted or unsubstituted aryl group having 6 to 50 ring carbon atoms, a substituted or unsubstituted heterocyclic group having 5 to 50 ring atoms, or groups represented by formulae (461) to (464) below.

[Formula 263]

(461)

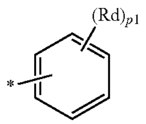

(462)

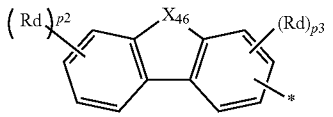

(463)

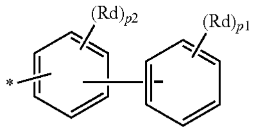

(464)

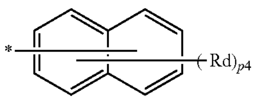

In the formulae (461) to (464):

$R_d$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_{46}$ is C($R_{801}$)($R_{802}$), $NR_{803}$, an oxygen atom, or a sulfur atom;

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

preferably, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different;

when a plurality of $R_{803}$ are present, the plurality of $R_{803}$ are mutually the same or different;

p1 is 5;

p2 is 4;

p3 is 3;

p4 is 7; and in the formulae (461) to (464), * each independently represent a bonding position to a cyclic structure.

$R_{901}$ to $R_{907}$ in the emitting compounds including the first emitting compound, the second emitting compound and the third emitting compound are defined as above.

In an exemplary embodiment, the compound represented by the formula (45) is represented by one of formulae (45-1) to (45-6) below.

[Formula 264]

(45-1)

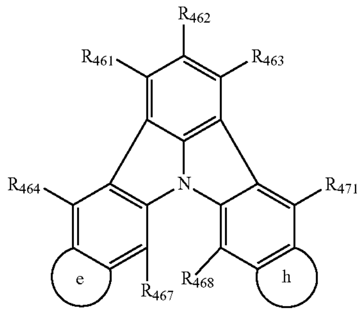

(45-2)

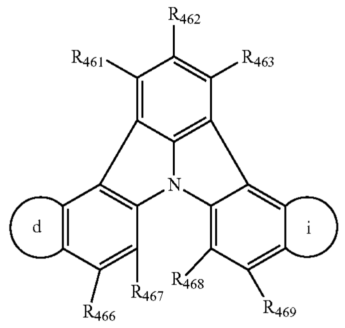

(45-3)

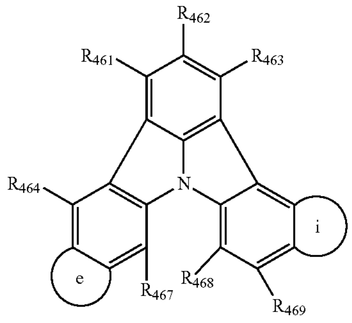

[Formula 265]

(45-4)

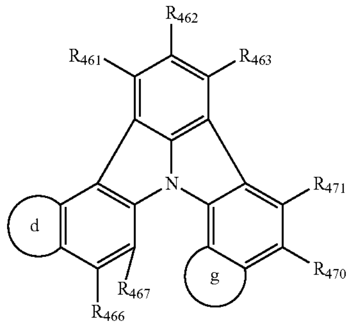

-continued (45-5)

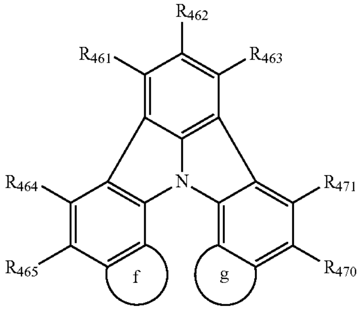

(45-6)

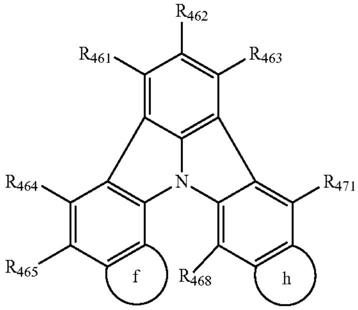

In the formulae (45-1) to (45-6):

rings d to i are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

In an exemplary embodiment, the compound represented by the formula (45) is represented by one of formulae (45-7) to (45-12) below.

[Formula 266]

(45-7)

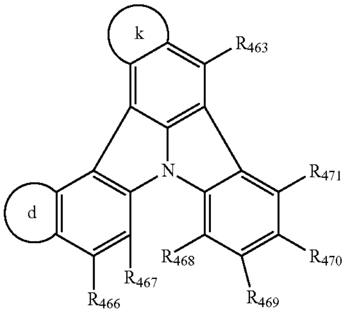

(45-8)

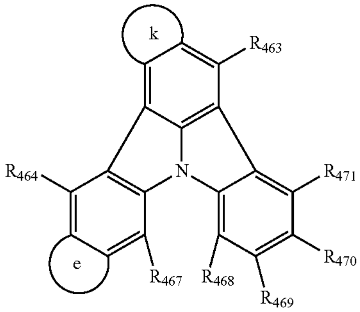

-continued (45-9)

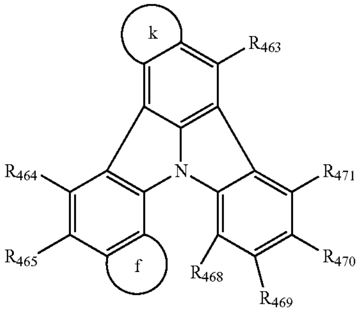

[Formula 267]

(45-10)

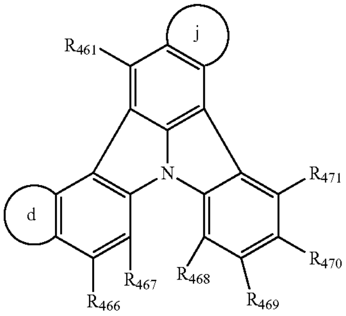

(45-11)

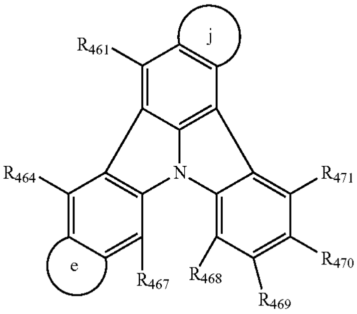

(45-12)

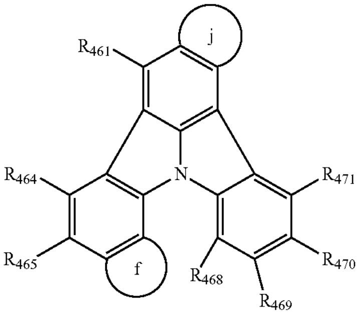

In the formulae (45-7) to (45-12):

rings d to f, k and j are each independently a substituted or unsubstituted monocyclic ring or a substituted or unsubstituted fused ring; and $R_{481}$ to $R_{471}$ each independently represent the same as $R_{461}$ to $R_{471}$ in the formula (45).

In an exemplary embodiment, the compound represented by the formula (45) is represented by one of formulae (45-13) to (45-21) below.

[Formula 268]
(45-13)
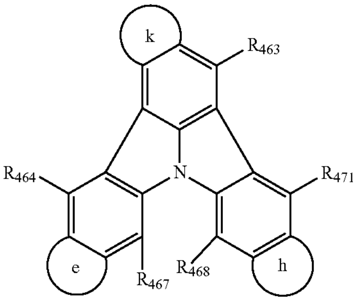
(45-14)
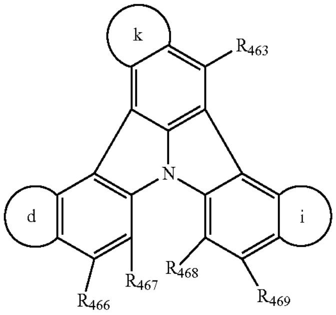
(45-15)
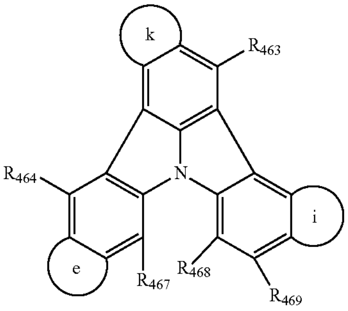
[Formula 269]
(45-16)
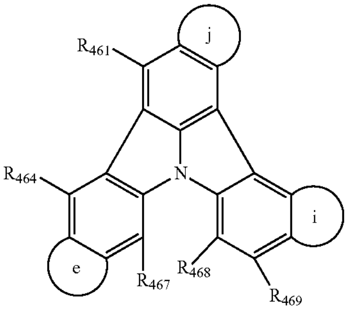
-continued
(45-17)
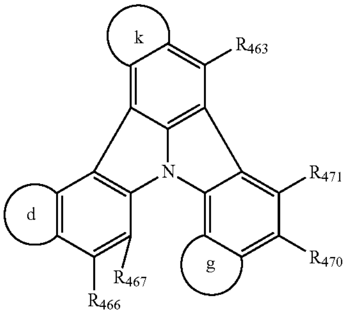
(45-18)
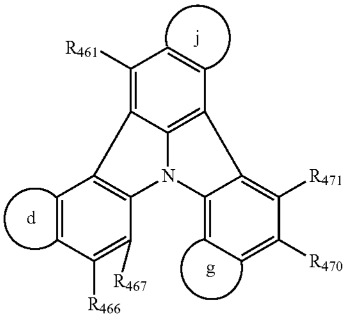
[Formula 270]
(45-19)
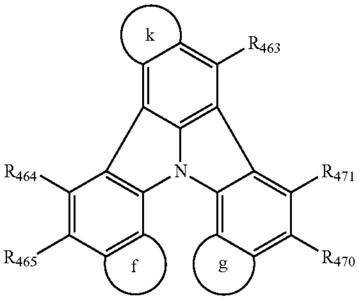
(45-20)
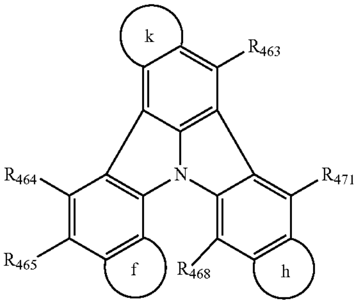
(45-21)
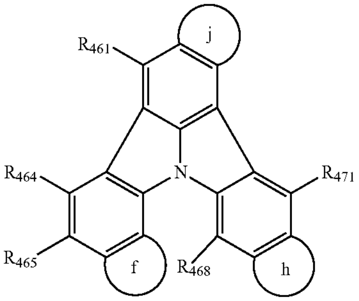

In the formulae (45-13) to (45-21):

rings d to k are each independently a substituted or unsubstituted monocyclic ring or a substituted or unsubstituted fused ring; and $R_{461}$ to $R_{471}$ each independently represent the same as $R_{461}$ to $R_{471}$ in the formula (45).

When the ring g or the ring h further has a substituent, examples of the substituent include a substituted or unsubstituted alkyl group having 1 to 50 carbon atoms, a substituted or unsubstituted aryl group having 6 to 50 ring carbon atoms, a group represented by the formula (461), a group represented by the formula (463), and a group represented by the formula (464).

In an exemplary embodiment, the compound represented by the formula (45) is represented by one of formulae (45-22) to (45-25) below.

[Formula 271]

(45-22)

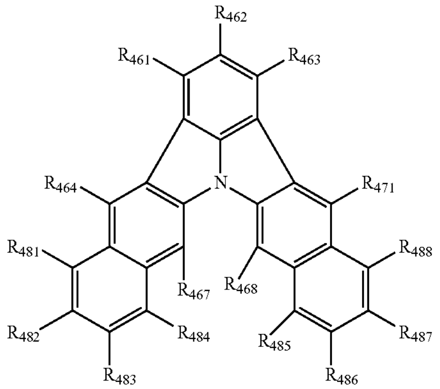

(45-23)

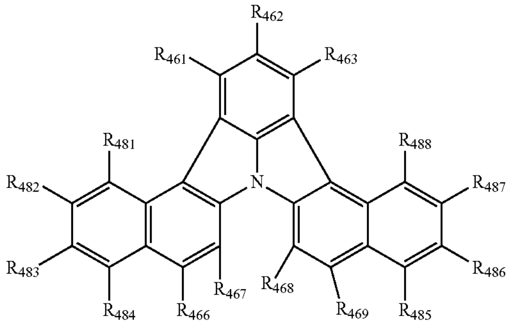

-continued (45-24)

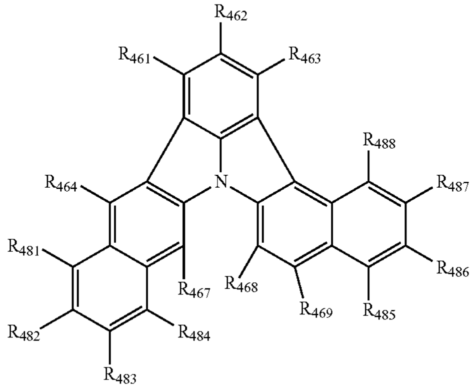

(45-25)

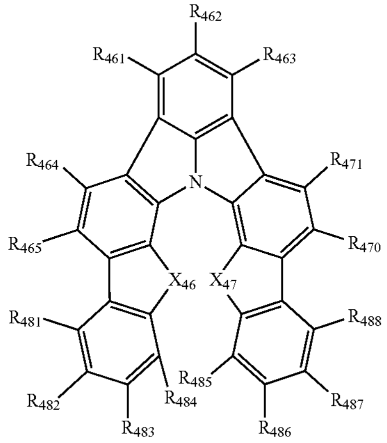

In the formulae (45-22) to (45-25):

$X_{46}$ and $X_{47}$ are each independently $C(R_{801})(R_{802})$, $NR_{803}$, an oxygen atom, or a sulfur atom;

$R_{461}$ to $R_{471}$ and $R_{481}$ to $R_{488}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; preferably, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, the compound represented by the formula (45) is represented by a formula (45-26) below.

[Formula 272]

(45-26)

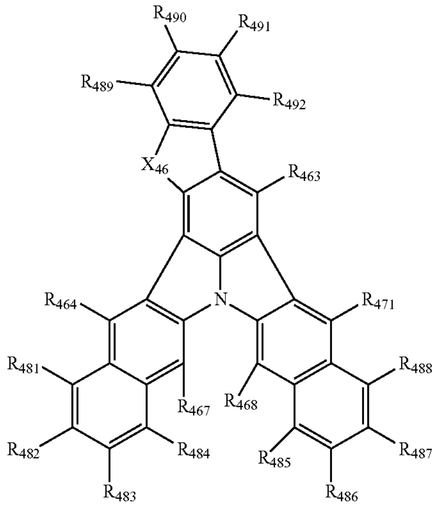

In the formula (45-26):

$X_{46}$ is $C(R_{801})(R_{802})$, $NR_{803}$, an oxygen atom, or a sulfur atom;

$R_{463}$, $R_{464}$, $R_{467}$, $R_{468}$, $R_{471}$, and $R_{481}$ to $R_{492}$ each independently represent the same as $R_{461}$ to $R_{471}$ in the formula (45);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms; preferably, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

Specific Examples of Compound Represented by Formula (4)

Specific examples of the compound represented by the formula (4) include compounds below. In the specific examples below, Ph represents a phenyl group, and D represents a deuterium atom.

[Formula 273]

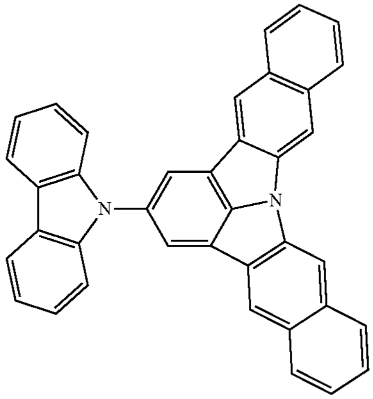

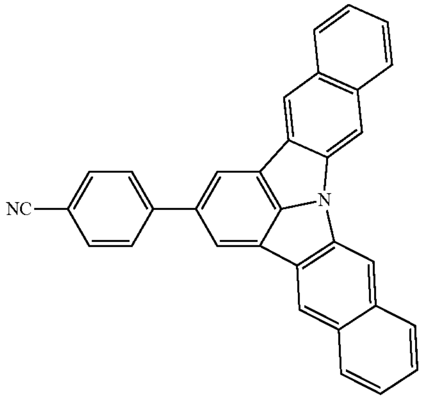

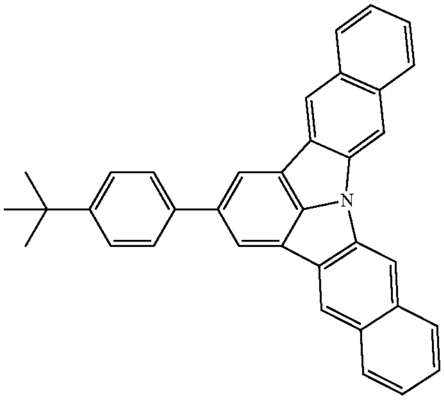

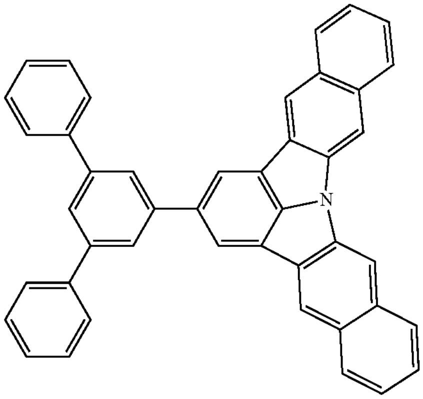

-continued
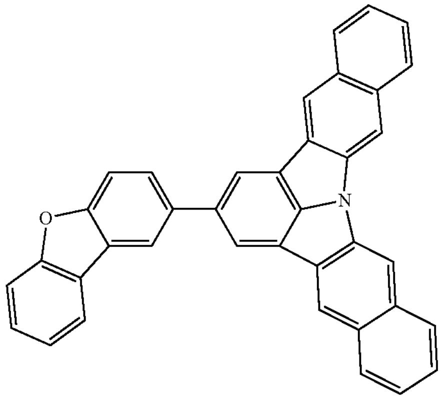
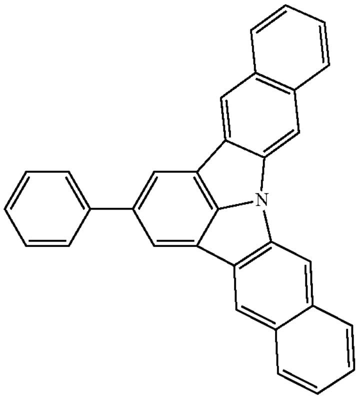
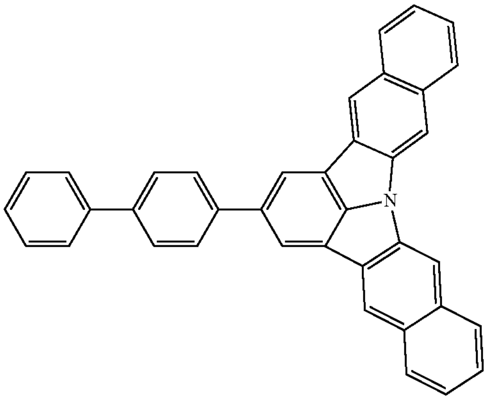
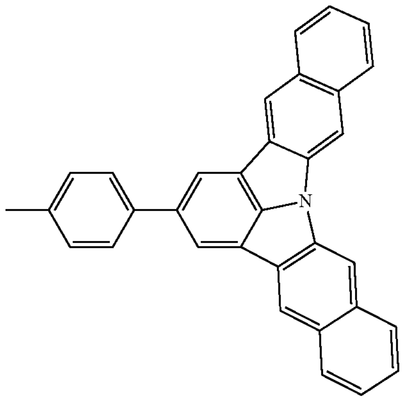
-continued
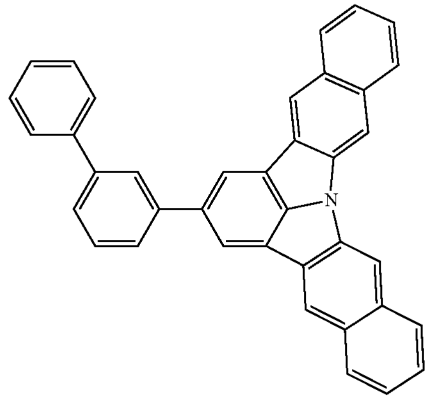
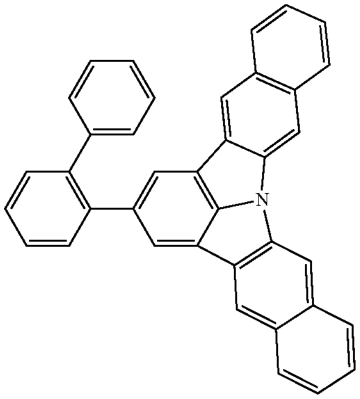
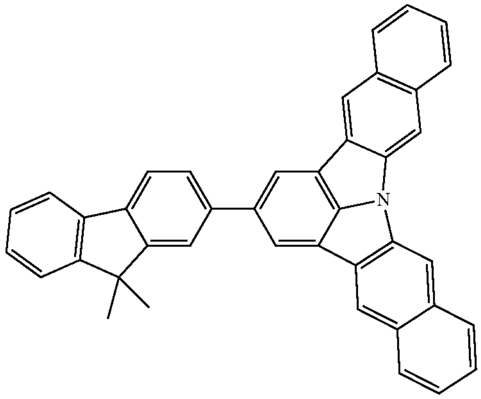
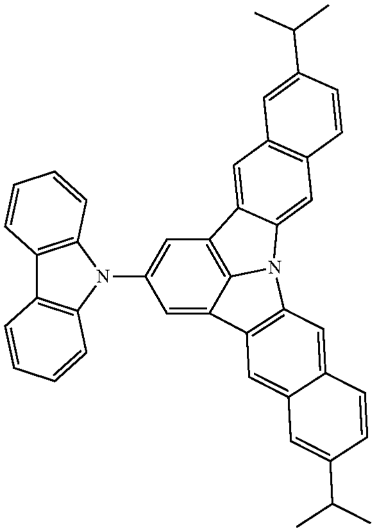

-continued
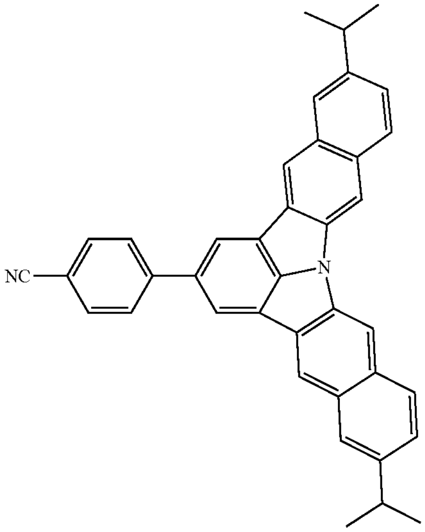
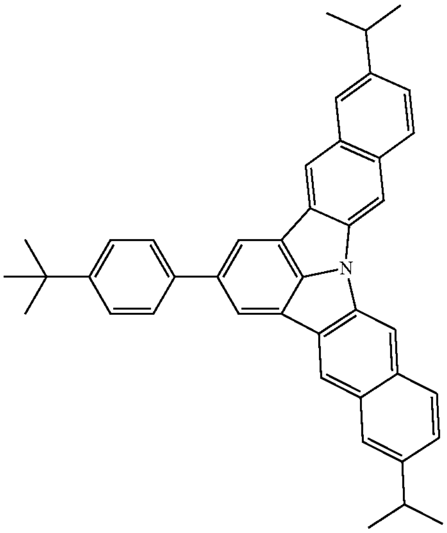
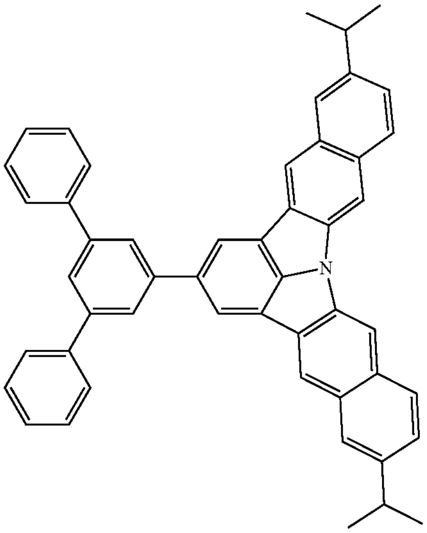
-continued
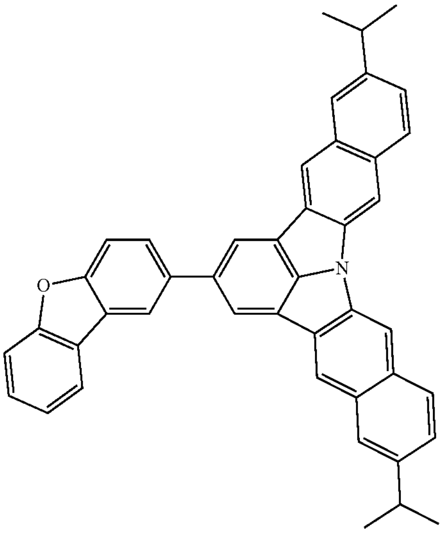
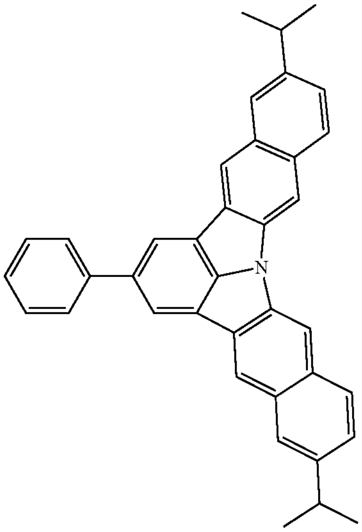
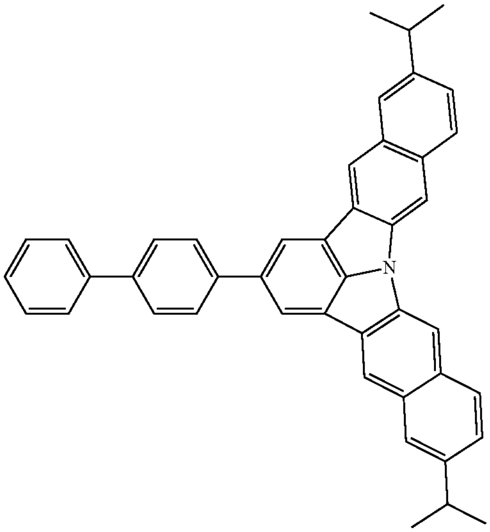

-continued
[Formula 274]
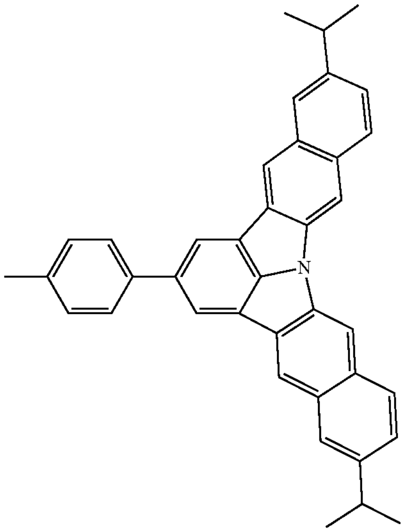
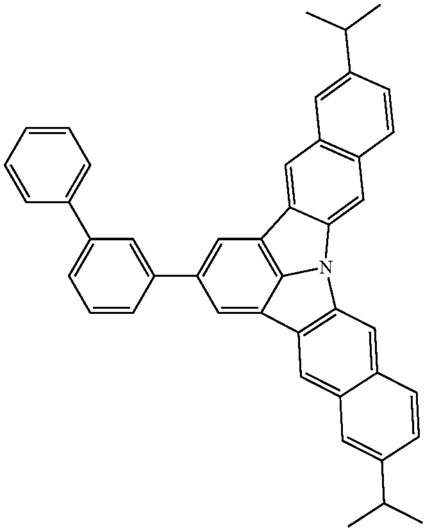
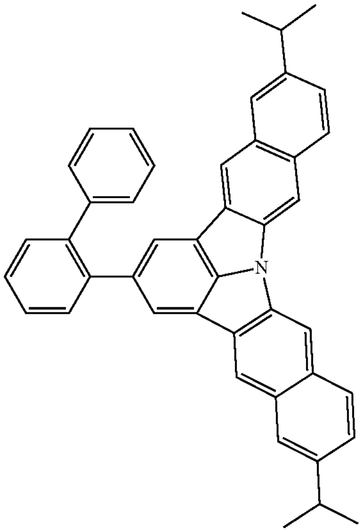
-continued
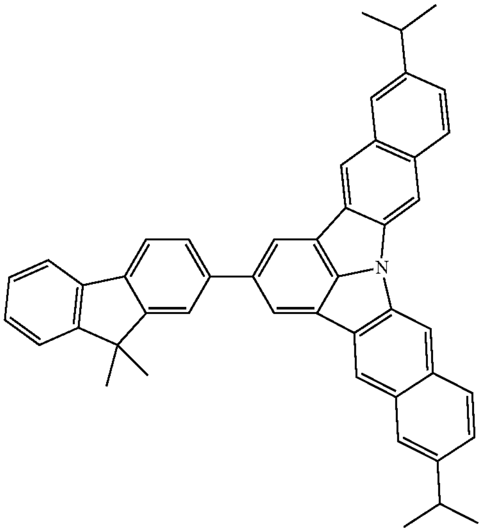
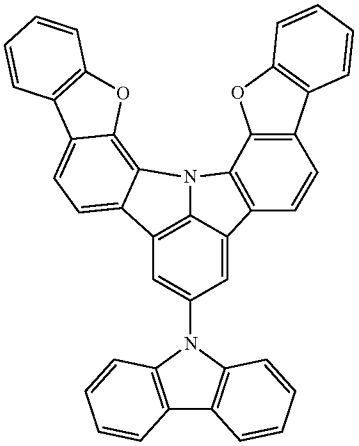
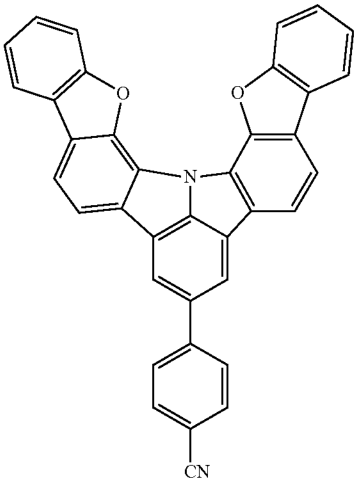
CN -continued
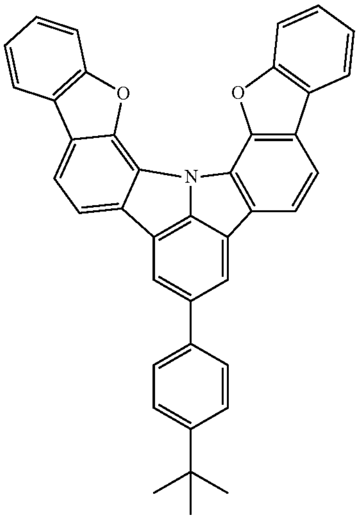
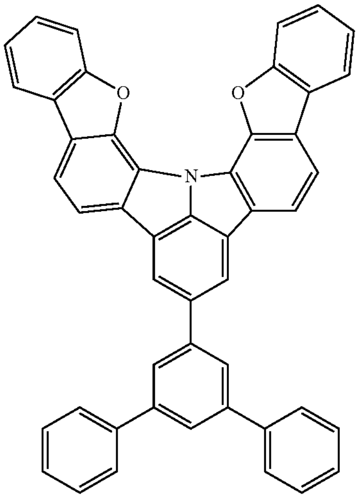
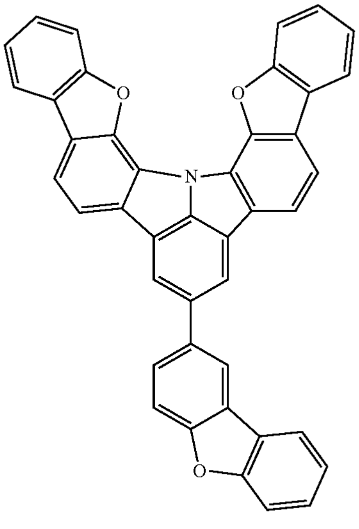
-continued
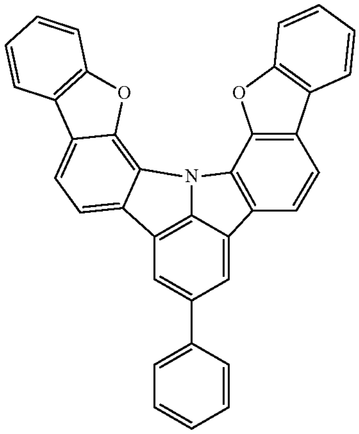
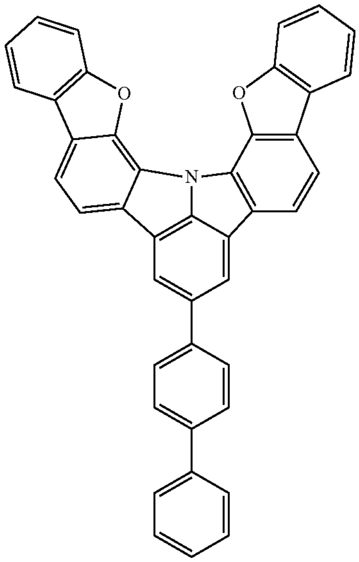
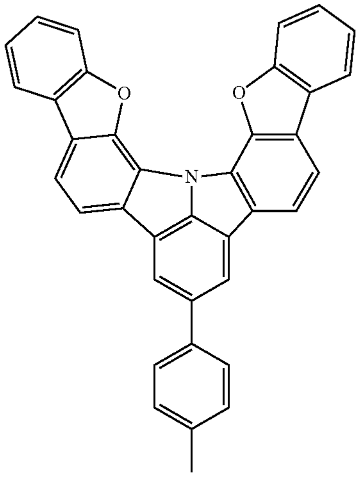

-continued
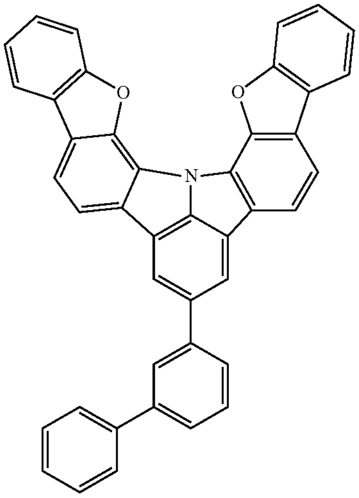
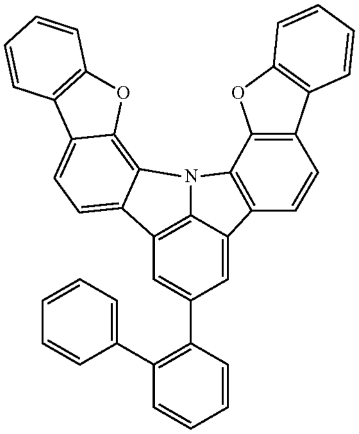
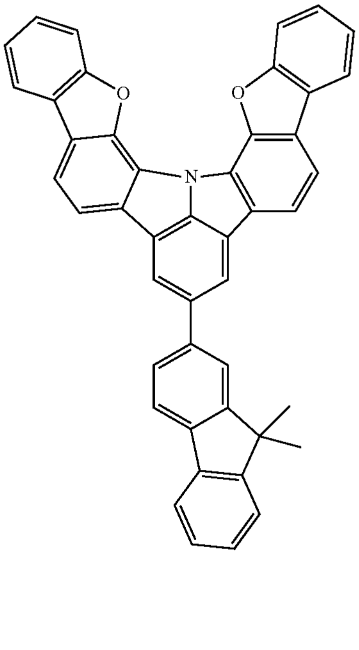
-continued
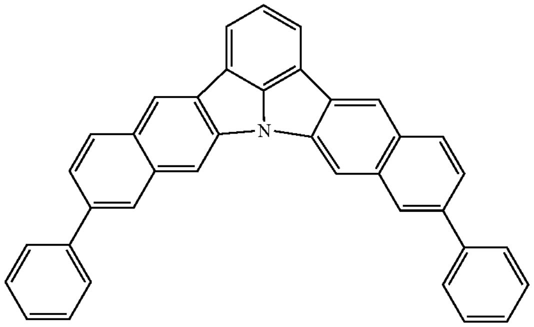
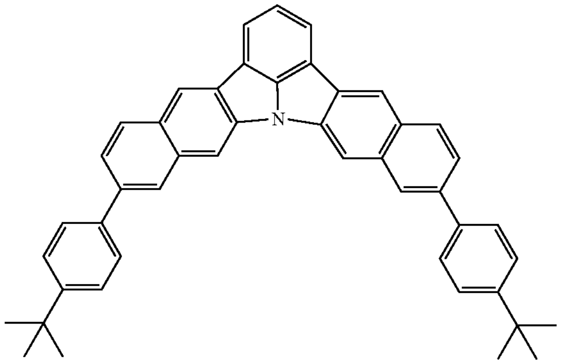
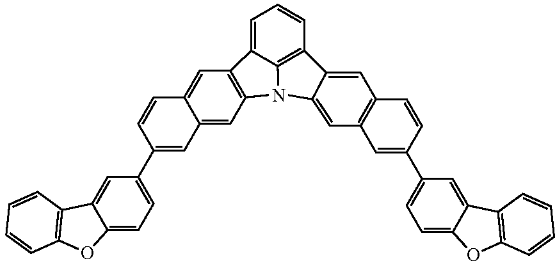
[Formula 275]
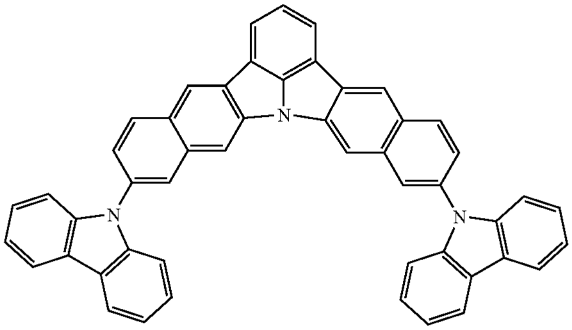
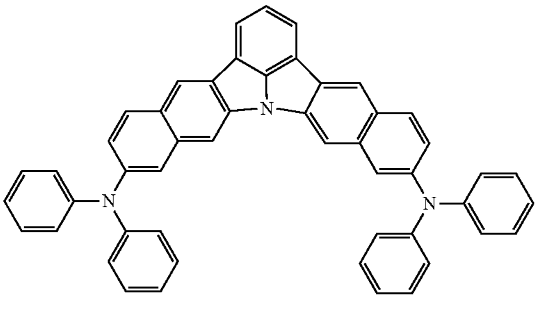

-continued
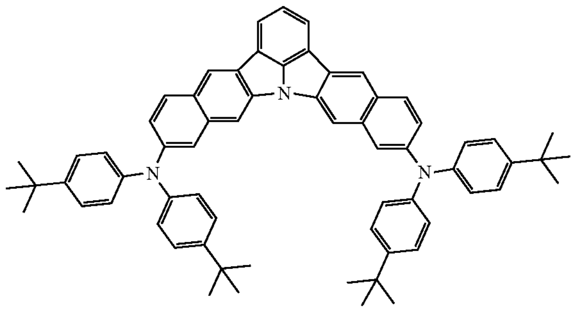
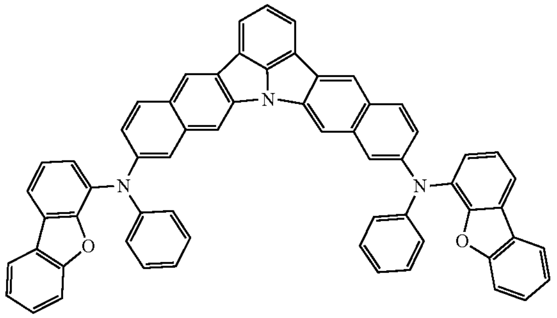
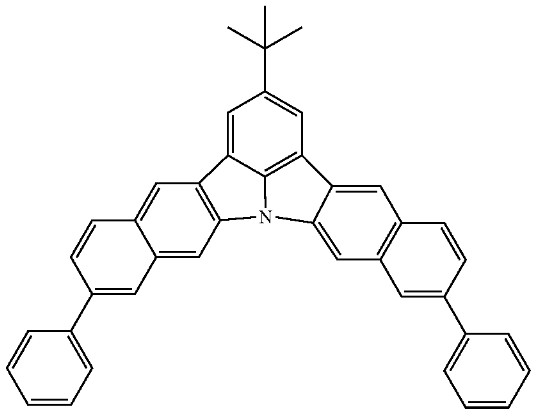
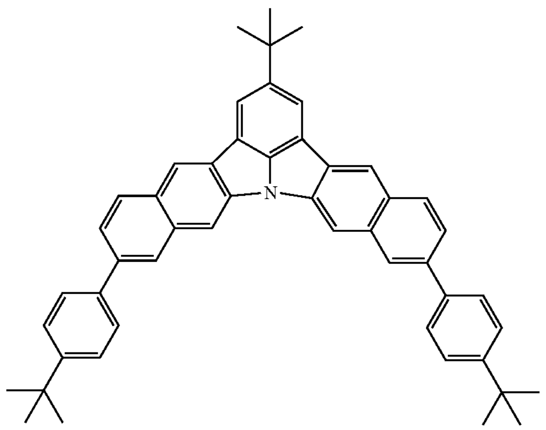
-continued
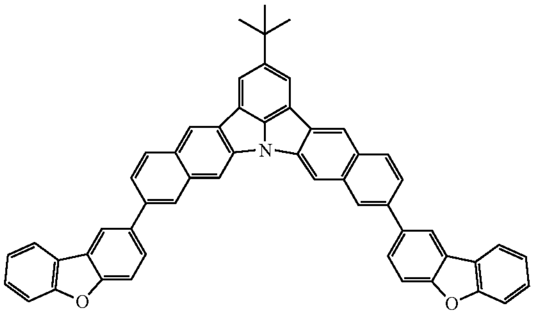
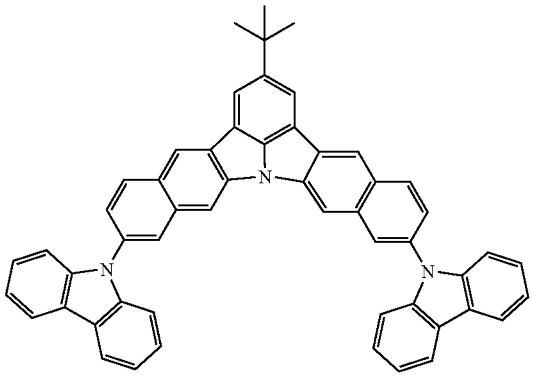
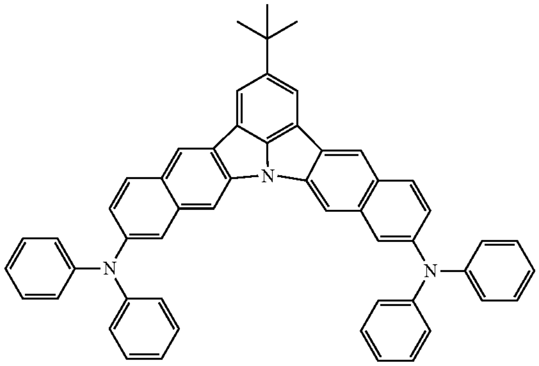
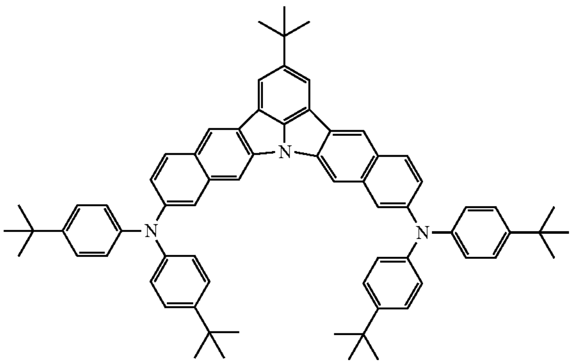

-continued
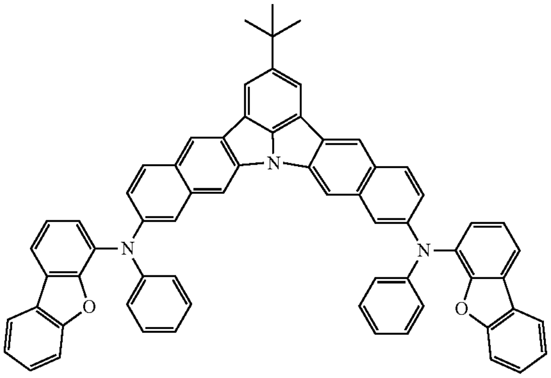
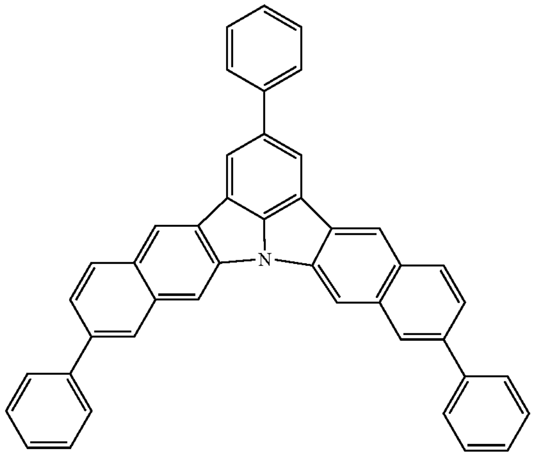
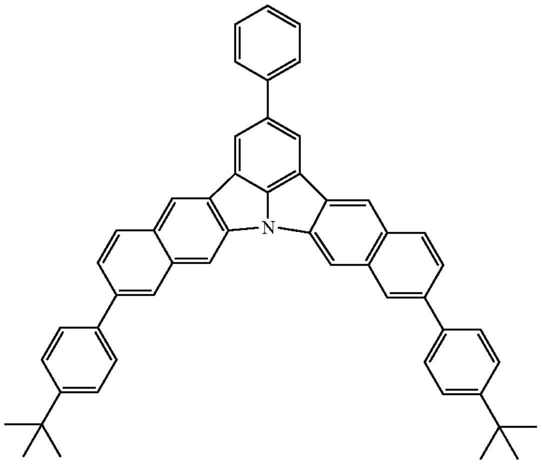
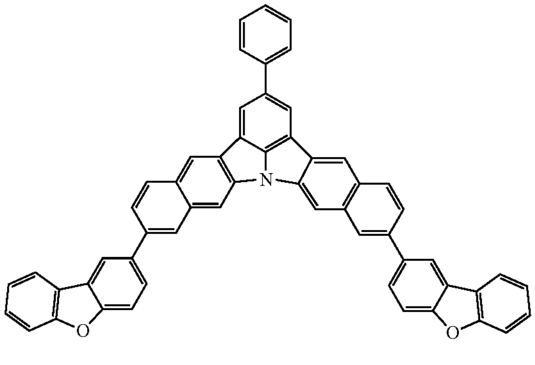
-continued
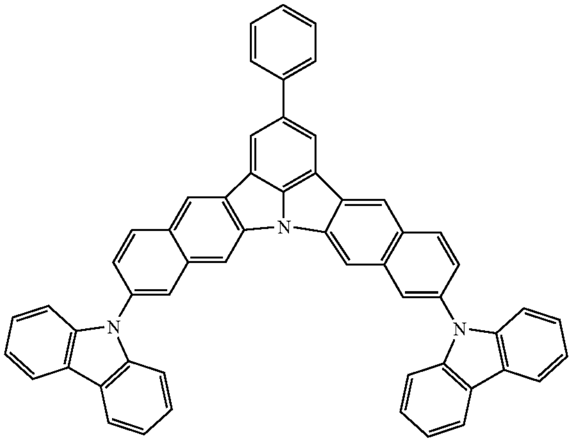
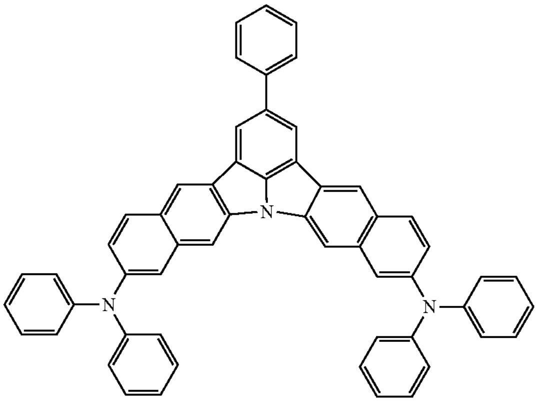
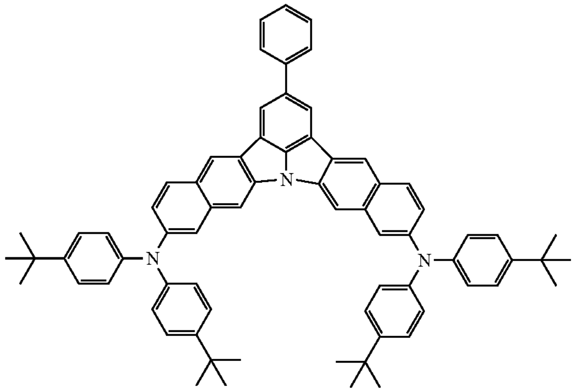
[Formula 276]
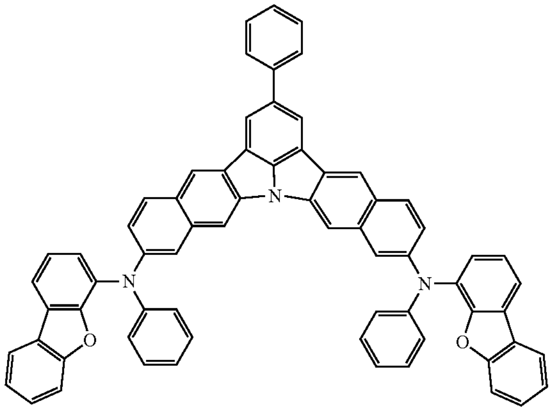

-continued
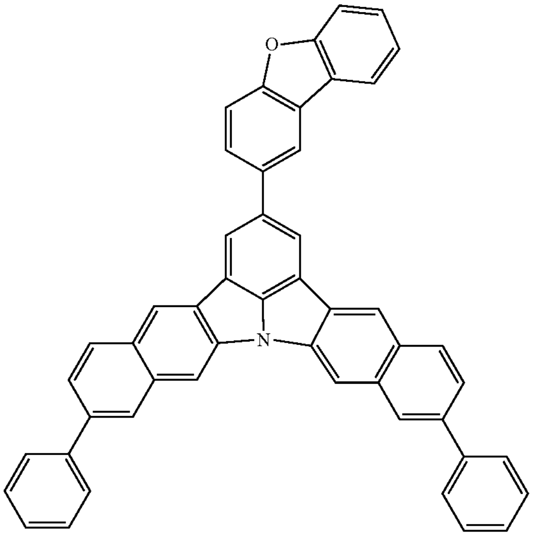
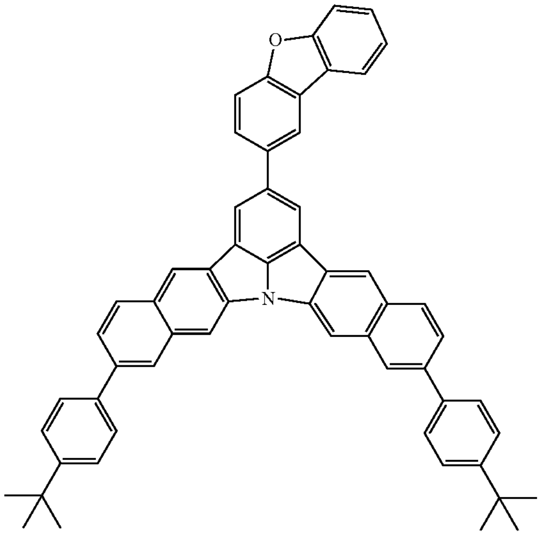
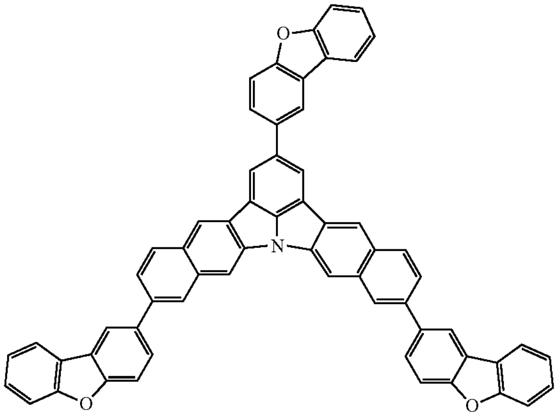
-continued
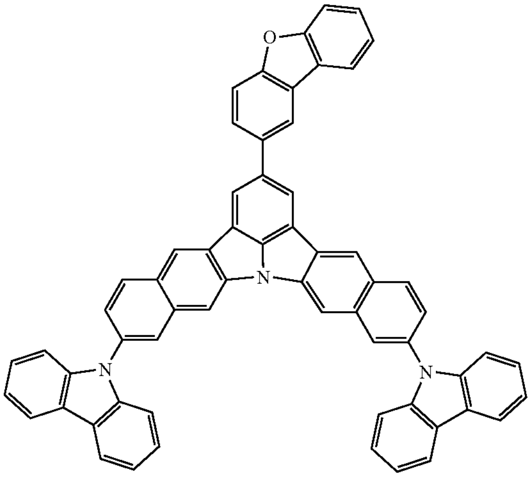
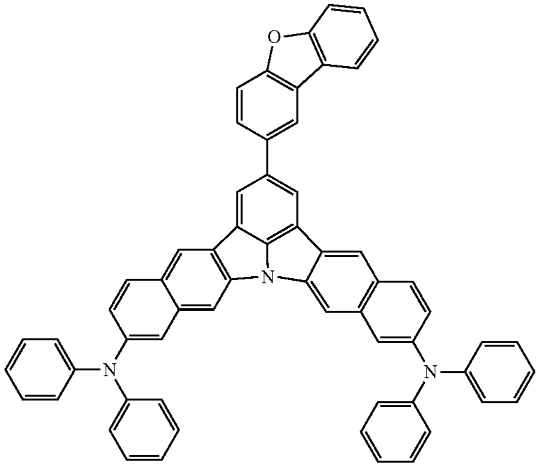
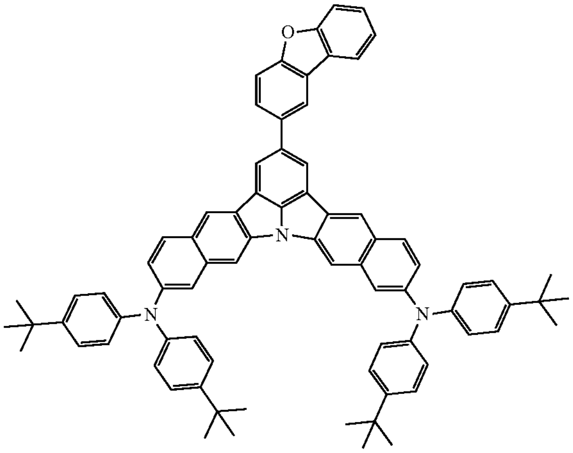

-continued
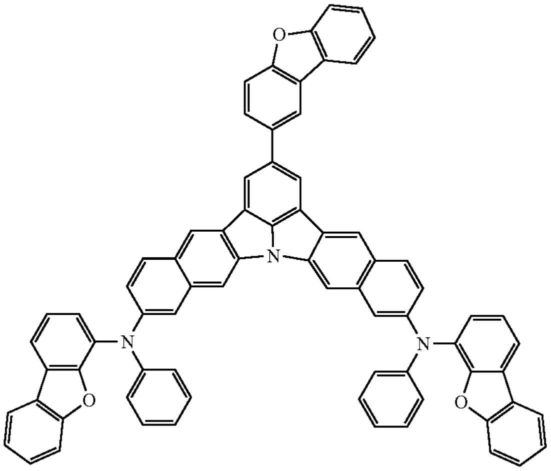
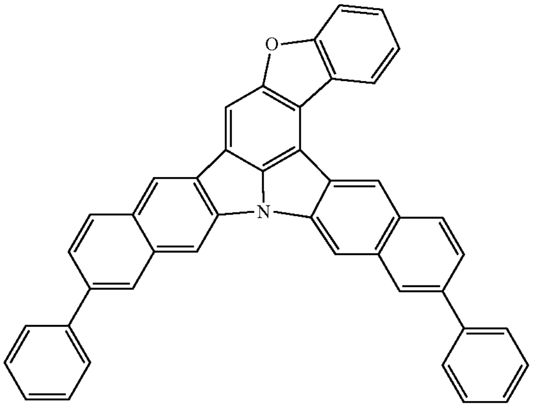
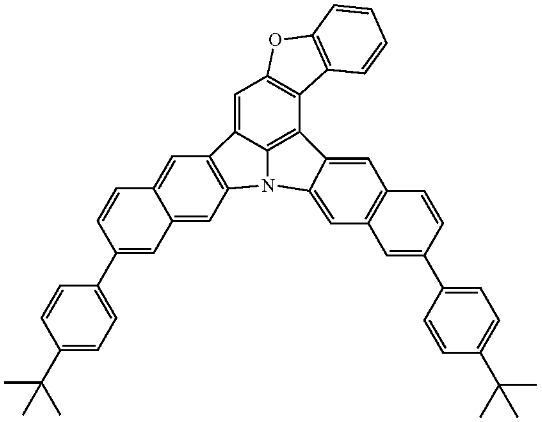
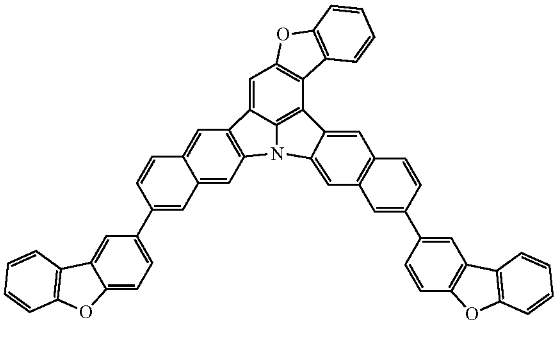
-continued
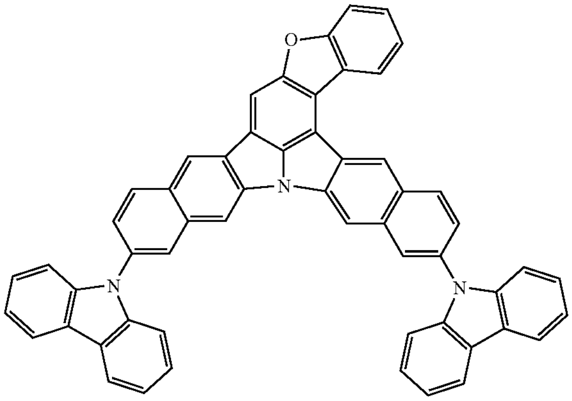
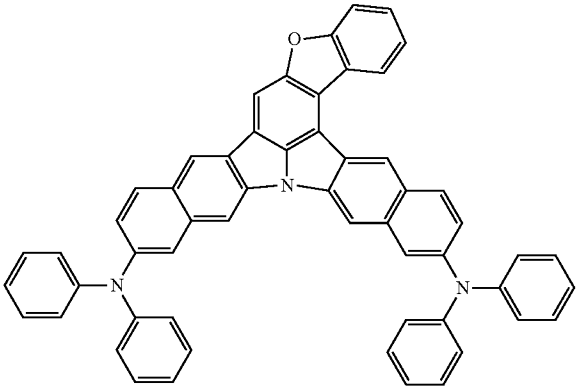
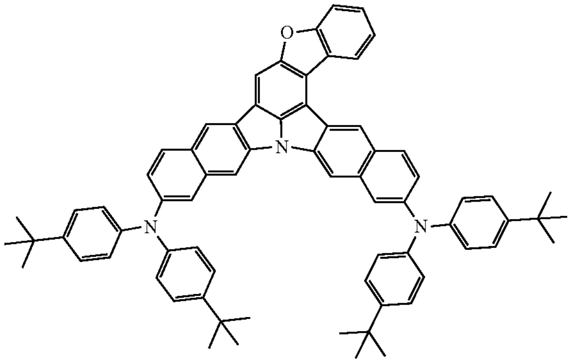
[Formula 277]
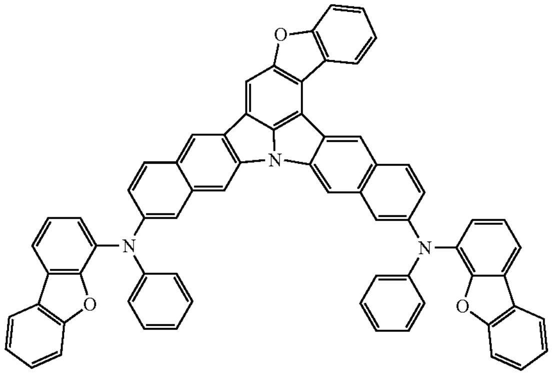

-continued
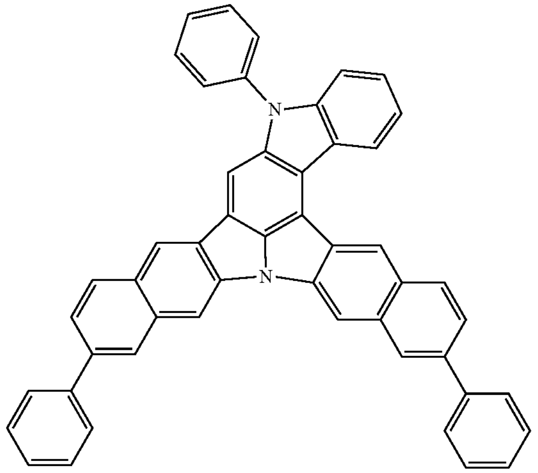
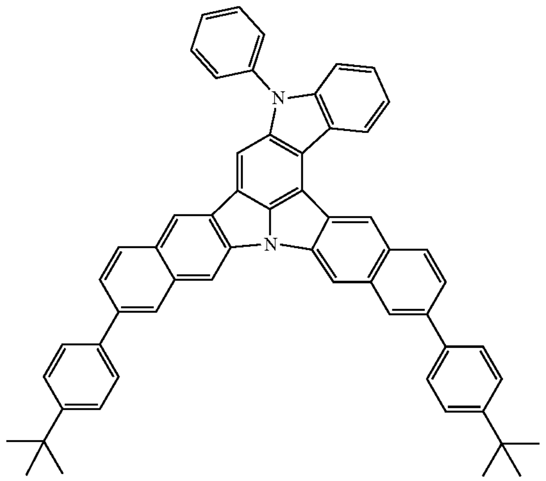
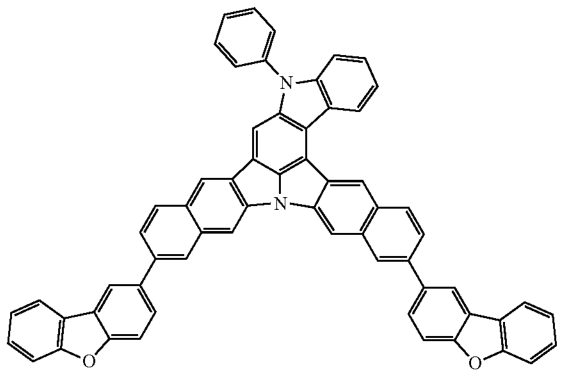
-continued
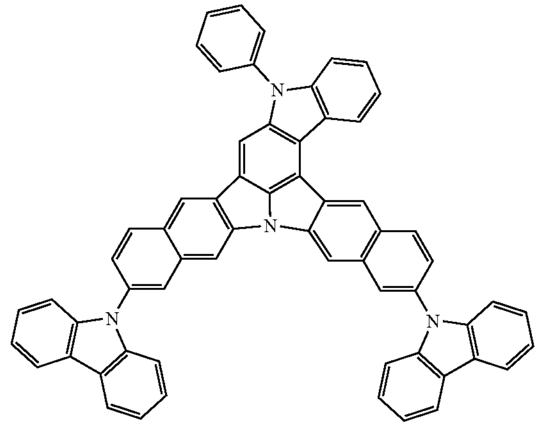
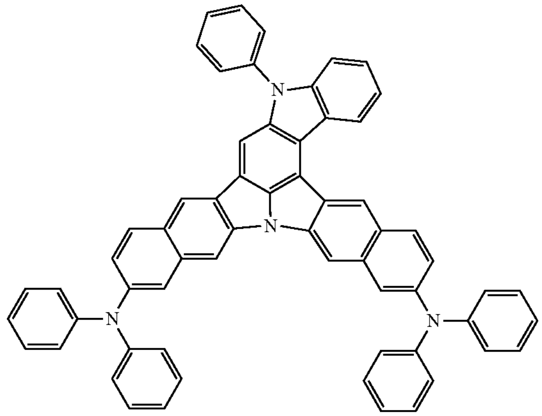
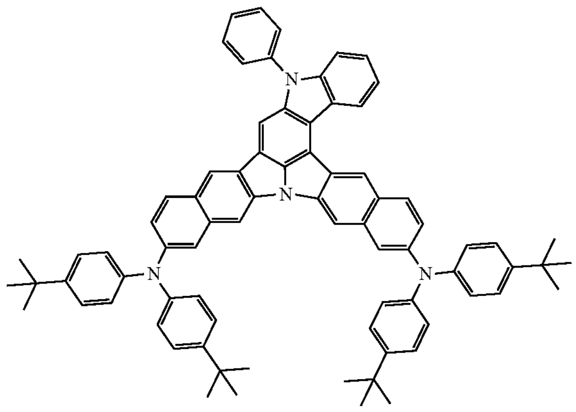
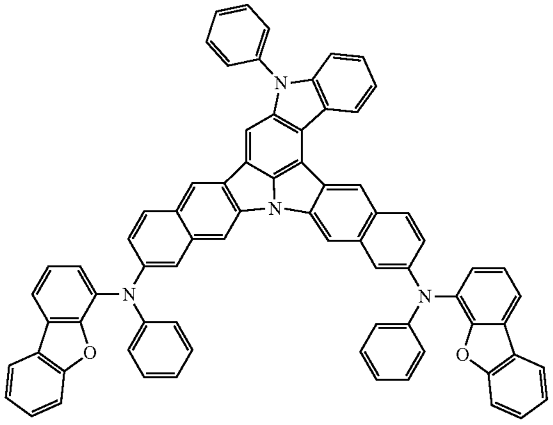

-continued
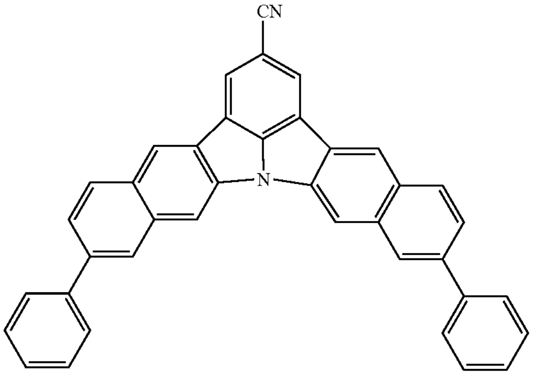
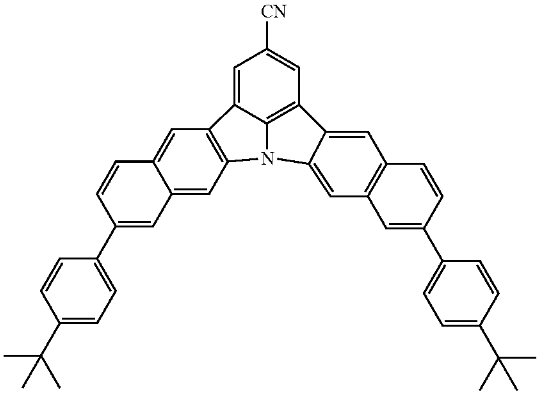
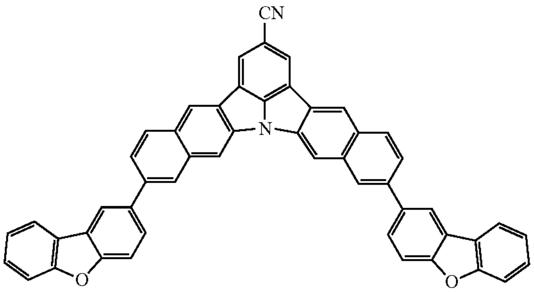
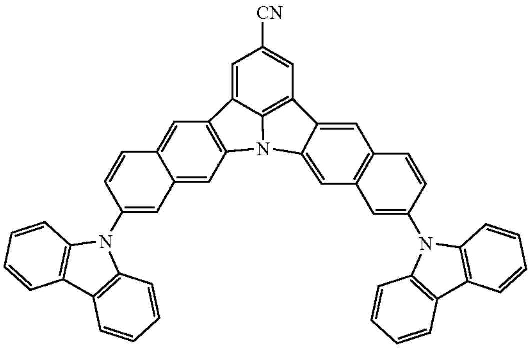
-continued
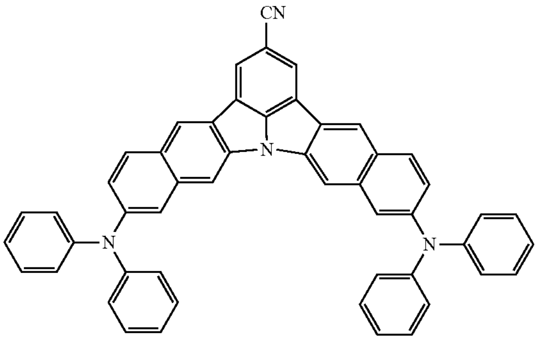
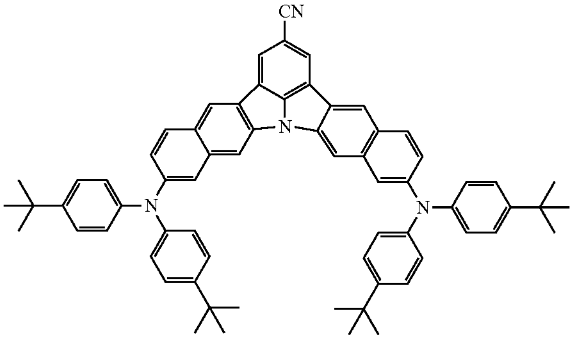
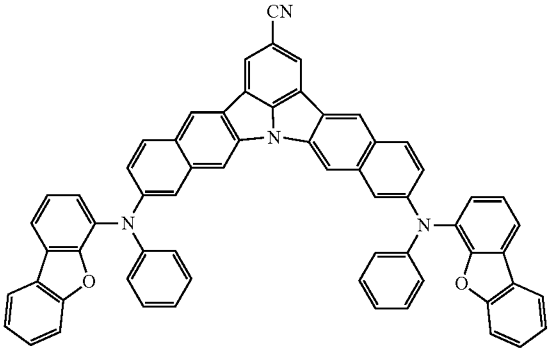
[Formula 278]
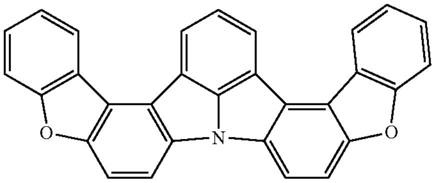
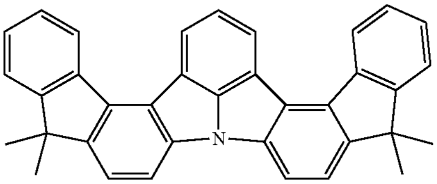

-continued
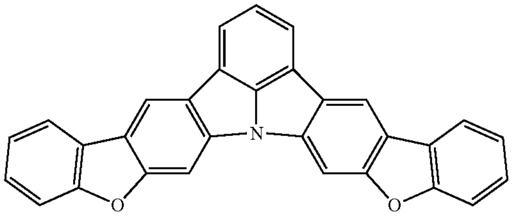
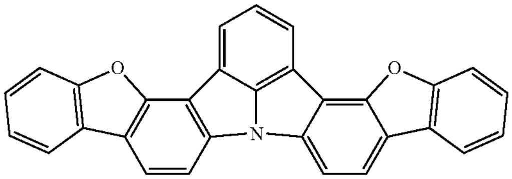
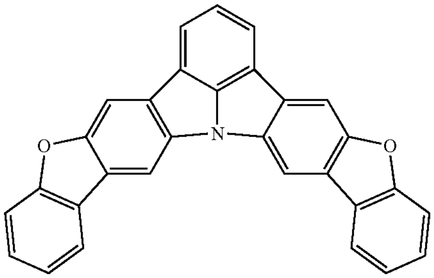
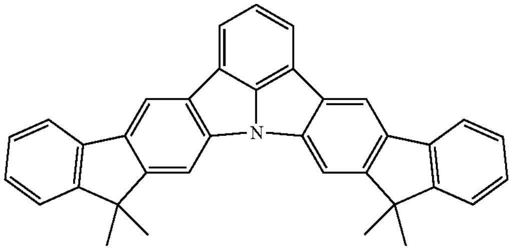
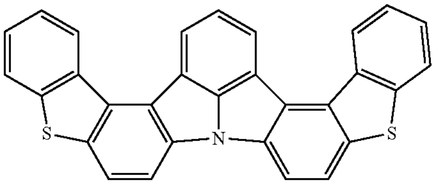
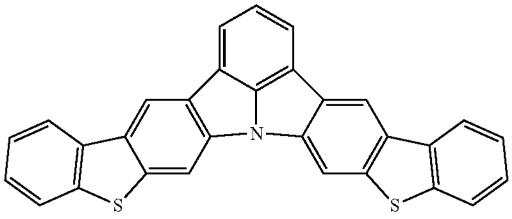
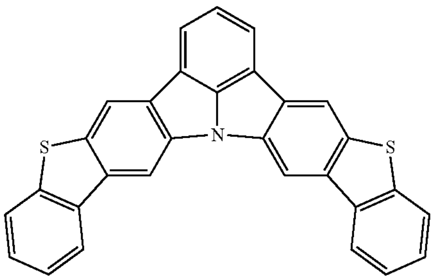
-continued
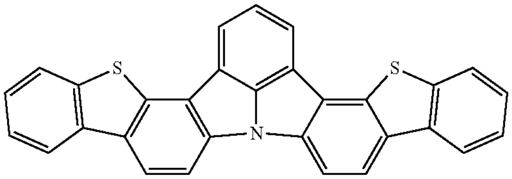
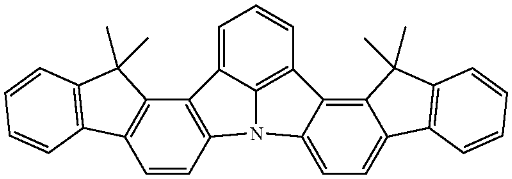
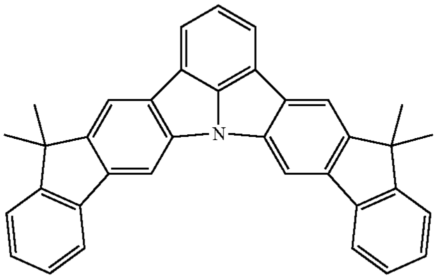
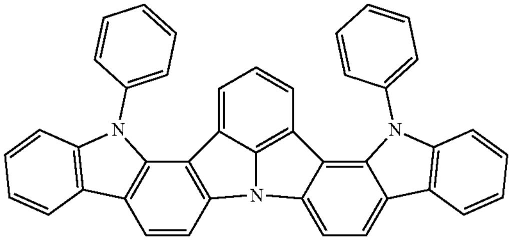
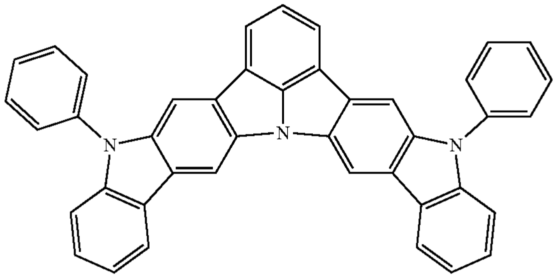
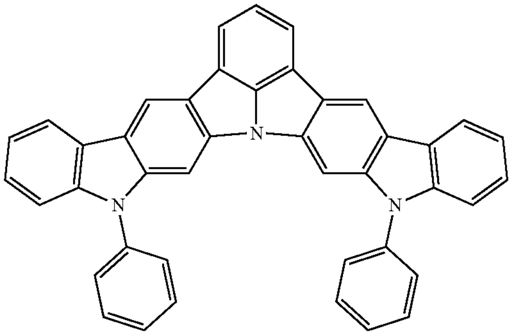

-continued
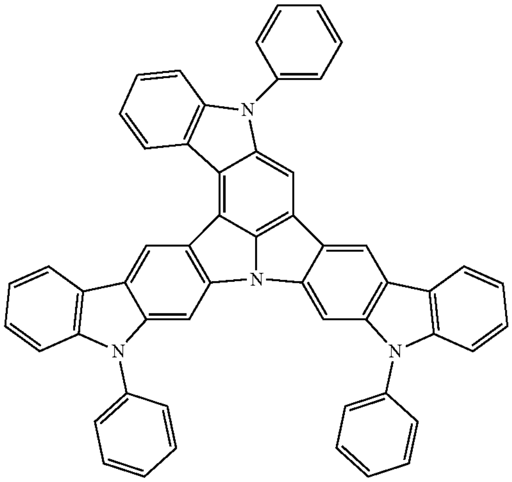
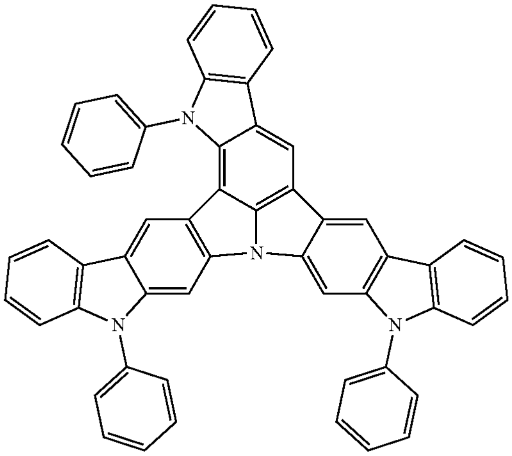
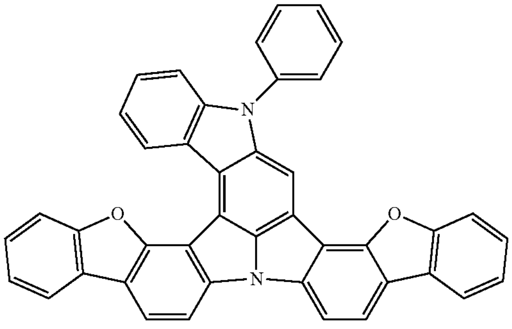
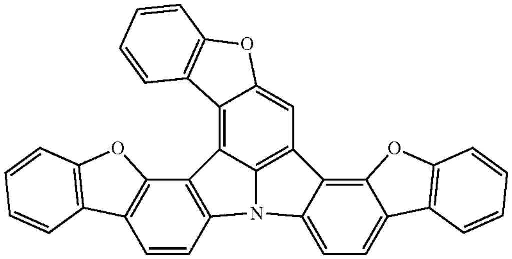
-continued
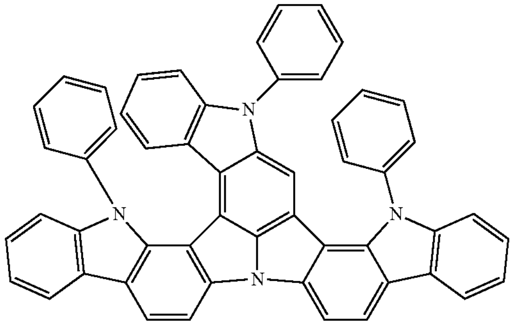
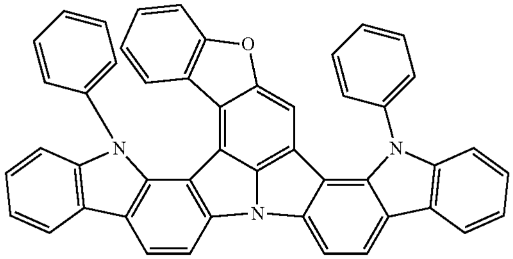
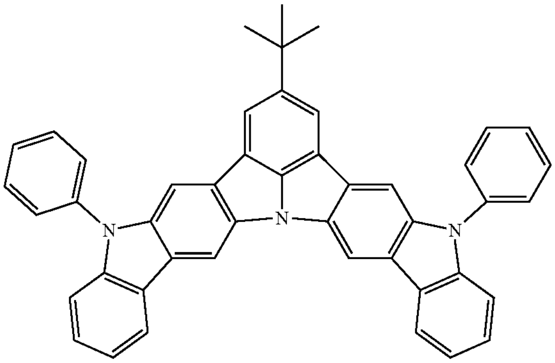
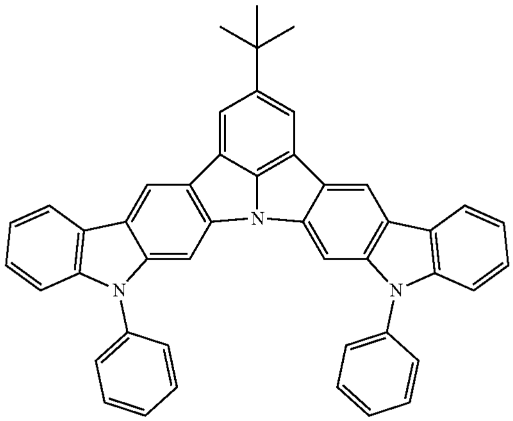

-continued
[Formula 279]
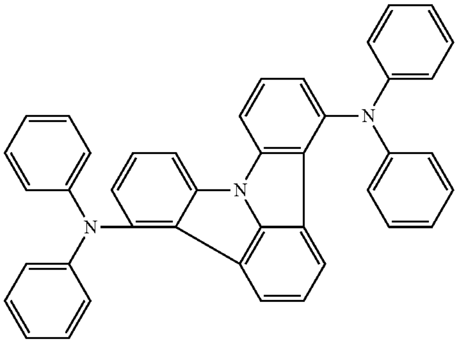
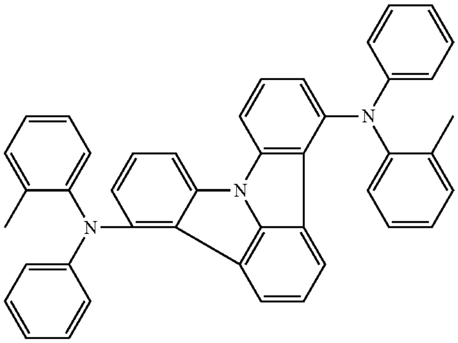
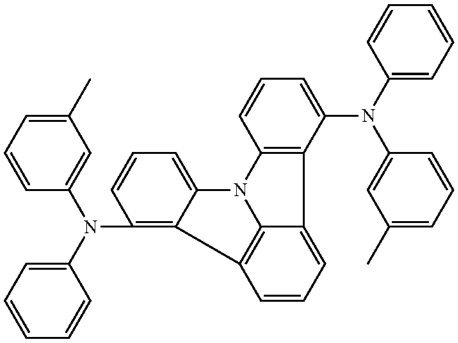
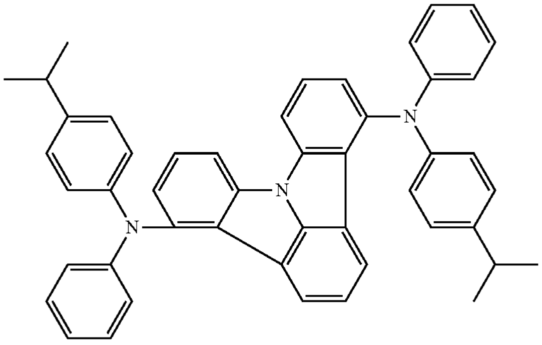
-continued
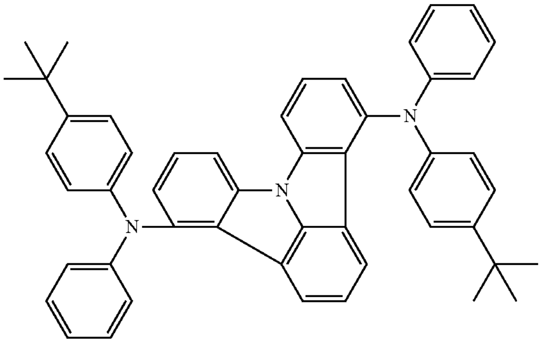
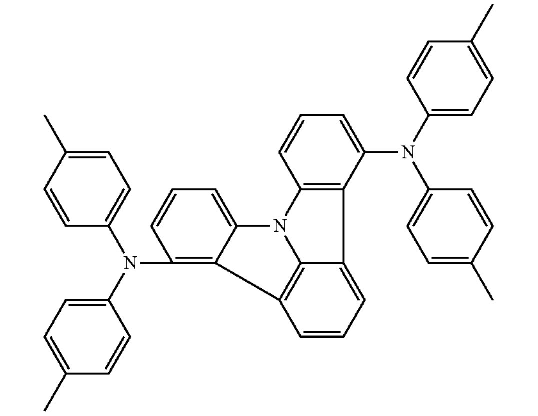
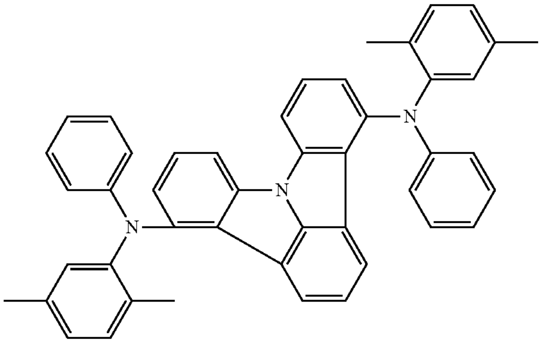
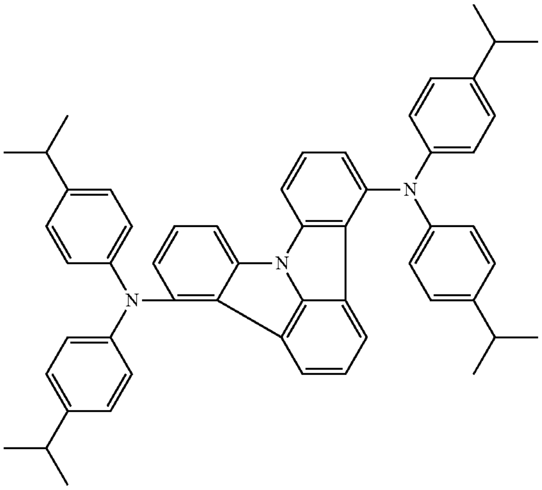

-continued
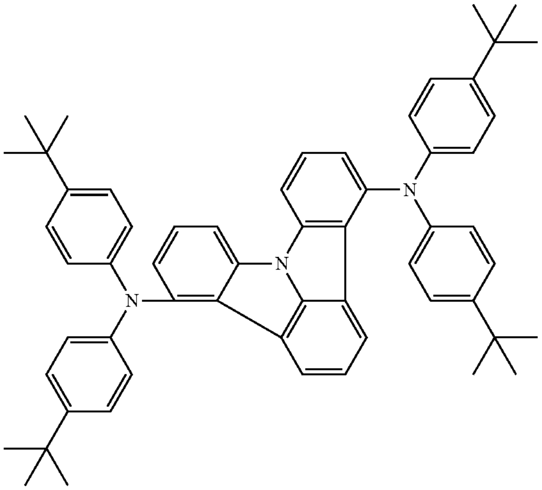
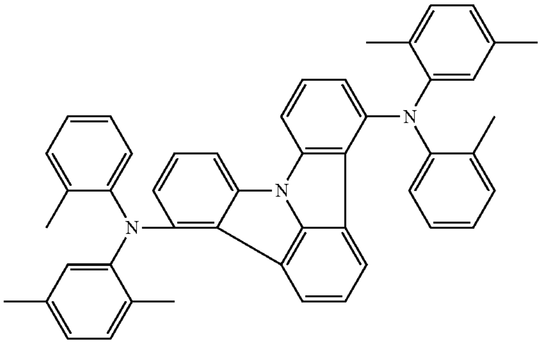
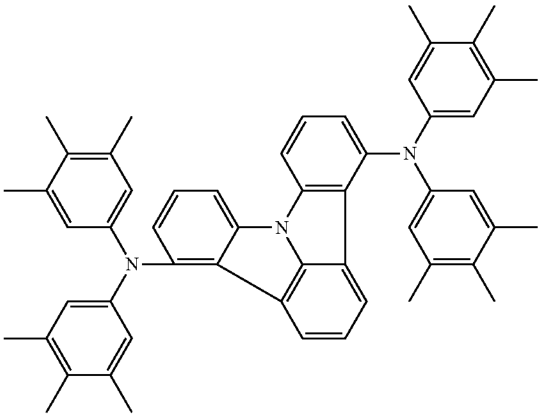
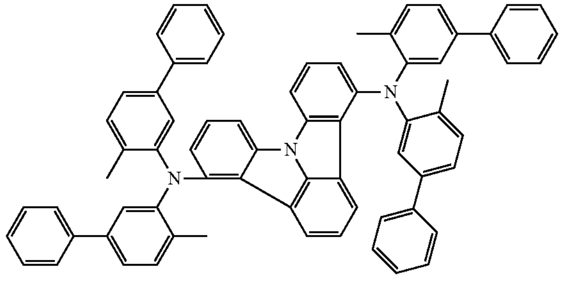
-continued
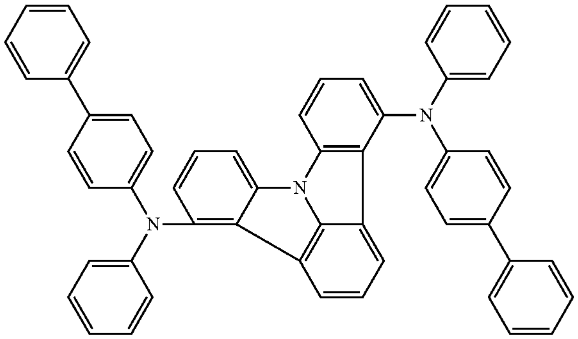
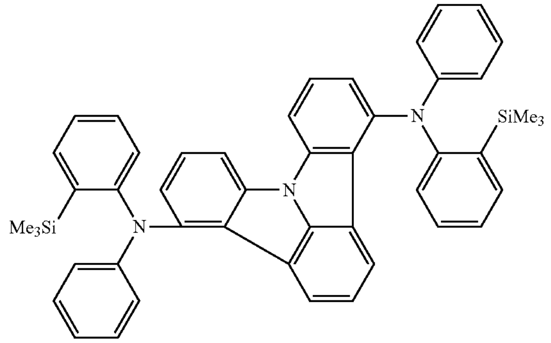
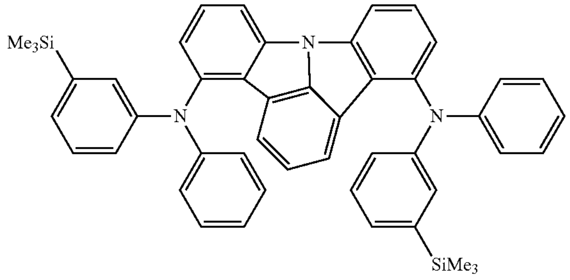
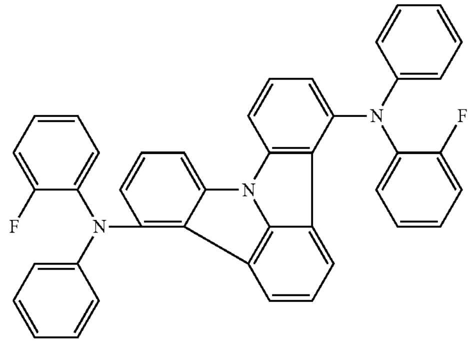
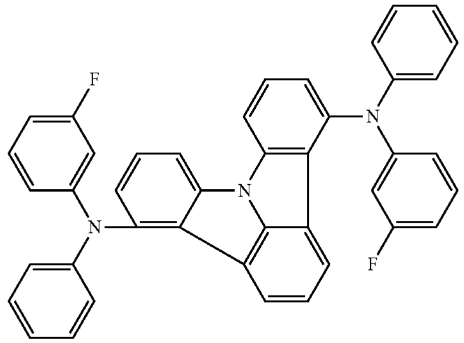

-continued
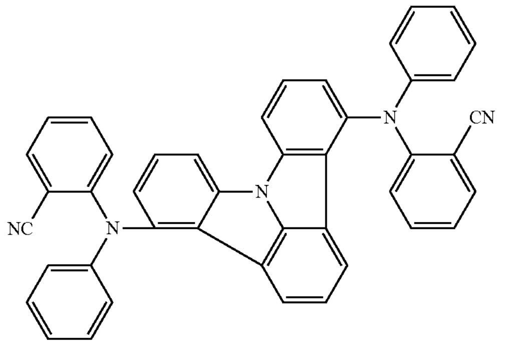
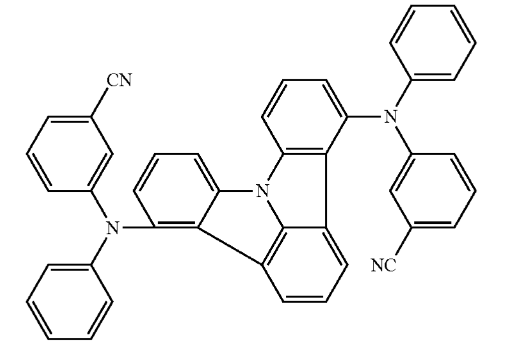
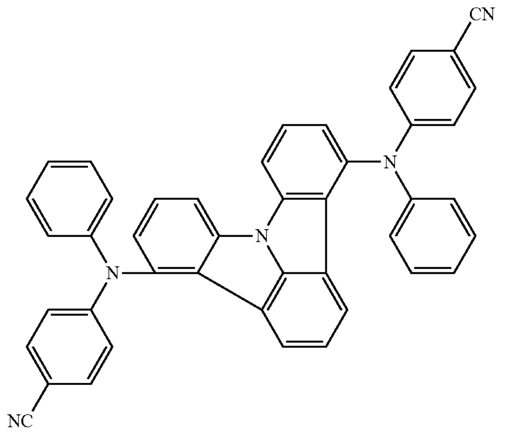
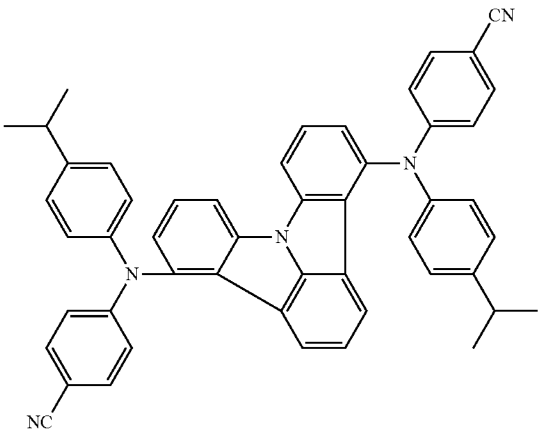
-continued
[Formula 280]
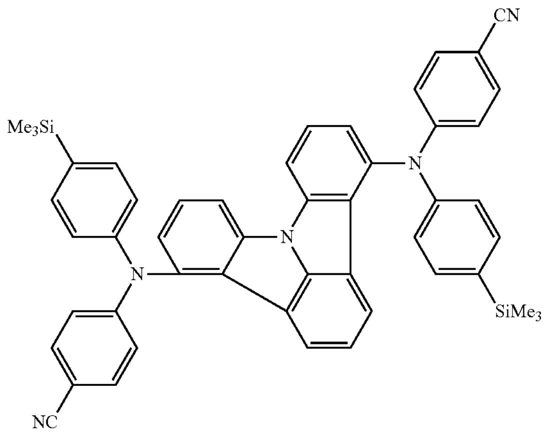
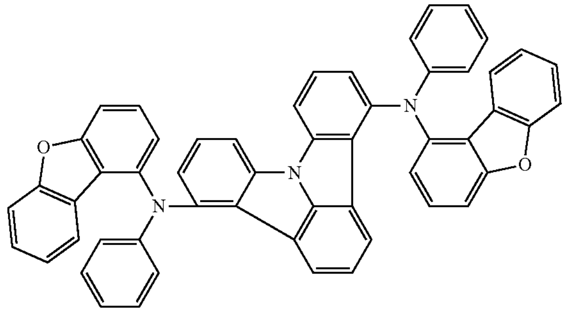
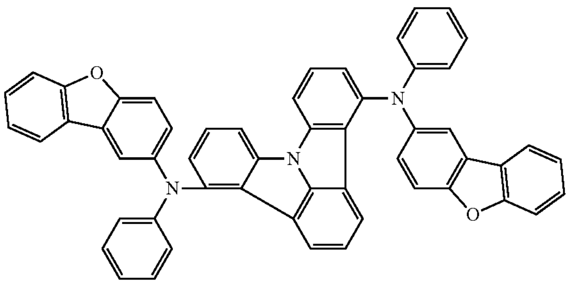
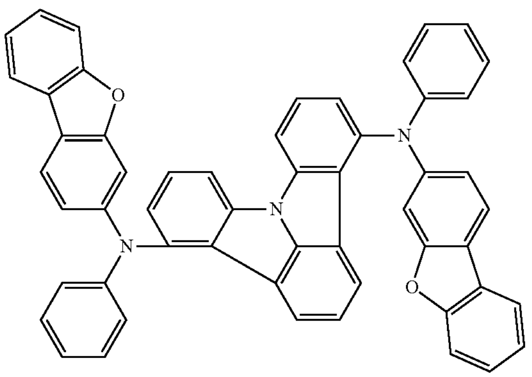

-continued
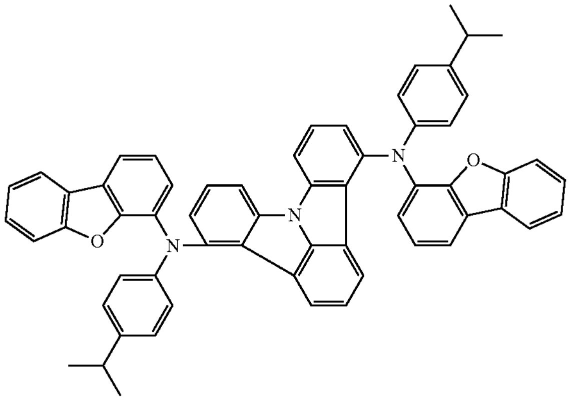
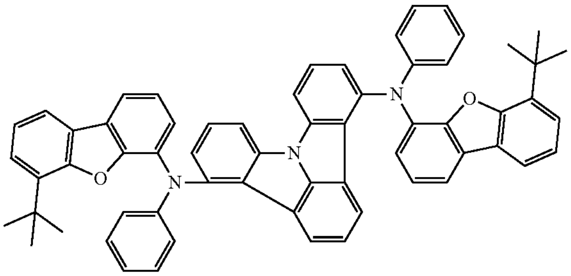
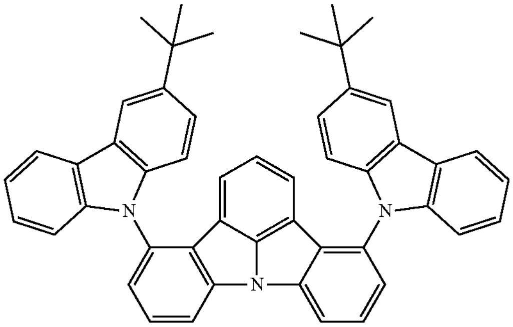
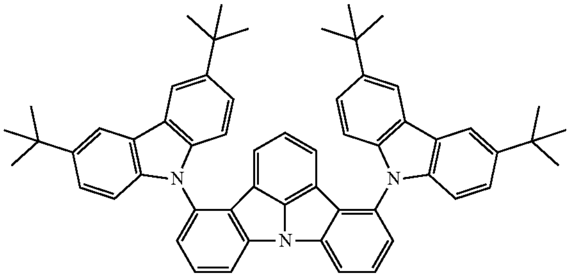
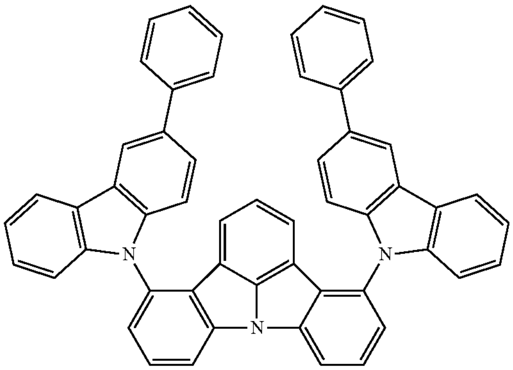
-continued
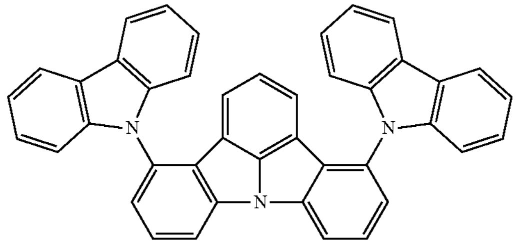
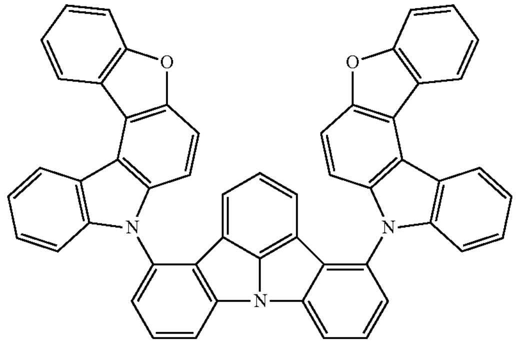
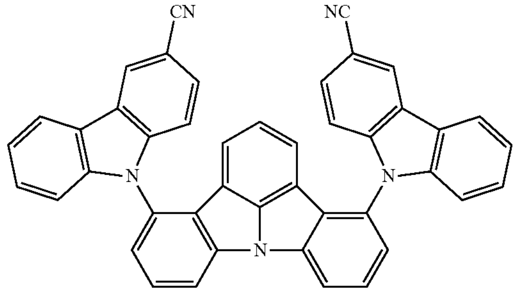
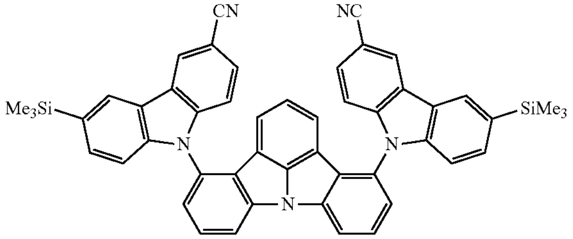
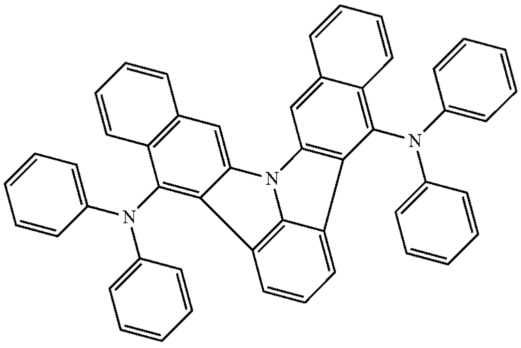

-continued
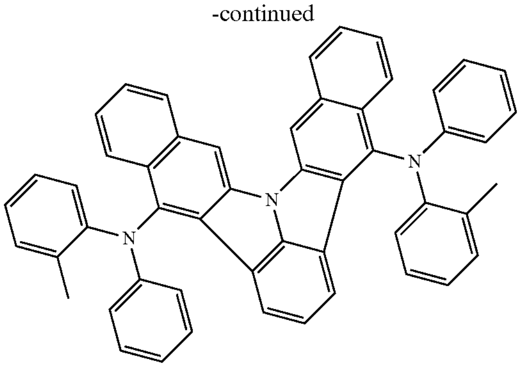
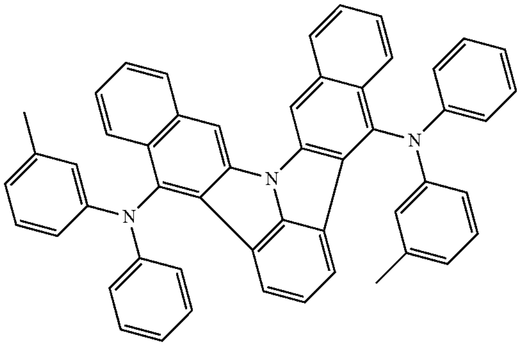
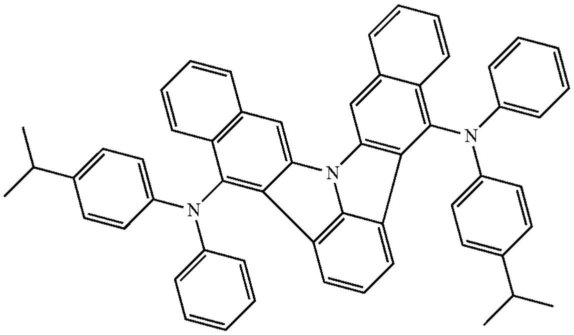
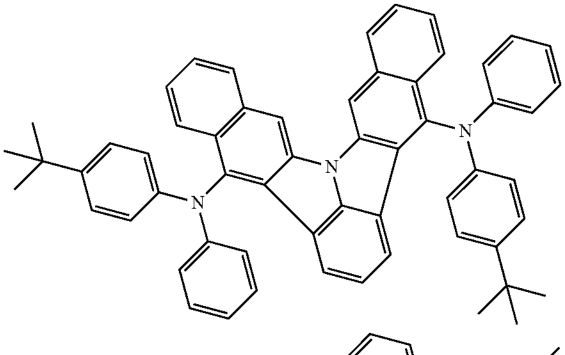
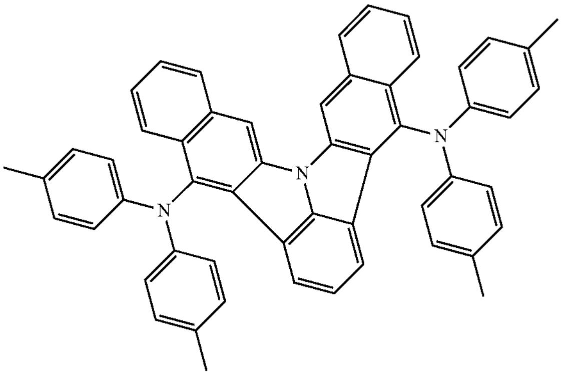
-continued
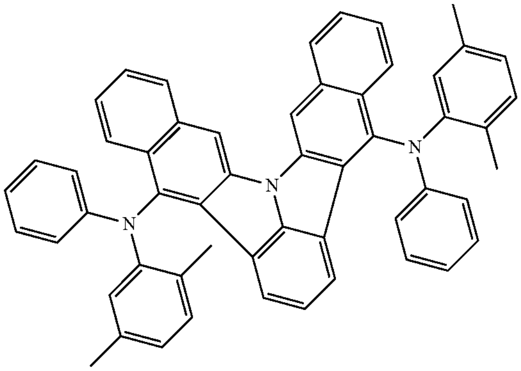
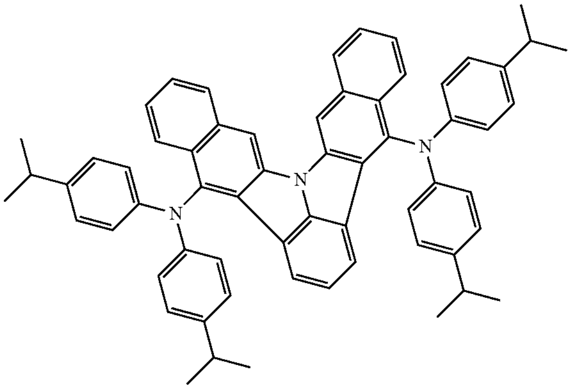
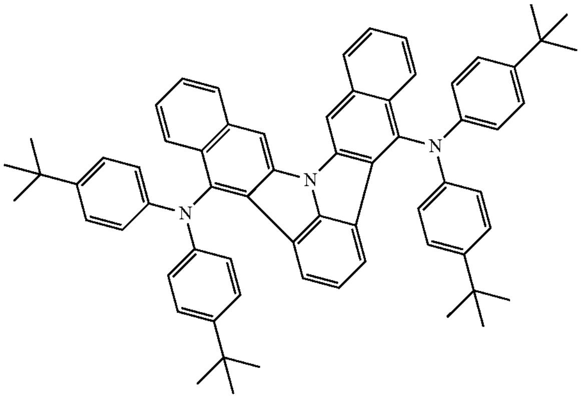
[Formula 281]
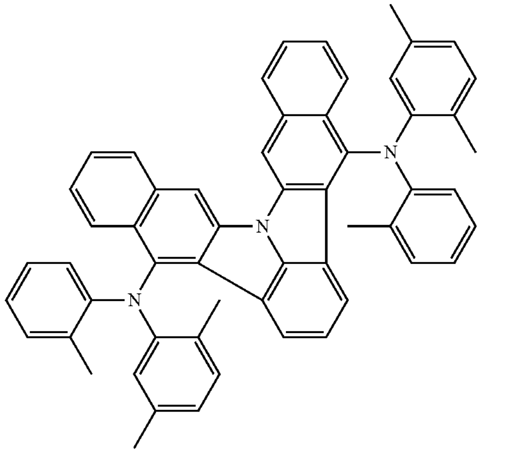

-continued
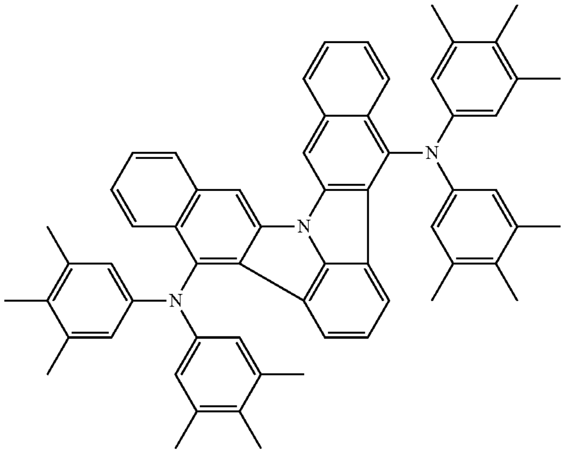
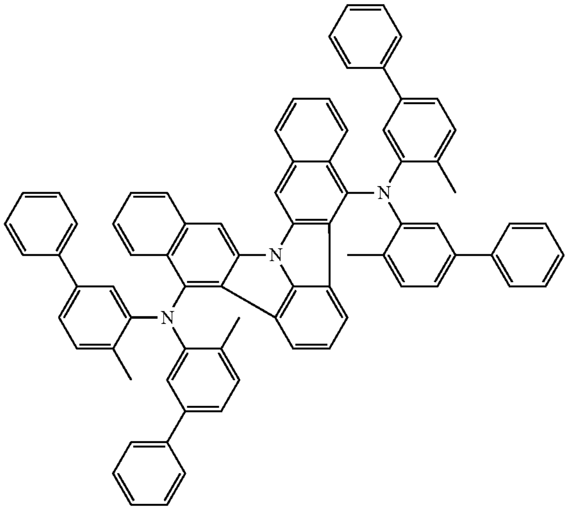
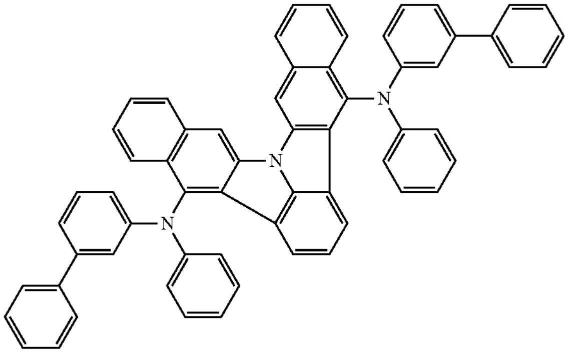
-continued
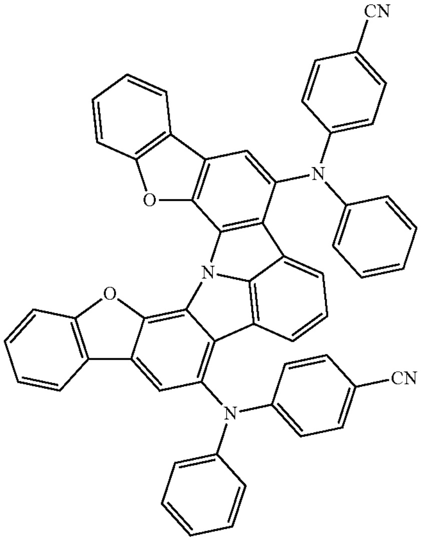
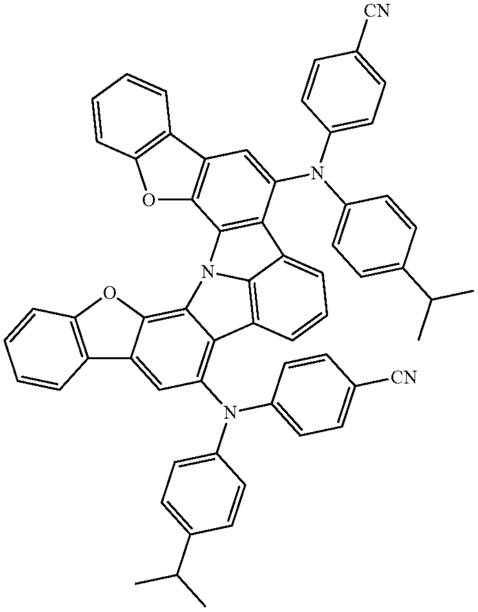

-continued
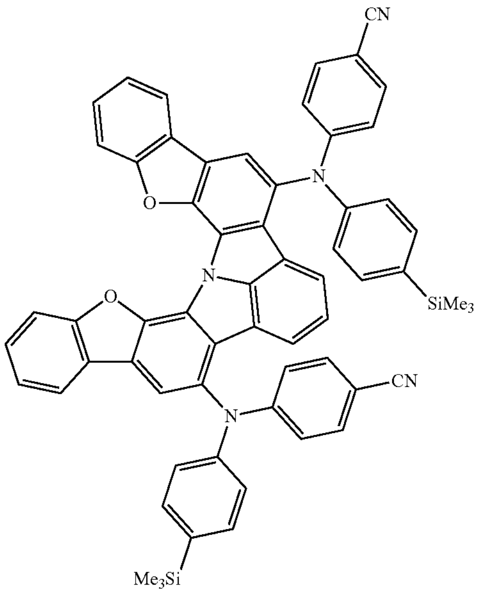
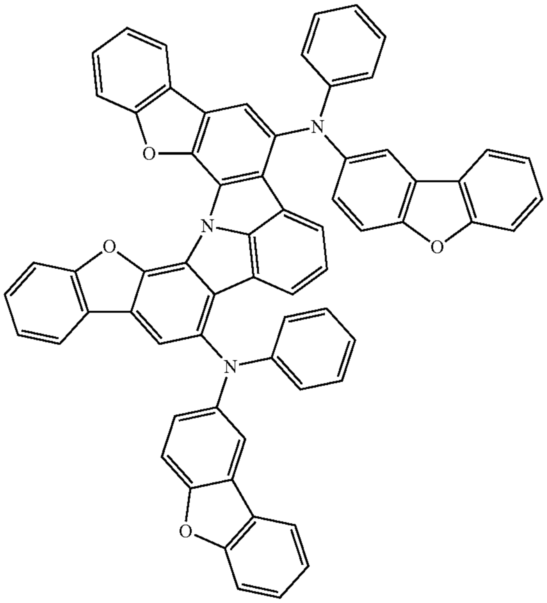
-continued
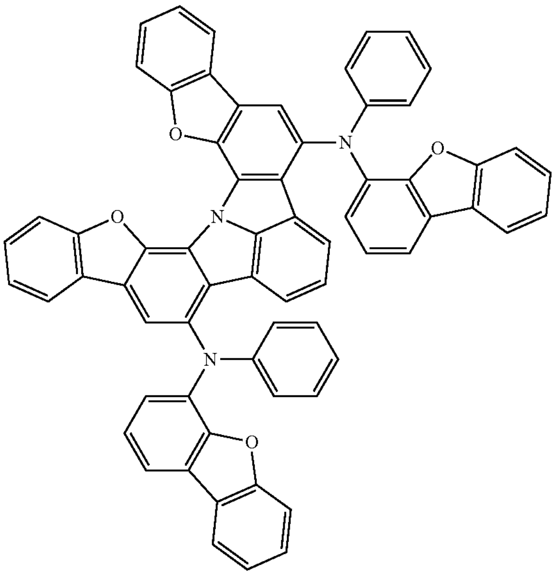
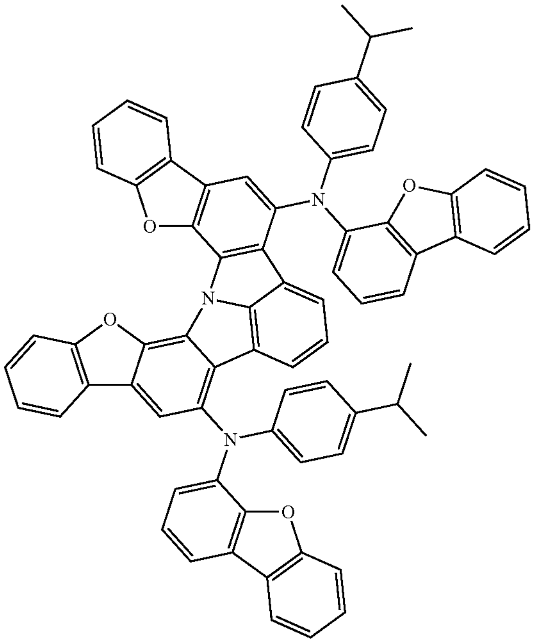

-continued
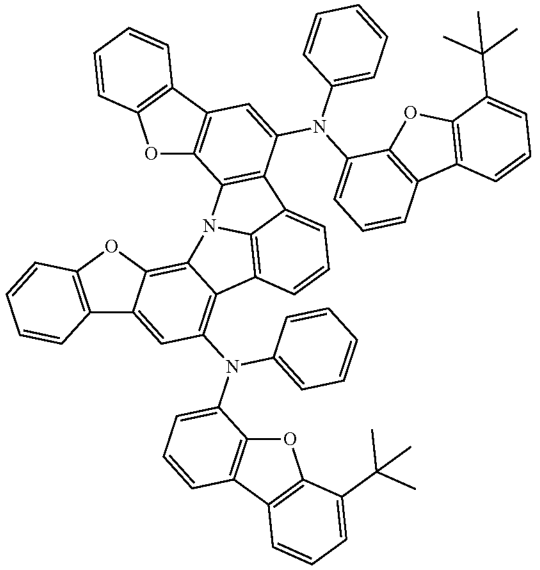
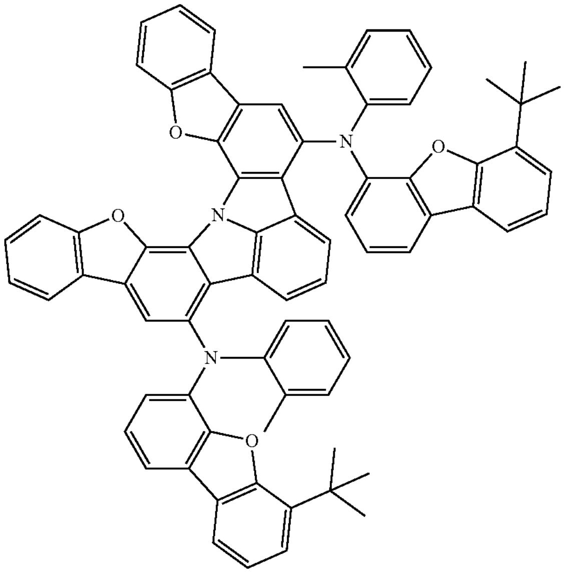
-continued
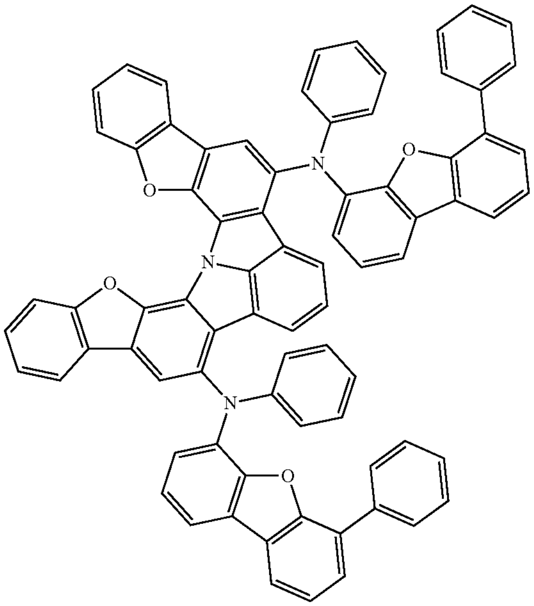
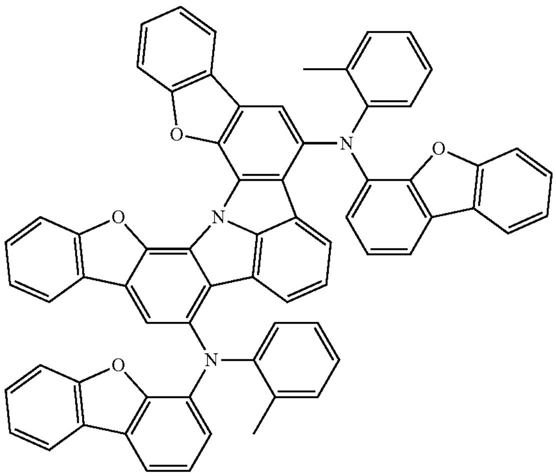
[Formula 282]
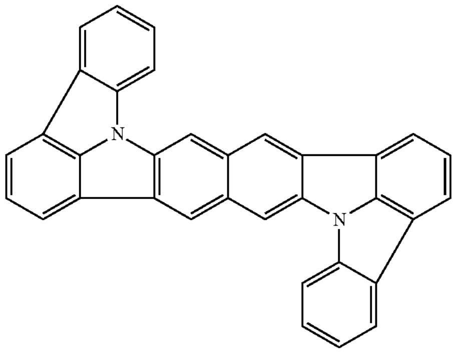
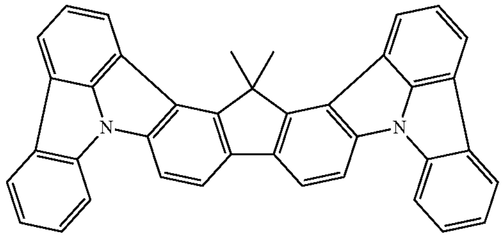

-continued
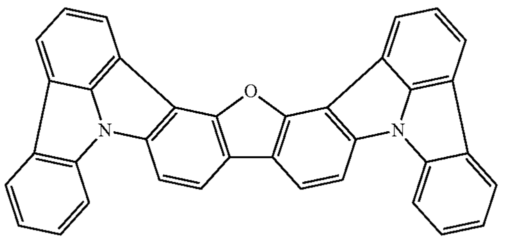
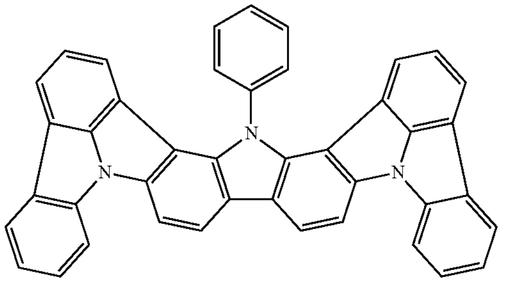
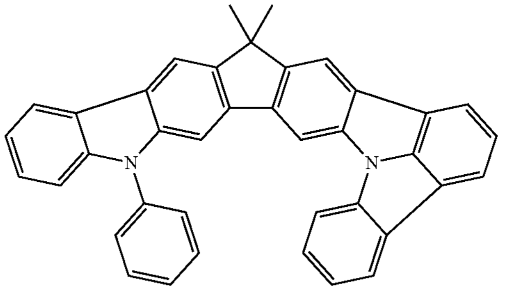
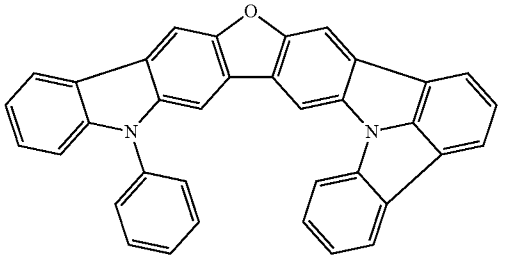
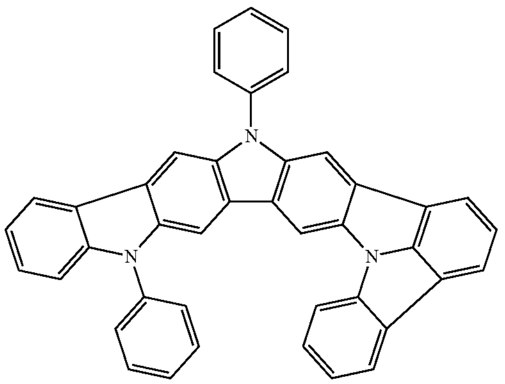
-continued
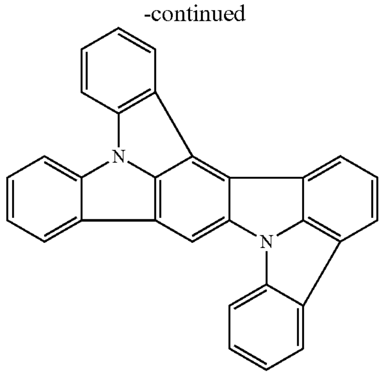
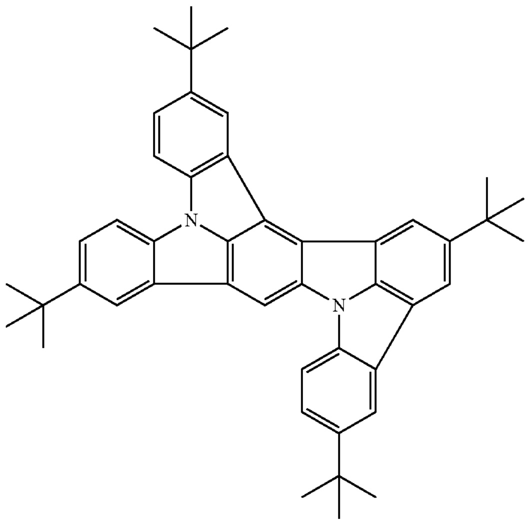
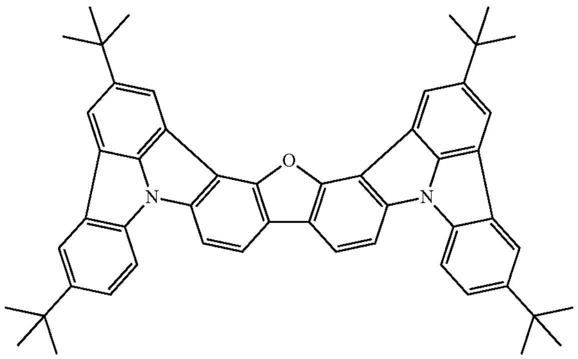 [SMILES: CC(C)(C)c1ccc2c(c1)c1cc(C(C)(C)C)cc3c4c5oc6c(ccc7c6c6cc(C(C)(C)C)cc8c9cc(C(C)(C)C)ccc9n7c86)c5ccc4n2c13]
Compound Represented by Formula (5)
The compound represented by the formula (5) will be described below. The compound represented by the formula (5) corresponds to a compound represented by the formula (41-3).

[Formula 283]

(5)

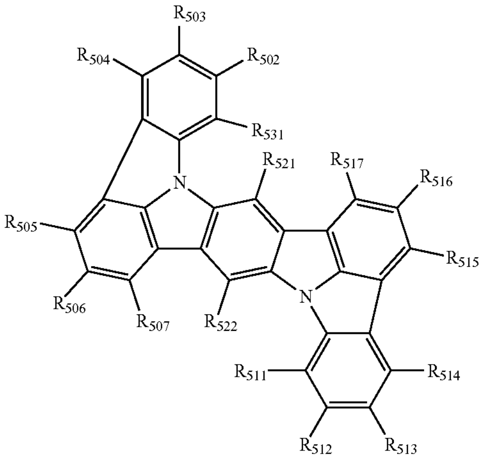

In the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded;

$R_{501}$ to $R_{507}$ and $R_{511}$ to $R_{517}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{521}$ and $R_{522}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

"A combination of adjacent two or more of $R_{501}$ to $R_{507}$ and $R_{511}$ to $R_{517}$" refers to, for instance, a combination of $R_{501}$ and $R_{502}$, a combination of $R_{502}$ and $R_{503}$, a combination of $R_{503}$ and $R_{504}$, a combination of $R_{505}$ and $R_{506}$, a combination of $R_{506}$ and $R_{507}$, and a combination of $R_{501}$, $R_{502}$, and $R_{503}$.

In an exemplary embodiment, at least one, preferably two of $R_{501}$ to $R_{507}$ or $R_{511}$ to $R_{517}$ are each a group represented by —N($R_{906}$)($R_{907}$).

In an exemplary embodiment, $R_{501}$ to $R_{507}$ and $R_{511}$ to $R_{517}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (52) below.

[Formula 284]

(52)

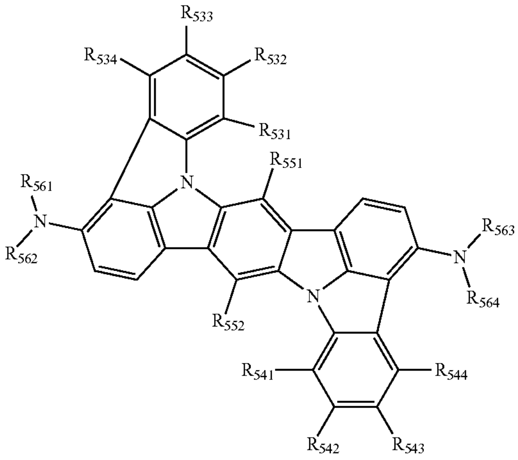

In the formula (52):

at least one combination of adjacent two or more of $R_{531}$ to $R_{534}$ and $R_{541}$ to $R_{544}$ are mutually bonded to form a substituted or unsubstituted monocyclic ring, mutually bonded to form a substituted or unsubstituted fused ring, or not mutually bonded;

$R_{531}$ to $R_{534}$ and $R_{541}$ to $R_{544}$ forming neither the monocyclic ring nor the fused ring, and $R_{551}$ and $R_{552}$ are each independently a hydrogen atom, a substituted or unsubstituted aryl group having 6 to 50 ring carbon atoms, or a substituted or unsubstituted heterocyclic group having 5 to 50 ring atoms; and $R_{561}$ to $R_{564}$ are each independently a substituted or unsubstituted aryl group having 6 to 50 ring carbon atoms, or a substituted or unsubstituted heterocyclic group having 5 to 50 ring atoms.

In an exemplary embodiment, the compound represented by the formula (5) is a compound represented by a formula (53) below.

[Formula 285]

(53)

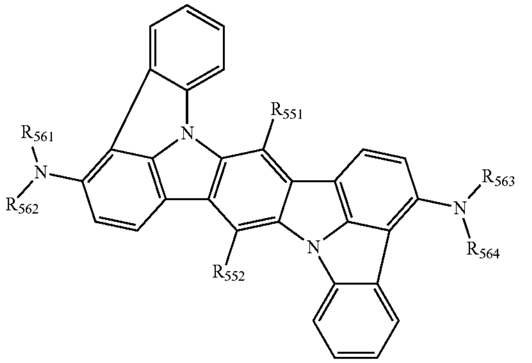

In the formula (53), $R_{551}$, $R_{552}$ and $R_{561}$ to $R_{564}$ each independently represent the same as $R_{551}$, $R_{552}$ and $R_{561}$ to $R_{564}$ in the formula (52).

In an exemplary embodiment, $R_{561}$ to $R_{564}$ in the formulae (52) and (53) are each independently a substituted or unsubstituted aryl group having 6 to 50 ring carbon atoms (preferably a phenyl group).

In an exemplary embodiment, $R_{521}$ and $R_{522}$ in the formula (5) and $R_{551}$ and $R_{552}$ in the formulae (52) and (53) are each a hydrogen atom.

In an exemplary embodiment, the substituent for the "substituted or unsubstituted" group in the formulae (5), (52) and (53) is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (5)

Specific examples of the compound represented by the formula (5) include compounds below.

[Formula 286]

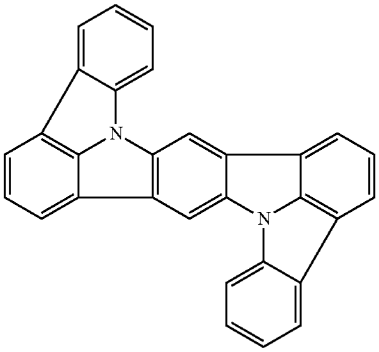

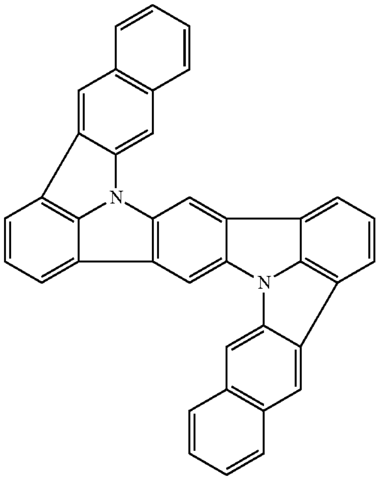

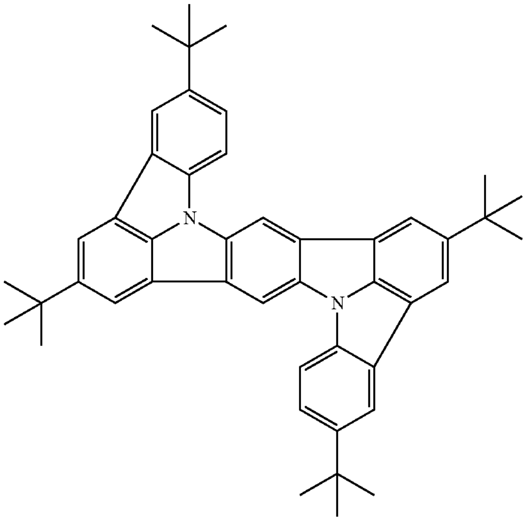

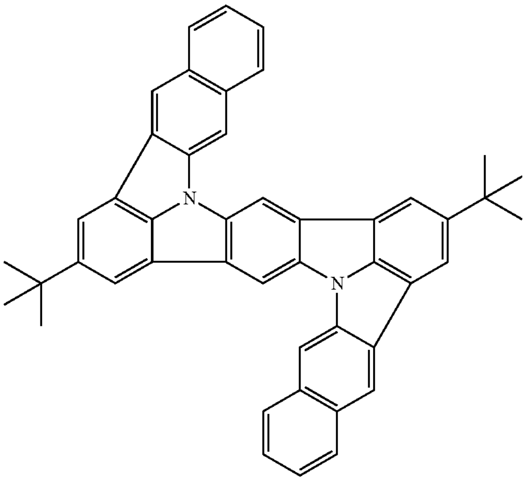

-continued
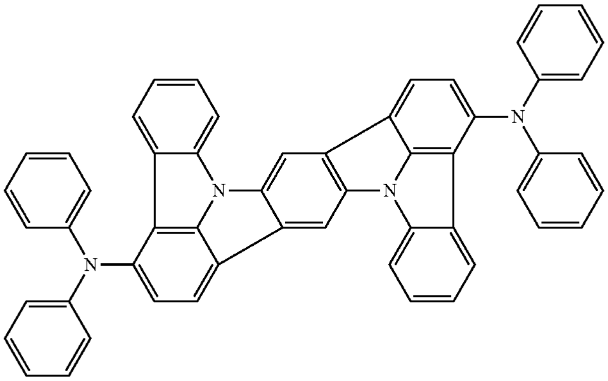
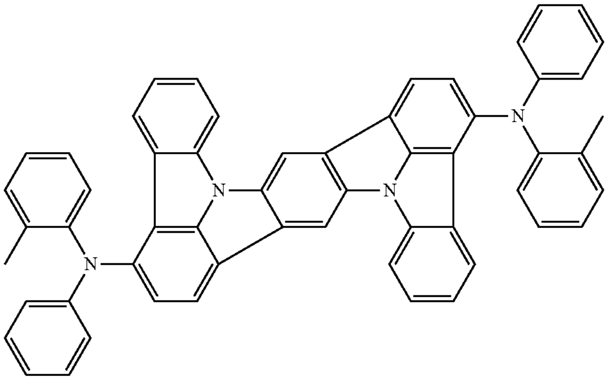
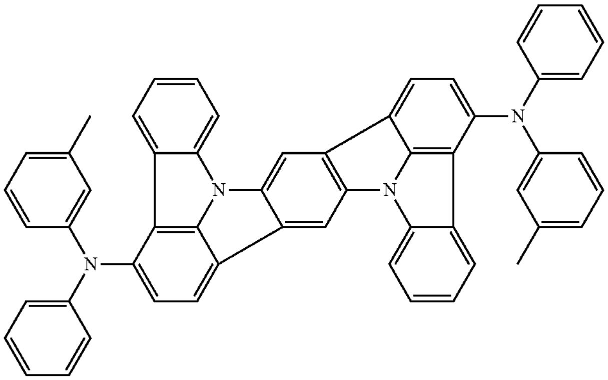
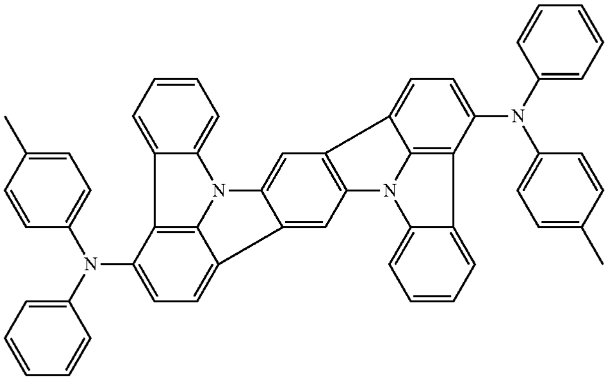

-continued
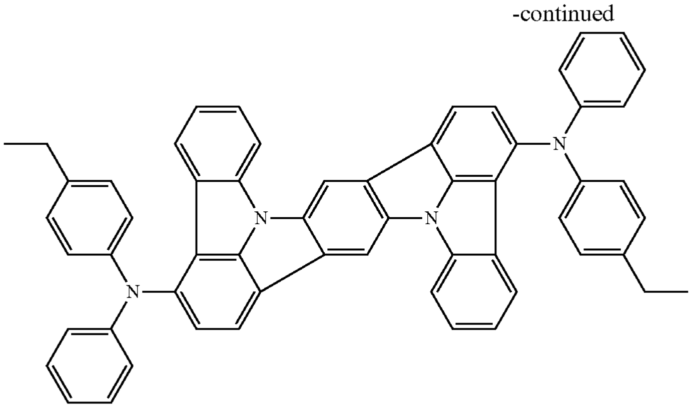
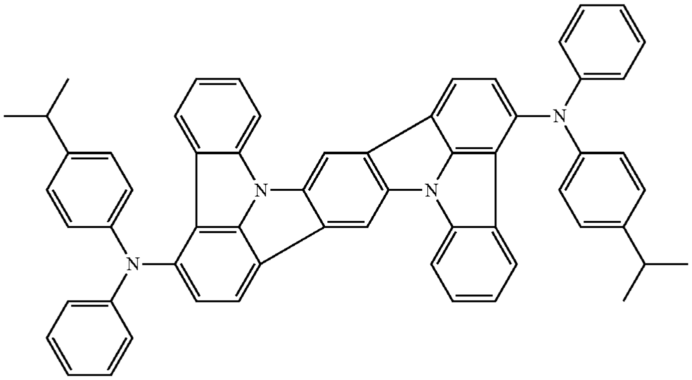
[Formula 287]
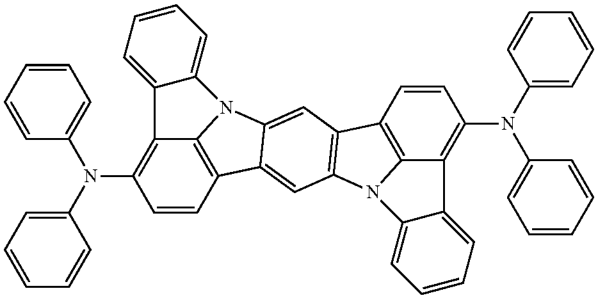
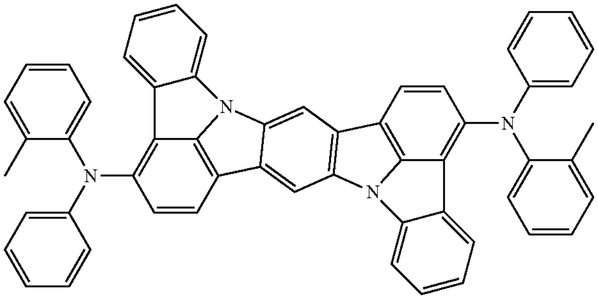
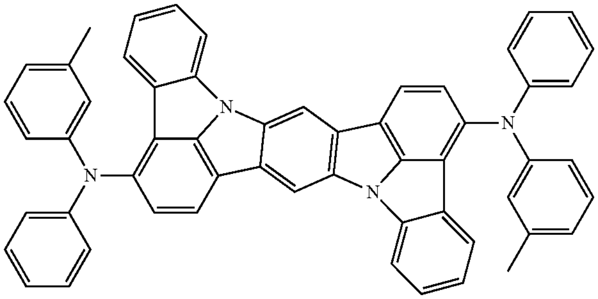

-continued
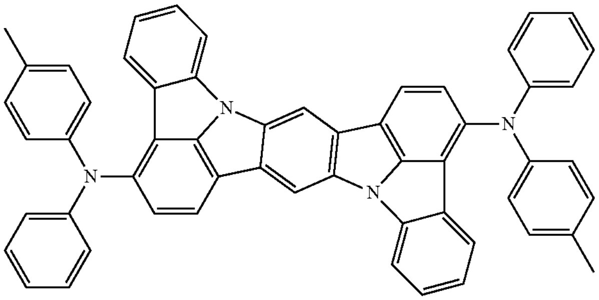
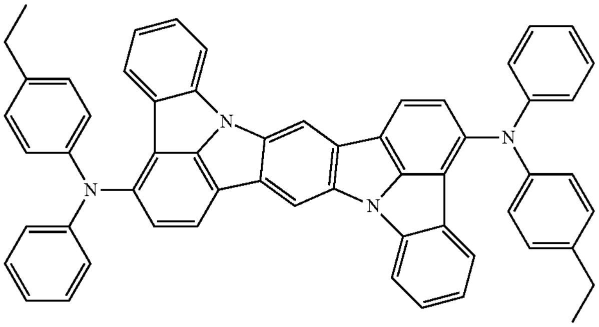
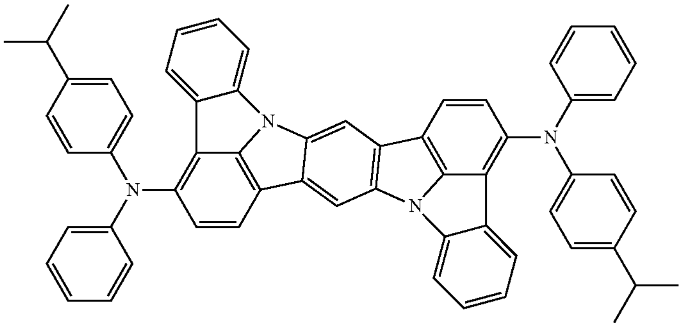
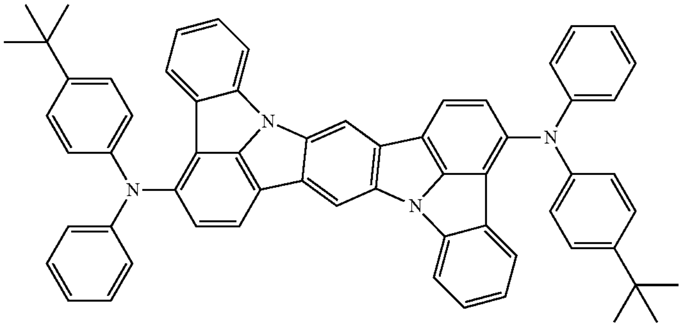
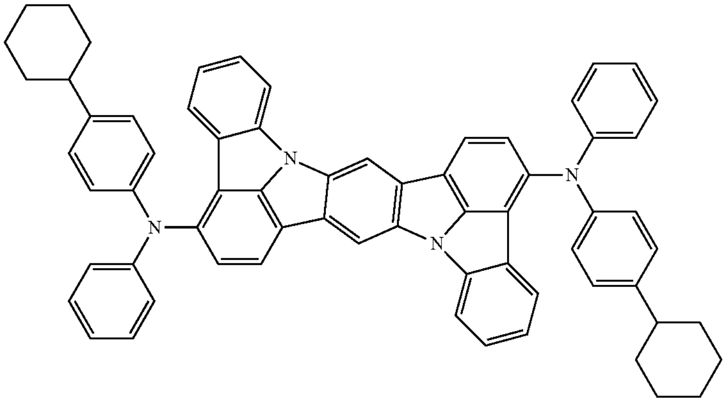

-continued
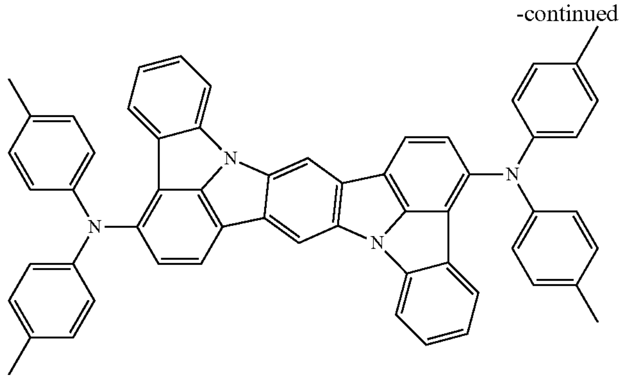
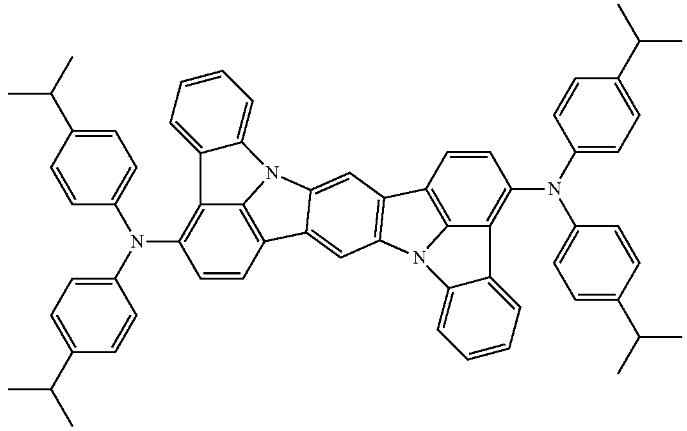
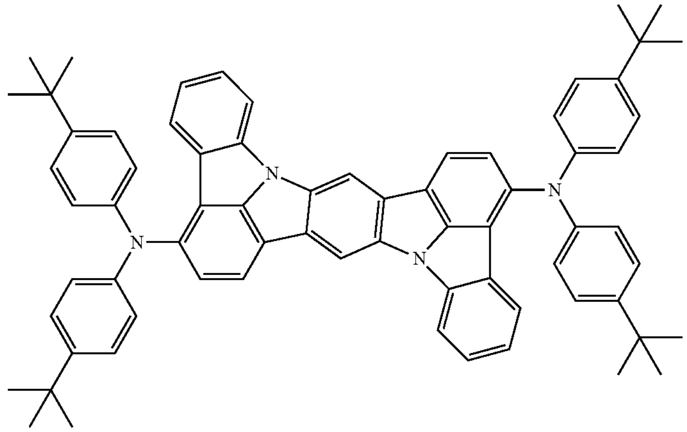
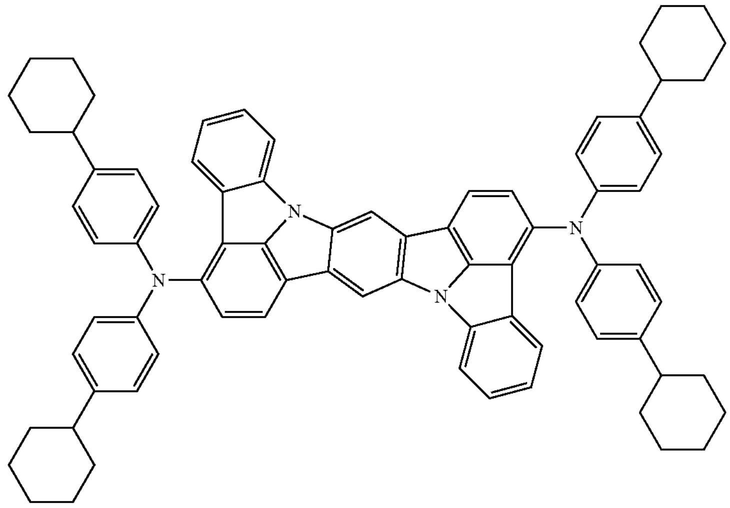

-continued
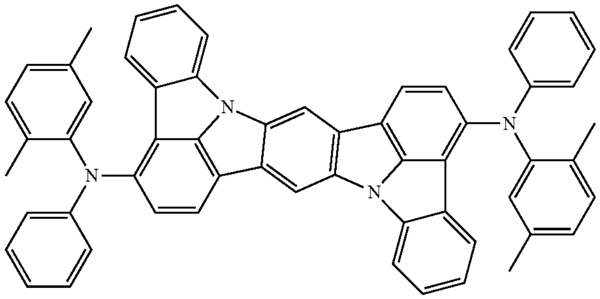
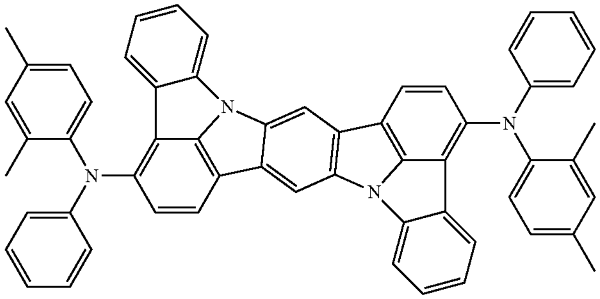
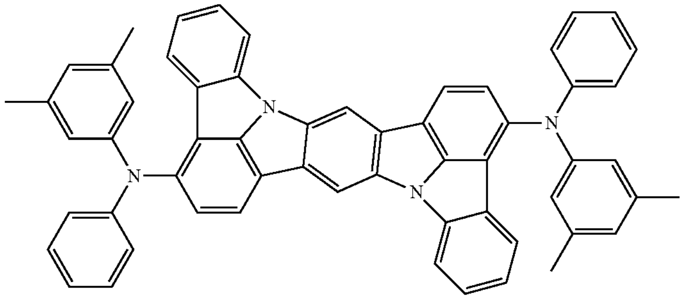
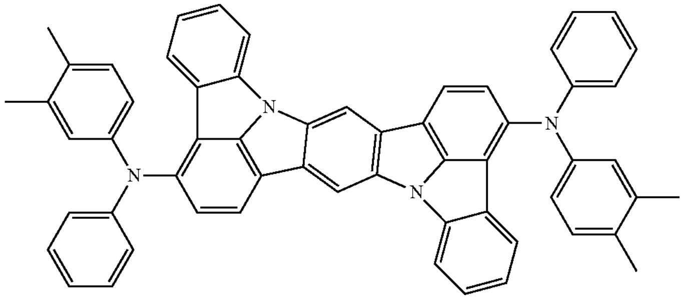
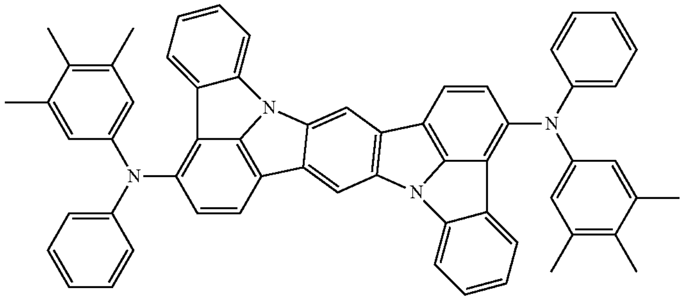

-continued
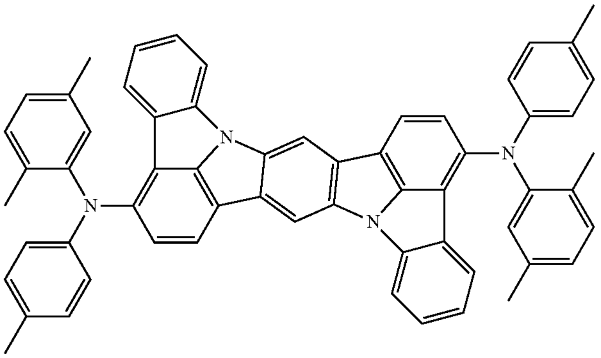
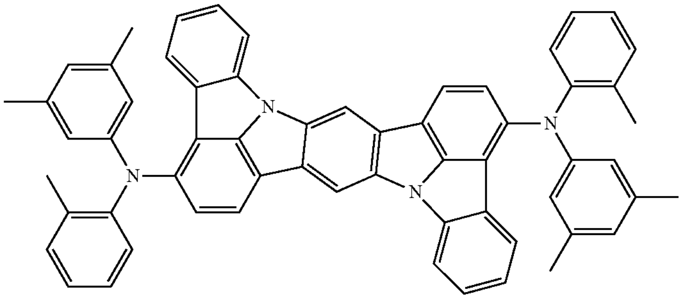
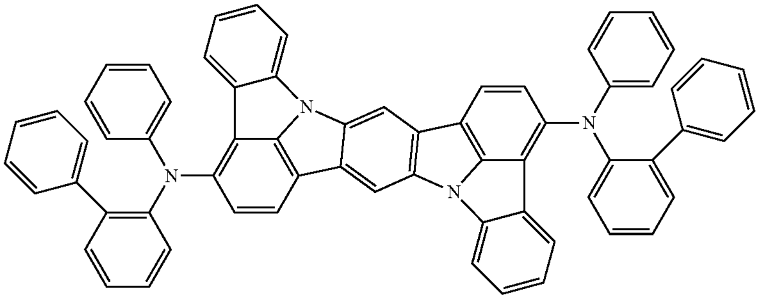
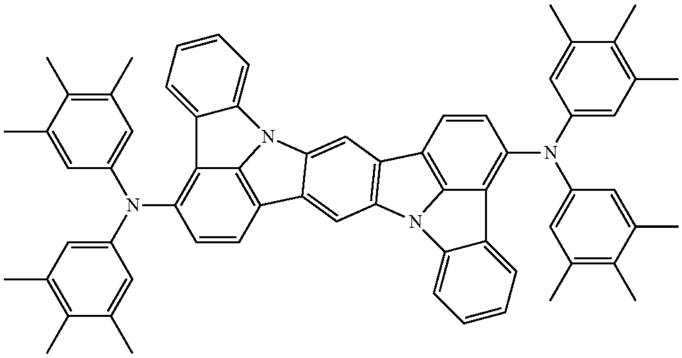

-continued
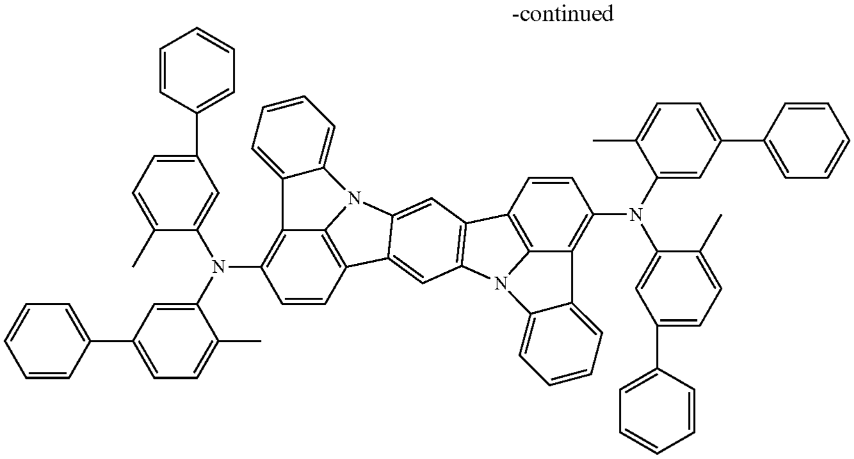
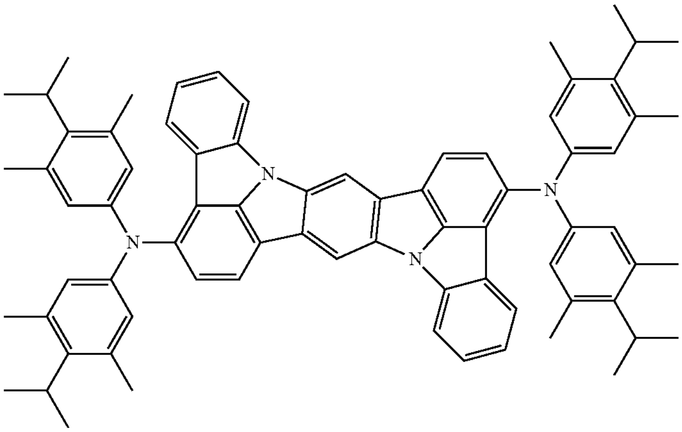
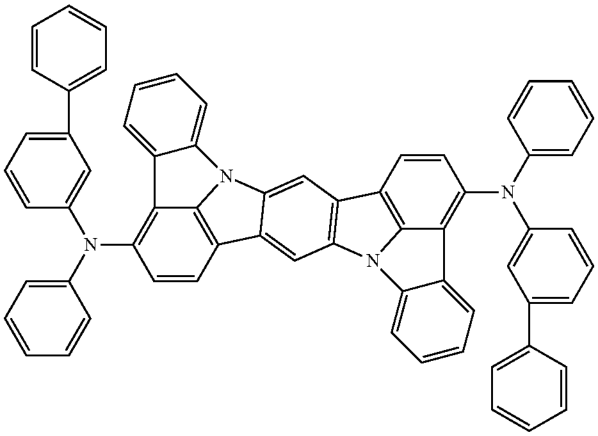
[Formula 288]
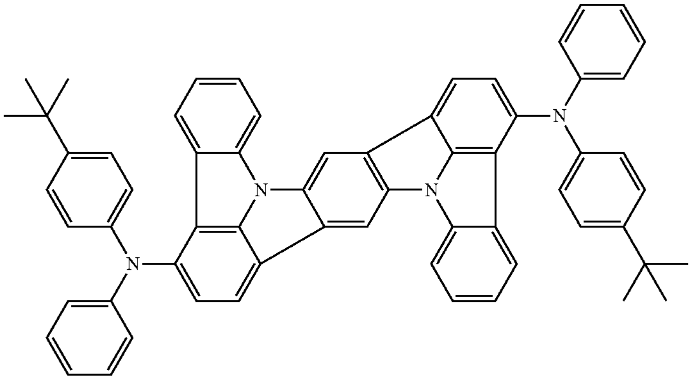

-continued
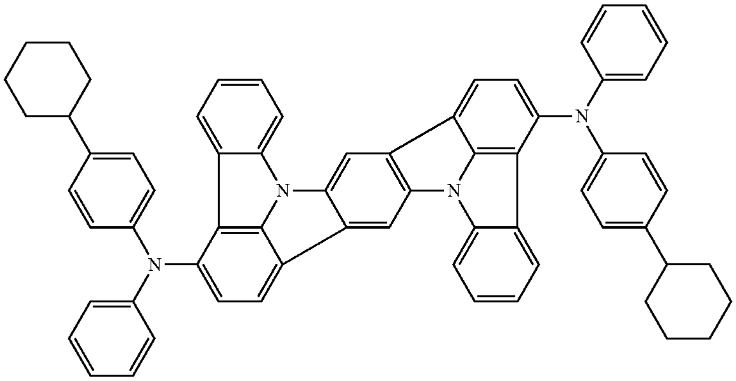
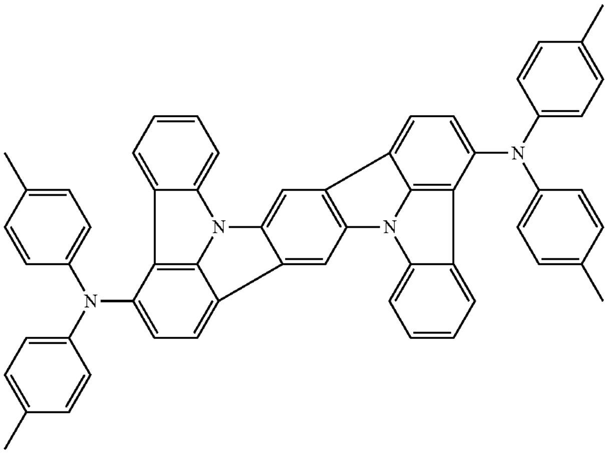
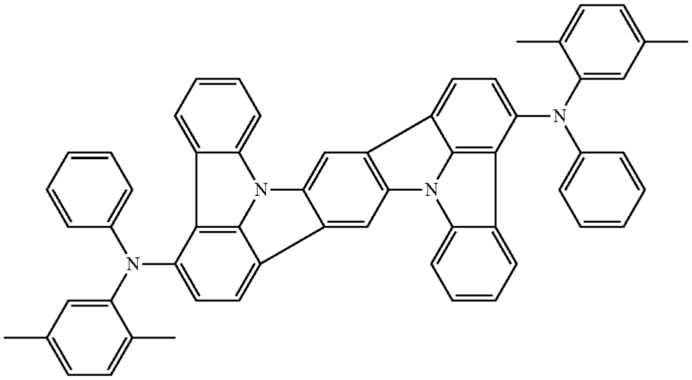
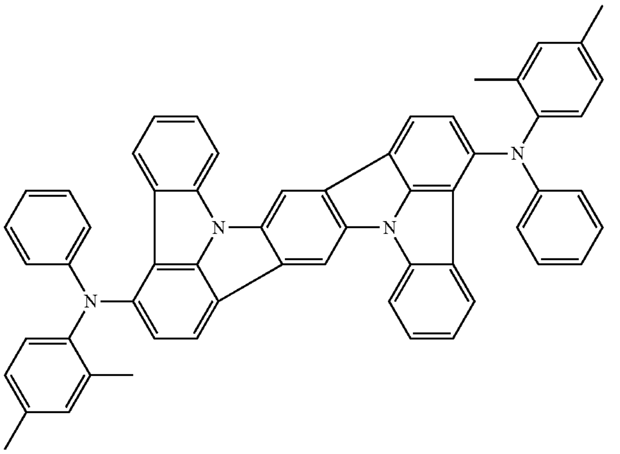

-continued
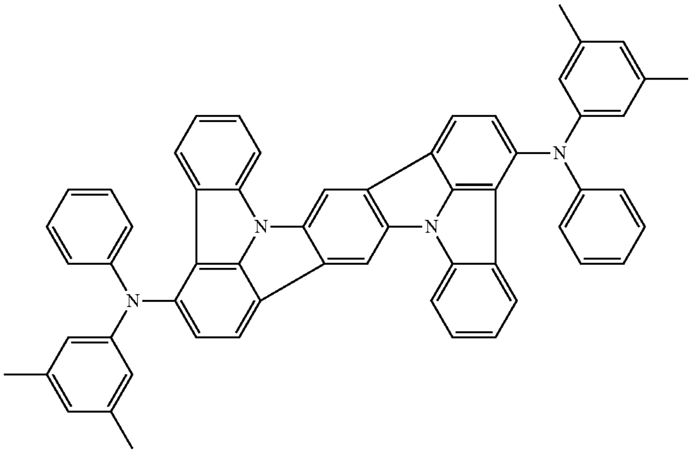
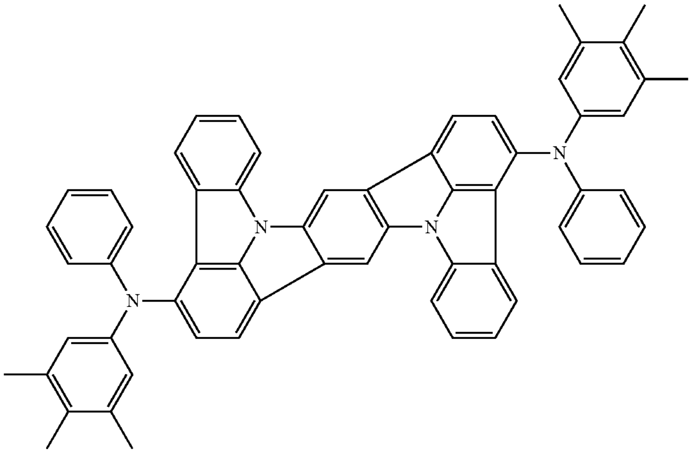
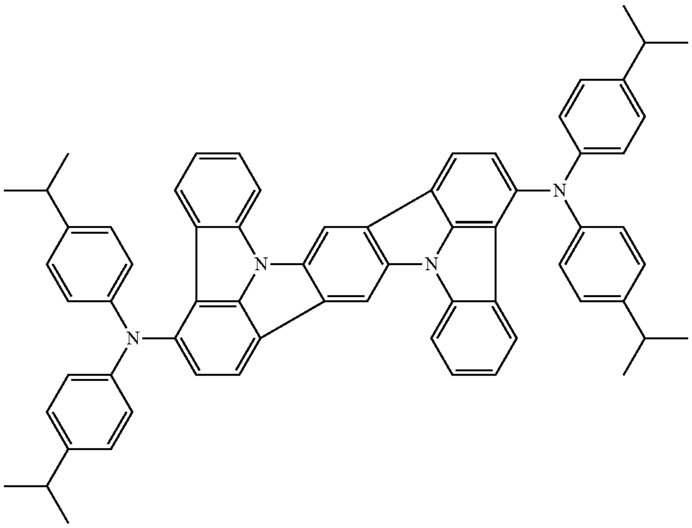

-continued
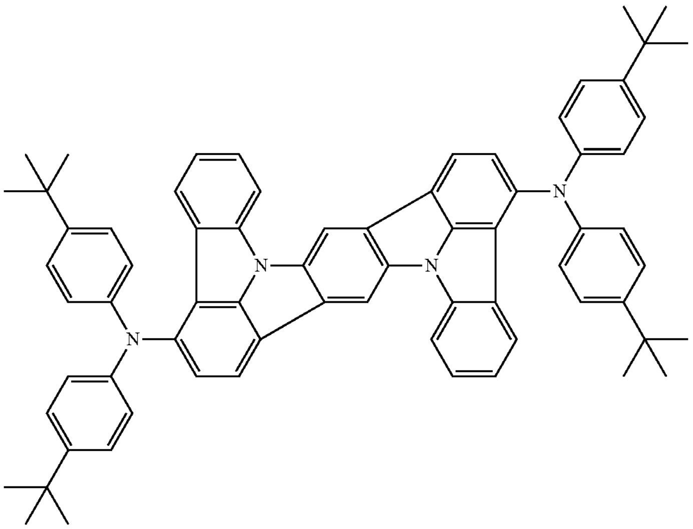
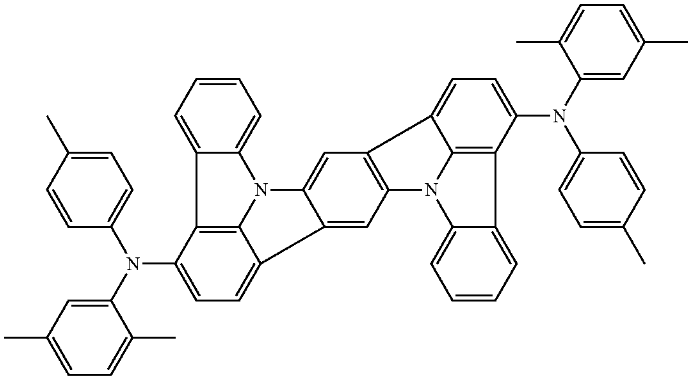
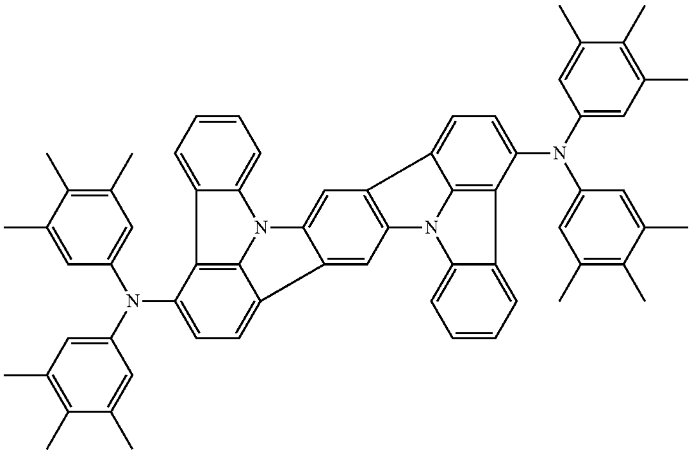
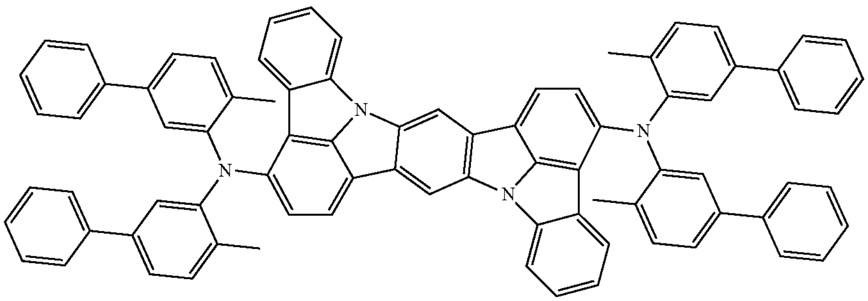

-continued
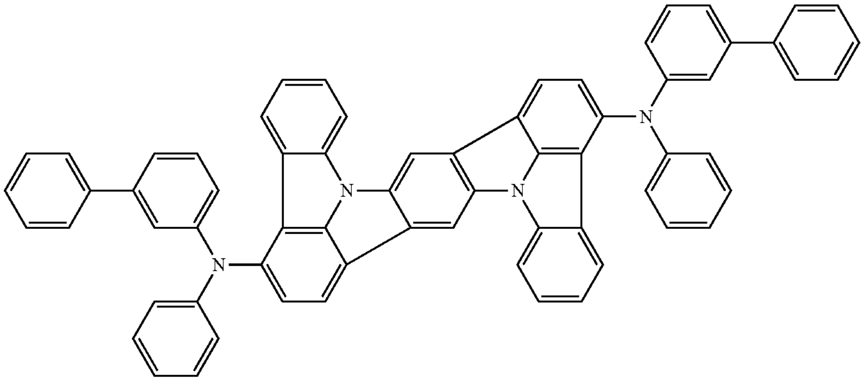
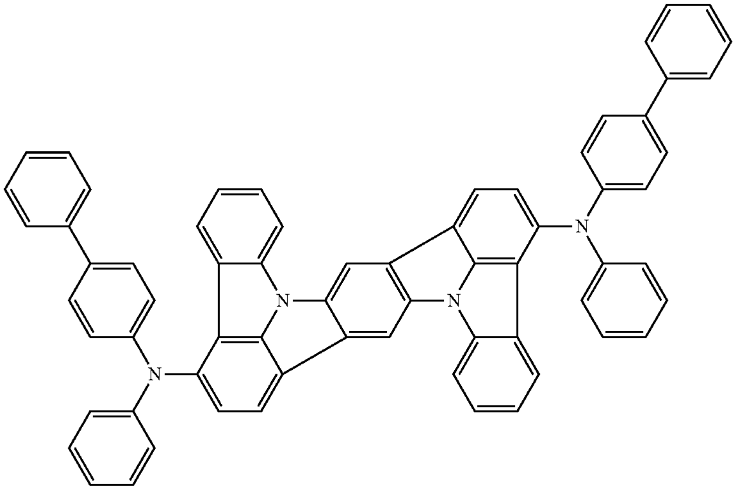
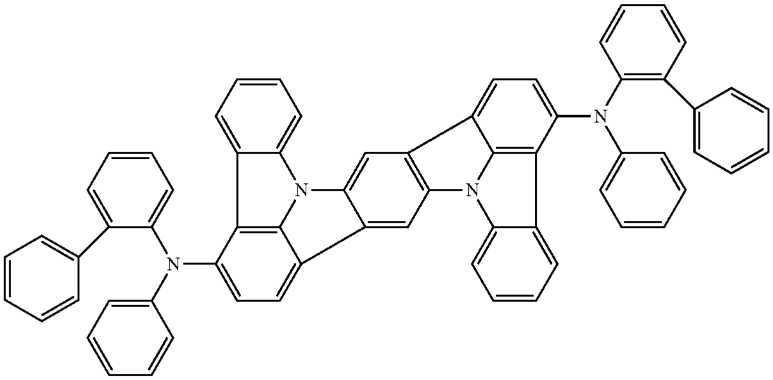
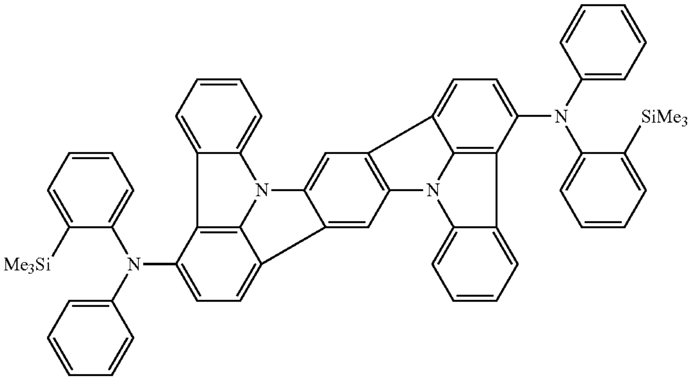

-continued
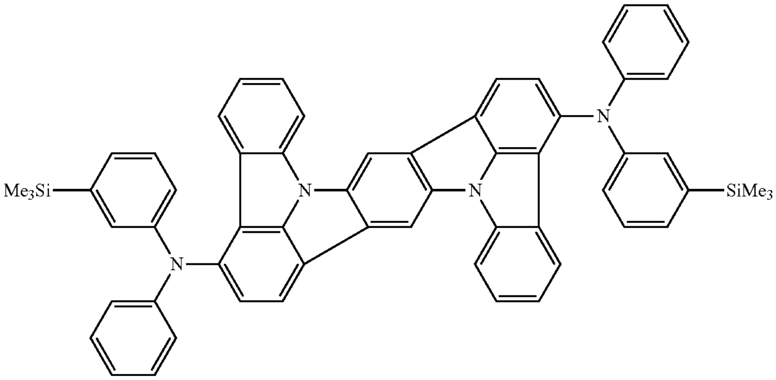
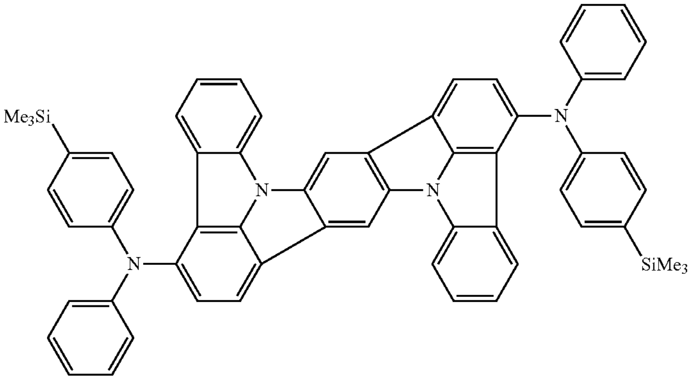
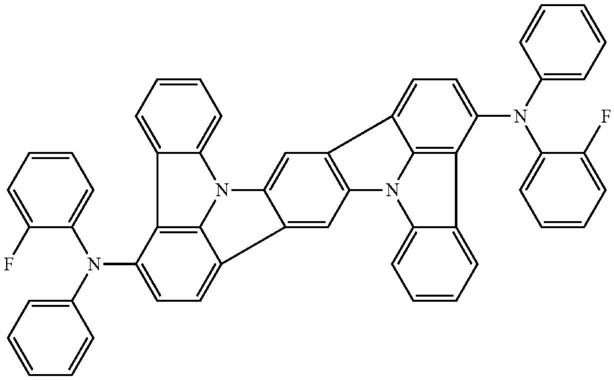
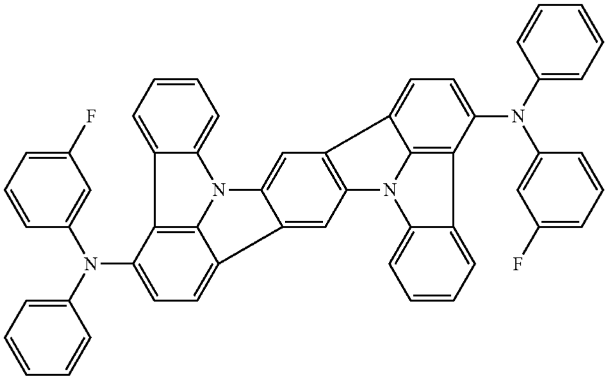

-continued
[Formula 289]
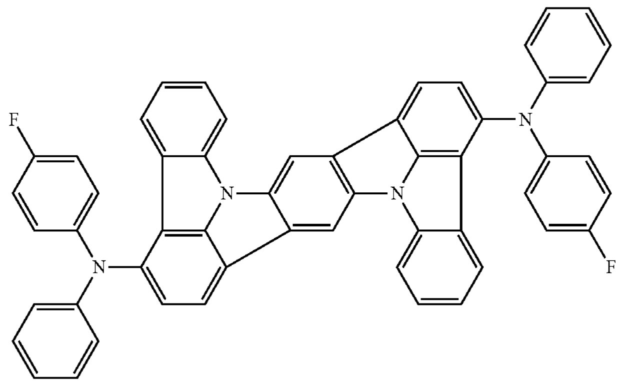
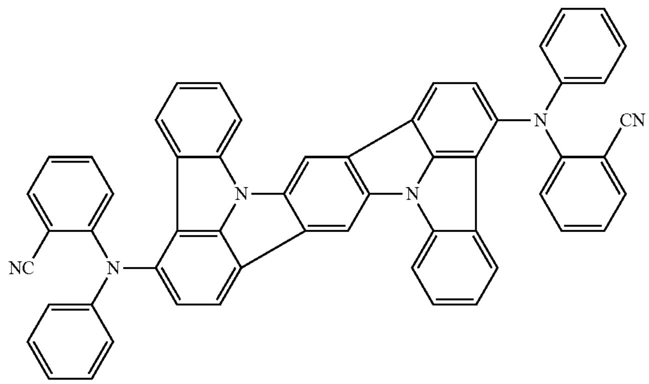
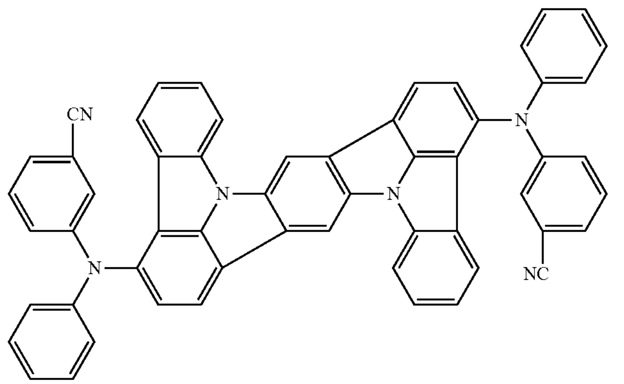
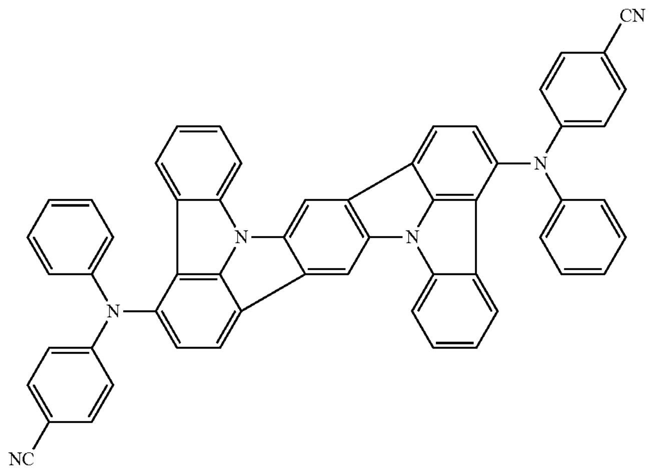

-continued
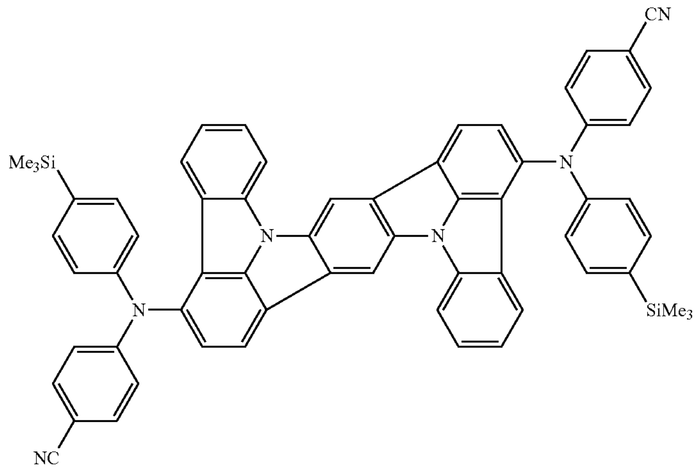
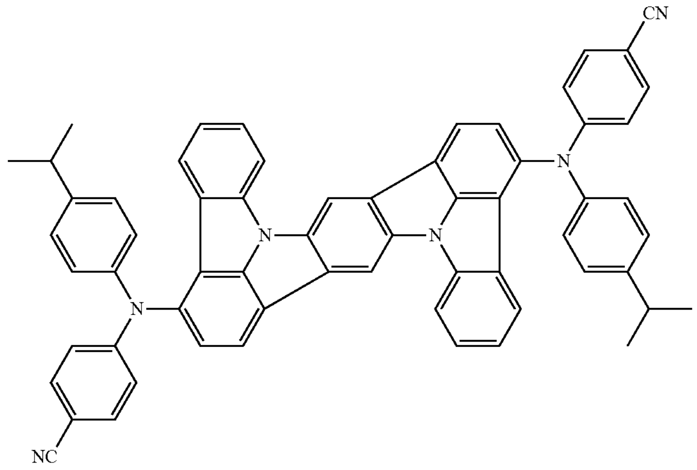
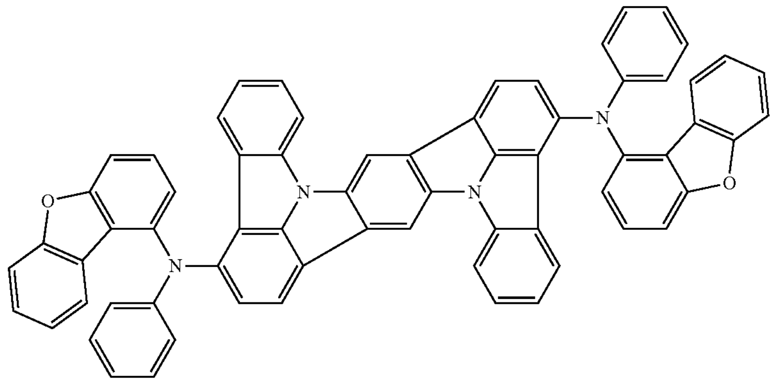
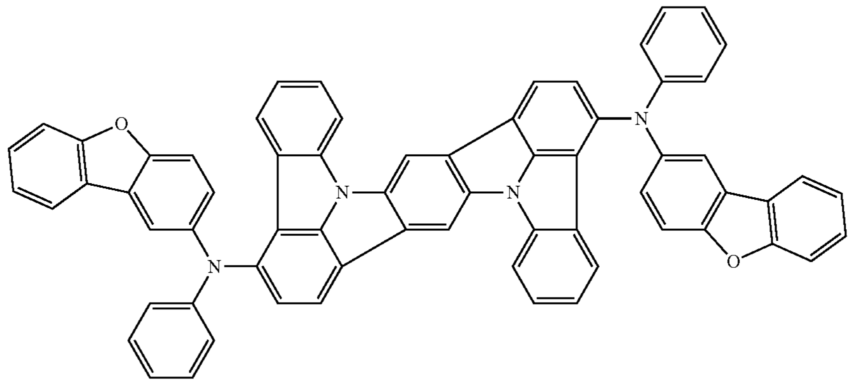

-continued
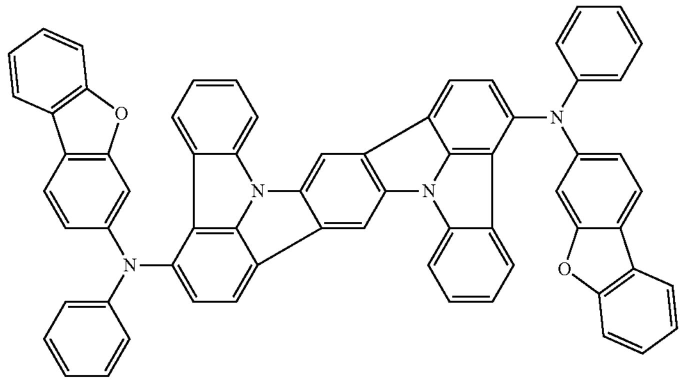
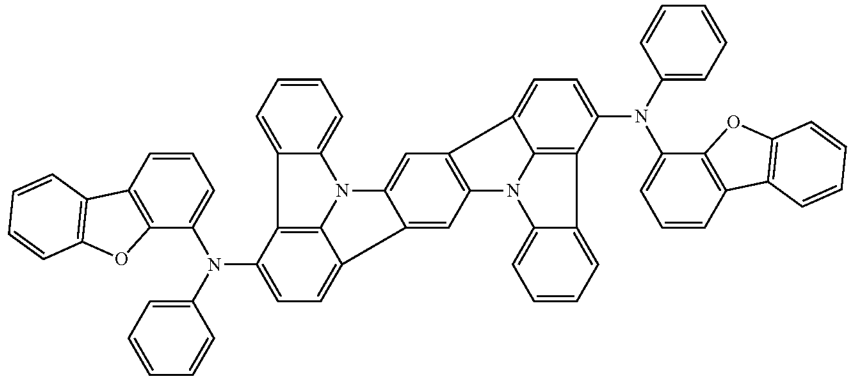
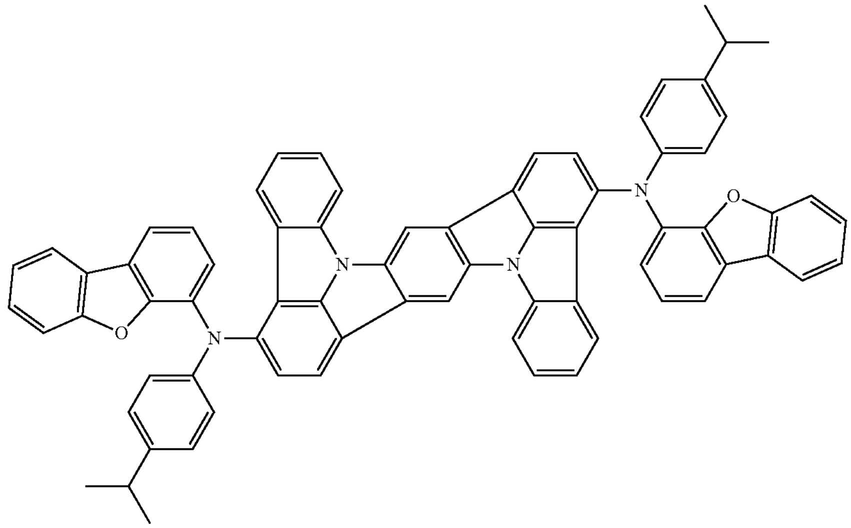
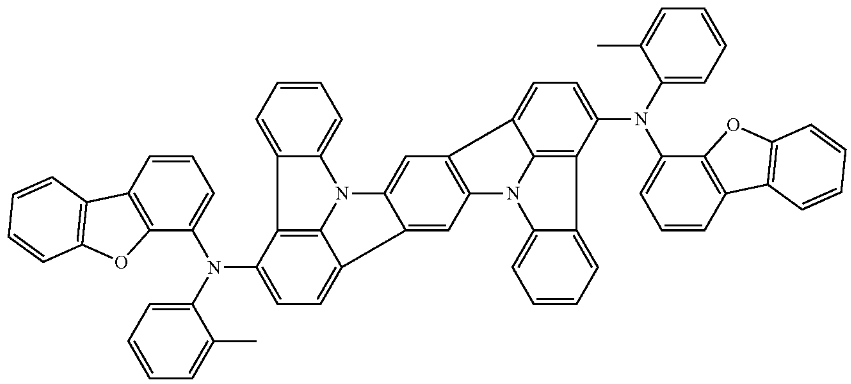

-continued
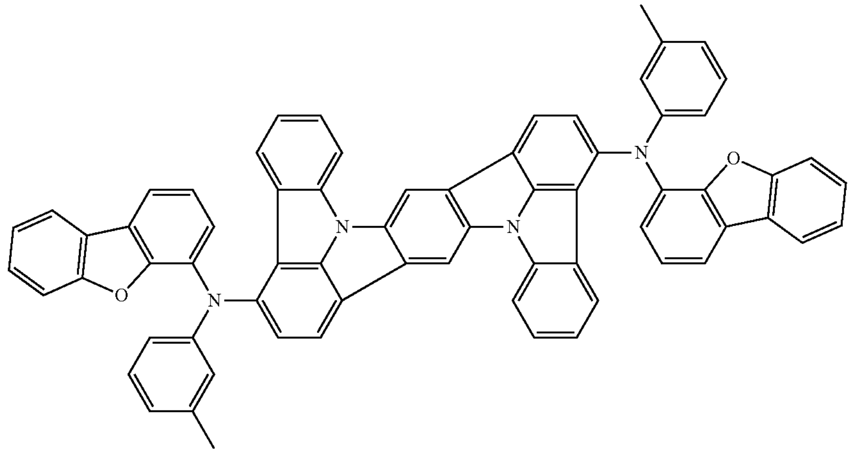
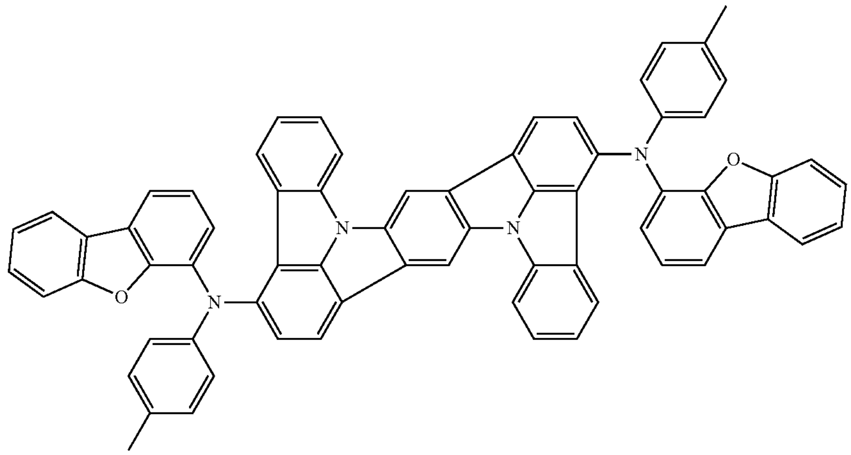
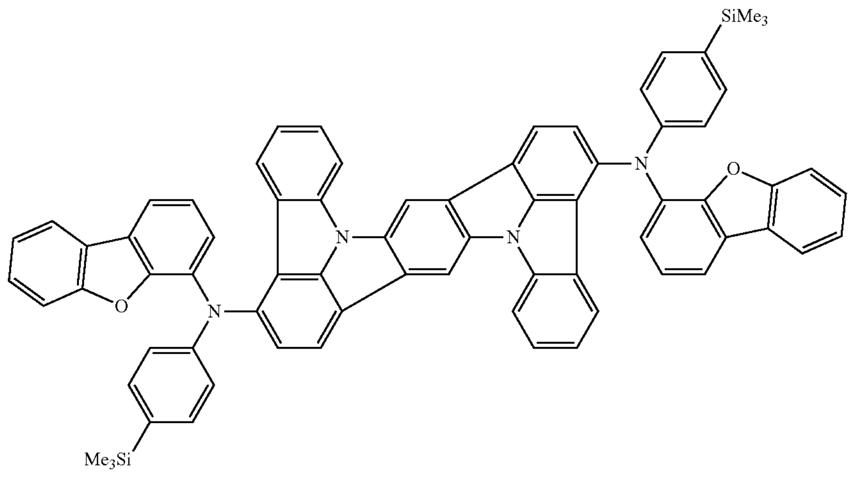

-continued
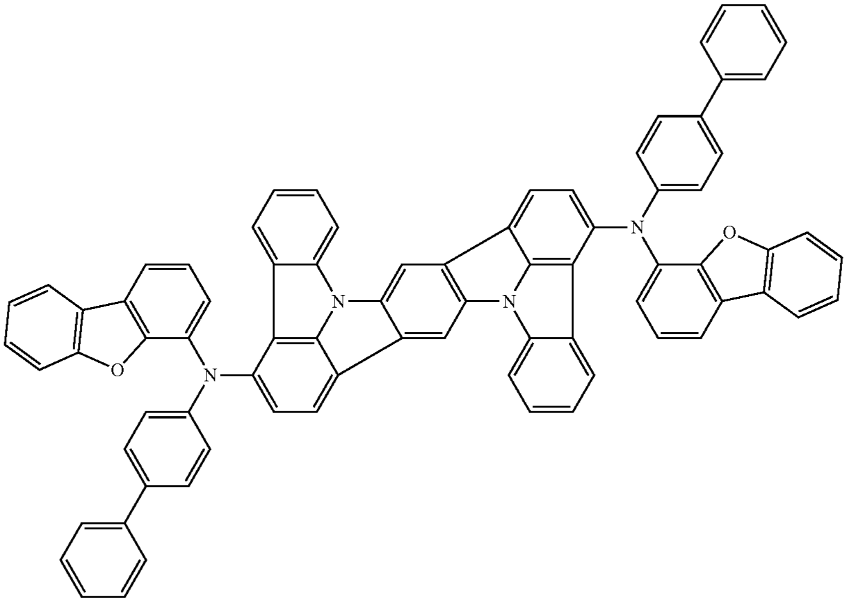
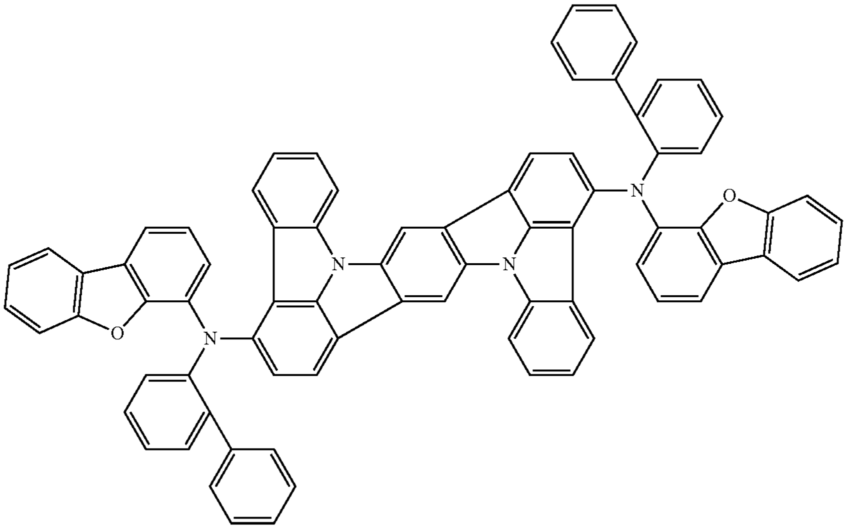
[Formula 290]
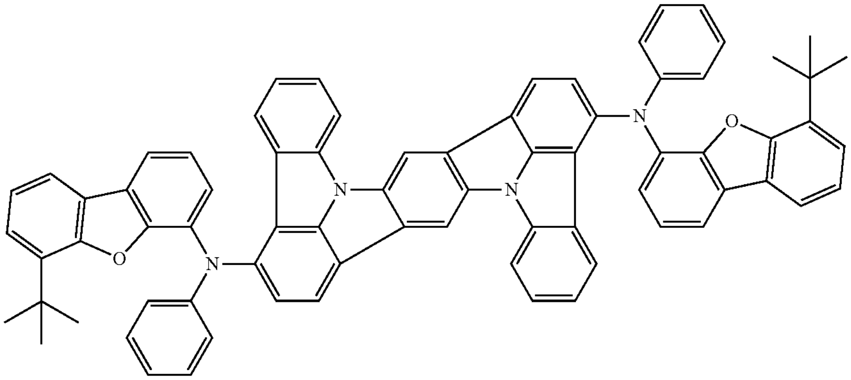

-continued
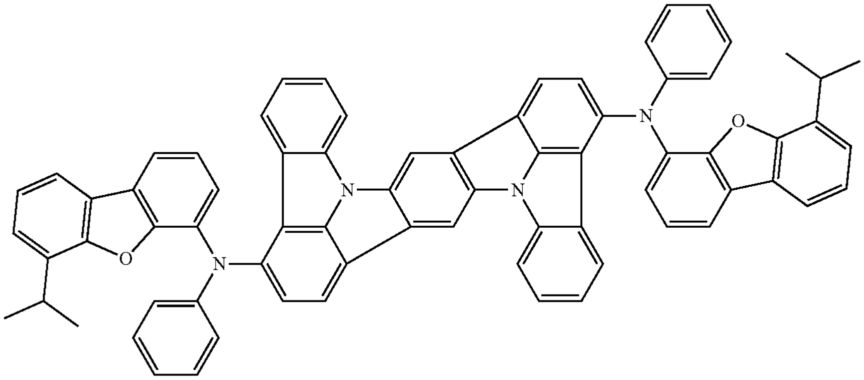
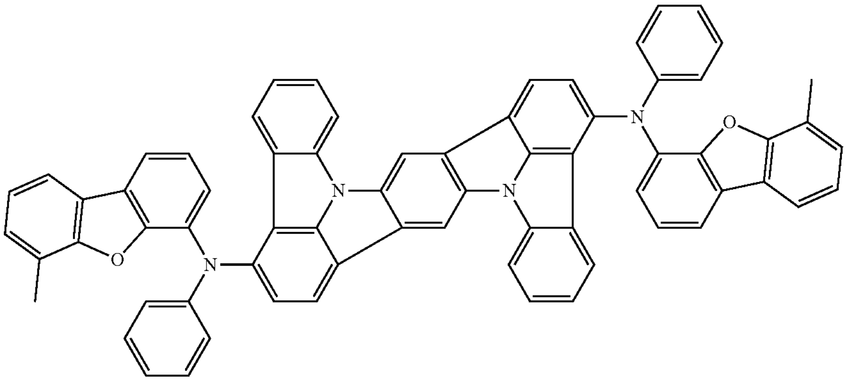
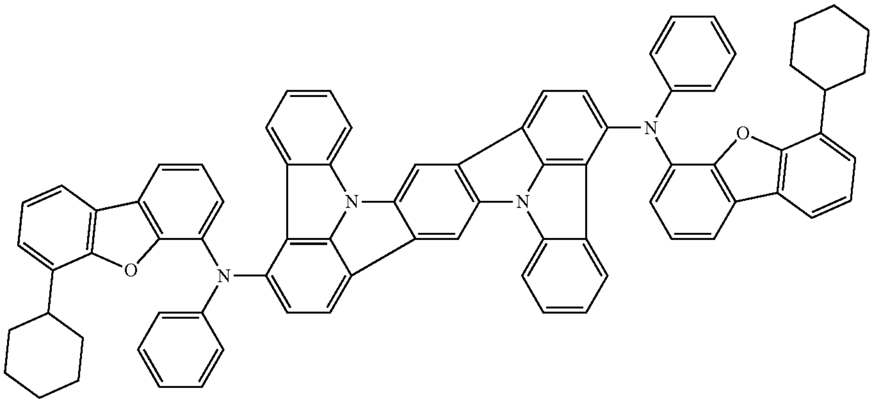
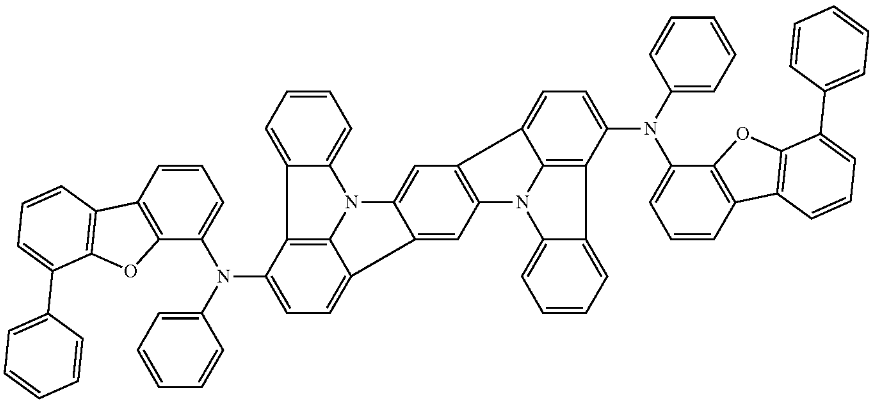

-continued
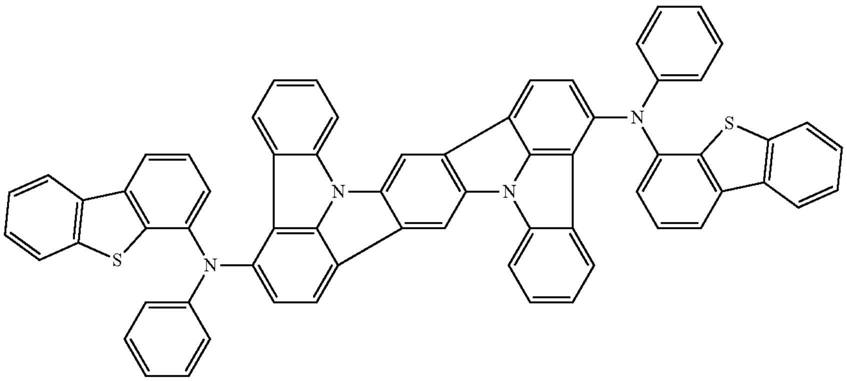
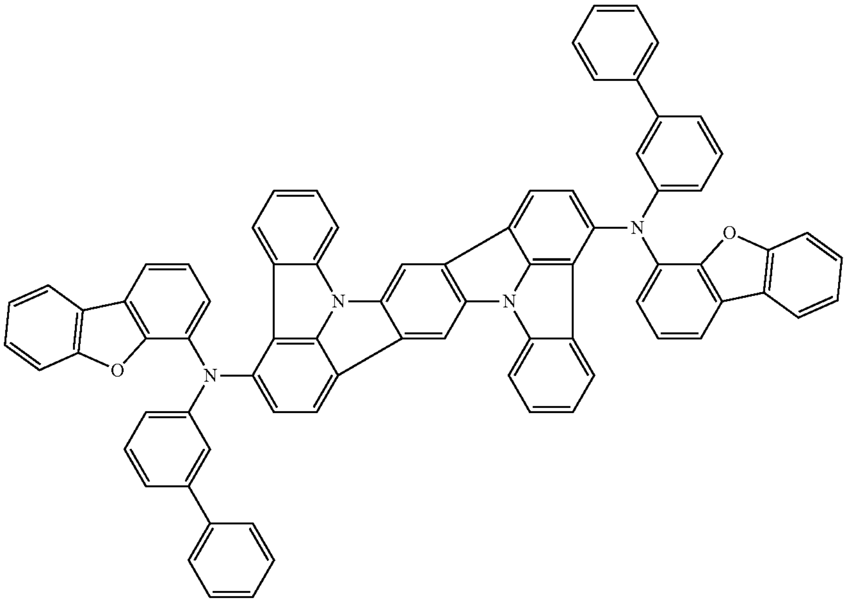
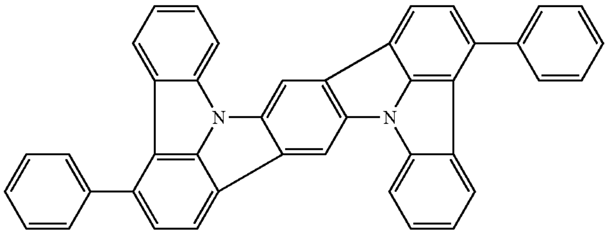
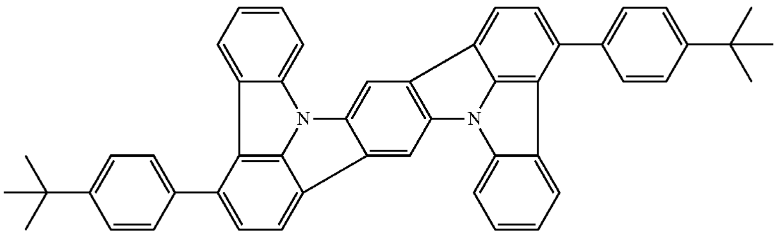
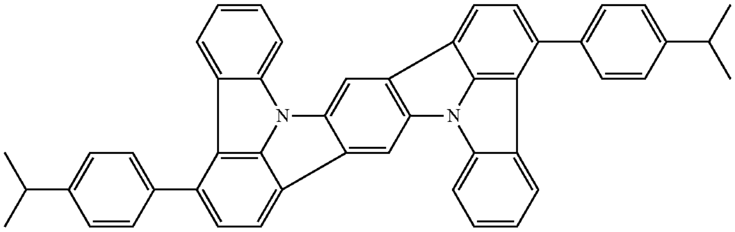

-continued
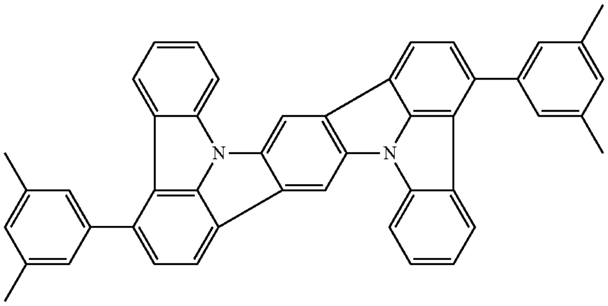
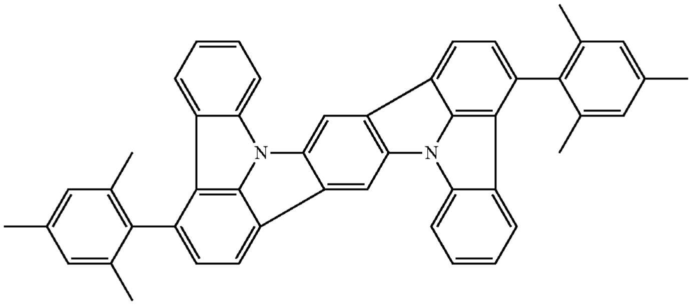
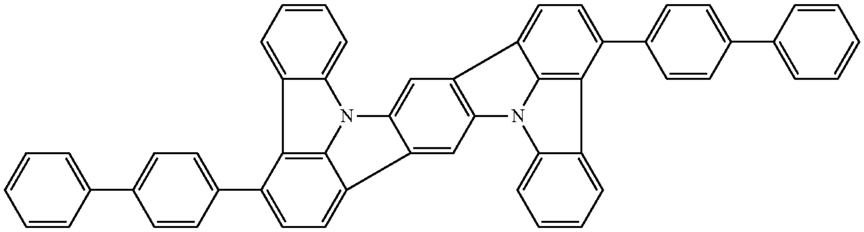
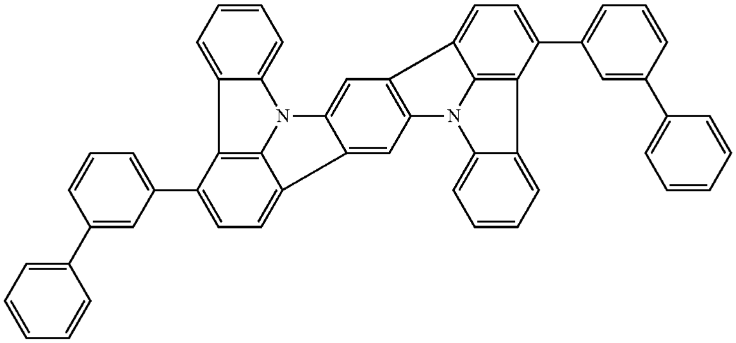
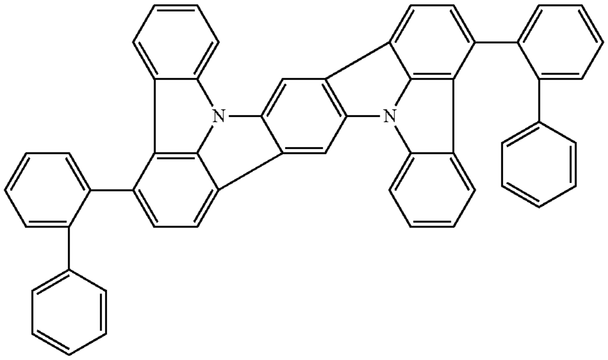

-continued
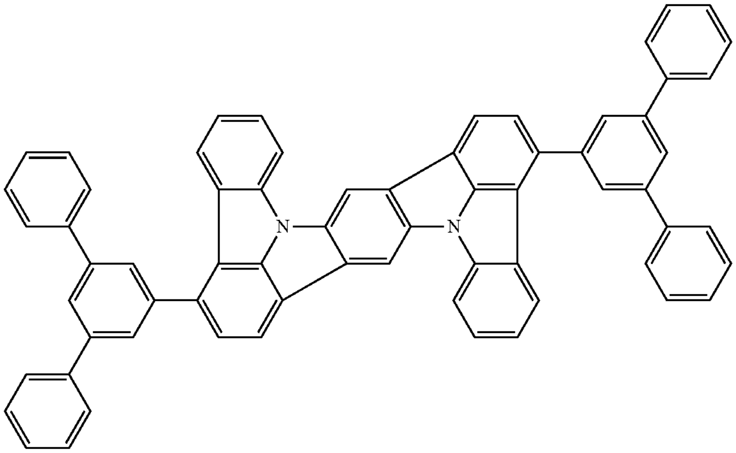
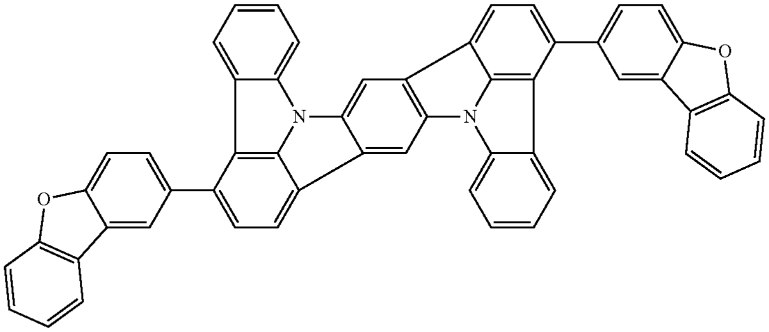
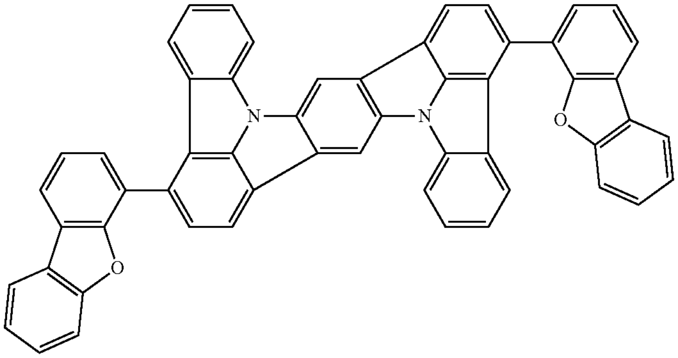
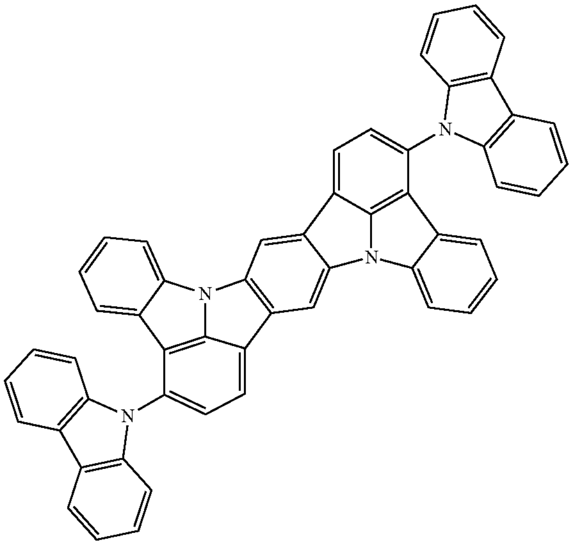

[Formula 291]
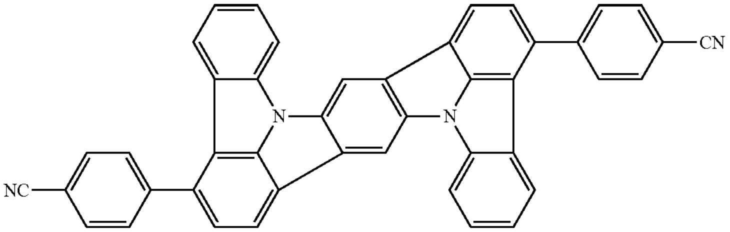
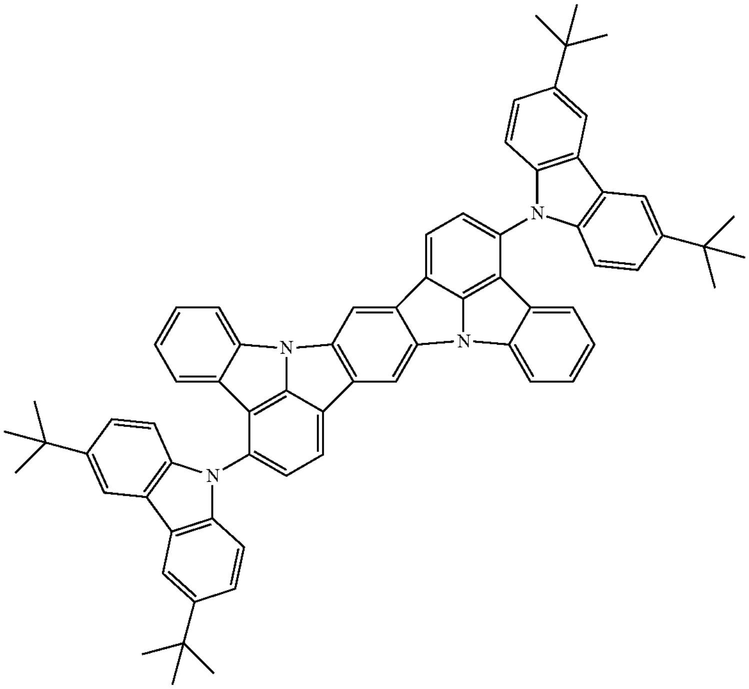
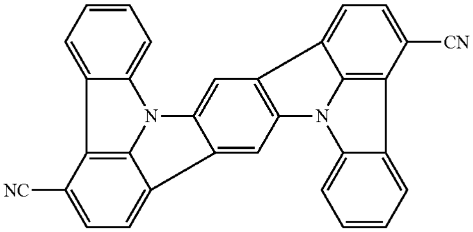
[Formula 292]
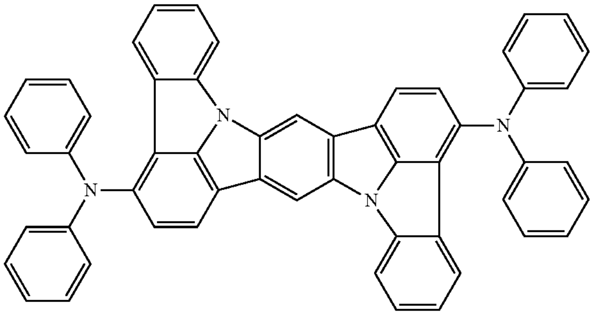
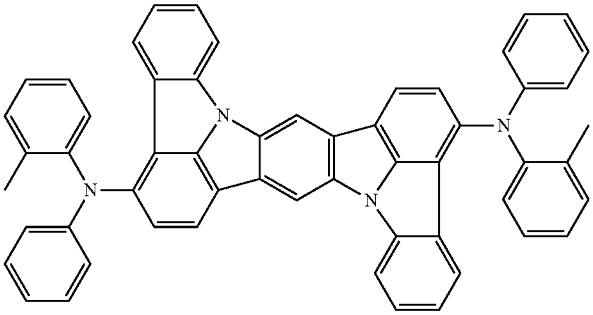

-continued
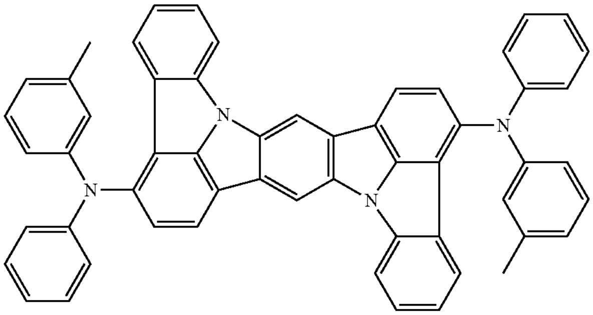
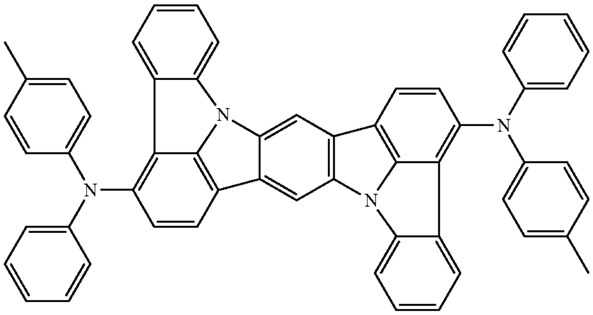
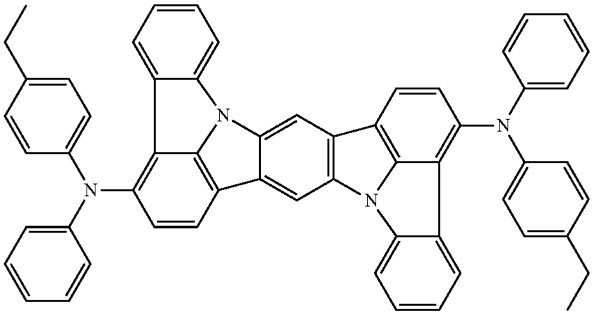
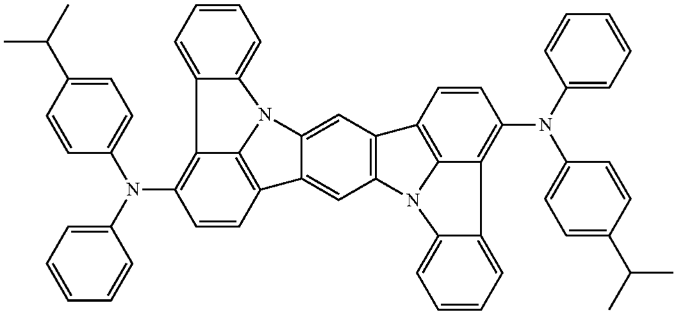
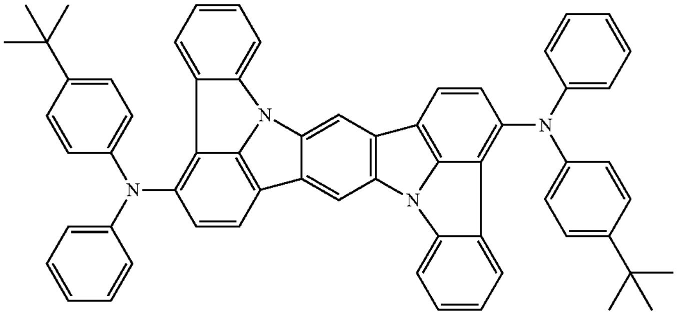
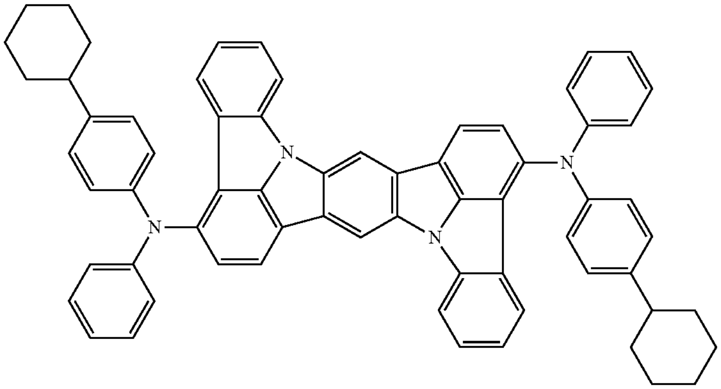

-continued
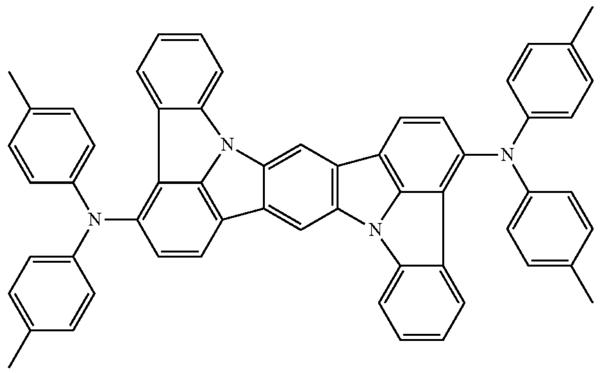
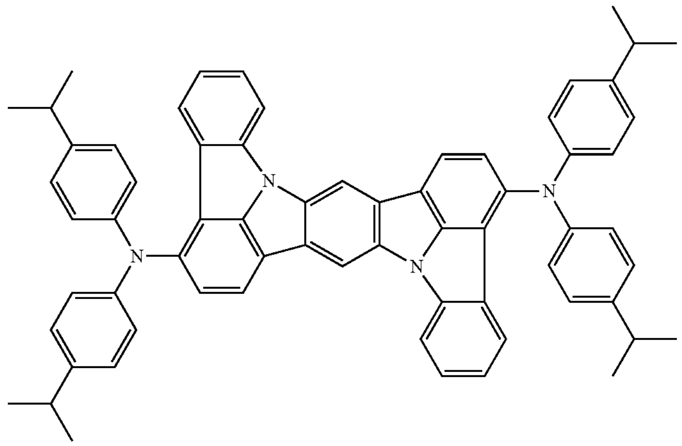
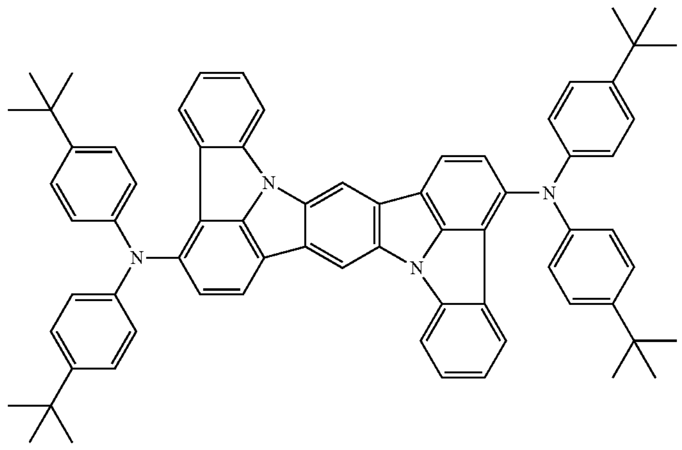

-continued
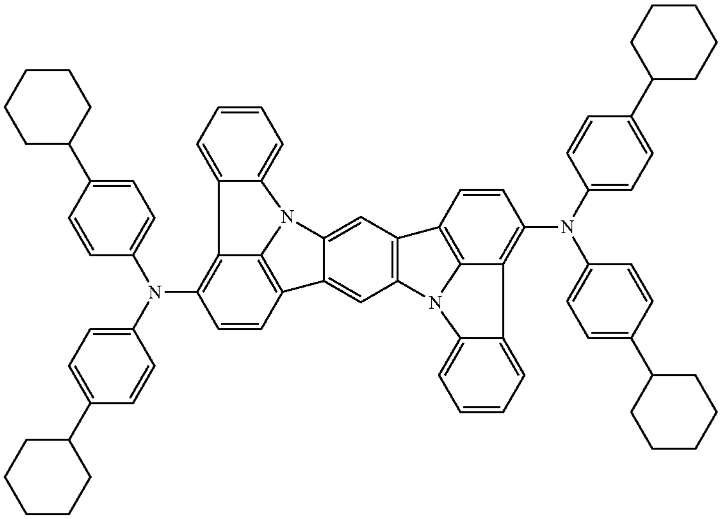
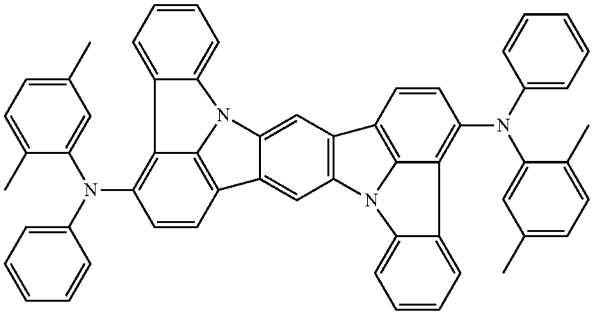
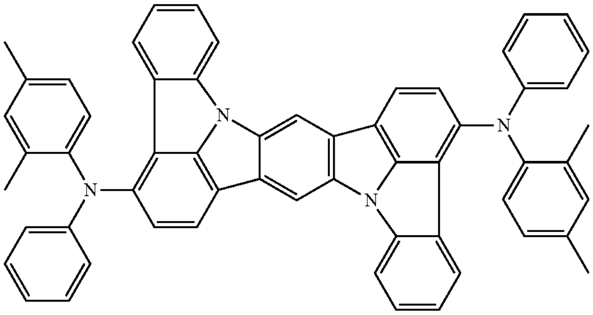
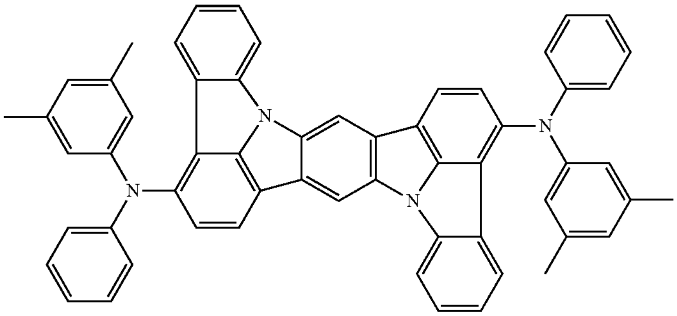
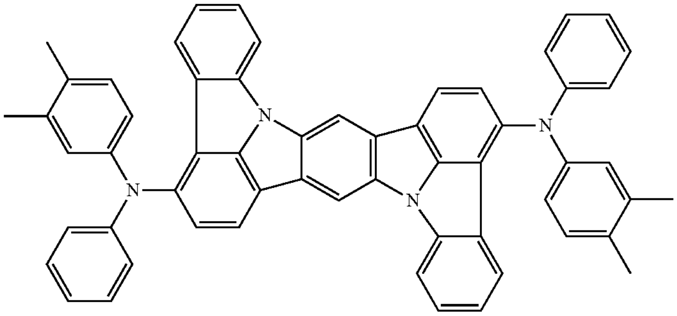

-continued
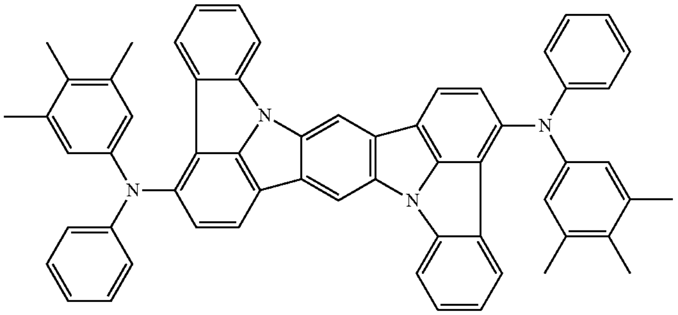
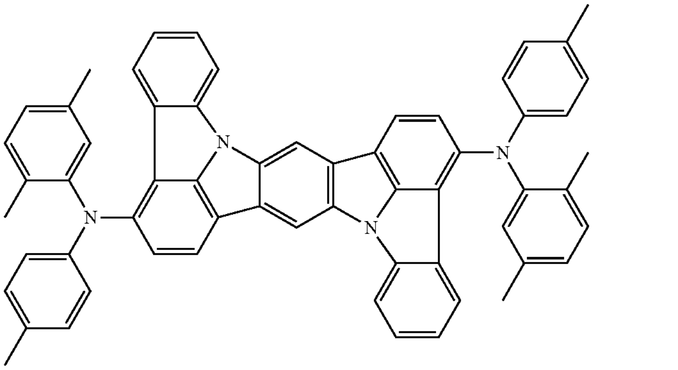
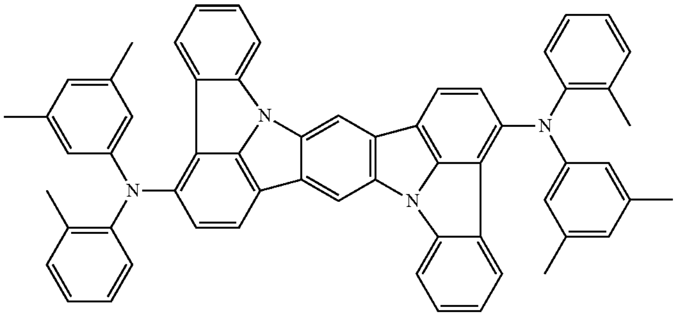
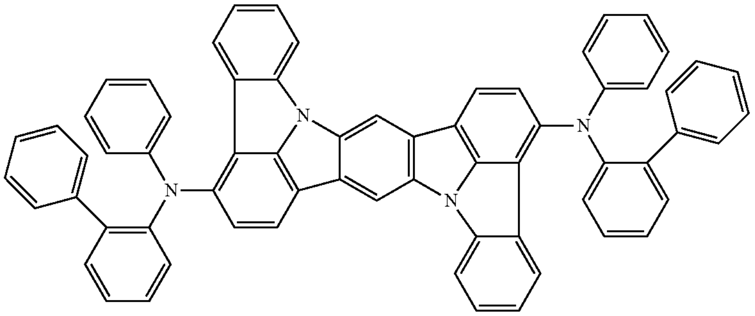
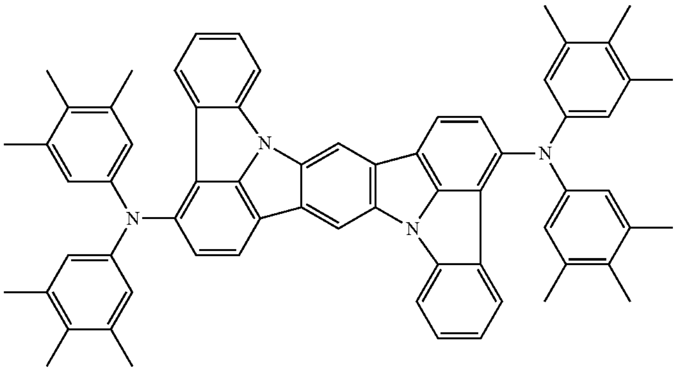

-continued
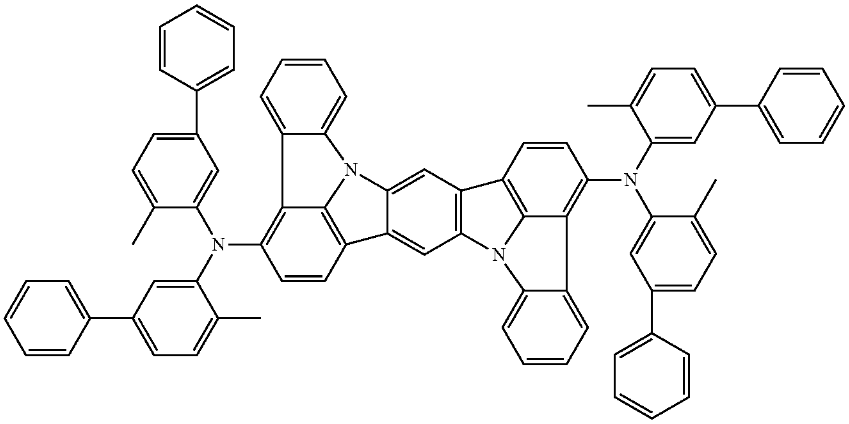
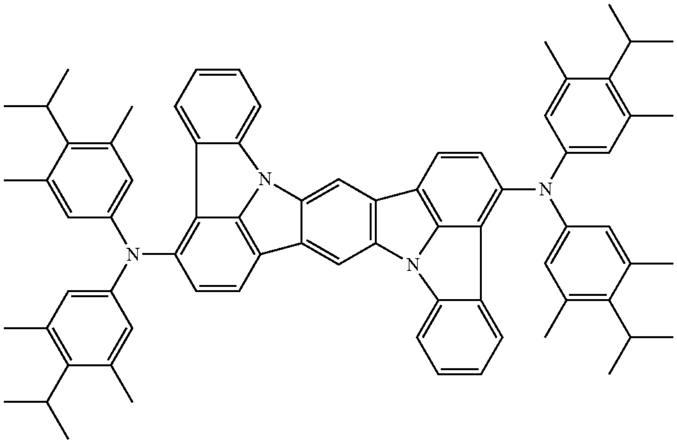
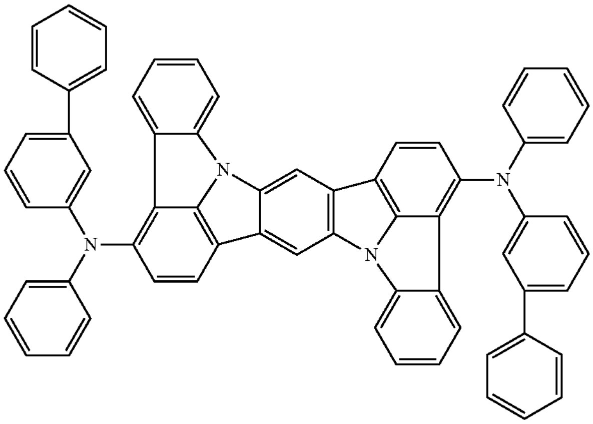
[Formula 293]
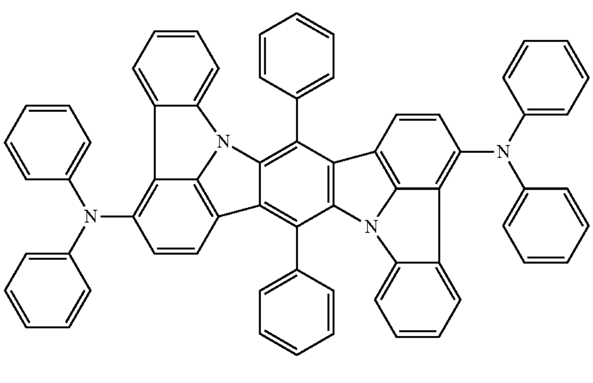
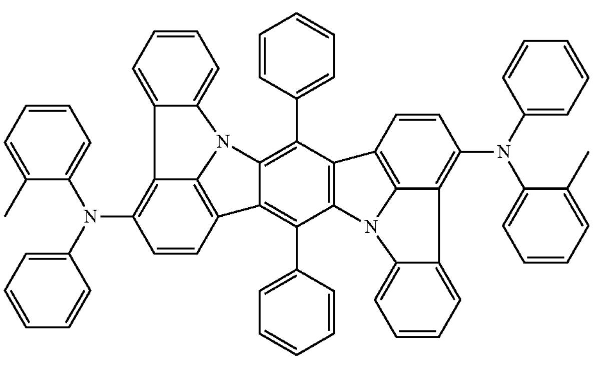

-continued
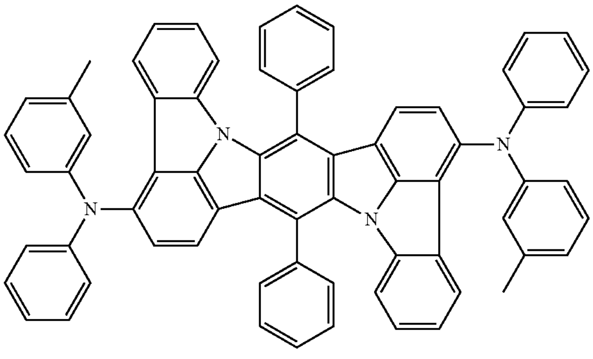
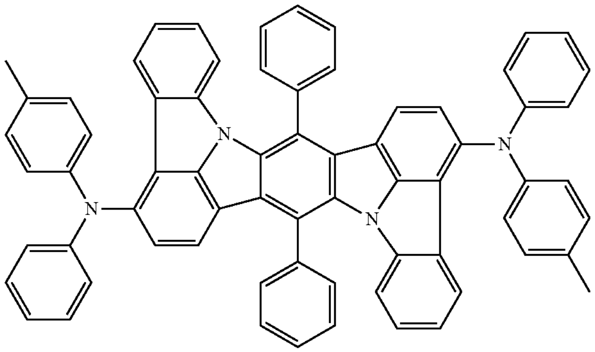
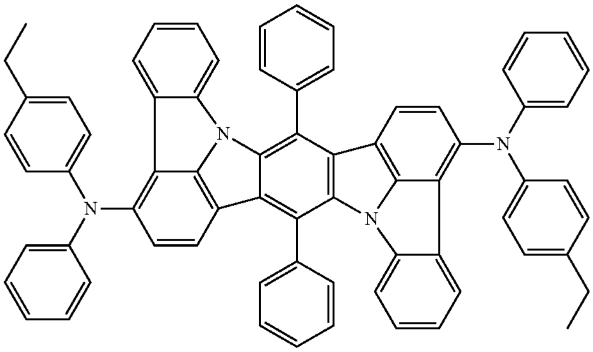
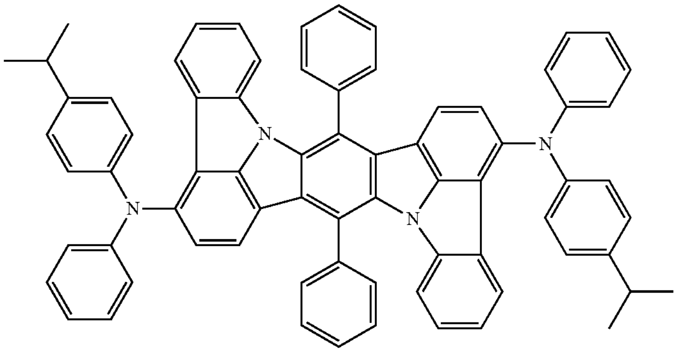
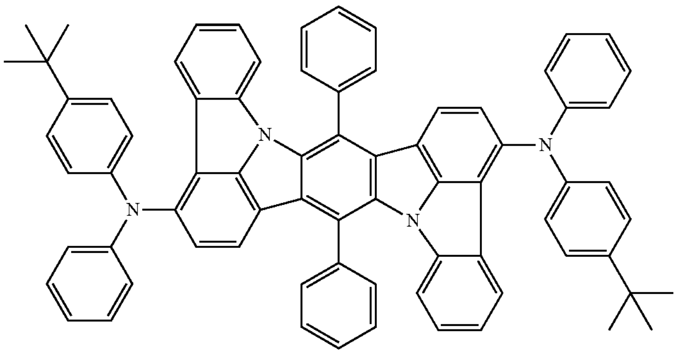

-continued
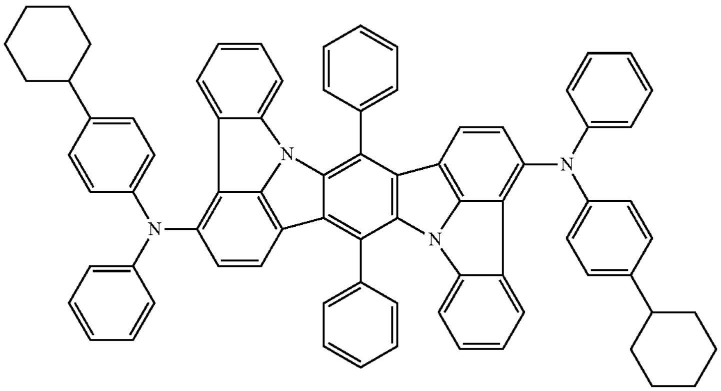
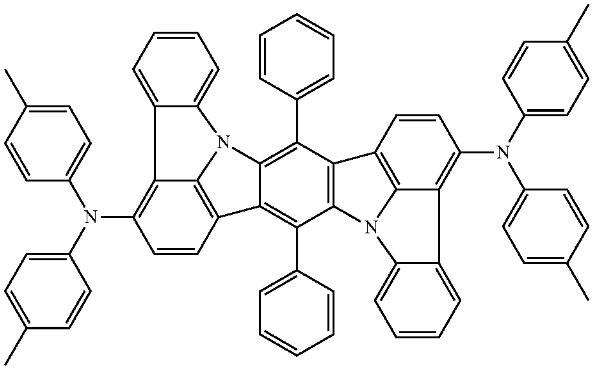
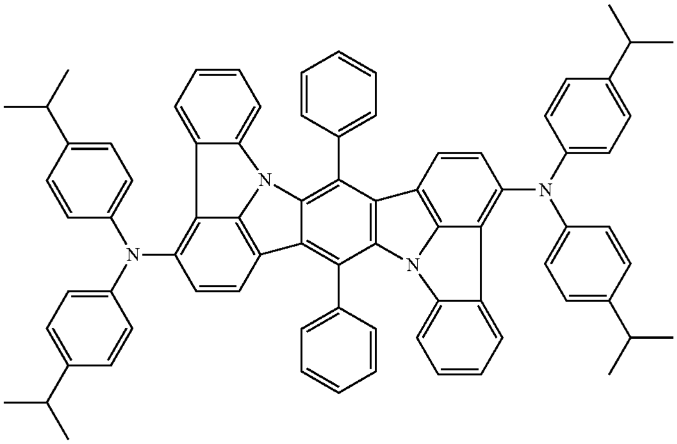
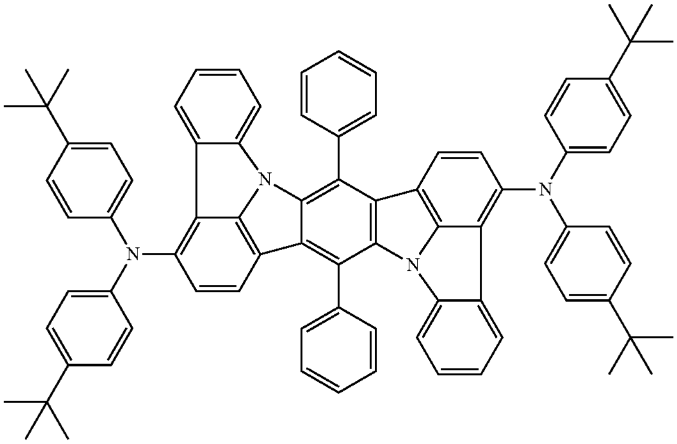

-continued
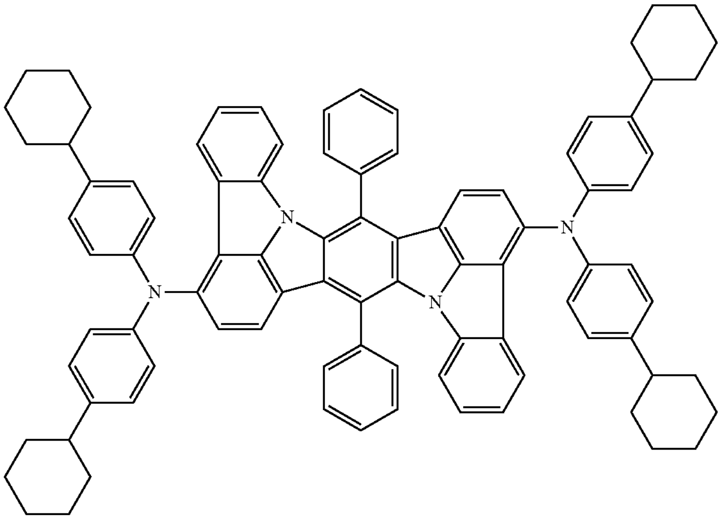
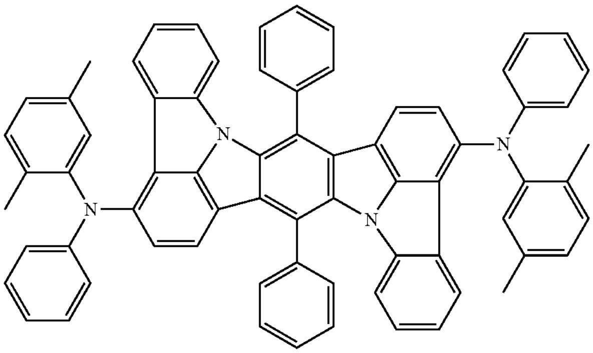
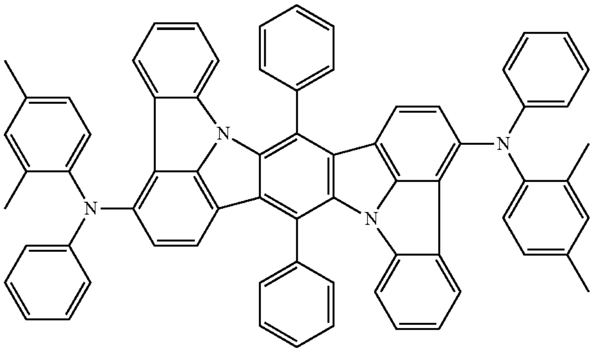
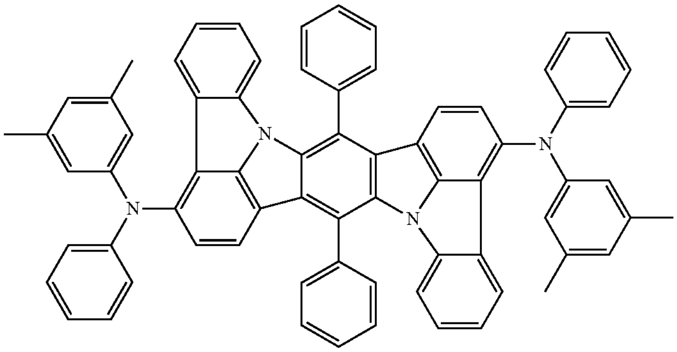

-continued
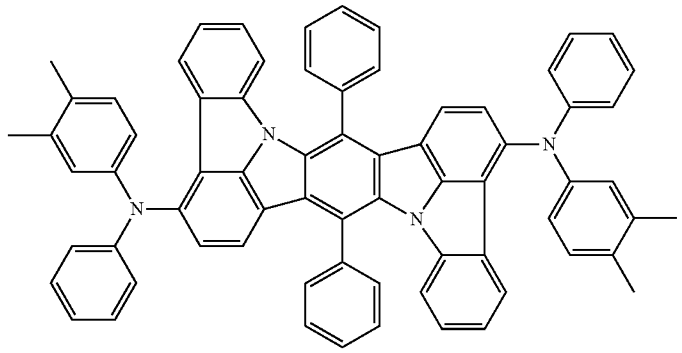
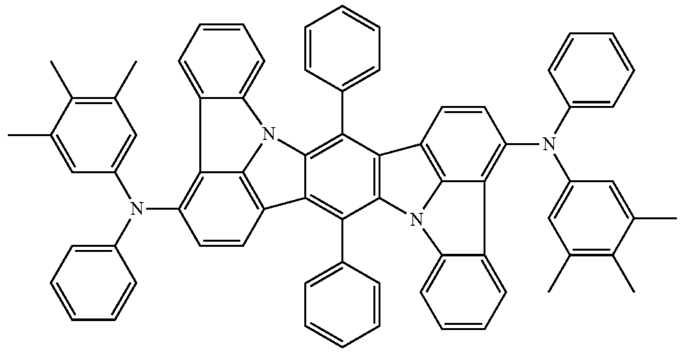
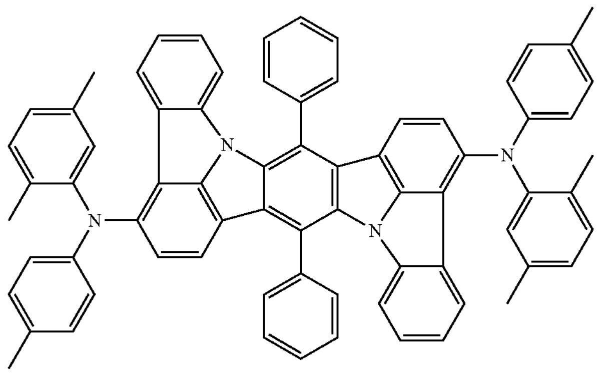
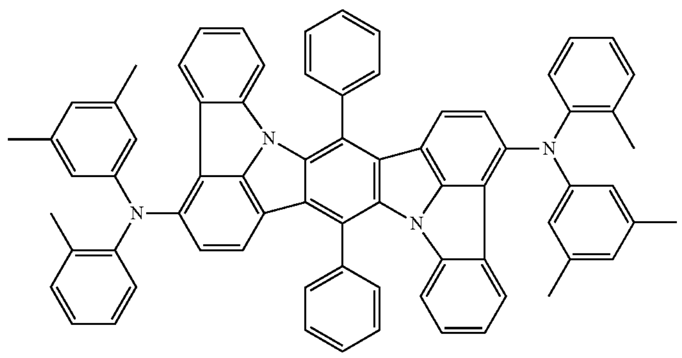

-continued
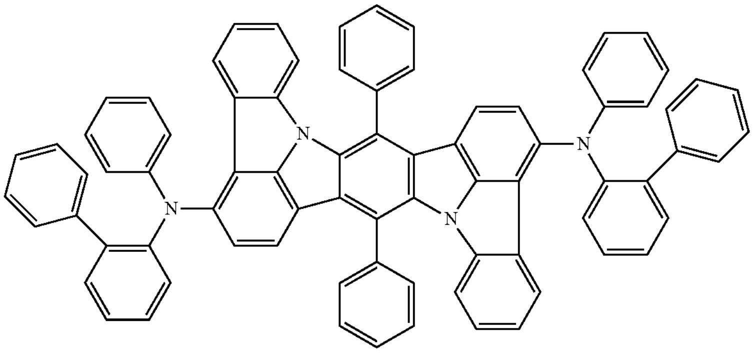
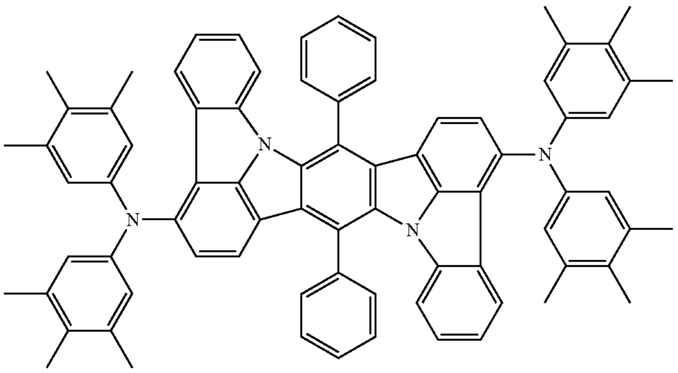
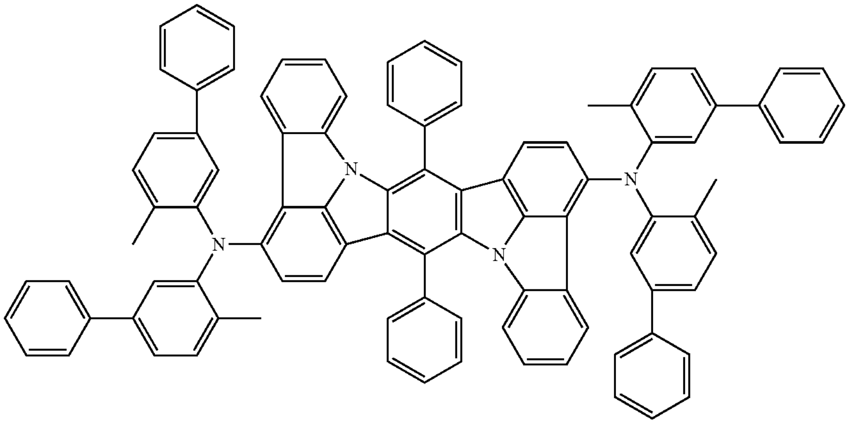
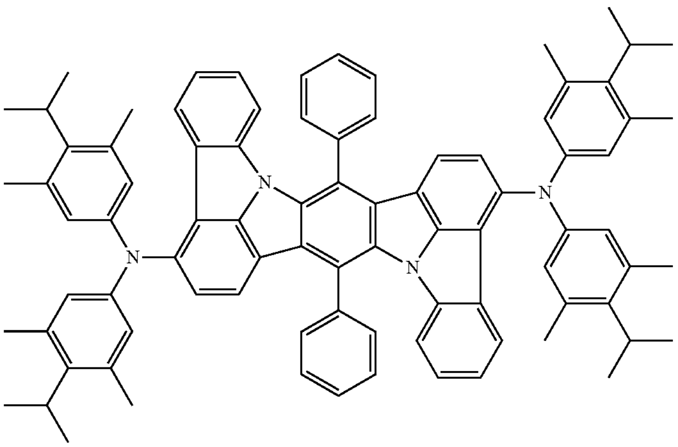

-continued
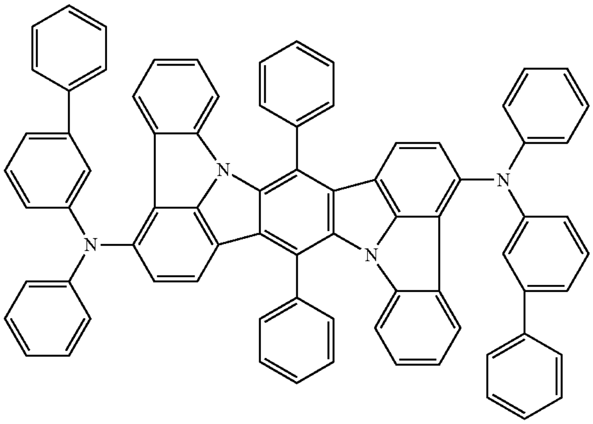
[Formula 294]
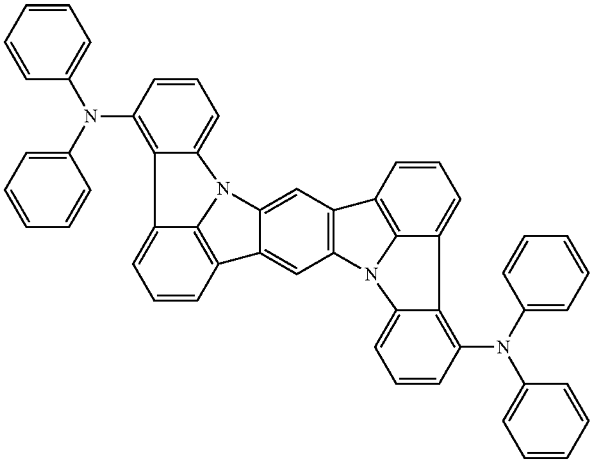
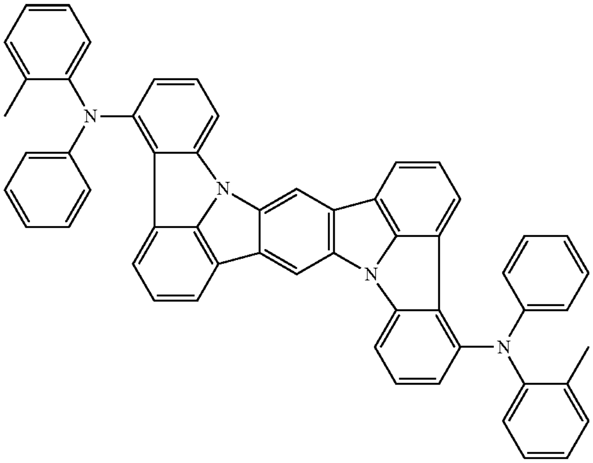
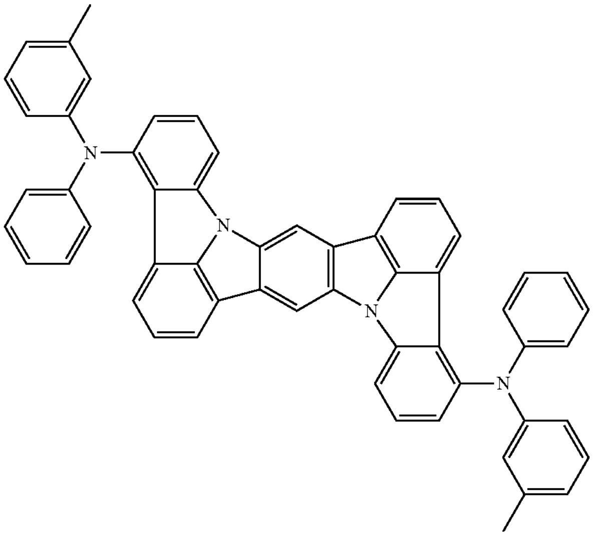

-continued
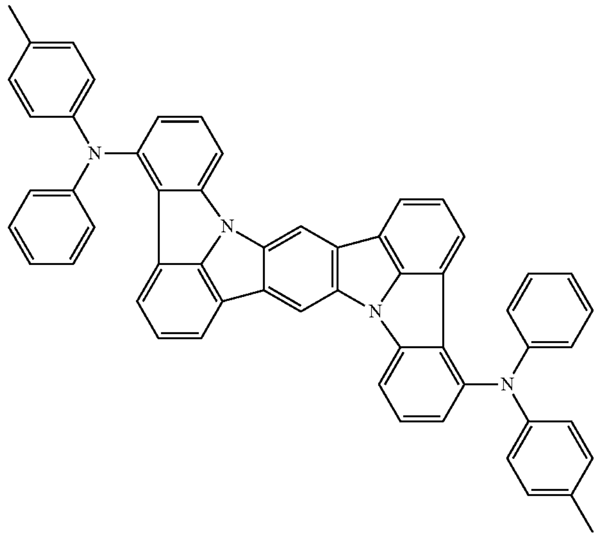
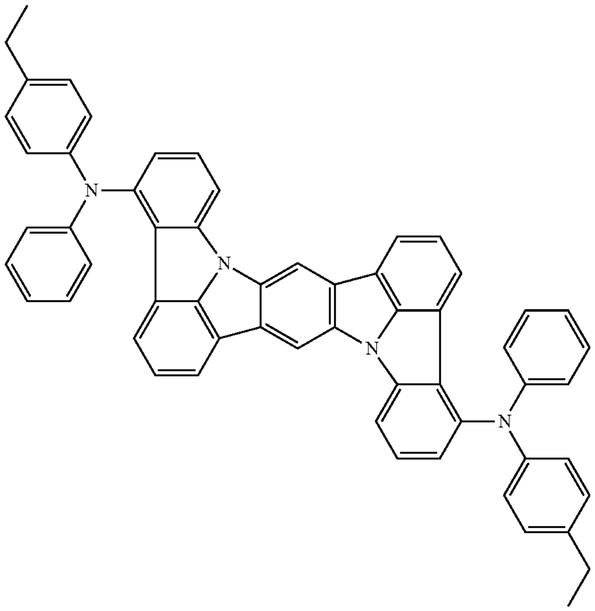
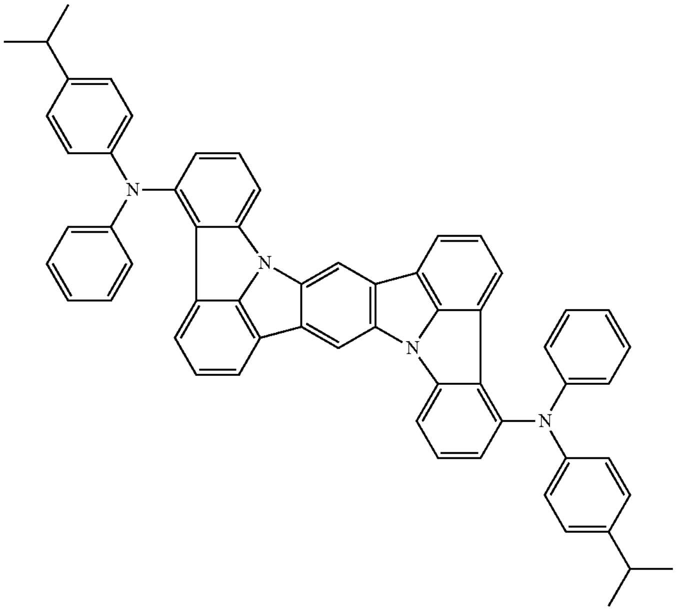

-continued
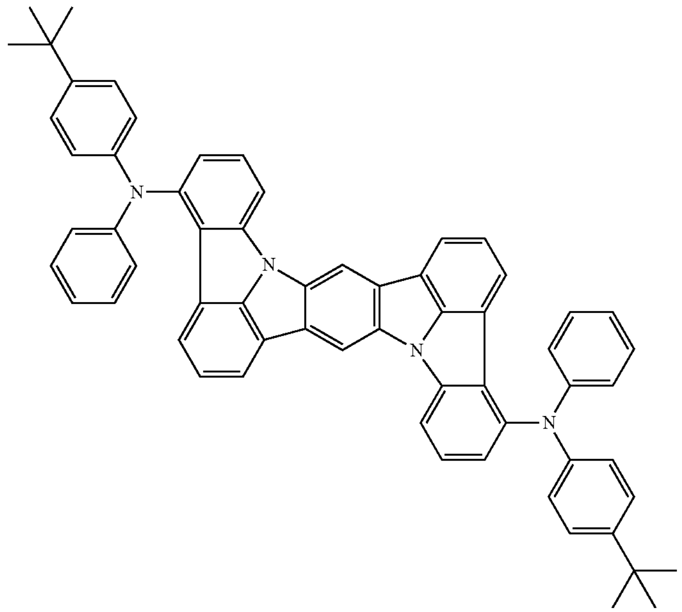
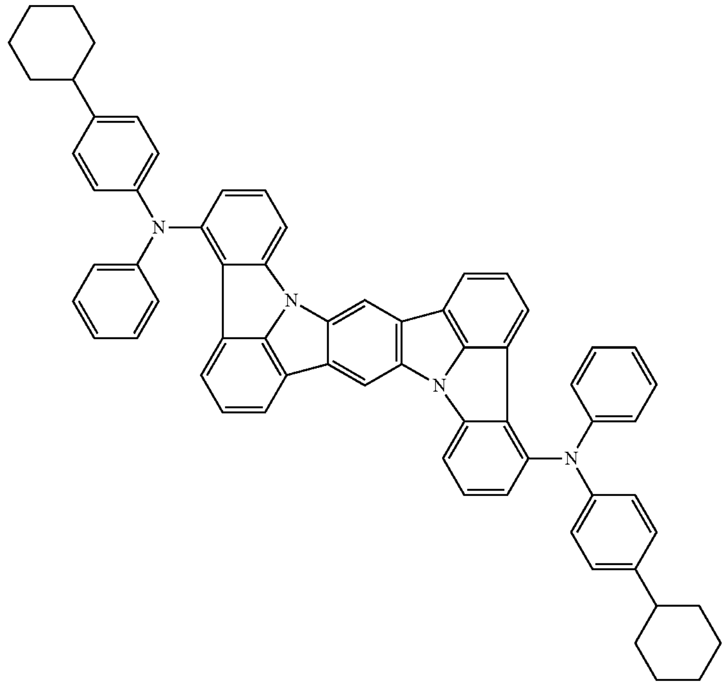

-continued
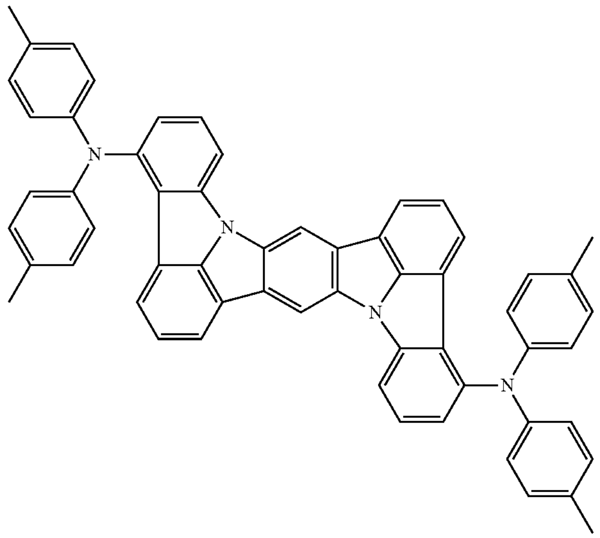
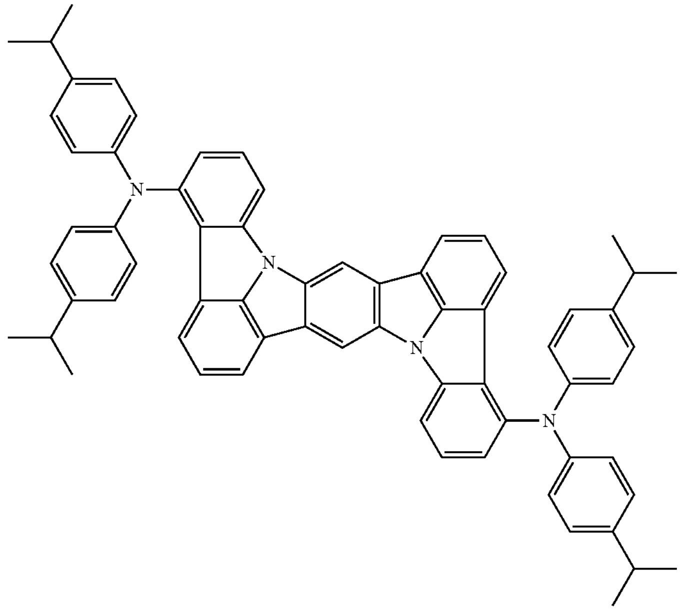

-continued
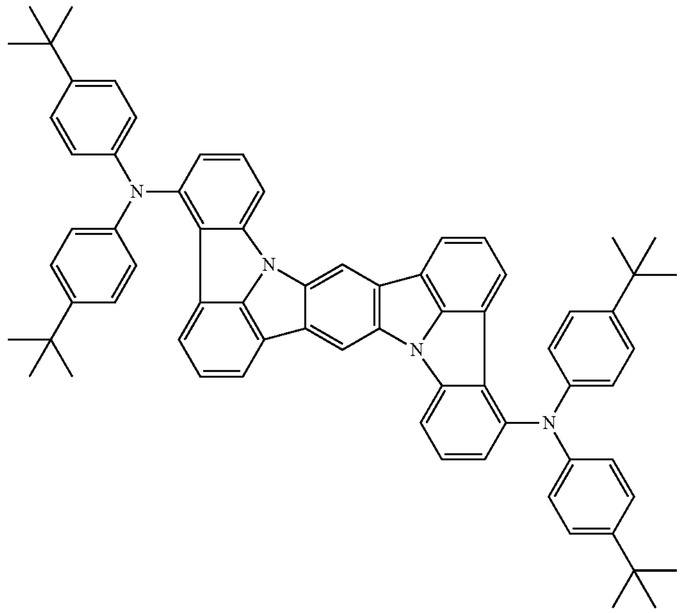
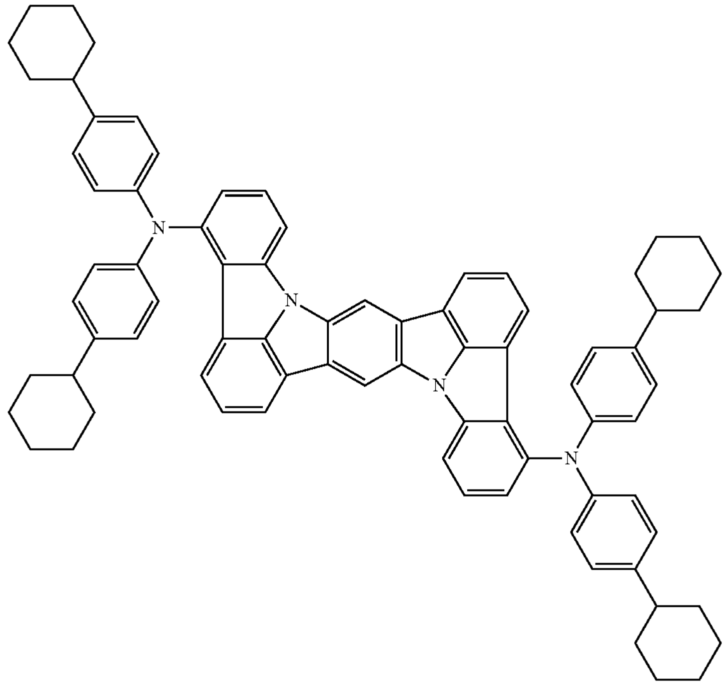

-continued
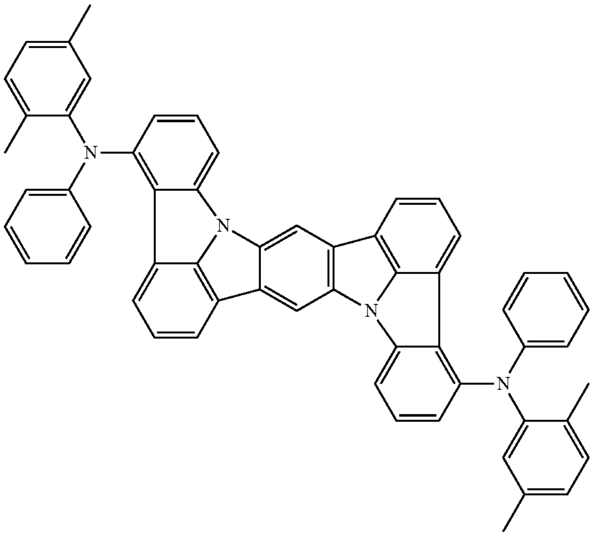
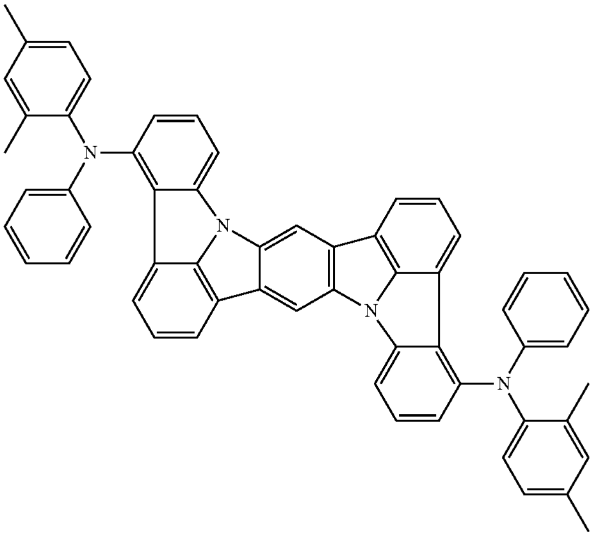
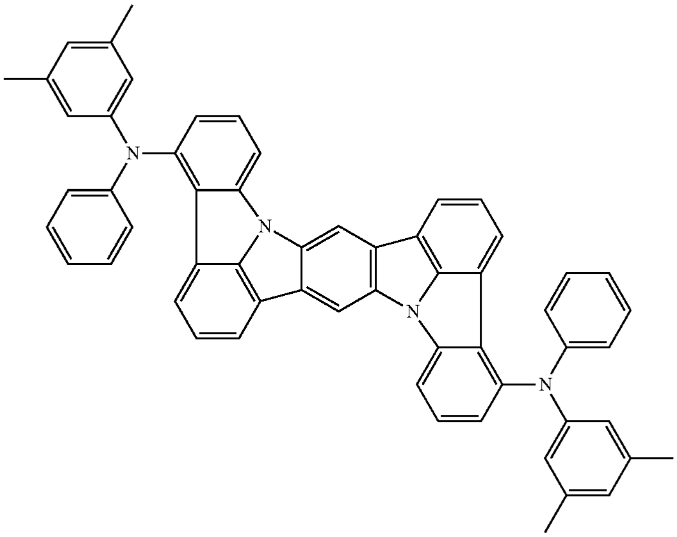
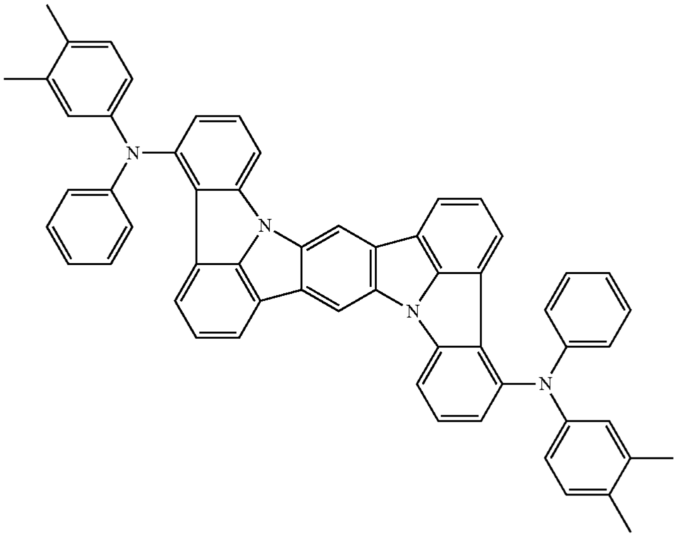

-continued
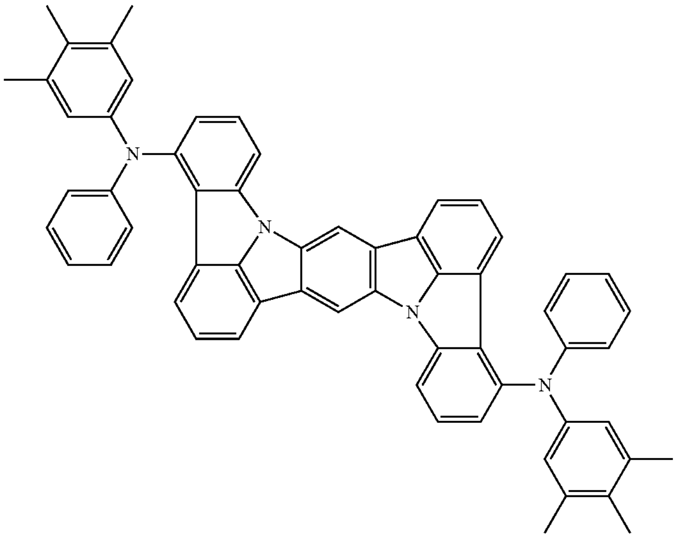
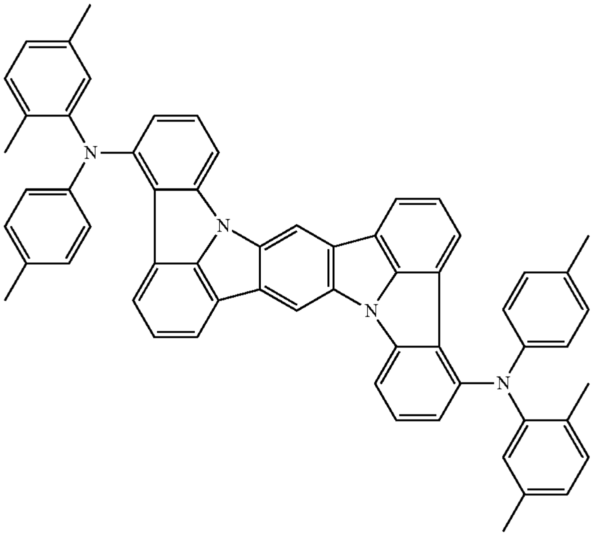
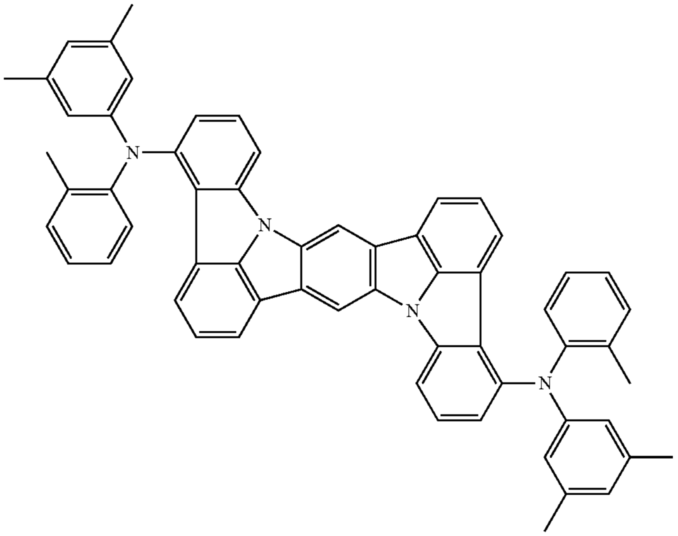

-continued
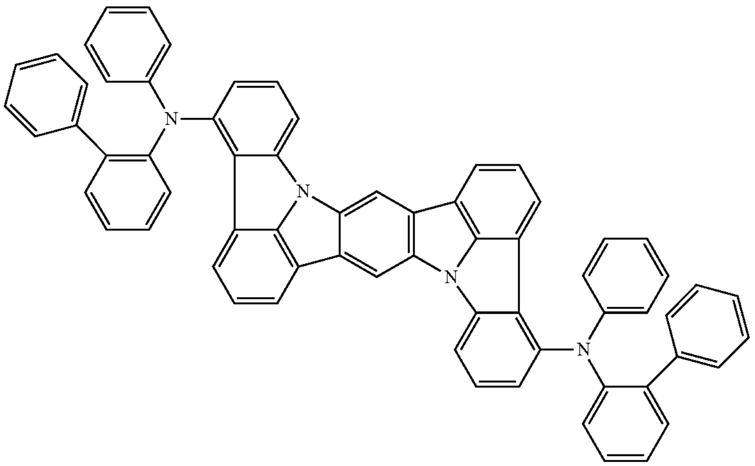
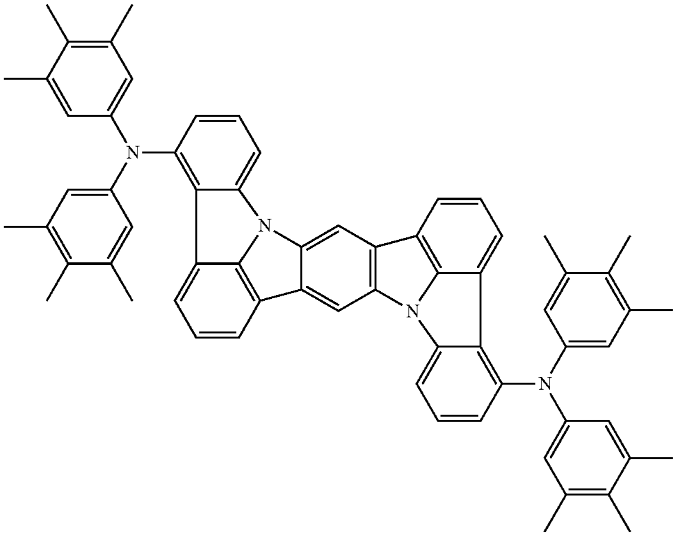
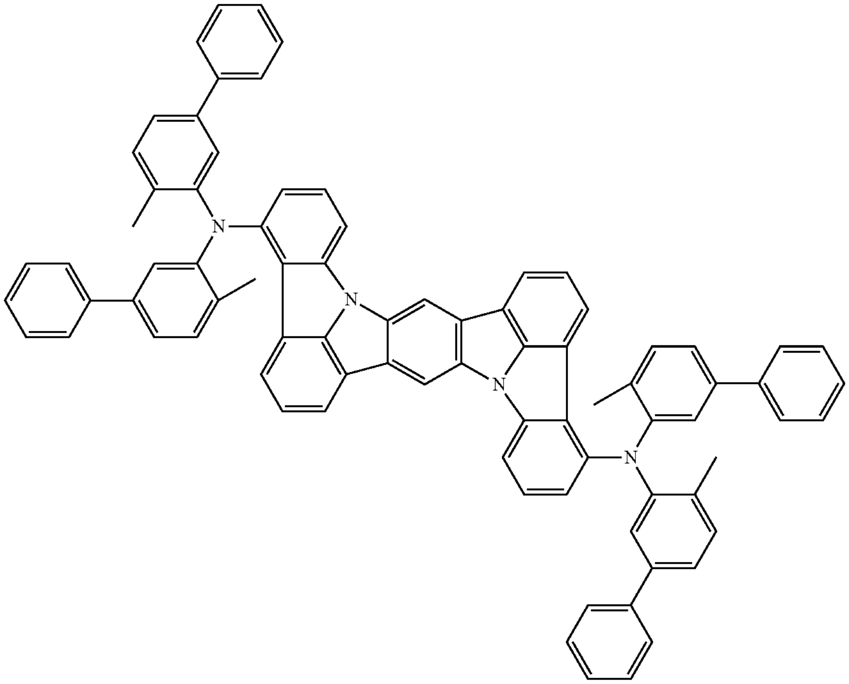

-continued
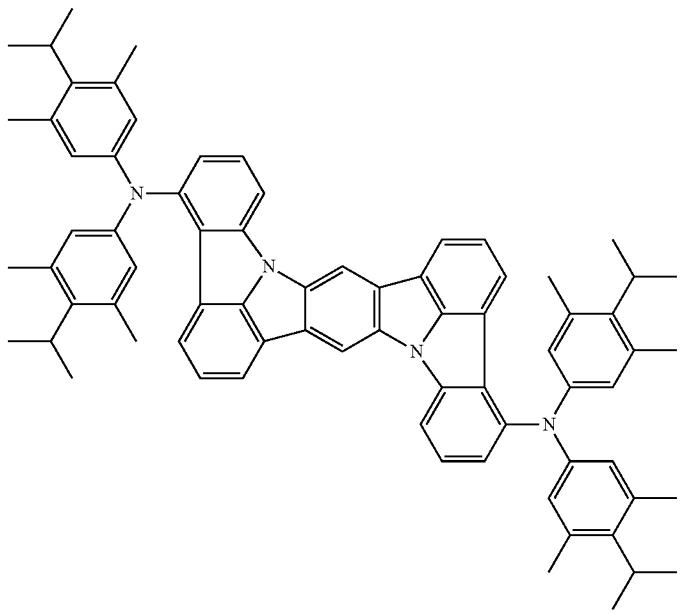
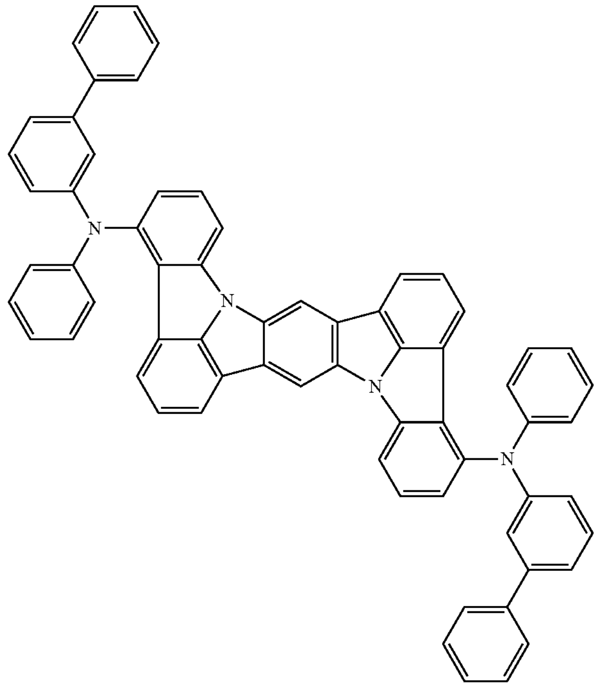

-continued
[Formula 295]
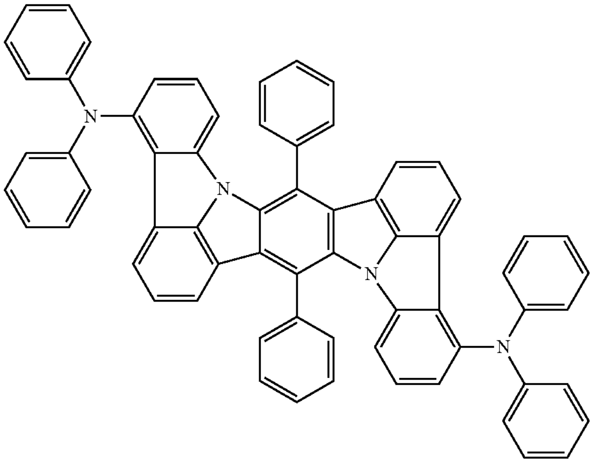
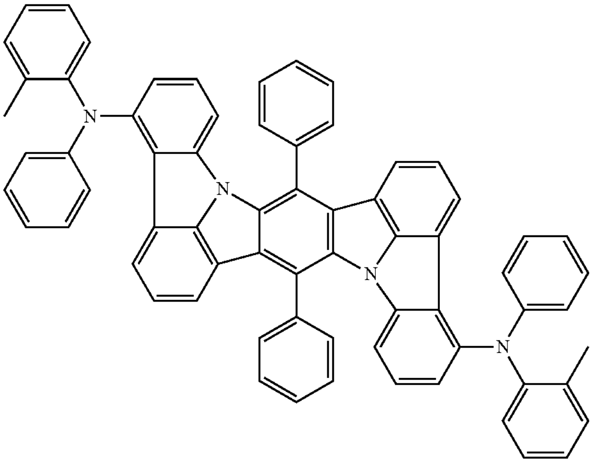
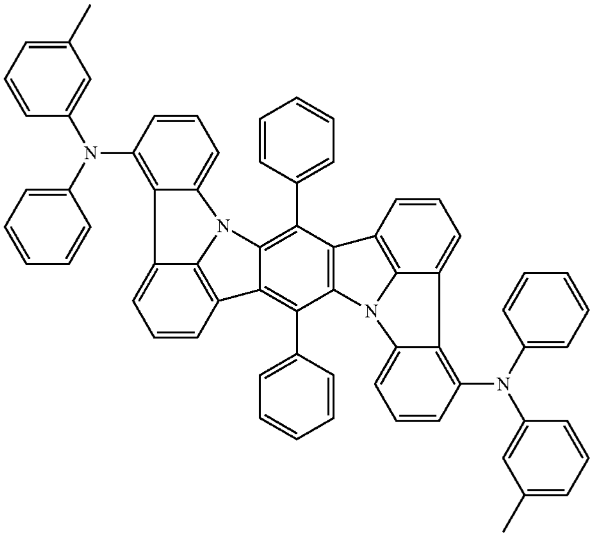
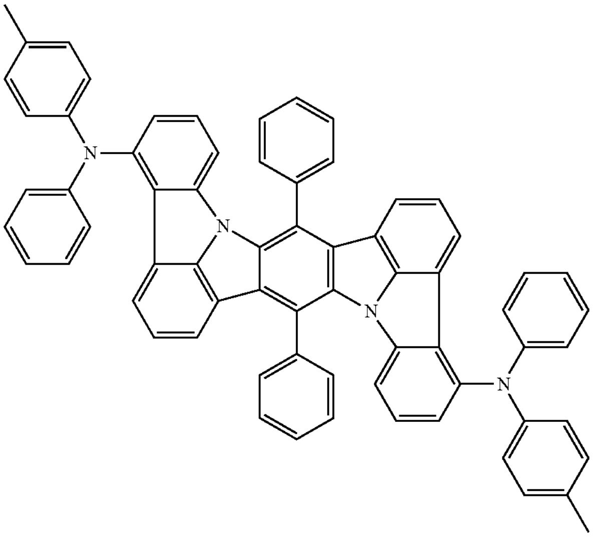
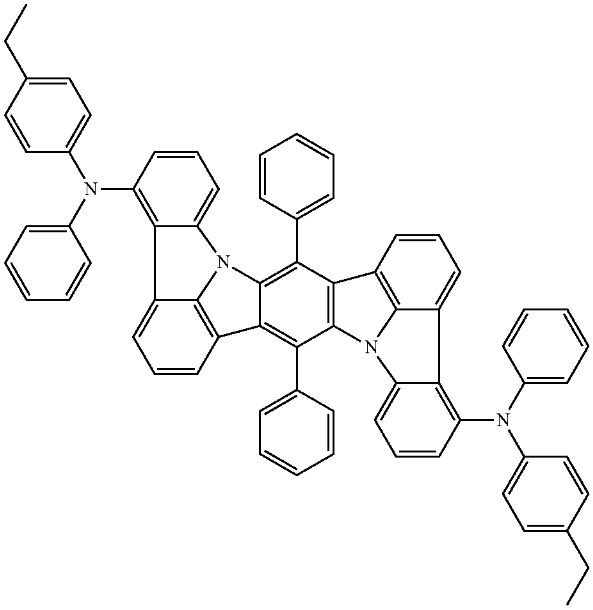

-continued
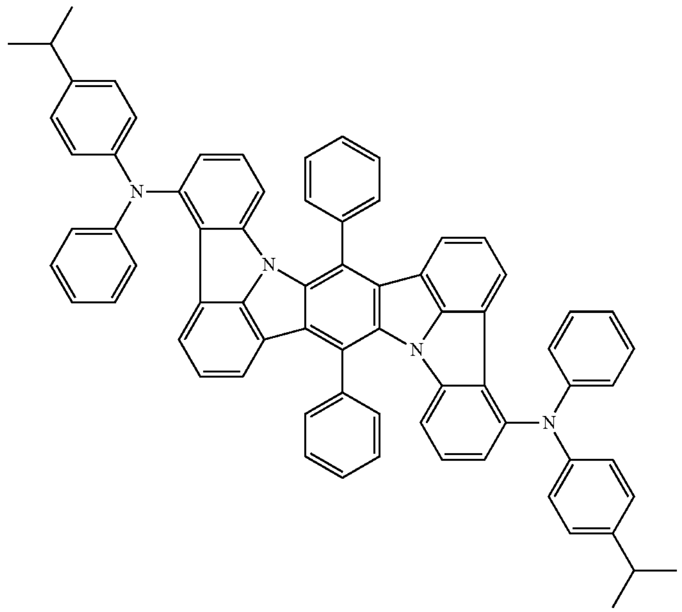
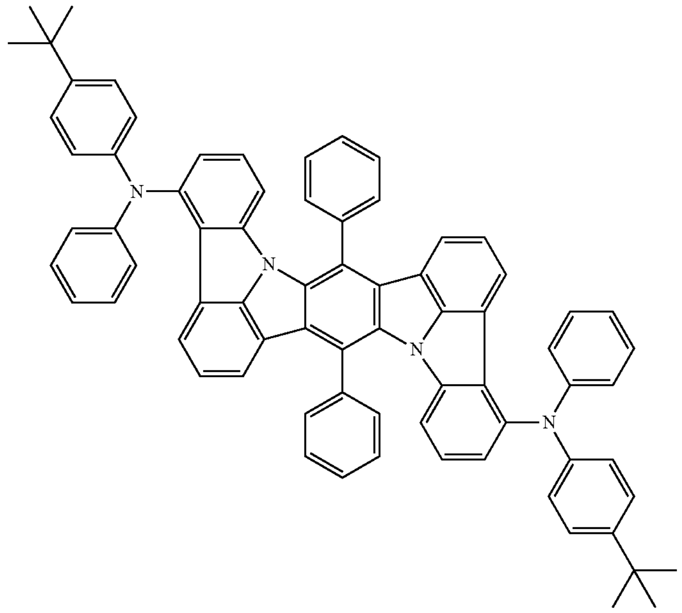

-continued
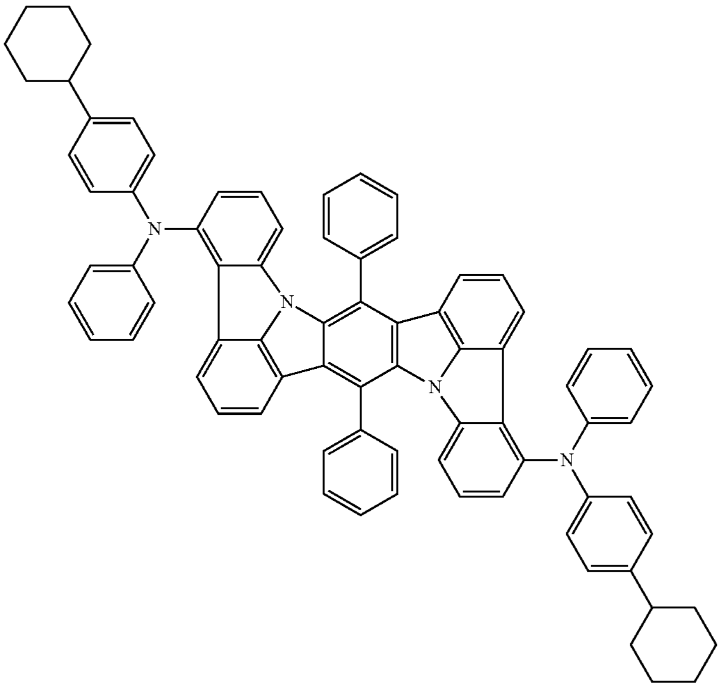
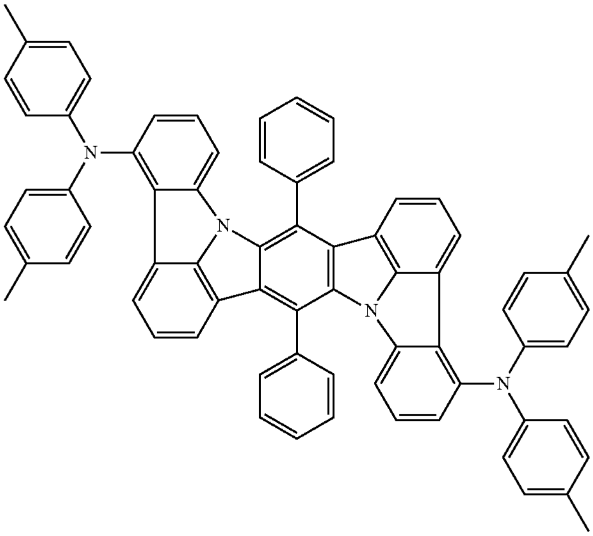

-continued
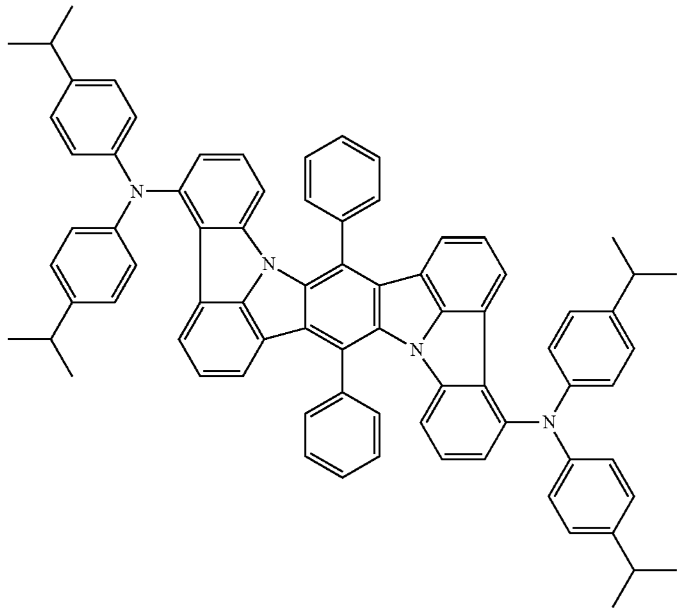
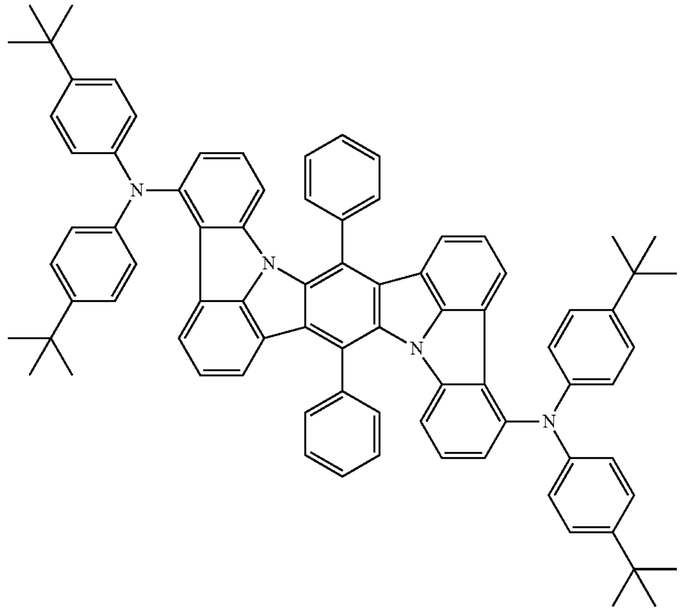

-continued
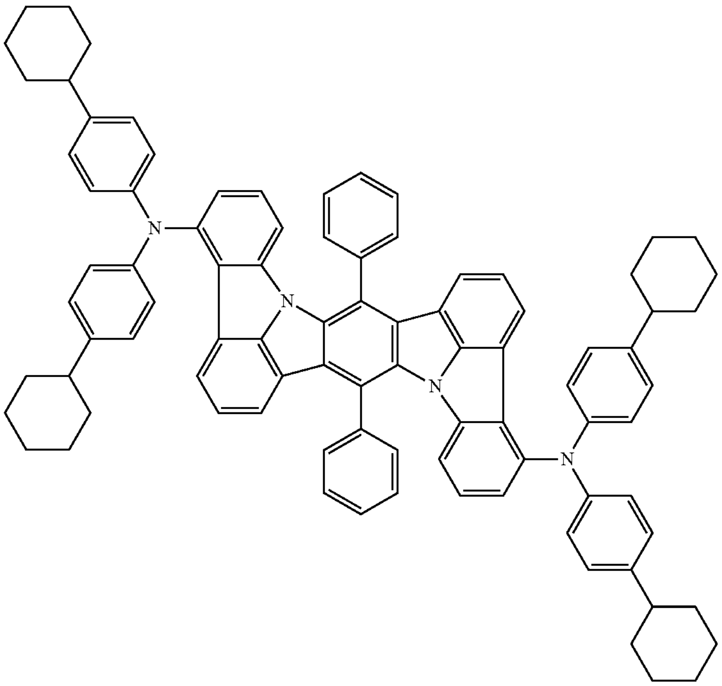
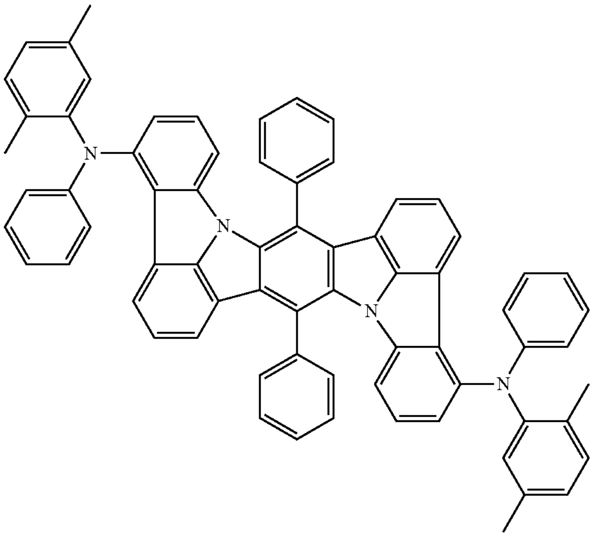

-continued
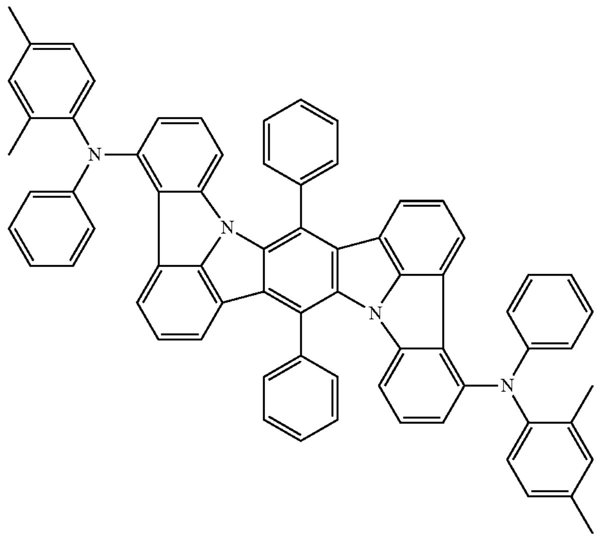
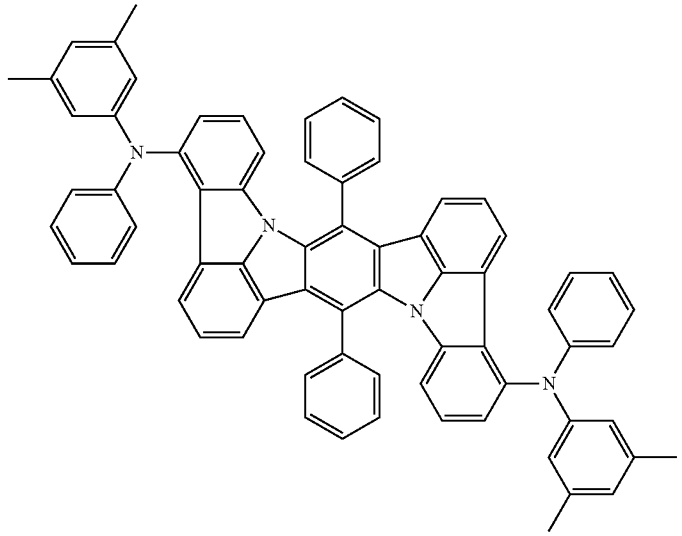
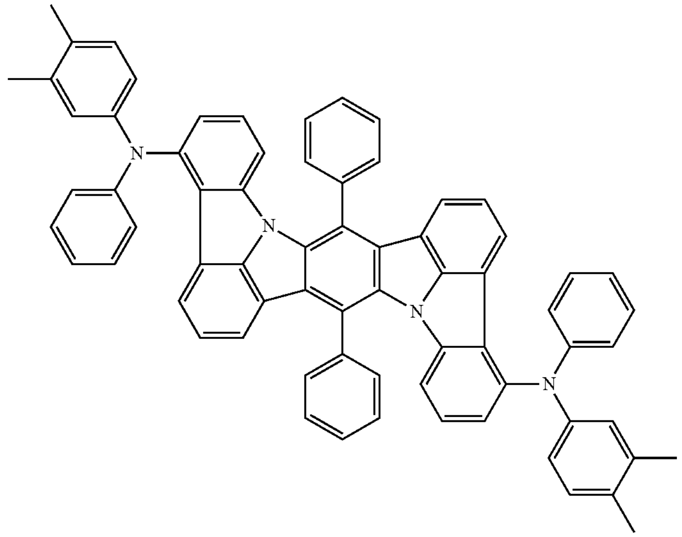

-continued
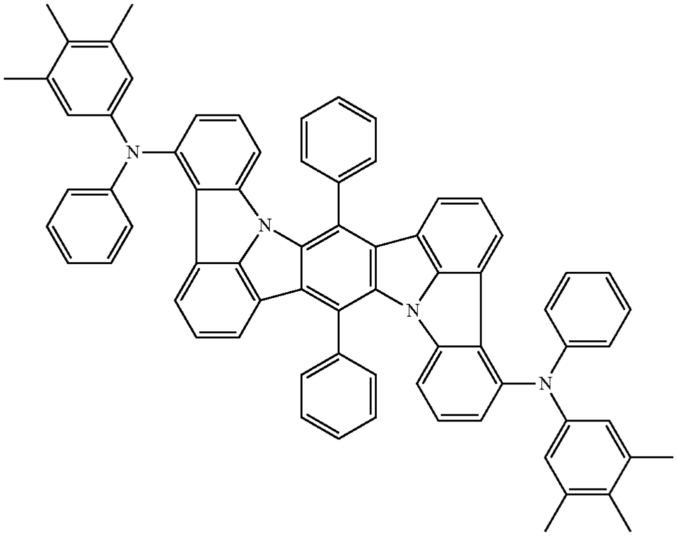
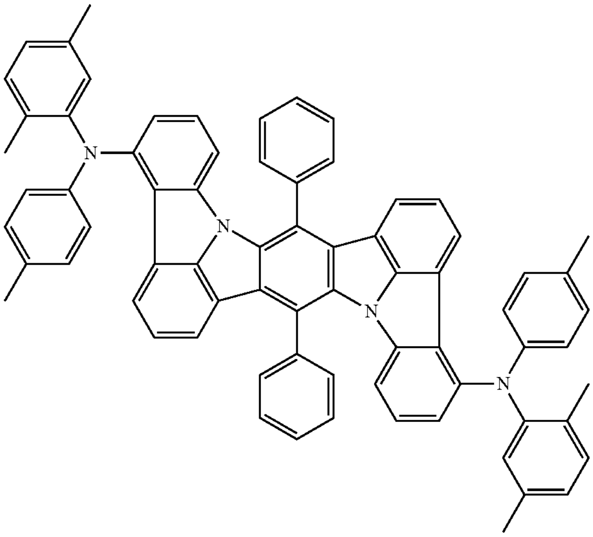
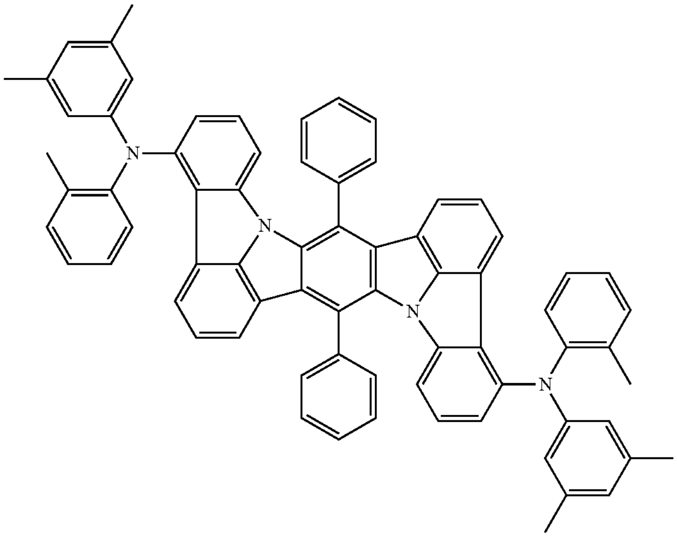

-continued
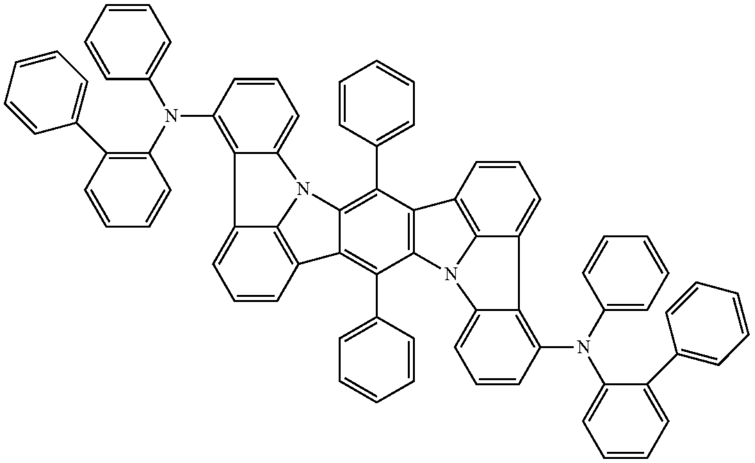
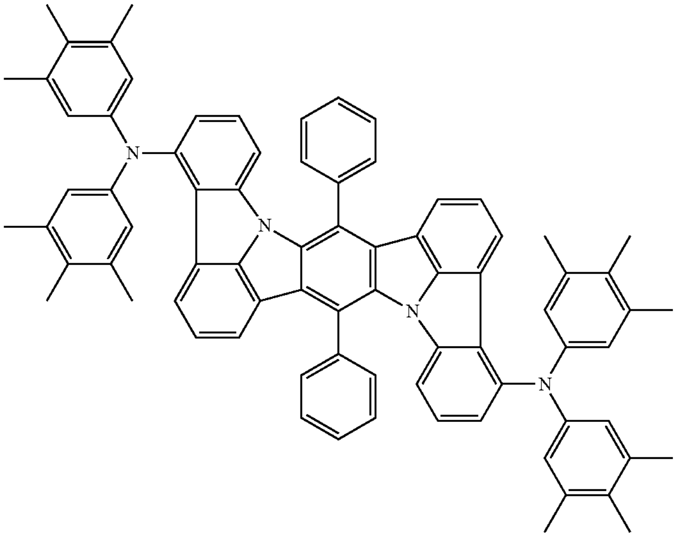
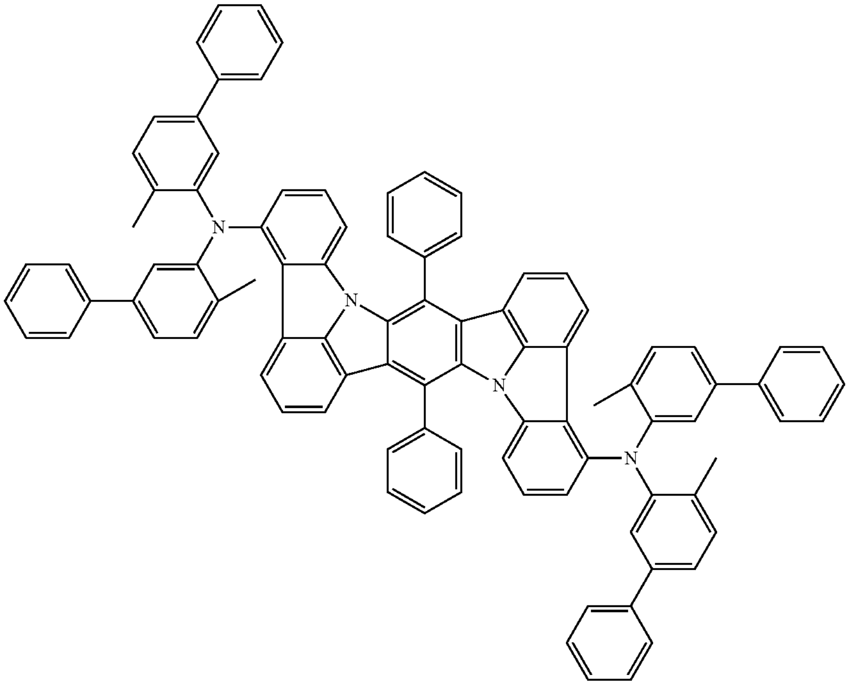

-continued
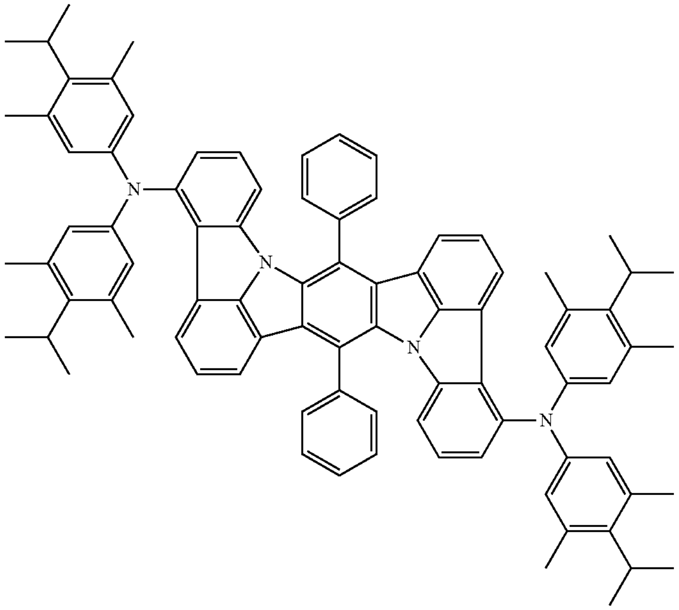
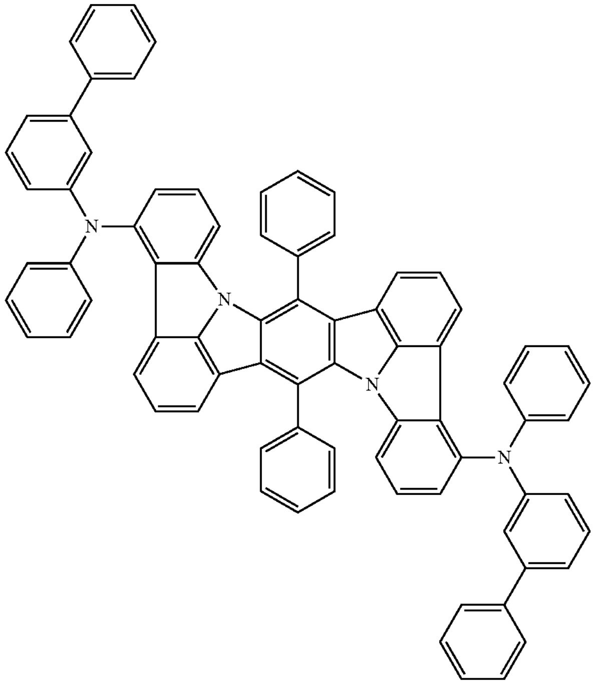

[Formula 296]
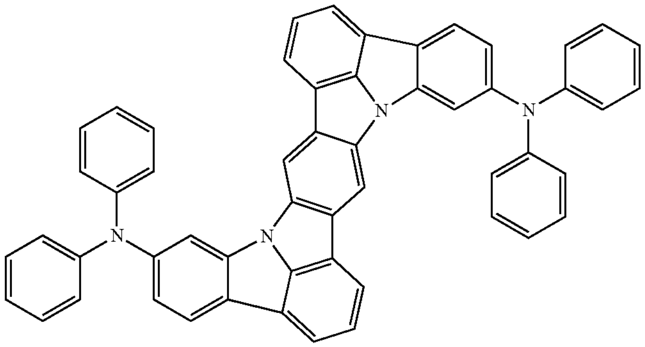
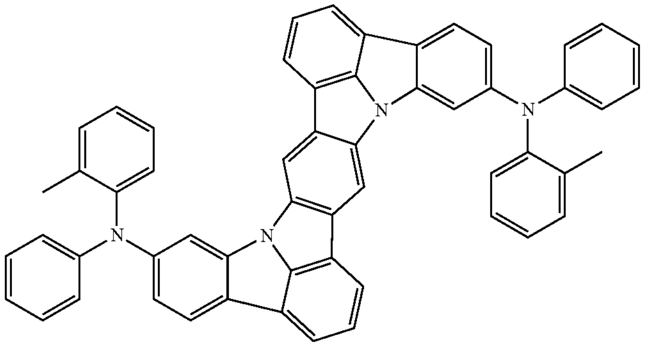
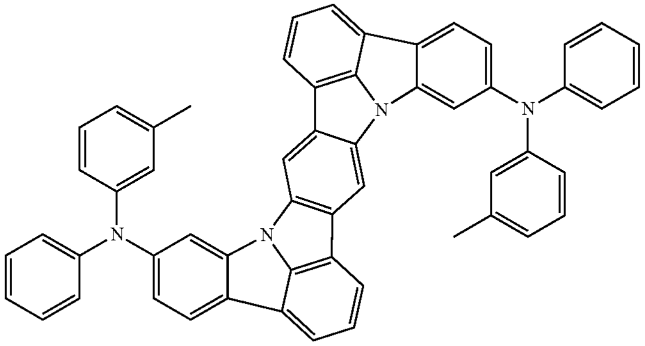
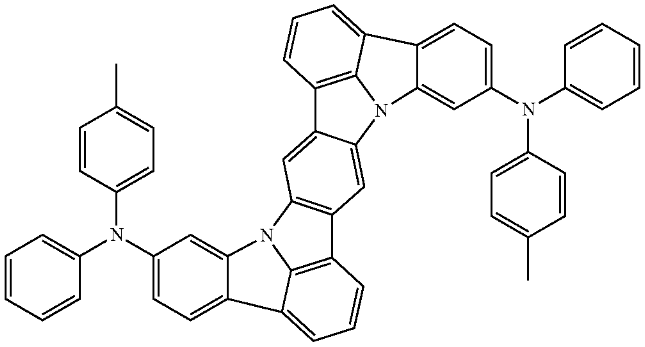

-continued
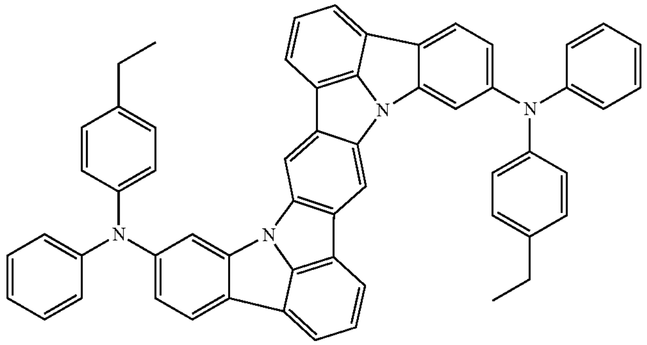
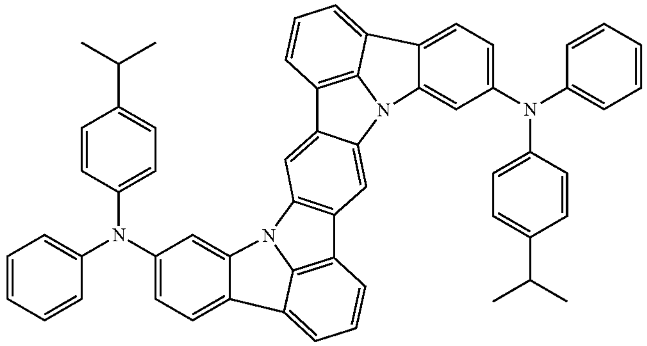
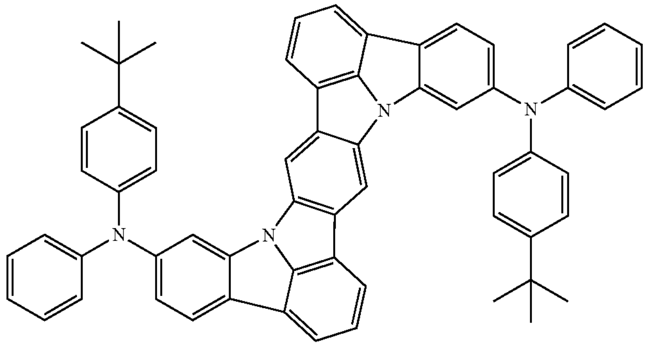
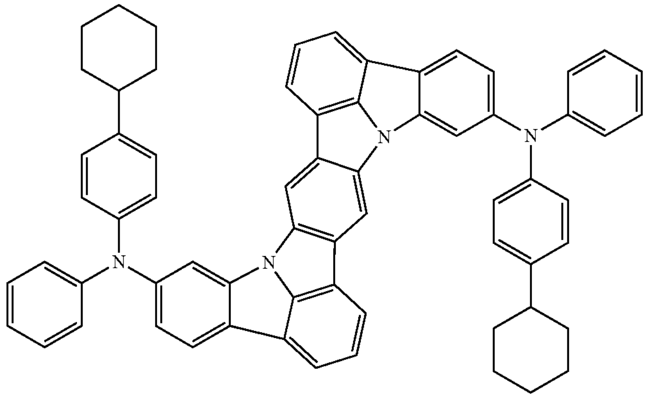

-continued
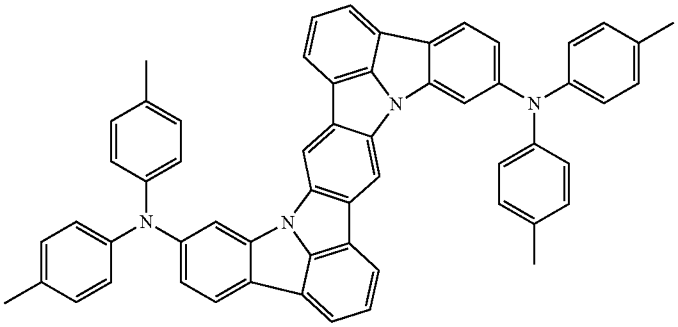
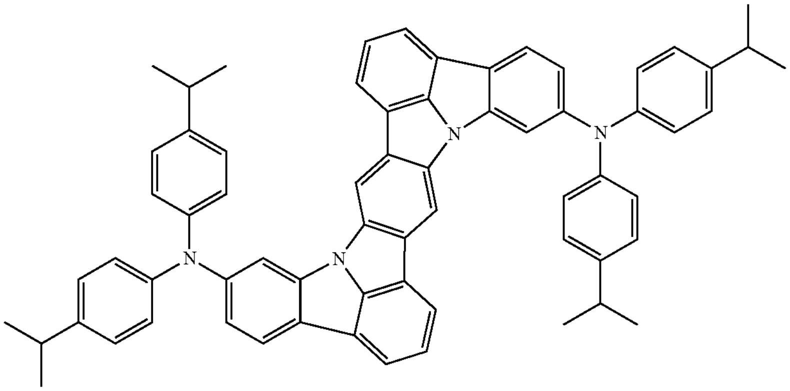
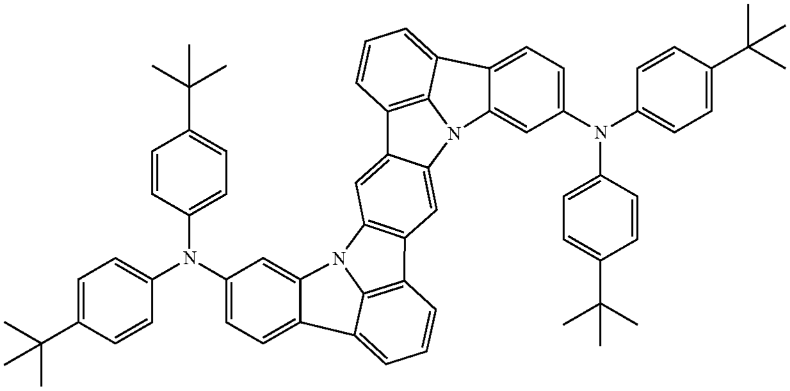
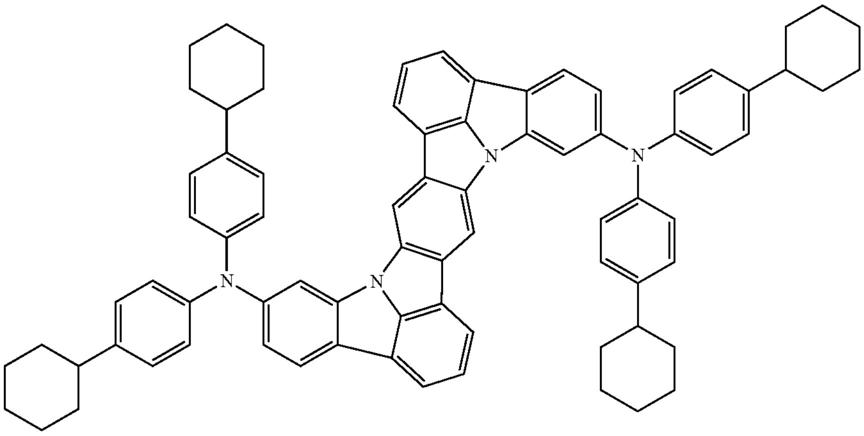

-continued
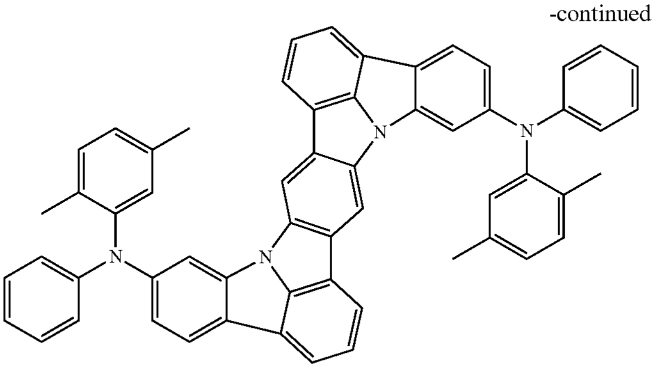
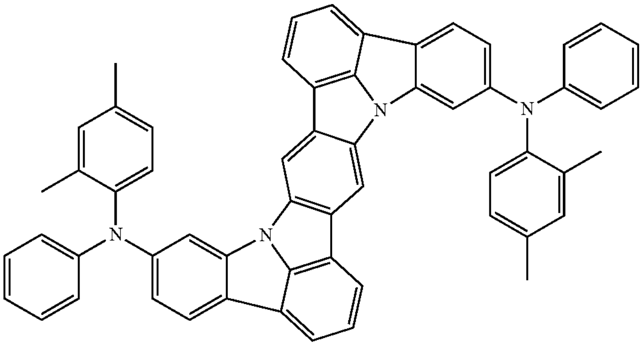
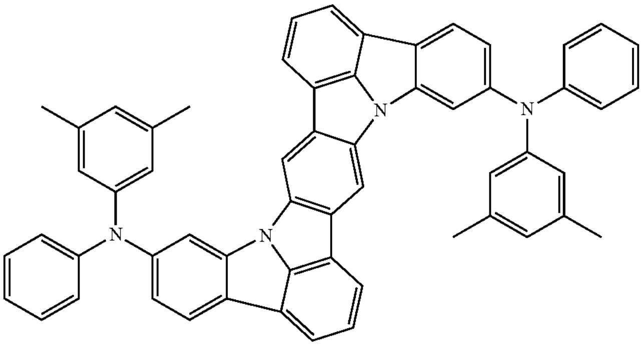
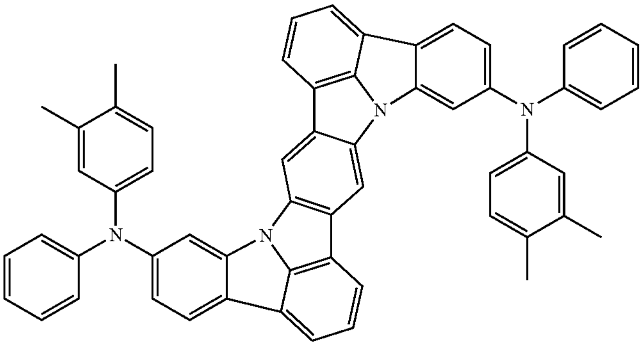
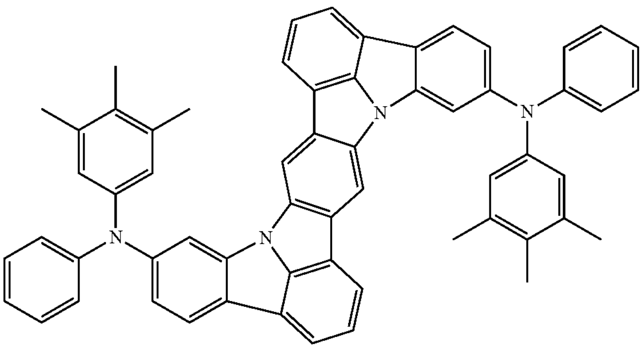

-continued
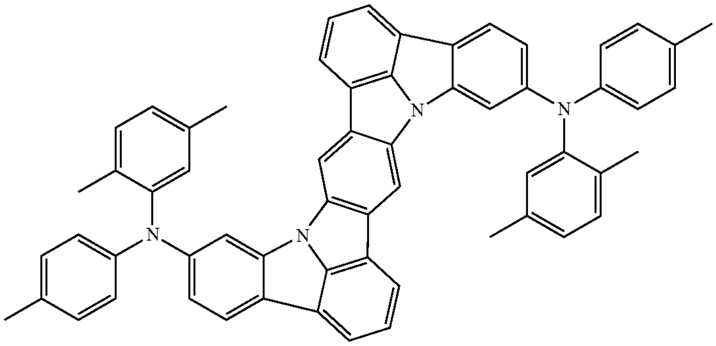
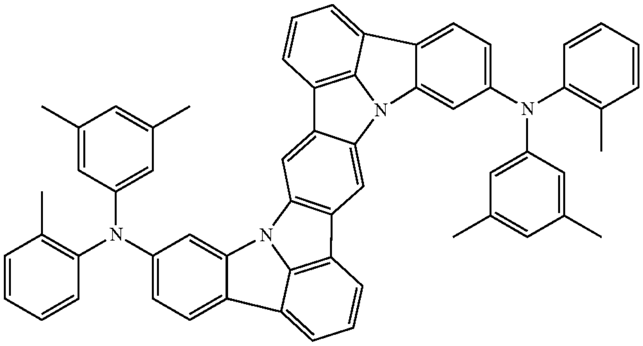
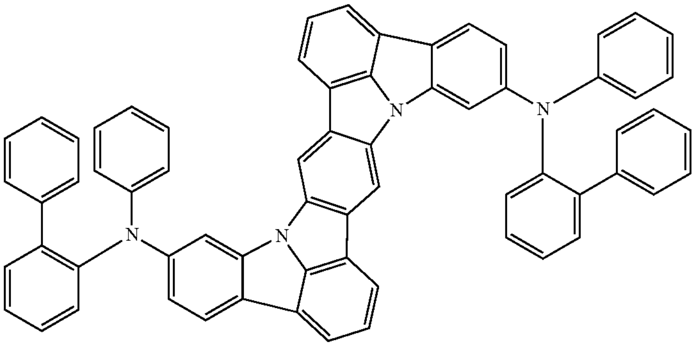
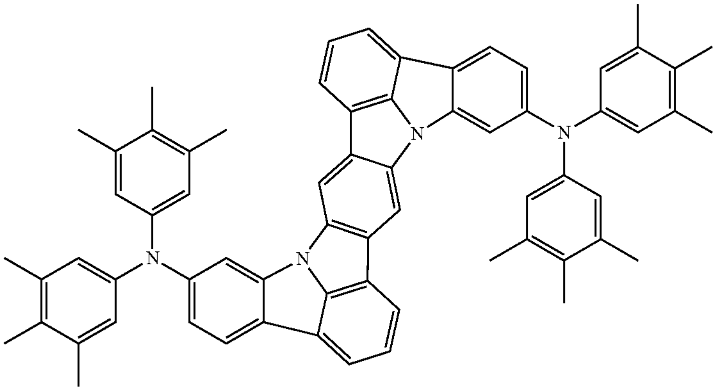

-continued
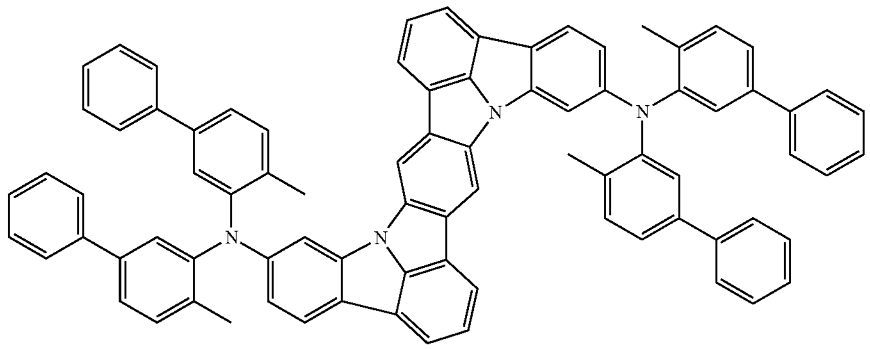
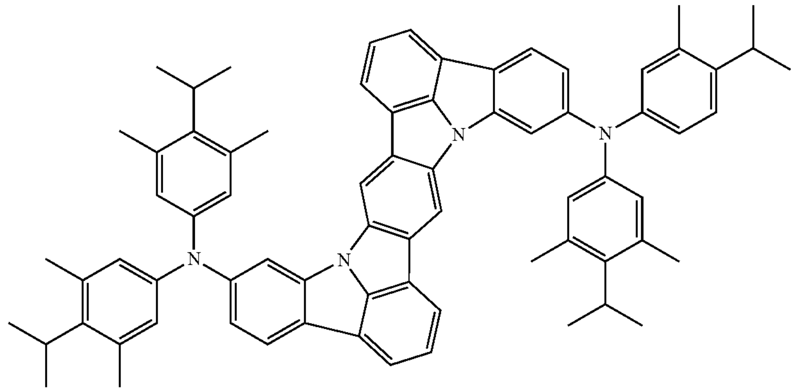
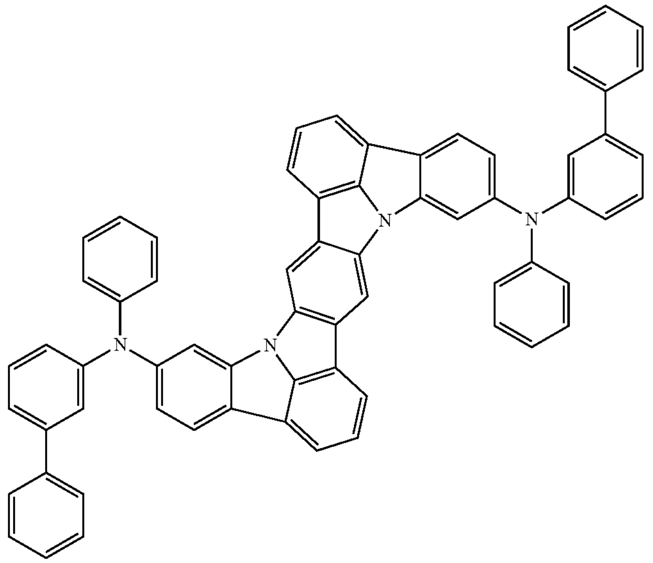

-continued
[Formula 297]
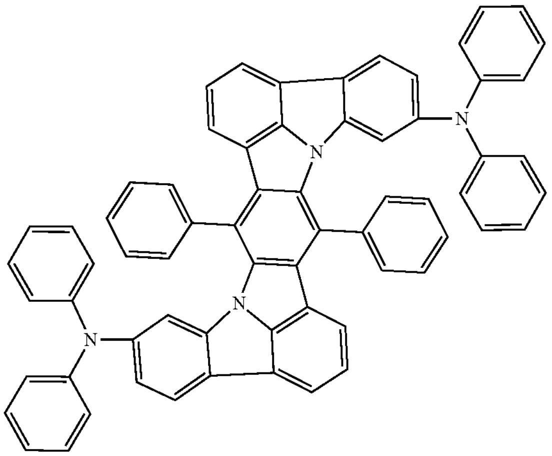
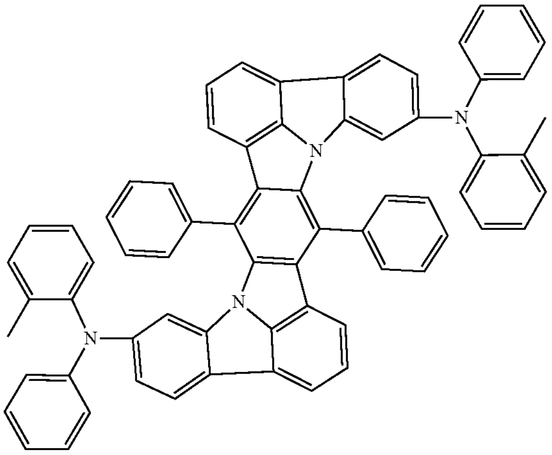
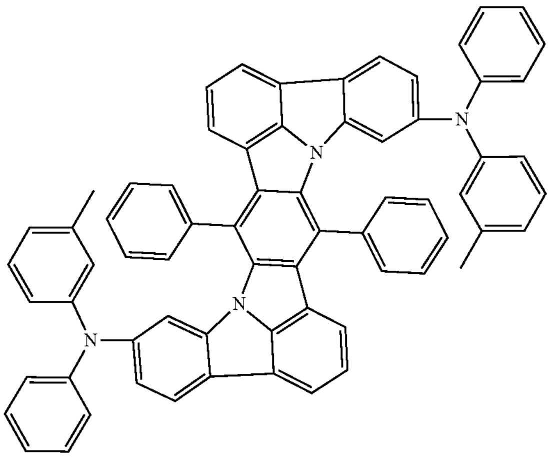
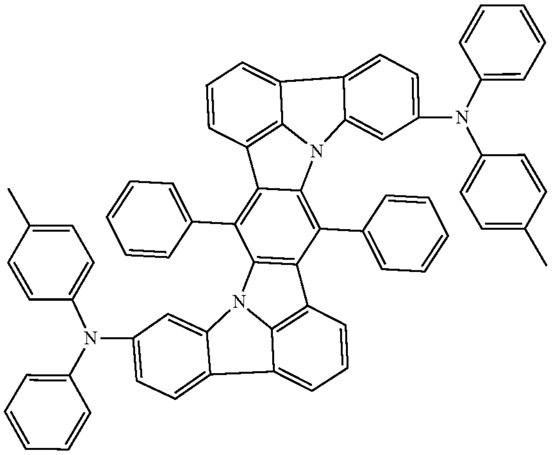
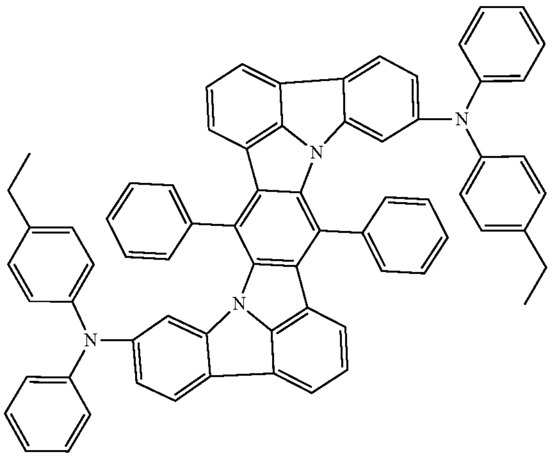
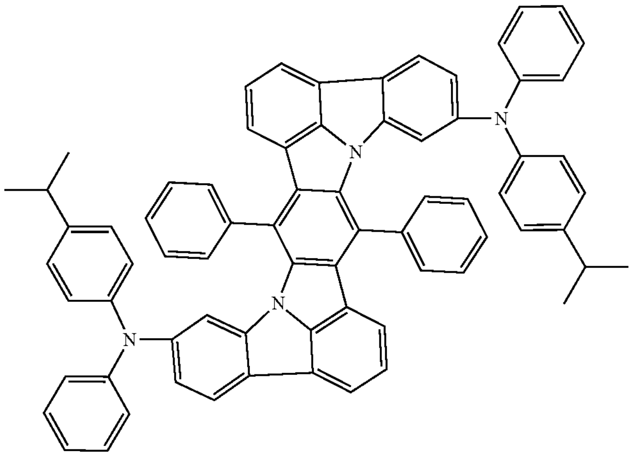

-continued
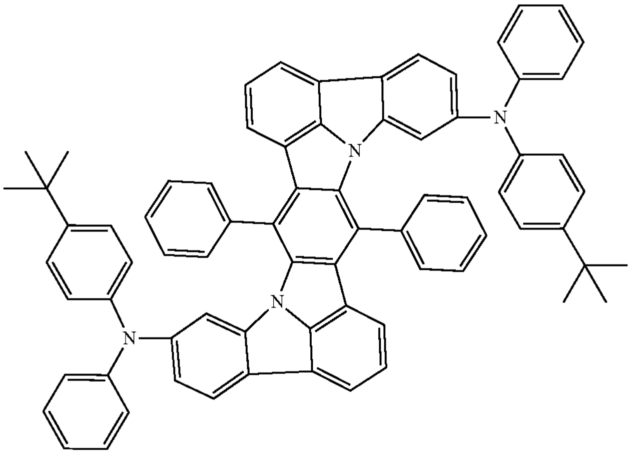
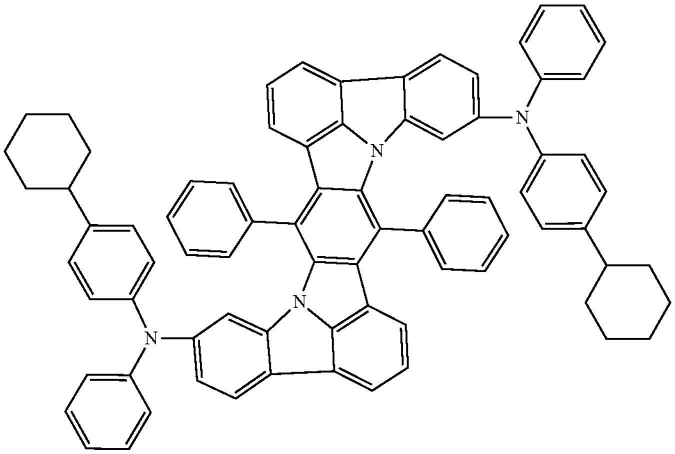
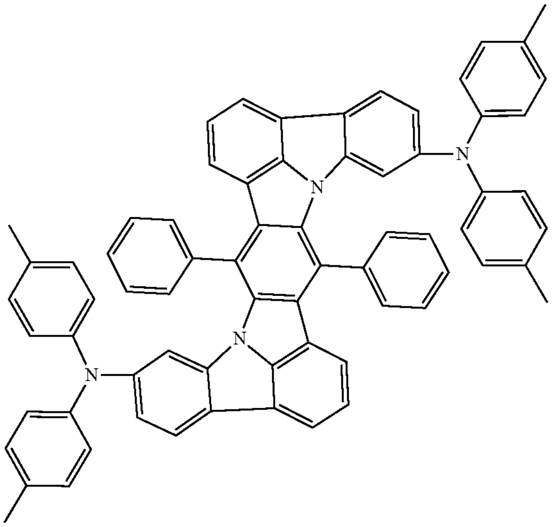

-continued
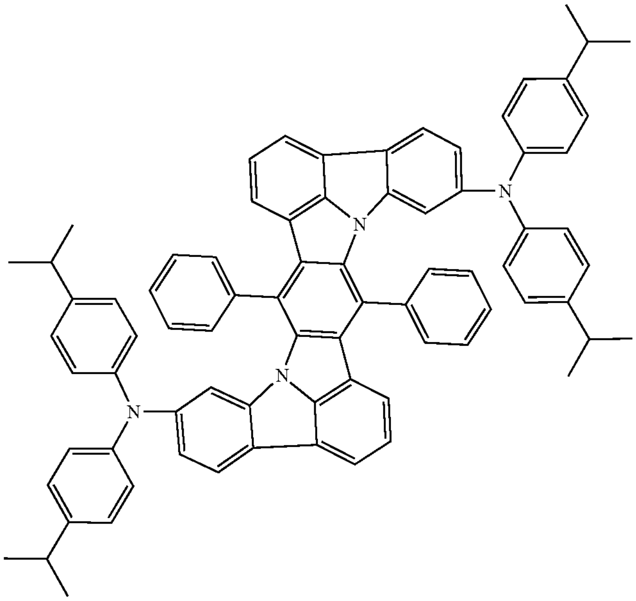
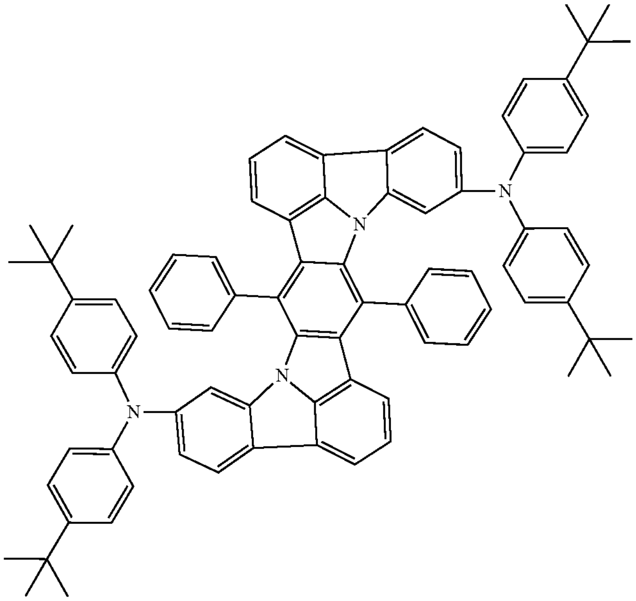

-continued
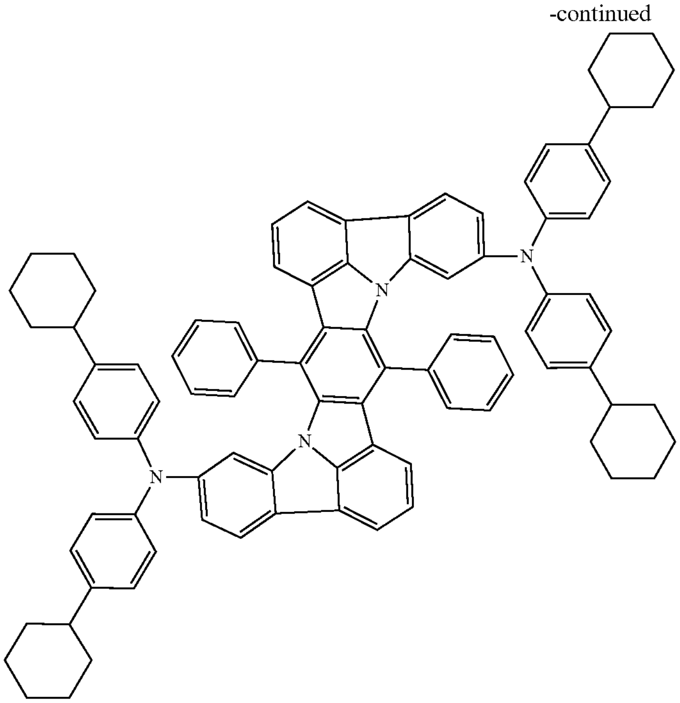
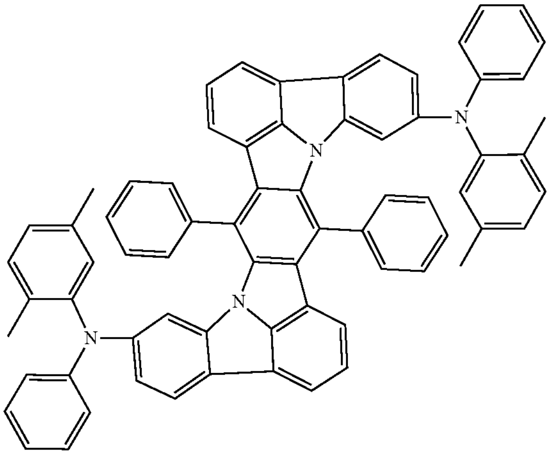
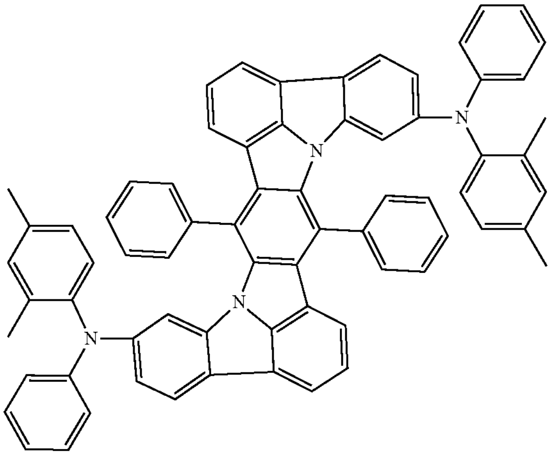
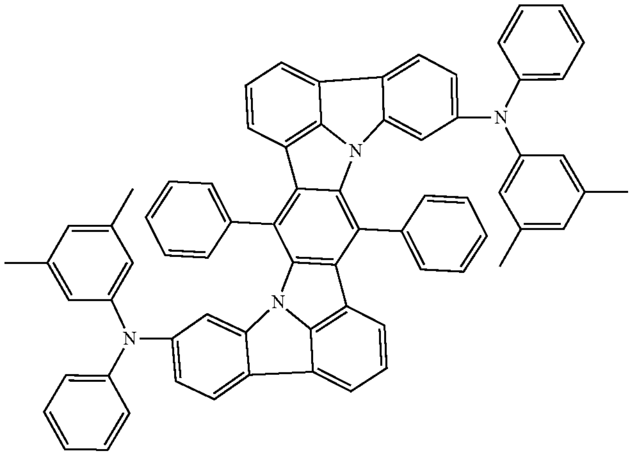

-continued
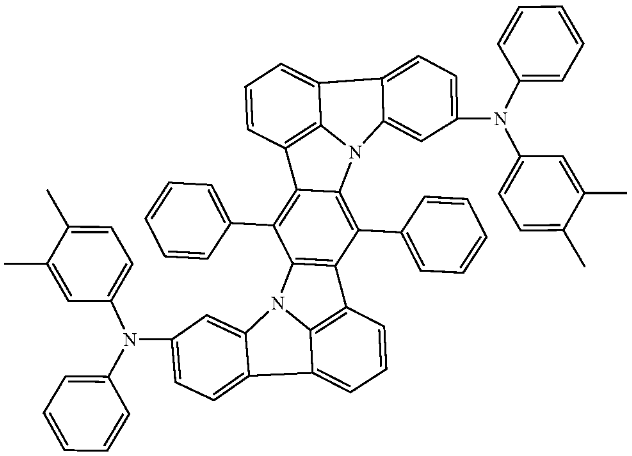
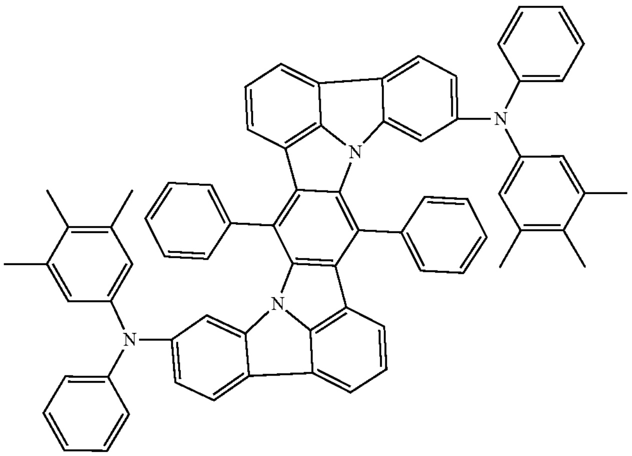
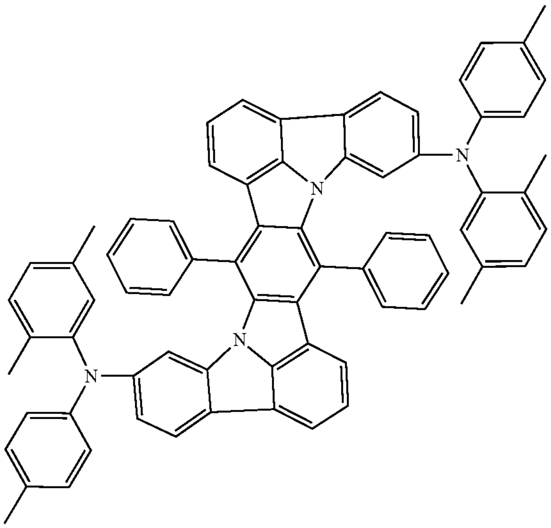
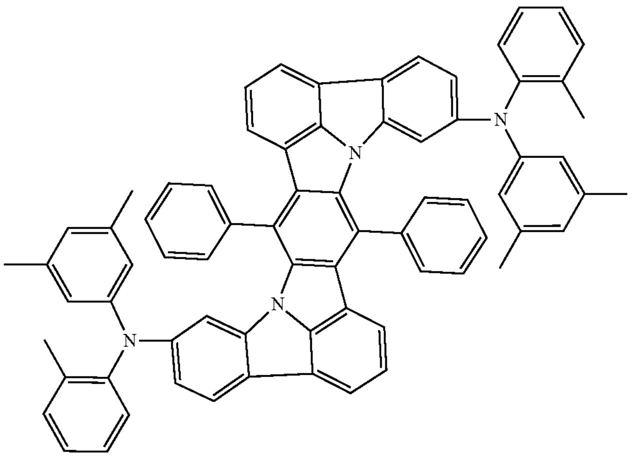

-continued
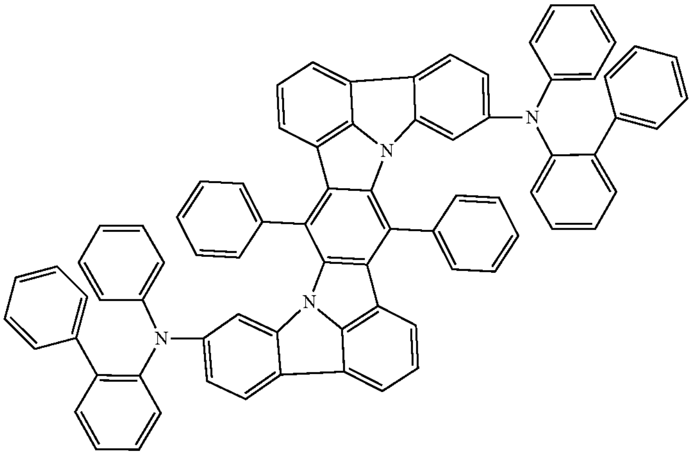
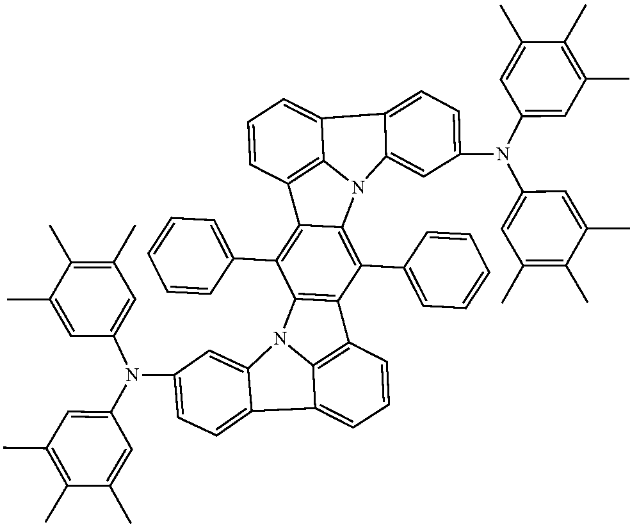
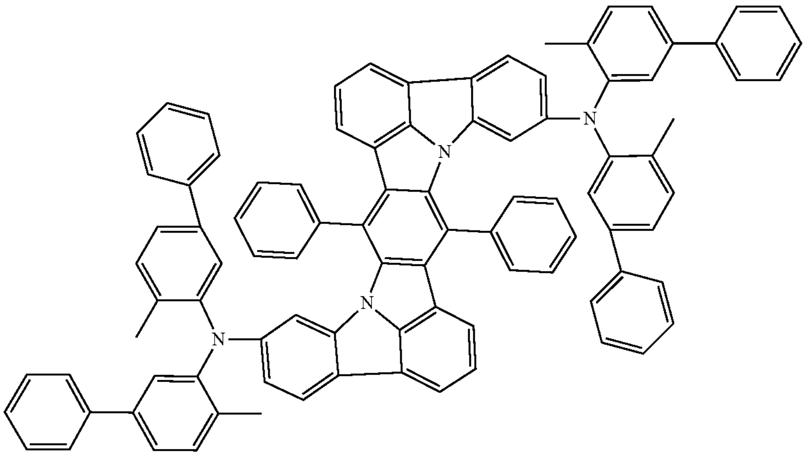

-continued
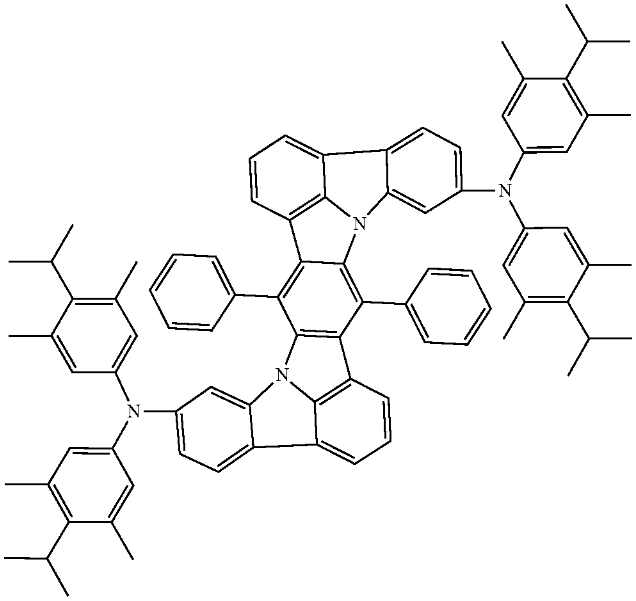
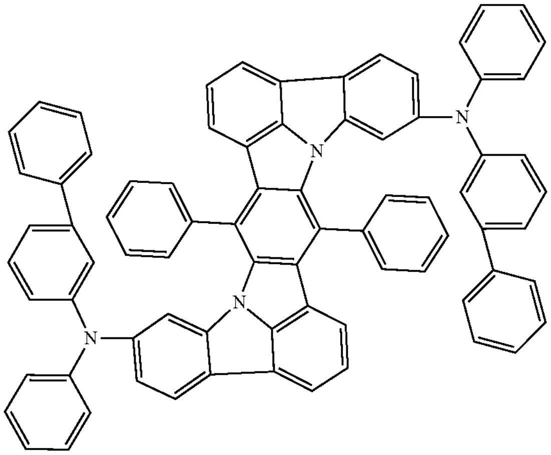
[Formula 298]
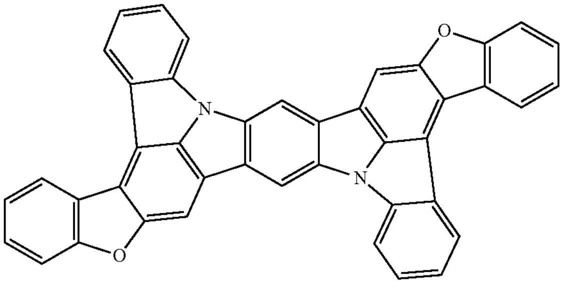
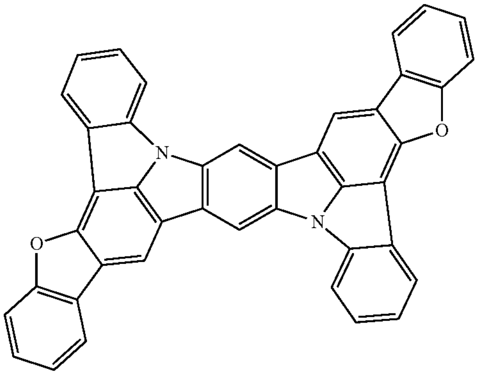

-continued
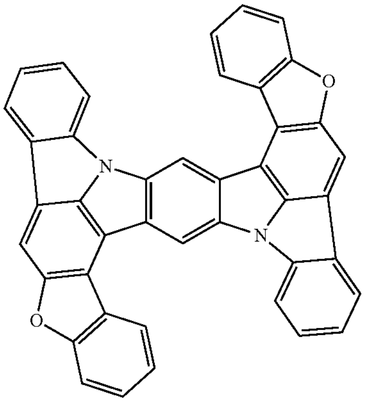
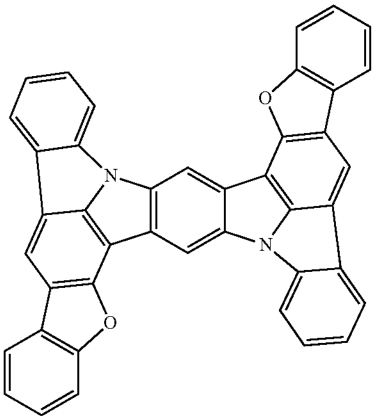
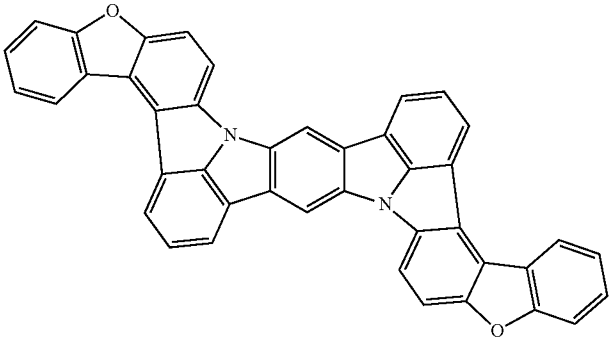
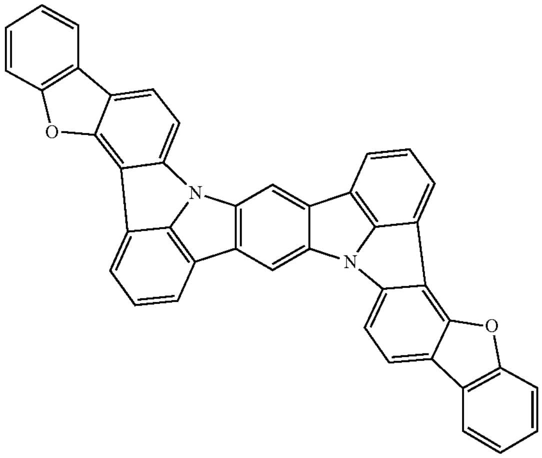
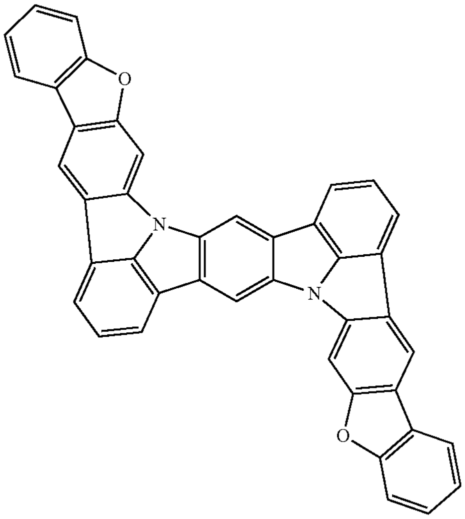
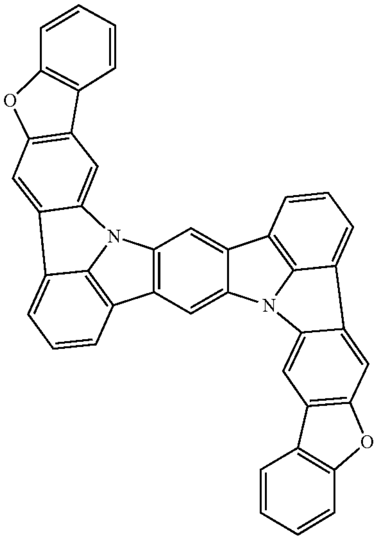

-continued
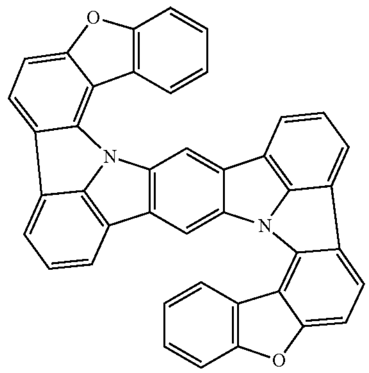
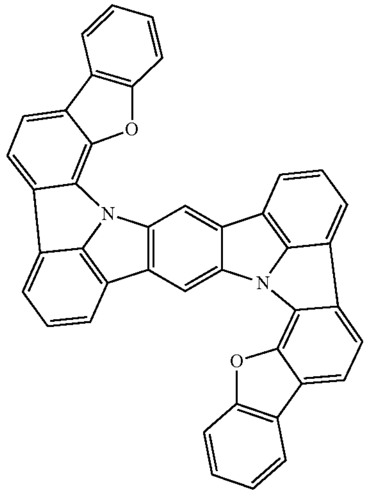
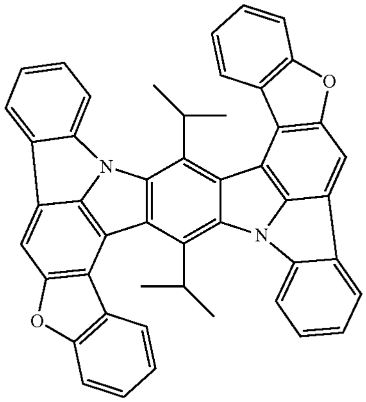
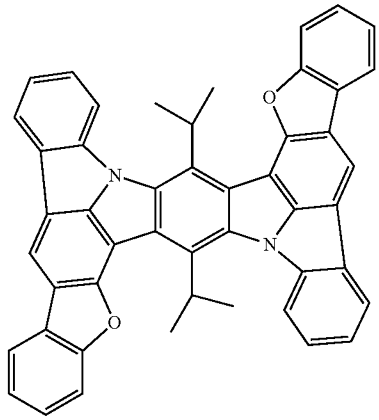
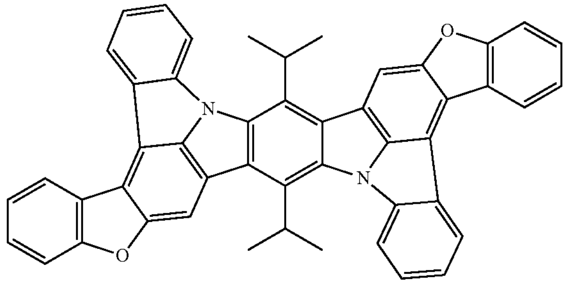
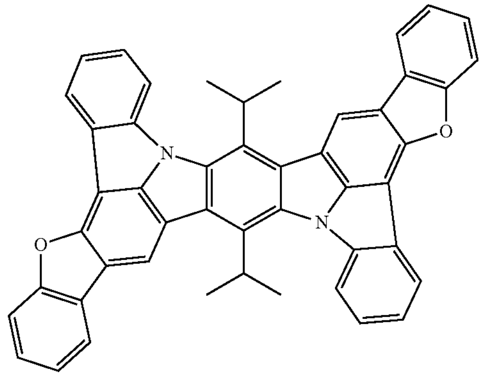
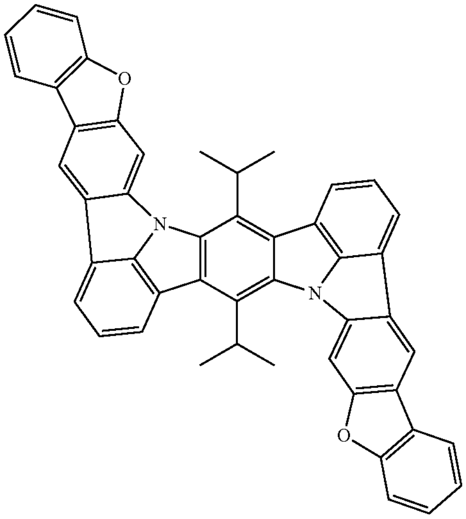

-continued
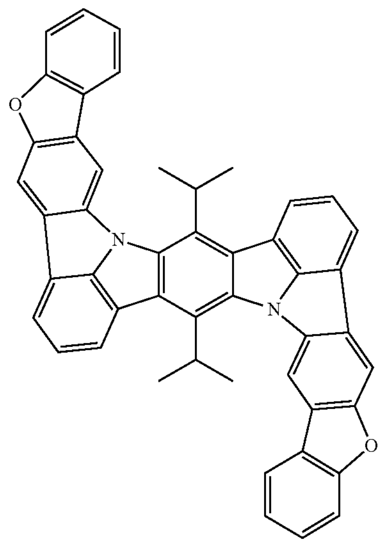
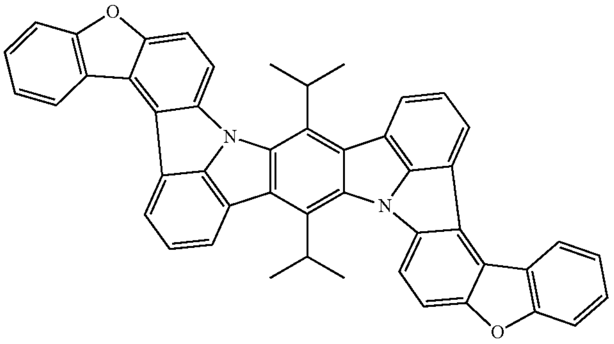
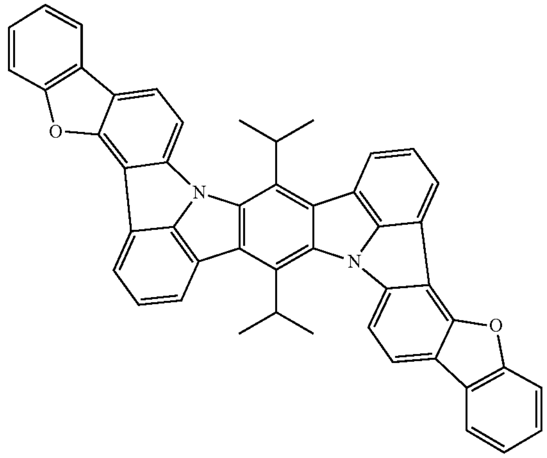
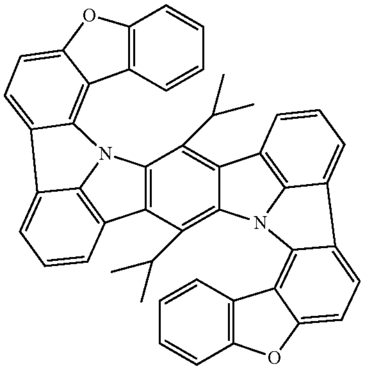
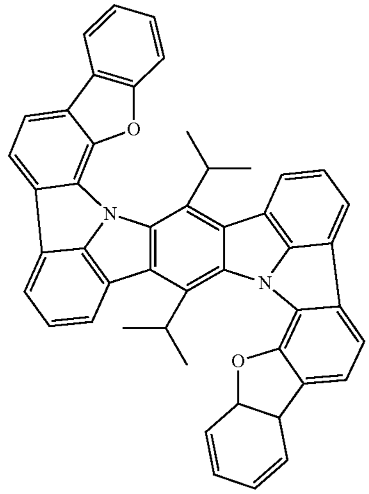

-continued
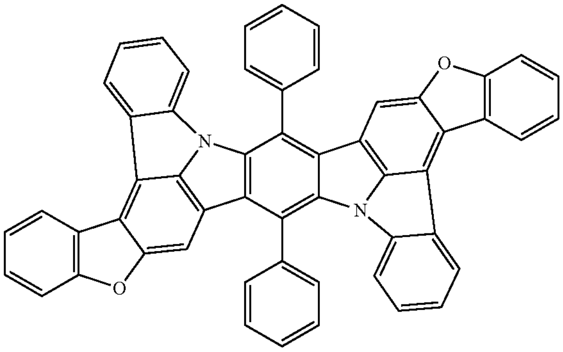
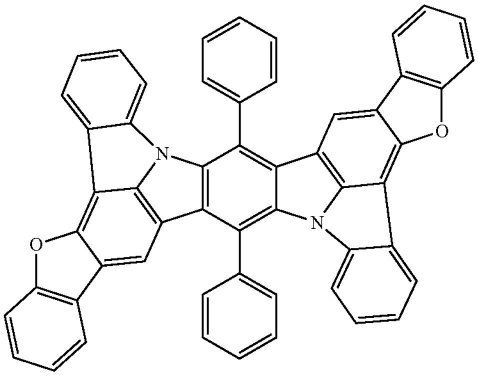
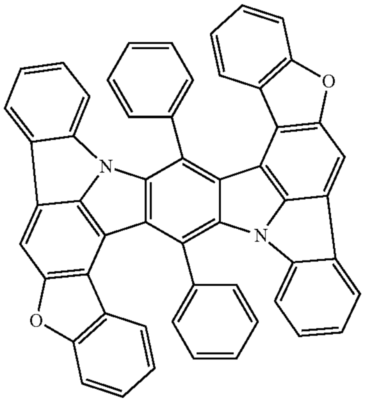
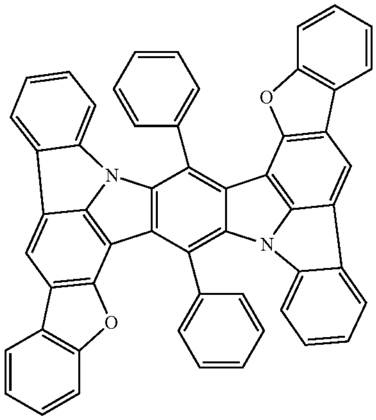
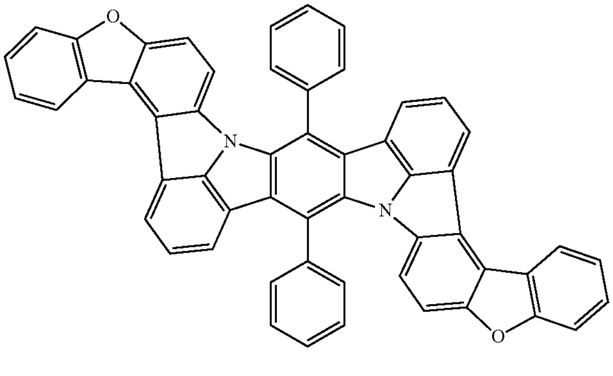
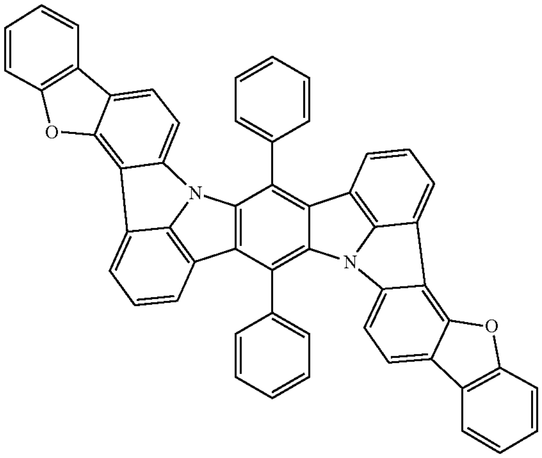

-continued
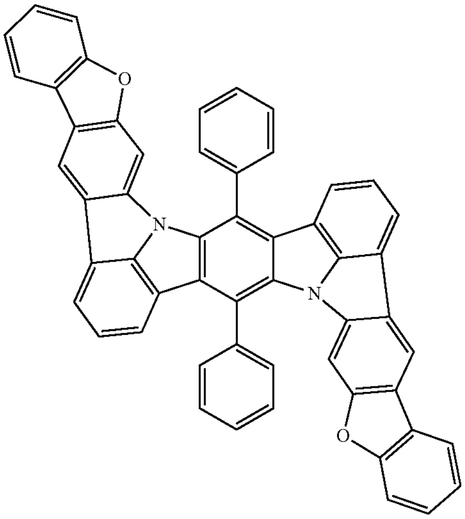
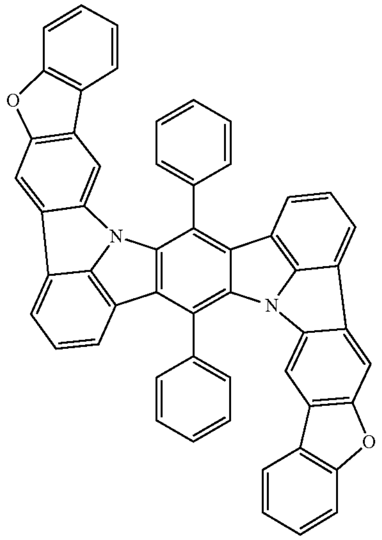
[Formula 299]
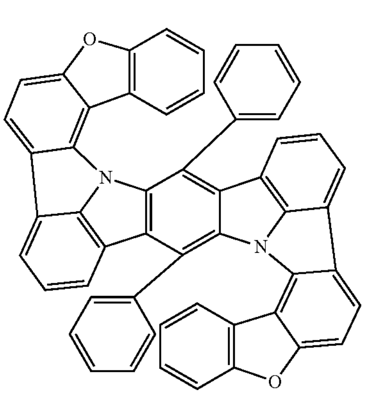
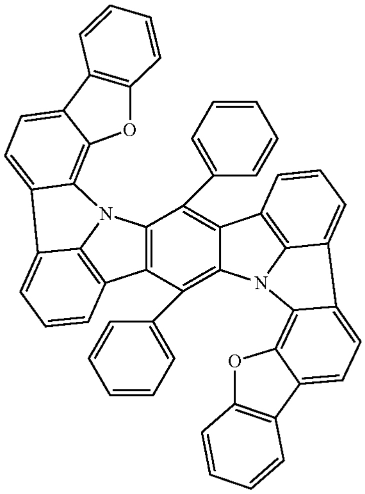
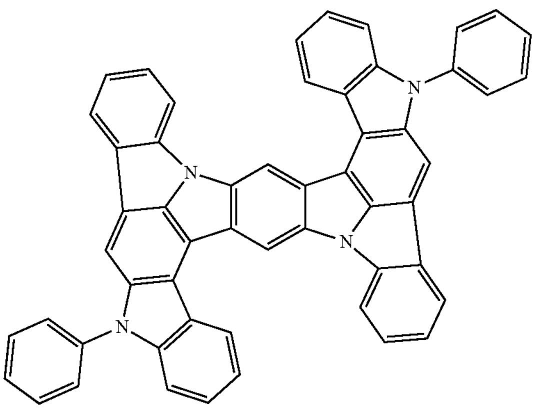
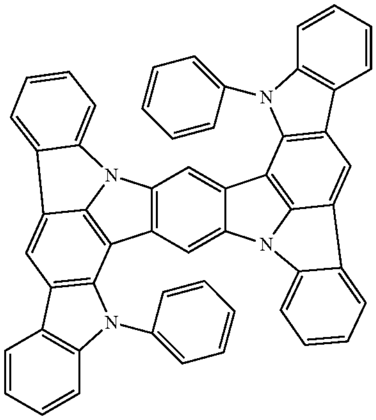

-continued
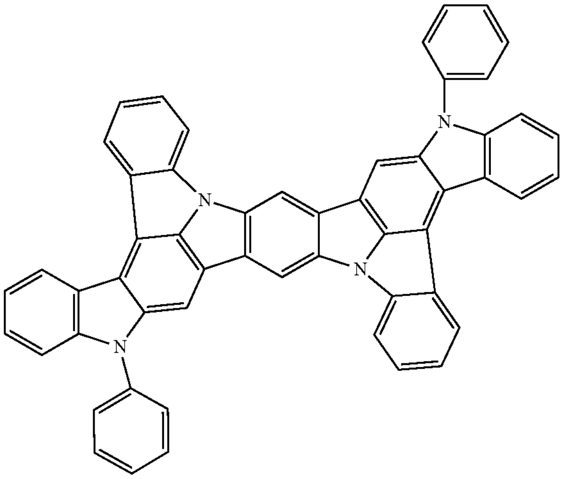
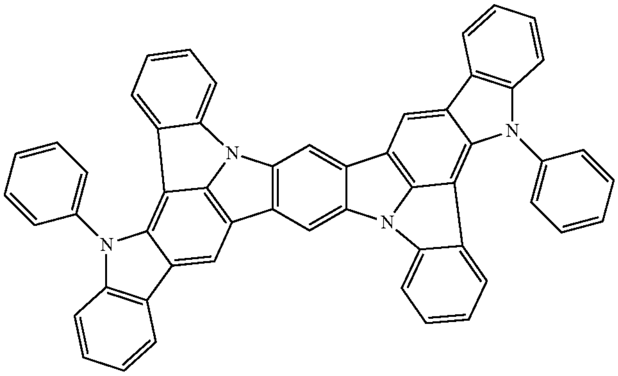
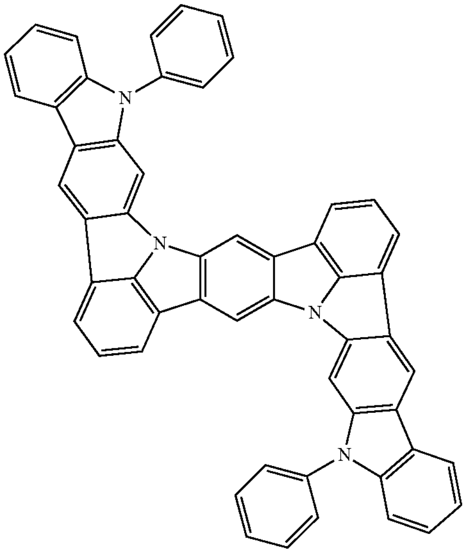
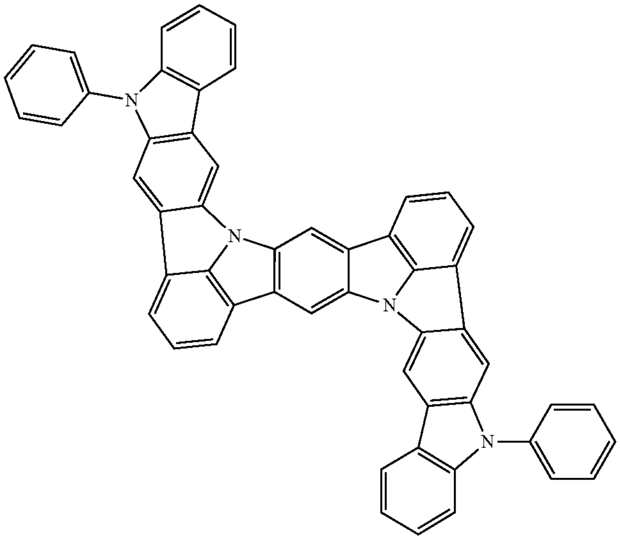

-continued
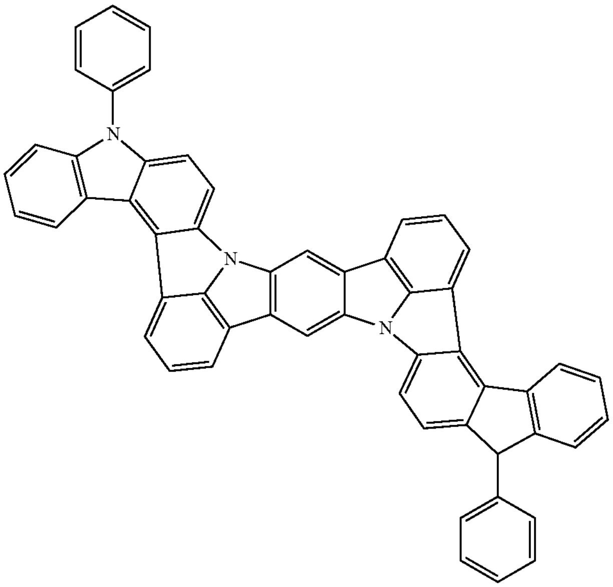
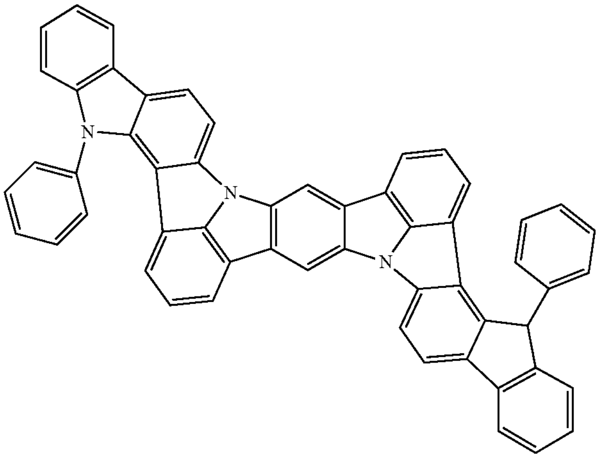
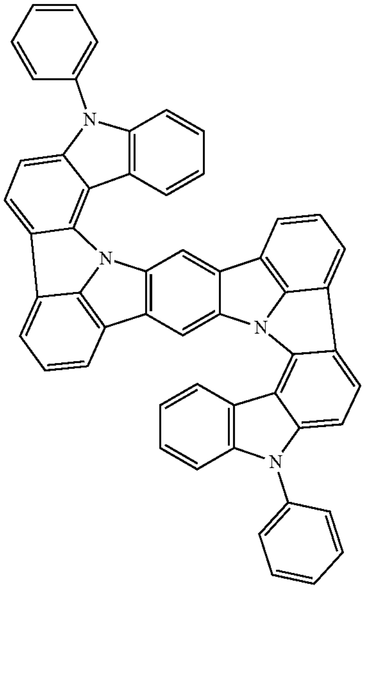
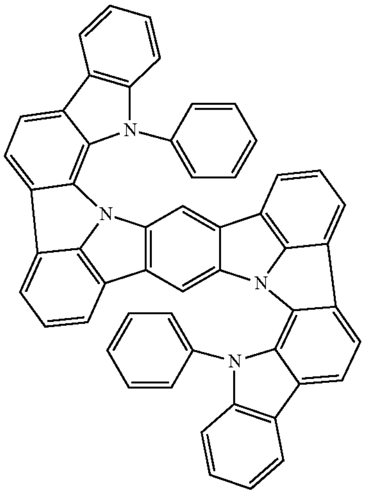

-continued
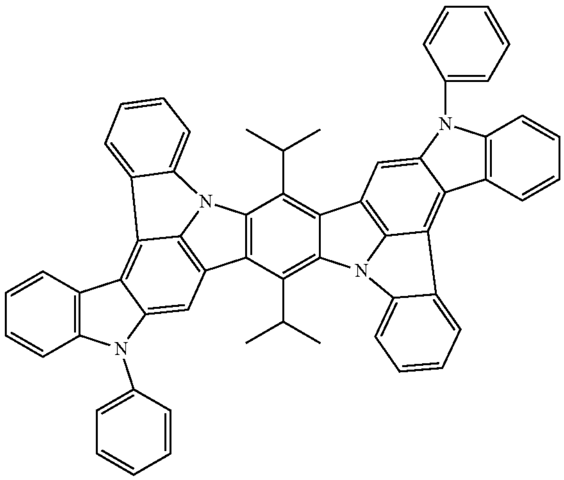
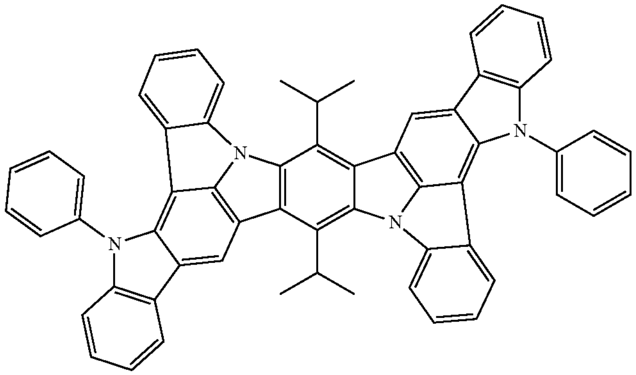
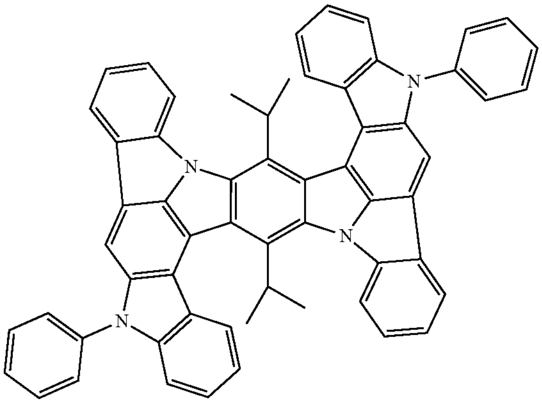
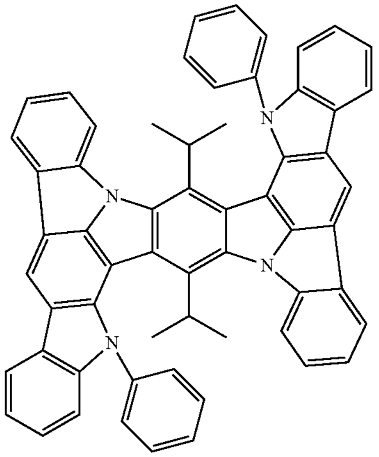
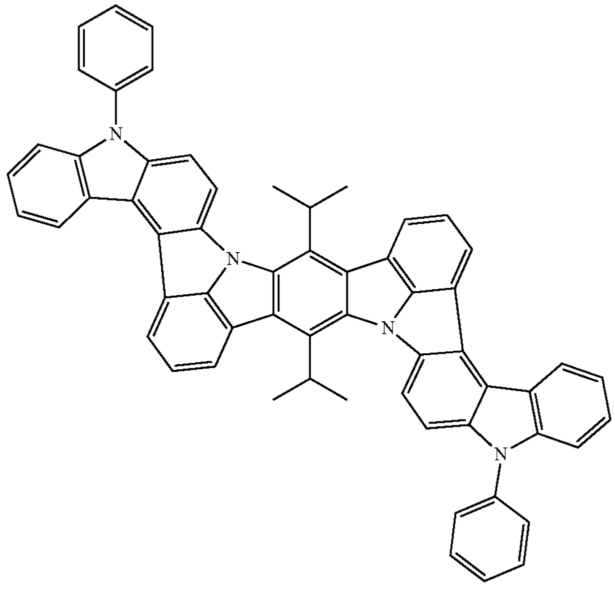

-continued
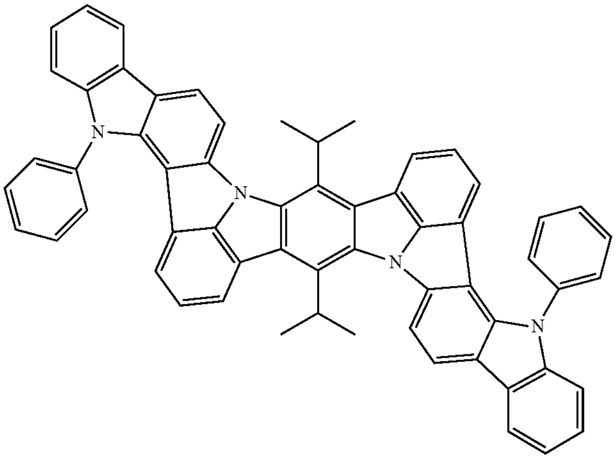
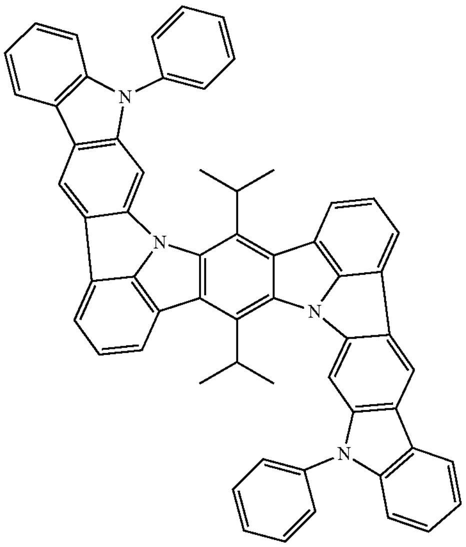
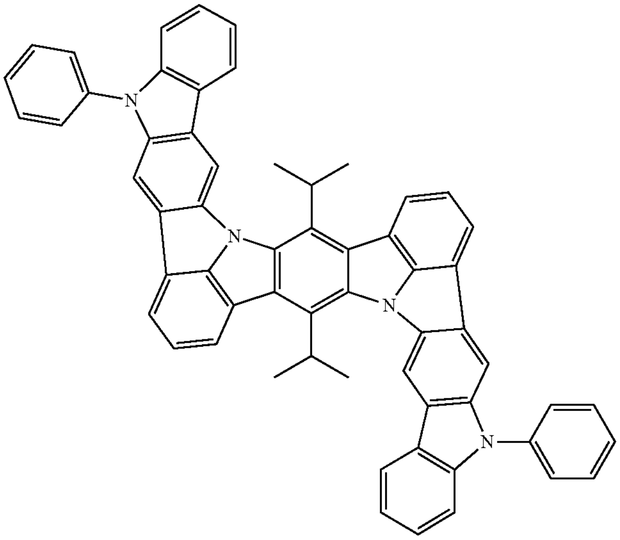
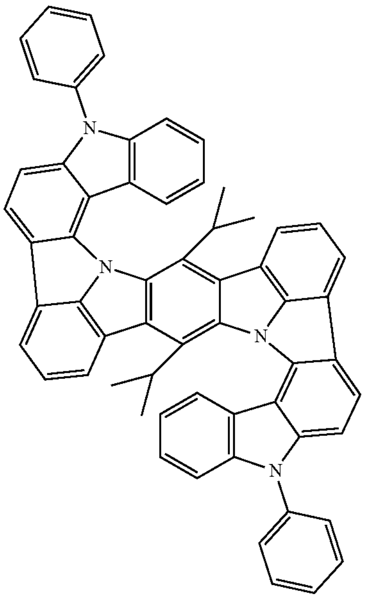
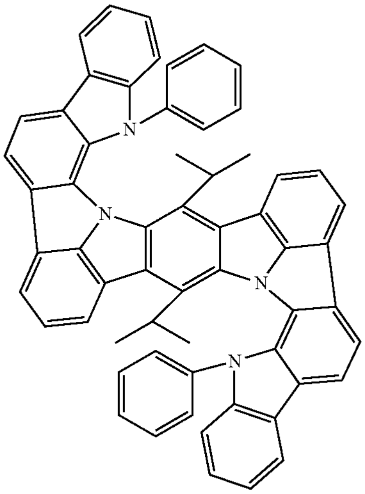

-continued
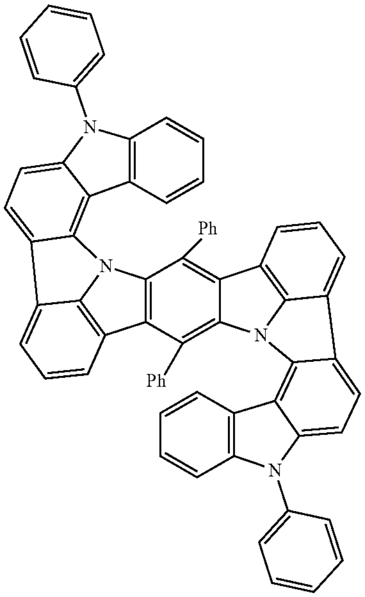
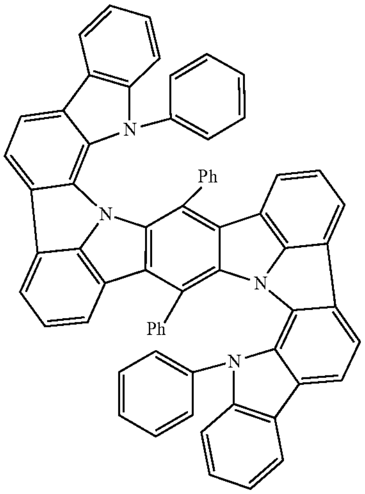
In the formula, Ph is a phenly group.
[Formula 300]
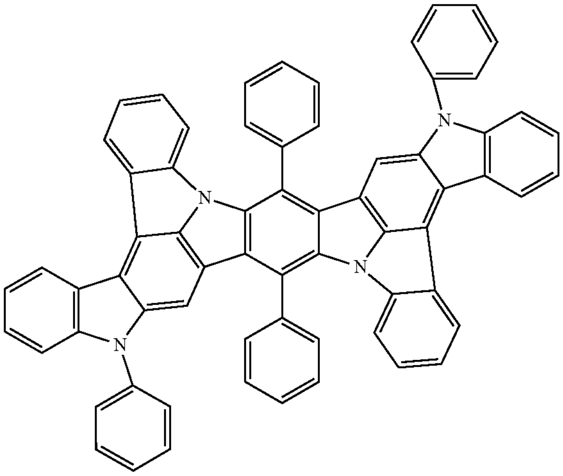
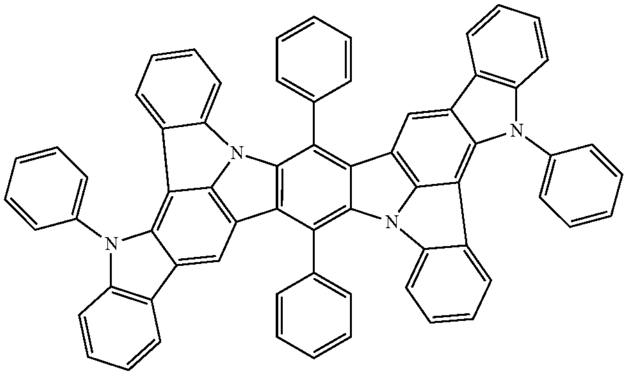
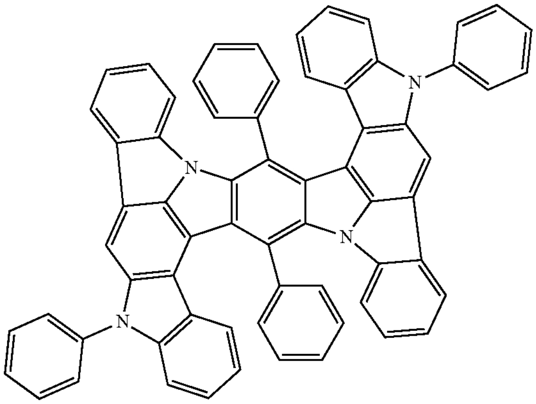
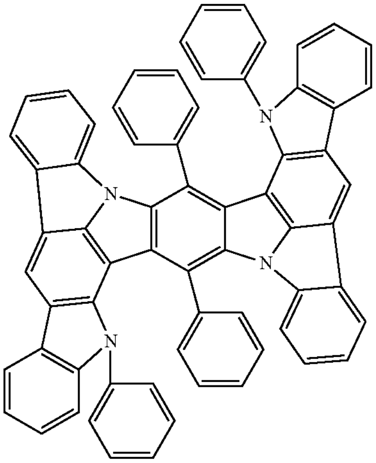

-continued
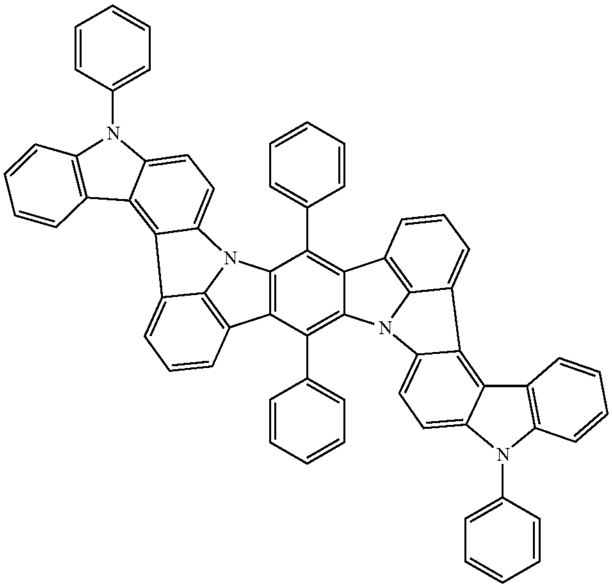
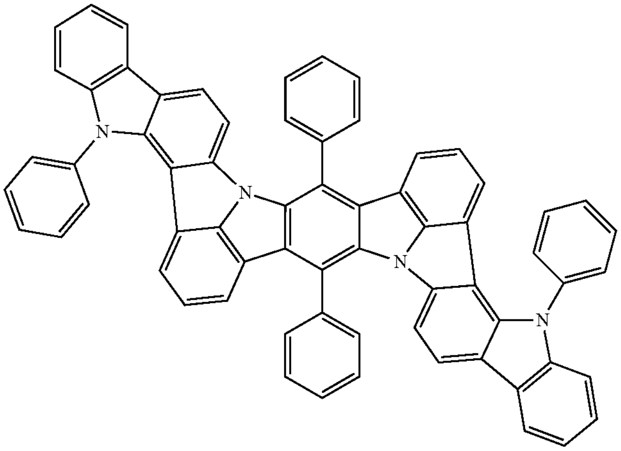
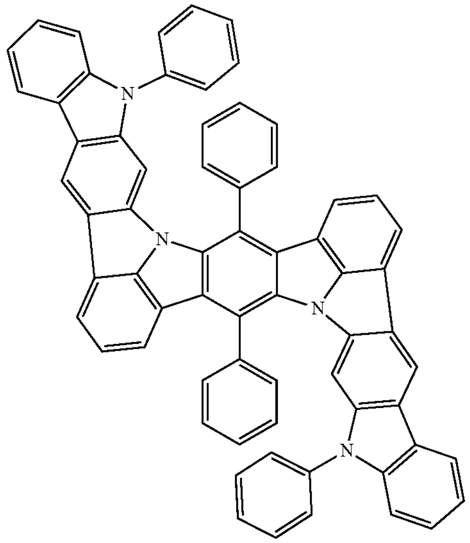
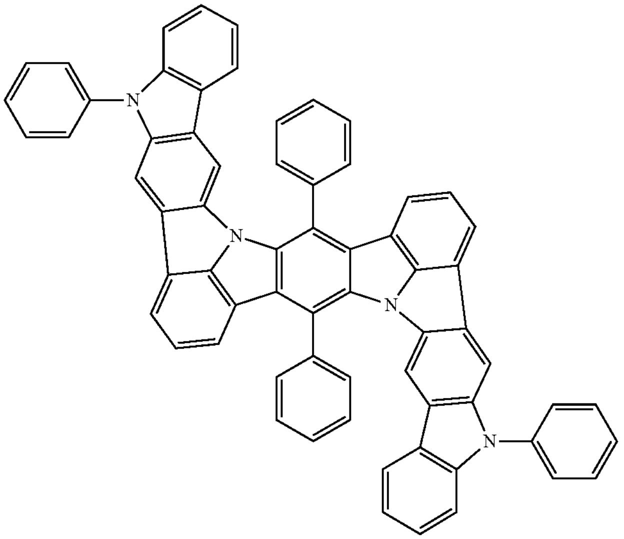
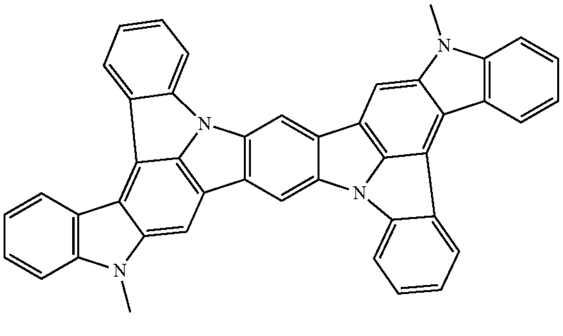

-continued
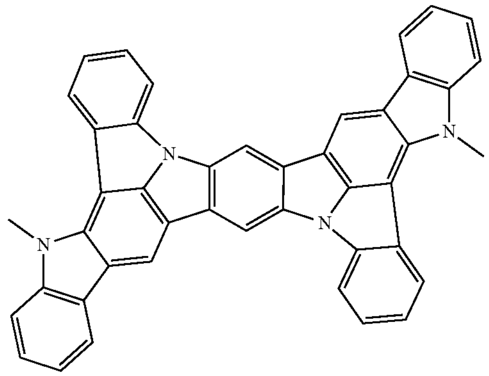
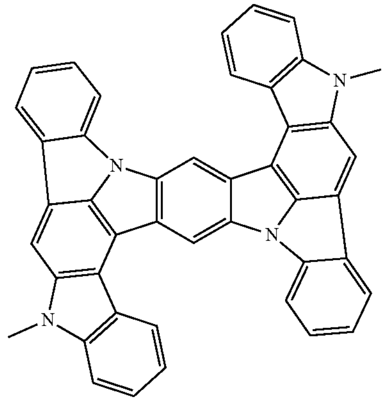
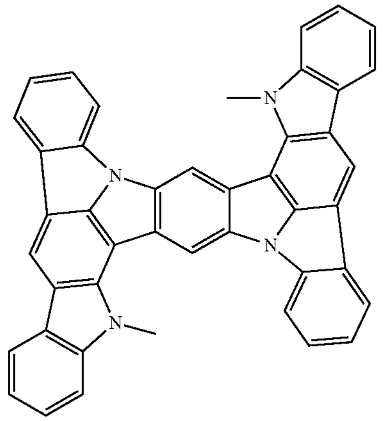
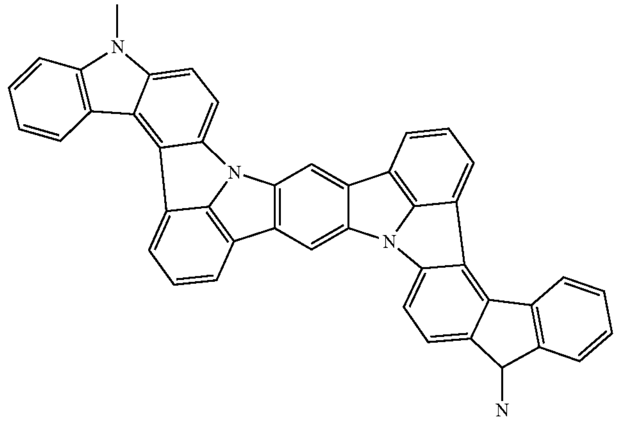
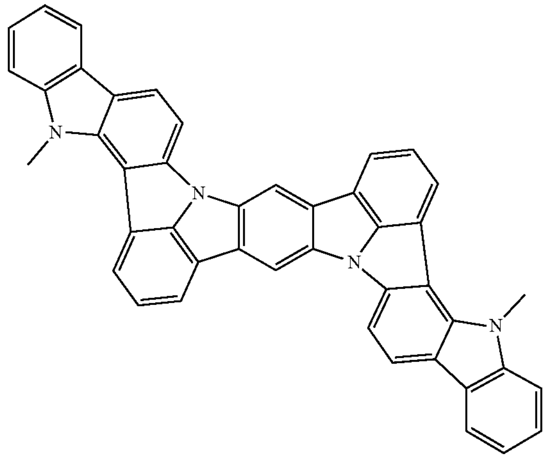

-continued
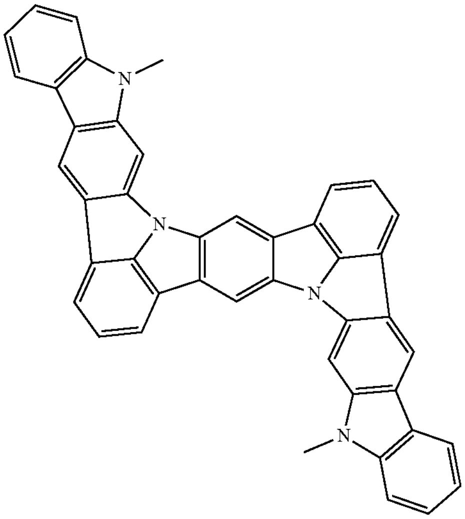
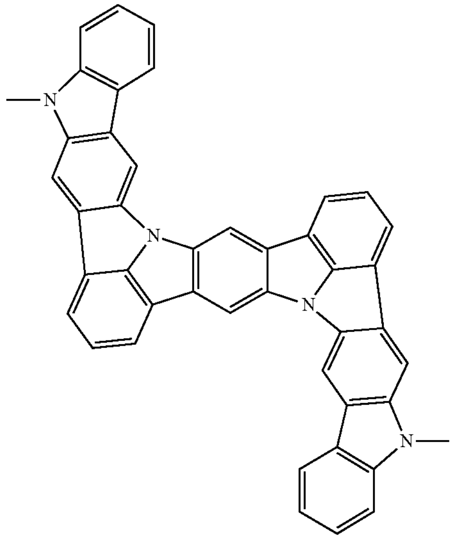
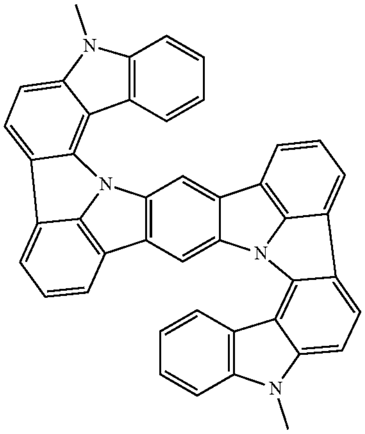
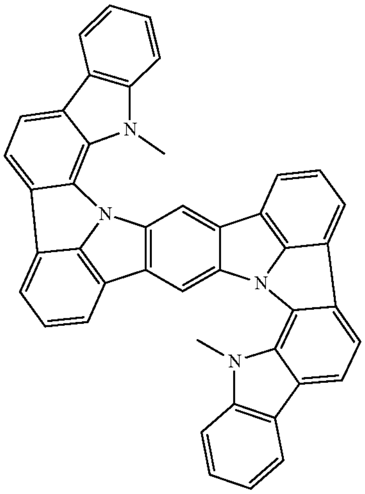
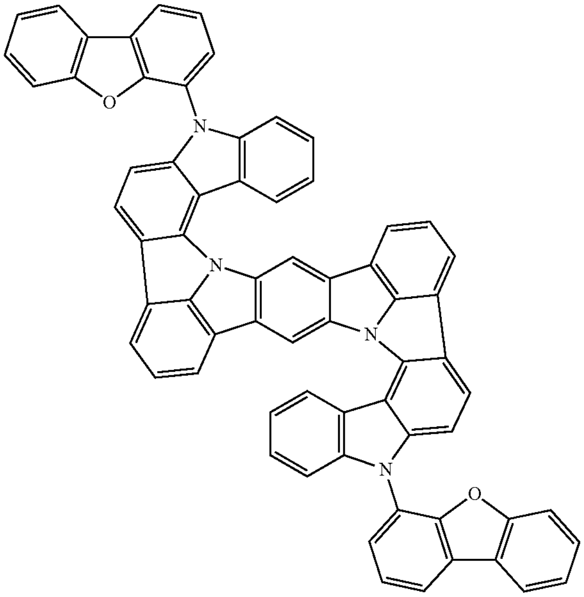
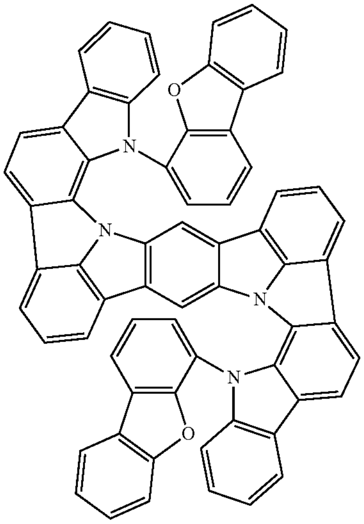

-continued
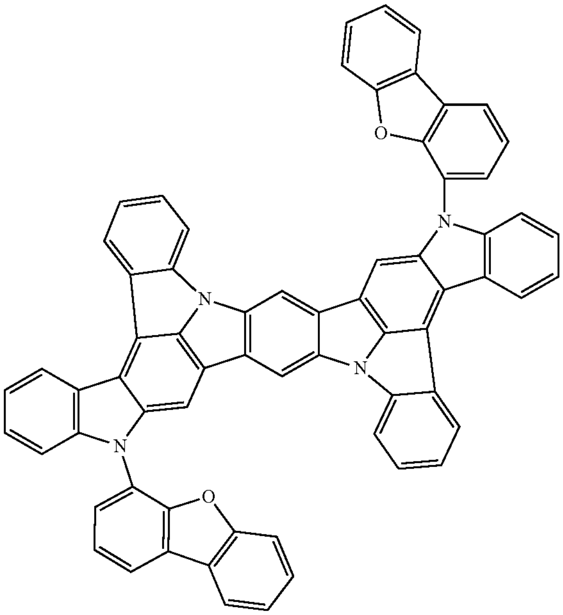
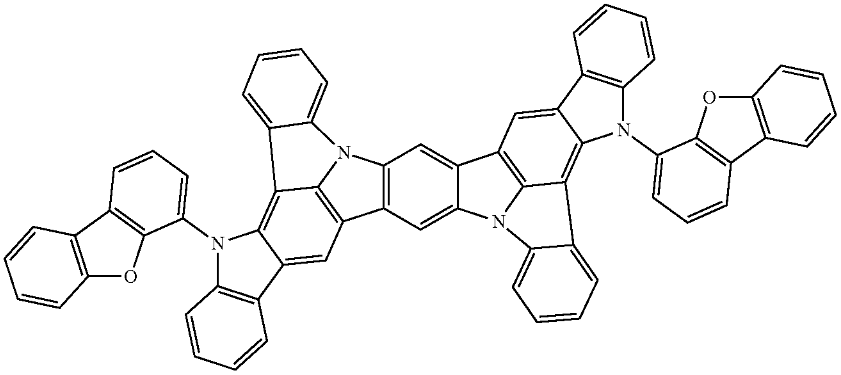
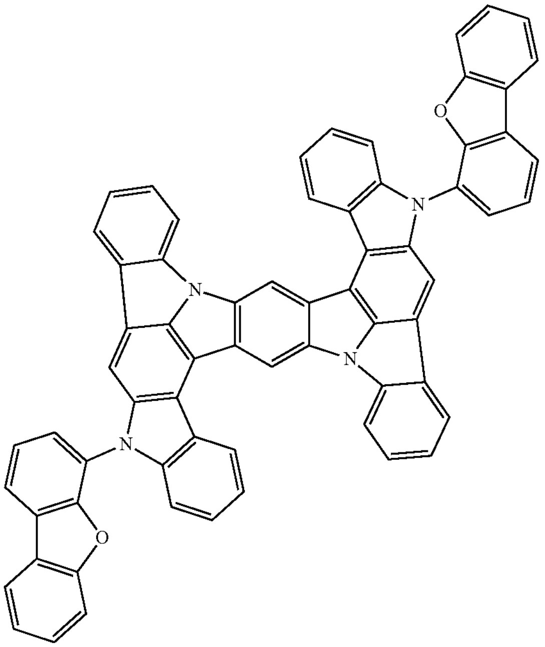
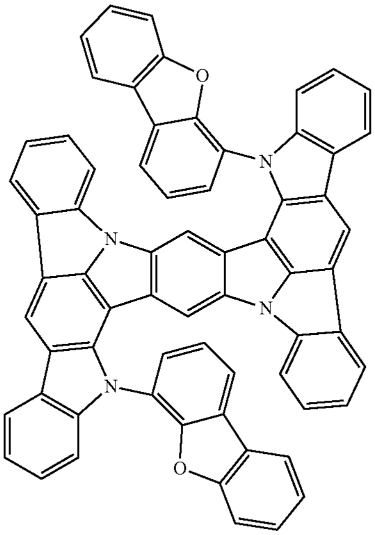

-continued
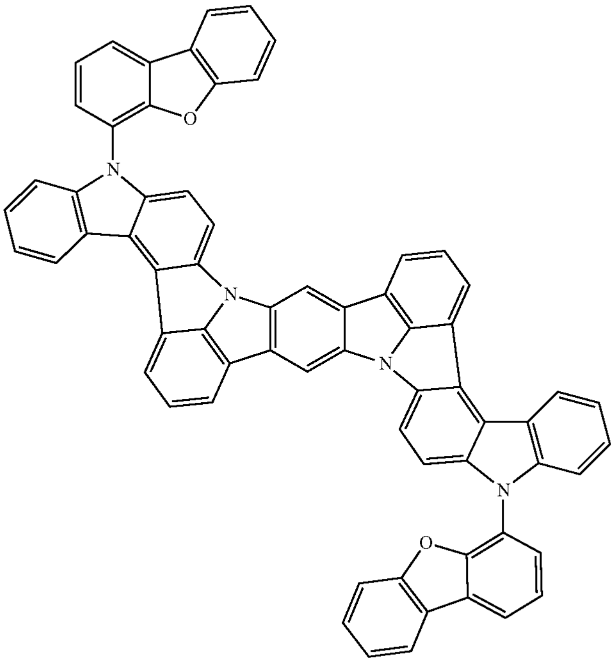
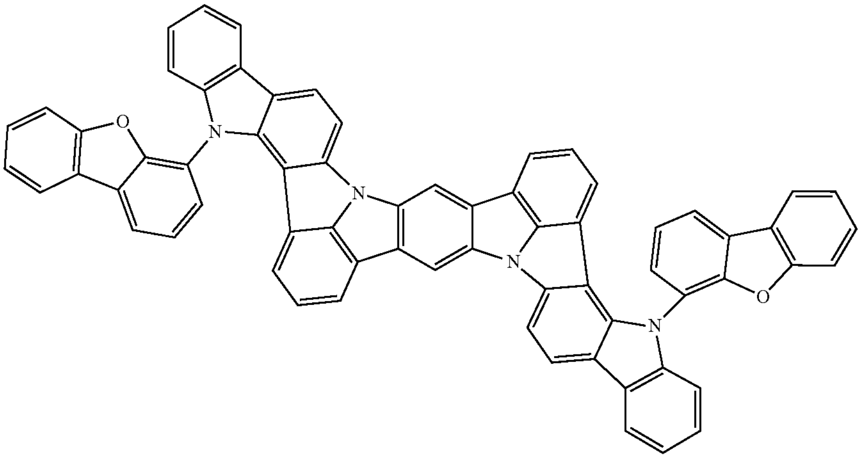
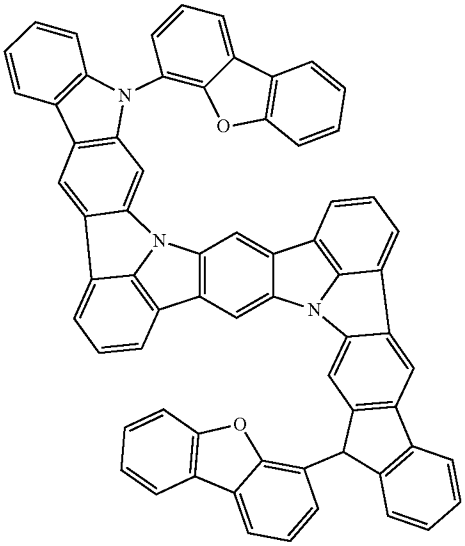

-continued
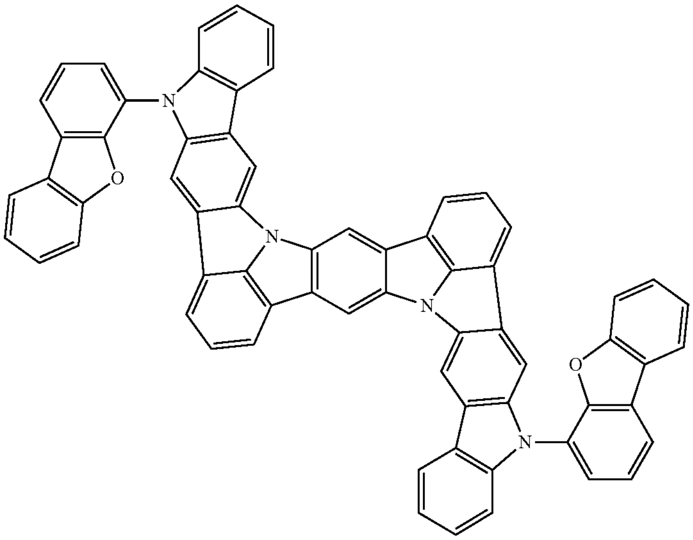
[Formula 301]
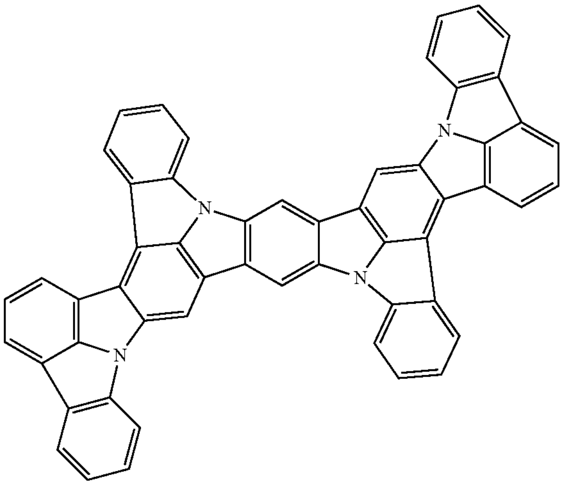
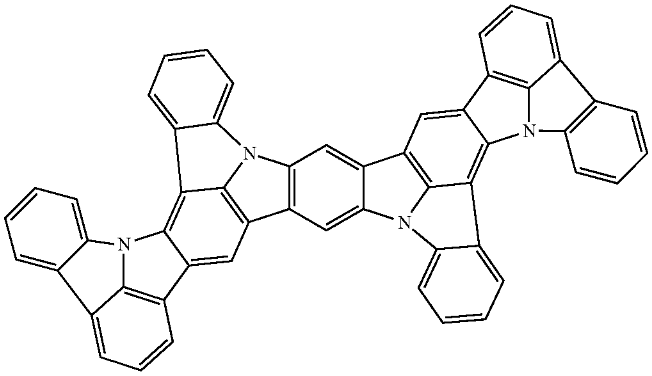
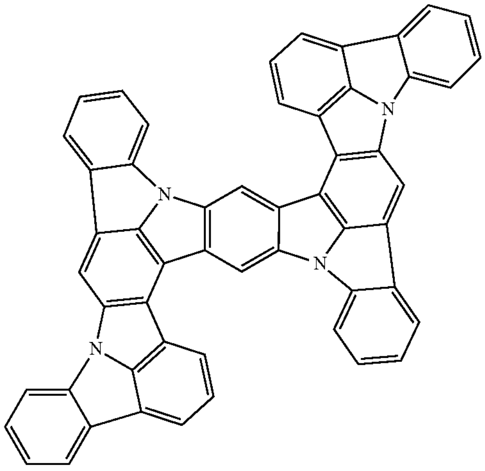

-continued
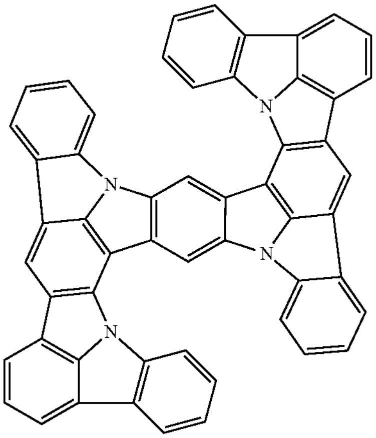
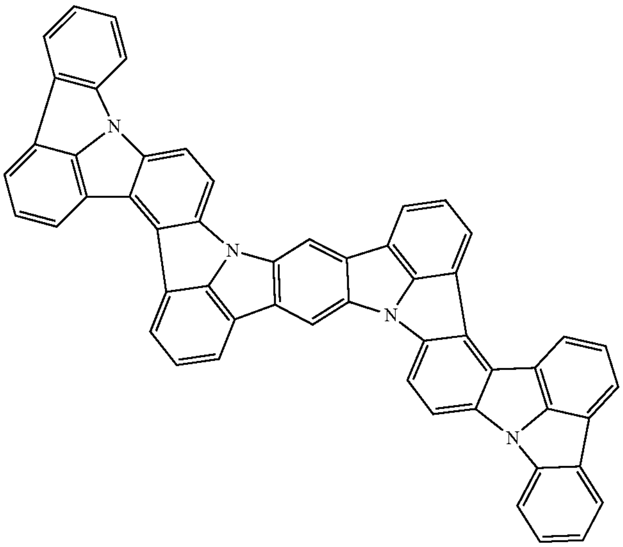
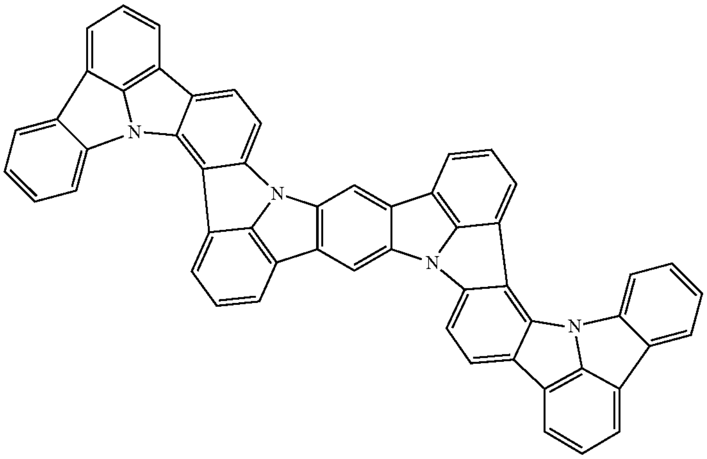
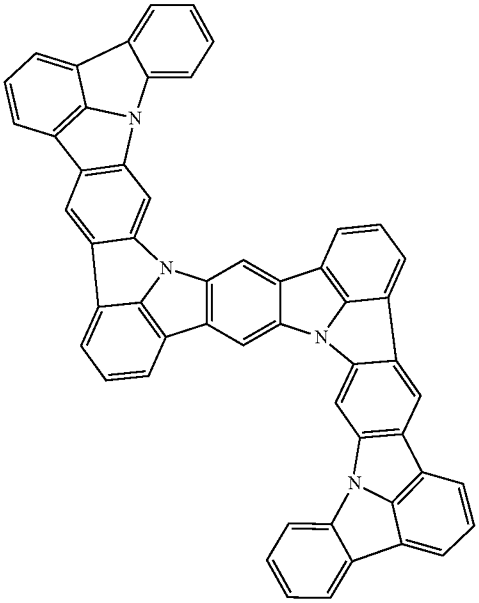
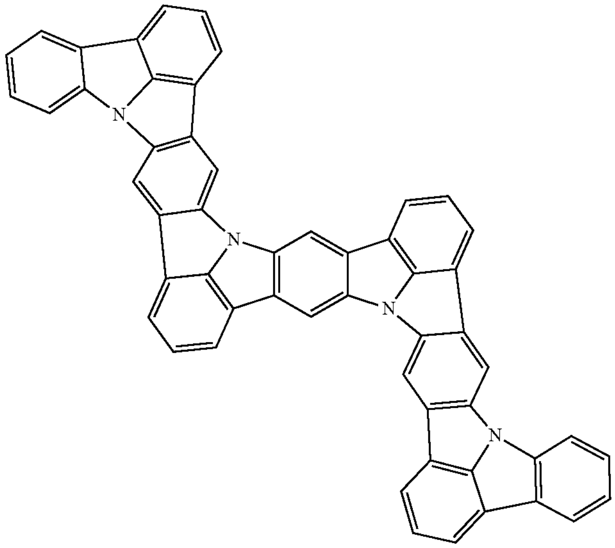

-continued
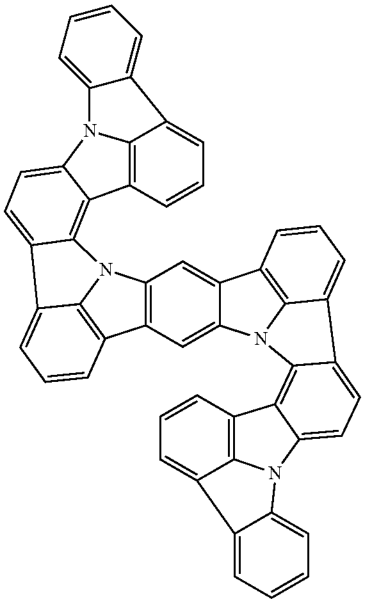
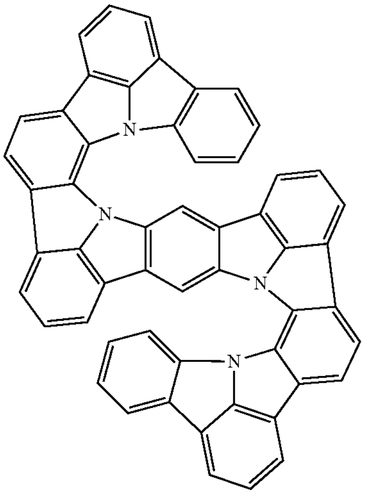
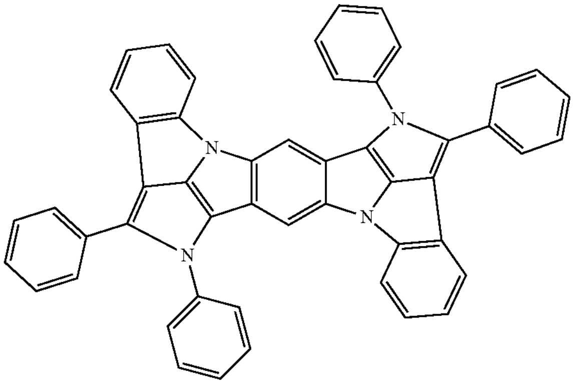
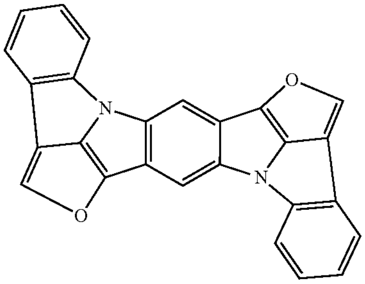
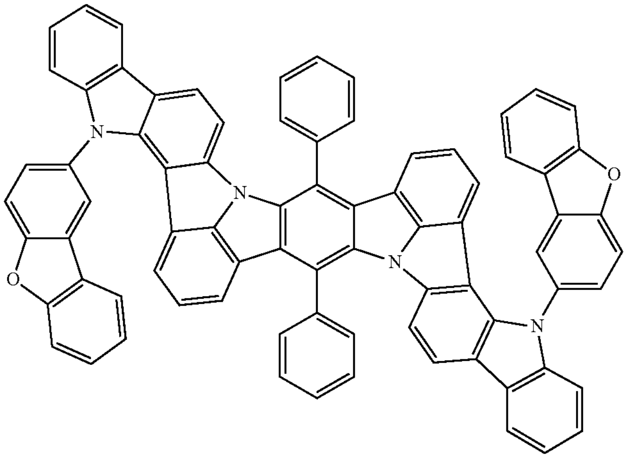

-continued
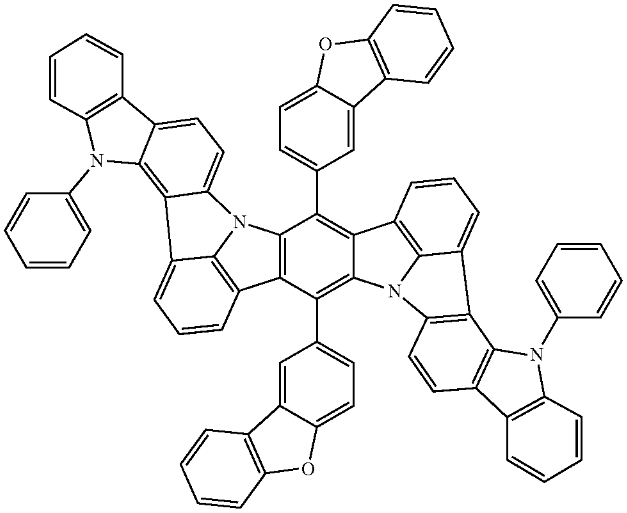
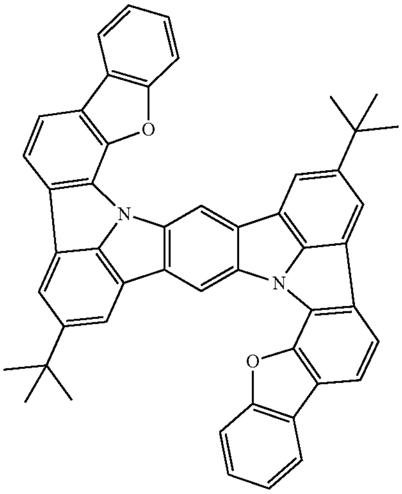
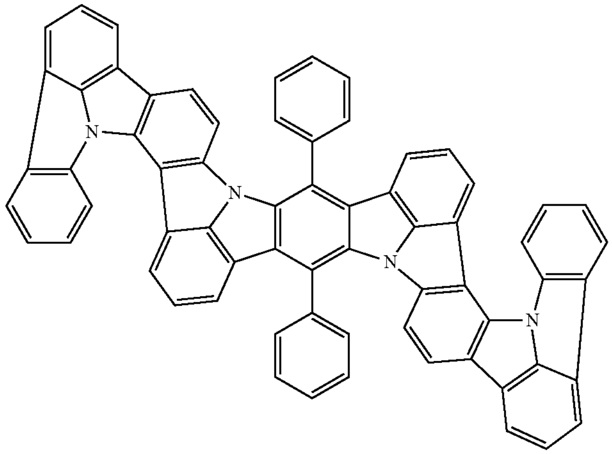
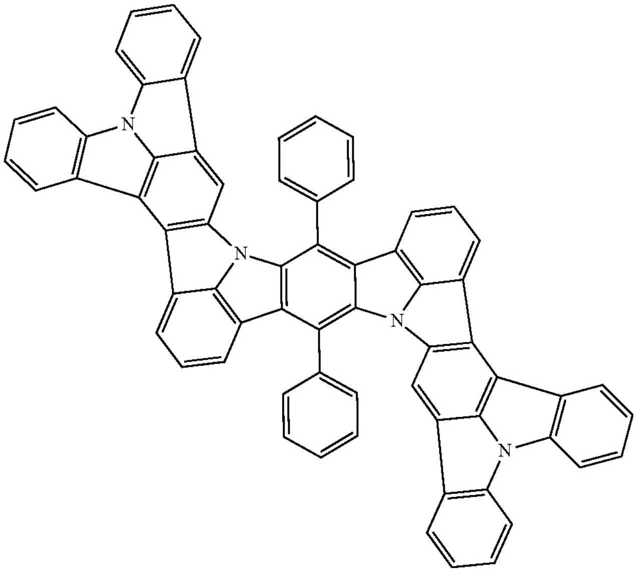

Compound Represented by Formula (6)

The compound represented by the formula (6) will be described below.

[Formula 302]

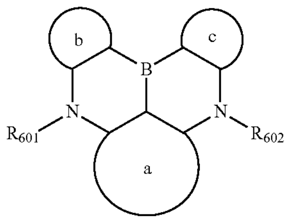

(6)

In the formula (6):

a ring a, a ring b and a ring c are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the ring a, ring b or ring c to form a substituted or unsubstituted heterocycle, or not bonded thereto to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The ring a, ring b and ring c are each a ring (a substituted or unsubstituted aromatic hydrocarbon ring having 6 to 50 ring carbon atoms, or a substituted or unsubstituted heterocycle having 5 to 50 ring atoms) fused with a fused bicyclic structure formed of a boron atom and two nitrogen atoms at the center of the formula (6).

The "aromatic hydrocarbon ring" for the rings a, b, and c has the same structure as a compound formed by introducing a hydrogen atom to the "aryl group" described above.

Ring atoms of the "aromatic hydrocarbon ring" for the ring a include three carbon atoms on the fused bicyclic structure at the center of the formula (6).

Ring atoms of the "aromatic hydrocarbon ring" for the rings b and c include two carbon atoms on the fused bicyclic structure at the center of the formula (6).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the rings a, b, and c has the same structure as a compound formed by introducing a hydrogen atom to the "heterocyclic group" described above.

Ring atoms of the "heterocycle" for the ring a include three carbon atoms on the fused bicyclic structure at the center of the formula (6). Ring atoms of the "heterocycle" for the rings b and c include two carbon atoms on the fused bicyclic structure at the center of the formula (6). Specific examples of the "substituted or unsubstituted heterocycle having 5 to 50 ring atoms" include a compound formed by introducing a hydrogen atom to the "heterocyclic group" described in the specific example group G2.

$R_{601}$ and $R_{602}$ may be each independently bonded with the ring a, ring b, or ring c to form a substituted or unsubstituted heterocycle. The "heterocycle" in this arrangement includes a nitrogen atom on the fused bicyclic structure at the center of the formula (6). The heterocycle in the above arrangement optionally includes a hetero atom other than the nitrogen atom. $R_{601}$ and $R_{602}$ being bonded with the ring a, ring b, or ring c specifically means that atoms forming $R_{601}$ and $R_{602}$ are bonded with atoms forming the ring a, ring b, or ring c. For instance, $R_{601}$ may be bonded with the ring a to form a bicyclic (or tri-or-more cyclic) fused nitrogen-containing heterocycle, in which the ring including $R_{601}$ and the ring a are fused. Specific examples of the nitrogen-containing heterocycle include a compound corresponding to the nitrogen-containing bi(or-more)cyclic fused heterocyclic group in the specific example group G2.

The same applies to $R_{601}$ bonded with the ring b, $R_{602}$ bonded with the ring a, and $R_{602}$ bonded with the ring c.

In an exemplary embodiment, the ring a, ring b and ring c in the formula (6) are each independently a substituted or unsubstituted aromatic hydrocarbon ring having 6 to 50 ring carbon atoms.

In an exemplary embodiment, the ring a, ring b and ring c in the formula (6) are each independently a substituted or unsubstituted benzene ring or a substituted or unsubstituted naphthalene ring.

In an exemplary embodiment, $R_{601}$ and $R_{602}$ in the formula (6) are each independently a substituted or unsubstituted aryl group having 6 to 50 ring carbon atoms, or a substituted or unsubstituted heterocyclic group having 5 to 50 ring atoms; and preferably a substituted or unsubstituted aryl group having 6 to 50 ring carbon atoms.

In an exemplary embodiment, the compound represented by the formula (6) is a compound represented by a formula (62) below.

[Formula 303]

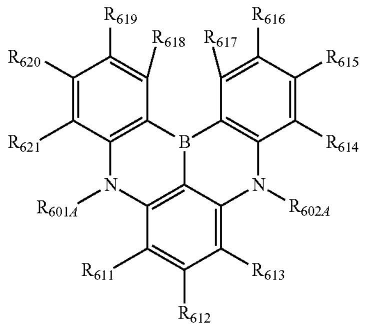

(62)

In the formula (62):

$R_{601A}$ is bonded with at least one of $R_{611}$ or $R_{621}$ to form a substituted or unsubstituted heterocycle, or not bonded therewith to form no substituted or unsubstituted heterocycle;

$R_{602A}$ is bonded with at least one of $R_{613}$ or $R_{614}$ to form a substituted or unsubstituted heterocycle, or not bonded therewith to form no substituted or unsubstituted heterocycle;

$R_{601A}$ and $R_{602A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{611}$ to $R_{621}$ are mutually bonded to form a substituted or unsubstituted monocyclic ring, mutually bonded to form a substituted or unsubstituted fused ring, or not mutually bonded; and $R_{611}$ to $R_{621}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

$R_{601A}$ and $R_{602A}$ in the formula (62) are groups corresponding to $R_{601}$ and $R_{602}$ in the formula (6), respectively.

For instance, $R_{601A}$ and $R_{611}$ are optionally bonded with each other to form a bicyclic (or tri-or-more cyclic) fused nitrogen-containing heterocycle, in which the ring including $R_{601A}$ and $R_{611}$ and a benzene ring corresponding to the ring a are fused. Specific examples of the nitrogen-containing heterocycle include a compound corresponding to the nitrogen-containing bi(or-more)cyclic fused heterocyclic group in the specific example group G2. The same applies to $R_{601A}$ bonded with $R_{621}$, $R_{602A}$ bonded with $R_{613}$, and $R_{602A}$ bonded with $R_{614}$.

At least one combination of adjacent two or more of $R_{611}$ to $R_{621}$ are mutually bonded to form a substituted or unsubstituted monocyclic ring, or mutually bonded to form a substituted or unsubstituted fused ring.

For instance, $R_{611}$ and $R_{612}$ are optionally mutually bonded to form a structure in which a benzene ring, indole ring, pyrrole ring, benzofuran ring, benzothiophene ring or the like is fused to the six-membered ring bonded with $R_{611}$ and $R_{612}$, the resultant fused ring forming a naphthalene ring, carbazole ring, indole ring, dibenzofuran ring, or dibenzothiophene ring, respectively.

In an exemplary embodiment, $R_{611}$ to $R_{621}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{611}$ to $R_{621}$ not contributing to ring formation are each independently a hydrogen atom, or a substituted or unsubstituted alkyl group having 1 to 50 carbon atoms.

In an exemplary embodiment, $R_{611}$ to $R_{621}$ not contributing to ring formation are each independently a hydrogen atom, or a substituted or unsubstituted alkyl group having 1 to 50 carbon atoms; and at least one of $R_{611}$ to $R_{621}$ is a substituted or unsubstituted alkyl group having 1 to 50 carbon atoms.

In an exemplary embodiment, the compound represented by the formula (62) is a compound represented by a formula (63) below.

[Formula 304]

(63)

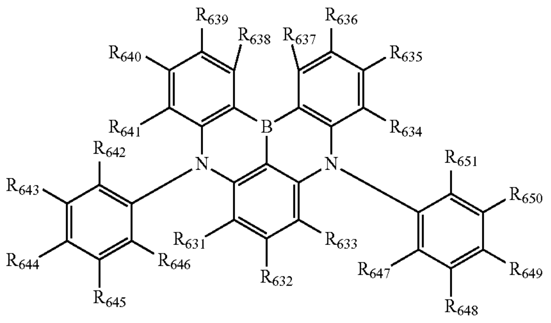

In the formula (63):

$R_{631}$ is bonded with $R_{646}$ to form a substituted or unsubstituted heterocycle, or not bonded therewith to form no substituted or unsubstituted heterocycle;

$R_{633}$ is bonded with $R_{647}$ to form a substituted or unsubstituted heterocycle, or not bonded therewith to form no substituted or unsubstituted heterocycle;

$R_{634}$ is bonded with $R_{651}$ to form a substituted or unsubstituted heterocycle, or not bonded therewith to form no substituted or unsubstituted heterocycle;

$R_{641}$ is bonded with $R_{642}$ to form a substituted or unsubstituted heterocycle, or not bonded therewith to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded; and $R_{631}$ to $R_{651}$ not forming the substituted or unsubstituted heterocycle, not forming the monocyclic ring, and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

$R_{631}$ is optionally bonded with $R_{646}$ to form a substituted or unsubstituted heterocycle. For instance, $R_{631}$ and $R_{646}$ are optionally bonded with each other to form a tri-or-more cyclic fused nitrogen-containing heterocycle, in which a benzene ring bonded with $R_{646}$, a ring including a nitrogen atom, and a benzene ring corresponding to the ring a are fused. Specific examples of the nitrogen-containing heterocycle include a compound corresponding to a nitrogen-containing tri(-or-more)cyclic fused heterocyclic group in the specific example group G2. The same applies to $R_{633}$ bonded with $R_{647}$, $R_{634}$ bonded with $R_{651}$, and $R_{641}$ bonded with $R_{642}$.

In an exemplary embodiment, $R_{631}$ to $R_{651}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{631}$ to $R_{651}$ not contributing to ring formation are each independently a hydrogen atom, or a substituted or unsubstituted alkyl group having 1 to 50 carbon atoms.

In an exemplary embodiment, $R_{631}$ to $R_{651}$ not contributing to ring formation are each independently a hydrogen atom, or a substituted or unsubstituted alkyl group having 1 to 50 carbon atoms; and at least one of $R_{631}$ to $R_{651}$ is a substituted or unsubstituted alkyl group having 1 to 50 carbon atoms.

In an exemplary embodiment, the compound represented by the formula (63) is a compound represented by a formula (63A) below.

[Formula 305]

(63A)

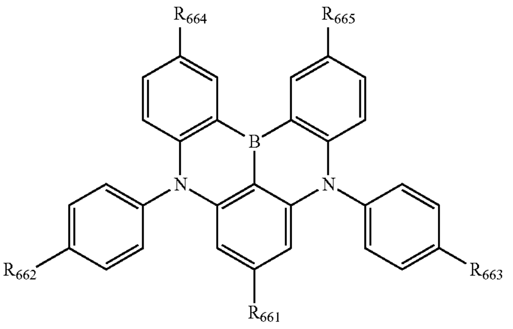

In the formula (63A):

$R_{661}$ is a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{662}$ to $R_{665}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms, or a substituted or unsubstituted aryl group having 6 to 50 ring carbon atoms.

In an exemplary embodiment, $R_{661}$ to $R_{665}$ are each independently a substituted or unsubstituted alkyl group having 1 to 50 carbon atoms.

In an exemplary embodiment, the compound represented by the formula (63) is a compound represented by a formula (63B) below.

[Formula 306]

(63B)

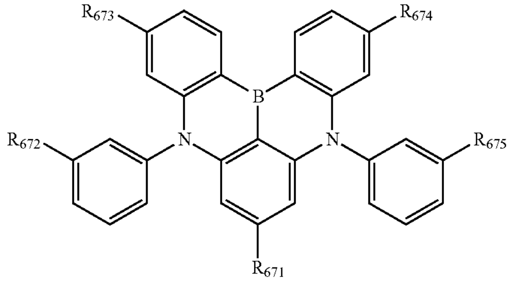

In the formula (63B):

$R_{671}$ and $R_{672}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms; and $R_{673}$ to $R_{675}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms.

In an exemplary embodiment, the compound represented by the formula (63) is a compound represented by a formula (63B') below.

[Formula 307]

(63B')

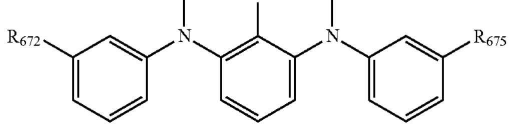

In the formula (63B'), $R_{672}$ to $R_{675}$ each independently represent the same as $R_{672}$ to $R_{675}$ in the formula (63B).

In an exemplary embodiment, at least one of $R_{671}$ to $R_{675}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$N(R_{906})(R_{907})$, or a substituted or unsubstituted aryl group having 6 to 50 ring carbon atoms.

In an exemplary embodiment:

$R_{672}$ is a hydrogen atom, a substituted or unsubstituted alkyl group having 1 to 50 carbon atoms, a group represented by —$N(R_{906})(R_{907})$, or a substituted or unsubstituted aryl group having 6 to 50 ring carbon atoms; and $R_{671}$ and $R_{673}$ to $R_{675}$ are each independently a substituted or unsubstituted alkyl group having 1 to 50 carbon atoms, a group represented by —$N(R_{906})(R_{907})$, or a substituted or unsubstituted aryl group having 6 to 50 ring carbon atoms.

In an exemplary embodiment, the compound represented by the formula (63) is a compound represented by a formula (63C) below.

[Formula 308]

(63C)

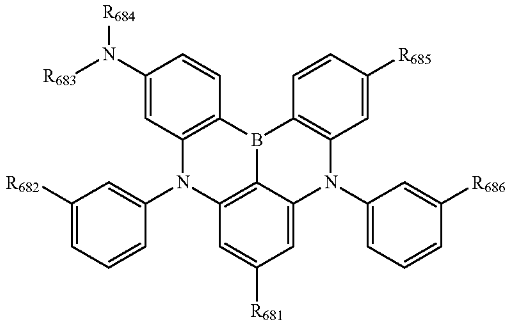

In the formula (63C):

$R_{681}$ and $R_{682}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{683}$ to $R_{686}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In an exemplary embodiment, the compound represented by the formula (63) is a compound represented by a formula (63C') below.

[Formula 309]

(63C')

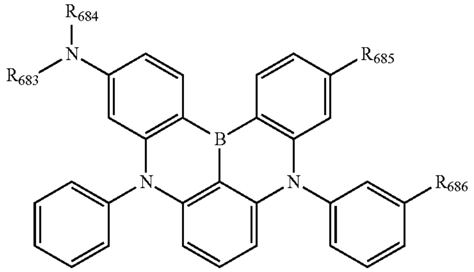

In the formula (63C'), $R_{683}$ to $R_{686}$ each independently represent the same as $R_{683}$ to $R_{686}$ in the formula (63C).

In an exemplary embodiment, $R_{681}$ to $R_{686}$ are each independently a substituted or unsubstituted alkyl group having 1 to 50 carbon atoms or a substituted or unsubstituted aryl group having 6 to 50 ring carbon atoms.

In an exemplary embodiment, $R_{681}$ to $R_{686}$ are each independently a substituted or unsubstituted aryl group having 6 to 50 carbon atoms.

The compound represented by the formula (6) is producible by initially bonding the ring a, ring b and ring c with linking groups (a group including N—$R_{601}$ and a group including N—$R_{602}$) to form an intermediate (first reaction), and bonding the ring a, ring b and ring c with a linking group (a group including a boron atom) to form a final product (second reaction). In the first reaction, an amination reaction (e.g. Buchwald-Hartwig reaction) is applicable. In the second reaction, Tandem Hetero-Friedel-Crafts Reactions or the like is applicable.

Specific Examples of Compound Represented by Formula (6)

Specific examples of the compound represented by the formula (6) are shown below. It should however be noted that these specific examples are merely exemplary and do not limit the compound represented by the formula (6).

[Formula 310]

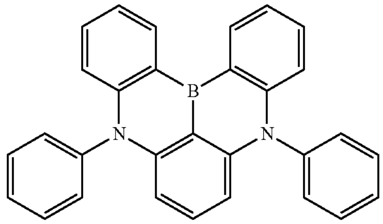

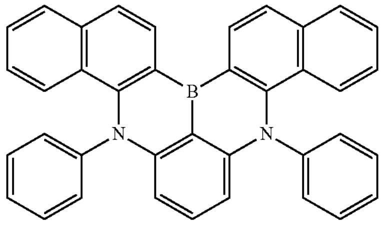

-continued
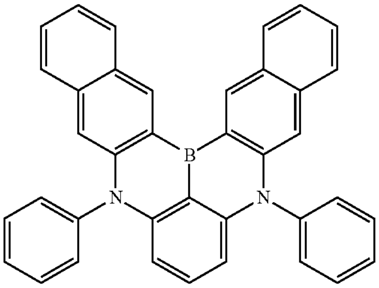
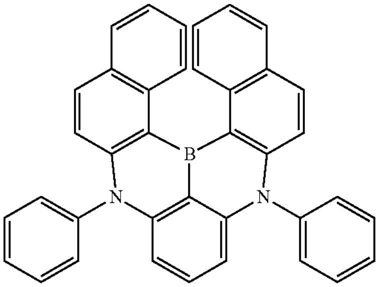
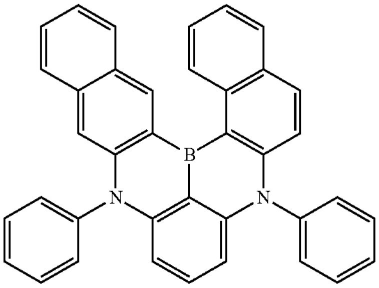
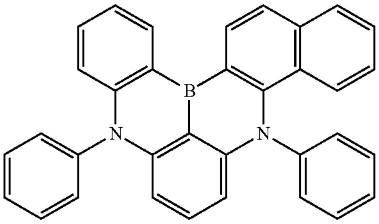
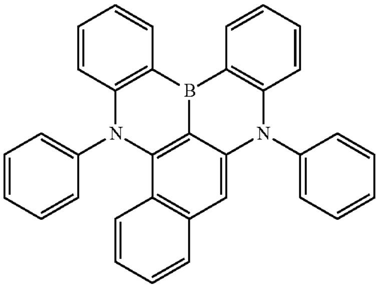
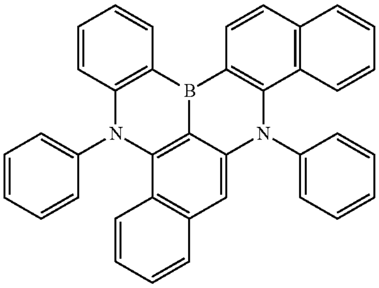
-continued
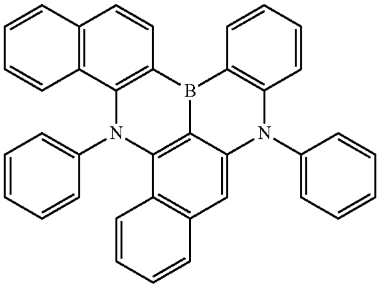
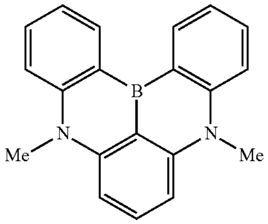
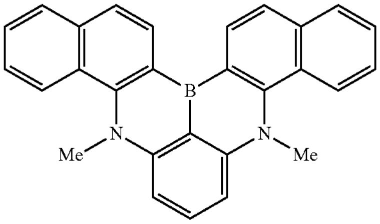
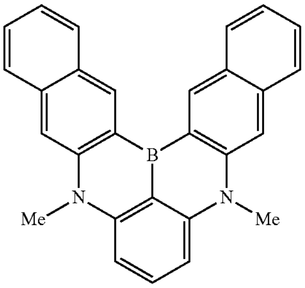
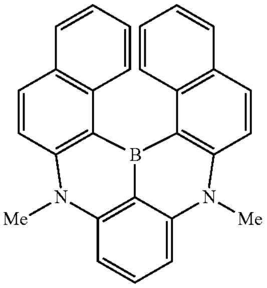
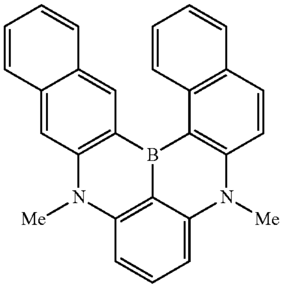
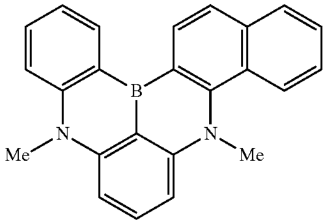

-continued
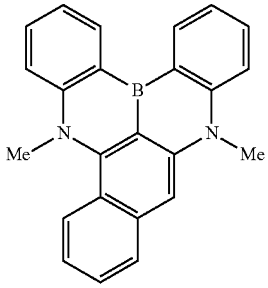
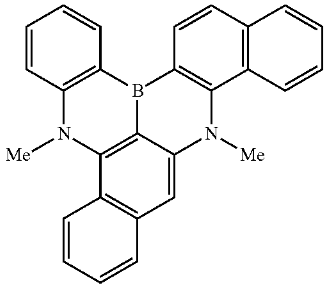
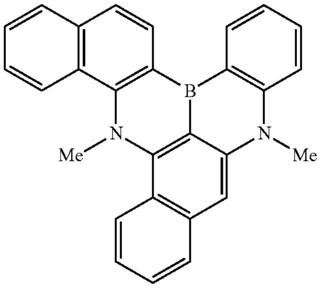
[Formula 311]
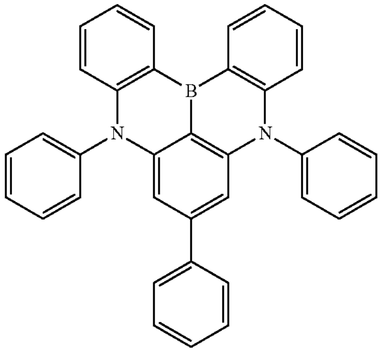
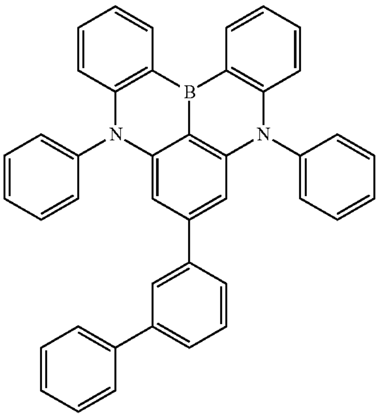
-continued
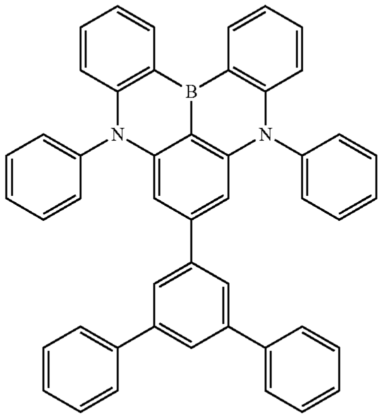
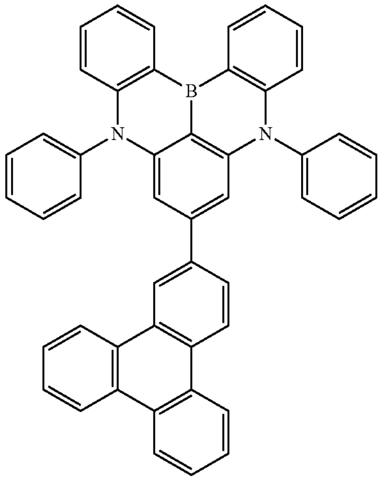
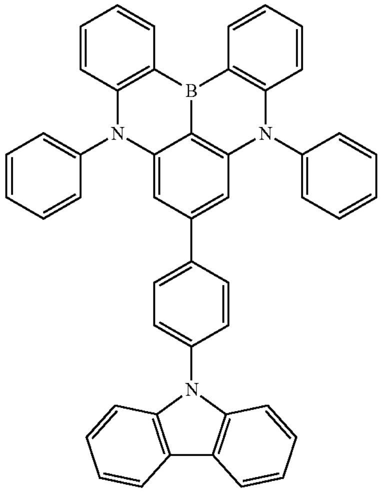

-continued
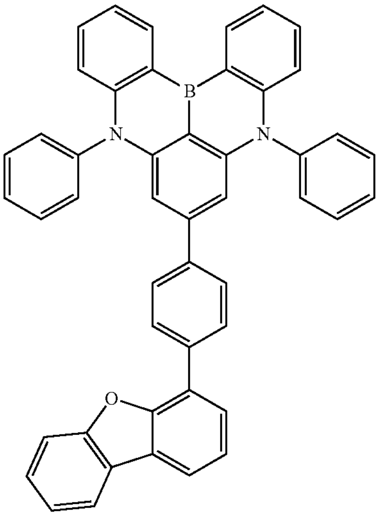
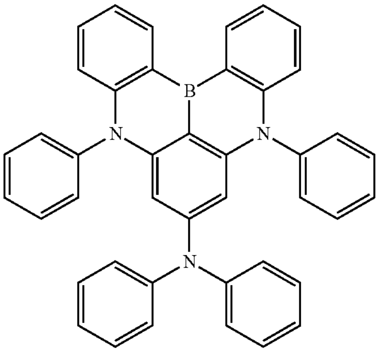
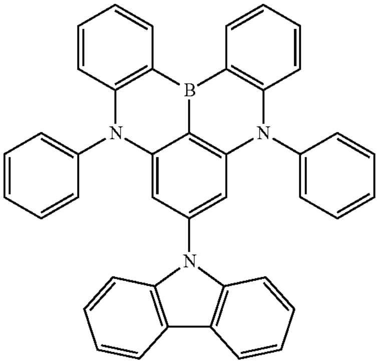
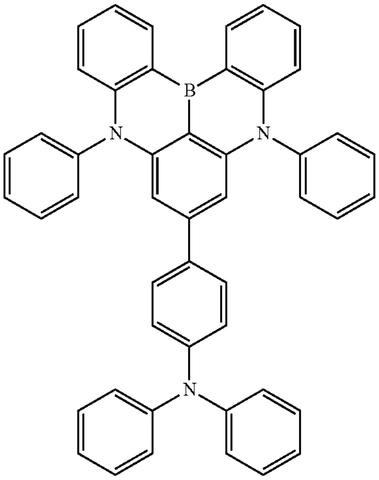
-continued
[Formula 312]
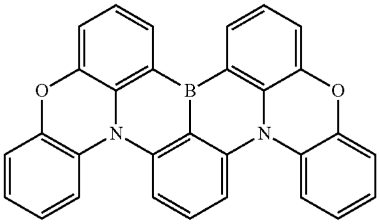
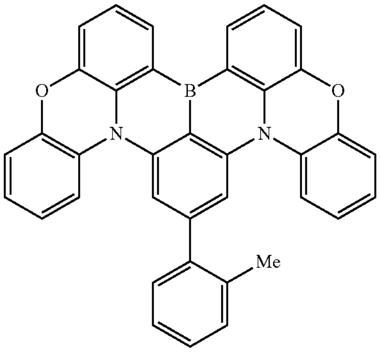
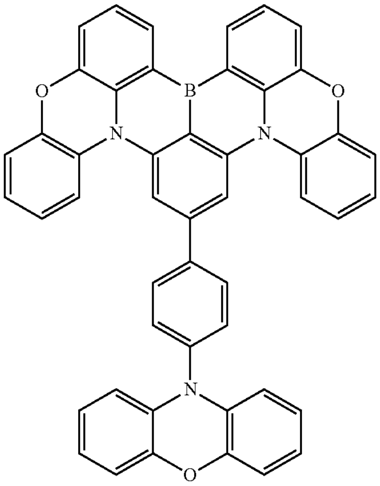
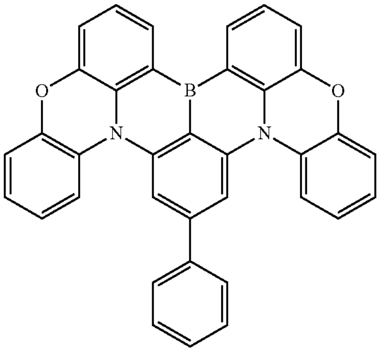

-continued
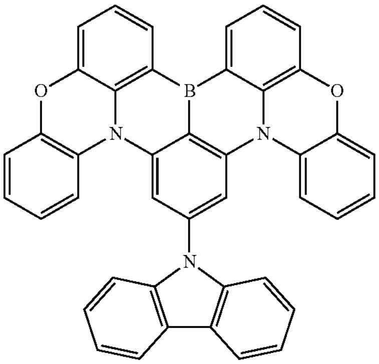
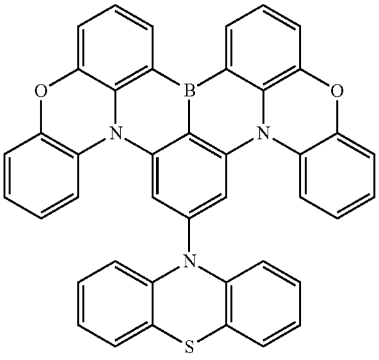
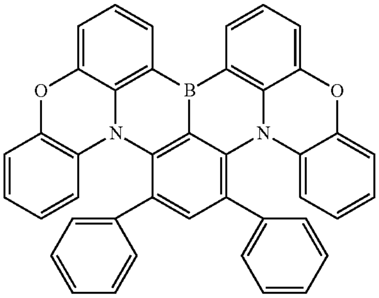
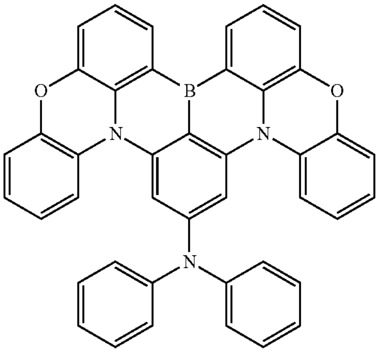
-continued
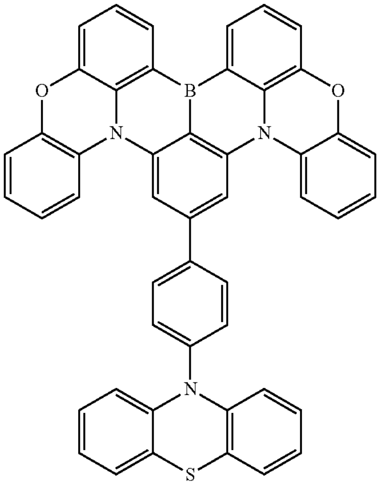
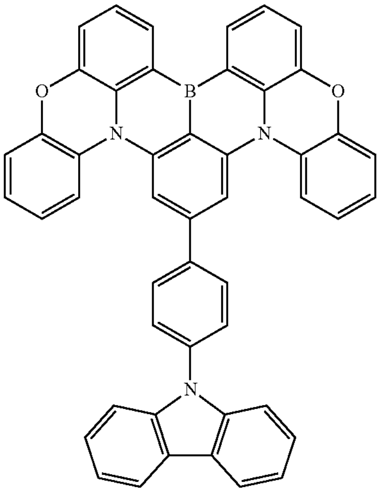
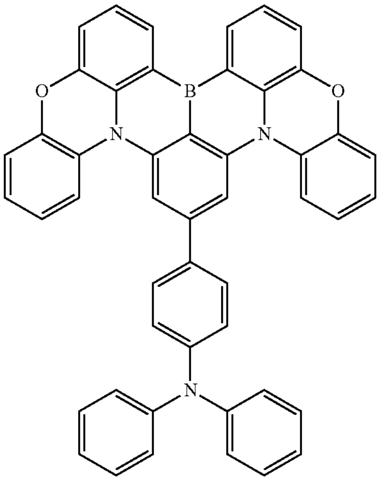

-continued
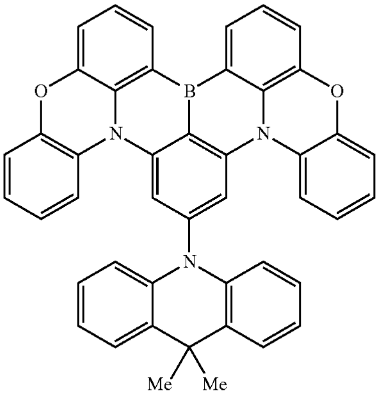
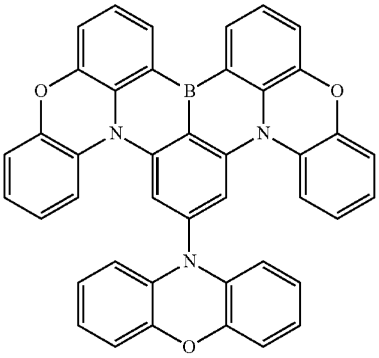
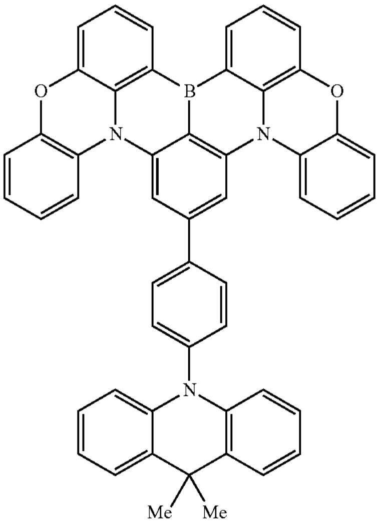
[Formula 313]
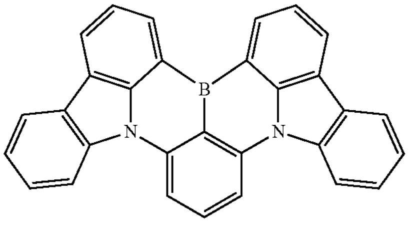
-continued
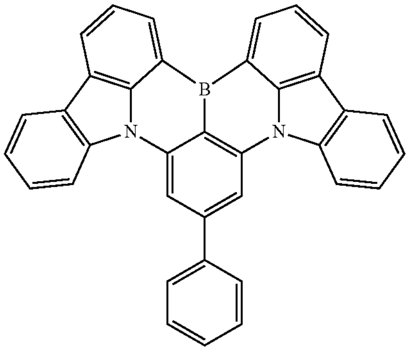
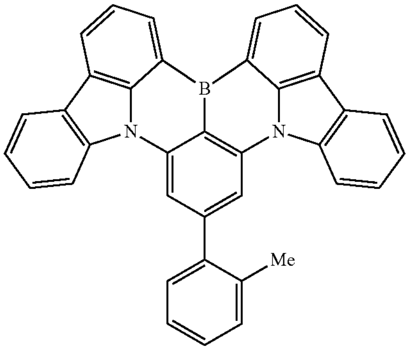
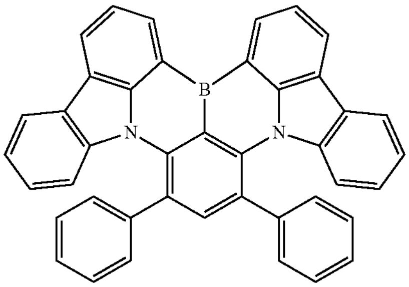
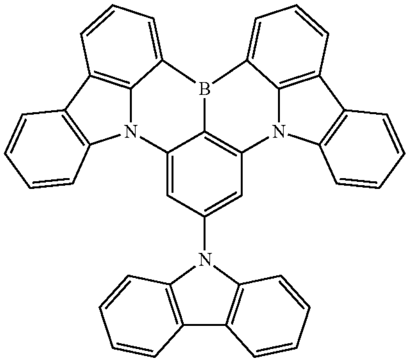
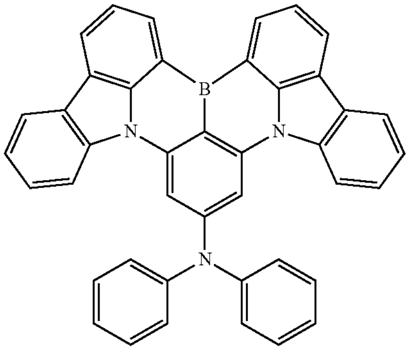

-continued
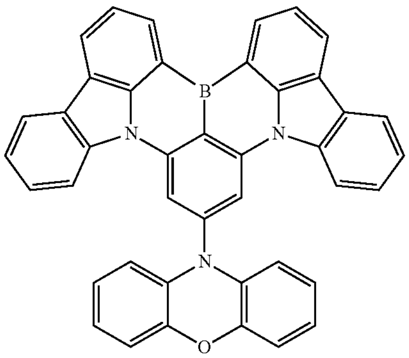
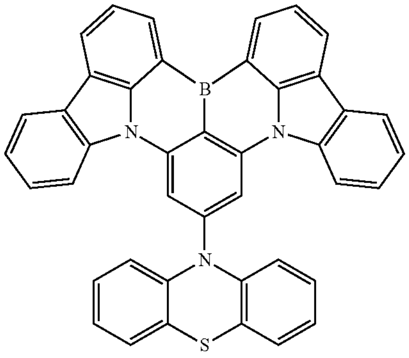
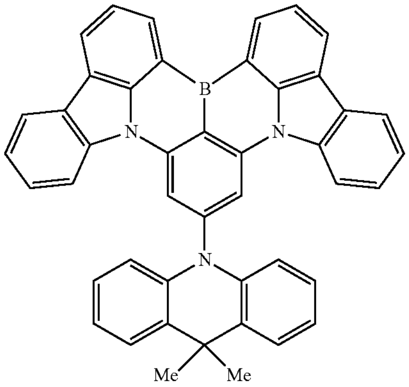
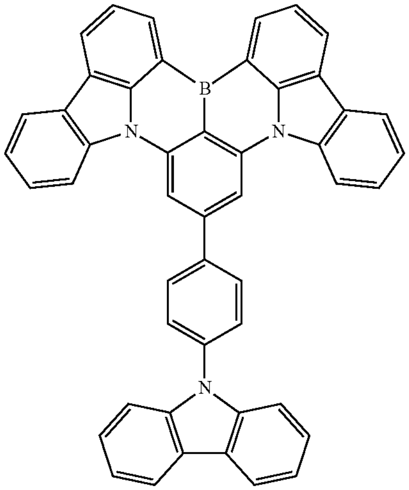
-continued
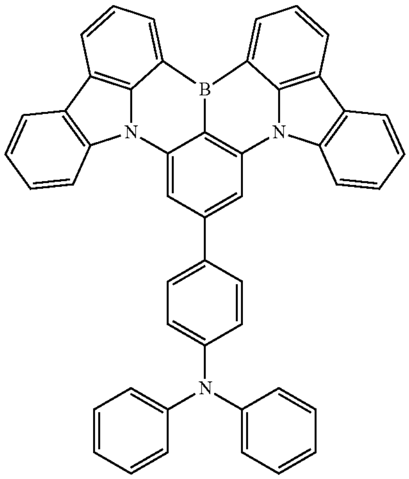
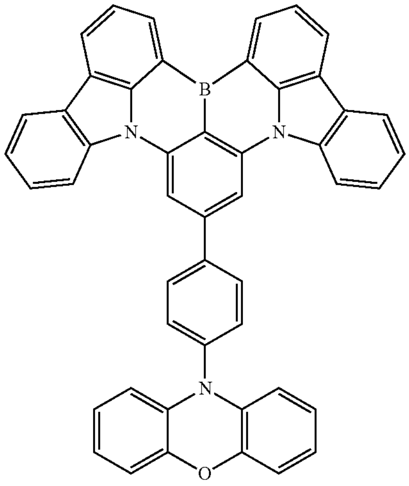
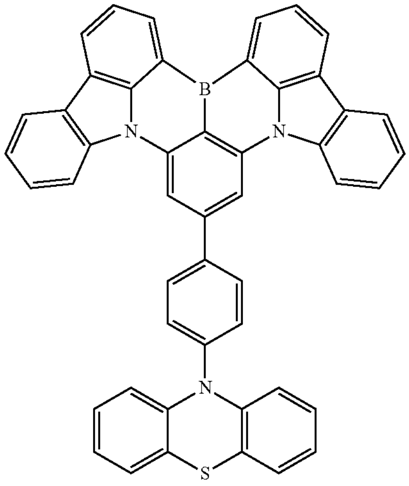

-continued
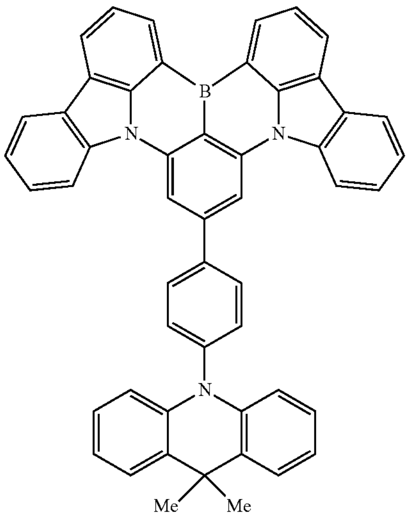
[Formula 314]
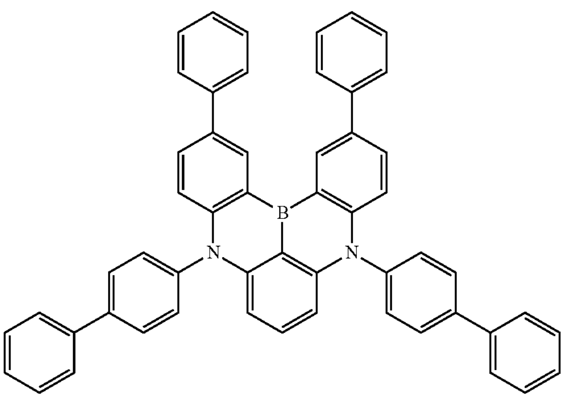
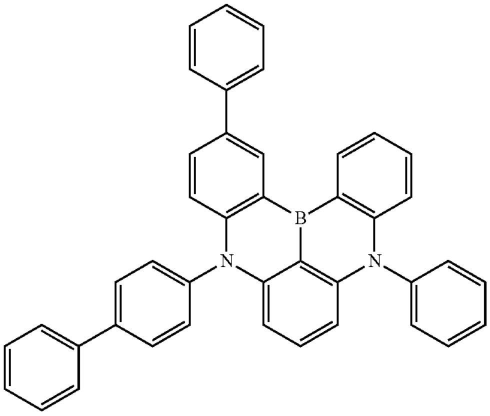
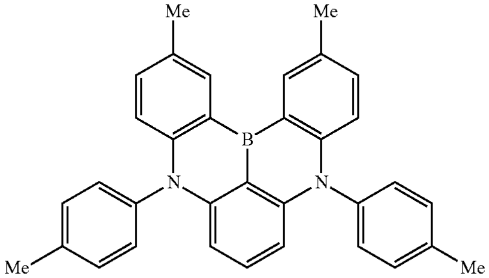
-continued
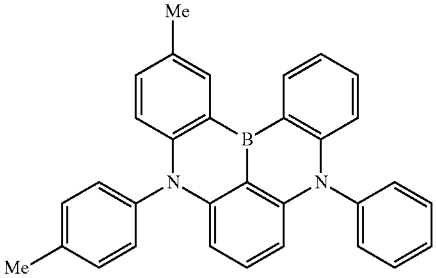
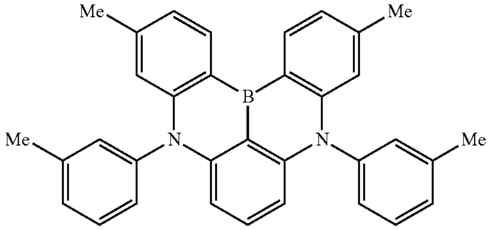
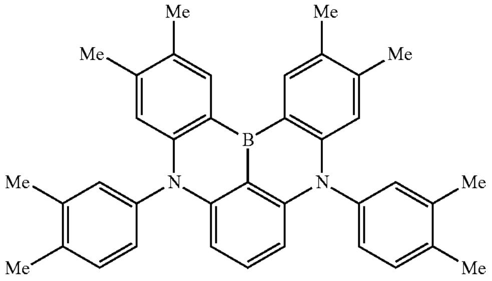
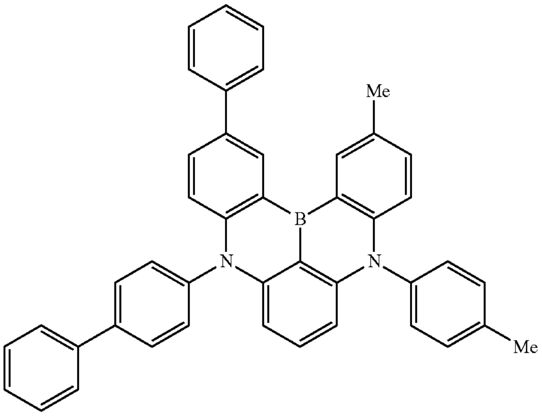
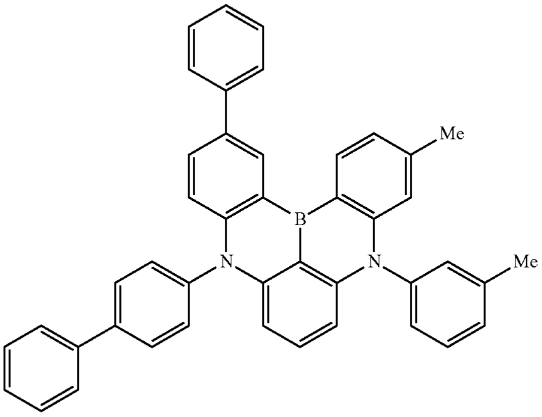

-continued
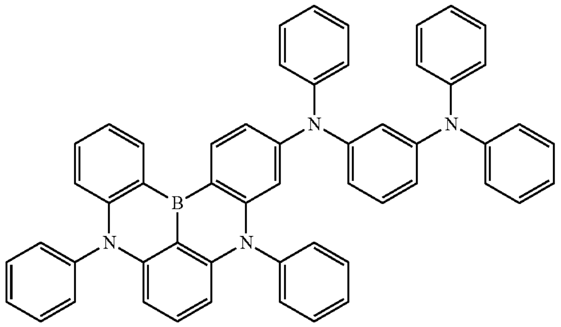
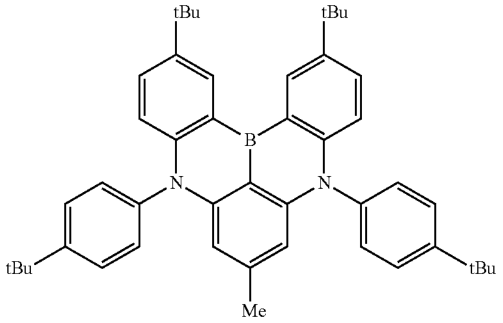
[Formula 315]
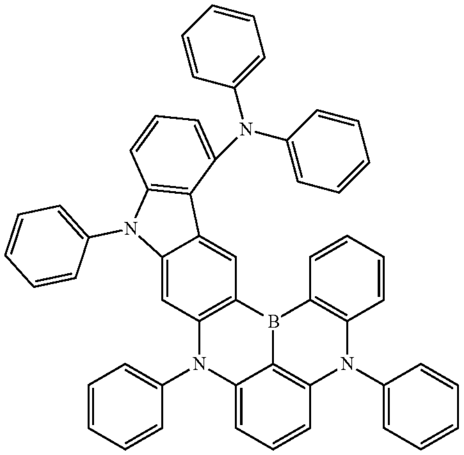
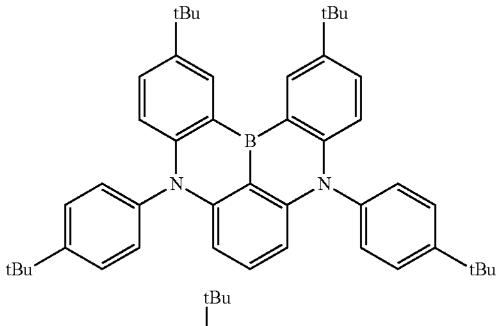
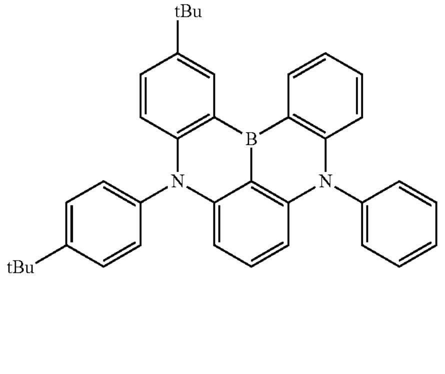
-continued
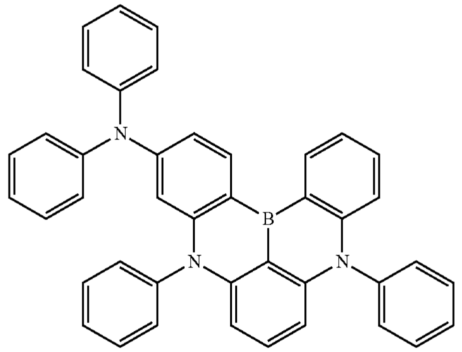
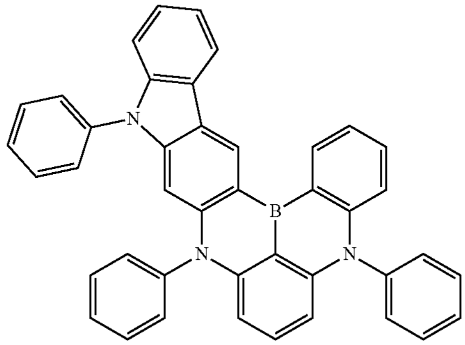
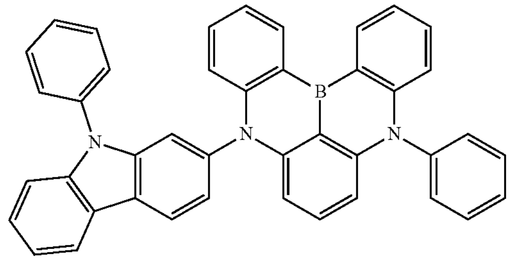
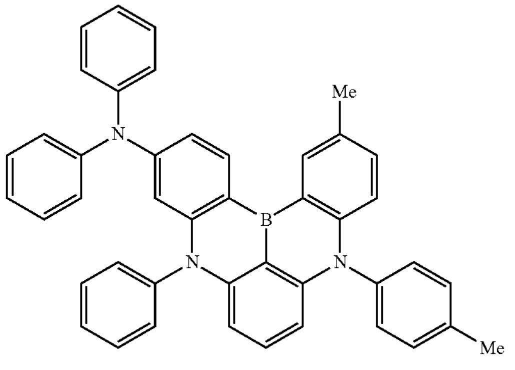
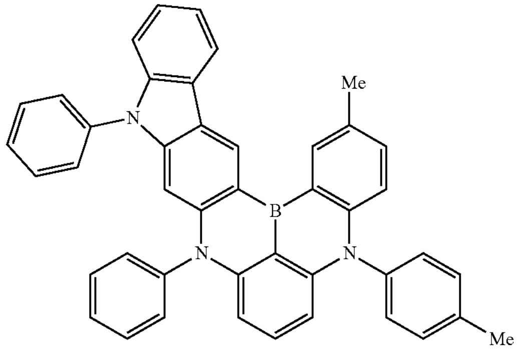

-continued
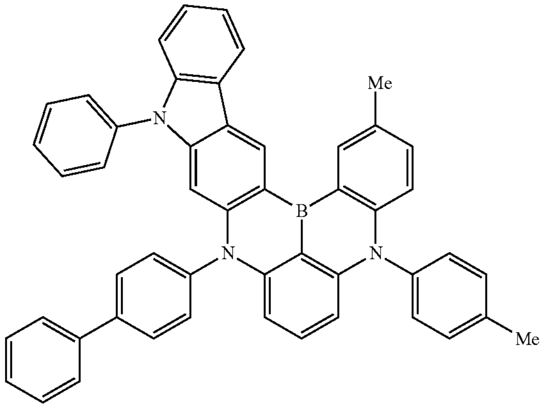
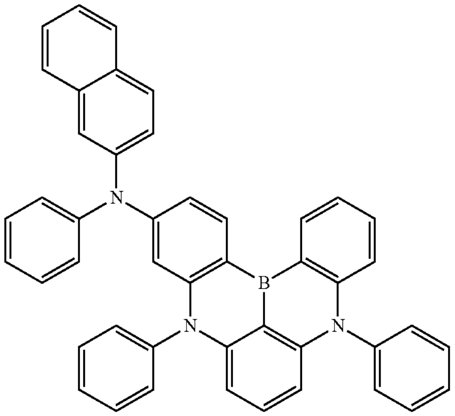
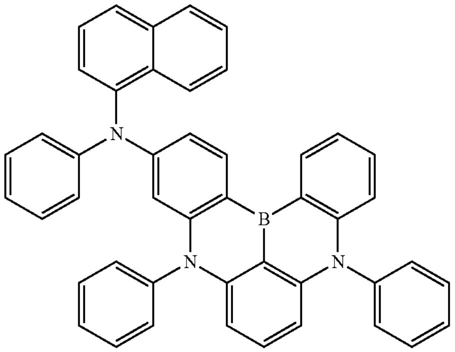
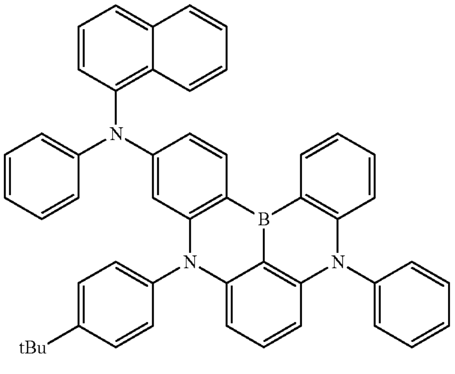
-continued
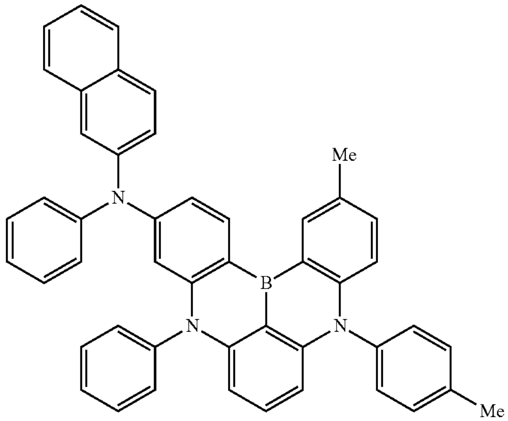
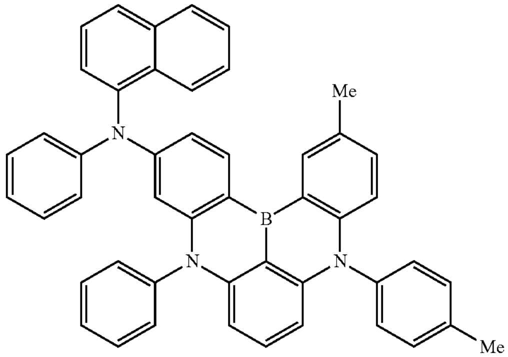
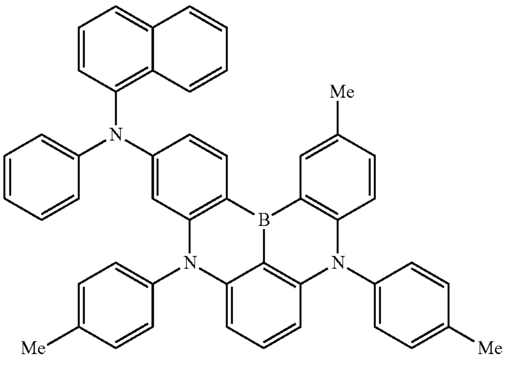

[Formula 316]
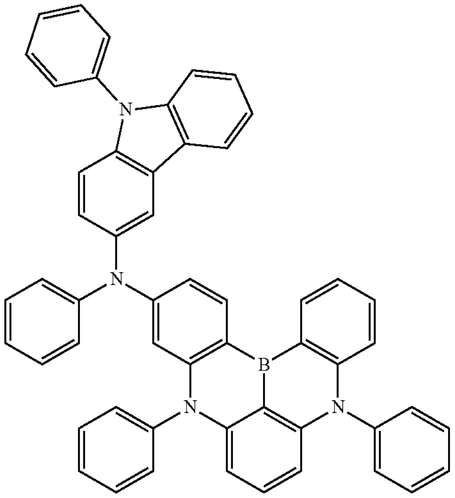
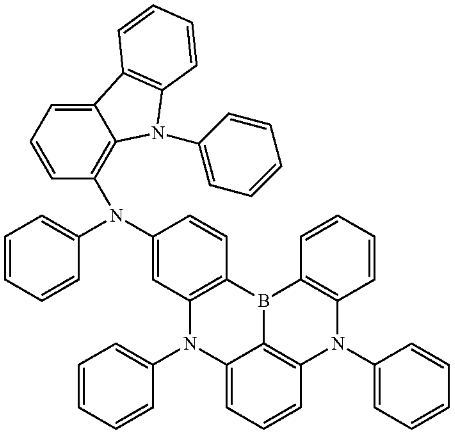
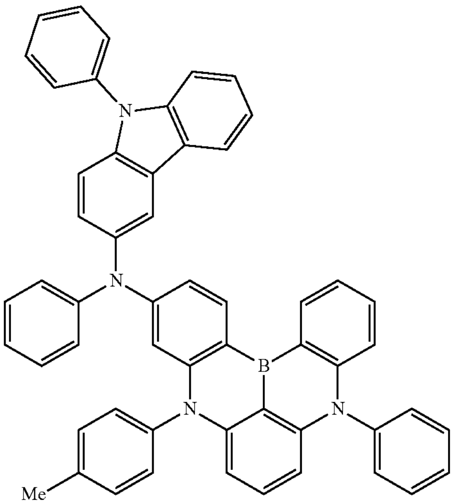
-continued
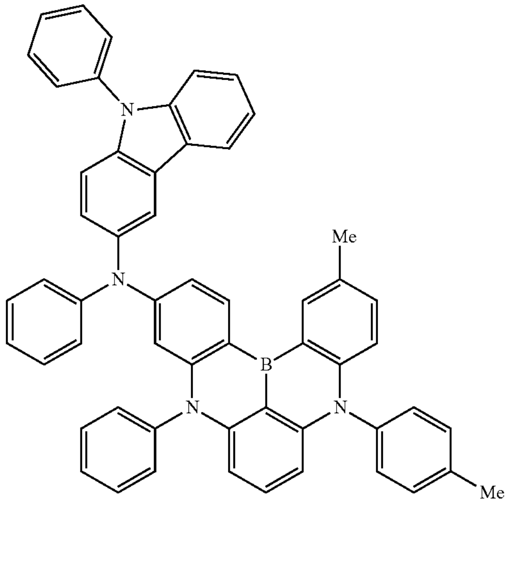
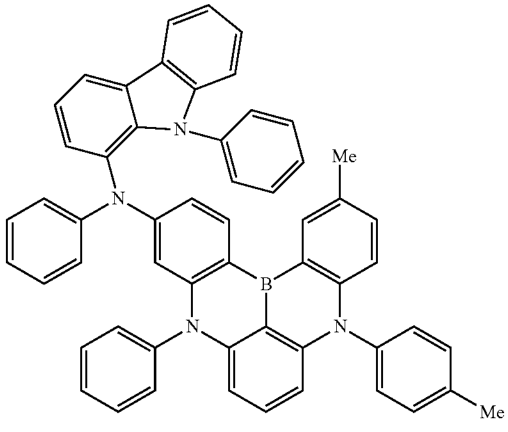

-continued
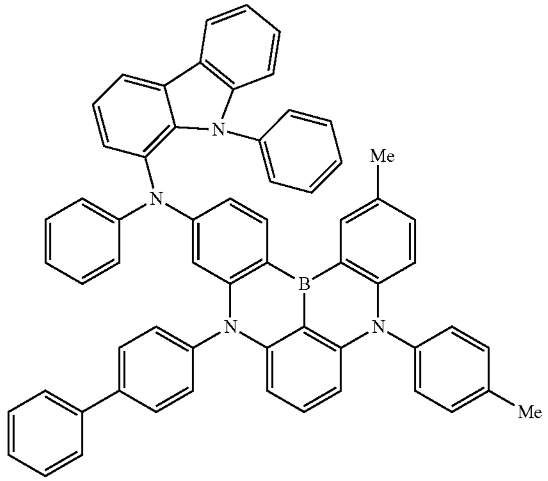
-continued
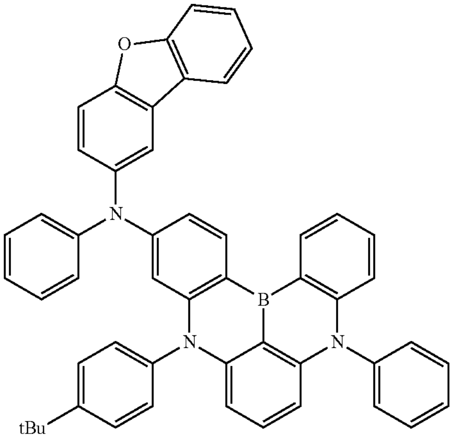
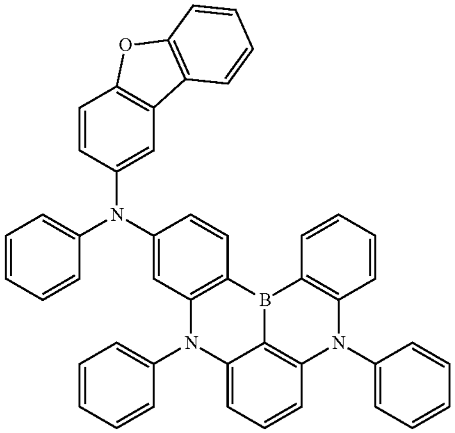
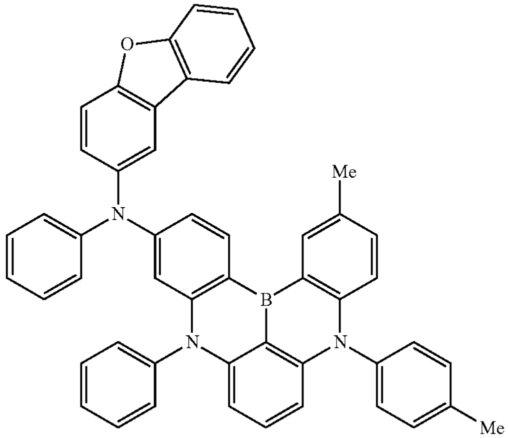
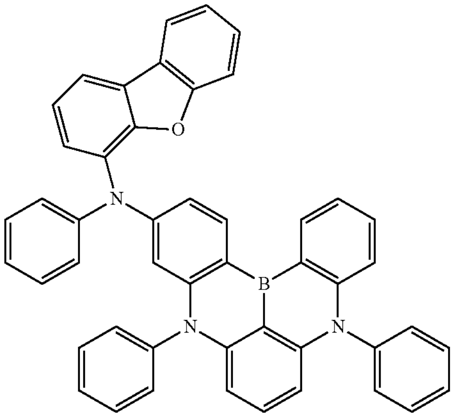
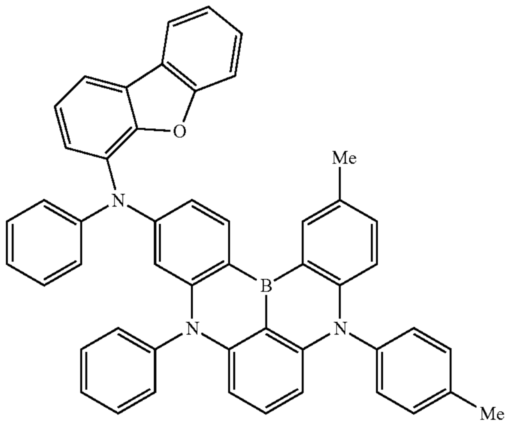

-continued
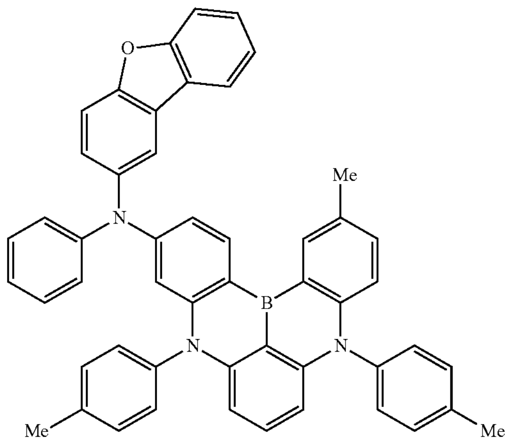
[Formula 317]
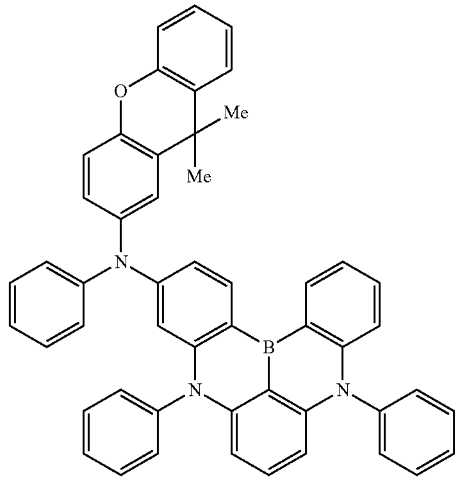
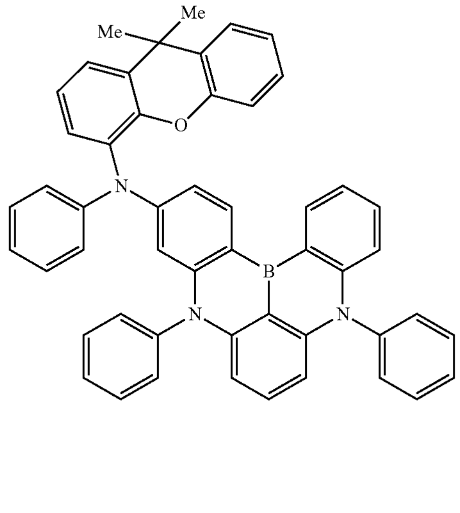
-continued
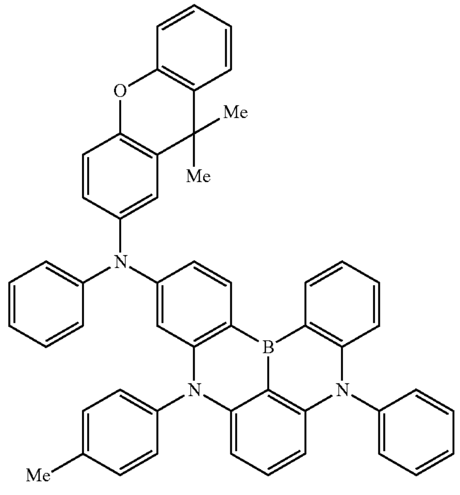
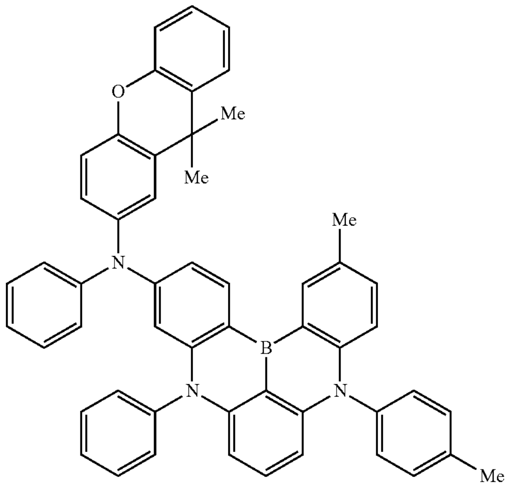
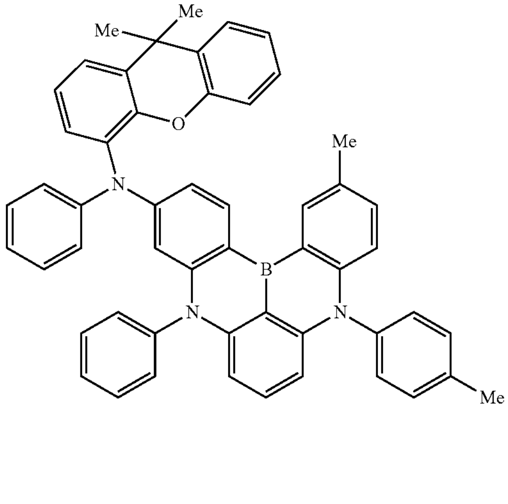

-continued
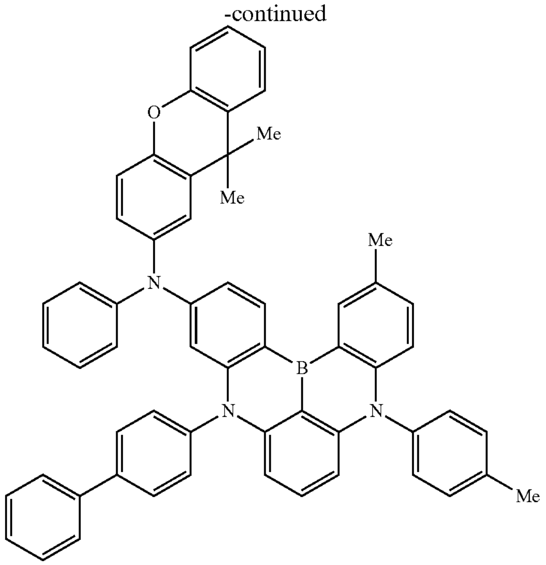
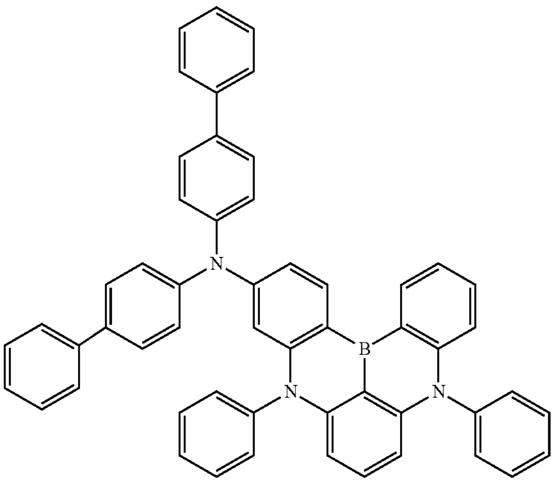
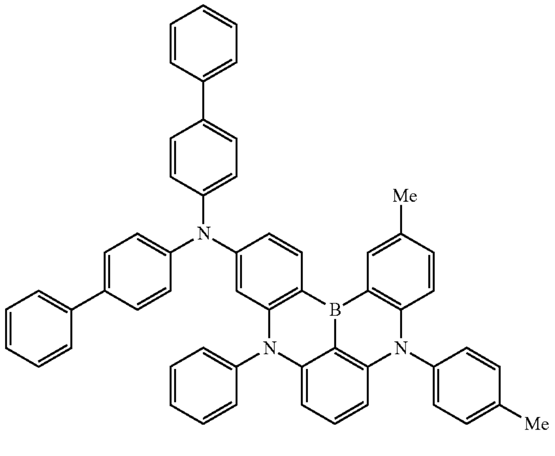
-continued
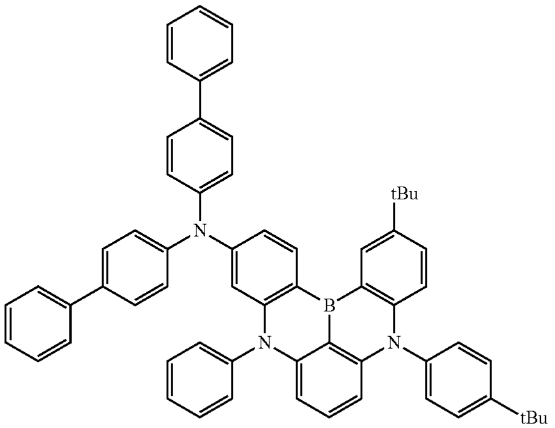
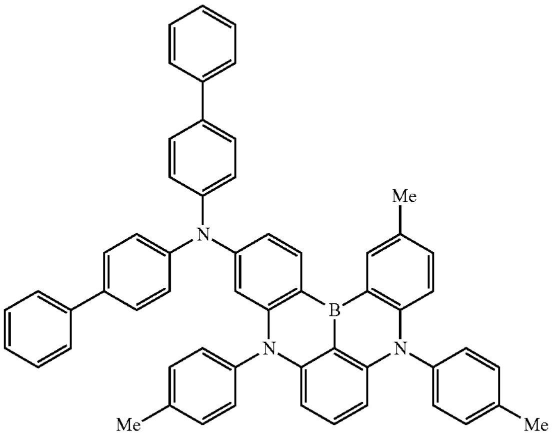
Formula 318]
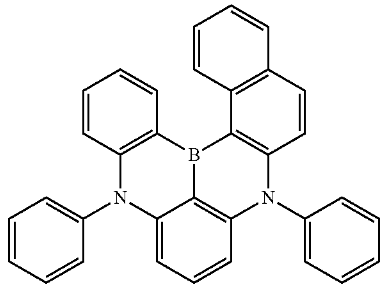
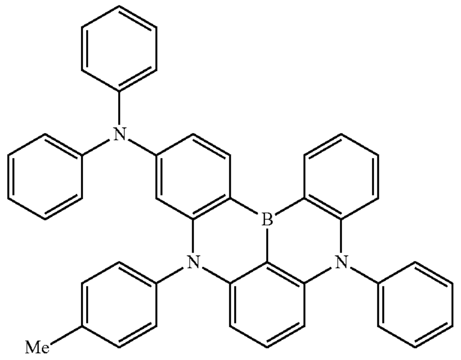

-continued
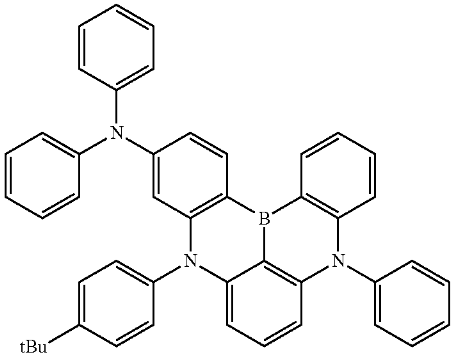
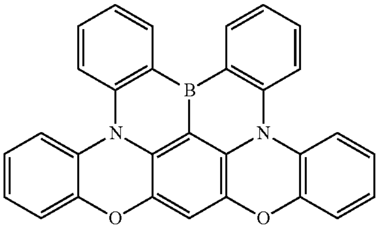
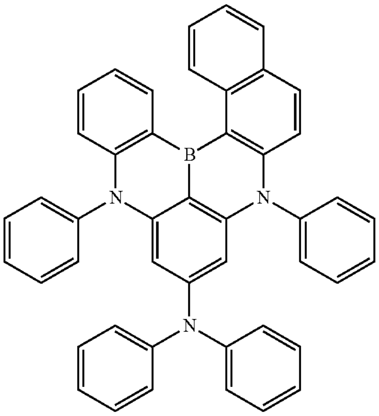
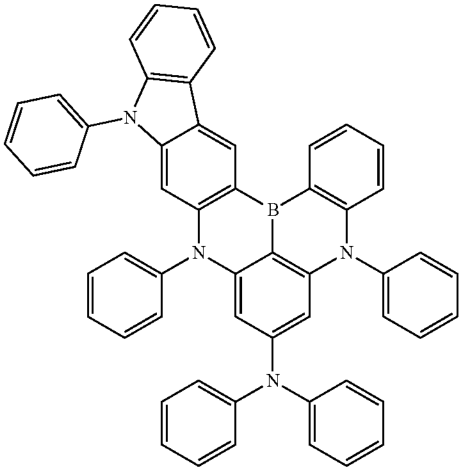
-continued
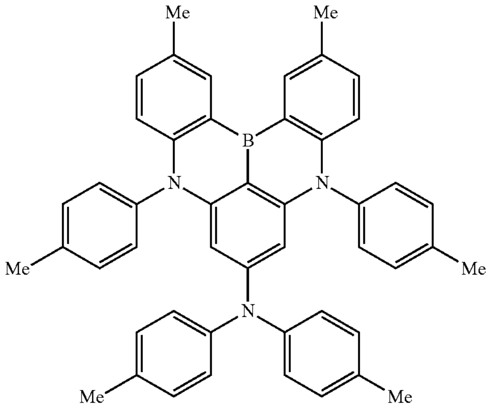
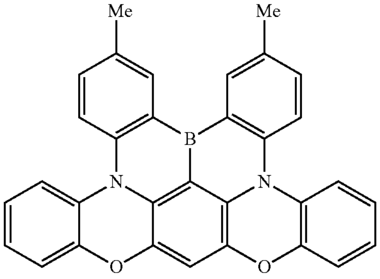
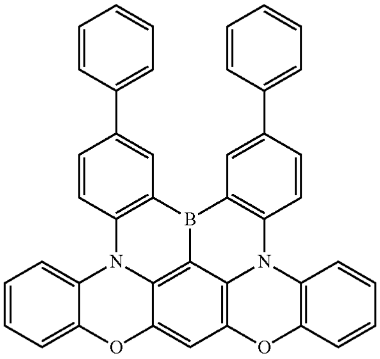
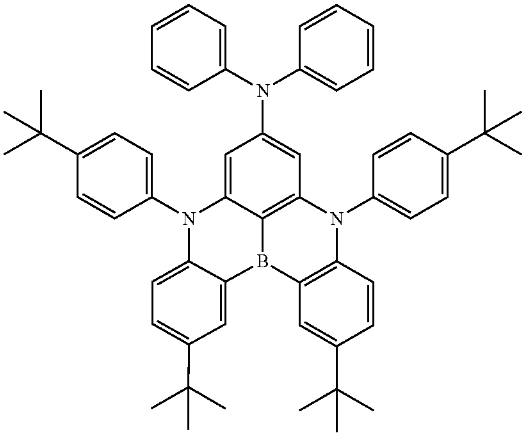

-continued
[Formula 319]
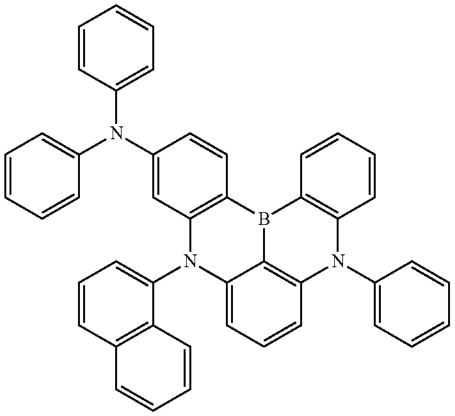
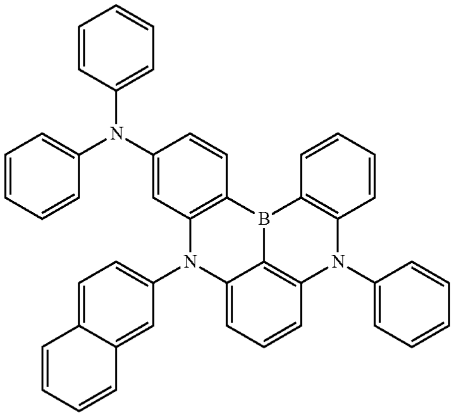
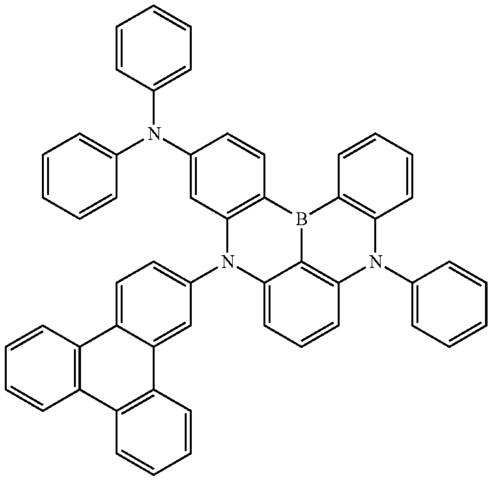
-continued
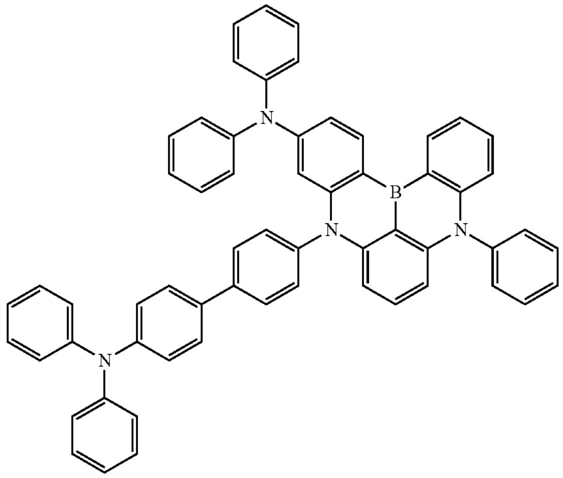
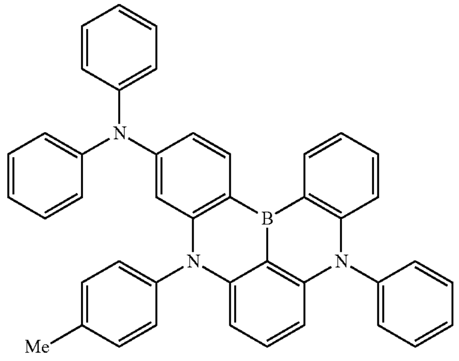
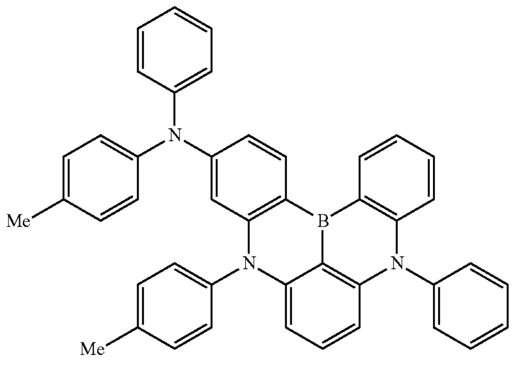
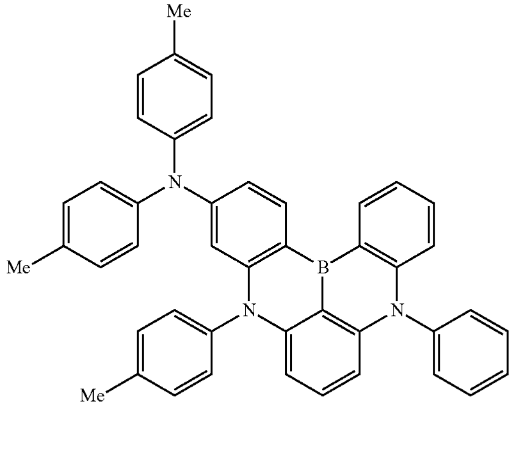

-continued
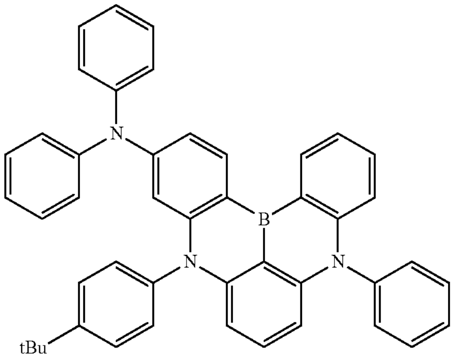
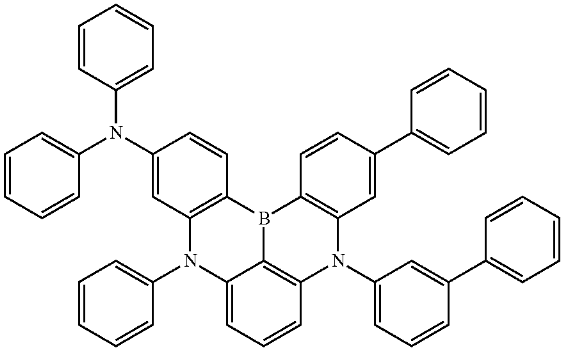
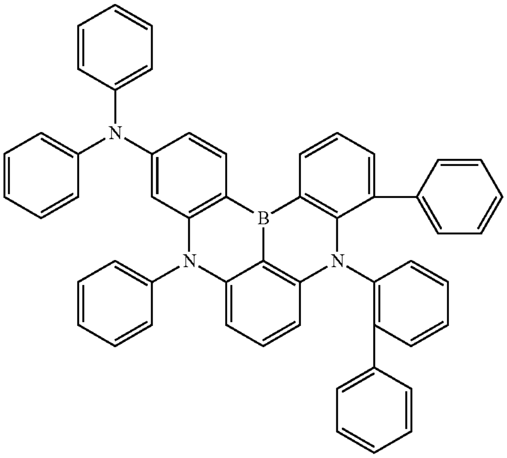
[Formula 320]
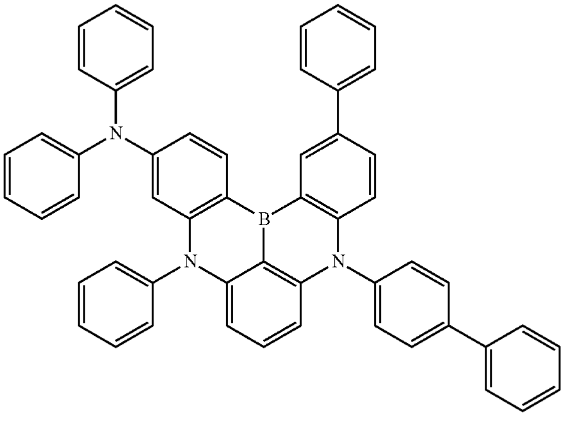
-continued
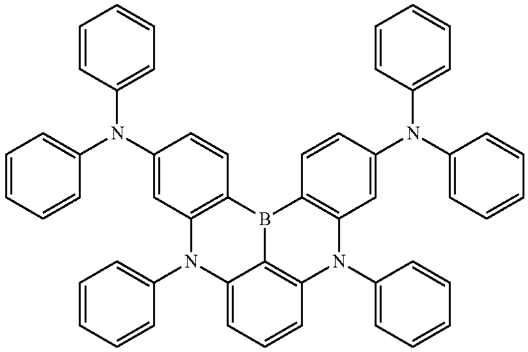
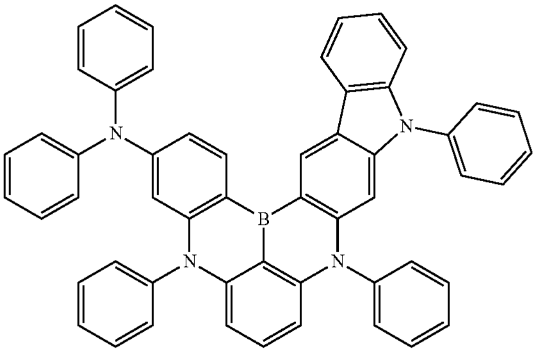
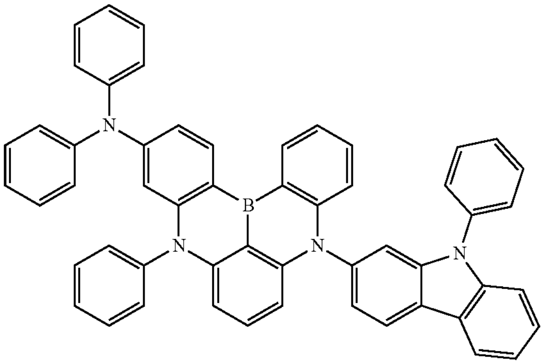
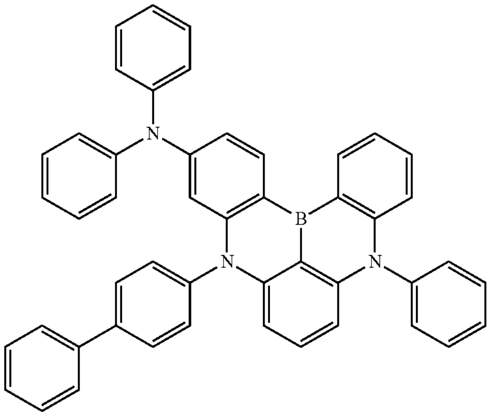

-continued
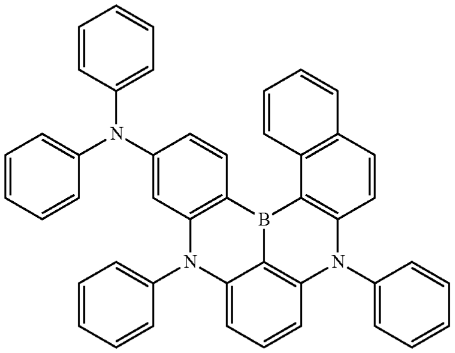
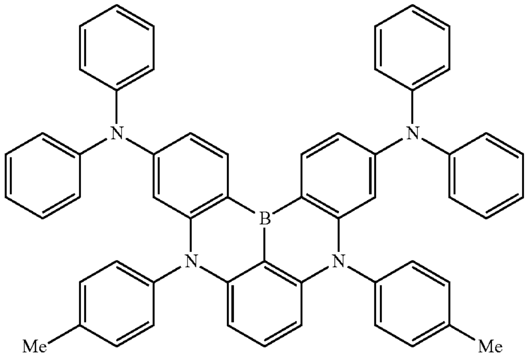
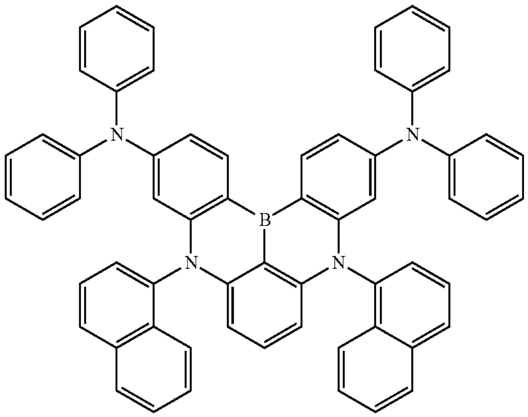
[Formula 321]
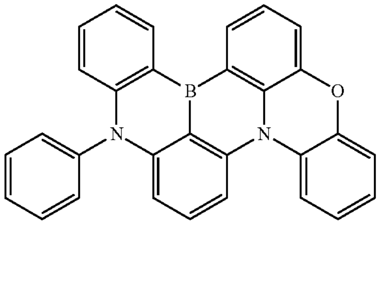
-continued
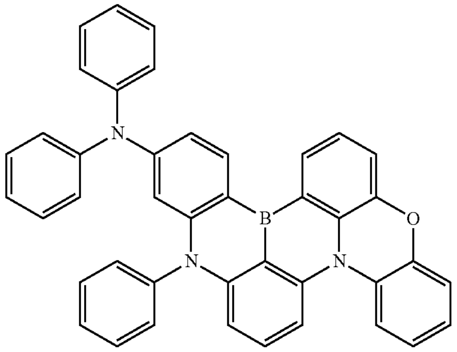
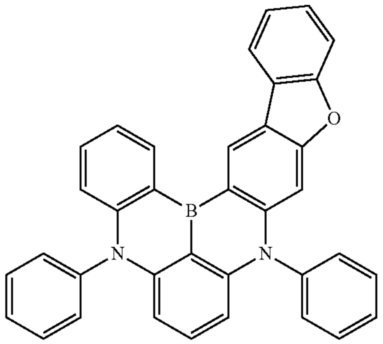
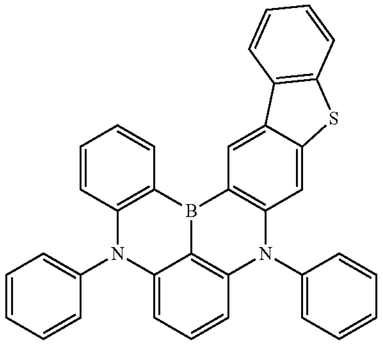
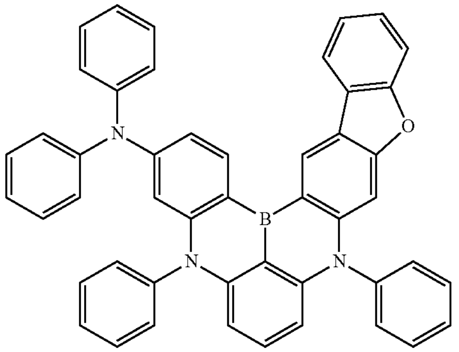
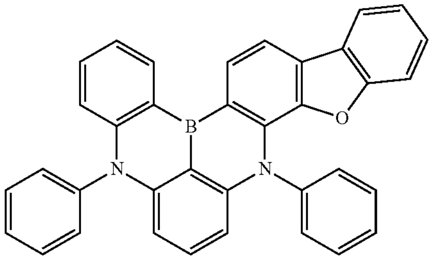

-continued

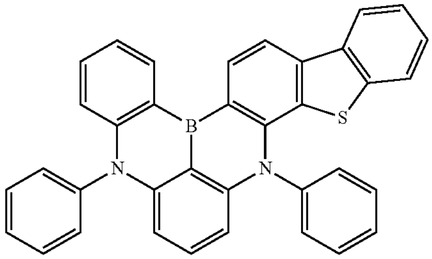

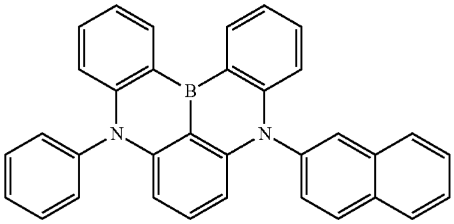

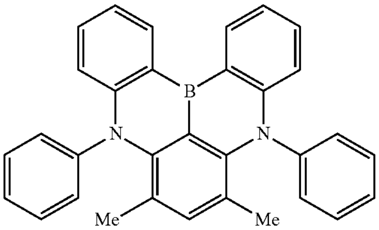

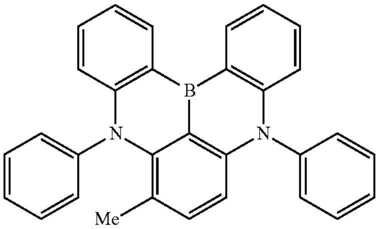

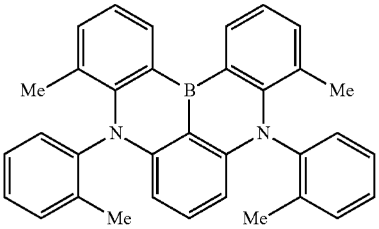

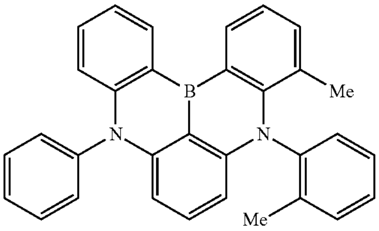

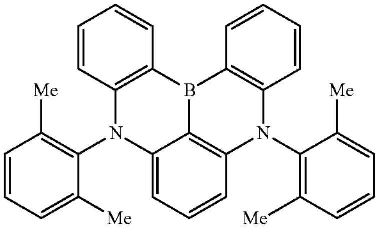

-continued

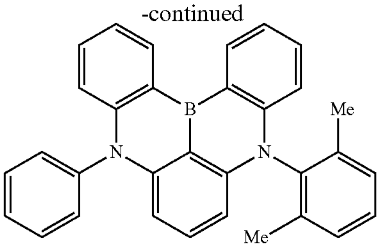

Compound Represented by Formula (7)

The compound represented by the formula (7) will be described below.

[Formula 322]

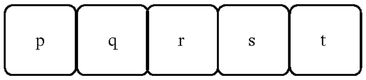

(7)

[Formula 323]

(72)

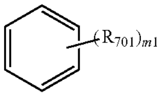

(73)

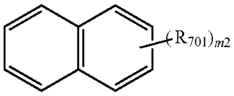

(74)

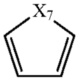

(75)

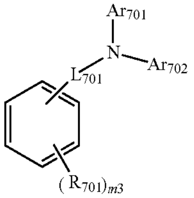

(76)

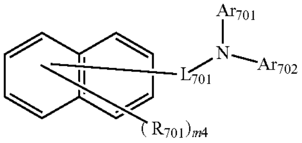

In the formula (7):

a ring r is a ring represented by the formula (72) or the formula (73), the ring r being fused with adjacent ring(s) at any position(s);

a ring q and a ring s are each independently a ring represented by the formula (74) and fused with adjacent ring(s) at any position(s);

a ring p and a ring t are each independently a structure represented by the formula (75) or the formula (76) and fused with adjacent ring(s) at any position(s);

$X_7$ is an oxygen atom, a sulfur atom, or $NR_{702}$;

when a plurality of $R_{701}$ are present, adjacent ones of the plurality of $R_{701}$ are mutually bonded to form a substituted or unsubstituted monocyclic ring, mutually bonded to form a substituted or unsubstituted fused ring, or not mutually bonded;

$R_{701}$ forming neither the monocyclic ring nor the fused ring and $R_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms; and $Ar_{701}$ and $Ar_{702}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

$L_{701}$ is a substituted or unsubstituted alkylene group having 1 to 50 carbon atoms, a substituted or unsubstituted alkenylene group having 2 to 50 carbon atoms, a substituted or unsubstituted alkynylene group having 2 to 50 carbon atoms, a substituted or unsubstituted cycloalkylene group having 3 to 50 ring carbon atoms, a substituted or unsubstituted arylene group having 6 to 50 ring carbon atoms, or a substituted or unsubstituted divalent heterocyclic group having 5 to 50 ring atoms;

m1 is 0, 1, or 2;

m2 is 0, 1, 2, 3, or 4;

m3 are each independently 0, 1, 2, or 3;

m4 are each independently 0, 1, 2, 3, 4, or 5;

when a plurality of $R_{701}$ are present, the plurality of $R_{701}$ are mutually the same or different;

when a plurality of $X_7$ are present, the plurality of $X_7$ are mutually the same or different;

when a plurality of $R_{702}$ are present, the plurality of $R_{702}$ are mutually the same or different;

when a plurality of $Ar_{701}$ are present, the plurality of $Ar_{701}$ are mutually the same or different;

when a plurality of $Ar_{702}$ are present, the plurality of $Ar_{702}$ are mutually the same or different; and when a plurality of $L_{701}$ are present, the plurality of $L_{701}$ are mutually the same or different.

In the formula (7), each of the ring p, ring q, ring r, ring s, and ring t is fused with an adjacent ring(s) sharing two carbon atoms. The fused position and orientation are not limited but may be defined as required.

In an exemplary embodiment, in the formula (72) or the formula (73) representing the ring r, m1=0 or m2=0 is satisfied.

In an exemplary embodiment, the compound represented by the formula (7) is represented by any one of formulae (71-1) to (71-6) below.

[Formula 324]

(71-1)

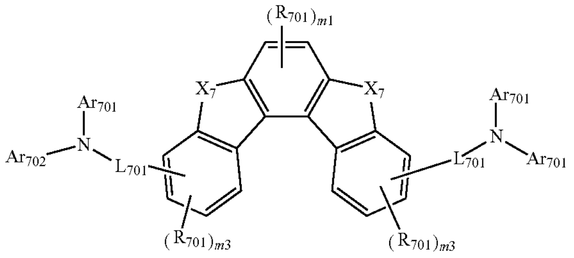

[Formula 325]

(71-2)

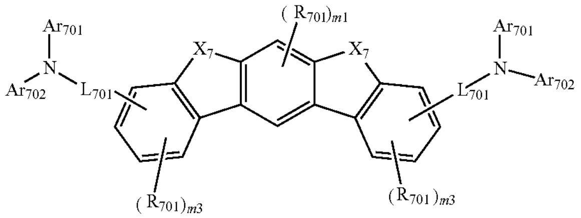

[Formula 326]

(71-3)

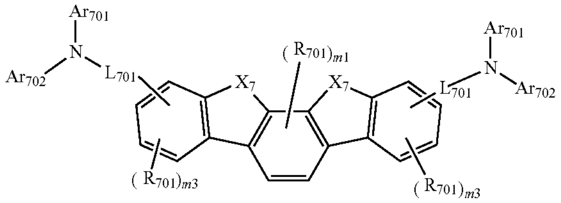

[Formula 327]

(71-4)

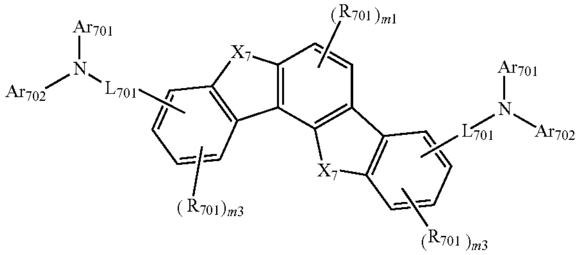

[Formula 328]

(71-5)

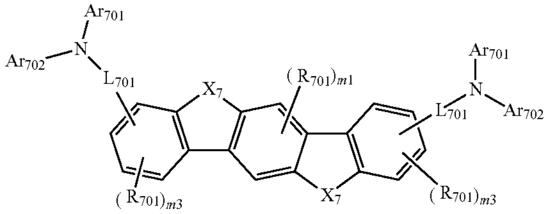

-continued

[Formula 329]

(71-6)

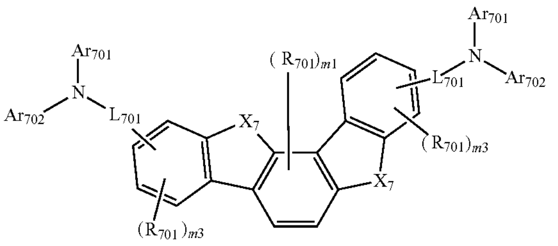

In the formulae (71-1) to (71-6), $R_{701}$, $X_7$, $Ar_{70}$, $Ar_{702}$, $L_{701}$, m1 and m3 respectively represent the same as $R_{701}$, $X_7$, $Ar_{701}$, $Ar_{702}$, $L_{701}$, m1 and m3 in the formula (7).

In an exemplary embodiment, the compound represented by the formula (7) is represented by any one of formulae (71-11) to (71-13) below.

[Formula 330]

(71-11)

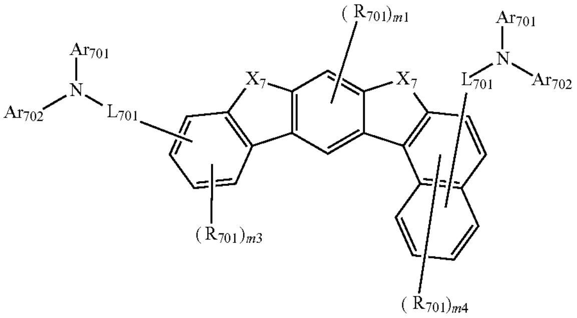

-continued

[Formula 331]

(71-12)

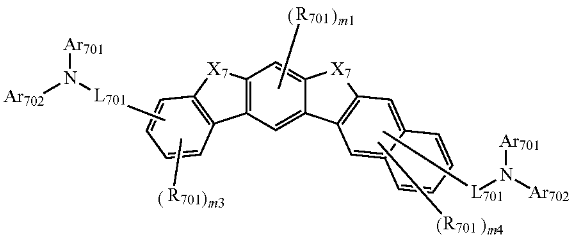

[Formula 332]

(71-13)

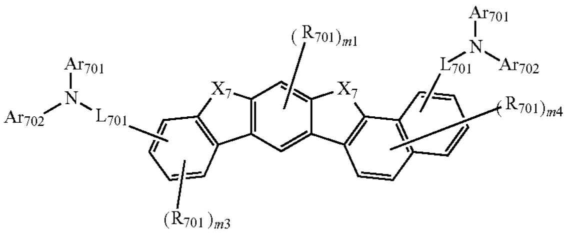

In the formulae (71-11) to (71-13), $R_{701}$, $X_7$, $Ar_{701}$, $Ar_{702}$, $L_{701}$, m1, m3 and m4 respectively represent the same as $R_{701}$, $X_7$, $Ar_{701}$, $Ar_{702}$, $L_{701}$, m1, m3 and m4 in the formula (7).

In an exemplary embodiment, the compound represented by the formula (7) is represented by any one of formulae (71-21) to (71-25) below.

[Formula 333]

(71-21)

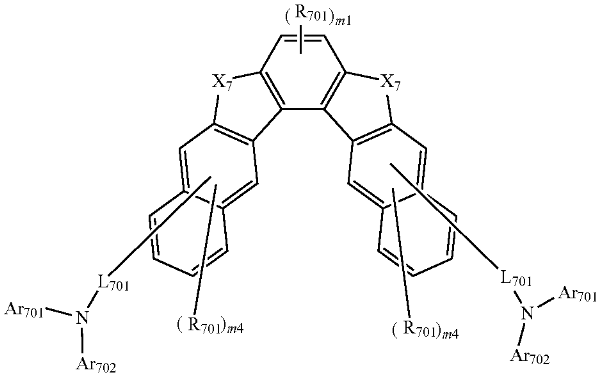

-continued
[Formula 334]
(71-22)
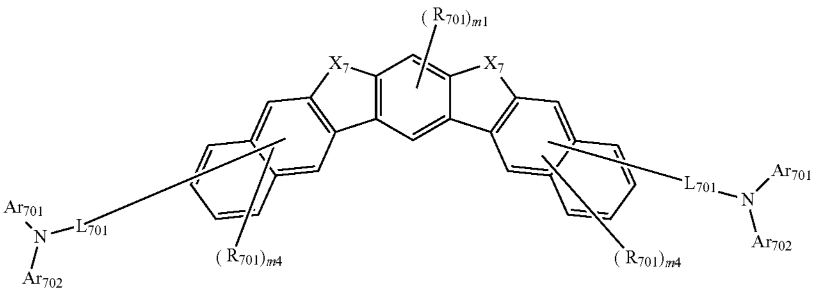
[Formula 335]
(71-23)
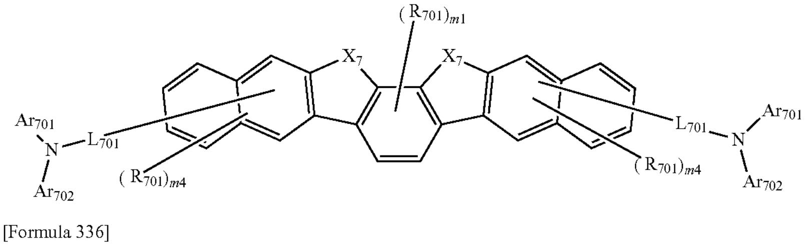
[Formula 336]
(71-24)
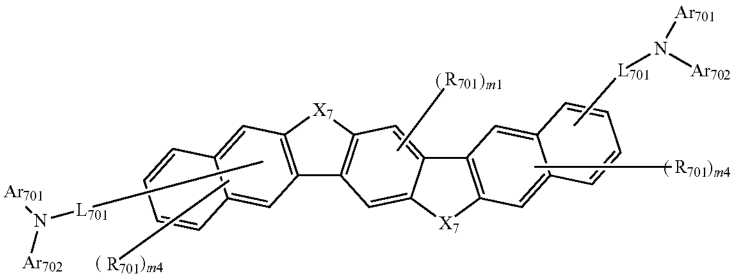
[Formula 337]
(71-25)
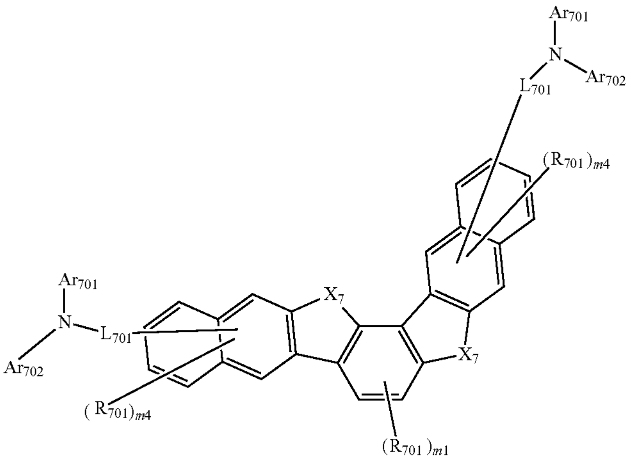

In the formulae (71-21) to (71-25), $R_{701}$, $X_7$, $Ar_{701}$, $Ar_{702}$, $L_{701}$, m1 and m4 respectively represent the same as $R_{701}$, $X_7$, $Ar_{701}$, $Ar_{702}$, $L_{701}$, m1 and m4 in the formula (7).

In an exemplary embodiment, the compound represented by the formula (7) is represented by any one of formulae (71-31) to (71-33) below.

[Formula 338]

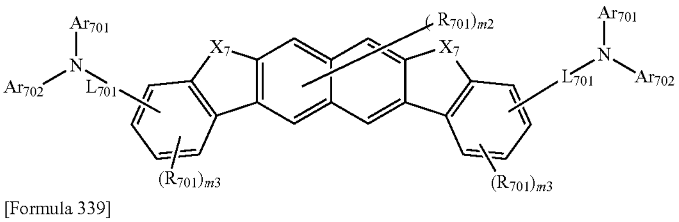

(71-31)

[Formula 339]

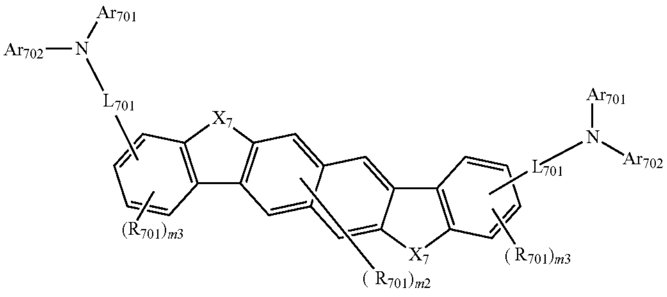

(71-32)

[Formula 340]

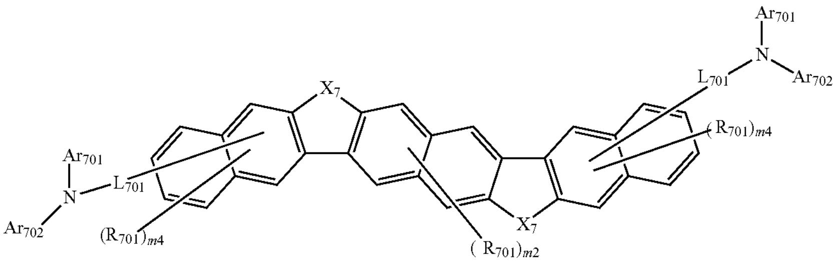

(71-33)

In the formulae (71-31) to (71-33), $R_{701}$, $X_7$, $Ar_{701}$, $Ar_{702}$, $L_{701}$, and m2 to m4 respectively represent the same as $R_{701}$, $X_7$, $Ar_{701}$, $Ar_{702}$, $L_{701}$, and m2 to m4 in the formula (7).

In an exemplary embodiment, $Ar_{701}$ and $Ar_{702}$ are each independently a substituted or unsubstituted aryl group having 6 to 50 ring carbon atoms.

In an exemplary embodiment, one of $Ar_{701}$ and $Ar_7$ oz is a substituted or unsubstituted aryl group having 6 to 50 ring carbon atoms, and the other of $Ar_{701}$ and $Ar_{702}$ is a substituted or unsubstituted heterocyclic group having 5 to 50 ring atoms.

Specific Examples of Compound Represented by Formula (7)

Specific examples of the compound represented by the formula (7) include compounds below.

[Formula 341]
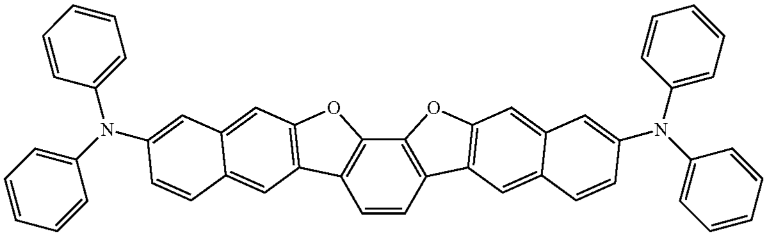
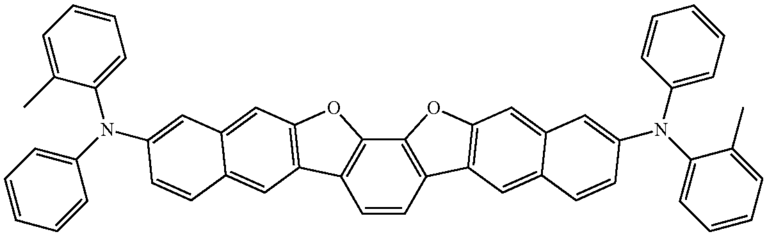
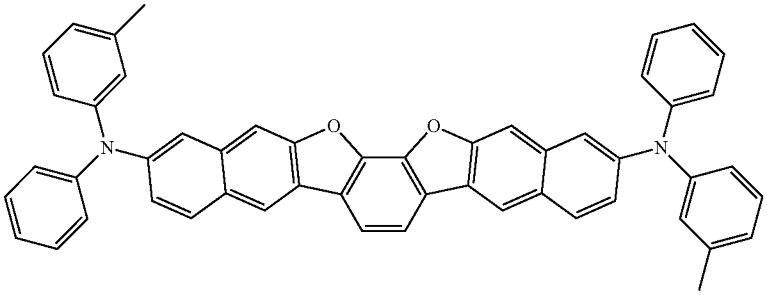
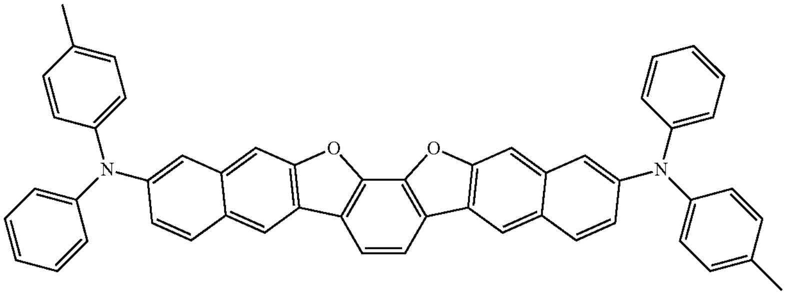
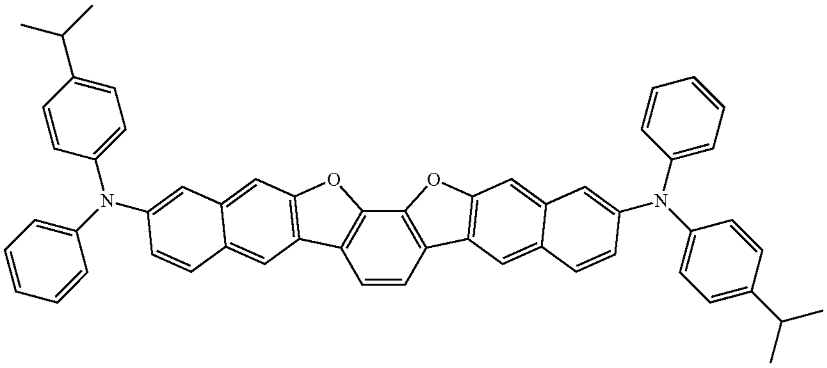

-continued
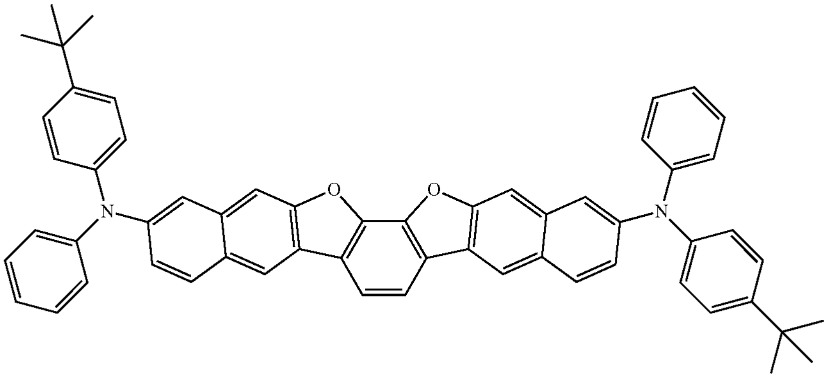
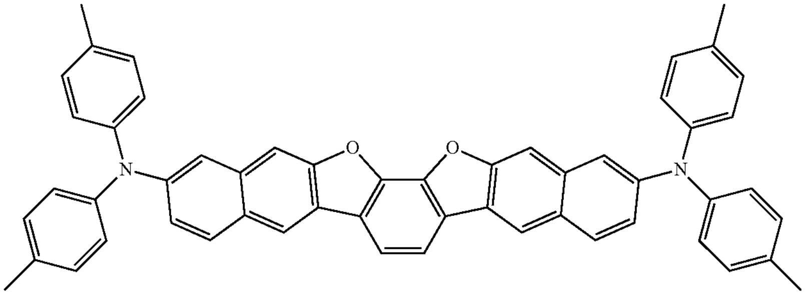
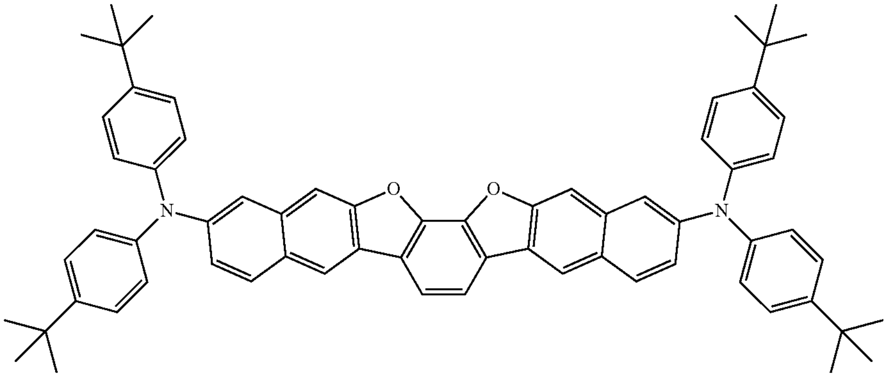
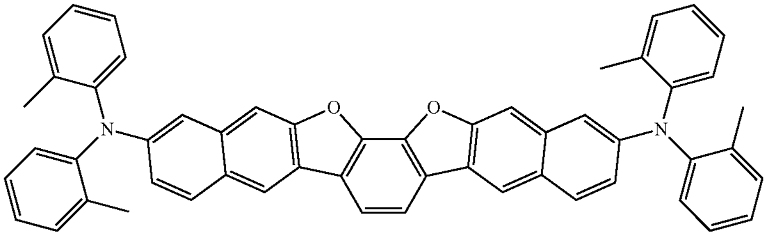
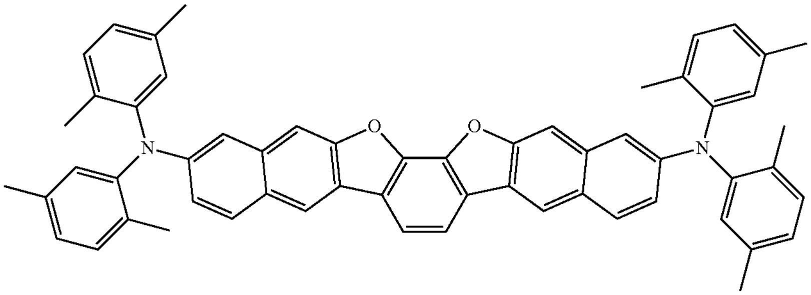

-continued
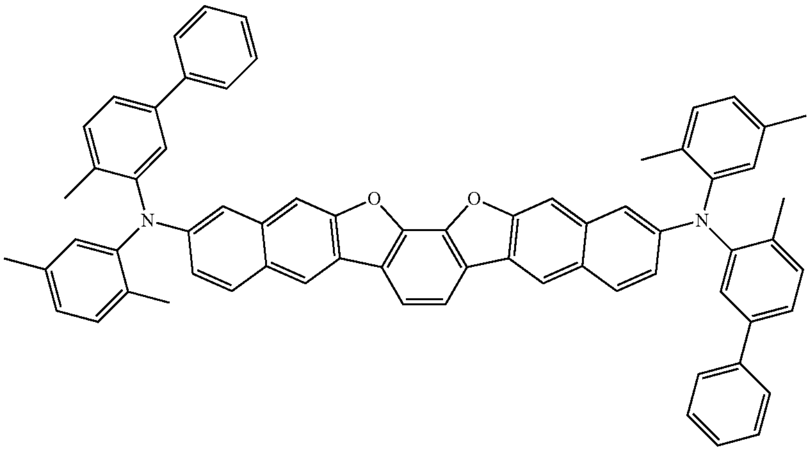
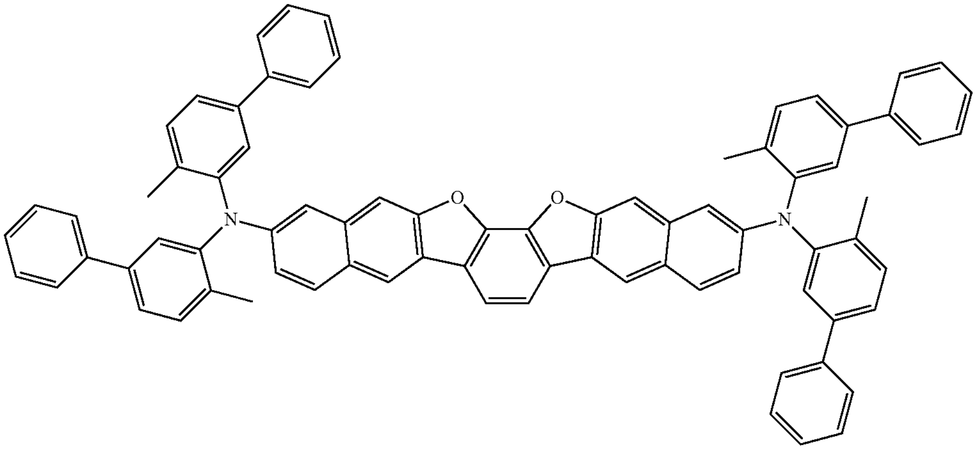
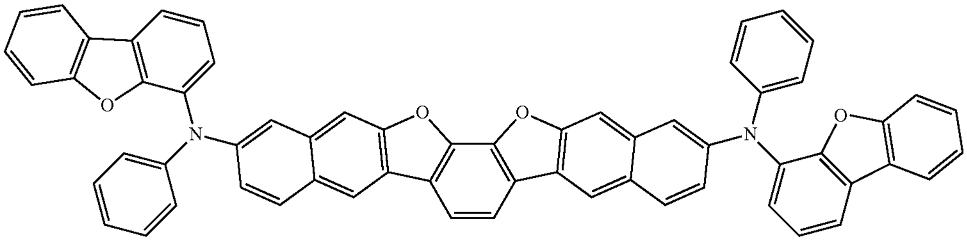
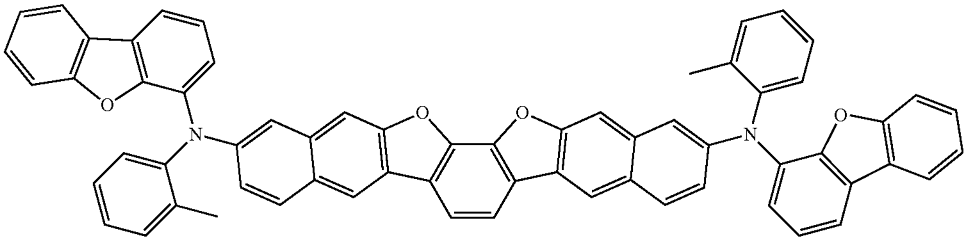

-continued
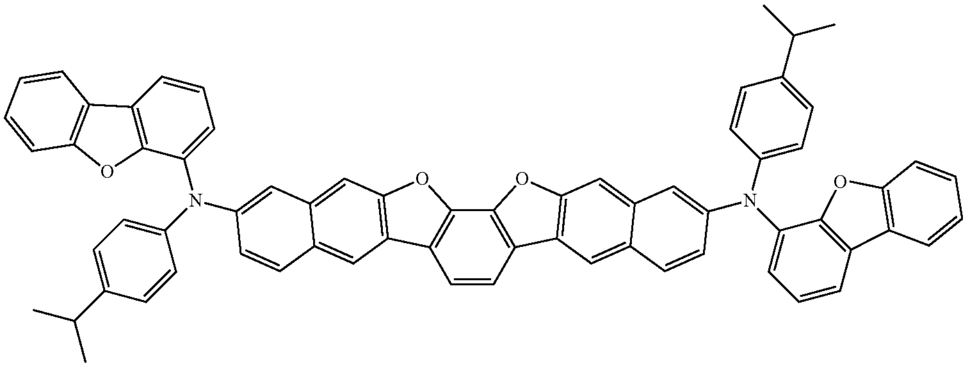
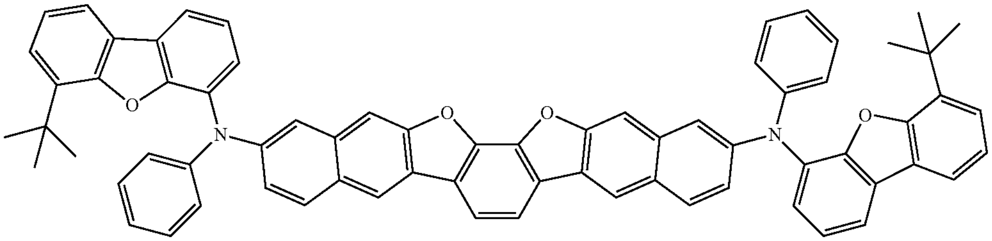
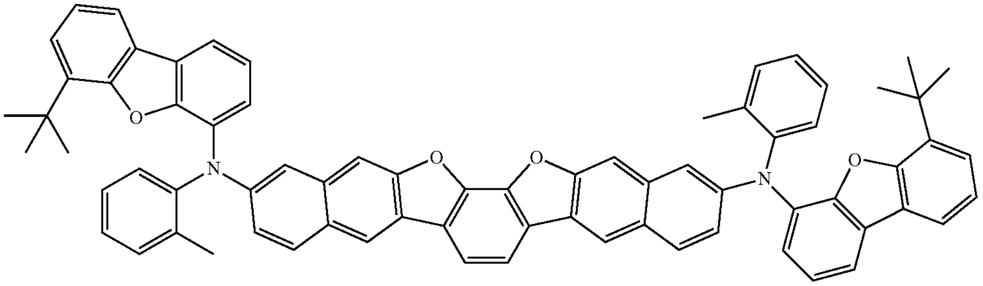
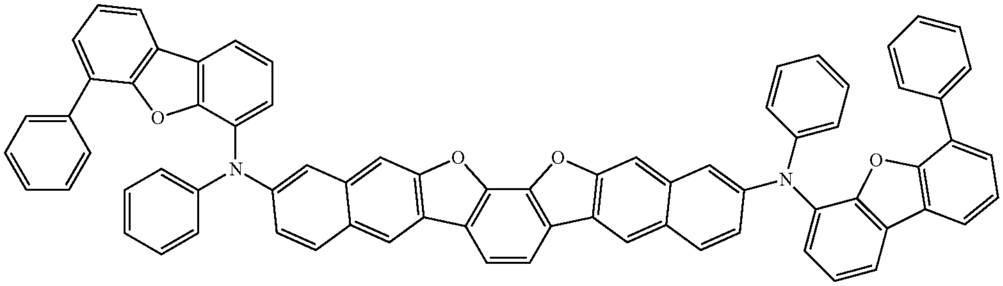
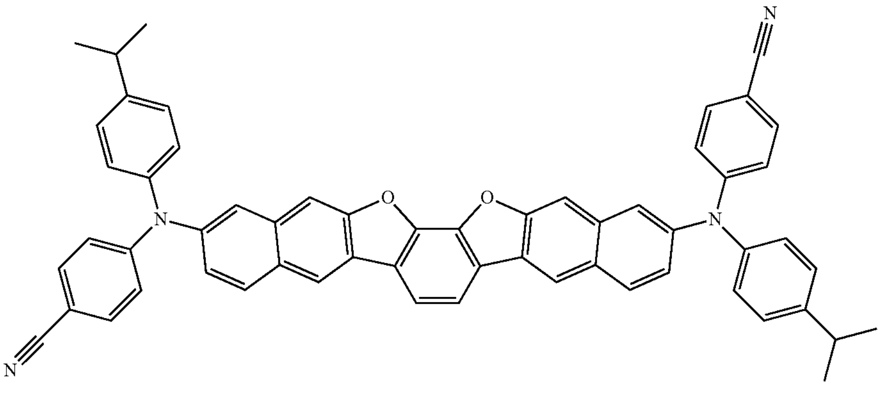

-continued
[Formula 342]
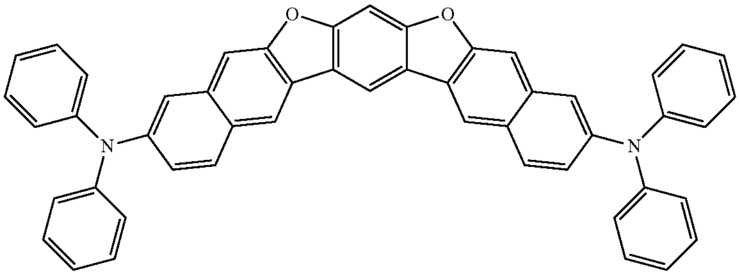
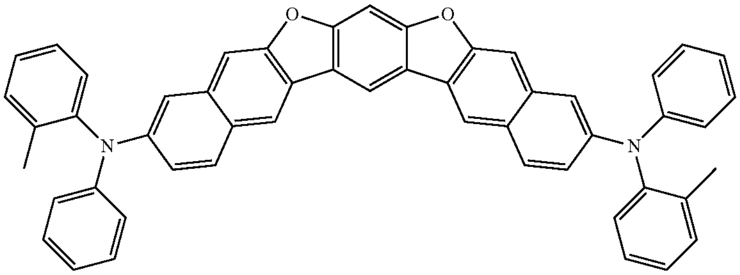
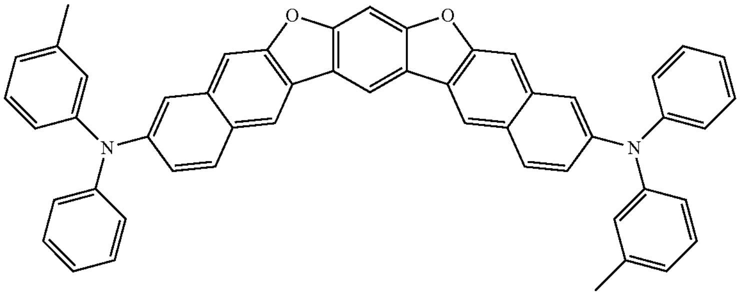
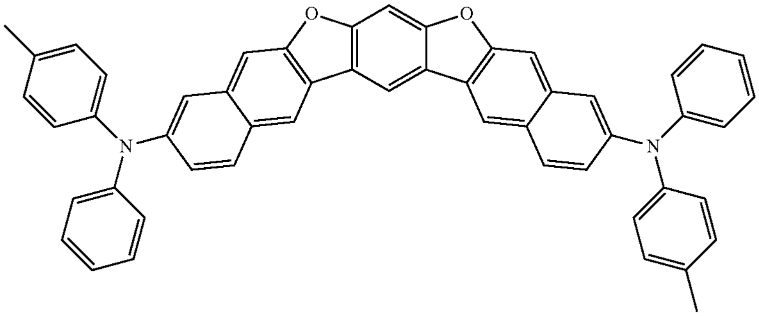
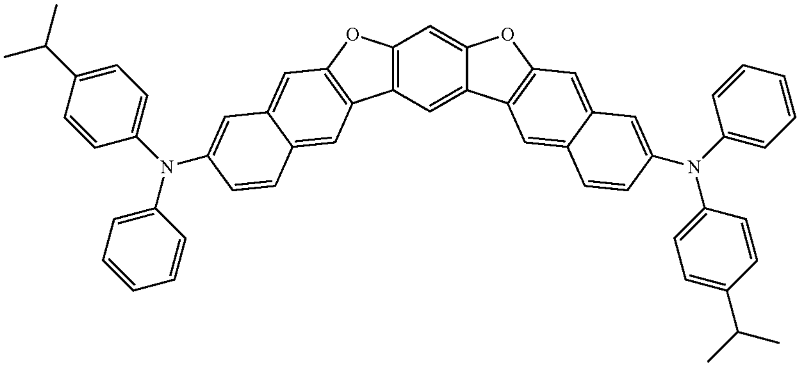

-continued
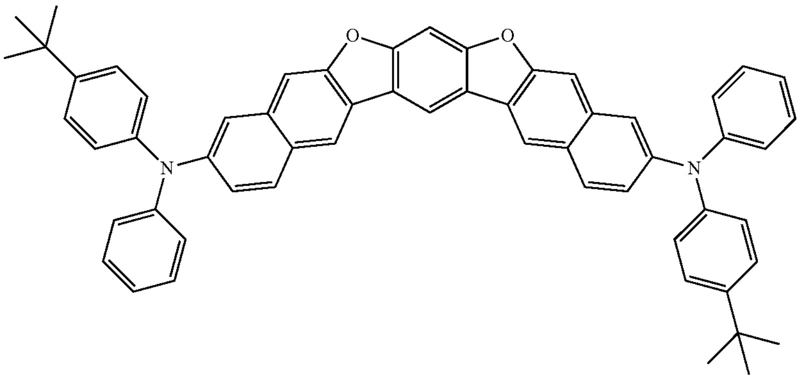
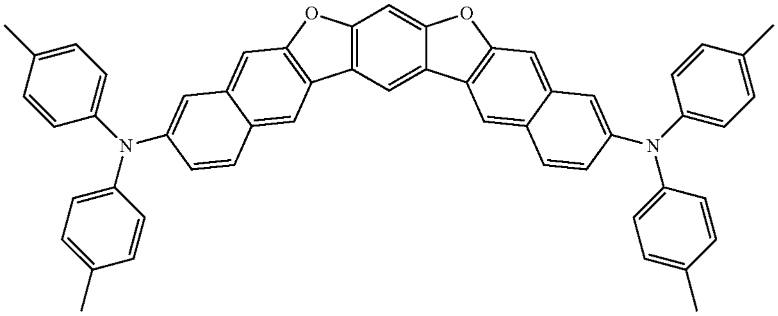
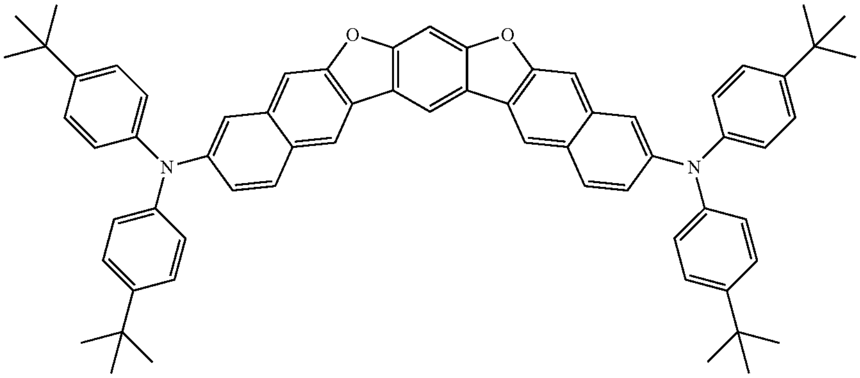
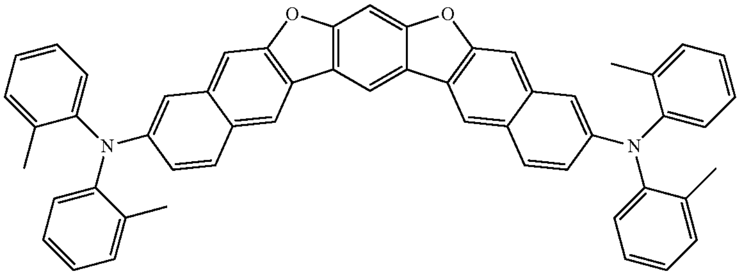
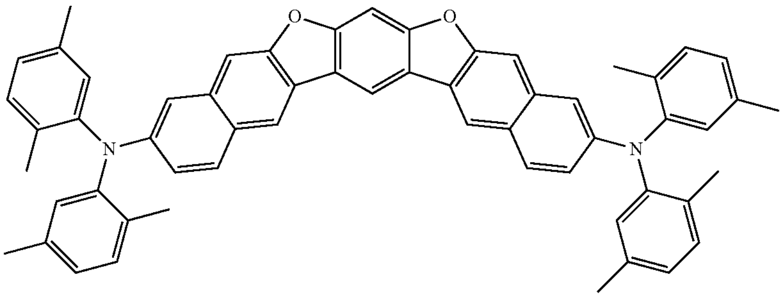

-continued
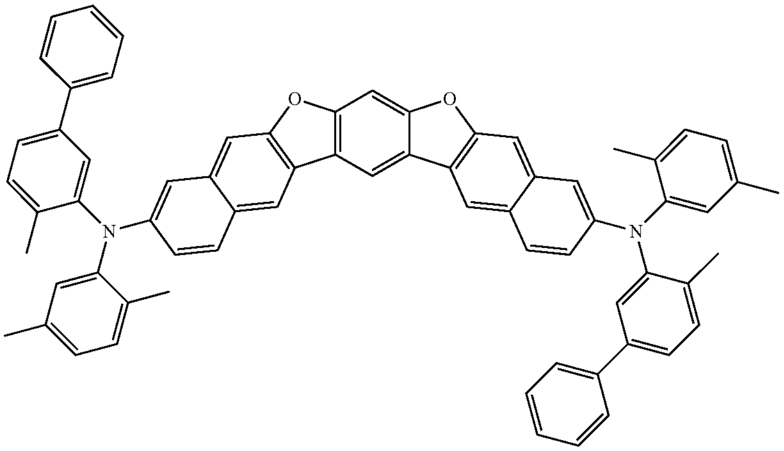
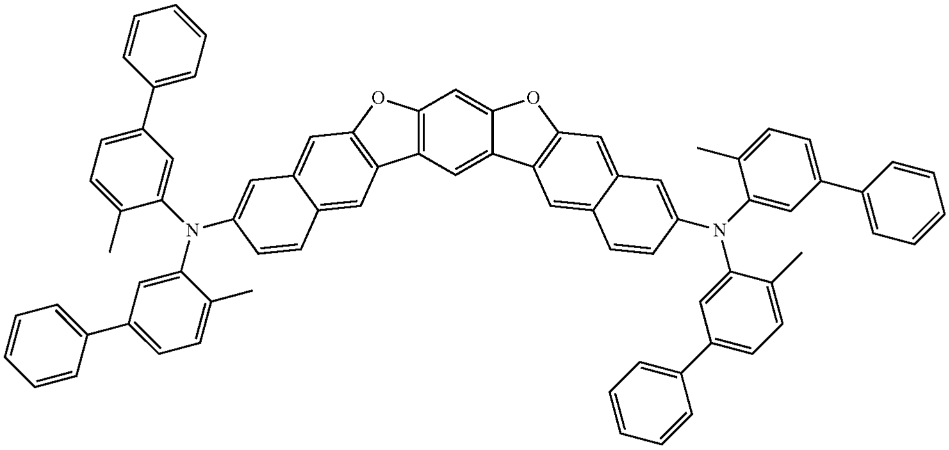
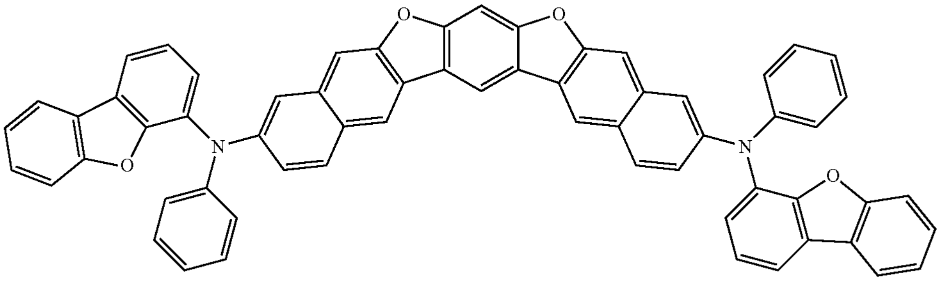
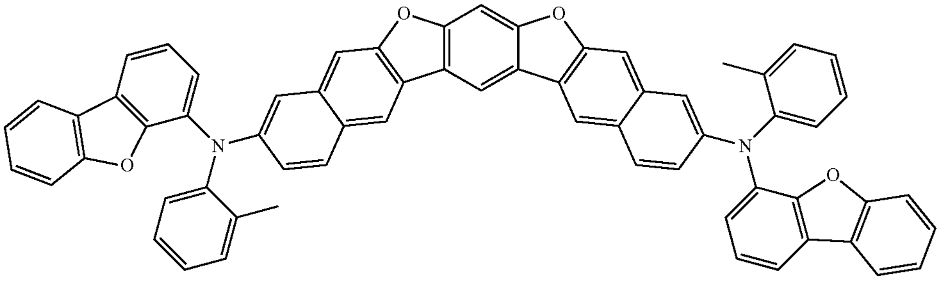

-continued
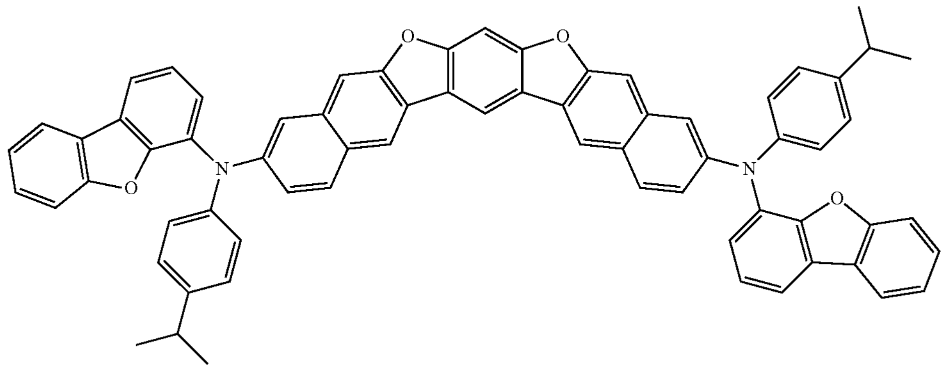
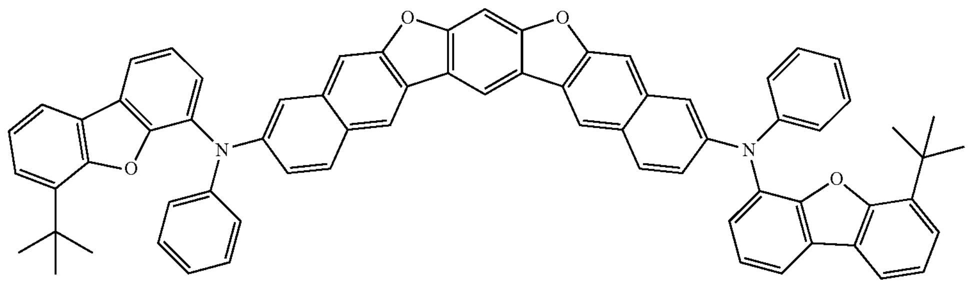
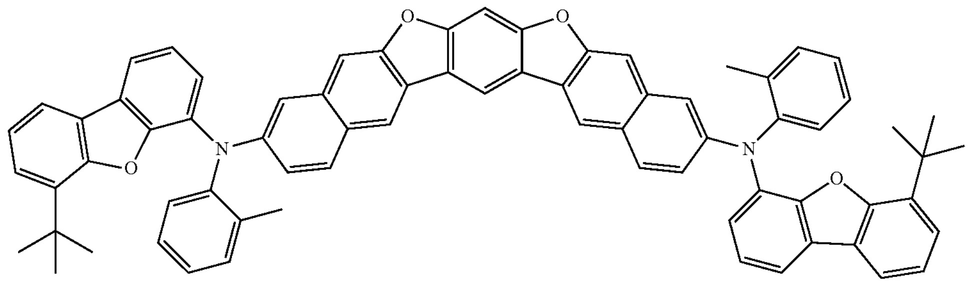
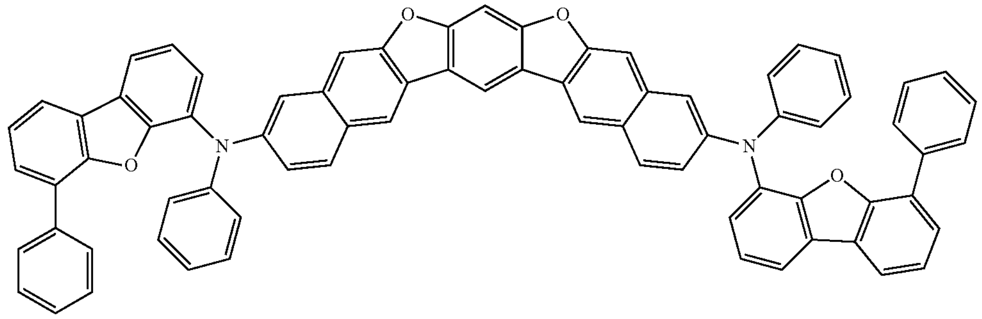
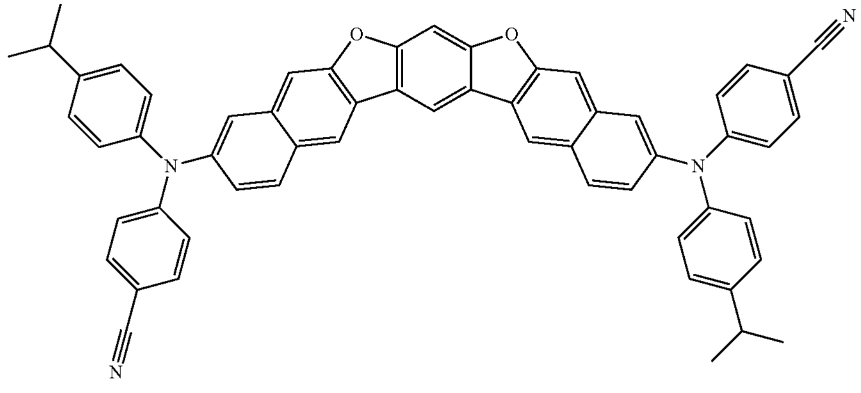

-continued
[Formula 343]
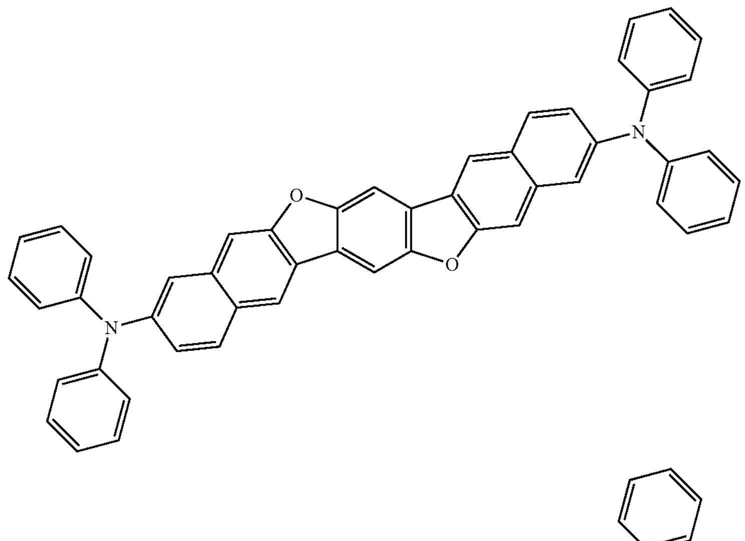
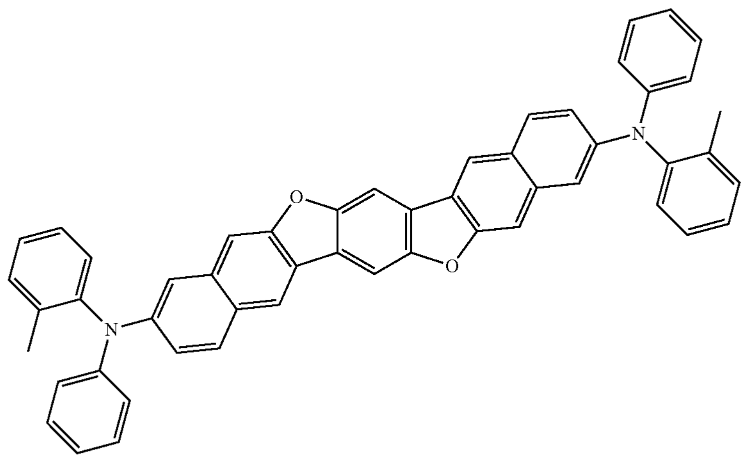
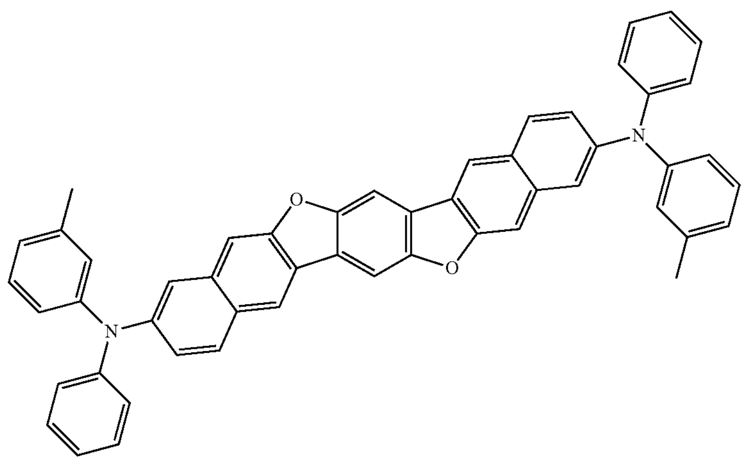

-continued
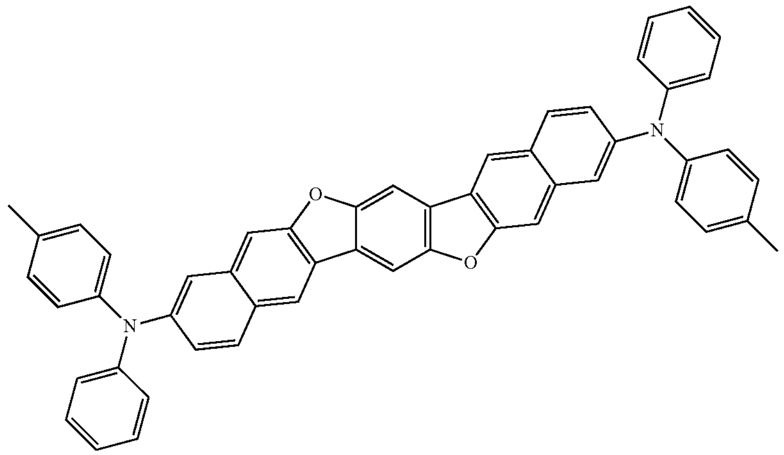
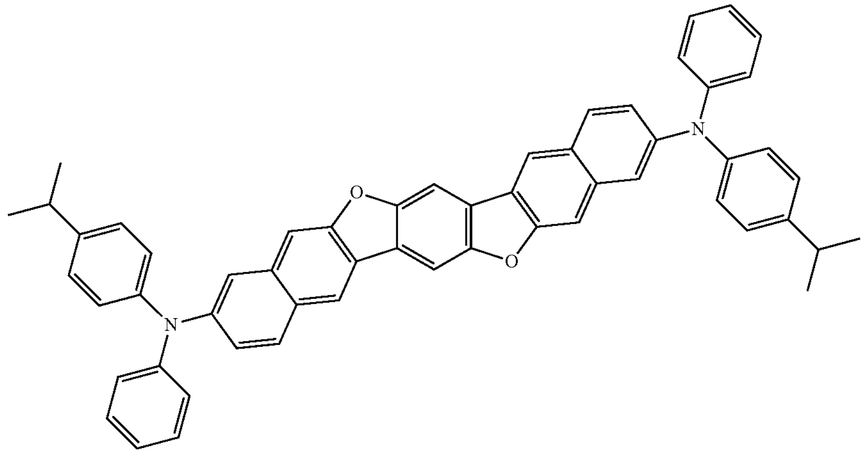
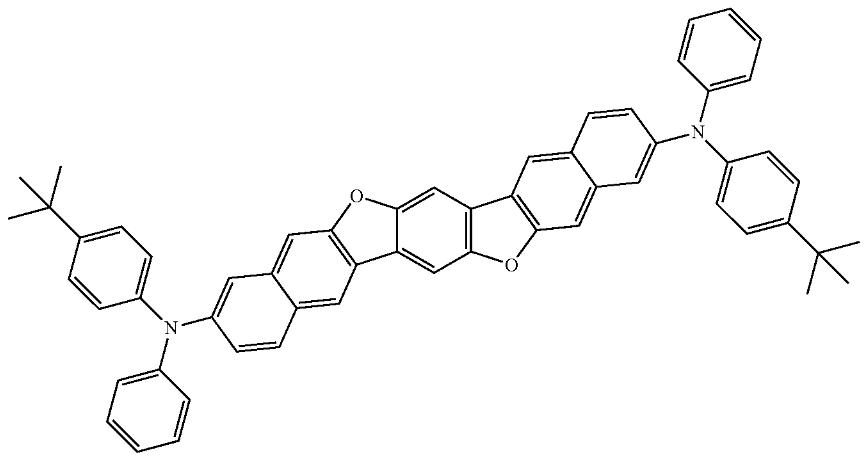

-continued
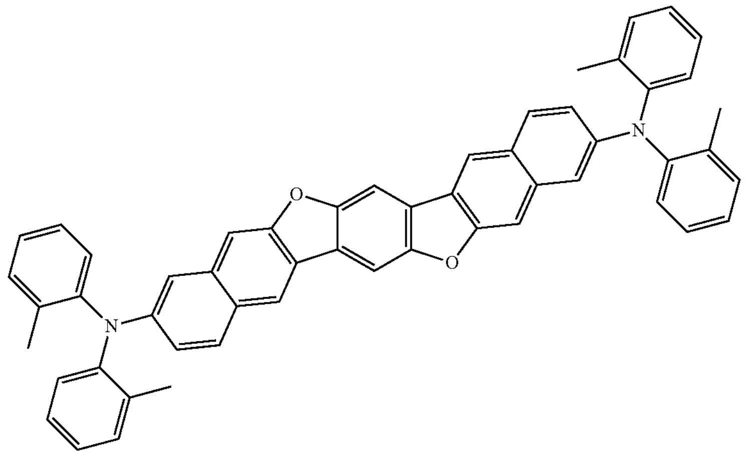
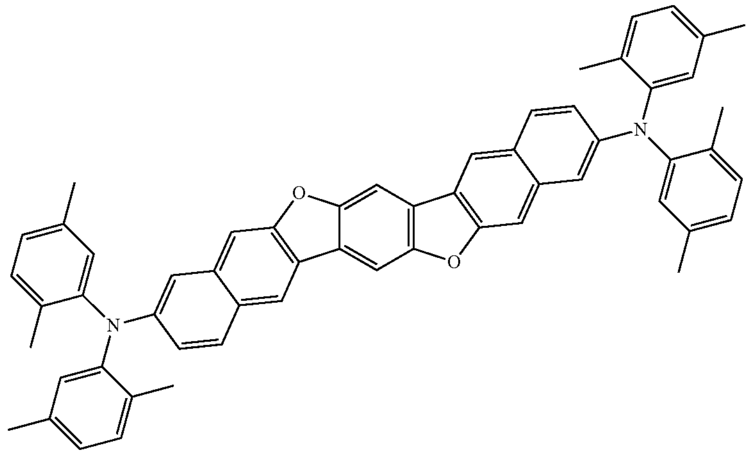
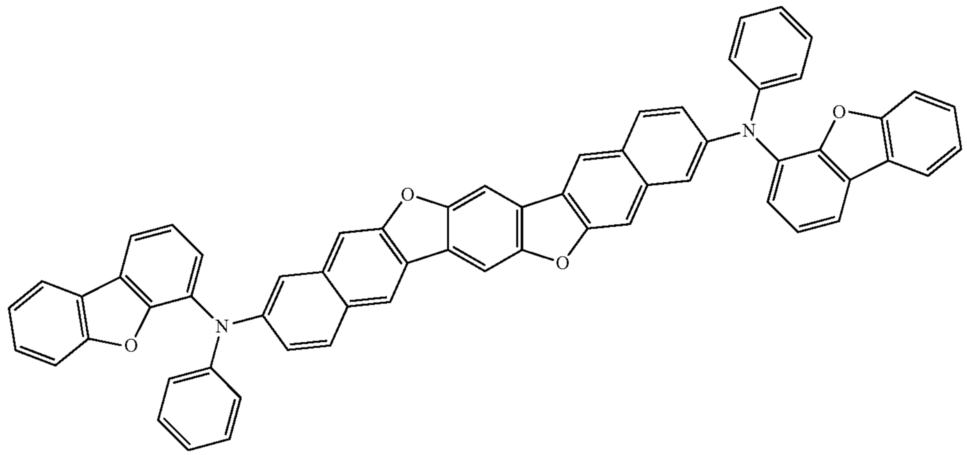

-continued
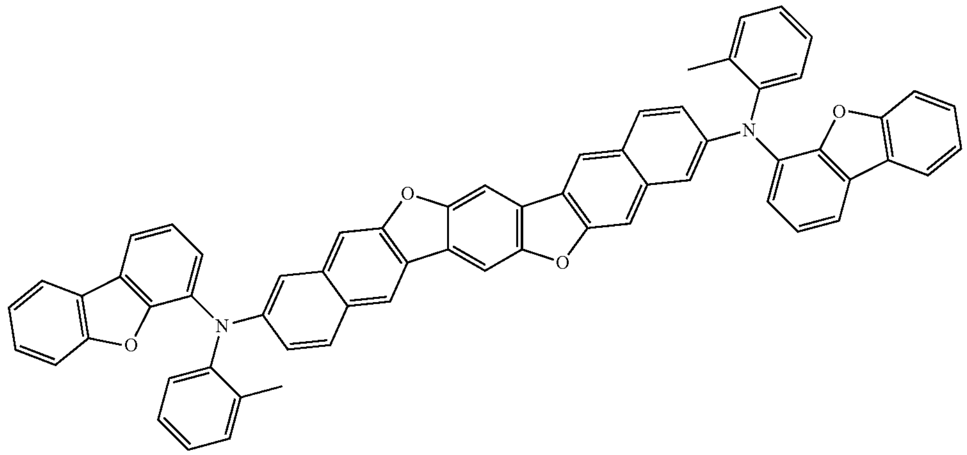
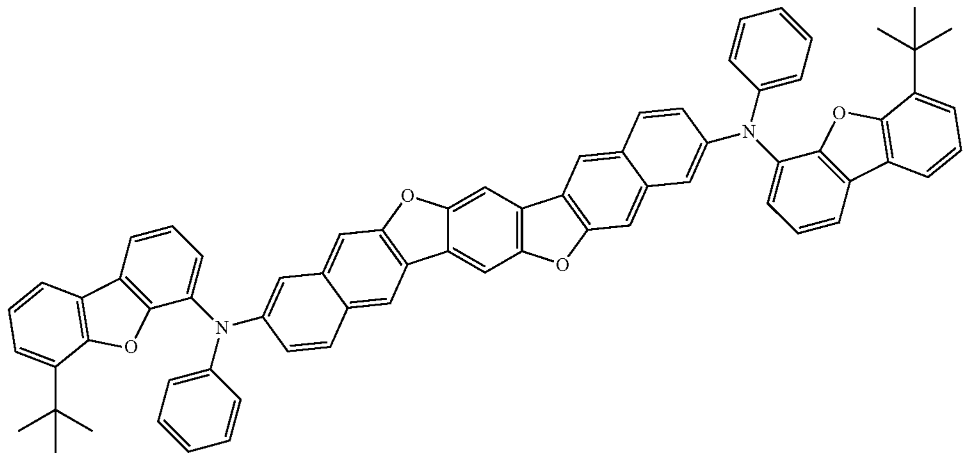
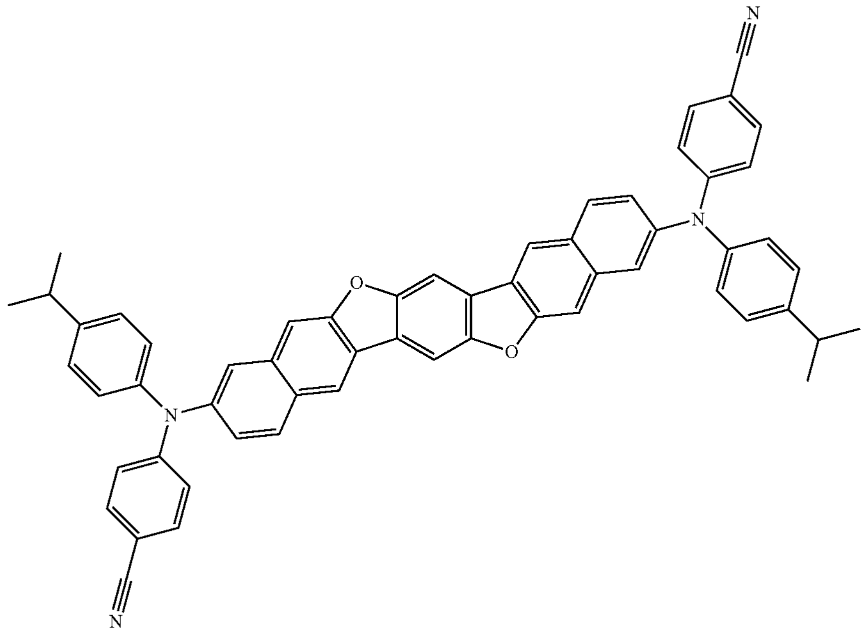

-continued
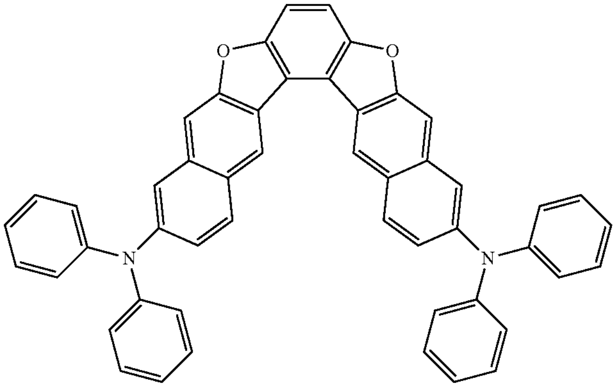
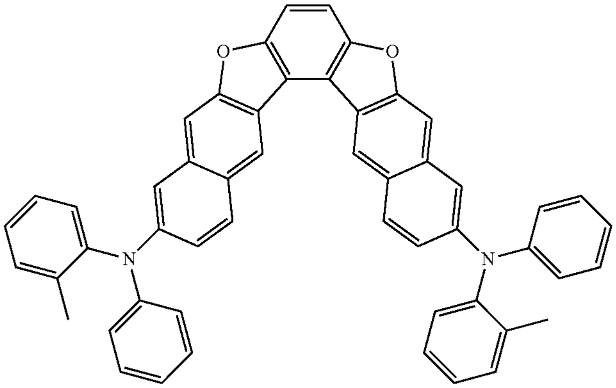
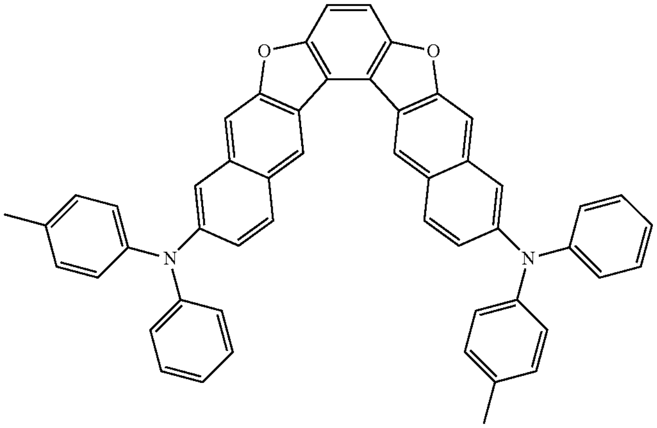
[Formula 344]
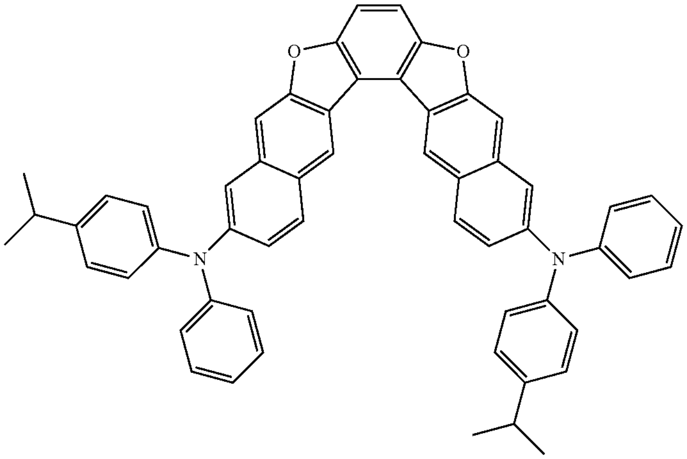

-continued
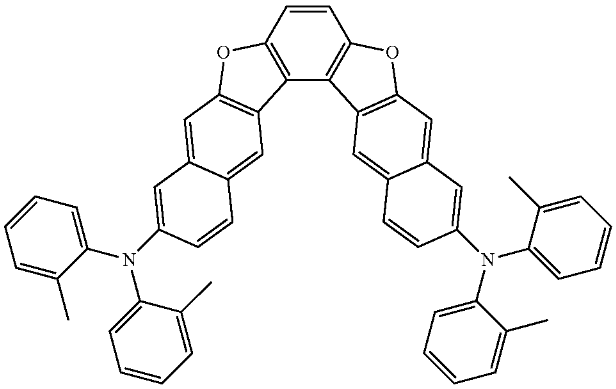
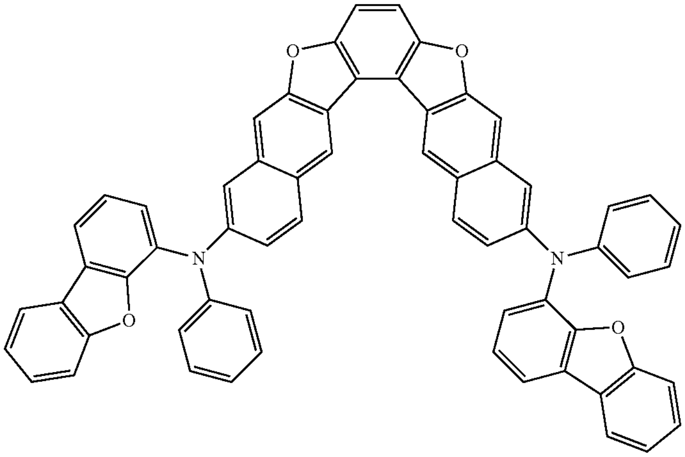
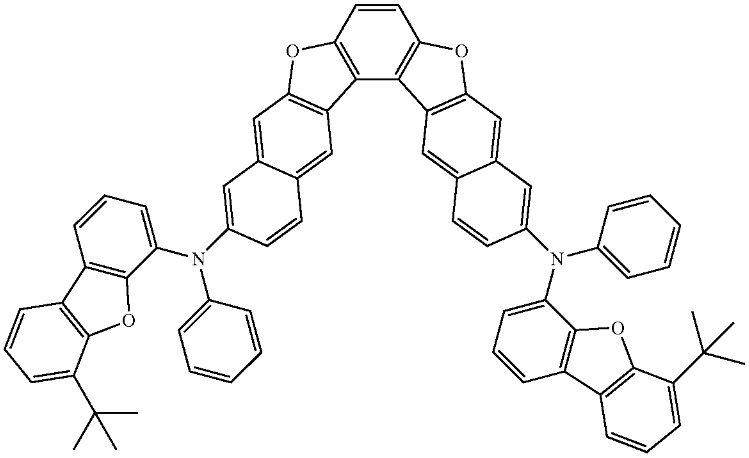

-continued
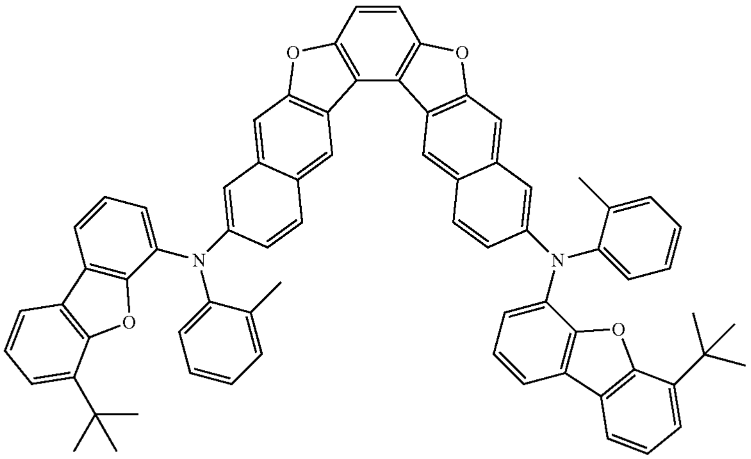
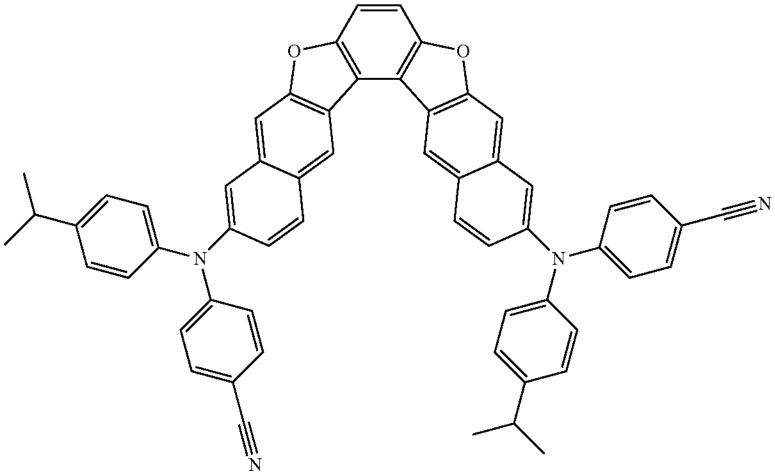
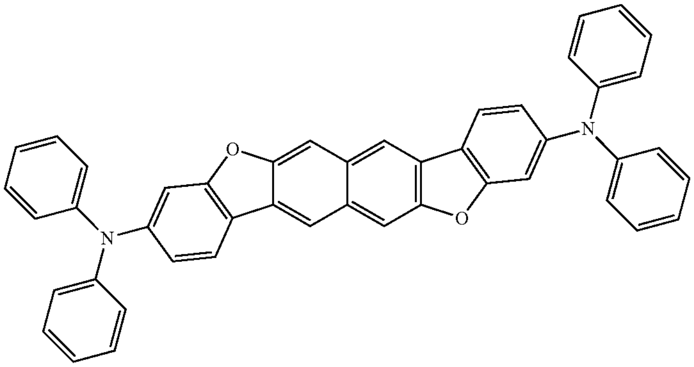
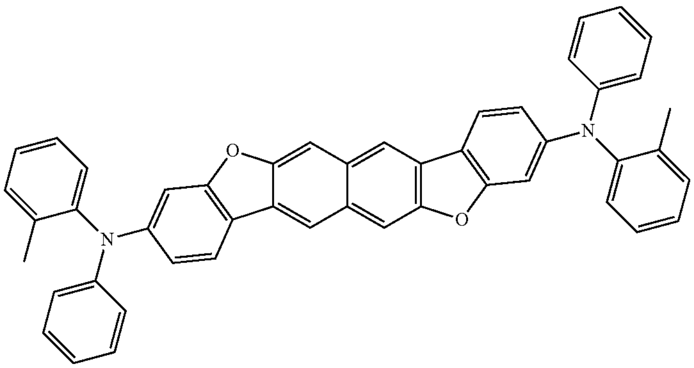

-continued
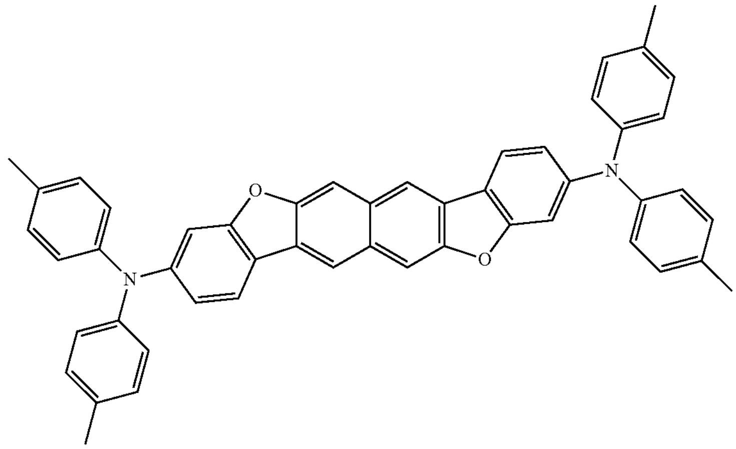
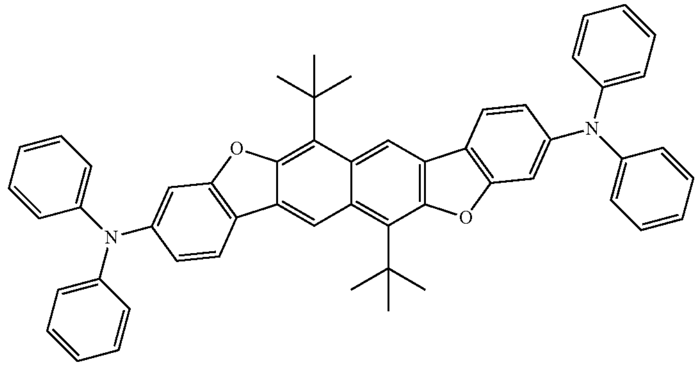
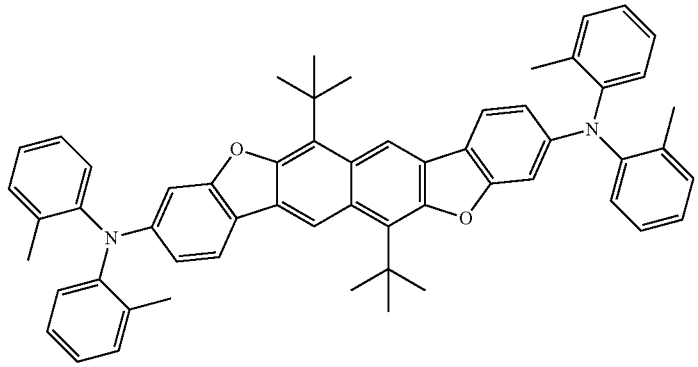
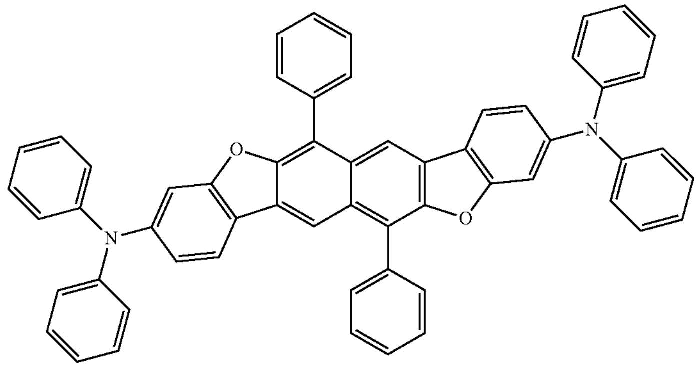

-continued
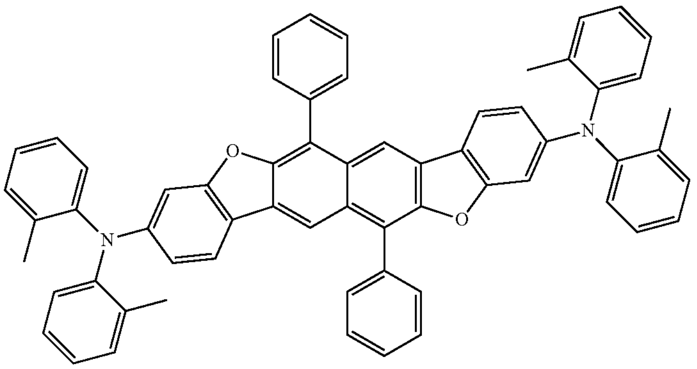
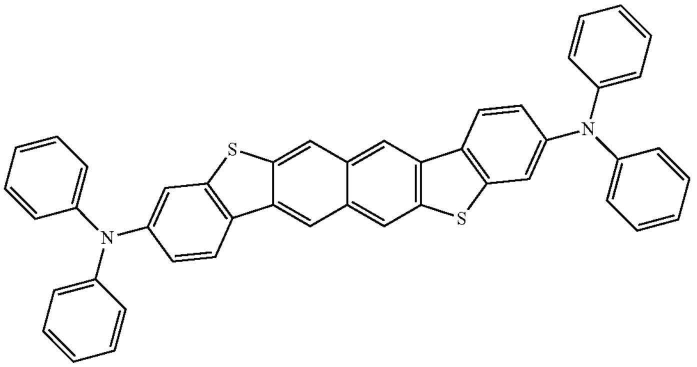
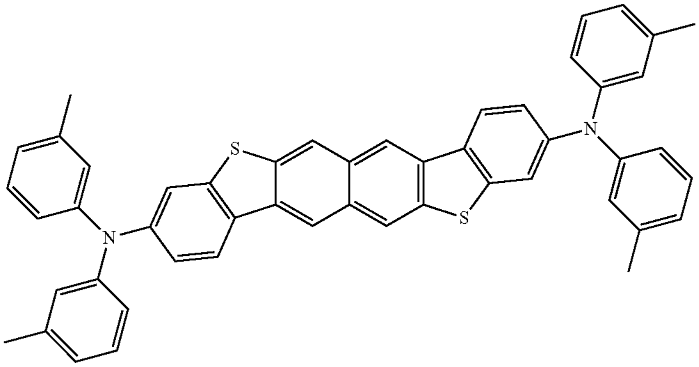
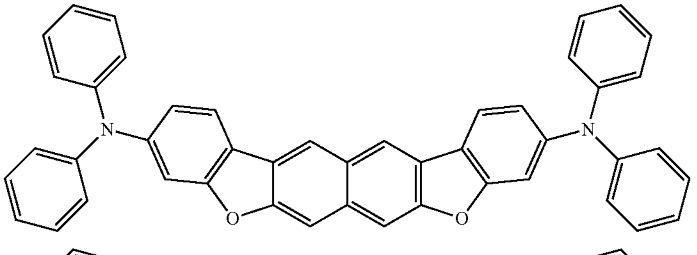
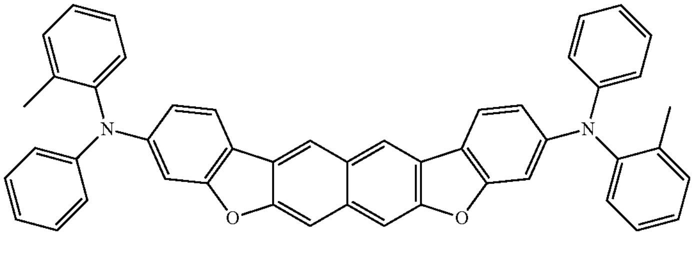

-continued
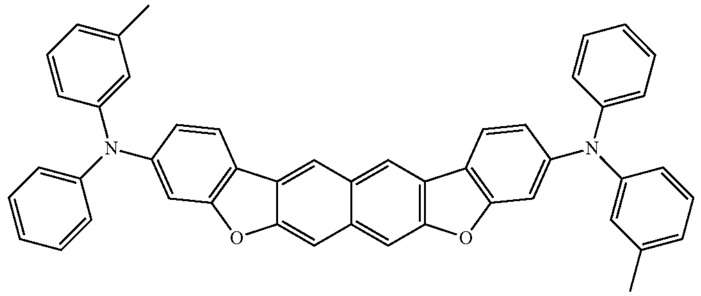
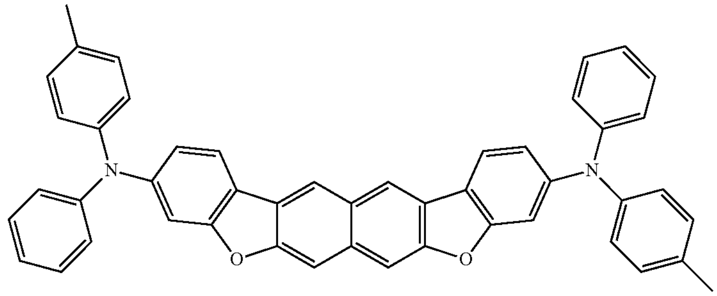
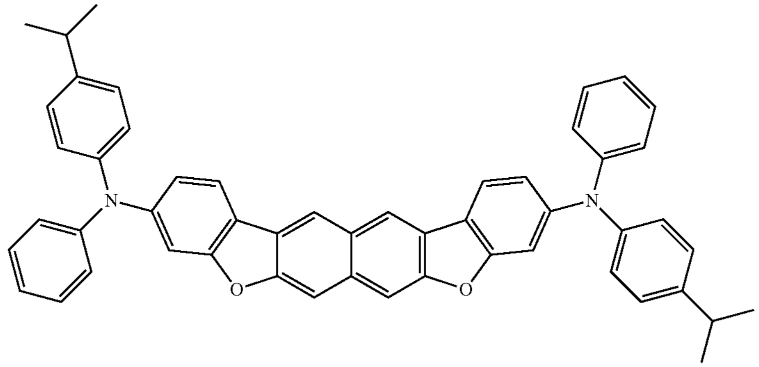
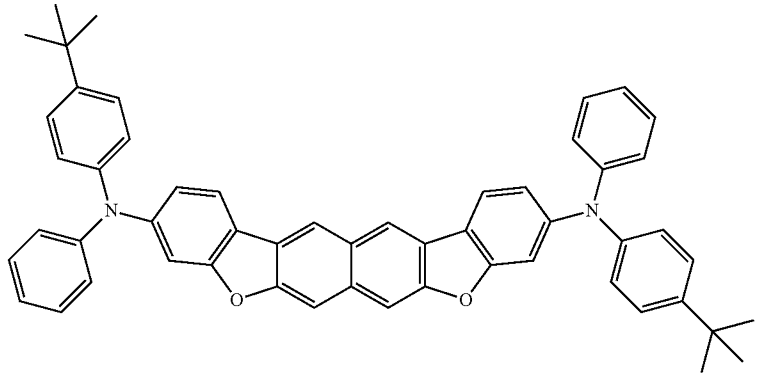
[Formula 345]
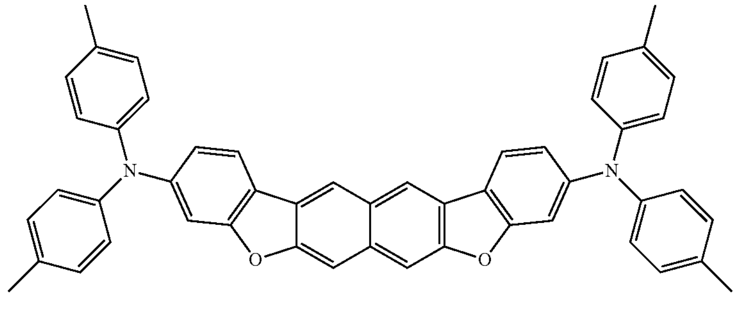

-continued
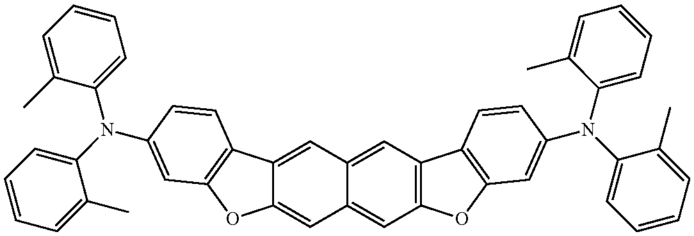
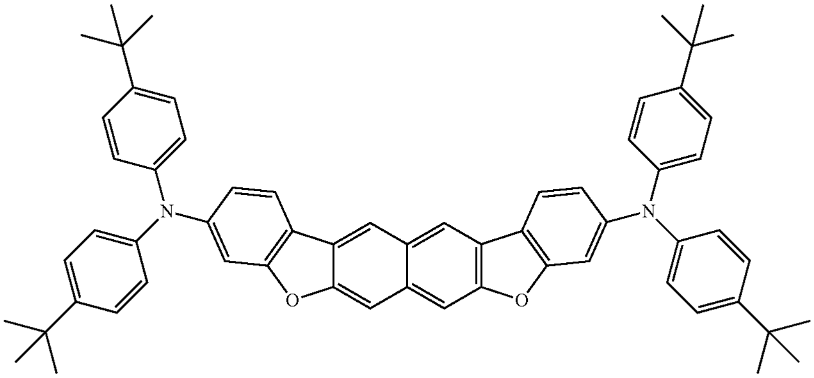
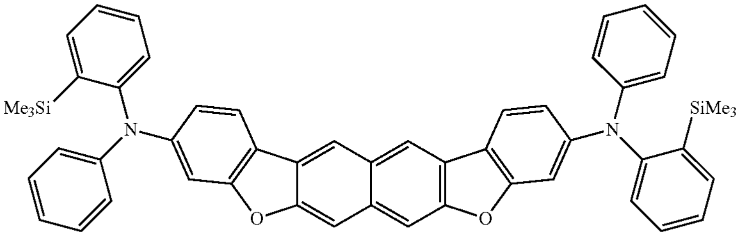
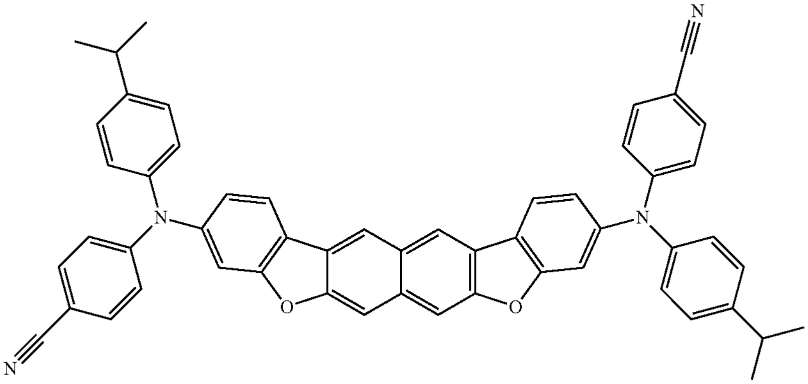
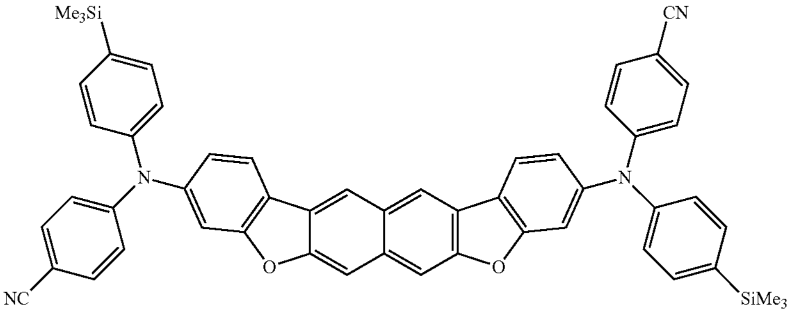

-continued
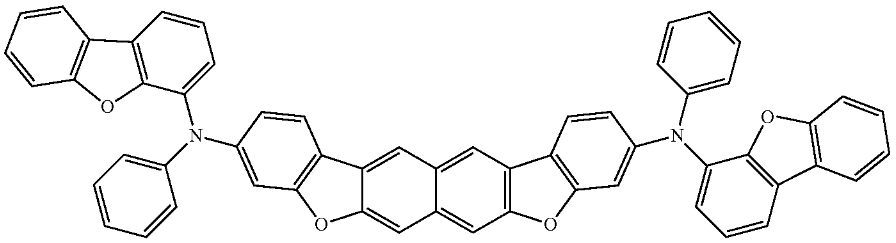
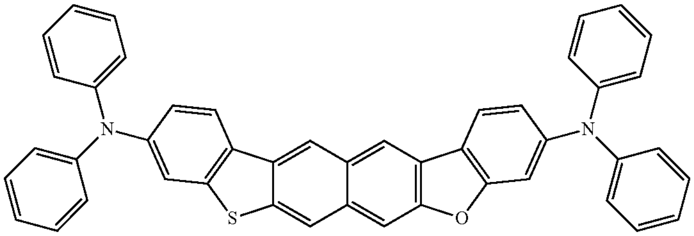
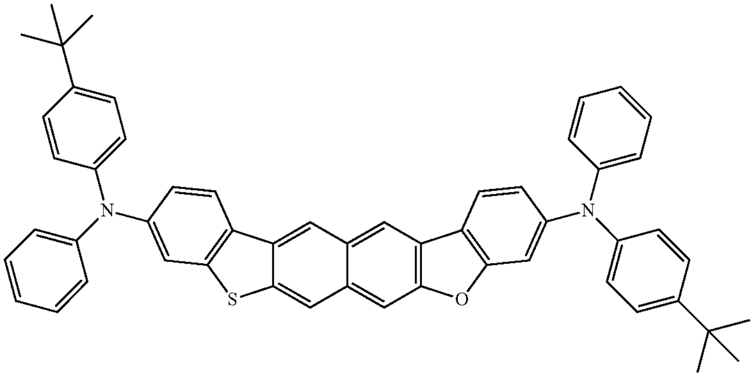
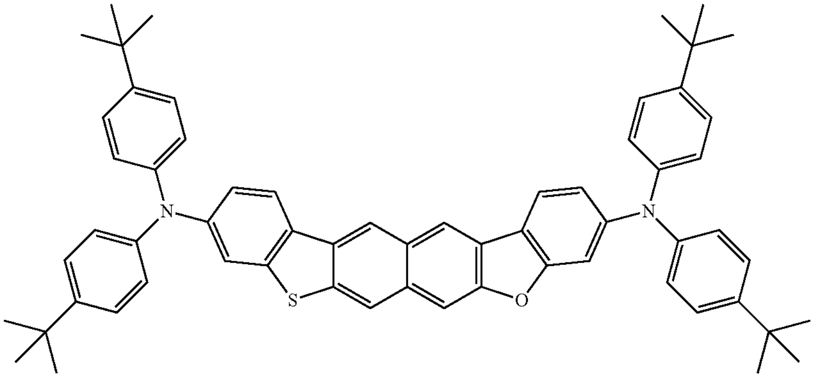
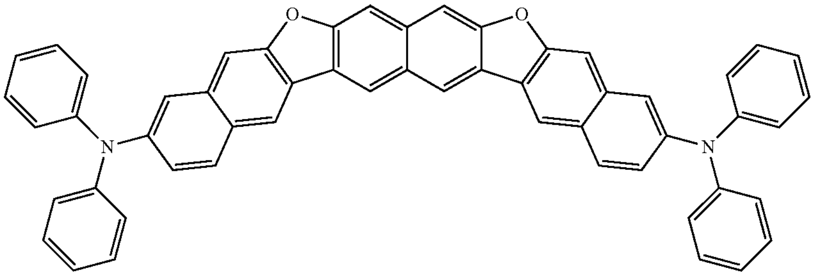

-continued
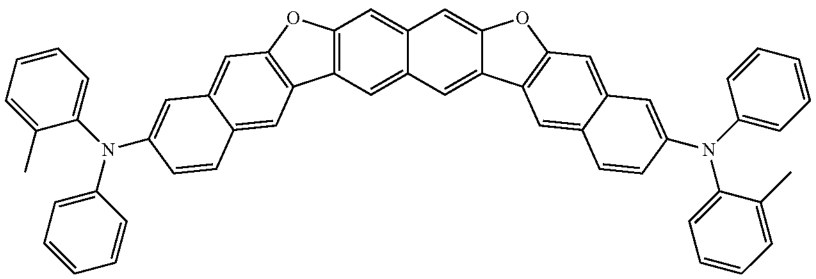
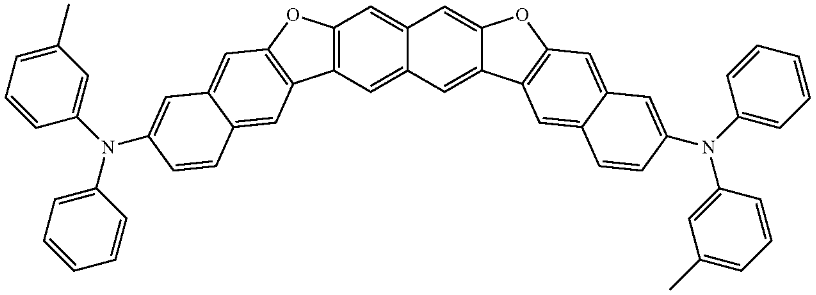
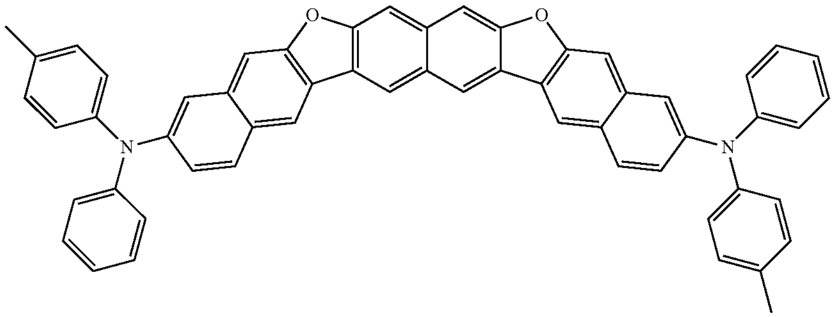
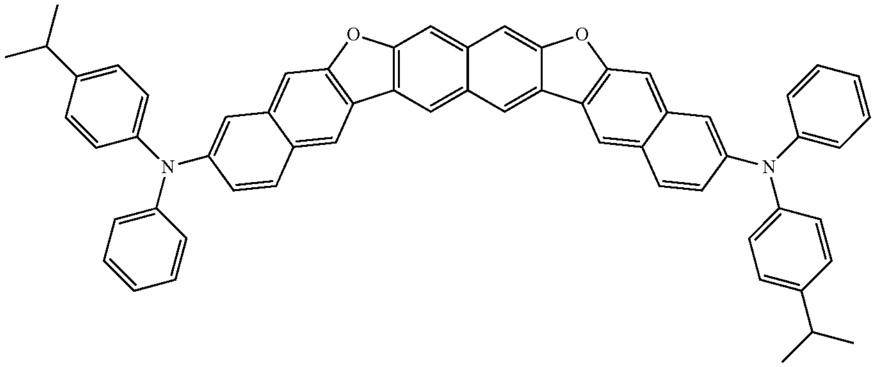
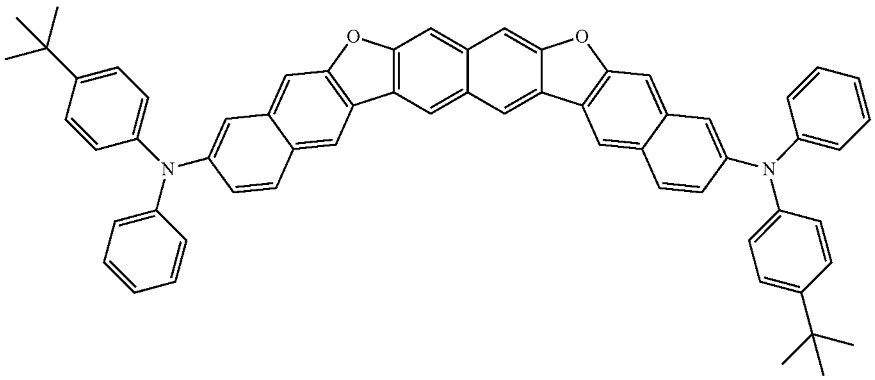

-continued
[Formula 346]
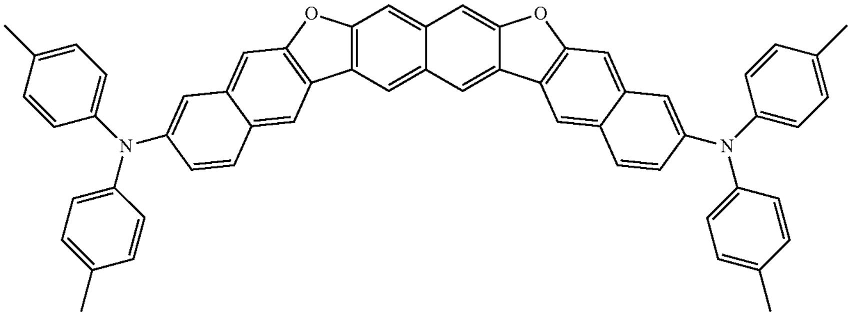
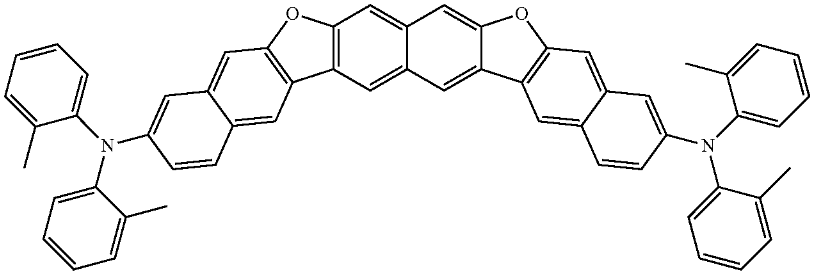
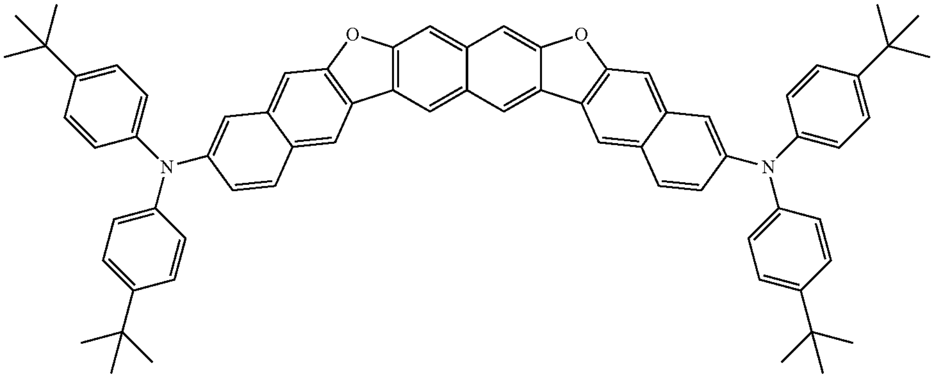
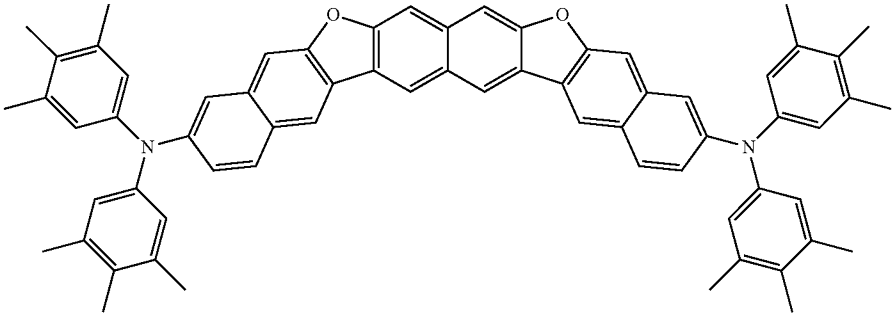
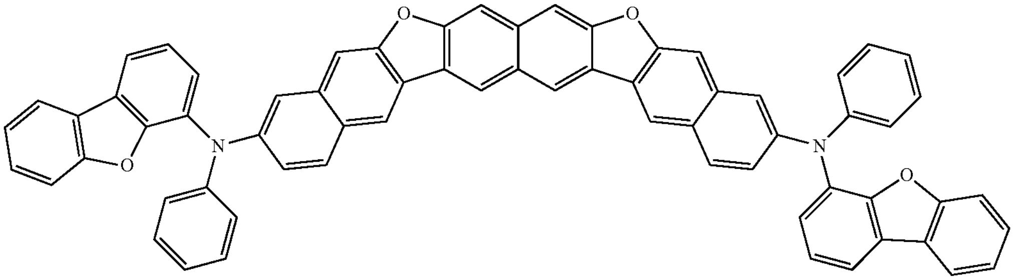

-continued

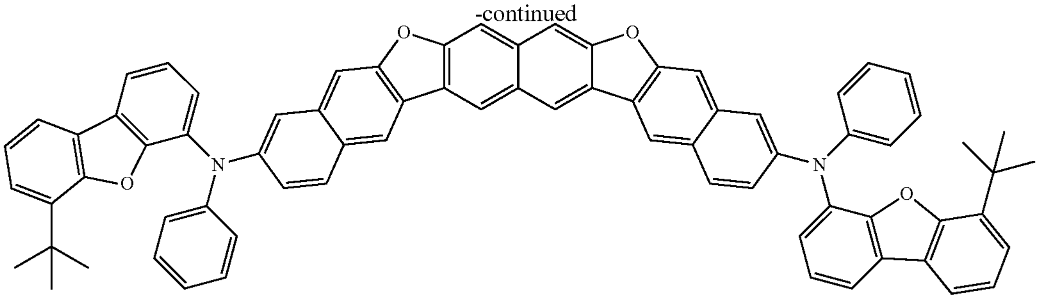

Compound Represented by Formula (8)

The compound represented by the formula (8) will be described below.

[Formula 347]

(8)

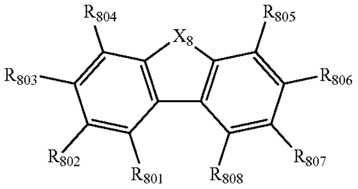

In the formula (8):

at least one combination of $R_{801}$ and $R_{802}$, $R_{802}$ and $R_{803}$, or $R_{803}$ and $R_{804}$ are mutually bonded to form a divalent group represented by a formula (82) below; and at least one combination of $R_{805}$ and $R_{808}$, $R_{806}$ and $R_{807}$, or $R_{807}$ and $R_{808}$ are mutually bonded to form a divalent group represented by a formula (83) below.

[Formula 348]

(82)

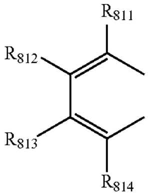

(83)

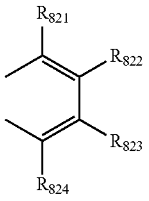

At least one of $R_{801}$ to $R_{804}$ not forming the divalent group represented by the formula (82) or $R_{811}$ to $R_{814}$ is a monovalent group represented by a formula (84) below;

at least one of $R_{805}$ to $R_{808}$ not forming the divalent group represented by the formula (83) or $R_{821}$ to $R_{824}$ is a monovalent group represented by the formula (84);

$X_8$ is an oxygen atom, a sulfur atom, or $NR_{809}$; and $R_{801}$ to $R_{808}$ not forming the divalent group represented by the formula (82) or (83) and not being the monovalent group represented by the formula (84), $R_{811}$ to $R_{814}$ and $R_{821}$ to $R_{824}$ not being the monovalent group represented by the formula (84), and $R_{809}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

[Formula 349]

(84)

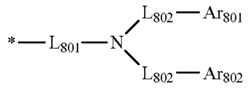

In the formula (84):

$Ar_{801}$ and $Ar_{802}$ are each independently a substituted or unsubstituted aryl group having 6 to 50 ring carbon atoms, or a substituted or unsubstituted heterocyclic group having 5 to 50 ring atoms;

$L_{801}$ to $L_{803}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (84) represents a bonding position to a cyclic structure represented by the formula (8) or a bonding position to a group represented by the formula (82) or (83).

In the formula (8), the positions for the divalent group represented by the formula (82) and the divalent group represented by the formula (83) to be formed are not specifically limited but the divalent groups may be formed at any possible positions on $R_{801}$ to $R_{808}$.

In an exemplary embodiment, the compound represented by the formula (8) is represented by any one of formulae (81-1) to (81-6) below.

[Formula 350]

(81-1)

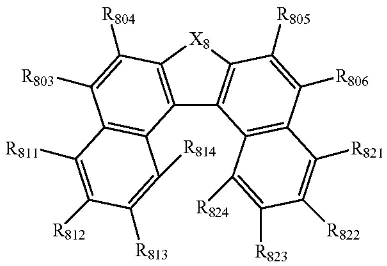

(81-2)

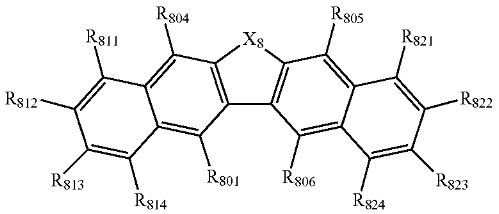

[Formula 351]

(81-3)

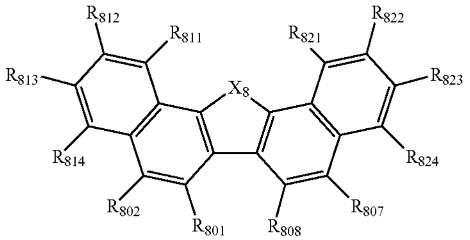

(81-4)

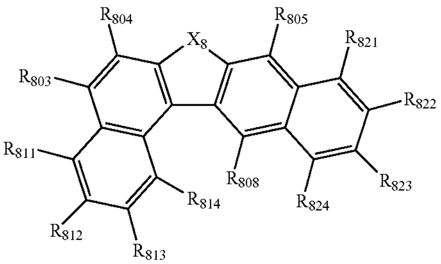

[Formula 352]

(81-5)

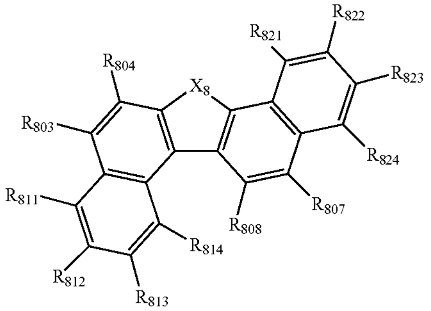

-continued (81-6)

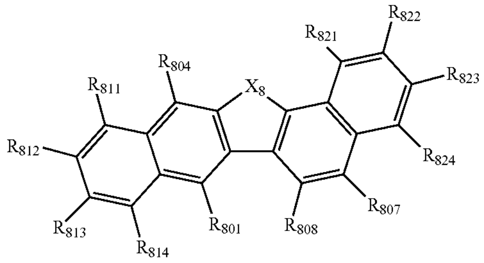

In the formulae (81-1) to (81-6):

$X_8$ represents the same as $X_8$ in the formula (8);

at least two of $R_{801}$ to $R_{824}$ are each a monovalent group represented by the formula (84); and $R_{801}$ to $R_{824}$ not being the monovalent group represented by the formula (84) are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (8) is represented by any one of formulae (81-7) to (81-18) below.

[Formula 353]

(81-7)

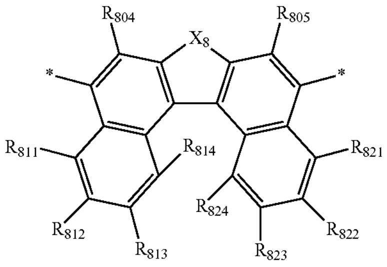

(81-8)

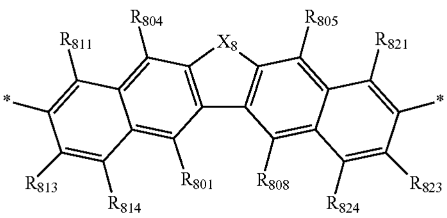

-continued

[Formula 354]

(81-9)

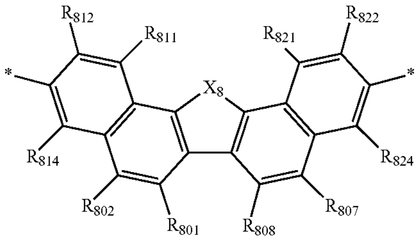

(81-10)

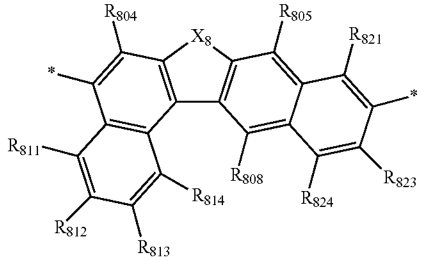

[Formula 355]

(81-11)

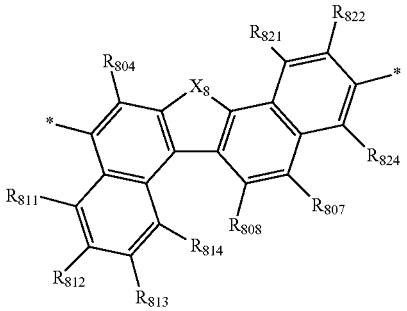

(81-12)

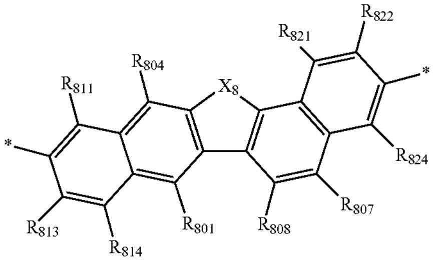

[Formula 356]

(81-13)

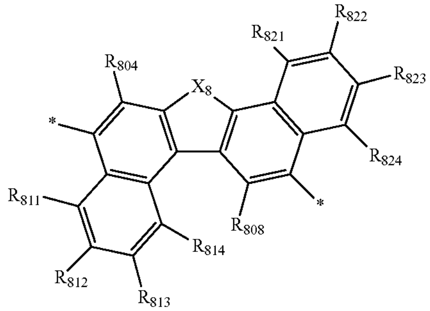

-continued (81-14)

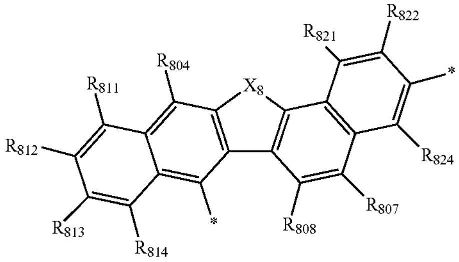

[Formula 357]

(81-15)

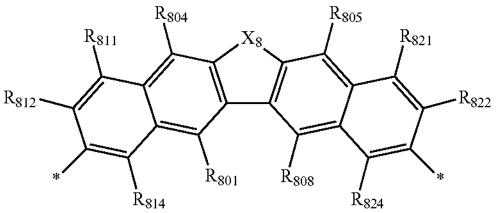

(81-16)

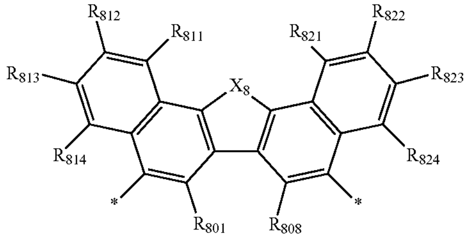

[Formula 358]

(81-17)

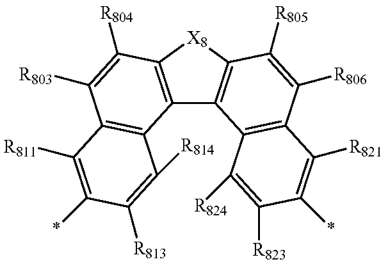

(81-18)

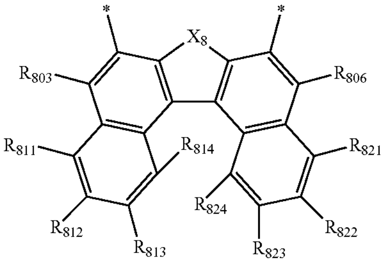

In the formulae (81-7) to (81-18):

$X_8$ represents the same as $X_8$ in the formula (8);

* is a single bond bonded to a monovalent group represented by the formula (84); and $R_{801}$ to $R_{824}$ each independently represent the same as $R_{801}$ to $R_{824}$ in the formulae (81-1) to (81-6) that are each not the monovalent group represented by the formula (84).

$R_{801}$ to $R_{808}$ not forming the divalent group represented by the formula (82) or (83) and not being the monovalent group represented by the formula (84), and $R_{811}$ to $R_{814}$ and $R_{821}$ to $R_{824}$ not being the monovalent group represented by the formula (84) are preferably each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The monovalent group represented by the formula (84) is preferably represented by a formula (85) or (86) below.

[Formula 359]

(85)

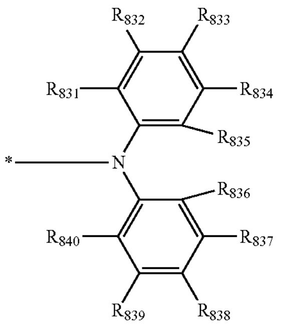

In the formula (85):

$R_{831}$ to $R_{840}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and

* in the formula (85) represents the same as * in the formula (84).

[Formula 360]

(86)

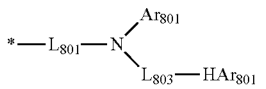

In the formula (86):

$Ar_{801}$, $L_{801}$, and $L_{803}$ represent the same as $Ar_{801}$, $L_{801}$, and $L_{803}$ in the formula (84); and $HAr_{801}$ is a structure represented by a formula (87) below.

[Formula 361]

(87)

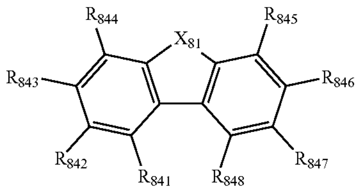

In the formula (87):

$X_{81}$ is an oxygen atom or a sulfur atom;

one of $R_{841}$ to $R_{848}$ is a single bond with $L_{803}$; and $R_{841}$ to $R_{848}$ not being the single bond are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (8)

Specific examples of the compound represented by the formula (8) include compounds shown below as well as the compounds disclosed in WO 2014/104144.

[Formula 362]

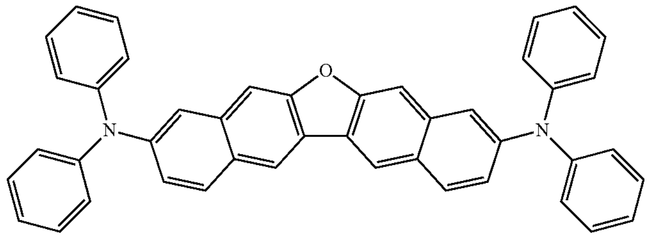

-continued
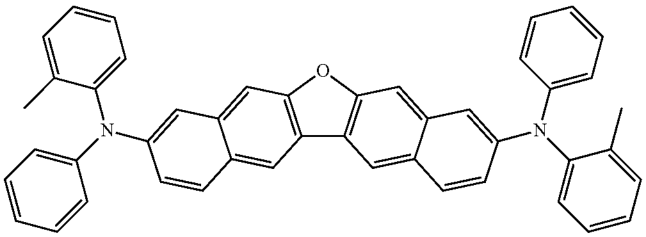
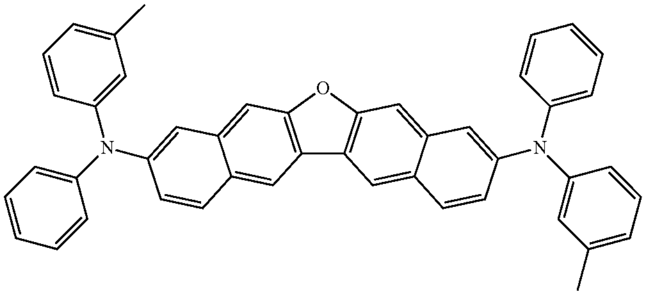
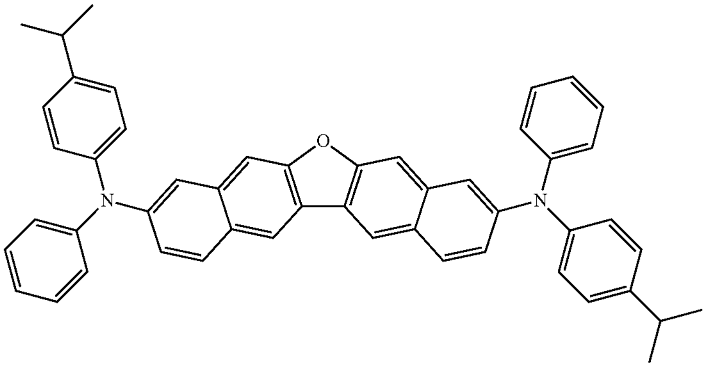
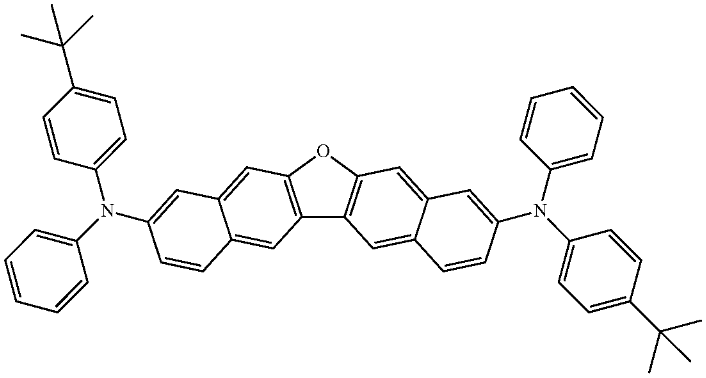
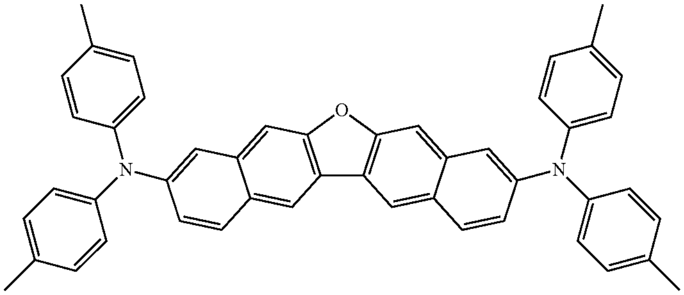

-continued
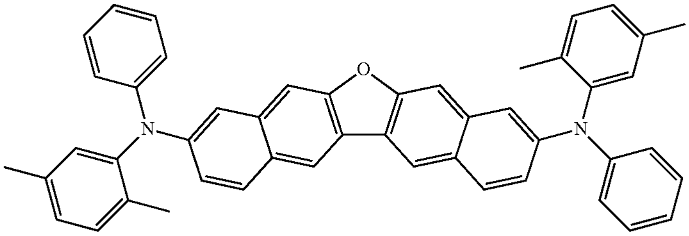
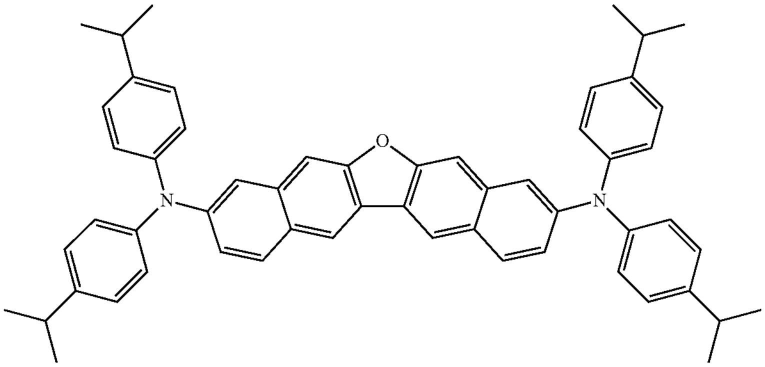
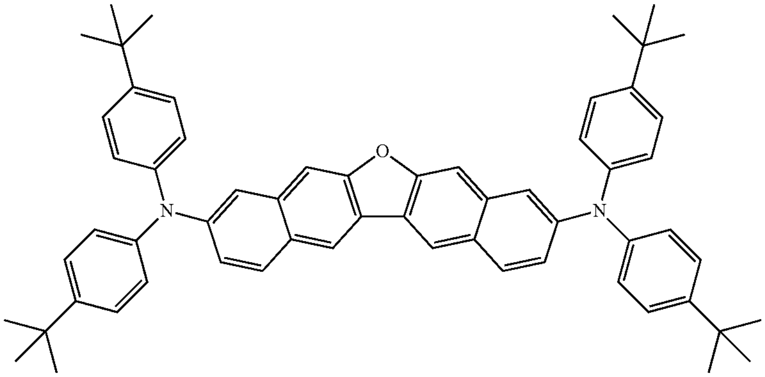
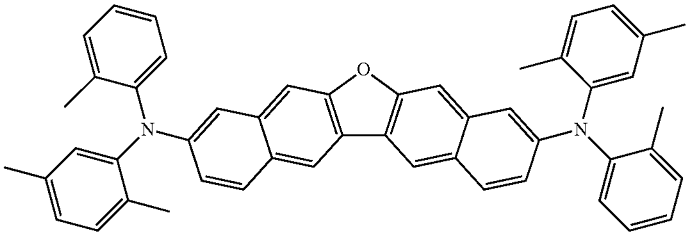
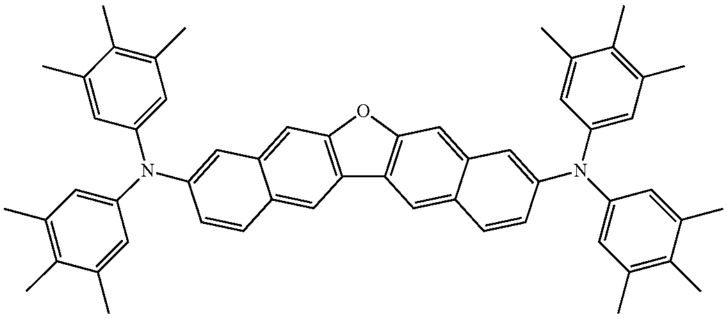

-continued
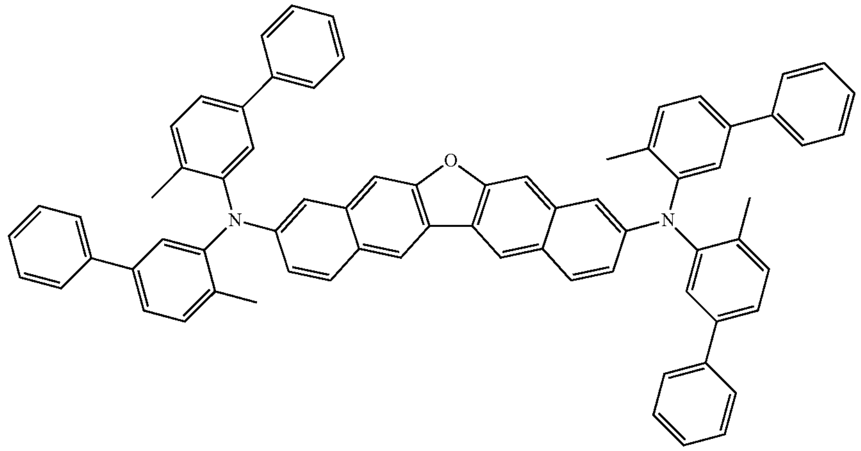
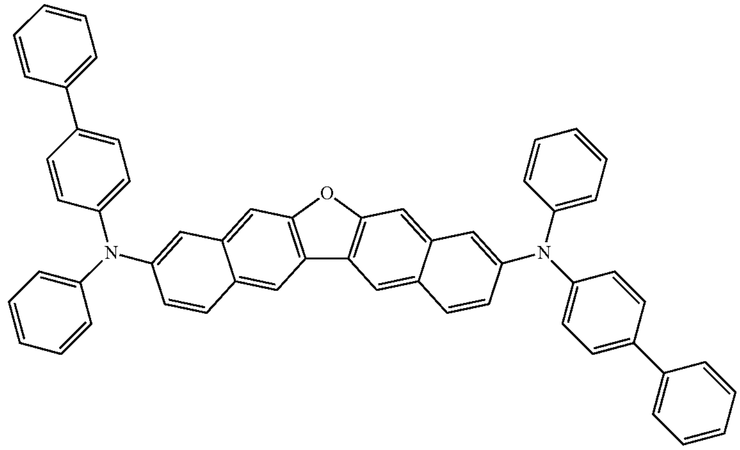
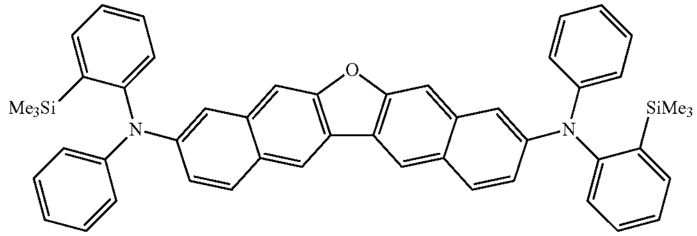
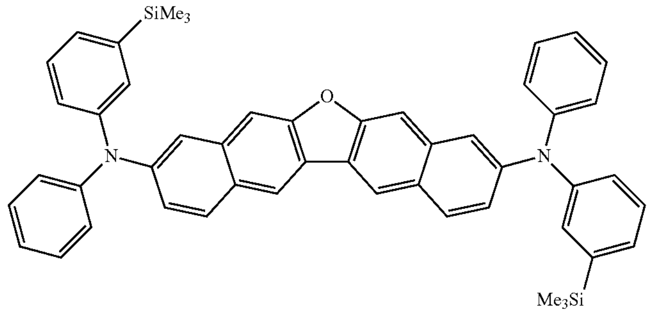
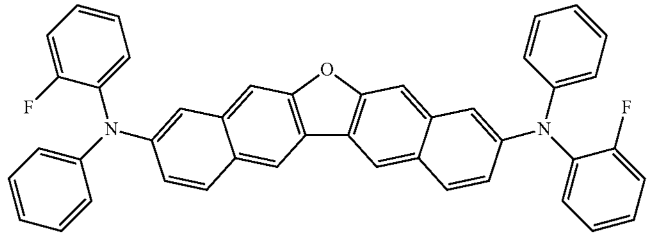

-continued
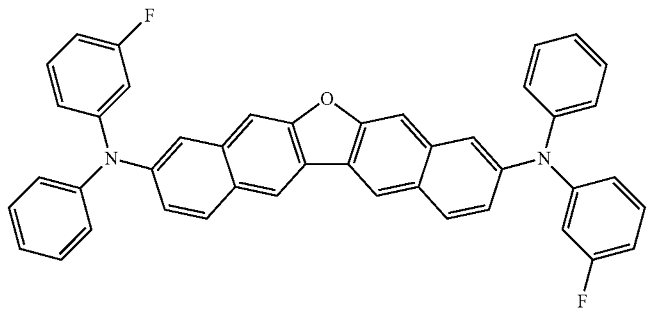
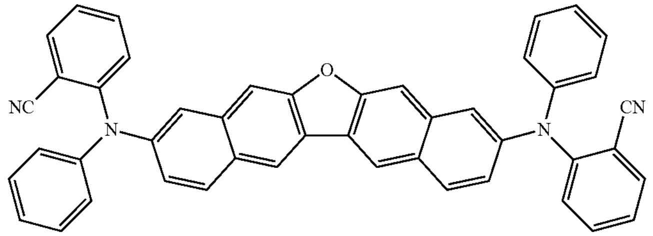
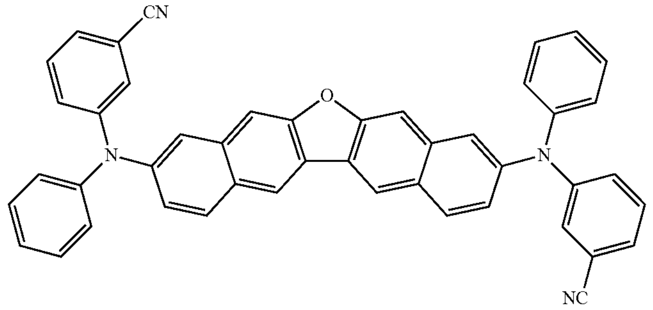
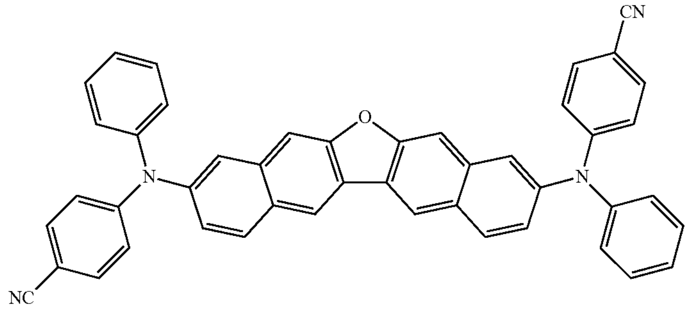
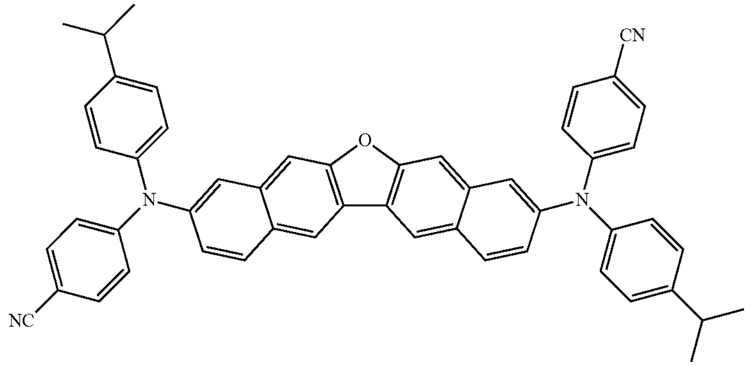

-continued
[Formula 363]
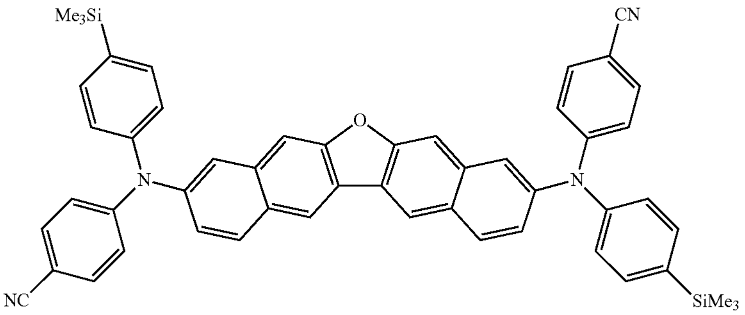
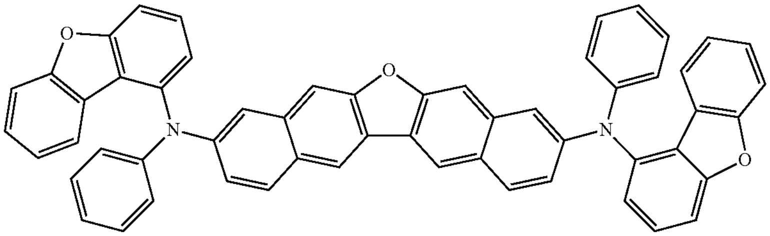
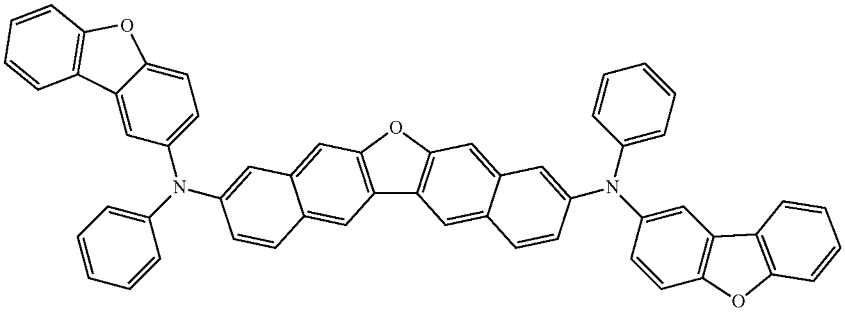
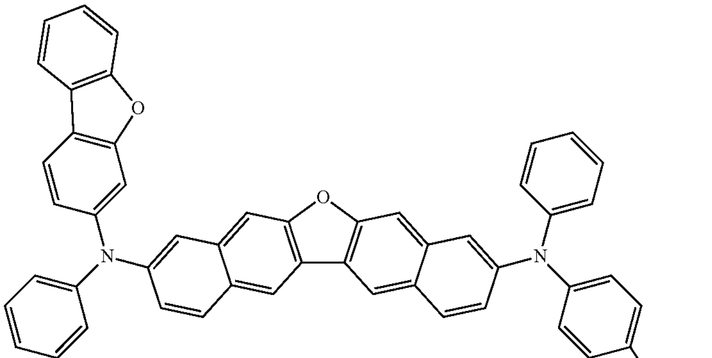
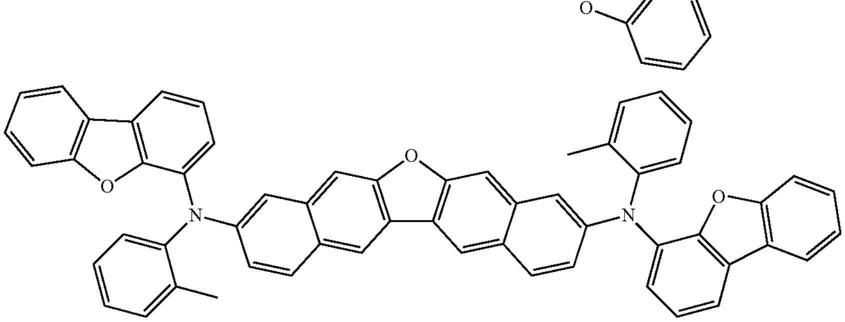

-continued
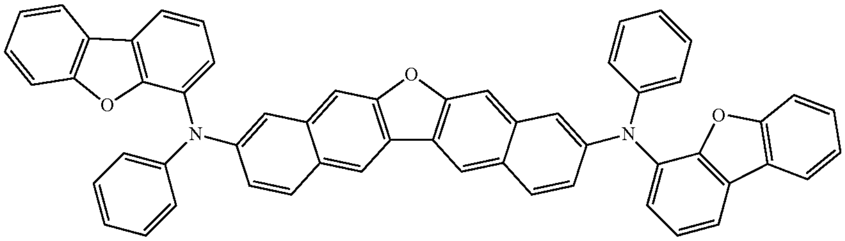
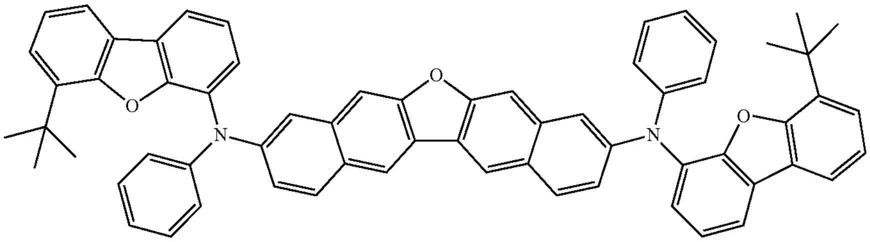
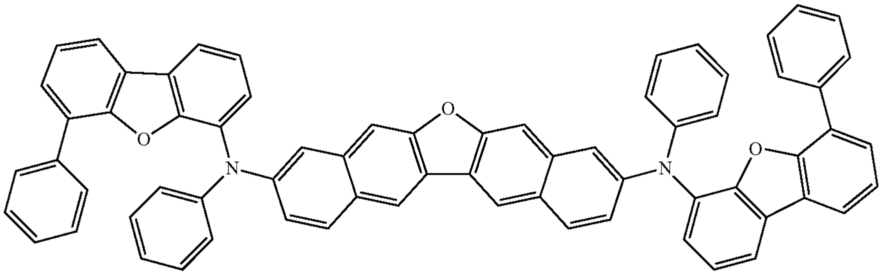
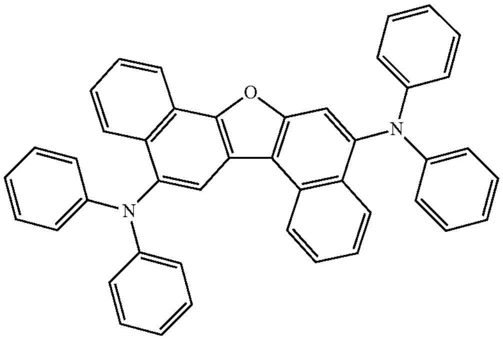
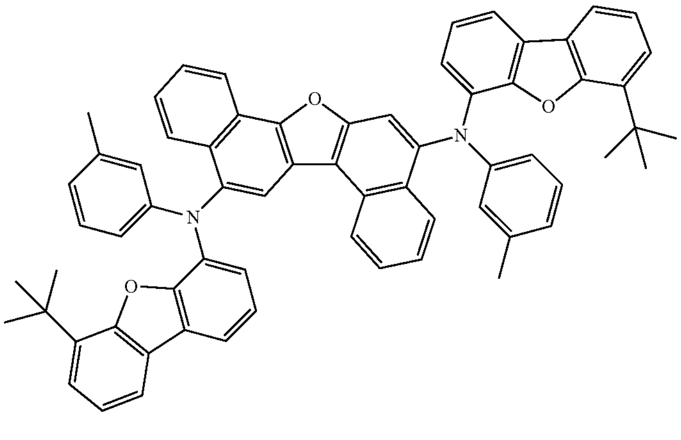
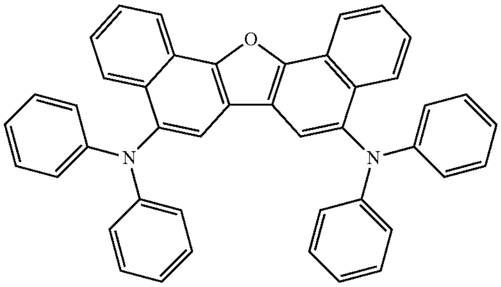
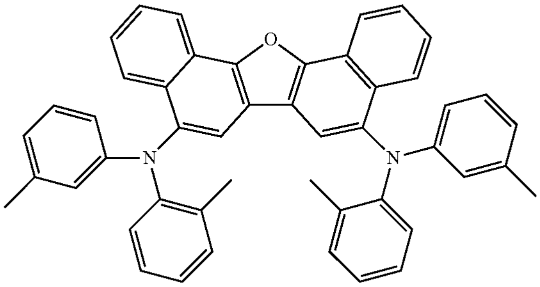

-continued
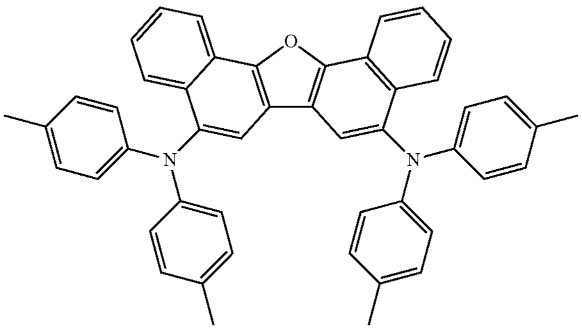
[Formula 364]
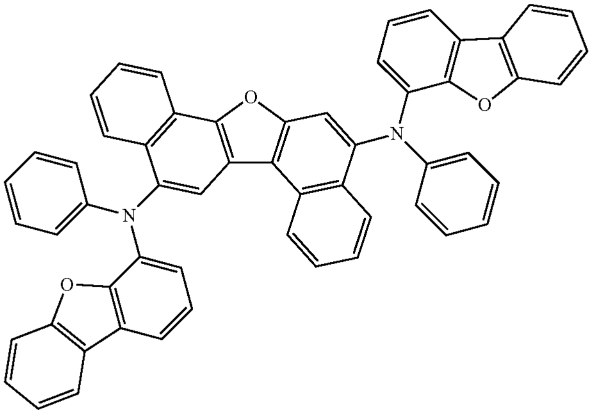
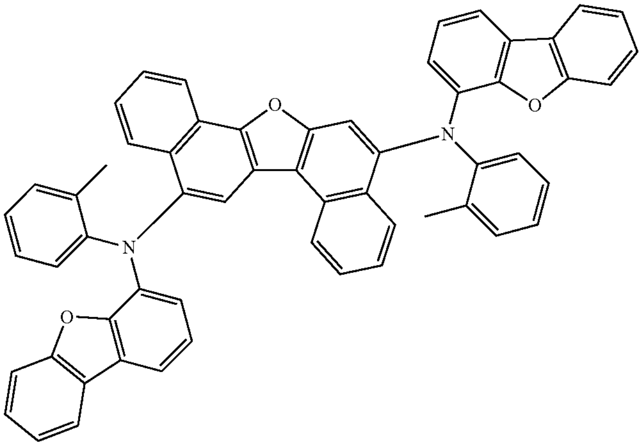
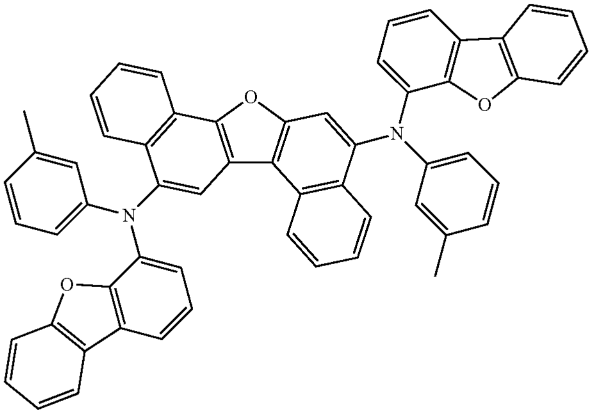

-continued
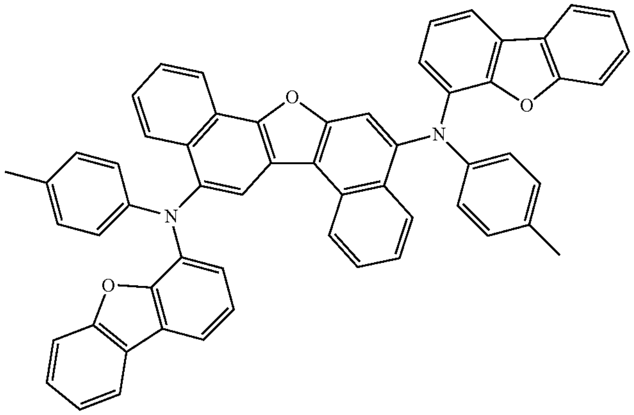
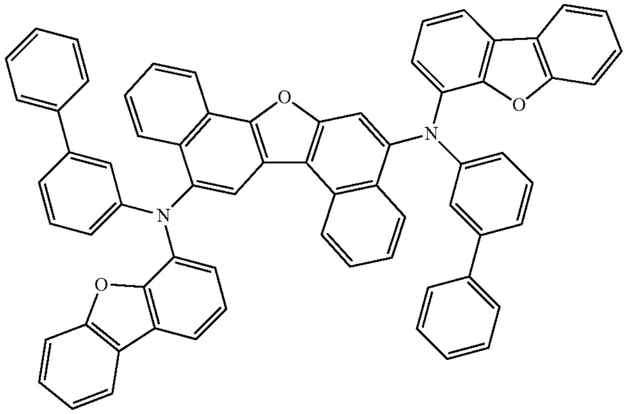
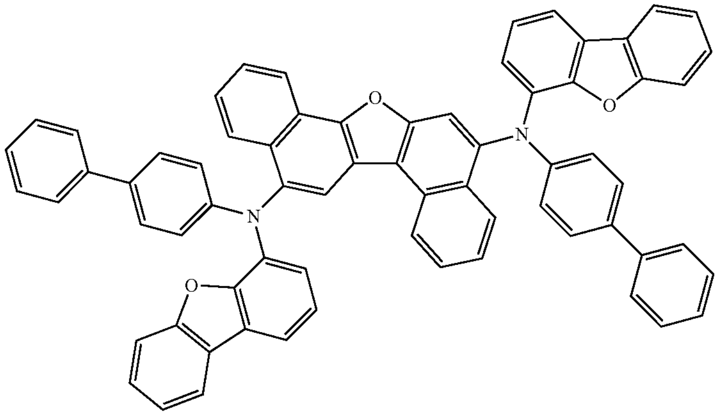
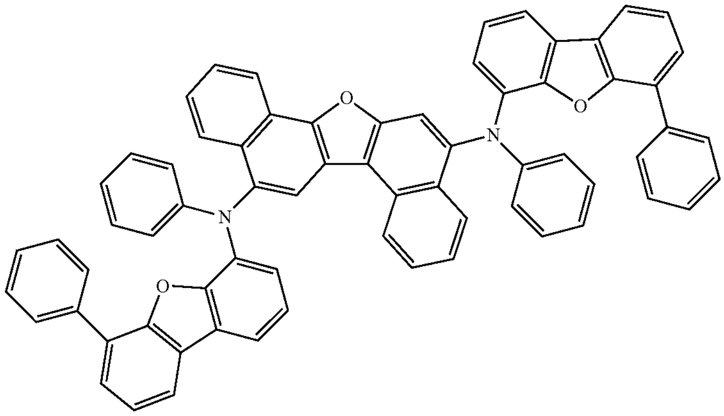

-continued
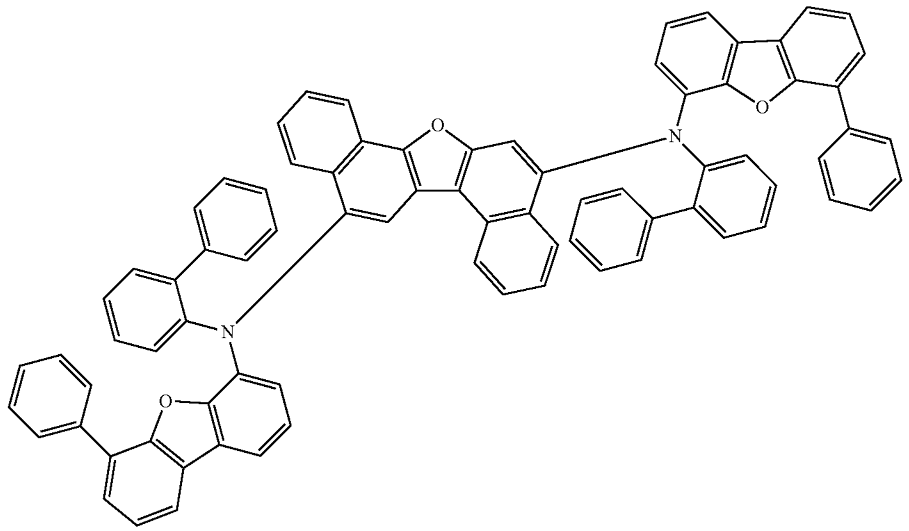
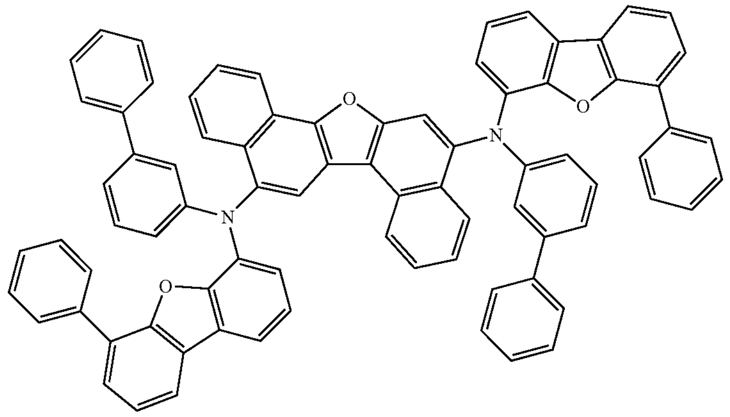
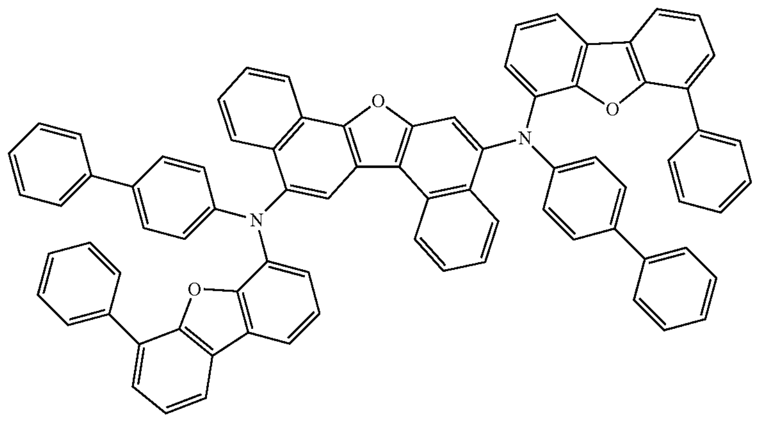

-continued
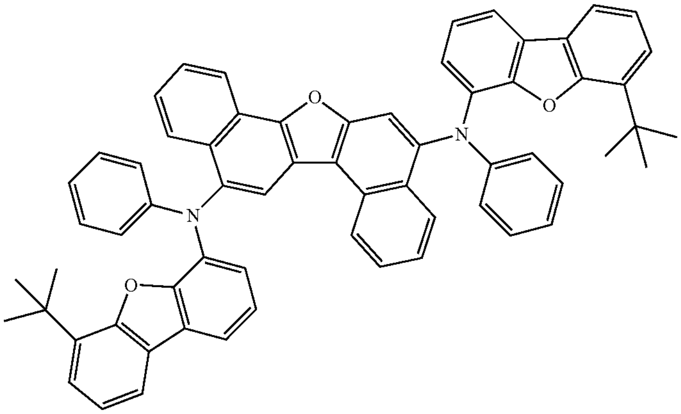
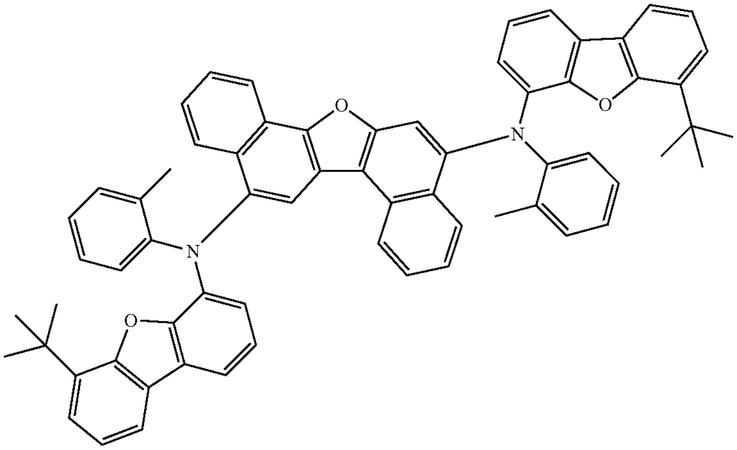
[Formula 365]
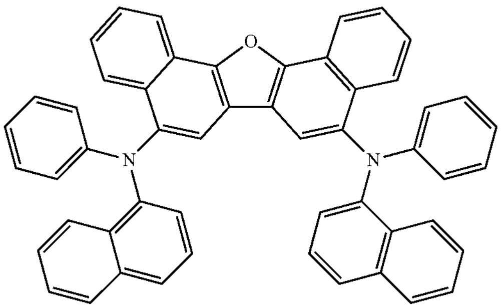
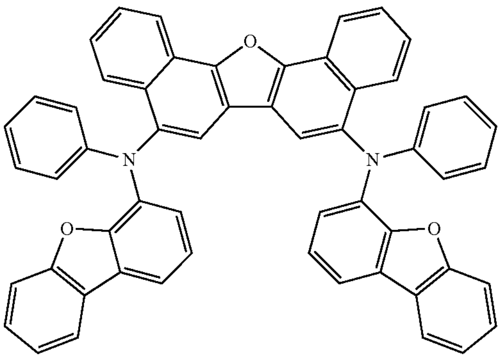
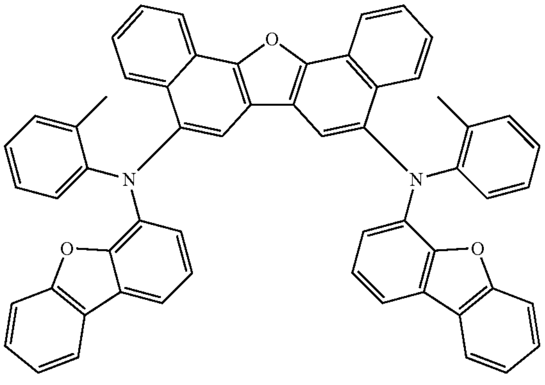
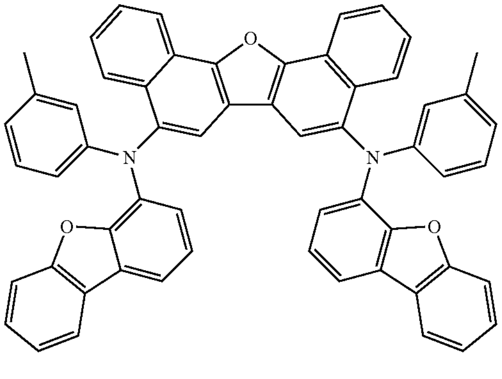

-continued
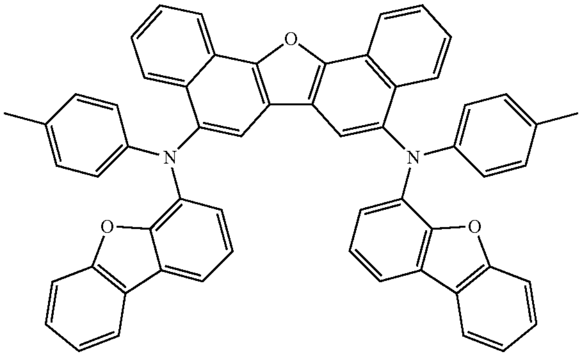
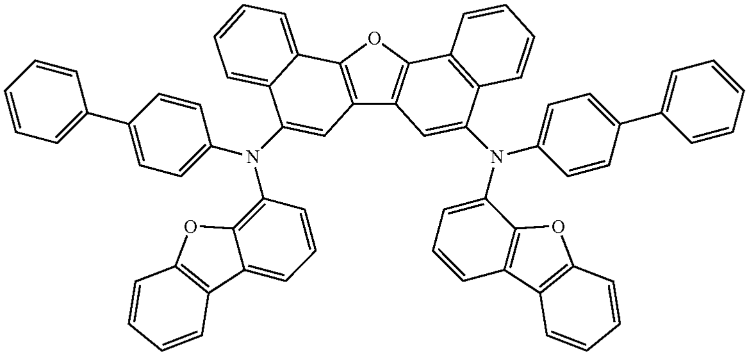
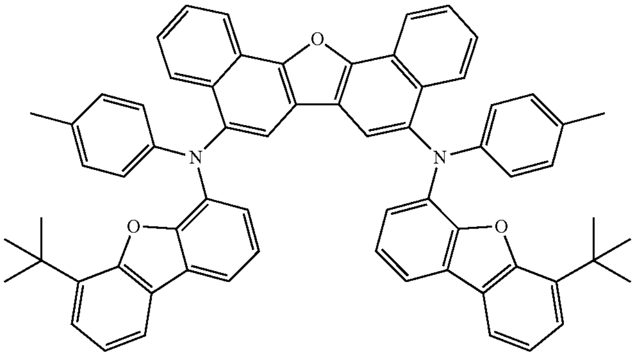
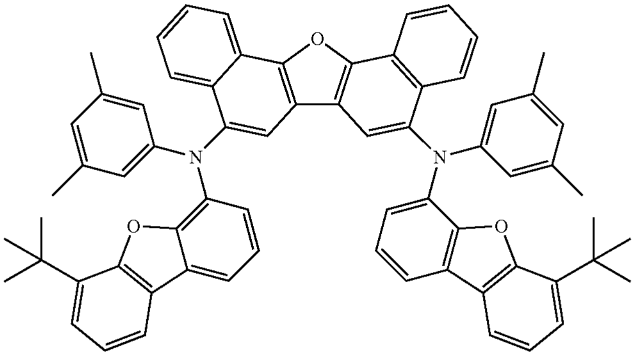

-continued
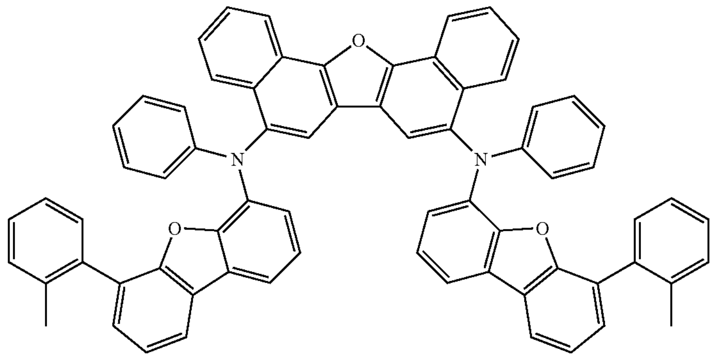
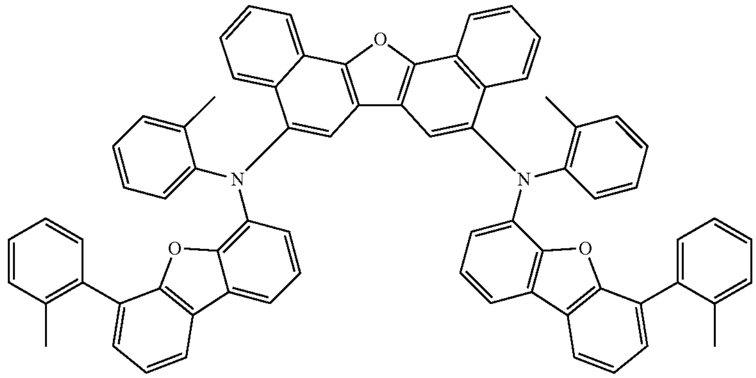
[Formula 366]
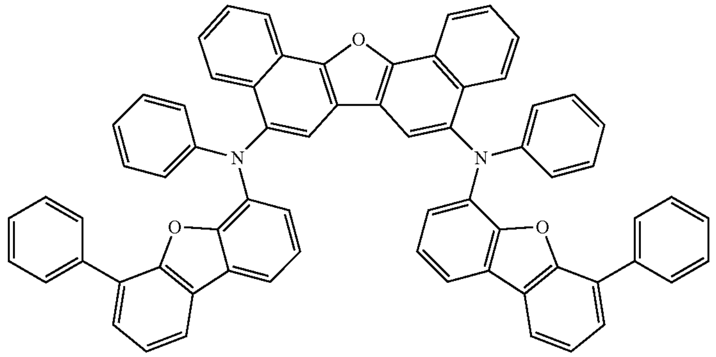
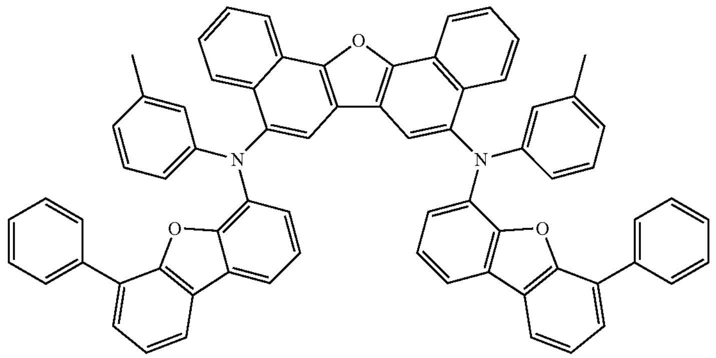

-continued
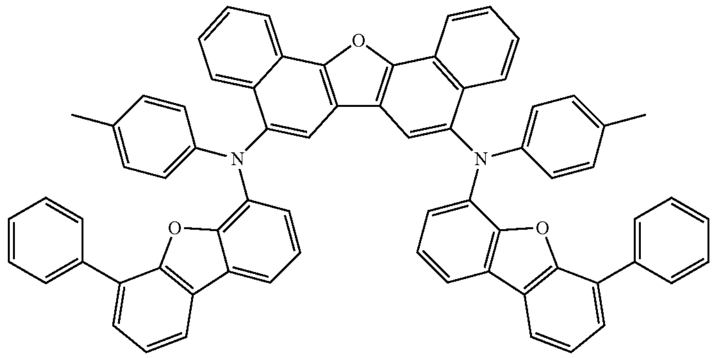
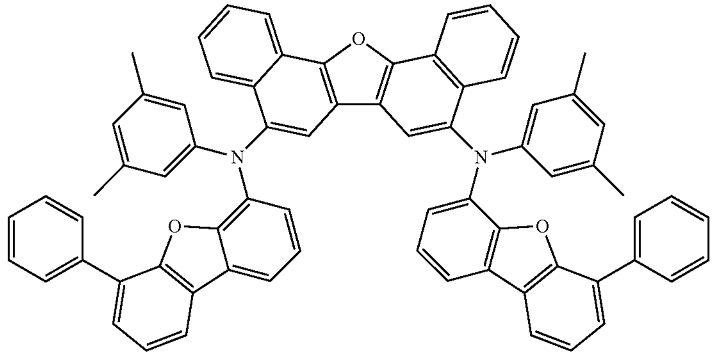
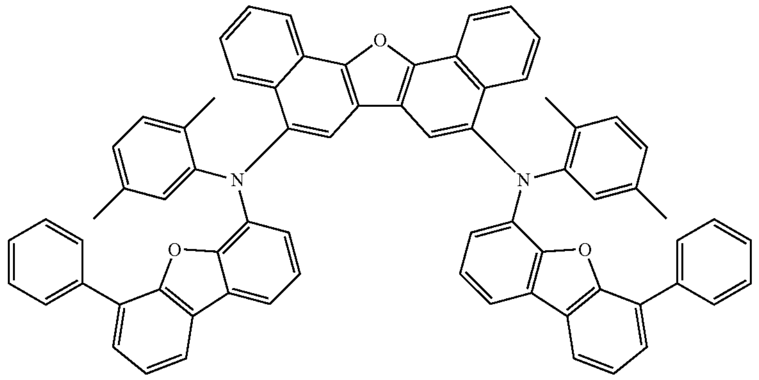
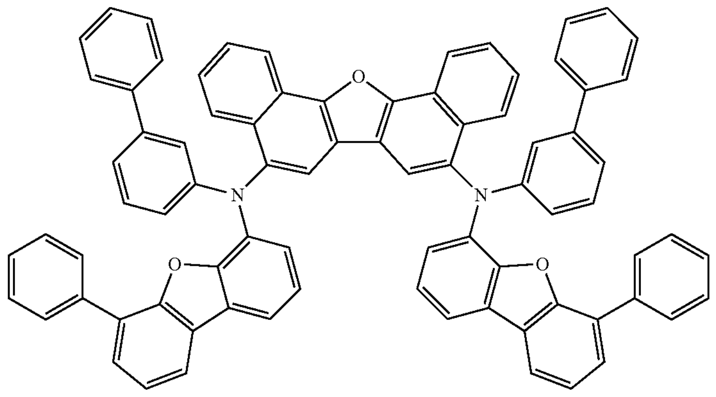

-continued
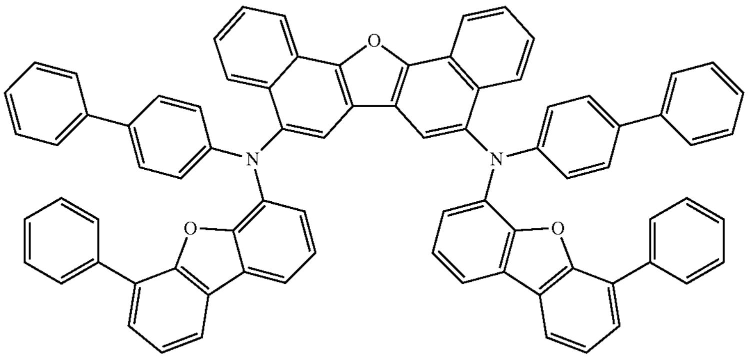
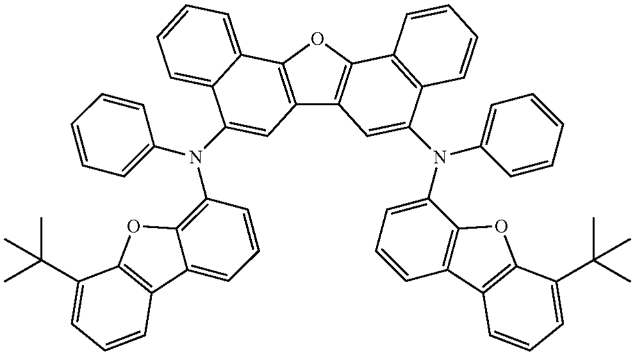
[Formula 367]
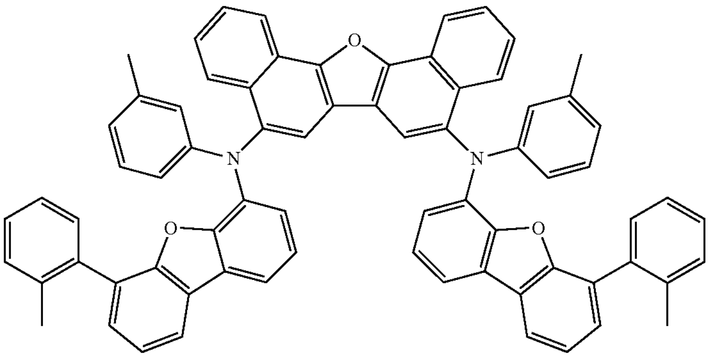
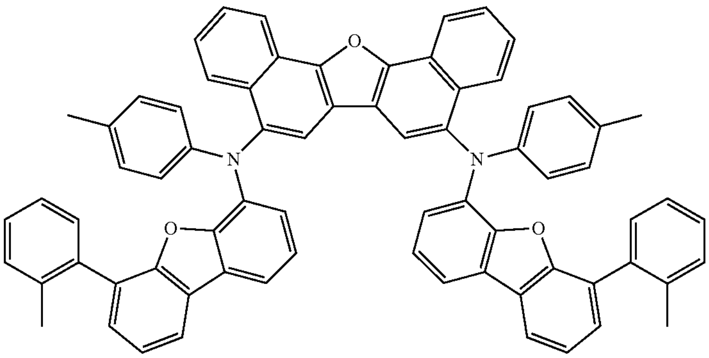

-continued
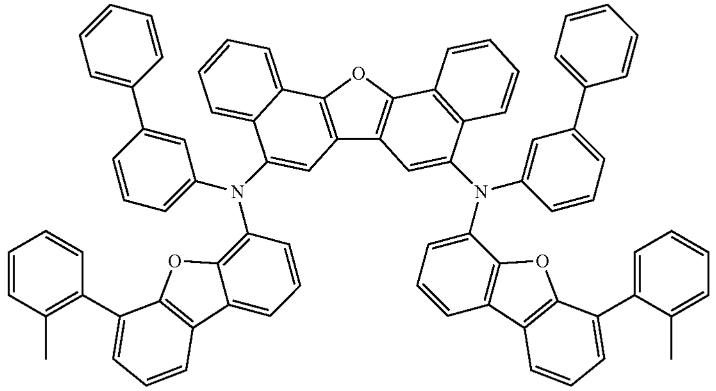
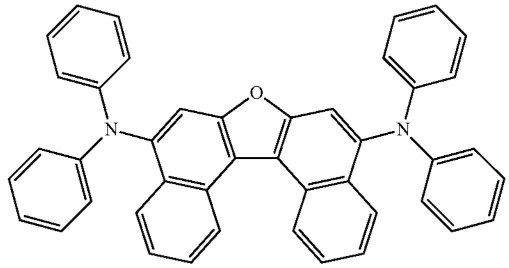
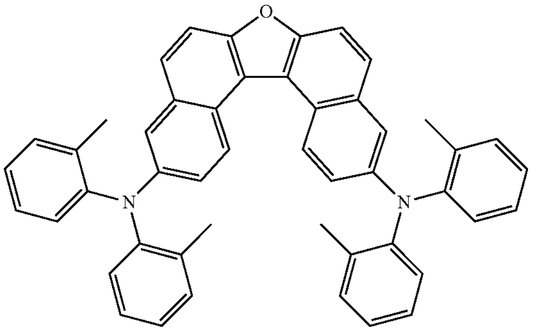
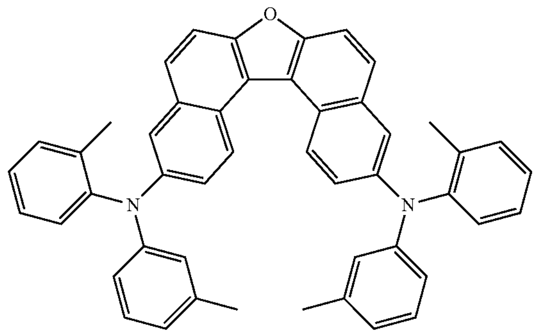
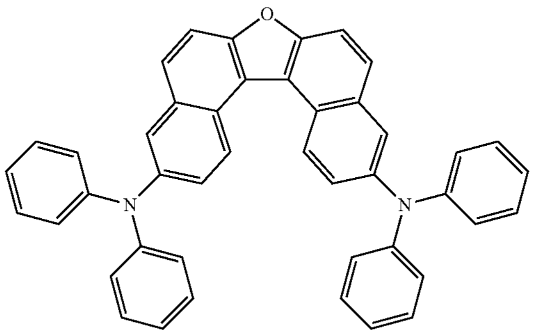
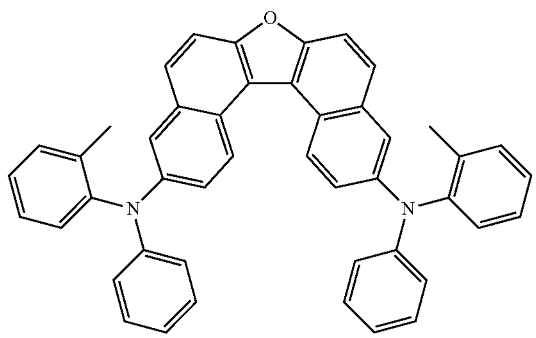
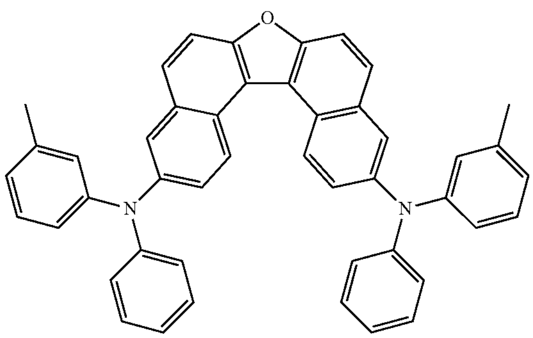

-continued
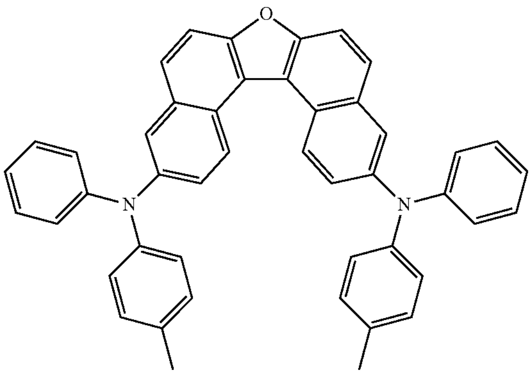
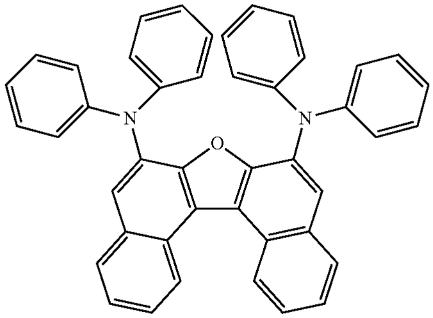
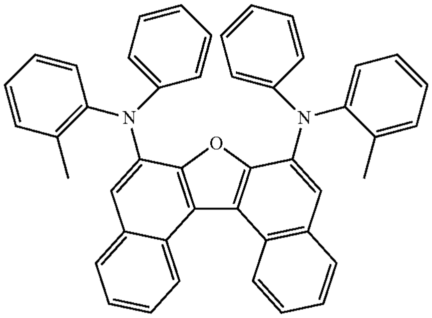
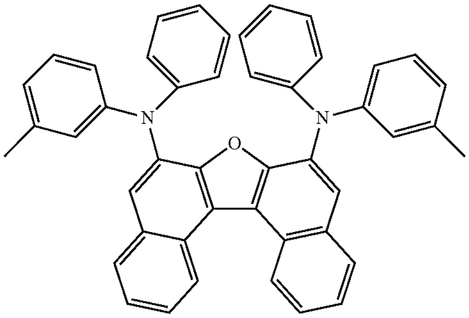
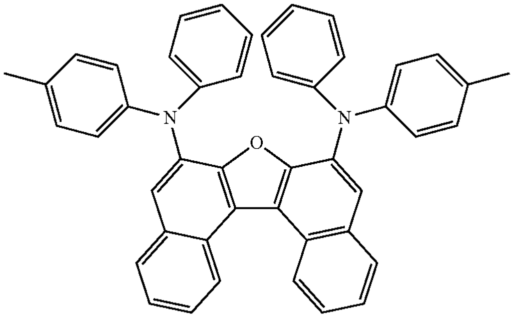
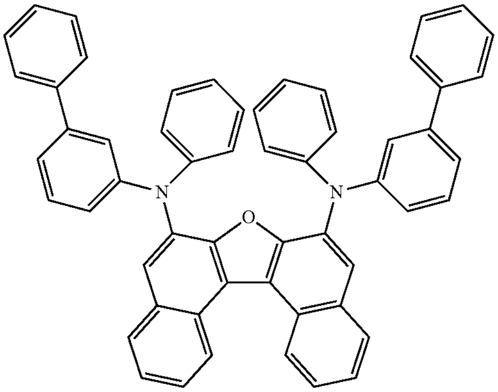
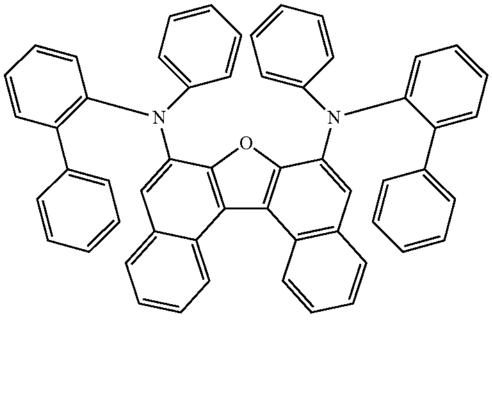

Compound Represented by Formula (9)

The compound represented by the formula (9) will be described below.

[Formula 368]

(9)

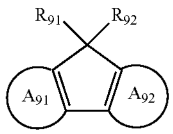

In the formula (9):

a ring $A_{91}$ and a ring $A_{92}$ are each independently a substituted or unsubstituted aromatic hydrocarbon ring having 6 to 50 ring carbon atoms, or a substituted or unsubstituted heterocycle having 5 to 50 ring atoms; and at least one of the ring $A_{91}$ or the ring $A_{92}$ is bonded with * in a structure represented by a formula (92) below.

[Formula 369]

(92)

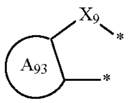

In the formula (92):

a ring A93 is a substituted or unsubstituted aromatic hydrocarbon ring having 6 to 50 ring carbon atoms, or a substituted or unsubstituted heterocycle having 5 to 50 ring atoms;

$X_9$ is $NR_{93}$, $C(R_{94})(R_{95})$, $Si(R_{96})(R_{97})$, $Ge(R_{98})(R_{99})$, an oxygen atom, a sulfur atom, or a selenium atom;

$R_{91}$ and $R_{92}$ are mutually bonded to form a substituted or unsubstituted monocyclic ring, mutually bonded to form a substituted or unsubstituted fused ring, or not mutually bonded; and $R_{91}$ and $R_{92}$ forming neither the monocyclic ring nor the fused ring, and $R_{93}$ to $R_{99}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms.

At least one of the ring A91 or the ring A92 is bonded to * in a structure represented by the formula (92). In other words, the ring-forming carbon atoms of the aromatic hydrocarbon ring or the ring atoms of the heterocycle of the ring A91 in an exemplary embodiment are bonded to * in a structure represented by the formula (92). Further, the ring-forming carbon atoms of the aromatic hydrocarbon ring or the ring atoms of the heterocycle of the ring A92 in an exemplary embodiment are bonded to * in a structure represented by the formula (92).

In an exemplary embodiment, a group represented by a formula (93) below is bonded to one or both of the ring A91 and the ring A92.

[Formula 370]

(93)

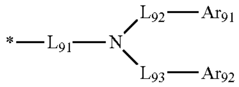

In the formula (93):

$Ar_{91}$ and $Ar_{92}$ are each independently a substituted or unsubstituted aryl group having 6 to 50 ring carbon atoms, or a substituted or unsubstituted heterocyclic group having 5 to 50 ring atoms;

$L_{91}$ to $L_{93}$ are each independently a single bond, a substituted or unsubstituted arylene group having 6 to 30 ring carbon atoms, a substituted or unsubstituted divalent heterocyclic group having 5 to 30 ring atoms, or a divalent linking group formed by bonding two, three or four groups selected from the group consisting of a substituted or unsubstituted arylene group having 6 to 30 ring carbon atoms and a substituted or unsubstituted divalent heterocyclic group having 5 to 30 ring atoms; and

* in the formula (93) represents a bonding position to one of the ring A91 and the ring A92.

In an exemplary embodiment, in addition to the ring A91, the ring-forming carbon atoms of the aromatic hydrocarbon ring or the ring atoms of the heterocycle of the ring A92 are bonded to * in a structure represented by the formula (92). In this case, the structures represented by the formula (92) may be mutually the same or different.

In an exemplary embodiment, $R_{91}$ and $R_{92}$ are each independently a substituted or unsubstituted aryl group having 6 to 50 ring carbon atoms.

In an exemplary embodiment, $R_{91}$ and $R_{92}$ are mutually bonded to form a fluorene structure.

In an exemplary embodiment, the ring A91 and the ring A92 are each independently a substituted or unsubstituted aromatic hydrocarbon ring having 6 to 50 ring carbon atoms, example of which is a substituted or unsubstituted benzene ring.

In an exemplary embodiment, the ring A93 is a substituted or unsubstituted aromatic hydrocarbon ring having 6 to 50 ring carbon atoms, example of which is a substituted or unsubstituted benzene ring.

In an exemplary embodiment, $X_9$ is an oxygen atom or a sulfur atom.

Specific Examples of Compound Represented by Formula (9)

Specific examples of the compound represented by the formula (9) include compounds below.

[Formula 371]
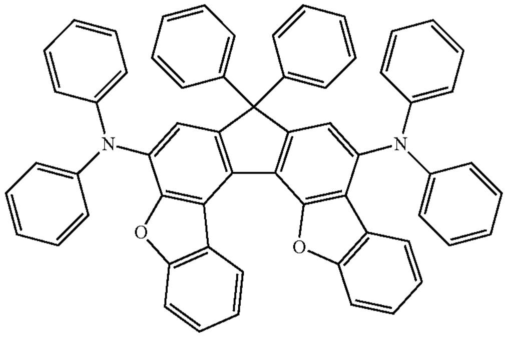
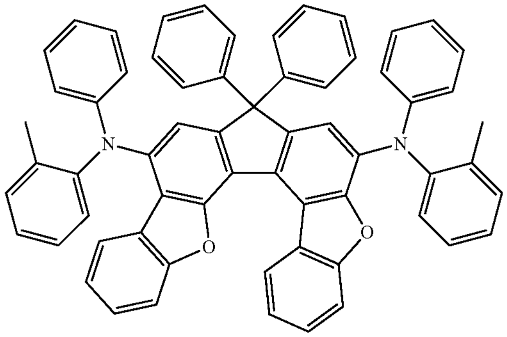
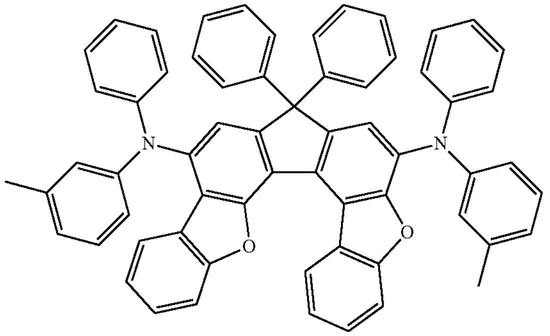
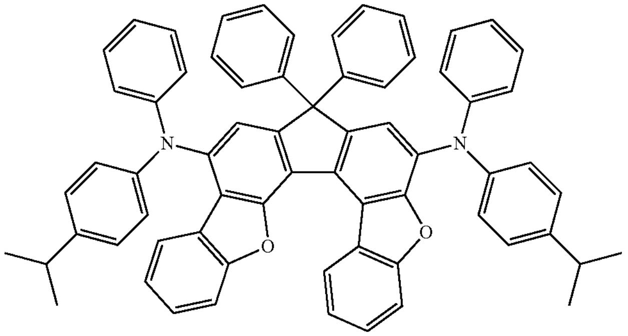
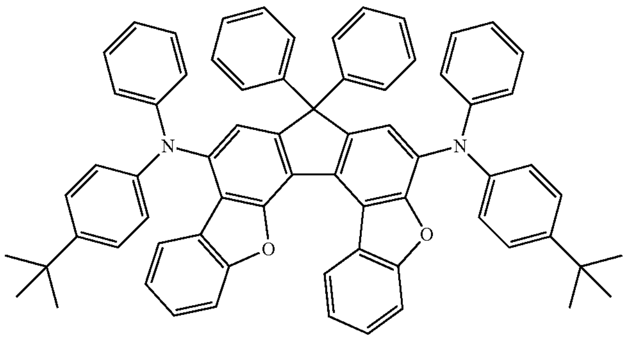
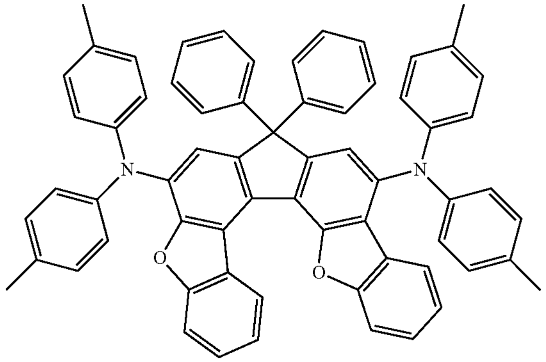
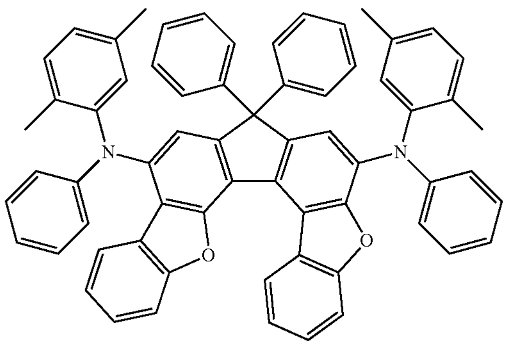
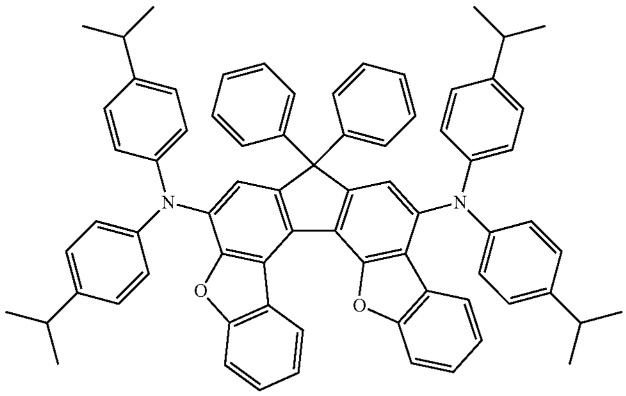

-continued
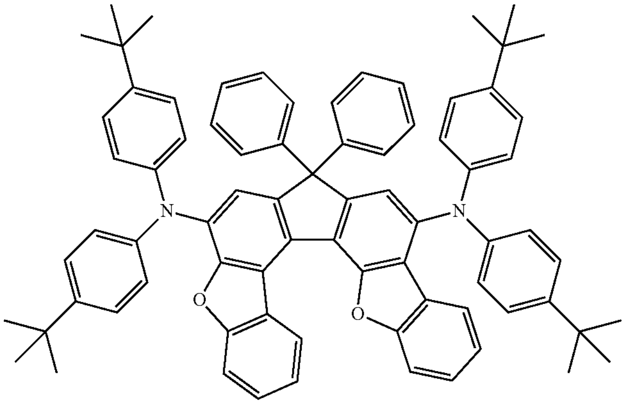
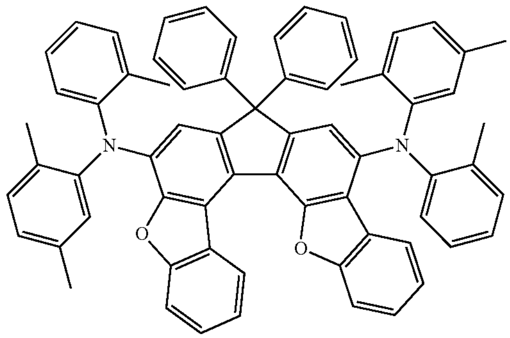
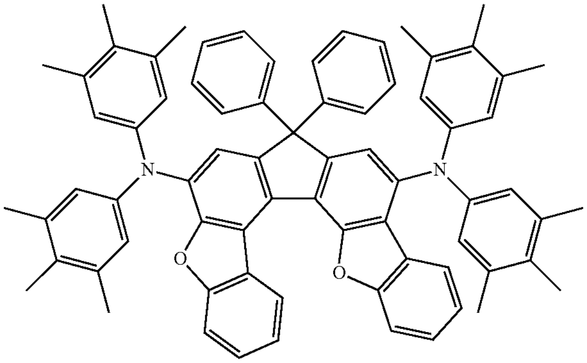
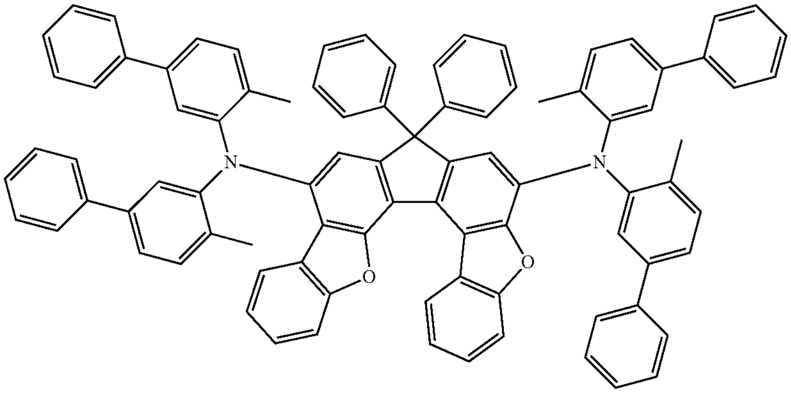
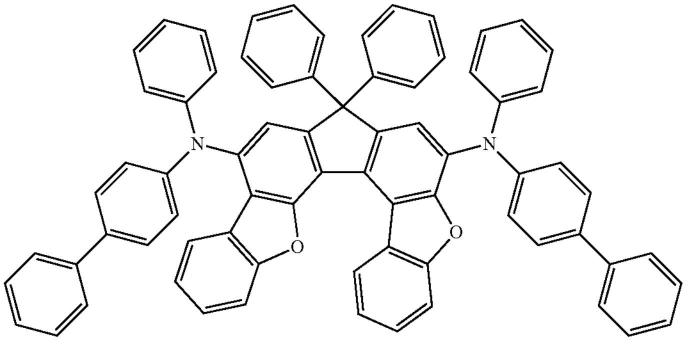

-continued
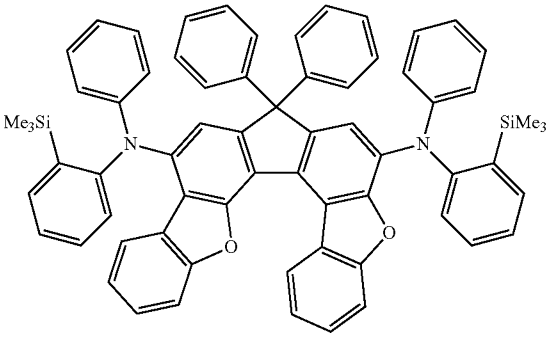
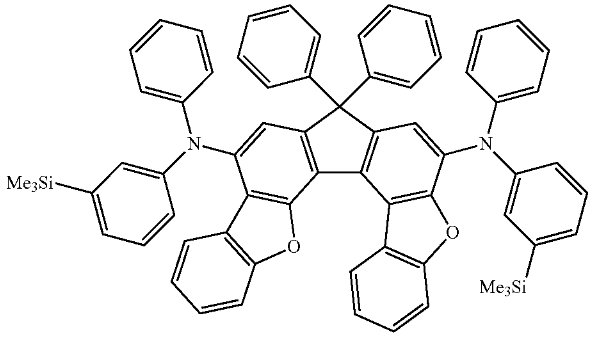
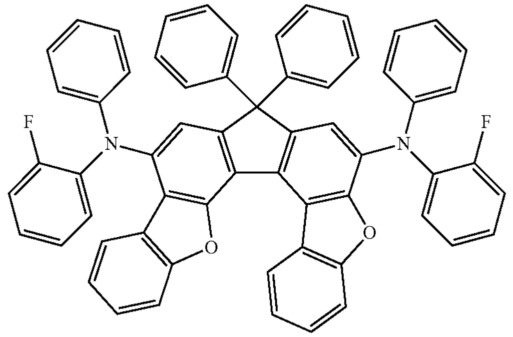
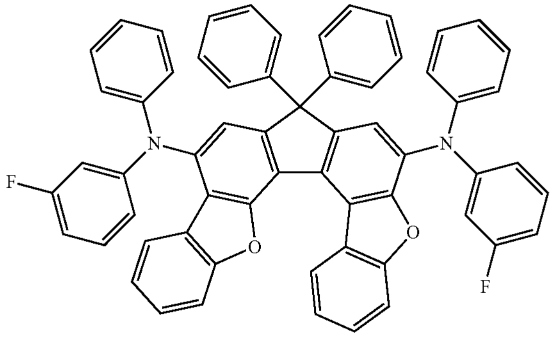
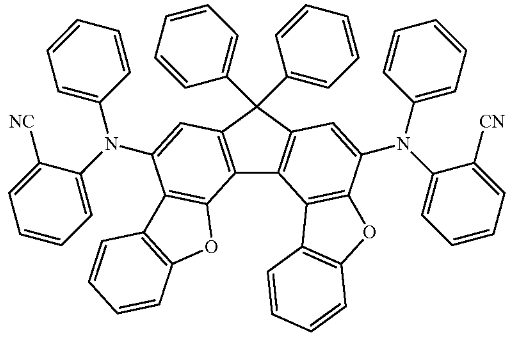
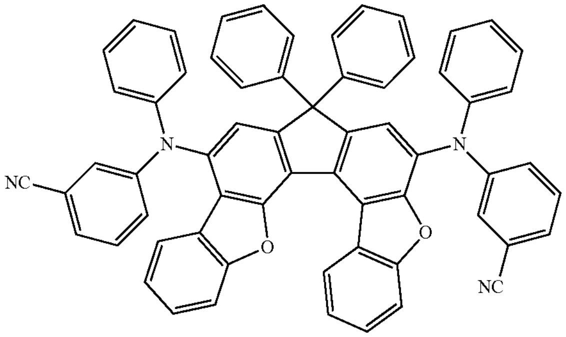
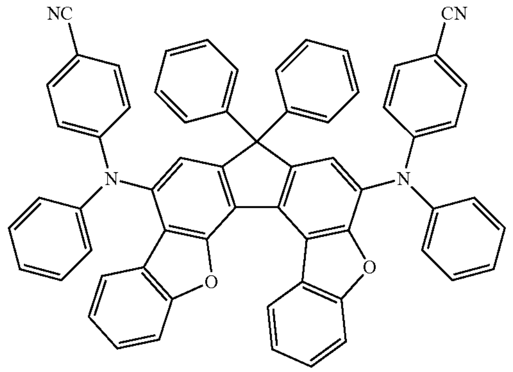
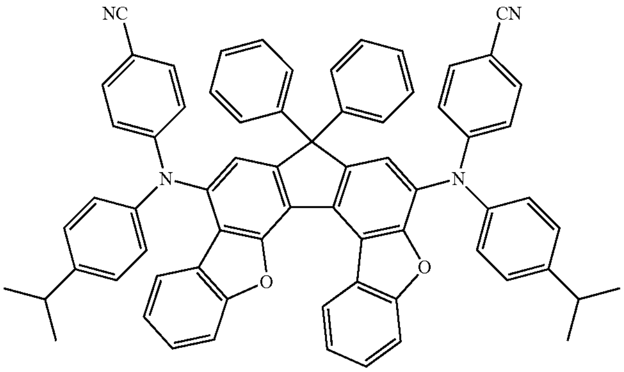

-continued
[Formula 372]
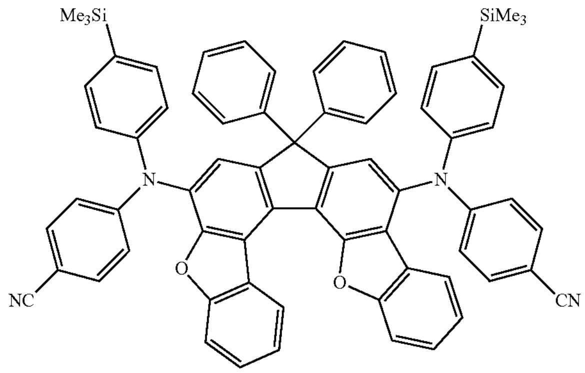
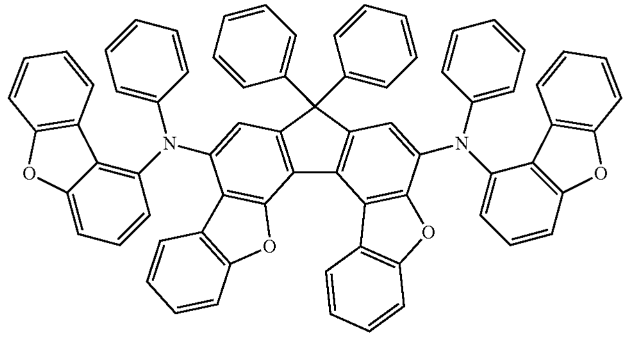
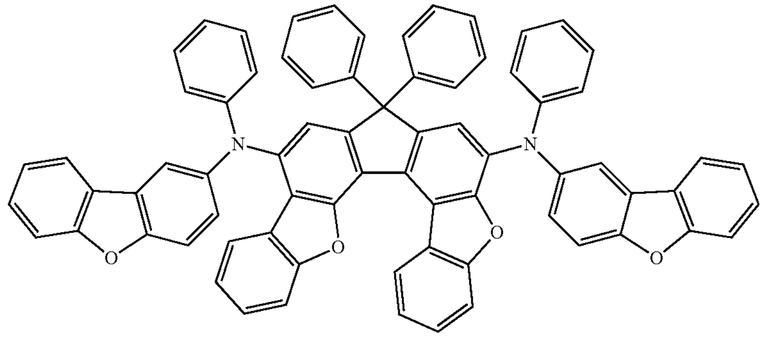
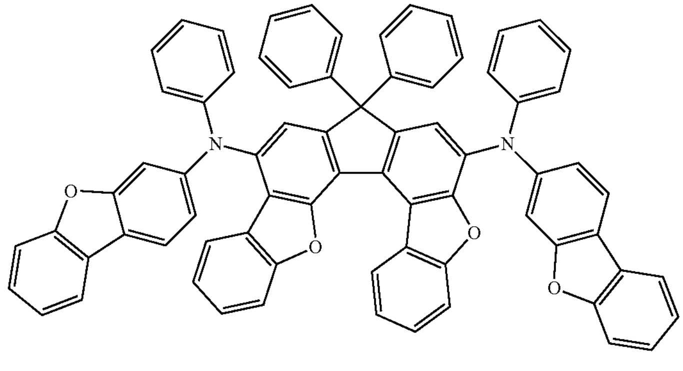

-continued
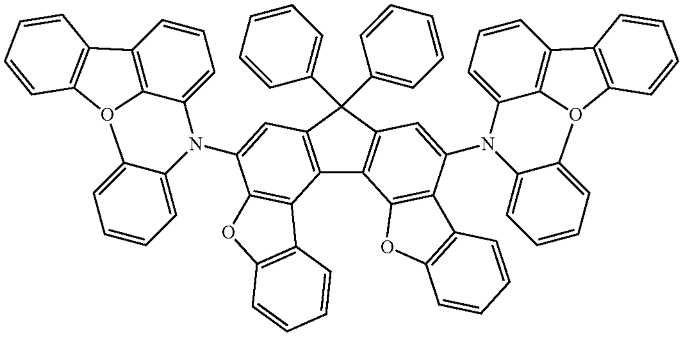
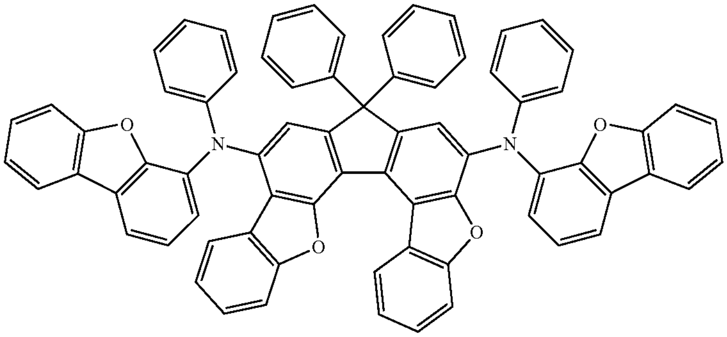
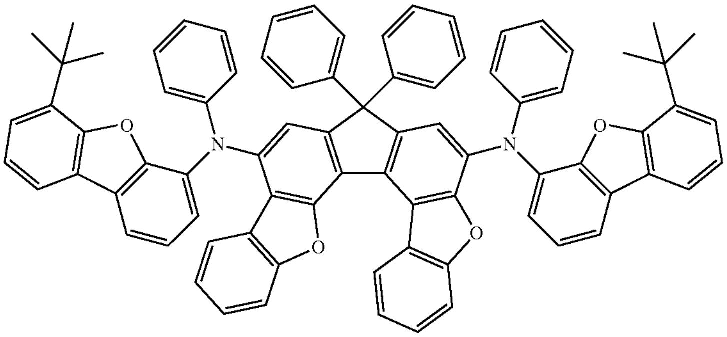
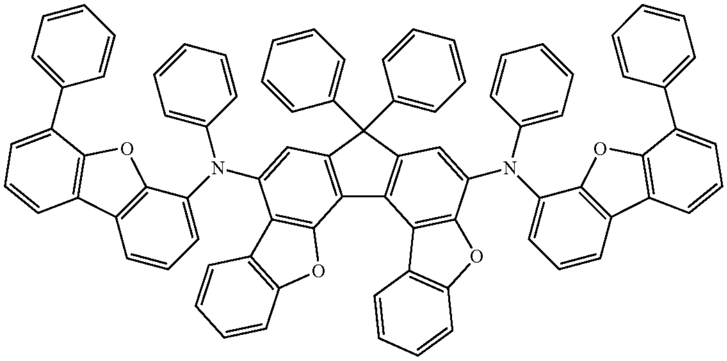
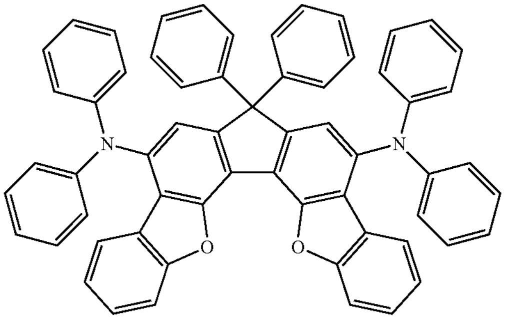
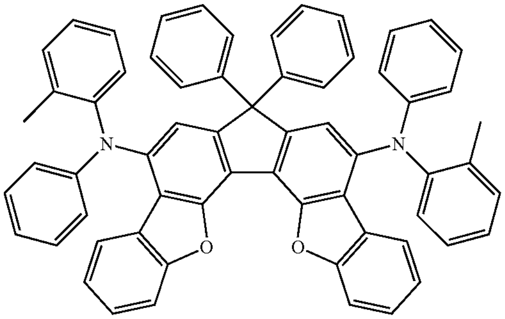

-continued
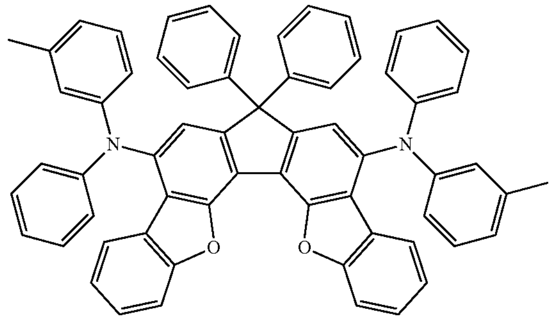
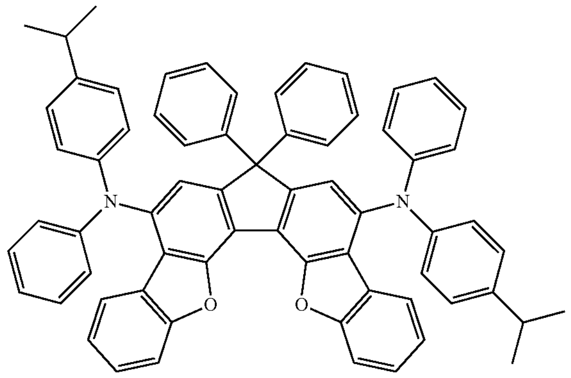
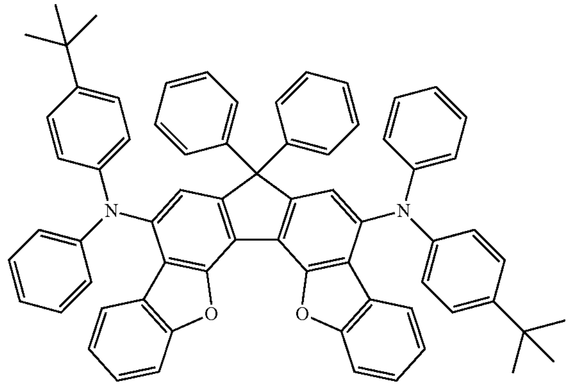
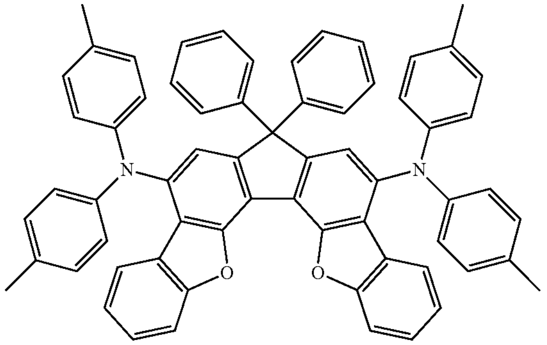
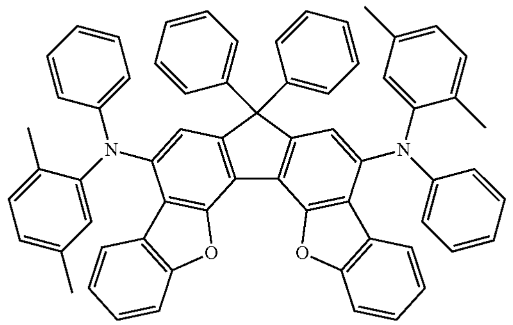
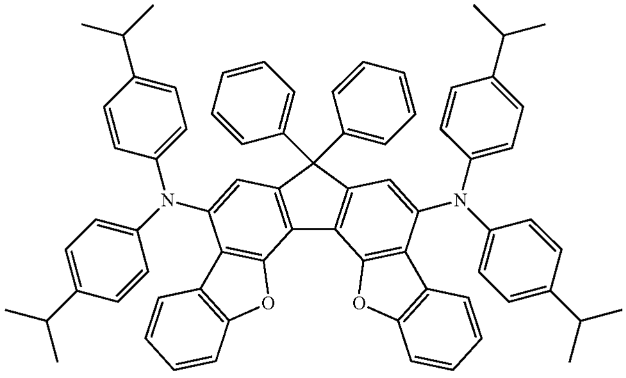
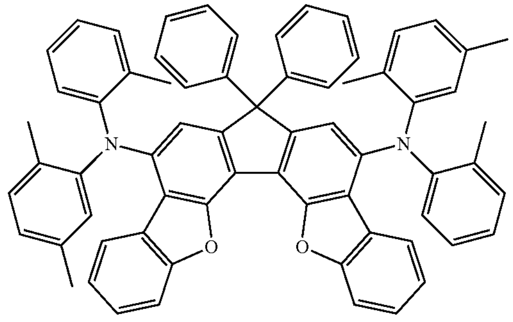
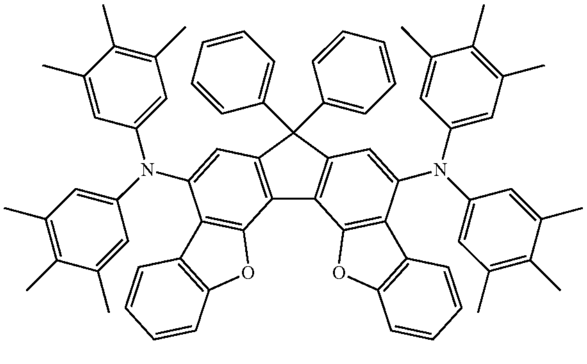

-continued
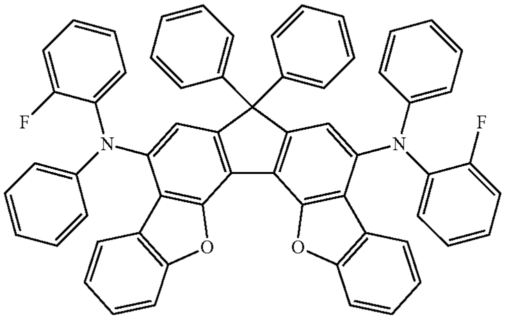
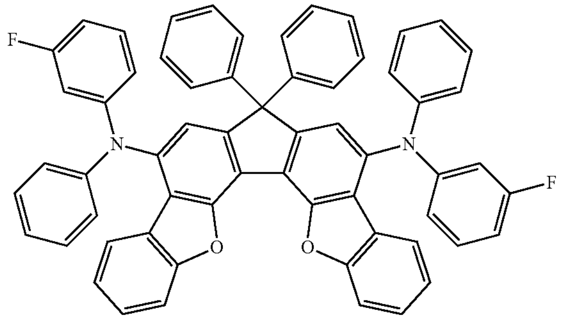
[Formula 373]
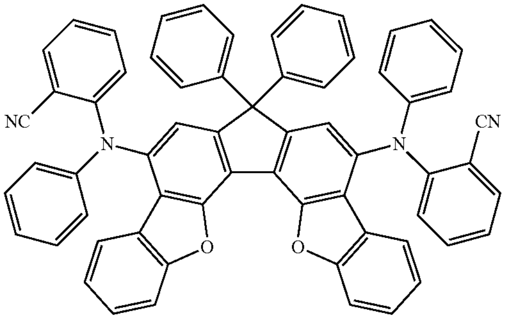
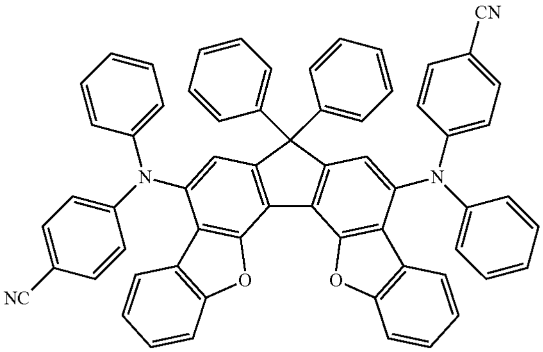
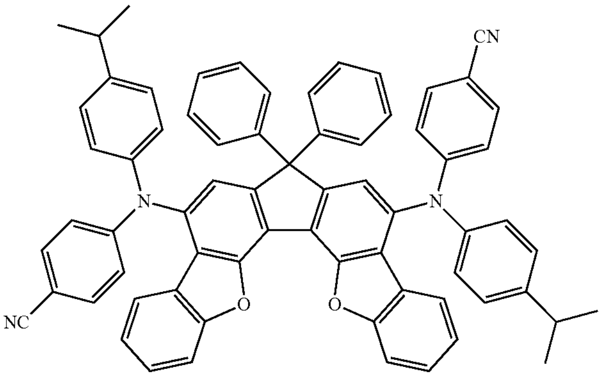
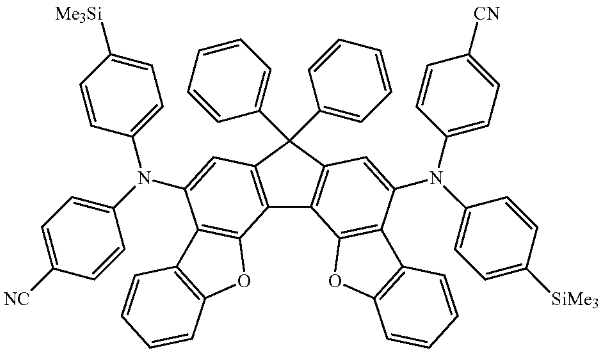

-continued
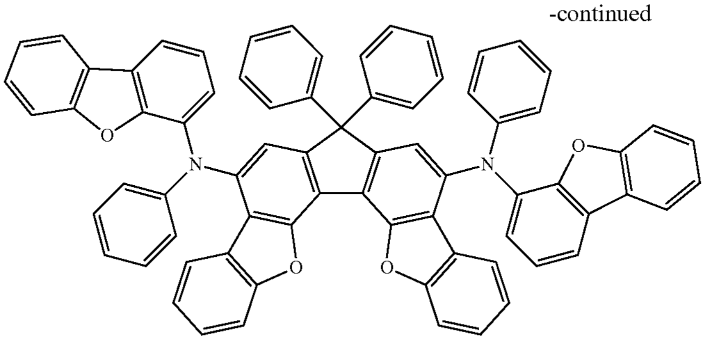
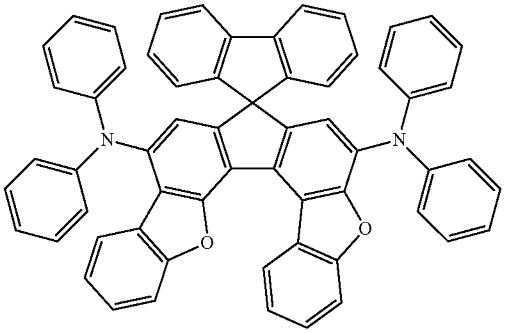
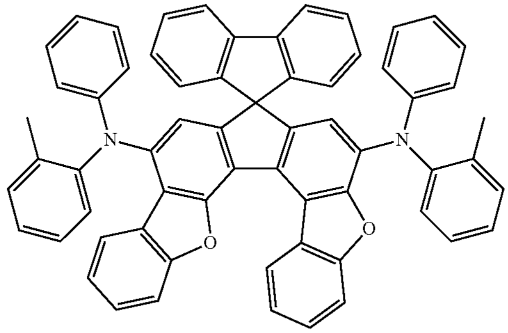
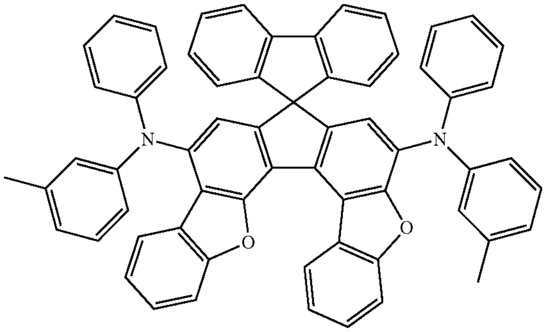
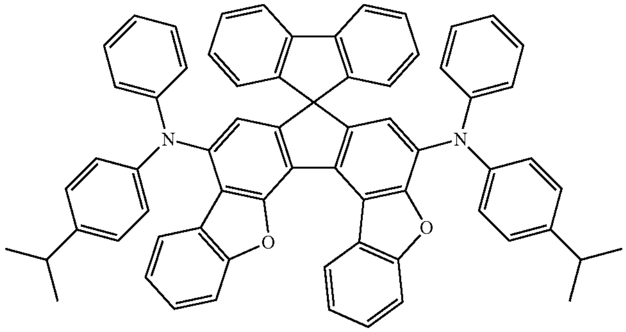
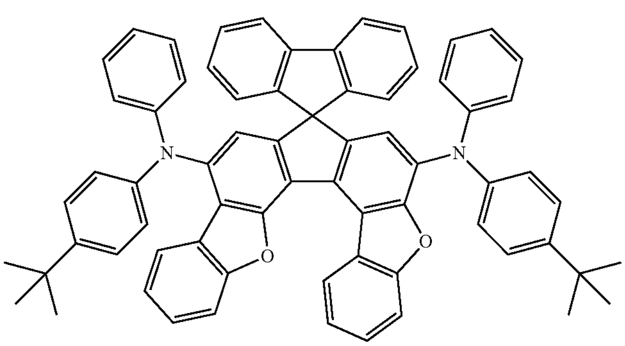
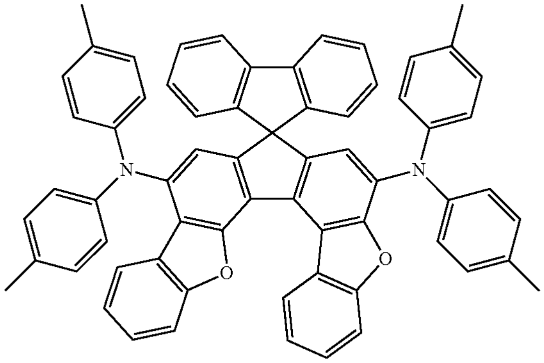
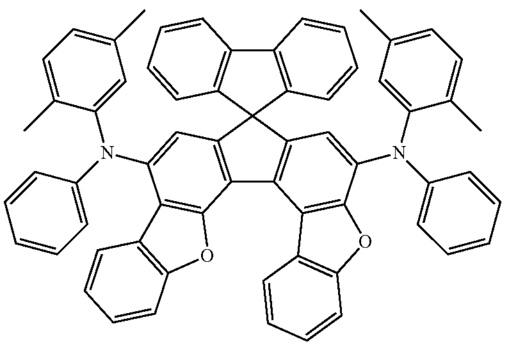
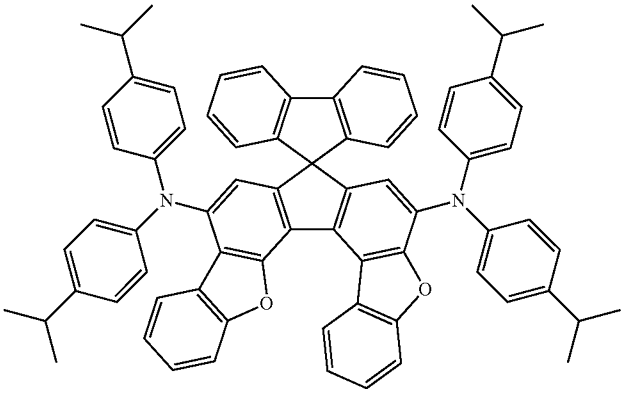

-continued
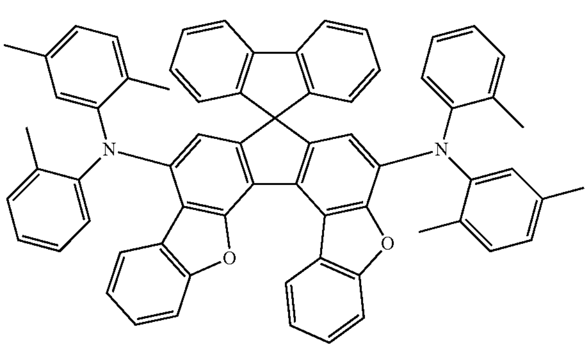
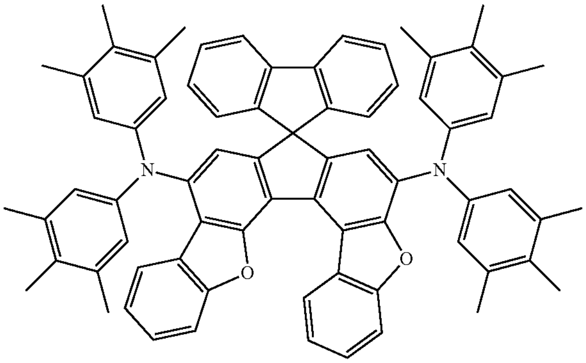
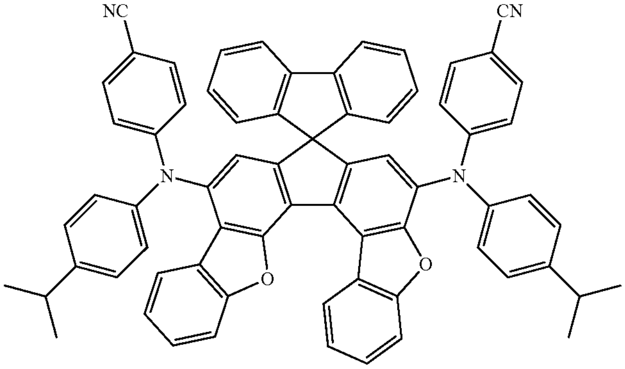
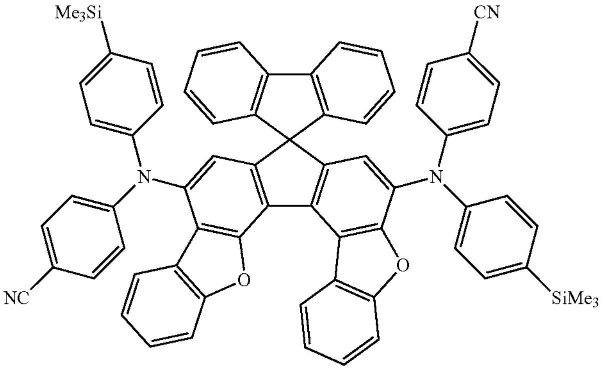
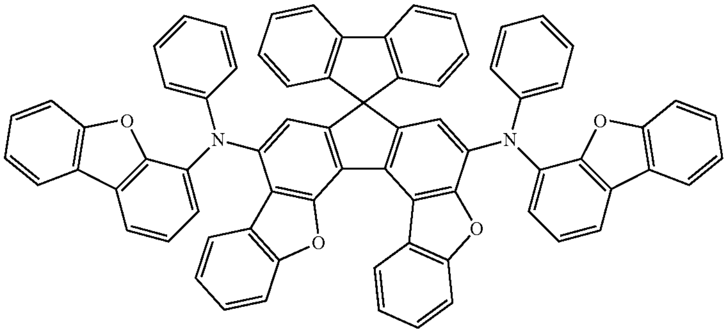

-continued
[Formula 374]
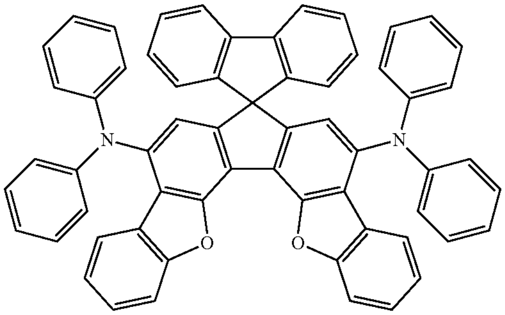
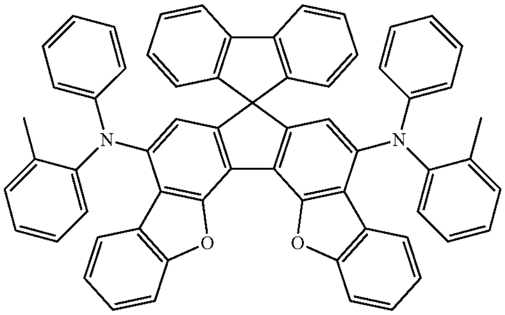
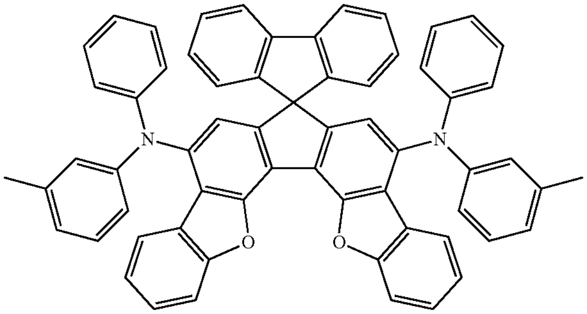
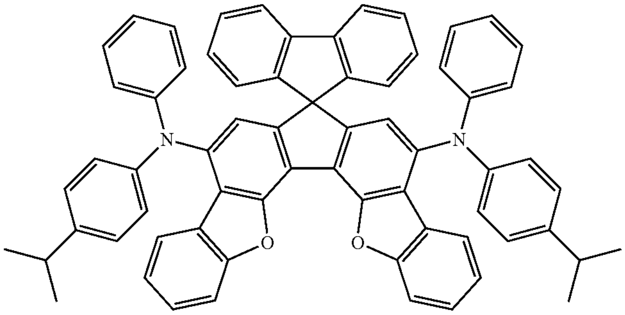
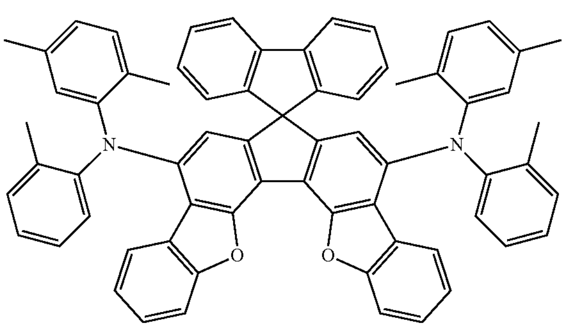
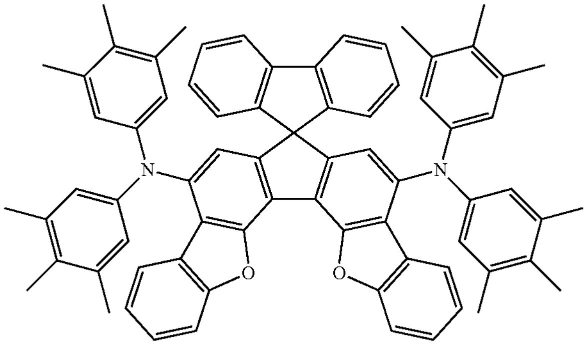
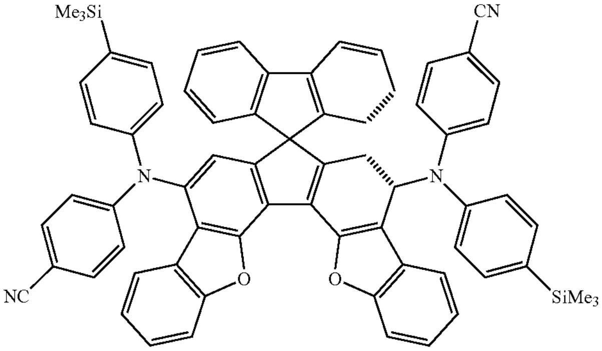

-continued

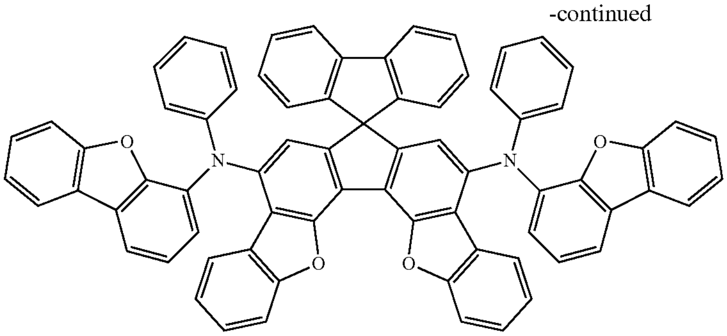

Compound Represented by Formula (10)

The compound represented by the formula (10) will be described below.

[Formula 375]

(10)

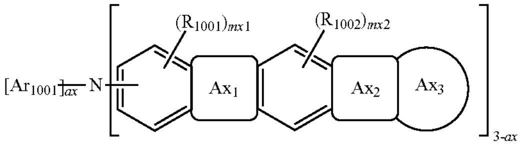

[Formula 376]

(10a)

(10b)

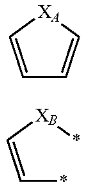

In the formula (10):

a ring $Ax_1$ is a ring represented by the formula (10a) that is fused with adjacent ring(s) at any position(s);

a ring $Ax_2$ is a ring represented by the formula (10b) that is fused with adjacent ring(s) at any position(s);

two * in the formula (10b) are bonded to a ring $Ax_3$ at any position(s);

$X_A$ and $X_B$ are each independently $C(R_{1003})(R_{1004})$, $Si(R_{1005})(R_{1006})$, an oxygen atom or a sulfur atom;

the ring $Ax_3$ is a substituted or unsubstituted aromatic hydrocarbon ring having 6 to 50 ring carbon atoms, or a substituted or unsubstituted heterocycle having 5 to 50 ring atoms;

$Ar_{1001}$ is a substituted or unsubstituted aryl group having 6 to 50 ring carbon atoms, or a substituted or unsubstituted heterocyclic group having 5 to 50 ring atoms;

$R_{1001}$ to $R_{1006}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

mx1 is 3, and mx2 is 2;

a plurality of $R_{1001}$ are mutually the same or different;

a plurality of $R_{1002}$ are mutually the same or different;

ax is 0, 1, or 2;

when ax is 0 or 1, the structures enclosed by brackets indicated by "3-ax" are mutually the same or different; and when ax is 2, a plurality of $Ar_{1001}$ are mutually the same or different.

In an exemplary embodiment, $Ar_{1001}$ is a substituted or unsubstituted aryl group having 6 to 50 ring carbon atoms.

In an exemplary embodiment, the ring $Ax_3$ is a substituted or unsubstituted aromatic hydrocarbon ring having 6 to 50 ring carbon atoms, example of which is a substituted or unsubstituted benzene ring, a substituted or unsubstituted naphthalene ring, or a substituted or unsubstituted anthracene ring.

In an exemplary embodiment, $R_{1003}$ and $R_{1004}$ are each independently a substituted or unsubstituted alkyl group having 1 to 50 carbon atoms.

In an exemplary embodiment, ax is 1.

Specific Examples of Compound Represented by Formula (10)

Specific examples of the compound represented by the formula (10) include compounds below.

[Formula 377]
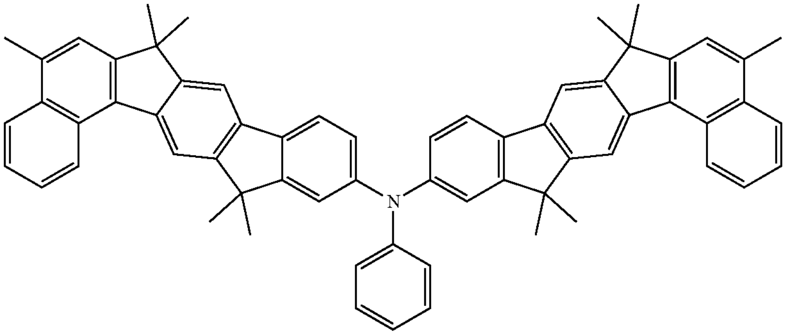
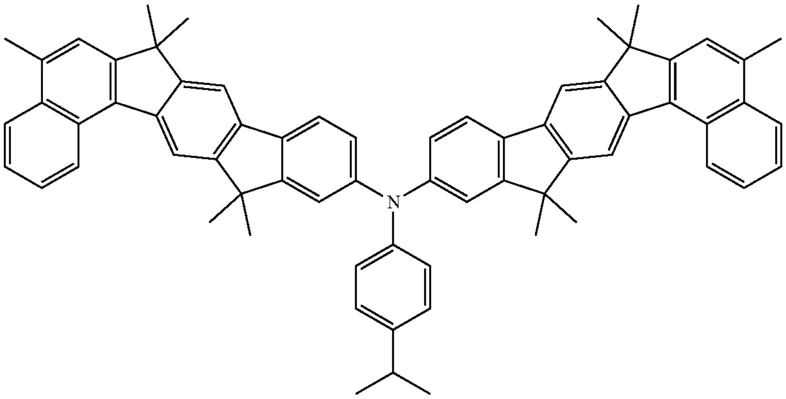
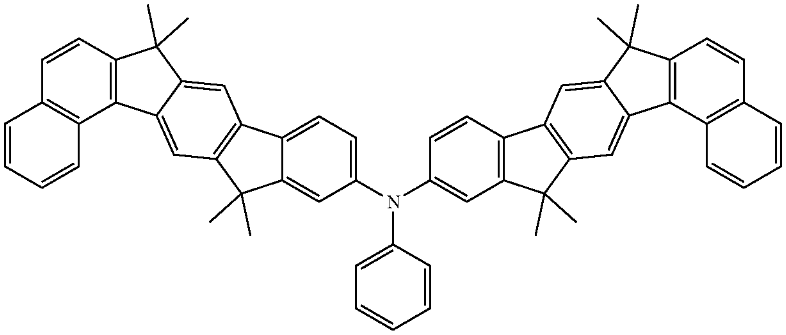
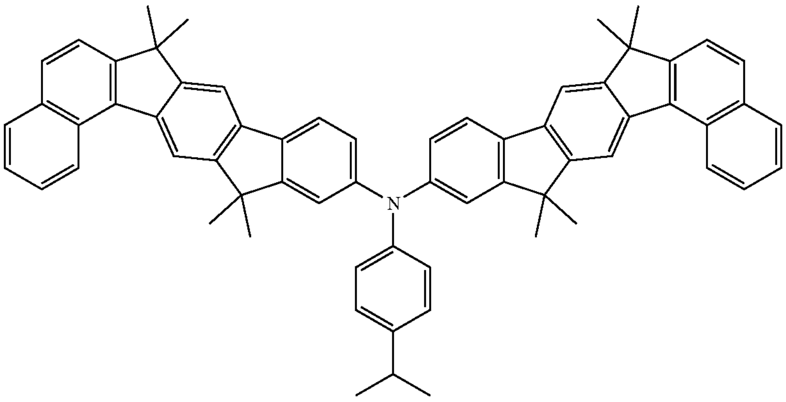

-continued
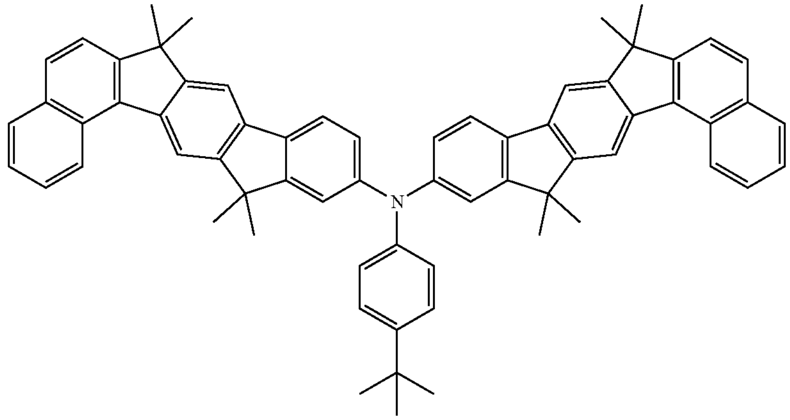
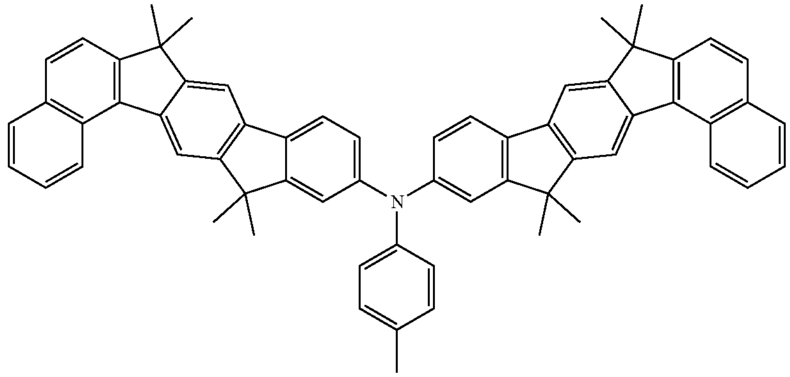
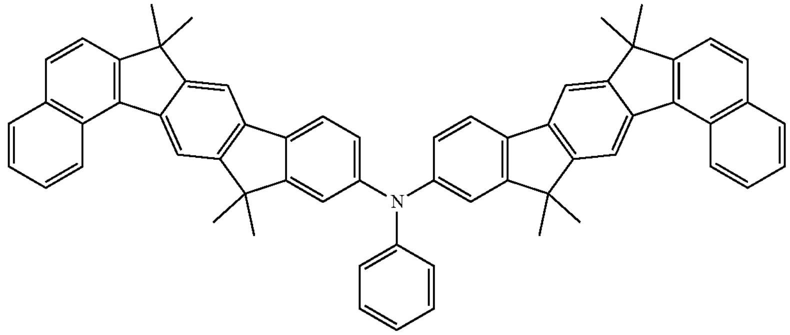
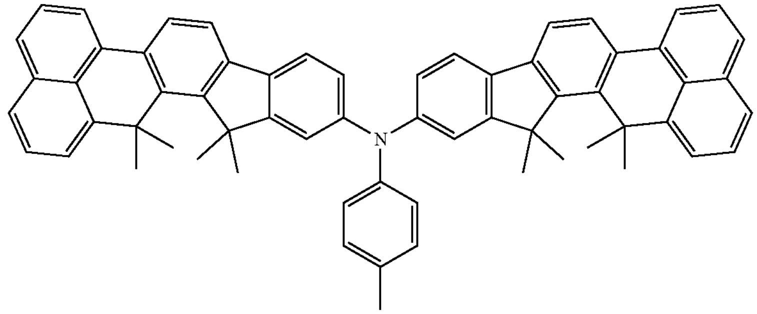

-continued
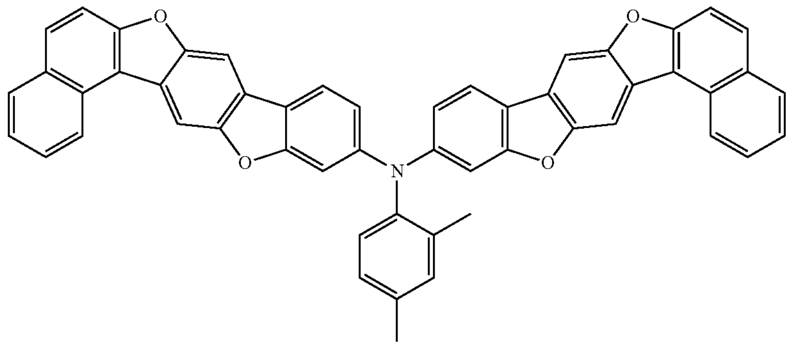
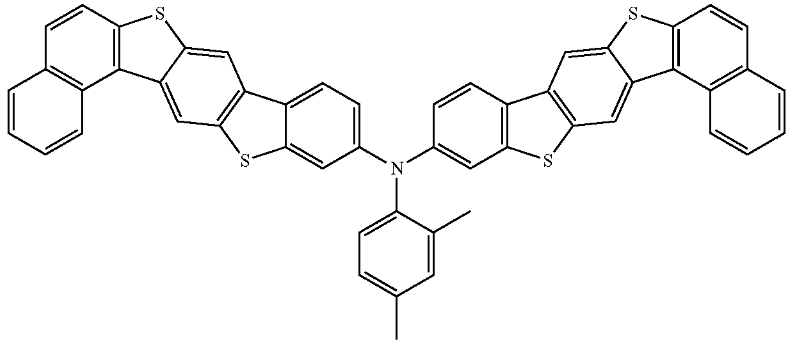
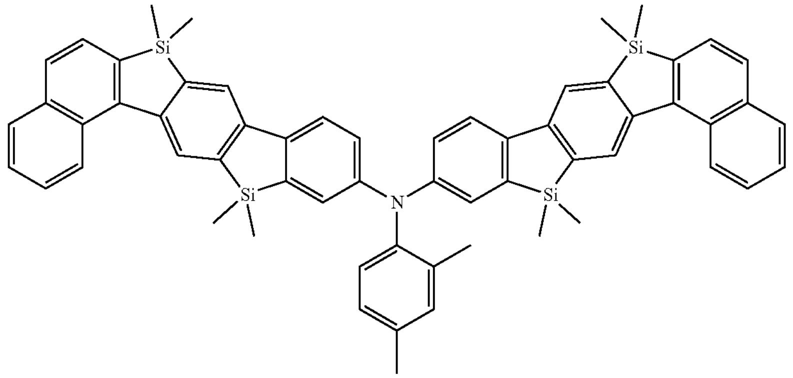

In an exemplary embodiment, the emitting layer contains, as the emitting compound, at least one compound selected from the group consisting of a compound represented by the formula (4), a compound represented by the formula (5), a compound represented by the formula (7), a compound represented by the formula (8), a compound represented by the formula (9), and a compound represented by a formula (63a) below.

[Formula 378]

(63a)

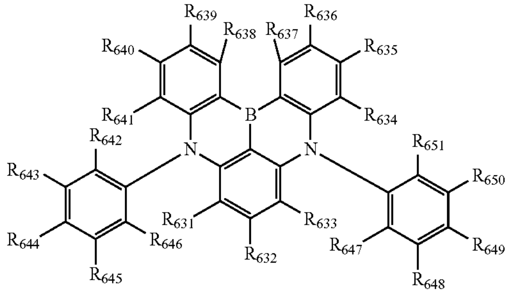

In the formula (63a):

$R_{631}$ is bonded with $R_{646}$ to form a substituted or unsubstituted heterocycle, or not bonded therewith to form no substituted or unsubstituted heterocycle;

$R_{633}$ is bonded with $R_{647}$ to form a substituted or unsubstituted heterocycle, or not bonded therewith to form no substituted or unsubstituted heterocycle;

$R_{634}$ is bonded with $R_{651}$ to form a substituted or unsubstituted heterocycle, or not bonded therewith to form no substituted or unsubstituted heterocycle;

$R_{641}$ is bonded with $R_{642}$ to form a substituted or unsubstituted heterocycle, or not bonded therewith to form no substituted or unsubstituted heterocycle;

at least one combination of adjacent two or more of $R_{631}$ to $R_{651}$ are mutually bonded to form a substituted or unsubstituted monocyclic ring, mutually bonded to form a substituted or unsubstituted fused ring, or not mutually bonded;

$R_{631}$ to $R_{651}$ not forming the substituted or unsubstituted heterocycle, not forming the monocyclic ring, and not forming the fused ring are each independently a hydrogen atom, a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aryl group having 6 to 50 ring carbon atoms, or a substituted or unsubstituted heterocyclic group having 5 to 50 ring atoms; and at least one of $R_{631}$ to $R_{651}$ not forming the substituted or unsubstituted heterocycle, not forming the monocyclic ring, and not forming the fused ring is a halogen atom, a cyano group, a nitro group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

In an exemplary embodiment, the compound represented by the formula (4) is a compound represented by the formula (41-3), the formula (41-4), or the formula (41-5), the ring A1 in the formula (41-5) being a substituted or unsubstituted fused aromatic hydrocarbon ring having 10 to 50 ring carbon atoms, or a substituted or unsubstituted fused heterocycle having 8 to 50 ring atoms.

In an exemplary embodiment, in the formulae (41-3), (41-4) and (41-5), the substituted or unsubstituted fused aromatic hydrocarbon ring having 10 to 50 ring carbon atoms is a substituted or unsubstituted naphthalene ring, a substituted or unsubstituted anthracene ring, or a substituted or unsubstituted fluorene ring, and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, in the formulae (41-3), (41-4) and (41-5), the substituted or unsubstituted fused aromatic hydrocarbon ring having 10 to 50 ring carbon atoms is a substituted or unsubstituted naphthalene ring or a substituted or unsubstituted fluorene ring, and the substituted or unsubstituted fused heterocycle having 8 to 50 ring atoms is a substituted or unsubstituted dibenzofuran ring, a substituted or unsubstituted carbazole ring, or a substituted or unsubstituted dibenzothiophene ring.

In an exemplary embodiment, the compound represented by the formula (4) is selected from the group consisting of a compound represented by a formula (461), a compound represented by a formula (462), a compound represented by a formula (463), a compound represented by a formula (464), a compound represented by a formula (465), a compound represented by a formula (466), and a compound represented by a formula (467) below.

[Formula 379]

(461)

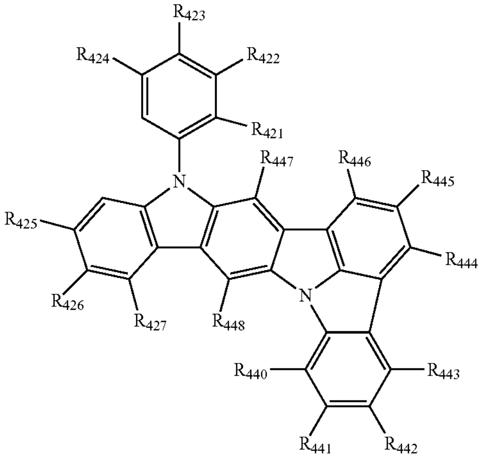

-continued (462)

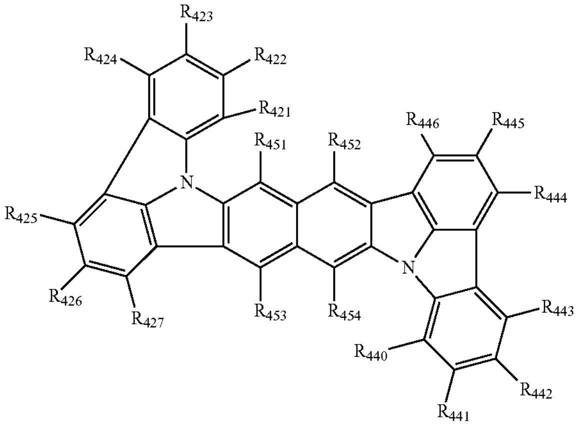

[Formula 380]

(463)

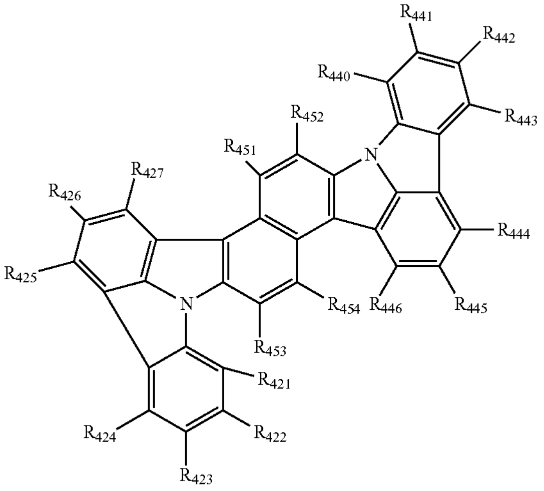

(464)

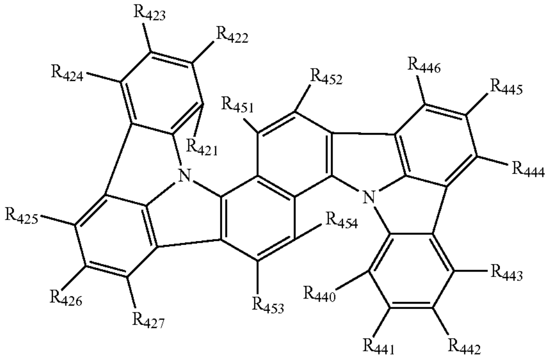

-continued

[Formula 381]

(465)

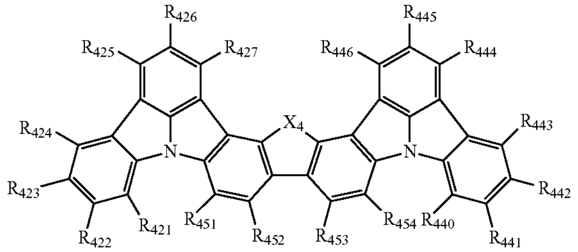

[Formula 382]

(466)

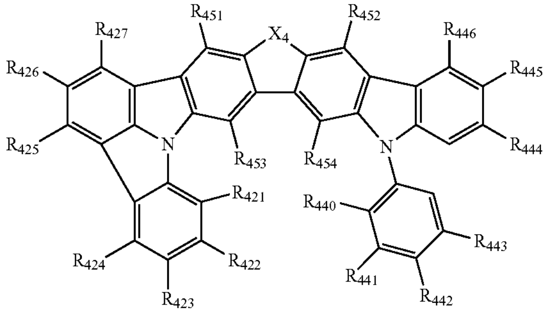

[Formula 383]

(467)

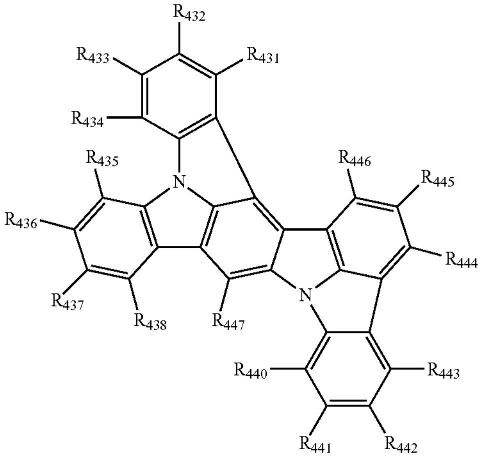

In the formulae (461) to (467):

at least one combination of adjacent two or more of $R_{421}$ to $R_{427}$, $R_{431}$ to $R_{436}$, $R_{440}$ to $R_{448}$, and $R_{451}$ to $R_{454}$ are mutually bonded to form a substituted or unsubstituted monocyclic ring, mutually bonded to form a substituted or unsubstituted fused ring, or not mutually bonded;

$R_{437}$, $R_{438}$, and $R_{421}$ to $R_{427}$, $R_{431}$ to $R_{436}$, $R_{440}$ to $R_{448}$, and $R_{451}$ to $R_{454}$ forming neither the monocyclic ring nor the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—

($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$X_4$ is an oxygen atom, $NR_{801}$, or C($R_{802}$)($R_{803}$);

$R_{801}$, $R_{802}$, and $R_{803}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

preferably, a substituted or unsubstituted alkyl group having 1 to 50 carbon atoms, or a substituted or unsubstituted aryl group having 6 to 50 ring carbon atoms;

when a plurality of $R_{801}$ are present, the plurality of $R_{801}$ are mutually the same or different;

when a plurality of $R_{802}$ are present, the plurality of $R_{802}$ are mutually the same or different; and when a plurality of $R_{803}$ are present, the plurality of $R_{803}$ are mutually the same or different.

In an exemplary embodiment, $R_{421}$ to $R_{427}$ and $R_{440}$ to $R_{448}$ are each independently a hydrogen atom, a substituted or unsubstituted aryl group having 6 to 50 ring carbon atoms, or a substituted or unsubstituted heterocyclic group having 5 to 50 ring atoms.

In an exemplary embodiment, $R_{421}$ to $R_{427}$ and $R_{440}$ to $R_{447}$ are each independently selected from the group consisting of a hydrogen atom, a substituted or unsubstituted aryl group having 6 to 18 ring carbon atoms and a substituted or unsubstituted heterocyclic group having 5 to 18 ring atoms.

In an exemplary embodiment, the compound represented by the formula (41-3) is a compound represented by a formula (41-3-1) below.

[Formula 384]

(41-3-1)

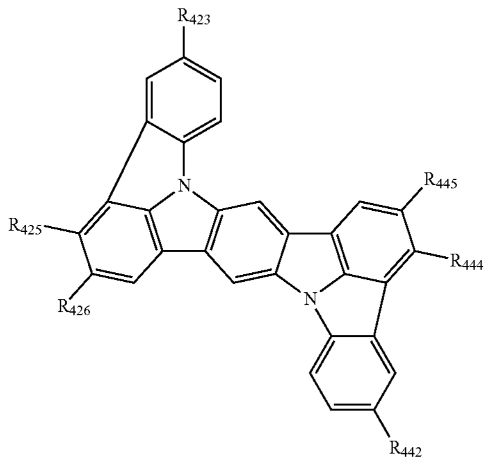

In the formula (41-3-1), $R_{423}$, $R_{425}$, $R_{426}$, $R_{442}$, Rau and $R_{445}$ each independently represent the same as $R_{423}$, $R_{425}$, $R_{426}$, $R_{442}$, Rau and $R_{445}$ in the formula (41-3).

In an exemplary embodiment, the compound represented by the formula (41-3) is a compound represented by a formula (41-3-2) below.

[Formula 385]

(41-3-2)

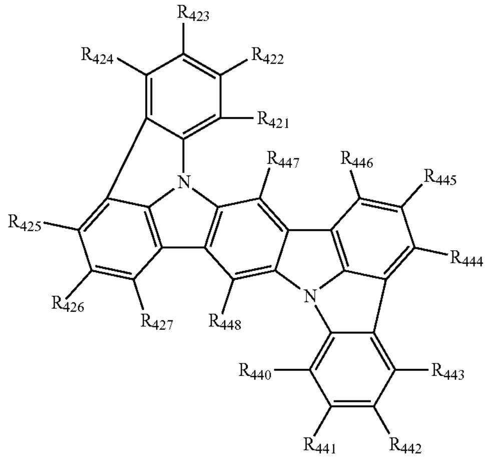

In the formula (41-3-2), $R_{421}$ to $R_{427}$ and $R_{440}$ to $R_{448}$ each independently represent the same as $R_{421}$ to $R_{427}$ and $R_{440}$ to $R_{448}$ in the formula (41-3); and at least one of $R_{421}$ to $R_{427}$ or $R_{440}$ to $R_{446}$ is a group represented by —N($R_{906}$)($R_{907}$).

In an exemplary embodiment, two of $R_{421}$ to $R_{427}$ and $R_{440}$ to $R_{446}$ in the formula (41-3-2) are each a group represented by —N($R_{906}$)($R_{907}$).

In an exemplary embodiment, the compound represented by the formula (41-3-2) is a compound represented by a formula (41-3-3) below.

[Formula 386]

(41-3-3)

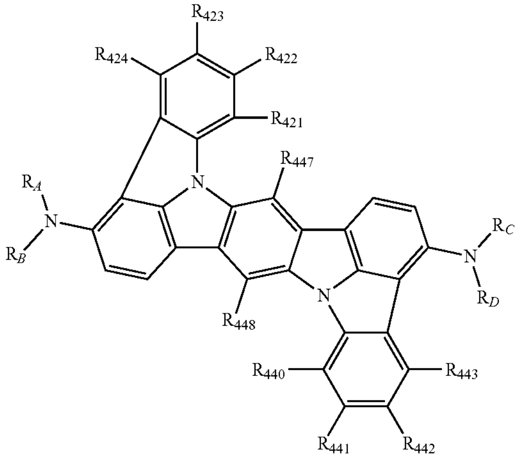

In the formula (41-3-3), $R_{421}$ to $R_{424}$, $R_{440}$ to $R_{443}$, $R_{447}$, and $R_{448}$ each independently represent the same as $R_{421}$ to $R_{424}$, $R_{440}$ to $R_{443}$, $R_{447}$, and $R_{448}$ in the formula (41-3); and $R_A$, $R_B$, $R_C$ and $R_D$ are each independently a substituted or unsubstituted aryl group having 6 to 18 ring carbon atoms, or a substituted or unsubstituted heterocyclic group having 5 to 18 ring atoms.

In an exemplary embodiment, the compound represented by the formula (41-3-3) is a compound represented by a formula (41-3-4) below.

[Formula 387]

(41-3-4)

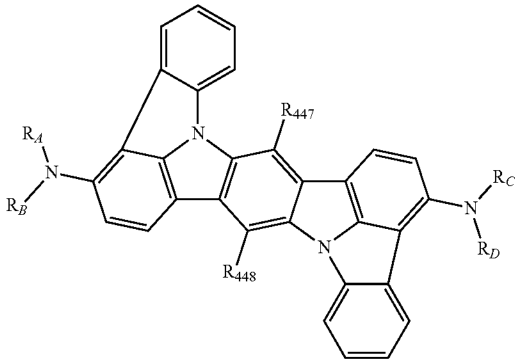

In the formula (41-3-4), $R_{447}$, $R_{448}$, $R_A$, $R_B$, $R_C$ and $R_D$ each independently represent the same as $R_{447}$, $R_{448}$, $R_A$, $R_B$, $R_C$ and $R_D$ in the formula (41-3-3).

In an exemplary embodiment, $R_A$, $R_B$, $R_C$, and $R_D$ are each independently a substituted or unsubstituted aryl group having 6 to 18 ring carbon atoms.

In an exemplary embodiment, $R_A$, $R_B$, $R_C$, and $R_D$ are each independently a substituted or unsubstituted phenyl group.

In an exemplary embodiment, $R_{447}$ and $R_{448}$ are each a hydrogen atom.

In an exemplary embodiment, the substituent for "the substituted or unsubstituted" group in each of the formulae is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In an exemplary embodiment, the substituent for "the substituted or unsubstituted" group in each of the above formulae is an unsubstituted alkyl group having 1 to 50 carbon atoms, an unsubstituted aryl group having 6 to 50 ring carbon atoms, or an unsubstituted heterocyclic group having 5 to 50 ring atoms.

In an exemplary embodiment, the substituent for "the substituted or unsubstituted" group in each of the above formulae is an unsubstituted alkyl group having 1 to 18 carbon atoms, an unsubstituted aryl group having 6 to 18 ring carbon atoms, or an unsubstituted heterocyclic group having 5 to 18 ring atoms.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Further, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include indium tin oxide (ITO), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the EL layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode.

Examples of the material for the cathode include elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance include: an aromatic amine compound, which is a low-molecule organic compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N, N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ $cm^2/(V{\cdot}s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

The organic EL device according to the exemplary embodiment also preferably further includes a hole transporting layer disposed between the anode and the emitting zone (preferably between the anode and the first and second emitting layers, the first and second emitting layers being in direct contact with each other), and the hole transporting layer preferably contains a compound represented by a formula (C1) or (D1) below.

[Formula 388]

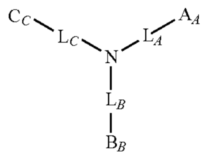

(C1)

In the formula (C1):

$L_A$, $L_B$, and $L_C$ are each independently a single bond, a substituted or unsubstituted arylene group having 6 to 18 ring carbon atoms, or a substituted or unsubstituted divalent heterocyclic group having 5 to 13 ring atoms;

$A_A$, $B_B$ and $C_C$ are each independently a substituted or unsubstituted aryl group having 6 to 30 ring carbon atoms, a substituted or unsubstituted heterocyclic group having 5 to 30 ring atoms, or a group represented by —Si(R'901)(R'902)(R'903);

$R'_{901}$ to $R'_{903}$ are each independently a substituted or unsubstituted aryl group having 6 to 30 ring carbon atoms;

when a plurality of $R'_{901}$ are present, the plurality of $R'_{901}$ are mutually the same or different;

when a plurality of $R'_{902}$ are present, the plurality of $R'_{902}$ are mutually the same or different; and when a plurality of $R'_{903}$ are present, the plurality of $R'_{903}$ are mutually the same or different.

[Formula 389]

(D1)

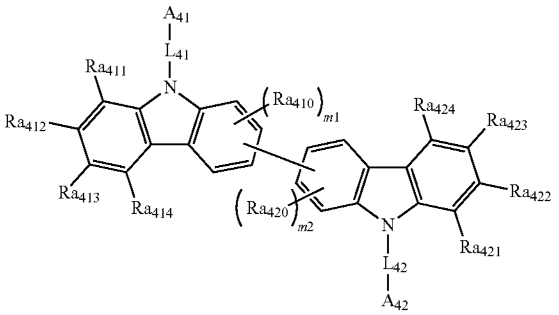

In the formula (D1):

$A_{41}$ and $A_{42}$ are each independently a substituted or unsubstituted aryl group having 6 to 30 ring carbon atoms, or a substituted or unsubstituted heterocyclic group having 5 to 30 ring atoms;

$L_{41}$ and $L_{42}$ are each independently a single bond, a substituted or unsubstituted arylene group having 6 to 30 ring carbon atoms, or a substituted or unsubstituted divalent heterocyclic group having 5 to 30 ring atoms;

at least one combination of adjacent two or more of $Ra_{410}$ to $Ra_{414}$ are mutually bonded to form a substituted or unsubstituted monocyclic ring, mutually bonded to form a substituted or unsubstituted fused ring, or not mutually bonded;

at least one combination of adjacent two or more of $Ra_{420}$ to $Ra_{424}$ are mutually bonded to form a substituted or unsubstituted monocyclic ring, mutually bonded to form a substituted or unsubstituted fused ring, or not mutually bonded;

$Ra_{410}$ to $Ra_{414}$ and $Ra_{420}$ to $Ra_{424}$ forming neither the substituted or unsubstituted monocyclic ring nor the substituted or unsubstituted fused ring are each independently a hydrogen atom, a cyano group, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a halogen atom, a nitro group, a substituted or unsubstituted aryl group having 6 to 50 ring carbon atoms, or a substituted or unsubstituted heterocyclic group having 5 to 50 ring atoms;

m1 and m2 are each 3;

three $Ra_{410}$ are mutually the same or different;

three $Ra_{420}$ are mutually the same or different;

$R_{901}$, $R_{902}$, $R_{903}$ and $R_{904}$ in the compound represented by the formula (D1) are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

In the organic EL device according to the exemplary embodiment, the hole transporting layer preferably contains a compound represented by the formula (C1).

In the compound represented by the formula (C1), all the groups specified as "substituted or unsubstituted" groups are preferably "unsubstituted" groups.

Electron Transporting Layer

The organic EL device according to the exemplary embodiment may further include additional electron transporting layer(s) (for instance, a second electron transporting layer and a third electron transporting layer) between the first and second emitting layers and the cathode.

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable.

In the exemplary embodiment, a benzimidazole compound is preferably usable for the additional electron transporting layer(s). The above-described substances mostly have an electron mobility of $10^{-6}$ $cm^2/Vs$ or more. It should be noted that any substance other than the above substance may be used for the electron transporting layer as long as the substance exhibits a higher electron transportability than the hole transportability.

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

In the organic EL device according to the exemplary embodiment, the substituent for "the substituted or unsubstituted" group is preferably a group selected from the group consisting of an alkyl group having 1 to 18 carbon atoms, an aryl group having 6 to 18 ring carbon atoms and a heterocyclic group having 5 to 18 ring atoms.

In the organic EL device according to the exemplary embodiment, the substituent for "the substituted or unsubstituted" group is preferably an alkyl group having 1 to 5 carbon atoms.

Layer Formation Method

A method of forming each layer of the organic EL device in the exemplary embodiment is subject to no limitation except for the above particular description.

However, known methods of dry film-forming such as vacuum deposition, sputtering, plasma or ion plating and wet film-forming such as spin coating, dipping, flow coating or ink-jet are applicable.

Film Thickness

A film thickness of each of the organic layers of the organic EL device in the exemplary embodiment is not limited unless otherwise specified in the above. In general, the thickness preferably ranges from several nanometers to 1 μm because an excessively small film thickness is likely to cause defects (e.g. pin holes) and an excessively large thickness leads to the necessity of applying high voltage and consequent reduction in efficiency.

Emission Wavelength of Organic EL Device

The organic electroluminescence device according to the exemplary embodiment preferably emits light having a maximum peak wavelength of 500 nm or less, and preferably emits light having a maximum peak wavelength in a range from 430 nm to 480 nm when the organic electroluminescence device is driven.

The maximum peak wavelength of the light emitted from the organic EL device when being driven is measured as follows. Voltage is applied to the organic EL device such that a current density becomes 10 $mA/cm^2$, where spectral radiance spectrum is measured by a spectroradiometer CS-2000 (produced by Konica Minolta, Inc.). A peak wavelength of an emission spectrum, at which the luminous intensity of the obtained spectral radiance spectrum is at the maximum, is measured and defined as a maximum peak wavelength (unit: nm).

According to the exemplary embodiment, there can be provided an organic electroluminescence device excellent in multiple performances in a balanced manner.

Second Exemplary Embodiment

Electronic Device

An electronic device according to the exemplary embodiment is installed with any one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above-described exemplary embodiments but includes any modification and improvement as long as such modification and improvement are compatible with the invention.

For instance, the emitting layers are not limited to two layers, but may be provided by layering three or more emitting layers. When the organic EL device has three or more emitting layers, it is only required that at least two emitting layers satisfy the conditions described in the above exemplary embodiment. For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer may be provided adjacent to at least one of a side of the emitting layer close to the anode or a side of the emitting layer close to the cathode. The blocking layer is preferably provided in contact with the emitting layer to block at least any of holes, electrons or excitons.

For instance, when the blocking layer is provided in contact with the side of the emitting layer close to the cathode, the blocking layer permits transport of electrons, and blocks holes from reaching a layer provided closer to the cathode (e.g., the electron transporting layer) beyond the blocking layer. When the organic EL device includes the electron transporting layer, the blocking layer is preferably interposed between the emitting layer and the electron transporting layer.

When the blocking layer is provided in contact with the side of the emitting layer close to the anode, the blocking layer permits transport of holes and blocks electrons from reaching a layer provided closer to the anode (e.g., the hole transporting layer) beyond the blocking layer. When the organic EL device includes the hole transporting layer, the blocking layer is preferably interposed between the emitting layer and the hole transporting layer.

Alternatively, the blocking layer may be provided adjacent to the emitting layer so that the excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

The invention will be described in further detail with reference to Examples. The scope of the invention is by no means limited to Examples.

Compounds

Structures of compounds used for producing organic EL devices in Examples 1 to 2 and Reference Examples 1 to 3 are shown below.

[Formula 390]

ET1

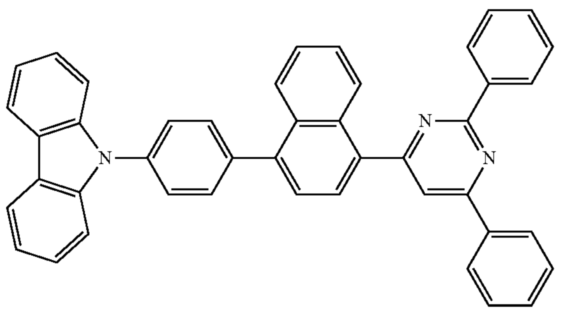

ET2

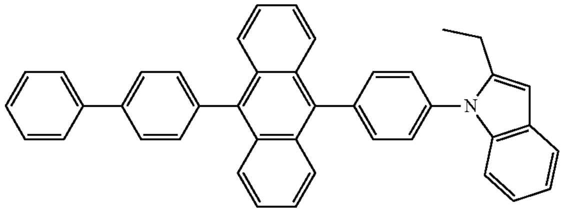

ET3

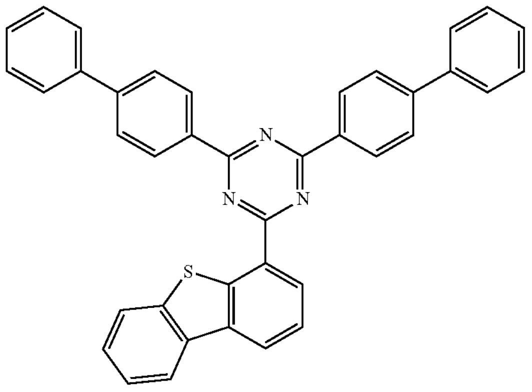

-continued

ET4

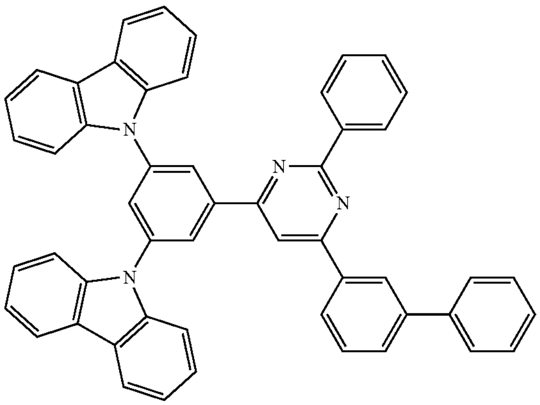

ET5

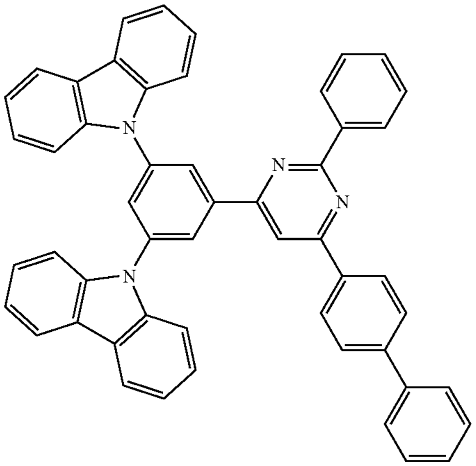

ET6

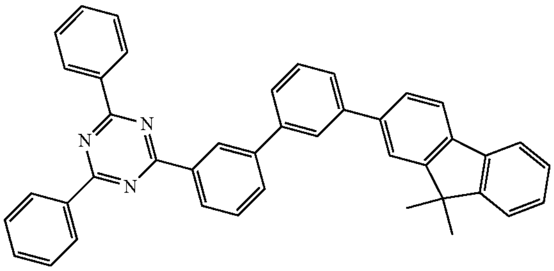

Structures of comparative compounds used for producing organic EL devices in Comparative Examples 1 to 3 are shown below.

[Formula 391]

Ref-ET1

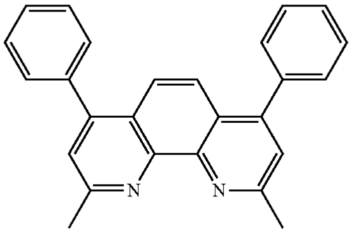

-continued
Ref-ET2
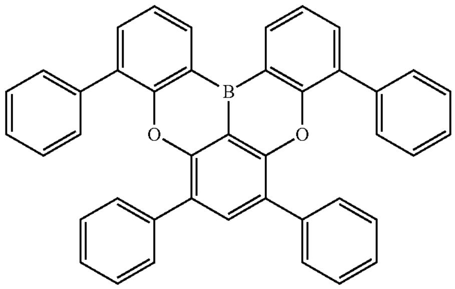
Ref-ET3
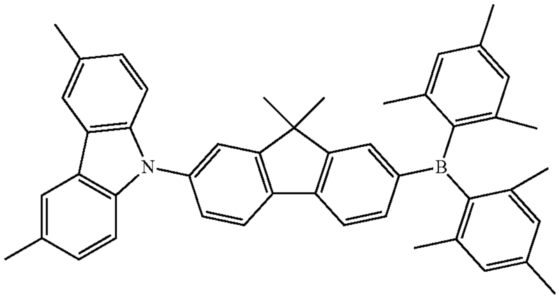
Ref-ET4
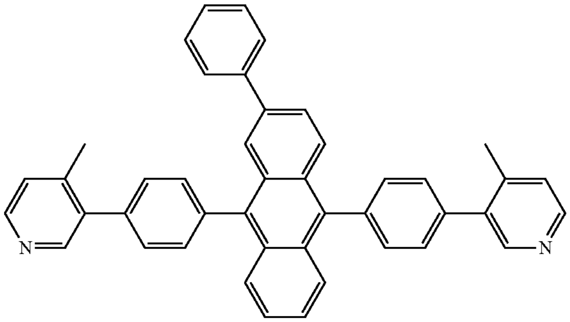
Structures of other compounds used for producing organic EL devices in Examples 1 to 2, Reference Examples 1 to 3 and Comparative Examples 1 to 3 are shown below.
[Formula 392]
HA
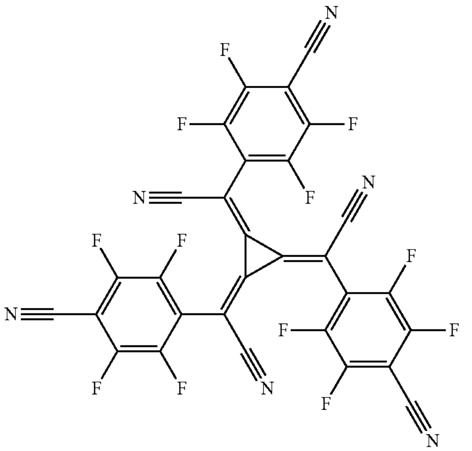
-continued
HT1
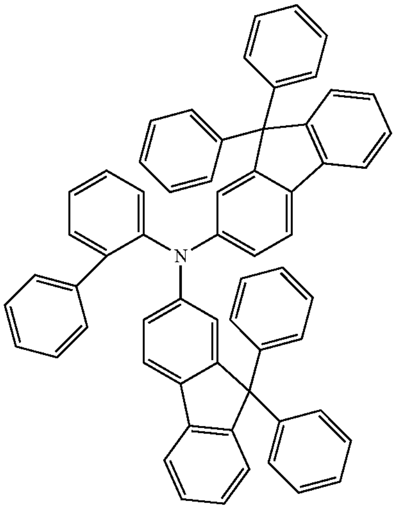
HT2
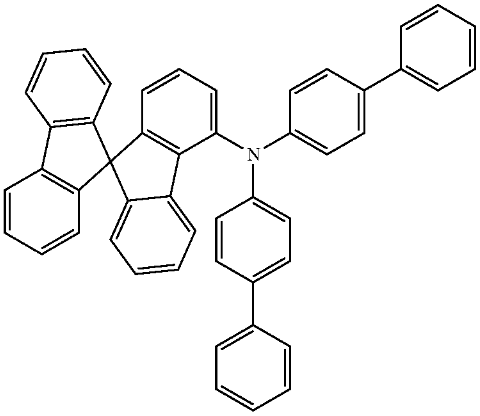
BH1
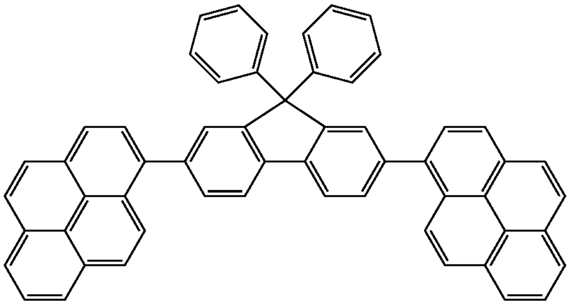
BD
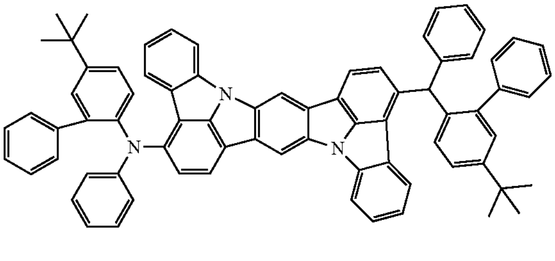

-continued

BH2

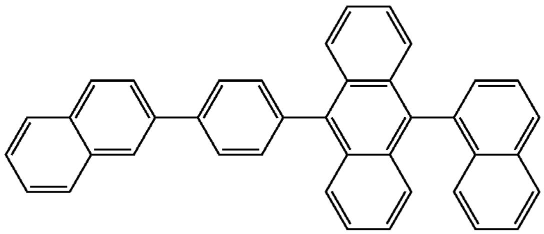

Production of Organic EL Device

The organic EL devices were produced and evaluated as follows.

Example 1

A glass substrate (size: 25 mm×75 mm×1.1 mm thick, produced by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. Firstly, a compound HT1 and a compound HA were co-deposited on a surface of the glass substrate where the transparent electrode line was provided in a manner to cover the transparent electrode, thereby forming a 10-nm-thick hole injecting layer. The ratios of the compound HT1 and the compound HA in the hole injecting layer were 97 mass % and 3 mass %, respectively.

After forming the hole injecting layer, the compound HT1 was vapor-deposited to form an 80-nm-thick first hole transporting layer.

After forming the first hole transporting layer, a compound HT2 was vapor-deposited to form a 10-nm-thick second hole transporting layer (also referred to as an electron blocking layer (EBL)).

A compound BH1 (first host material) and a compound BD (first emitting compound) were co-deposited on the second hole transporting layer such that the ratio of the compound BD accounted for 2 mass %, thereby forming a 5-nm-thick first emitting layer.

A compound BH2 (second host material) and the compound BD (second emitting compound) were co-deposited on the first emitting layer so that a ratio of the compound BD accounted for 2 mass %, thereby forming a 20-nm-thick second emitting layer.

A compound ET1 was vapor-deposited on the second emitting layer to form a 10-nm-thick first electron transporting layer (occasionally also referred to as a hole blocking layer (HBL)).

A compound ET2 was vapor-deposited on the first electron transporting layer to form a 15-nm-thick second electron transporting layer.

LiF was vapor-deposited on the second electron transporting layer to form a 1-nm-thick electron injecting layer.

Metal (Al) was vapor-deposited on the electron injecting layer to form an 80-nm-thick cathode.

A device arrangement of the organic EL device in Example 1 is roughly shown as follows.

ITO(130)/HT1:HA(10,97%:3%)/HT1(80)/HT2(10)/BH1:BD(5,98%:2%)/BH2:BD(20,9 8%:2%)/ET1(10)/ET2(15)/LiF(1)/AI(80)

Numerals in parentheses represent a film thickness (unit: nm).

The numerals (97%:3%) represented by percentage in the same parentheses indicate a ratio (mass %) between the compound HT1 and the compound HA in the hole injecting layer. The numerals (98%:2%) represented by percentage in the same parentheses indicate a ratio (mass %) between the host material (compound BH1 or BH2) and the dopant material (compound BD) in the first emitting layer or the second emitting layer. Similar notations apply to the description below.

Example 2

An organic EL device of Example 2 was produced in the same manner as in Example 1 except that the compound ET2 used to form the second electron transporting layer was changed to the compound ET2 and a compound ET3 shown in Table 1 and the compound ET2 and the compound ET3 were co-deposited to form a 15-nm-thick second electron transporting layer. The ratios of the compound ET2 and the compound ET3 in the second electron transporting layer of Example 2 were 85 mass % and 15 mass %, respectively.

Reference Examples 1 to 3

Organic EL devices of Reference Examples 1 to 3 were each produced in the same manner as in Example 1 except that the compound ET1 used to form the first electron transporting layer was changed to a third compound shown in Table 1 to form a first electron transporting layer.

Comparative Example 1

An organic EL device of Comparative Example 1 was produced in the same manner as in Example 1 except that the compound ET1 used to form the first electron transporting layer was changed to a third compound shown in Table 1 to form a first electron transporting layer, the compound ET2 used to form the second electron transporting layer was changed to compounds Ref-ET1 and Li shown in Table 1 and the compounds Ref-ET1 and Li were co-deposited to form a second electron transporting layer. The ratios of the compound Ref-ET1 and the compound Li in the second electron transporting layer of Comparative Example 1 were 97 mass % and 3 mass %, respectively. Li co-deposited with the compound Ref-ET1 is a metal lithium that does not fall under a fifth compound, but is listed in a column of the fifth compound in the table for illustrative purposes.

Comparative Examples 2 and 3

Organic EL devices of Comparative Examples 2 to 3 were each produced in the same manner as in Example 1 except that the compound ET1 used to form the first electron transporting layer was changed to a third compound shown in Table 1 to form a first electron transporting layer and that the compound ET2 used to form the second electron transporting layer was changed to a fourth compound shown in Table 1 to form a second electron transporting layer.

Evaluation of Organic EL Devices

The produced organic EL devices were evaluated as follows. Table 1 shows the evaluation results. Table 1 also shows physical properties of compounds used in the emitting layers and electron transporting layers of Examples.

Drive Voltage $V_D$

A drive voltage $V_D$ (unit: V) was measured when current was applied between the anode and the cathode such that a current density was 10 mA/$cm^2$.

External Quantum Efficiency EQE

The organic EL device obtained was driven by DC constant current at a current density of 10 mA/$cm^2$ at room temperature. A luminance intensity was measured by using a spectroradiometer CS-2000 (produced by Konica Minolta, Inc.).

The result of the measurement was used to determine an external quantum efficiency (unit: %). Table 1 shows the results.

Lifetime LT90

The organic EL device obtained was driven by DC constant current at a current density of 50 mA/$cm^2$. Time elapsed until a luminance intensity was decreased to 90% of an initial luminance intensity was measured. The time measured was defined as 90% lifetime (LT90 (unit: hr)). The luminance intensity was measured by using a spectroradiometer CS-2000 (produced by Konica Minolta, Inc.).

Performance Index

A performance index of the organic EL device obtained was calculated based on drive voltage $V_D$ (unit: V), EQE (unit: %), LT90 (unit: hr), and a numerical formula (Numerical Formula 1X) below.

$$\text{Performance Index} = \text{EQE} \times \text{LT90}/V_D^2 \quad \text{(Numerical Formula 1X)}$$

TABLE 1

| | First emitting layer | | | Second emitting layer | | | | First electron transporting layer Third compound | |
|---|---|---|---|---|---|---|---|---|---|
| | First host material | | First emitting compound | Second host material | | | Second emitting compound | | |
| | Name | $T_1$ [eV] | Name | Name | $T_1$ [eV] | Af [eV] | Name | Name | Af [eV] |
| Example 1 | BH1 | 2.08 | BD | BH2 | 1.86 | 2.09 | BD | ET1 | 2.20 |
| Example 2 | BH1 | 2.08 | BD | BH2 | 1.86 | 2.09 | BD | ET1 | 2.20 |
| Reference Example 1 | BH1 | 2.08 | BD | BH2 | 1.86 | 2.09 | BD | ET4 | 2.32 |
| Reference Example 2 | BH1 | 2.08 | BD | BH2 | 1.86 | 2.09 | BD | ET5 | 2.33 |
| Reference Example 3 | BH1 | 2.08 | BD | BH2 | 1.86 | 2.09 | BD | ET6 | 2.35 |
| Comparative Example 1 | BH1 | 2.08 | BD | BH2 | 1.86 | 2.09 | BD | Ref-ET1 | 1.86 |
| Comparative Example 2 | BH1 | 2.08 | BD | BH2 | 1.86 | 2.09 | BD | Ref-ET2 | 1.88 |
| Comparative Example 3 | BH1 | 2.08 | BD | BH2 | 1.86 | 2.09 | BD | Ref-ET3 | 2.03 |

| | Second electron transporting layer | | | | Evaluation of device | | | |
|---|---|---|---|---|---|---|---|---|
| | Fourth compound | | Fifth compound | | | | | Performance index |
| | Name | Af [eV] | Name | Af [eV] | Drive voltage $V_D$ [V] | EQE [%] | LT90 [hr] | EQE × LT90/$V_D^2$ |
| Example 1 | ET2 | 2.10 | — | — | 3.8 | 11.8 | 470 | 384 |
| Example 2 | ET2 | 2.10 | ET3 | 2.50 | 4.0 | 11.2 | 570 | 399 |
| Reference Example 1 | ET2 | 2.10 | — | — | 4.0 | 11.4 | 490 | 349 |
| Reference Example 2 | ET2 | 2.10 | — | — | 4.2 | 10.9 | 570 | 352 |
| Reference Example 3 | ET2 | 2.10 | — | — | 4.0 | 11.5 | 470 | 338 |
| Comparative Example 1 | Ref-ET1 | 1.86 | Li | | 4.6 | 7.5 | 10 | 4 |
| Comparative Example 2 | Ref-ET4 | 2.10 | — | — | 4.5 | 8.2 | 20 | 8 |
| Comparative Example 3 | Ref-ET4 | 2.10 | — | — | 4.6 | 7.8 | 30 | 11 |

The organic EL devices of Examples 1 to 2 and Reference Examples 1 to 3, as compared with the organic EL devices of Comparative Examples 1 to 3, had a higher efficiency, longer lifetime and lower drive voltage, and thus were excellent in multiple performances (luminous efficiency, lifetime and drive voltage) in a balanced manner.

The organic EL device with a higher efficiency, longer lifetime and lower voltage has a larger performance index, and the organic EL device with a larger performance index is desirable as a device with lower power consumption. Examples 1 to 2 were devices with a larger performance index and a lower power consumption not only than the organic EL devices of Comparative Examples 1 to 3 but also than the organic EL devices of Reference Examples 1 to 3.

Evaluation of Compounds

Triplet Energy $T_1$

A measurement target compound was dissolved in EPA (diethylether:isopentane:ethanol=5:5:2 in volume ratio) at a concentration of 10 μmol/L, and the obtained solution was put in a quartz cell to provide a measurement sample. A phosphorescence spectrum (ordinate axis: phosphorescent luminous intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value $\lambda_{edge}$ [nm] at an intersection of the tangent and the abscissa axis. The calculated energy amount was defined as triplet energy $T_1$. It should be noted that the triplet energy $T_1$ may have an error of about plus or minus 0.02 eV depending on measurement conditions.

$$T_1\,[\text{eV}] = 1239.85/\lambda_{edge} \qquad \text{Conversion Equation (F1)}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 produced by Hitachi High-Technologies Corporation was used.

Singlet Energy $S_1$

A toluene solution of a measurement target compound at a concentration of 10 µmol/L was prepared and put in a quartz cell. An absorption spectrum (ordinate axis: absorption intensity, abscissa axis: wavelength) of the thus-obtained sample was measured at a normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate singlet energy.

$$S_1\,[\text{eV}] = 1239.85/\lambda_{edge} \qquad \text{Conversion Equation (F2)}$$

A spectrophotometer (U3310 produced by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Measurement of Affinity Value Af

An affinity value Af of a measurement target (compound or material) was calculated on the basis of a numerical formula (Numerical Formula 1Y) below. The unit of the affinity value Af is eV.

$$Af = -1.19 \times (Ere - Efc) - 4.78\ \text{eV} \qquad \text{(Numerical Formula 1Y)}$$

In the formula (Numerical Formula 1Y), Ere and Efc are defined as follows.

Ere: First reduction potential (DPV, Negative scan)

Efc: First oxidation potential of ferrocene (DPV, Positive scan), (ca. +0.55 V vs Ag/AgCl)

Oxidation-reduction potential was measured by the differential pulse voltammetry (DPV) method using an electrochemical analyzer (CHI630B, produced by ALS). A sample solution used for the measurement was prepared by dissolving the measurement target at a concentration of 1.0 mmol/L in N, N-dimethylformamide (DMF) as a solvent with tetrabutylammonium hexafluorophosphate (TBHP) as a supporting electrolyte dissolved at a concentration of 100 mmol/L. A glassy carbon electrode was used as a working electrode. A platinum (Pt) electrode was used as an opposing electrode.

Measurement of Maximum Fluorescence Peak Wavelength (FL-peak)

A measurement target compound was dissolved in toluene at a concentration of $4.9\times10^{-6}$ mol/L to prepare a toluene solution thereof. Using a fluorescence spectrometer (spectrophotofluorometer F-7000 manufactured by Hitachi High-Tech Science Corporation), the toluene solution of the measurement target compound was excited at 390 nm, where a maximum fluorescence peak wavelength λ (unit: nm) was measured.

The maximum fluorescence peak wavelength λ of the compound BD was 452 nm.

TABLE 2

| | $S_1$ [eV] | $T_1$ [eV] |
|---|---|---|
| BH1 | 3.09 | 2.08 |
| BH2 | 3.01 | 1.86 |
| BD | 2.74 | 2.30 |

The invention claimed is:

1. An organic electroluminescence device, comprising:

an anode;

a cathode;

an emitting zone disposed between the anode and the cathode; and a first electron transporting layer disposed between the emitting zone and the cathode, wherein the emitting zone comprises a first emitting layer and a second emitting layer, the first emitting layer comprises a first compound as a first host material and a first emitting compound that emits light having a maximum peak wavelength of 500 nm or less, the second emitting layer comprises a second compound as a second host material and a second emitting compound that emits light having a maximum peak wavelength of 500 nm or less, the first host material and the second host material are mutually different, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1A) below, the first electron transporting layer comprises a third compound, and a difference between an affinity value of the third compound Af(M3) and an affinity value of the host material comprised in the emitting layer that is disposed closer to the cathode and is either the first emitting layer or the second emitting layer Af(HX) satisfies a relationship of a numerical formula (Numerical Formula 2A) below, $$T_1(H1) > T_1(H2), \quad \text{(Numerical Formula 1A)}$$

$$0\text{ eV} \le Af(M3) - Af(HX) < 0.15\text{ eV}. \quad \text{(Numerical Formula 2A)}$$

2. An organic electroluminescence device, comprising:

an anode;

a cathode;

an emitting zone disposed between the anode and the cathode; and a first electron transporting layer disposed between the emitting zone and the cathode, wherein the emitting zone comprises a first emitting layer and a second emitting layer, the first emitting layer comprises a first compound as a first host material and a first emitting compound that emits light having a maximum peak wavelength of 500 nm or less, the second emitting layer comprises a second compound as a second host material and a second emitting compound that emits light having a maximum peak wavelength of 500 nm or less, the first host material and the second host material are mutually different, the first emitting compound and the second emitting compound are mutually the same or different, a triplet energy of the first host material $T_1(H1)$ and a triplet energy of the second host material $T_1(H2)$ satisfy a relationship of a numerical formula (Numerical Formula 1A) below, the first electron transporting layer comprises a third compound, the third compound is a pyrimidine compound, and a difference between an affinity value of the third compound Af(M3) and an affinity value of the host material comprised in the emitting layer that is disposed closer to the cathode and is either the first emitting layer or the second emitting layer Af(HX) satisfies a relationship of a numerical formula (Numerical Formula 2B) below, $$T_1(H1) > T_1(H2), \quad \text{(Numerical Formula 1A)}$$

$$0\text{ eV} \le Af(M3) - Af(HX) < 0.22\text{ eV}. \quad \text{(Numerical Formula 2B)}$$

3. The organic electroluminescence device according to claim 1, wherein the third compound is a compound represented by a formula (3) below,

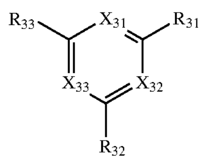

(3)

where, in the formula (3):

$X_{31}$ to $X_{33}$ are each independently $CR_{34}$ or a nitrogen atom;

$R_{34}$ is a hydrogen atom or a substituent $R_{30}$;

at least two of $X_{31}$ to $X_{33}$ are each a nitrogen atom;

when two or more $R_{34}$ are present, the two or more $R_{34}$ are mutually the same or different;

$R_{31}$ to $R_{33}$ are each independently a hydrogen atom, or a substituent $R_{30}$; and the substituent $R_{30}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

when two or more substituents $R_{30}$ are present, the two or more substituents $R_{30}$ are mutually the same or different;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

4. The organic electroluminescence device according to claim 3, wherein the third compound is a compound represented by a formula (31) below, (31)

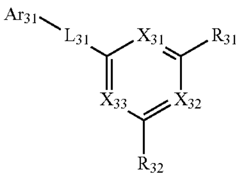

where, in the formula (31):

$X_{31}$ to $X_{33}$, $R_{31}$ and $R_{32}$ are defined as in the formula (3);

$L_{31}$ is a single bond, a substituted or unsubstituted arylene group having 6 to 50 ring carbon atoms, or a substituted or unsubstituted divalent heterocyclic group having 5 to 50 ring atoms; and $Ar_{31}$ is a substituted or unsubstituted aryl group having 6 to 50 ring carbon atoms, or a substituted or unsubstituted heterocyclic group having 5 to 50 ring atoms.

5. The organic electroluminescence device according to claim 4, wherein $Ar_{31}$ is a group represented by a formula (32) below, (32)

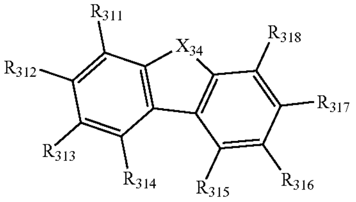

where, in the formula (32):

$X_{34}$ is an oxygen atom, a sulfur atom, $N(R_{321})$, or $C(R_{322})(R_{323})$;

one of $R_{311}$ to $R_{318}$ and $R_{321}$ to $R_{323}$ is a single bond with $L_{31}$;

at least one combination of adjacent two or more of $R_{311}$ to $R_{318}$ not being the single bond with $L_{31}$ are mutually bonded to form a substituted or unsubstituted monocyclic ring, mutually bonded to form a substituted or unsubstituted fused ring, or not mutually bonded;

a combination of $R_{322}$ and $R_{323}$ not being the single bond with $L_{31}$ are mutually bonded to form a substituted or unsubstituted monocyclic ring, mutually bonded to form a substituted or unsubstituted fused ring, or not mutually bonded;

$R_{311}$ to $R_{318}$ not being the single bond with $L_{31}$ and forming neither the substituted or unsubstituted monocyclic ring nor the substituted or unsubstituted fused ring, $R_{321}$, and $R_{322}$ and $R_{323}$ not being the single bond with $L_{31}$ and forming neither the substituted or unsubstituted monocyclic ring nor the substituted or unsubstituted fused ring are each independently a hydrogen atom, or a substituent $R_{30}$; and the substituent $R_{30}$ is defined as in the formula (3).

6. The organic electroluminescence device according to claim 5, wherein $X_{34}$ is $N(R_{321})$.

7. The organic electroluminescence device according to claim 5, wherein the third compound is a compound represented by a formula (33) below, (33)

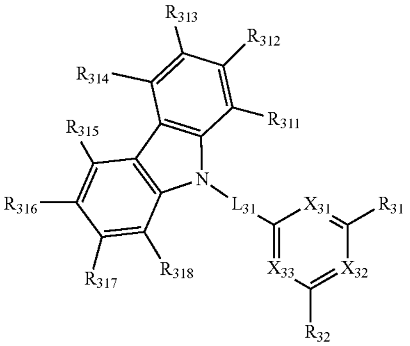

where, in the formula (33):

$X_{31}$ to $X_{33}$, $R_{31}$ and $R_{32}$ are each defined as in the formula (3);

$L_{31}$ is defined as in the formula (31); and $R_{311}$ to $R_{318}$ are each defined as in the formula (32).

8. The organic electroluminescence device according to claim 7, wherein $L_{31}$ is a single bond or an unsubstituted arylene group having 6 to 50 ring carbon atoms;

the substituent $R_{30}$ is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, a group represented by $—Si(R_{911})(R_{912})(R_{913})$, a group represented by $—O—(R_{914})$, a group represented by $—S—(R_{915})$, a group represented by $—N(R_{916})(R_{917})$, a halogen atom, a cyano group, a nitro group, or an unsubstituted aryl group having 6 to 50 ring carbon atoms; and $R_{911}$ to $R_{917}$ are each independently a hydrogen atom, an unsubstituted alkyl group having 1 to 50 carbon atoms, an unsubstituted cycloalkyl group having 3 to 50 ring carbon atoms, or an unsubstituted aryl group having 6 to 50 ring carbon atoms.

9. The organic electroluminescence device according to claim 3, wherein two of $X_{31}$ to $X_{33}$ are each a nitrogen atom and a remaining one of $X_{31}$ to $X_{33}$ is $CR_{34}$.

10. The organic electroluminescence device according to claim 5, wherein $R_{311}$ to $R_{318}$ are each a hydrogen atom.

11. The organic electroluminescence device according to claim 1, further comprising a second electron transporting layer between the first electron transporting layer and the cathode.

12. The organic electroluminescence device according to claim 11, wherein the second electron transporting layer comprises a fourth compound, the fourth compound is at least one compound selected from the group consisting of a compound represented by a formula (E41) below, a compound represented by a formula (E42) below, a compound represented by a formula (E43) below, a compound represented by a formula (E44) below, and a phosphine oxide compound, and the third compound in the first electron transporting layer and the fourth compound in the second electron transporting layer are mutually different compounds, (E41)

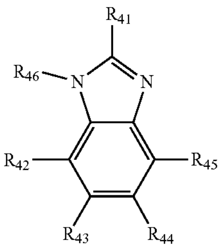

where, in the formula (E41):

at least one combination of adjacent two or more of $R_{41}$ to $R_{46}$ are mutually bonded to form a substituted or unsubstituted monocyclic ring, mutually bonded to form a substituted or unsubstituted fused ring, or not mutually bonded;

$R_{41}$ to $R_{46}$ forming neither the substituted or unsubstituted monocyclic ring nor the substituted or unsubstituted fused ring are each independently a hydrogen atom, or a substituent $R_{40}$;

the substituent $R_{40}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{40}$ are present, the two or more substituents $R_{40}$ are mutually the same or different, (E42)

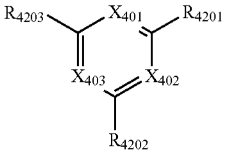

where, in the formula (E42):

$X_{401}$ to $X_{403}$ are each independently $CR_{4204}$ or a nitrogen atom;

$R_{4204}$ is a hydrogen atom or a substituent $R_{4200}$;

at least one of $X_{401}$ to $X_{403}$ is a nitrogen atom;

when two or more $R_{4204}$ are present, the two or more $R_{4204}$ are mutually the same or different;

$R_{4201}$ to $R_{4203}$ are each independently a hydrogen atom, or a substituent $R_{4200}$; and the substituent $R_{4200}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4200}$ are present, the two or more substituents $R_{4200}$ are mutually the same or different, (E43)

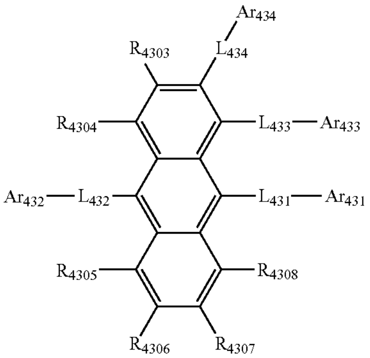

where, in the formula (E43):

at least one combination of adjacent two or more of $R_{4303}$ to $R_{4308}$ are mutually bonded to form a substituted or unsubstituted monocyclic ring, mutually bonded to form a substituted or unsubstituted fused ring, or not mutually bonded;

$R_{4303}$ to $R_{4308}$ forming neither the substituted or unsubstituted monocyclic ring nor the substituted or unsubstituted fused ring are each independently a hydrogen atom, or a substituent $R_{4300}$;

$L_{431}$ to $L_{434}$ are each independently a single bond, a substituted or unsubstituted arylene group having 6 to 50 ring carbon atoms, or a substituted or unsubstituted divalent heterocyclic group having 5 to 50 ring atoms;

$Ar_{431}$ to $Ar_{434}$ are each independently a hydrogen atom, a substituted or unsubstituted aryl group having 6 to 50 ring carbon atoms, or a substituted or unsubstituted heterocyclic group having 5 to 50 ring atoms;

at least one of $Ar_{431}$ to $Ar_{434}$ is a substituted or unsubstituted heterocyclic group having 5 to 50 ring atoms, and at least one heterocyclic group of $Ar_{431}$ to $Ar_{434}$ is a monovalent nitrogen-containing heterocyclic group;

the substituent $R_{4300}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4300}$ are present, the two or more substituents $R_{4300}$ are mutually the same or different, (E44)

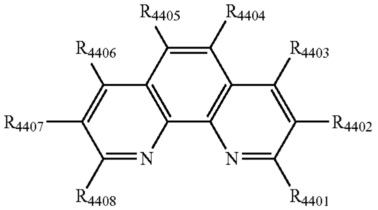

where, in the formula (E44):

at least one combination of adjacent two or more of $R_{4401}$ to $R_{4408}$ are mutually bonded to form a substituted or unsubstituted monocyclic ring, mutually bonded to form a substituted or unsubstituted fused ring, or not mutually bonded;

$R_{4401}$ to $R_{4408}$ forming neither the substituted or unsubstituted monocyclic ring nor the substituted or unsubstituted fused ring are each independently a hydrogen atom, or a substituent $R_{4400}$;

the substituent $R_{4400}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and when two or more substituents $R_{4400}$ are present, the two or more substituents $R_{4400}$ are mutually the same or different, in the forth compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

13. The organic electroluminescence device according to claim 12, wherein the fourth compound is a compound represented by a formula (E411) or a formula (E412) below, (E411)

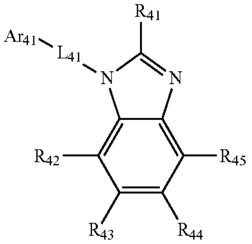

(E412)

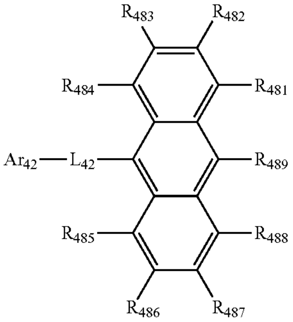

where, in the formula (E411):

$R_{41}$ to $R_{45}$ are defined as in the formula (E41);

$L_{41}$ is a single bond, a substituted or unsubstituted arylene group having 6 to 50 ring carbon atoms, or a substituted or unsubstituted divalent heterocyclic group having 5 to 50 ring atoms; and $Ar_{41}$ is a group represented by the formula (E412), where, in the formula (E412):

one of $R_{481}$ to $R_{489}$ is a single bond with $L_{41}$;

at least one combination of adjacent two or more of $R_{481}$ to $R_{489}$ not being the single bond with $L_{41}$ are mutually bonded to form a substituted or unsubstituted monocyclic ring, mutually bonded to form a substituted or unsubstituted fused ring, or not mutually bonded;

$R_{481}$ to $R_{489}$ not being the single bond with $L_{41}$, not forming the substituted or unsubstituted monocyclic ring, and not forming the substituted or unsubstituted fused ring are each independently a hydrogen atom, or a substituent $R_{480}$;

$L_{42}$ are each independently a single bond, a substituted or unsubstituted arylene group having 6 to 50 ring carbon atoms, or a substituted or unsubstituted divalent heterocyclic group having 5 to 50 ring atoms;

$Ar_{42}$ are each independently a substituted or unsubstituted aryl group having 6 to 50 ring carbon atoms, or a substituted or unsubstituted heterocyclic group having 5 to 50 ring atoms;

the substituent $R_{480}$ represents the same as $R_{40}$ in the formula (E41); and when two or more substituents $R_{480}$ are present, the two or more substituents $R_{480}$ are mutually the same or different.

14. The organic electroluminescence device according to claim 13, wherein the fourth compound is a compound represented by a formula (E413) below, (E413)

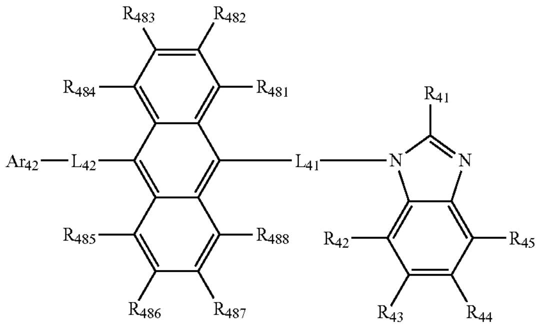

where, in the formula (E413):

$R_{41}$ to $R_{45}$ are each defined as in the formula (E41);

$L_{41}$ is defined as in the formula (E411); and $R_{481}$ to $R_{488}$, $L_{42}$ and $Ar_{42}$ are each defined as in the formula (E412).

15. The organic electroluminescence device according to claim 12, wherein the fourth compound is a compound represented by a formula (E421) below, (E421)

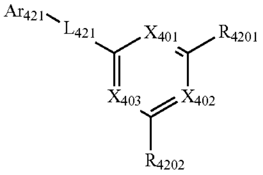

where, in the formula (E421):

$X_{401}$ to $X_{403}$, $R_{4201}$ and $R_{4202}$ are defined as in the formula (E42);

$L_{421}$ is a single bond, a substituted or unsubstituted arylene group having 6 to 50 ring carbon atoms, or a substituted or unsubstituted divalent heterocyclic group having 5 to 50 ring atoms; and $Ar_{421}$ is a substituted or unsubstituted aryl group having 6 to 50 ring carbon atoms, or a substituted or unsubstituted heterocyclic group having 5 to 50 ring atoms.

16. The organic electroluminescence device according to claim 15, wherein the fourth compound is a compound represented by a formula (E422) or a formula (E423) below, (E422)

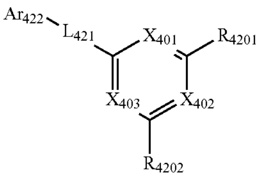

-continued (E423)

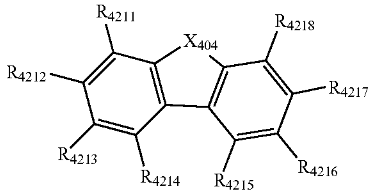

where, in the formula (E422):

$X_{401}$ to $X_{403}$, $R_{4201}$ and $R_{4202}$ are each defined as in the formula (E42);

$L_{421}$ is defined as in the formula (E421); and $Ar_{422}$ is a group represented by the formula (E423), where, in the formula (E423):

$X_{404}$ is an oxygen atom, a sulfur atom, N ($R_{4221}$) or C ($R_{4222}$)($R_{4223}$);

one of $R_{4211}$ to $R_{4218}$ and $R_{4221}$ to $R_{4223}$ is a single bond with $L_{421}$;

at least one combination of adjacent two or more of $R_{4211}$ to $R_{4218}$ not being the single bond with $L_{421}$ are mutually bonded to form a substituted or unsubstituted monocyclic ring, mutually bonded to form a substituted or unsubstituted fused ring, or not mutually bonded;

a combination of $R_{4222}$ and $R_{4223}$ not being the single bond with $L_{421}$ are mutually bonded to form a substituted or unsubstituted monocyclic ring, mutually bonded to form a substituted or unsubstituted fused ring, or not mutually bonded;

$R_{4211}$ to $R_{4218}$ not being the single bond with $L_{421}$ and forming neither the substituted or unsubstituted monocyclic ring nor the substituted or unsubstituted fused ring, $R_{4221}$, and $R_{4222}$ and $R_{4223}$ not being the single bond with $L_{421}$ and forming neither the substituted or unsubstituted monocyclic ring nor the substituted or unsubstituted fused ring are each independently a hydrogen atom, or a substituent $R_{4200}$; and the substituent $R_{4200}$ is defined as in the formula (E42).

17. The organic electroluminescence device according to claim 12, wherein the fourth compound is a compound represented by a formula (E431) below, (E431)

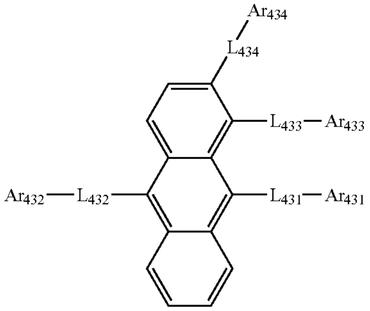

where, in the formula (E431), $L_{431}$ to $L_{434}$ and $Ar_{431}$ to $Ar_{434}$ are each defined as in the formula (E43).

18. The organic electroluminescence device according to claim 12, wherein the fourth compound is a compound represented by a formula (E432) below, (E432)

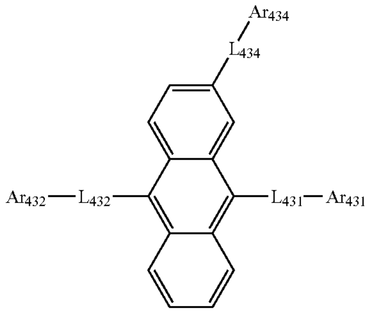

where, in the formula (E432), $L_{431}$, $L_{432}$, $L_{434}$, $Ar_{431}$, $Ar_{432}$, and $Ar_{434}$ are each defined as in the formula (E43).

19. The organic electroluminescence device according to claim 12, wherein the fourth compound is a compound represented by a formula (E441) below, (E441)

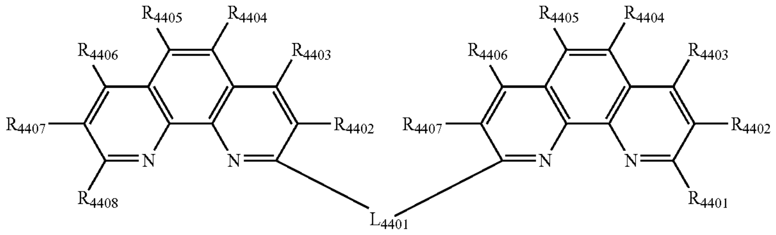

where, in the formula (E441):

$R_{4401}$ to $R_{4408}$ are each independently defined as in the formula (E44);

$L_{4401}$ is a single bond, a substituted or unsubstituted arylene group having 6 to 50 ring carbon atoms, or a substituted or unsubstituted divalent heterocyclic group having 5 to 50 ring atoms;

two $R_{4402}$ are mutually the same or different;
two $R_{4403}$ are mutually the same or different;
two $R_{4404}$ are mutually the same or different;
two $R_{4405}$ are mutually the same or different;
two $R_{4406}$ are mutually the same or different; and
two $R_{4407}$ are mutually the same or different.

20. The organic electroluminescence device according to claim 19, wherein the fourth compound is a compound represented by a formula (E442) below, (E442)

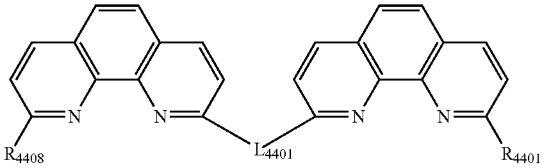

where, in the formula (E442), $R_{4401}$ and $R_{4408}$ are defined as in the formula (E44), and $L_{4401}$ is defined as in the formula (E441).

21. The organic electroluminescence device according to claim 12, wherein the fourth compound is a compound represented by a formula (E45) below, (E45)

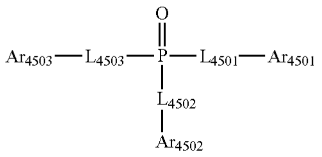

where, in the formula (E45):

$L_{4501}$ to $L_{4503}$ are each independently a single bond, a substituted or unsubstituted arylene group having 6 to 50 ring carbon atoms, or a substituted or unsubstituted divalent heterocyclic group having 5 to 50 ring atoms; and $Ar_{4501}$ to $Ar_{4503}$ are each independently a substituted or unsubstituted aryl group having 6 to 50 ring carbon atoms, or a substituted or unsubstituted heterocyclic group having 5 to 50 ring atoms.

22. The organic electroluminescence device according to claim 21, wherein the fourth compound is a compound represented by a formula (E451) below, (E451)

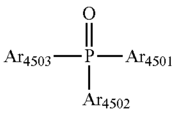

where, in the formula (E451), $Ar_{4501}$ to $Ar_{4503}$ are defined as in the formula (E45).

23. The organic electroluminescence device according to claim 12, wherein the second electron transporting layer further comprises a fifth compound, and an affinity value of the fifth compound Af(M5) is more than an affinity value of the fourth compound Af(M4).

24. The organic electroluminescence device according to claim 23, wherein the fifth compound is a compound represented by a formula (E511) or a formula (E512) below, (E511)

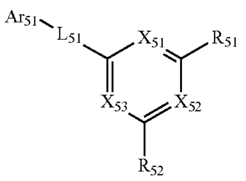

-continued (E512)

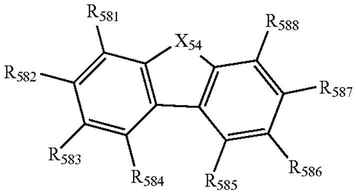

where, in the formula (E511):

$X_{51}$ to $X_{53}$ are each independently $CR_{54}$ or a nitrogen atom;

$R_{54}$ is a hydrogen atom or a substituent $R_{50}$;

at least one of $X_{51}$ to $X_{53}$ is a nitrogen atom;

when two or more $R_{54}$ are present, the two or more $R_{54}$ are mutually the same or different;

$R_{51}$ and $R_{52}$ are each independently a hydrogen atom or a substituent $R_{50}$;

the substituent $R_{50}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

when two or more substituents $R_{50}$ are present, the two or more substituents $R_{50}$ are mutually the same or different;

$L_{51}$ is a single bond, a substituted or unsubstituted arylene group having 6 to 50 ring carbon atoms, or a substituted or unsubstituted divalent heterocyclic group having 5 to 50 ring atoms; and $Ar_{51}$ is a group represented by the formula (E512), where, in the formula (E512):

$X_{54}$ is an oxygen atom, a sulfur atom, N $(R_{591})$ or C $(R_{592})(R_{593})$;

one of $R_{581}$ to $R_{588}$ and $R_{591}$ to $R_{593}$ is a single bond with $L_{51}$;

at least one combination of adjacent two or more of $R_{581}$ to $R_{588}$ not being the single bond with $L_{51}$ are mutually bonded to form a substituted or unsubstituted monocyclic ring, mutually bonded to form a substituted or unsubstituted fused ring, or not mutually bonded;

a combination of $R_{592}$ and $R_{593}$ not being the single bond with $L_{51}$ are mutually bonded to form a substituted or unsubstituted monocyclic ring, mutually bonded to form a substituted or unsubstituted fused ring, or not mutually bonded;

$R_{581}$ to $R_{588}$ not being the single bond with $L_{51}$ and forming neither the substituted or unsubstituted monocyclic ring nor the substituted or unsubstituted fused ring, $R_{591}$, and $R_{592}$ and $R_{593}$ not being the single bond with $L_{51}$ and forming neither the substituted or unsubstituted monocyclic ring nor the substituted or unsubstituted fused ring are each independently a hydrogen atom, or a substituent $R_{50}$; and the substituent $R_{50}$ is defined as in the formula (E511), in the fifth compound, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

25. The organic electroluminescence device according to claim 24, wherein the fifth compound is a compound represented by a formula (E513) below, (E513)

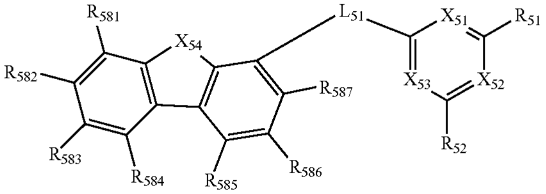

where, in the formula (E513):

$X_{51}$ to $X_{53}$, $R_{51}$, $R_{52}$, and $L_{51}$ are each defined as in the formula (E511); and $X_{54}$ and $R_{581}$ to $R_{587}$ are each defined as in the formula (E512).

26. The organic electroluminescence device according to claim 11, wherein the first electron transporting layer is in direct contact with the second electron transporting layer.

27. The organic electroluminescence device according to claim 1, wherein the first electron transporting layer is in direct contact with the first emitting layer or the second emitting layer in the emitting zone.

28. The organic electroluminescence device according to claim 1, wherein the first emitting layer and the second emitting layer are in direct contact with each other.

29. The organic electroluminescence device according to claim 1, wherein the first emitting layer is disposed between the anode and the second emitting layer.

30. The organic electroluminescence device according to claim 1, wherein the second emitting layer is disposed between the anode and the first emitting layer.

31. The organic electroluminescence device according to claim 1, wherein the affinity value of the third compound Af(M3) is 2.30 eV or less.

32. The organic electroluminescence device according to claim 1, wherein the affinity value of the third compound Af(M3) is 2.15 eV or more.

33. The organic electroluminescence device according to claim 1, wherein the first host material comprises, in a molecule, a linking structure comprising a benzene ring and a naphthalene ring linked to each other with a single bond, the benzene ring and the naphthalene ring in the linking structure are each independently fused or not fused with a further monocyclic ring or fused ring, and the benzene ring and the naphthalene ring in the linking structure are further linked to each other by cross-linking at at least one site other than the single bond.

34. The organic electroluminescence device according to claim 33, wherein the cross-linking comprises a double bond.

35. The organic electroluminescence device according to claim 1, wherein the first host material comprises, in a molecule, a biphenyl structure comprising a first benzene ring and a second benzene ring linked to each other with a single bond, and the first benzene ring and the second benzene ring in the biphenyl structure are further linked to each other by cross-linking at at least one site other than the single bond.

36. The organic electroluminescence device according to claim 35, wherein the first benzene ring and the second benzene ring in the biphenyl structure are further linked to each other by the cross-linking at one site other than the single bond.

37. The organic electroluminescence device according to claim 35, wherein the cross-linking comprises a double bond.

38. The organic electroluminescence device according to claim 35, wherein the first benzene ring and the second benzene ring in the biphenyl structure are further linked to each other by the cross-linking at two sites other than the single bond, and the cross-linking comprises no double bond.

39. The organic electroluminescence device according to claim 1, wherein the first compound is a compound represented by a formula (1) below, (1)

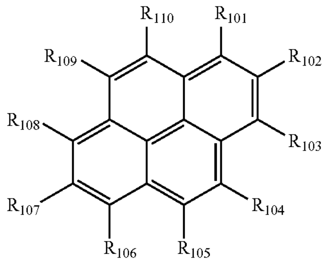

(11)

$$*-(L_{101})_{mx}-Ar_{101}$$

where, in the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11);

when a plurality of groups represented by the formula (11) are present, the plurality of groups represented by the formula (11) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4, or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1), and in the first compound represented by the formula (1), $R_{901}$, $R_{902}$, $R_{903}$, $R_{904}$, $R_{905}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

40. The organic electroluminescence device according to claim 1, wherein the second compound is a compound represented by a formula (2) below,

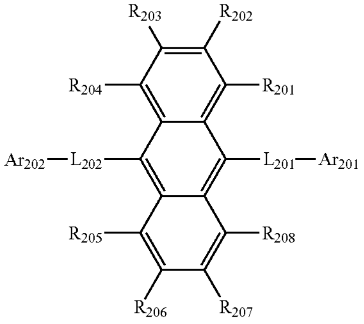

(2)

where, in the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms;

$Ar_{201}$ and $Ar_{202}$ are each independently a substituted or unsubstituted aryl group having 6 to 50 ring carbon atoms, or a substituted or unsubstituted heterocyclic group having 5 to 50 ring atoms, and in the second compound represented by the formula (2), $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

41. An electronic device comprising the organic electroluminescence device according to claim 1.

* * * * *